US012507590B2

(12) United States Patent
Lee et al.

(10) Patent No.: US 12,507,590 B2
(45) Date of Patent: Dec. 23, 2025

(54) ORGANIC ELECTRIC ELEMENT COMPRISING ORGANIC COMPOUND AND ELECTRONIC DEVICE THEREOF

(71) Applicant: DUK SAN NEOLUX CO., LTD., Chungcheongnam-do (KR)

(72) Inventors: Hyung Dong Lee, Chungcheongnam-do (KR); Min Ji Jo, Chungcheongnam-do (KR); Sun Hee Lee, Chungcheongnam-do (KR); Soung Yun Mun, Chungcheongnam-do (KR); Byoung Yeop Kang, Chungcheongnam-do (KR)

(73) Assignee: DUK SAN NEOLUX CO., LTD., Chungcheongnam-Do (KR)

( * ) Notice: Subject to any disclaimer, the term of this patent is extended or adjusted under 35 U.S.C. 154(b) by 874 days.

(21) Appl. No.: 17/782,574

(22) PCT Filed: Oct. 22, 2020

(86) PCT No.: PCT/KR2020/014520

§ 371 (c)(1),
(2) Date: Jun. 3, 2022

(87) PCT Pub. No.: WO2021/112403

PCT Pub. Date: Jun. 10, 2021

(65) Prior Publication Data

US 2023/0111751 A1 Apr. 13, 2023

(30) Foreign Application Priority Data

Dec. 6, 2019 (KR) ........................ 10-2019-0161865

(51) Int. Cl.

| | |
|---|---|
| ***H10K 50/00*** | (2023.01) |
| ***H10K 85/60*** | (2023.01) |
| *H10K 10/40* | (2023.01) |
| *H10K 30/50* | (2023.01) |
| *H10K 50/11* | (2023.01) |
| *H10K 50/15* | (2023.01) |
| *H10K 101/10* | (2023.01) |

(52) U.S. Cl.

CPC ....... *H10K 85/6572* (2023.02); *H10K 85/636* (2023.02); *H10K 85/654* (2023.02); *H10K 85/657* (2023.02); *H10K 85/6574* (2023.02); *H10K 85/6576* (2023.02); *H10K 10/40* (2023.02); *H10K 30/50* (2023.02); *H10K 50/00* (2023.02); *H10K 50/11* (2023.02); *H10K 50/156* (2023.02); *H10K 2101/10* (2023.02)

(58) Field of Classification Search

None

See application file for complete search history.

(56) References Cited

U.S. PATENT DOCUMENTS

| | | | | |
|---|---|---|---|---|
| 10,644,246 | B2 * | 5/2020 | Parham | H10K 85/657 |
| 11,063,226 | B1 * | 7/2021 | Lee | H10K 85/636 |
| 11,217,757 | B2 * | 1/2022 | Adamovich | C09K 11/06 |
| 2010/0084647 | A1 * | 4/2010 | Kondakova | H10K 85/6572 257/E51.026 |
| 2017/0125697 | A1 * | 5/2017 | Cho | H10K 85/6572 |
| 2017/0217992 | A1 * | 8/2017 | Jun | C07D 491/10 |
| 2020/0251663 | A1 * | 8/2020 | Choi | H10K 85/656 |
| 2021/0066620 | A1 * | 3/2021 | Lee | H10K 85/6576 |
| 2021/0098714 | A1 * | 4/2021 | Choi | H10K 85/653 |
| 2021/0184151 | A1 * | 6/2021 | Lee | H10K 85/342 |
| 2021/0198567 | A1 * | 7/2021 | Jun | C09K 11/06 |
| 2021/0296589 | A1 * | 9/2021 | Song | C07F 5/027 |
| 2021/0305519 | A1 * | 9/2021 | Jung | H10K 85/631 |
| 2021/0320265 | A1 * | 10/2021 | Song | H10K 85/622 |
| 2021/0376252 | A1 * | 12/2021 | Sun | C07F 15/0086 |
| 2022/0109114 | A1 * | 4/2022 | Kim | H10K 85/626 |
| 2022/0123246 | A1 * | 4/2022 | Syn | H10K 85/631 |
| 2022/0199917 | A1 * | 6/2022 | Syn | H10K 85/654 |
| 2023/0090659 | A1 * | 3/2023 | Kwon | H10K 85/633 257/40 |
| 2023/0292612 | A1 * | 9/2023 | Song | H10K 85/615 |

FOREIGN PATENT DOCUMENTS

| | | | | |
|---|---|---|---|---|
| CN | 110416422 A | | 11/2019 | |
| KR | 10-2016-0123453 A | | 10/2016 | |
| KR | 10-2017-0089785 A | | 8/2017 | |
| KR | 10-2018-0012199 A | | 2/2018 | |
| KR | 10-2018-0093354 A | | 8/2018 | |
| KR | 20190003098 A | * | 1/2019 | C09K 11/06 |
| WO | WO-2019027189 A1 | * | 2/2019 | H10K 85/111 |
| WO | WO 2019/206292 A1 | | 10/2019 | |

OTHER PUBLICATIONS

Machine translation of KR-20190003098-A, translation generated Jul. 2025, 45 pages. (Year: 2025).*

Machine translation of WO-2019027189-A1, translation generated Jul. 2025, 25 pages. (Year: 2025).*

Office action issued on Jul. 1, 2025 from China Patent Office in a counterpart China Patent Application No. 202080085734.8 (all the cited references are listed in this IDS.) (English translation is also submitted herewith.).

International Search Report for PCT/KR2020/014520 mailed on Jan. 27, 2021.

* cited by examiner

*Primary Examiner* — Robert S Loewe

(74) *Attorney, Agent, or Firm* — The PL Law Group, PLLC

(57) ABSTRACT

An organic electric element according to an embodiment of the present disclosure includes a first electrode, a second electrode, and an organic material layer formed between the first electrode and the second electrode. The organic material layer includes compounds represented by Formula 1 and Formula 2 of the present invention, thereby the driving voltage the organic electric element can be lowered, and the luminous efficiency and the life time of the organic electric element can be improved.

19 Claims, 3 Drawing Sheets

ORGANIC ELECTRIC ELEMENT COMPRISING ORGANIC COMPOUND AND ELECTRONIC DEVICE THEREOF

CROSS REFERENCE TO RELATED APPLICATIONS AND CLAIM OF PRIORITY

This application claims benefit under 35 U.S.C. 119, 120, 121, or 365(c), and is a National Stage entry from International Application No. PCT/KR2020/014520, filed Oct. 22, 2020, which claims priority to the benefit of Korean Patent Application No. 10-2019-0161865 filed in the Korean Intellectual Property Office on Dec. 6, 2019, the entire contents of which are incorporated herein by reference.

BACKGROUND

1. Technical Field

The present invention relates to organic electric element comprising organic compound and electronic device thereof.

2. Background Art

In general, an organic light emitting phenomenon refers to a phenomenon in which electric energy is converted into light energy of an organic material. An organic electric element utilizing the organic light emitting phenomenon usually has a structure including an anode, a cathode, and an organic material layer interposed therebetween. In many cases, the organic material layer has a multi-layered structure having respectively different materials in order to improve efficiency and stability of an organic electric element, and for example, may comprise a hole injection layer, a hole transport layer, a light emitting layer, an electron transport layer, an electron injection layer, or the like.

Materials used as an organic material layer in an organic electric element may be classified into a light emitting material and a charge transport material, for example, a hole injection material, a hole transport material, an electron transport material, an electron injection material, and the like according to its function. Further, the light emitting material may be divided into a high molecular weight type and a low molecular weight type according to its molecular weight, and may also be divided into a fluorescent material derived from excited singlet states of electron and a phosphorescent material derived from excited triplet states of electron according to its light emitting mechanism. Further, the light emitting material may be divided into blue, green, and red light emitting material and yellow and orange light emitting material required for better natural color reproduction according to its light emitting color.

Meanwhile, when only one material is used as a light emitting material, there occur problems of shift of a maximum luminescence wavelength to a longer wavelength due to intermolecular interactions and lowering of the efficiency of a corresponding element due to deterioration in color purity or a reduction in luminous efficiency. On account of this, a host/dopant system may be used as the light emitting material in order to enhance the color purity and increase the luminous efficiency through energy transfer. This is based on the principle that if a small amount of dopant having a smaller energy band gap than a host forming a light emitting layer is mixed in the light emitting layer, then excitons generated in the light emitting layer are transported to the dopant, thus emitting light with high efficiency. With regard to this, since the wavelength of the host is shifted to the wavelength band of the dopant, light having a desired wavelength can be obtained according the type of the dopant.

Currently, the power consumption is required more than more as size of display becomes larger and larger in the portable display market. Therefore, the power consumption is very important factor in the portable display with a limited power source of the battery, and efficiency and life span issues are also solved.

Efficiency, life span, driving voltage, and the like are correlated with each other. If efficiency is increased, then driving voltage is relatively lowered, and the crystallization of an organic material due to Joule heating generated during operation is reduced as driving voltage is lowered. As a result, life span tens to increase. However, efficiency cannot be maximized only by simply improving the organic material layer. This is because long life span and high efficiency can be simultaneously achieved when an optimal combination of energy levels and Ti values, inherent material properties (mobility, interfacial properties, etc.), and the like among the respective layers included in the organic material layer is given.

Therefore, there is a need to develop host material that has high thermal stability and can efficiently a charge balance in the light-emitting layer.

SUMMARY

An objection of the present invention is to provide organic electric element comprising the compound capable of lowering a driving voltage and improving luminous efficiency and lifetime of the element, and electronic device thereof.

The present invention provides organic electric element including compound represented by the following Formulas 1 and 2 in a light-emitting layer, and electronic device thereof.

<Formula 1>

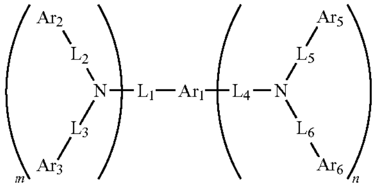

<Formula 2>

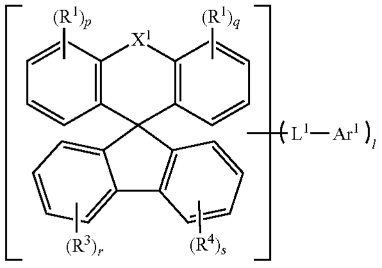

By employing the mixture of compound represented by Formula 1 and compound represented by Formula 2 of the present invention as material of a light emitting layer, the driving voltage of the element can be lowered, and the luminous efficiency and lifespan of the element can be improved.

DETAILED DESCRIPTION

Figure 1:
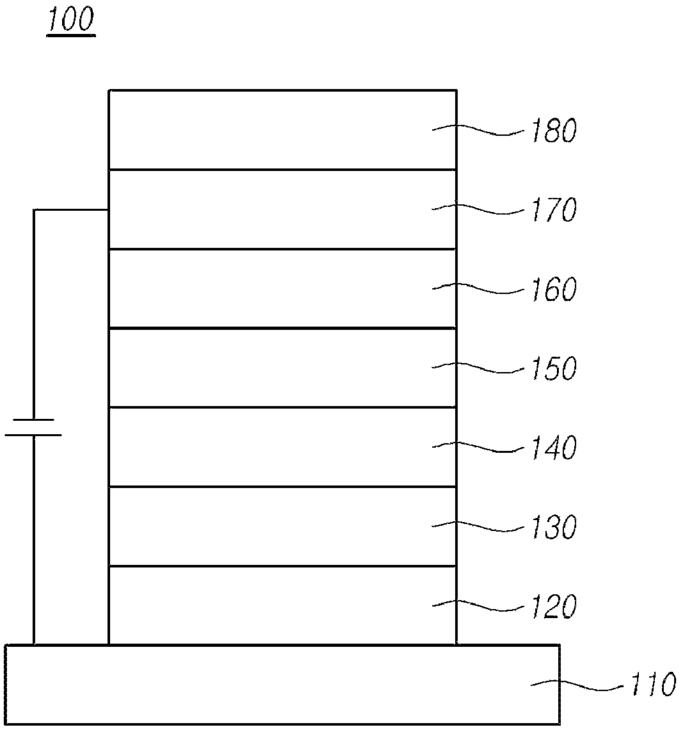
FIGS. 1 to 3 illustrate an example of organic electroluminescent element according to the present invention.

Unless otherwise stated, the term "aryl group" and "arylene group" as used herein has, but not limited to, 6 to 60 carbon atoms. The aryl group or arylene group in the present invention may comprise a monocyclic ring, ring assemblies, a fused polycyclic system, spiro compounds and the like.

As used herein, the term "fluorenyl group" refers to a substituted or unsubstituted fluorenyl group, "fluorenylene group" refers to a substituted or unsubstituted fluorenyl group. The fluorenyl group or fluorenylene group used in the present invention comprises a spiro compound formed by combining R and R' with each other in the following structure, and also comprises compound formed by linking adjacent R"s to each other. "Substituted fluorenyl group", "substituted fluorenylene group" means that at least one of R, R', R" in the following structure is a substituent other than hydrogen, and R" may be 1 to 8 in the following formula.

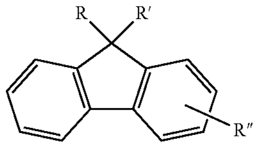

The term "spiro compound" as used herein has a spiro union which means union having one atom as the only common member of two rings. The common atom is designated as 'spiro atom'. The compounds are defined as 'monospiro-', 'dispiro-' or 'trispiro-' depending on the number of spiro atoms in one compound.

In addition, "fluorenyl group", "fluorenylene group", etc. as used herein are 9,9-dimethyl-9H-fluorene, 9,9-diphenyl-9H-fluorene, 9,9'-spirofluorene, spiro[benzo[b]fluorene-11, 9'-fluorene], benzo[b]fluorene, 11,11-diphenyl-11H-benzo [b]fluorene, 9-(naphthalen-2-yl)9-phenyl-9H-fluorene and the like.

The term "heterocyclic group" used in the specification comprises a non-aromatic ring as well as an aromatic ring like "heteroaryl group" or "heteroarylene group". Unless otherwise stated, the term "heterocyclic group" means, but not limited to, a ring containing one or more heteroatoms and having 2 to 60 carbon atoms. Unless otherwise stated, the term "heteroatom" as used herein represents N, O, S, P or Si and the heterocyclic group means a monocyclic, ring assemblies, fused polycyclic system or spiro compound containing a heteroatom. In addition, heterocyclic group comprises compound comprising the heteroatom group such as $SO_2$, P=O and the like instead of carbon forming a ring like the following compound.

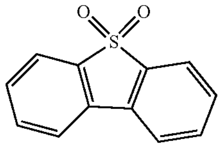 [SMILES: O=S1(=O)c2ccccc2-c2ccccc21]

The term "aliphatic ring group" as used herein refers to a cyclic hydrocarbon except for aromatic hydrocarbons, and comprises a monocyclic ring, ring assemblies, a fused polycyclic system, spiro compounds, and the like, and unless otherwise stated, it means a ring of 3 to 60 carbon atoms, but not limited thereto. For example, a fused ring formed by benzene being an aromatic ring with cyclohexane being a non-aromatic ring corresponds to aliphatic ring group.

In this specification, a 'group name' corresponding to an aryl group, an arylene group, a heterocyclic group, and the like exemplified for each symbol and its substituent may be written in the name of functional group reflecting the valence, and may also be described as the name of a parent compound. For example, in the case of phenanthrene which is a kind of aryl group, it may be described by distinguishing valence such as 'phenanthryl (group)' when it is 'monovalent group', and as 'phenanthrylene (group)' when it is 'divalent group', and it may also be described as 'phenanthrene' being a parent compound name, regardless of its valence. Similarly, in the case of pyrimidine, it may be described as 'pyrimidine' regardless of its valence, and it may also be described as the name of corresponding functional group such as pyrimidinyl (group) when it is 'monovalent group', and as 'pyrimidylene (group)' when it is 'divalent group'.

In addition, in the present specification, the numbers and alphabets indicating a position may be omitted when describing a compound name or a substituent name, For example, pyrido[4,3-d]pyrimidine, benzopuro[2,3-d]pyrimidine and 9,9-dimethyl-9H-fluorene can be described as pyridopyrimidine, benzofurropyrimidine and dimethylfluorene, respectively. Therefore, both benzo[g]quinoxaline and benzo[f]quinoxaline can be described as benzoquinoxaline.

In addition, unless expressly stated, the formula used in the present invention is applied in the same way as the definition of the substituent by the exponential definition of the following formula.

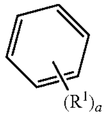

In the above formula, when a is an integer of zero, the substituent IV is absent, that is, hydrogen atoms are bonded to all the carbons constituting the benzene ring. Here, formulas or compounds can be described while omitting the representation of hydrogen bonded to carbon. In addition, one substituent IV is bonded to any one carbon of the carbons forming the benzene ring when "a" is an integer of 1, when "a" is an integer of 2 or 3, substituents $R^1$s may be bonded to the carbons of the benzene ring, for example, as followings and, when "a" is an integer of 4 to 6, substituents $R^1$s are bonded to the carbons of the benzene ring in a similar manner. Further, when "a" is an integer of 2 or more, $R^1$s may be the same as or different from each other.

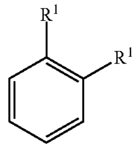
(a = 2)

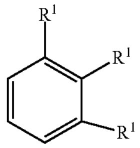
(a = 3)

In addition, unless otherwise described herein, when referring to a condensed/fused ring, the number in the 'number-condensed ring' indicates the number of condensed rings. For example, a form in which three rings are condensed with each other, such as anthracene, phenanthrene, benzoquinazoline, and the like, may be represented by a 3-condensed ring.

In addition, unless otherwise described herein, in the case of expressing a ring in the form of a 'number-membered' such as a 5-membered ring or a 6-membered ring, the number in the 'number-membered' represents the number of atoms forming the ring. For example, thiophene or furan may correspond to a 5-membered ring, and benzene or pyridine may correspond to a 6-membered ring.

In addition, unless otherwise described herein, a ring formed by bonding adjacent groups to each other may be selected from the group consisting of a $C_6$-$C_{60}$ aromatic ring group, a fluorenyl group, a $C_2$-$C_{60}$ heterocyclic group containing at least one heteroatom selected from the group consisting of O, N, S, Si, and P, and a $C_3$-$C_{60}$ aliphatic ring. Unless otherwise stated, the term "between neighboring groups", for an example, in the following Formulas, comprises not only "between $R_1$ and $R_2$", "between $R_2$ and $R_3$", "between $R_3$ and $R_4$", "between $R_5$ and $R_6$", but also "between $R_7$ and $R_8$" sharing one carbon, and may comprise "between substituents" attached to atoms (carbon or nitrogen) making up a ring such as "between $R_1$ and $R_7$", "between $R_1$ and $R_8$", or "between $R_4$ and $R_5$" and the like, which are not directly neighboring. That is, when there is substituent bonded to directly neighboring element such as carbon or nitrogen constituting a ring, the substituent may correspond to neighboring group, when no substituent is bonded to element constituting a ring at directly neighboring position, a substituent bonded to a next element constituting a ring may correspond to neighboring group, and substituents bonded to the same carbons constituting a ring may also be neighboring groups.

In the following Formulas, when the substituents bonded to the same carbon, such as $R_7$ and $R_8$, are linked to each other to form a ring, a compound containing a spiro-moiety may be formed.

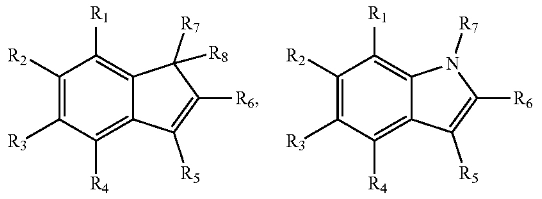

In addition, in the present specification, the expression 'neighboring (adjacent) groups may be linked to each other to form a ring' is used in the same sense as 'neighboring groups are linked selectively to each other to form a ring', and a case where at least one pair of neighboring groups may be bonded to each other to form a ring.

In addition, unless otherwise specified in the present specification, an aryl group, an arylene group, a fluorenyl group, a fluorenylene group, a heterocyclic group, an aliphatic ring group, an alkyl group, an alkenyl group, an alkynyl group, an alkoxy group, an aryloxy group, and a ring formed by linking neighboring groups to each other may be each optionally substituted with one or more substituents selected from the group consisting of deuterium, halogen, a silane group unsubstituted or substituted with a $C_1$-$C_{20}$ alkyl group or a $C_6$-$C_{20}$ aryl group, a phosphine oxide group unsubstituted or substituted with a $C_1$-$C_{20}$ alkyl group or a $C_6$-$C_{20}$ aryl group, a siloxane group, a cyano group, a nitro group, a $C_1$-$C_{20}$ alkylthio group, a $C_1$-$C_{20}$ alkoxy group, a $C_6$-$C_{20}$ aryloxy group, a $C_6$-$C_{20}$ arylthio, a $C_1$-$C_{20}$ alkyl group, a $C_2$-$C_{20}$ alkenyl group, a $C_2$-$C_{20}$ alkynyl group, a $C_6$-$C_{20}$ aryl group, a fluorenyl group, a $C_2$-$C_{20}$ heterocyclic group containing at least one heteroatom of O, N, S, Si, and P, and a $C_3$-$C_{20}$ aliphatic ring group.

Hereinafter, referring to FIGS. 1 to 3, a lamination structure of an organic electric element including compound of the present invention will be described.

In designation of reference numerals to components in respective drawings, it should be noted that the same elements will be designated by the same reference numerals although they are shown in different drawings. In addition, in describing the present invention, the detailed description of related and well-known configurations and functions will be omitted when it may make the subject matter of the present invention rather unclear.

In describing the present invention, terms, such as first, second, A, B, (a), (b) or the like may be used. These terms are only for distinguishing the component from other components, and the essence, order, or order of the component is not limited by the term. It will be understood that the expression "one component is "connected," "coupled" or "joined" to another component" comprises the case where a third component may be "connected," "coupled," and "joined" between the first and second components as well as the case where the first component may be directly connected, coupled or joined to the second component.

In addition, it will be understood that when an element such as a layer, film, region or substrate is referred to as being "on" or "over" another element, it can be directly on the other element or intervening elements may also be present. In contrast, when an element is referred to as being "directly on" another element, there are no intervening elements present.

Figure 2:
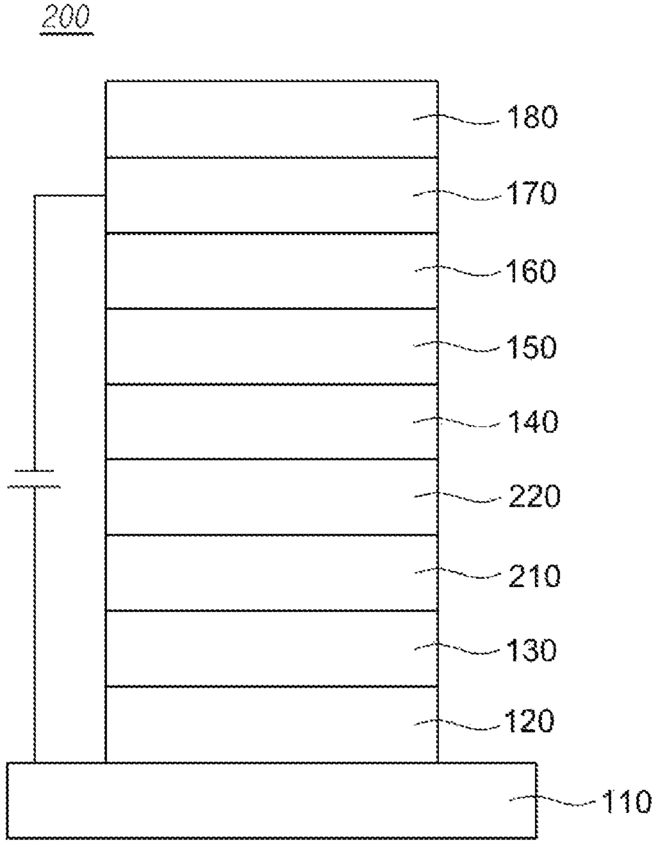
Figure 3:
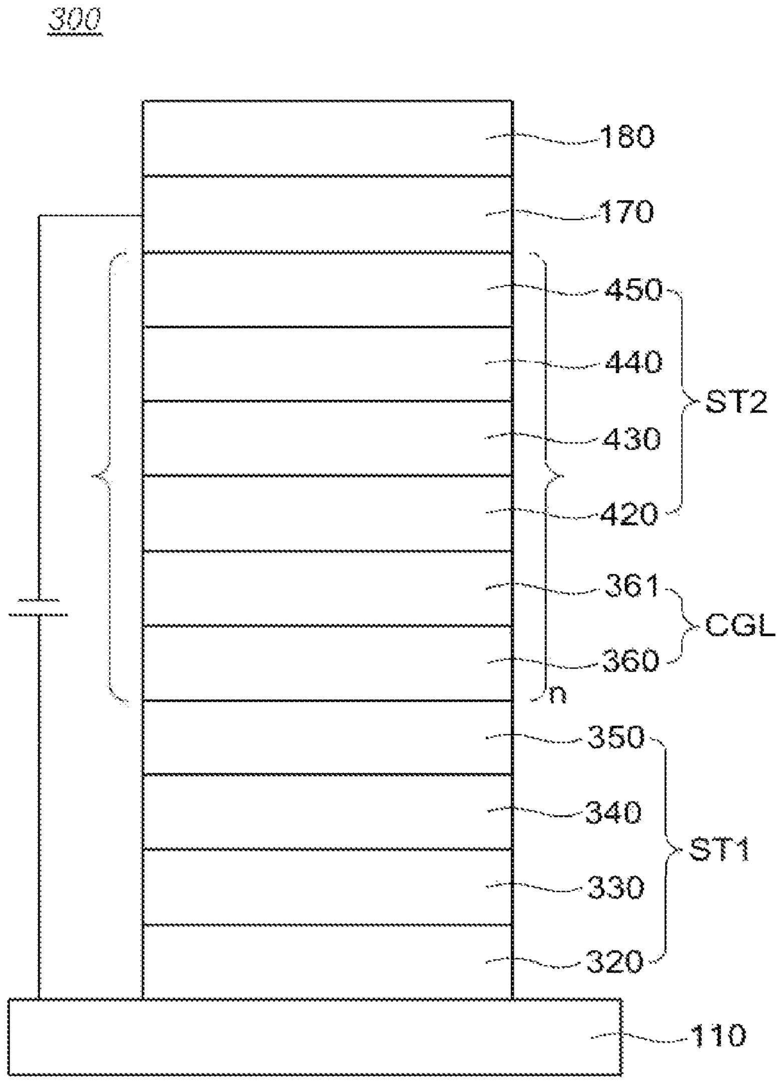

The FIGS. 1 to 3 are laminated structures showing an example of an organic electric element according to an embodiment of the present invention, respectively.

Referring to the FIG. 1, an organic electric element 100 according to an embodiment of the present invention includes a first electrode 110 formed on a substrate (not shown), a second electrode 170, and an organic material layer formed between the first electrode 110 and the second electrode 170.

The first electrode 110 may be an anode (positive electrode), and the second electrode 170 may be a cathode (negative electrode). In the case of an inverted organic electric element, the first electrode may be a cathode, and the second electrode may be an anode.

The organic material layer may be comprised a hole injection layer 120, a hole transport layer 130, a light emitting layer 140, an electron transport layer 150, and an electron injection layer 160. Specifically, a hole injection layer 120, a hole transport layer 130, a light emitting layer 140, an electron transport layer 150, and an electron injection layer 160 are formed on the first electrode 110 in sequence.

Preferably, a layer for improving the luminous efficiency 180 may be formed one side of sides of the first electrode 110 or the second electrode 170, wherein the one side is not facing the organic material layer, as a result the luminous efficiency of an organic electric element can be improved.

For example, the light efficiency improving layer 180 may be formed on the second electrode 170, as a result, in the case of a top emission organic light emitting diode, the optical energy loss due to Surface Plasmon Polaritons (SPPs) at the second electrode 170 may be reduced and in the case of a bottom emission organic light emitting diode, the light efficiency improving layer 180 may serve as a buffer for the second electrode 170.

A buffer layer or an emission-auxiliary layer may be further formed between the hole transport layer 130 and the light emitting layer 140, which will be described with reference to FIG. 2.

Referring to FIG. 2, the organic electric element 200 according to another embodiment of the present invention may comprise a hole injection layer 120, a hole transport layer 130, a buffer layer 210, an emission-auxiliary layer 220, a light emitting layer 140, an electron transport layer 150, an electron injection layer 160, and a second electrode 170 sequentially formed on a first electrode 110, and a light efficiency improving layer 180 may be formed on the second electrode 170.

Although not shown in FIG. 2, an electron transport auxiliary layer may be further formed between the light emitting layer 140 and the electron transport layer 150.

In addition, according to another embodiment of the present invention, the organic material layer may be a form consisting of a plurality of stacks, wherein the stacks comprise a hole transport layer, a light emitting layer, and an electron transport layer, respectively. This will be described with reference to FIG. 3.

Referring to FIG. 3, two or more sets of stacks of organic material layers ST1 and ST2 may be formed between a first electrode 110 and a second electrode 170 of organic electric element 300 according to another embodiment of the present invention, wherein the organic material layers are consisted of multiple layers, respectively, and a charge generation layer CGL may be formed between the stacks of the organic material layer.

Specifically, organic electric element according to the embodiment of the present invention may comprise a first electrode 110, a first stack ST1, a charge generation layer CGL, a second stack ST2, and a second electrode 170 and a light efficiency improving layer 180.

The first stack ST1 is an organic layer formed on the first electrode 110, and the first stack ST1 may comprise a first hole injection layer 320, a first hole transport layer 330, a first light emitting layer 340 and a first electron transport layer 350 and the second stack ST2 may comprise a second hole injection layer 420, a second hole transport layer 430, a second light emitting layer 440 and a second electron transport layer 450. Like this, the first stack and the second stack may be organic material layers having the same or different stacked-structures.

The charge generation layer CGL may be formed between the first stack ST1 and the second stack ST2. The charge generation layer CGL may comprise a first charge generation layer 360 and a second charge generation layer 361. The charge generating layer CGL is formed between a first light emitting layer 340 and a second light emitting layer 440 to increase the current efficiency generated in each of light emitting layers and to smoothly distribute charges.

The first light emitting layer 340 may comprise light emitting material comprising blue host doped with blue fluorescent dopant and the second light emitting layer 440 may comprise light emitting material comprising green host doped with greenish yellow dopant and red dopant together, but the material of the first light emitting layer 340 and the second light emitting layer 440 according to an embodiment of the present invention is not limited thereto.

In FIG. 3, n may be an integer of 1 to 5 and the charge generation layer CGL and the third stack may be further stacked on the second stack ST2 when n is 2.

When a plurality of light emitting layers are formed in a multi-layer stack structure as shown in FIG. 3, it is possible to manufacture organic electroluminescent element that emits not only white light but also various colors, wherein the white light is emitted by the mixing effect of light emitted from each of light emitting layers.

Even if the core is the same core, the band gap, the electrical characteristics, the interface characteristics and the like may be different depending on which substituent is bonded at which position. Therefore, it is necessary to study the selection of the core and a combination of the core and the sub-substituent bonded to the core. In particular, long life span and high efficiency can be simultaneously achieved when the optimal combination of energy levels and Ti values, inherent material properties (mobility, interfacial properties, etc.), and the like among the respective layers of an organic material layer is achieved.

Therefore, energy level and Ti value between the respective layers of the organic material layer, inherent material properties (mobility, interfacial properties, etc.) and the like can be optimized by using compounds represented by Formula 1 and the compound represented by Formula 2 as hosts for the light emitting layers 140, 340, and 440, and thus it is possible to simultaneously improve the lifetime and efficiency of the organic electric element.

Organic electric element according to an embodiment of the present invention may be manufactured using various deposition methods. Organic electric element according to an embodiment of the present invention may be manufactured using a PVD (physical vapor deposition) method or CVD (chemical vapor deposition) method. For example, organic electric element may be manufactured by depositing a metal, conductive metal oxide or a mixture thereof on the substrate to form an anode 110, forming an organic material layer comprising a hole injection layer 120, a hole transport layer 130, a light emitting layer 140, an electron transport layer 150, and an electron injection layer 160 on the anode, and then depositing material used as the cathode 170 on the organic material layer. Also, an emission-auxiliary layer 220 may be formed between a hole transport layer 130 and a light emitting layer 140, and an electron transport auxiliary layer (not shown) may be further formed between a light emitting layer 140 and an electron transport layer 150 and, as described above, a stack structure may be formed.

In addition, the organic material layer may be manufactured in such a manner that the fewer layers are formed using various polymer materials by a soluble process or solvent process, for example, spin coating, nozzle printing, inkjet printing, slot coating, dip coating, roll-to-roll, doctor blading, screen printing, or thermal transfer, instead of deposition. Since the organic material layer according to the present invention may be formed in various ways, the scope of protection of the present invention is not limited by a method forming the organic material layer.

Organic electric element according to an embodiment of the present invention may be of a top emission type, a bottom emission type, or a dual emission type depending on the material used.

In addition, organic electric element according to an embodiment of the present invention may be selected from the group consisting of an organic light emitting diode, an organic solar cell, an organic photo conductor, an organic transistor, an element for monochromatic illumination and an element for quantum dot display.

Another embodiment of the present invention provides an electronic device including a display device which includes the above described organic electric element, and a control unit for controlling the display device. Here, the electronic device may be a wired/wireless communication terminal which is currently used or will be used in the future, and covers all kinds of electronic devices including a mobile communication terminal such as a cellular phone, a personal digital assistant (PDA), an electronic dictionary, a point-to-multipoint (PMP), a remote controller, a navigation unit, a game player, various kinds of TVs, and various kinds of computers.

Hereinafter, an organic electric element according to one aspect of the present invention will be described.

An organic electric element according to one aspect of the present invention comprises a first electrode, a second electrode, and an organic material layer formed between the first electrode and the second electrode, wherein the organic material layer comprises a phosphorescent light emitting layer, and the host of the phosphorescent light emitting layer comprises a first compound represented by the following Formula 1 and a second compound represented by the following Formula 2.

<Formula 1>

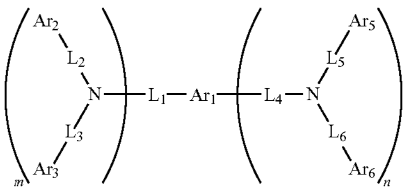

<Formula 2>

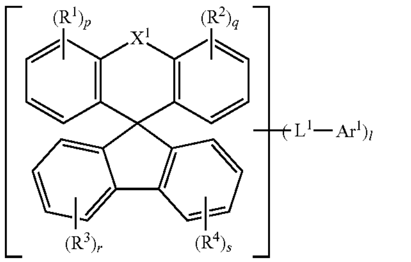

First, Formula 1 will be described.

In Formula 1, each of symbols may be defined as follows.

$Ar_1$ to $Ar_3$, $Ar_5$ and $Ar_6$ are each independently selected from the group consisting of a $C_6$-$C_{60}$ aryl group, a fluorenyl group, a $C_2$-$C_{60}$ heterocyclic group comprising at least one heteroatom selected from the group consisting of O, N, S, Si and P, a $C_3$-$C_{60}$ aliphatic ring, and -L'-N($R_a$)($R_b$).

$L_1$ to $L_6$ are each independently selected from the group consisting of a single bond, a $C_6$-$C_{60}$ arylene group, a fluorenylene group, a $C_3$-$C_{60}$ aliphatic ring, and a $C_2$-$C_{60}$ heterocyclic group comprising at least one heteroatom selected from the group consisting of O, N, S, Si and P.

n is 0 or 1, m is 1 or 2, and when m is 2, each of a plurality of $L_2$s, each of a plurality of $L_3$s, each of a plurality of $Ar_2$s, and each of a plurality of $Ar_3$s are the same as or different from each other.

L' is selected from the group consisting of a single bond, a $C_6$-$C_{60}$ arylene group, a fluorenylene group, a $C_3$-$C_{60}$ aliphatic ring, a $C_2$-$C_{60}$ heterocyclic group comprising at least one heteroatom selected from the group consisting of O, N, S, Si and P, and a combination thereof.

$R_a$ and $R_b$ are each independently selected from the group consisting of a $C_6$-$C_{60}$ aryl group, a fluorenyl group, a $C_3$-$C_{60}$ aliphatic ring, and a $C_2$-$C_{60}$ heterocyclic group comprising at least one heteroatom selected from the group consisting of O, N, S, Si and P.

When at least one of $Ar_1$-$Ar_3$, $Ar_5$, $Ar_6$, $R_a$ and $R_b$ is an aryl group, the aryl group may be, for example, a $C_6$-$C_{30}$, a $C_6$-$C_{25}$, a $C_6$-$C_{18}$, a $C_6$-$C_{16}$, a $C_6$-$C_{14}$, a $C_6$-$C_{12}$, a $C_6$, a $C_{10}$, a $C_{12}$, a $C_{14}$, a $C_{16}$ or a $C_{18}$ aryl group, specifically, phenyl, biphenyl, naphthyl, terphenyl, phenanthrene, triphenylene, or the like.

When at least one of $L_1$-$L_6$ and L' is an arylene group, the arylene group may be, for example, a $C_6$-$C_{30}$, a $C_6$-$C_{25}$, a $C_6$-$C_{18}$, a $C_6$-$C_{16}$, a $C_6$-$C_{14}$, a $C_6$-$C_{12}$, a $C_6$, a $C_{10}$, a $C_{12}$, a $C_{14}$, a $C_{16}$ or a $C_{18}$ arylene group, specifically, phenyl, biphenyl, naphthyl, terphenyl, or the like.

When at least one of $Ar_1$-$Ar_3$, $Ar_5$, $Ar_6$, $R_a$, $R_b$, $L_1$-$L_6$ and L' is a heterocyclic group, the heterocyclic group may be, for example, a $C_2$-$C_{30}$, a $C_2$-$C_{26}$, a $C_2$-$C_{24}$, a $C_2$-$C_{23}$, a $C_2$-$C_{21}$, a $C_2$-$C_{20}$, a $C_2$-$C_{19}$, a $C_2$-$C_{18}$, a $C_2$-$C_{16}$, a $C_2$-$C_{14}$, a $C_2$-$C_{13}$, a $C_2$-$C_{12}$, a $C_2$-$C_{11}$, a $C_2$-$C_{10}$, a $C_2$-$C_9$, a $C_2$-$C_8$, a $C_2$-$C_7$, a $C_2$-$C_6$, a $C_2$-$C_5$, a $C_2$-$C_4$, a $C_2$-$C_3$, a $C_2$, a $C_3$, a $C_4$, a $C_5$, a $C_6$, a $C_7$, a $C_8$, a $C_9$, a $C_{10}$, a $C_{11}$, a $C_{12}$, a $C_{13}$, a $C_{14}$, a $C_{15}$, a $C_{16}$, a $C_{17}$, a $C_{18}$, a $C_{19}$, a $C_{20}$, a $C_{21}$, a $C_{22}$, a $C_{23}$ or a $C_{24}$ heterocyclic group, specifically, pyridine, pyrimidine, pyrazine, pyridazine, triazine, furan, thiophene, pyrrole, silole, indene, indole, phenyl-indole, benzoindole, phenyl-benzoindole, benzofuran, benzothiophene, benzoimidazole, benzothiazole, benzoxazole, benzosilole, dibenzofuran, dibenzothiophene, carbazole, quinoline, isoquinoline, benzoquinoline, quinoxaline, quinazoline, phenanthroline, naphthobenzothiophene, naphthobenzofuran, phenyl-carbazole, benzocarbazole, phenyl-benzocarbazole, naphthyl-benzocarbazole, dibenzocarbazole, indolocarbazole, benzofuropyridine, benzothienopyridine, benzofuropyridine, benzofuropyrimidine, phenanthrobenzothiophene, phenanthrobenzofuran, dinaphthothiophene, dinaphthofuran, phenanthroline, and the like.

When at least one of $Ar_1$-$Ar_3$, $Ar_5$, $Ar_6$, $R_a$ and $R_b$ is a fluorenyl group or at least one of $L_1$-$L_6$ is a fluorenylene group, the fluorenyl group or fluorenylene group may be, for example, 9,9-dimethyl-9H-fluorene, 9,9-diphenyl-9H-fluorene, 9,9'-spirobifluorene, spiro[benzo[b]fluorene-11,9'-fluorene], benzo[b]fluorene, 11,11-diphenyl-11H-benzo[b]fluorene, 9-(naphthalen-2-yl)9-phenyl-9H-fluorene, and the like.

When at least one of $Ar_1$-$Ar_3$, $Ar_5$, $Ar_6$, $R_a$ and $R_b$ is an alkyl group, the alkyl group may be, for example, a $C_1$-$C_{20}$, a $C_1$-$C_{10}$, a $C_1$-$C_4$, a $C_1$, a $C_2$, a $C_3$ or a $C_4$ alkyl group, specifically, methyl, t-butyl, or the like.

When at least one of $Ar_1$-$Ar_3$, $Ar_5$, $Ar_6$, $R_a$ and $R_b$ is an alkenyl group, the alkenyl group may be, for example, a $C_2$-$C_{20}$, a $C_2$-$C_{10}$, a $C_2$-$C_4$, a $C_2$-$C_3$, a $C_2$, a $C_3$, a $C_4$ alkenyl group, specifically, methylene, ethylene, propylene, or the like.

For example, Formula 1 may be represented by one of the following Formula 1-A-1 to Formula 1-A-5.

<Formula 1-A-1>

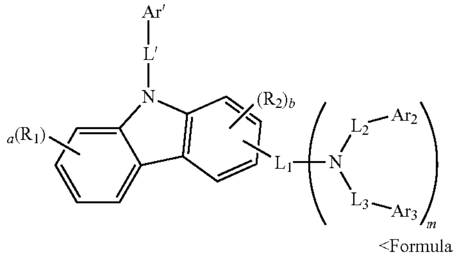

<Formula 1-A-2>

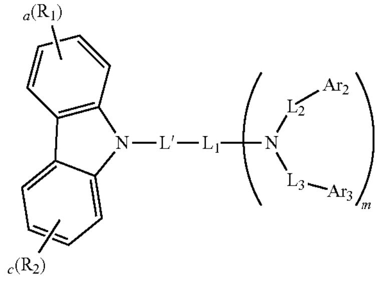

<Formula 1-A-3>

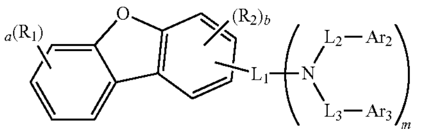

<Formula 1-A-4>

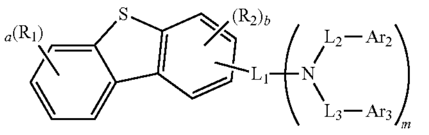

<Formula 1-A-5>

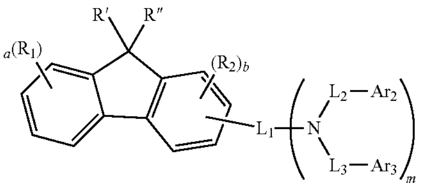

In Formulas 1-A-1 to Formula 1-A-5, $L_1$ to $L_3$, $Ar_2$, $Ar_3$ and m are the same as defined for Formula 1.

L' is selected from the group consisting of a single bond, a $C_6$-$C_{20}$ arylene group, a fluorenylene group, a $C_2$-$C_{20}$ heterocyclic group comprising at least one heteroatom selected from the group consisting of O, N, S, Si and P, and a $C_3$-$C_{20}$ aliphatic ring.

Ar' is selected from the group consisting of a $C_6$-$C_{20}$ aryl group, a fluorenyl group, a $C_2$-$C_{20}$ heterocyclic group containing at least one heteroatom of O, N, S, Si, and P, and a $C_3$-$C_{20}$ aliphatic ring group.

$R_1$, $R_2$, R' and R" are each independently selected from the group consisting of hydrogen, deuterium, halogen, a silane group unsubstituted or substituted with a $C_1$-$C_{20}$ alkyl group or a $C_6$-$C_{20}$ aryl group, a cyano group, a nitro group, a $C_1$-$C_{20}$ alkylthio group, a $C_1$-$C_{20}$ alkoxy group, a $C_6$-$C_{20}$ aryloxy group, a $C_6$-$C_{20}$ arylthio, a $C_1$-$C_{20}$ alkyl group, a $C_2$-$C_{20}$ alkenyl group, a $C_2$-$C_{20}$ alkynyl group, a $C_6$-$C_{20}$ aryl group, a fluorenyl group, a $C_2$-$C_{20}$ heterocyclic group containing at least one heteroatom of O, N, S, Si, and P, and a $C_3$-$C_{20}$ aliphatic ring group, and neighboring groups may be linked to each other to form a ring.

Here, the term 'neighboring groups' may mean, for example, neighboring $R_1$s, neighboring $R_2$s, R' and R".

a and c are each an integer of 0-4, b is an integer of 0-3, and where each of these is an integer of 2 or more, each of $R_1$s and each of $R_2$s are the same as or different from each other.

When L' is an arylene group, the arylene group may be, for example, a $C_6$-$C_{18}$, a $C_6$-$C_{16}$, a $C_6$-$C_{14}$, a $C_6$-$C_{12}$, a $C_6$, a $C_{10}$, a $C_{12}$, a $C_{14}$, a $C_{16}$ or a $C_{18}$ arylene group.

When Ar', $R_1$, $R_2$, R' and R" are an aryl group, the aryl group may be, for example, a $C_6$-$C_{18}$, a $C_6$-$C_{16}$, a $C_6$-$C_{14}$, a $C_6$-$C_{12}$, a $C_6$, a $C_{10}$, a $C_{12}$, a $C_{14}$, a $C_{16}$ or a $C_{18}$ aryl group.

When L', Ar', $R_1$, $R_2$, R' and R" are further substituted with a heterocyclic group, the heterocyclic group may be, for example, a $C_2$-$C_{18}$, a $C_2$-$C_{16}$, a $C_2$-$C_{14}$, a $C_2$-$C_{13}$, a $C_2$-$C_{12}$, a $C_2$-$C_{11}$, a $C_2$-$C_{10}$, a $C_2$-$C_9$, a $C_2$-$C_8$, a $C_2$-$C_7$, a $C_2$-$C_6$, a $C_2$-$C_5$, a $C_2$-$C_4$, a $C_2$-$C_3$, a $C_2$, a $C_3$, a $C_4$, a $C_5$, a $C_6$, a $C_7$, a $C_8$, a $C_9$, a $C_{10}$, a $C_{11}$, a $C_{12}$, a $C_{13}$, a $C_{14}$, a $C_{15}$, a $C_{16}$, a $C_{17}$, a $C_{18}$ heterocyclic group.

For example, Formula 1-A-1 may be represented by Formula 1-A-1a or 1-A-1b.

<Formula 1-A-1a>

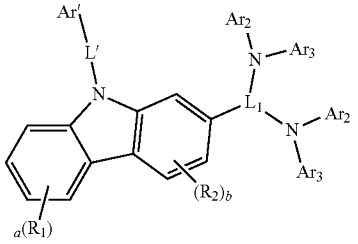

<Formula 1-A-1b>

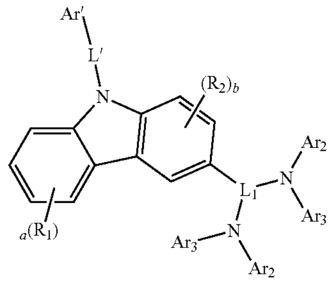

In Formulas 1-A-1a and 1-A-1b, each of symbols is the same as defined for Formula 1-A-1.

For example, Formula 11 may be represented by one of the following Formula 1-B-1 to Formula 1-B-4.

<Formula 1-B-1>

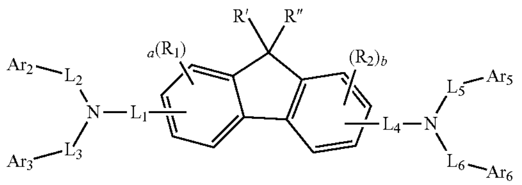

-continued

<Formula 1-B-2>

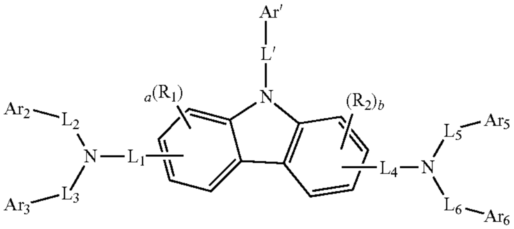

<Formula 1-B-3>

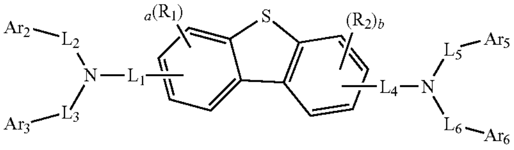

<Formula 1-B-4>

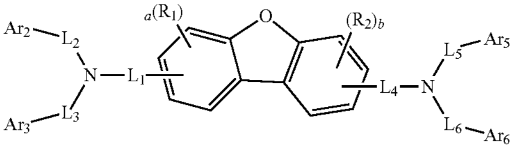

In Formulas 1-B-1 to 1-B-4, a and b are each an integer of 0-3, and where each of these is an integer of 2 or more, each of $R_1$s and each of $R_2$s are the same as or different from each other, and the rest of the symbols are the same as defined for Formulas 1-A-1 to 1-A-5.

For example, Formula 1 may be represented by one of the following Formula 1-C-1 to Formula 1-C-4.

<Formula 1-C-1>

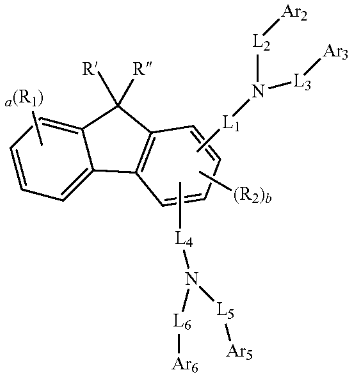

<Formula 1-C-2>

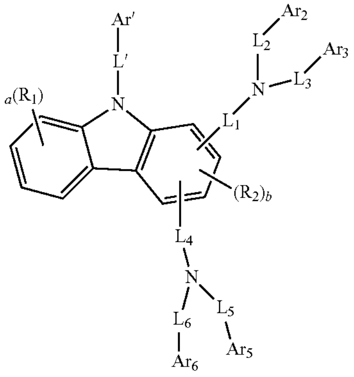

-continued

<Formula 1-C-3>

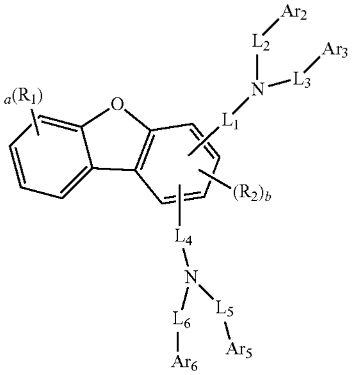

<Formula 1-C-4>

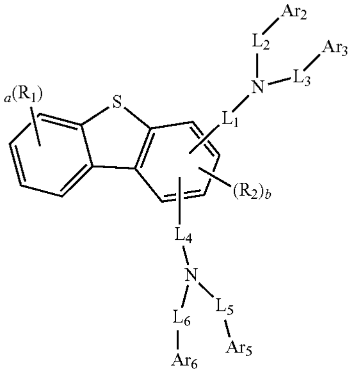

In Formulas 1-C-1 to Formula 1-C-4, a is an integer of 0-4, b is an integer of 0-2, and where each of these is an integer of 2 or more, each of $R_1$s and each of $R_2$s are the same as or different from each other.

For example, Formula 1 may be represented by one of the following Formula 1-D-1 to Formula 1-D-3 or by one of the following Formula 1-E-1 to Formula 1-E-5.

<Formula 1-D-1>

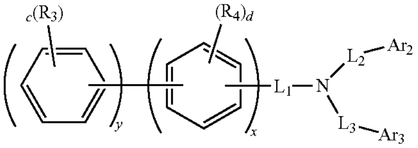

<Formula 1-D-2>

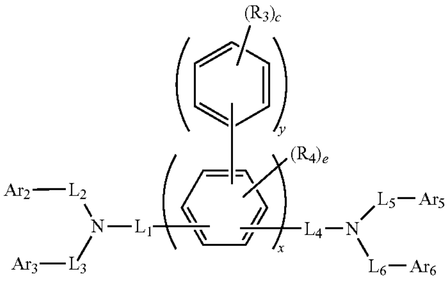

-continued

<Formula 1-D-3>

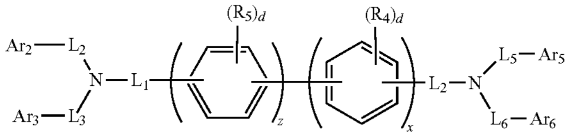

<Formula 1-E-1>

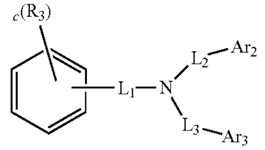

<Formula 1-E-2>

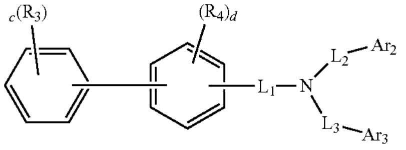

<Formula 1-E-3>

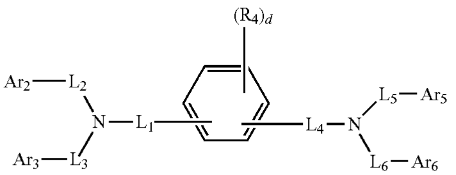

<Formula 1-E-4>

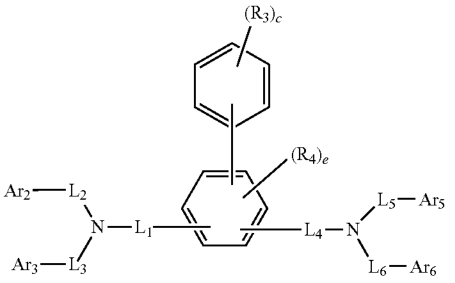

<Formula 1-E-5>

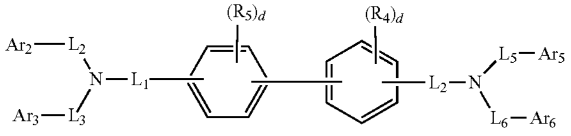

In Formulas 1-D-1 to 1-D-3, and 1-E-1 to 1-E-5, x is an integer of 1-2, y is an integer of 0-1, z is an integer of 1-2, c is an integer of 0-5, d is an integer of 0-4, e is an integer of 0-3, and when c, d and e are each an integer of 2 or more, each of $R_3$s, each of $R_4$s, and each of $R_5$s are the same as or different from each other, and the rest of symbols are the same as defined in Formula 1.

In Formula 1 and each of the related formulas, each of symbols may be further substituted. For example, $Ar_1$-$Ar_3$, $Ar_5$, $Ar_6$, $L_1$-$L_6$, L', $R_a$, $R_b$, $R_1$-$R_5$, R', R", Ar' and the ring formed by linking neighboring groups to each other may be each substituted with one or more substituents selected from the group consisting of deuterium, halogen, a silane group unsubstituted or substituted with a $C_1$-$C_{20}$ alkyl group or a $C_6$-$C_{20}$ aryl group, a siloxane group, a cyano group, a nitro group, a $C_1$-$C_{20}$ alkylthio group, a $C_1$-$C_{20}$ alkoxy group, a $C_6$-$C_{20}$ aryloxy group, a $C_6$-$C_{20}$ arylthio, a $C_1$-$C_{20}$ alkyl group, a $C_2$-$C_{20}$ alkenyl group, a $C_2$-$C_{20}$ alkynyl group, a $C_6$-$C_{20}$ aryl group, a fluorenyl group, a $C_2$-$C_{20}$ heterocyclic group containing at least one heteroatom of O, N, S, Si, and P, a $C_3$-$C_{20}$ aliphatic ring group, a $C_7$-$C_{20}$ arylalkyl group, and a $C_5$-$C_{20}$ arylalkenyl group.

When at least one of $Ar_1$-$Ar_3$, $Ar_5$, $Ar_6$, $L_1$-$L_6$, L', $R_a$, $R_b$, $R_1$-$R_5$, R', R", Ar' and the ring formed by linking neighboring groups to each other is further substituted with an aryl group, the aryl group may be, for example, a $C_6$-$C_{18}$, a $C_6$-$C_{16}$, a $C_6$-$C_{14}$, a $C_6$-$C_{12}$, a $C_6$, a $C_{10}$, a $C_{12}$, a $C_{14}$, a $C_{16}$ or a $C_{18}$ aryl group.

When at least one of $Ar_1$-$Ar_3$, $Ar_5$, $Ar_6$, $L_1$-$L_6$, L', $R_a$, $R_b$, $R_1$-$R_5$, R', R", Ar' and the ring formed by linking neighboring groups to each other is further substituted with a heterocyclic group, the heterocyclic group may be, for example, a $C_2$-$C_{18}$, a $C_2$-$C_{16}$, a $C_2$-$C_{14}$, a $C_2$-$C_{13}$, a $C_2$-$C_{12}$, a $C_2$-$C_{11}$, a $C_2$-$C_{10}$, a $C_2$-$C_9$, a $C_2$-$C_8$, a $C_2$-$C_7$, a $C_2$-$C_6$, a $C_2$-$C_5$, a $C_2$-$C_4$, a $C_2$-$C_3$, a $C_2$, a $C_3$, a $C_4$, a $C_5$, a $C_6$, a $C_7$, a $C_8$, a $C_9$, a $C_{10}$, a $C_{11}$, a $C_{12}$, a $C_{13}$, a $C_{14}$, a $C_{15}$, a $C_{16}$, a $C_{17}$ or a $C_{18}$ heterocyclic group.

When at least one of $Ar_1$-$Ar_3$, $Ar_5$, $Ar_6$, $L_1$-$L_6$, L', $R_a$, $R_b$, $R_1$-$R_5$, R', R", Ar' and the ring formed by linking neighboring groups to each other is further substituted with an alkyl group, the alkyl group may be, for example, a $C_1$-$C_{20}$, a $C_1$-$C_{10}$, a $C_1$-$C_4$, a $C_1$, a $C_2$, a $C_3$ or a $C_4$ alkyl group.

When at least one of $Ar_1$-$Ar_3$, $Ar_5$, $Ar_6$, $L_1$-$L_6$, L', $R_a$, $R_b$, $R_1$-$R_5$, R', R", Ar' and the ring formed by linking neighboring groups to each other is further substituted with a silane group substituted with an alkyl group, the alkyl group may be, for example, a $C_1$-$C_{10}$, a $C_1$-$C_4$, a $C_1$, a $C_2$, a $C_3$ or a $C_4$ alkyl group.

Next, the following Formula 2 will be described.

<Formula 2>

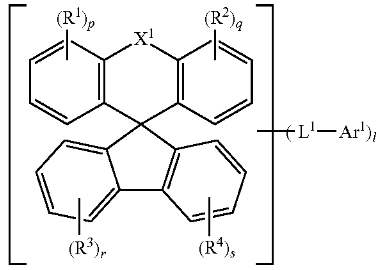

In Formula 2, each of symbols may be defined as follows.

In Formula 2, -(L1-Ar1) may be bonded to any of the four benzene rings constituting the backbone.

$X^1$ is N-$L^a$-$Ar^a$, O or S.

IV to $R^4$ are each independently selected from the group consisting of hydrogen, deuterium, halogen, a cyano group, a nitro group, a $C_6$-$C_{60}$ aryl group, a fluorenyl group, a $C_2$-$C_{60}$ heterocyclic group comprising at least one heteroatom selected from the group consisting of O, N, S, Si and P, a $C_3$-$C_{60}$ aliphatic ring, a $C_1$-$C_{30}$ alkyl group, a $C_2$-$C_{30}$ alkenyl group, a $C_2$-$C_{30}$ alkynyl group, a $C_1$-$C_{30}$ alkoxyl group, a $C_6$-$C_{30}$ aryloxy group and -L'-N($R_a$)($R_b$), and neighboring groups may be bonded to each other to form a ring. Here, the term 'neighboring groups' means, for example, neighboring $R^1$s, neighboring $R^2$s, neighboring $R^3$s, neighboring $R^4$s, neighboring $R^1$ and $L^a$, neighboring $R^1$ and $Ar^a$, neighboring $R^2$ and $L^a$, neighboring $R^1$ and $Ar^a$ or the like.

p, q, r and s are an integer of 0 to 4, and where each of these is an integer of 2 or more, each of $R^1$s, each of $R^2$s, each of $R^3$s and each of $R^4$s are the same as or different from each other, $Ar^1$ is selected from the group consisting of a $C_6$-$C_{60}$ aryl group, a fluorenyl group, a $C_2$-$C_{60}$ heterocyclic group comprising at least one heteroatom selected from the group consisting of O, N, S, Si and P, a $C_3$-$C_{60}$ aliphatic ring, and -L'-N($R_a$)($R_b$), $L^1$ is selected from the group consisting of a single bond, a $C_6$-$C_{60}$ arylene group, a fluorenylene group, a $C_3$-$C_{60}$ aliphatic ring, and a $C_2$-$C_{60}$ heterocyclic group comprising at least one heteroatom selected from the group consisting of O, N, S, Si and P.

l is an integer of 0 to 4, and l is not 0 when $X^1$ is O or S. When l is an integer of 2 or more, each of the plurality of $L^1$s and each of the plurality of $Ar^1$s are the same as or different from each other.

L' and $L^a$ are each independently selected from the group consisting of a single bond, a $C_6$-$C_{60}$ arylene group, a fluorenylene group, a $C_3$-$C_{60}$ aliphatic ring, a $C_2$-$C_{60}$ heterocyclic group comprising at least one heteroatom selected from the group consisting of O, N, S, Si and P, and a combination thereof.

$R_a$, $R_b$ and $Ar^a$ are each independently selected from the group consisting of a $C_6$-$C_{60}$ aryl group, a fluorenyl group, a $C_3$-$C_{60}$ aliphatic ring, and a $C_2$-$C_{60}$ heterocyclic group comprising at least one heteroatom selected from the group consisting of O, N, S, Si and P.

When at least one of $R^1$-$R^4$, $Ar^1$ is an aryl group, the aryl group may be, for example, a $C_6$-$C_{30}$, a $C_6$-$C_{25}$, a $C_6$-$C_{18}$, a $C_6$-$C_{16}$, a $C_6$-$C_{14}$, a $C_6$-$C_{12}$, a $C_6$, a $C_{10}$, a $C_{12}$, a $C_{14}$, a $C_{16}$ or a $C_{18}$ aryl group, specifically, phenyl, biphenyl, naphthyl, terphenyl, phenanthrene, triphenylene, or the like.

When $L^1$ is an arylene group, the arylene group may be, for example, a $C_6$-$C_{30}$, a $C_6$-$C_{25}$, a $C_6$-$C_{18}$, a $C_6$-$C_{16}$, a $C_6$-$C_{14}$, a $C_6$-$C_{12}$, a $C_6$, a $C_{10}$, a $C_{12}$, a $C_{14}$, a $C_{16}$ or a $C_{18}$ arylene group, specifically, phenylene, biphenyl, naphthylene, terphenyl, or the like.

When at least one of $R^1$-$R^4$, $L^1$ is a heterocyclic group, the heterocyclic group may be, for example, a $C_2$-$C_{30}$, a $C_2$-$C_{26}$, a $C_2$-$C_{24}$, a $C_2$-$C_{23}$, a $C_2$-$C_{21}$, a $C_2$-$C_{20}$, a $C_2$-$C_{19}$, a $C_2$-$C_{18}$, a $C_2$-$C_{16}$, a $C_2$-$C_{14}$, a $C_2$-$C_{13}$, a $C_2$-$C_{12}$, a $C_2$-$C_{11}$, a $C_2$-$C_{10}$, a $C_2$-$C_9$, a $C_2$-$C_8$, a $C_2$-$C_7$, a $C_2$-$C_6$, a $C_2$-$C_5$, a $C_2$-$C_4$, a $C_2$-$C_3$, a $C_2$, a $C_3$, a $C_4$, a $C_5$, a $C_6$, a $C_7$, a $C_8$, a $C_9$, a $C_{10}$, a $C_{11}$, a $C_{12}$, a $C_{13}$, a $C_{14}$, a $C_{15}$, a $C_{16}$, a Cr, a $C_{18}$, a $C_{19}$, a $C_{20}$, a $C_{21}$, a $C_{22}$, a $C_{23}$ or a $C_{24}$ heterocyclic group, specifically, pyridine, pyrimidine, pyrazine, pyridazine, triazine, indene, indole, phenyl-indole, benzoindole, phenylbenzoindole, benzofuran, benzothiophene, dibenzofuran, dibenzothiophene, carbazole, quinoline, isoquinoline, benzoquinoline, quinoxaline, quinazoline, phenanthroline, naphthobenzothiophene, naphthobenzofuran, phenyl-carbazole, benzocarbazole, dinaphthothiophene, dinaphthofuran, phenanthroline, and the like.

When at least one of L' and $L^a$ is an arylene group, the arylene group may be, for example, a $C_6$-$C_{18}$, a $C_6$-$C_{16}$, a $C_6$-$C_{14}$, a $C_6$-$C_{12}$, a $C_6$, a $C_{10}$, a $C_{12}$, a $C_{14}$, a $C_{16}$ or a $C_{18}$ arylene group.

When at least one of L' and $L^a$ is a heterocyclic group, the heterocyclic group may be, for example, a $C_2$-$C_{18}$, a $C_2$-$C_{16}$, a $C_2$-$C_{14}$, a $C_2$-$C_{13}$, a $C_2$-$C_{12}$, a $C_2$-$C_{11}$, a $C_2$-$C_{10}$, a $C_2$-$C_9$, a $C_2$-$C_8$, a $C_2$-$C_7$, a $C_2$-$C_6$, a $C_2$-$C_5$, a $C_2$-$C_4$, a $C_2$-$C_3$, a $C_2$, a $C_3$, a $C_4$, a $C_5$, a $C_6$, a $C_7$, a $C_8$, a $C_9$, a $C_{10}$, a $C_{11}$, a $C_{12}$, a $C_{13}$, a $C_{14}$, a $C_{15}$, a $C_{16}$, a $C_{17}$ or a $C_{18}$ heterocyclic group, When at least one of $R_a$, $R_b$ and $Ar^a$ is an aryl group, the aryl group may be, for example, a $C_6$-$C_{18}$, a $C_6$-$C_{16}$, a $C_6$-$C_{14}$, a $C_6$-$C_{12}$, a $C_6$, a $C_{10}$, a $C_{12}$, a $C_{14}$, a $C_{16}$ or a $C_{18}$ aryl group.

When at least one of $R_a$, $R_b$ and $Ar^a$ is a heterocyclic group, the heterocyclic group may be, for example, a $C_2$-$C_{18}$, a $C_2$-$C_{16}$, a $C_2$-$C_{14}$, a $C_2$-$C_{13}$, a $C_2$-$C_{12}$, a $C_2$-$C_{11}$, a $C_2$-$C_{10}$, a $C_2$-$C_9$, a $C_2$-$C_8$, a $C_2$-$C_7$, a $C_2$-$C_6$, a $C_2$-$C_5$, a $C_2$-$C_4$, a $C_2$-$C_3$, a $C_2$, a $C_3$, a $C_4$, a $C_5$, a $C_6$, a $C_7$, a $C_8$, a $C_9$, a $C_{10}$, a $C_{11}$, a $C_{12}$, a $C_{13}$, a $C_{14}$, a $C_{15}$, a $C_{16}$, a $C_{17}$ or a $C_{18}$ heterocyclic group.

When at least one of $R^1$-$R^4$, $Ar^1$, $R_a$, $R_b$ and $Ar^a$ is a fluorenyl group or $L^1$ is a fluorenylene group, the fluorenyl group or fluorenylene group may be, for example, 9,9-dimethyl-9H-fluorene, 9,9-diphenyl-9H-fluorene, 9,9'-spirobifluorene, spiro[benzo[b]fluorene-11,9'-fluorene], benzo[b]fluorene, 11,11-diphenyl-11H-benzo[b]fluorene, 9-(naphthalen-2-yl)9-phenyl-9H-fluorene, and the like.

When at least one of $R^1$-$R^4$ is an alkyl group, the alkyl group may be, for example, a $C_1$-$C_{20}$, a $C_1$-$C_{10}$, a $C_1$-$C_4$, a $C_1$, a $C_2$, a $C_3$ or a $C_4$ alkyl group, specifically, methyl, t-butyl, or the like.

For example, the ring formed by linking neighboring $R^1$s to each other, neighboring $R^2$s to each other, neighboring $R^3$s to each other, or neighboring $R^4$s to each other may be a ring represented by one of the following Formulas F-1 to F-4.

<Formula F-1>

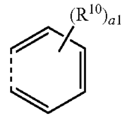

<Formula F-2>

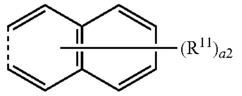

<Formula F-3>

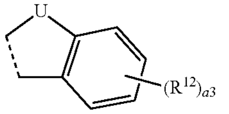

<Formula F-4>

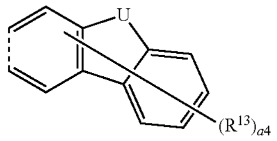

In Formulas F-1 to F-4, the dotted line is the condensation site, and U is N-$L_a$-$Ar_a$, C(R')(R"), O or S.

$R^{10}$ to $R^{13}$, R' and R" are each independently selected from the group consisting of hydrogen, deuterium, halogen, a silane group unsubstituted or substituted with a $C_1$-$C_{20}$ alkyl group or a $C_6$-$C_{20}$ aryl group, a cyano group, a nitro group, a $C_1$-$C_{20}$ alkylthio group, a $C_1$-$C_{20}$ alkoxy group, a $C_6$-$C_{20}$ aryloxy group, a $C_6$-$C_{20}$ arylthio, a $C_1$-$C_{20}$ alkyl group, a $C_2$-$C_{20}$ alkenyl group, a $C_2$-$C_{20}$ alkynyl group, a $C_6$-$C_{20}$ aryl group, a fluorenyl group, a $C_2$-$C_{20}$ heterocyclic group containing at least one heteroatom of O, N, S, Si, and P, and a $C_3$-$C_{20}$ aliphatic ring group, and neighboring groups may be linked to each other to form a ring. Here, the term 'neighboring groups' may mean neighboring $R^{10}$s, neighboring $R^{11}$s, neighboring $R^{12}$s, neighboring $R^{13}$s, R' and R", and the like.

a1 and a3 are each an integer of 0-4, a2 and a4 are each an integer of 0-6, and where each of these is an integer of 2 or more, each of $R^{10}$s, each of $R^{11}$s, each of $R^{12}$s and each of $R^{13}$s are the same as or different from each other.

$L_a$ is selected from the group consisting of a single bond, a $C_6$-$C_{20}$ arylene group, a fluorenylene group, a $C_2$-$C_{20}$ heterocyclic group comprising at least one heteroatom selected from the group consisting of O, N, S, Si and P, and a $C_3$-$C_{20}$ aliphatic ring.

$Ar_a$ is selected from the group consisting of a $C_6$-$C_{20}$ aryl group, a fluorenyl group, a $C_2$-$C_{20}$ heterocyclic group containing at least one heteroatom of O, N, S, Si, and P, and a $C_3$-$C_{20}$ aliphatic ring group.

When at least one of $R^{10}$-$R^{13}$, R', R" and $Ar_a$ is an aryl group, the aryl group may be, for example, a $C_6$-$C_{18}$, a $C_6$-$C_{16}$, a $C_6$-$C_{14}$, a $C_6$-$C_{12}$, a $C_6$, a $C_{10}$, a $C_{12}$, a $C_{14}$, a $C_{16}$ or a $C_{18}$ aryl group.

When $L_a$ is an arylene group, the arylene group may be, for example, a $C_6$-$C_{18}$, a $C_6$-$C_{16}$, a $C_6$-$C_{14}$, a $C_6$-$C_{12}$, a $C_6$, a $C_{10}$, a $C_{12}$, a $C_{14}$, a $C_{16}$ or a $C_{18}$ arylene group.

When at least one of $R^{10}$-$R^{13}$, R', R", $Ar_a$ and $L_a$ are a heterocyclic group, the heterocyclic group may be, for example, a $C_2$-$C_{18}$, a $C_2$-$C_{16}$, a $C_2$-$C_{14}$, a $C_2$-$C_{13}$, a $C_2$-$C_{12}$, a $C_2$-$C_{11}$, a $C_2$-$C_{10}$, a $C_2$-$C_9$, a $C_2$-$C_8$, a $C_2$-$C_7$, a $C_2$-$C_6$, a $C_2$-$C_5$, a $C_2$-$C_4$, a $C_2$-$C_3$, a $C_2$, a $C_3$, a $C_4$, a $C_5$, a $C_6$, a $C_7$, a $C_8$, a $C_9$, a $C_{10}$, a $C_{11}$, a $C_{12}$, a $C_{13}$, a $C_{14}$, a $C_{15}$, a $C_{16}$, a $C_{17}$, a $C_{18}$ heterocyclic group.

For example, in Formula 2, $R^1$-$R^4$ may be represented by one of Formula S-1 or S-2 below.

<Formula S-1>

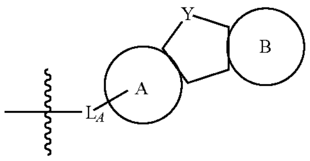

<Formula S-2>

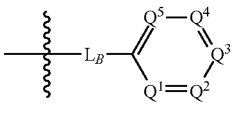

In Formulas S-1 and S-2, Y is N-$L_a$-$Ar_a$, C(R')(R"), O or S, and $Q^1$ to $Q^5$ are each independently N or C(R').

$L_A$, $L_B$ and $L_a$ are each independently from the group consisting of a single bond, a $C_6$-$C_{20}$ arylene group, a fluorenylene group, a $C_2$-$C_{20}$ heterocyclic group comprising at least one heteroatom selected from the group consisting of O, N, S, Si and P, and a $C_3$-$C_{20}$ aliphatic ring.

$Ar_a$ is selected from the group consisting of a $C_6$-$C_{20}$ aryl group, a fluorenyl group, a $C_2$-$C_{20}$ heterocyclic group containing at least one heteroatom of O, N, S, Si, and P, and a $C_3$-$C_{20}$ aliphatic ring group.

R' and R" are each independently selected from the group consisting of hydrogen, deuterium, halogen, a silane group unsubstituted or substituted with a $C_1$-$C_{20}$ alkyl group or a $C_6$-$C_{20}$ aryl group, a cyano group, a nitro group, a $C_1$-$C_{20}$ alkylthio group, a $C_1$-$C_{20}$ alkoxy group, a $C_6$-$C_{20}$ aryloxy group, a $C_6$-$C_{20}$ arylthio, a $C_1$-$C_{20}$ alkyl group, a $C_2$-$C_{20}$ alkenyl group, a $C_2$-$C_{20}$ alkynyl group, a $C_6$-$C_{20}$ aryl group, a fluorenyl group, a $C_2$-$C_{20}$ heterocyclic group containing at least one heteroatom of O, N, S, Si, and P, and a $C_3$-$C_{20}$ aliphatic ring group, and adjacent groups may be linked to each other to form a ring, and R' and R" may be linked to each other to form a ring.

A ring formed by linking adjacent R's to each other or R' and R" groups to each other may be selected from the group consisting of a $C_6$-$C_{60}$ aromatic ring group, a fluorenyl group, a $C_2$-$C_{60}$ heterocyclic group containing at least one heteroatom of O, N, S, Si, and P, and a $C_3$-$C_{60}$ aliphatic ring group. For example, in C(R'), when adjacent R's are linked to each other to form an aromatic ring formed, the aromatic ring may be a $C_6$-$C_{30}$, a $C_6$-$C_{25}$, a $C_6$-$C_{18}$, a $C_6$-$C_{16}$, a $C_6$-$C_{14}$, a $C_6$-$C_{12}$, a $C_6$, a $C_{10}$, a $C_{12}$, a $C_{14}$, a $C_{16}$ or a $C_{18}$ aromatic ring, for example, benzene, naphthalene, phenanthrene, or the like, and in C(R')(R"), when a R' and R" are linked to each other to form a ring, a compound having a spirobifluorene skeleton may be formed.

When at least one of $L_A$, $L_B$ and $L_a$ is an arylene group, the arylene group may be, for example, a $C_6$-$C_{18}$, a $C_6$-$C_{16}$, a $C_6$-$C_{14}$, a $C_6$-$C_{12}$, a $C_6$, a $C_{10}$, a $C_{12}$, a $C_{14}$, a $C_{16}$ or a $C_{18}$ arylene group.

When at least one of $Ar_a$, R' and R" is an aryl group, the aryl group may be, for example, a $C_6$-$C_{18}$, a $C_6$-$C_{16}$, a $C_6$-$C_{14}$, a $C_6$-$C_{12}$, a $C_6$, a $C_{10}$, a $C_{12}$, a $C_{14}$, a $C_{16}$ or a $C_{18}$ aryl group.

When at least one of $L_A$, $L_B$, $L_a$, $Ar_a$, R' and R" is a heterocyclic group, the heterocyclic group may be, for example a $C_2$-$C_{18}$, a $C_2$-$C_{16}$, a $C_2$-$C_{14}$, a $C_2$-$C_{13}$, a $C_2$-$C_{12}$, a $C_2$-$C_{11}$, a $C_2$-$C_{10}$, a $C_2$-$C_9$, a $C_2$-$C_8$, a $C_2$-$C_7$, a $C_2$-$C_6$, a $C_2$-$C_5$, a $C_2$-$C_4$, a $C_2$-$C_3$, a $C_2$, a $C_3$, a $C_4$, a $C_5$, a $C_6$, a $C_7$, a $C_8$, a $C_9$, a $C_{10}$, a $C_{11}$, a $C_{12}$, a $C_{13}$, a $C_{14}$, a $C_{15}$, a $C_{16}$, a $C_{17}$ or a $C_{18}$ heterocyclic group.

For example, A ring and B ring may be each selected from the following structures.

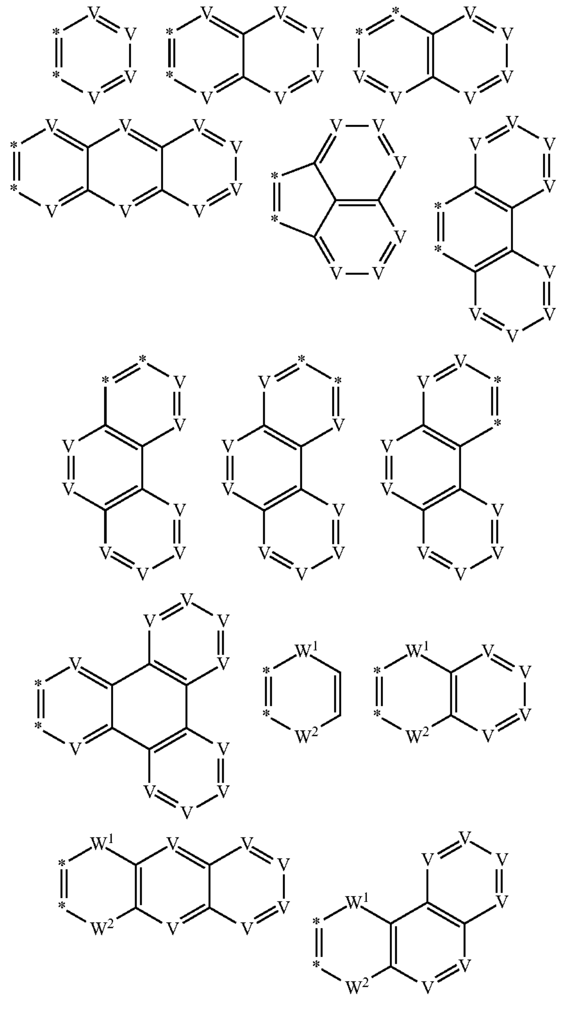

-continued

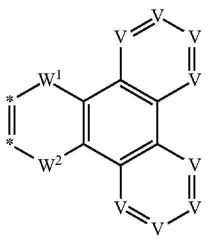

In the above structures, * indicates a condensed position, Vs are each N or C(R'), at least one of Vs is N, $W^1$ and $W^2$ are each independently a single bond, N-$L_a$-$Ar_a$, C(R')(R"), O or S, and R', R", $L_a$ and $Ar_a$ are the same as defined in the above.

For example, Formula 2 may be represented by one of the following Formulas 2-A to 2-D.

<Formula 2-A>

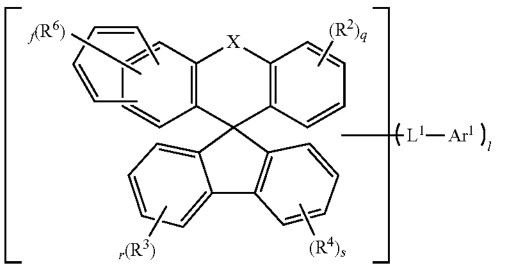

<Formula 2-B>

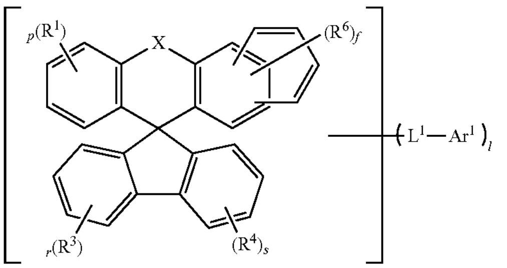

<Formula 2-C>

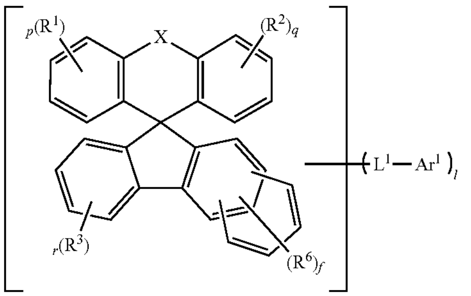

-continued

<Formula 2-D>

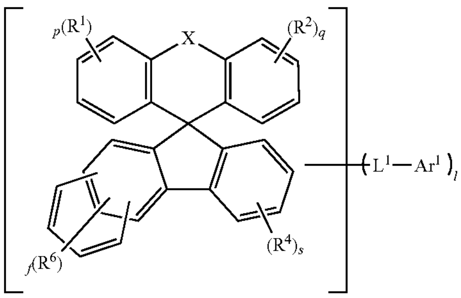

In Formulas 2-A to 2-D, X is the same as $X^1$ of formula 2, and the remaining symbols are as defined for Formula 2.

$R^6$ is selected from the group consisting of hydrogen, deuterium, halogen, a silane group unsubstituted or substituted with a $C_1$-$C_{20}$ alkyl group or a $C_6$-$C_{20}$ aryl group, a cyano group, a nitro group, a $C_1$-$C_{20}$ alkylthio group, a $C_1$-$C_{20}$ alkoxy group, a $C_6$-$C_{20}$ aryloxy group, a $C_6$-$C_{20}$ arylthio, a $C_1$-$C_{20}$ alkyl group, a $C_2$-$C_{20}$ alkenyl group, a $C_2$-$C_{20}$ alkynyl group, a $C_6$-$C_{20}$ aryl group, a fluorenyl group, a $C_2$-$C_{20}$ heterocyclic group containing at least one heteroatom of O, N, S, Si, and P, and a $C_3$-$C_{20}$ aliphatic ring group, and adjacent groups may be linked to each other to form a ring, f is an integer of 0-6, and when f is an integer of 2 or more, each of $R^6$s is the same as or different from each other.

When $R^6$ is an aryl group, the aryl group may be, for example, a $C_6$-$C_{18}$, a $C_6$-$C_{16}$, a $C_6$-$C_{14}$, a $C_6$-$C_{12}$, a $C_6$, a $C_{10}$, a $C_{12}$, a $C_{14}$, a $C_{16}$ or a $C_{18}$ aryl group.

When $R^6$ is a heterocyclic group, the heterocyclic group may be, for example, a $C_2$-$C_{18}$, a $C_2$-$C_{16}$, a $C_2$-$C_{14}$, a $C_2$-$C_{13}$, a $C_2$-$C_{12}$, a $C_2$-$C_{11}$, a $C_2$-$C_{10}$, a $C_2$-$C_9$, a $C_2$-$C_8$, a $C_2$-$C_7$, a $C_2$-$C_6$, a $C_2$-$C_5$, a $C_2$-$C_4$, a $C_2$-$C_3$, a $C_2$, a $C_3$, a $C_4$, a $C_5$, a $C_6$, a $C_7$, a $C_8$, a $C_9$, a $C_{10}$, a $C_{11}$, a $C_{12}$, a $C_{13}$, a $C_{14}$, a Cis, a $C_{16}$, a $C_{17}$, a Cis heterocyclic group.

For example, Formula 2 may be represented by one of the following Formulas 2-A-1 to 2-A-7.

<Formula 2-A-1>

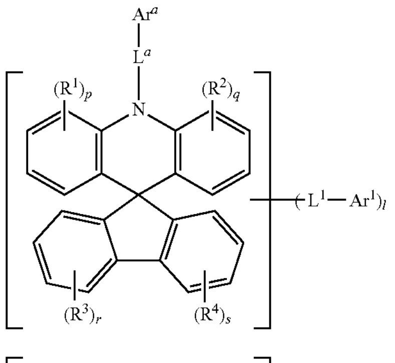

<Formula 2-A-2>

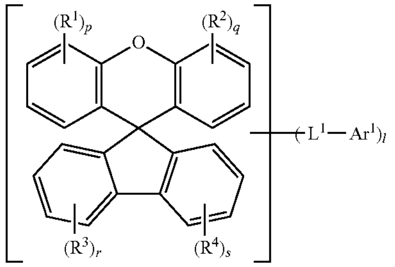

-continued

<Formula 2-A-3>

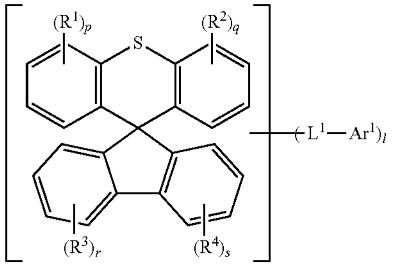

<Formula 2-A-4>

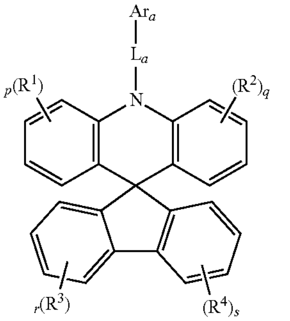

<Formula 2-A-5>

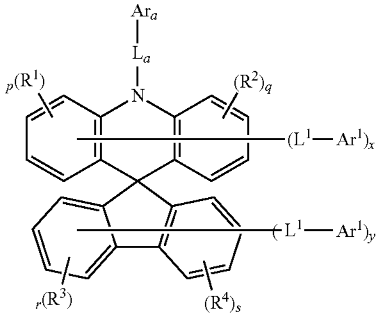

<Formula 2-A-6>

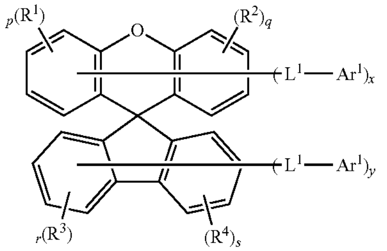

<Formula 2-A-7>

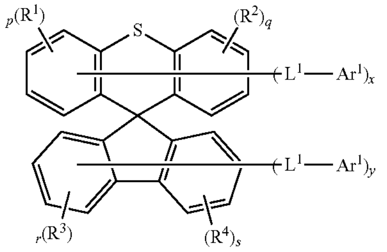

In Formulas 2-A-1 to 2-A-7, x and y are each an integer of 0-4, x+y is an integer of 1 or more, and the same symbols as those of Formula 2 are the same as defined for Formula 2. That is, $R^1$-$R^4$, $L^a$, $Ar^a$, $L^1$, p-s, l, etc. are the same as defined for Formula 2.

For example, Formula 2 may be represented by the following Formula 2-B-1.

<Formula 2-B-1>

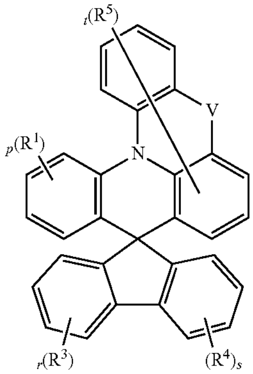

In Formula 2-B-1, the same symbols as those of Formula 2 are the same as defined for Formula 2.

V is N-$L_a$-$Ar_a$, C(R')(R"), O or S.

$R^5$, R' and R" are each independently selected from the group consisting of hydrogen, deuterium, halogen, a silane group unsubstituted or substituted with a $C_1$-$C_{20}$ alkyl group or a $C_6$-$C_{20}$ aryl group, a cyano group, a nitro group, a $C_1$-$C_{20}$ alkylthio group, a $C_1$-$C_{20}$ alkoxy group, a $C_6$-$C_{20}$ aryloxy group, a $C_6$-$C_{20}$ arylthio, a $C_1$-$C_{20}$ alkyl group, a $C_2$-$C_{20}$ alkenyl group, a $C_2$-$C_{20}$ alkynyl group, a $C_6$-$C_{20}$ aryl group, a fluorenyl group, a $C_2$-$C_{20}$ heterocyclic group containing at least one heteroatom of O, N, S, Si, and P, and a $C_3$-$C_{20}$ aliphatic ring group, and adjacent groups may be linked to each other to form a ring.

t is an integer of 0-7, and when t is an integer of 2 or more, each of $R^5$ s is the same as or different from each other.

$L_a$ is selected from the group consisting of a single bond, a $C_6$-$C_{20}$ arylene group, a fluorenylene group, a $C_2$-$C_{20}$ heterocyclic group comprising at least one heteroatom selected from the group consisting of O, N, S, Si and P, and a $C_3$-$C_{20}$ aliphatic ring.

$Ar_a$ is selected from the group consisting of a $C_6$-$C_{20}$ aryl group, a fluorenyl group, a $C_2$-$C_{20}$ heterocyclic group containing at least one heteroatom of O, N, S, Si, and P, and a $C_3$-$C_{20}$ aliphatic ring group.

When at least one of $R^5$, R', R" and $Ar_a$ is an aryl group, the aryl group may be, for example, a $C_6$-$C_{18}$, a $C_6$-$C_{16}$, a $C_6$-$C_{14}$, a $C_6$-$C_{12}$, a $C_6$, a $C_{10}$, a $C_{12}$, a $C_{14}$, a $C_{16}$ or a $C_{18}$ aryl group.

When $L_a$ is an arylene group, the arylene group may be, for example, a $C_6$-$C_{18}$, a $C_6$-$C_{16}$, a $C_6$-$C_{14}$, a $C_6$-$C_{12}$, a $C_6$, a $C_{10}$, a $C_{12}$, a $C_{14}$, a $C_{16}$ or a $C_{18}$ arylene group.

When at least one of $R^5$, R', R", $Ar_a$ and $L_a$ is a heterocyclic group, the heterocyclic group may be, for example, a $C_2$-$C_{18}$, a $C_2$-$C_{16}$, a $C_2$-$C_{14}$, a $C_2$-$C_{13}$, a $C_2$-$C_{12}$, a $C_2$-$C_{11}$, a $C_2$-$C_{10}$, a $C_2$-$C_9$, a $C_2$-$C_8$, a $C_2$-$C_7$, a $C_2$-$C_6$, a $C_2$-$C_5$, a $C_2$-$C_4$, a $C_2$-$C_3$, a $C_2$, a $C_3$, a $C_4$, a $C_5$, a $C_6$, a $C_7$, a $C_8$, a $C_9$, a $C_{10}$, a $C_{11}$, a $C_{12}$, a $C_{13}$, a $C_{14}$, a $C_{15}$, a $C_{16}$, a $C_{17}$, a $C_{18}$ heterocyclic group.

Formula 2-B-1 may be represented by one of the following Formula 2-E to Formula 2-H.

<Formula 2-E>

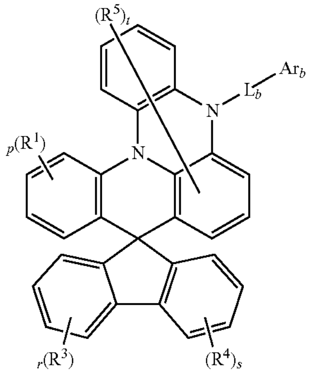

<Formula 2-F>

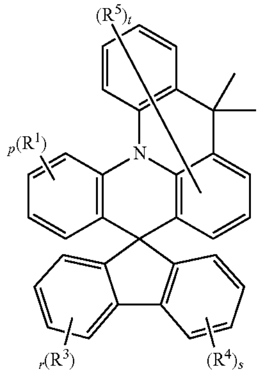

<Formula 2-G>

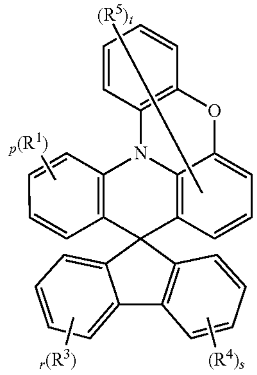

<Formula 2-H>

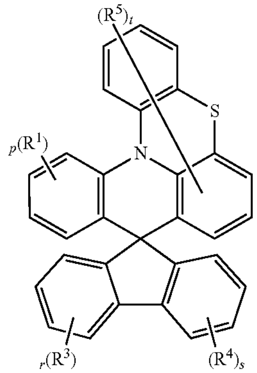

In Formulas 2-E to 2-H, each of symbols is the same as defined for Formula 2-B-1, $L_b$ is the same as $L_a$, and Am is the same as $Ar_a$.

For example, Formula 2 may be represented by one of the following Formulas 2-C-1 to 2-C-5.

<Formula 2-C-1>

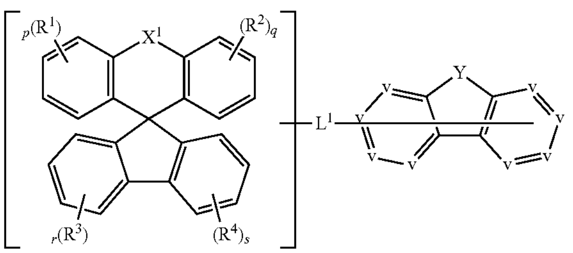

<Formula 2-C-2>

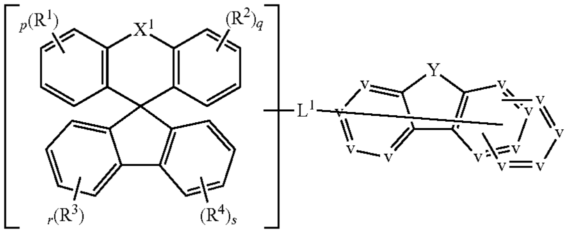

<Formula 2-C-3>

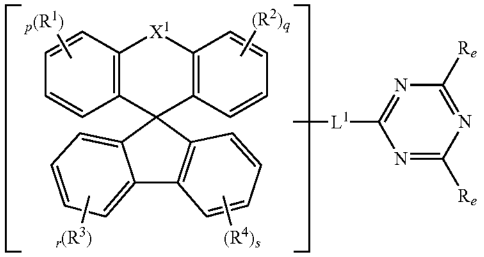

<Formula 2-C-4>

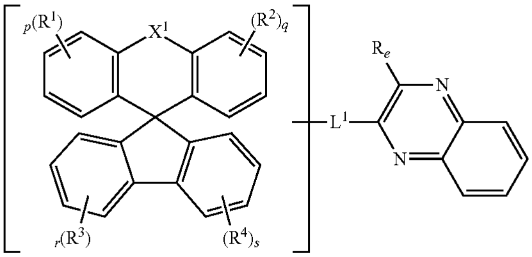

<Formula 2-C-5>

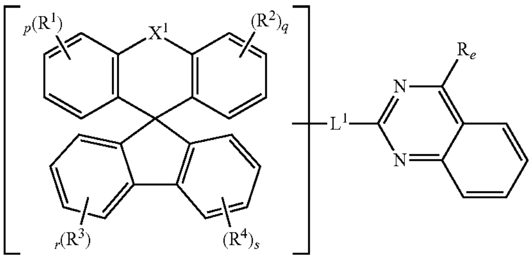

In Formulas 2-C-1 to 2-C-5, the same symbols as those of Formula 2 are the same as defined for Formula 2, Y is N-$L_a$-$Ar_a$, C(R')(R"), O or S, and Vs are each independently Nor C(R').

$R_e$, R' and R" are each independently selected from the group consisting of hydrogen, deuterium, halogen, a silane group unsubstituted or substituted with a $C_1$-$C_{20}$ alkyl group or a $C_6$-$C_{20}$ aryl group, a cyano group, a nitro group, a $C_1$-$C_{20}$ alkylthio group, a $C_1$-$C_{20}$ alkoxy group, a $C_6$-$C_{20}$ aryloxy group, a $C_6$-$C_{20}$ arylthio, a $C_1$-$C_{20}$ alkyl group, a $C_2$-$C_{20}$ alkenyl group, a $C_2$-$C_{20}$ alkynyl group, a $C_6$-$C_{20}$ aryl group, a fluorenyl group, a $C_2$-$C_{20}$ heterocyclic group containing at least one heteroatom of O, N, S, Si, and P, and a $C_3$-$C_{20}$ aliphatic ring group, and adjacent R's may be linked to each other to form a ring.

$L_a$ is selected from the group consisting of a single bond, a $C_6$-$C_{20}$ arylene group, a fluorenylene group, a $C_2$-$C_{20}$ heterocyclic group comprising at least one heteroatom selected from the group consisting of O, N, S, Si and P, and a $C_3$-$C_{20}$ aliphatic ring.

$Ar_a$ is selected from the group consisting of a $C_6$-$C_{20}$ aryl group, a fluorenyl group, a $C_2$-$C_{20}$ heterocyclic group containing at least one heteroatom of O, N, S, Si, and P, and a $C_3$-$C_{20}$ aliphatic ring group.

When at least one of $R_e$, R', R" and $Ar_a$ is an aryl group, the aryl group may be, for example, a $C_6$-$C_{18}$, a $C_6$-$C_{16}$, a $C_6$-$C_{14}$, a $C_6$-$C_{12}$, a $C_6$, a $C_{10}$, a $C_{12}$, a $C_{14}$, a $C_{16}$ or a $C_{18}$ aryl group.

When $L_a$ is an arylene group, the arylene group may be, for example, a $C_6$-$C_{18}$, a $C_6$-$C_{16}$, a $C_6$-$C_{14}$, a $C_6$-$C_{12}$, a $C_6$, a $C_{10}$, a $C_{12}$, a $C_{14}$, a $C_{16}$ or a $C_{18}$ arylene group.

When at least one of $R_e$, R', R", $Ar_a$ and $L_a$ is a heterocyclic group, the heterocyclic group may be, for example, a $C_2$-$C_{18}$, a $C_2$-$C_{16}$, a $C_2$-$C_{14}$, a $C_2$-$C_{13}$, a $C_2$-$C_{12}$, a $C_2$-$C_{11}$, a $C_2$-$C_{10}$, a $C_2$-$C_9$, a $C_2$-$C_8$, a $C_2$-$C_7$, a $C_2$-$C_6$, a $C_2$-$C_5$, a $C_2$-$C_4$, a $C_2$-$C_3$, a $C_2$, a $C_3$, a $C_4$, a $C_5$, a $C_6$, a $C_7$, a $C_8$, a $C_9$, a $C_{10}$, a $C_{11}$, a $C_{12}$, a $C_{13}$, a $C_{14}$, a $C_{15}$, a $C_{16}$, a $C_{17}$, a $C_{18}$ heterocyclic group.

In each of Formulas related to Formula 2, $Ar^1$, $L^1$, $R^1$-$R^4$, L', $L^a$, $Ar^a$, $R_a$, $R_b$ and the ring formed by linking neighboring groups to each other may be each further substituted with one or more substituents selected from the group consisting of deuterium, halogen, a silane group unsubstituted or substituted with a $C_1$-$C_{20}$ alkyl group or a $C_6$-$C_{20}$ aryl group, a siloxane group, a cyano group, a nitro group, a $C_1$-$C_{20}$ alkylthio group, a $C_1$-$C_{20}$ alkoxy group, a $C_6$-$C_{20}$ aryloxy group, a $C_6$-$C_{20}$ arylthio, a $C_1$-$C_{20}$ alkyl group, a $C_2$-$C_{20}$ alkenyl group, a $C_2$-$C_{20}$ alkynyl group, a $C_6$-$C_{20}$ aryl group, a fluorenyl group, a $C_2$-$C_{20}$ heterocyclic group containing at least one heteroatom of O, N, S, Si, and P, a $C_3$-$C_{20}$ aliphatic ring group, a $C_7$-$C_{20}$ arylalkyl group, and a $C_5$-$C_{20}$ arylalkenyl group.

When at least one of $Ar^1$, $L^1$, $R^1$-$R^4$, L', $L^a$, $Ar^a$, $R_a$, $R_b$ and the ring formed by linking neighboring groups to each other is further substituted with an aryl group, the aryl group may be, for example, a $C_6$-$C_{18}$, a $C_6$-$C_{16}$, a $C_6$-$C_{14}$, a $C_6$-$C_{12}$, a $C_6$, a $C_{10}$, a $C_{12}$, a $C_{14}$, a $C_{16}$ or a $C_{18}$ aryl group.

When at least one of $Ar^1$, $L^1$, $R^1$-$R^4$, L', $L^a$, $Ar^a$, $R_a$, $R_b$ and the ring formed by linking neighboring groups to each other is further substituted with a heterocyclic group, the heterocyclic group may be, for example a $C_2$-$C_{18}$, a $C_2$-$C_{16}$, a $C_2$-$C_{14}$, a $C_2$-$C_{13}$, a $C_2$-$C_{12}$, a $C_2$-$C_{11}$, a $C_2$-$C_{10}$, a $C_2$-$C_9$, a $C_2$-$C_8$, a $C_2$-$C_7$, a $C_2$-$C_6$, a $C_2$-$C_5$, a $C_2$-$C_4$, a $C_2$-$C_3$, a $C_2$, a $C_3$, a $C_4$, a $C_5$, a $C_6$, a $C_7$, a $C_8$, a $C_9$, a $C_{10}$, a $C_{11}$, a $C_{12}$, a $C_{13}$, a $C_{14}$, a $C_{15}$, a $C_{16}$, a $C_{17}$ or a $C_{18}$ heterocyclic group.

When at least one of $Ar^1$, $L^1$, $R^1$-$R^4$, L', $L^a$, $Ar^a$, $R_a$, $R_b$ and the ring formed by linking neighboring groups to each other is substituted with an alkyl group, the alkyl group may be, for example a $C_1$-$C_{20}$, a $C_1$-$C_{10}$, a $C_1$-$C_4$, a $C_1$, a $C_2$, a $C_3$ or a $C_4$ alkyl group, specifically, methyl, t-butyl, or the like.

For example, Formulas 1 and 2, $L_1$-$L_6$, $L^{11}$ may be independently one of Formulas b-1 to b-13.

<Formula b-1>

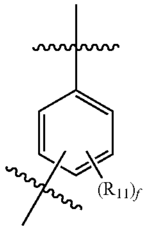

<Formula b-2>

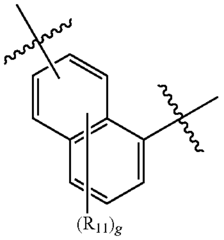

<Formula b-3>

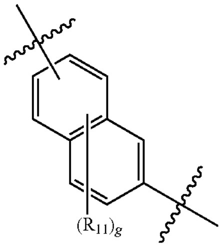

<Formula b-4>

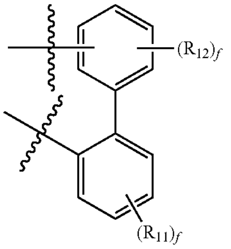

<Formula b-5>

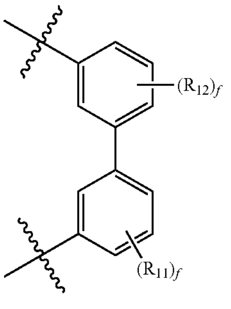

-continued

<Formula b-6>

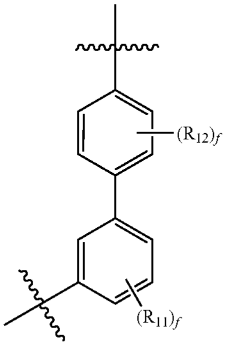

<Formula b-7>

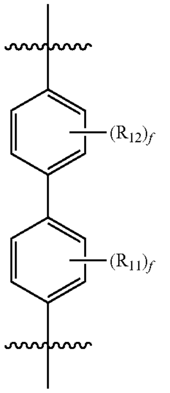

<Formula b-8>

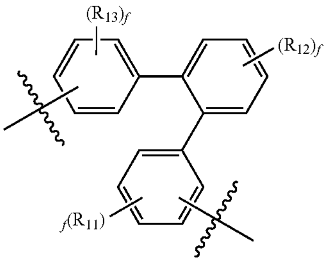

<Formula b-9>

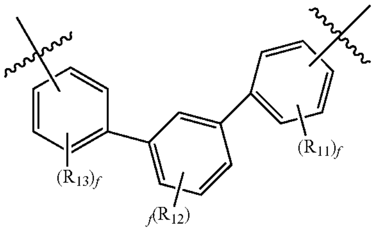

<Formula b-10

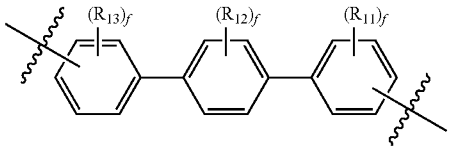

<Formula b-11>

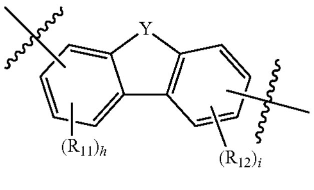

-continued

<Formula b-12>

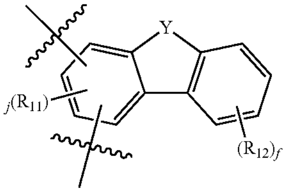

<Formula 1-13>

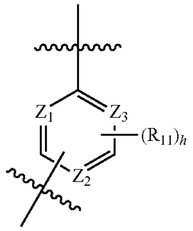

In Formulas b-1 to b-13, Y is N-$L_a$-$Ar_a$, C(R')(R"), O or S, $Z_1$-$Z_3$ are independently N or C(R'), and at least one of $Z_1$-$Z_3$ is N.

$R_{11}$-$R_{13}$, R' and R" are each independently selected from the group consisting of hydrogen, deuterium, halogen, a silane group unsubstituted or substituted with a $C_1$-$C_{20}$ alkyl group or a $C_6$-$C_{20}$ aryl group, a cyano group, a nitro group, a $C_1$-$C_{20}$ alkylthio group, a $C_1$-$C_{20}$ alkoxy group, a $C_6$-$C_{20}$ aryloxy group, a $C_6$-$C_{20}$ arylthio, a $C_1$-$C_{20}$ alkyl group, a $C_2$-$C_{20}$ alkenyl group, a $C_2$-$C_{20}$ alkynyl group, a $C_6$-$C_{20}$ aryl group, a fluorenyl group, a $C_2$-$C_{20}$ heterocyclic group containing at least one heteroatom of O, N, S, Si, and P, and a $C_3$-$C_{20}$ aliphatic ring group, and adjacent groups may be linked to each other to form a ring.

$L_a$ is selected from the group consisting of a single bond, a $C_6$-$C_{20}$ arylene group, a fluorenylene group, a $C_2$-$C_{20}$ heterocyclic group comprising at least one heteroatom selected from the group consisting of O, N, S, Si and P, and a $C_3$-$C_{20}$ aliphatic ring.

$Ar_a$ is selected from the group consisting of a $C_6$-$C_{20}$ aryl group, a fluorenyl group, a $C_2$-$C_{20}$ heterocyclic group containing at least one heteroatom of O, N, S, Si, and P, and a $C_3$-$C_{20}$ aliphatic ring group.

f is an integer of 0-4, h and i are each an integer of 0-3, j is an integer of 0-2, and where each of these is an integer of 2 or more, each of $R_{11}$s, each of $R_{12}$s, each of $R_{13}$s is the same as or different from each other.

When at least one of $R_{11}$-$R_{13}$, R', R" and $Ar_a$ is an aryl group, the aryl group may be, for example, a $C_6$-$C_{18}$, a $C_6$-$C_{16}$, a $C_6$-$C_{14}$, a $C_6$-$C_{12}$, a $C_6$, a $C_{10}$, a $C_{12}$, a $C_{14}$, a $C_{16}$ or a $C_{18}$ aryl group.

When $L_a$ is an arylene group, the arylene group may be, for example, a $C_6$-$C_{18}$, a $C_6$-$C_{16}$, a $C_6$-$C_{14}$, a $C_6$-$C_{12}$, a $C_6$, a $C_{10}$, a $C_{12}$, a $C_{14}$, a $C_{16}$ or a $C_{18}$ arylene group.

When at least one of $R_{11}$-$R_{13}$, R', R", $Ar_a$ and $L_a$ is a heterocyclic group, the heterocyclic group may be, for example, a $C_2$-$C_{18}$, a $C_2$-$C_{16}$, a $C_2$-$C_{14}$, a $C_2$-$C_{13}$, a $C_2$-$C_{12}$, a $C_2$-$C_{11}$, a $C_2$-$C_{10}$, a $C_2$-$C_9$, a $C_2$-$C_5$, a $C_2$-$C_7$, a $C_2$-$C_6$, a $C_2$-$C_5$, a $C_2$-$C_4$, a $C_2$-$C_3$, a $C_2$, a $C_3$, a $C_4$, a $C_5$, a $C_6$, a $C_7$, a $C_8$, a $C_9$, a $C_{10}$, a $C_{11}$, a $C_{12}$, a $C_{13}$, a $C_{14}$, a $C_{15}$, a $C_{16}$, a $C_{17}$, a $C_{18}$ heterocyclic group.

Specifically, compound represented by formula 1 may be one of the following compounds, but there is no limitation thereto.

1-1
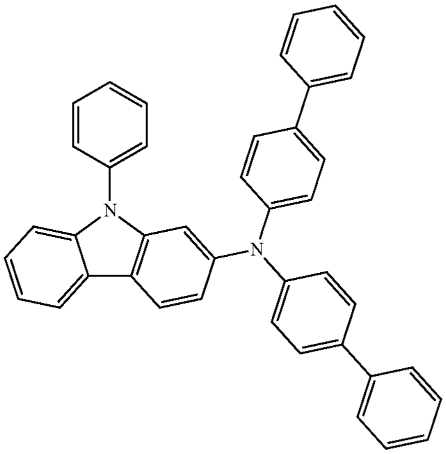
1-2
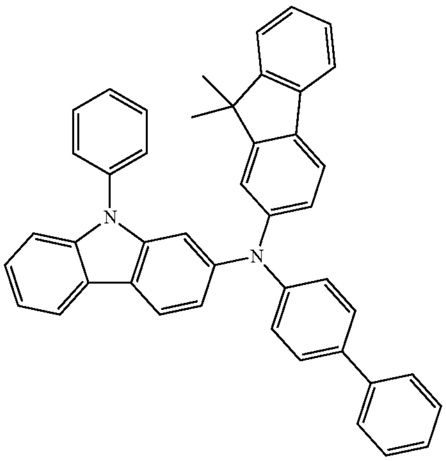
1-3
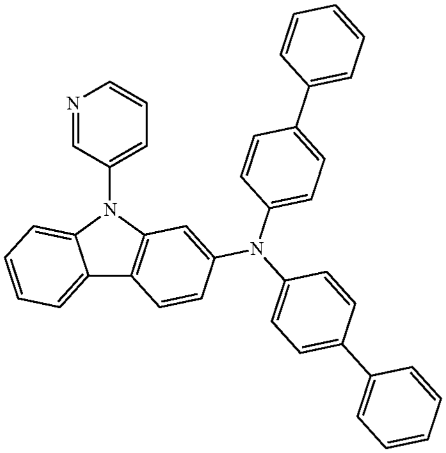
-continued
1-4
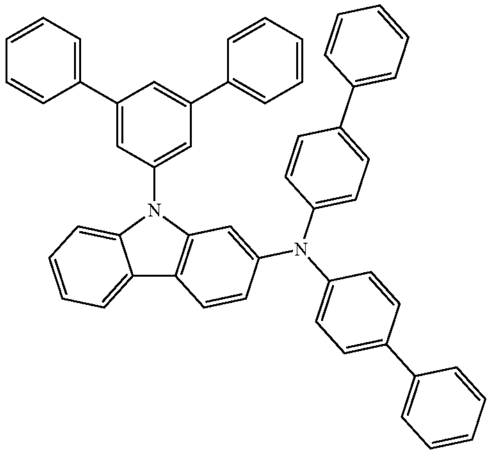
1-5
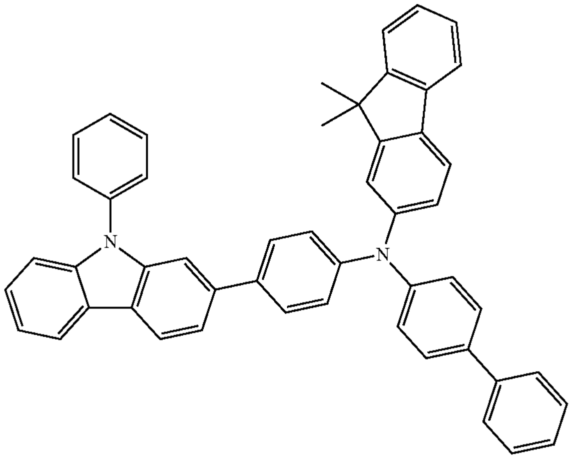
1-6
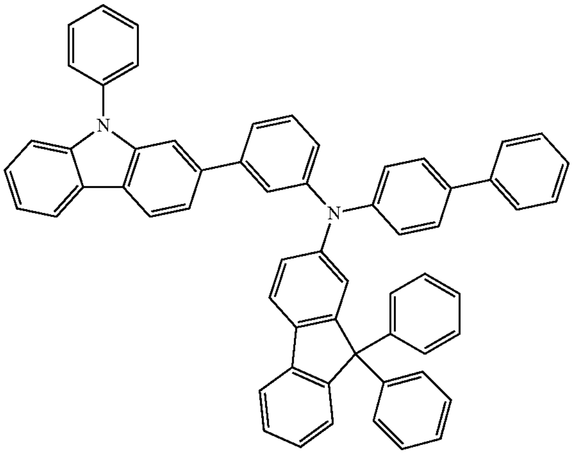

-continued
1-7
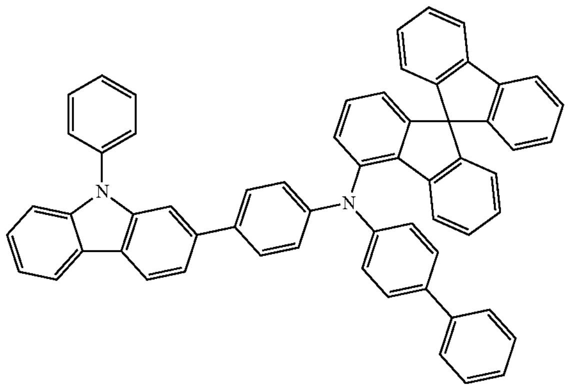
1-8
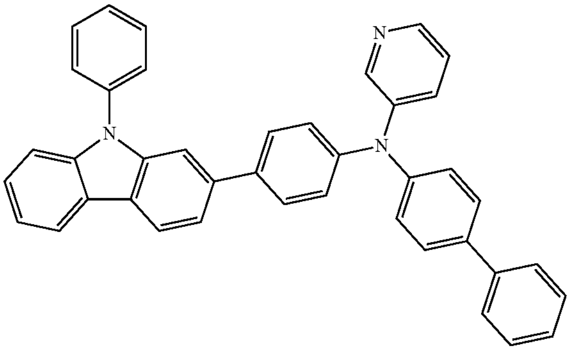
1-9
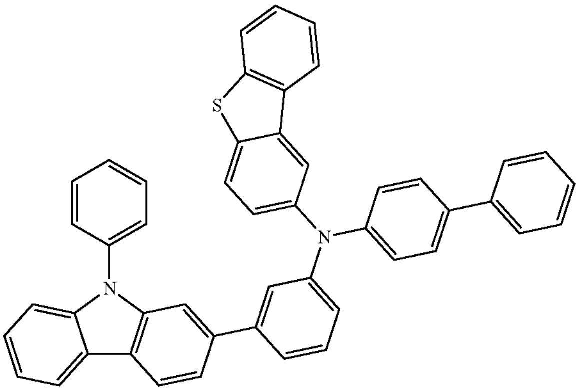
-continued
1-10
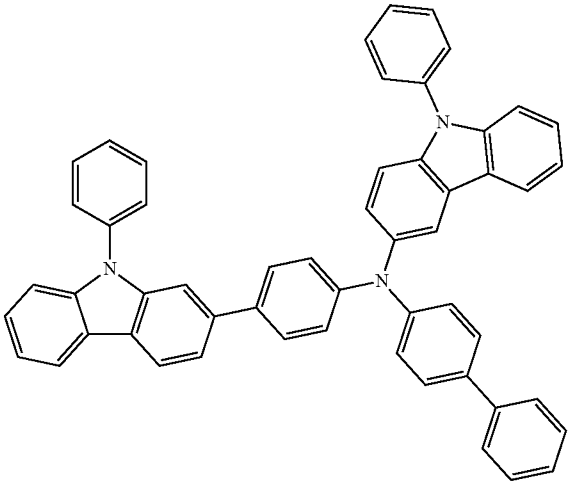
1-11
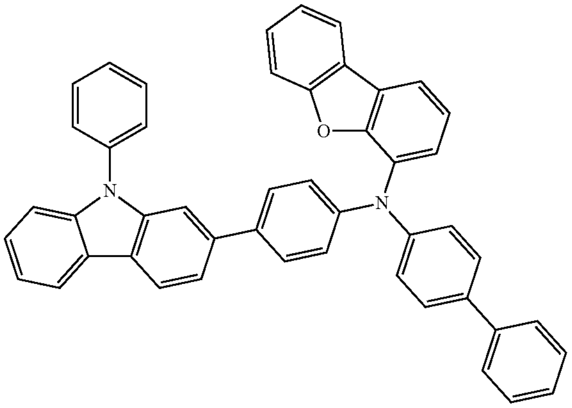
lp;.5p
1-12
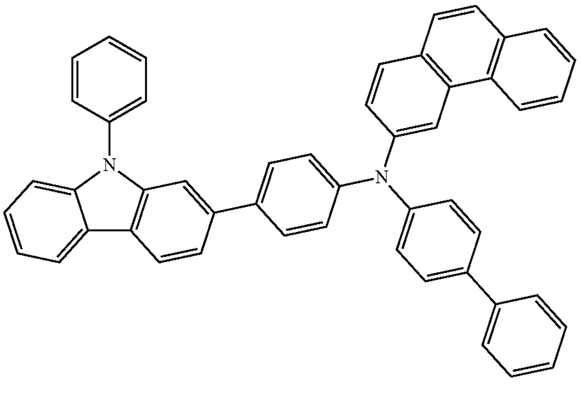
1-13
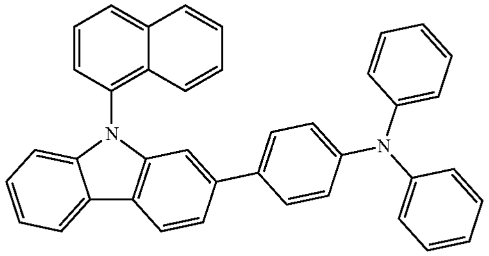

-continued
1-14
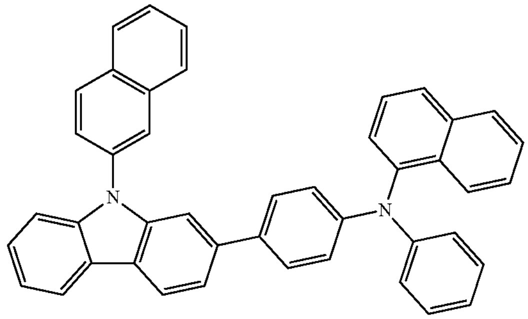
1-15
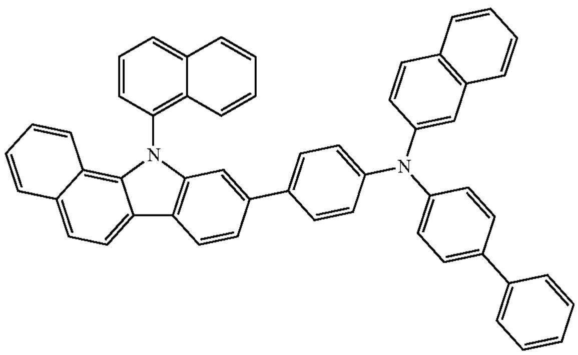
1-16
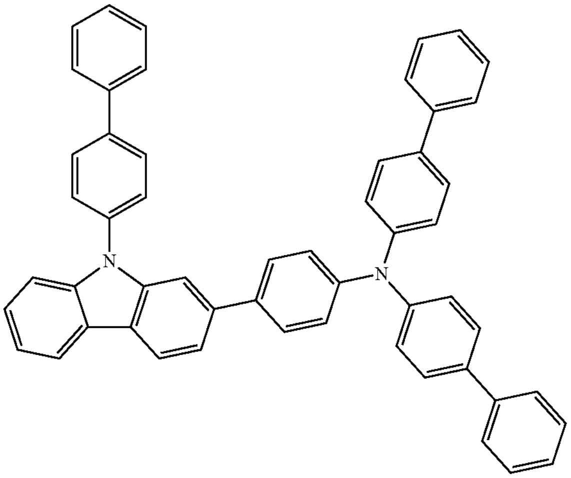
-continued
1-17
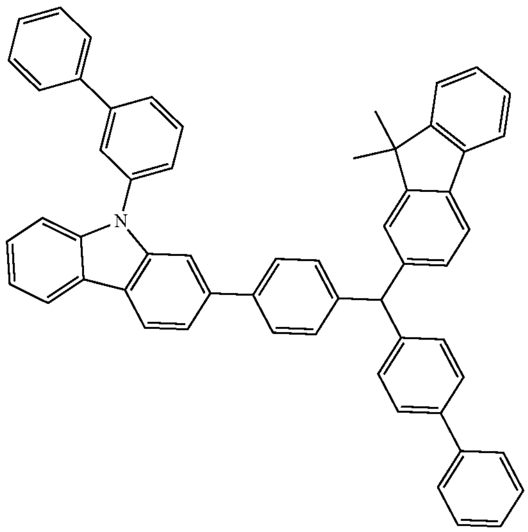
1-18
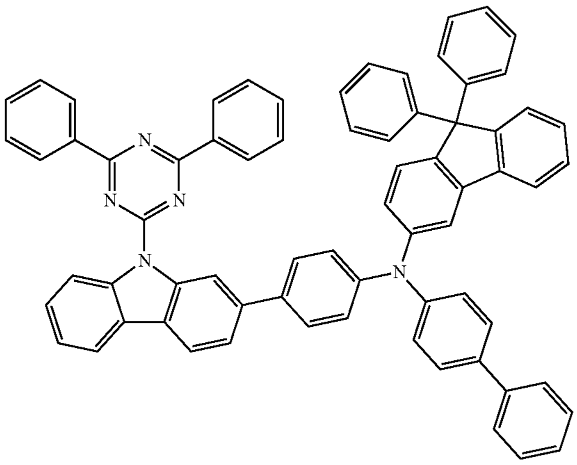
1-19
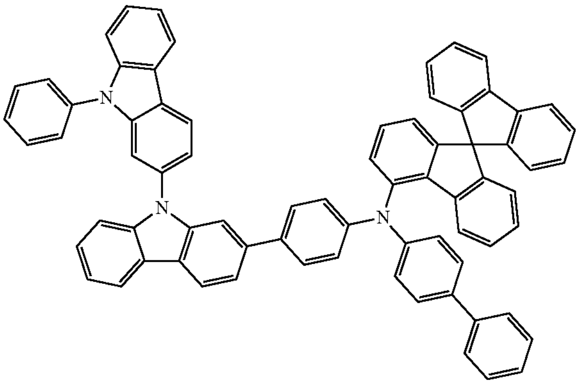

-continued
1-20
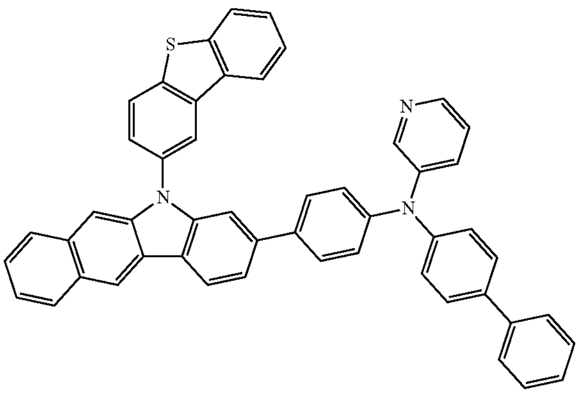
1-21
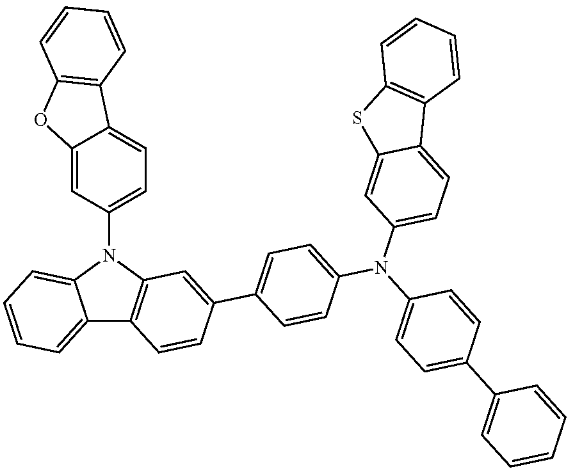
1-22
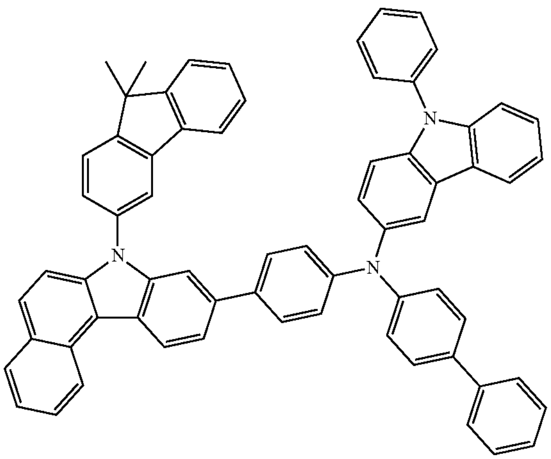
-continued
1-23
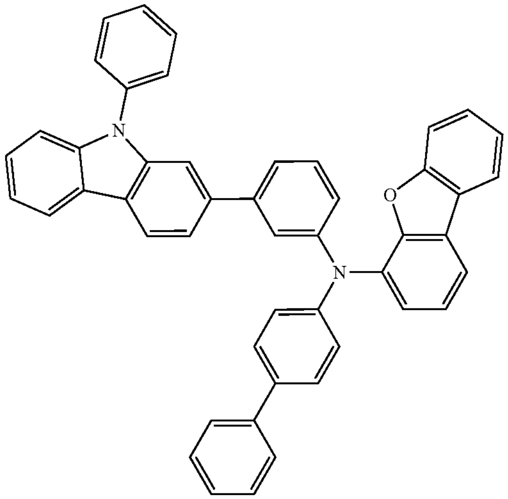
1-24
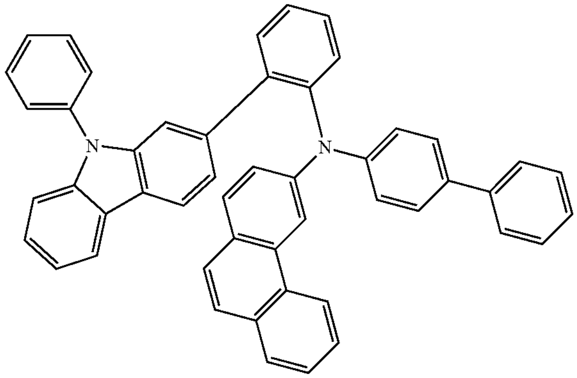
1-25
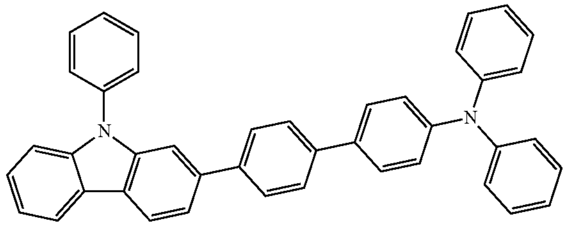
1-26
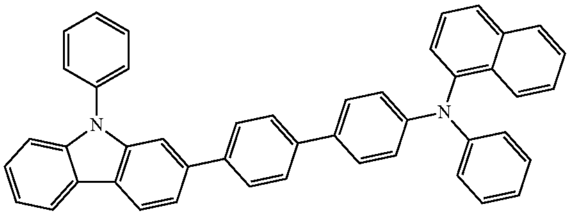

-continued
1-27
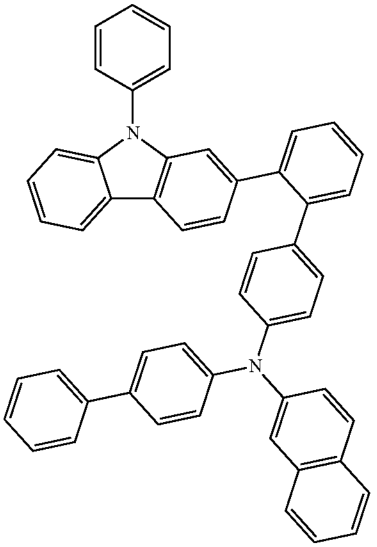
1-28
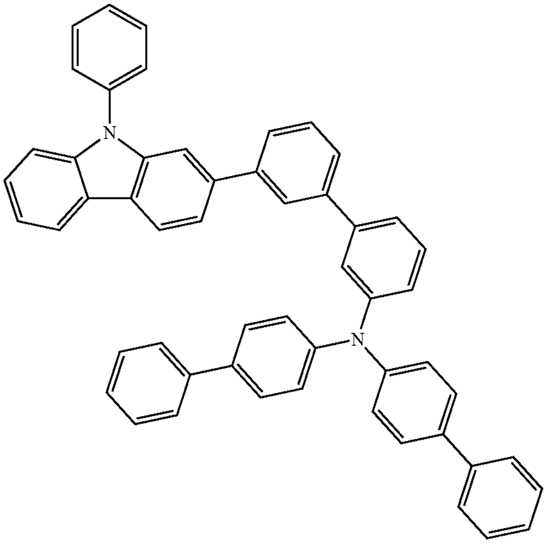
-continued
1-29
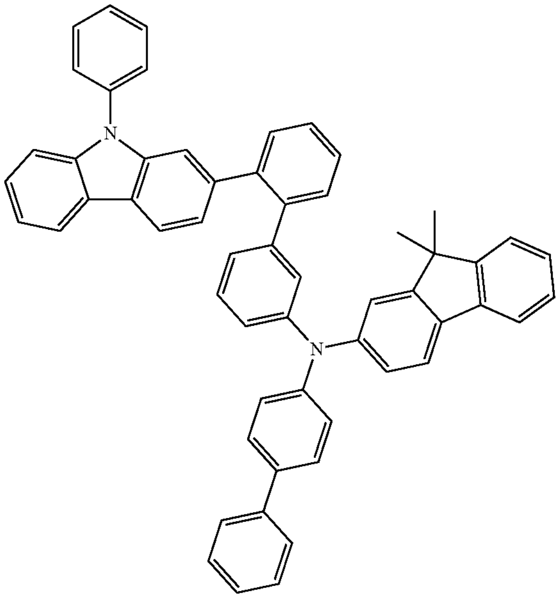
1-30
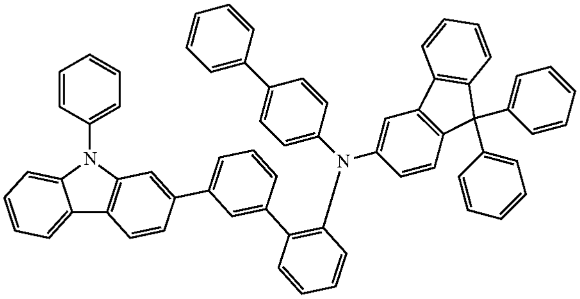
1-31
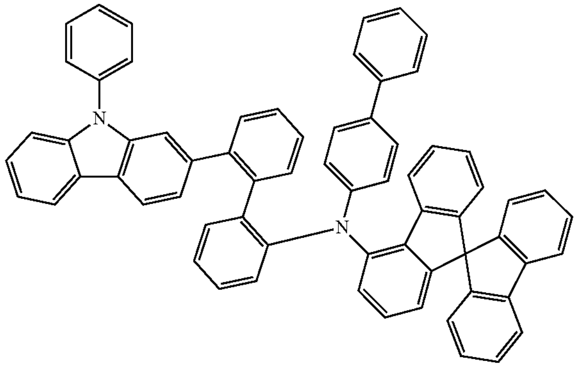

-continued
1-32
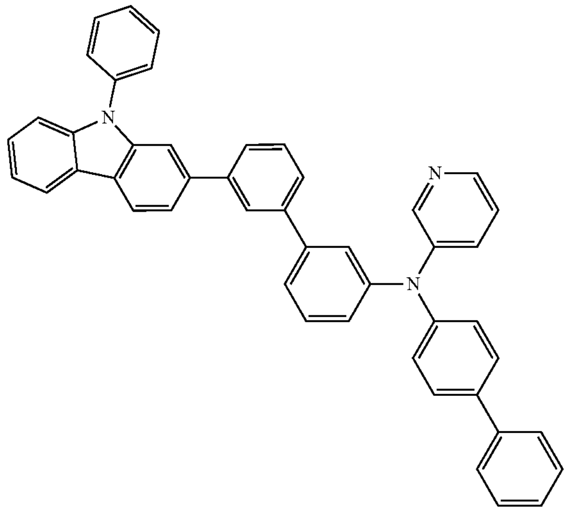
1-33
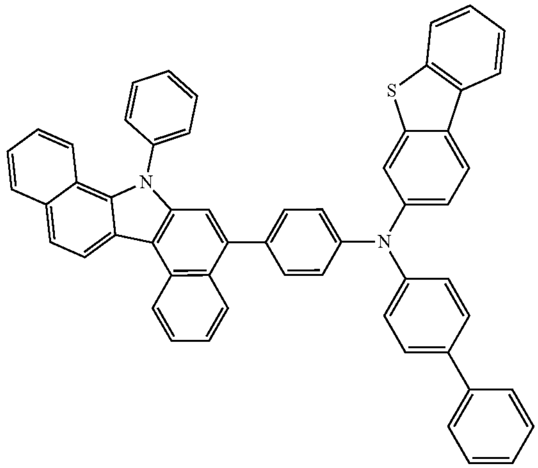
1-34
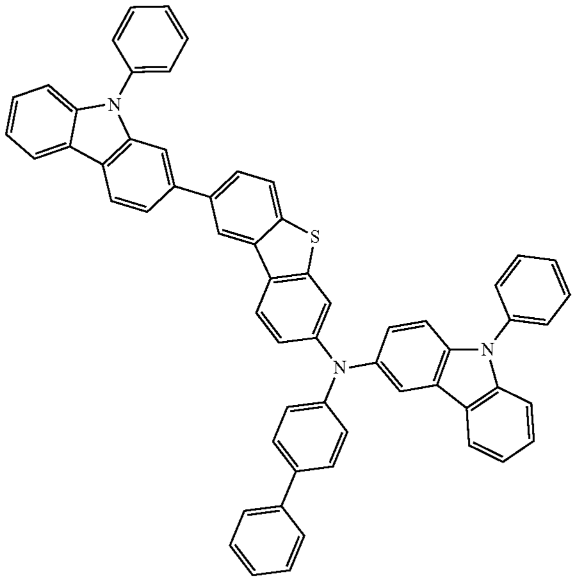
-continued
1-35
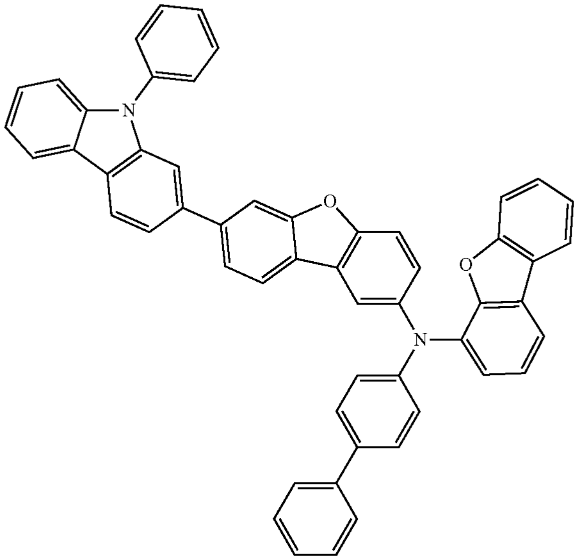
1-36
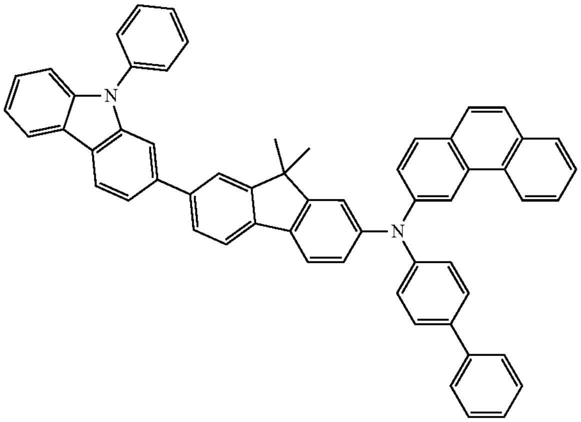
1-37
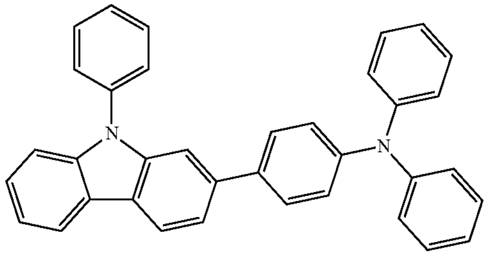
1-38
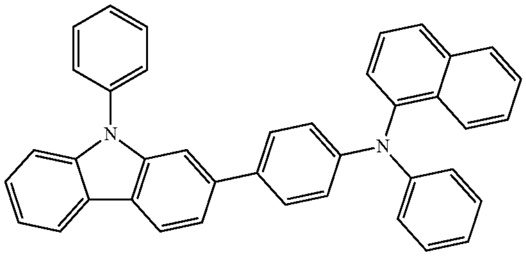

-continued
1-39
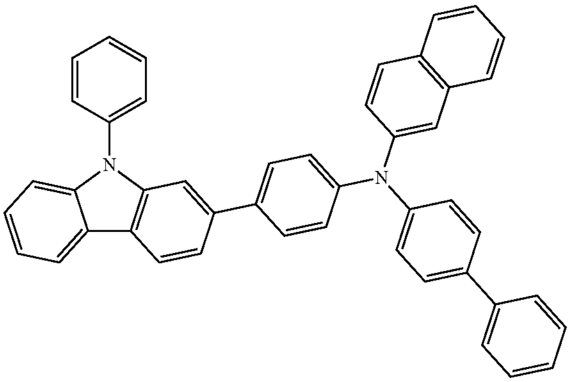
1-40
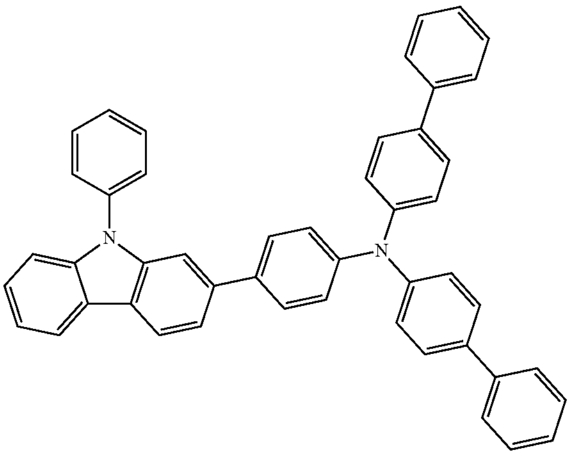
1-41
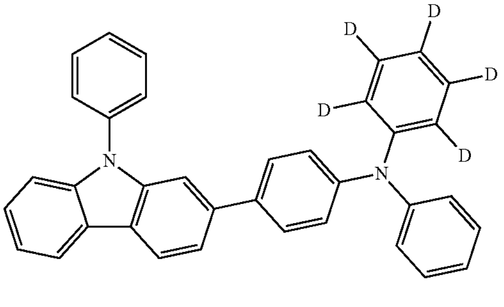
1-42
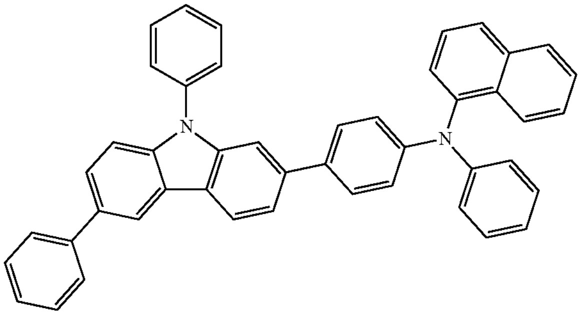
-continued
1-43
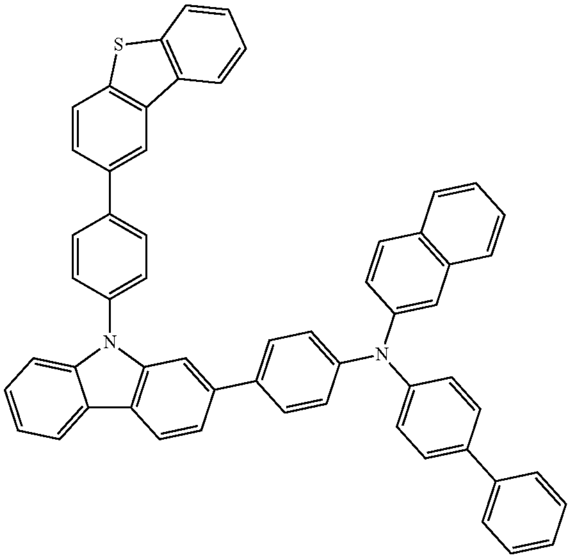
1-44
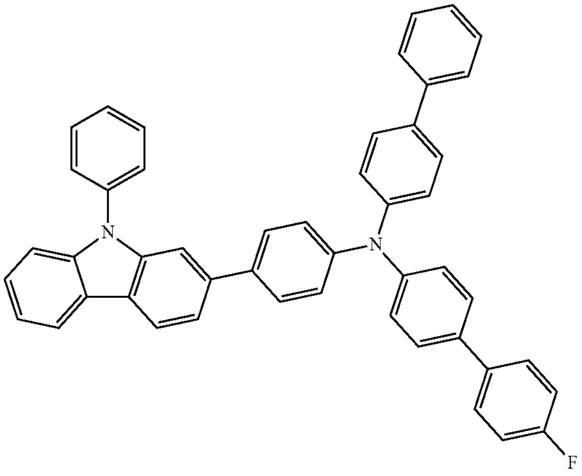
1-45
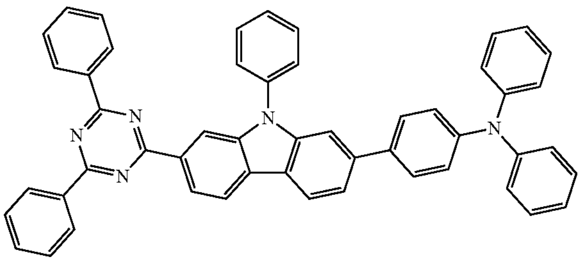

-continued
1-46
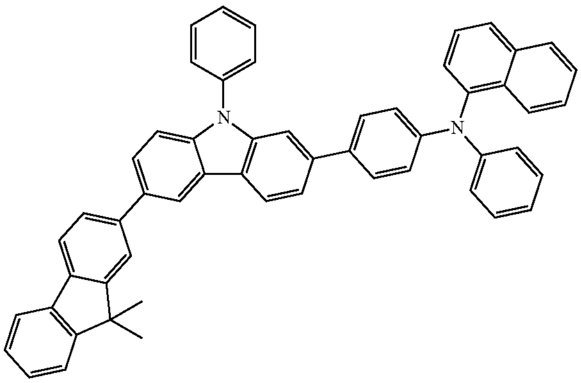
1-47
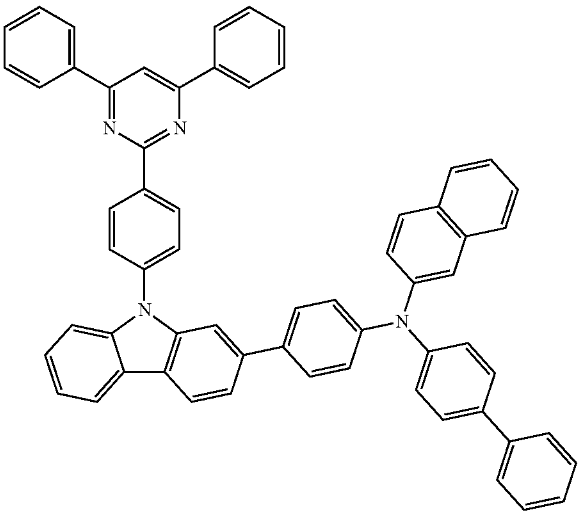
1-48
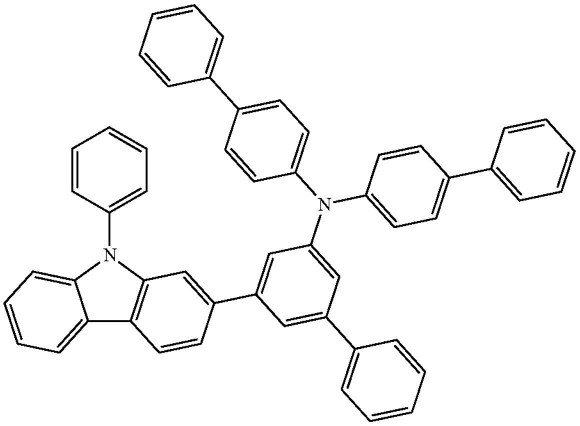
-continued
1-49
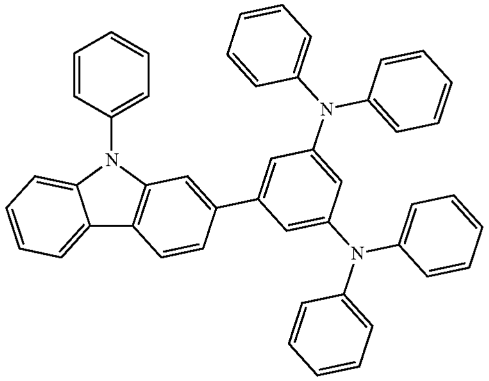
1-50
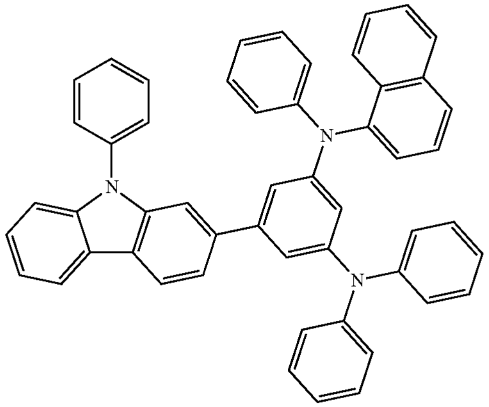
1-51
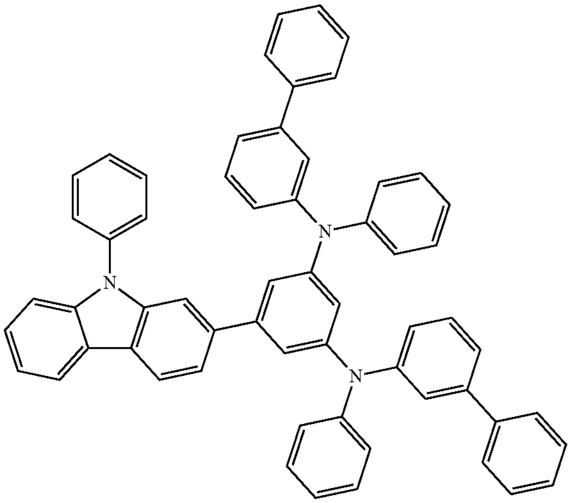

-continued
1-52
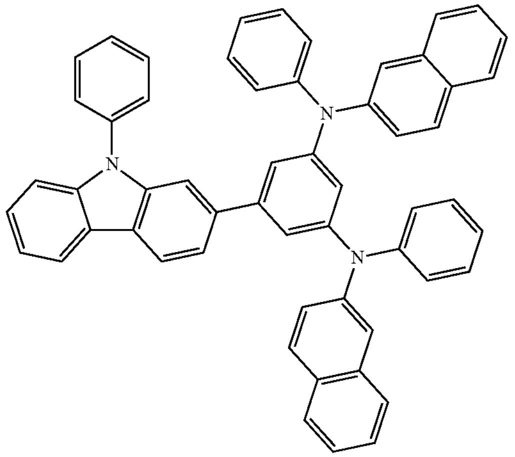
1-53
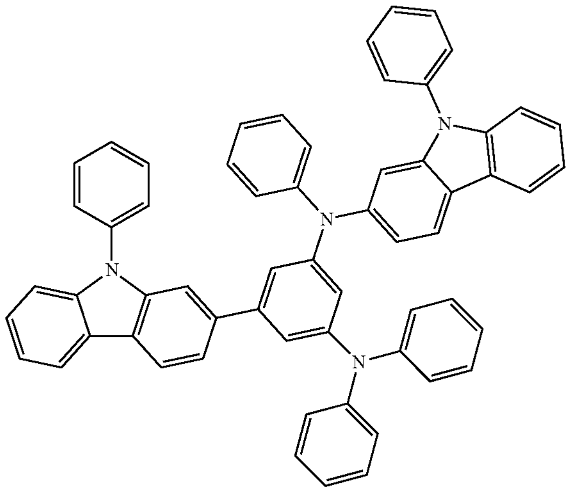
1-54
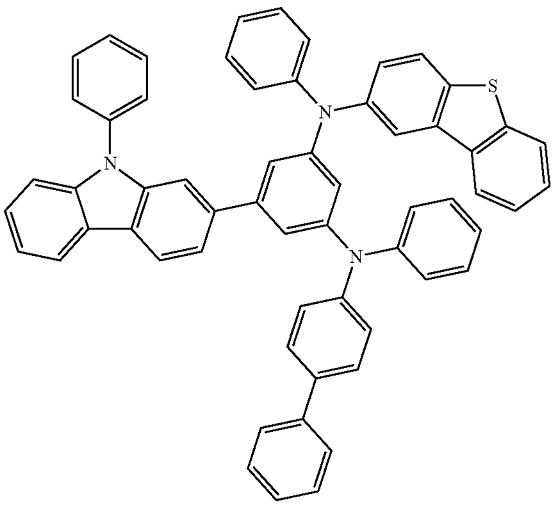
-continued
1-55
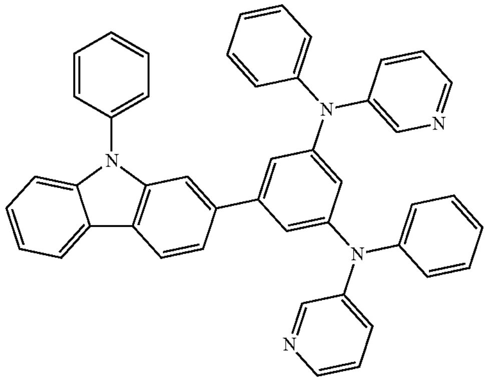
1-56
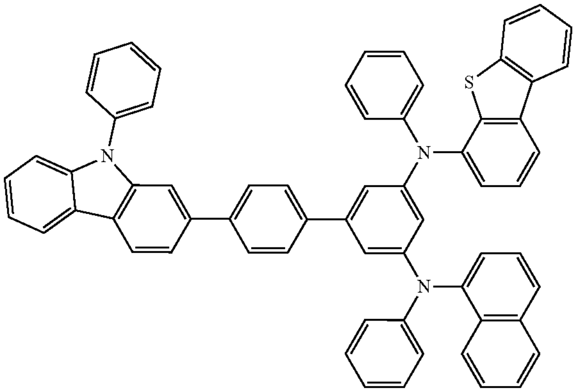
1-57
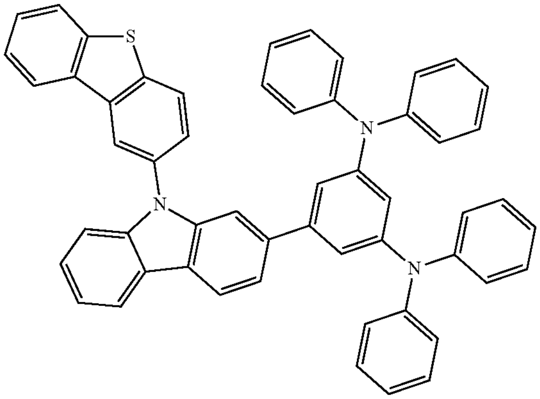
1-58
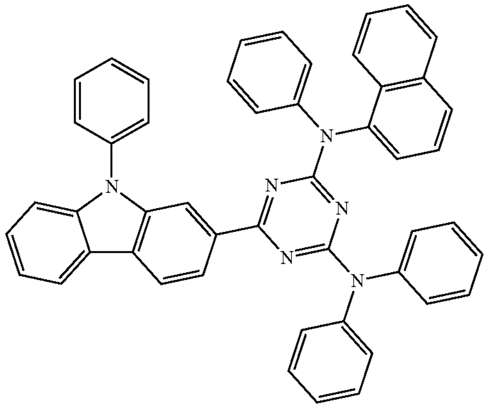

-continued
1-59
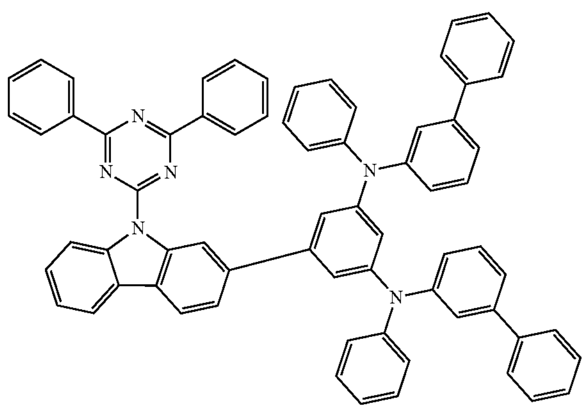
1-60
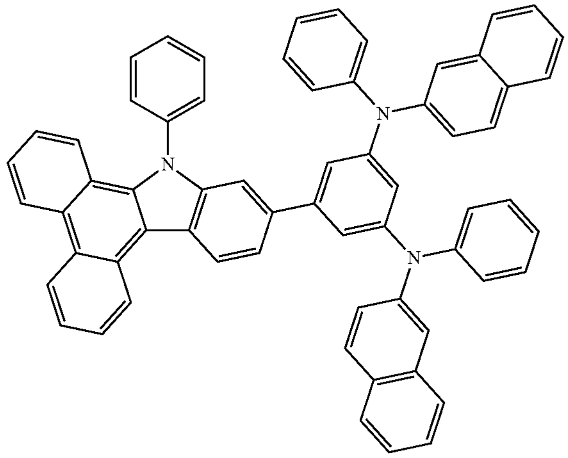
1-61
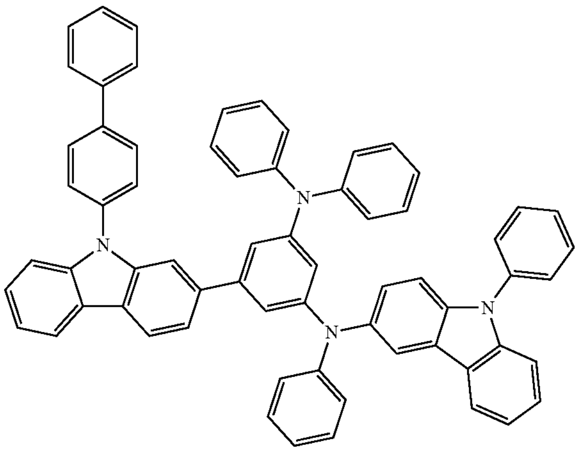
-continued
1-62
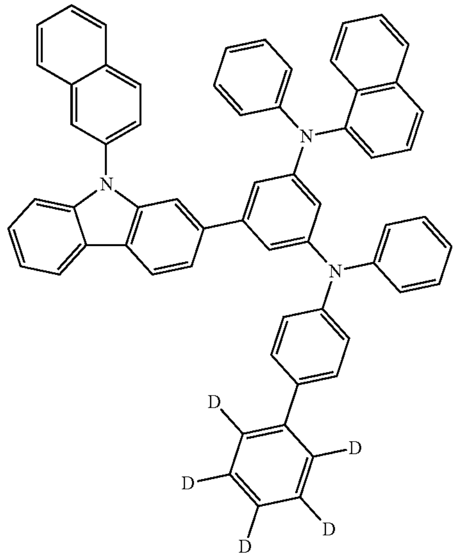
1-63
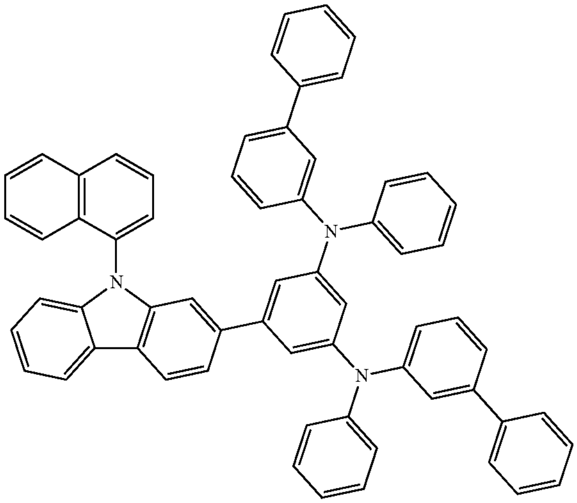
1-64
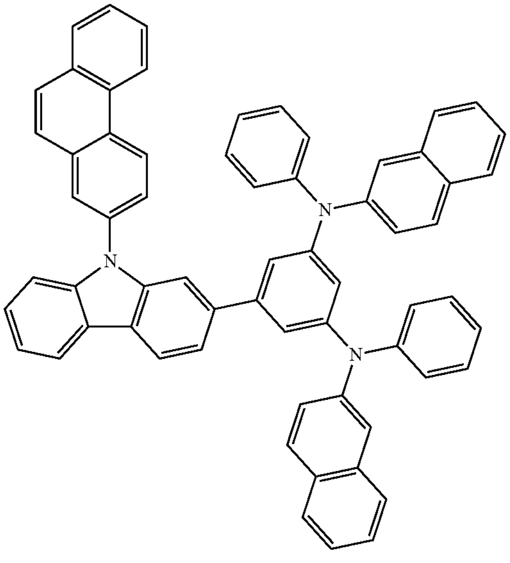

-continued
1-65
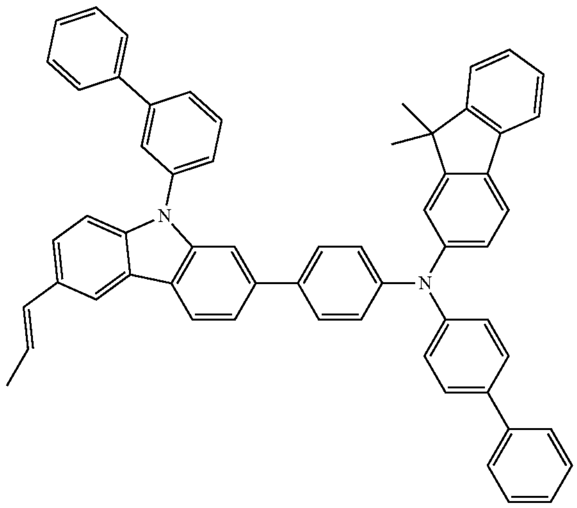
1-66
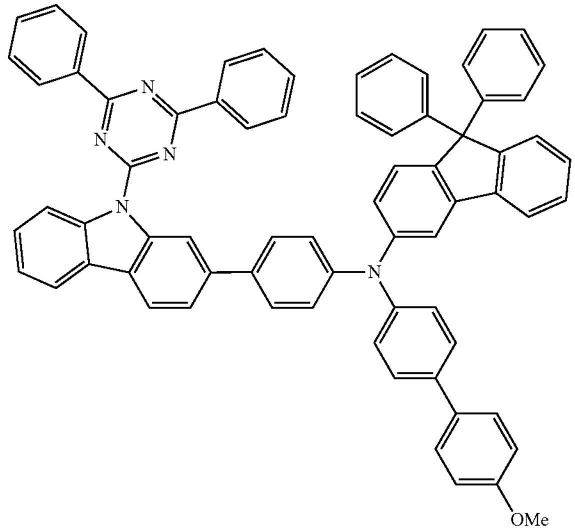
1-67
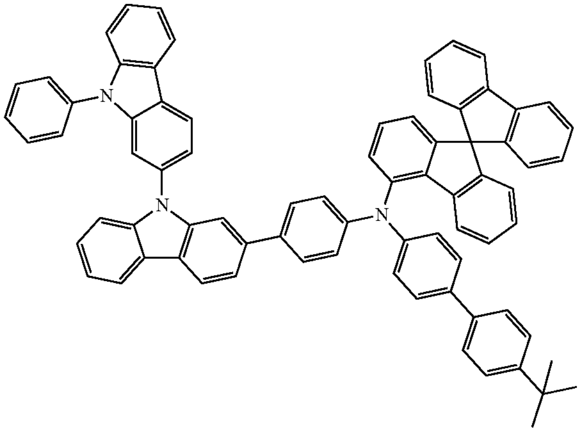
-continued
1-68
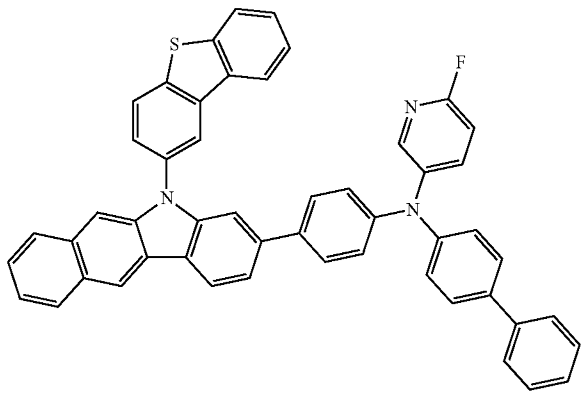
1-69
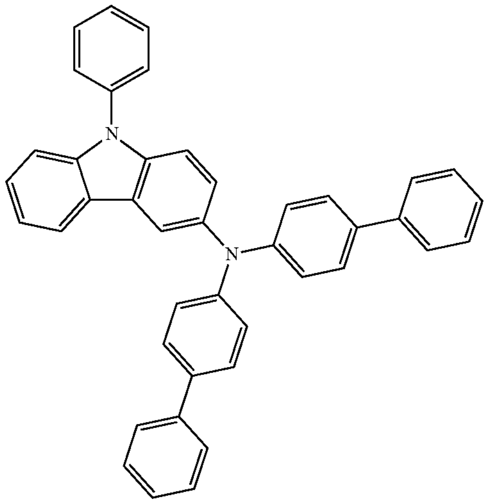
1-70
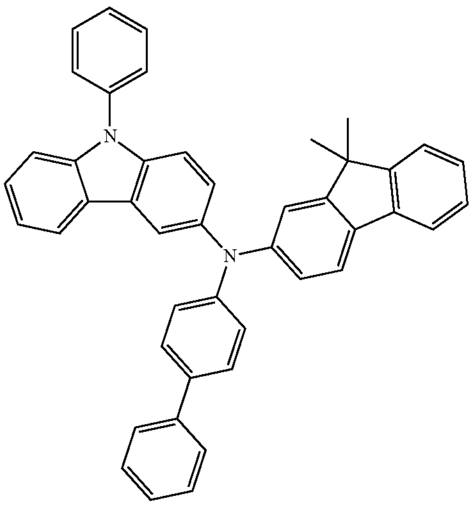

-continued
1-71
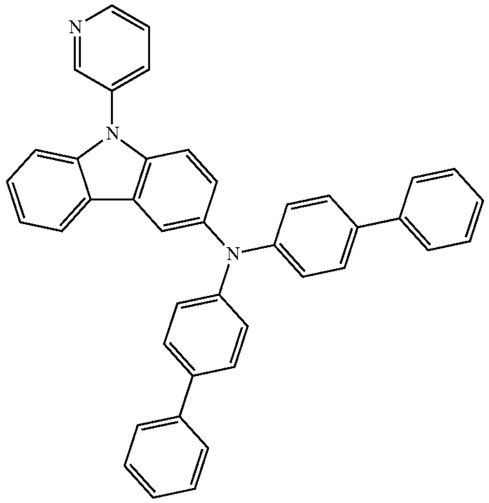
1-72
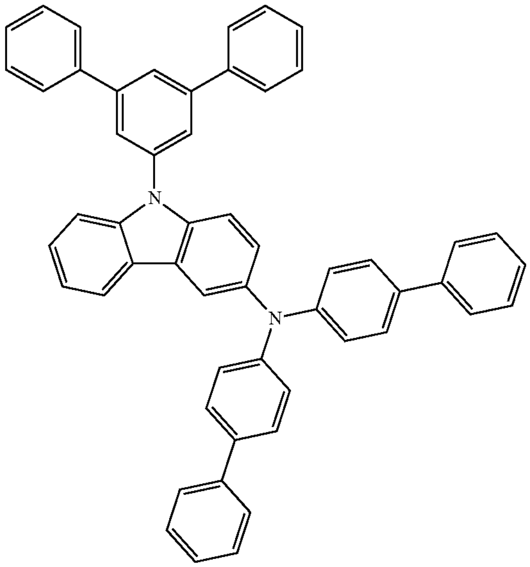
-continued
1-73
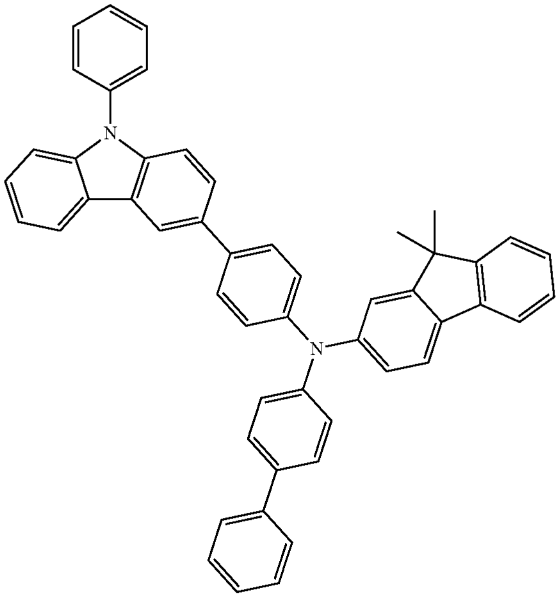
1-74
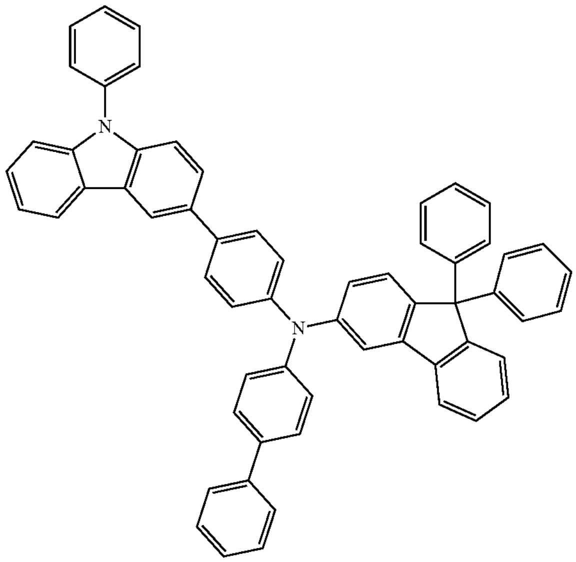

1-75
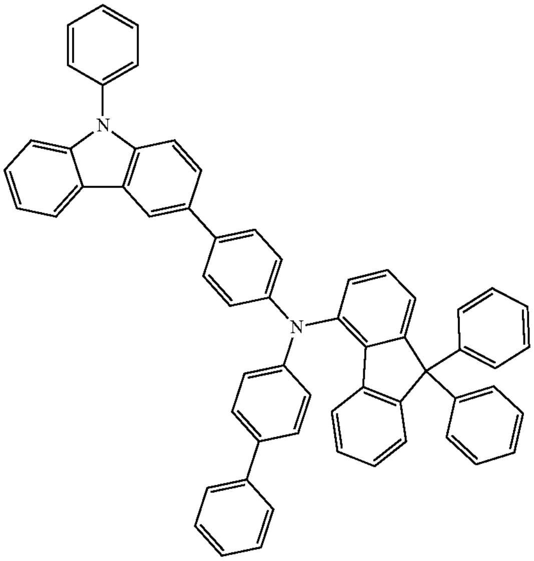
1-76
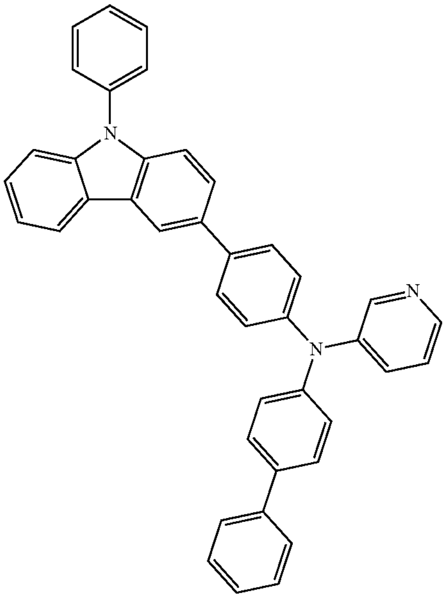
1-77
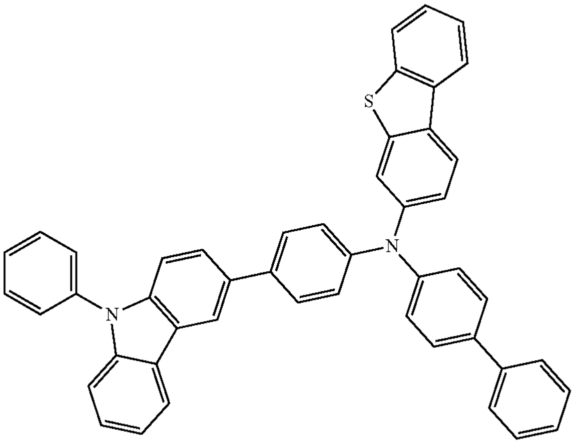
1-78
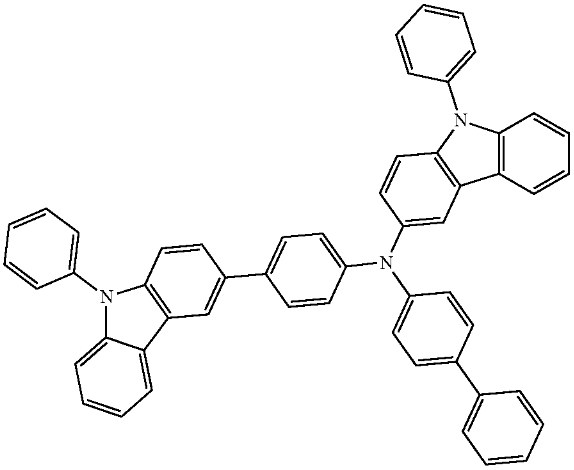
1-79
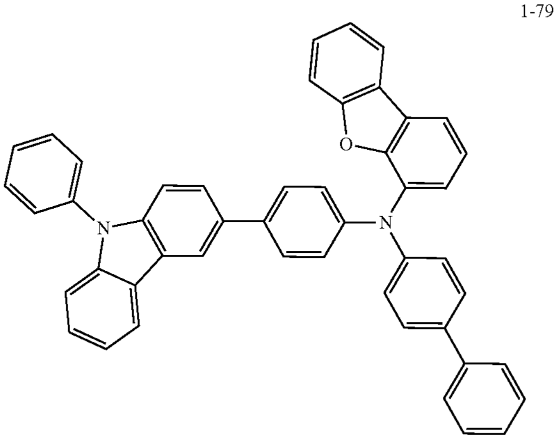
1-80
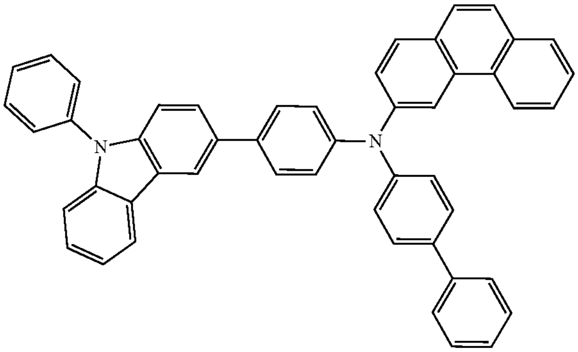

-continued
1-81
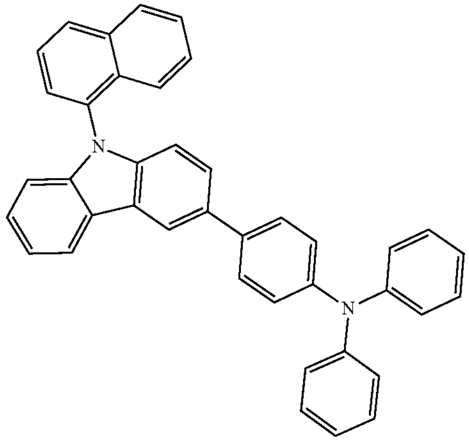
1-82
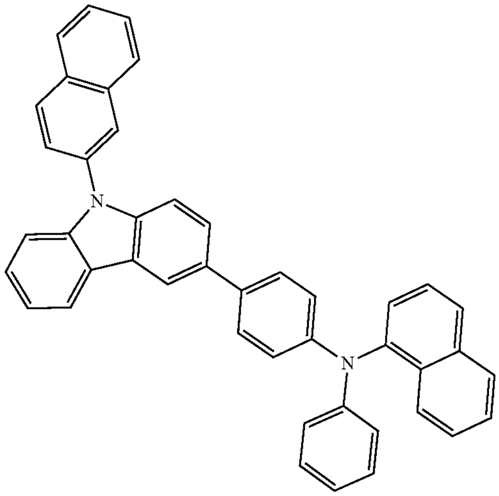
1-83
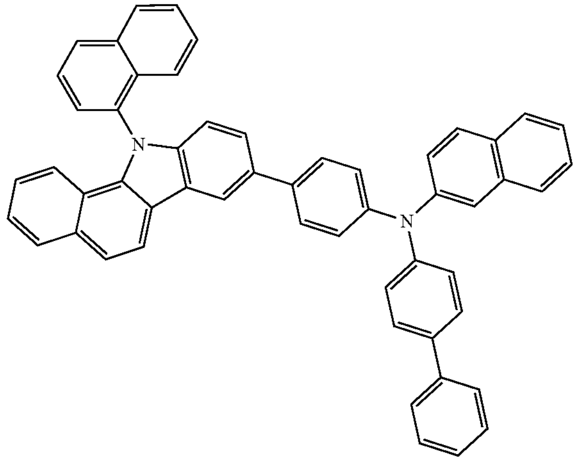
-continued
1-84
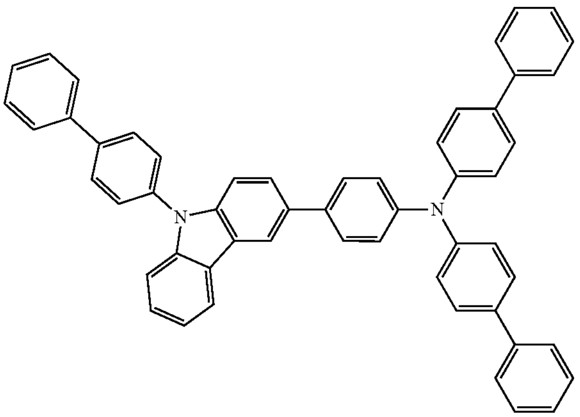
1-85
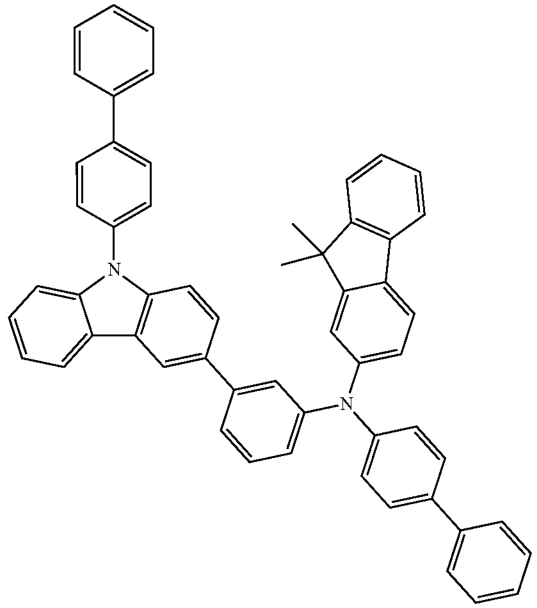
1-86
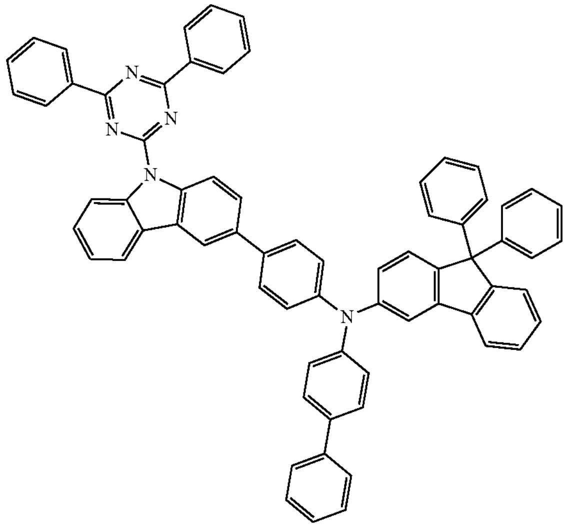

-continued
1-87
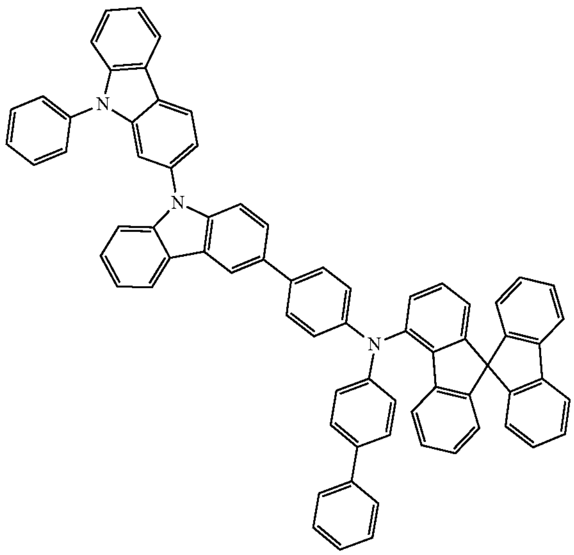
1-88
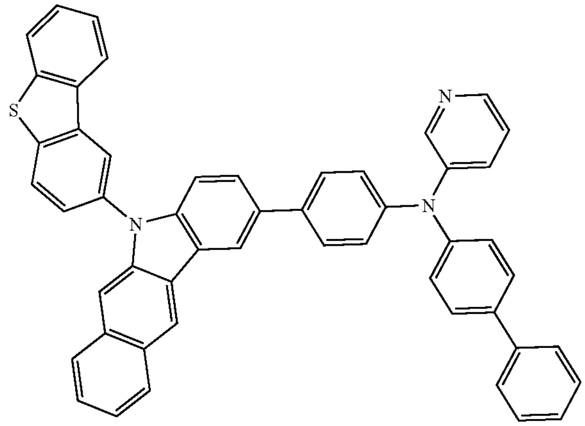
1-89
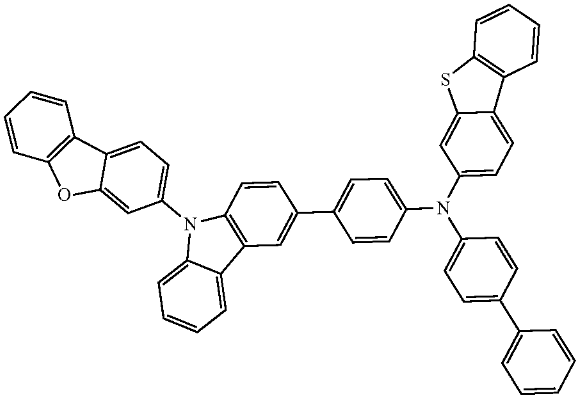
-continued
1-90
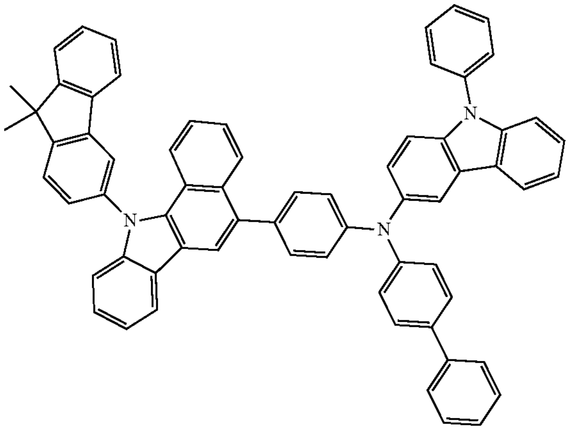
1-91
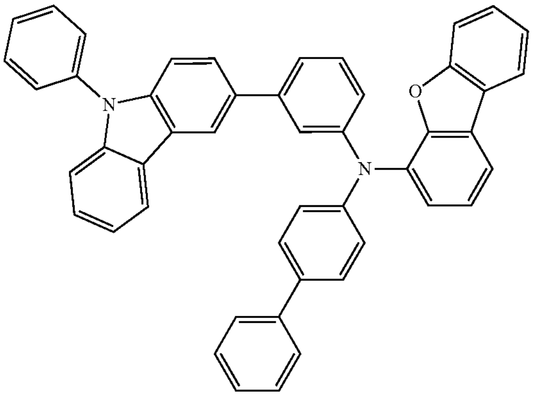
1-92
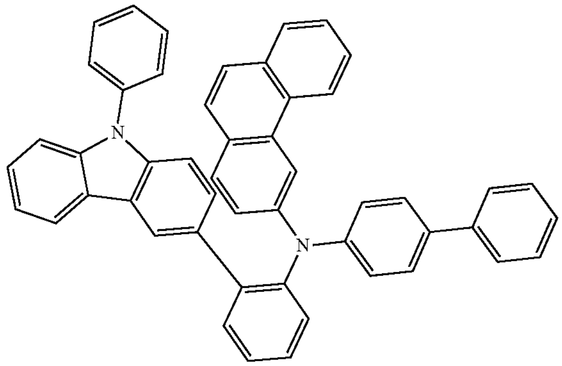

-continued
1-93
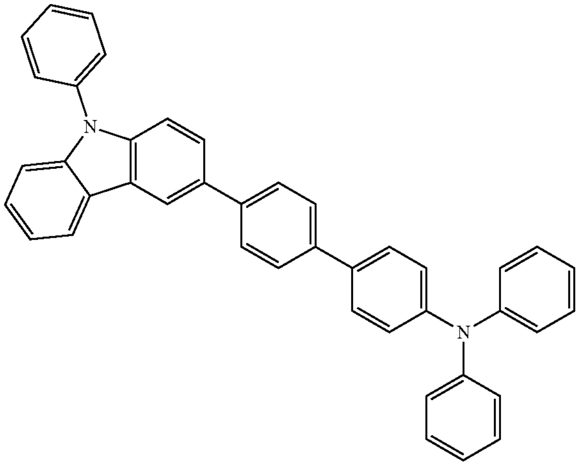
1-94
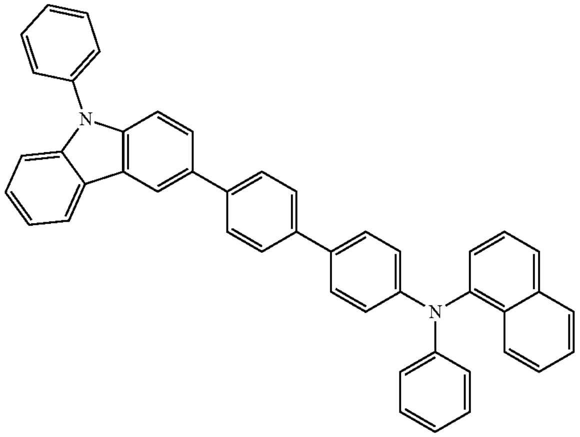
1-95
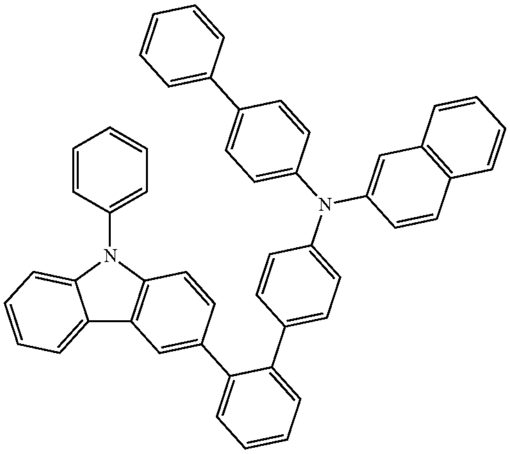
-continued
1-96
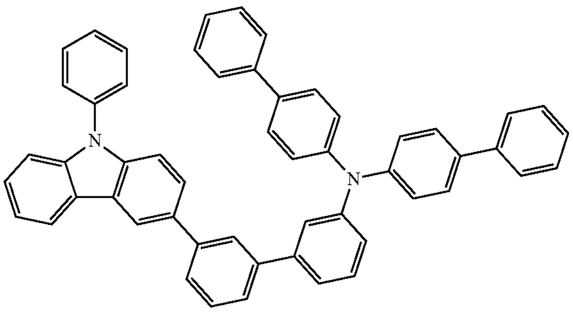
1-97
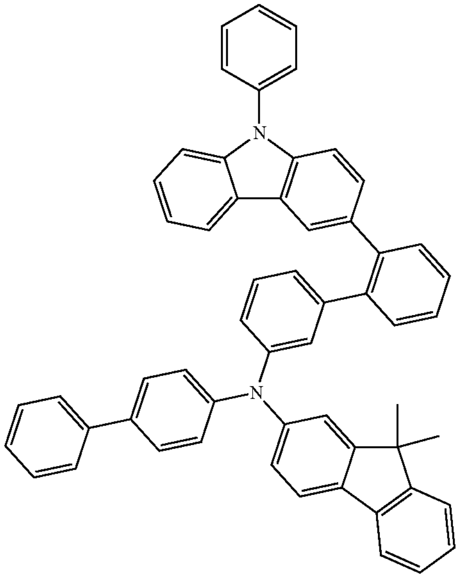
1-98
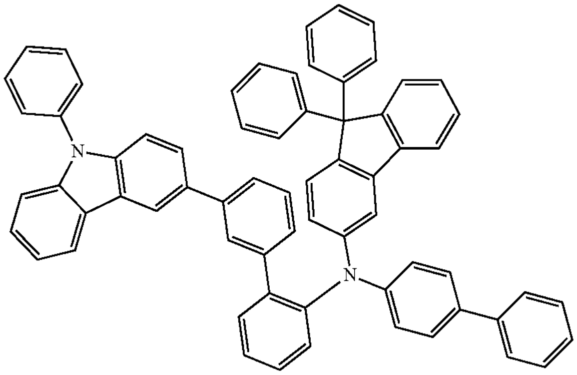

-continued
1-99
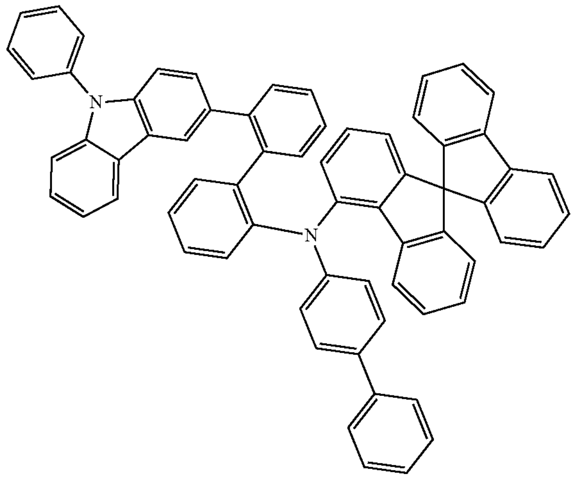
1-100
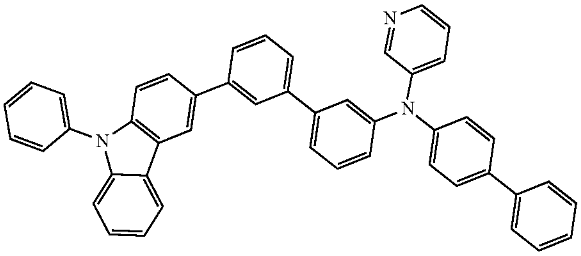
1-101
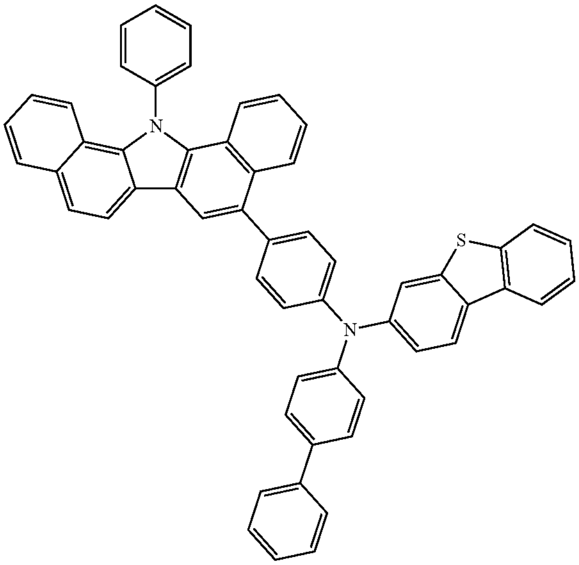
-continued
1-102
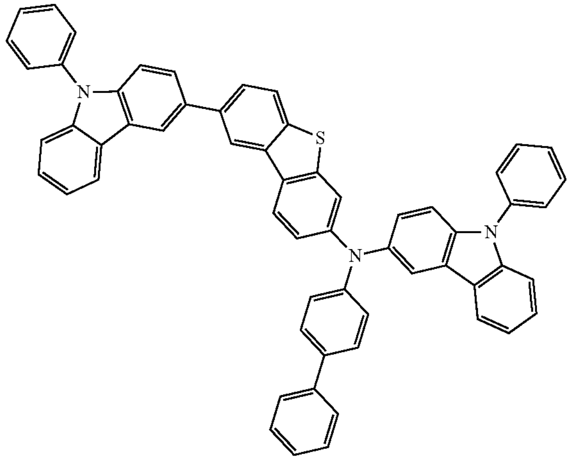
1-103
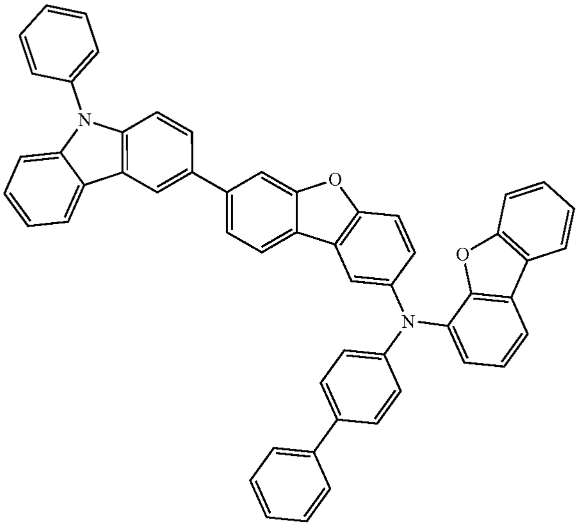
1-104
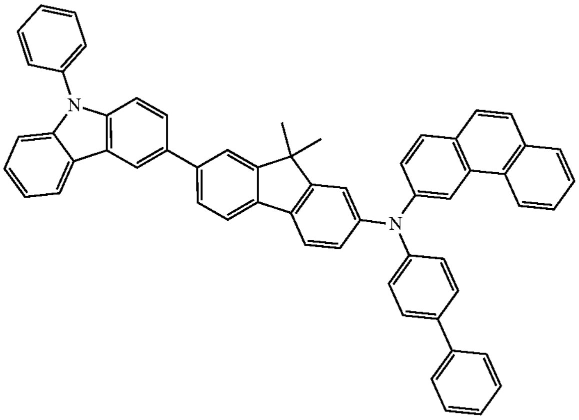

-continued
1-105
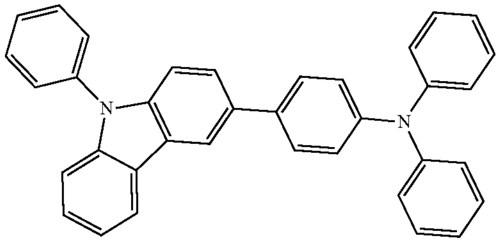
1-106
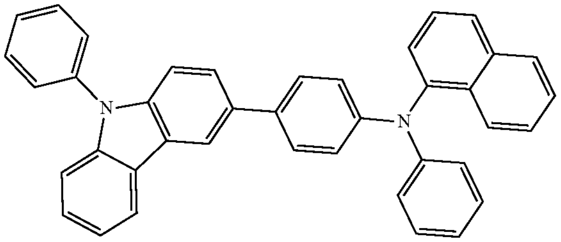
1-107
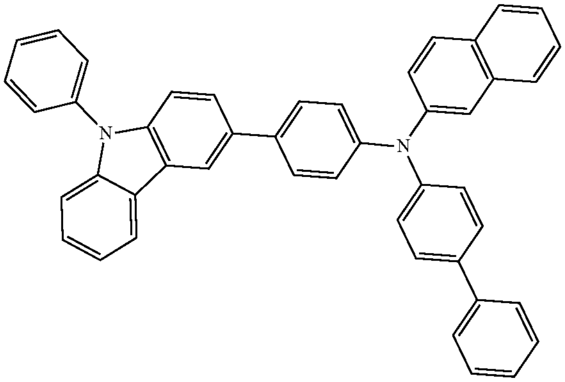
1-108
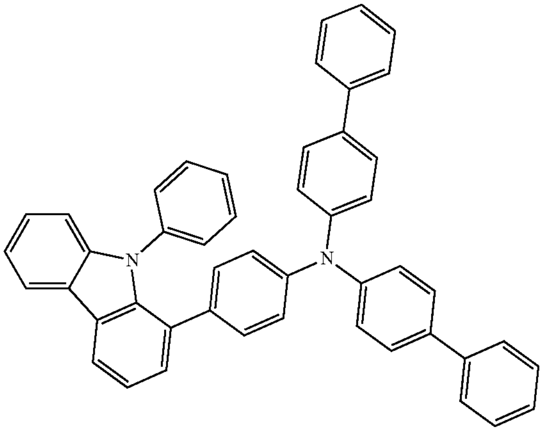
-continued
1-109
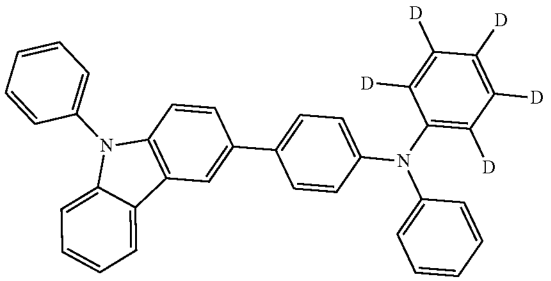
1-110
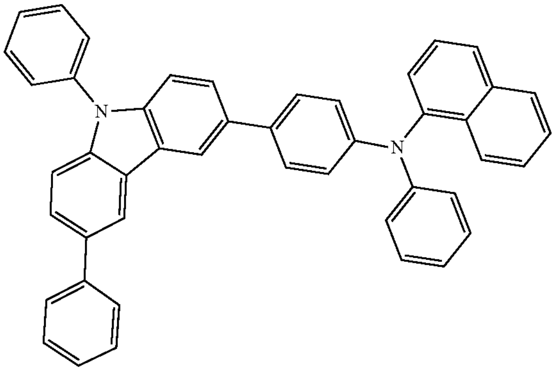
1-111
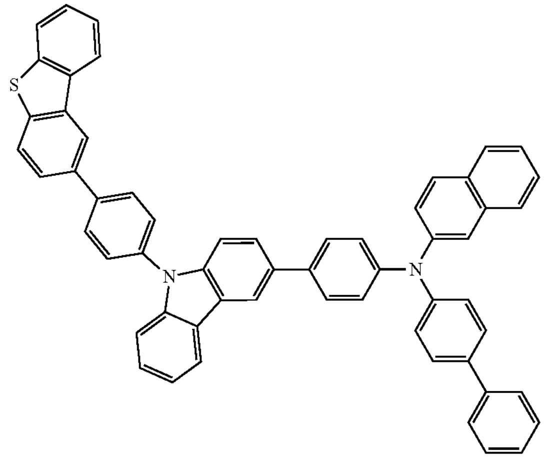

-continued
1-112
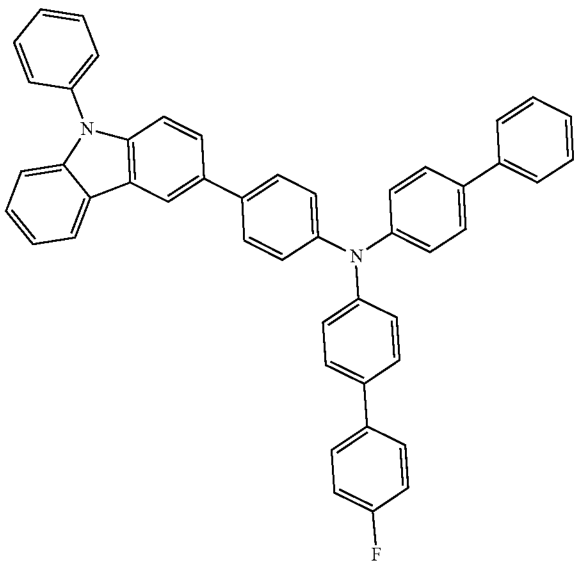
1-113
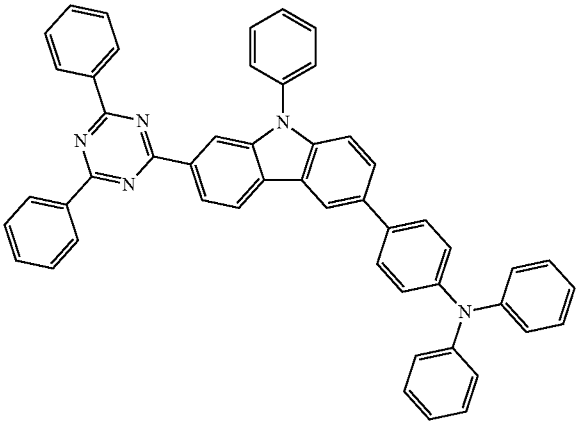
1-114
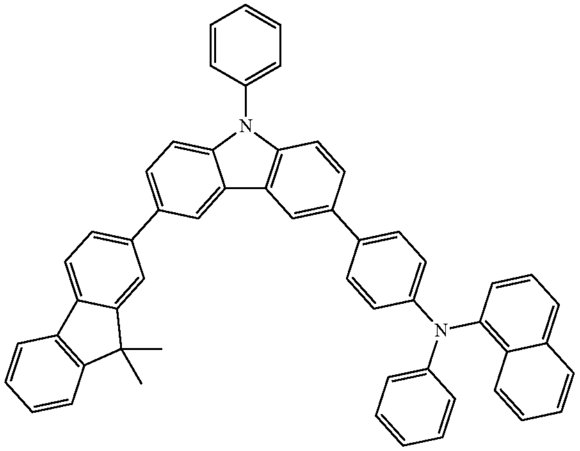
-continued
1-115
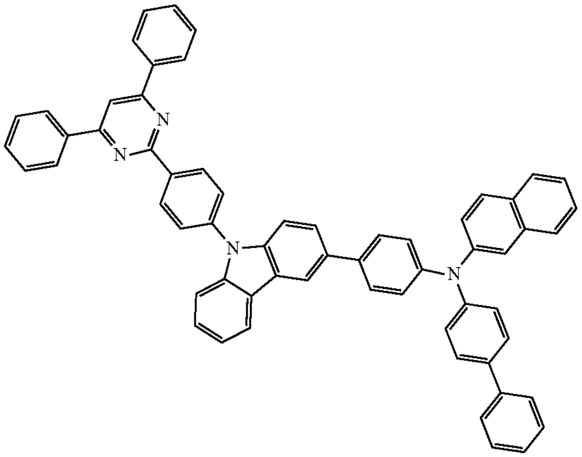
1-116
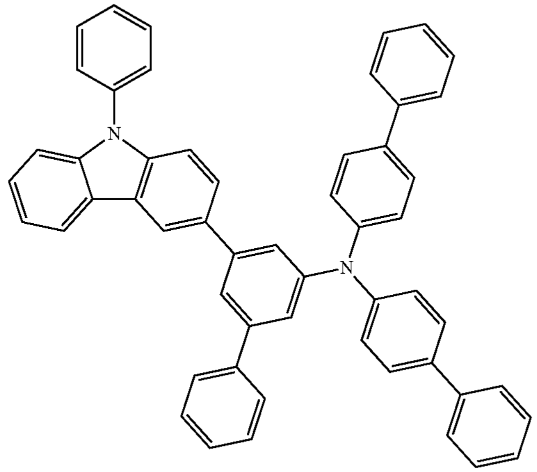
1-117
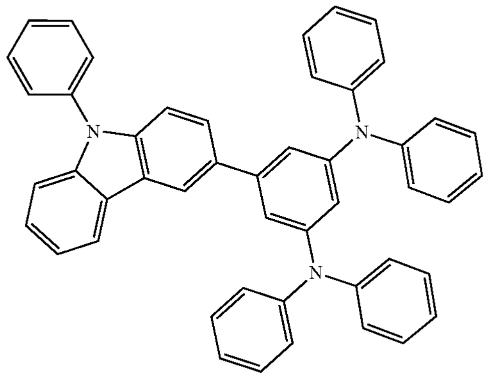

-continued
1-118
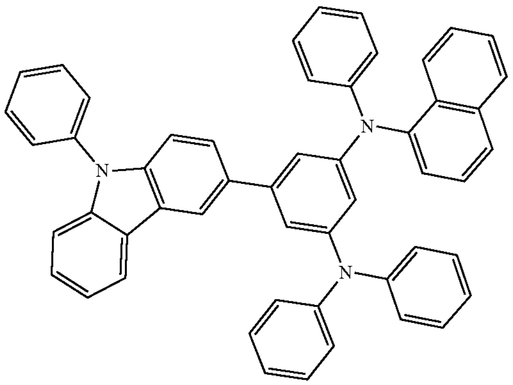
1-119
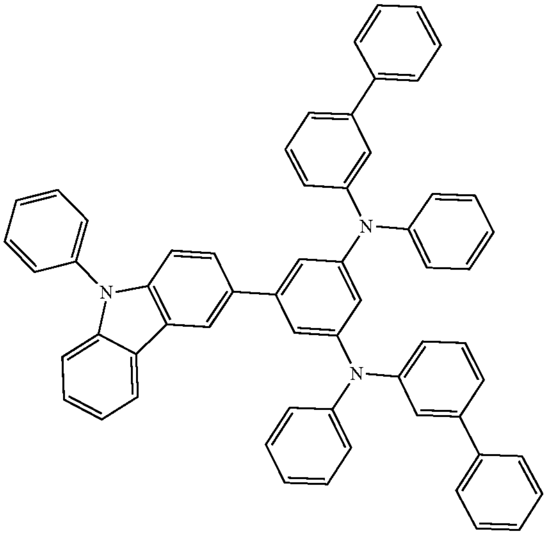
1-120
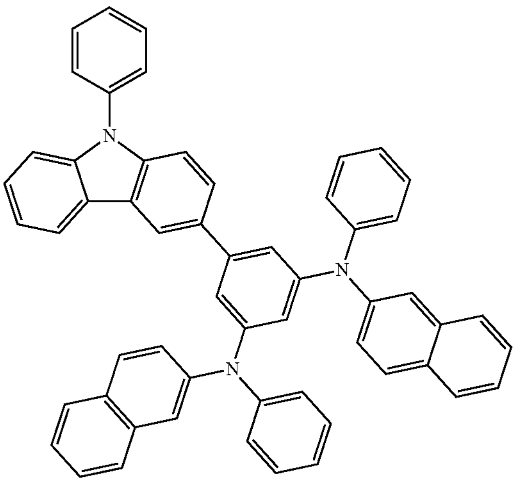
-continued
1-121
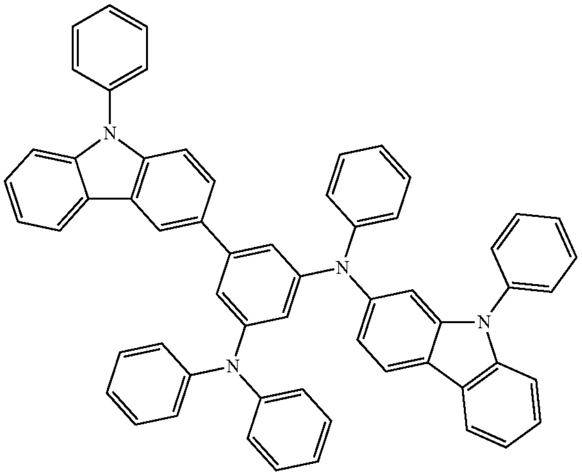
1-122
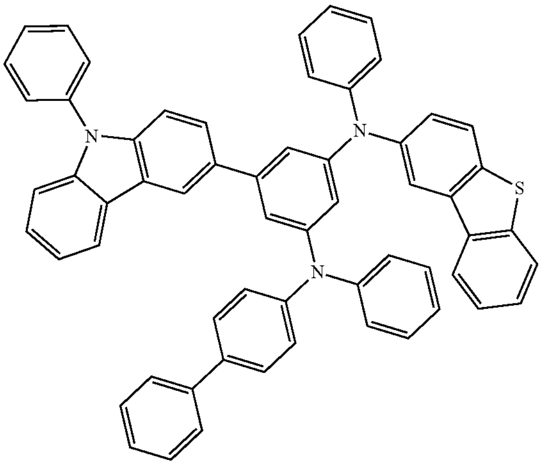
1-123
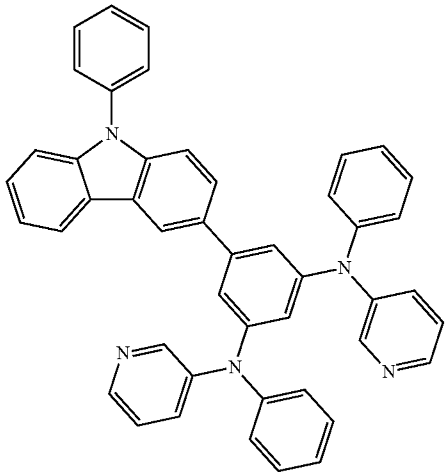

-continued
1-124
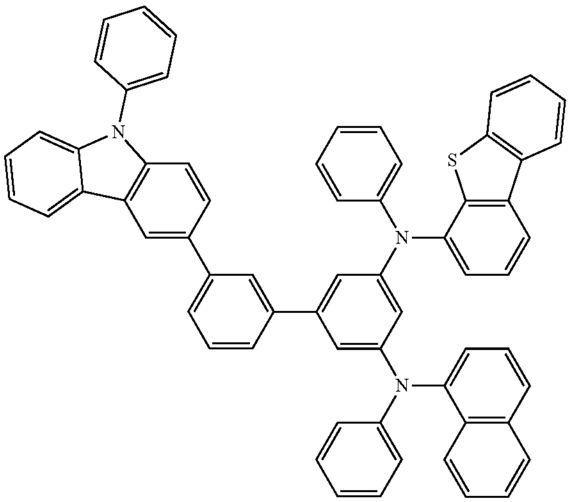
1-125
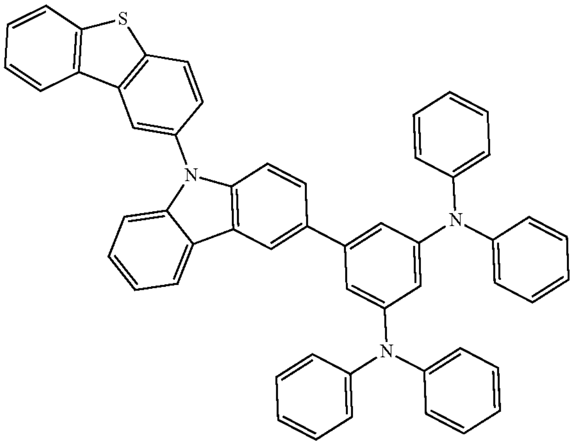
1-126
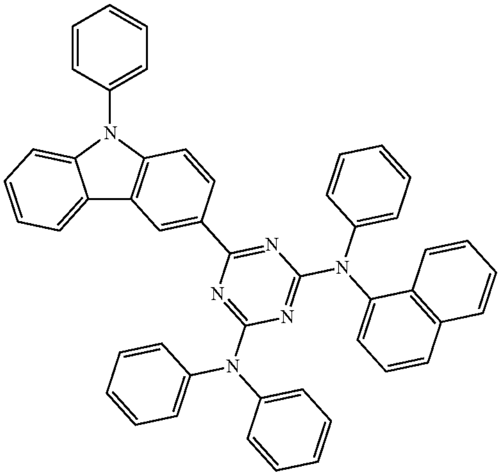
-continued
1-127
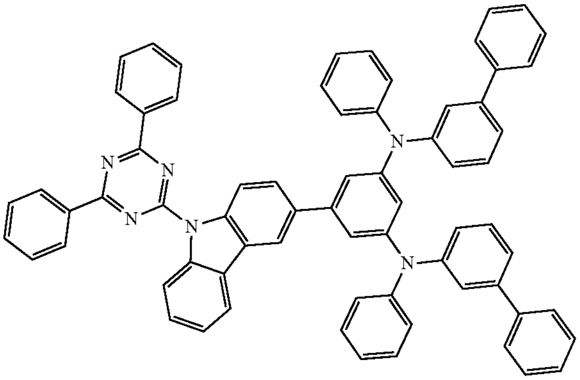
1-128
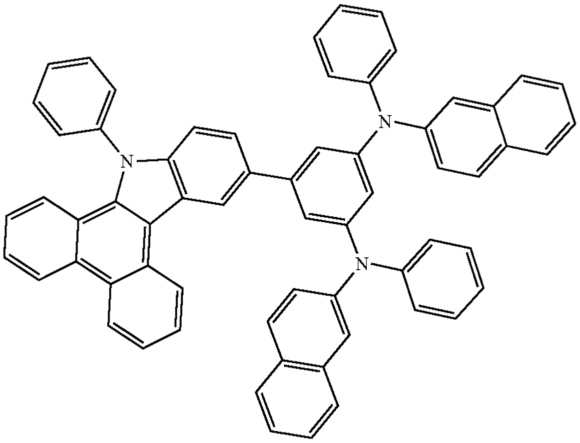
1-129
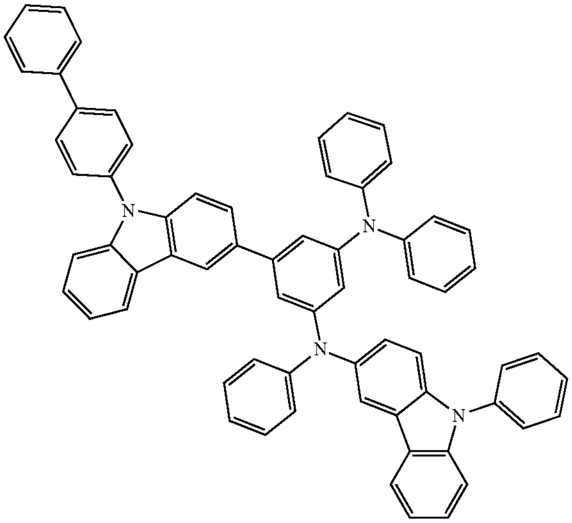

-continued
1-130
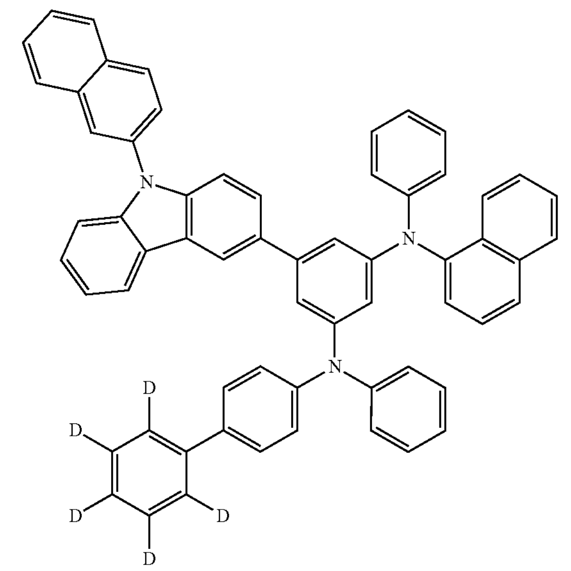
1-131
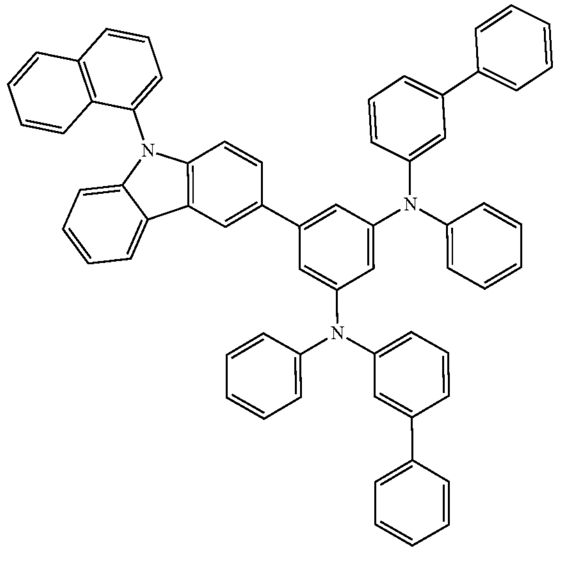
1-132
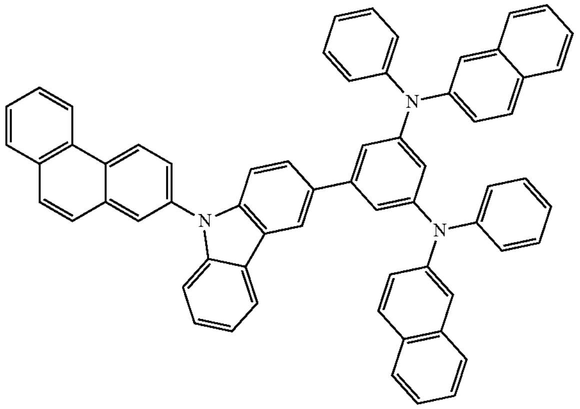
-continued
1-133
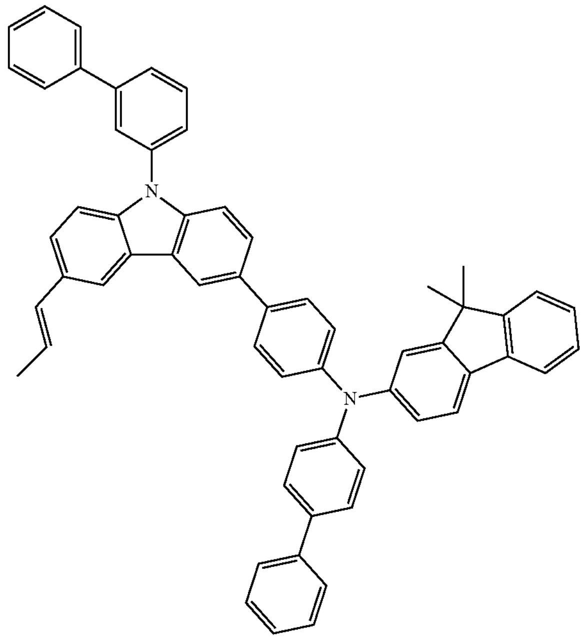
1-134
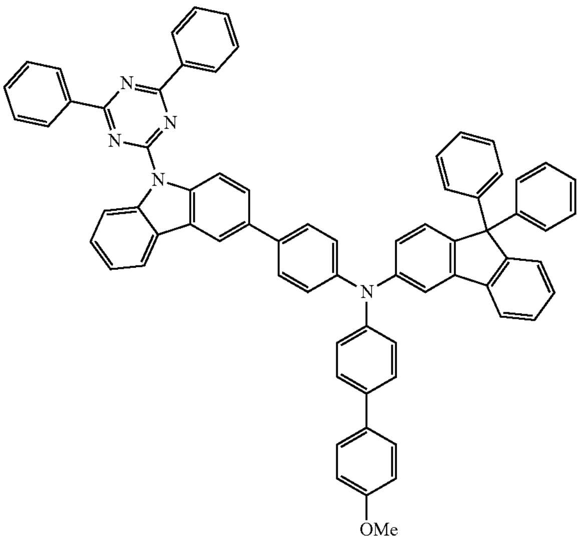

-continued
1-135
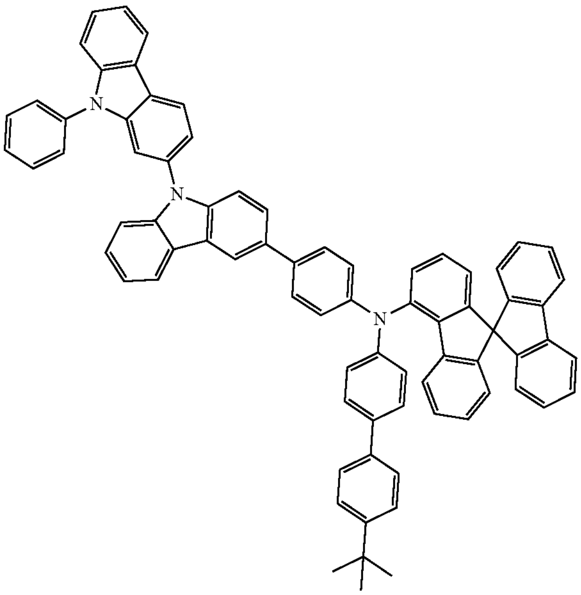
1-136
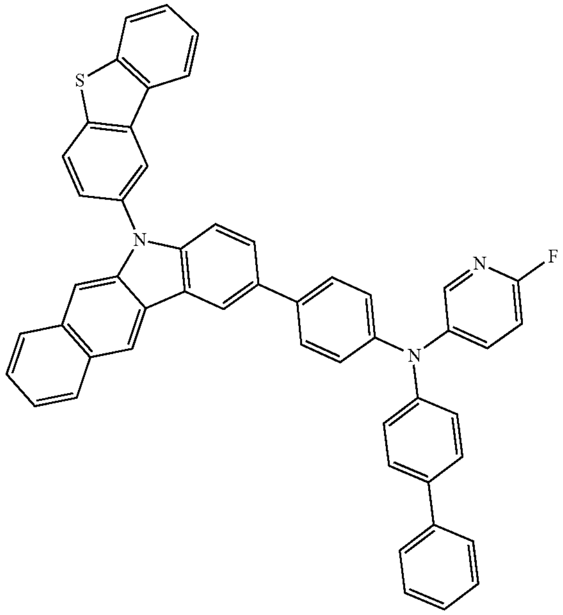
1-137
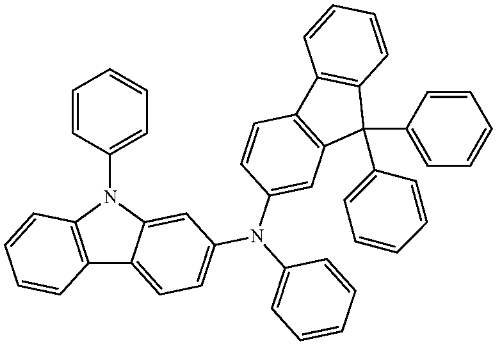
-continued
2-1
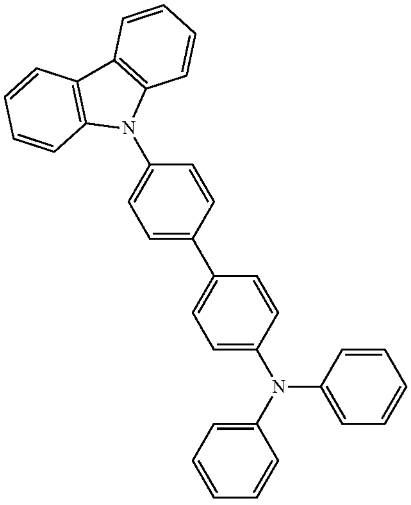
2-2
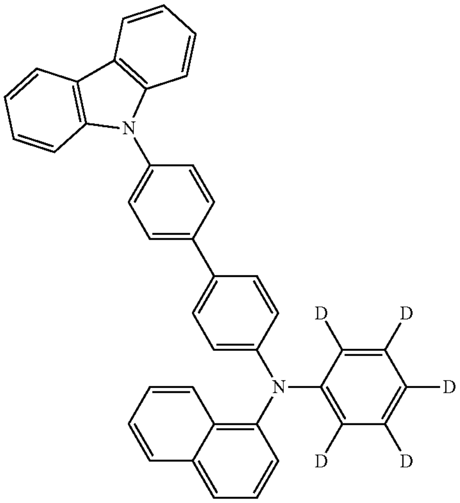
2-3
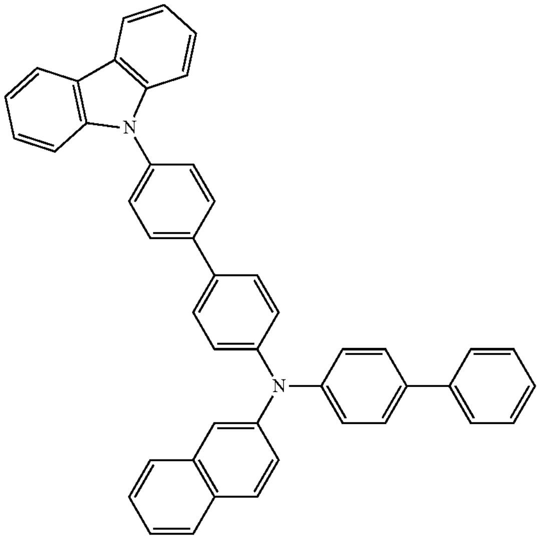

-continued
2-4
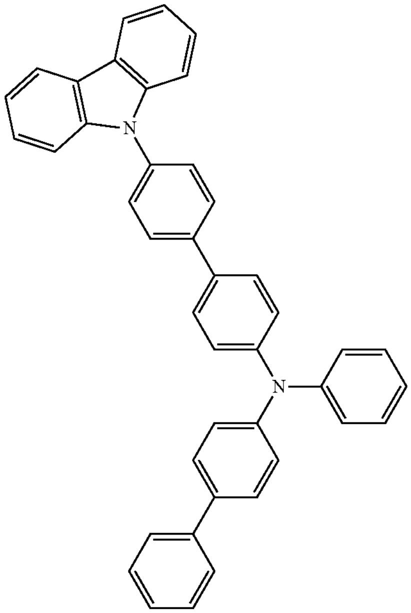
2-5
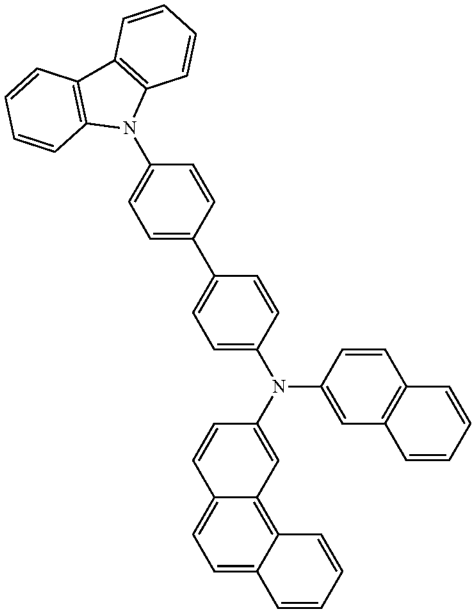
-continued
2-6
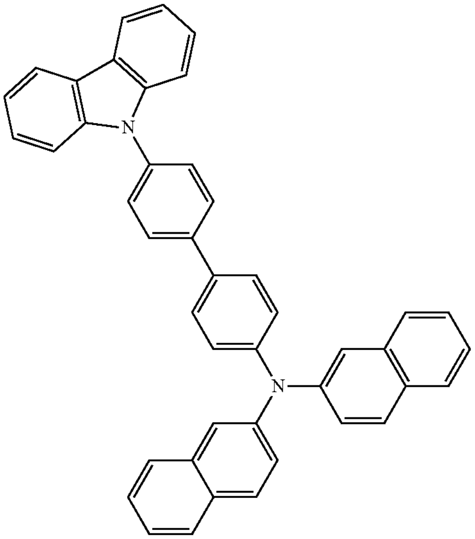
2-7
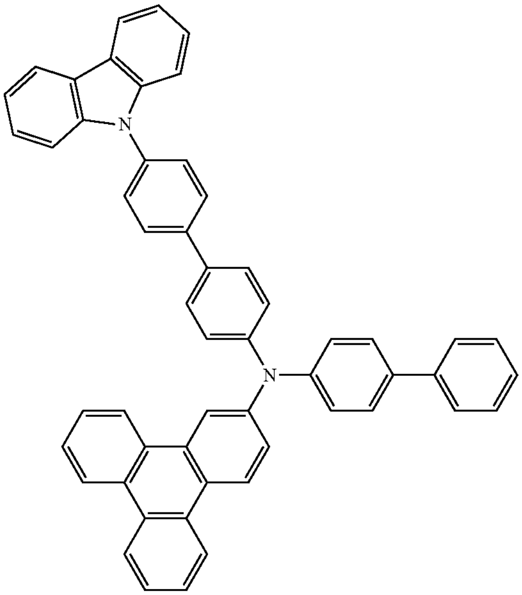

-continued
2-8
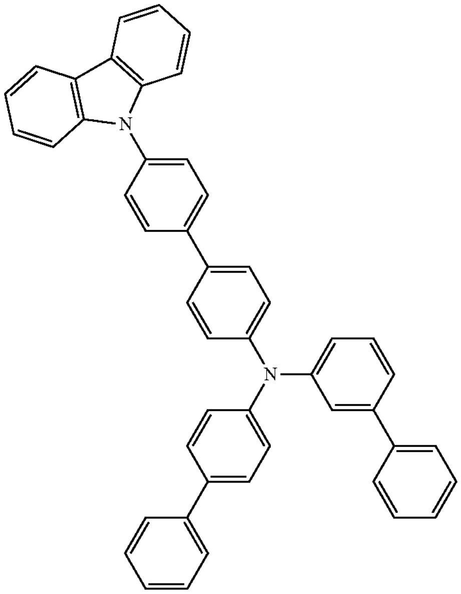
2-9
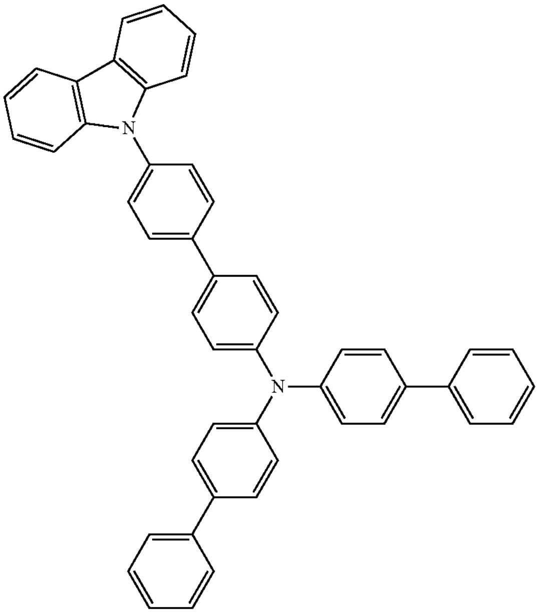
-continued
2-10
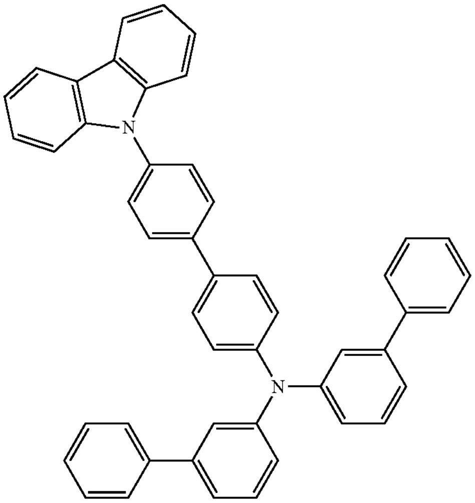
2-11
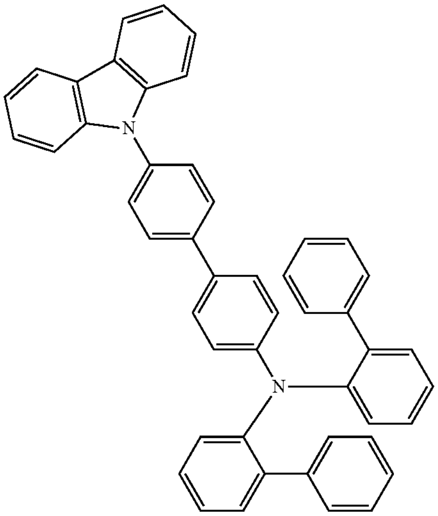

-continued
2-12
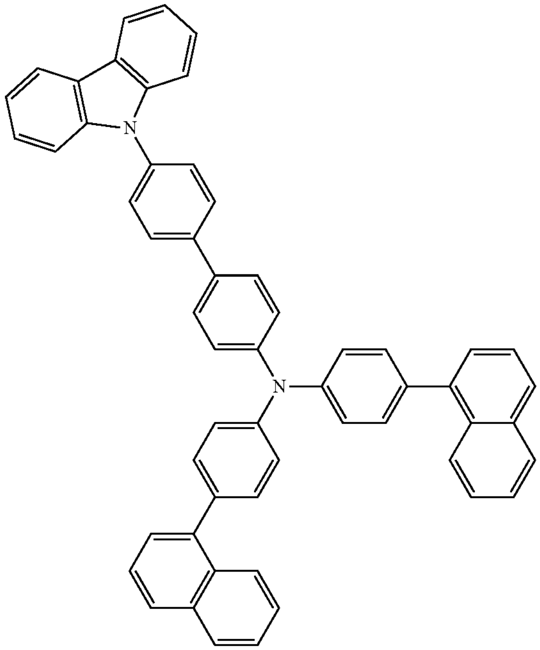
2-13
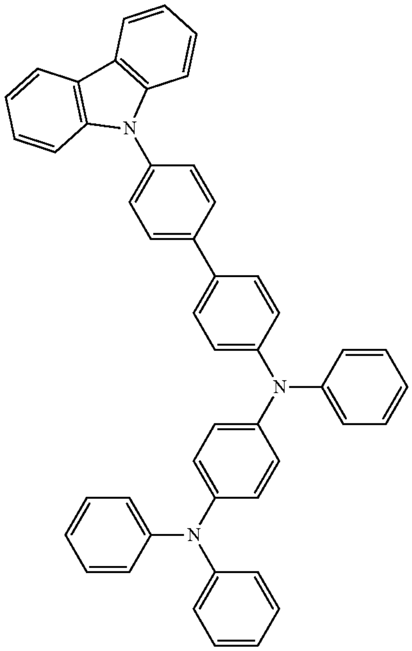
-continued
2-14
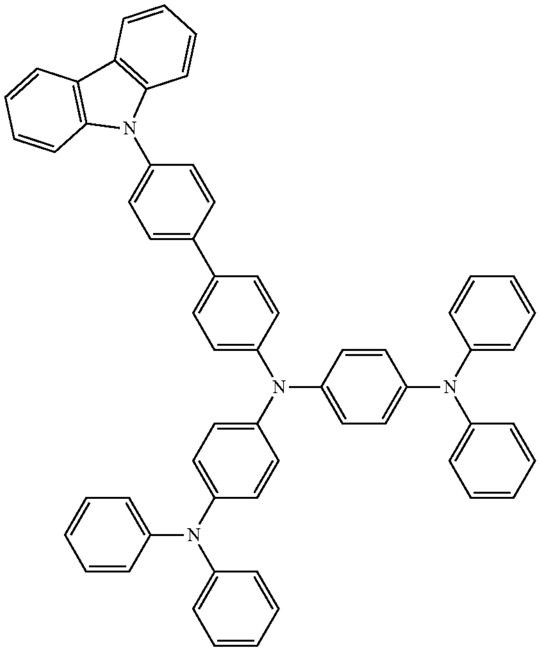
2-15
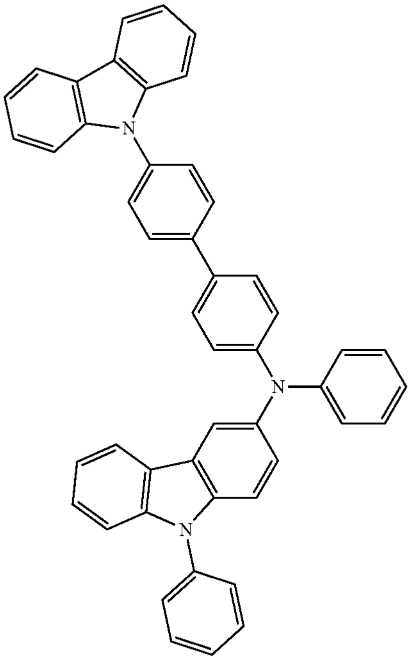

-continued
2-16
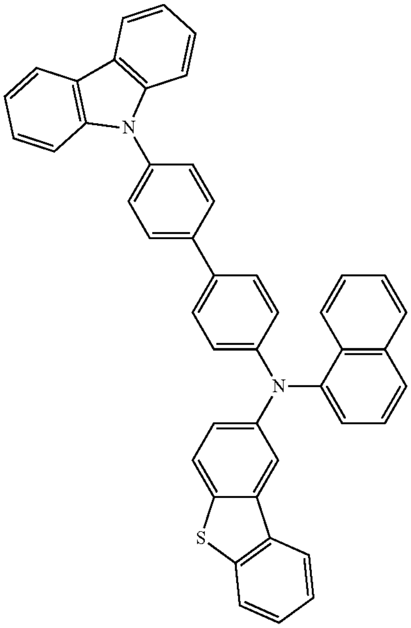
2-17
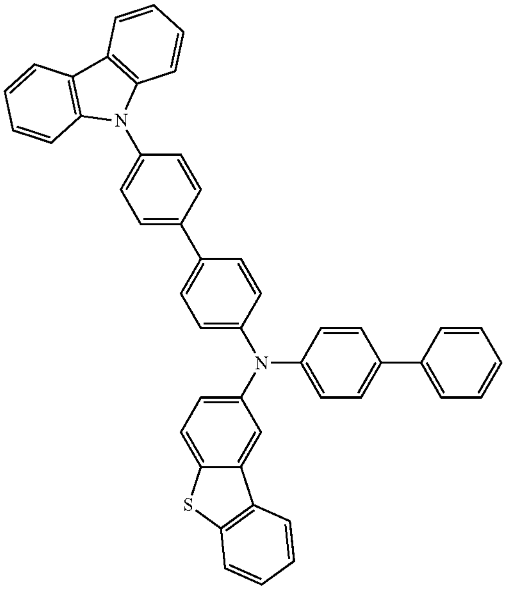
-continued
2-18
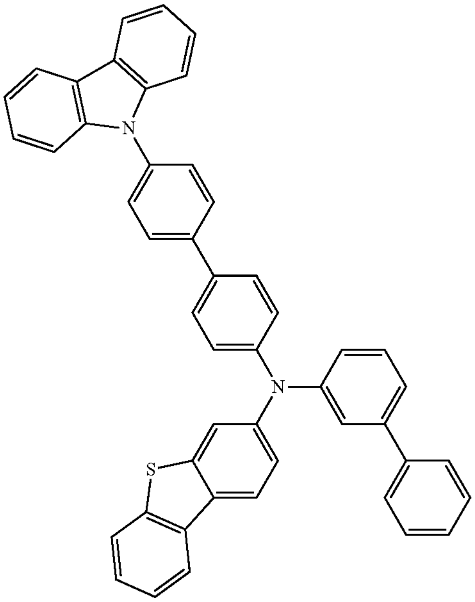
2-19
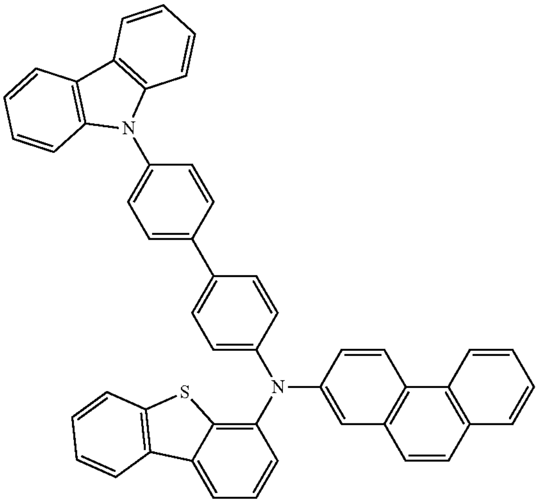

-continued
2-20
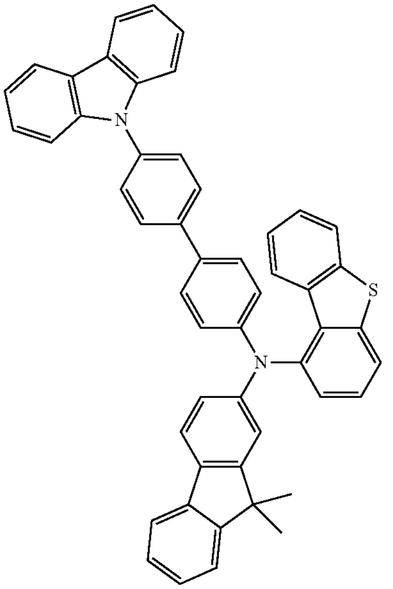
2-21
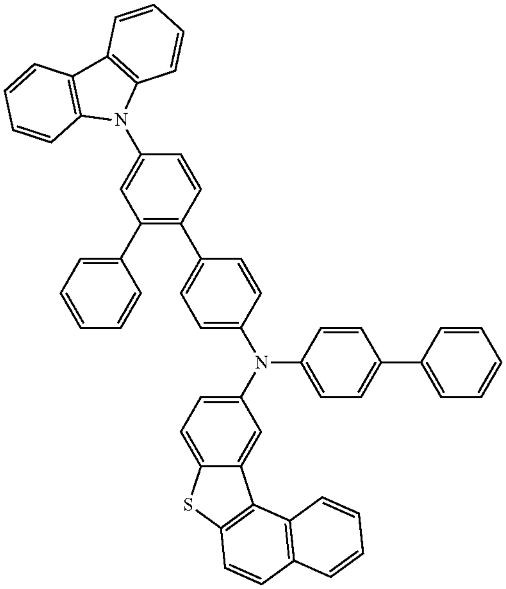
-continued
2-22
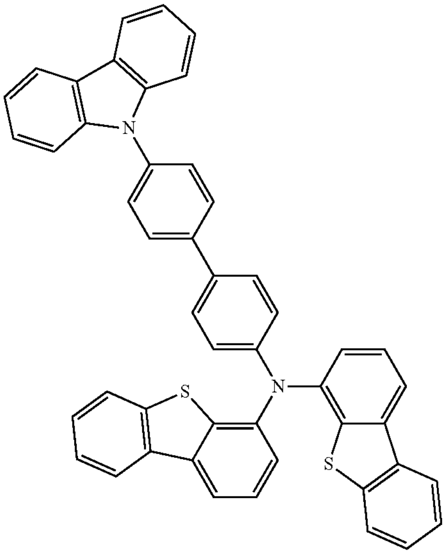
2-23
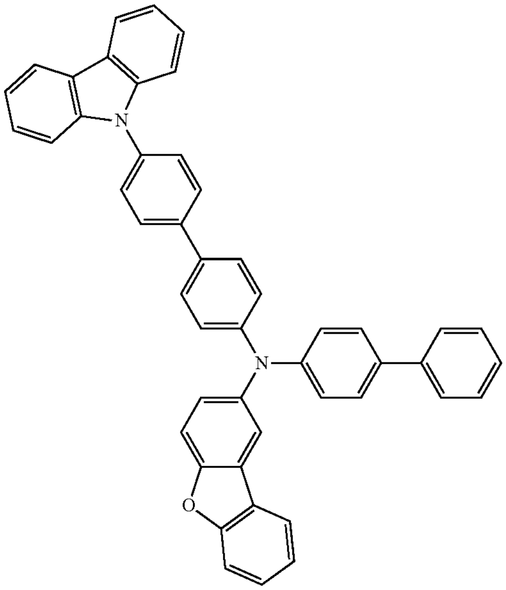

-continued
2-24
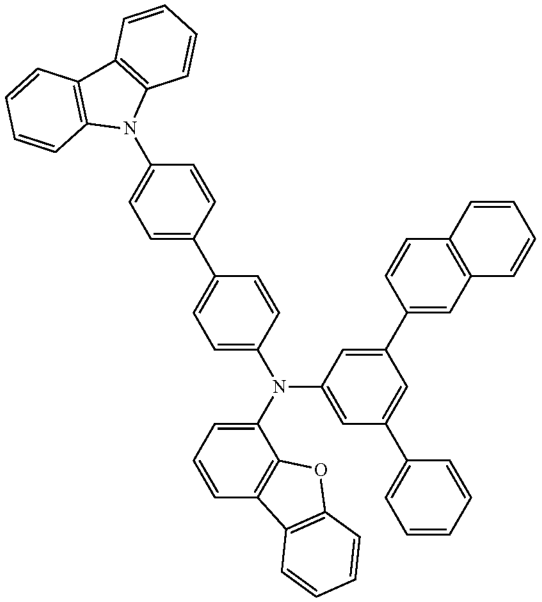
2-25
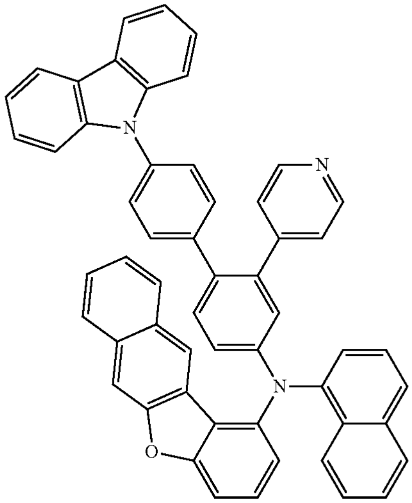
-continued
2-26
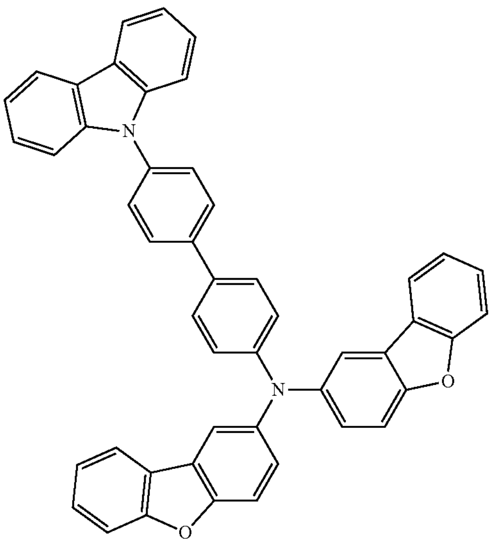
2-27
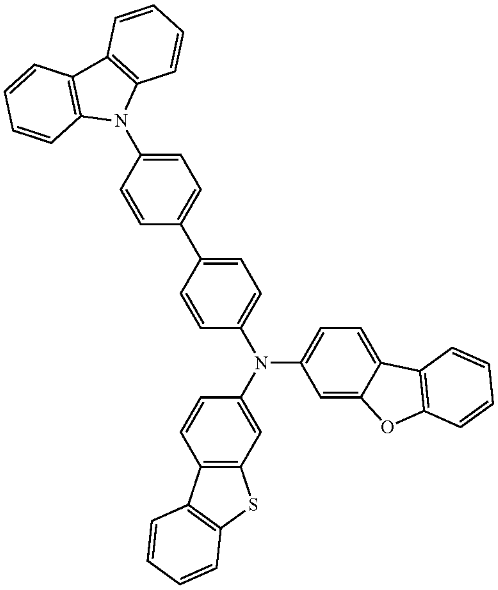

-continued
2-28
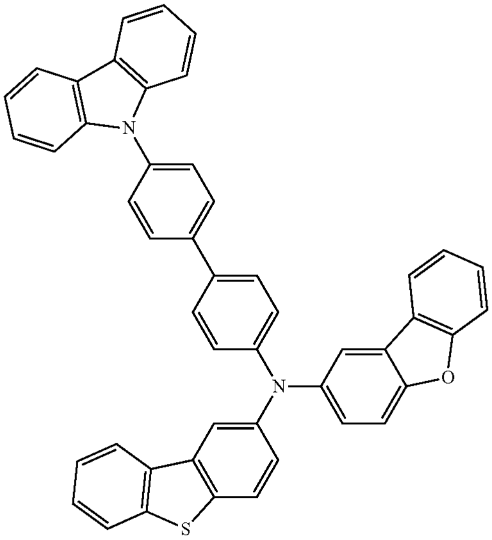
2-29
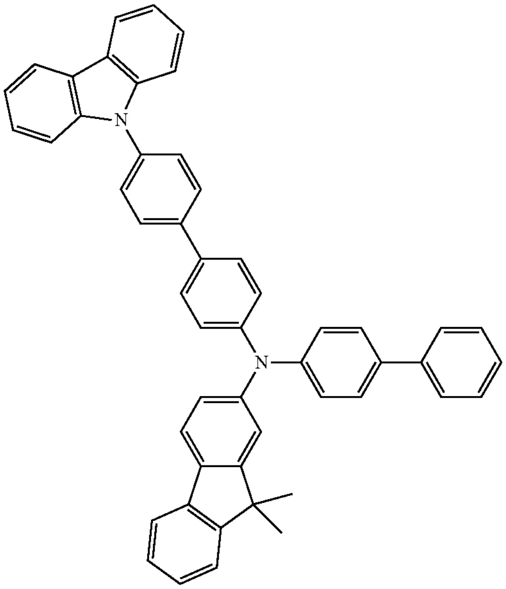
2-30
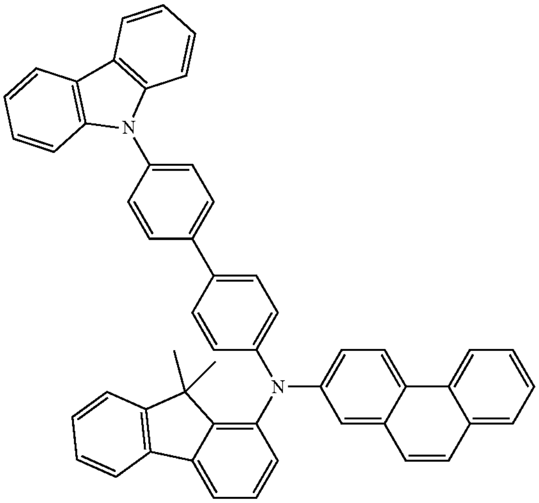
-continued
2-31
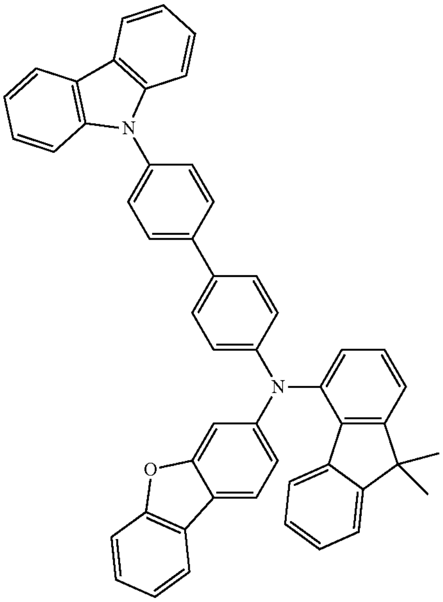
2-32
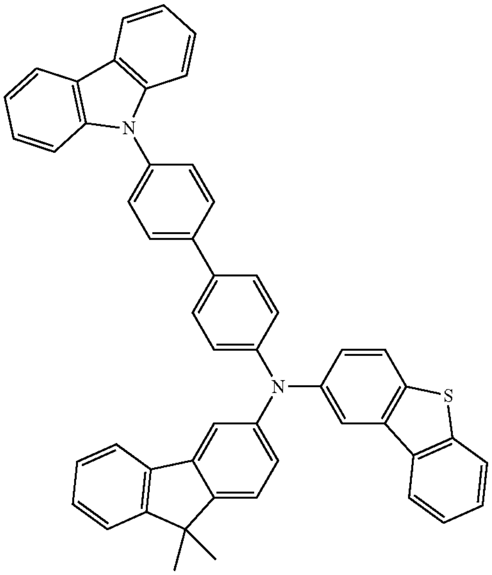

-continued
2-33
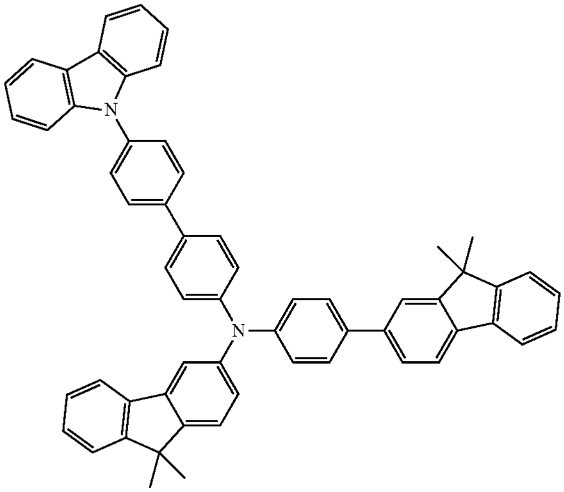
2-34
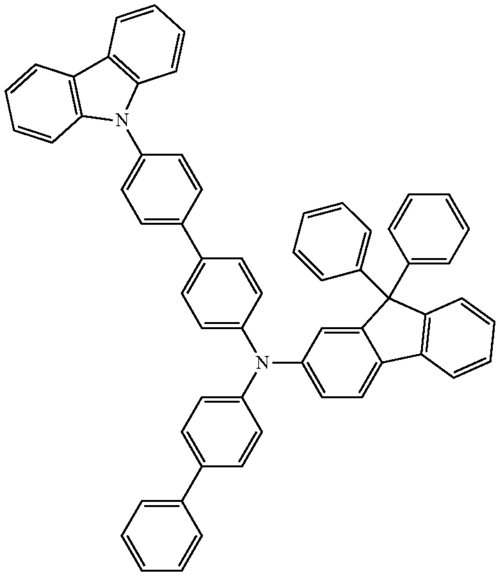
2-35
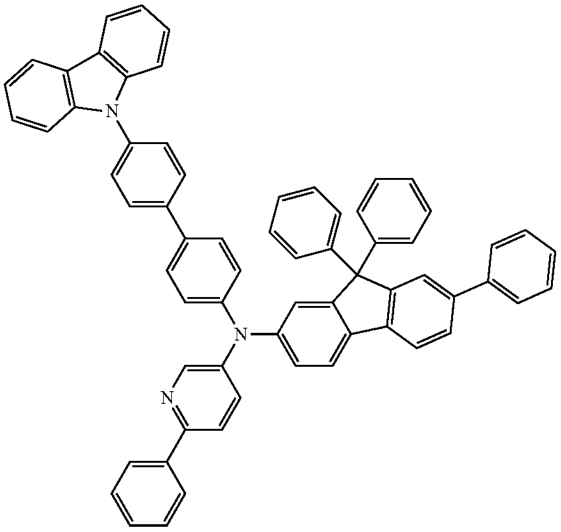
-continued
2-36
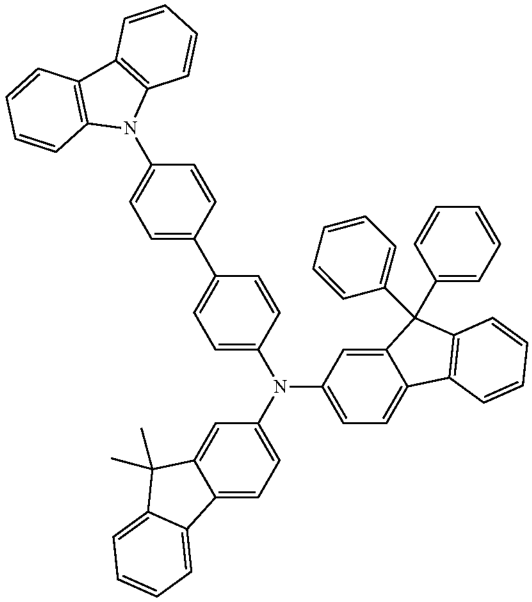
2-37
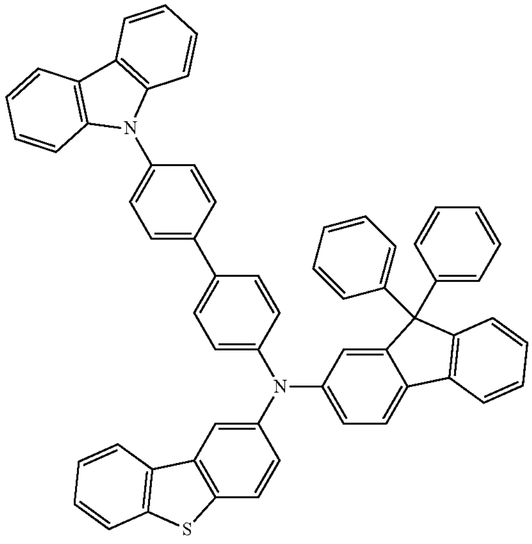

-continued
2-38
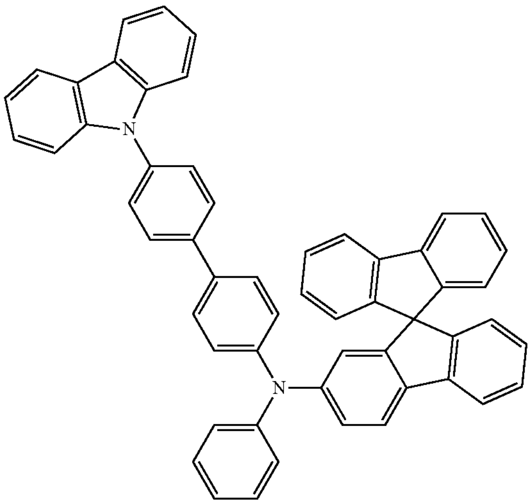
2-39
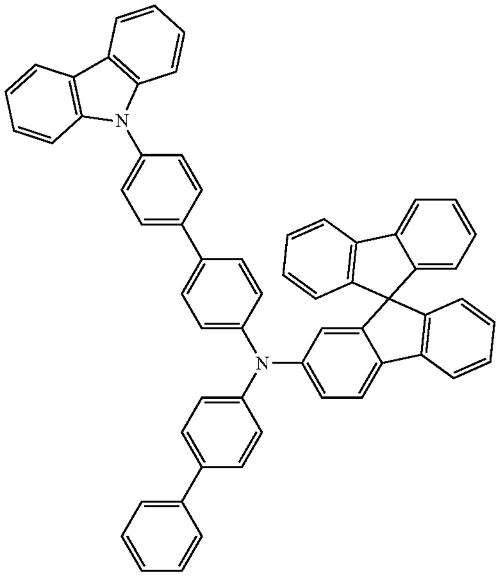
-continued
2-40
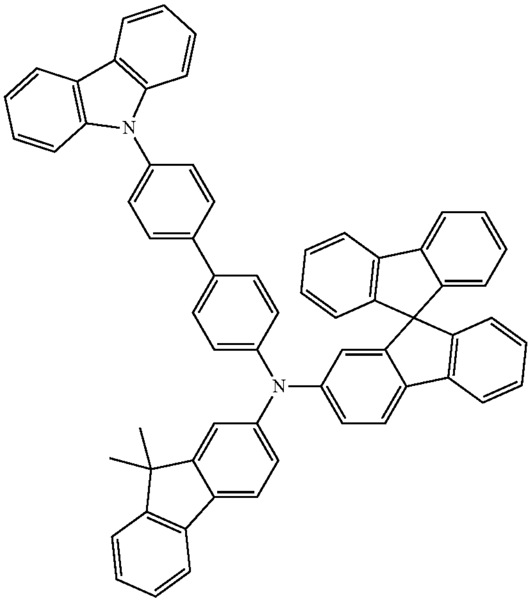
2-41
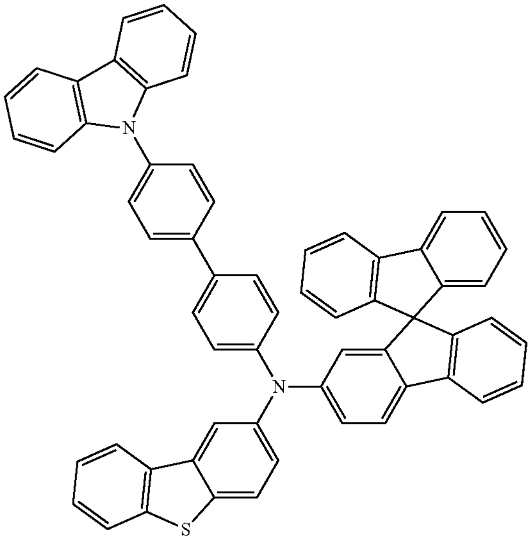

-continued
2-42
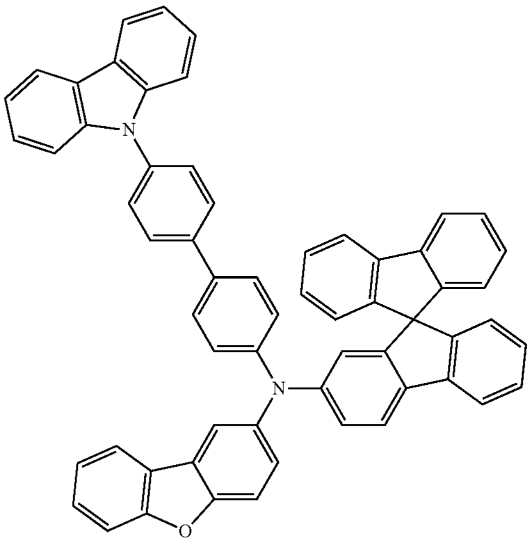
2-44
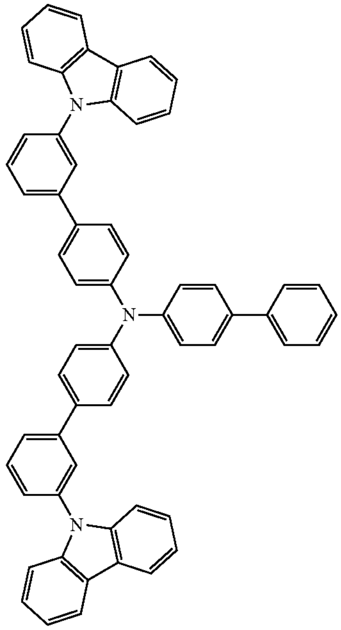
2-43
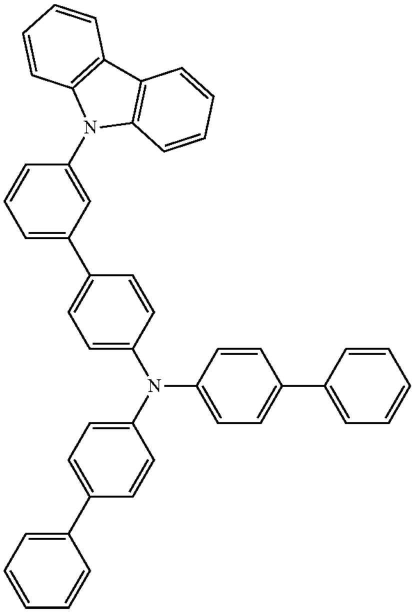
2-45
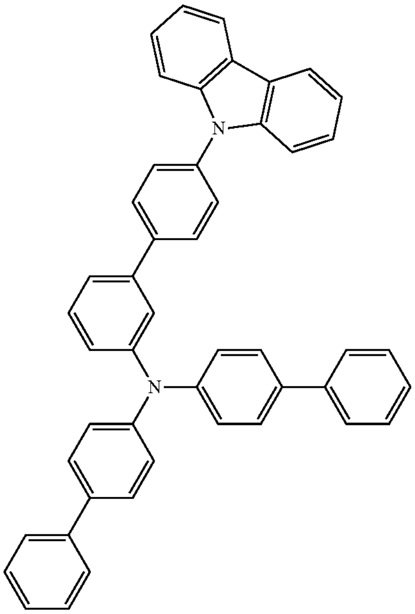

-continued
2-46
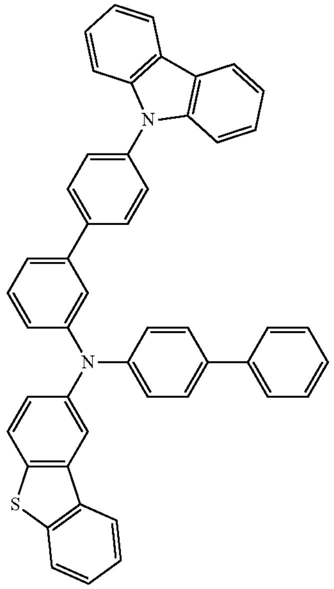
2-47
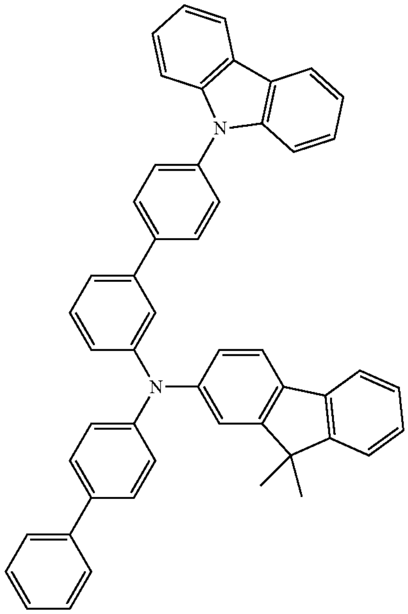
-continued
2-48
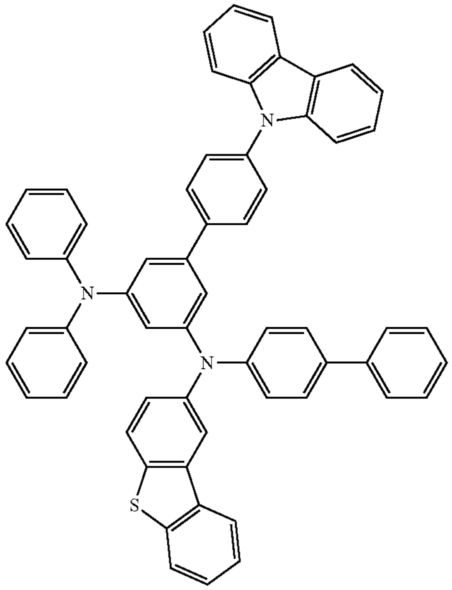
2-49
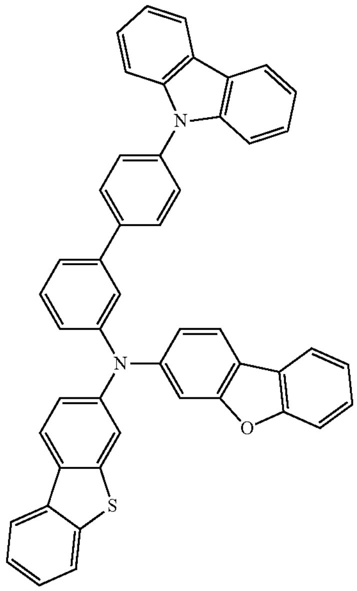
2-50
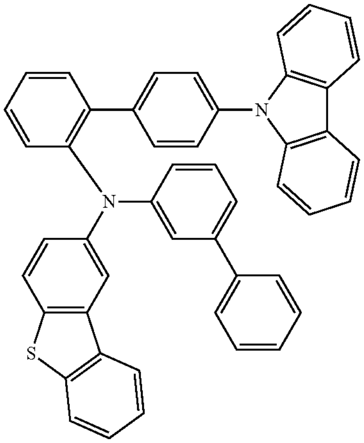

-continued
2-51
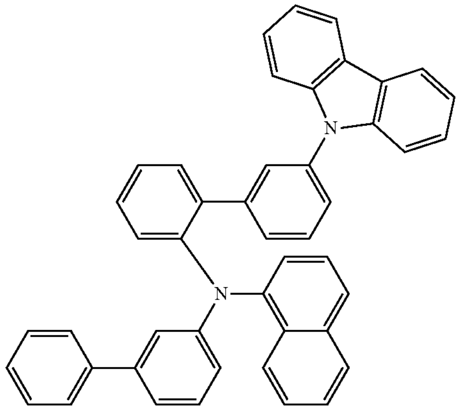
2-52
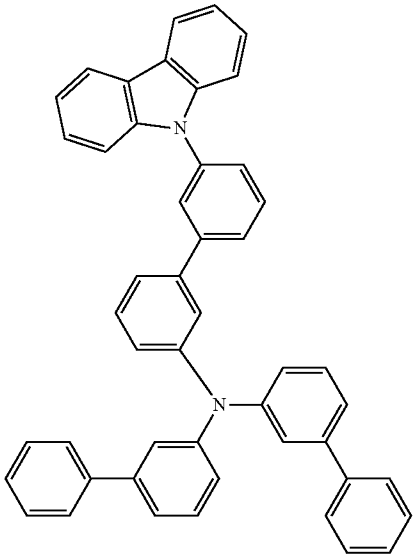
2-53
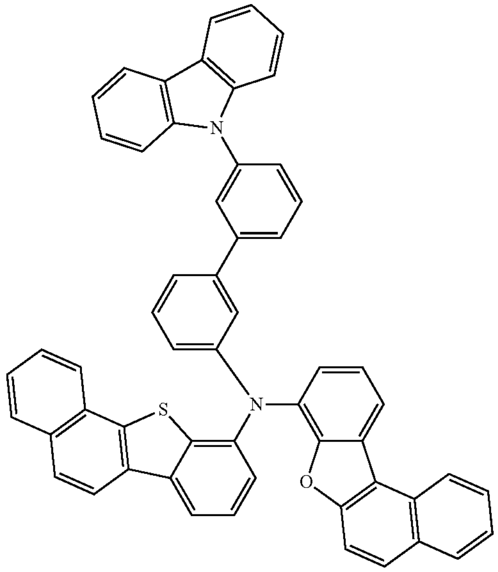
-continued
2-54
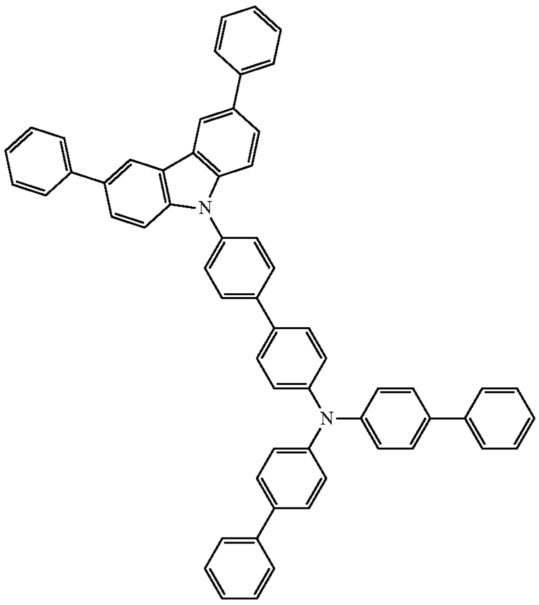
2-55
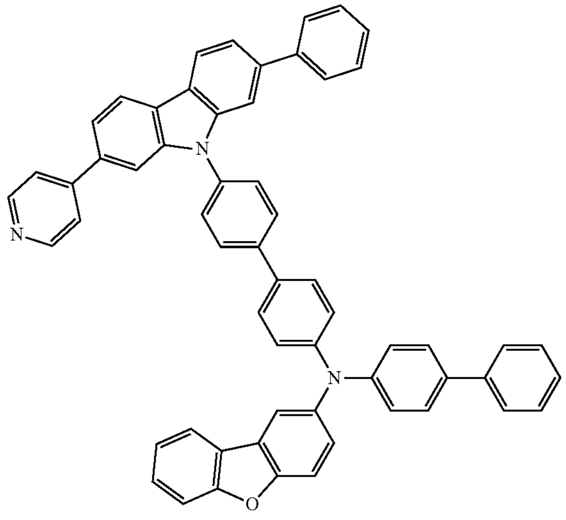
2-56
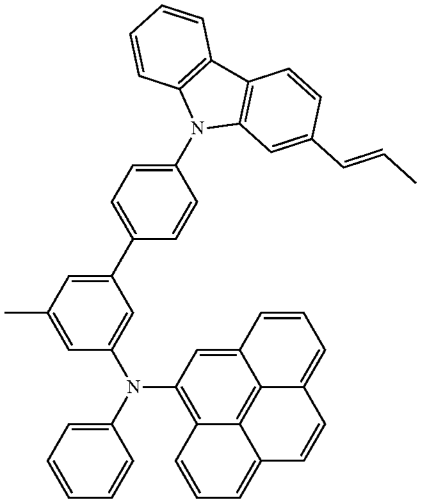

-continued
2-57
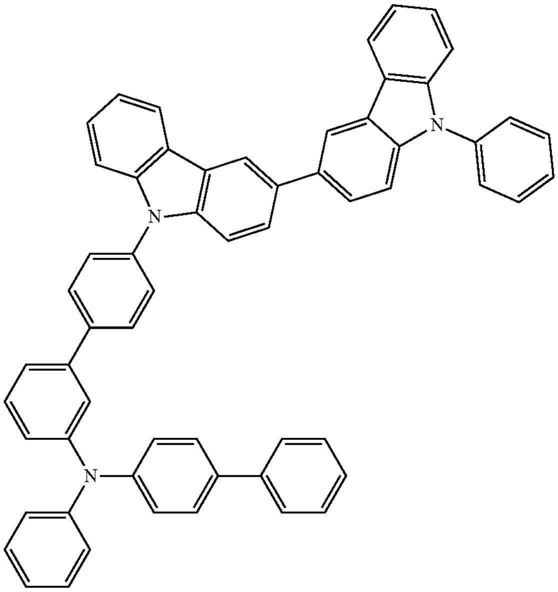
2-58
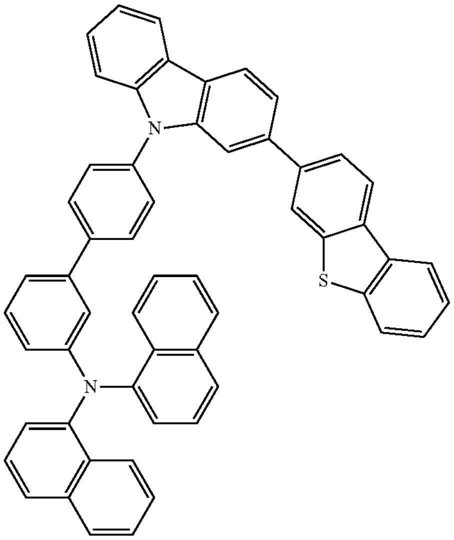
2-59
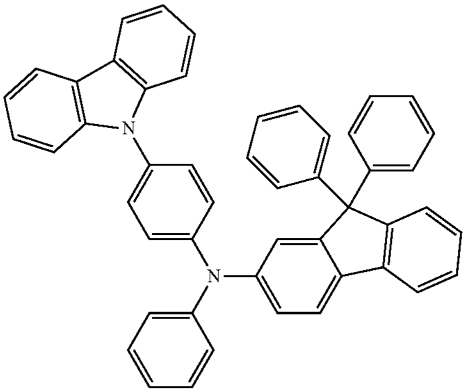
-continued
2-60
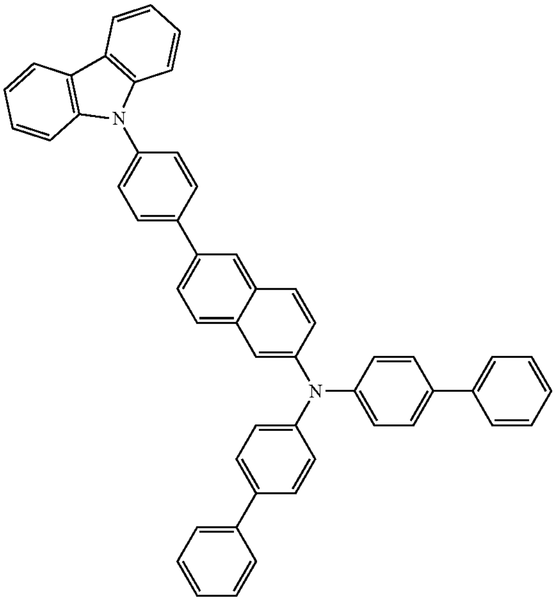
2-61
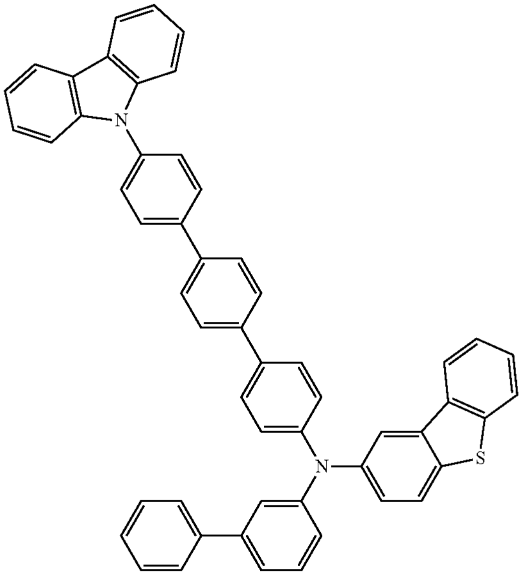
2-62
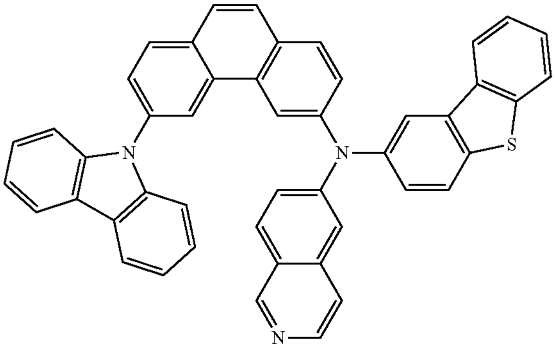

-continued
2-63
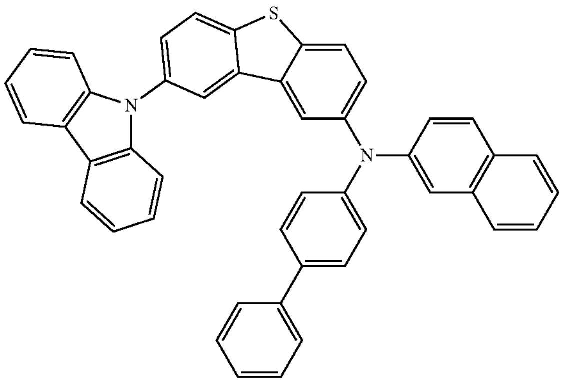
2-64
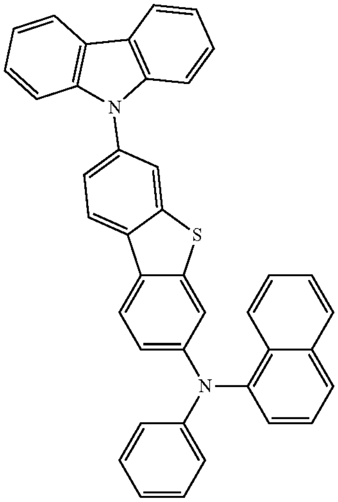
2-65
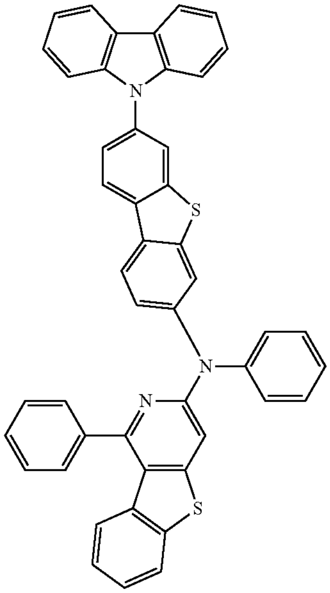
-continued
2-66
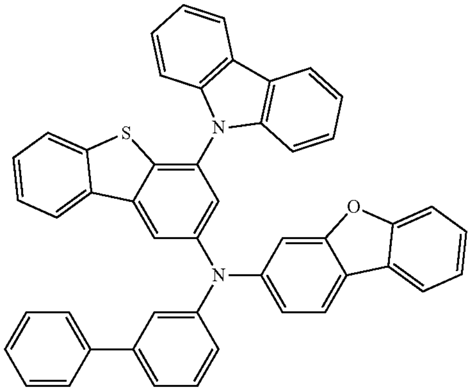
2-67
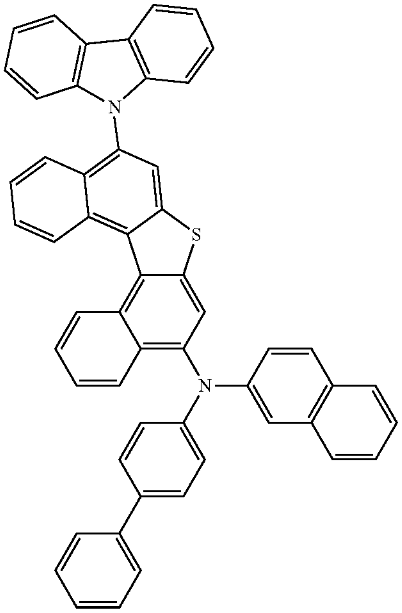
2-68
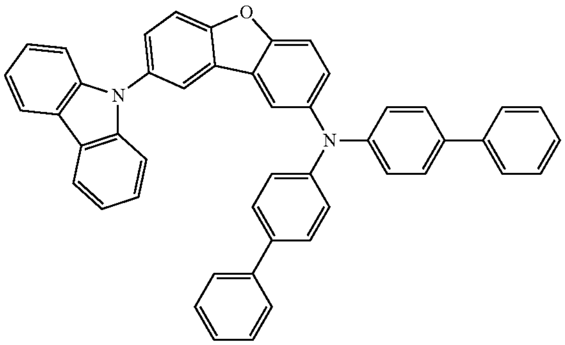

-continued
2-69
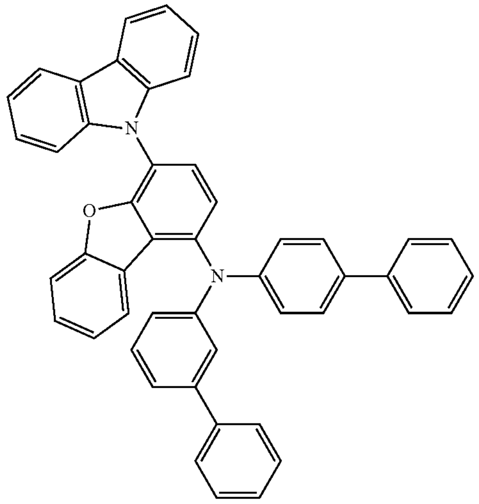
2-70
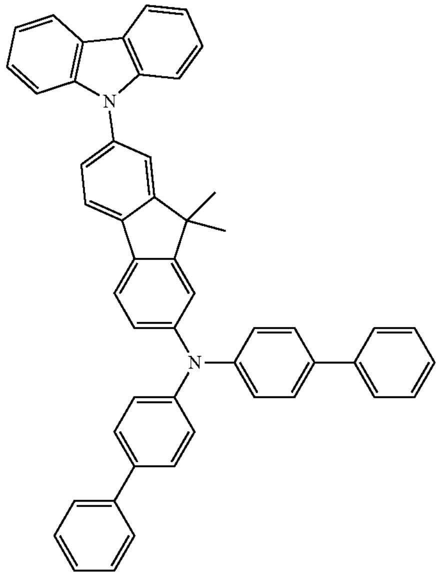
2-71
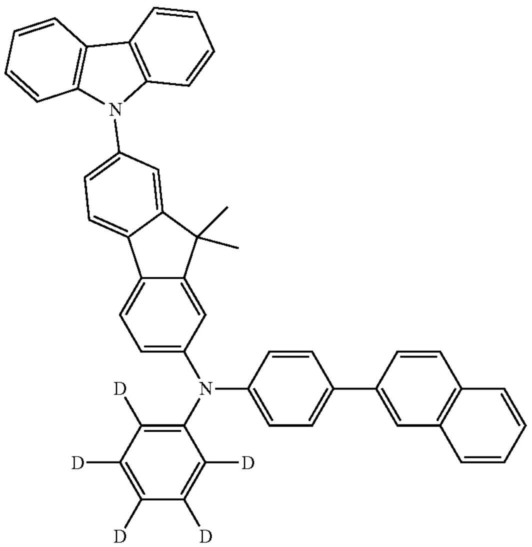
-continued
2-72
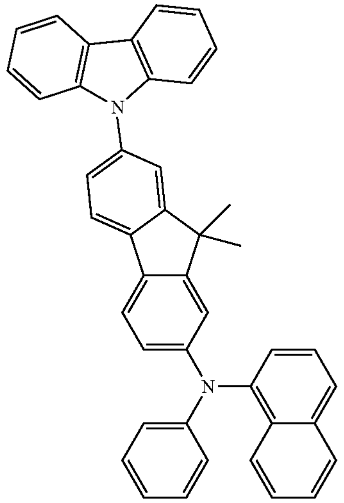
2-73
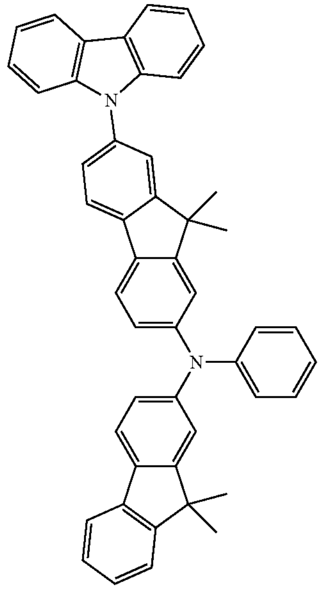

-continued
2-74
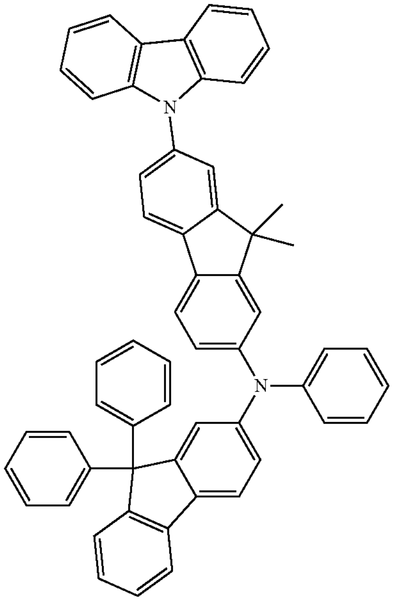
2-75
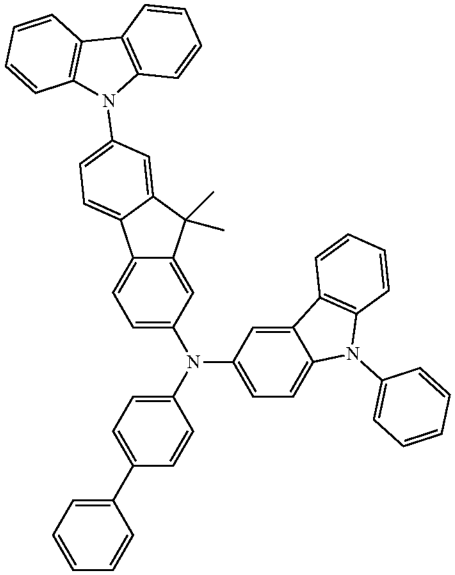
-continued
2-76
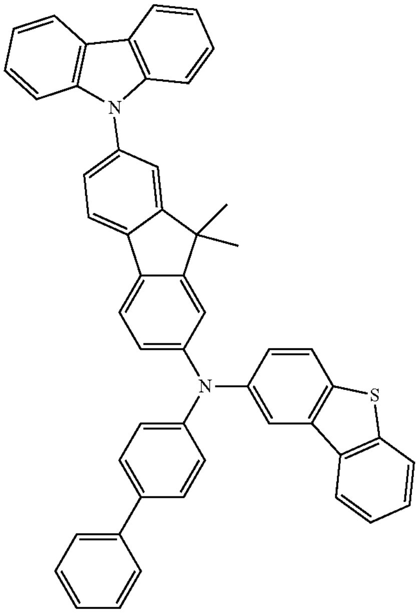
2-77
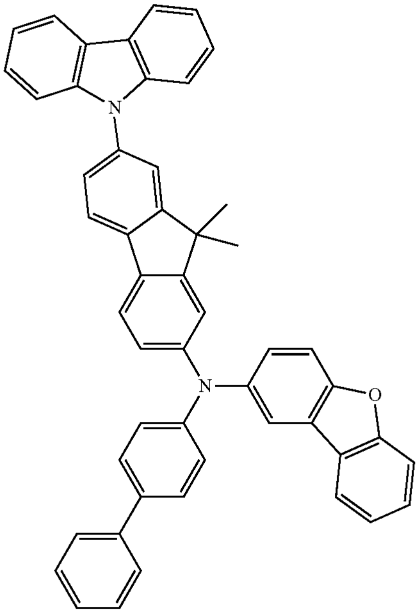

-continued
2-78
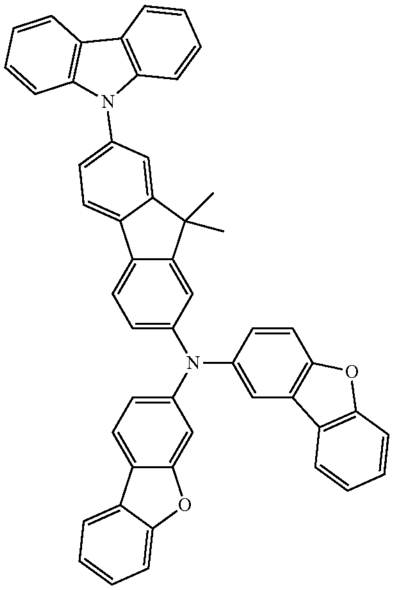
2-79
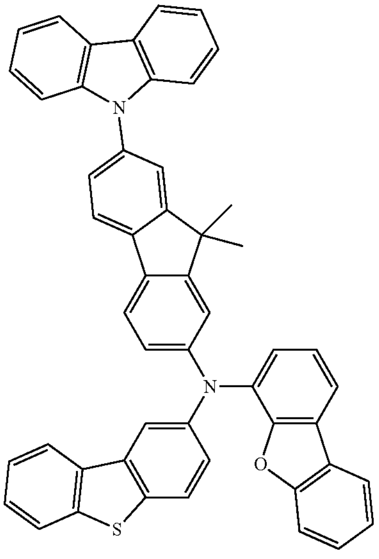
-continued
2-80
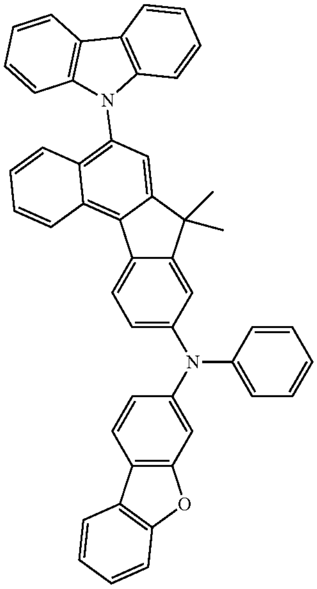
2-81
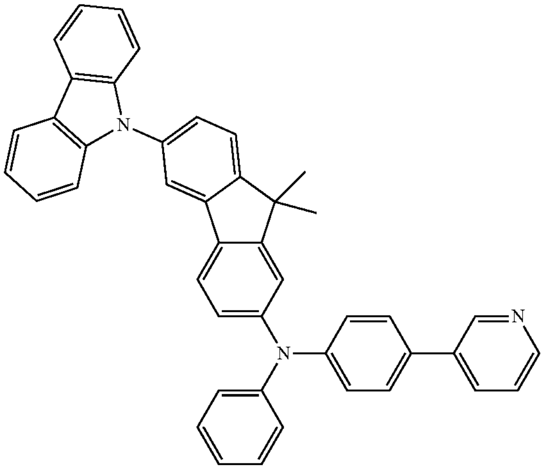

-continued
2-82
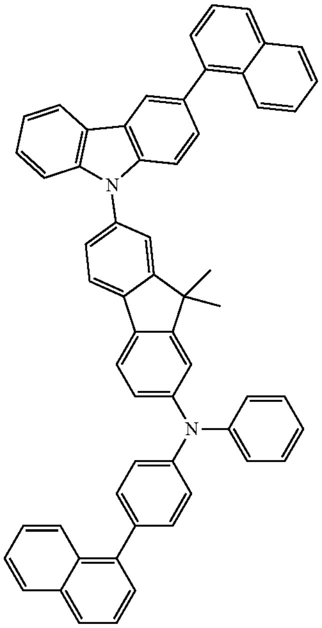
2-83
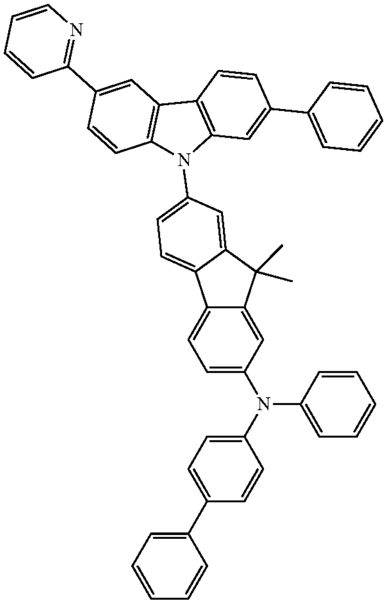
-continued
2-84
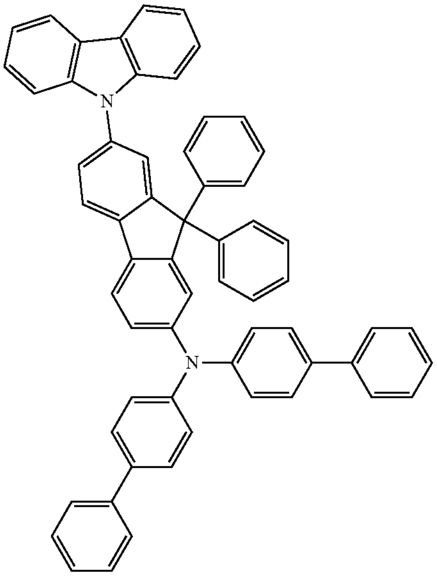
2-85
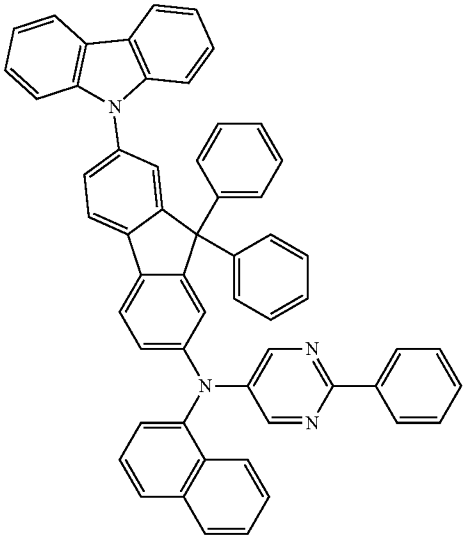

-continued
2-86
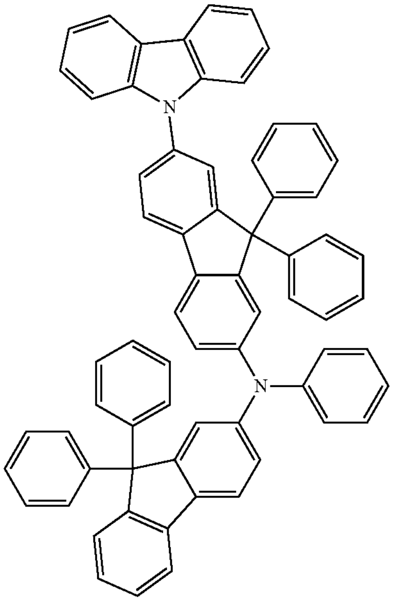
2-87
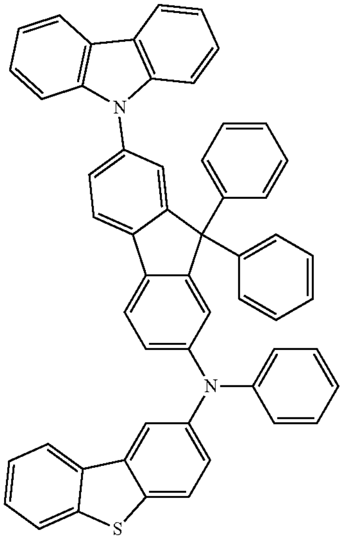
-continued
2-88
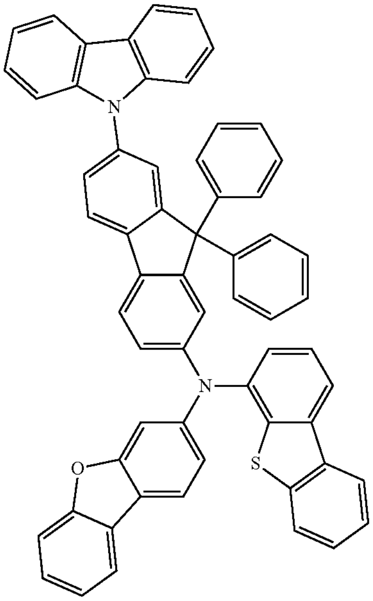
2-89
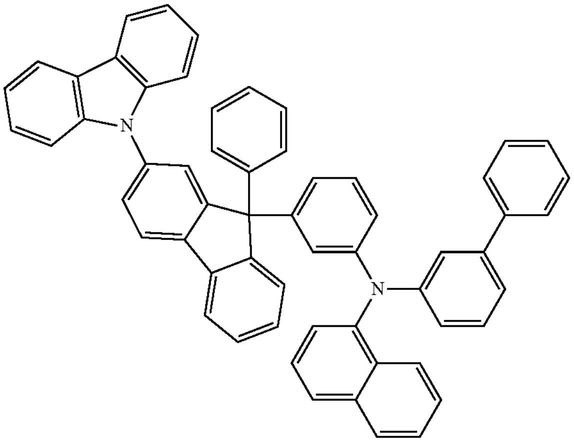
2-90
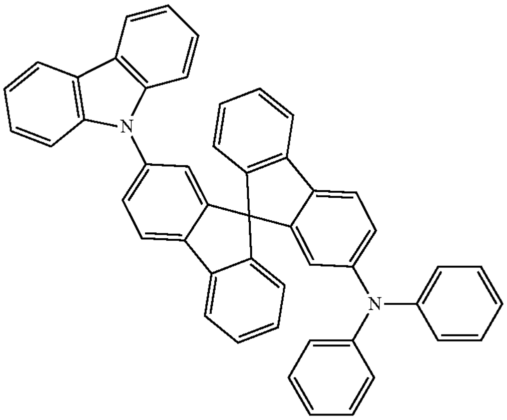

2-91
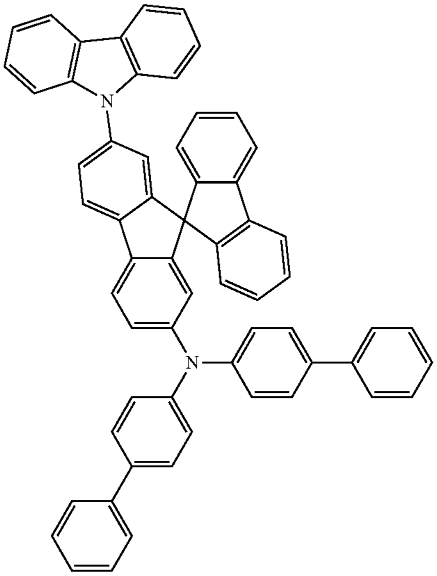
2-92
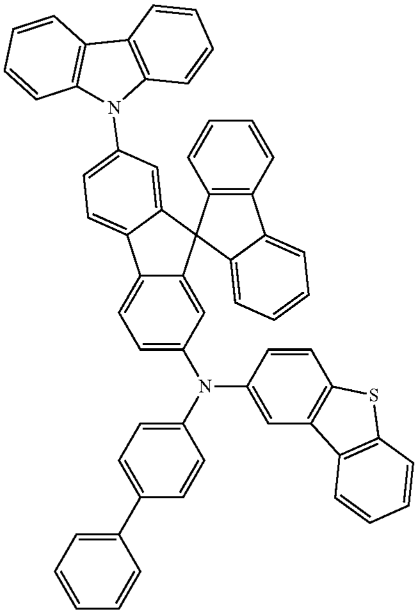
2-93
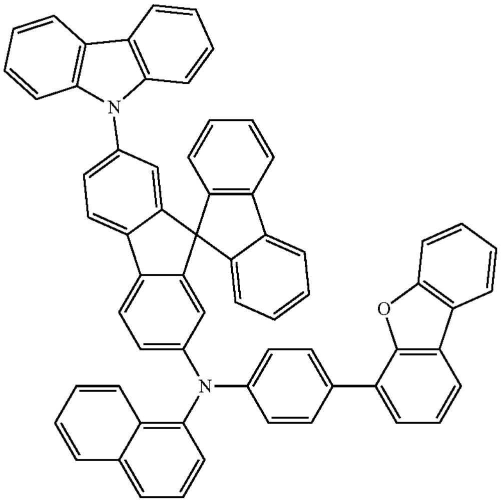
2-94
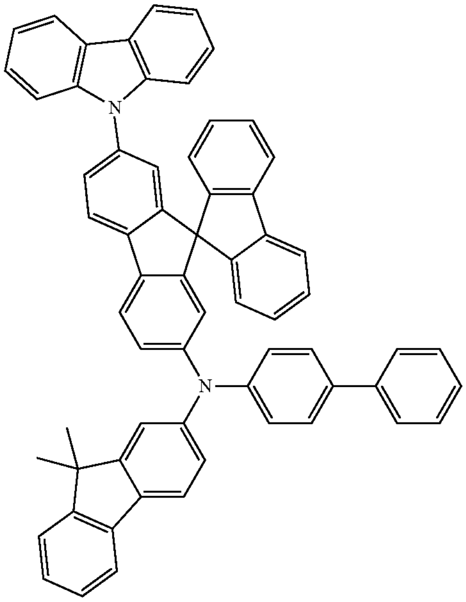

-continued
2-95
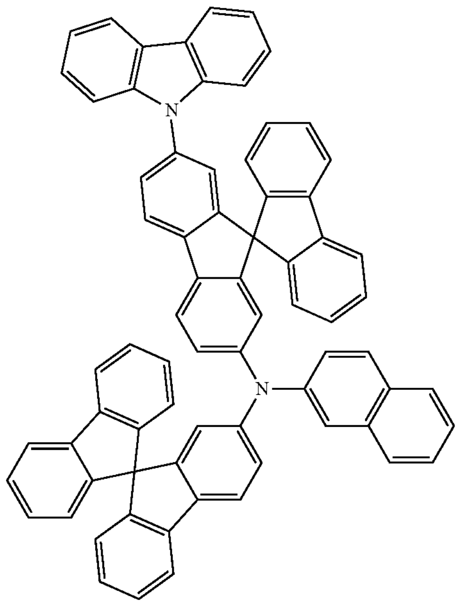
2-96
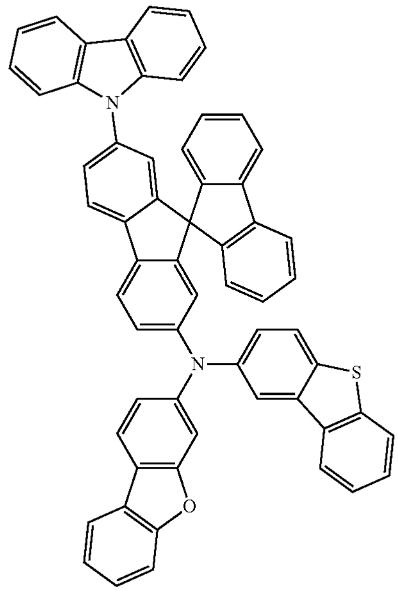
-continued
2-97
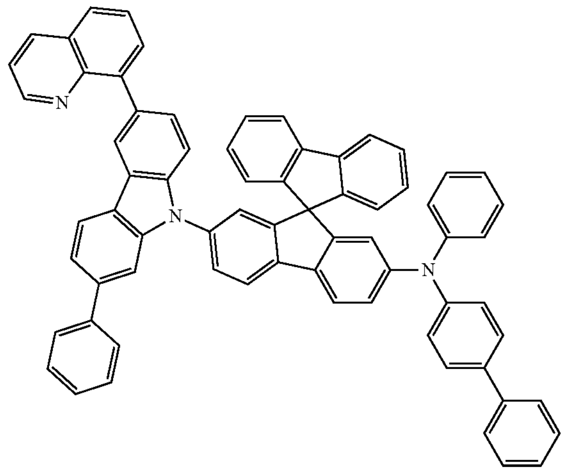
2-98
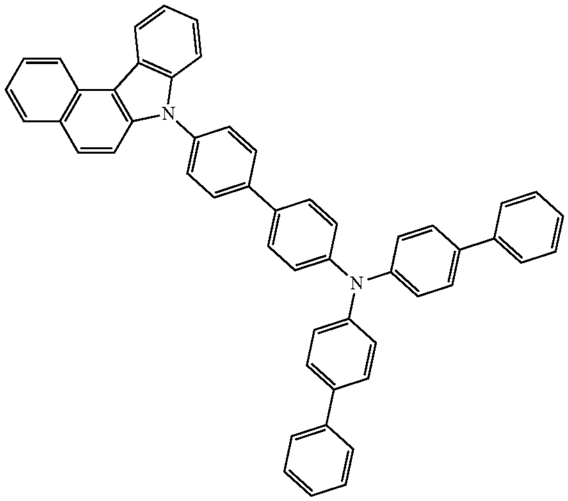
2-99
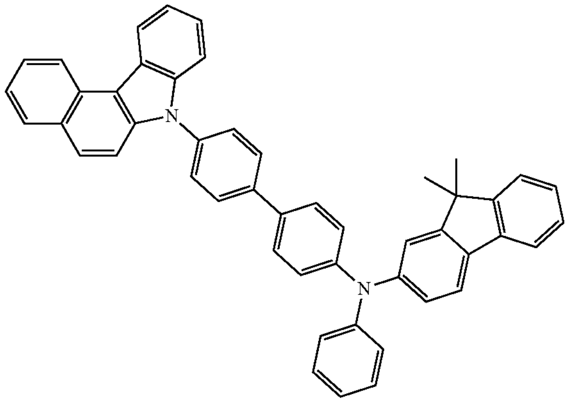

-continued
2-100
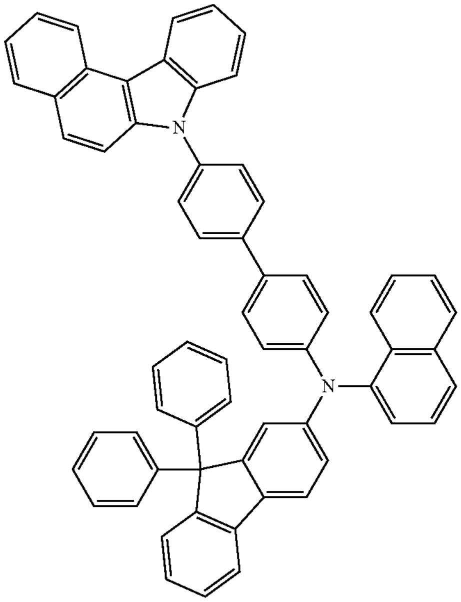
2-101
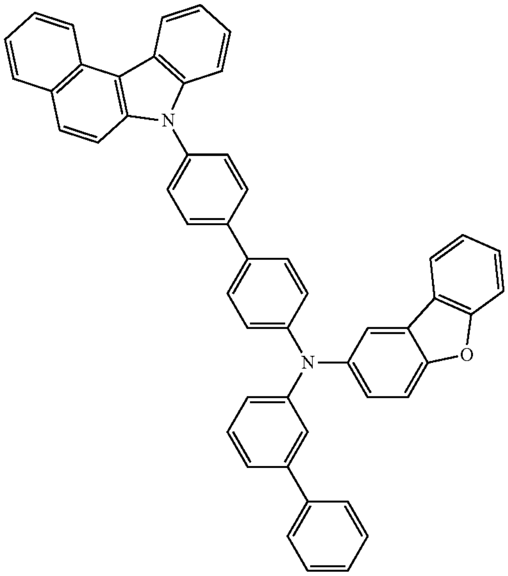
-continued
2-102
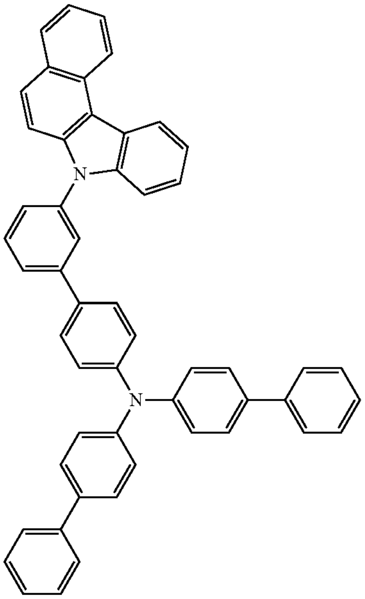
2-103
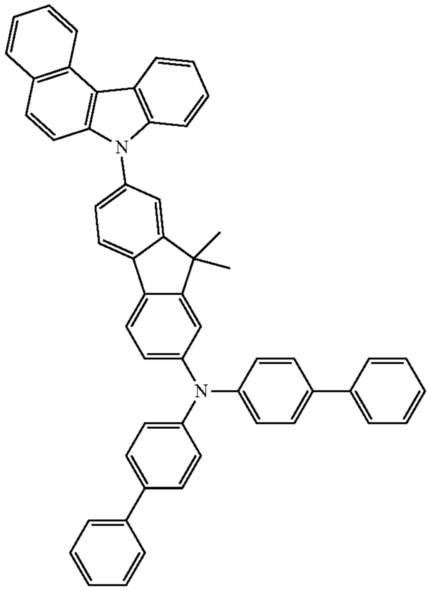

-continued
2-104
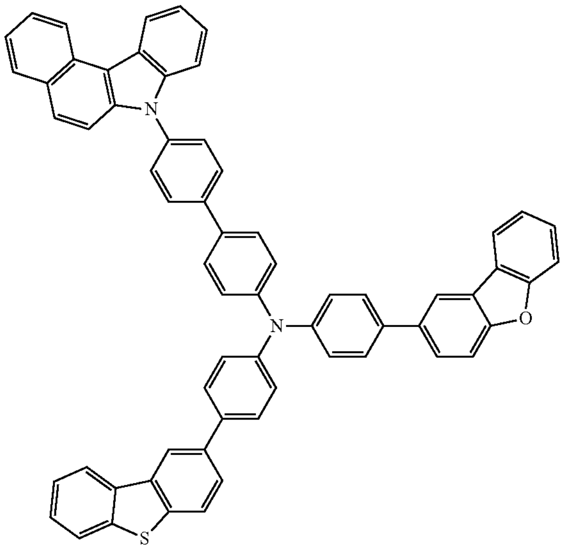
2-105
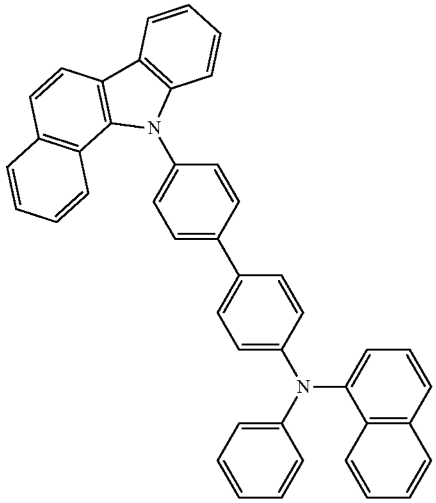
2-106
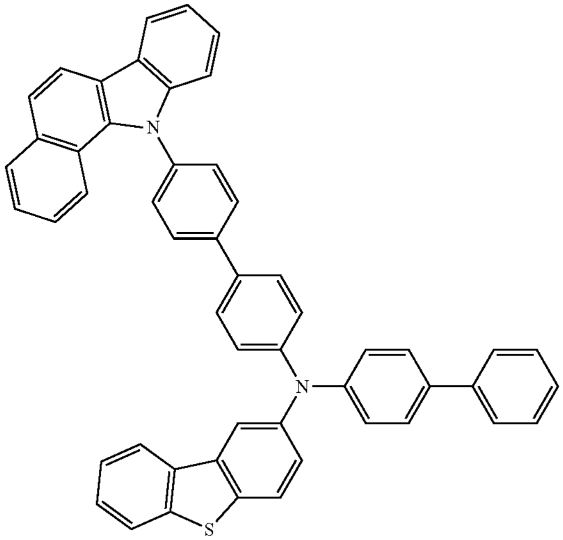
-continued
2-107
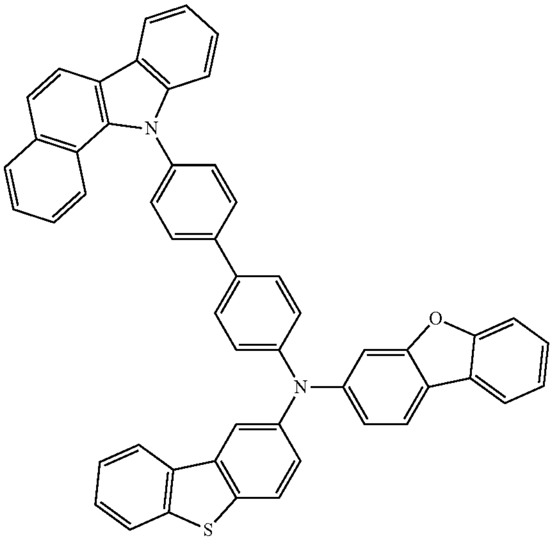
2-108
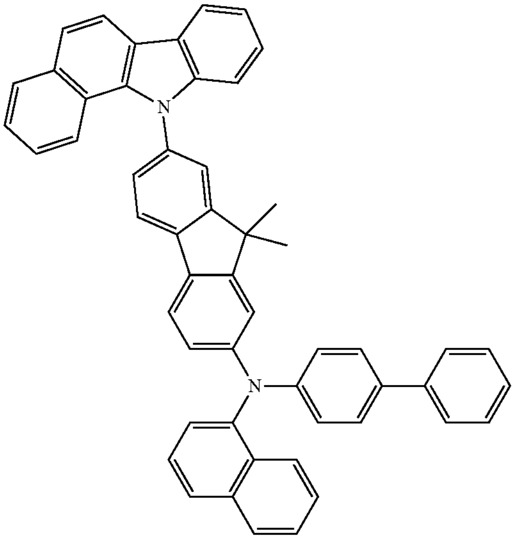

-continued
2-109
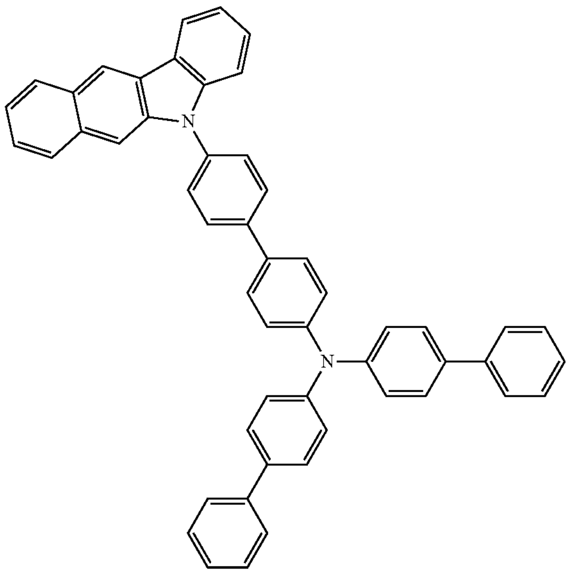
2-110
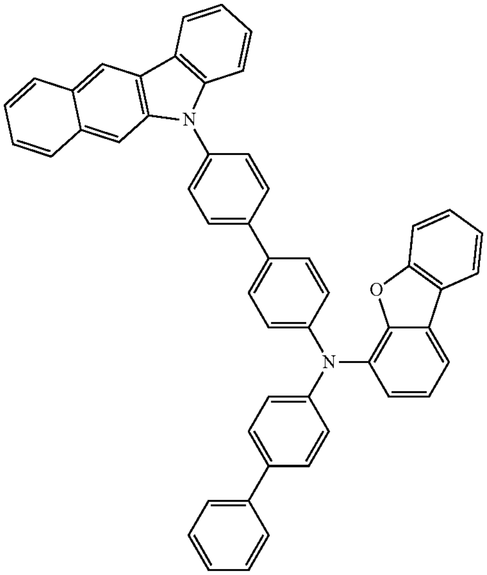
-continued
2-111
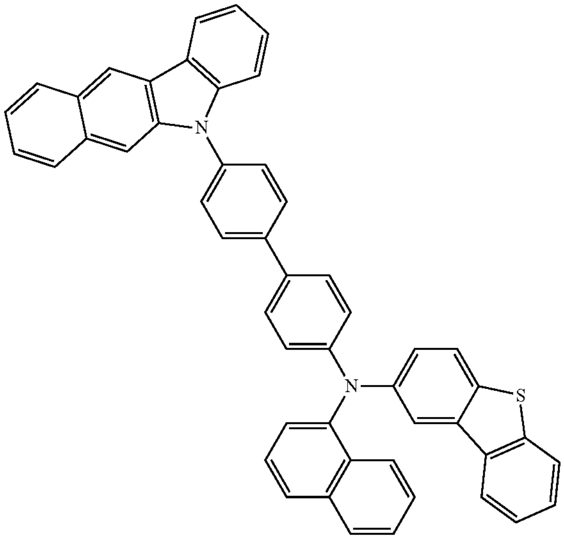
2-112
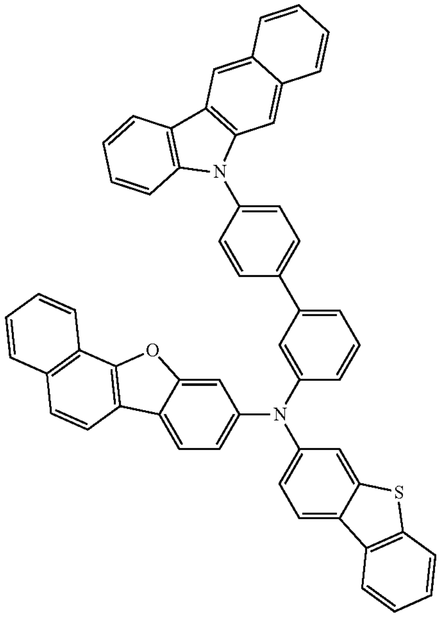

-continued
2-113
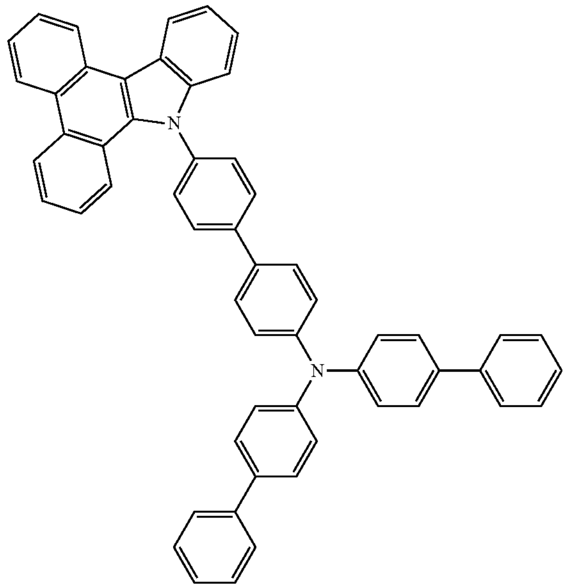
2-114
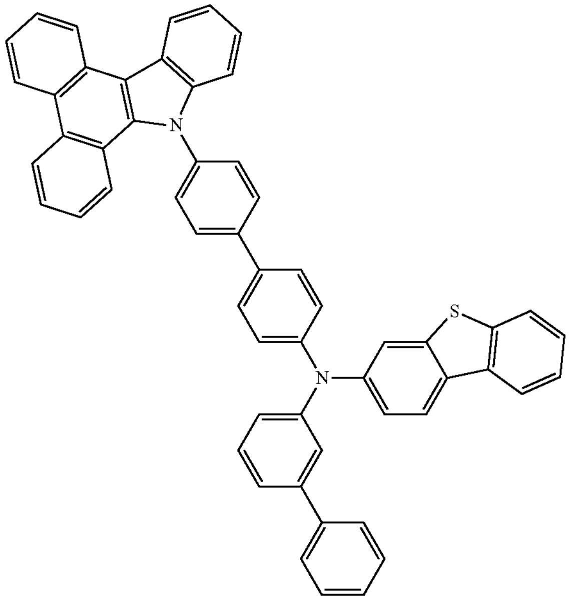
-continued
2-115
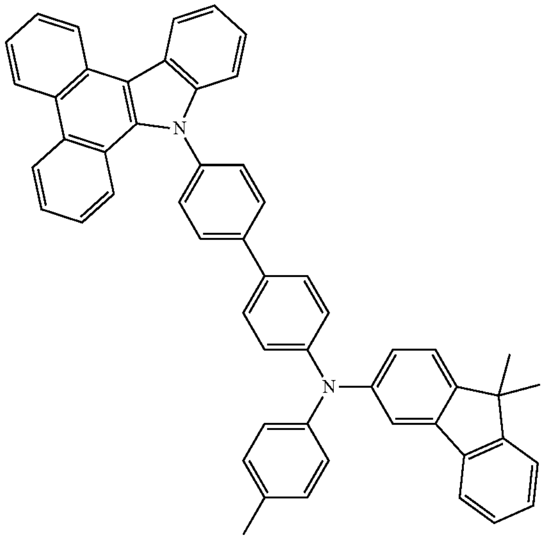
2-116
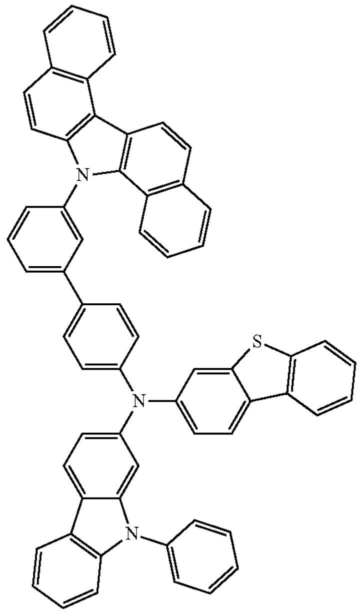

-continued
2-117
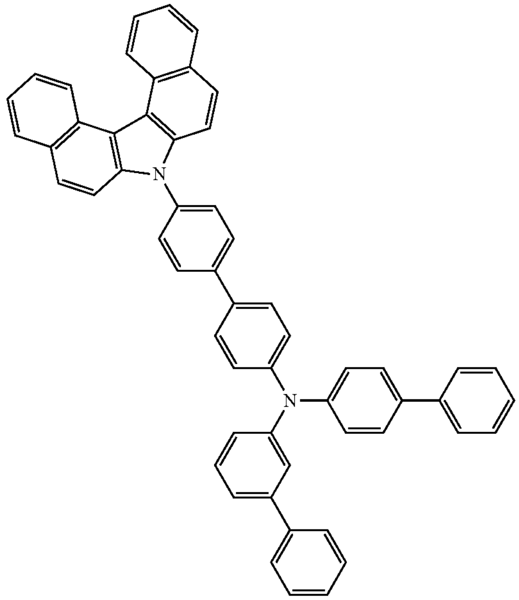
2-118
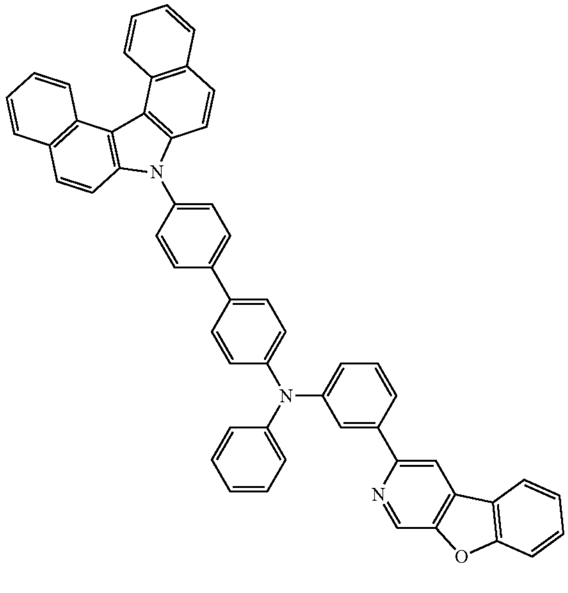
-continued
2-119
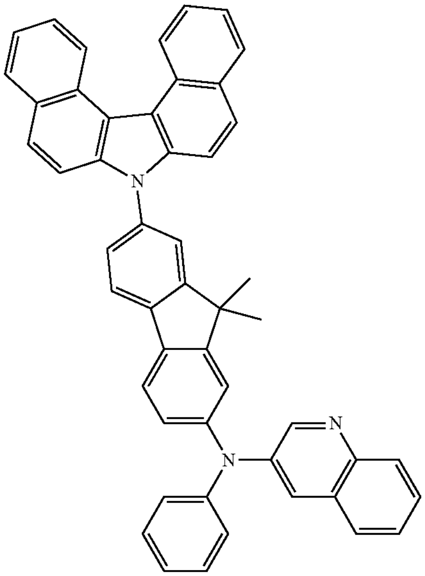
2-120
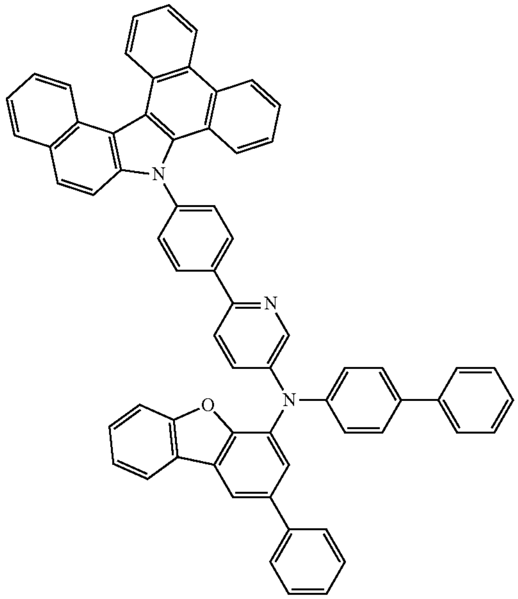

-continued
2-121
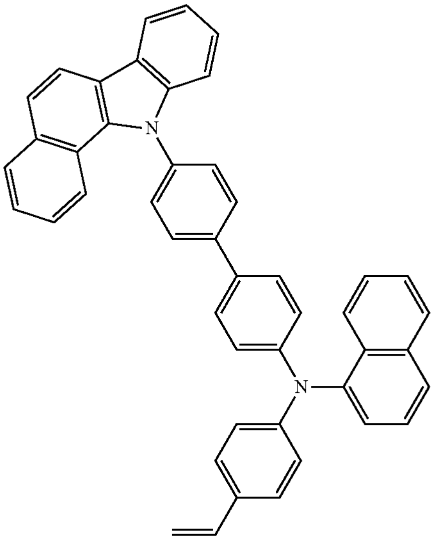
2-122
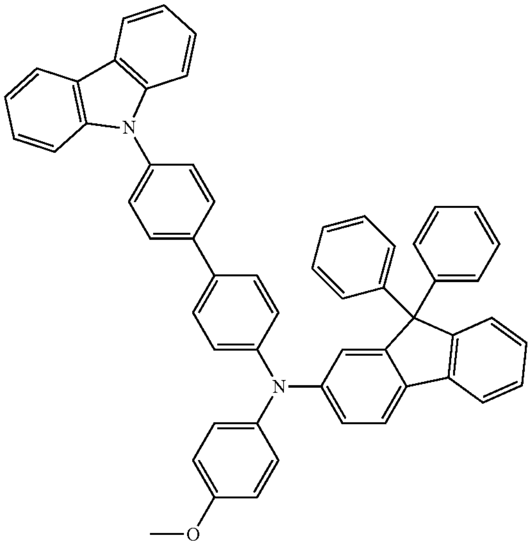
2-123
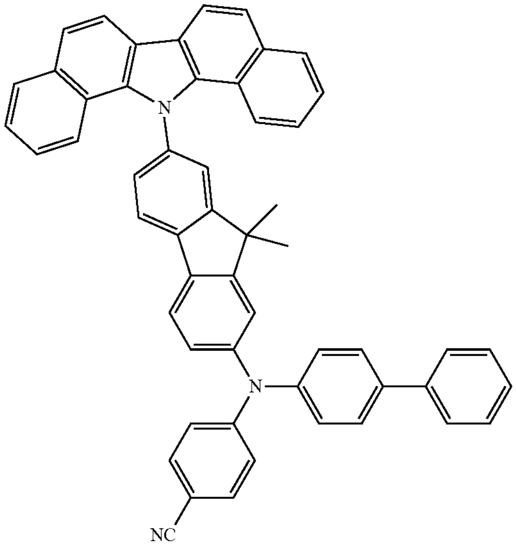
-continued
2-124
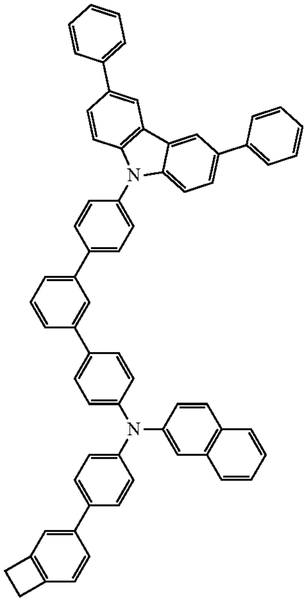
3-1
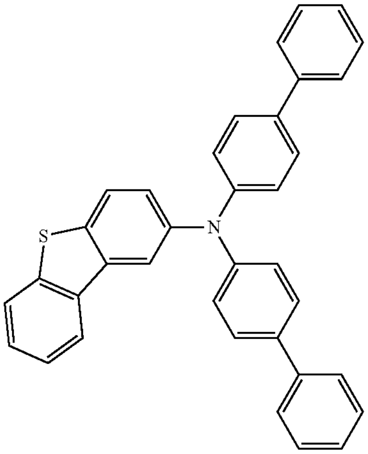
3-2
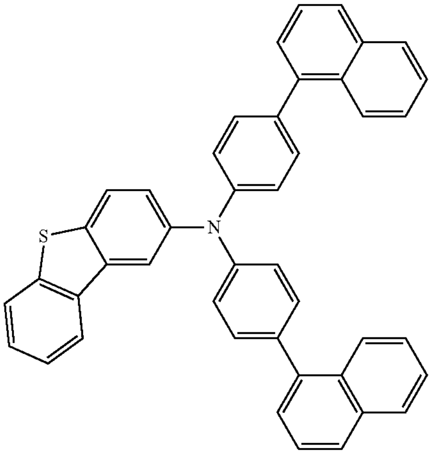

-continued
3-3
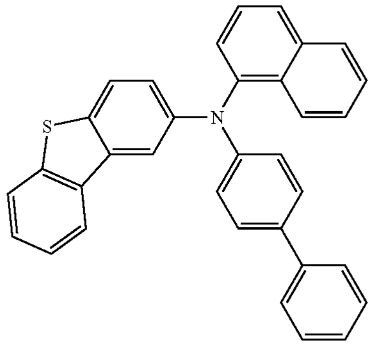
3-4
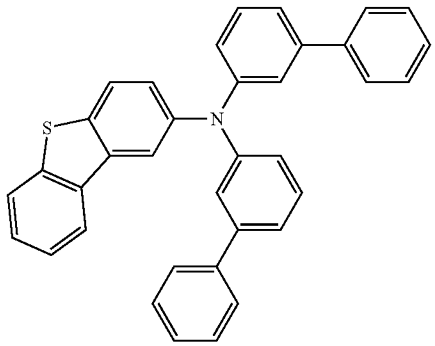
3-5
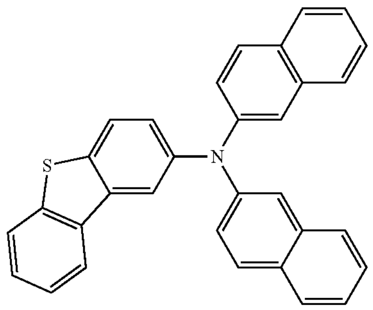
3-6
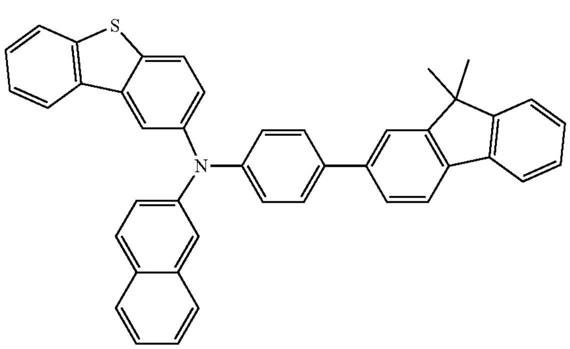
-continued
3-7
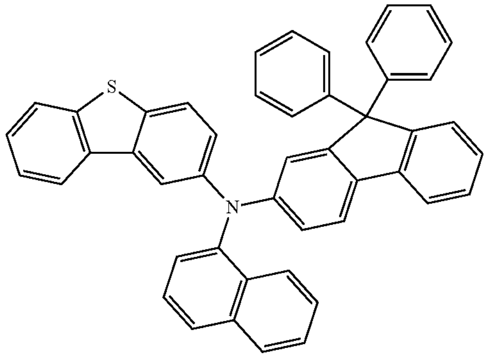
3-8
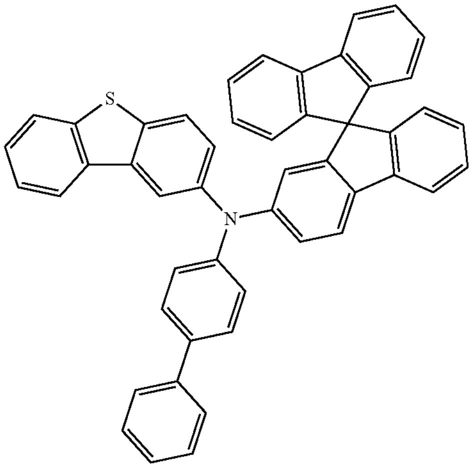
3-9
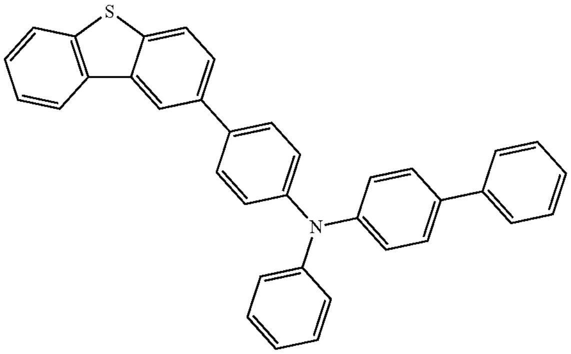

3-10
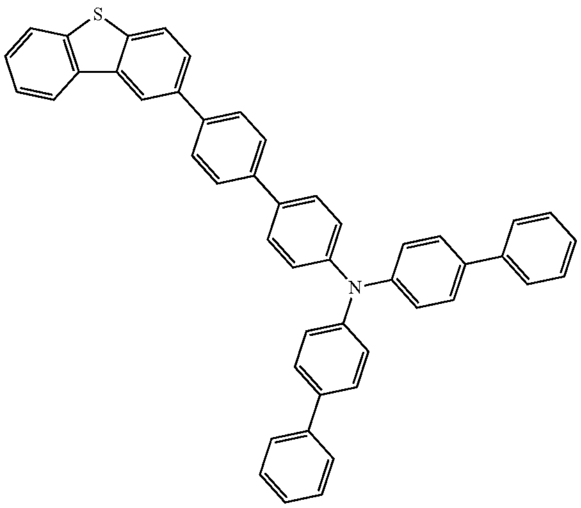
3-11
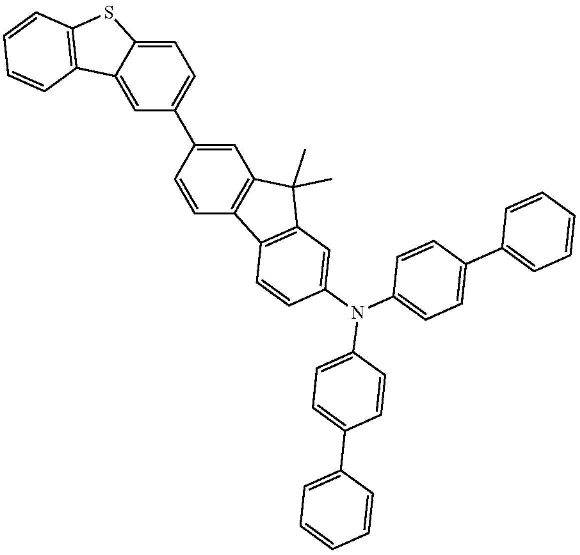
3-12
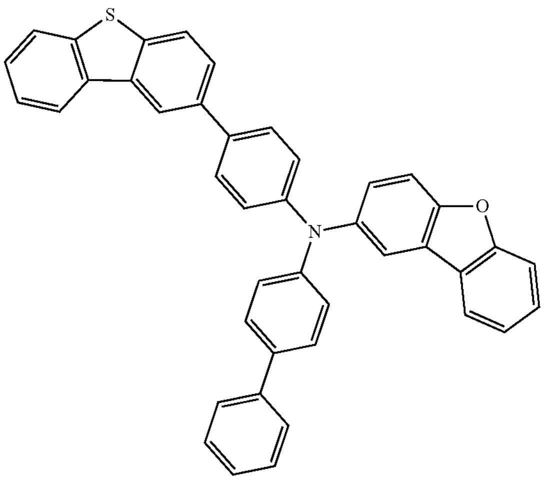
3-13
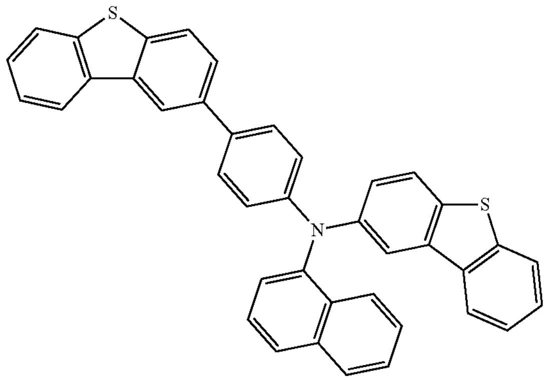
3-14
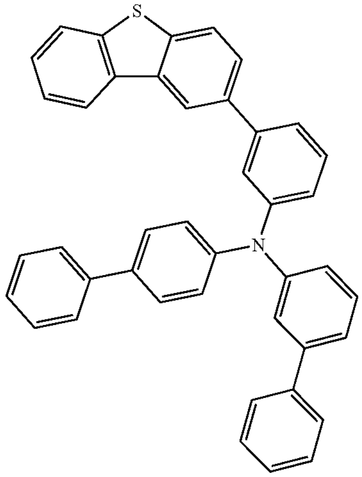
3-15
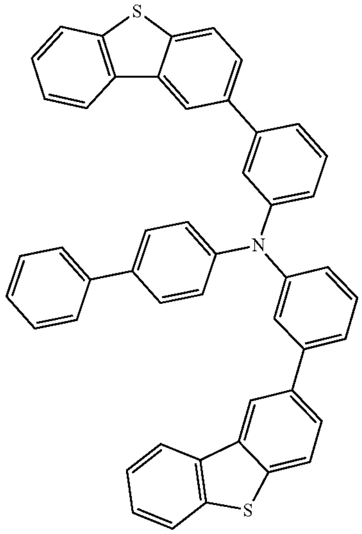

-continued
3-16
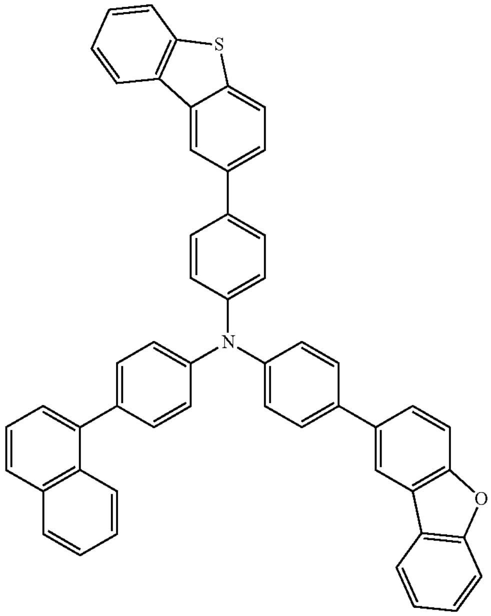
3-17
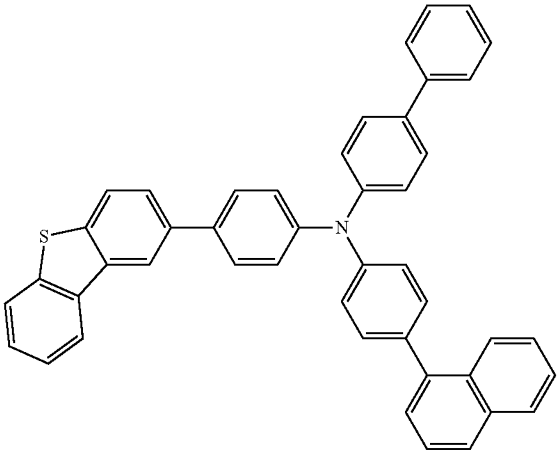
3-18
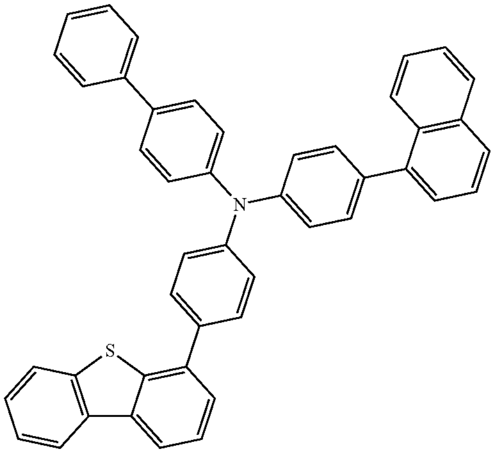
-continued
3-19
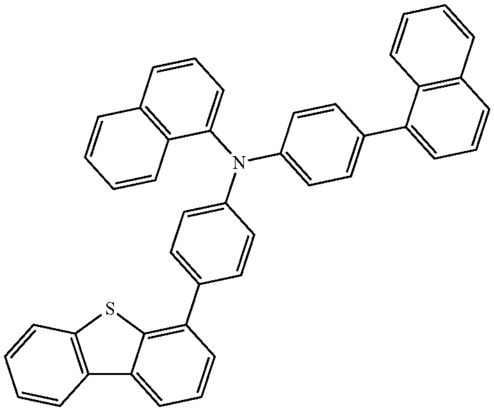
3-20
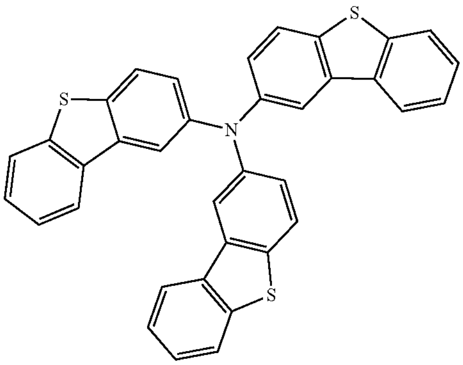
3-21
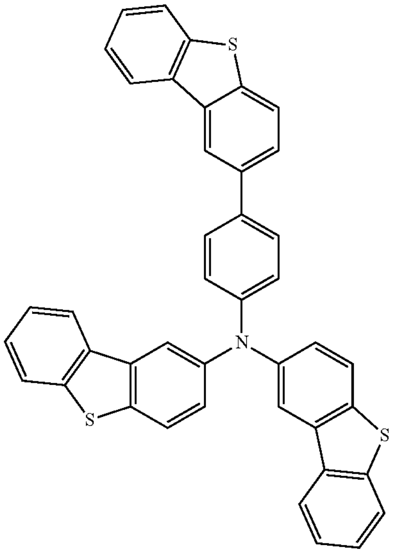

-continued
3-22
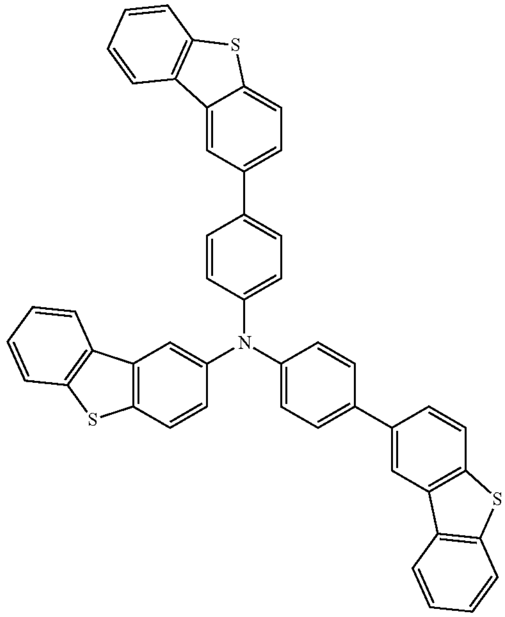
3-23
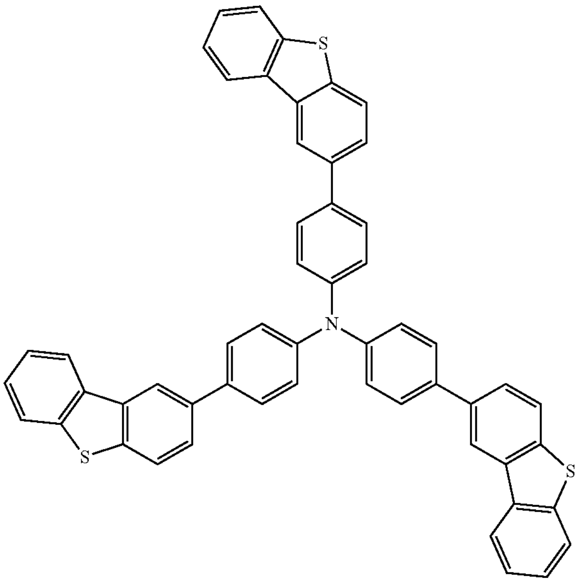
-continued
3-24
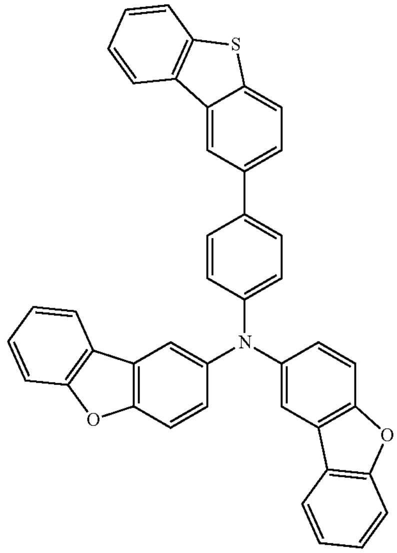
3-25
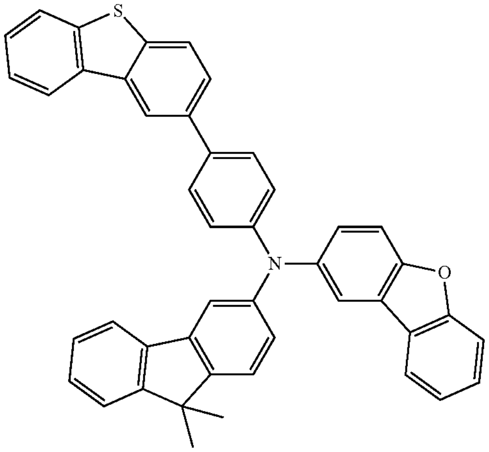
3-26
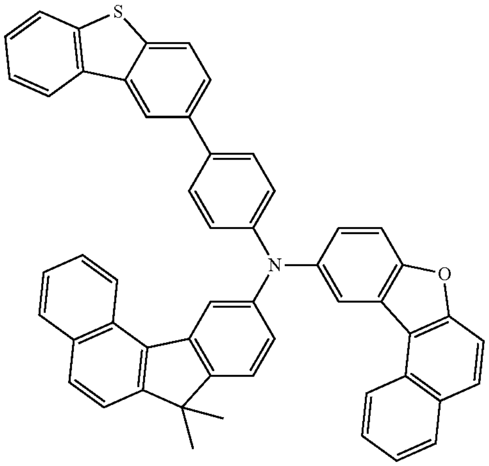

-continued
3-27
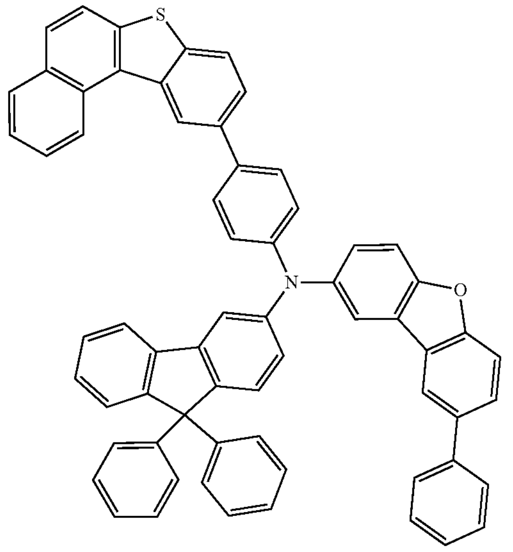
3-28
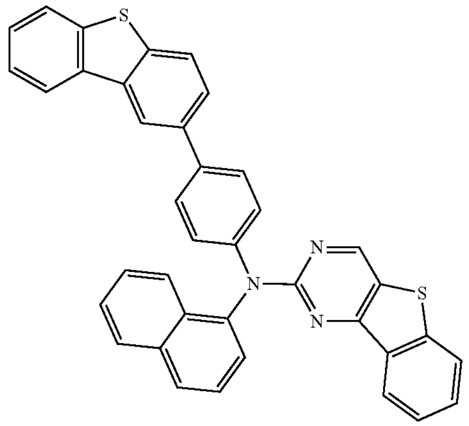
3-29
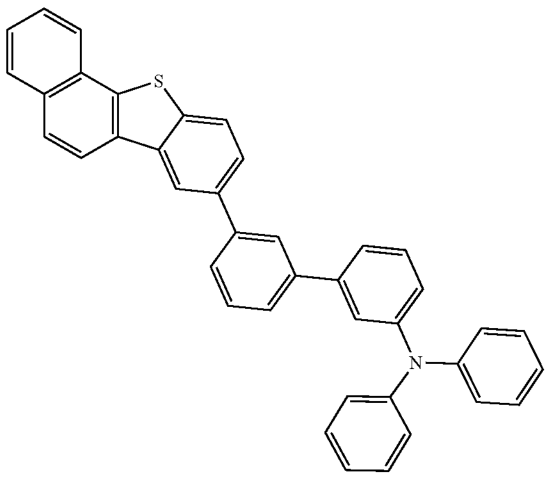
-continued
3-30
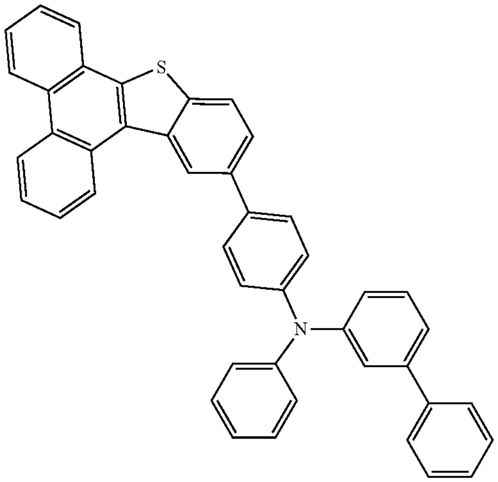
3-31
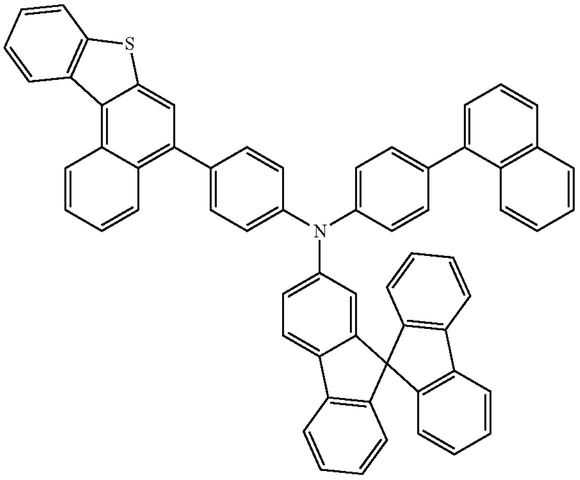
3-32
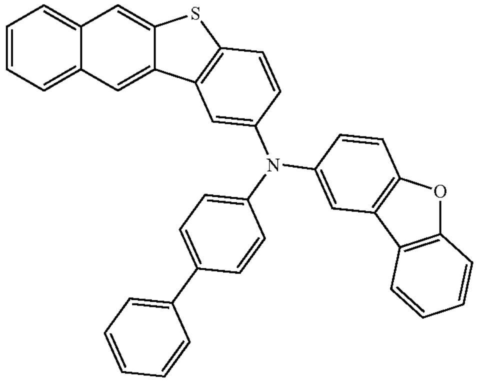

-continued
3-33
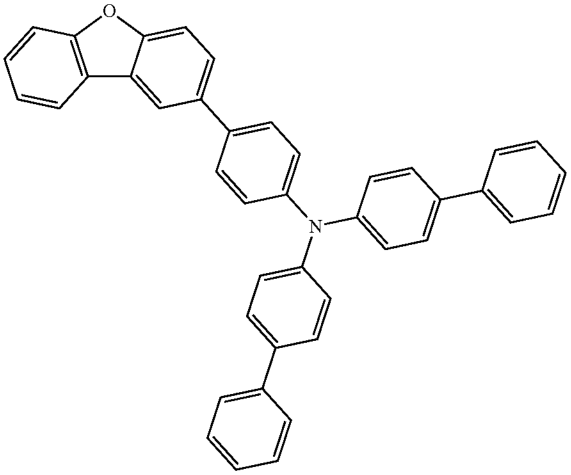
3-34
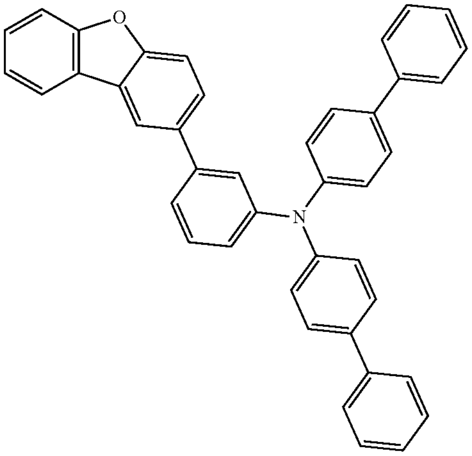
3-35
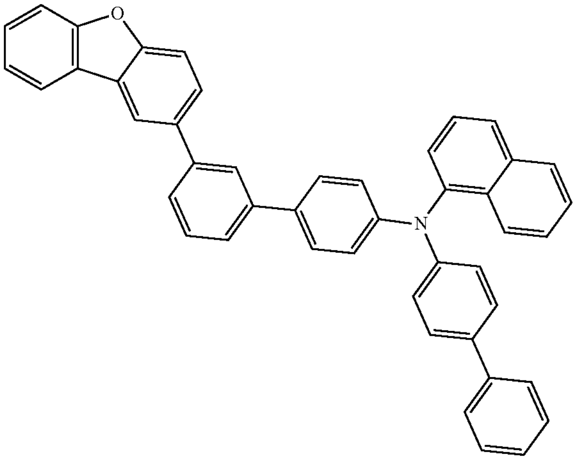
-continued
3-36
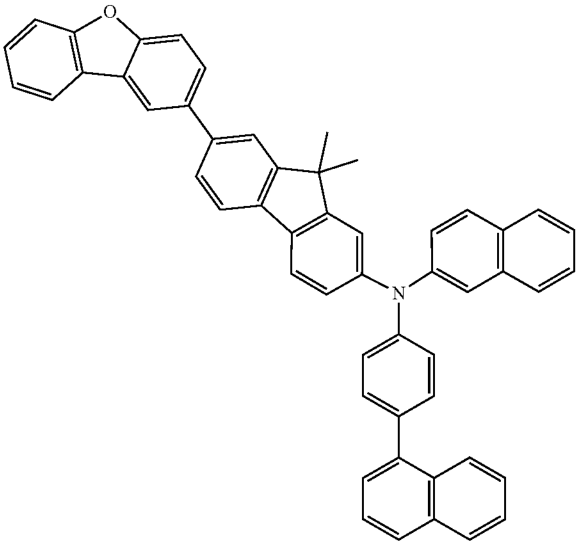
3-37
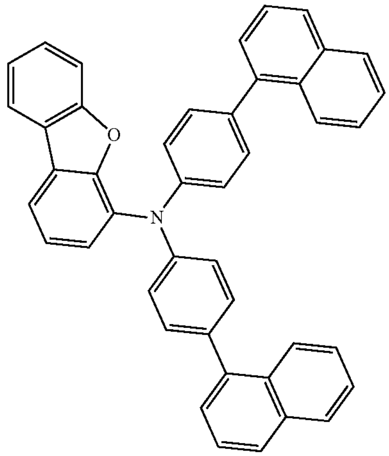
3-38
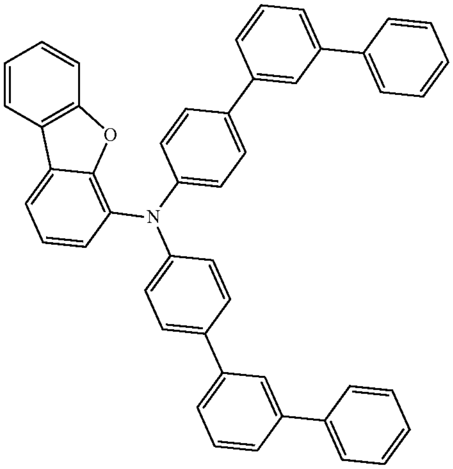

-continued
3-39
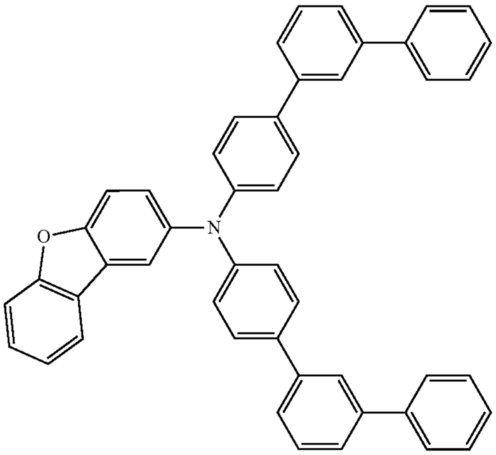
3-40
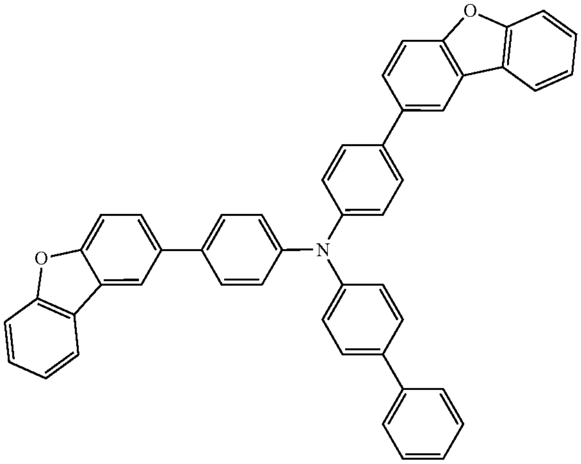
3-41
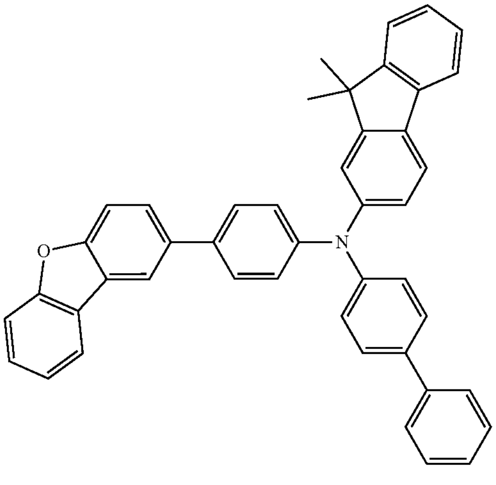
-continued
3-42
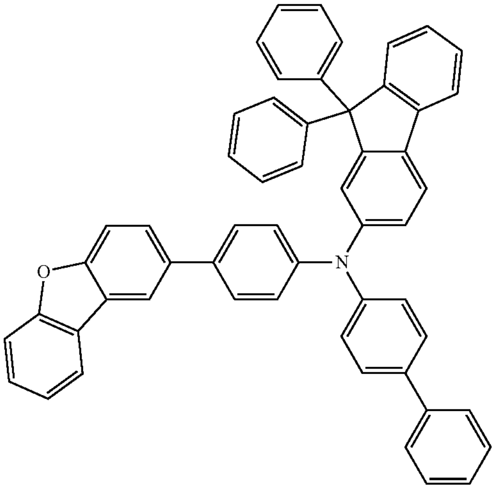
3-43
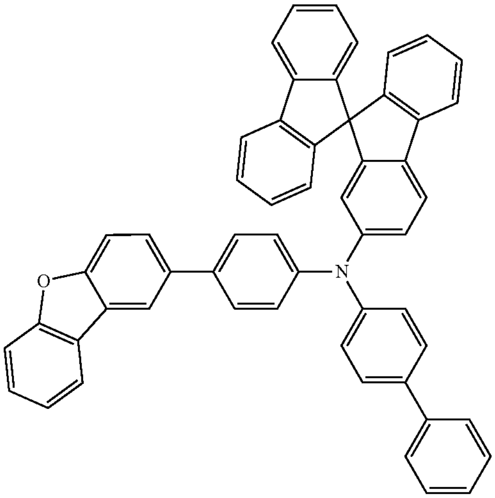
3-44
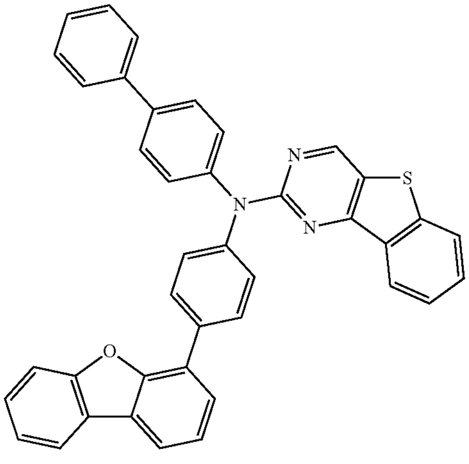

-continued
3-45
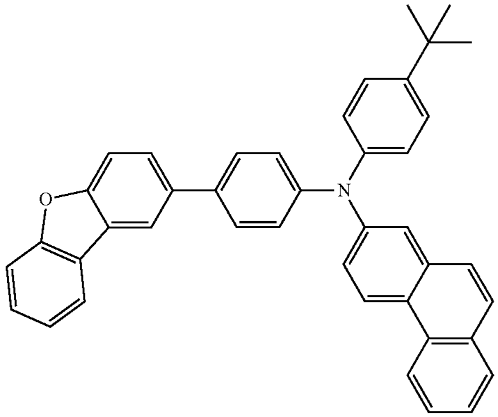
3-46
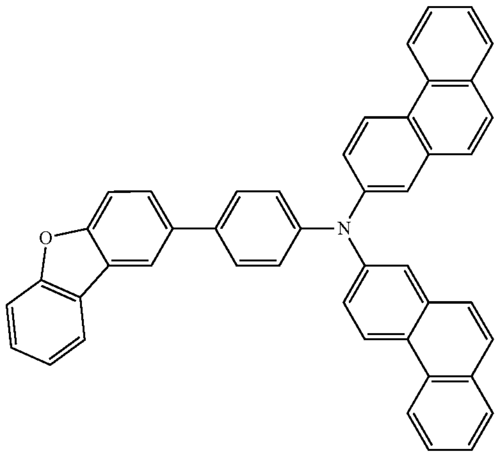
3-47
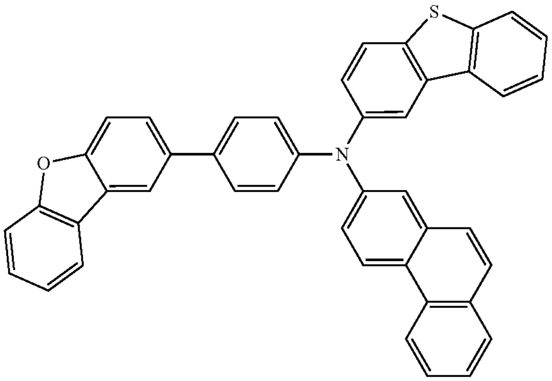
-continued
3-48
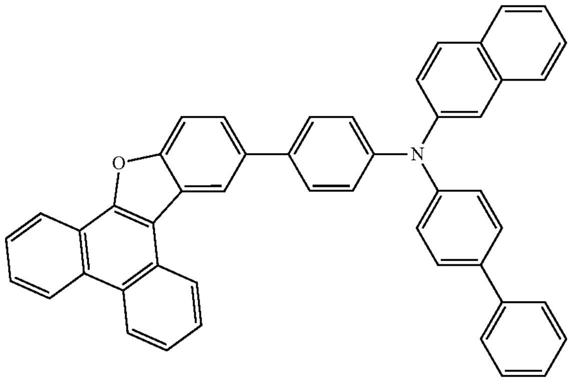
3-49
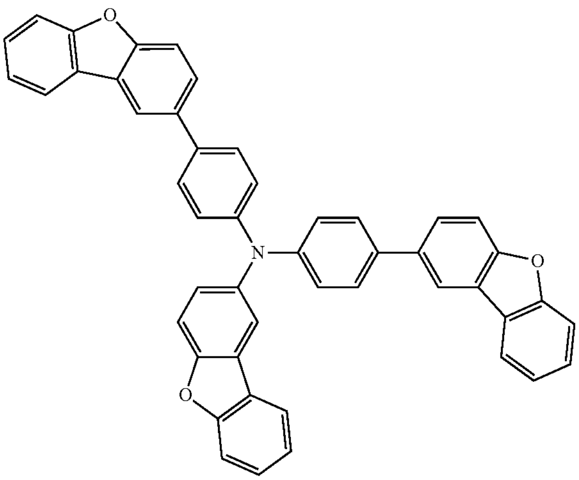
3-50
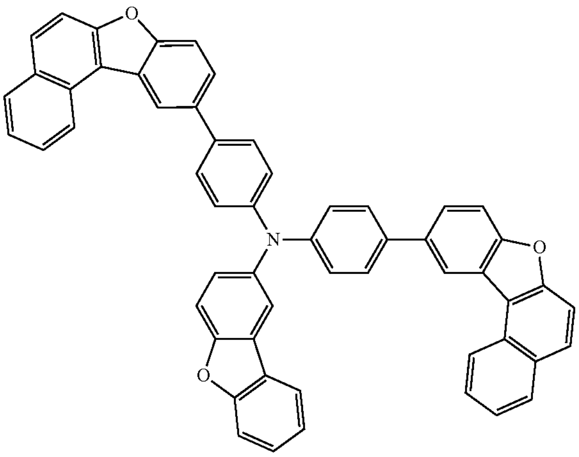

-continued
3-51
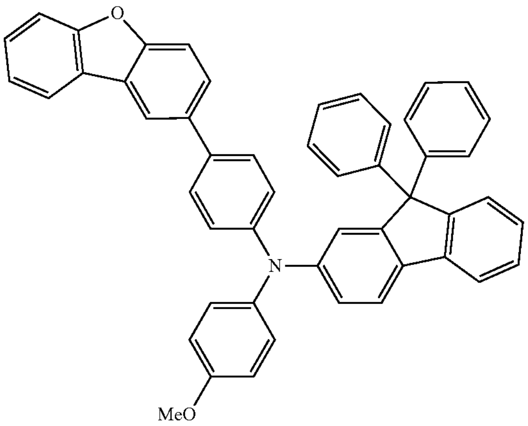
3-52
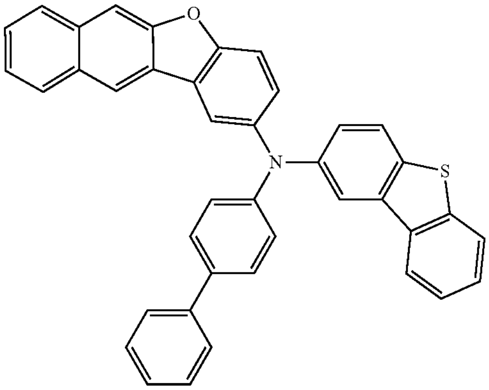
3-53
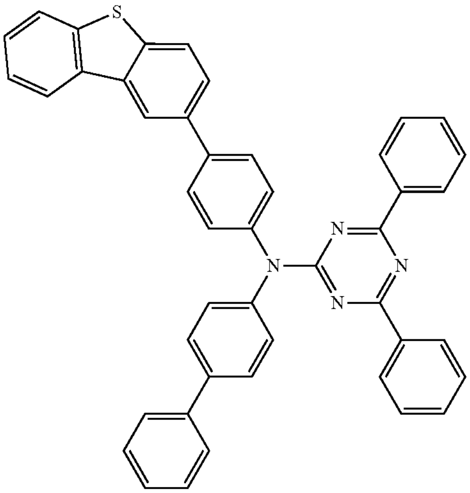
-continued
3-54
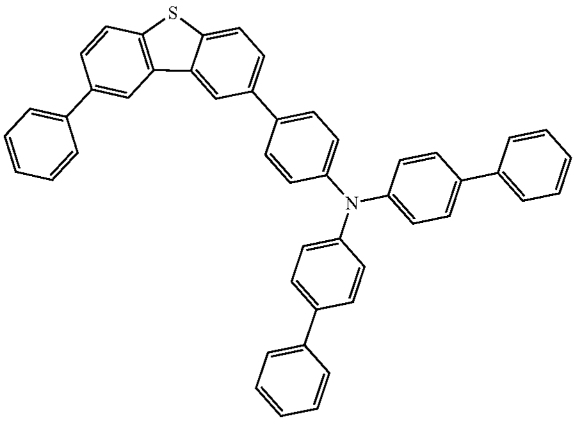
3-55
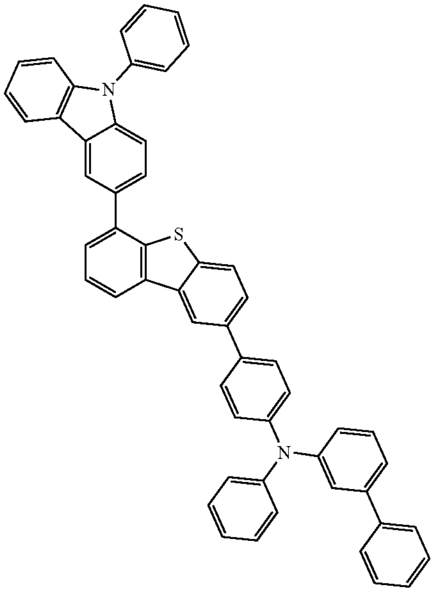
3-56
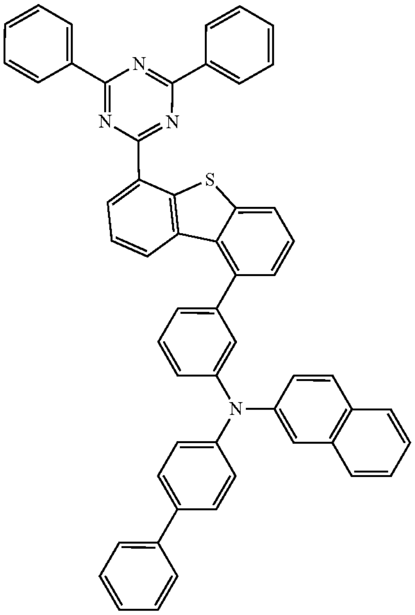

-continued
3-57
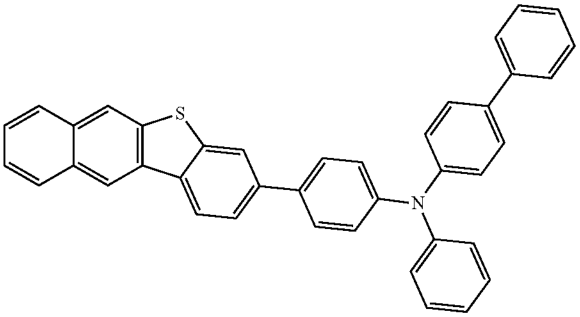
3-58
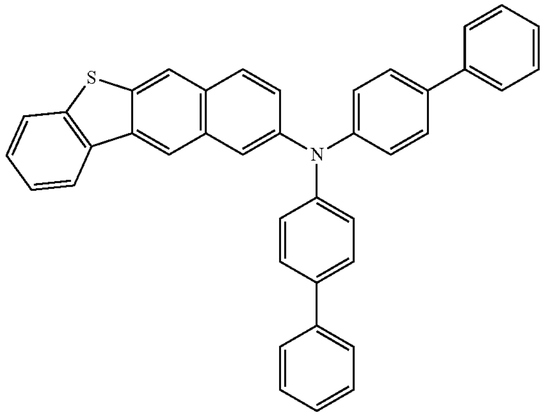
3-59
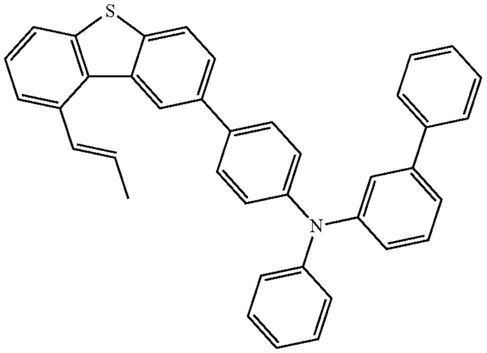
-continued
3-60
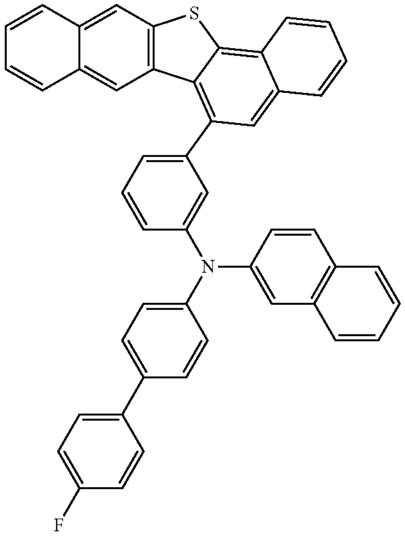
3-61
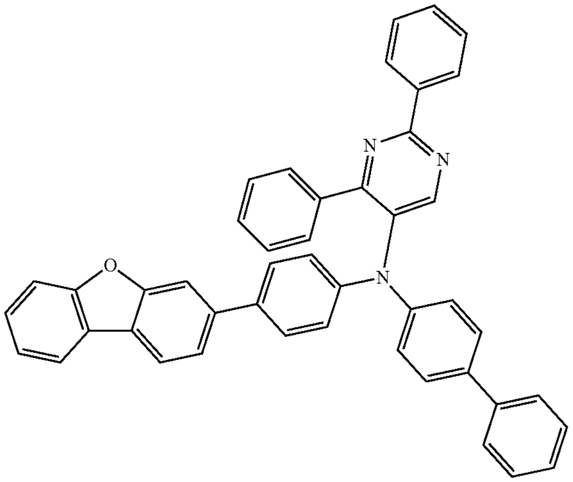
3-62
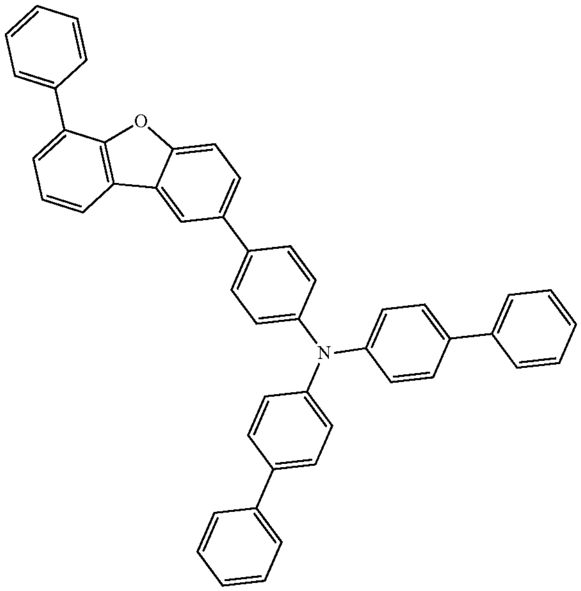

-continued
3-63
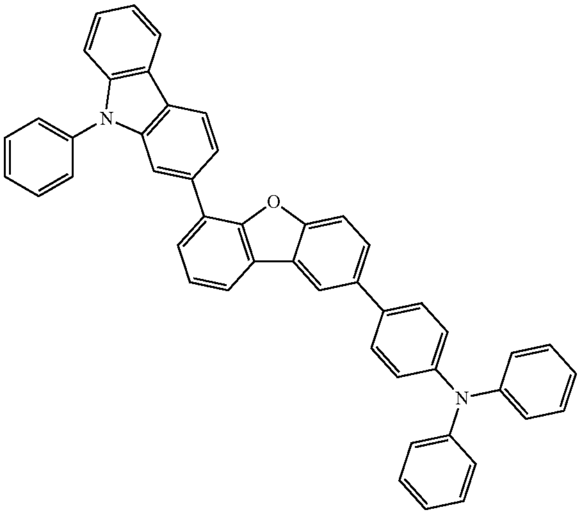
3-64
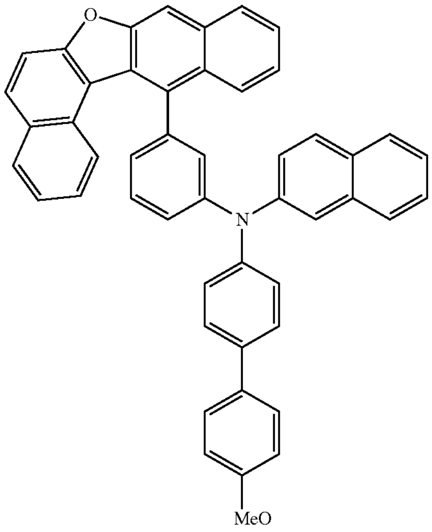
3-65
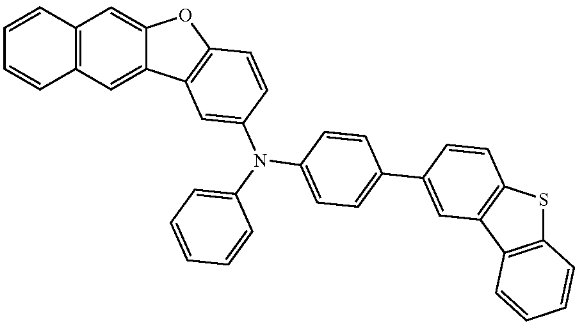
-continued
3-66
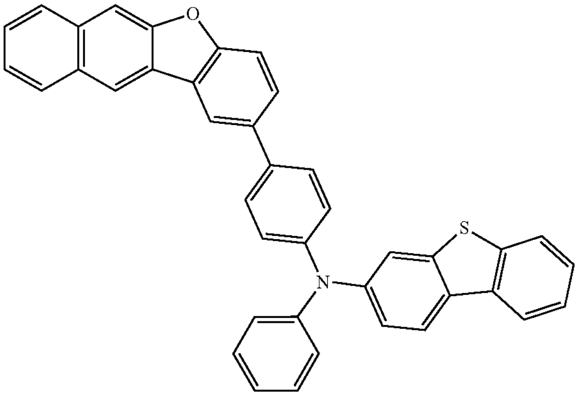
3-67
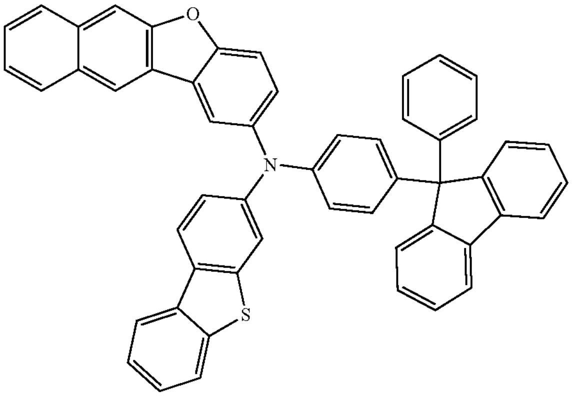
3-68
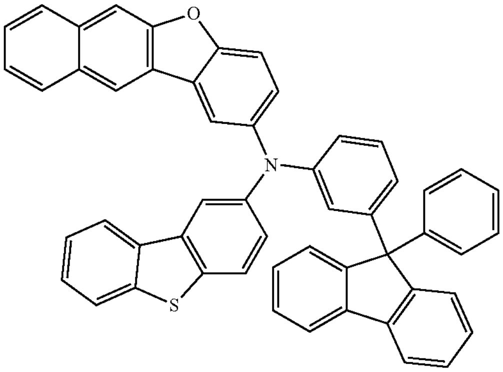
3-69
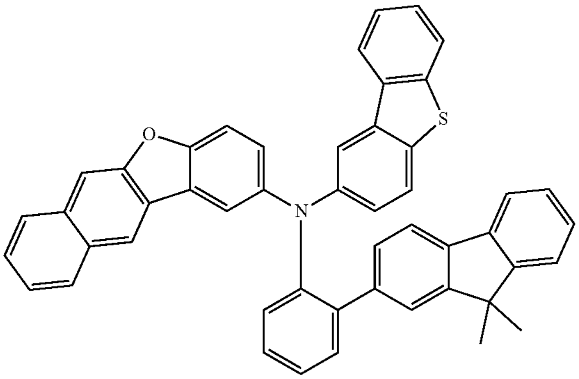

3-70
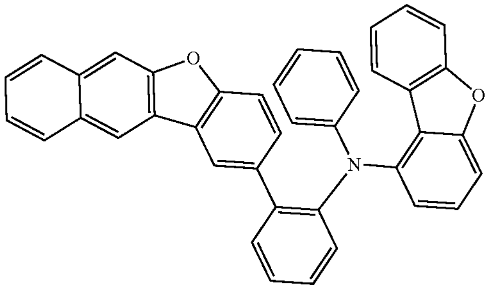
3-71
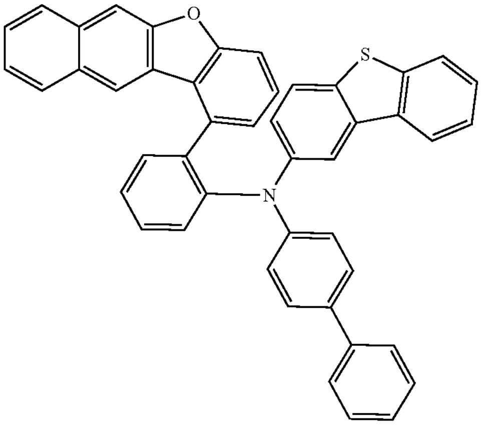
3-72
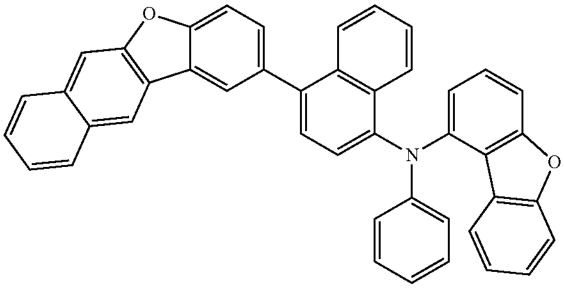
3-73
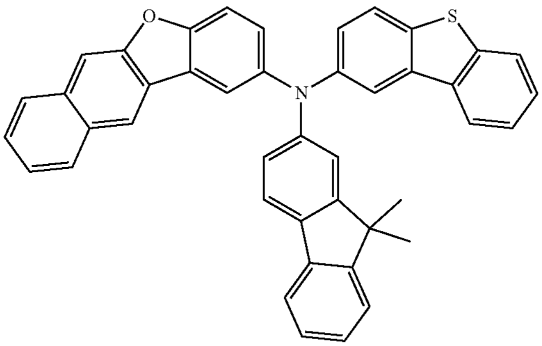
3-74
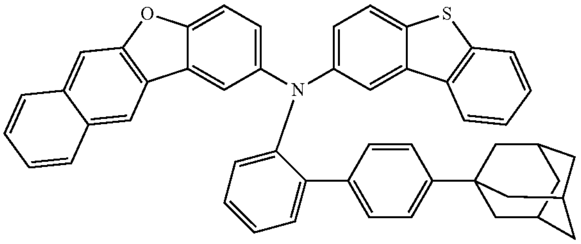
3-75
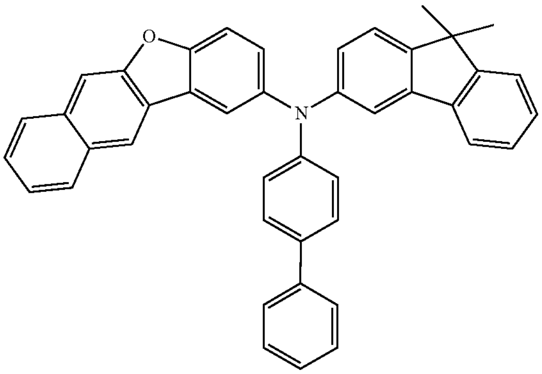
3-76
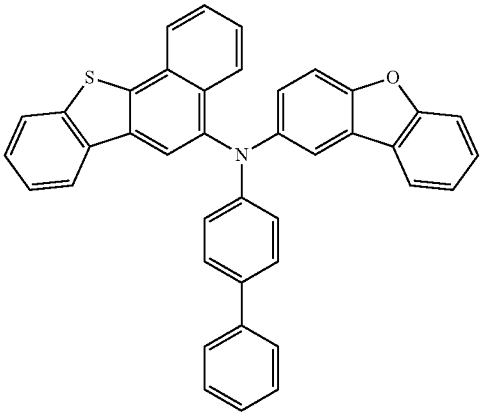
4-1
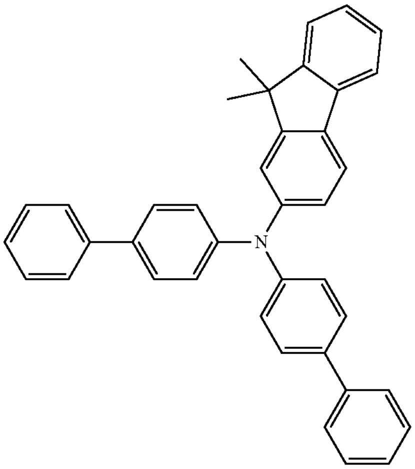

-continued
4-2
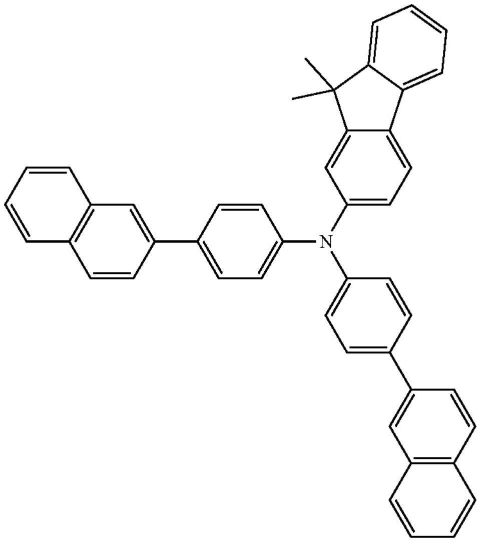
4-3
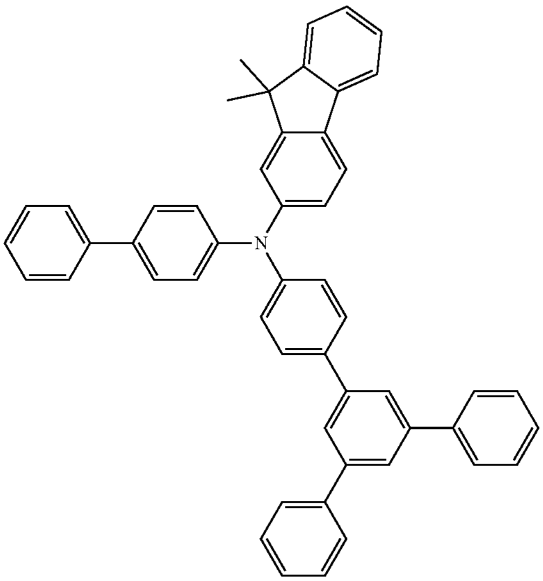
-continued
4-4
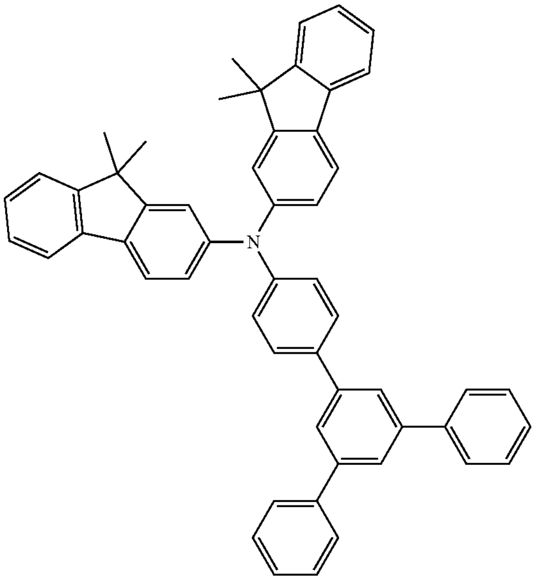
4-5
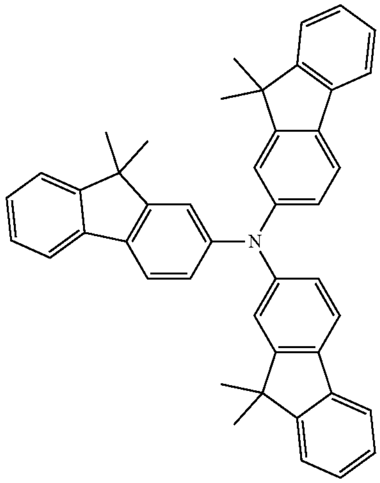
4-6
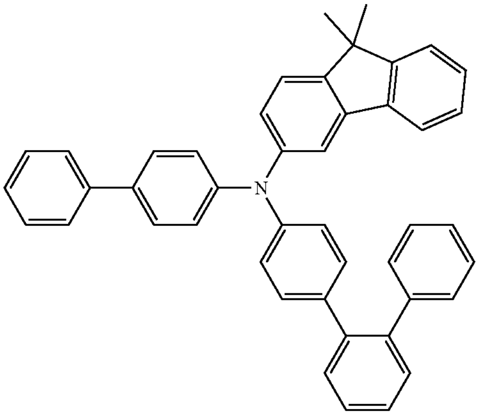

-continued
4-7
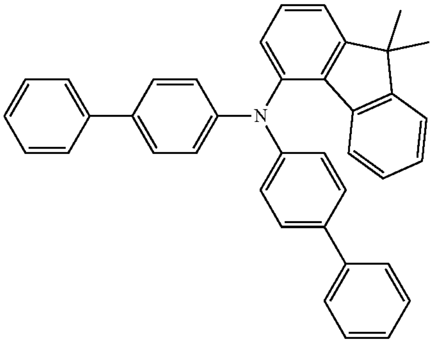
4-8
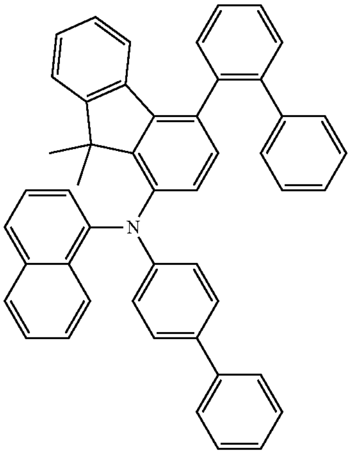
4-9
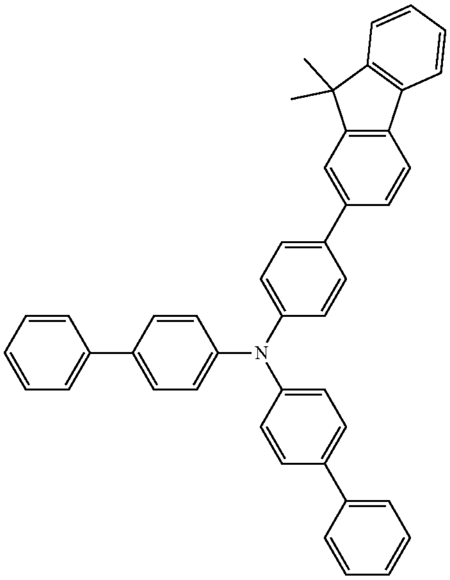
-continued
4-10
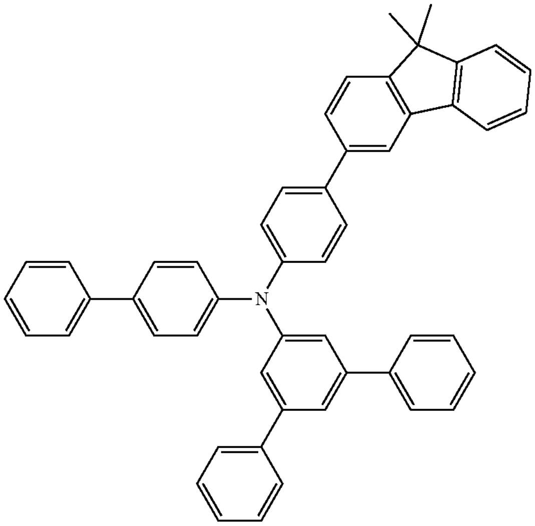
4-11
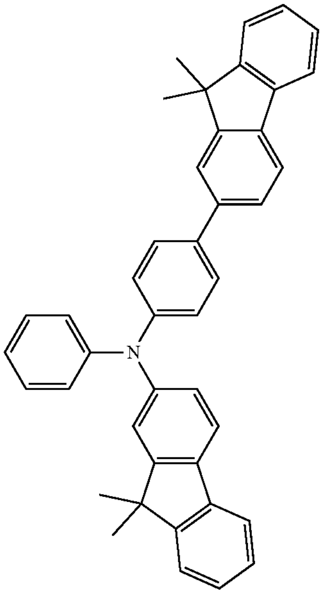

-continued
4-12
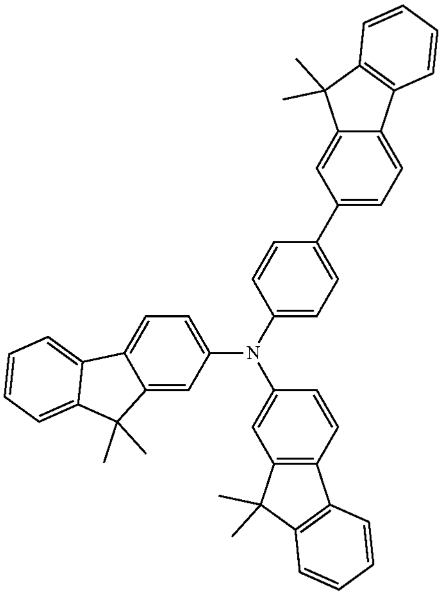
4-13
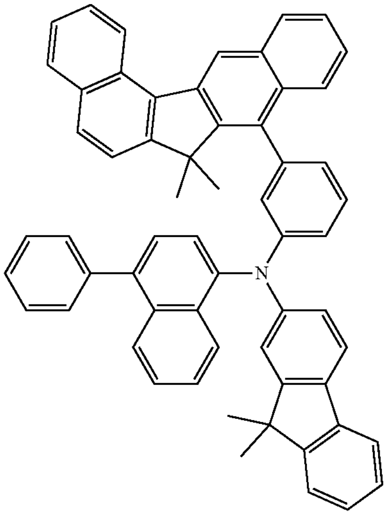
4-14
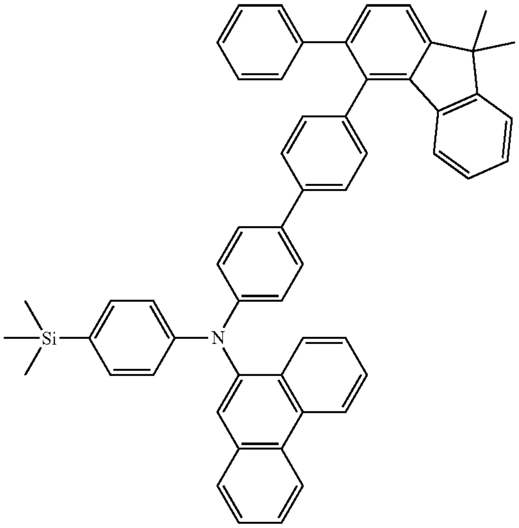
-continued
4-15
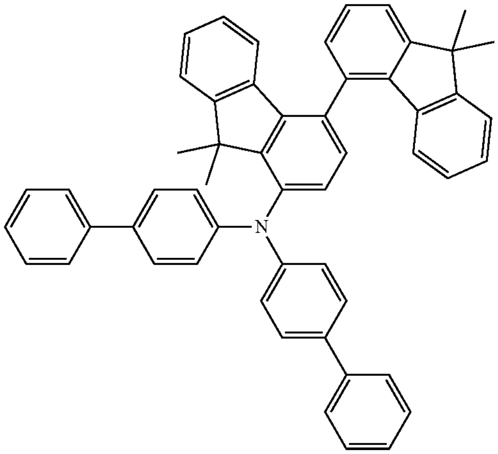
4-16
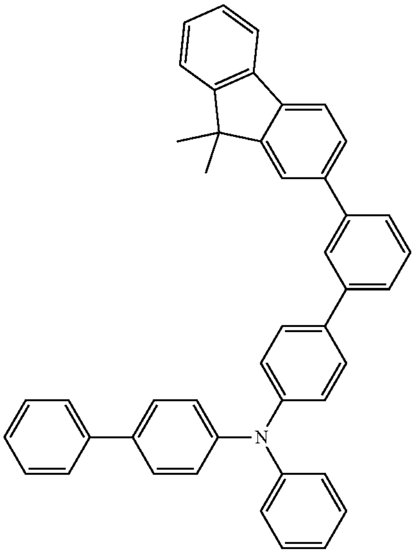
4-17
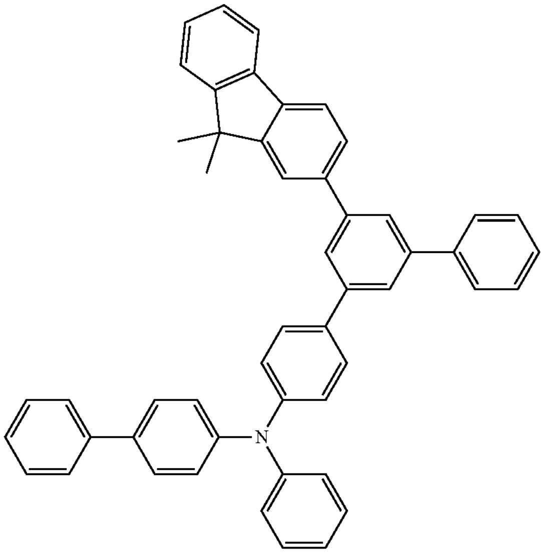

-continued
4-18
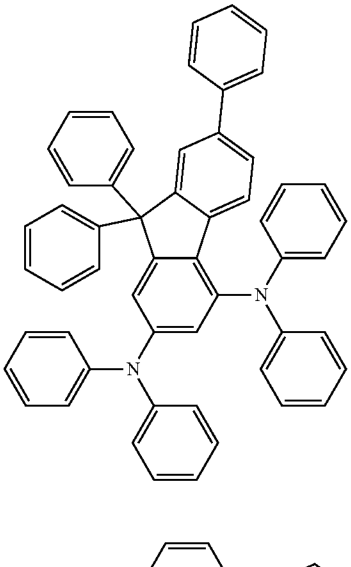
4-19
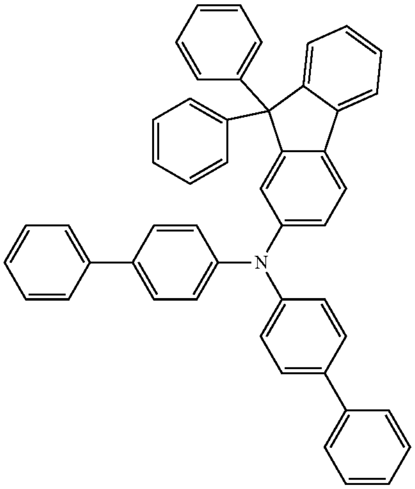
4-20
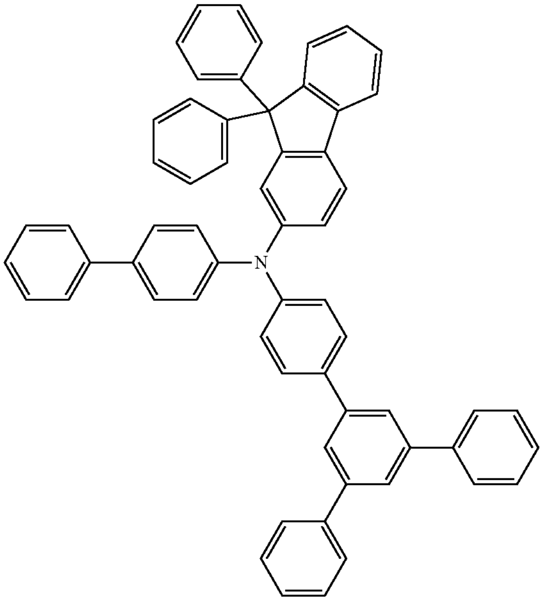
-continued
4-21
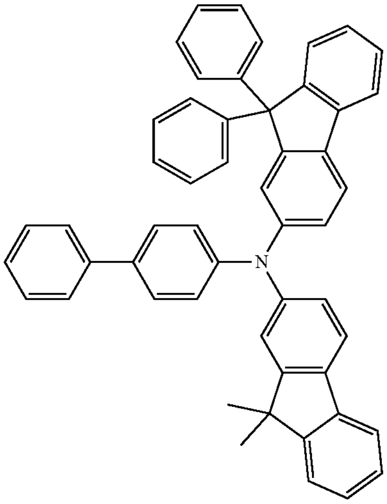
4-22
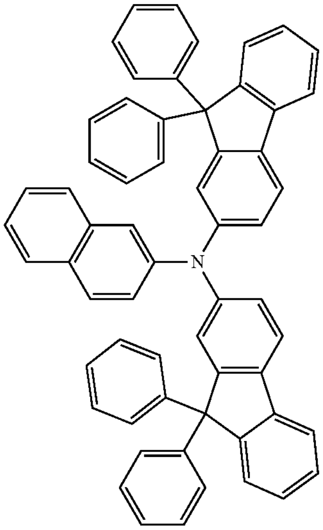
4-23
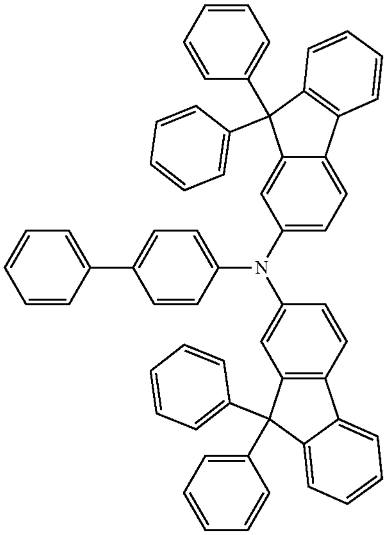

-continued
4-24
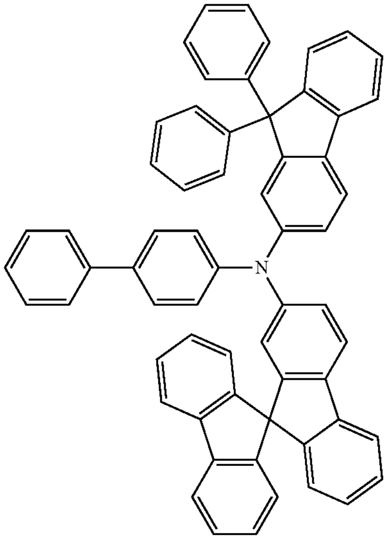
4-25
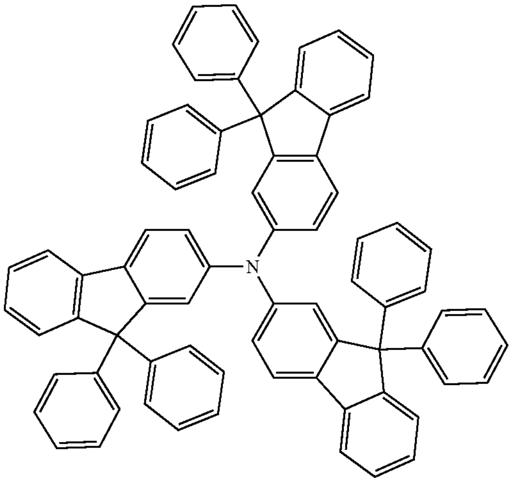
4-26
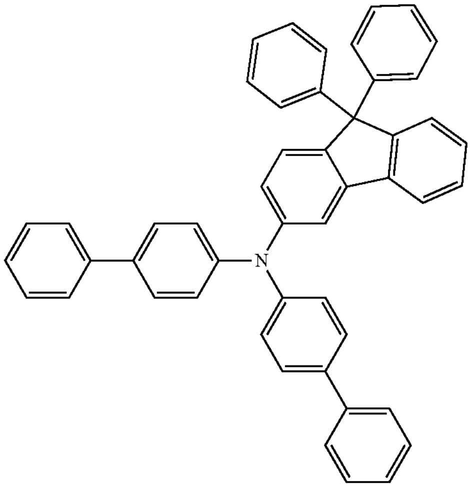
-continued
4-27
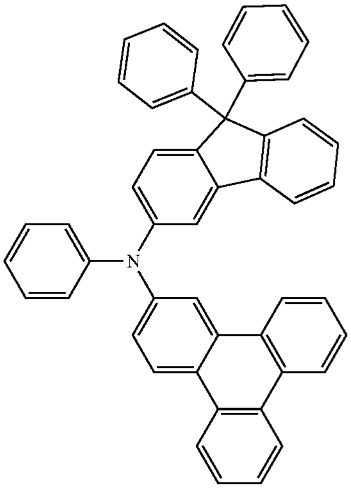
4-28
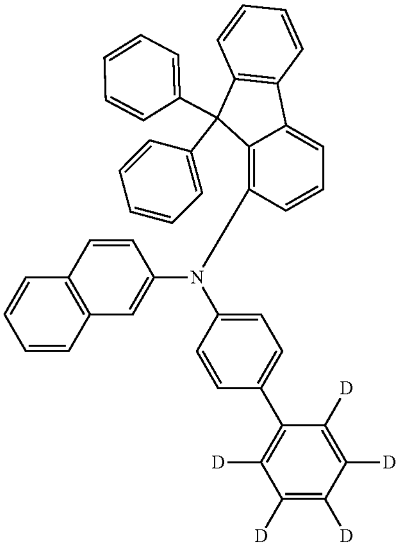
4-29
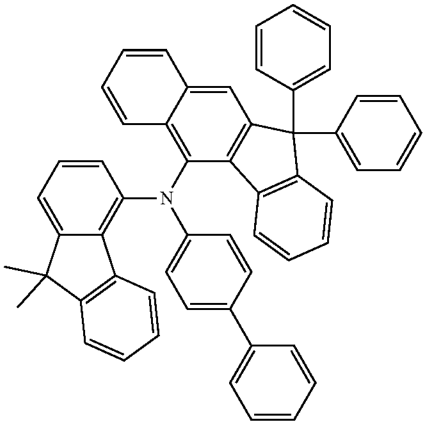

-continued
4-30
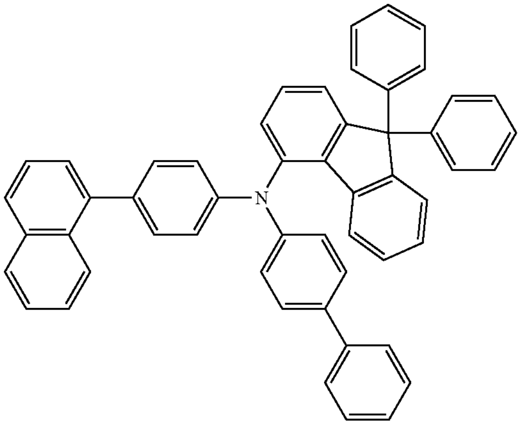
4-31
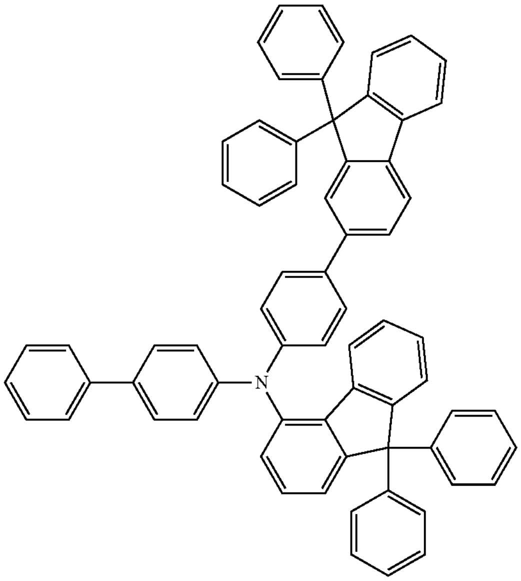
4-32
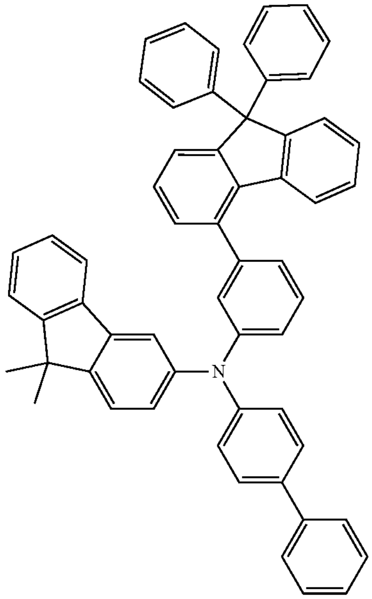
-continued
4-33
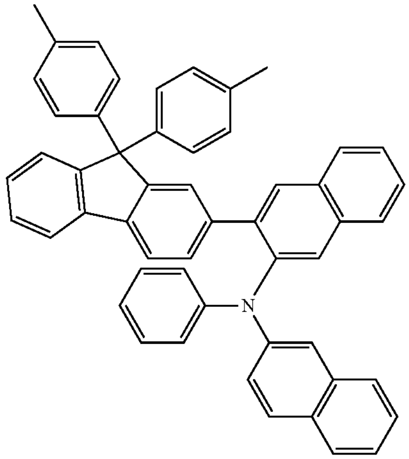
4-34
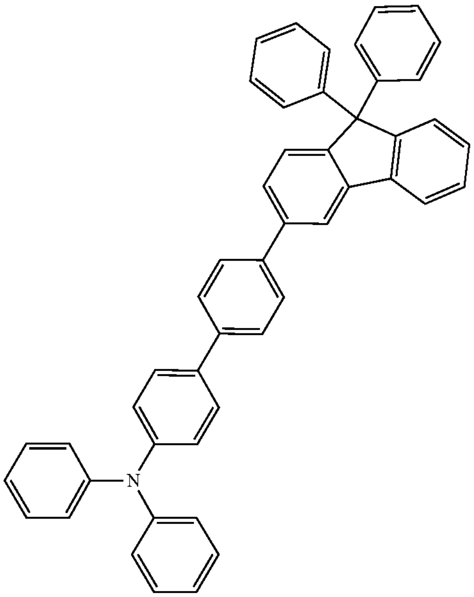

4-35
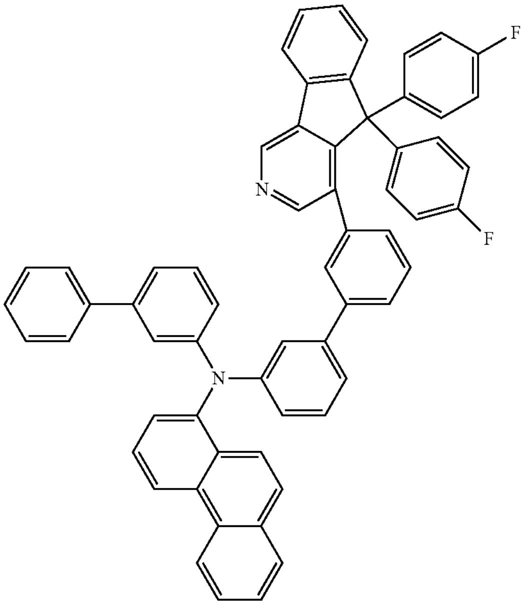
4-36
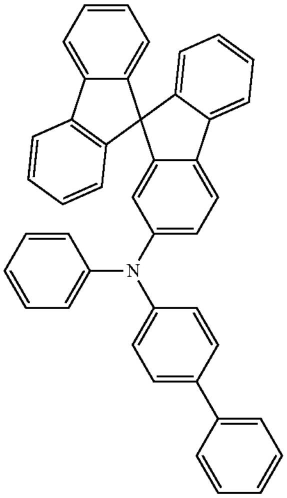
4-37
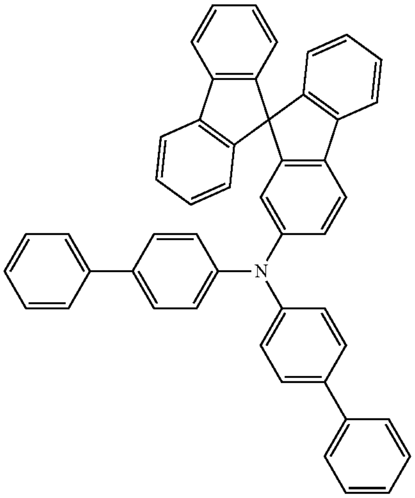
4-38
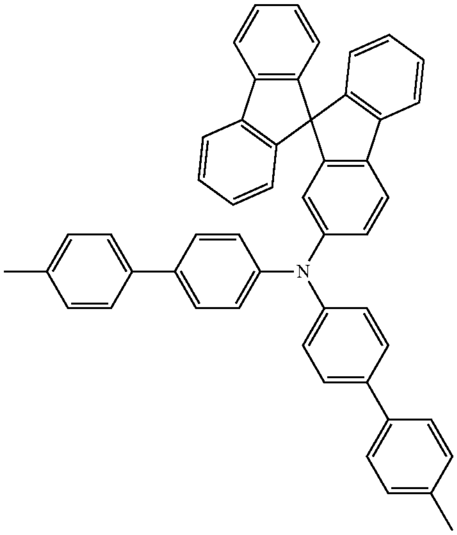
4-39
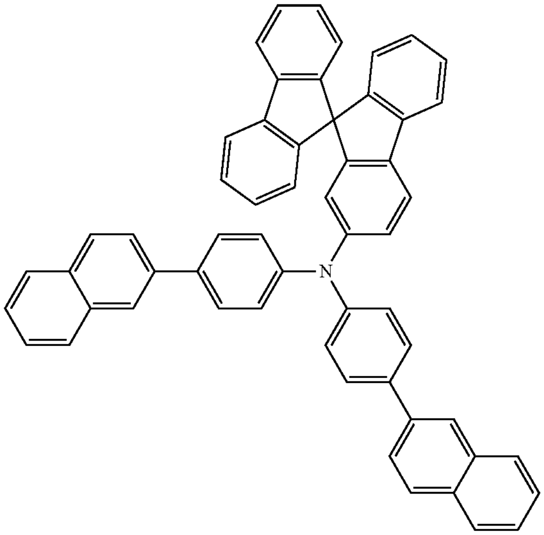
4-40
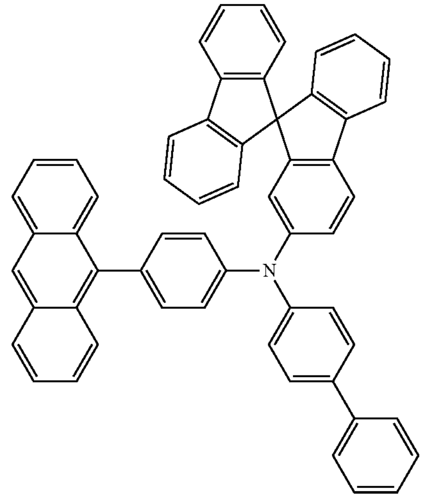

-continued
4-41
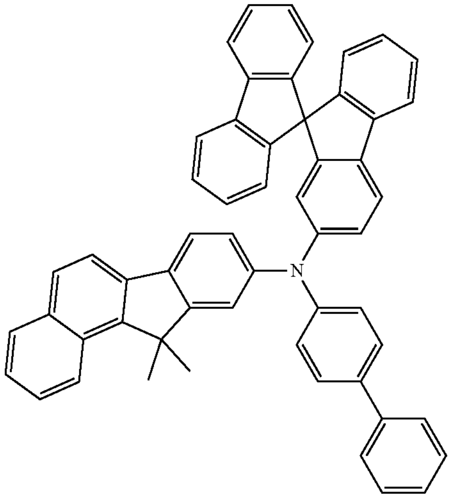
4-42
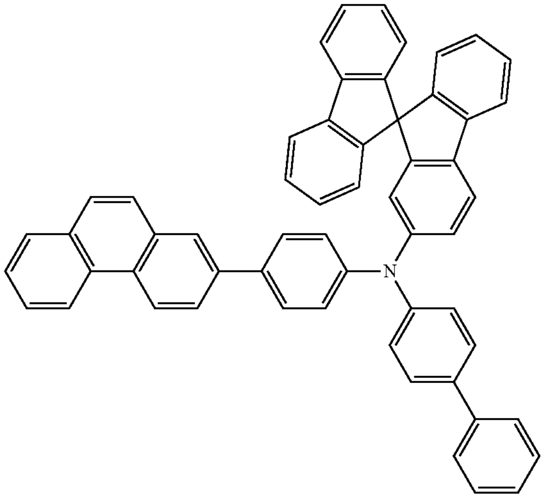
4-43
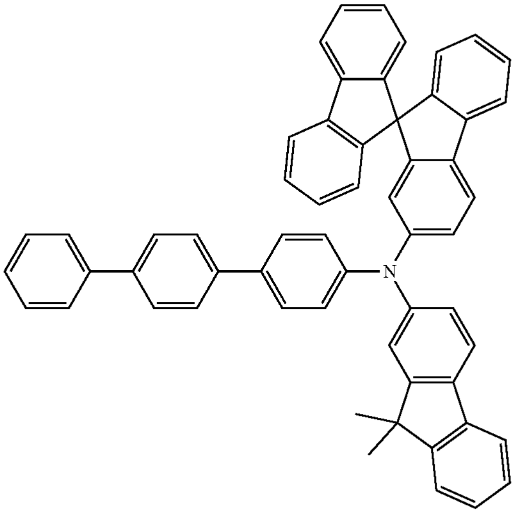
-continued
4-44
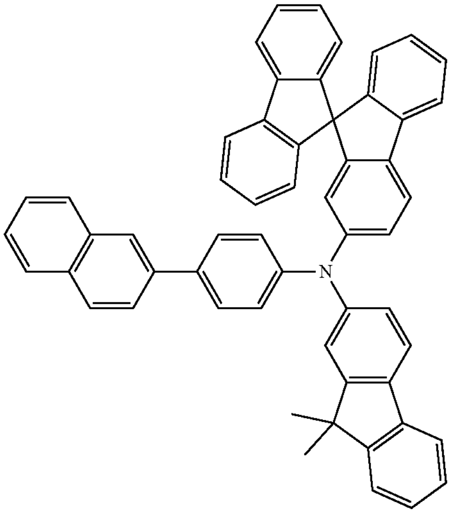
4-45
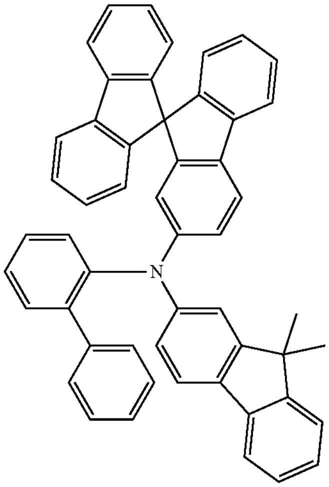
4-46
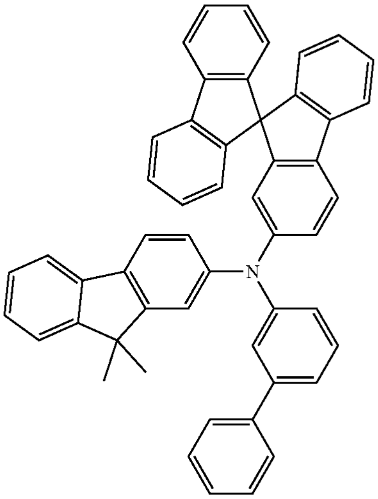

-continued
4-47
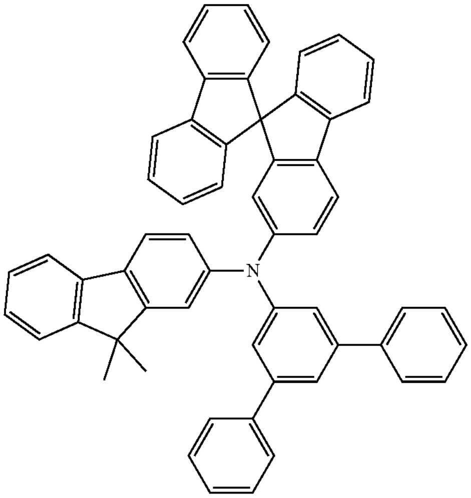
4-48
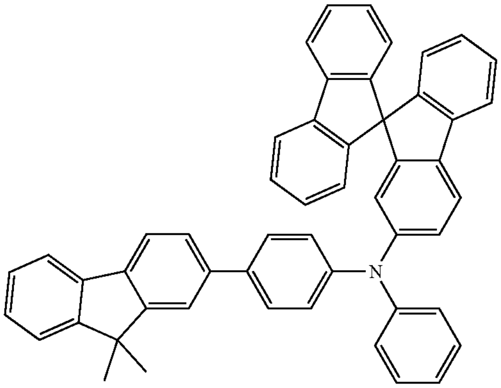
4-49
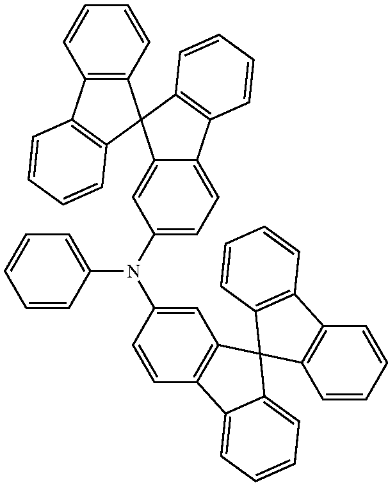
-continued
4-50
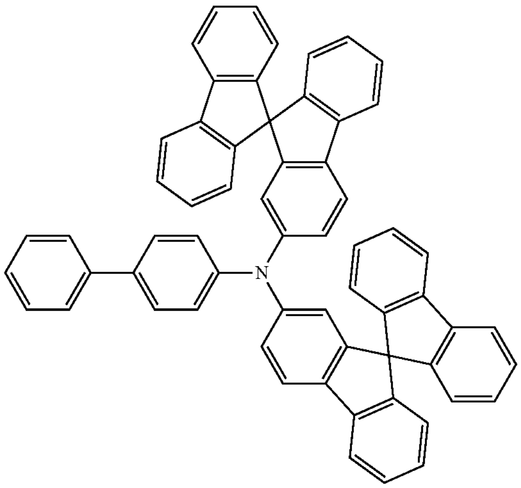
4-51
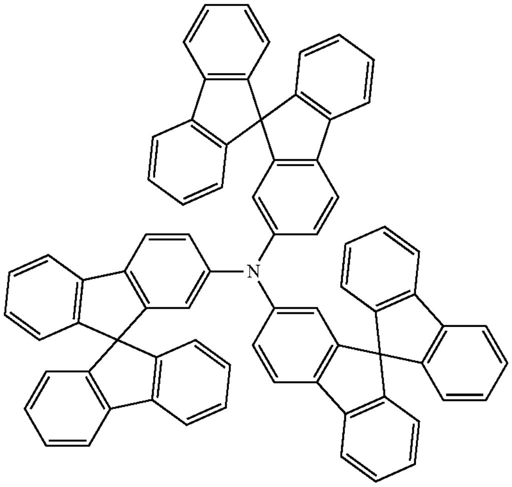
4-52
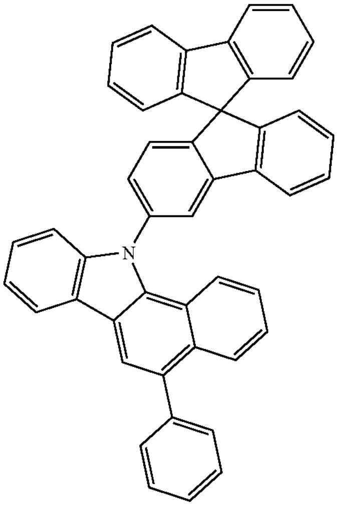

-continued
4-53
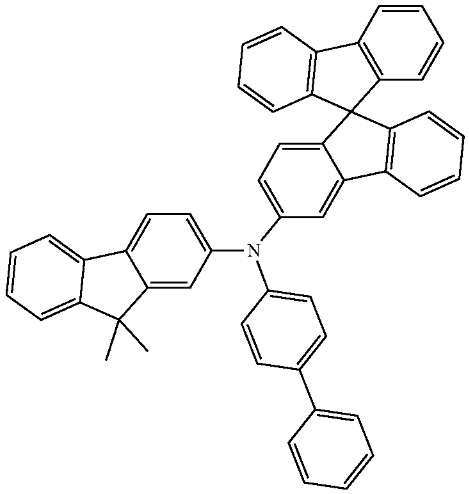
4-54
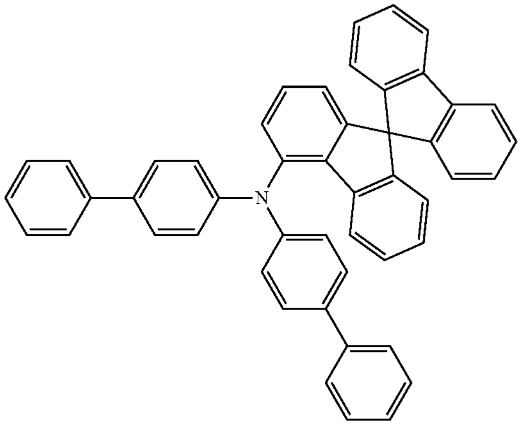
4-55
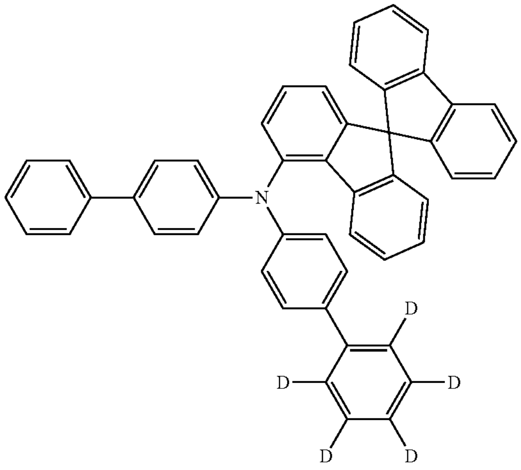
-continued
4-56
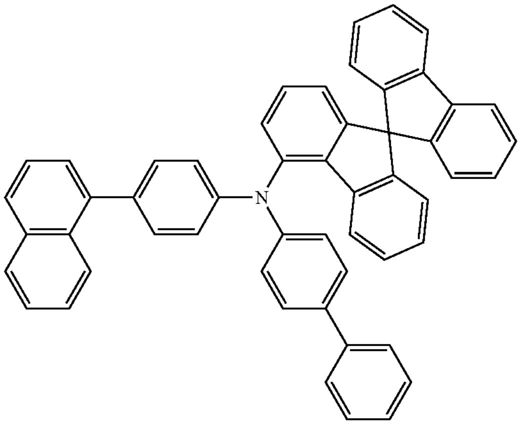
4-57
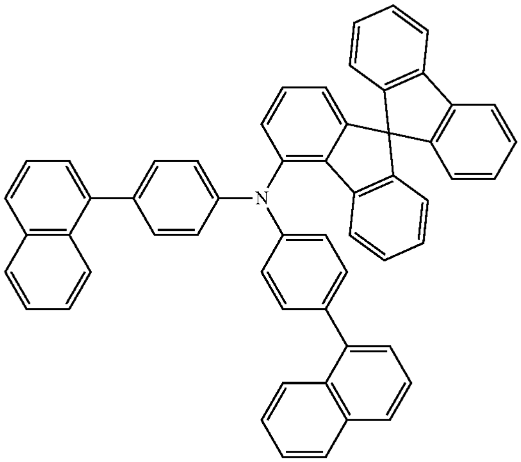
4-58
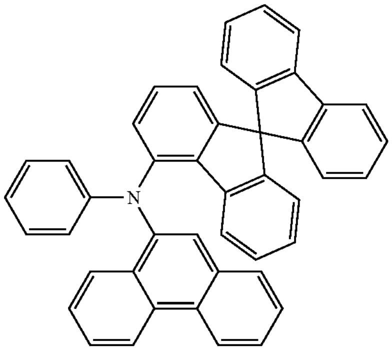

-continued
4-59
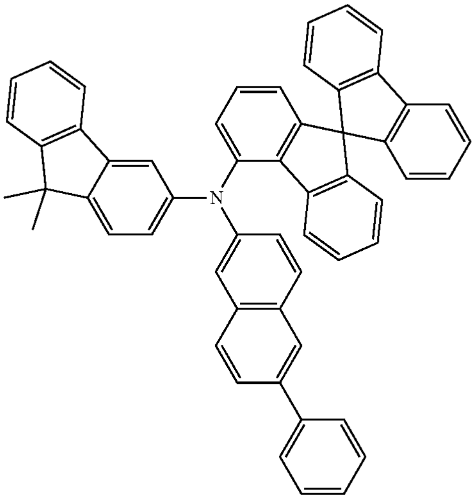
4-60
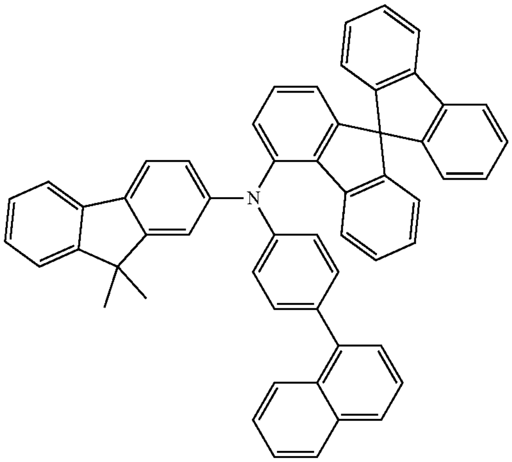
4-61
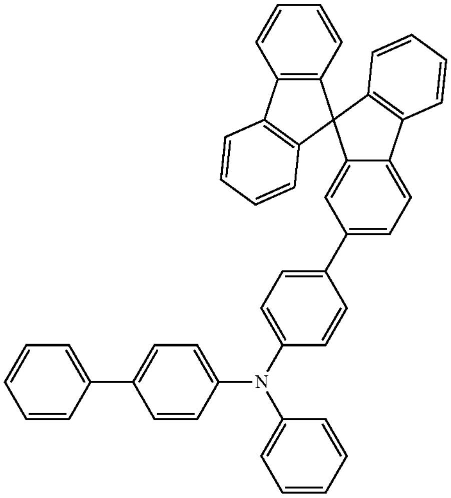
-continued
4-62
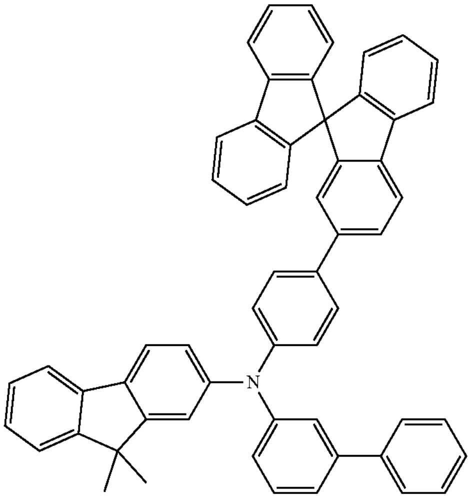
4-63
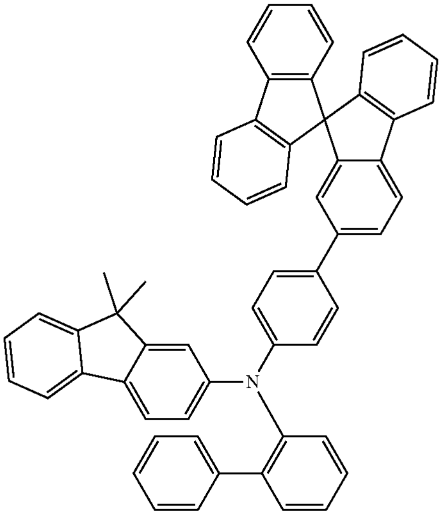
4-64
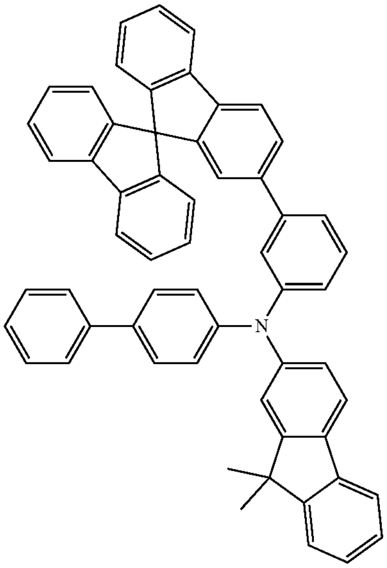

-continued
4-65
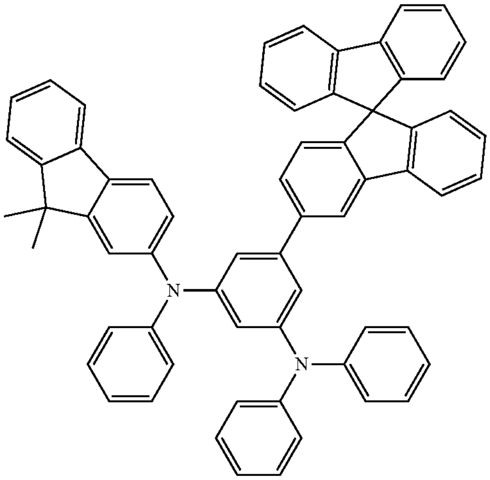
4-66
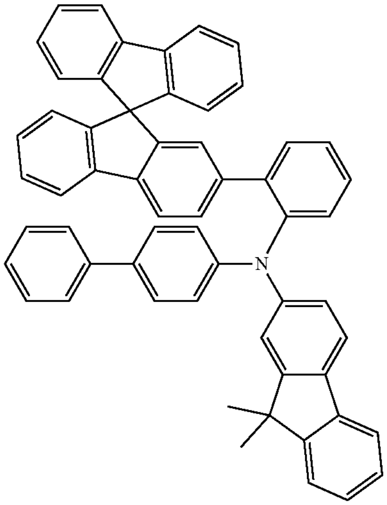
4-67
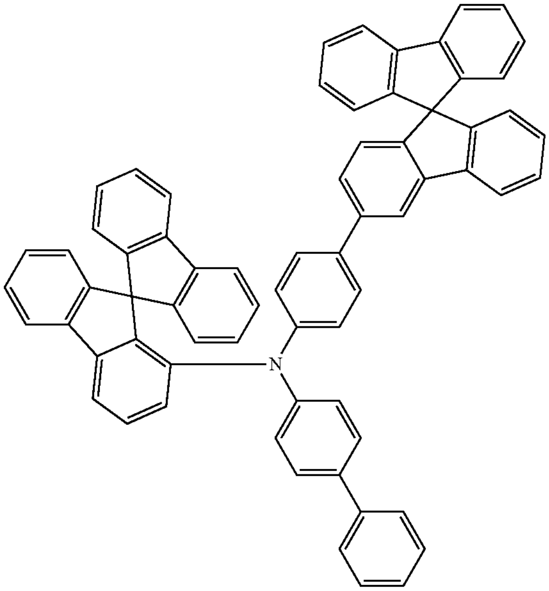
-continued
4-68
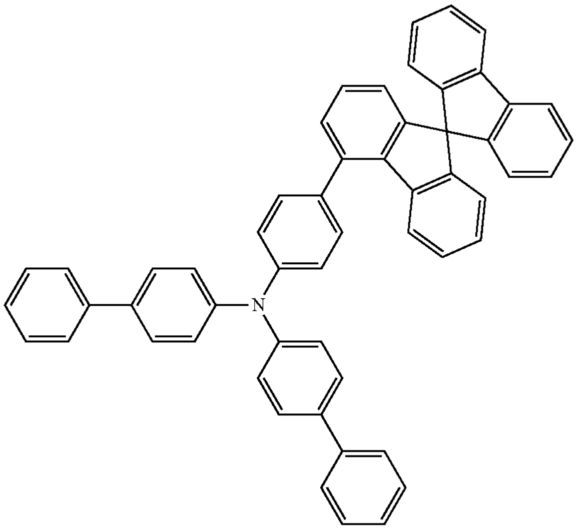
4-69
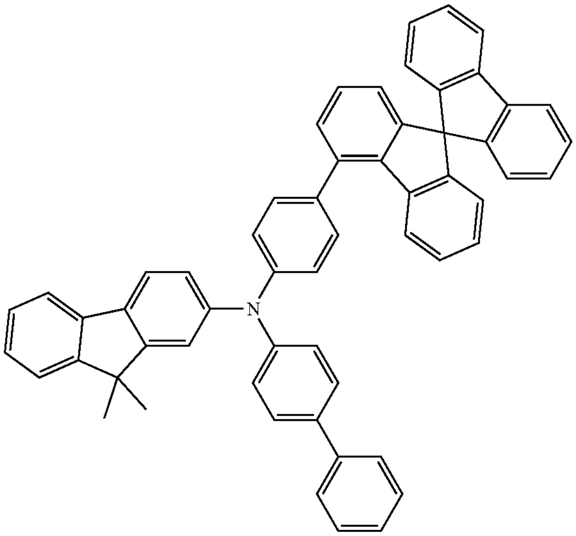
4-70
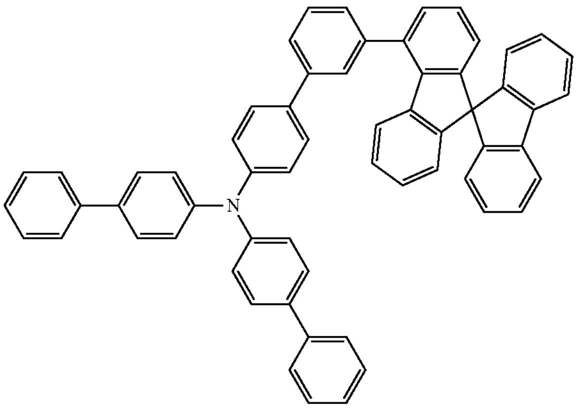

-continued
5-1
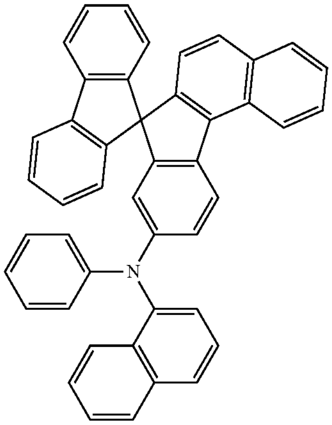
5-2
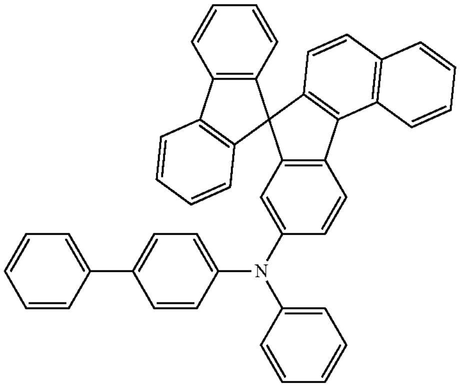
5-3
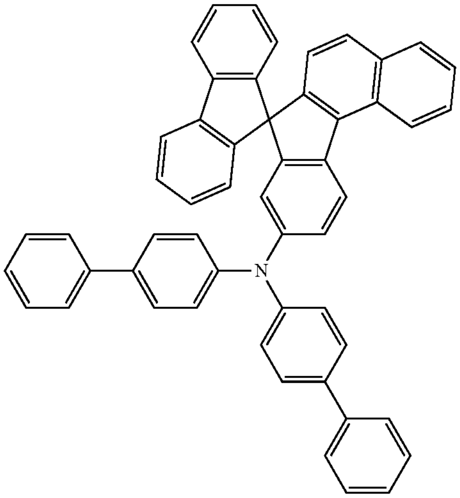
-continued
5-4
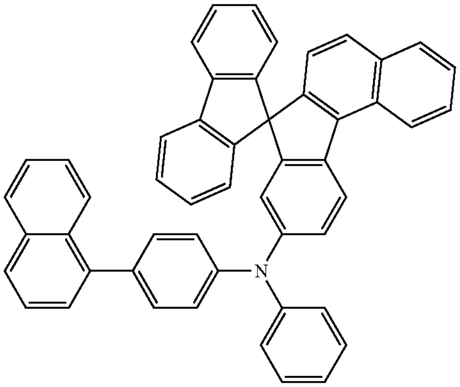
5-5
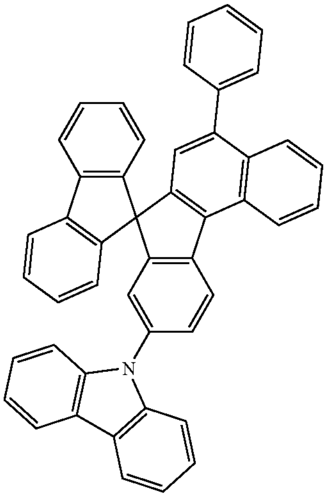
5-6
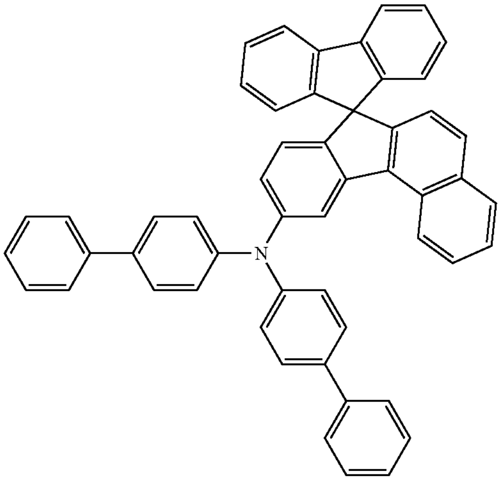

-continued
5-7
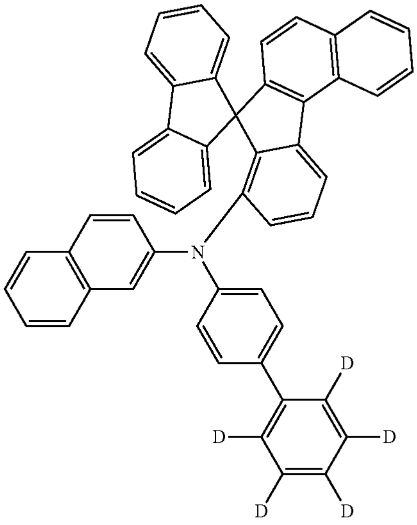
5-8
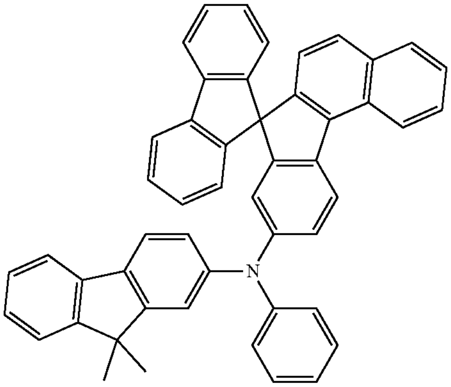
5-9
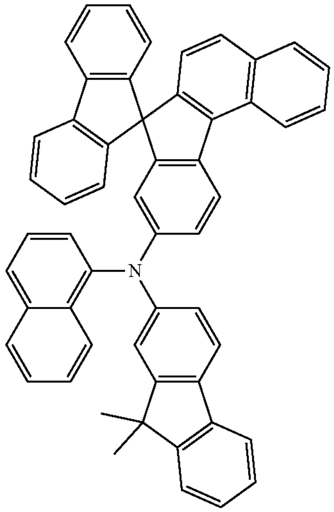
-continued
5-10
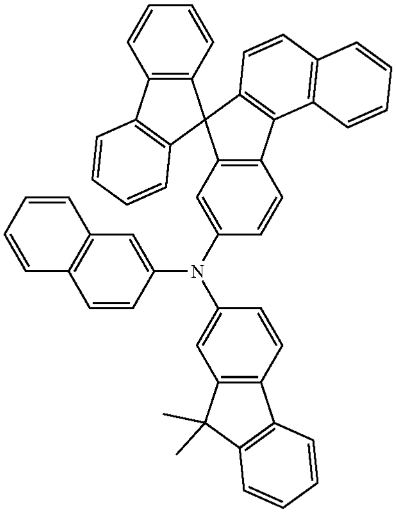
5-11
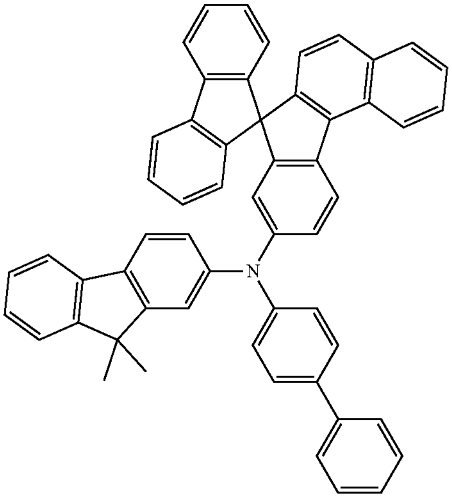

-continued
5-12
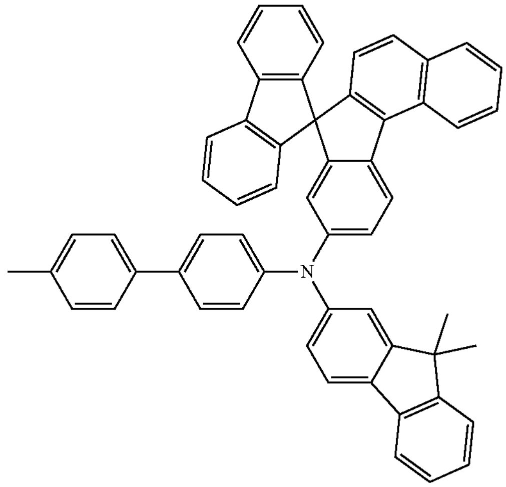
5-13
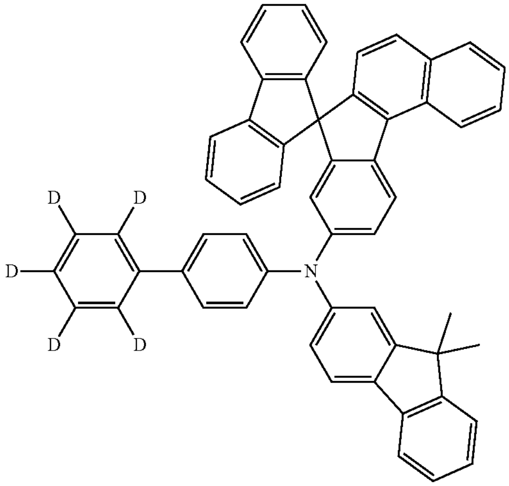
-continued
5-14
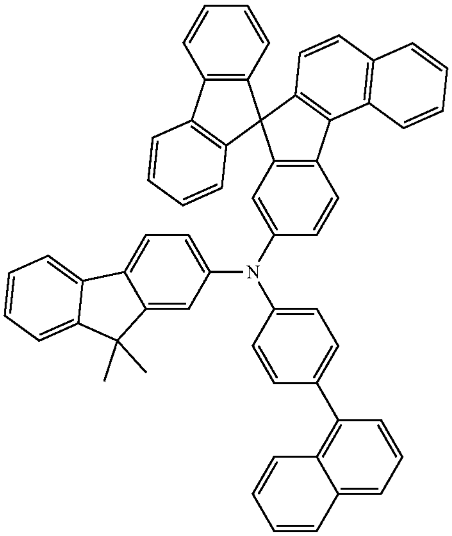
5-15
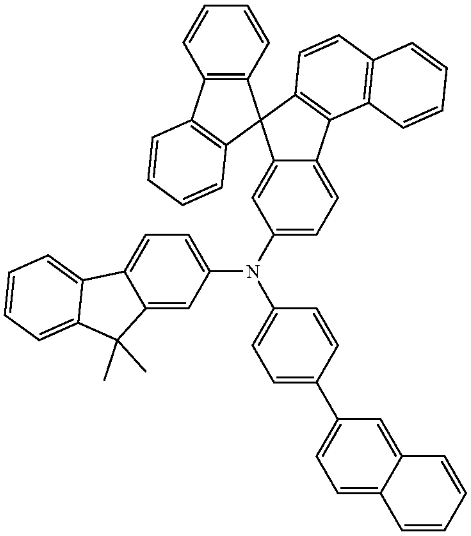

5-16
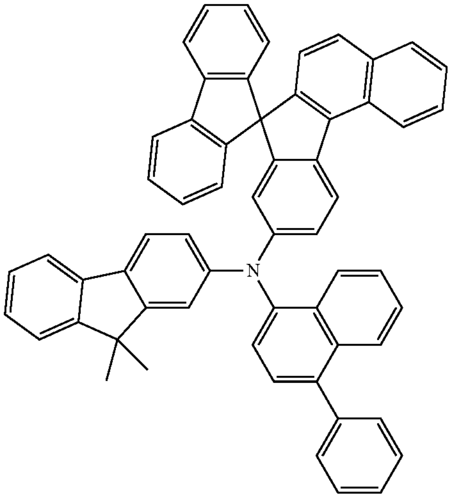
5-17
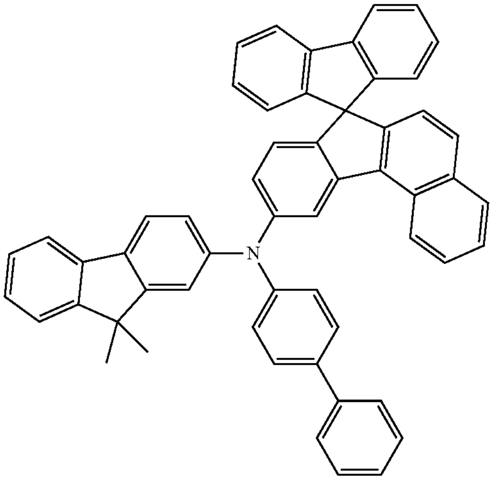
5-18
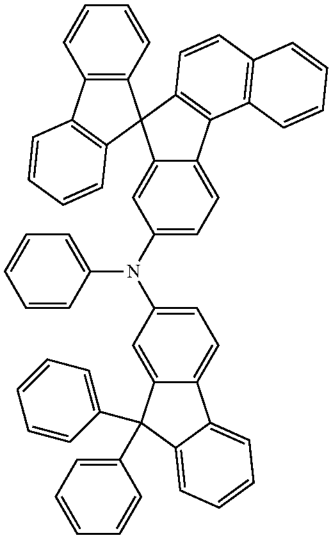
5-19
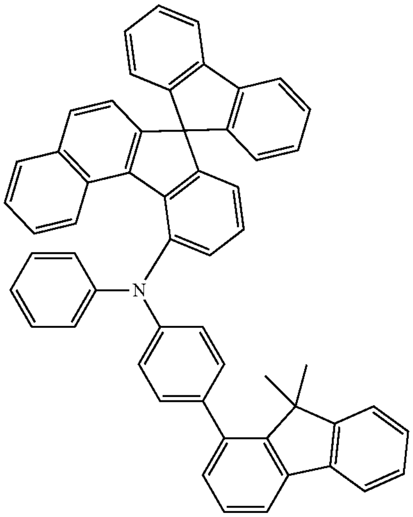
5-20
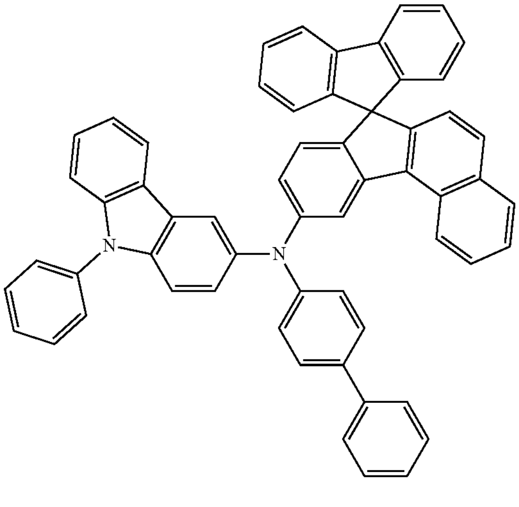
5-21
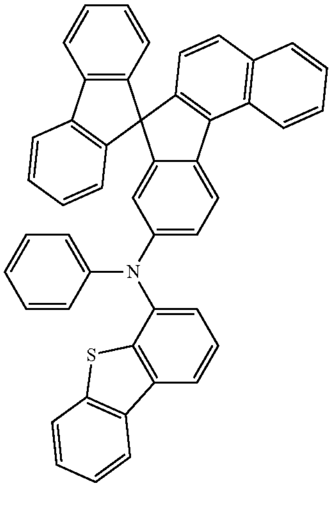

-continued
5-22
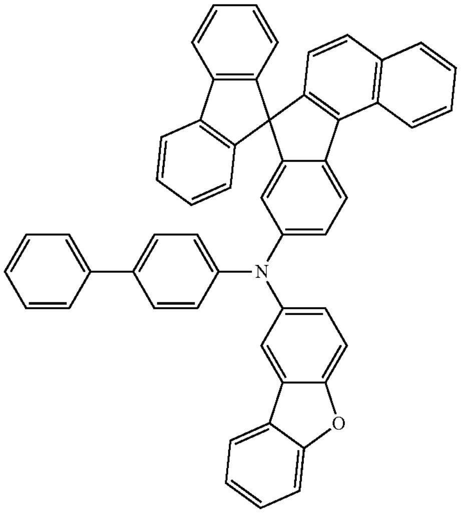
5-23
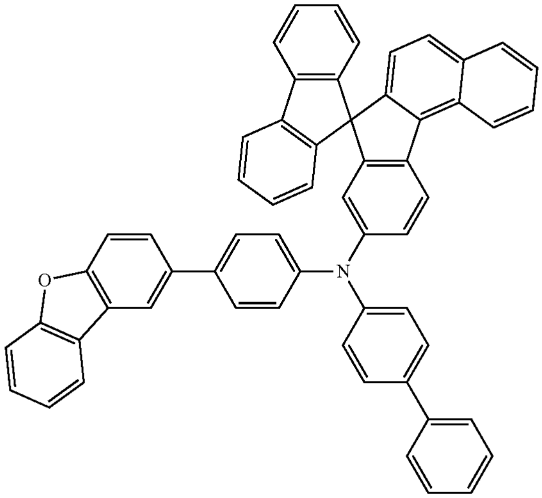
5-24
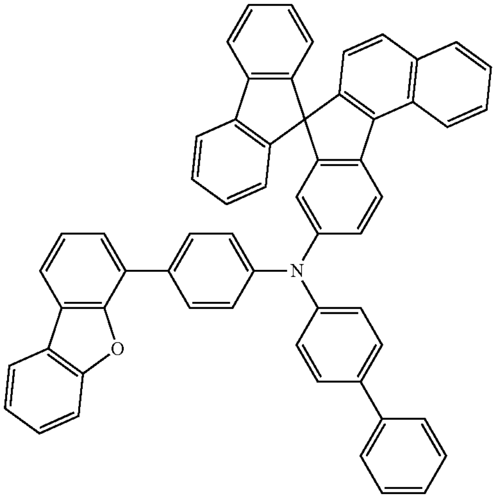
5-25
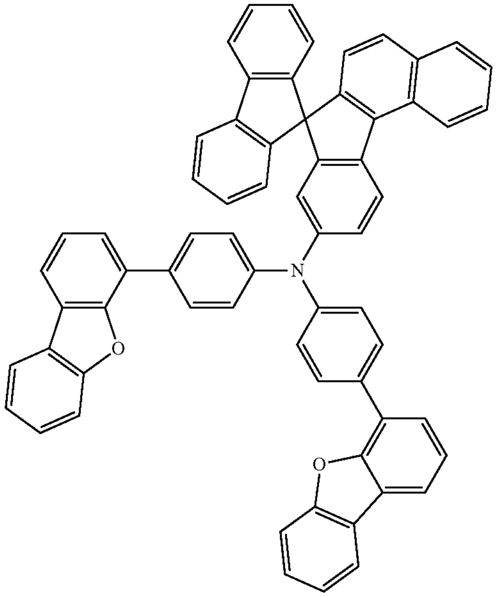
5-26
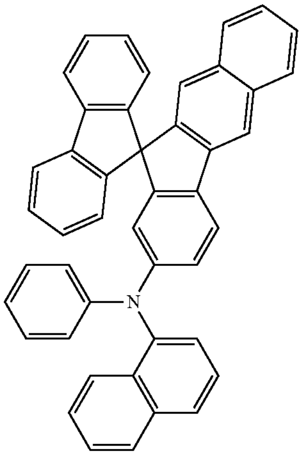
5-27
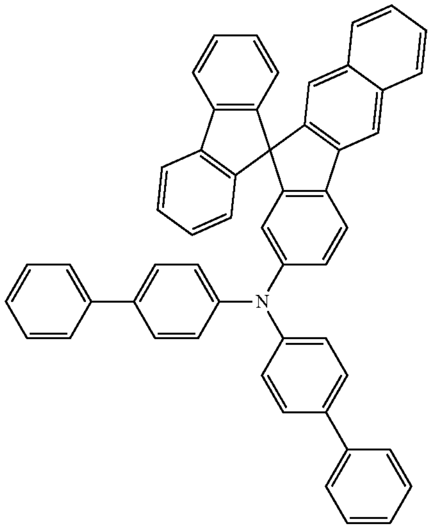

-continued
5-28
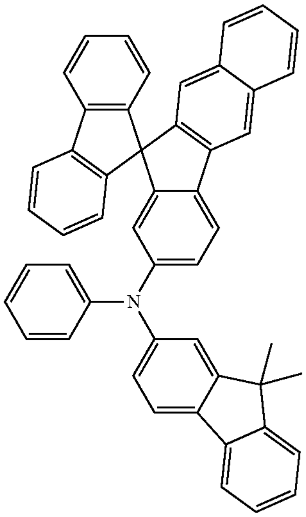
5-29
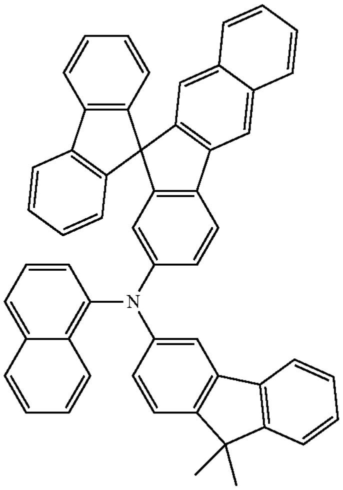
5-30
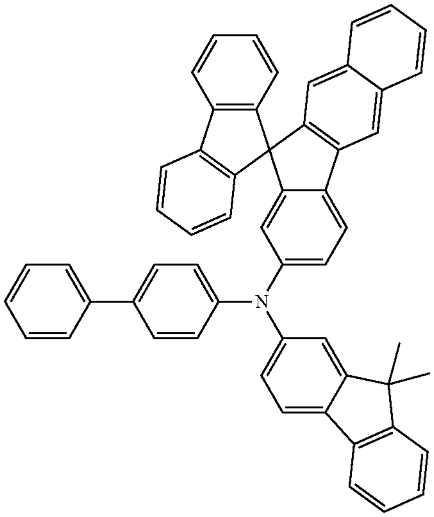
5-31
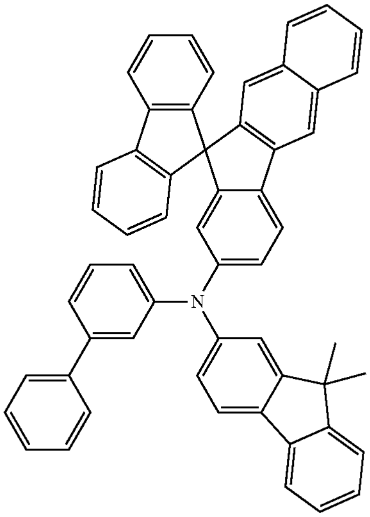
5-32
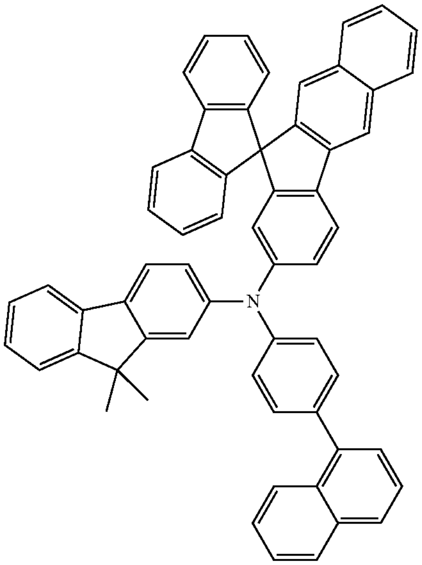
5-33
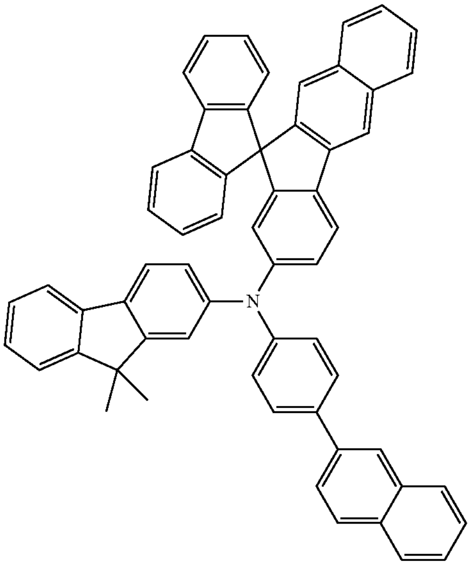

-continued
5-34
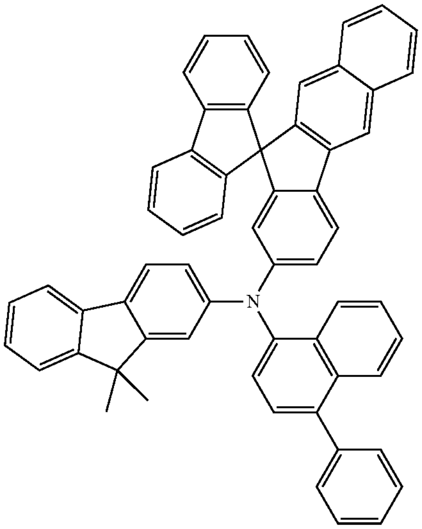
5-35
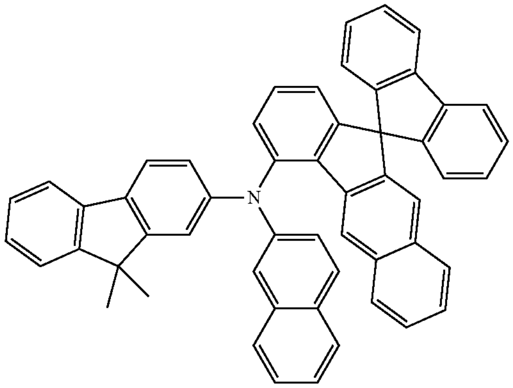
5-36
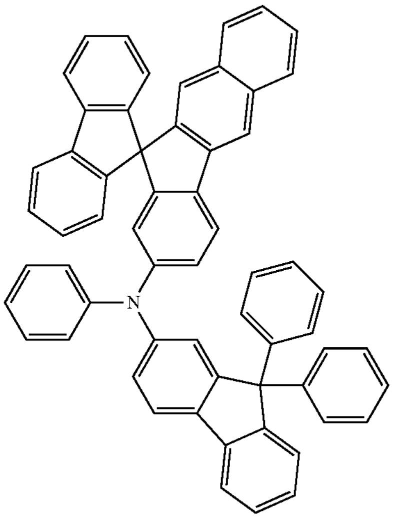
5-37
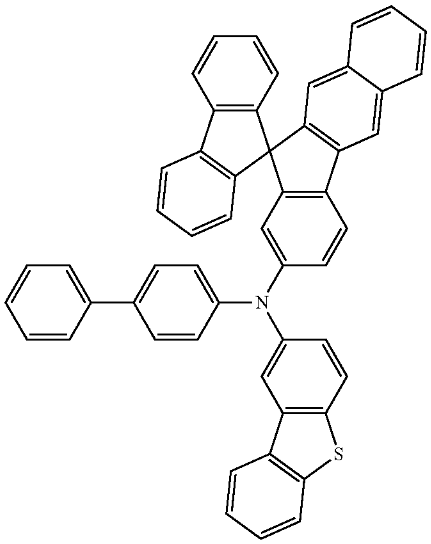
5-38
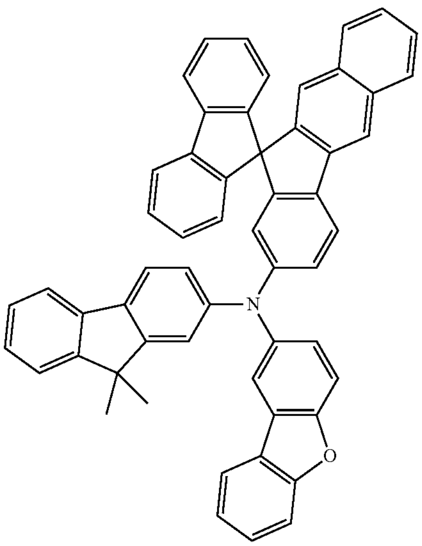
5-39
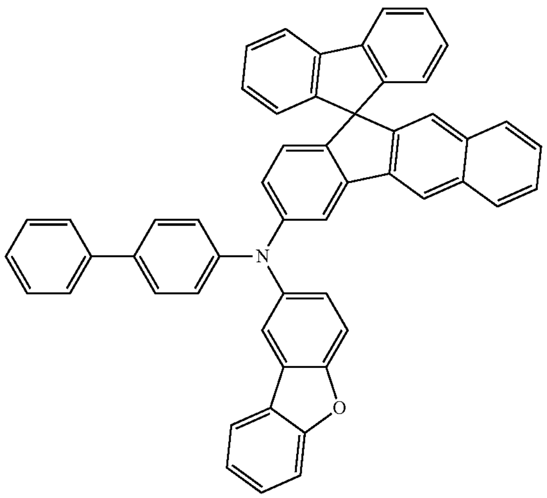

-continued
5-40
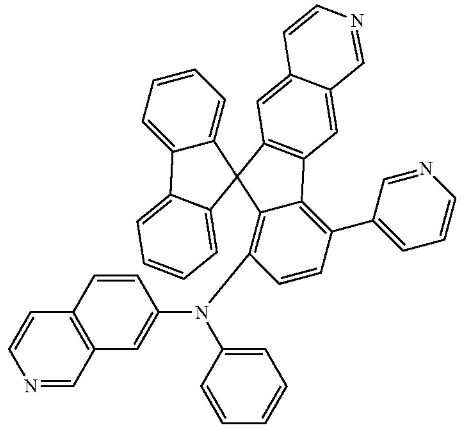
5-41
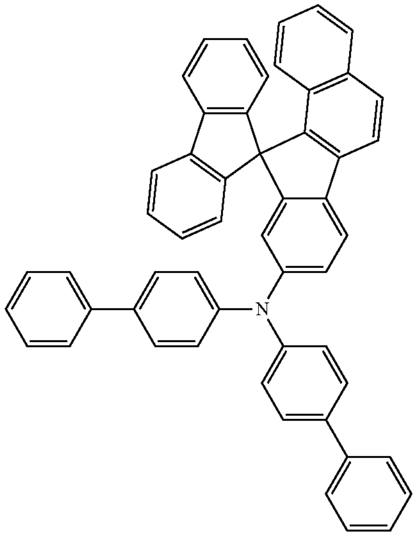
5-42
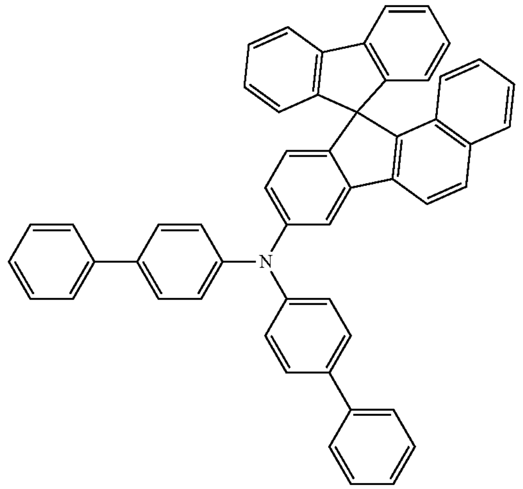
5-43
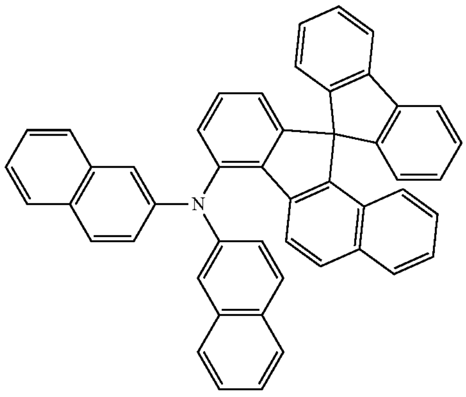
5-44
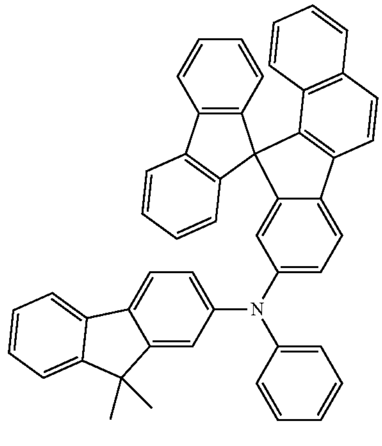
5-45
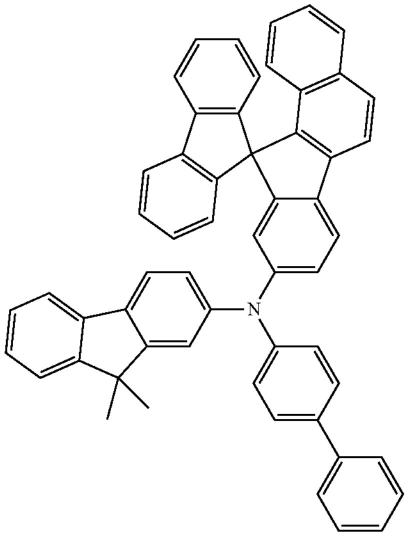

-continued
5-46
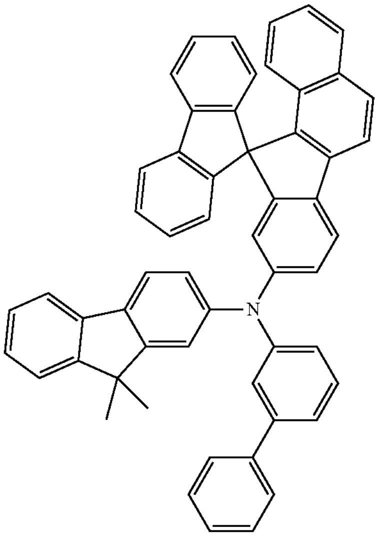
5-47
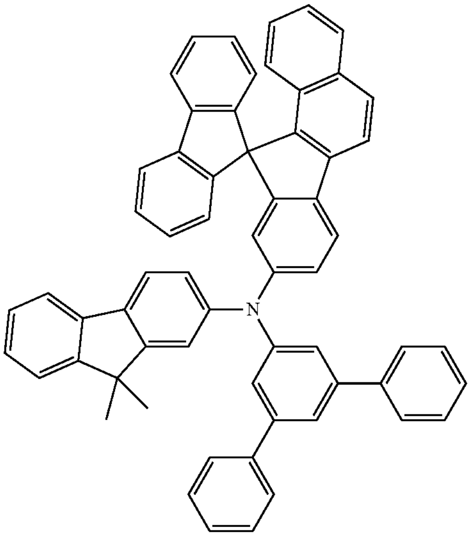
5-48
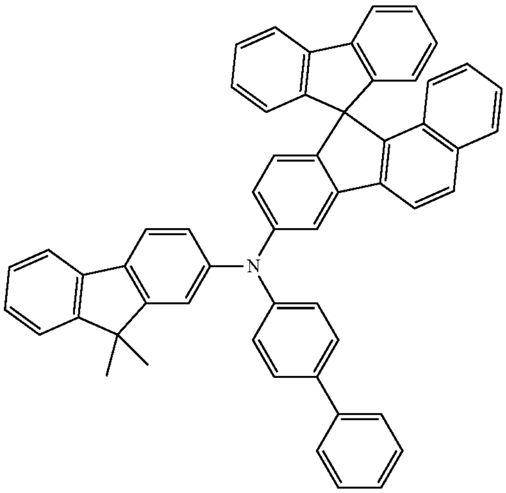
5-49
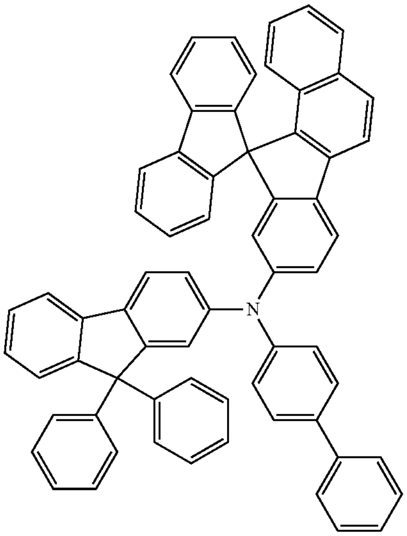
5-50
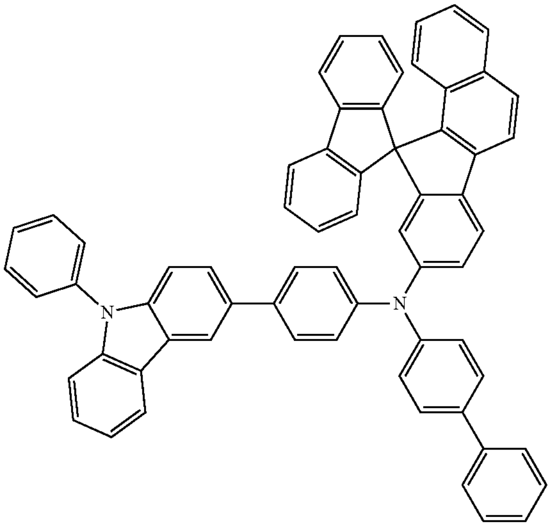
5-51
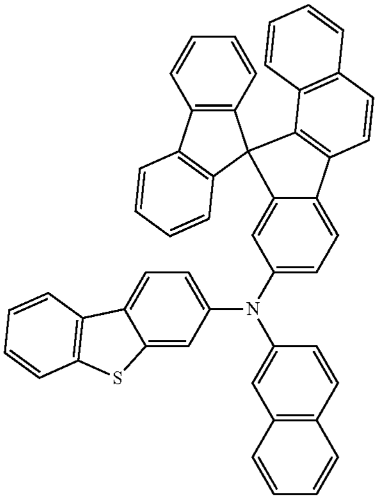

-continued
5-52
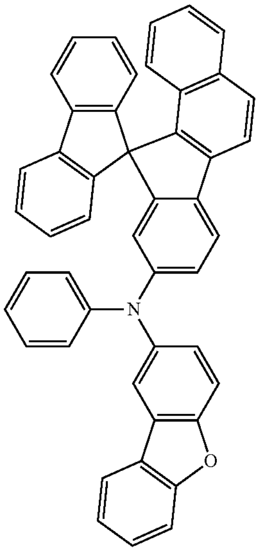
5-53
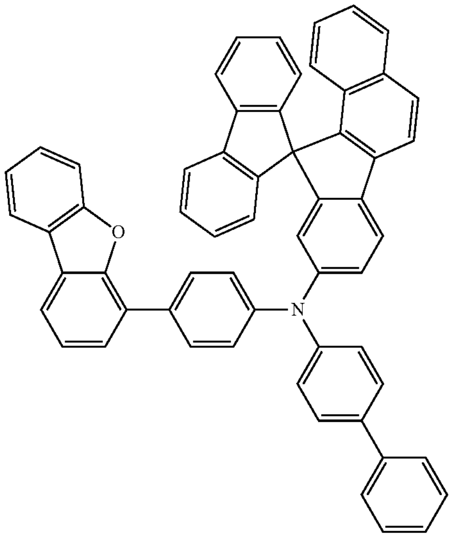
5-54
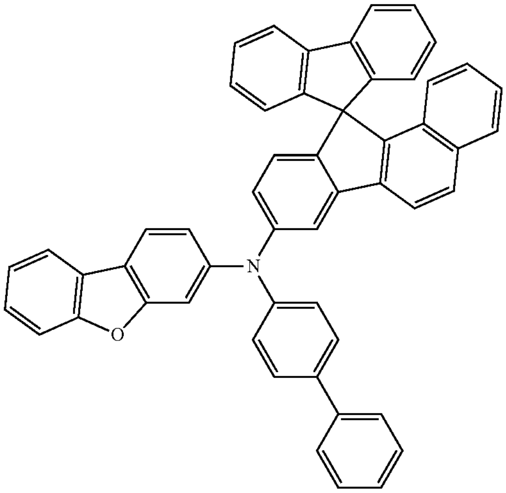
5-55
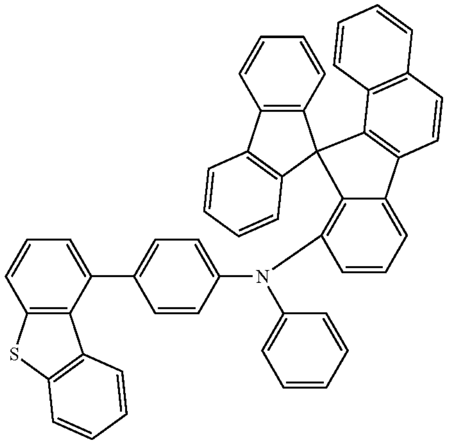
5-56
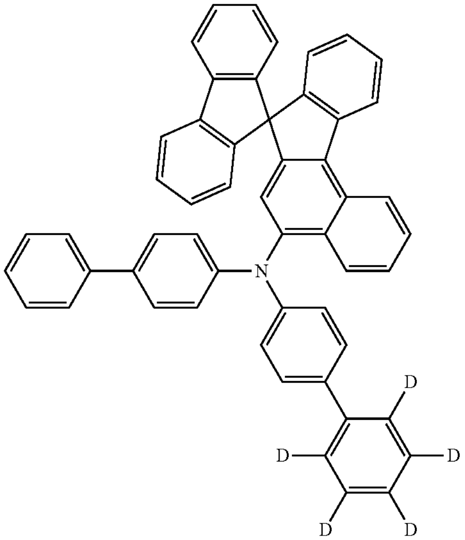
5-57
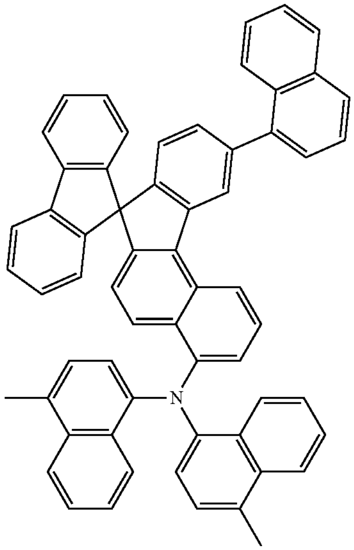

-continued
5-58
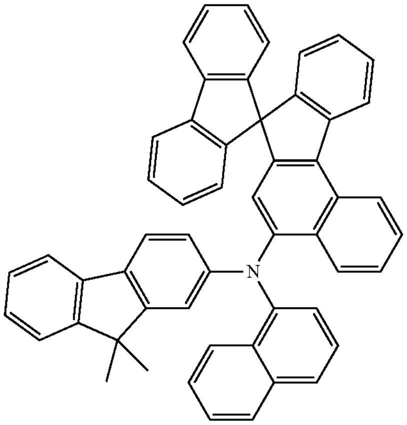
5-59
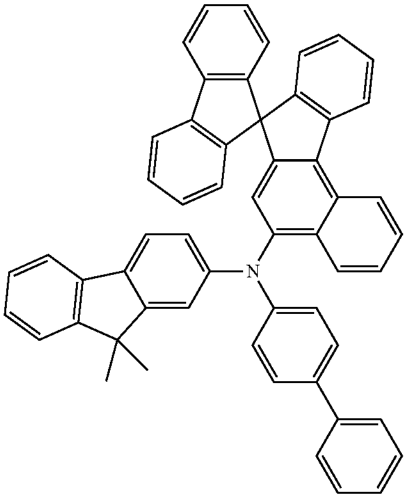
5-60
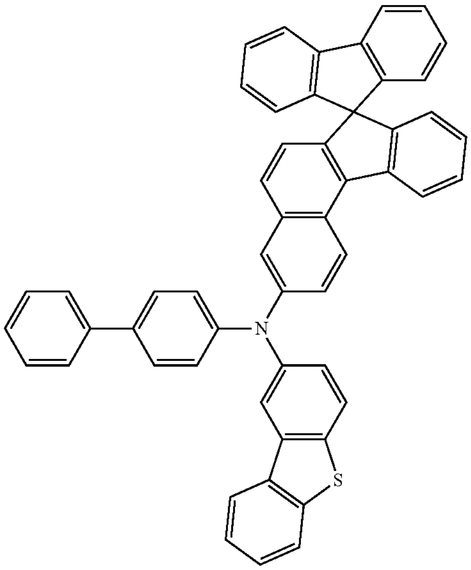
5-61
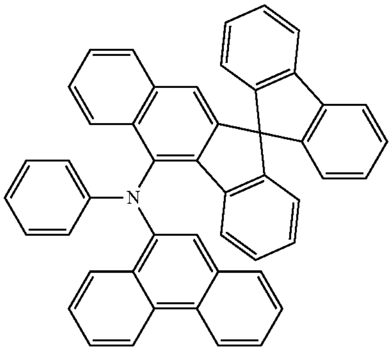
5-62
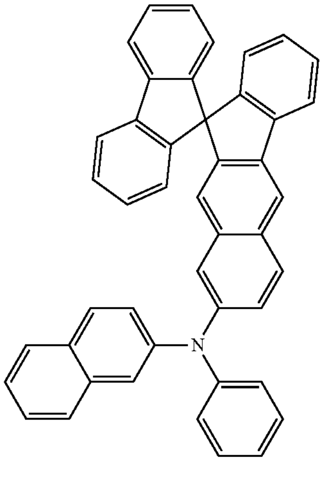
5-63
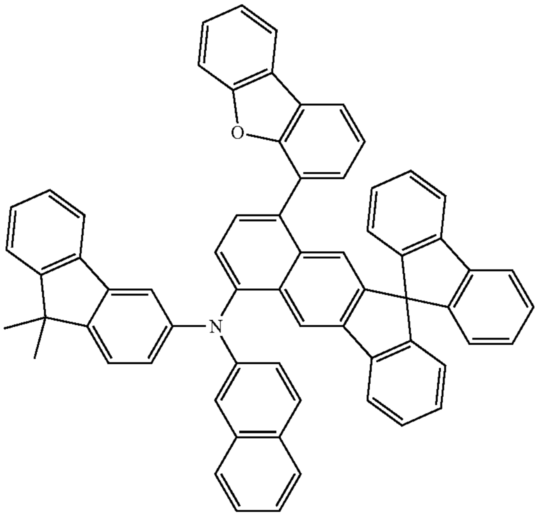

-continued
5-64
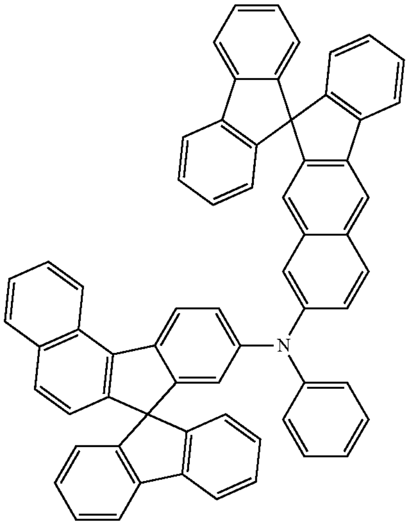
5-65
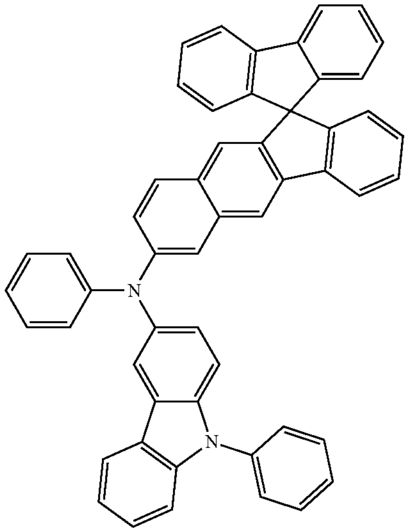
5-66
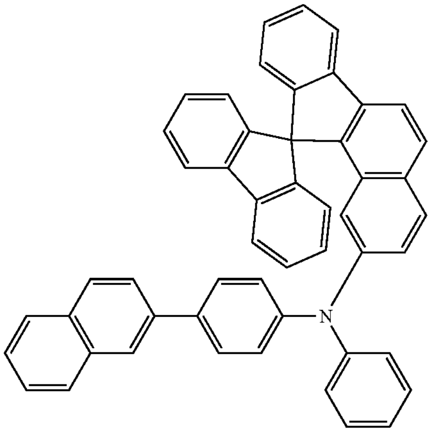
5-67
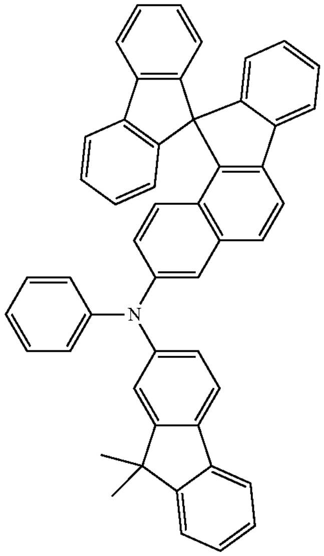
5-68
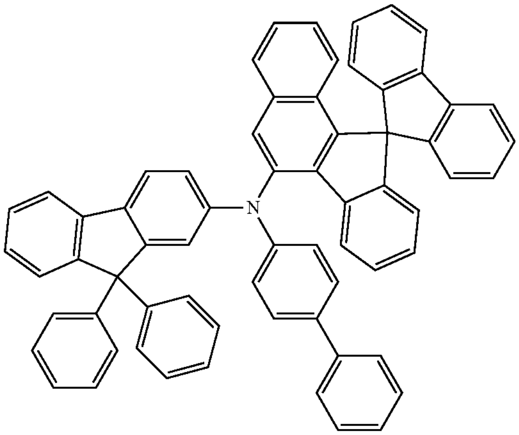
5-69
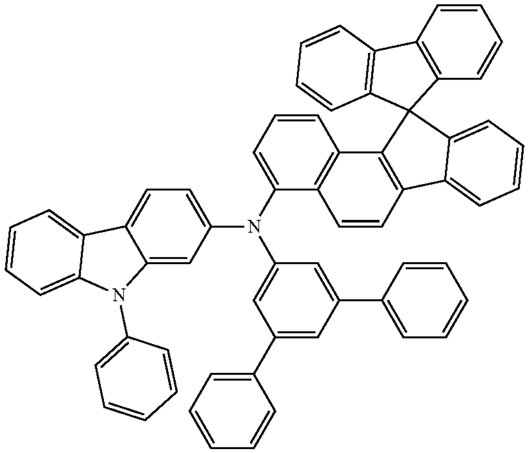

-continued
5-70
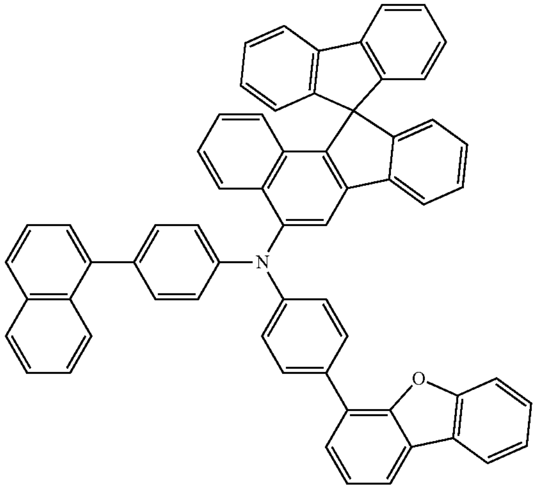
5-71
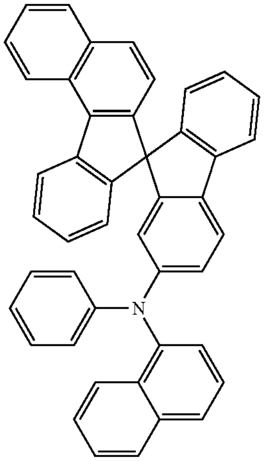
5-72
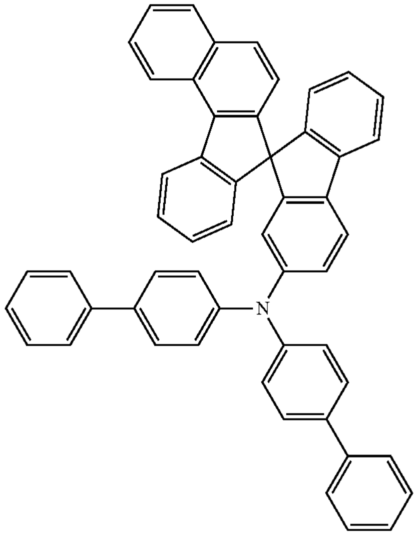
5-73
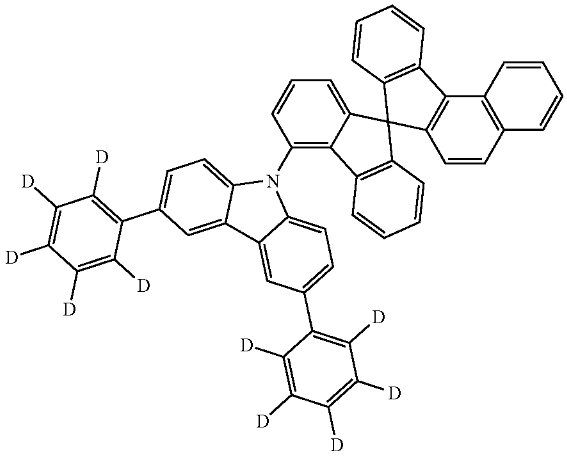
5-74
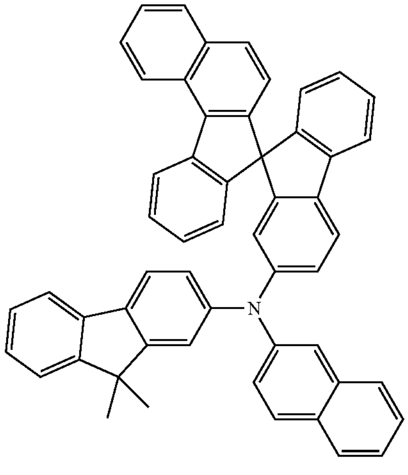
5-75
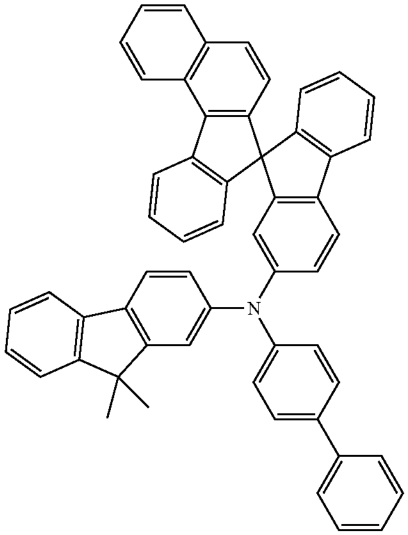

-continued
5-76
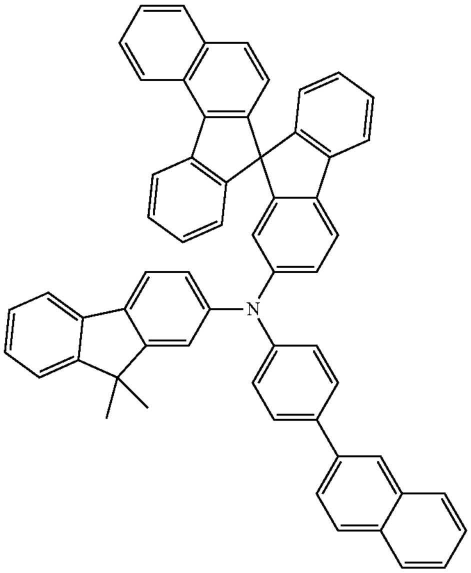
5-77
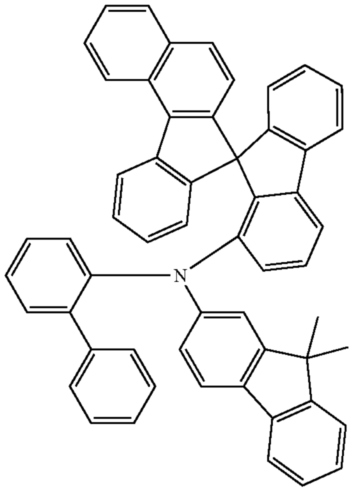
5-78
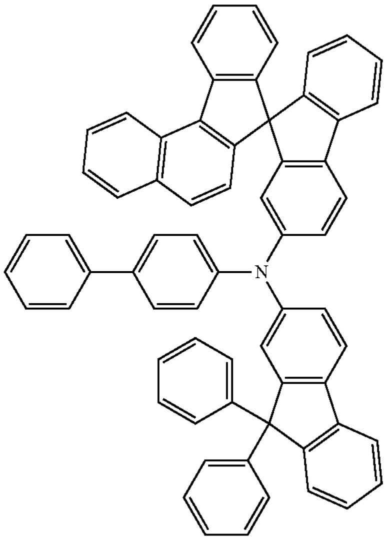
5-79
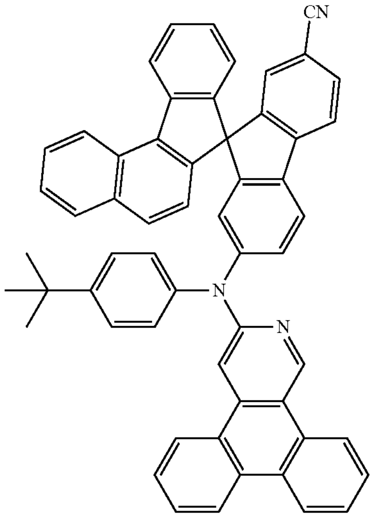

-continued
5-80
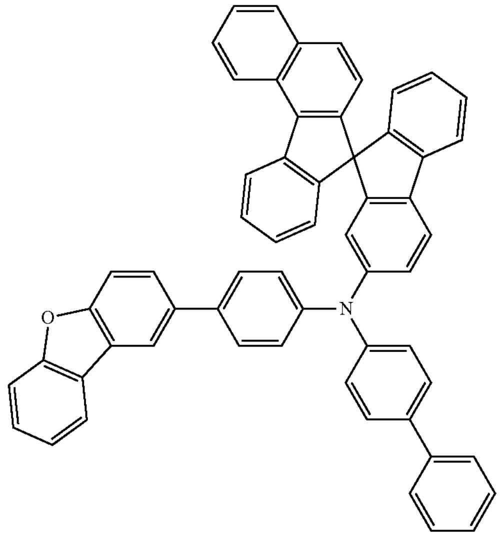
5-81
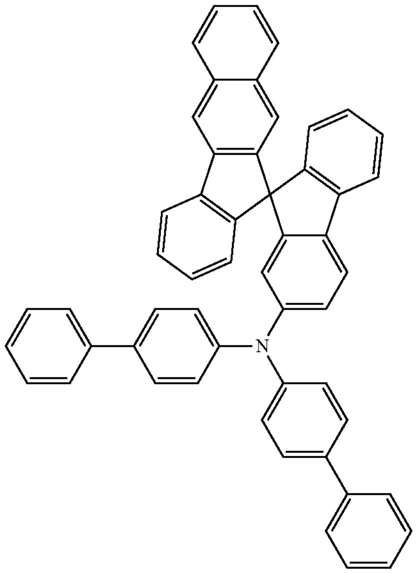
5-82
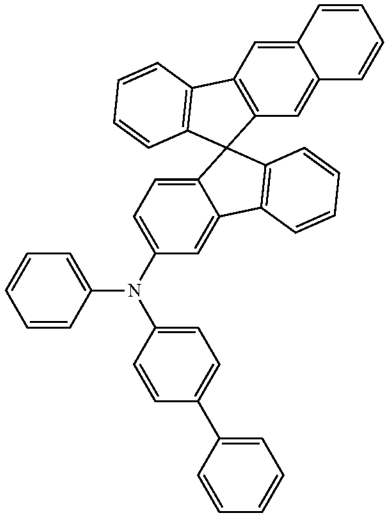
5-83
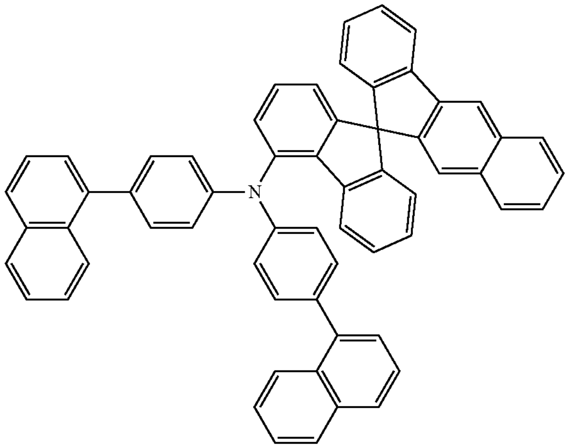

-continued
5-84
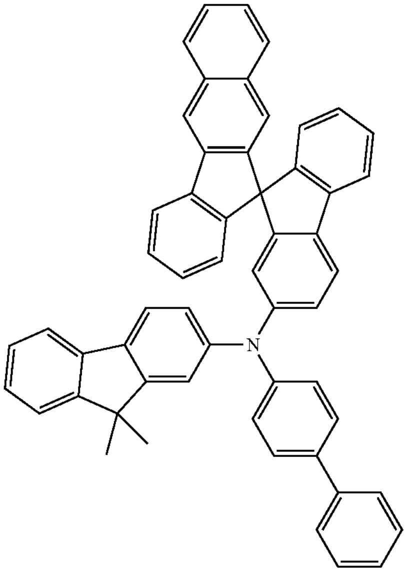
5-85
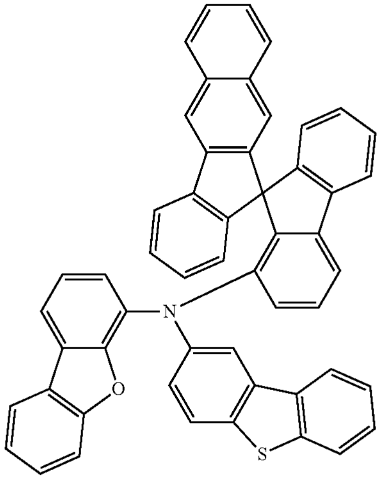
5-86
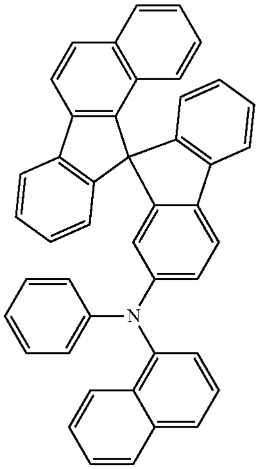
5-87
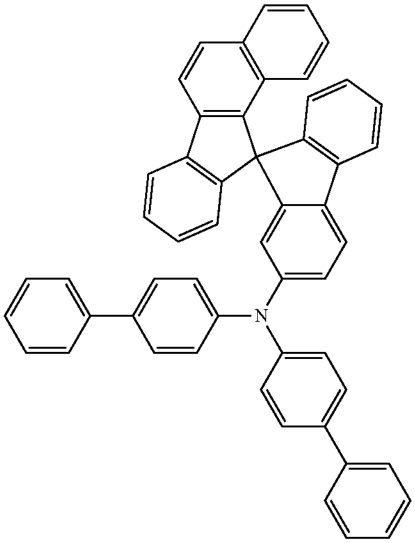
5-88
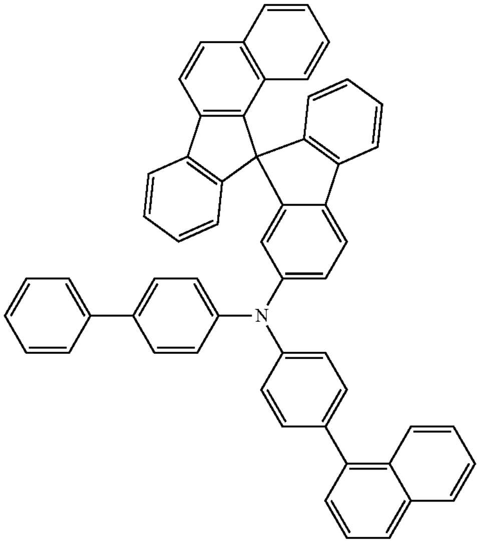
5-89
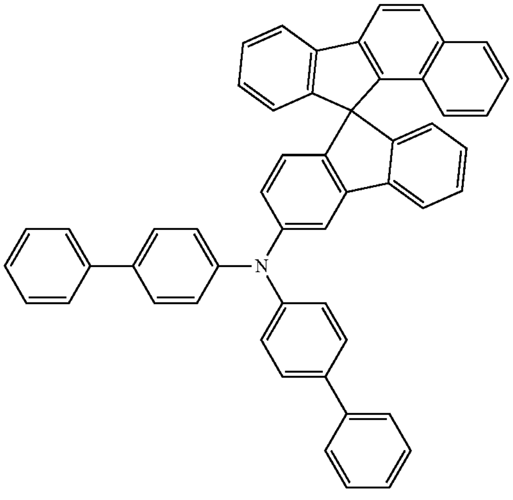

-continued
5-90
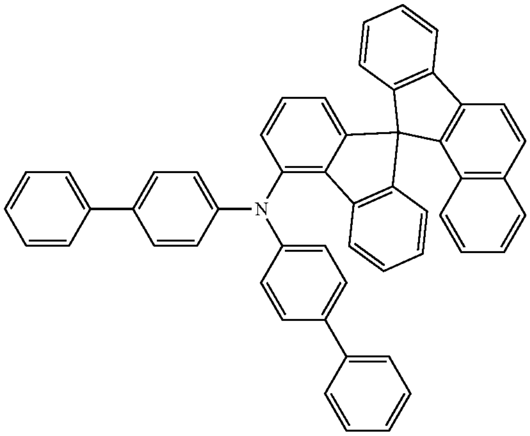
5-91
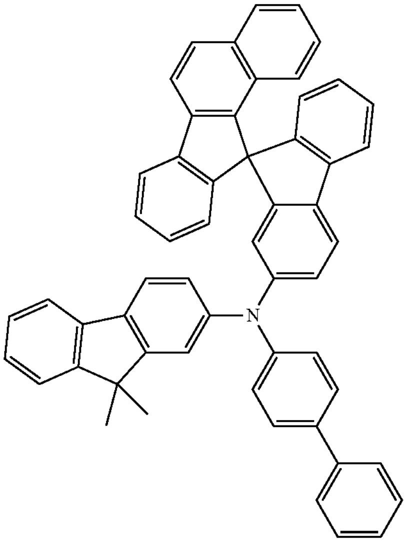
5-92
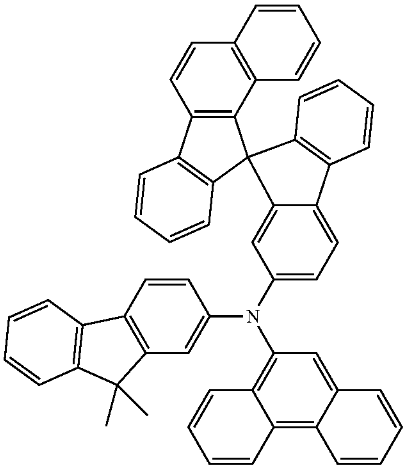
5-93
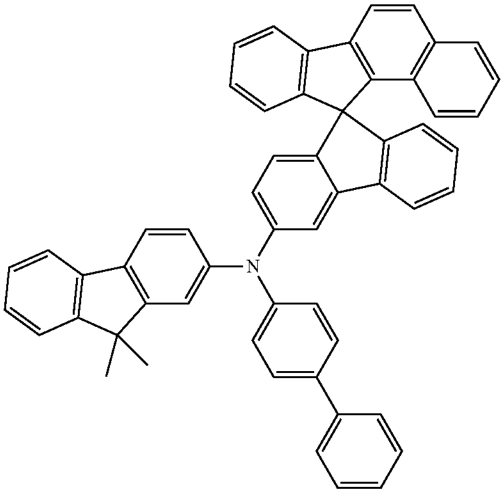
5-94
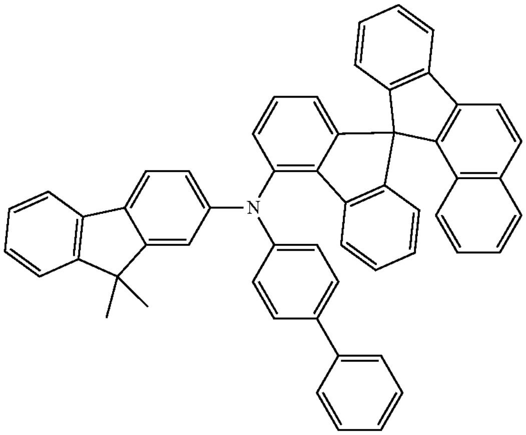
5-95
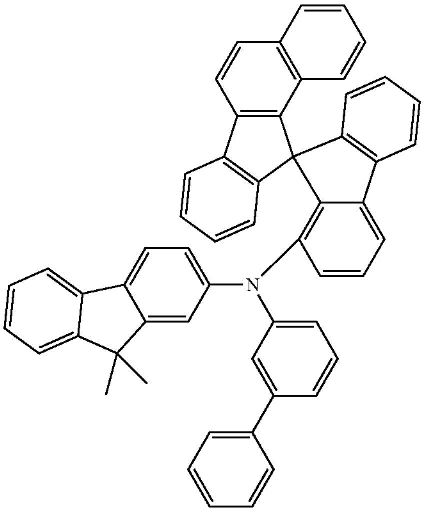

-continued
5-96
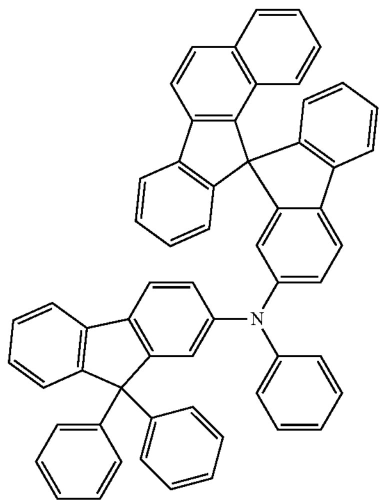
5-97
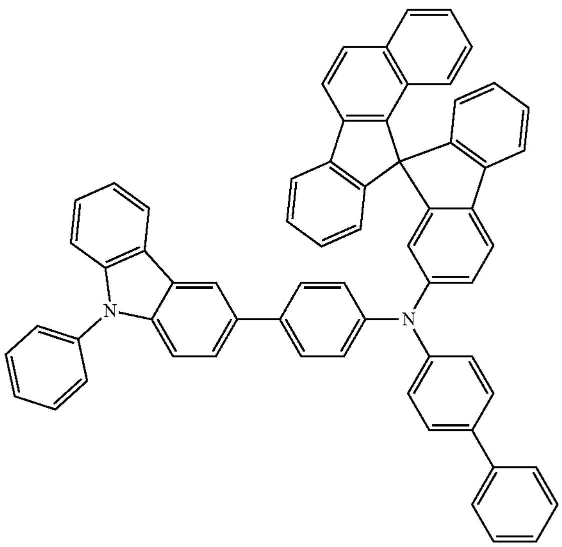
5-98
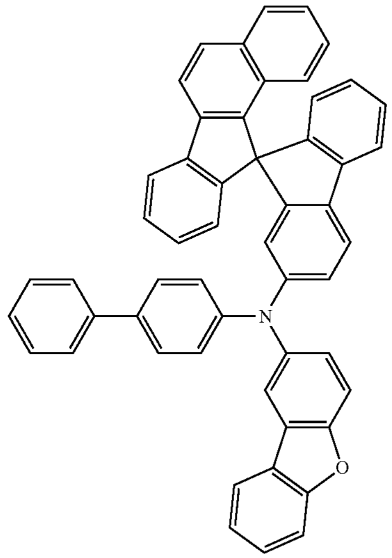
5-99
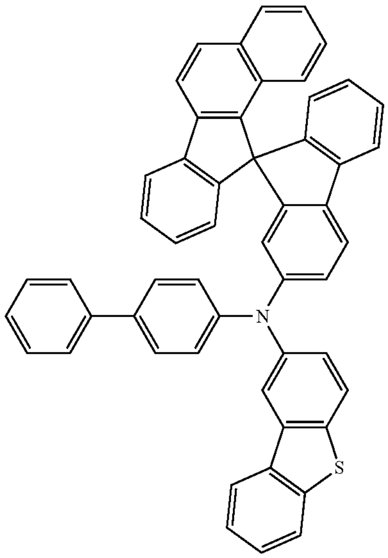

-continued
5-100
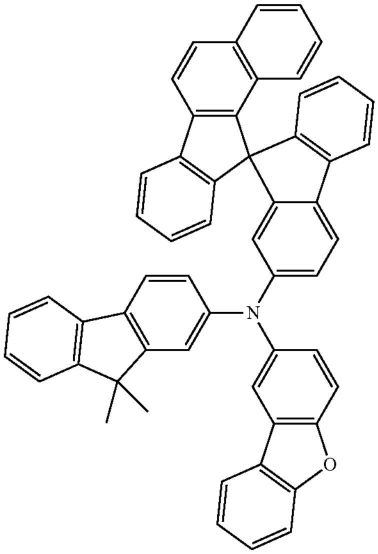
5-101
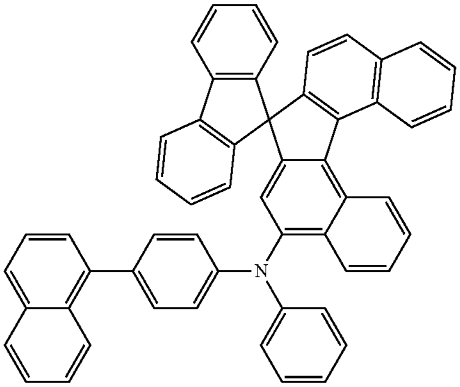
5-102
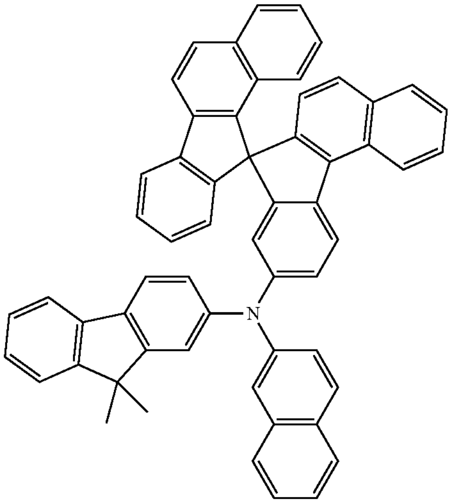
5-103
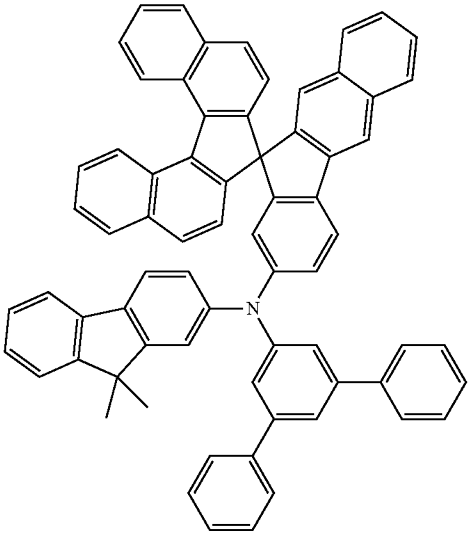
5-104
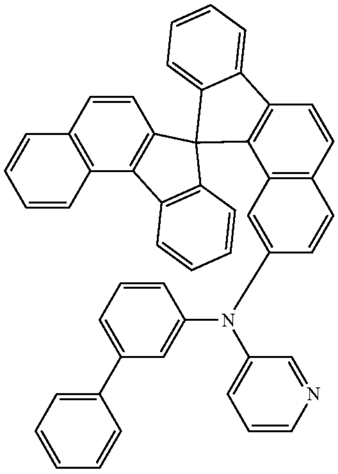
5-105
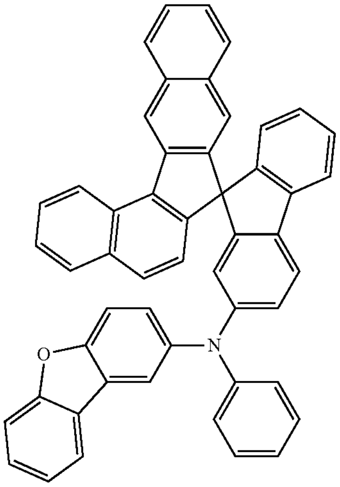

-continued
5-106
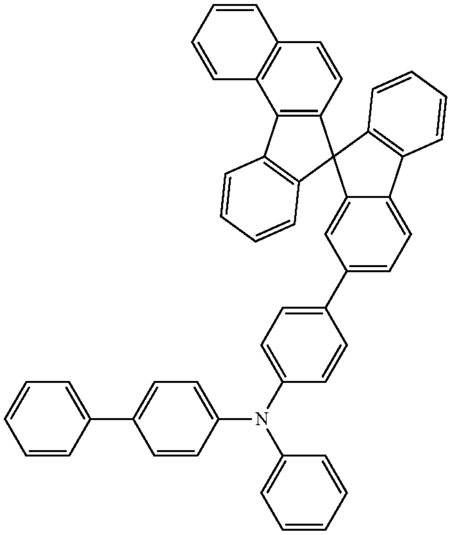
5-107
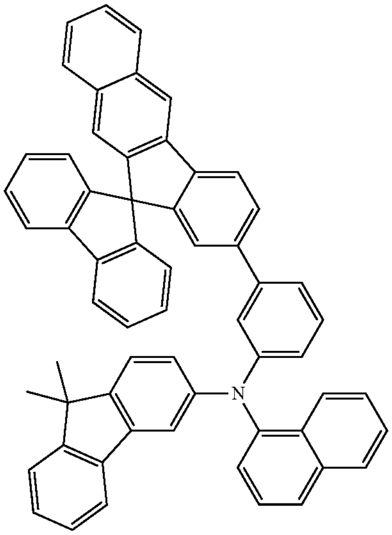
5-108
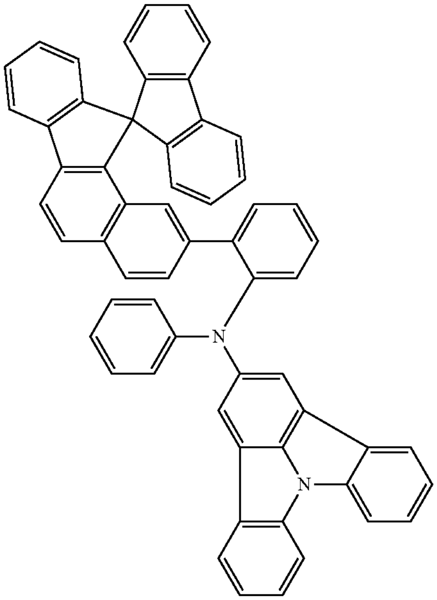
5-109
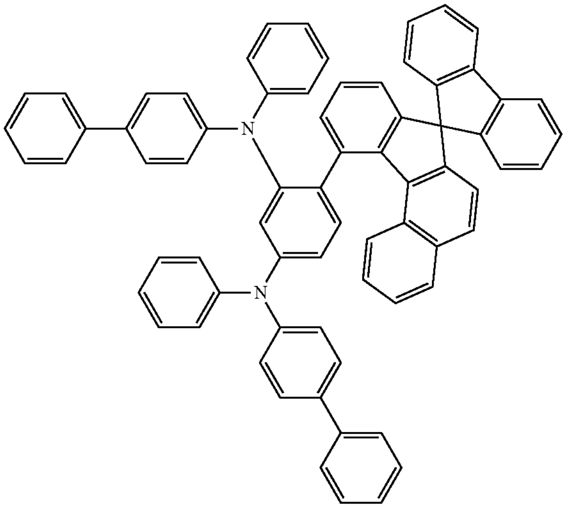

-continued
5-110
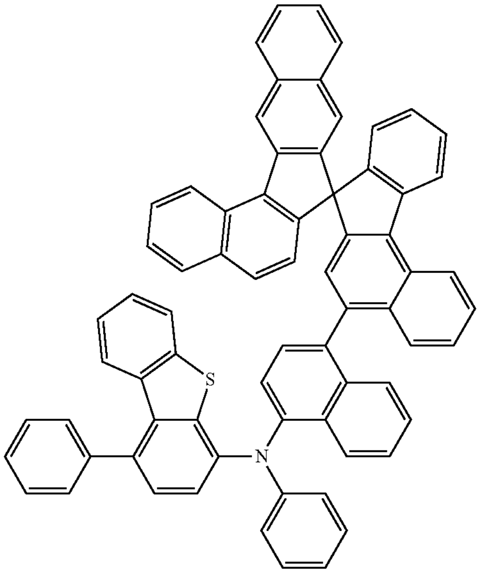
5-111
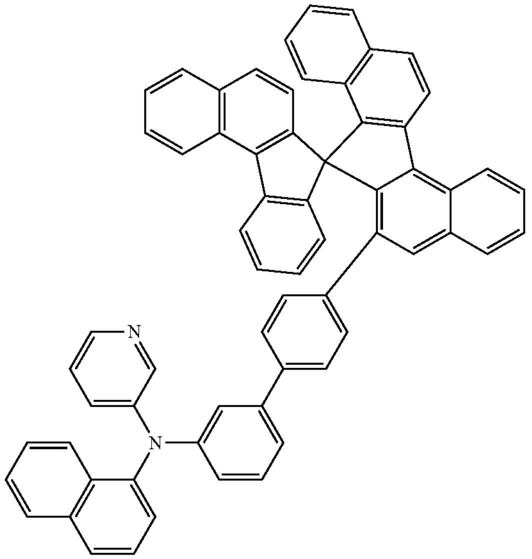
5-112
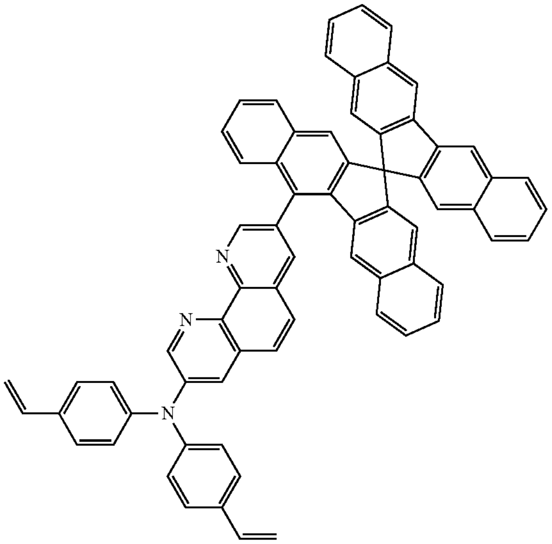
5-113
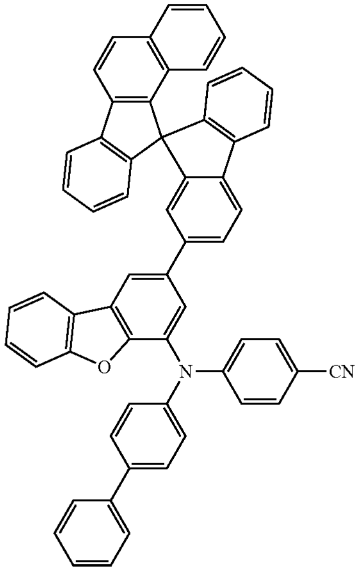

-continued
5-114
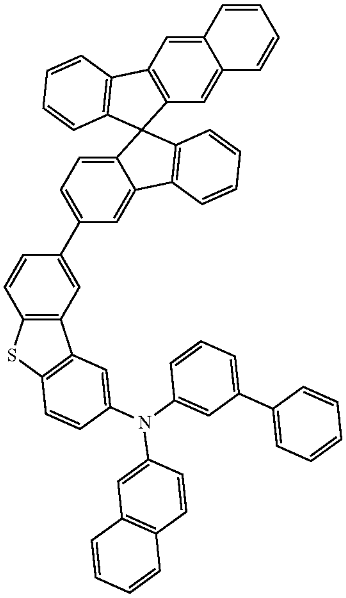
5-115
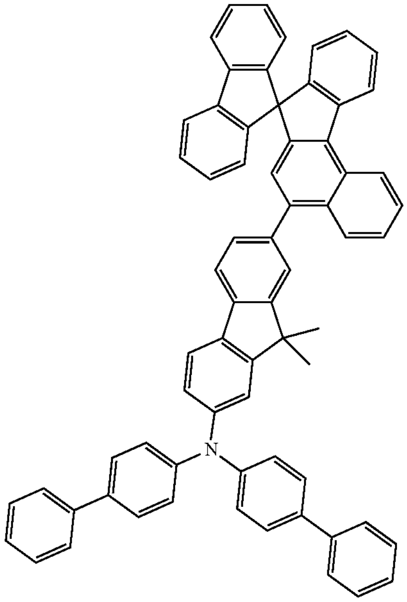
6-1
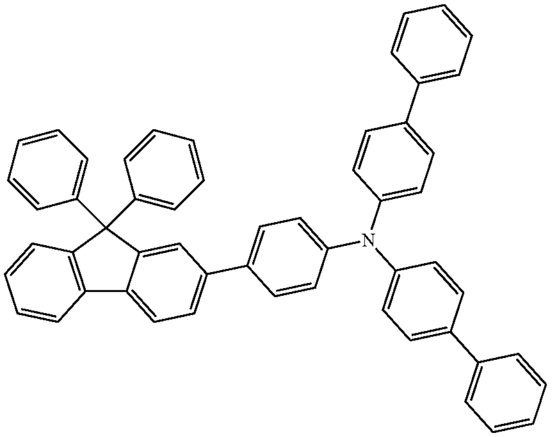
6-2
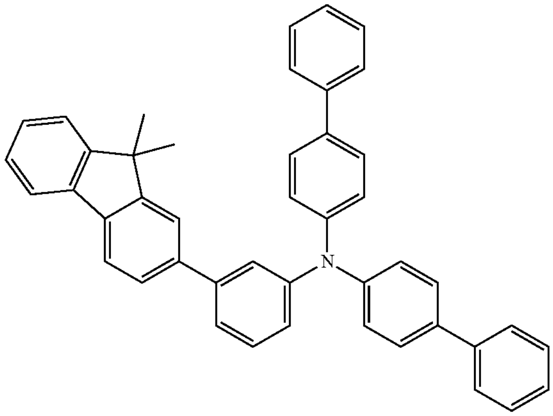
6-3
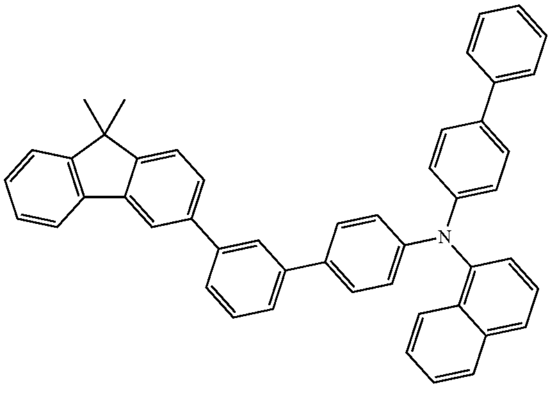
6-4
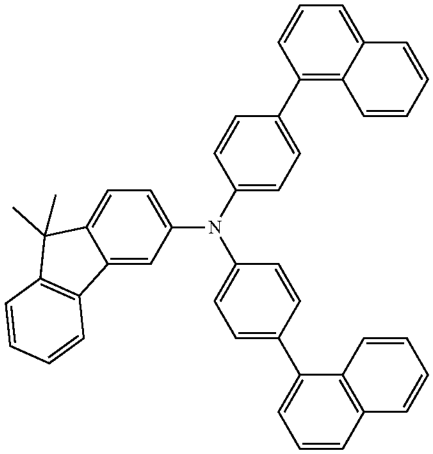

-continued
6-5
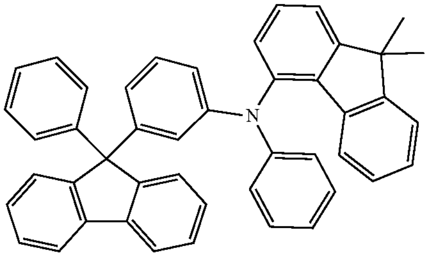
6-6
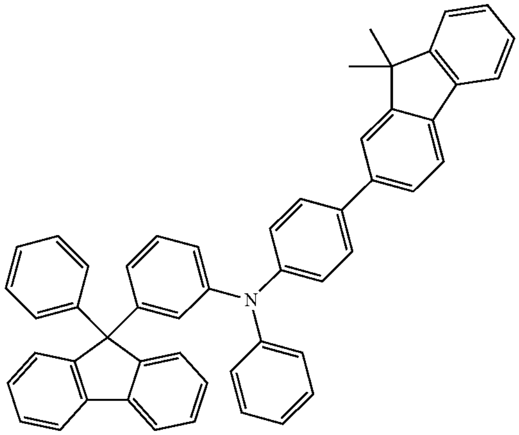
6-7
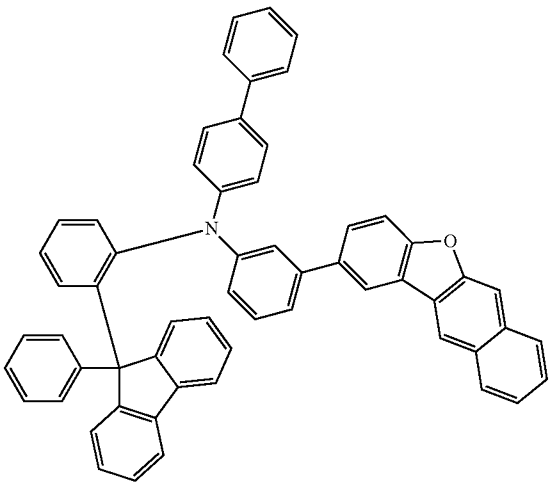
6-8
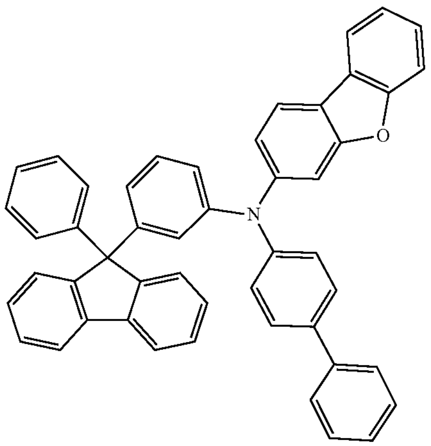
6-9
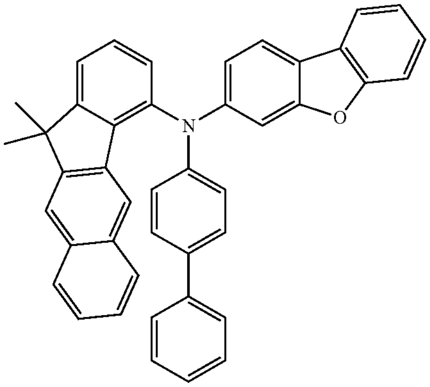
6-10
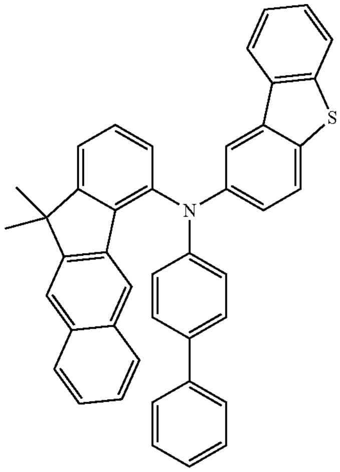

-continued
6-11
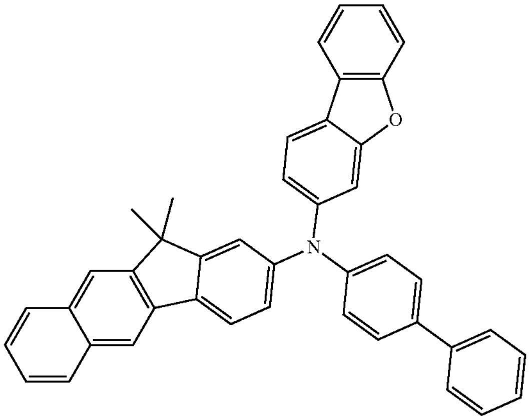
6-12
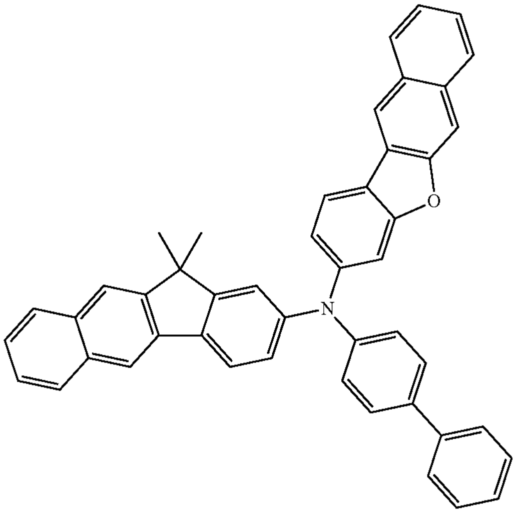
6-13
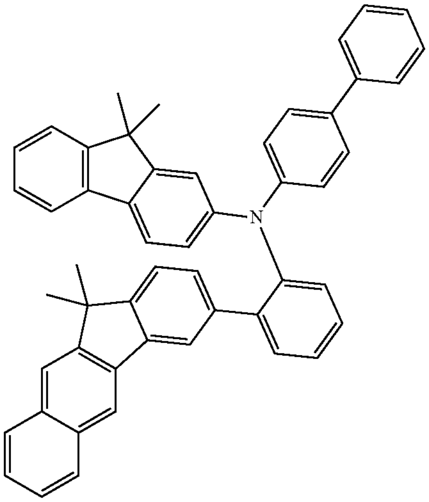
6-14
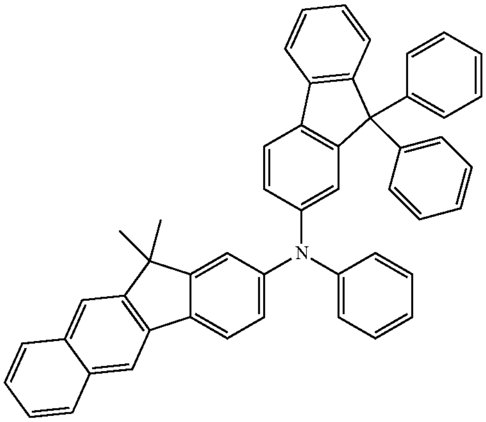
6-15
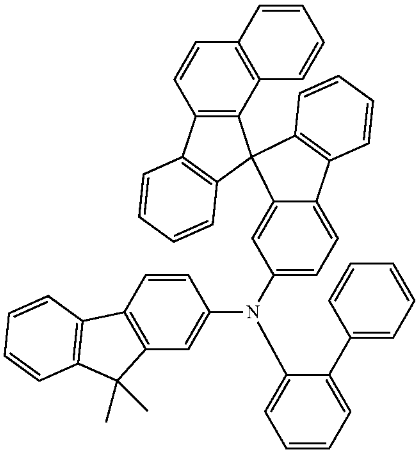
6-16
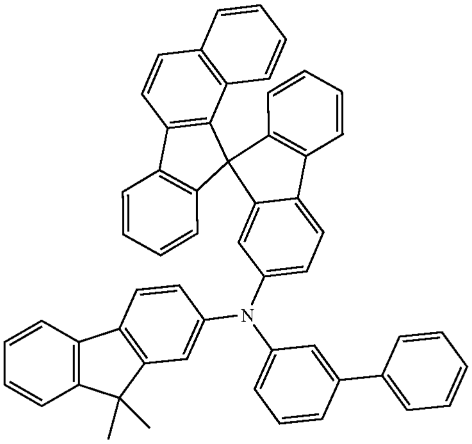

-continued
6-17
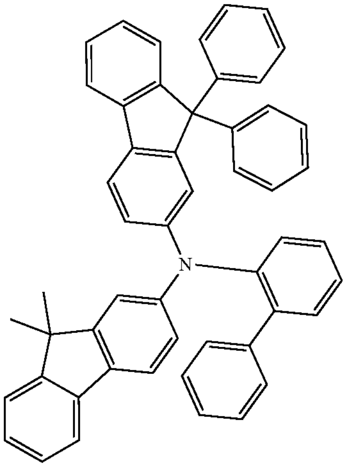
6-18
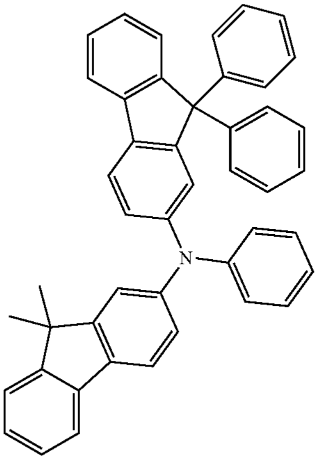
6-19
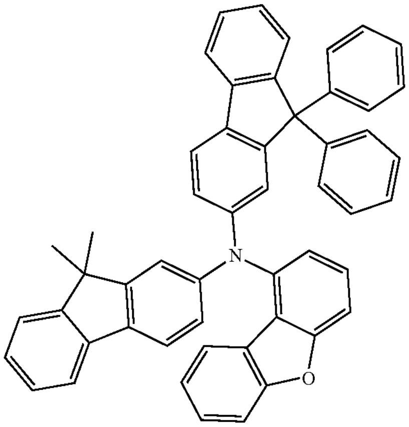
6-20
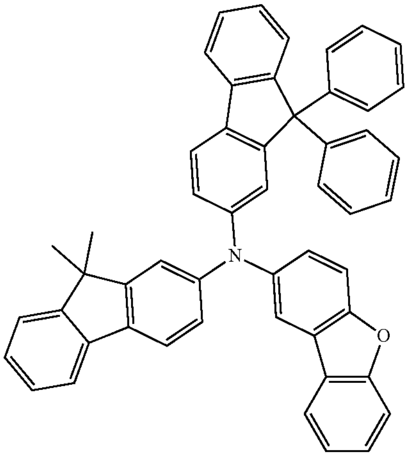
6-21
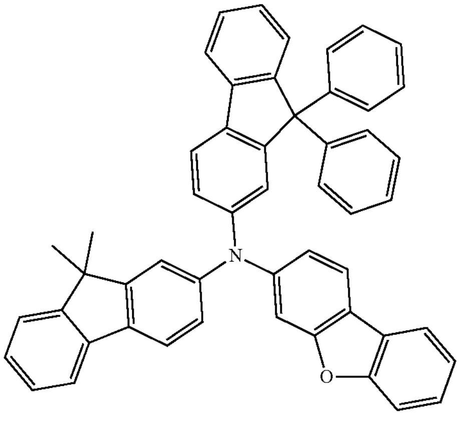
6-22
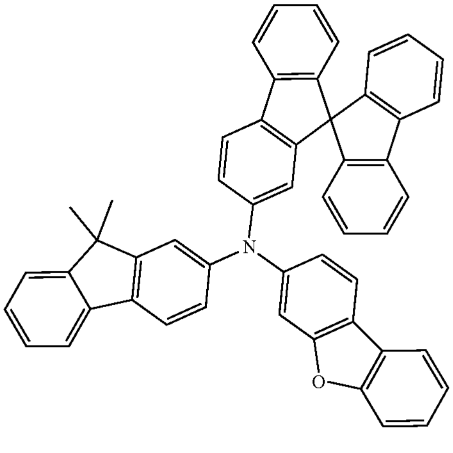

-continued
6-23
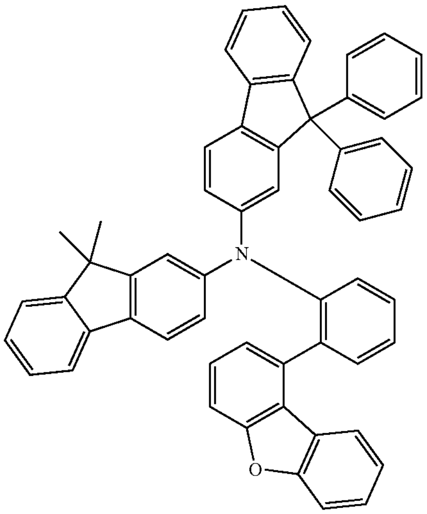
6-24
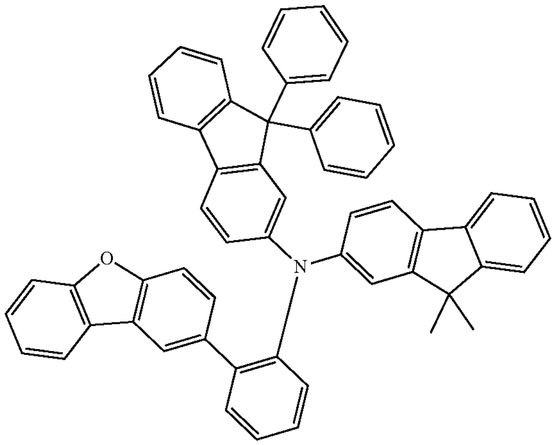
6-25
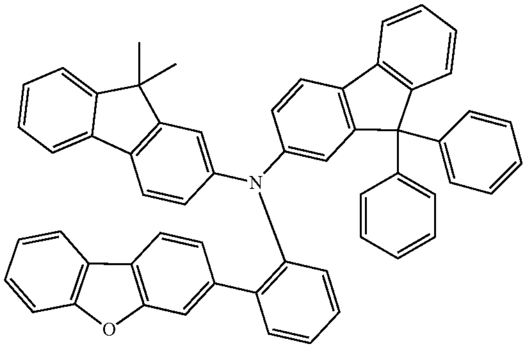
6-26
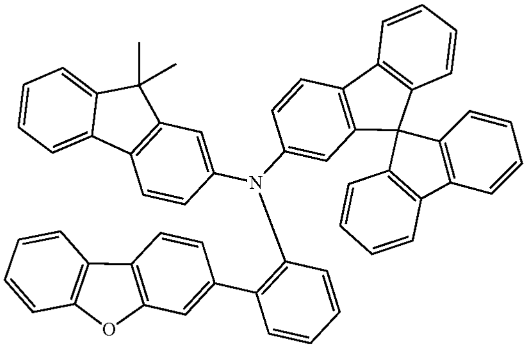
6-27
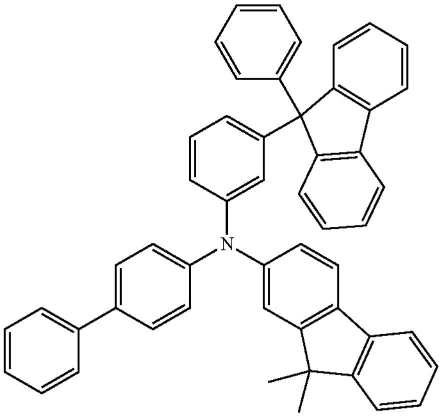
6-28
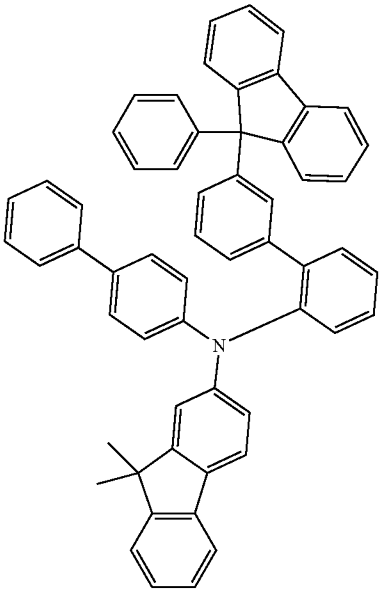

-continued
6-29
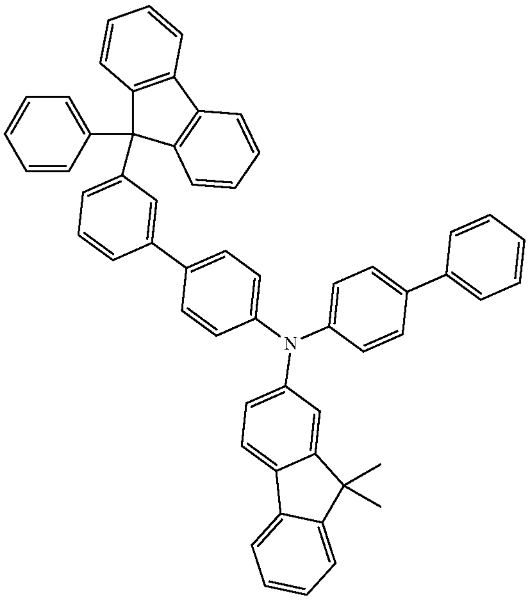
6-30
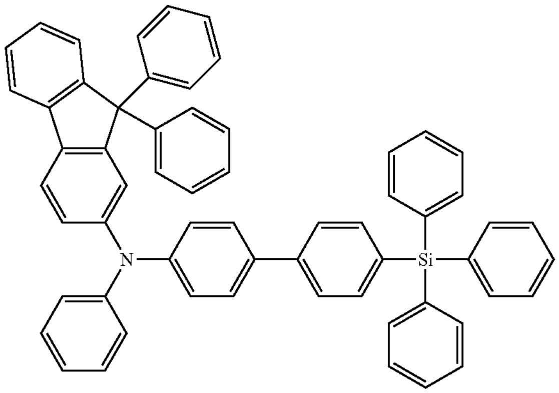
6-31
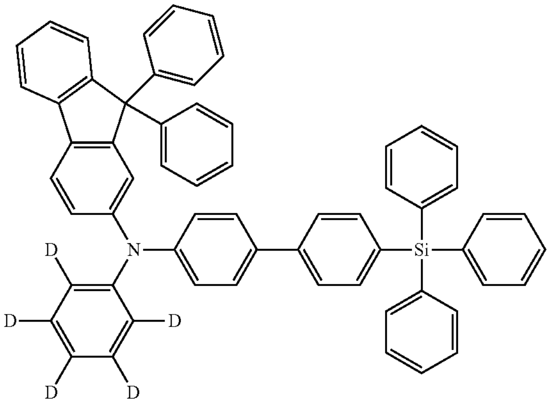
6-32
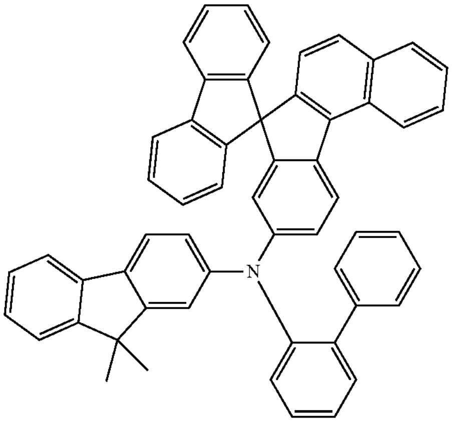
6-33
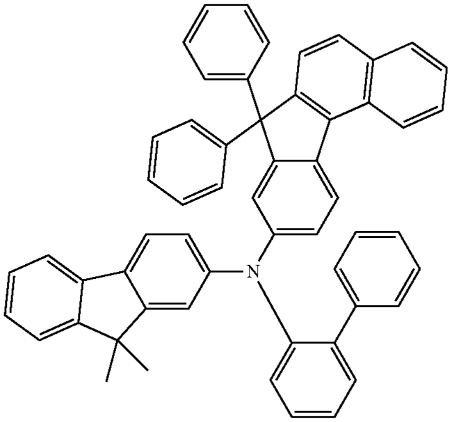
6-34
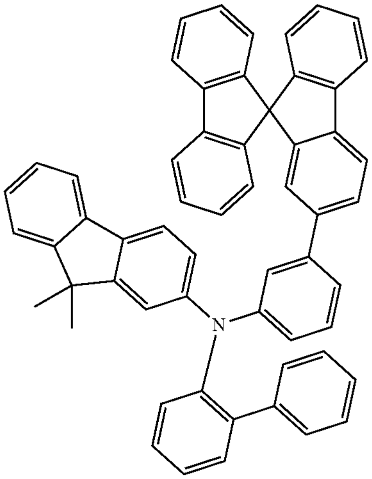

-continued
6-35
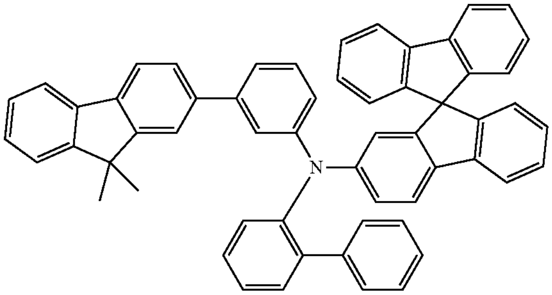
7-1
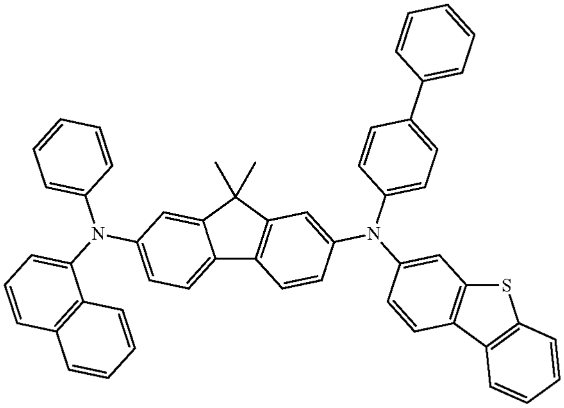
7-2
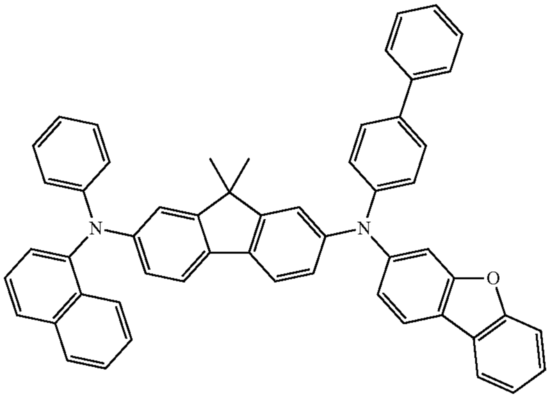
7-3
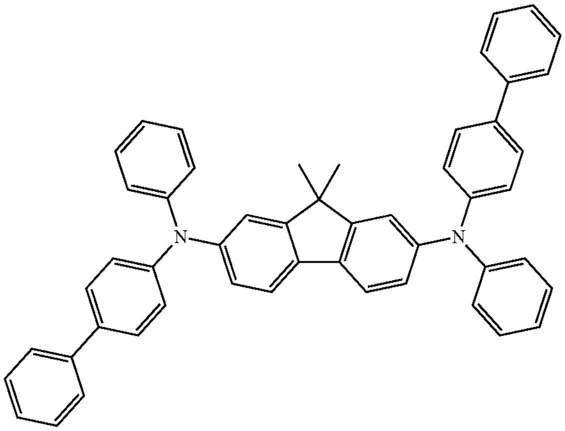
7-4
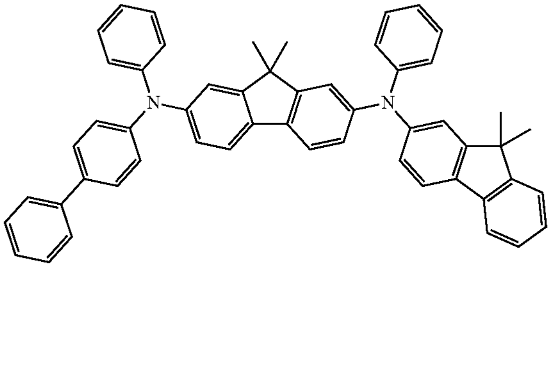
7-5
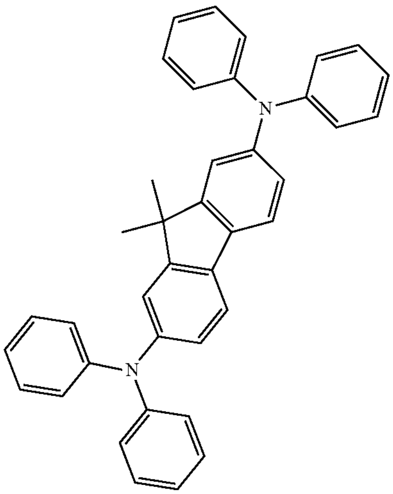

-continued
7-6
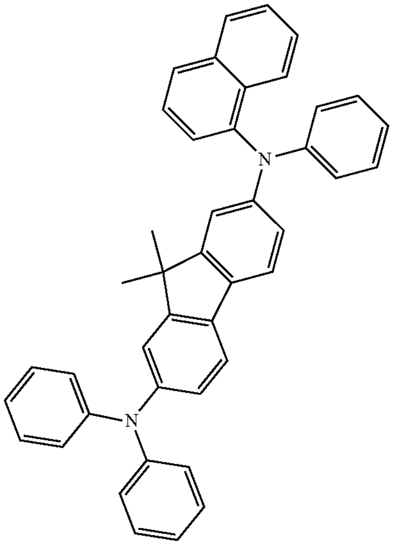
7-7
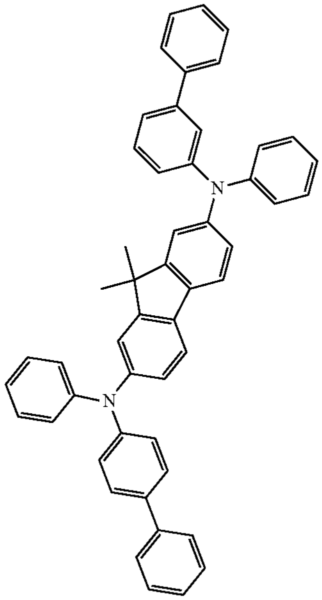
7-8
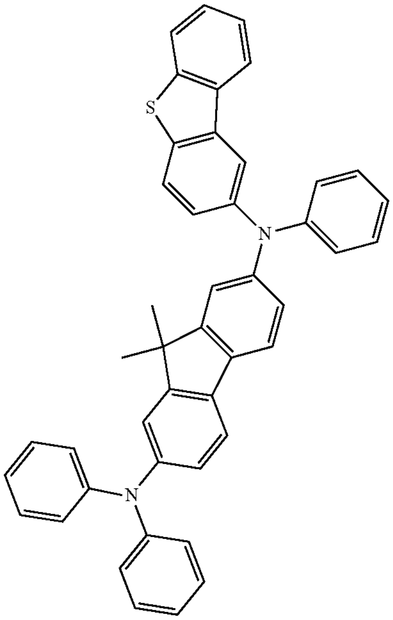
7-9
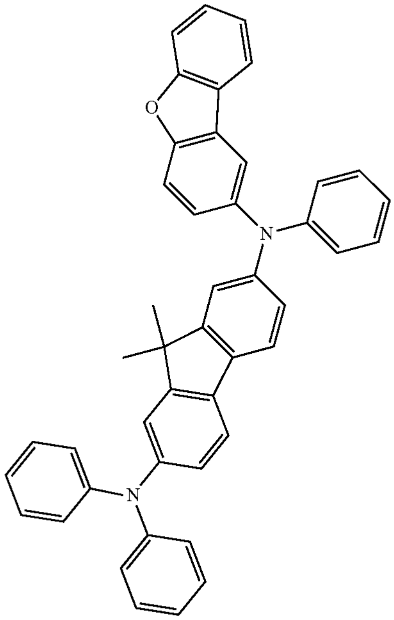

-continued
7-10
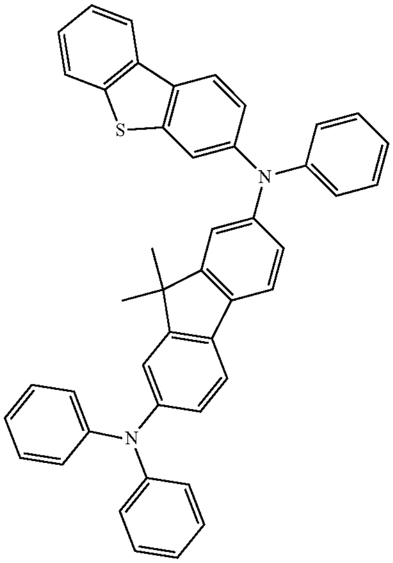
7-11
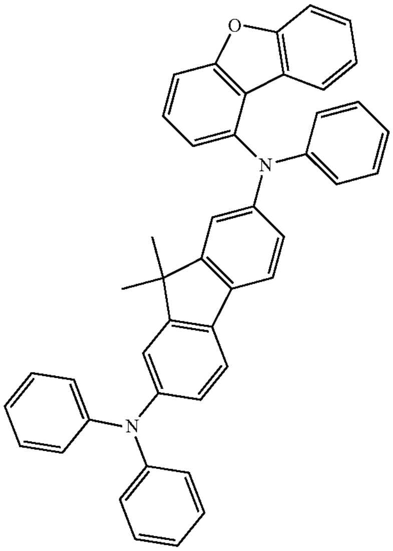
7-12
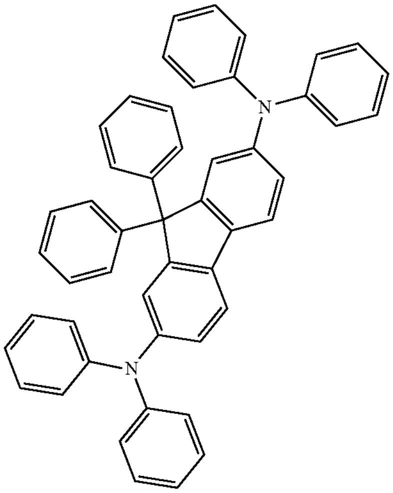
7-13
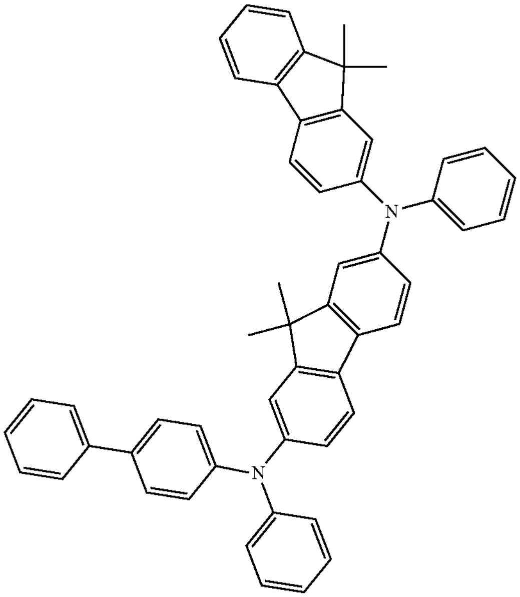

-continued
7-14
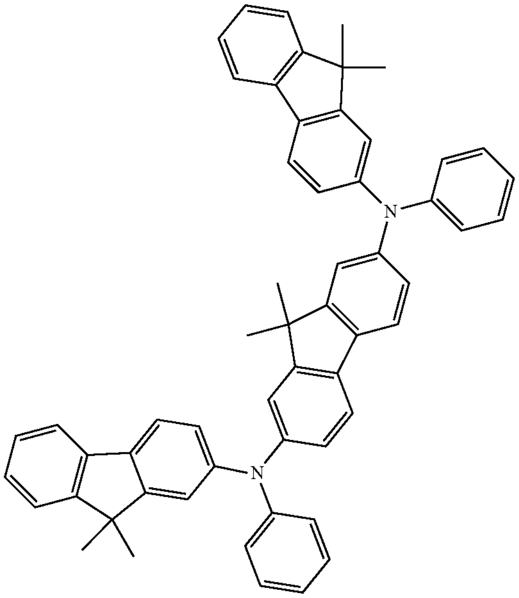
7-15
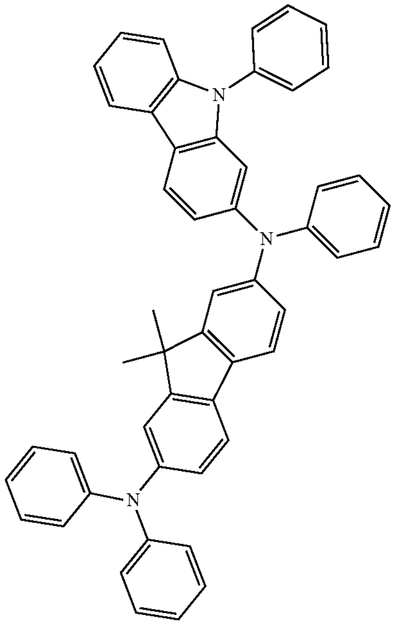
7-16
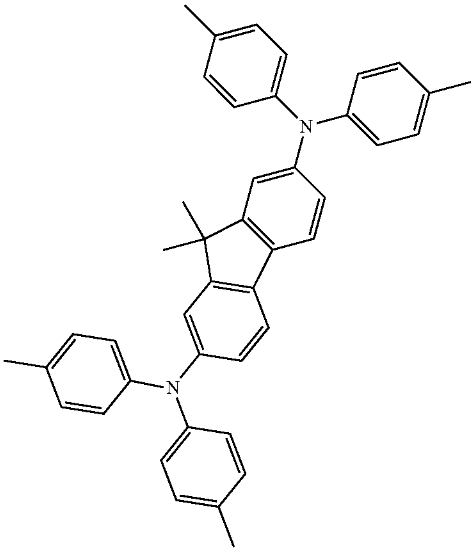
7-17
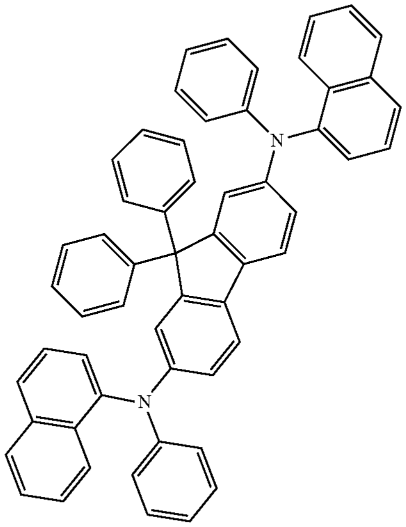

-continued
7-18
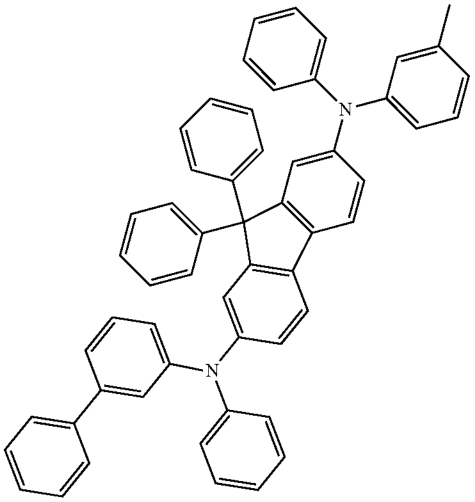
7-19
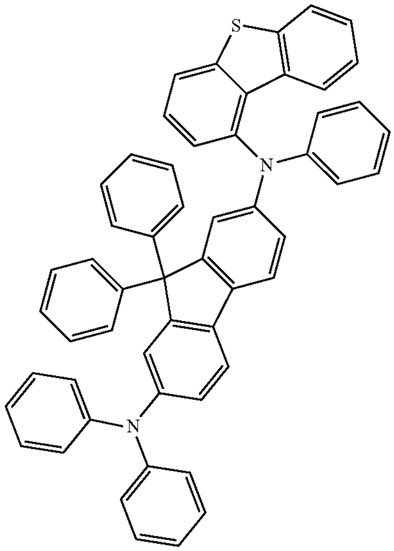
7-20
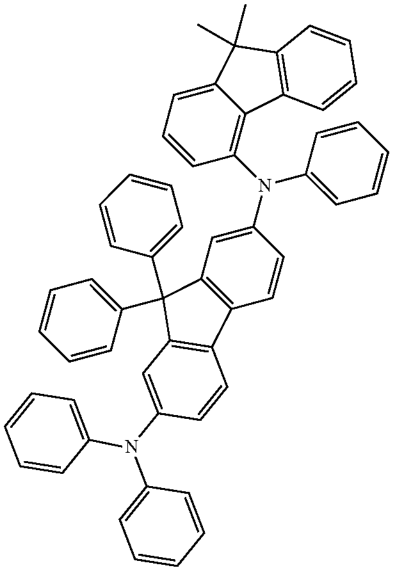
7-21
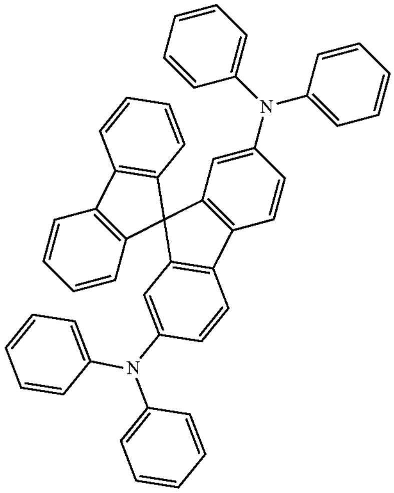

-continued
7-22
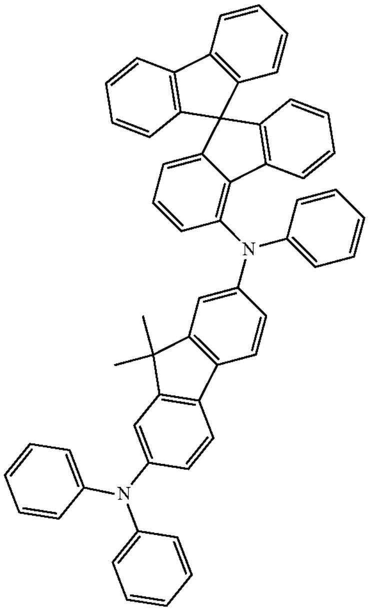
7-23
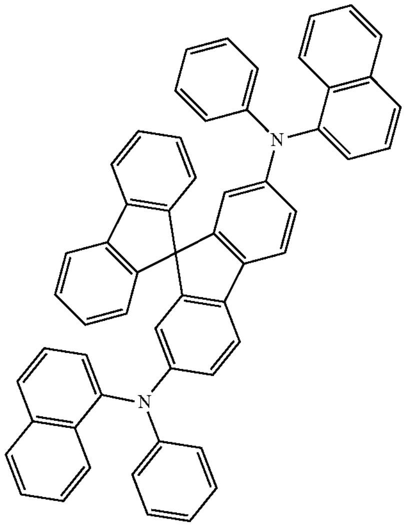
7-24
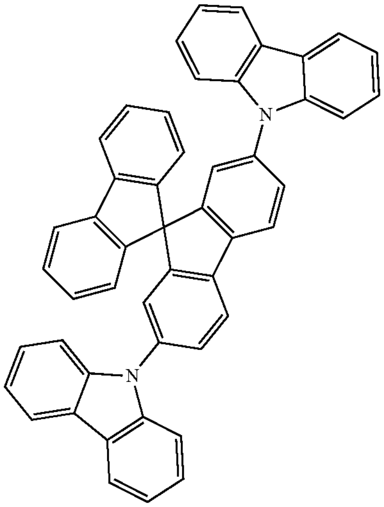
7-25
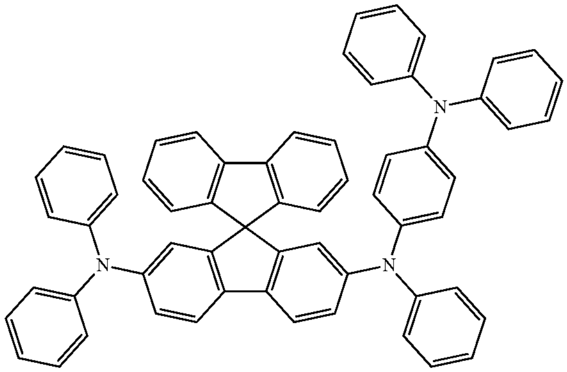
7-26
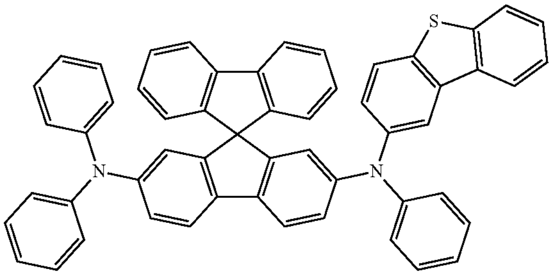
7-27
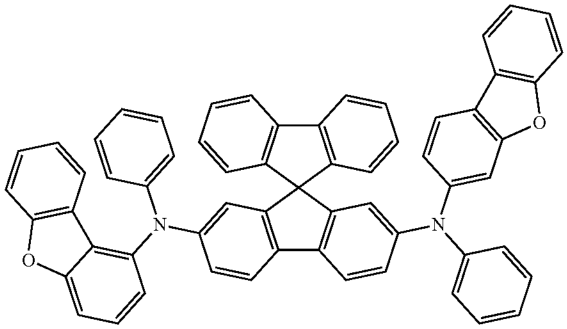

-continued
7-28
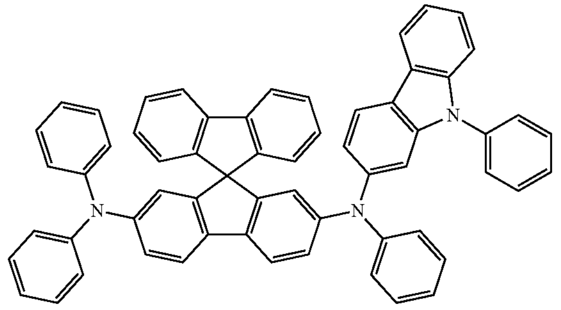
7-29
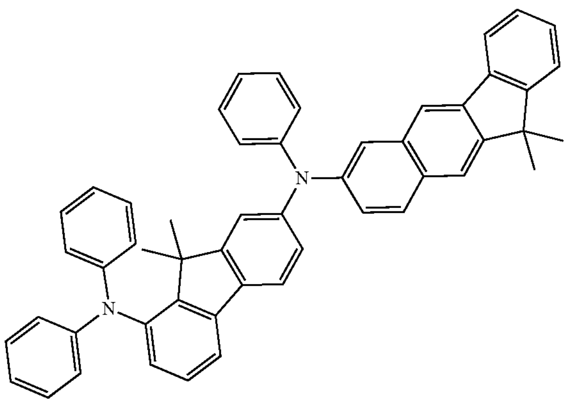
7-30
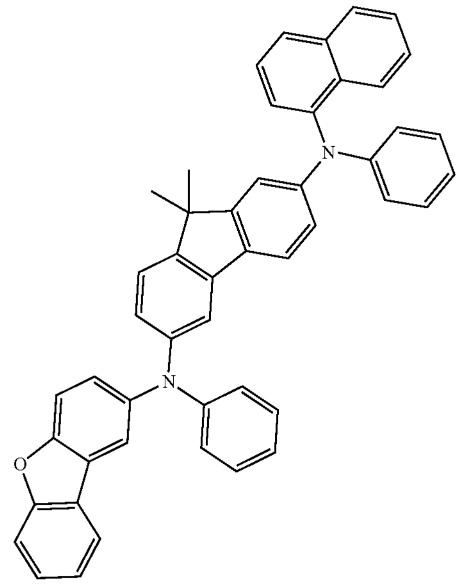
7-31
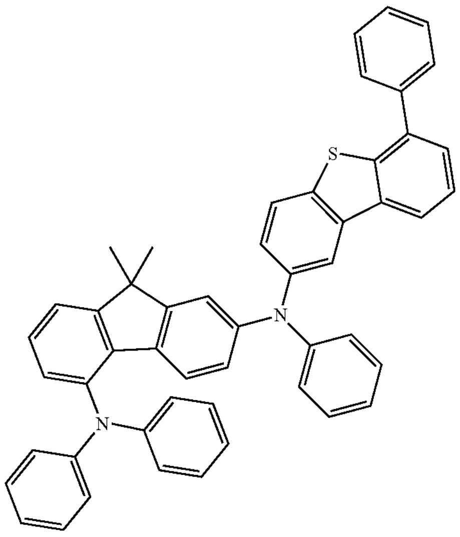
7-32
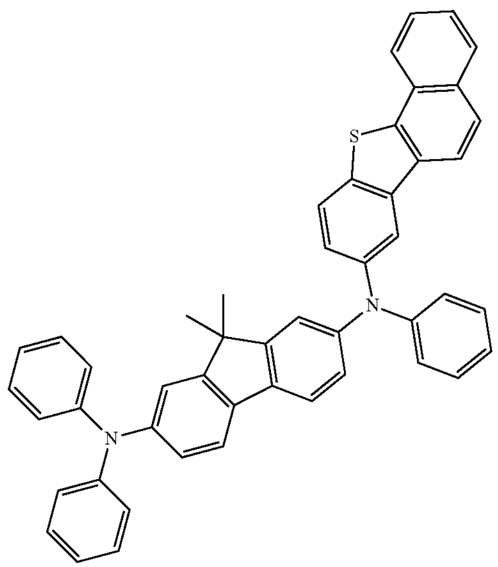
7-33
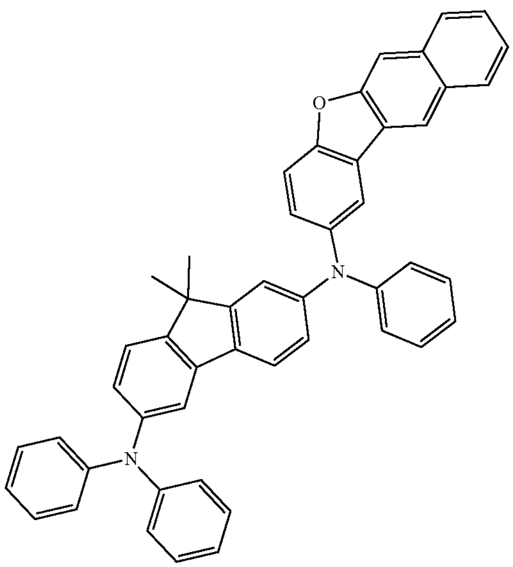

-continued
7-34
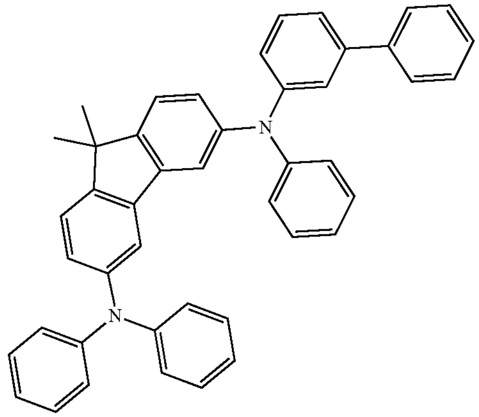
7-35
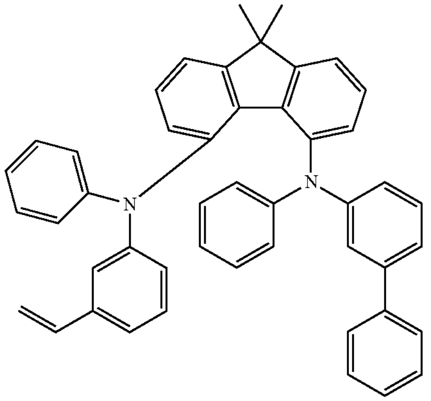
7-36
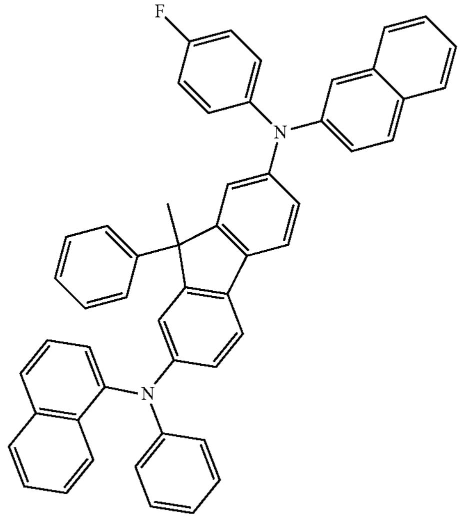
7-37
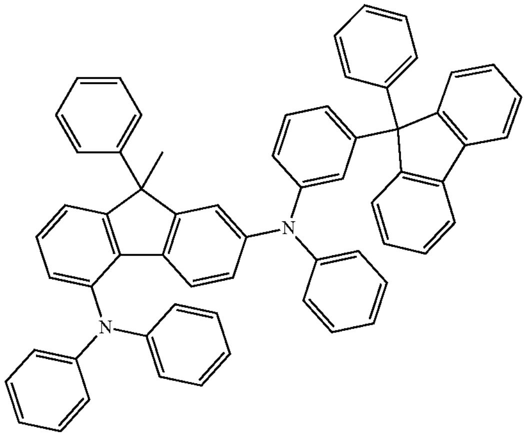
7-38
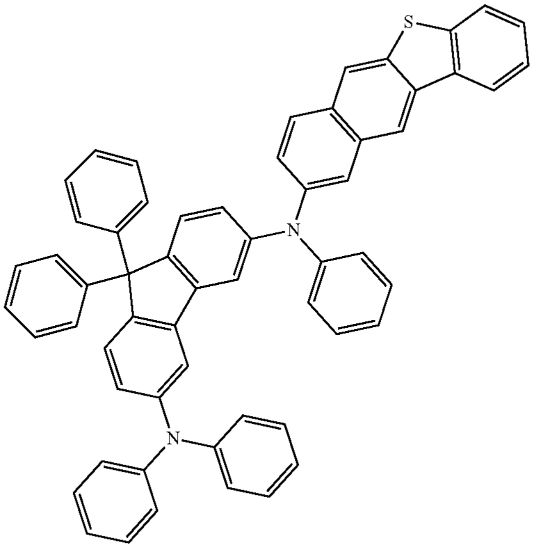
7-39
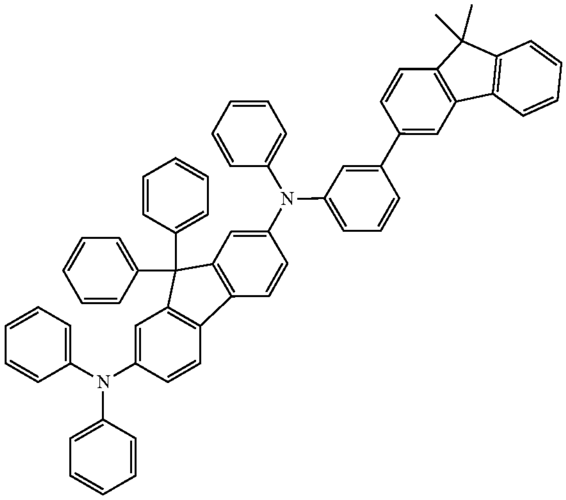

-continued
7-40
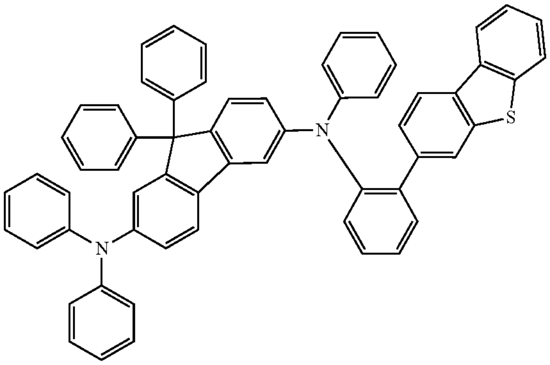
7-41
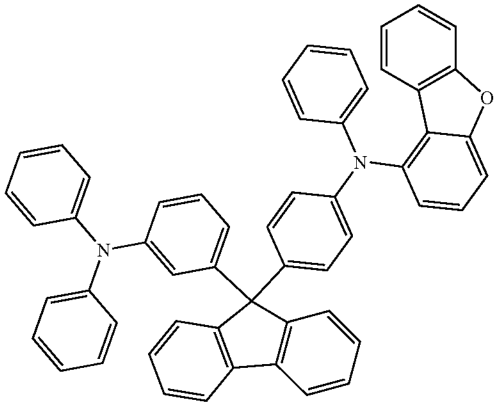
7-42
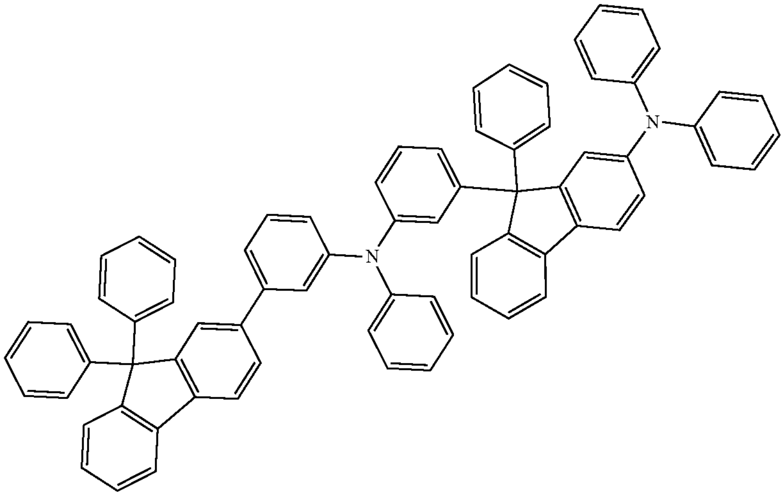

-continued
7-43
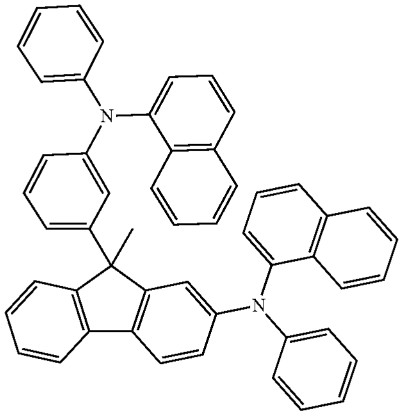
7-44
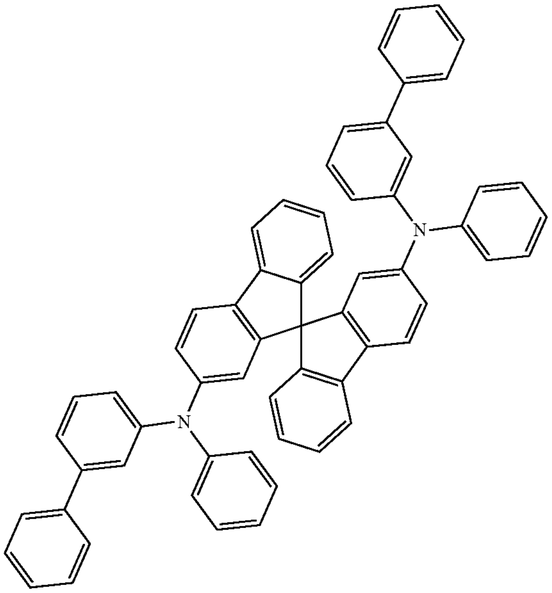
7-45
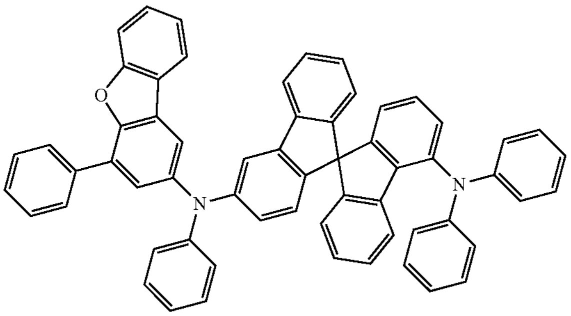
7-46
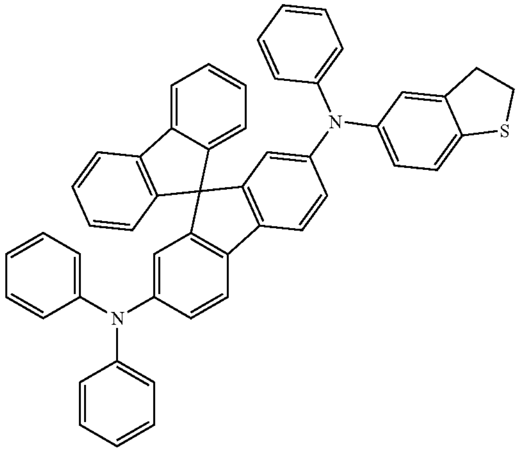
7-47
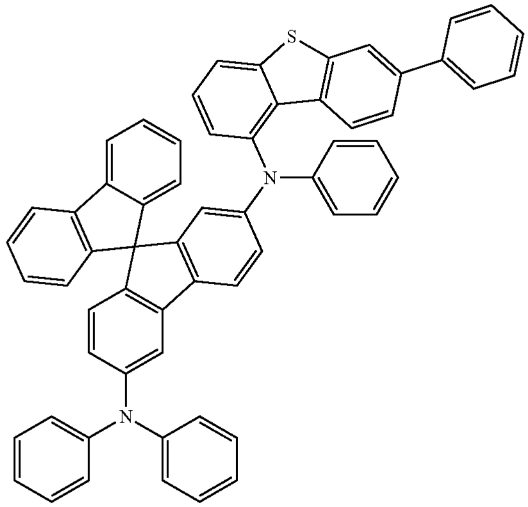
7-48
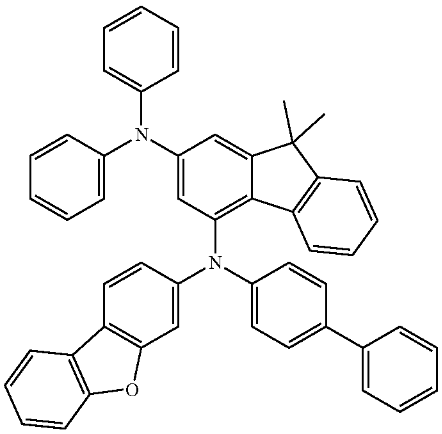

-continued
7-49
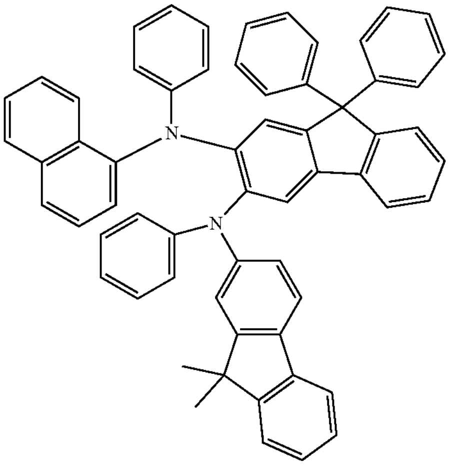
7-50
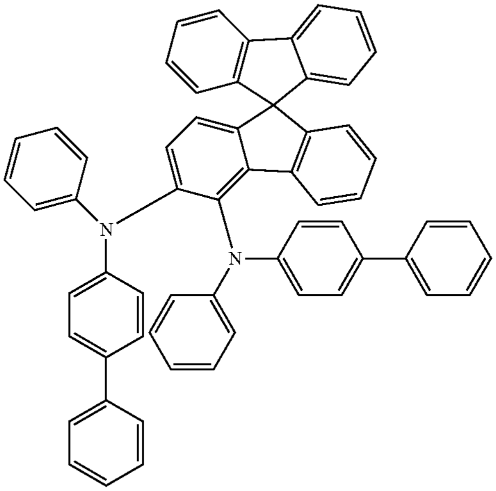
7-51
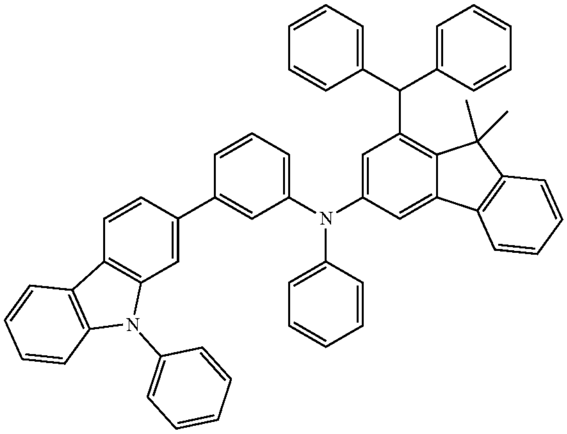
8-1
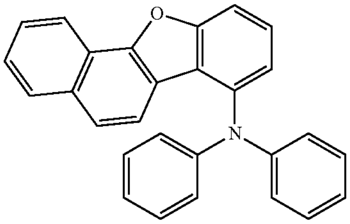
-continued
8-2
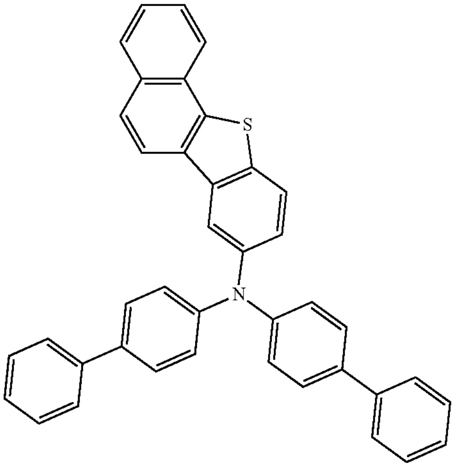
8-3
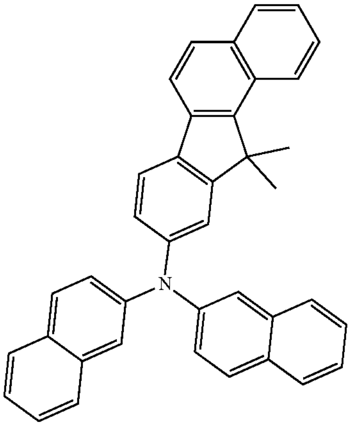
8-4
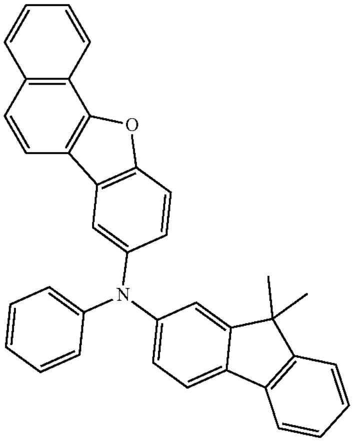

-continued
8-5
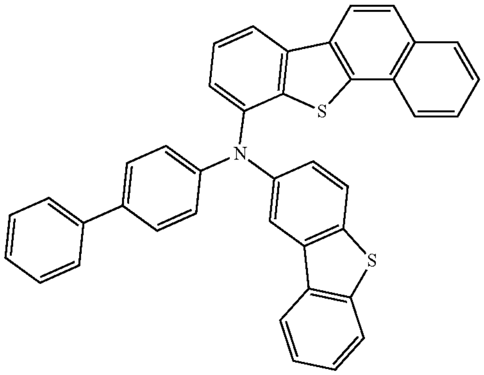
8-6
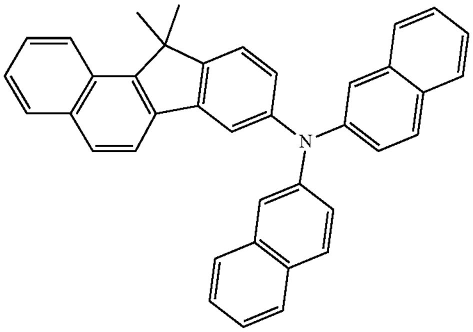
8-7
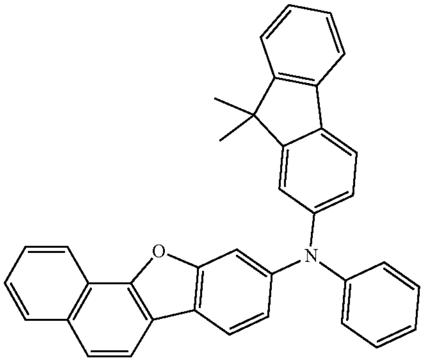
8-8
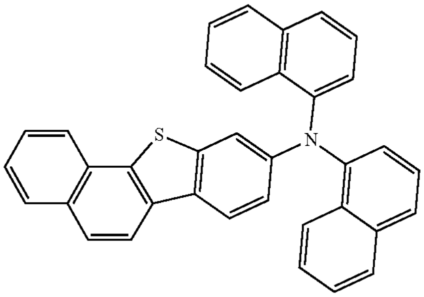
-continued
8-9
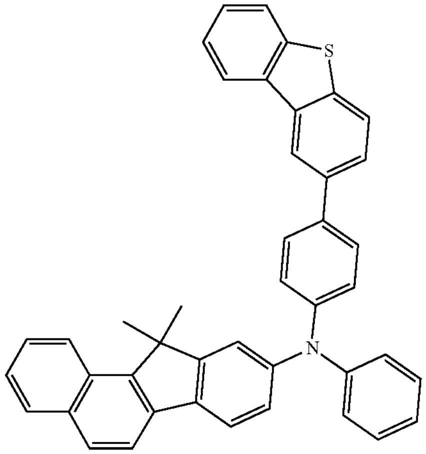
8-10
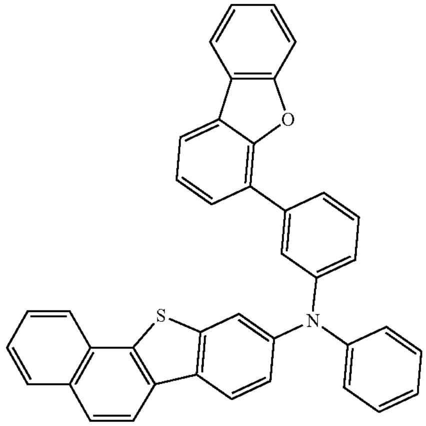
8-11
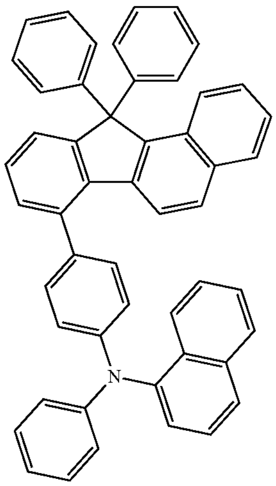

-continued
8-12
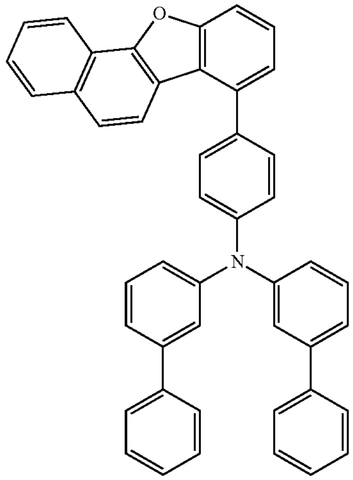
8-13
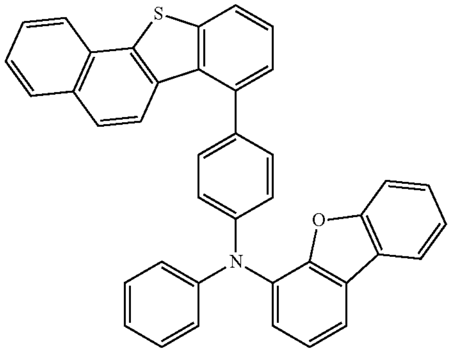
8-14
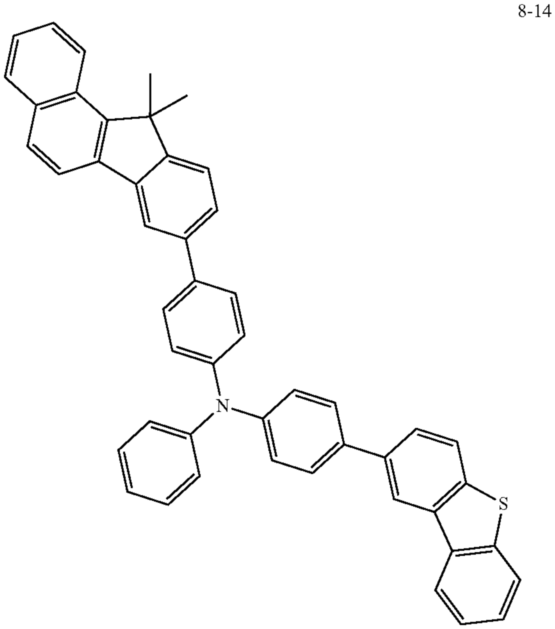
-continued
8-15
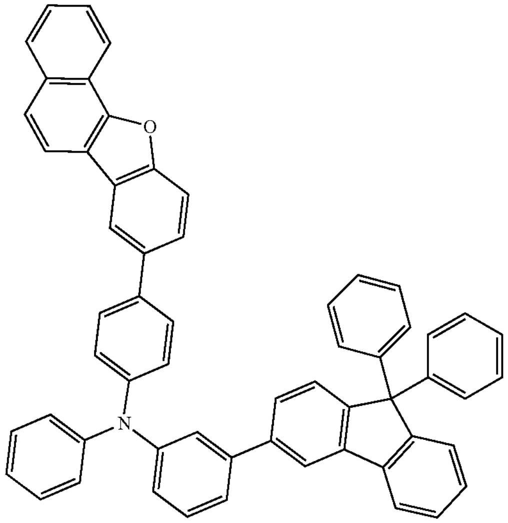
8-16
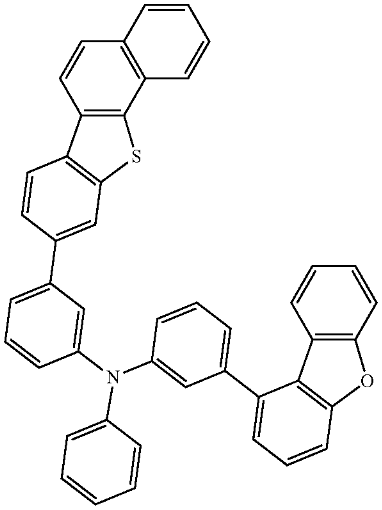
8-17
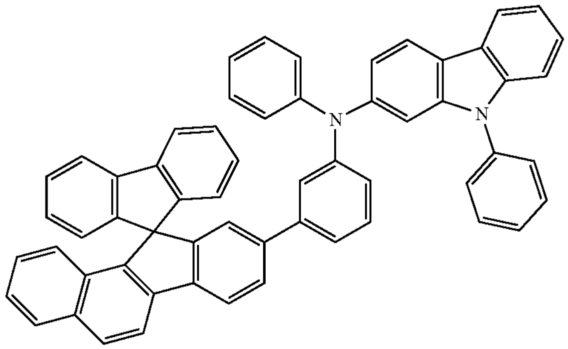

-continued
8-18
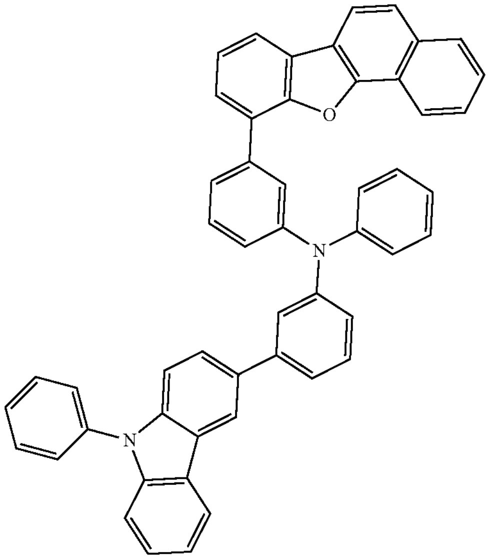
8-19
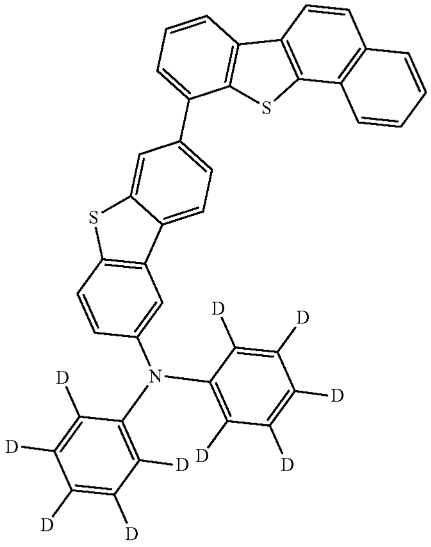
-continued
8-20
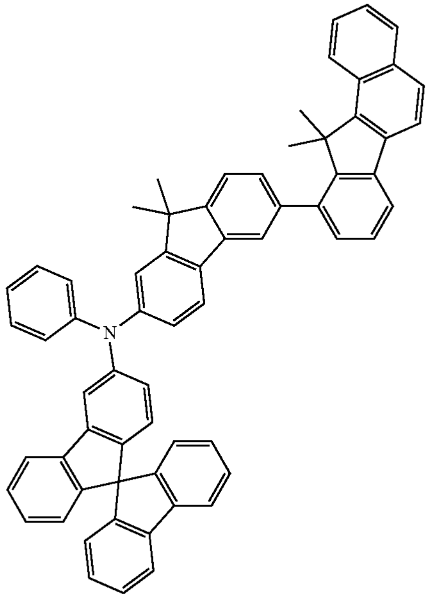
8-21
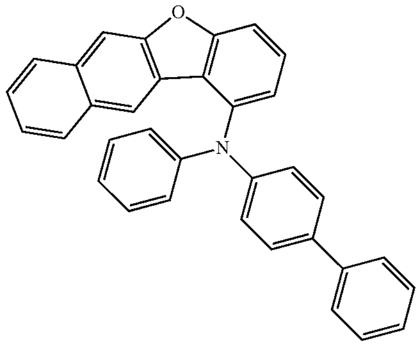
8-22
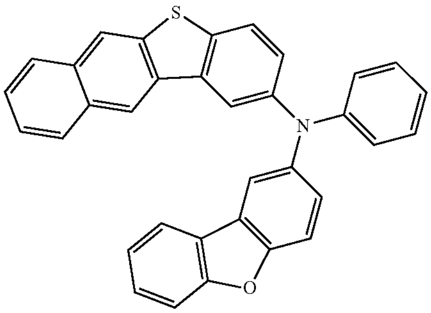
8-23
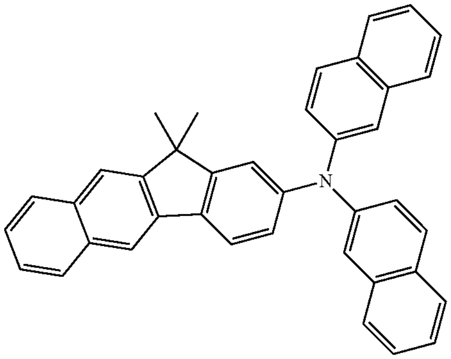

-continued
8-24
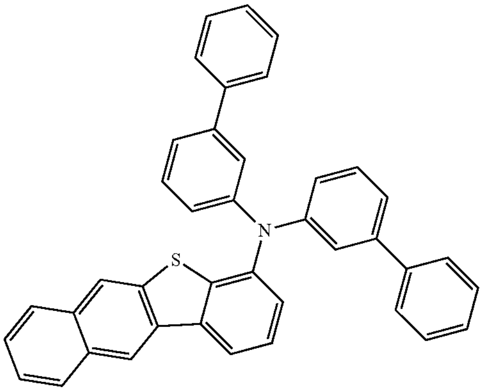
8-25
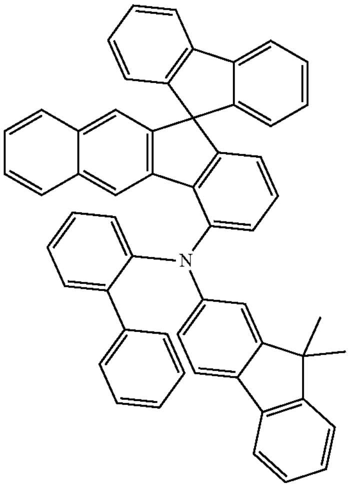
8-26
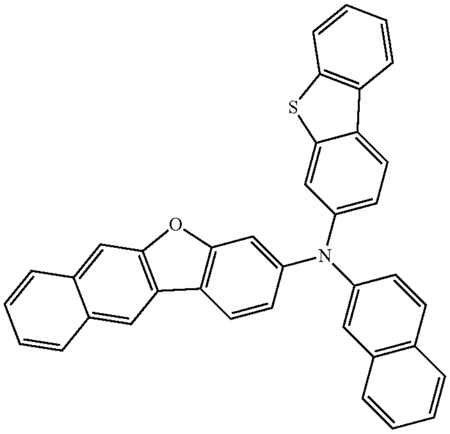
-continued
8-27
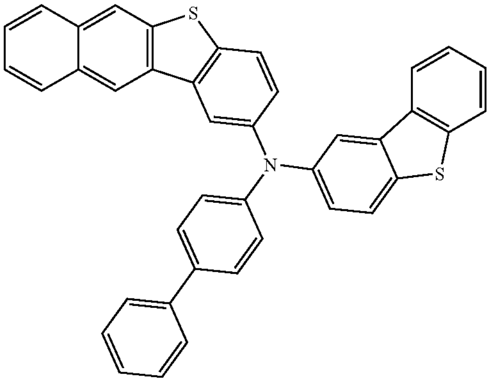
8-28
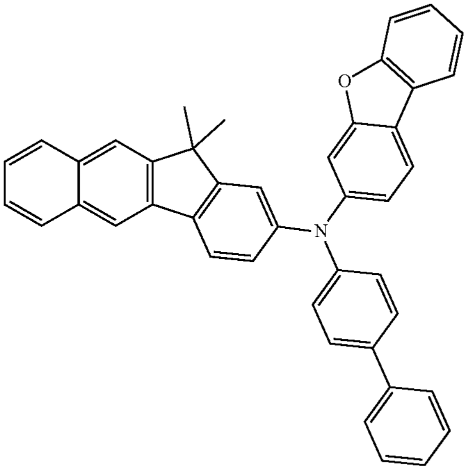
8-29
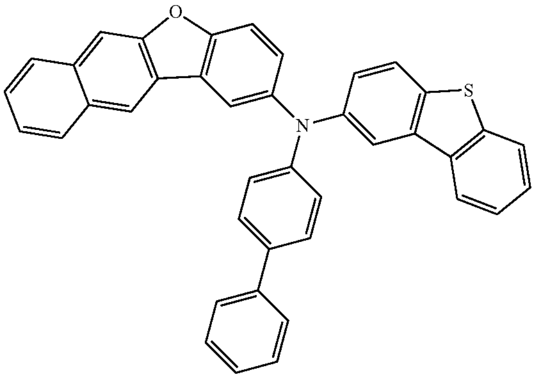

-continued
8-30
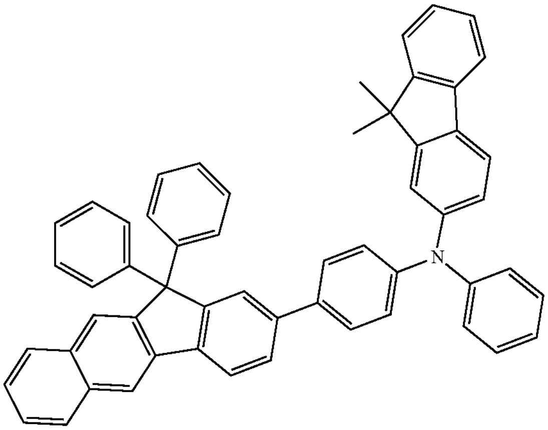
8-31
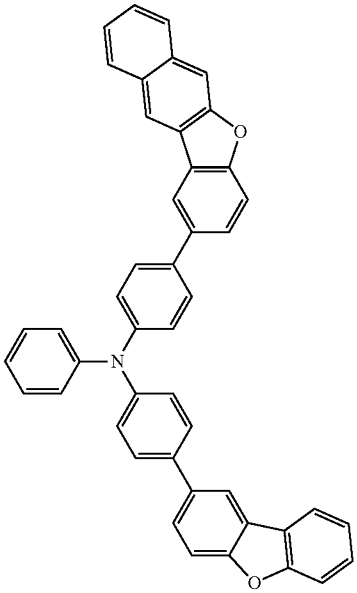
8-32
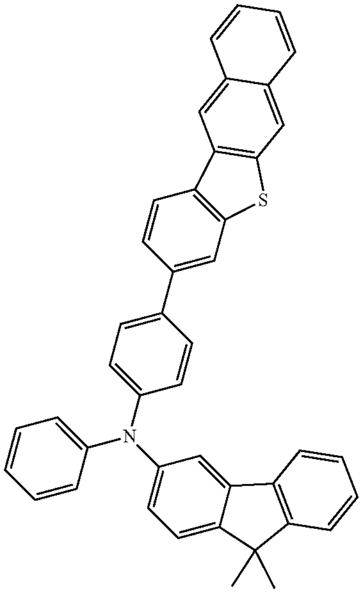
-continued
8-33
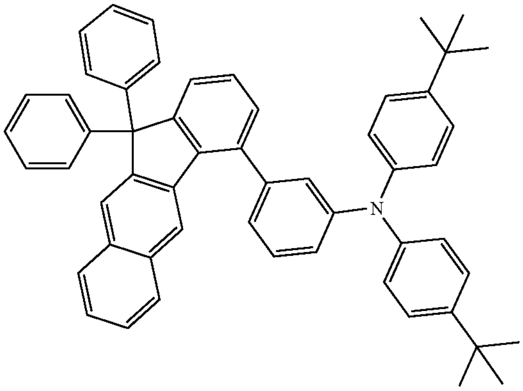
8-34
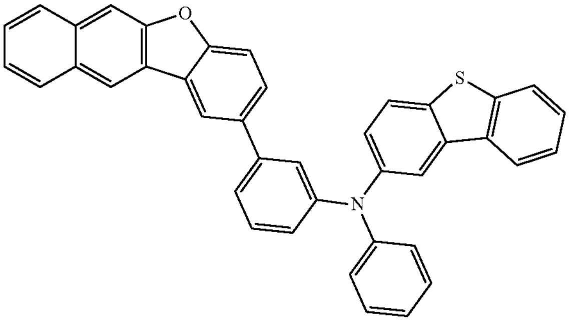
8-35
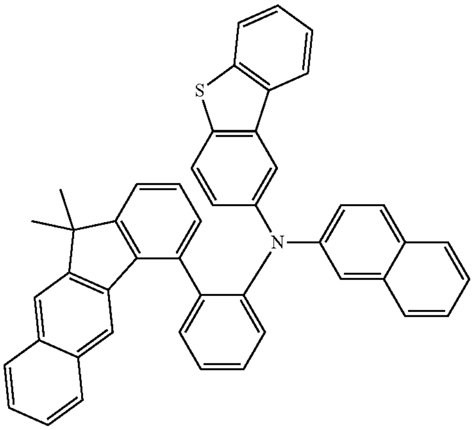
8-36
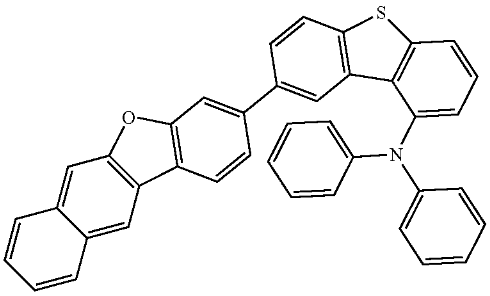

-continued
8-37
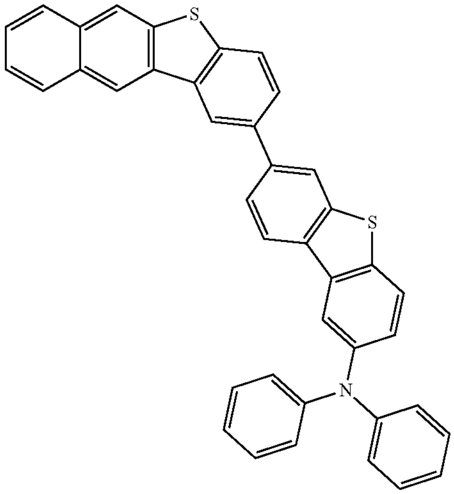
8-38
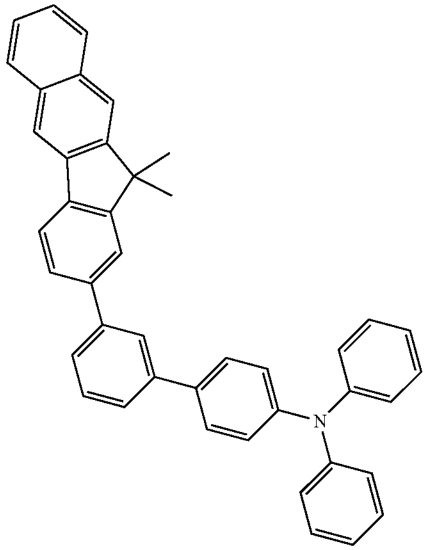
8-39
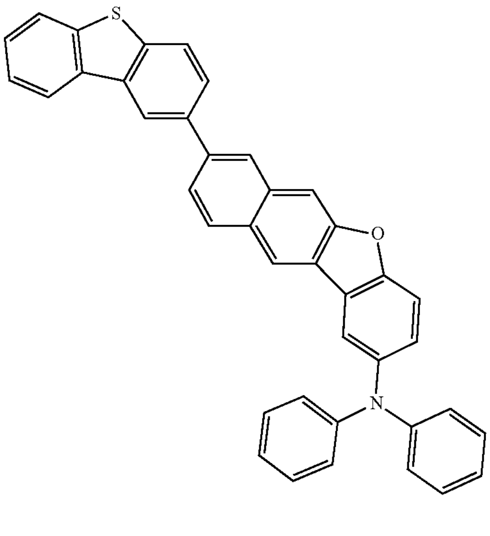
-continued
8-40
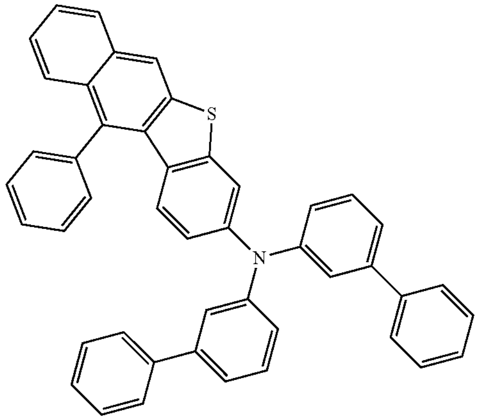
8-41
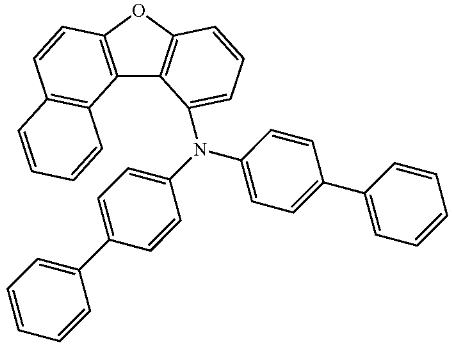
8-42
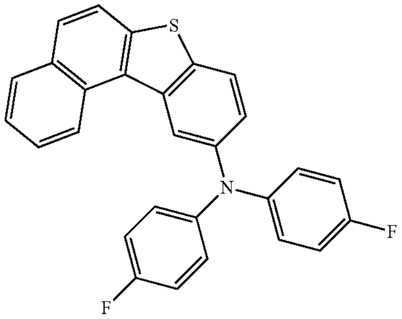
8-43
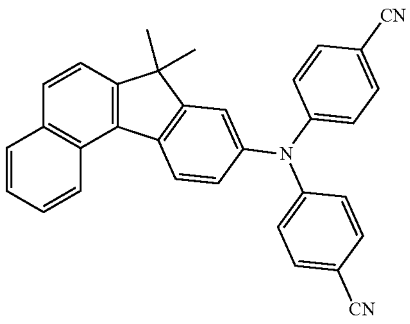

-continued
8-44
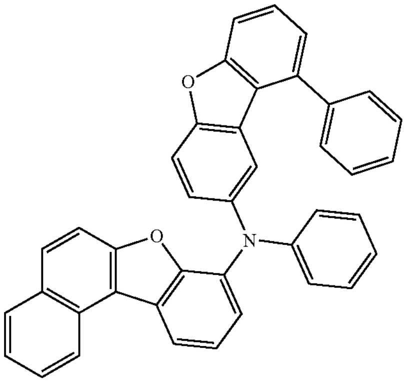
8-45
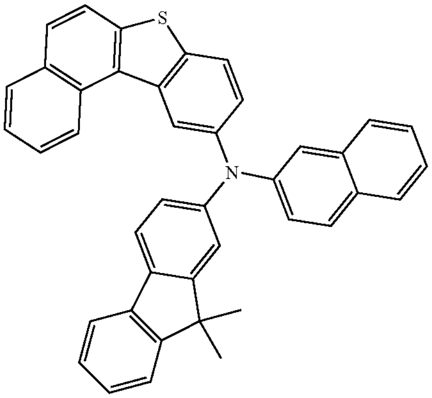
8-46
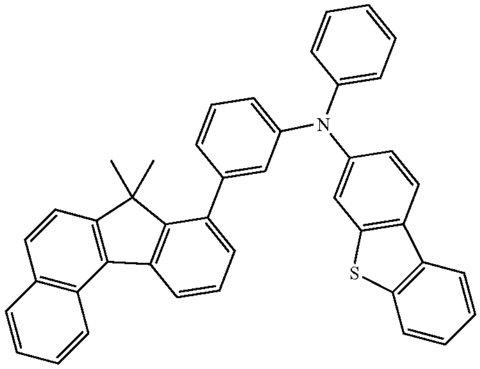
8-47
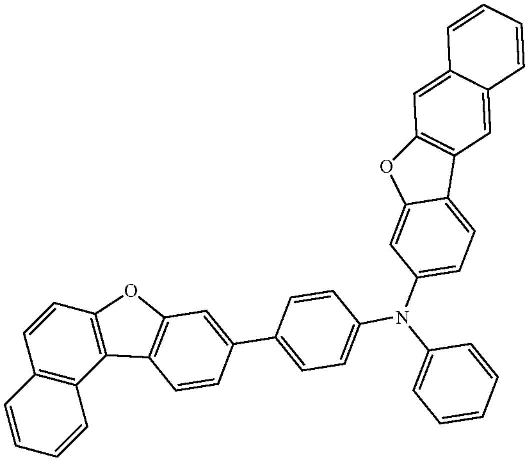
-continued
8-48
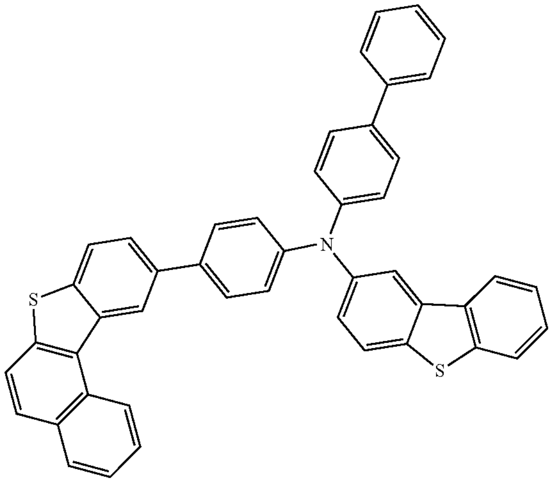
8-49
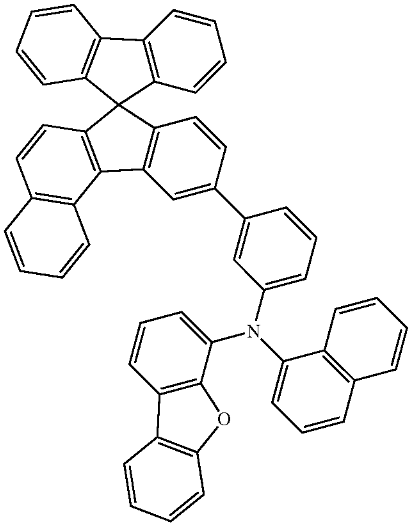
8-50
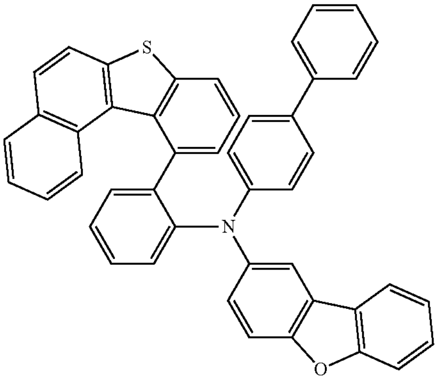

-continued
8-51
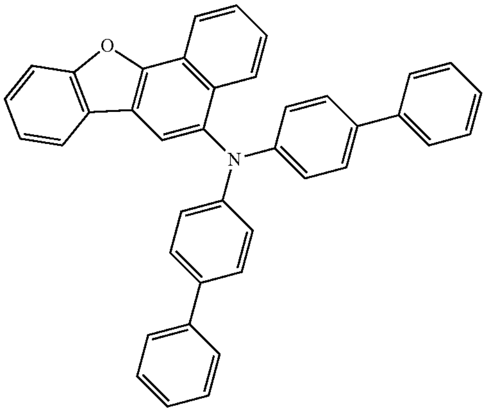
8-52
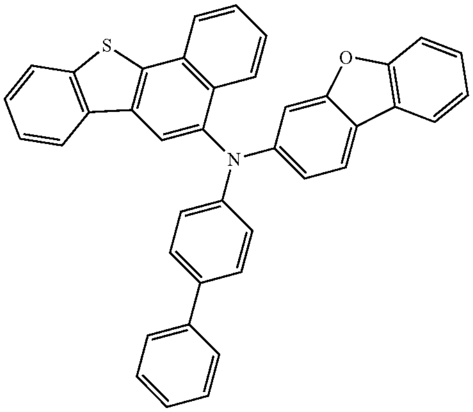
8-53
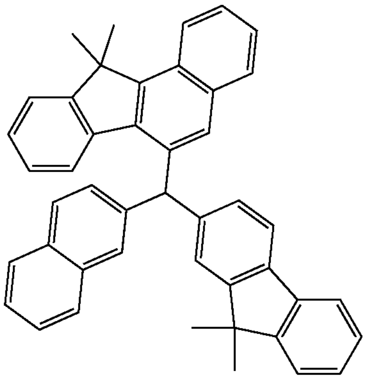
8-54
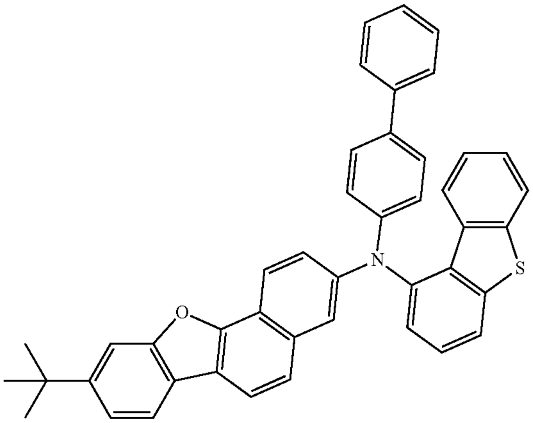
-continued
8-55
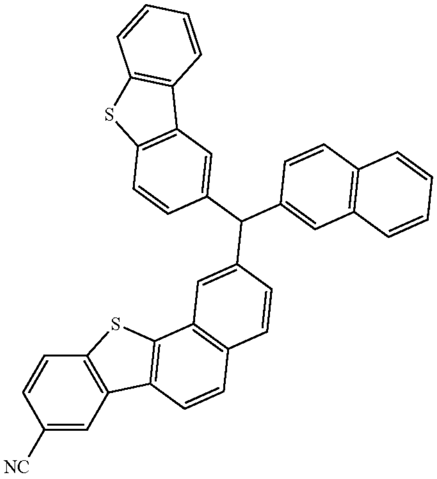
8-56
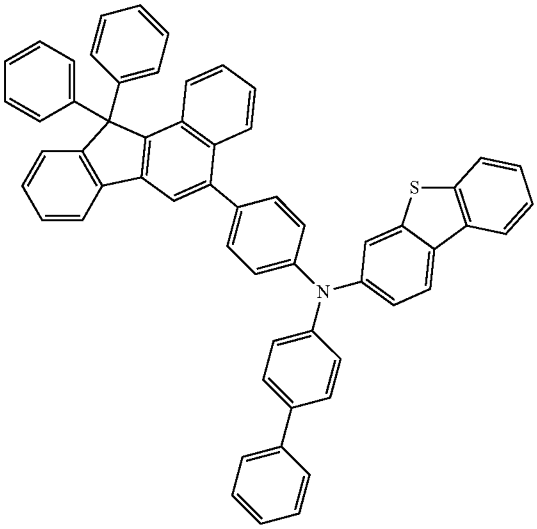
8-57
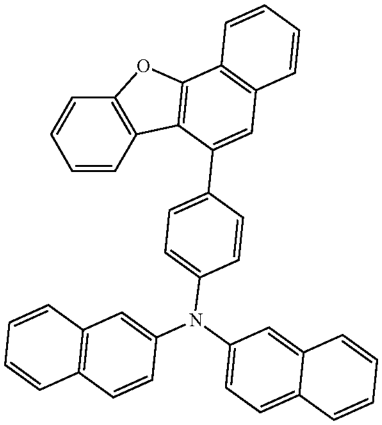

-continued
8-58
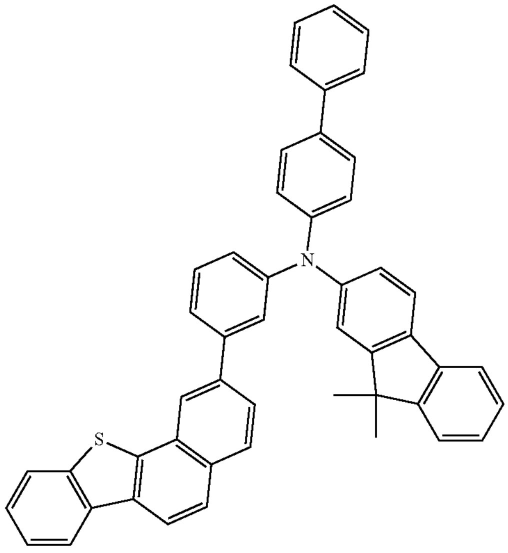
8-59
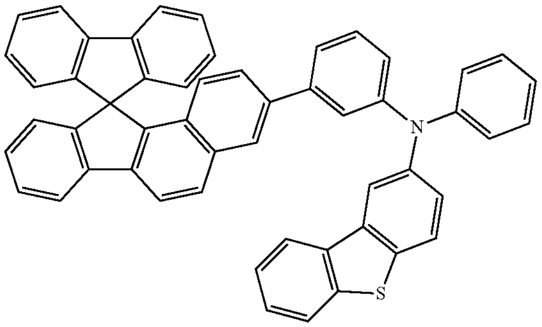
8-60
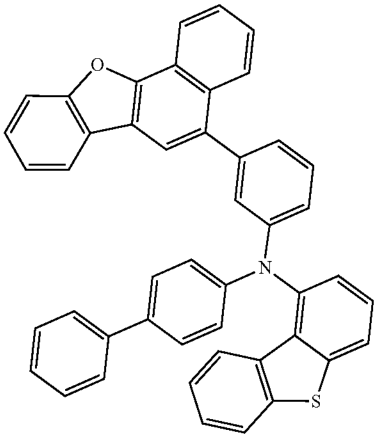
-continued
8-61
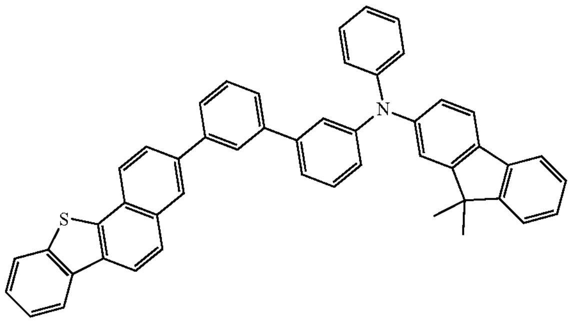
8-62
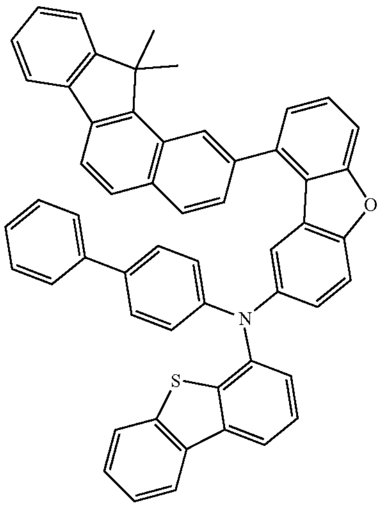
8-63
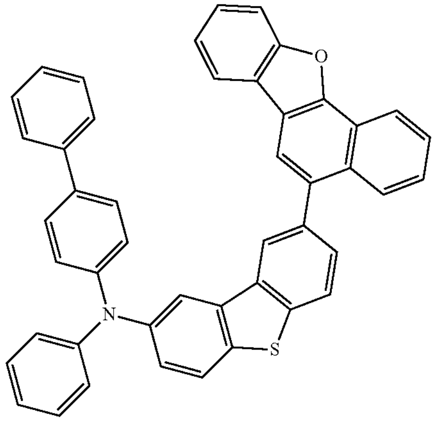

-continued
8-64
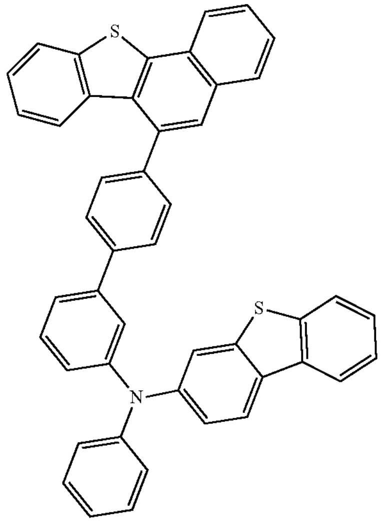
8-65
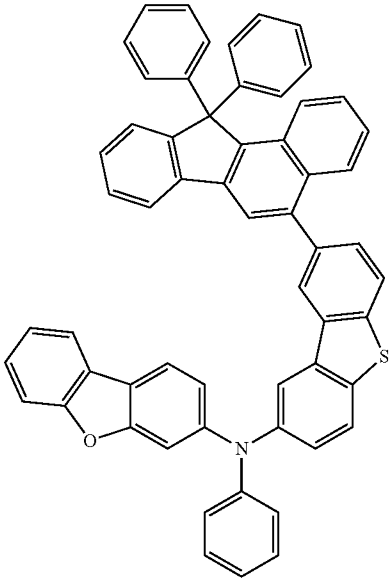
8-66
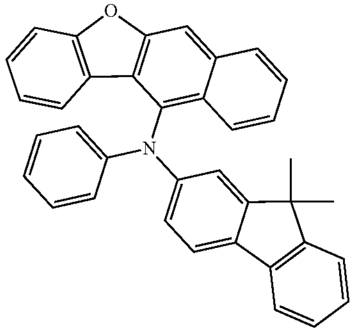
-continued
8-67
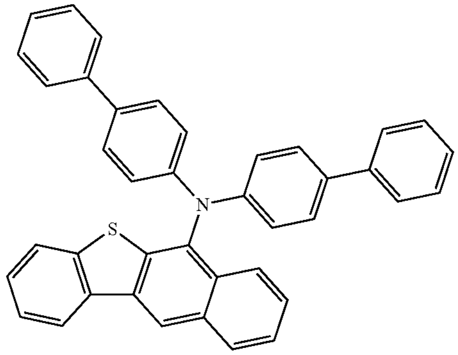
8-68
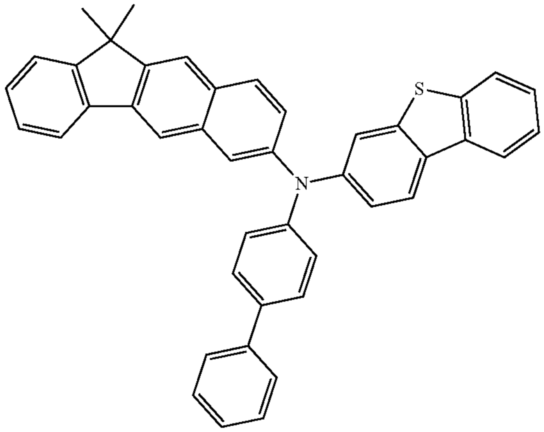
8-69
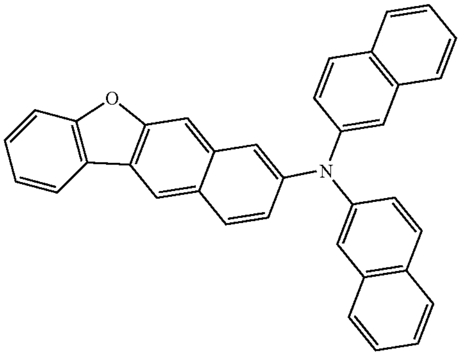
8-70
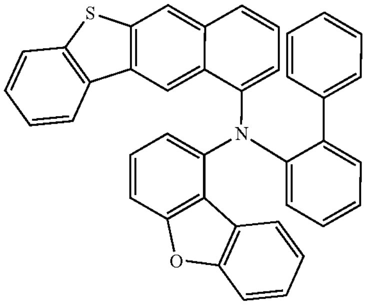

-continued
8-71
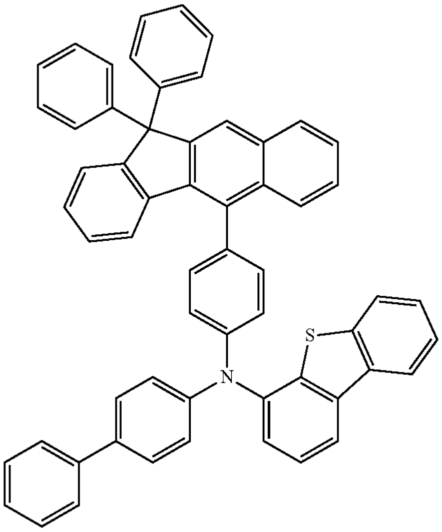
8-72
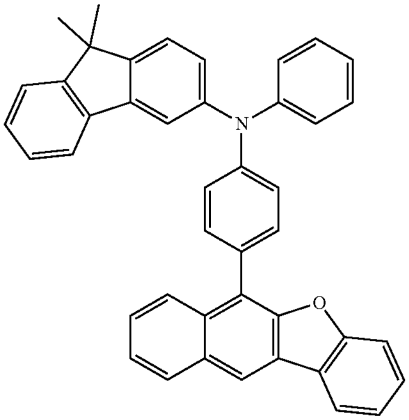
8-73
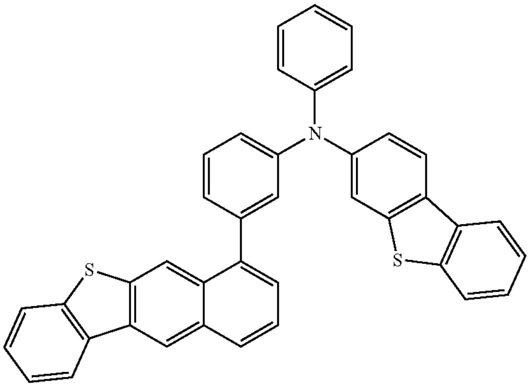
-continued
8-74
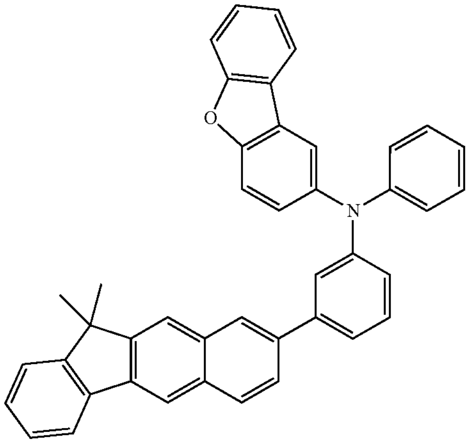
8-75
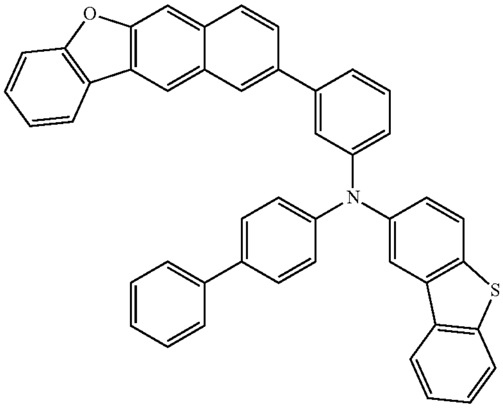
8-76
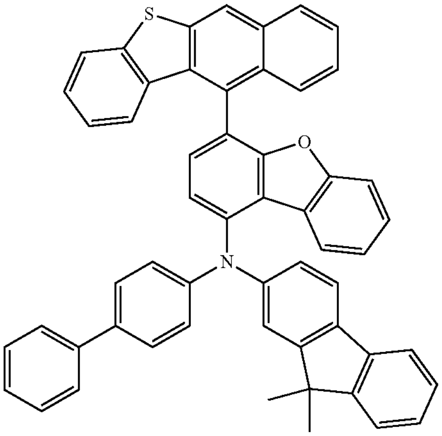
8-77
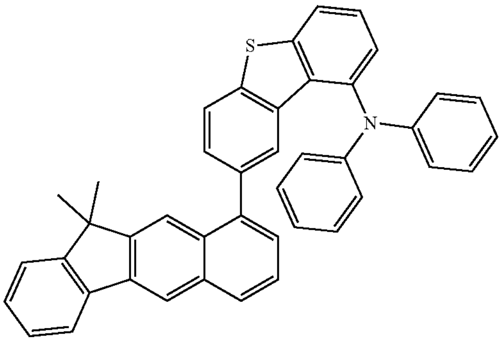

-continued
8-78
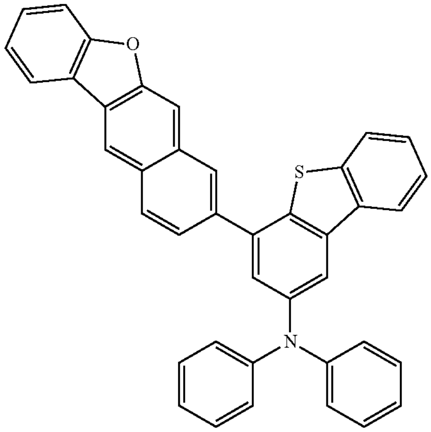
8-79
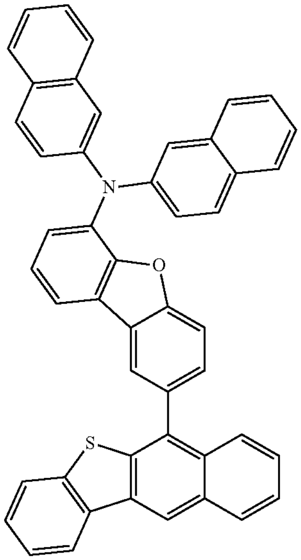
8-80
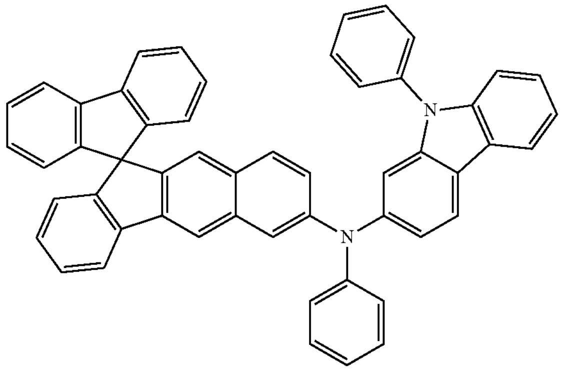
-continued
8-81
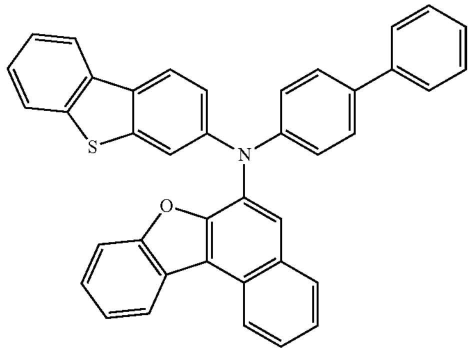
8-82
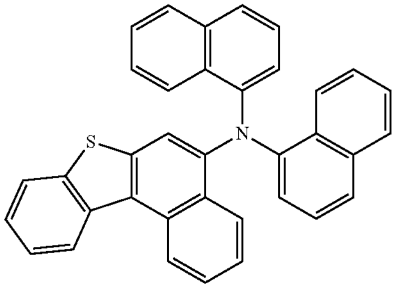
8-83
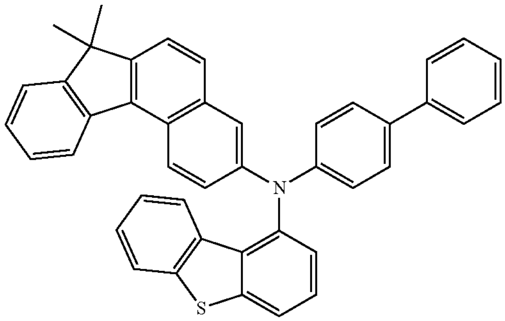
8-84
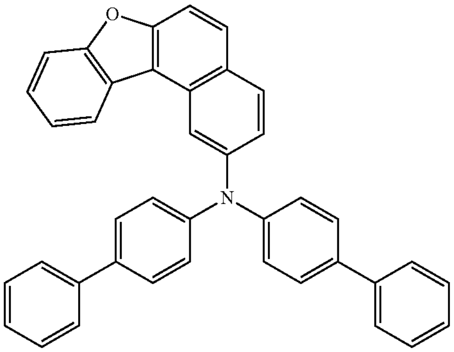

-continued
8-85
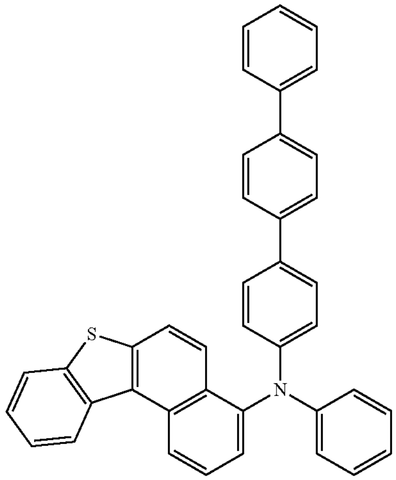
8-86
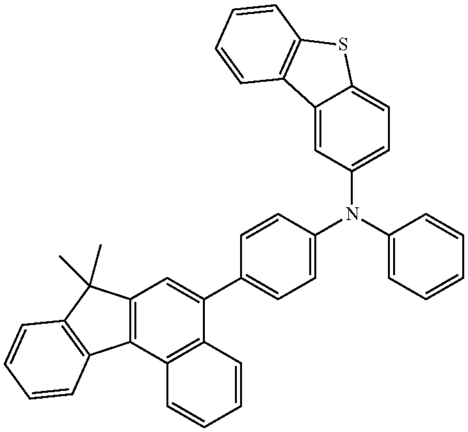
8-87
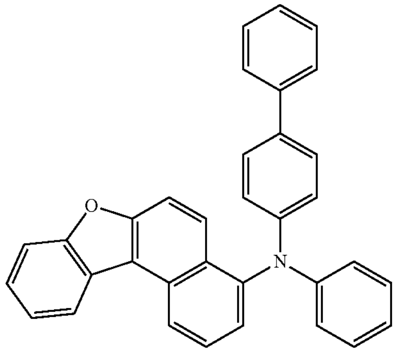
-continued
8-88
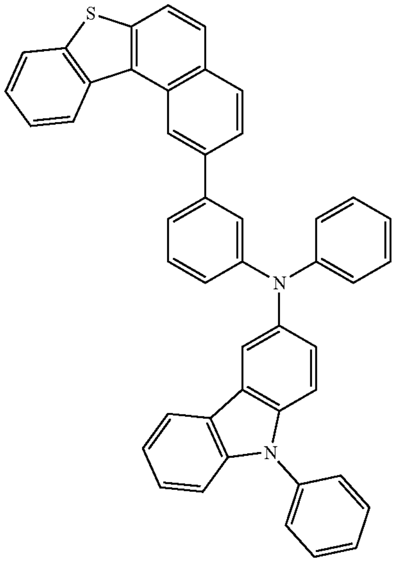
8-89
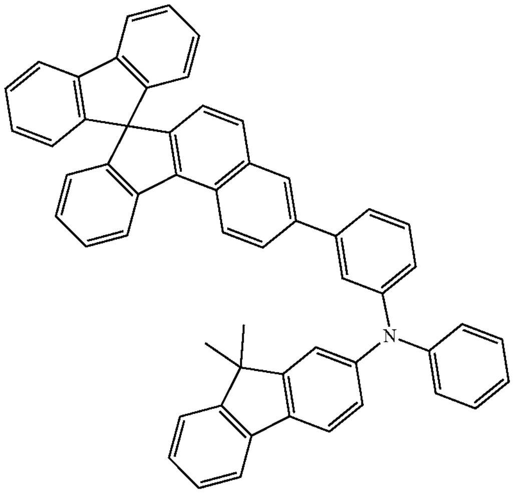
8-90
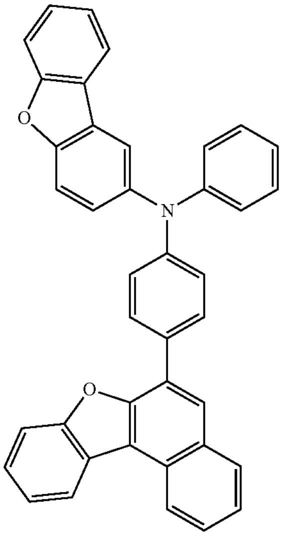

-continued
8-91
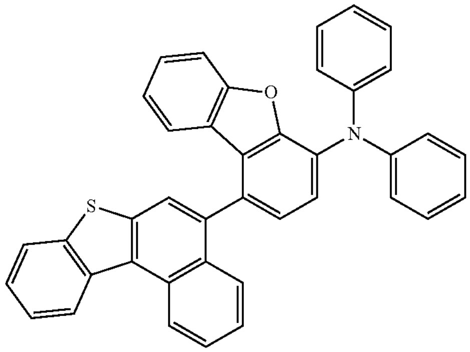
8-92
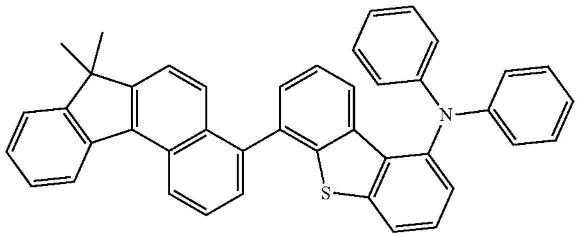
8-93
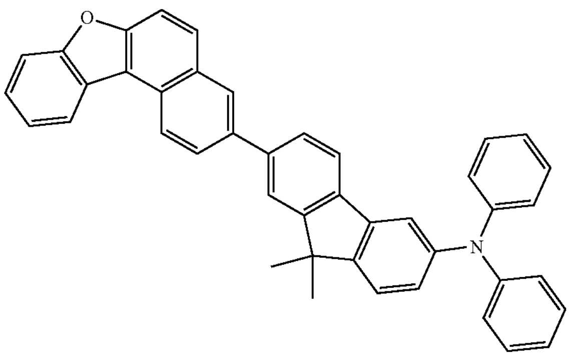
8-94
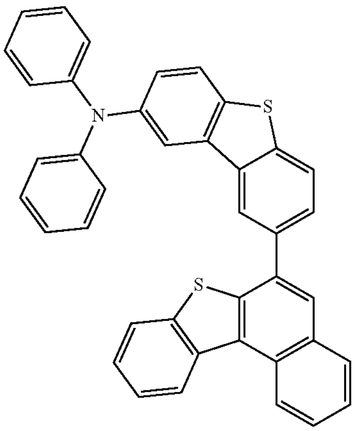
-continued
8-95
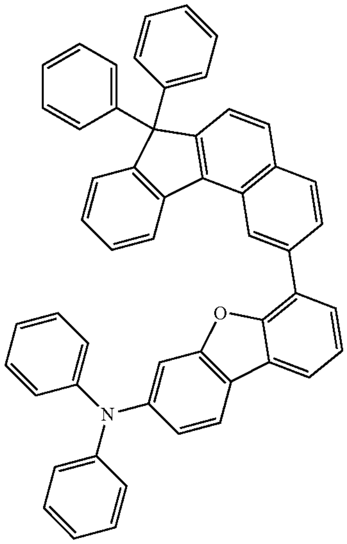
8-96
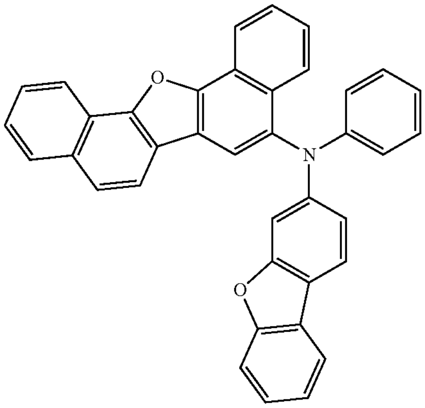
8-97
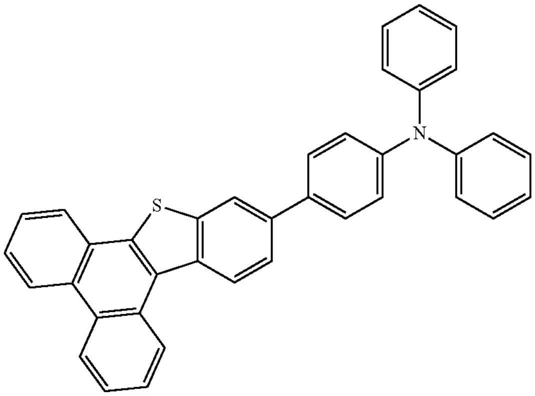

-continued
8-98
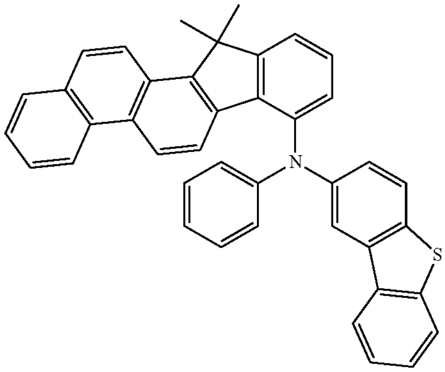
8-99
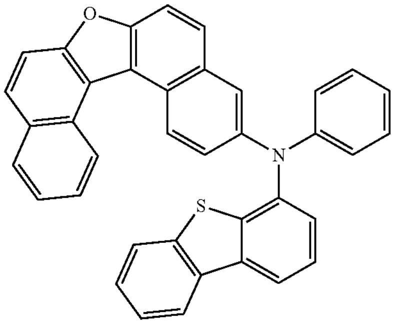
8-100
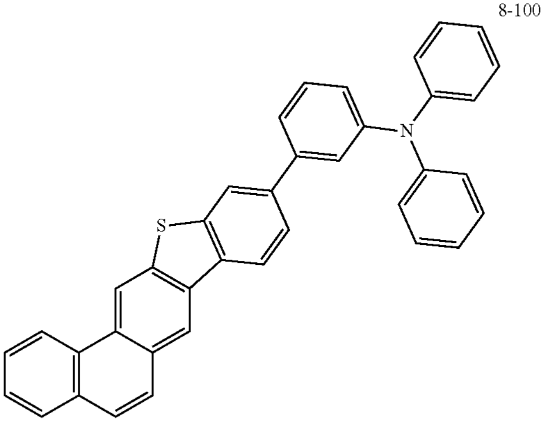
8-101
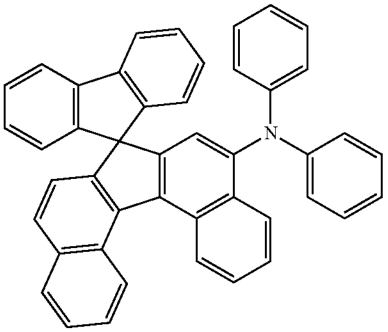
-continued
8-102
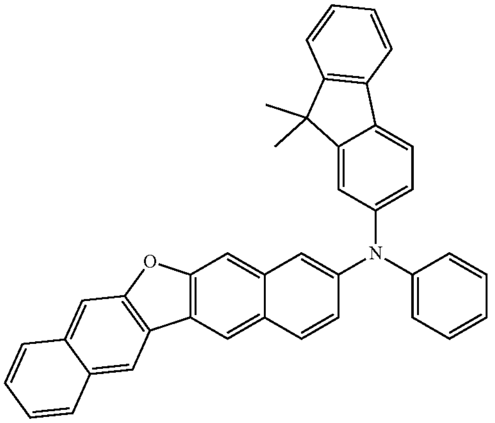
8-103
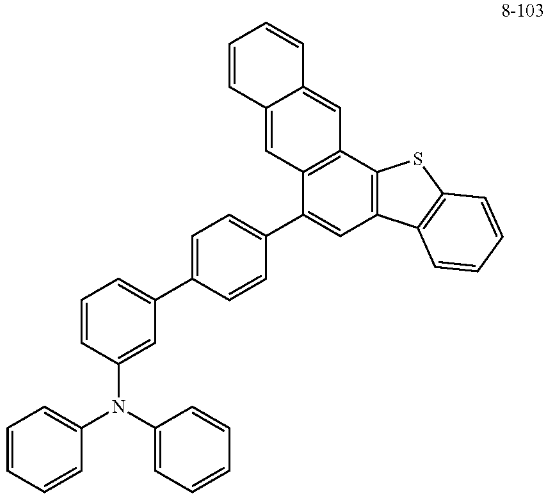
8-104
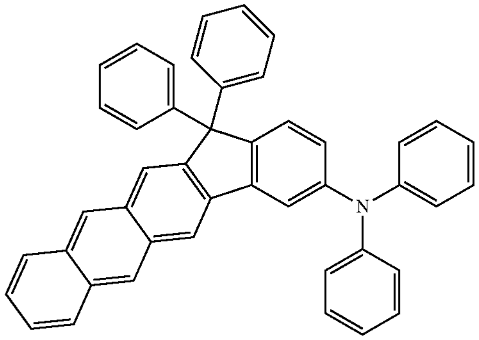
10-1
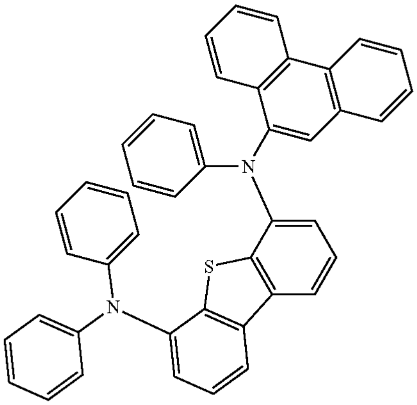

-continued
10-2
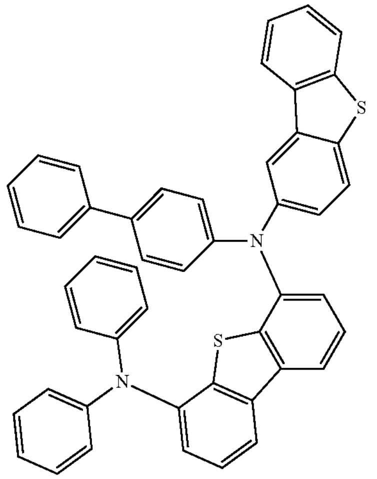
10-3
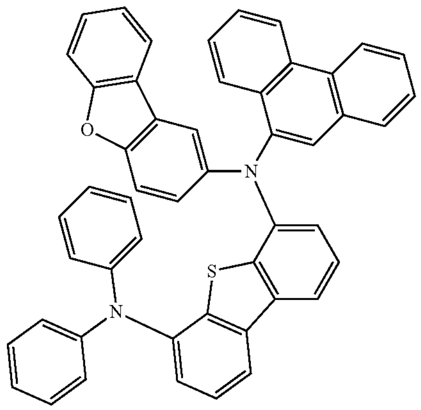
10-4
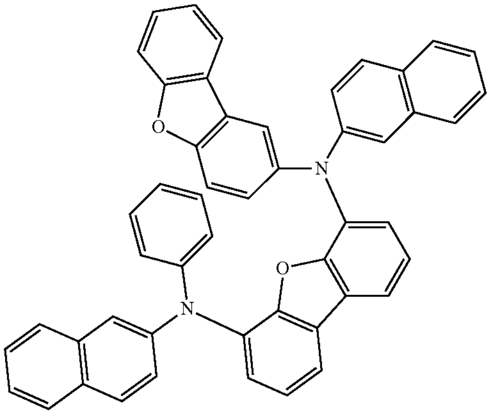
-continued
10-5
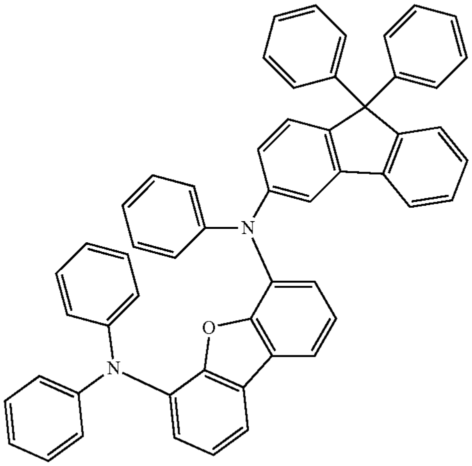
10-6
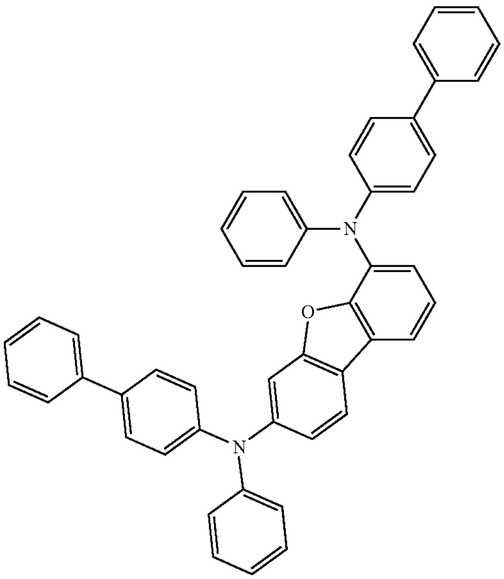
10-7
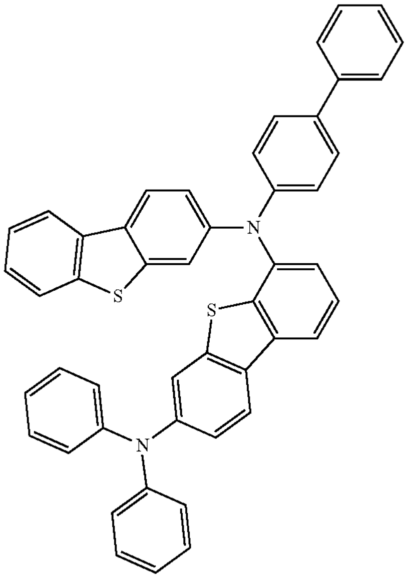

-continued
10-8
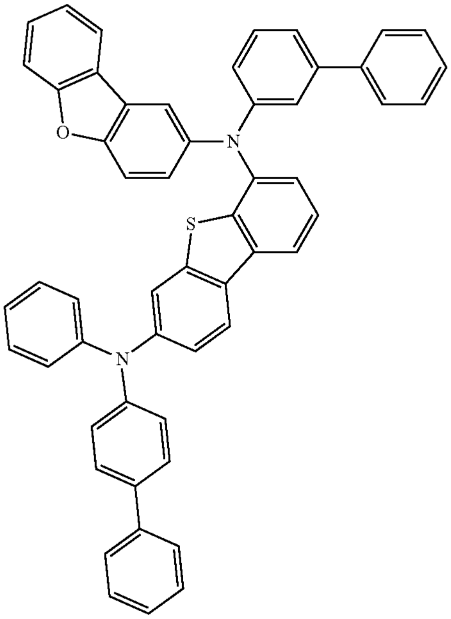
10-9
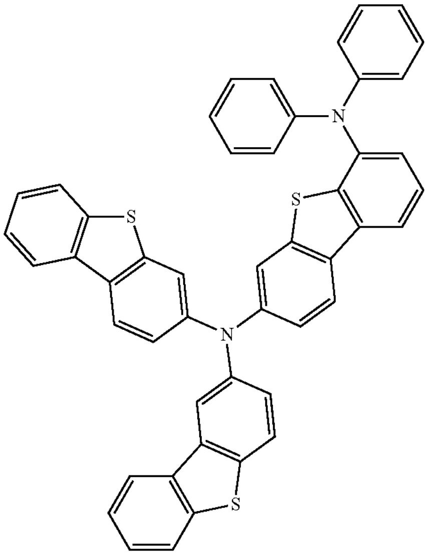
-continued
10-10
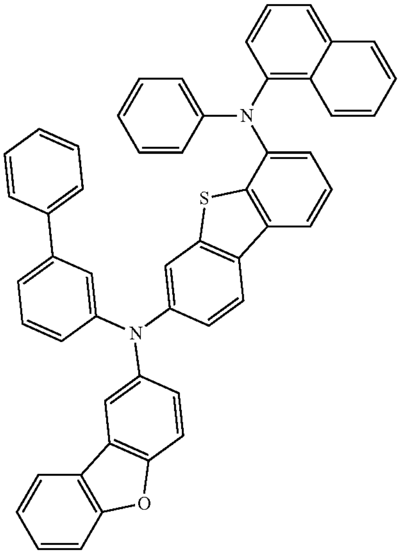
10-11
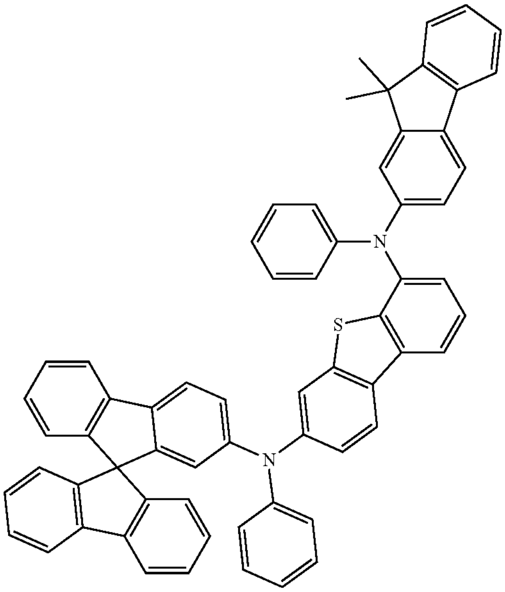
10-12
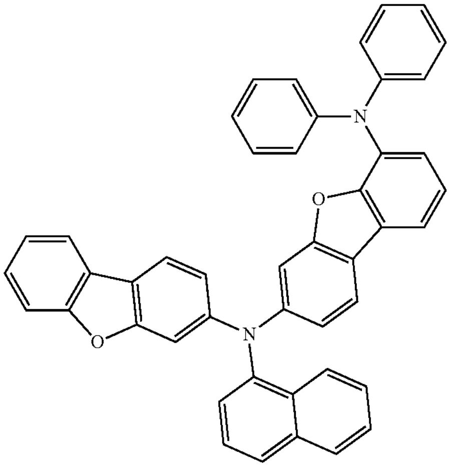

-continued
10-13
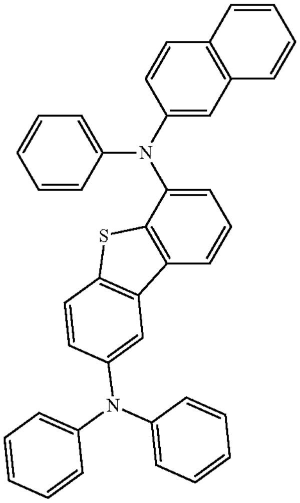
10-14
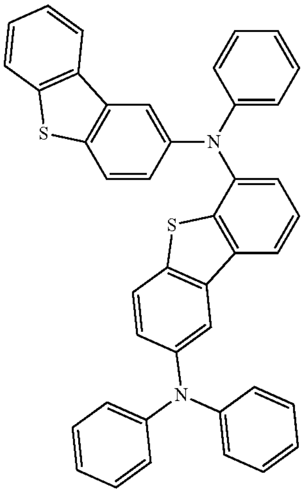
10-15
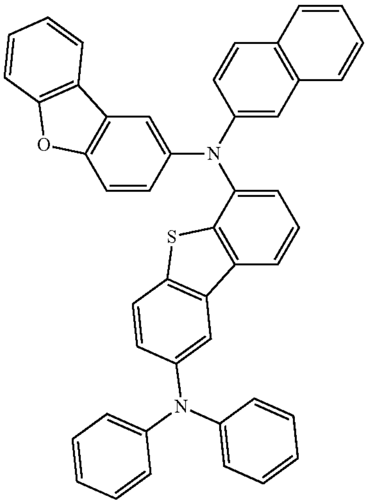
-continued
10-16
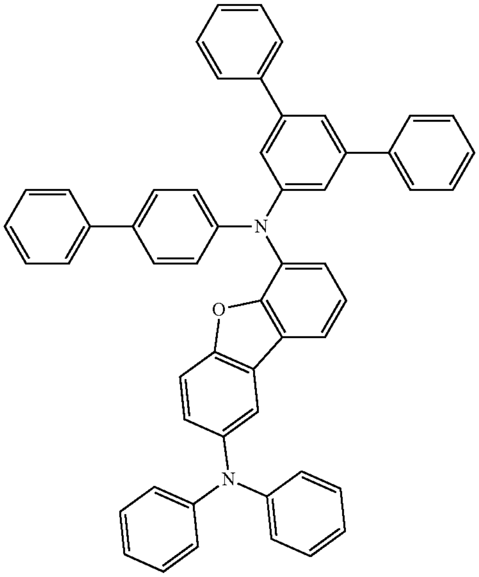
10-17
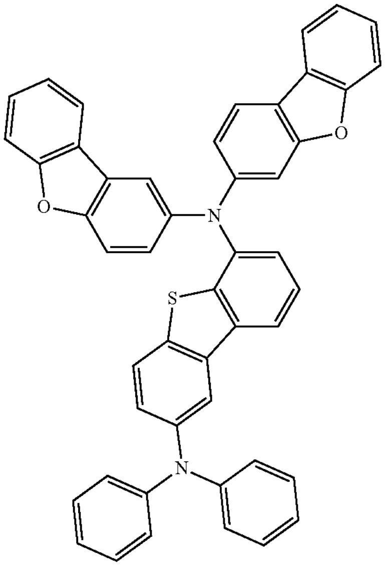

-continued
10-18
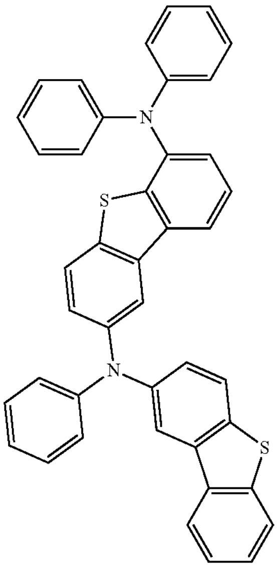
10-19
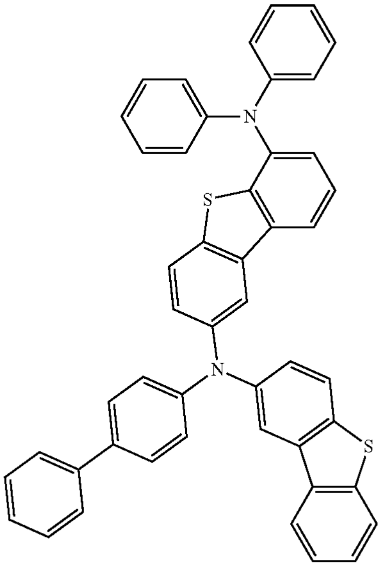
-continued
10-20
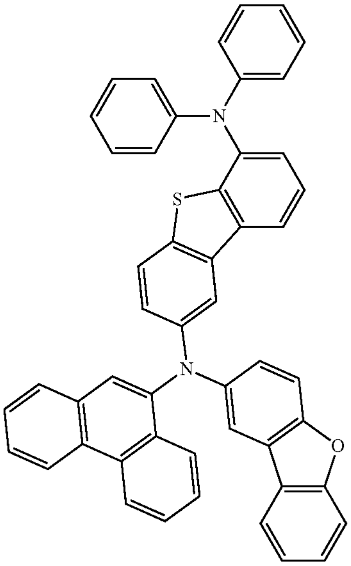
10-21
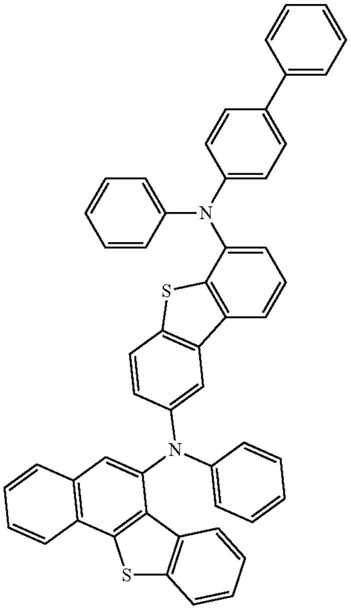

-continued
10-22
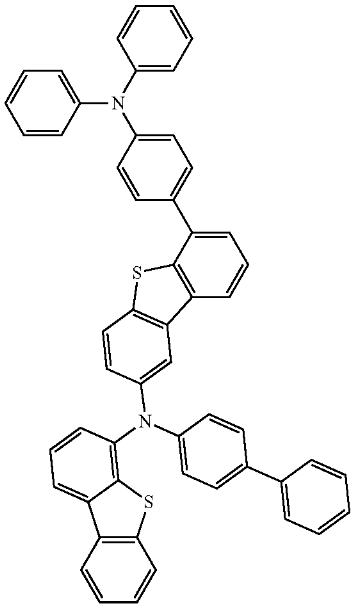
10-23
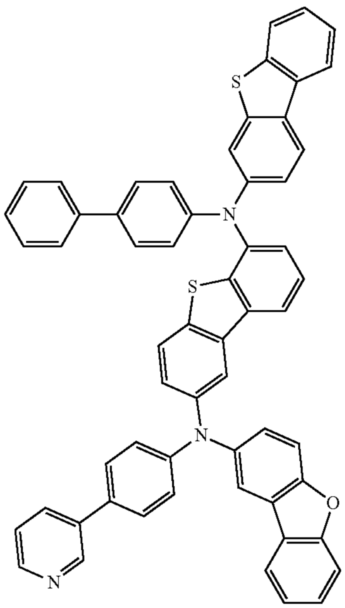
-continued
10-24
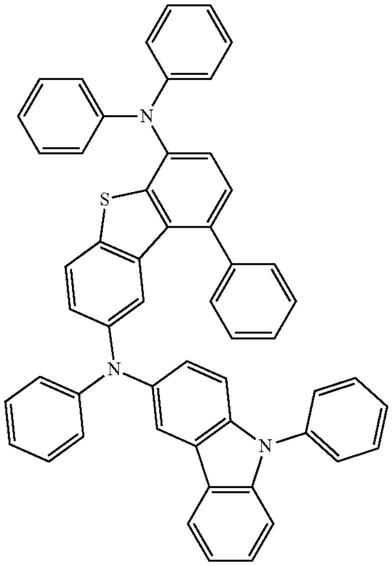
10-25
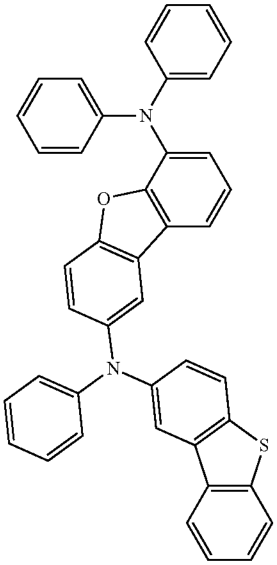
10-26
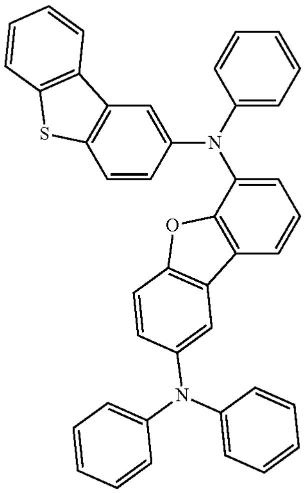

-continued
10-27
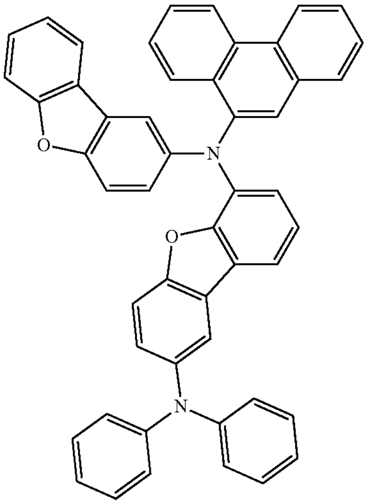
10-28
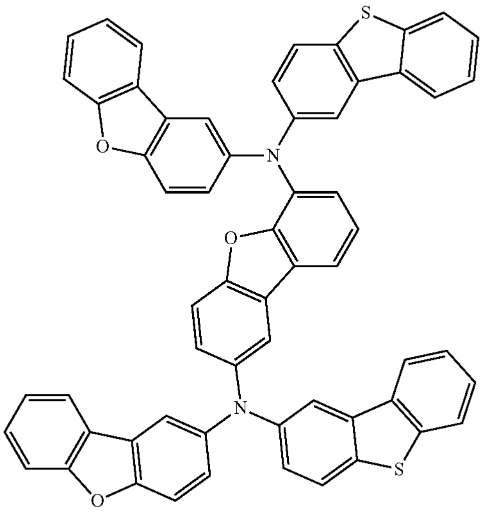
10-29
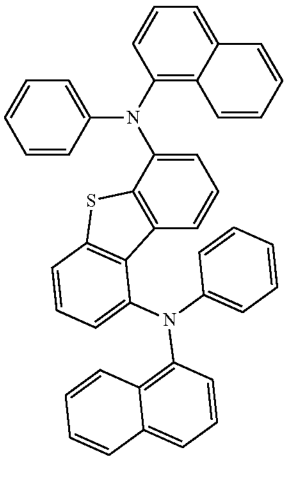
-continued
10-30
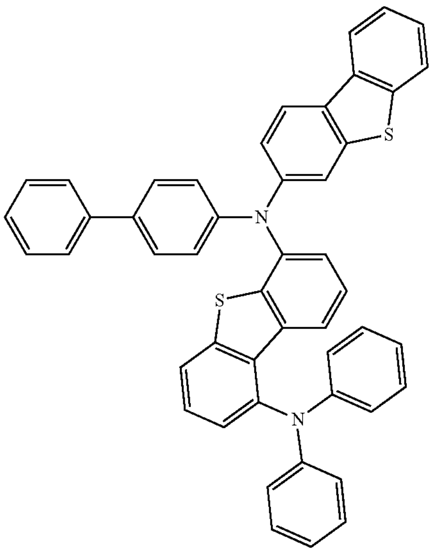
10-31
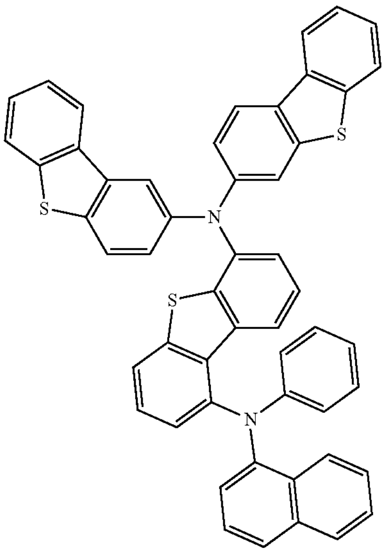
10-32
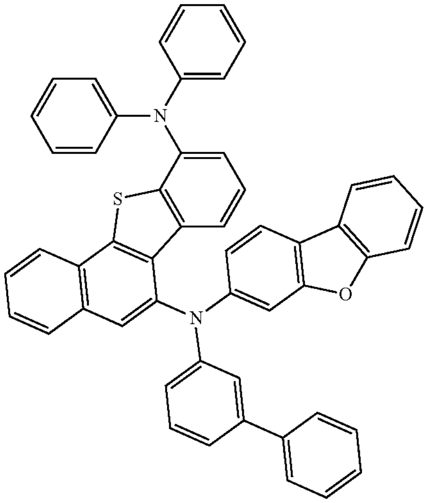

-continued
10-33
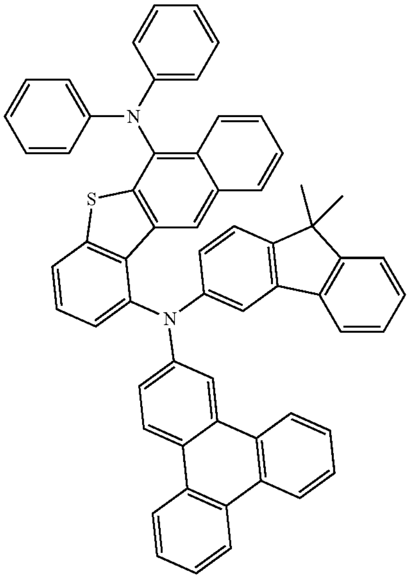
10-34
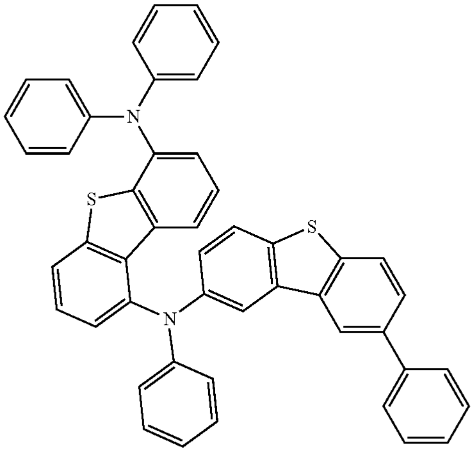
10-35
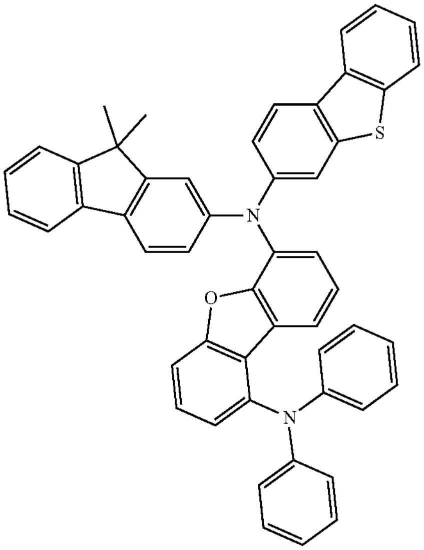
-continued
10-36
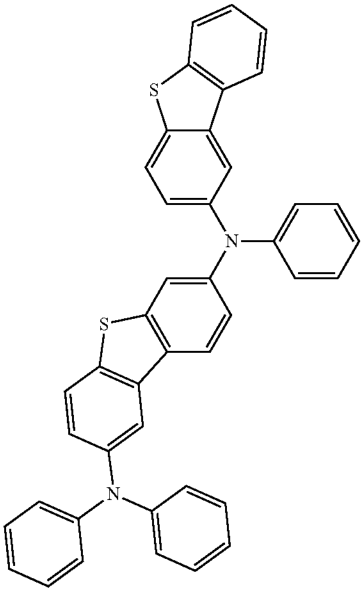
10-37
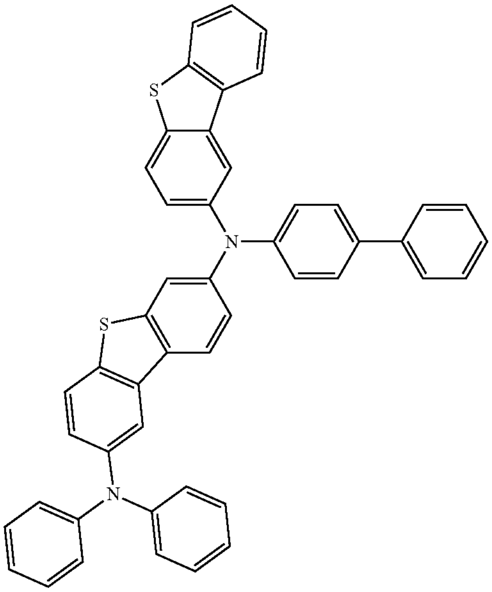

-continued
10-38
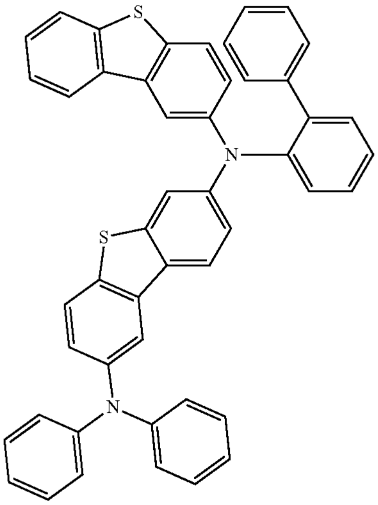
10-39
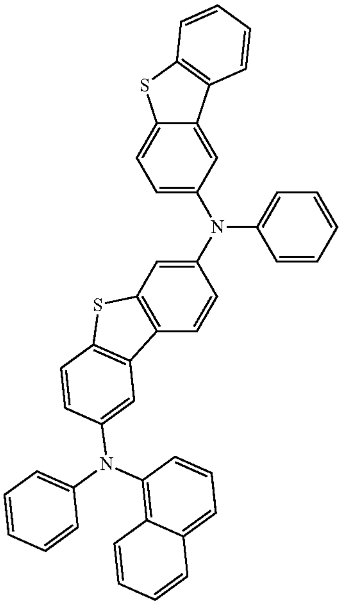
-continued
10-40
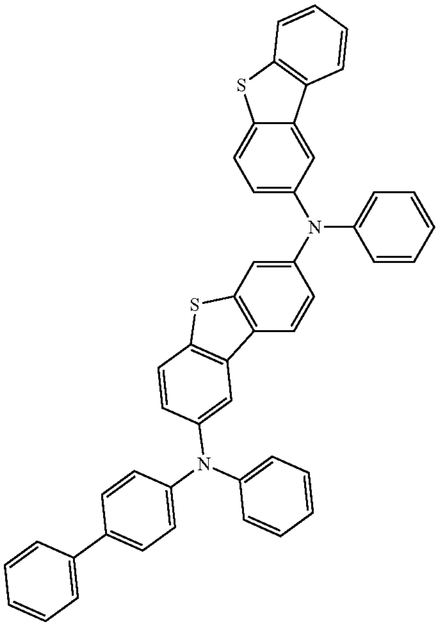
10-41
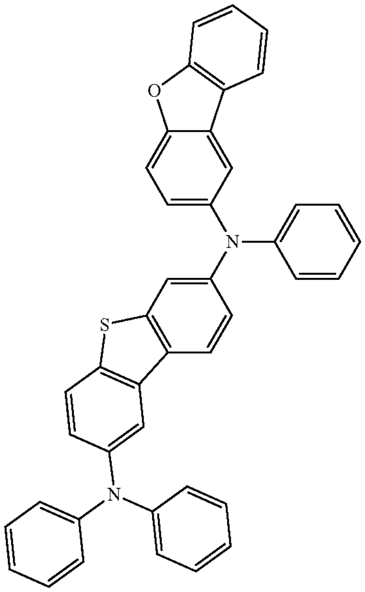

-continued
10-42
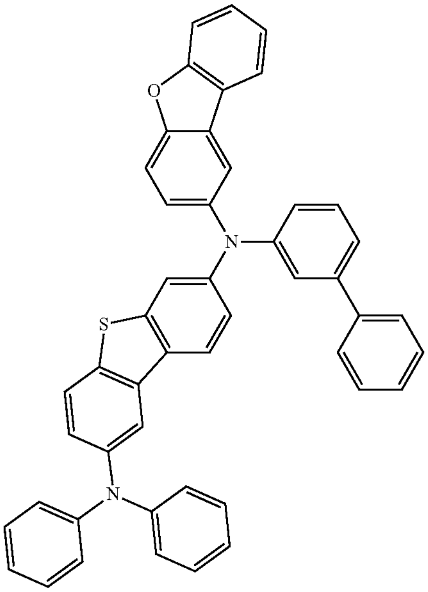
10-43
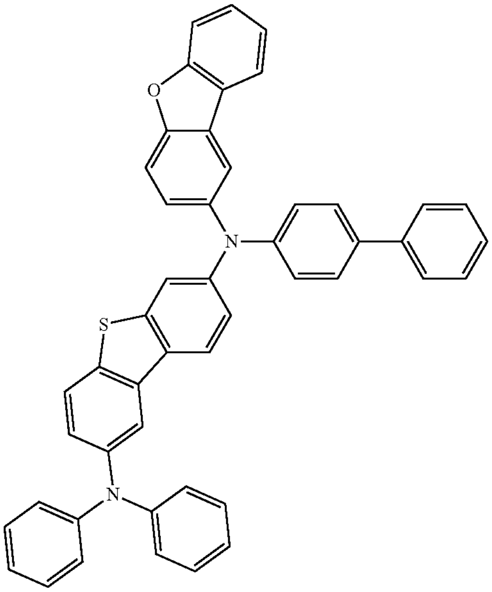
-continued
10-44
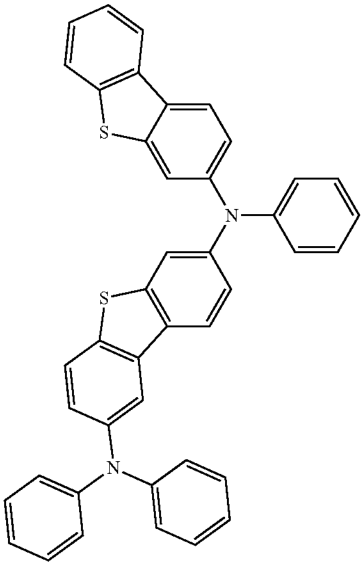
10-45
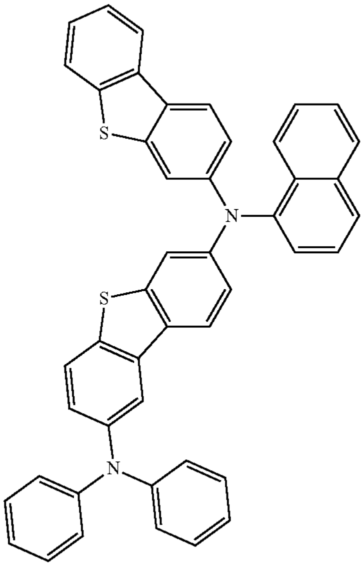

-continued
10-46
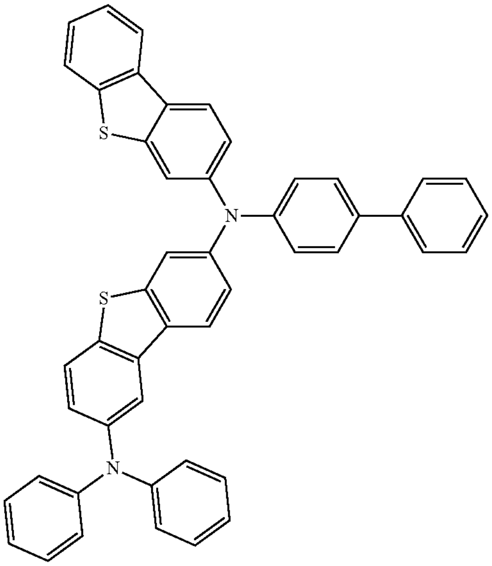
10-47
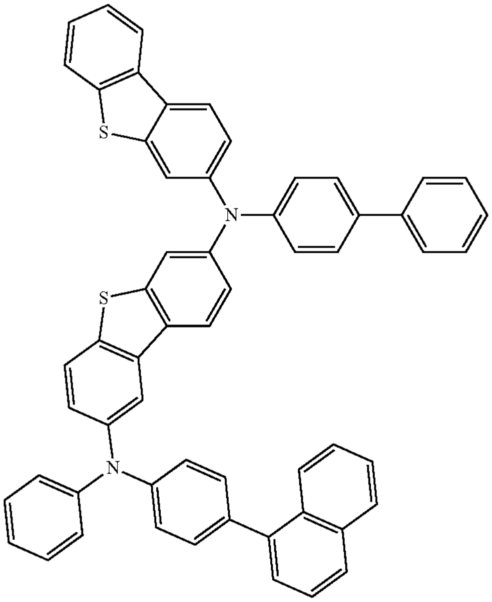
-continued
10-48
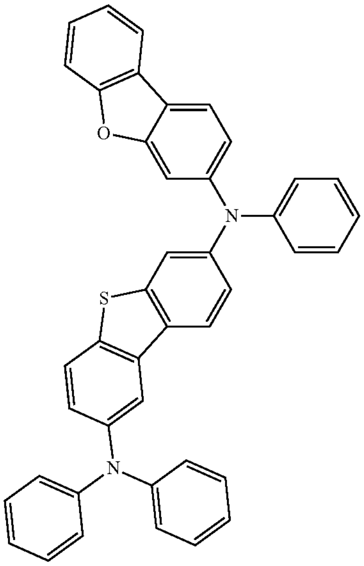
10-49
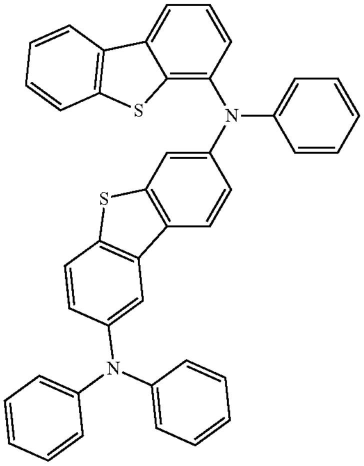
10-50
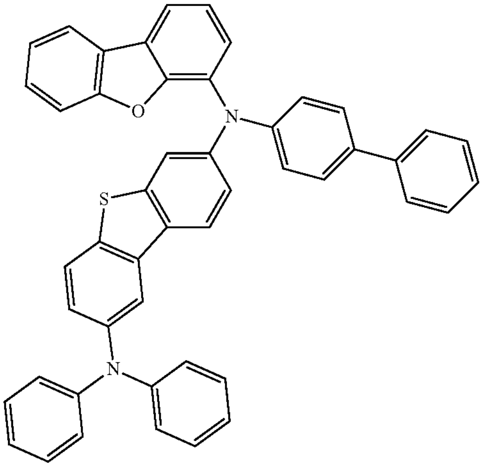

10-51
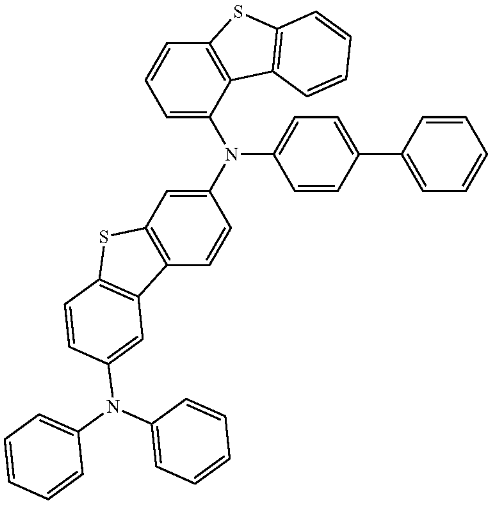
10-52
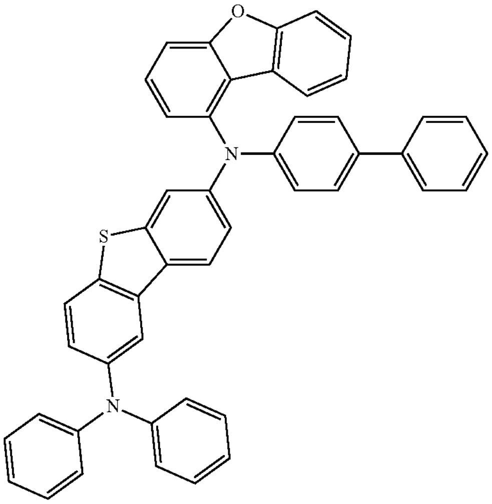
10-53
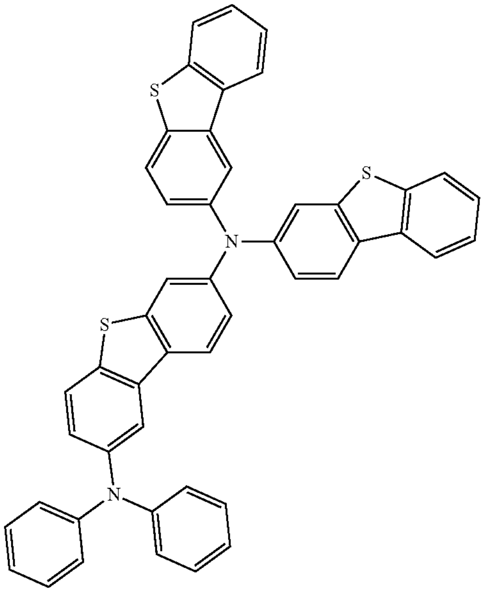
10-54
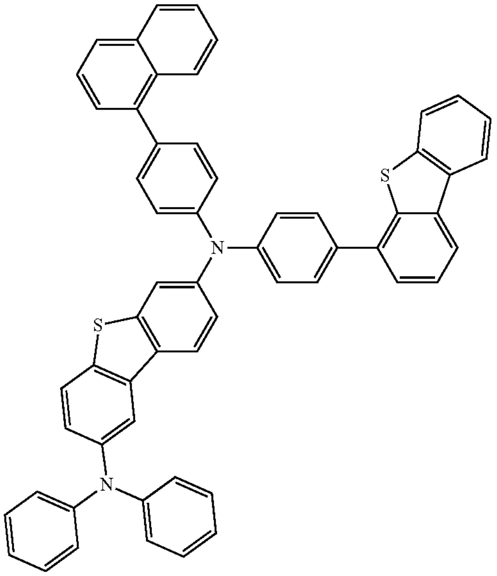
10-55
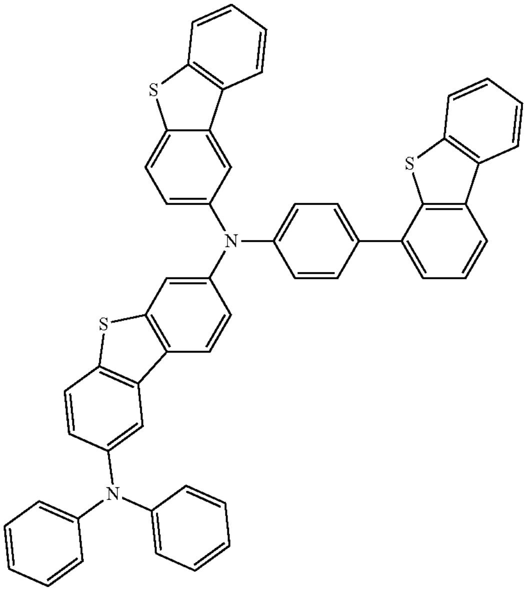

-continued
10-56
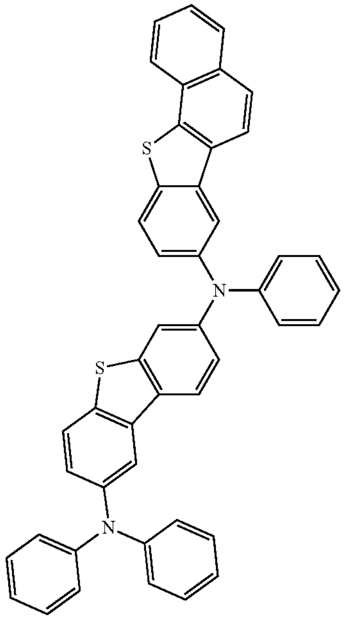
10-57
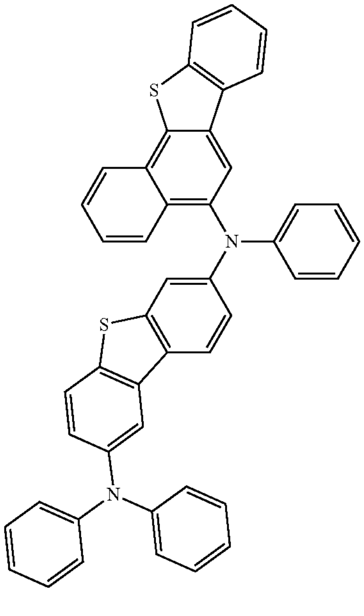
-continued
10-58
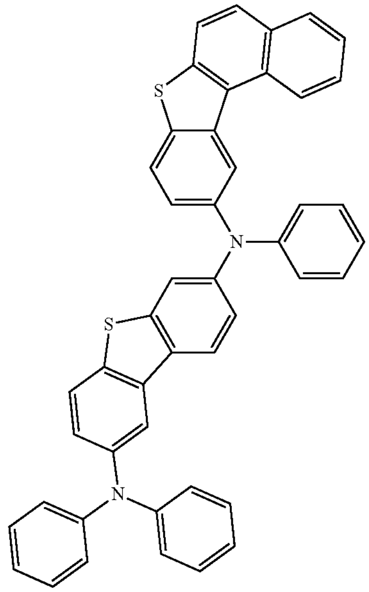
10-59
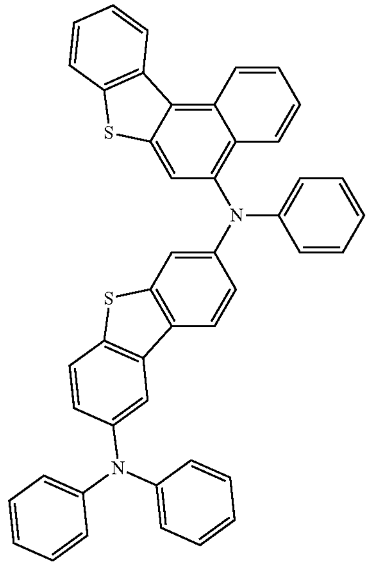
10-60
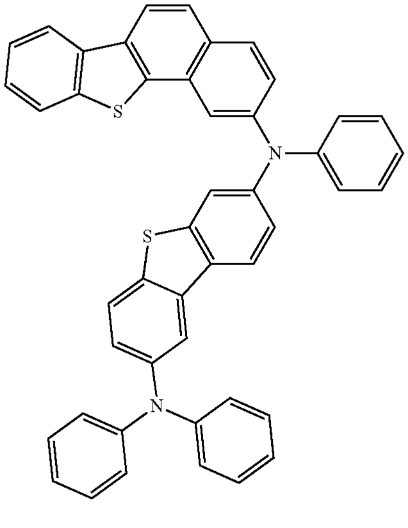

-continued
10-61
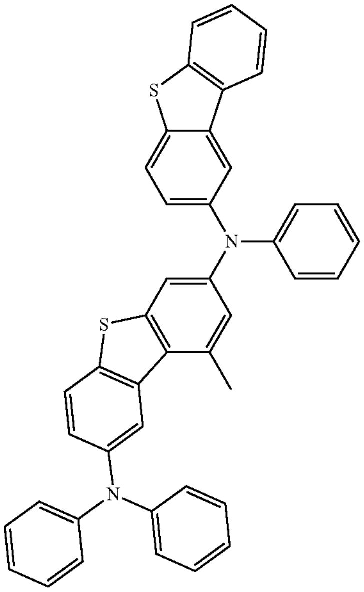
10-62
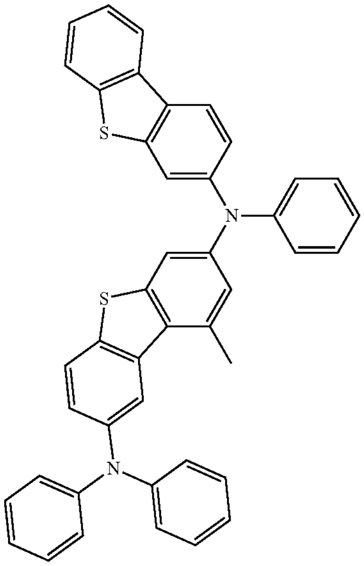
10-63
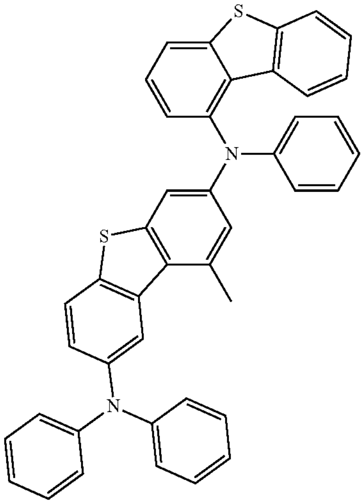
-continued
10-64
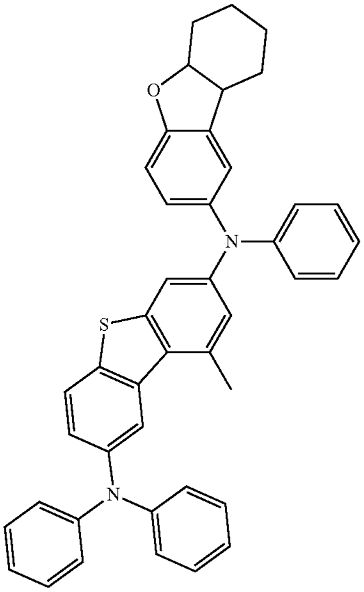
10-65
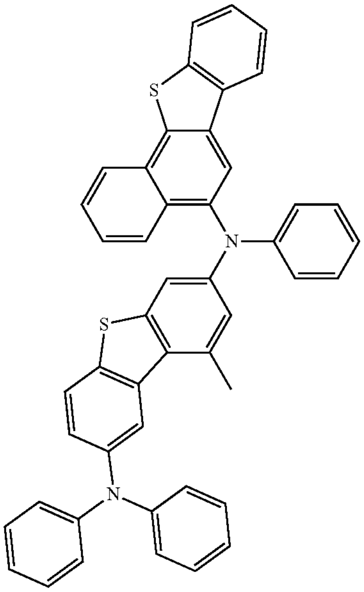

-continued
10-66
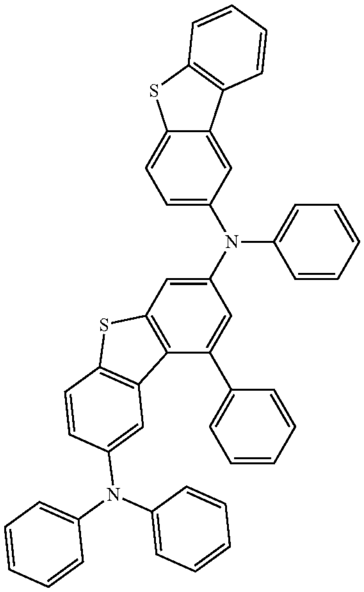
10-67
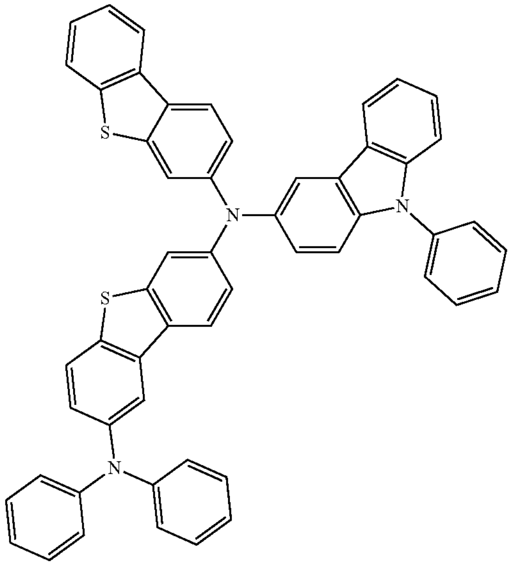
-continued
10-68
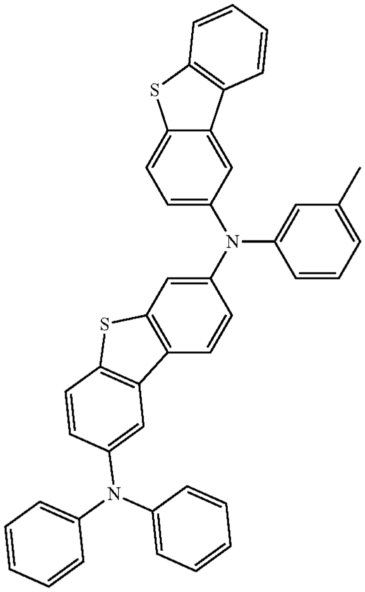
10-69
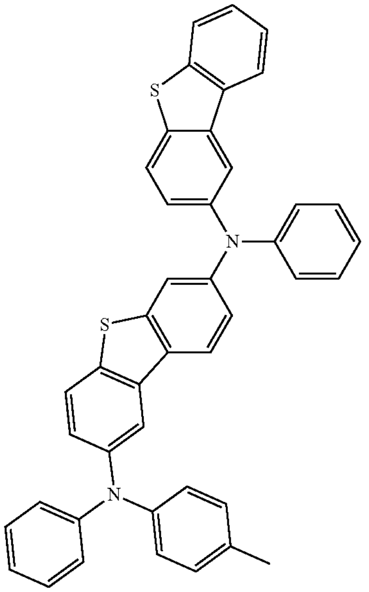

-continued
10-70
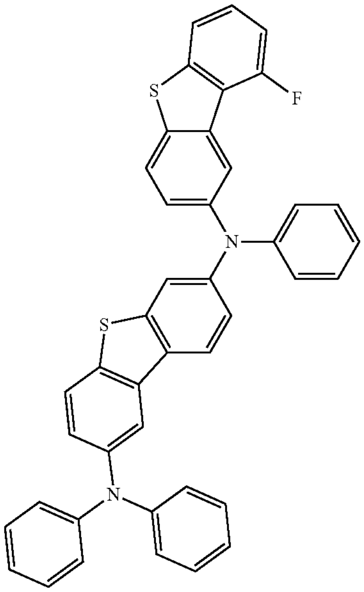
10-71
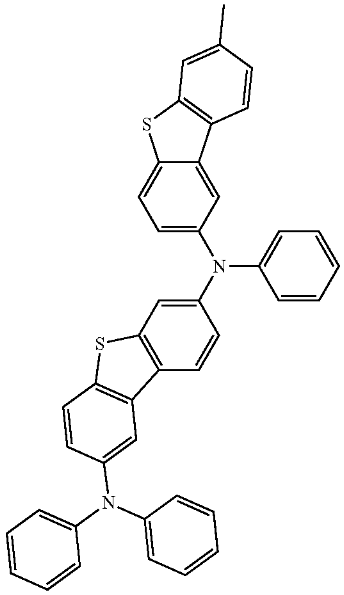
-continued
10-72
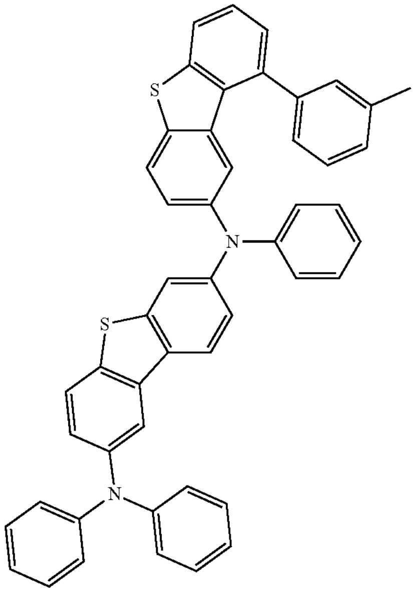
10-73
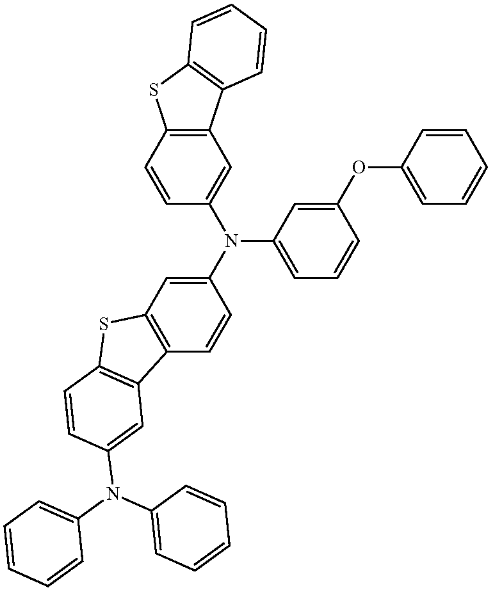

-continued
10-74
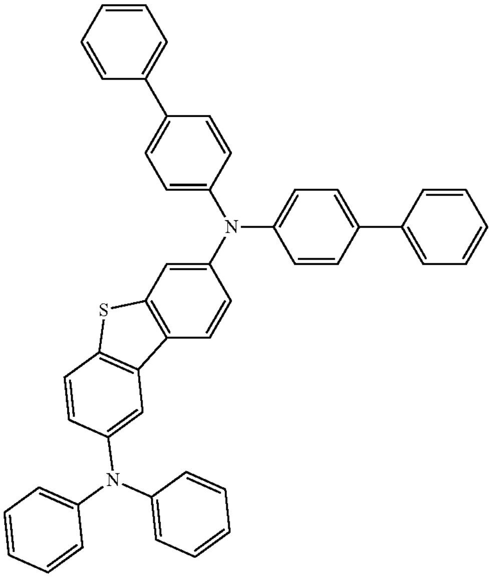
10-76
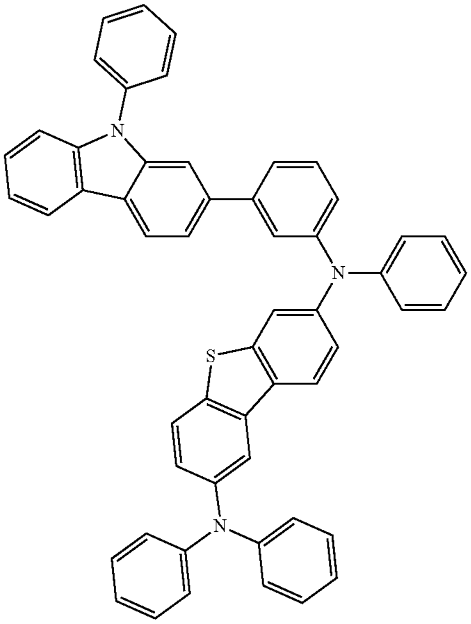
10-75
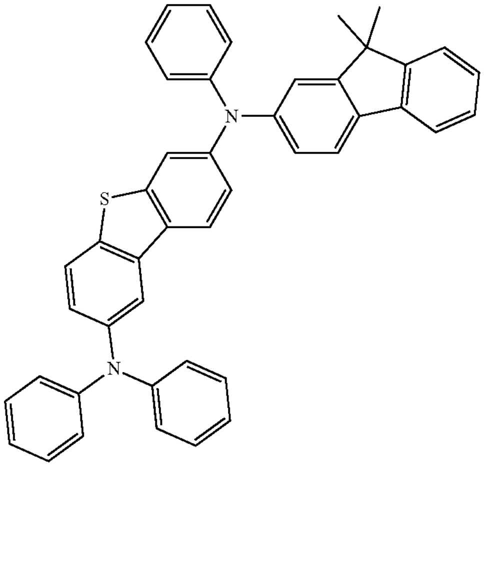
10-77
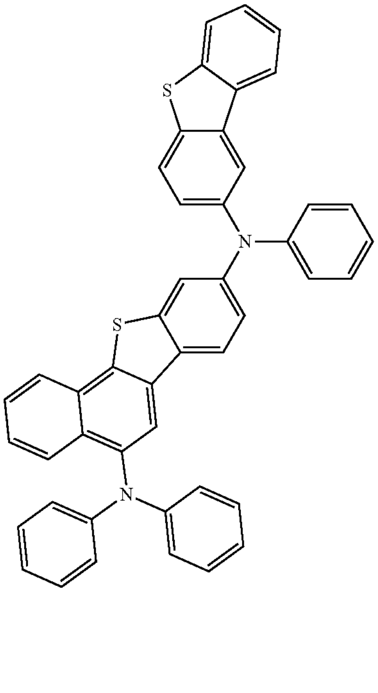

10-78
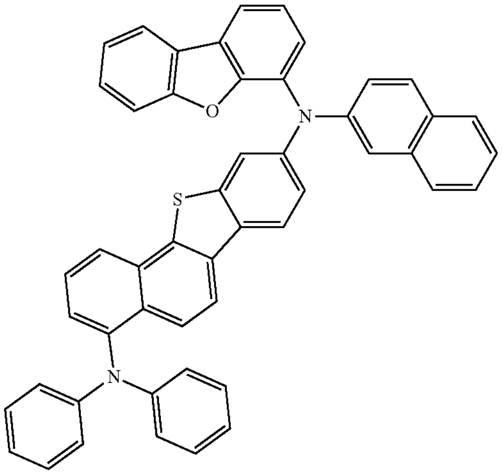
10-79
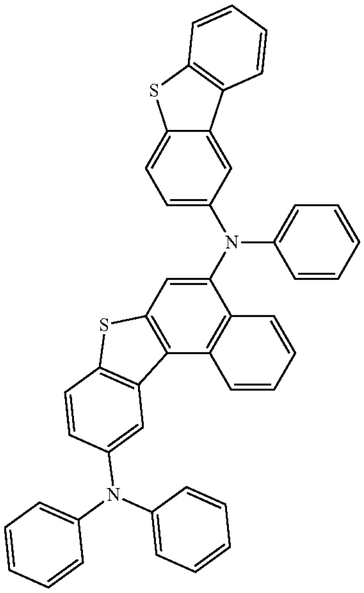
10-80
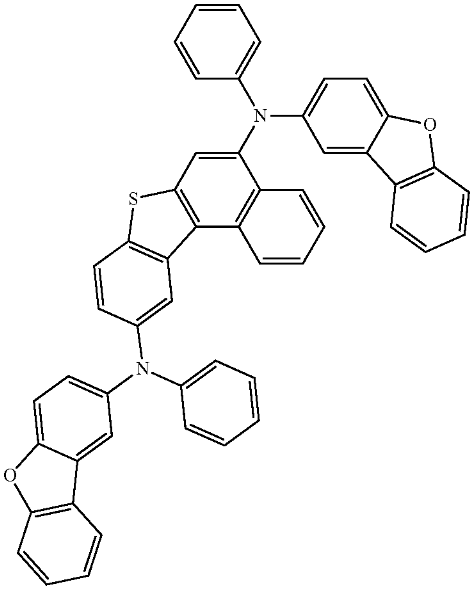
10-81
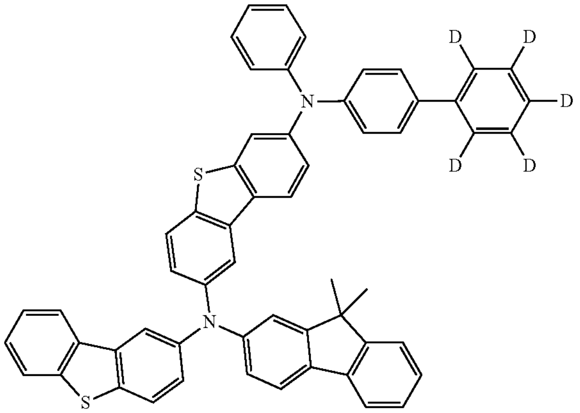
10-82
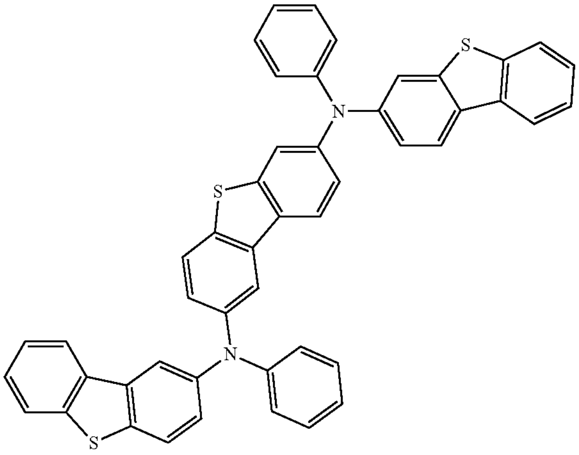
10-83
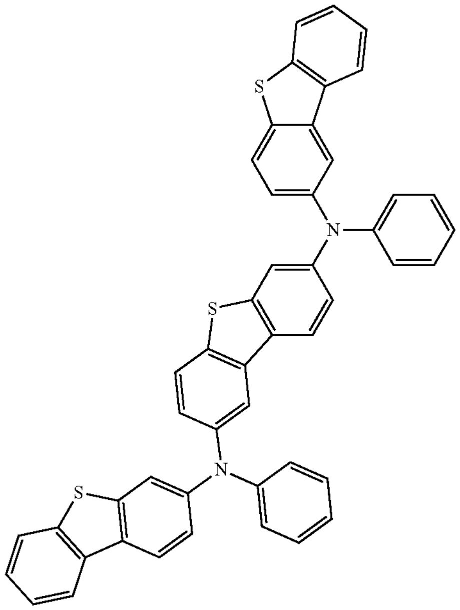

-continued
10-84
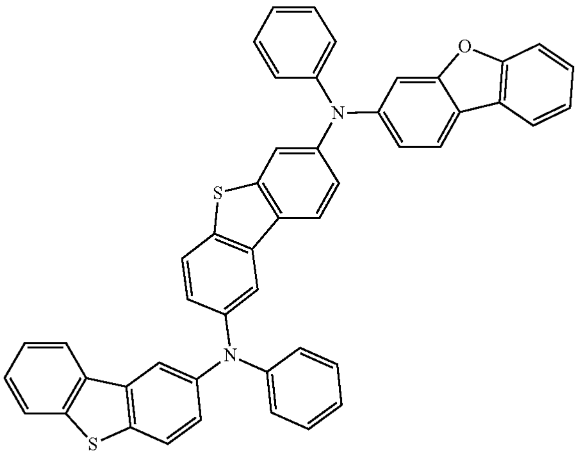
10-85
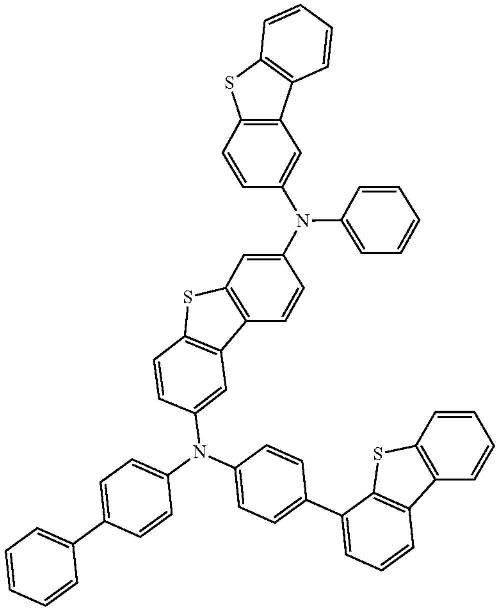
10-86
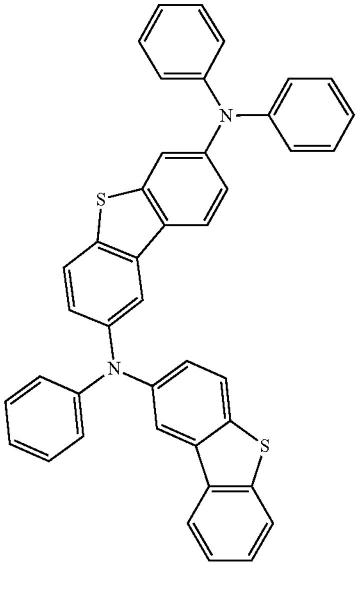
-continued
10-87
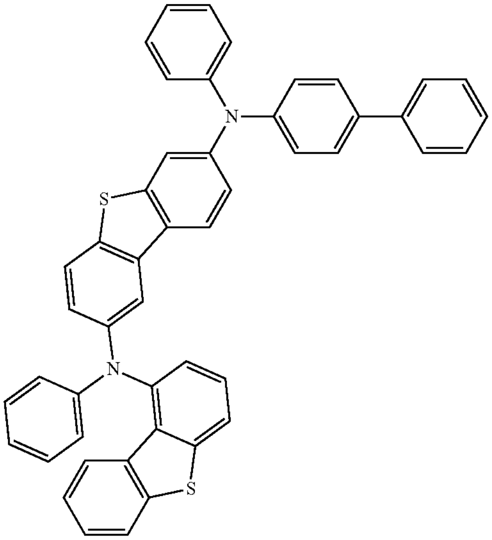
10-88
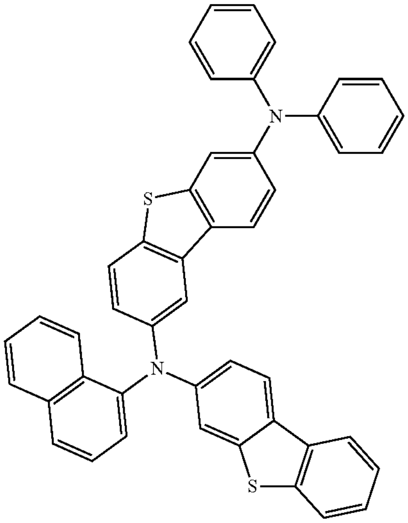
10-89
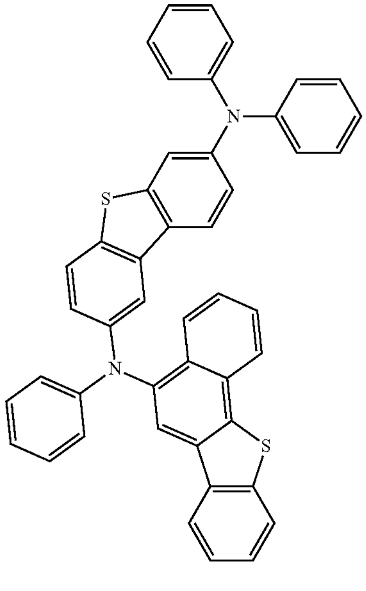

-continued
10-90
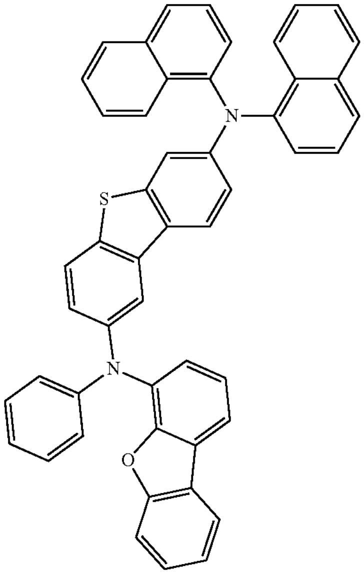
10-92
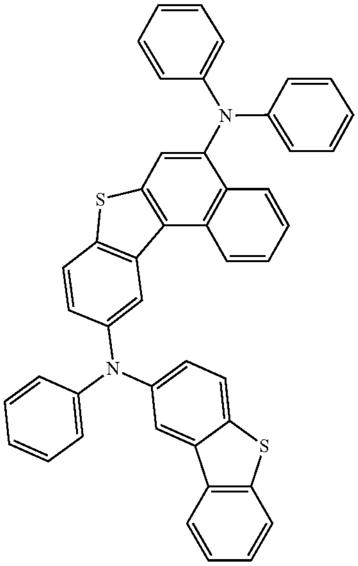
10-91
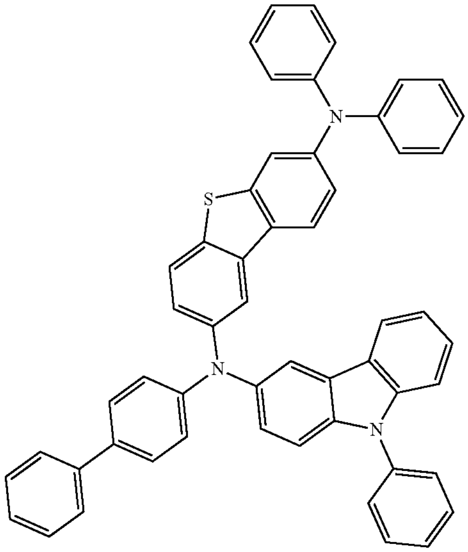
10-93
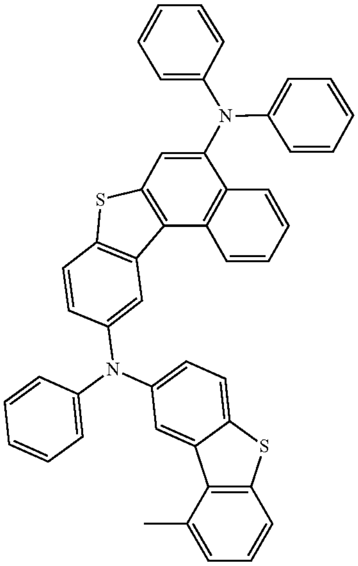

-continued
10-94
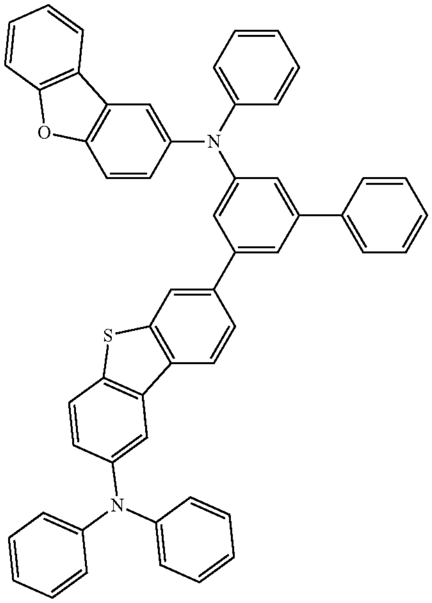
10-95
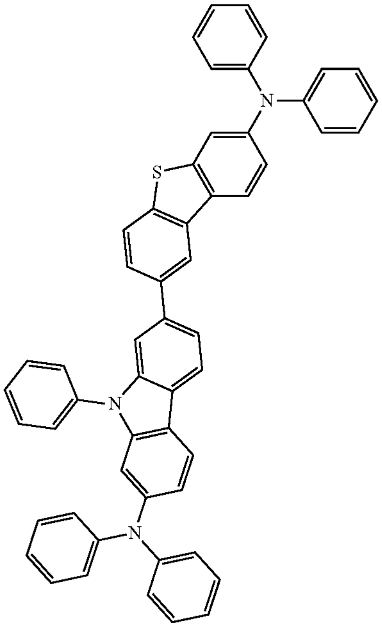
-continued
10-96
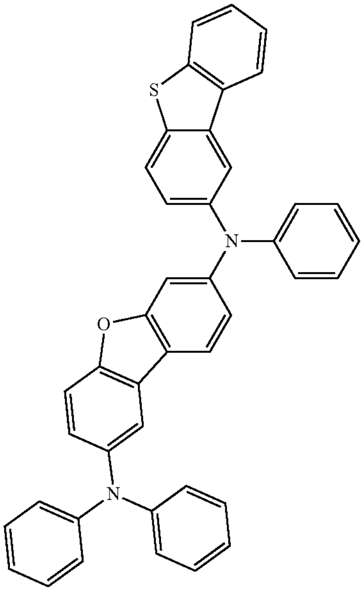
10-97
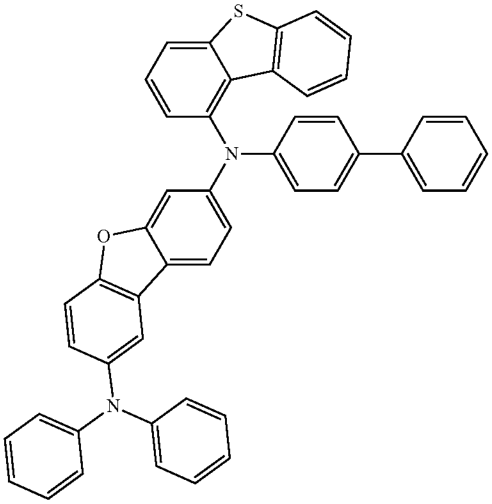

10-98
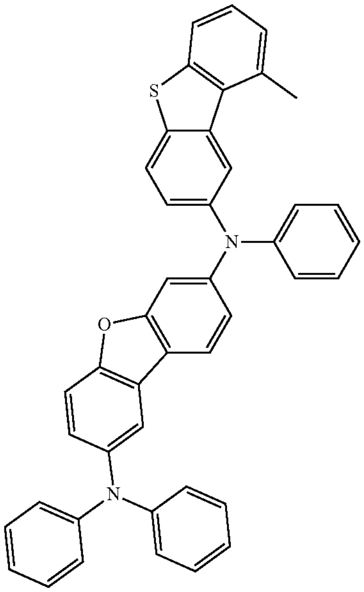
10-99
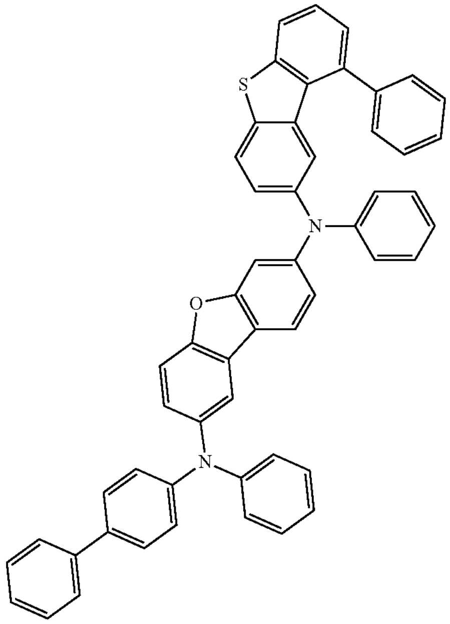
10-100
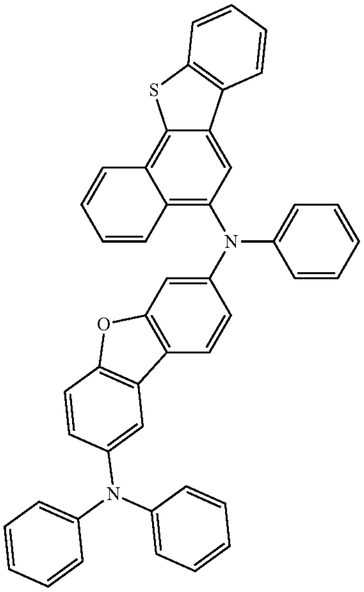
10-101
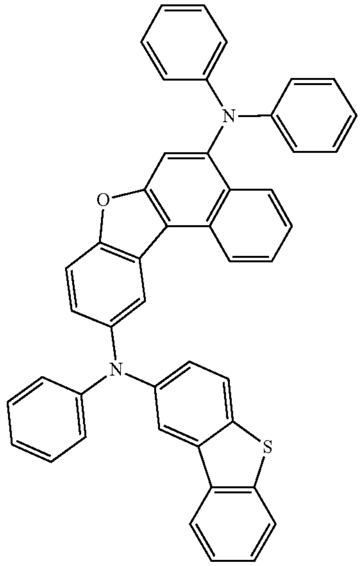

-continued
10-102
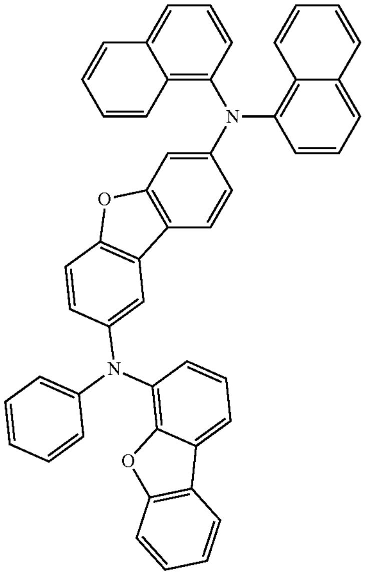
10-103
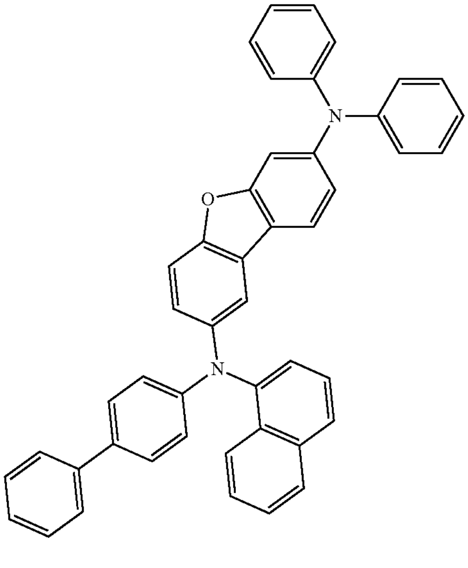
-continued
10-104
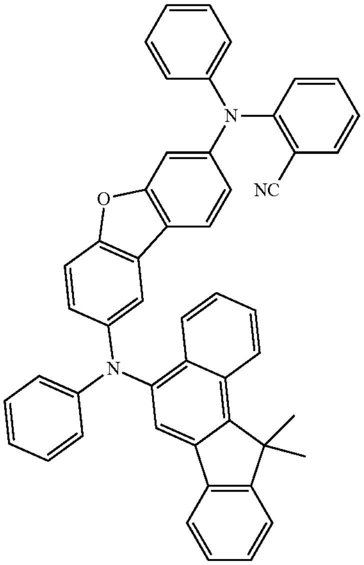
10-105
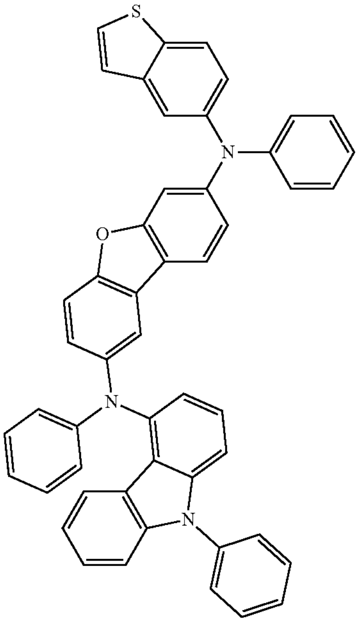

-continued
10-106
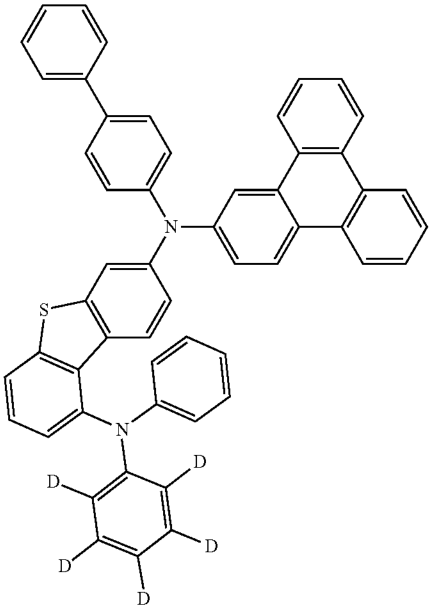
10-107
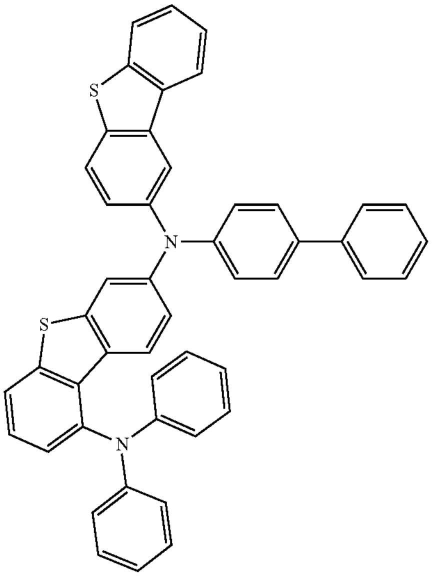
-continued
10-108
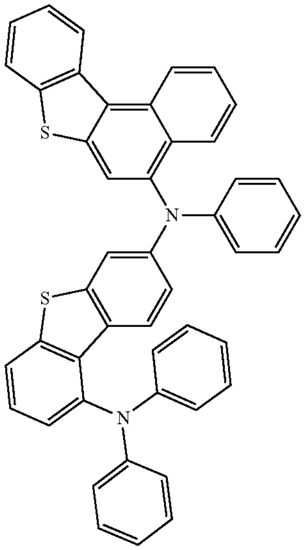
10-109
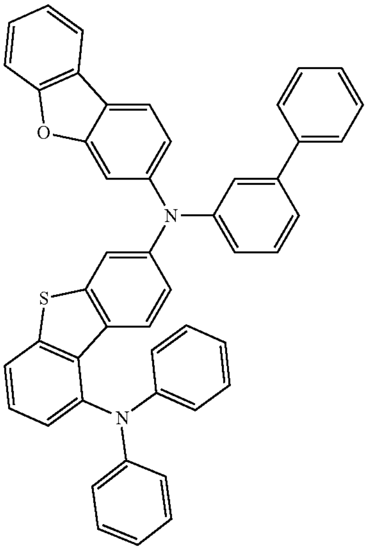
10-110
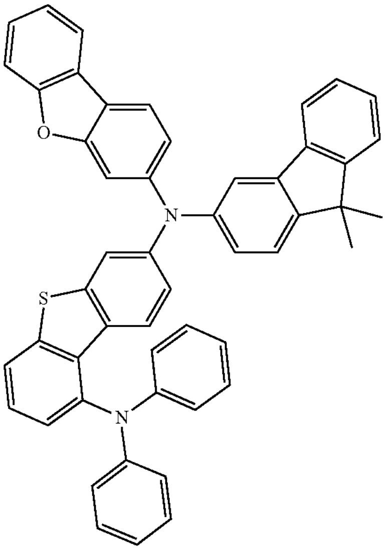

-continued
10-111
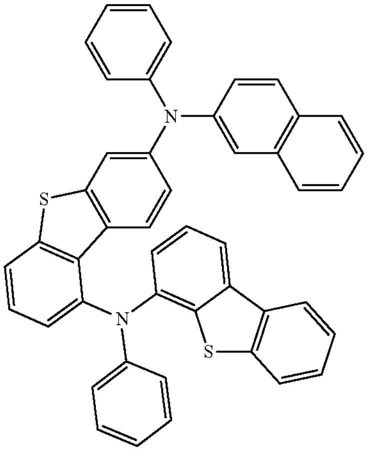
10-112
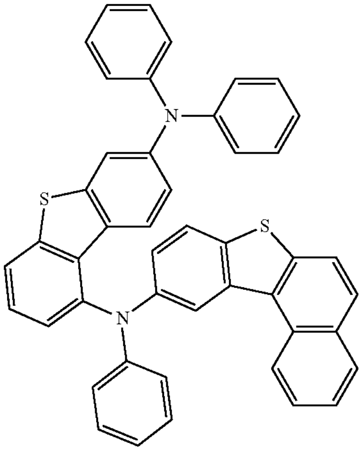
10-113
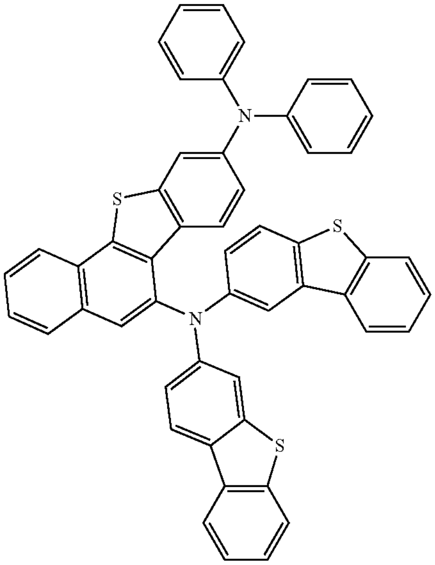
-continued
10-114
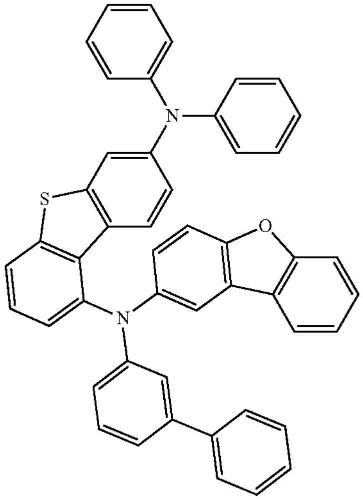
10-115
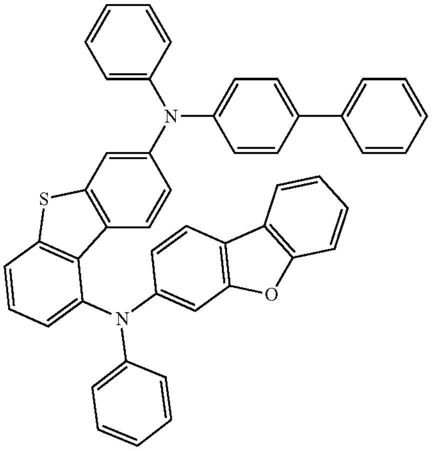
10-116
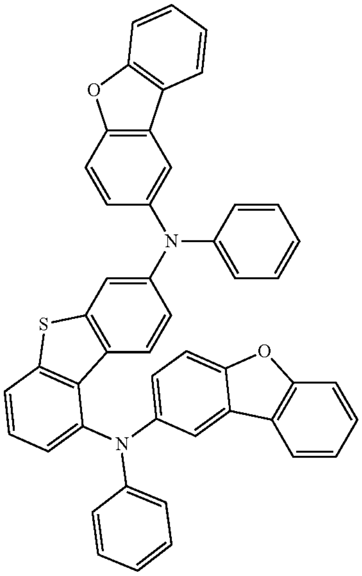

-continued
10-117
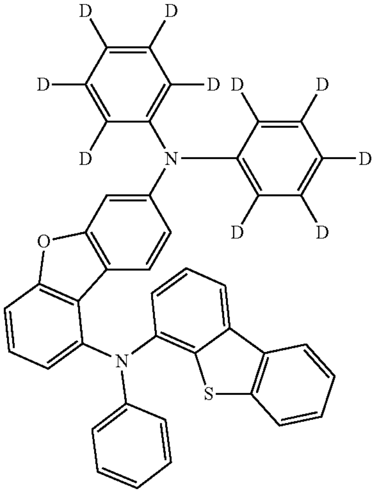
10-118
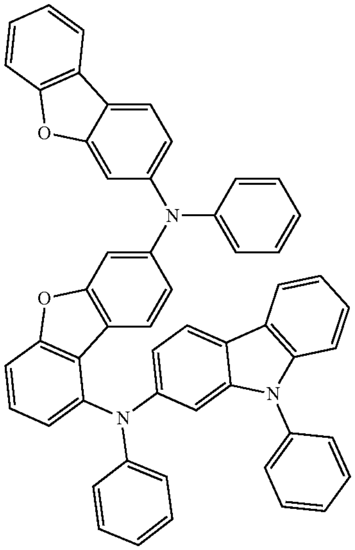
10-119
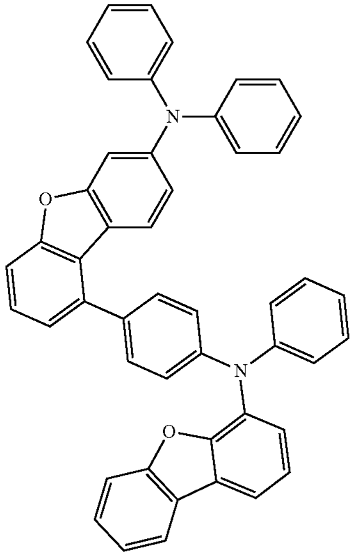
-continued
10-120
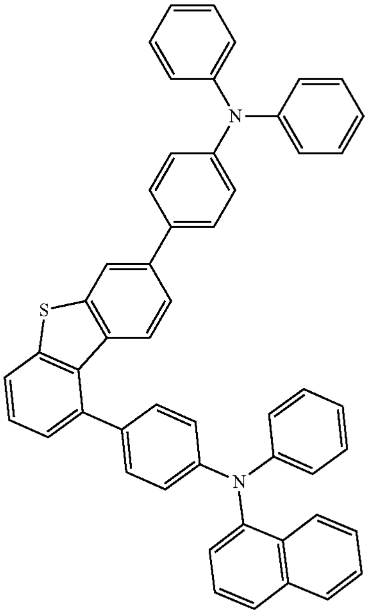
10-121
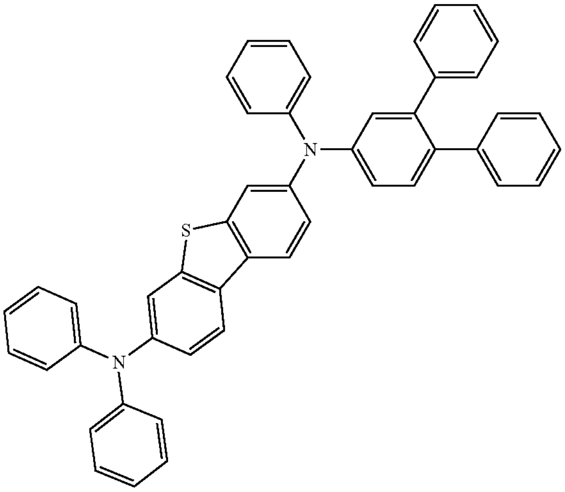

-continued
10-122
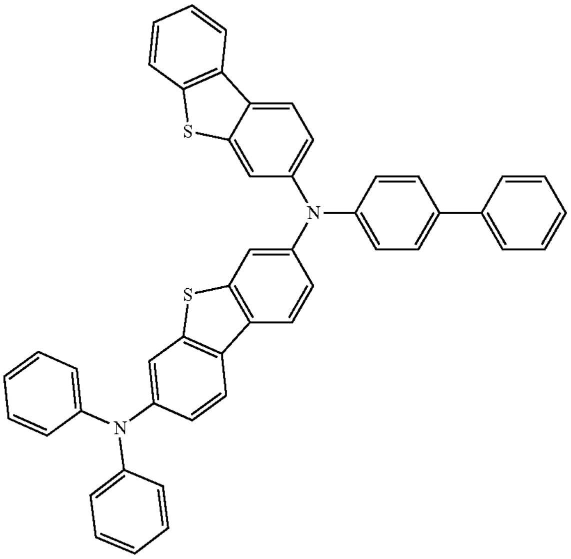
10-123
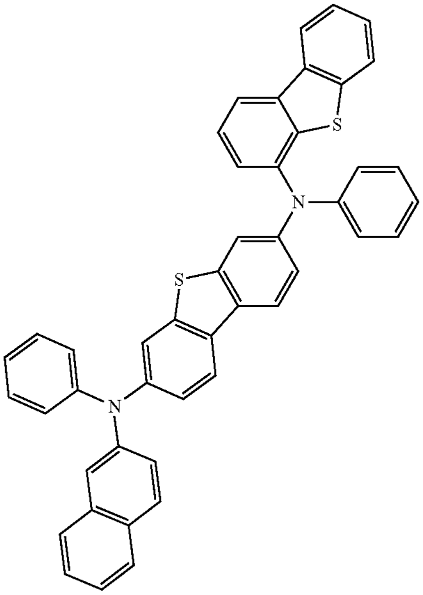
-continued
10-124
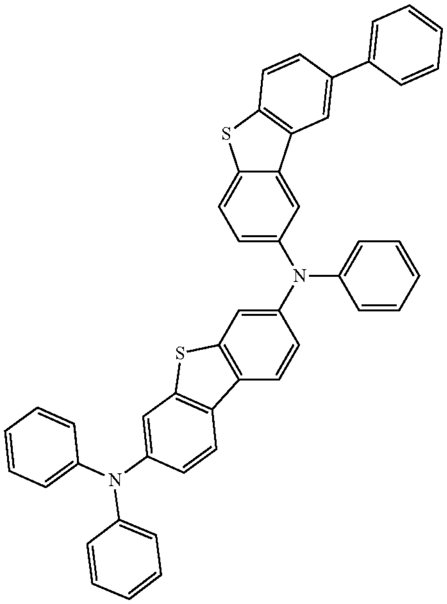
10-125
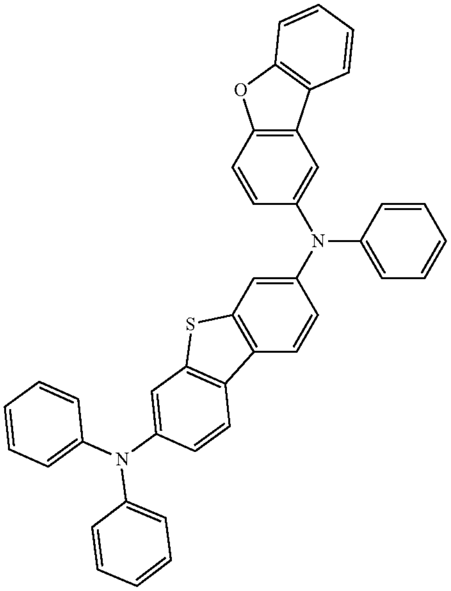

10-126
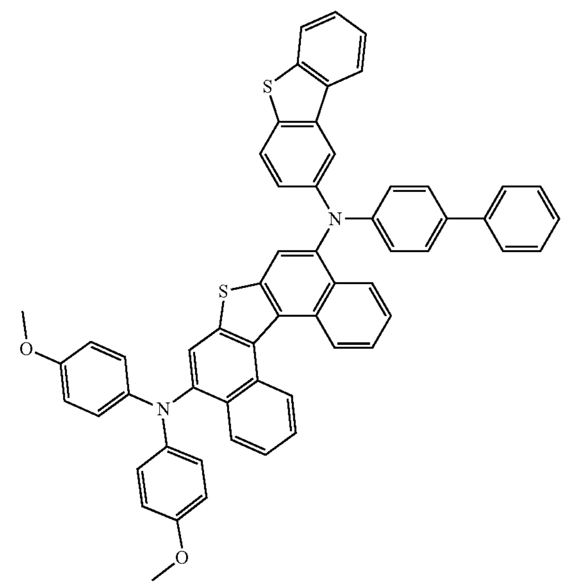
10-127
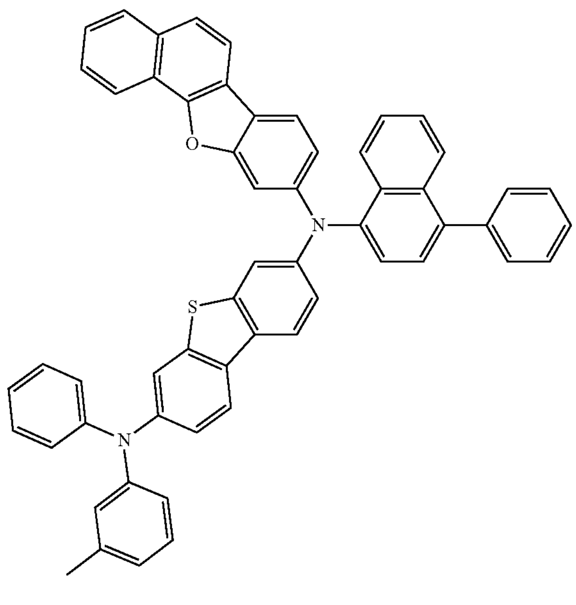
10-128
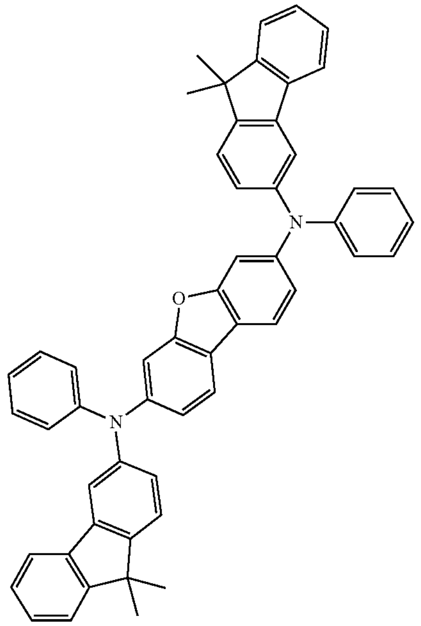
10-129
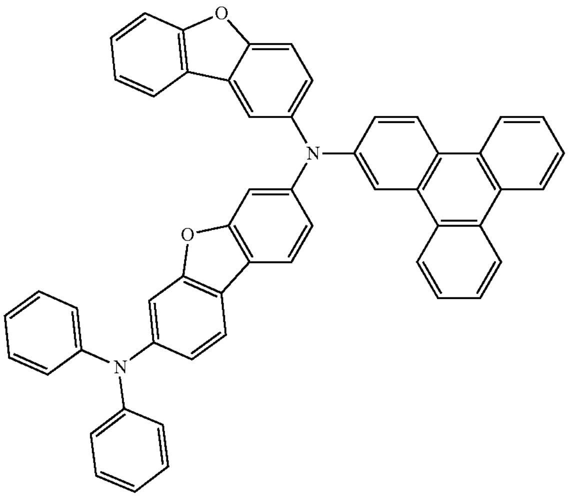

-continued
10-130
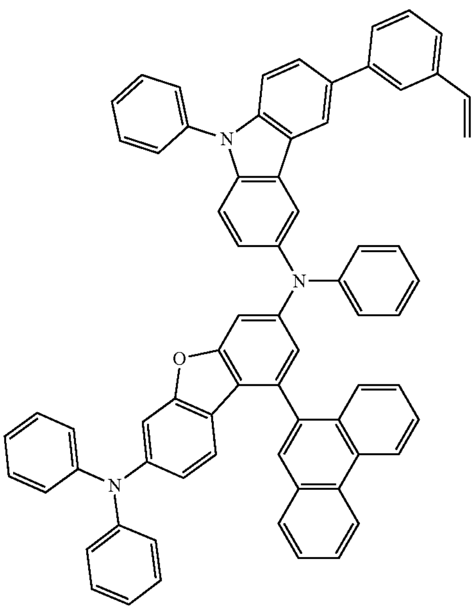
10-131
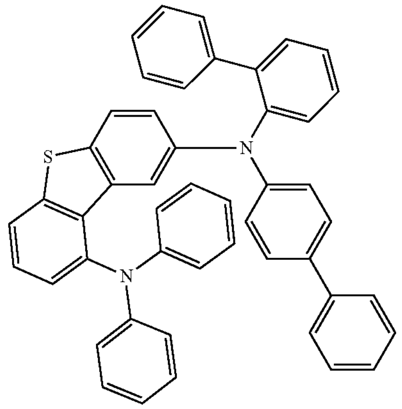
10-132
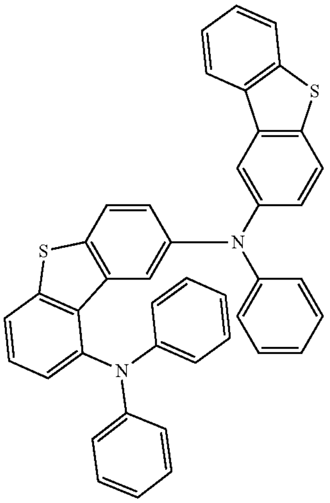
-continued
10-133
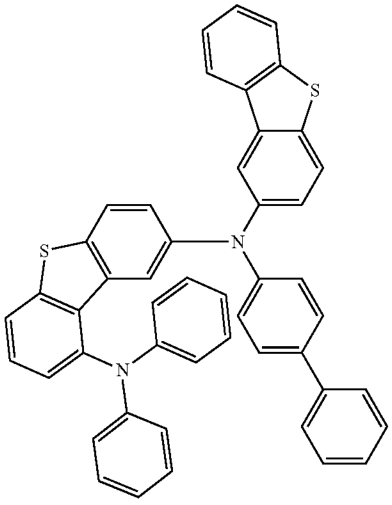
10-134
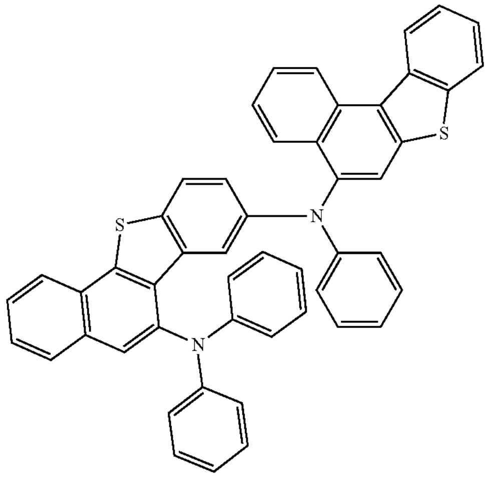
10-135
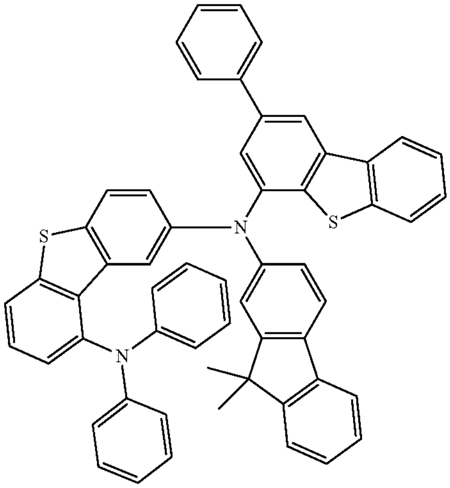

-continued
10-136
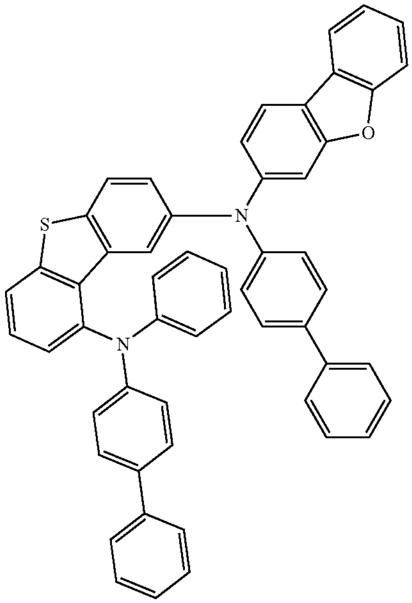
10-137
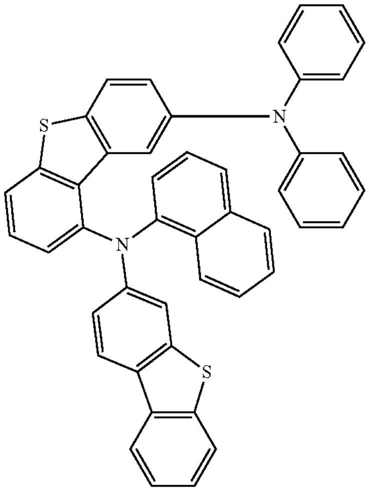
10-138
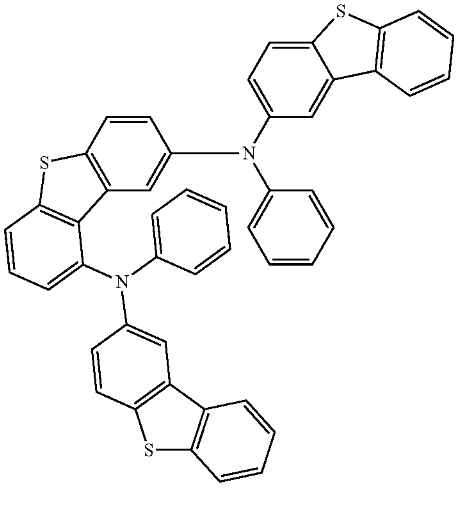
-continued
10-139
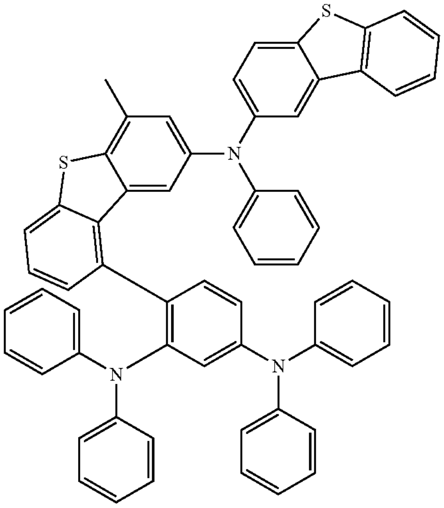
10-140
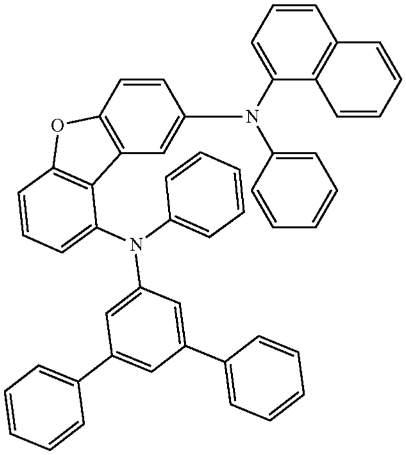
10-141
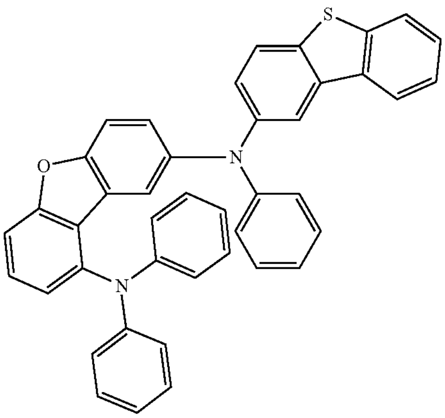

-continued
10-142
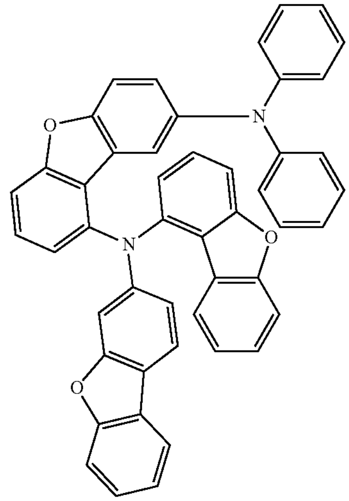
10-143
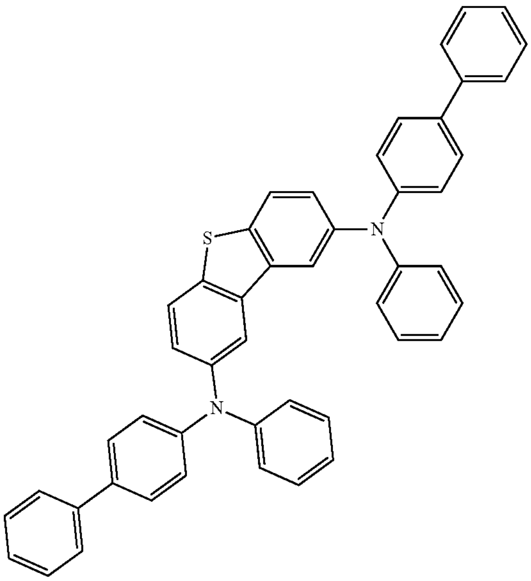
10-144
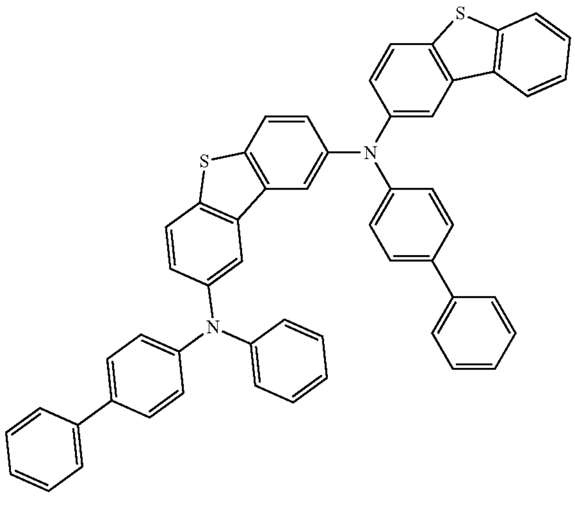
-continued
10-145
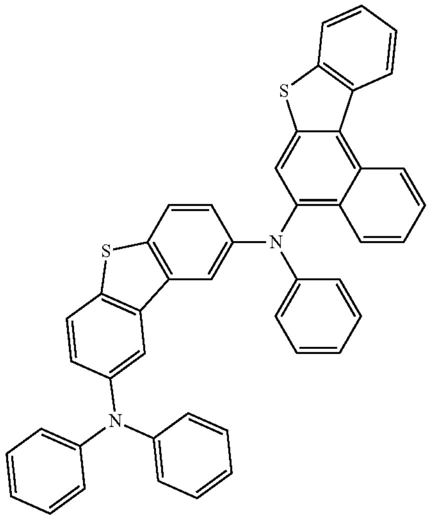
10-146
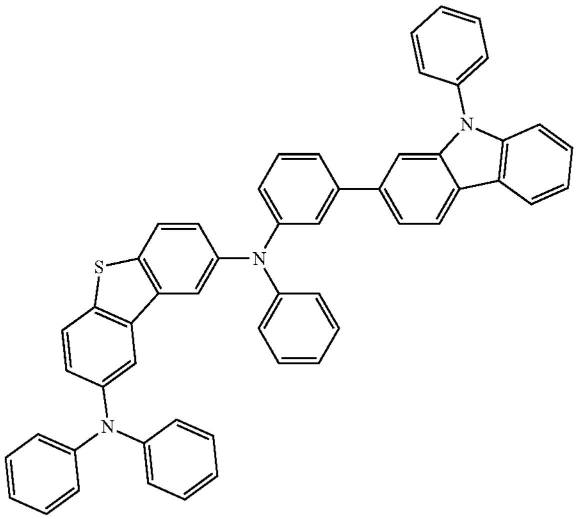
10-147
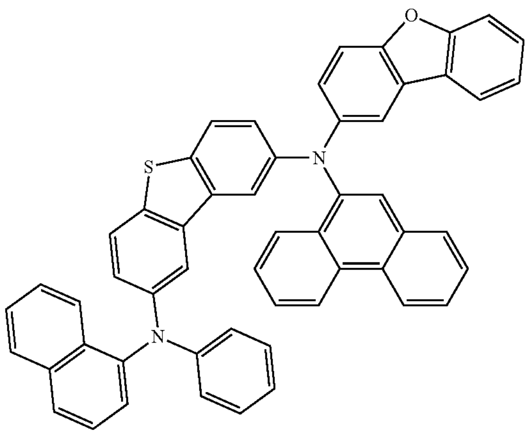

-continued
10-148
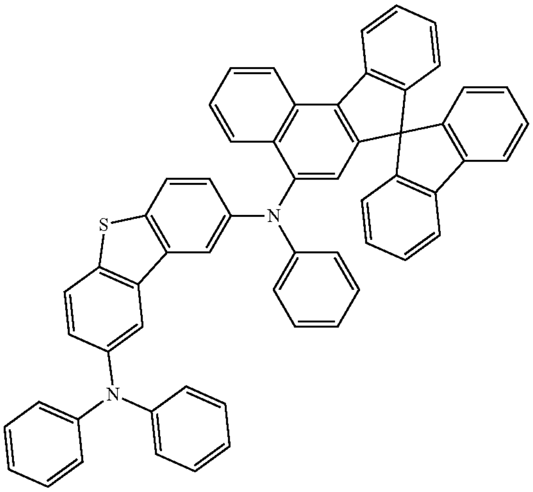
10-149
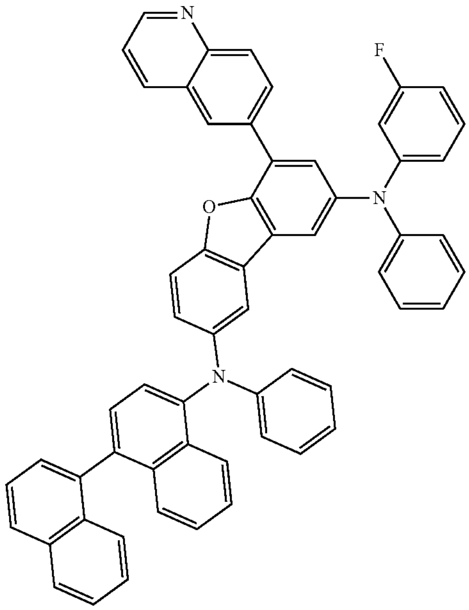
-continued
10-150
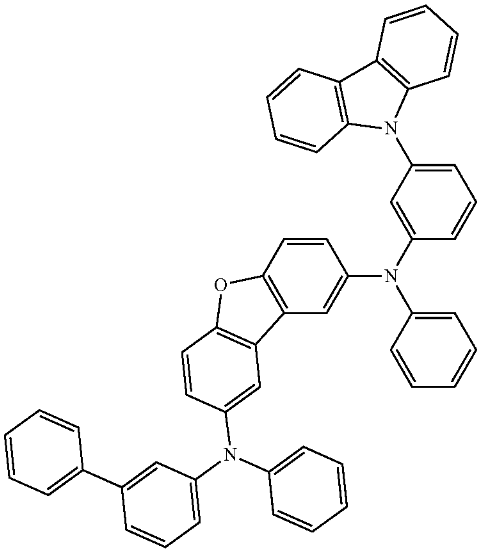
10-151
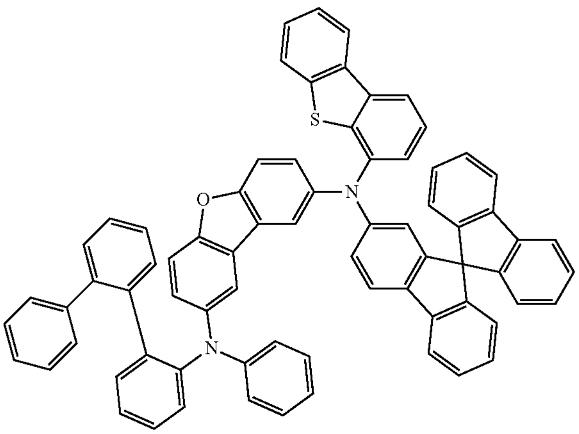
10-152
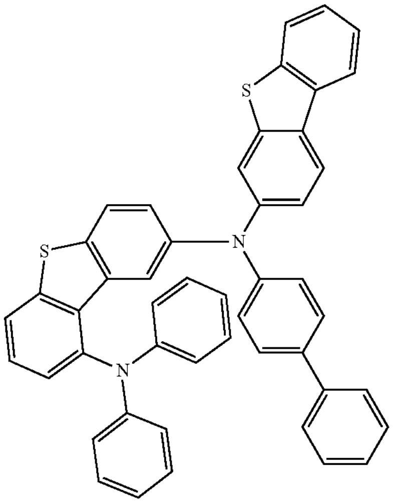

-continued
10-153
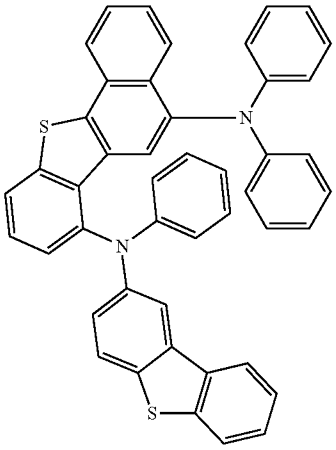
10-154
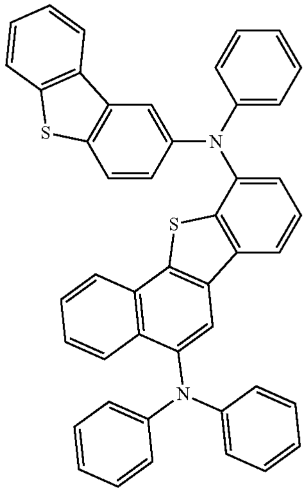
10-155
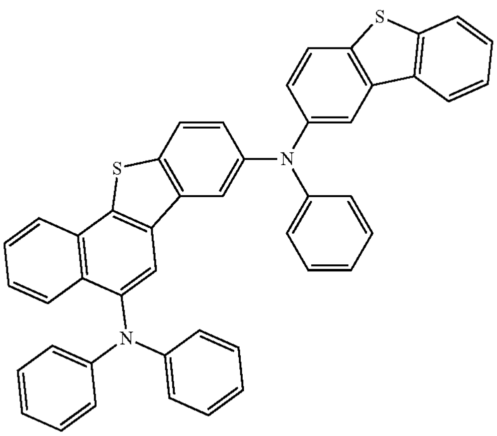
-continued
10-156
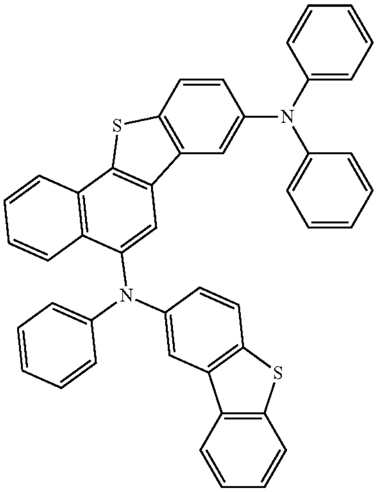
10-157
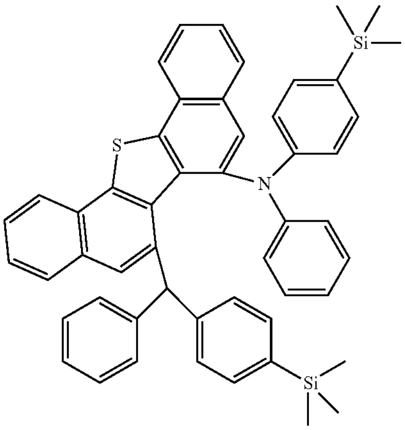
10-158
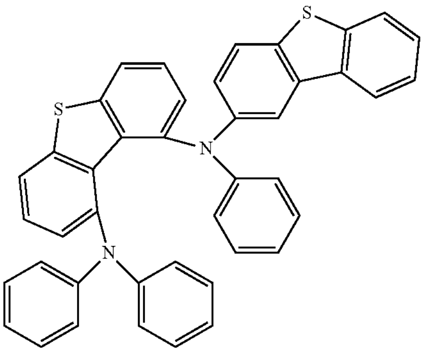
10-159
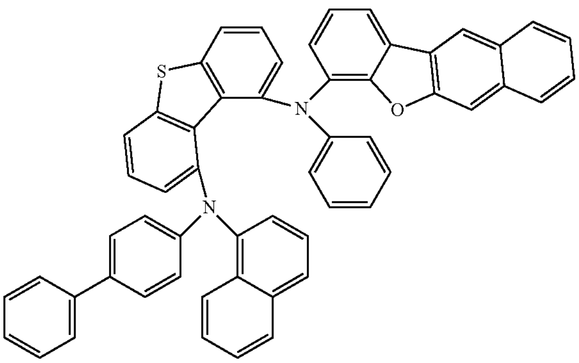

-continued
10-160
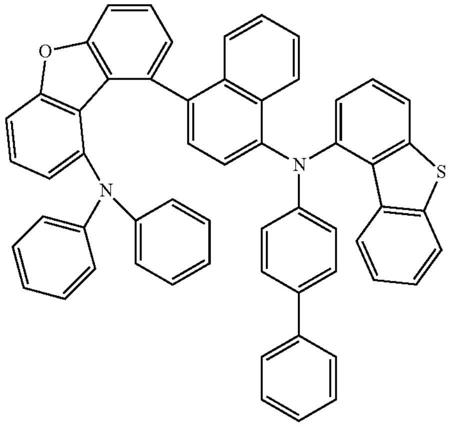
10-161
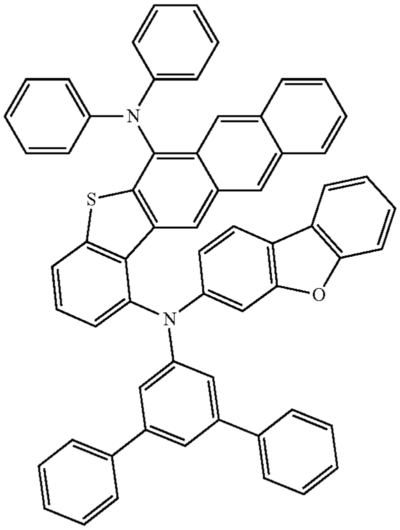
10-162
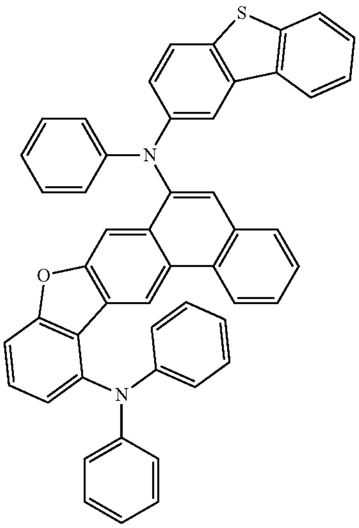
-continued
10-163
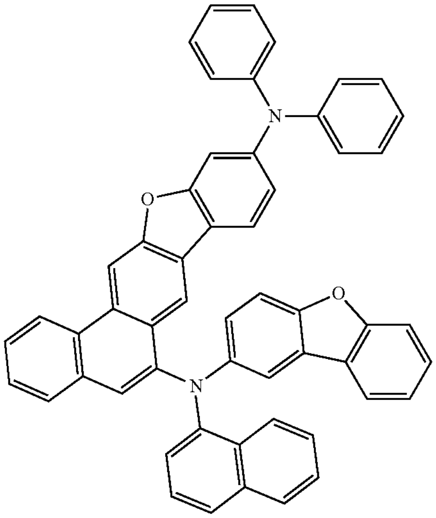
10-164
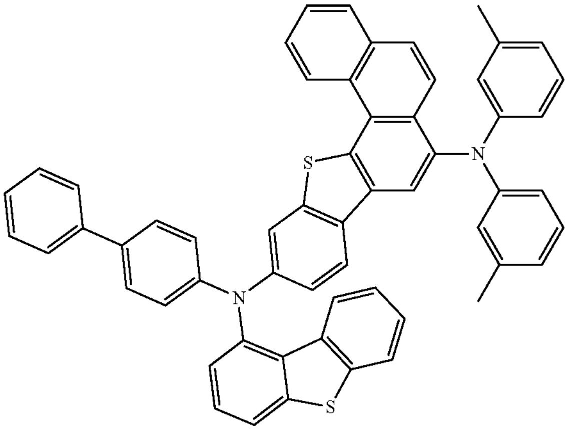
10-165
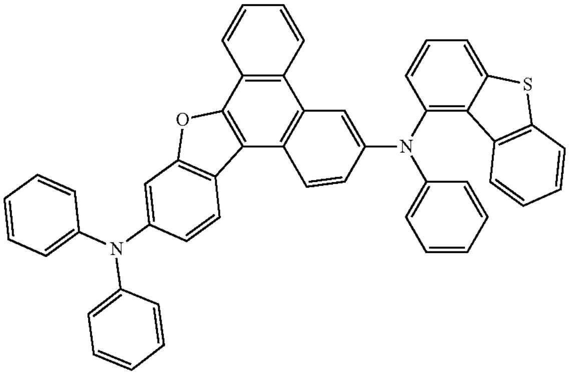

-continued
10-166
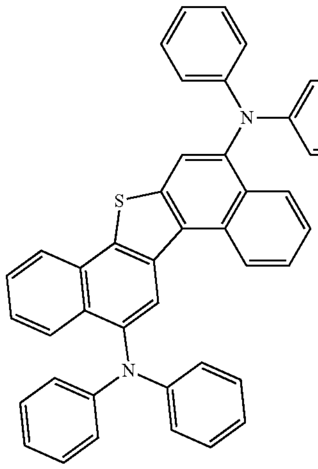
10-167
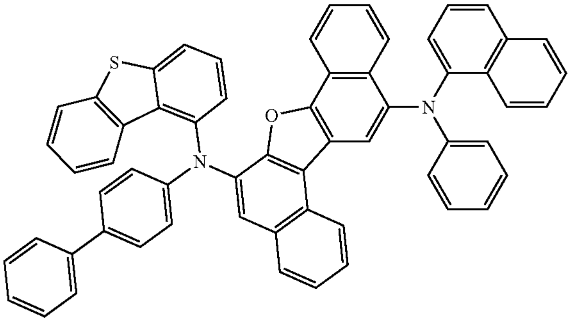
10-168
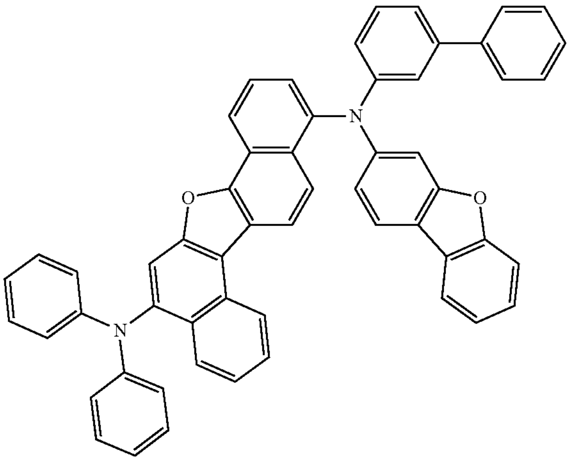
-continued
10-169
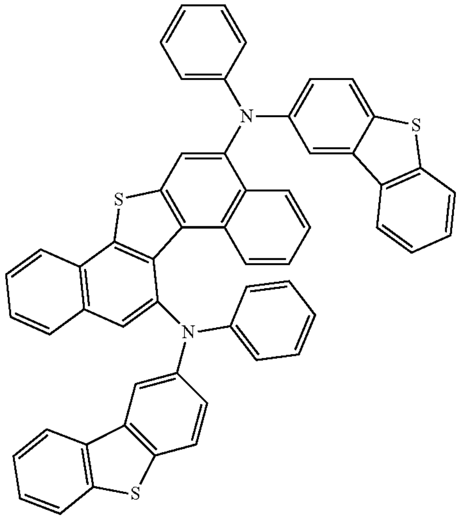
10-170
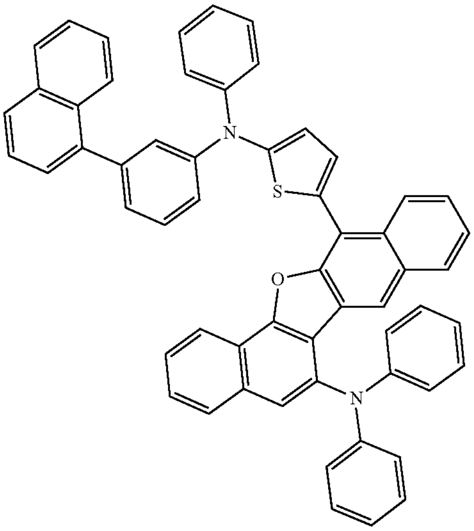
10-171
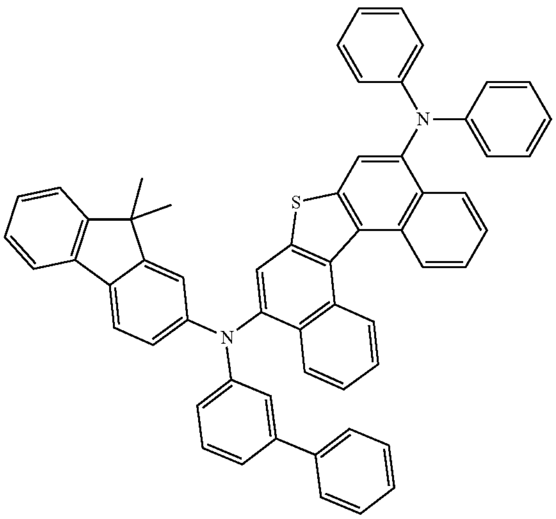

-continued
10-172
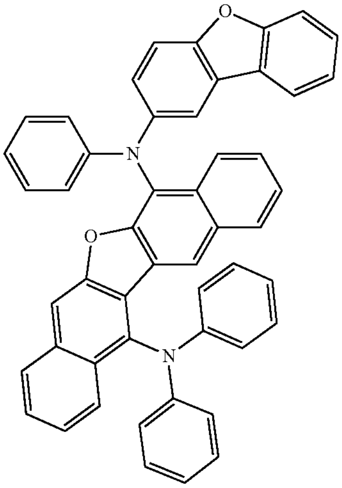
10-173
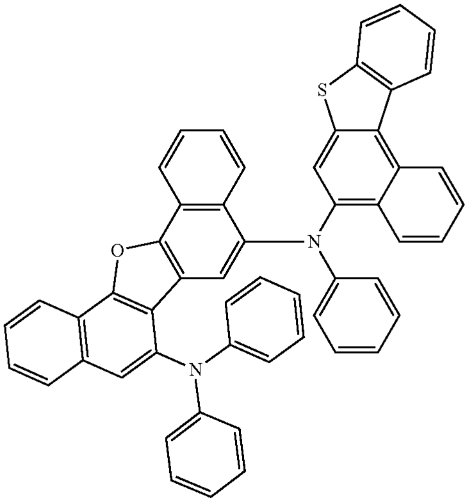
10-174
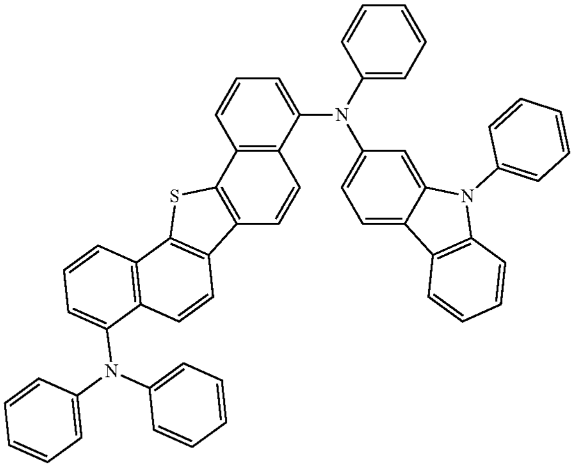
-continued
10-175
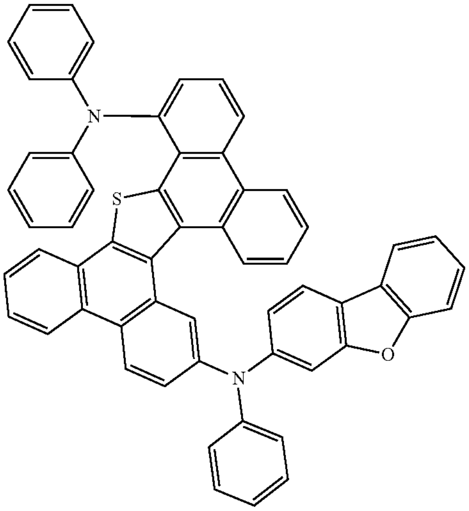
10-176
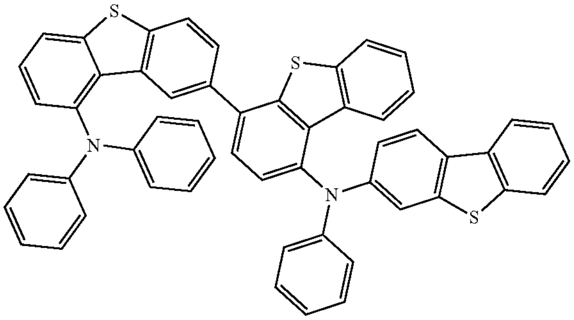
10-177
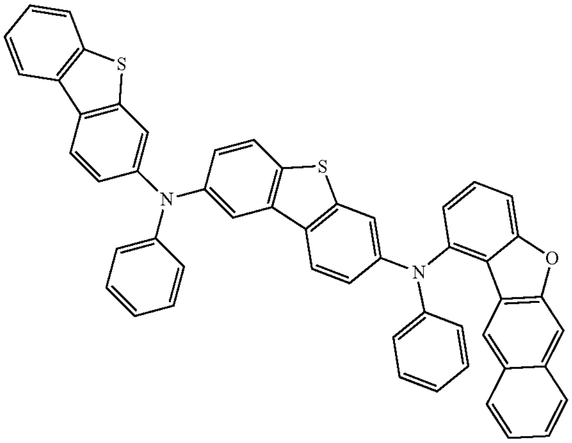

10-178
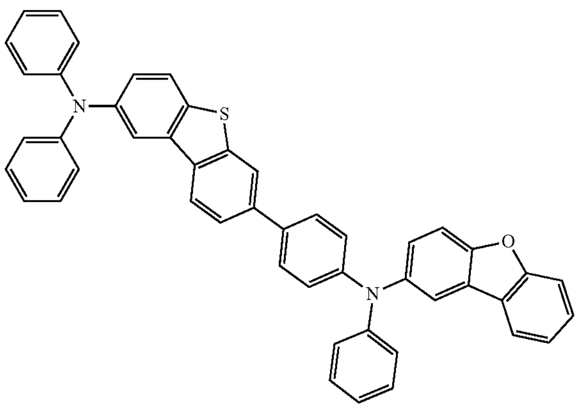
10-179
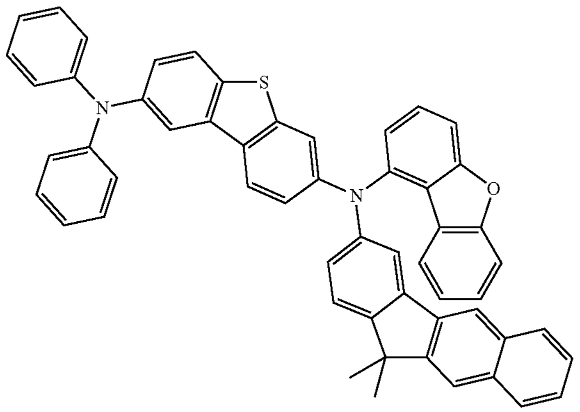
10-180
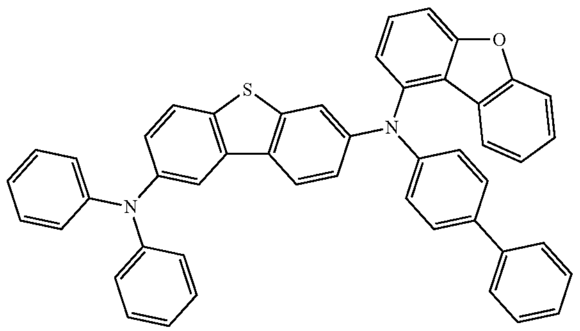
10-181
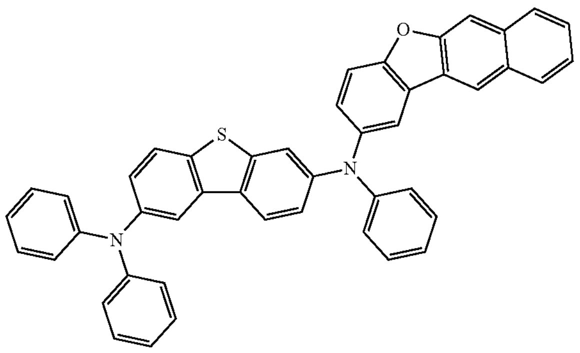
10-182
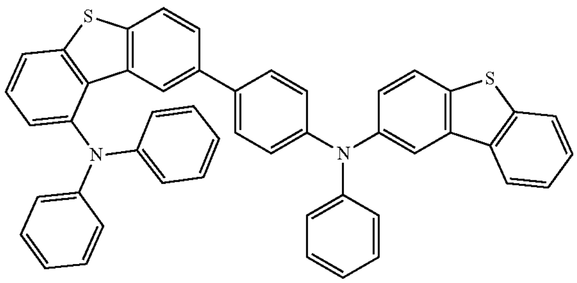
10-183
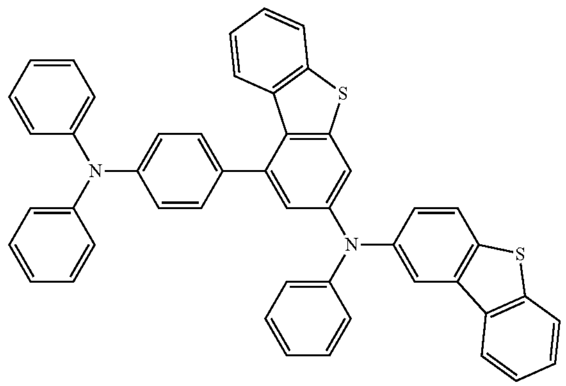
10-184
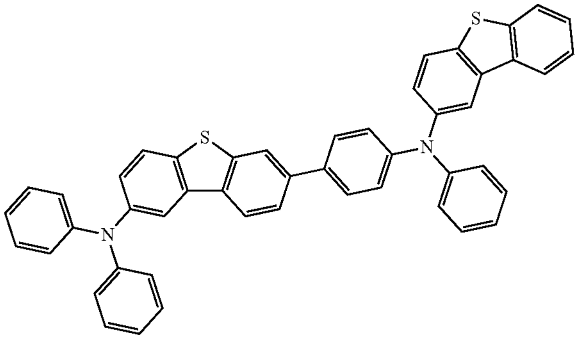
10-185
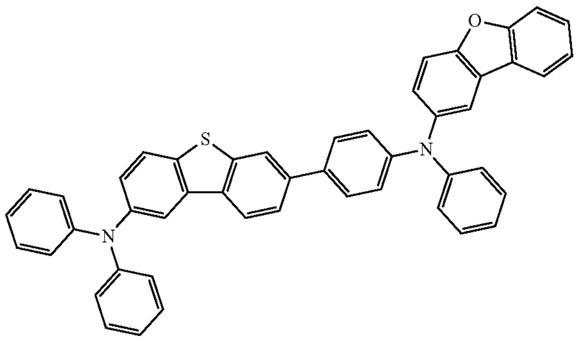

-continued
10-186
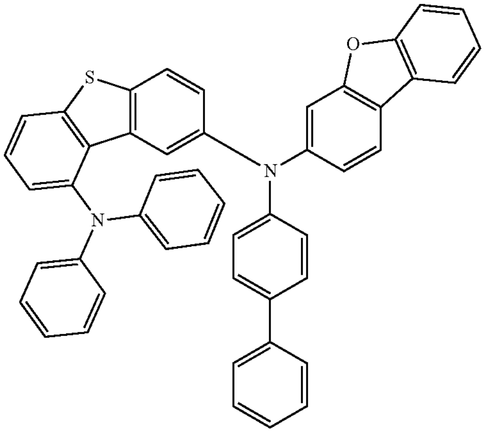
10-187
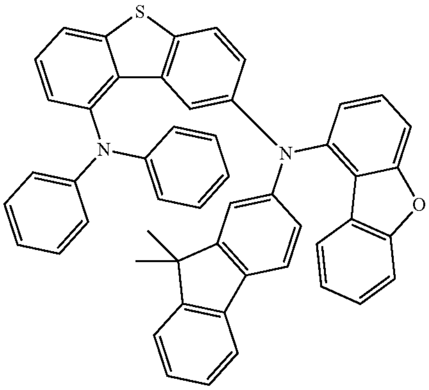
10-188
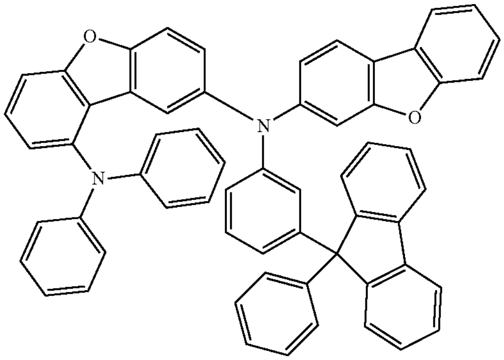
10-189
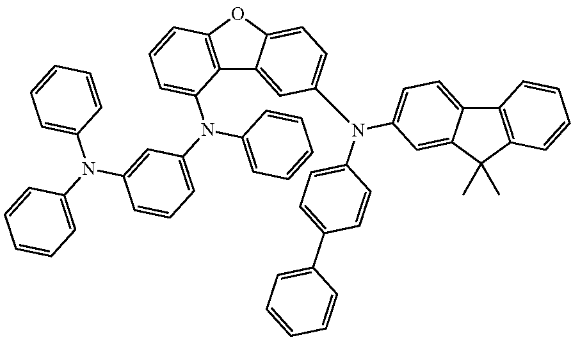
-continued
11-1
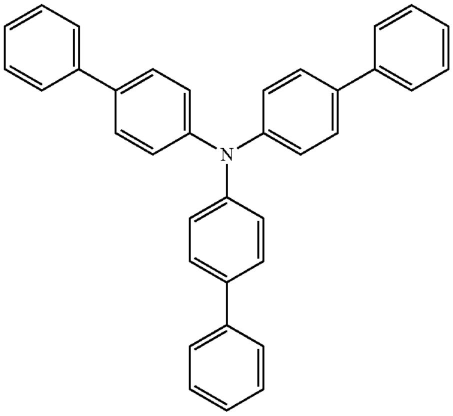
11-2
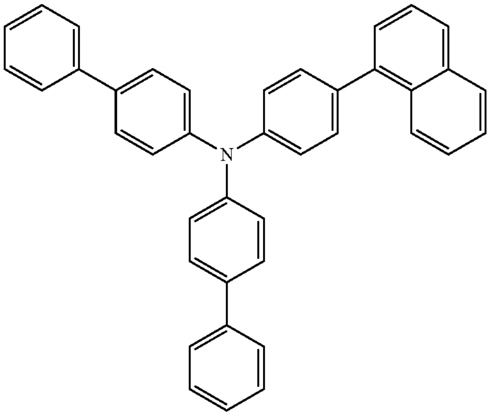
11-3
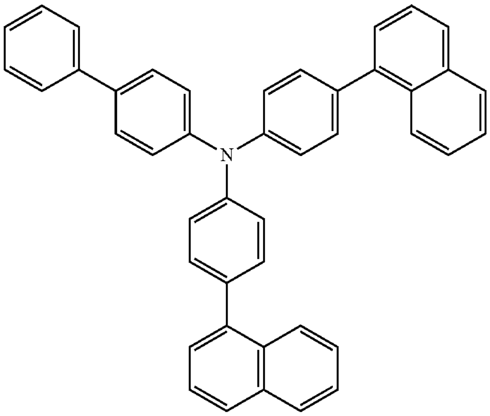

-continued
11-4
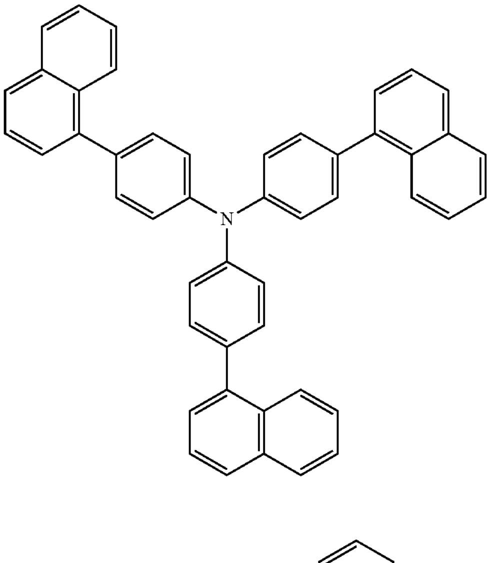
11-5
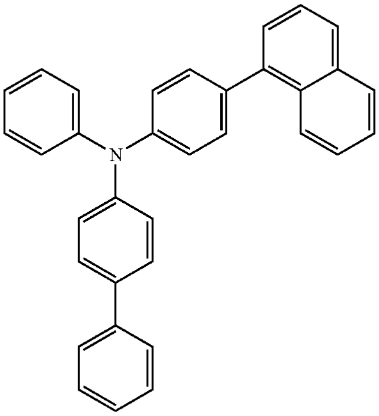
11-6
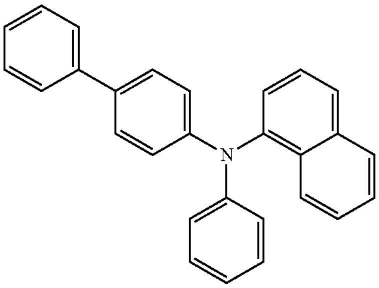
11-7
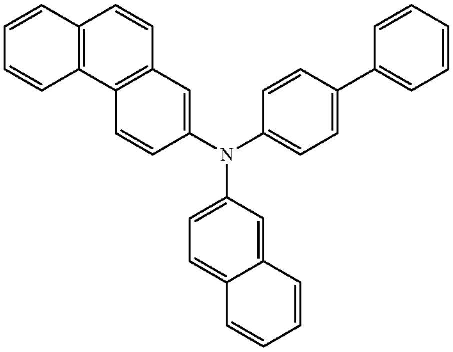
-continued
11-8
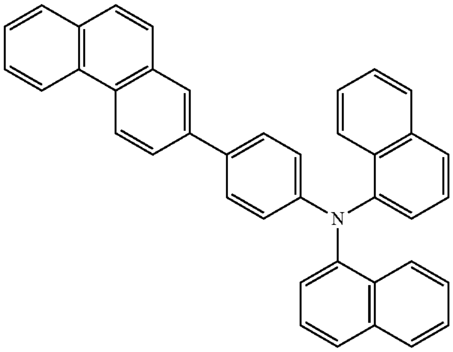
11-9
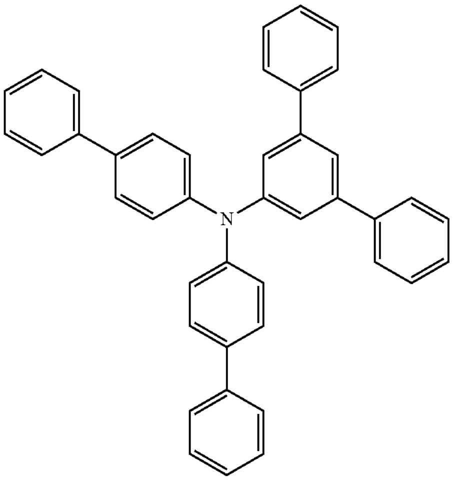
11-10
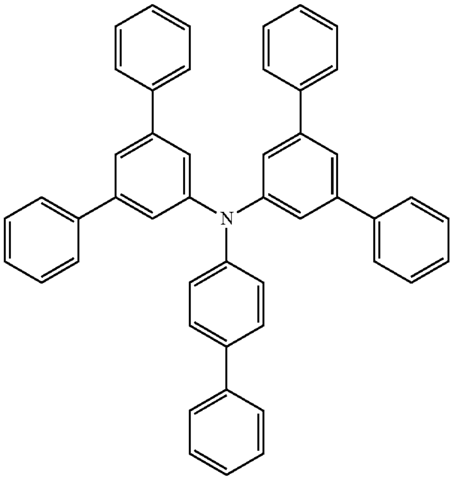

-continued
11-11
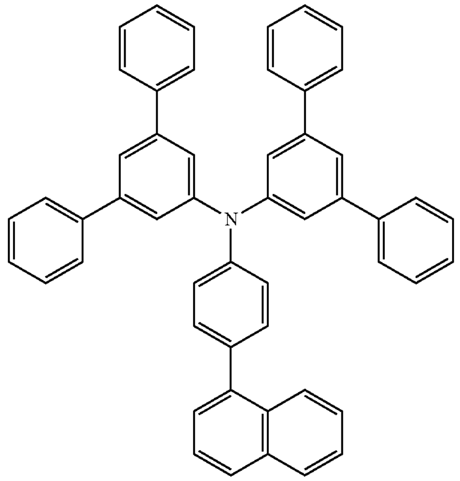
11-12
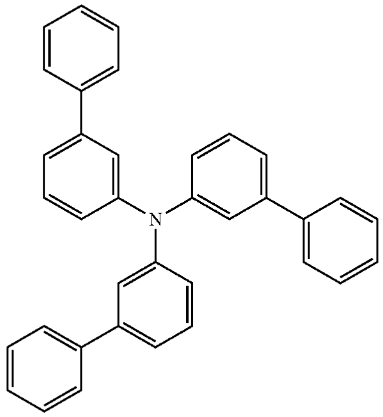
11-13
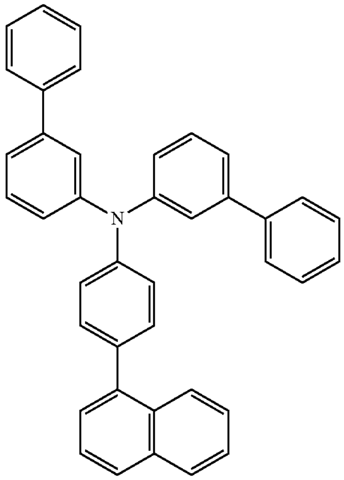
-continued
11-14
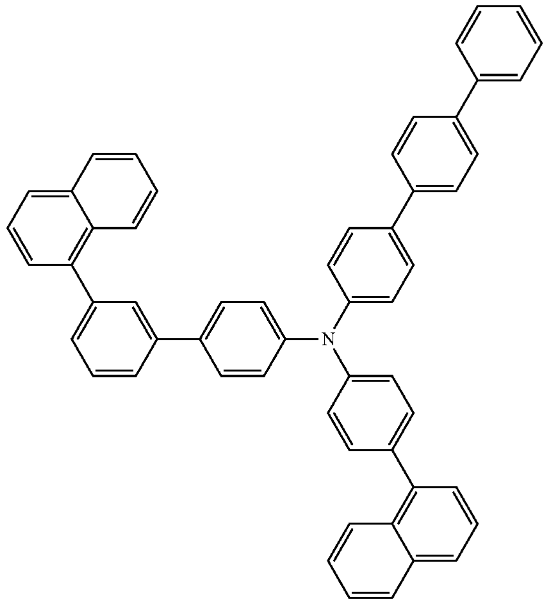
11-15
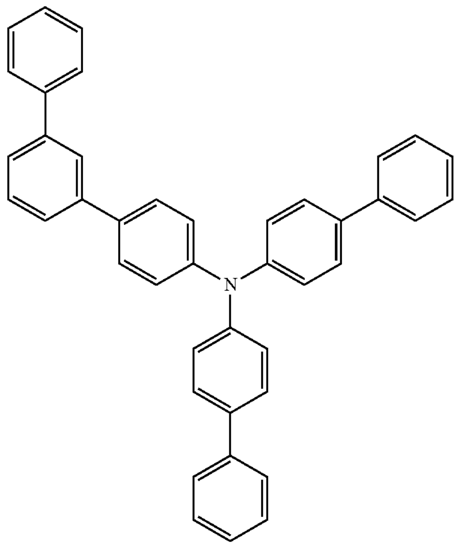

-continued
11-16
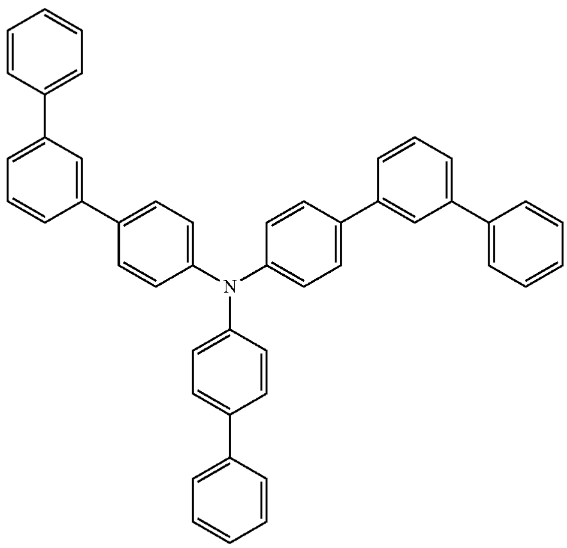
11-17
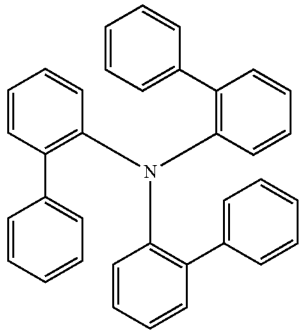
11-18
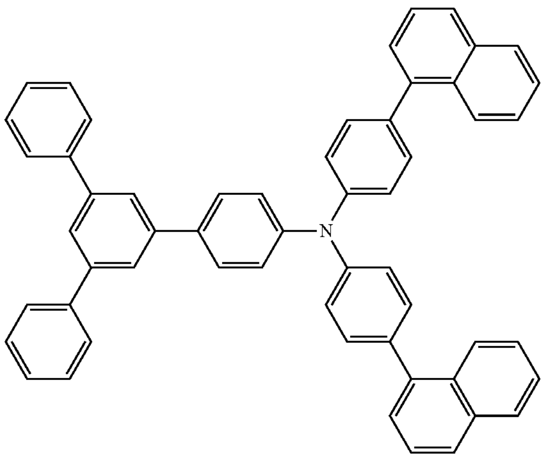
-continued
11-19
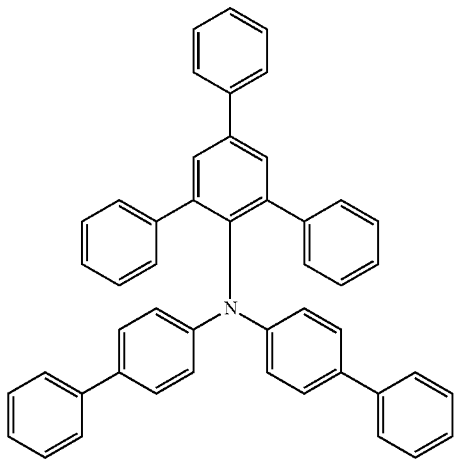
11-20
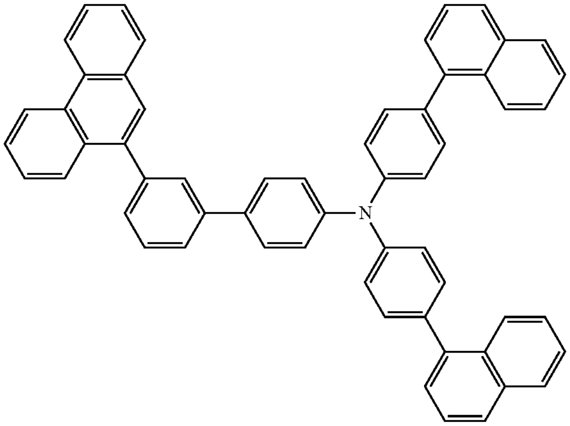
11-21
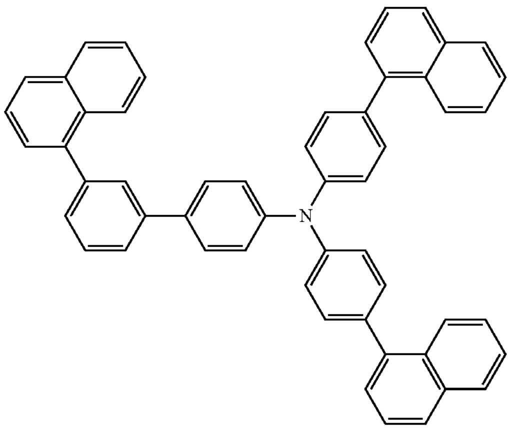

-continued
11-22
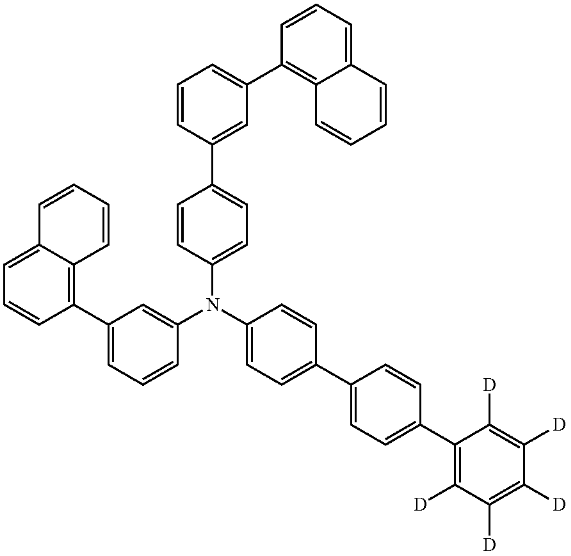
11-23
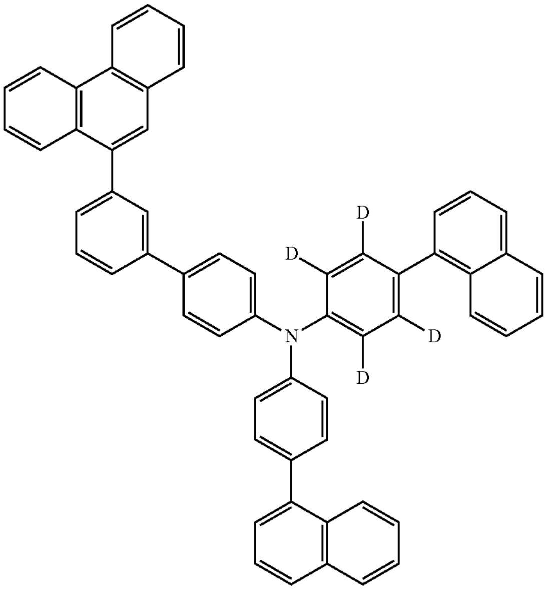
-continued
12-1
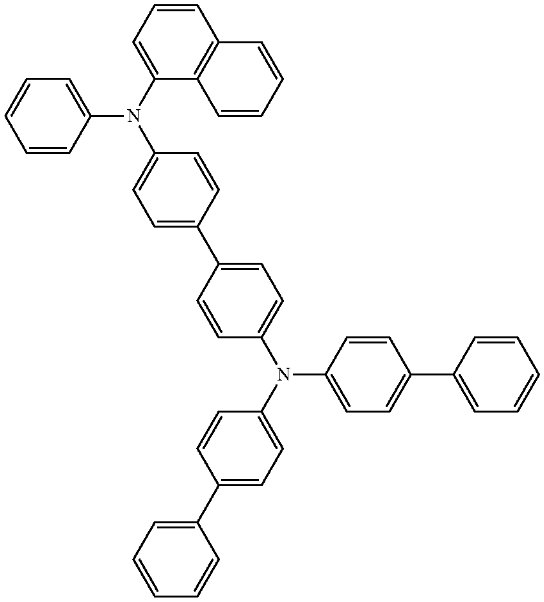
12-2
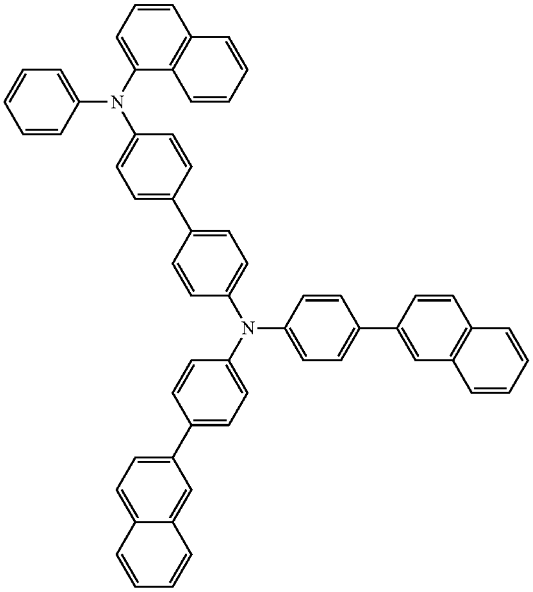

-continued
12-3
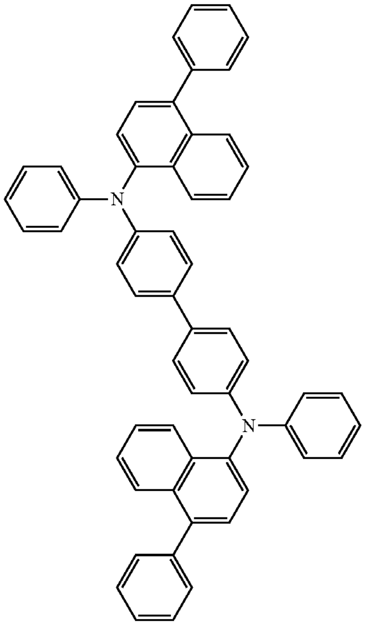
12-4
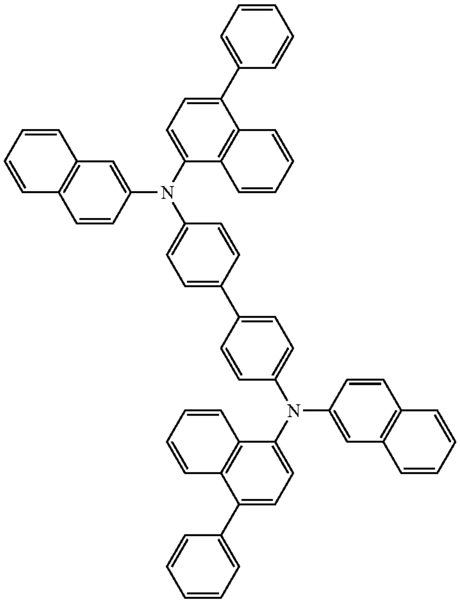
-continued
12-5
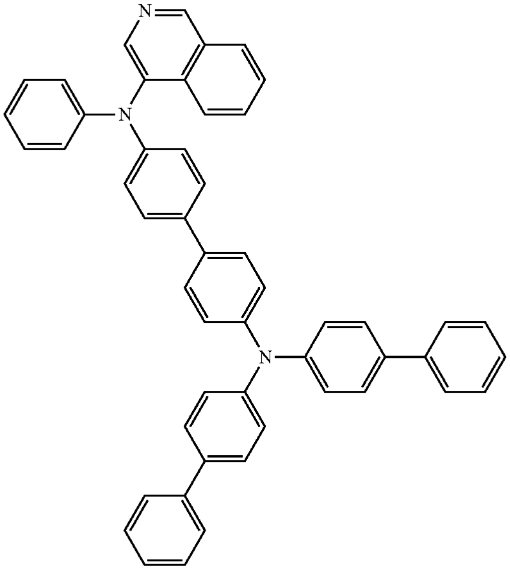
12-6
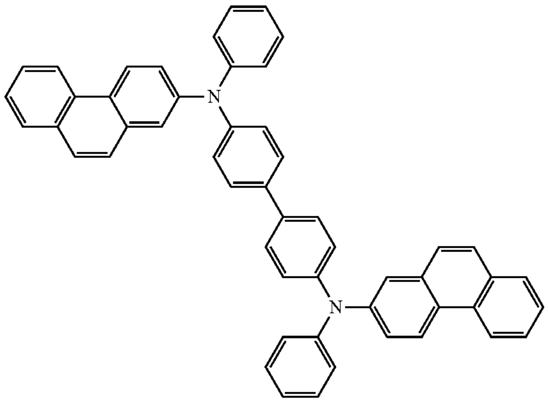
12-7
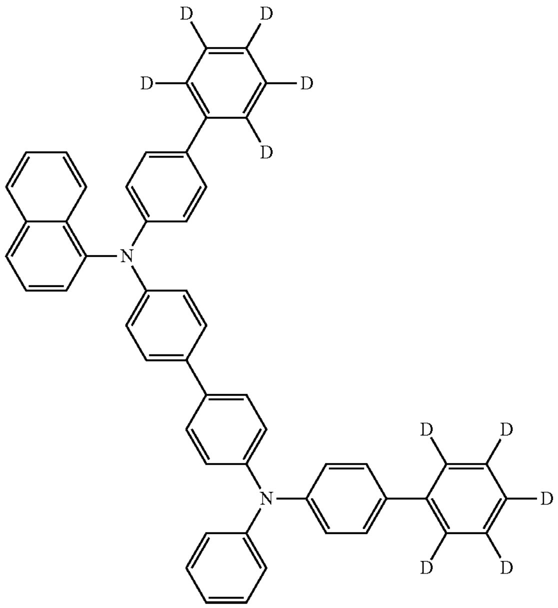

-continued
12-8
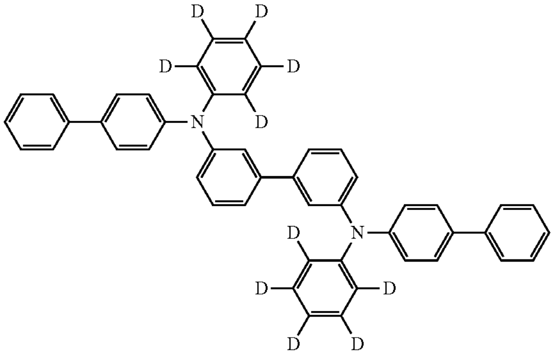
12-9
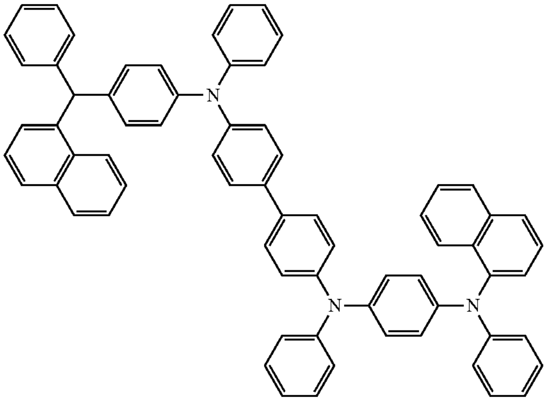
12-10
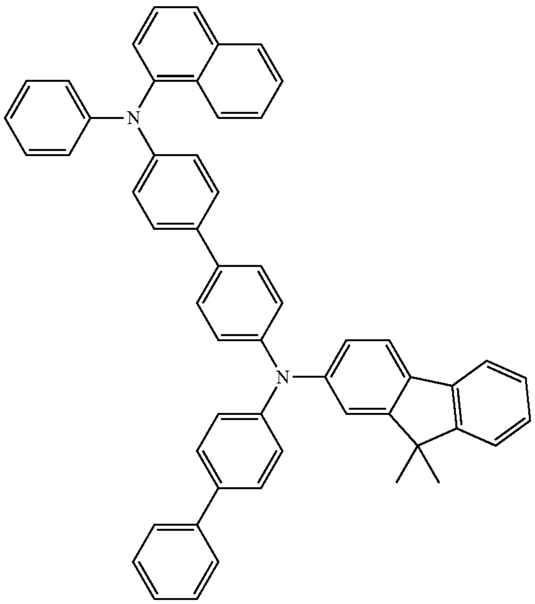
-continued
12-11
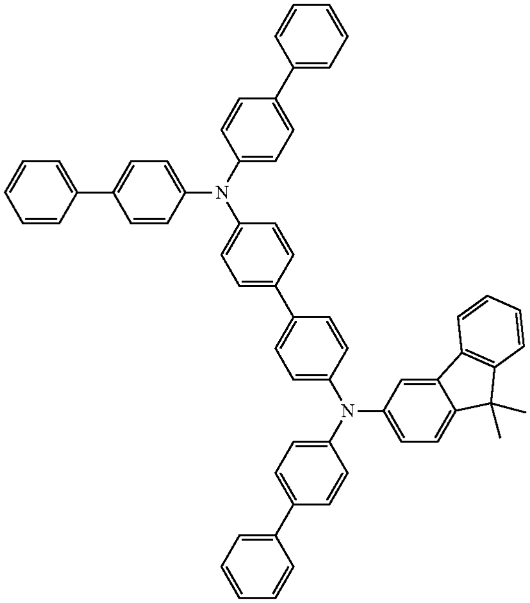
12-12
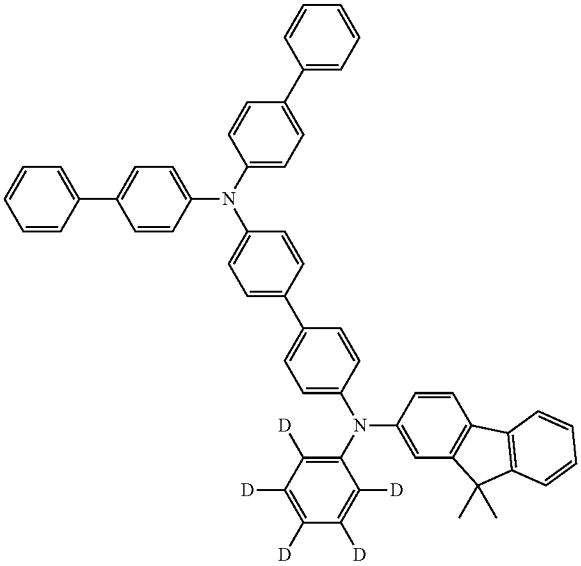

-continued
12-13
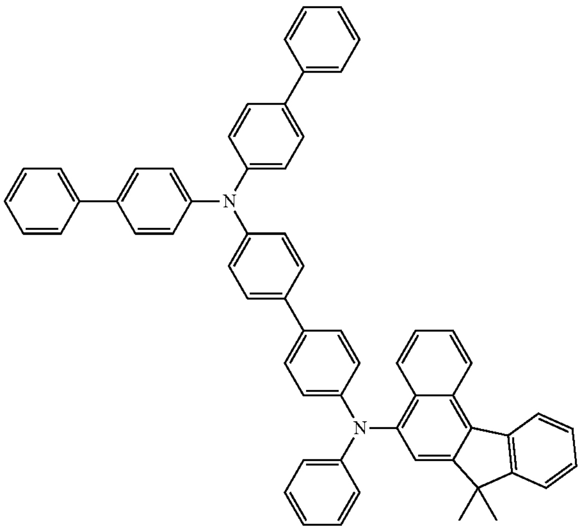
12-14
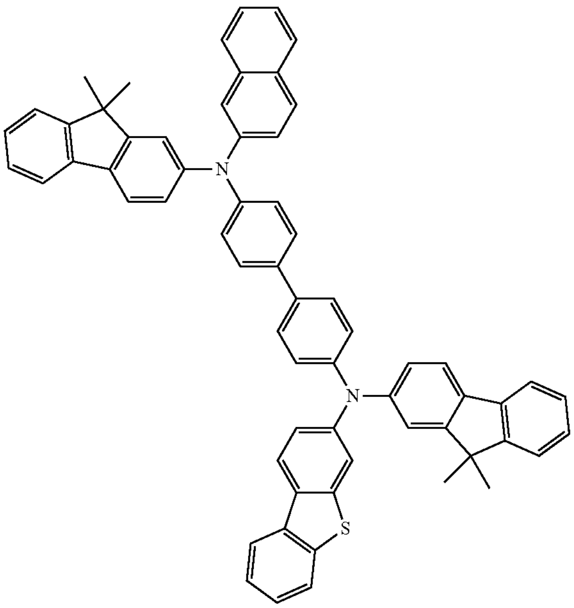
-continued
12-15
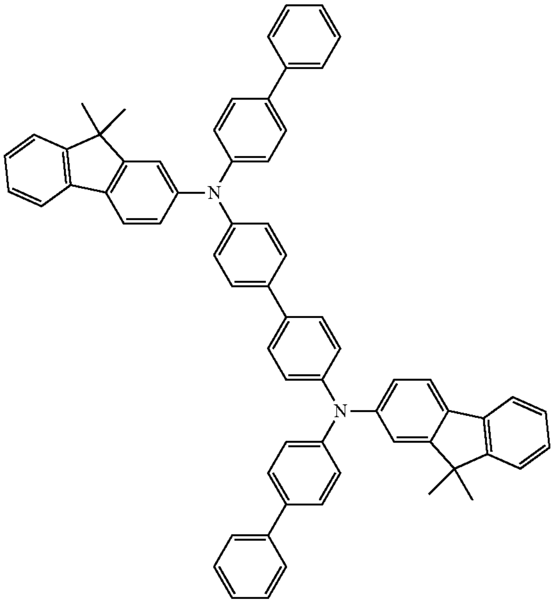
12-16
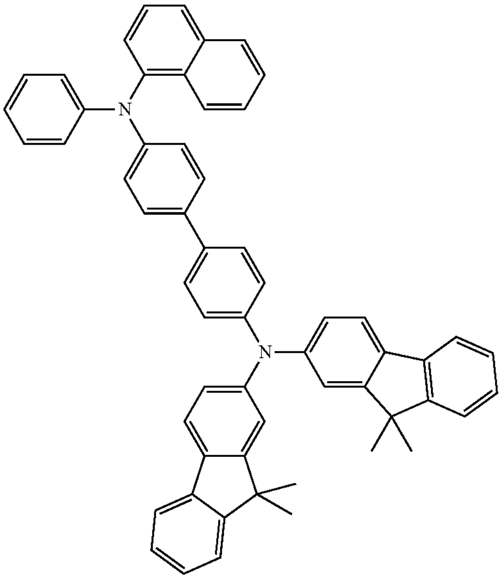

-continued
12-17
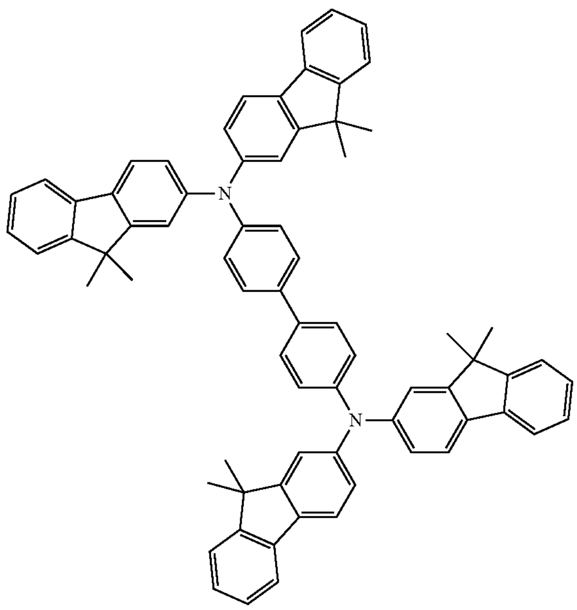
12-18
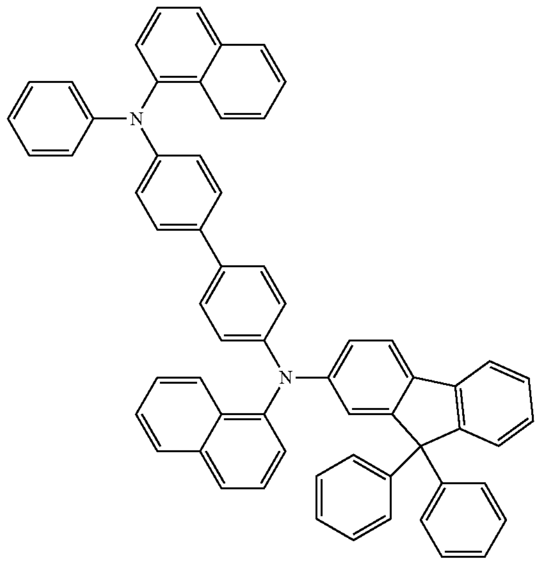
-continued
12-19
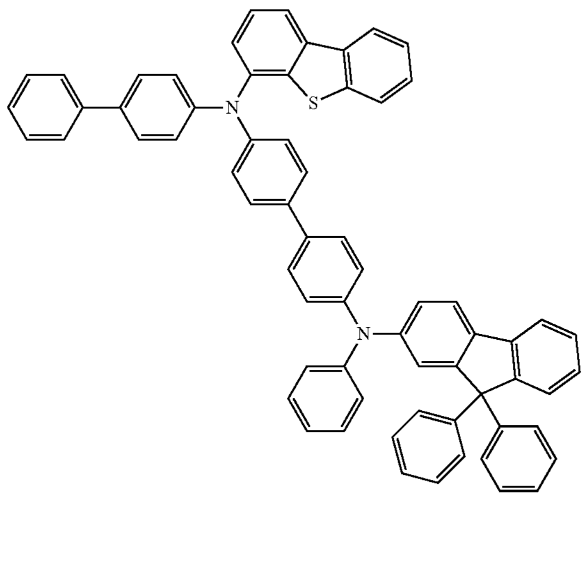
12-20
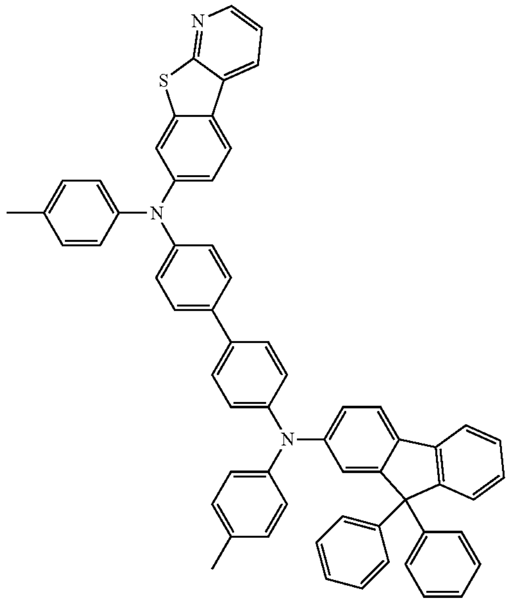

-continued
12-21
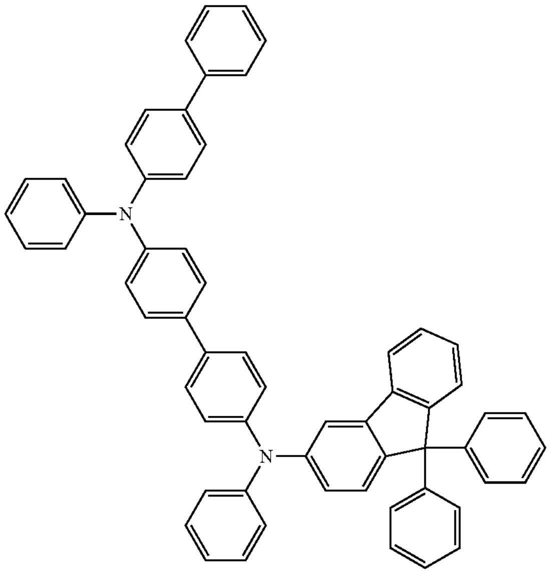
12-22
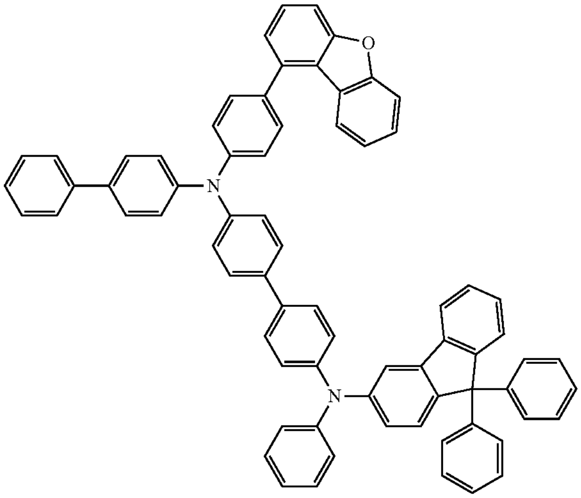
12-23
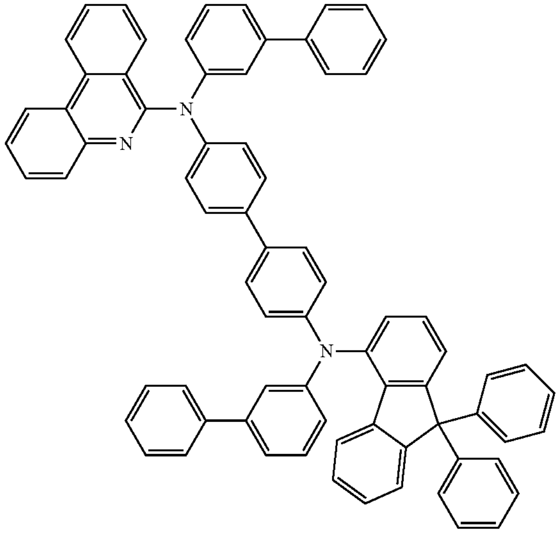
-continued
12-24
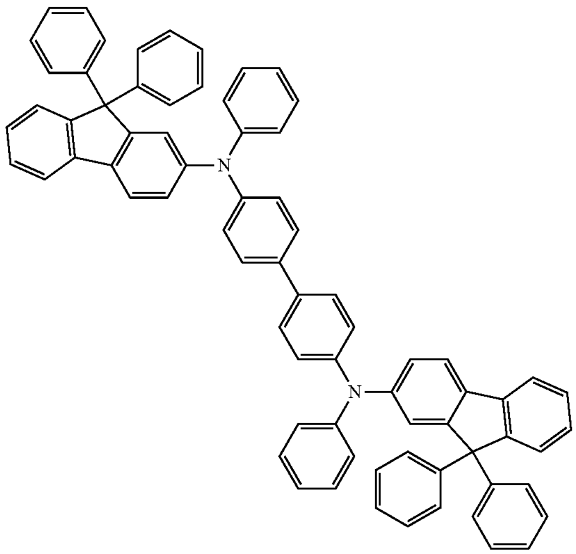
12-21
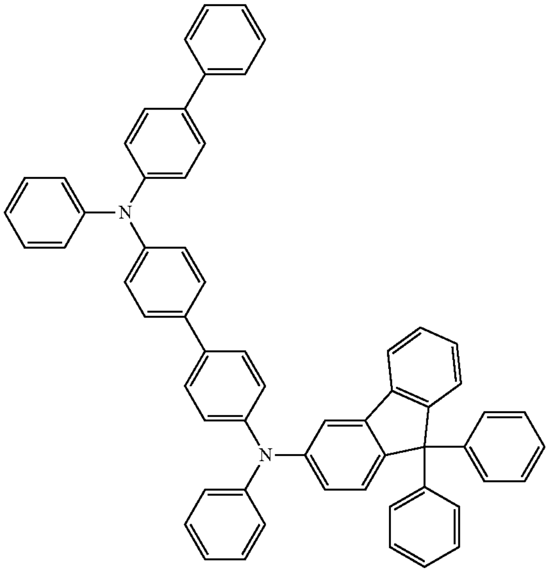

-continued
12-22
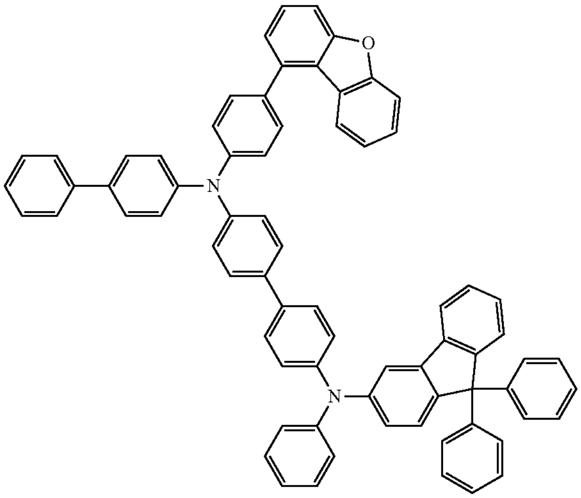
12-23
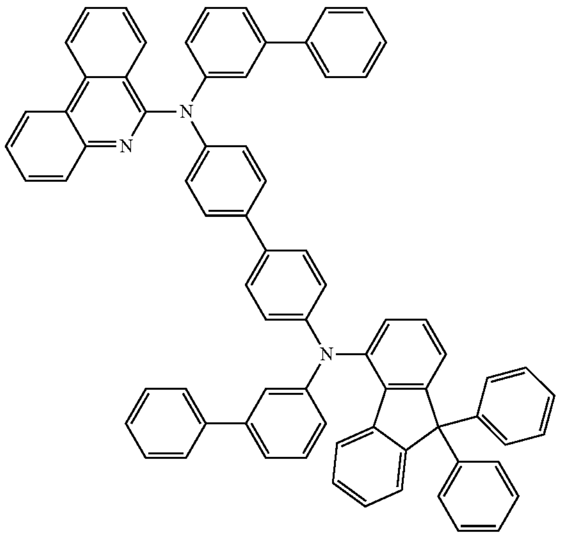
12-24
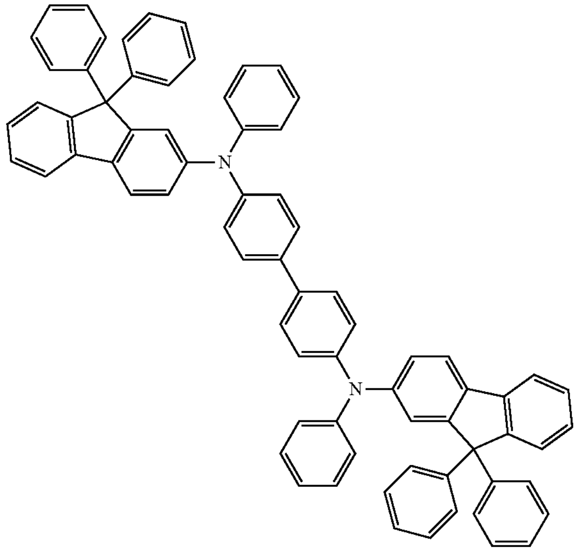
-continued
12-25
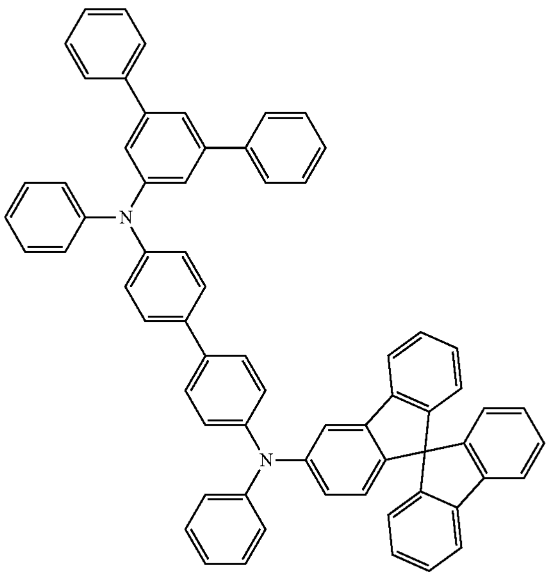
12-26
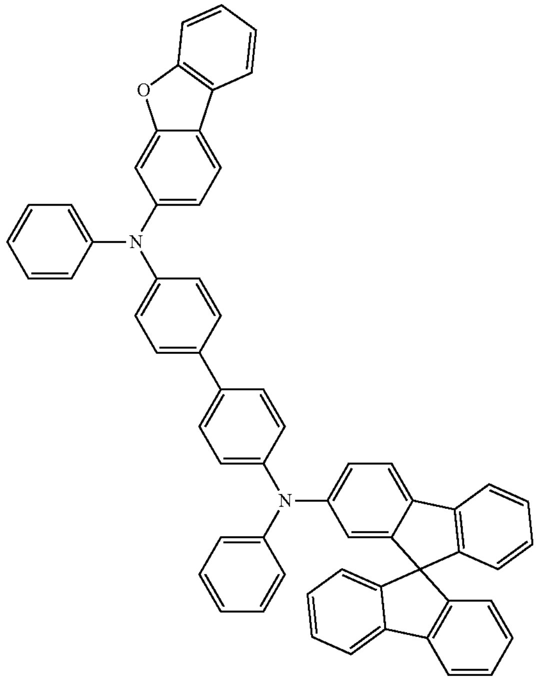

-continued
12-27
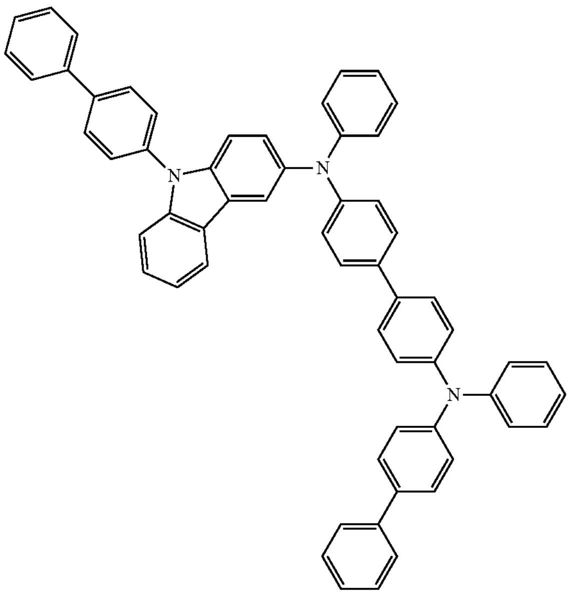
12-28
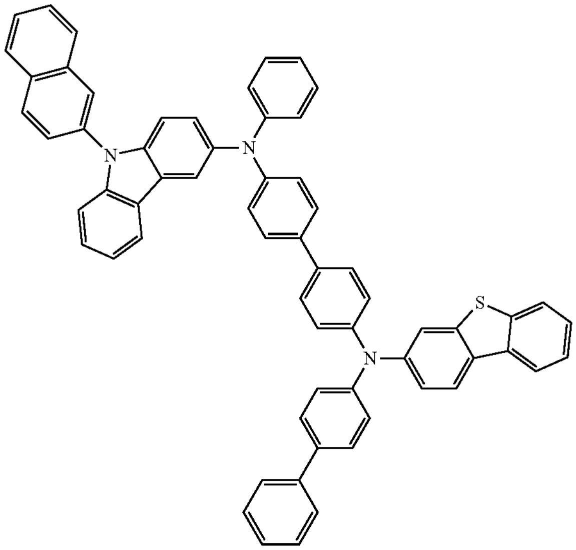
-continued
12-29
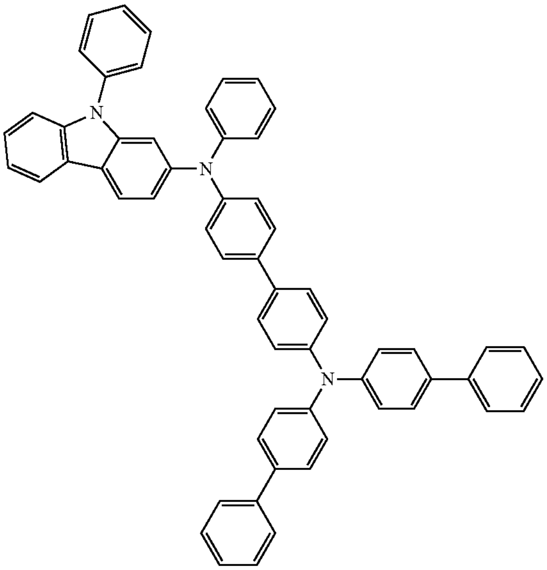
12-30
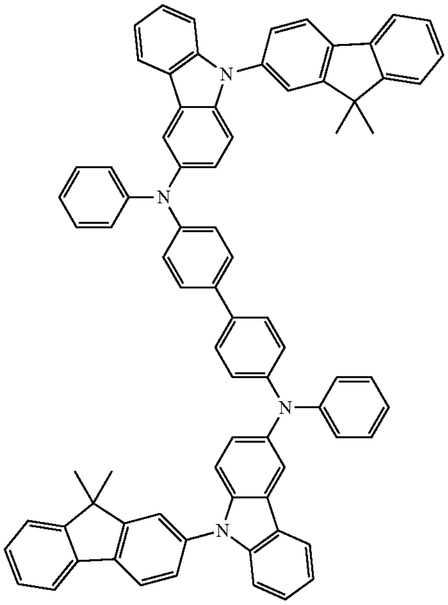

-continued
12-31
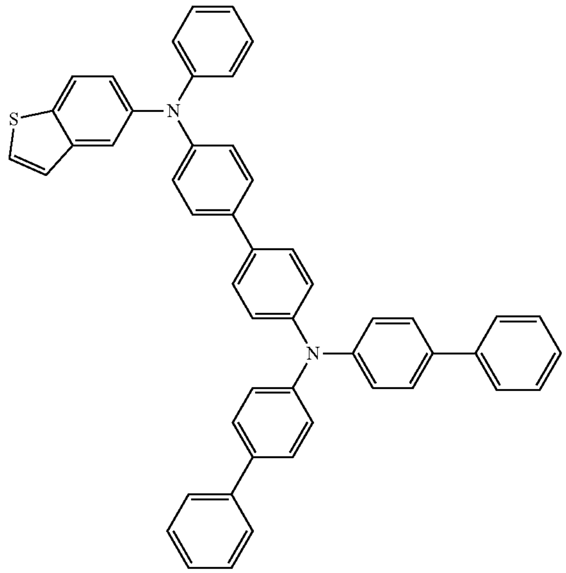
12-32
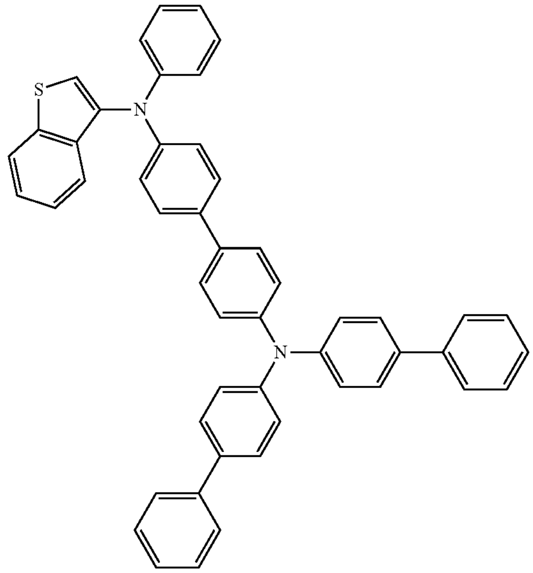
-continued
12-33
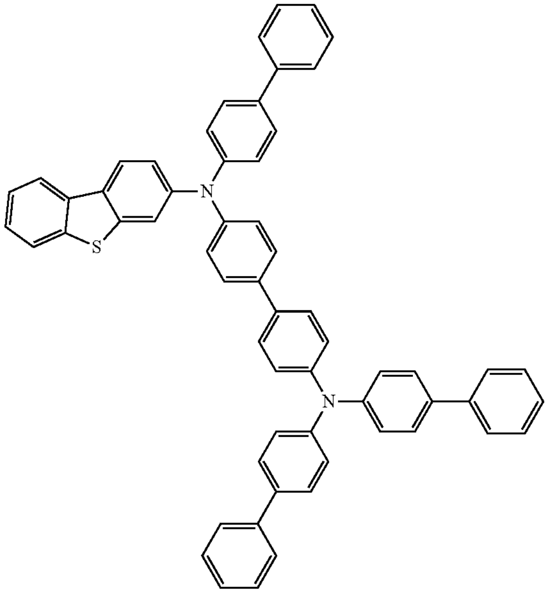
12-34
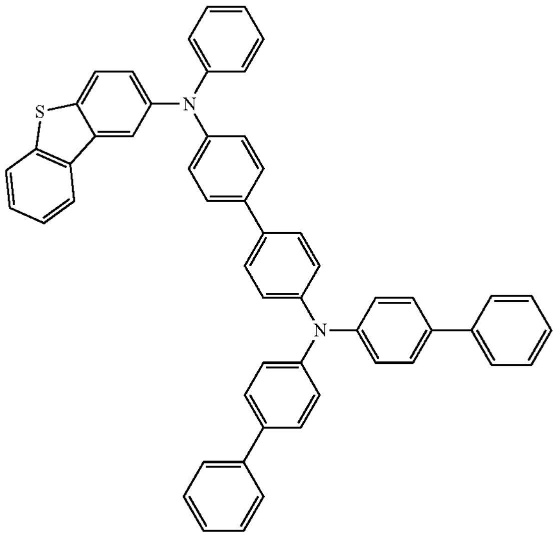
12-35
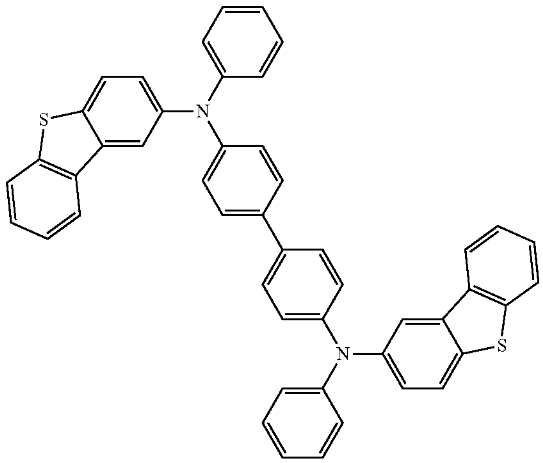

-continued
12-36
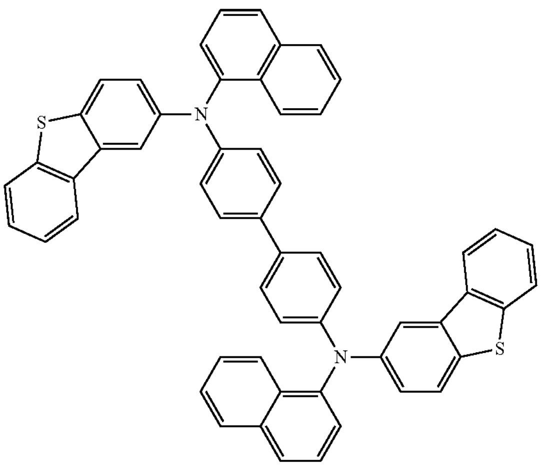
12-37
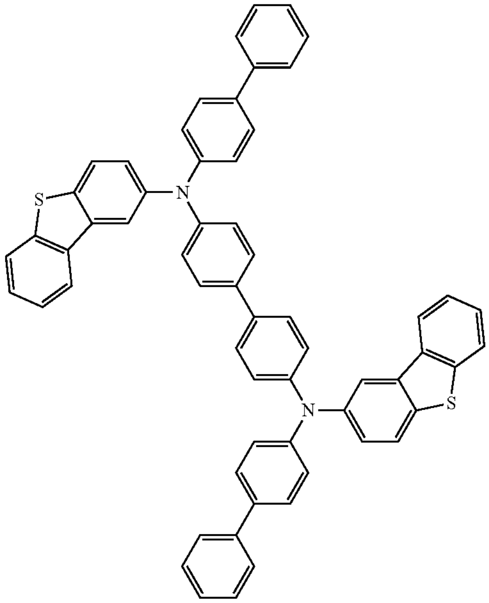
-continued
12-38
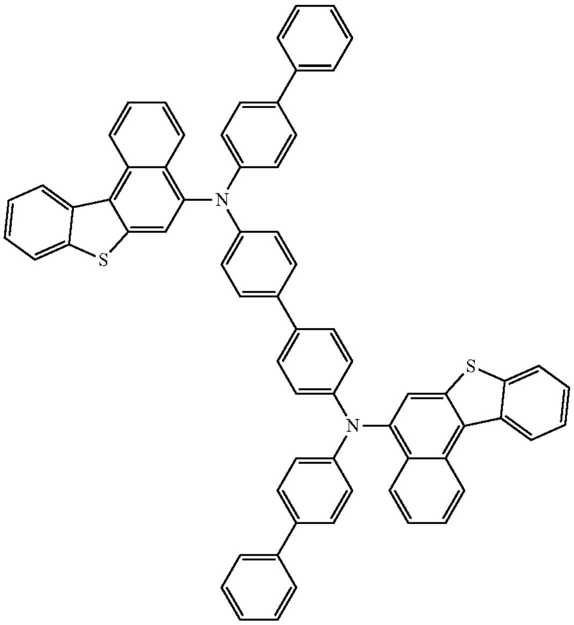
12-39
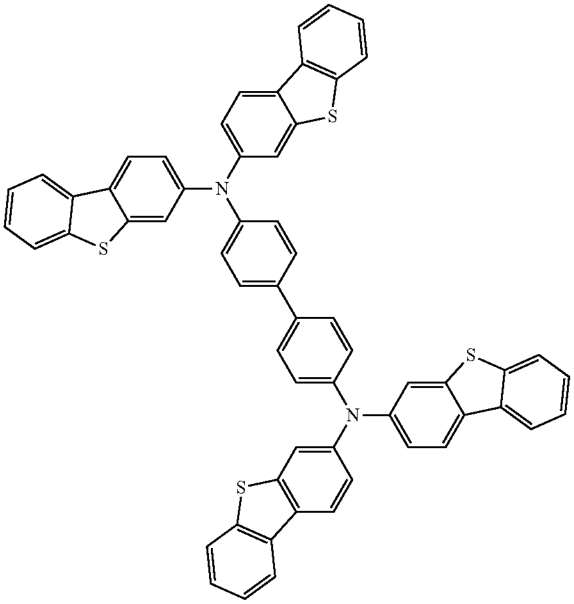

-continued
12-40
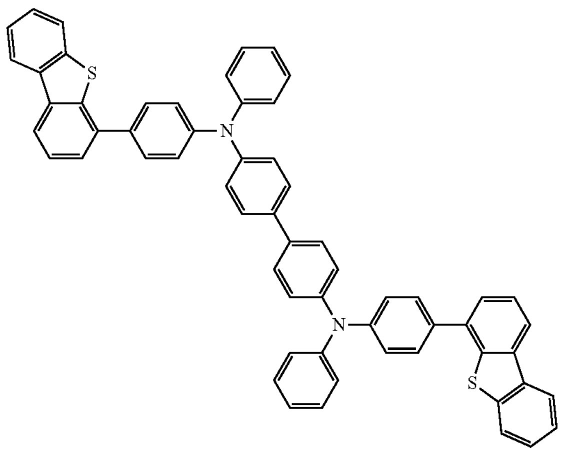
12-41
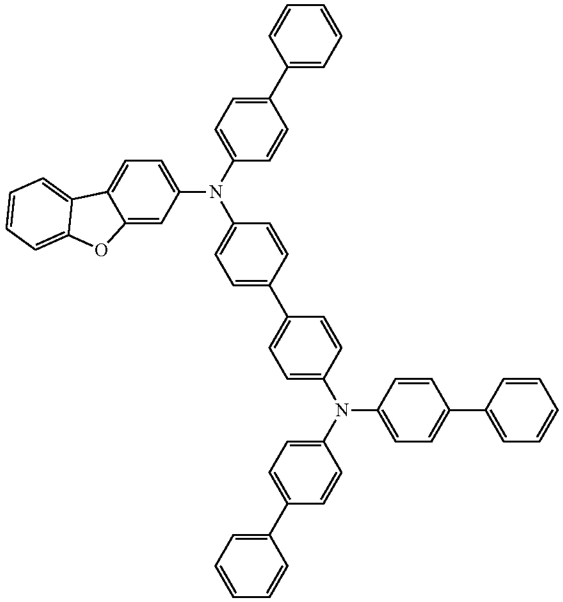
12-42
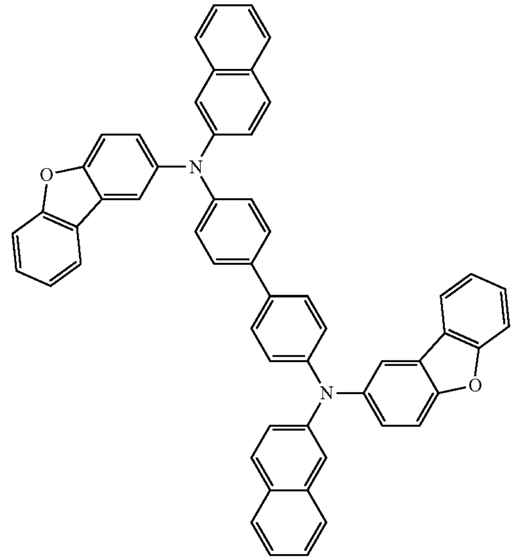
-continued
12-43
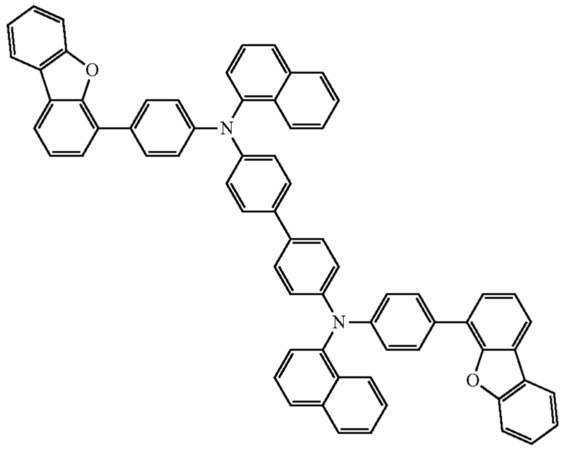
12-44
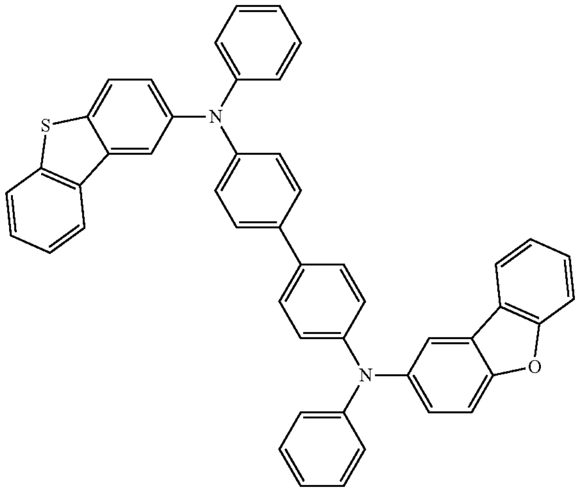
12-45
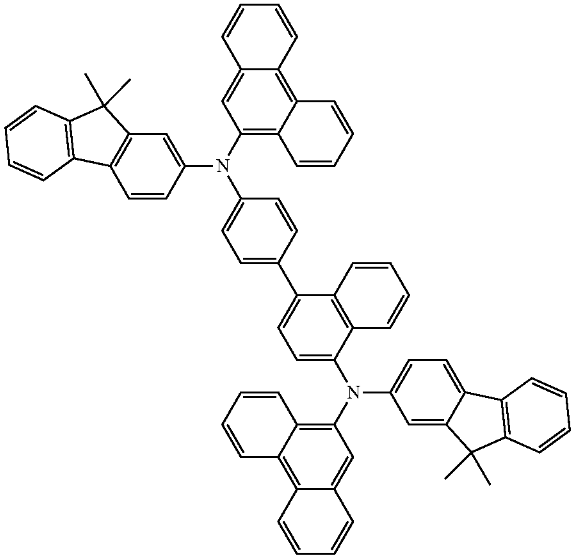

-continued
12-46
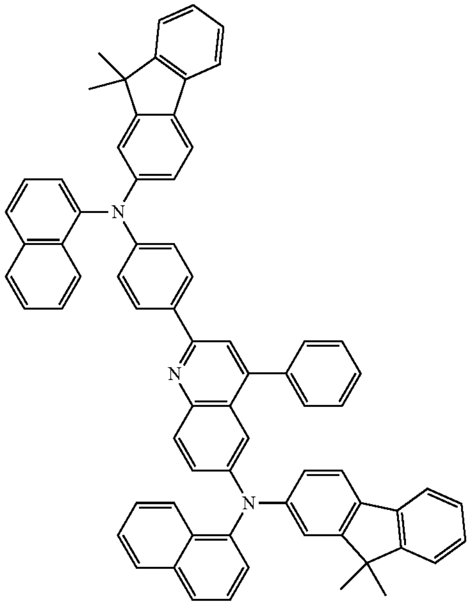
12-47
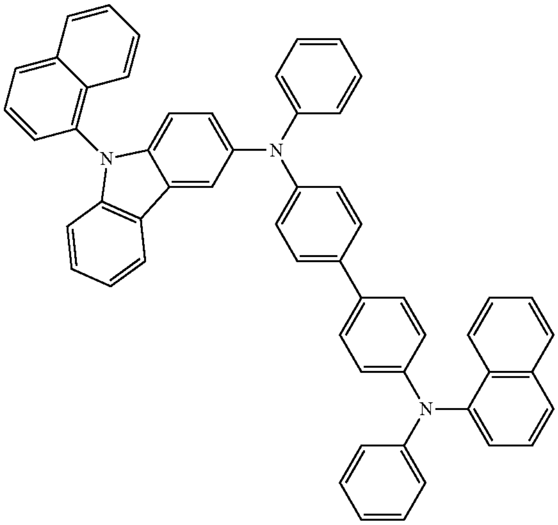
-continued
12-48
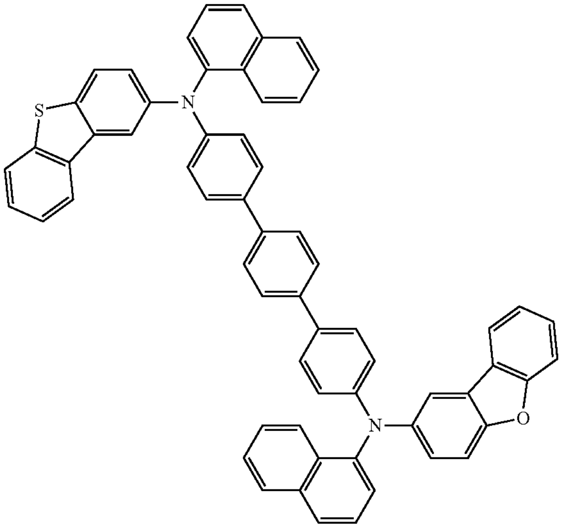
12-49
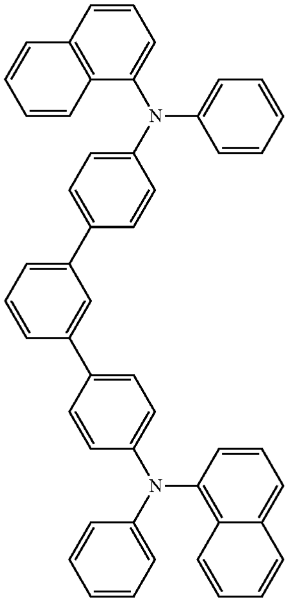

-continued
12-50
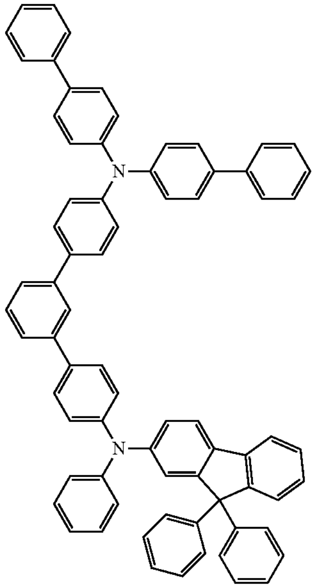
12-51
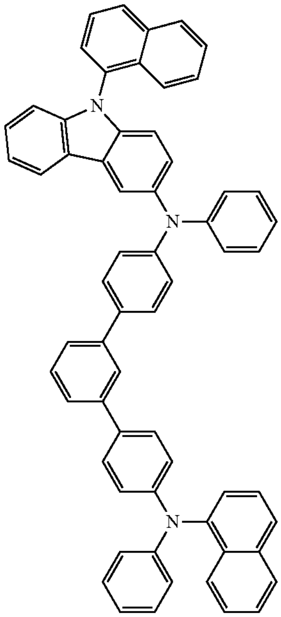
-continued
12-52
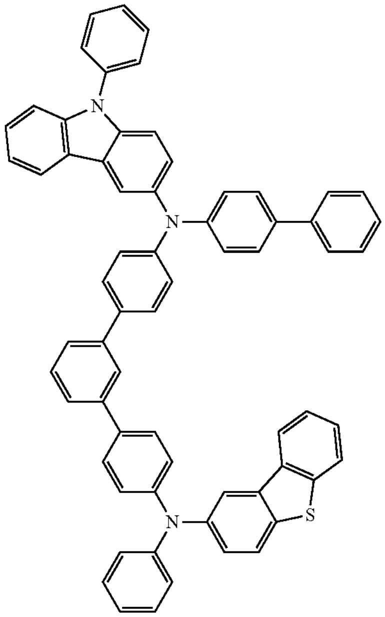
12-53
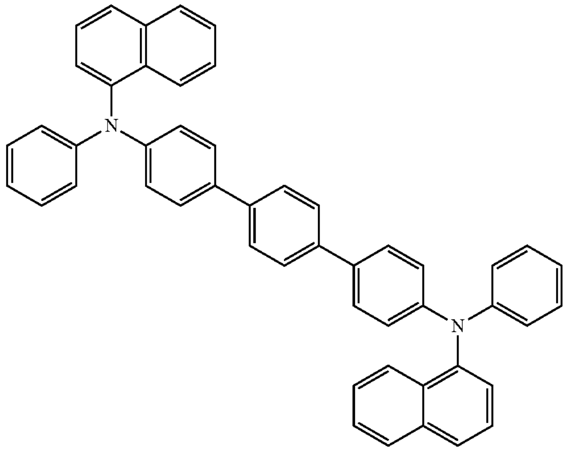

-continued
12-54
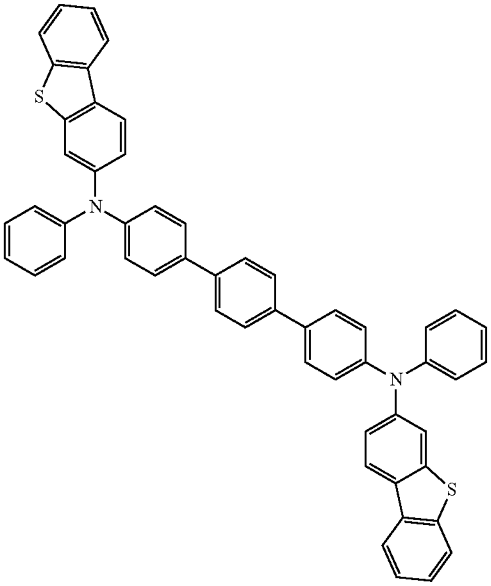
12-55
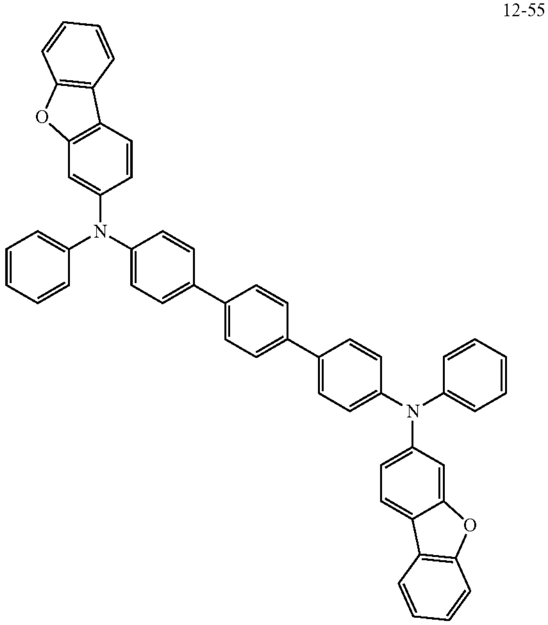
-continued
12-56
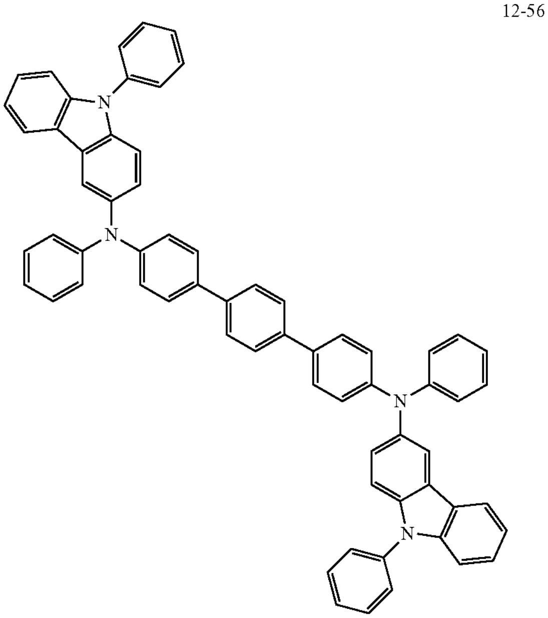
12-57
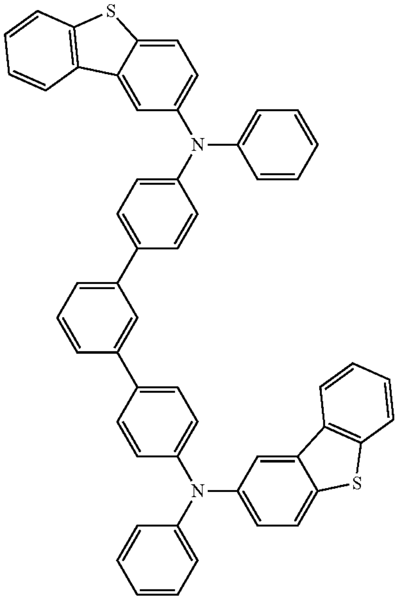

-continued
12-58
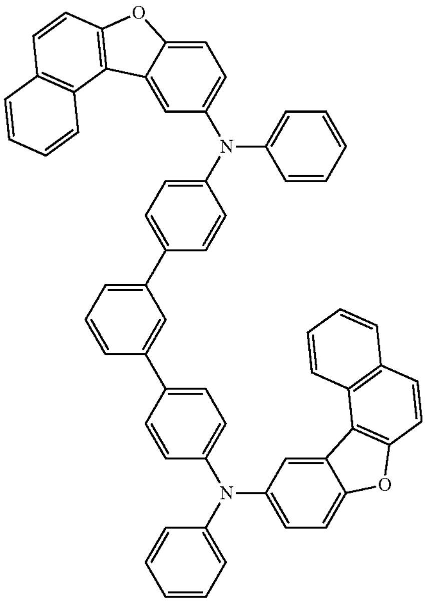
12-59
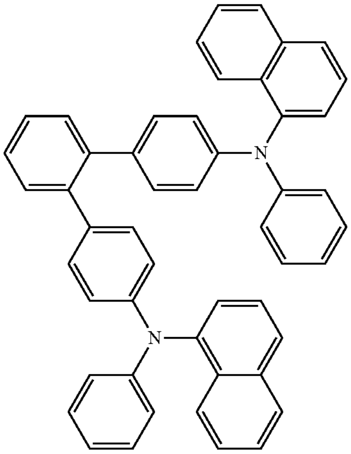
-continued
12-60
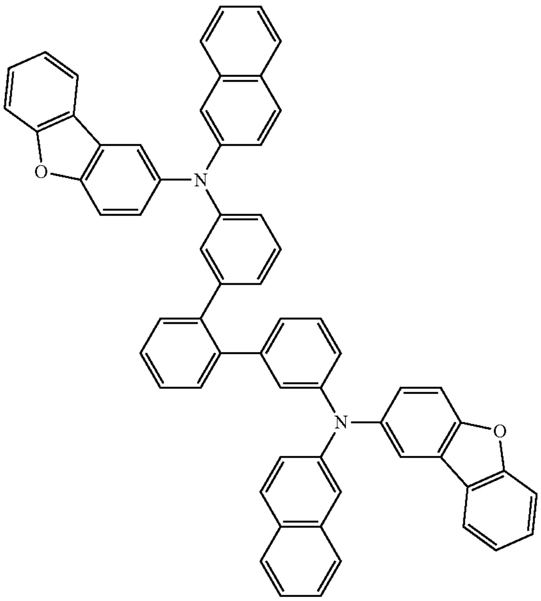
12-61
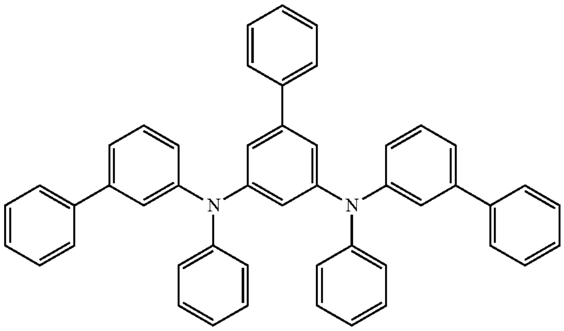
12-62
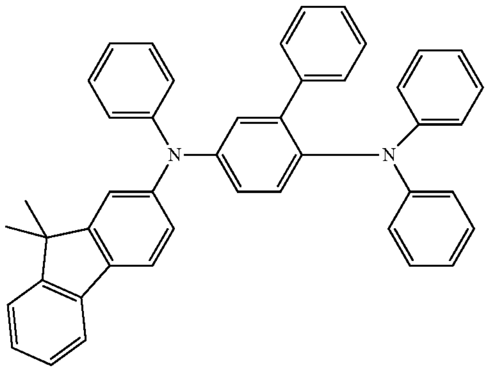

-continued
12-63
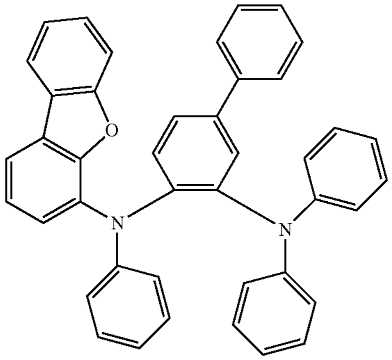
12-64
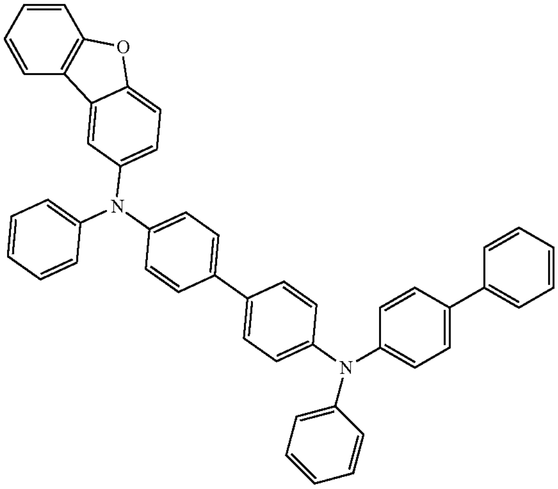
12-65
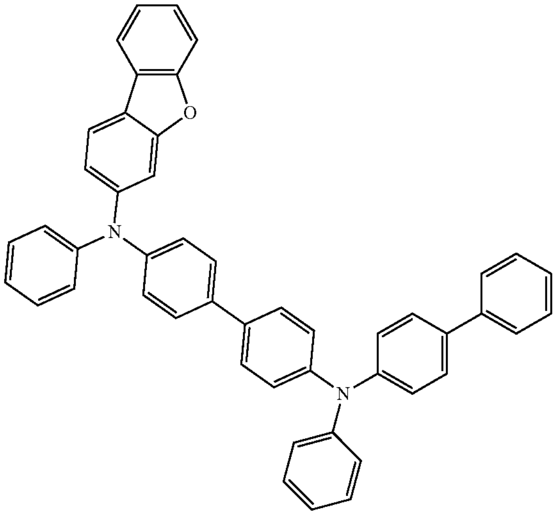
-continued
12-66
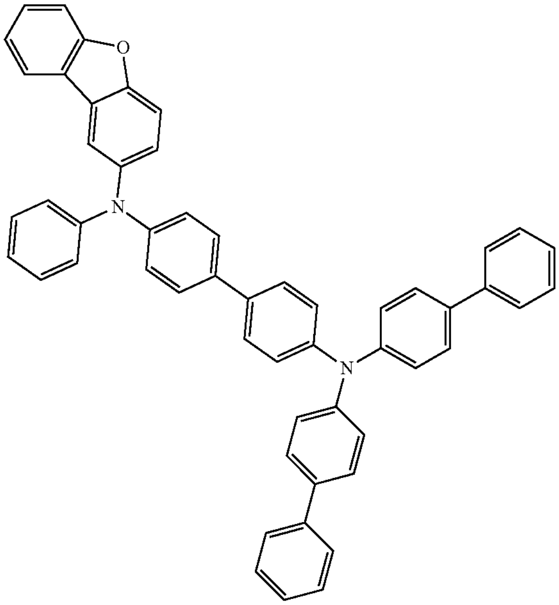
12-67
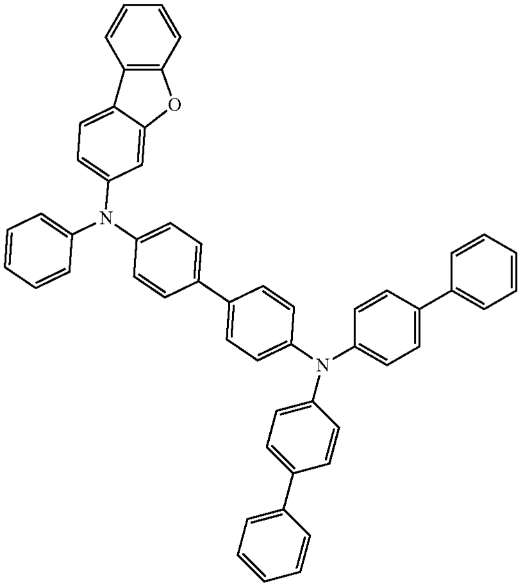

-continued
12-68
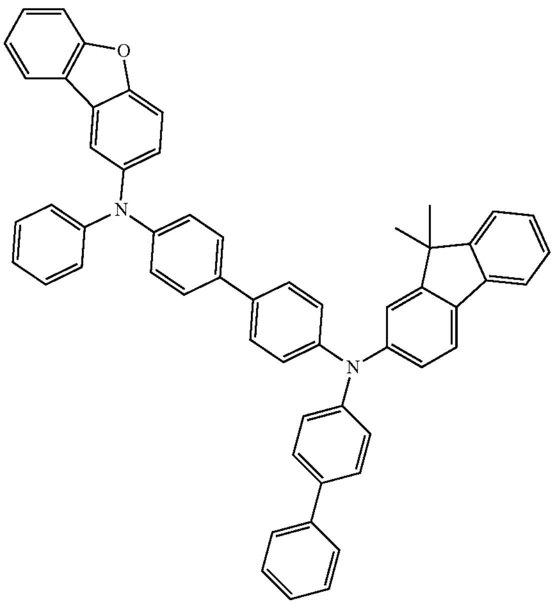
12-69
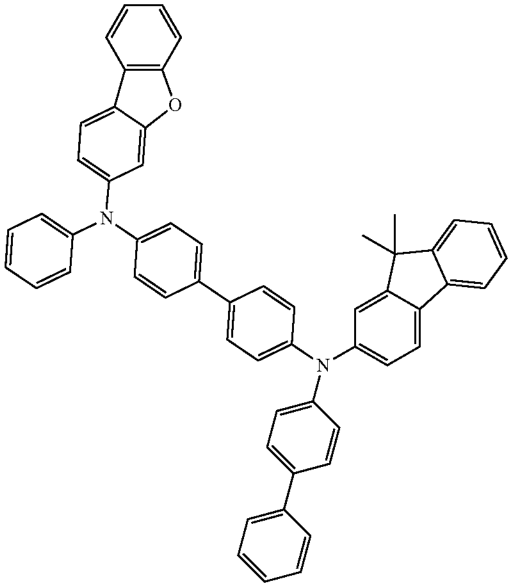
-continued
12-70
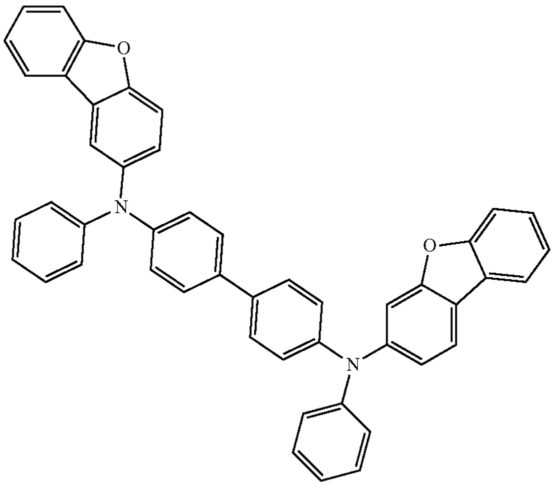
12-71
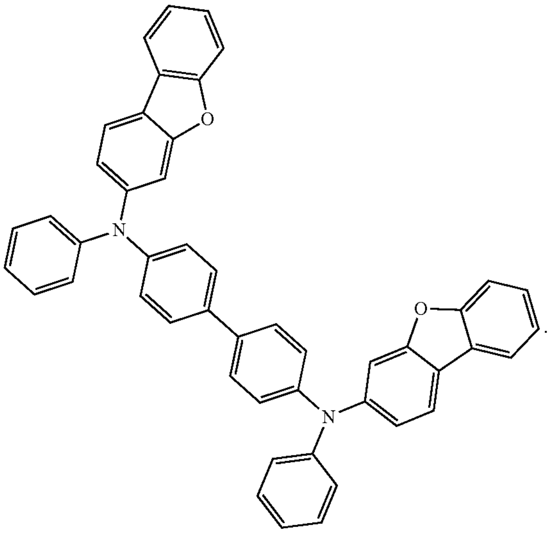
Specifically, the compound represented by formula 2 may be one of the following compounds, but there is no limitation thereto.
Z1-1
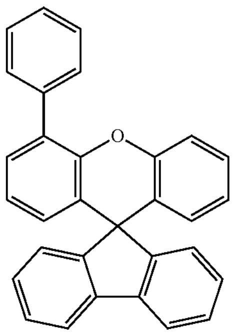

-continued
Z1-2
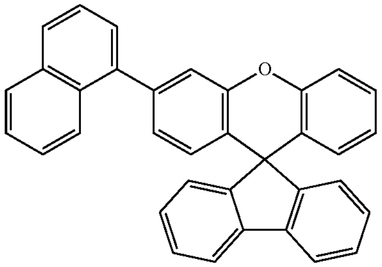
Z1-3
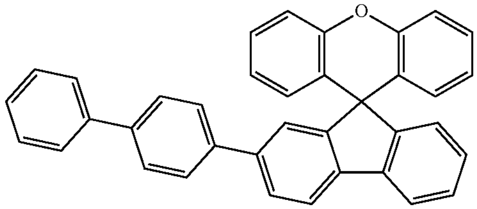
Z1-4
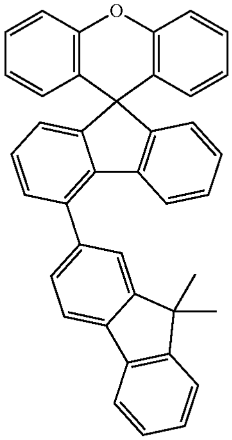
Z1-5
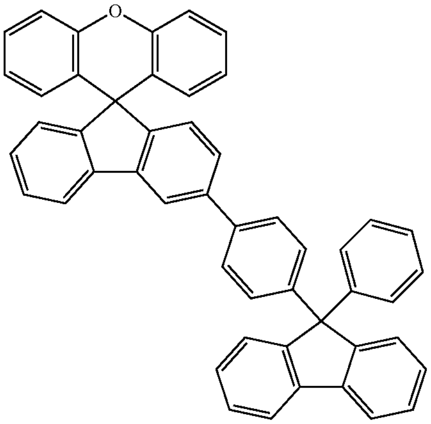
-continued
Z1-6
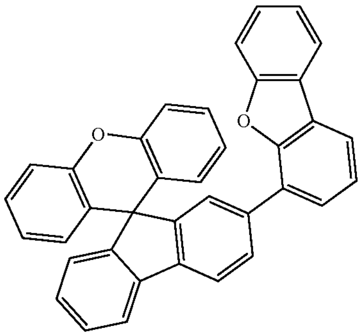
Z1-7
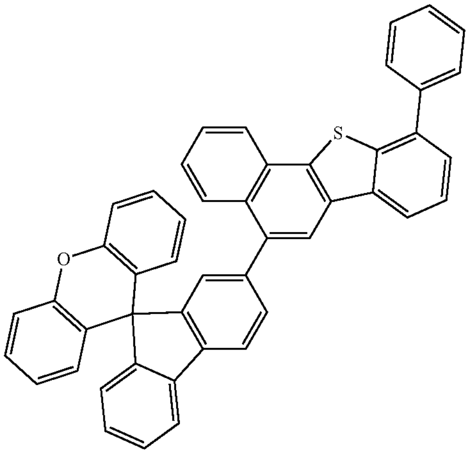
Z1-8
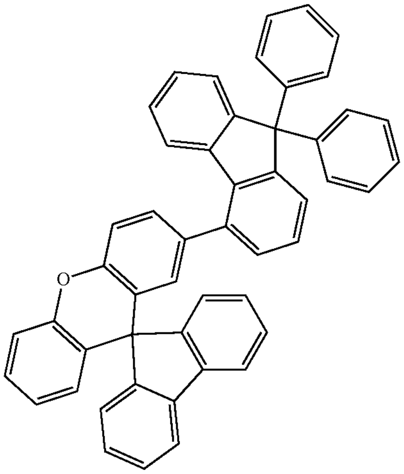

Z1-9
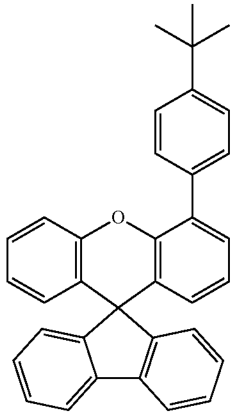
Z1-10
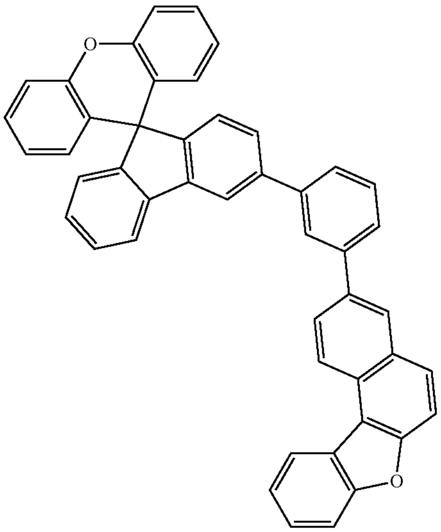
Z1-11
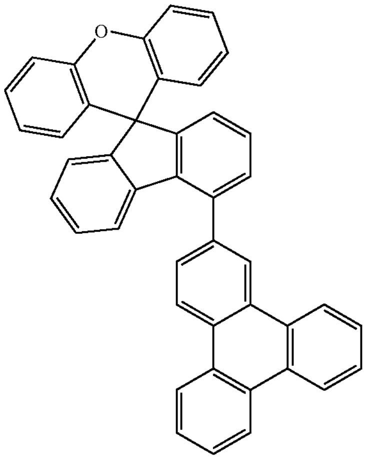
Z1-12
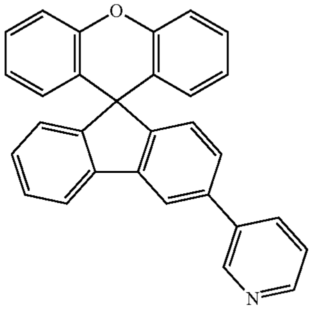
Z1-13
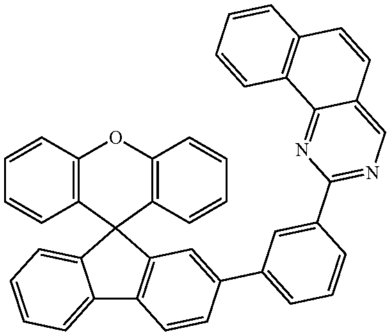
Z1-14
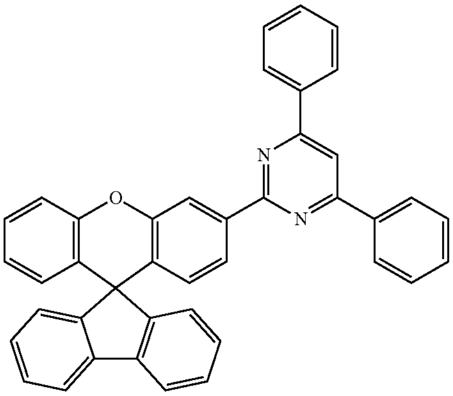
Z1-15
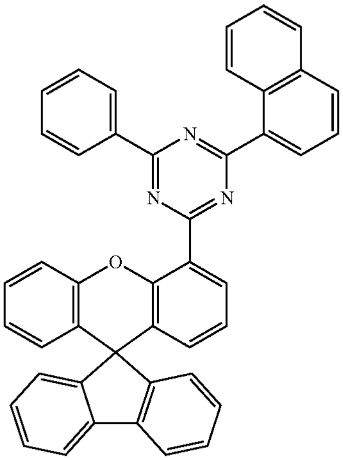

-continued
Z1-16
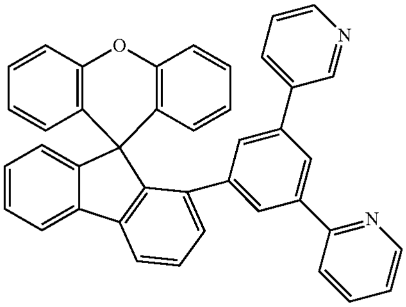
Z1-17
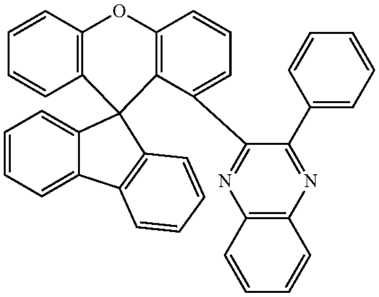
Z1-18
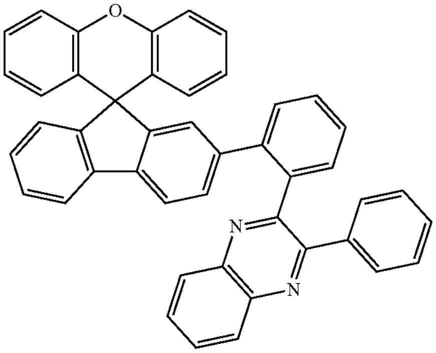
Z1-19
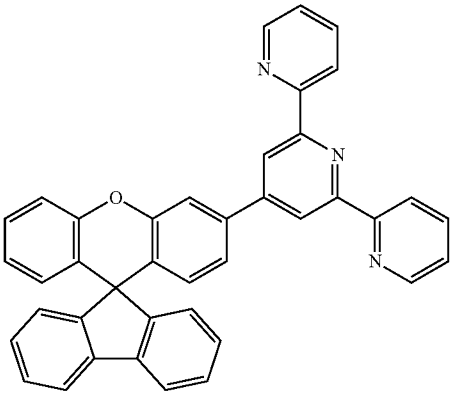
Z1-20
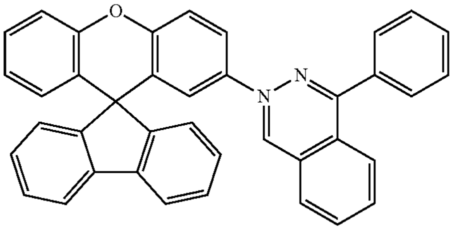
-continued
Z1-21
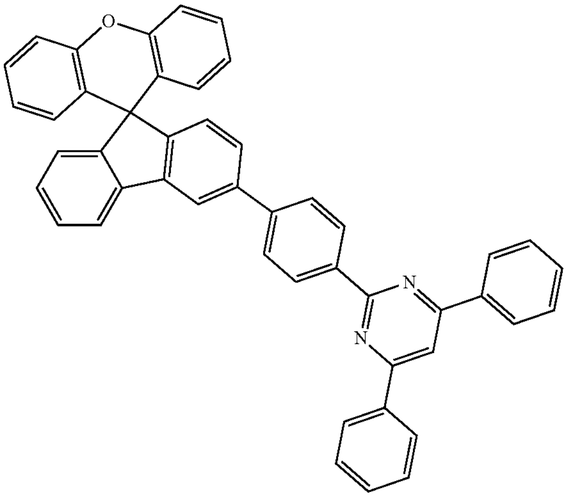
Z1-22
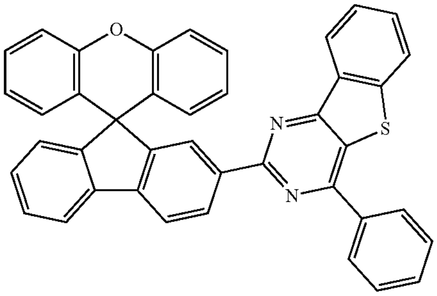
Z1-23
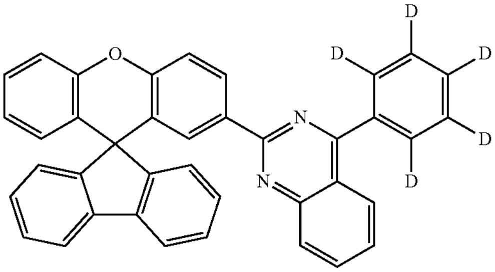
Z1-24
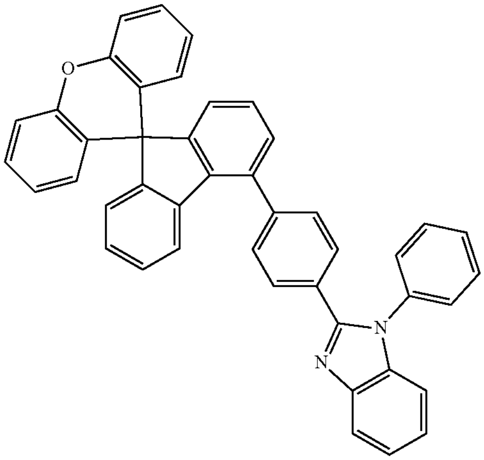

Z1-25
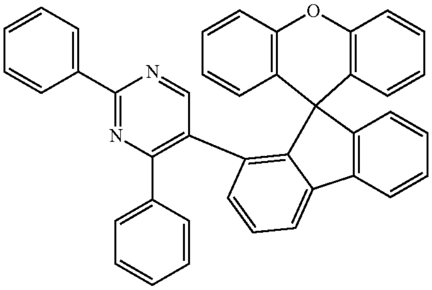
Z1-26
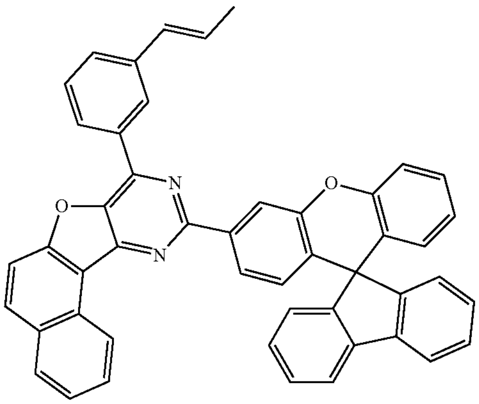
Z1-27
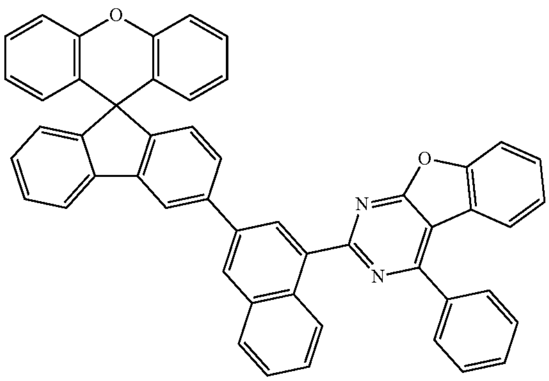
Z1-28
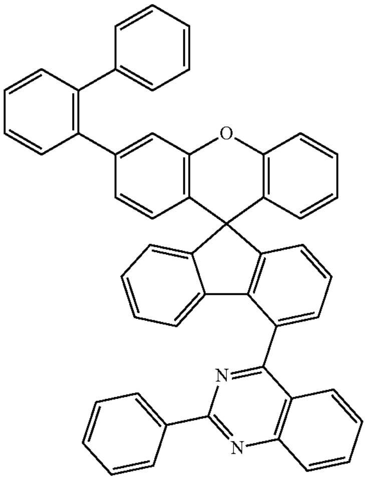
Z1-29
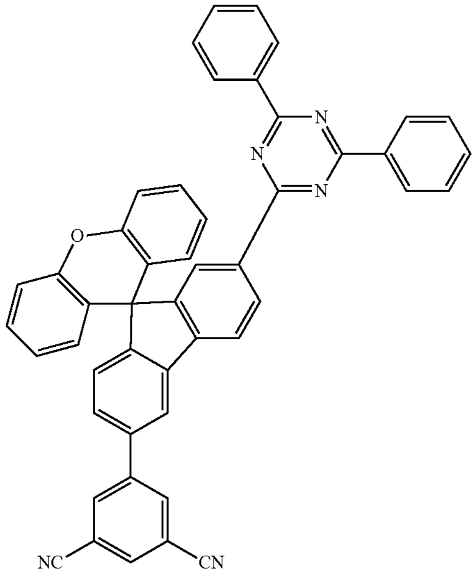
Z1-30
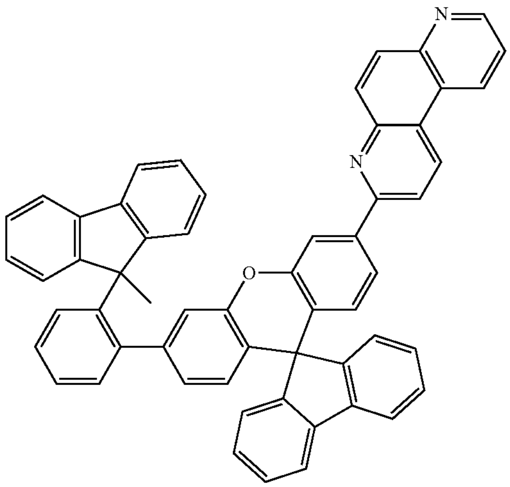
Z1-31
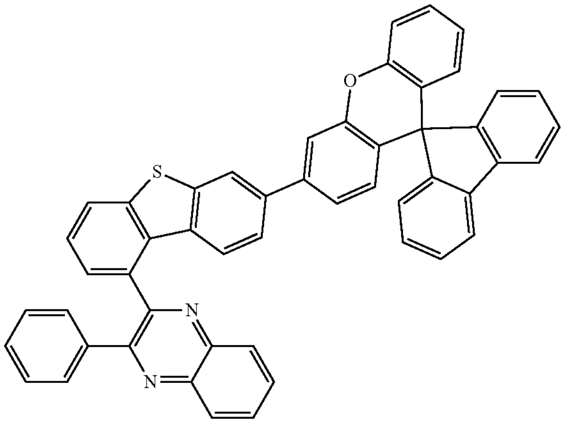

-continued
Z1-32
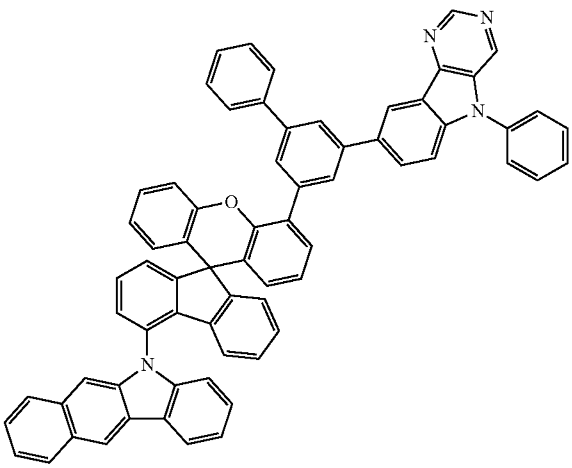
Z1-33
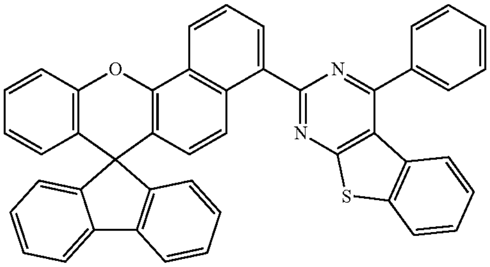
Z1-34
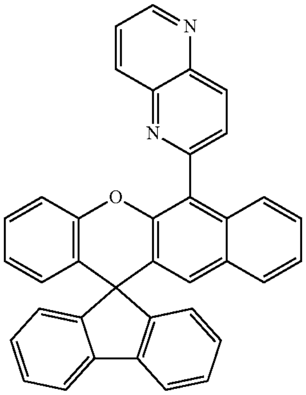
Z1-35
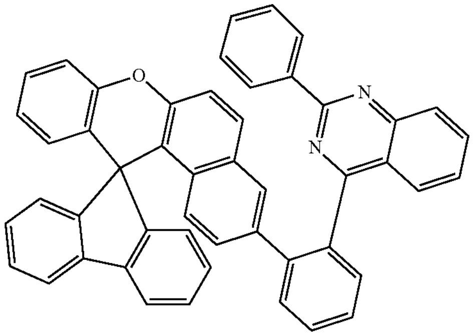
-continued
Z1-36
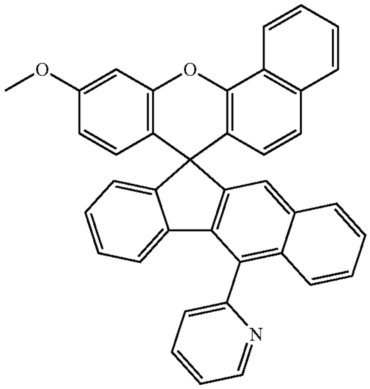
Z1-37
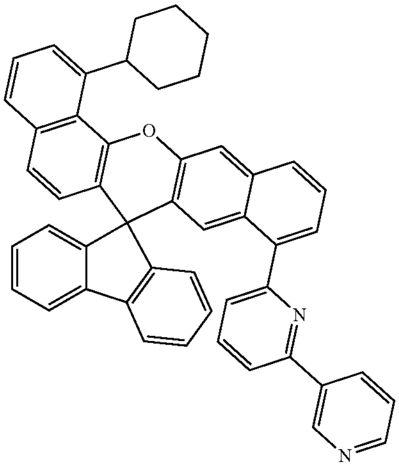
Z1-38
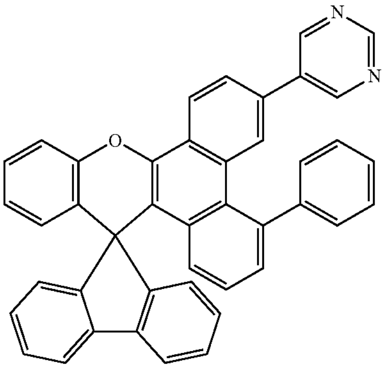
Z1-39
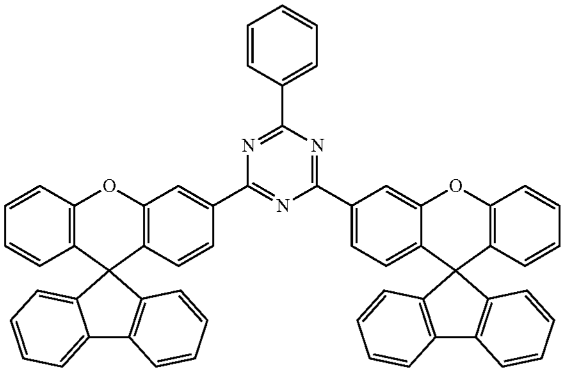

-continued
Z1-40
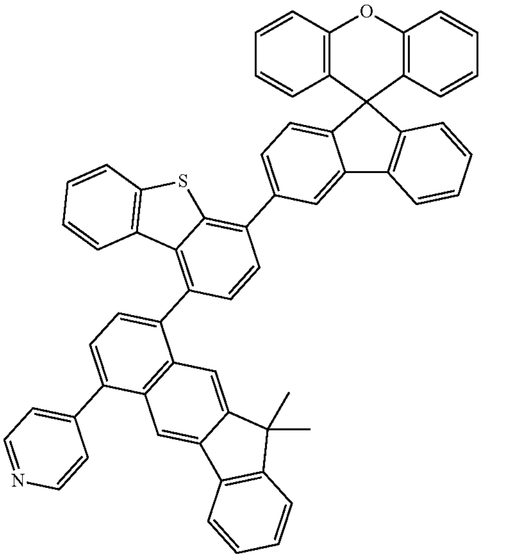
Z1-41
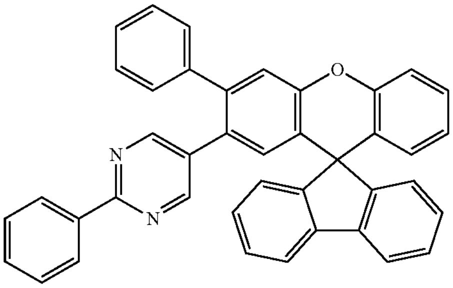
Z1-42
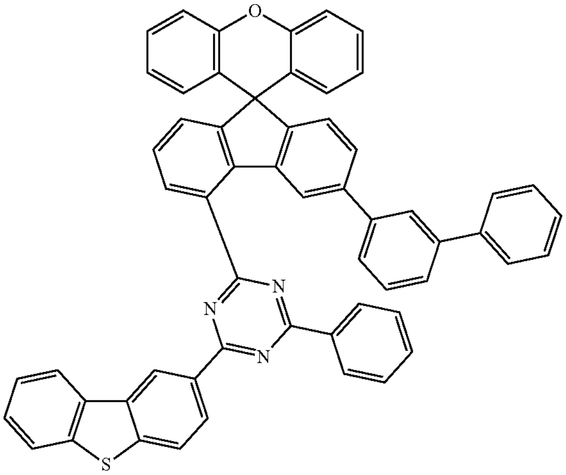
-continued
Z1-43
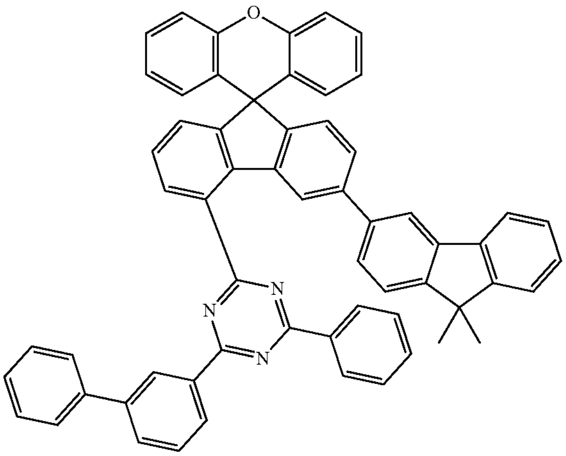
Z2-1
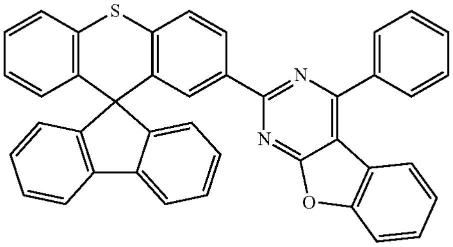
Z2-2
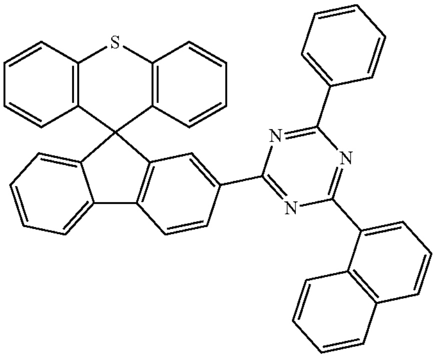
Z2-3
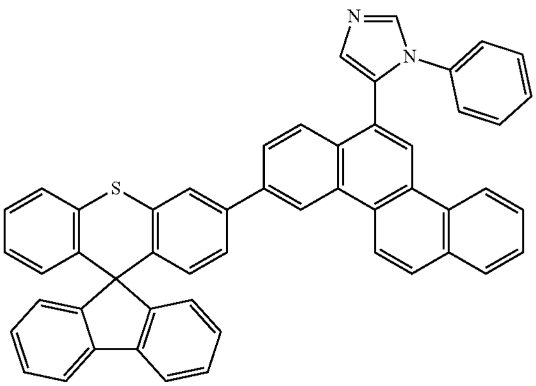

-continued
Z2-4
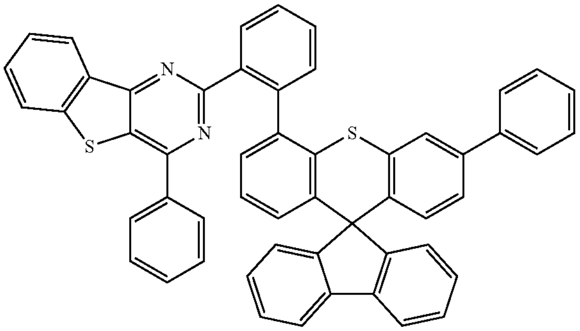
Z2-5
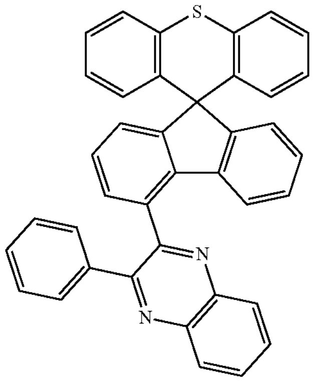
Z2-6
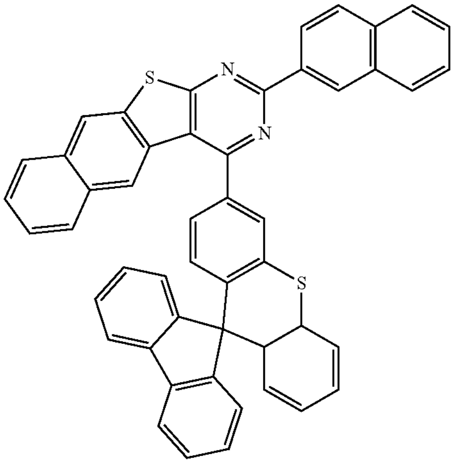
Z2-7
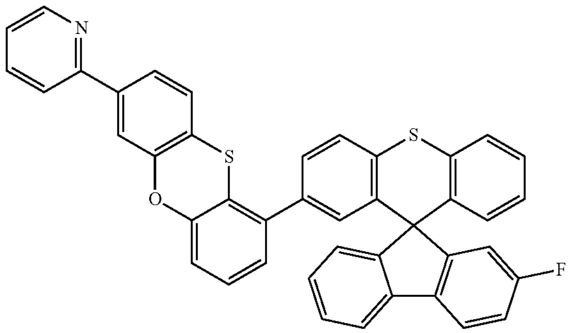
-continued
Z2-8
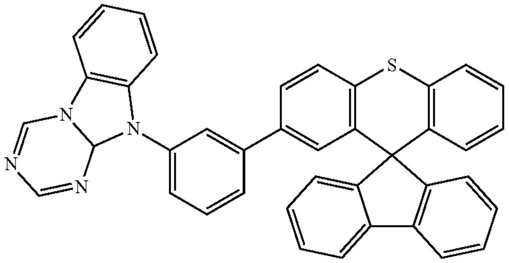
Z2-9
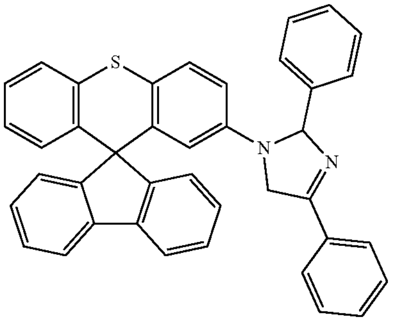
Z2-10
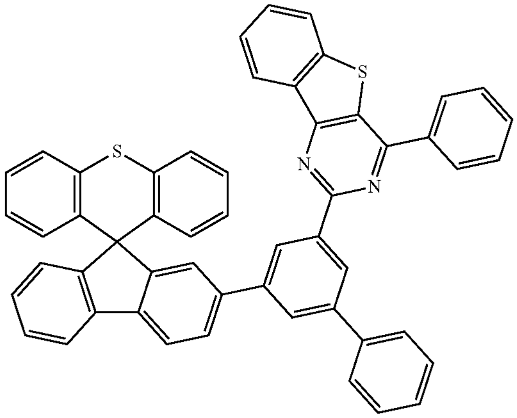
Z2-11
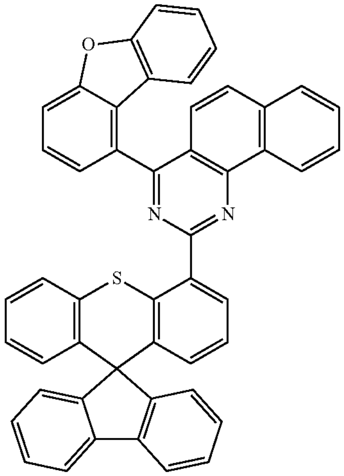

-continued
Z2-12
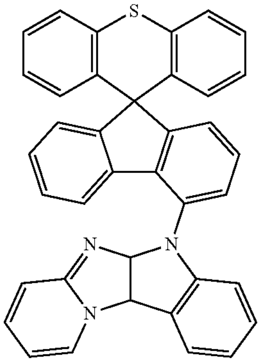
Z2-13
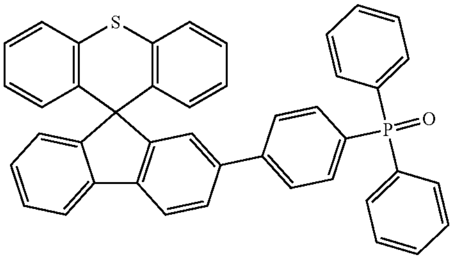
Z2-14
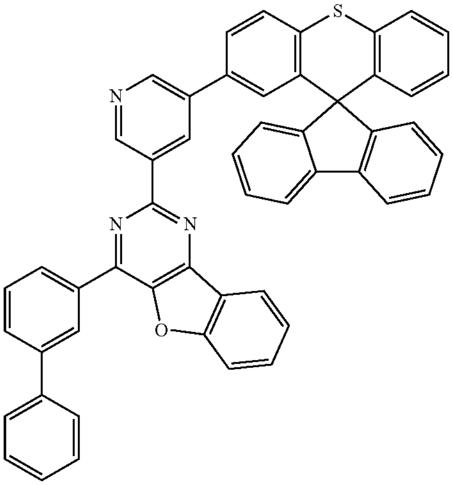
Z2-15
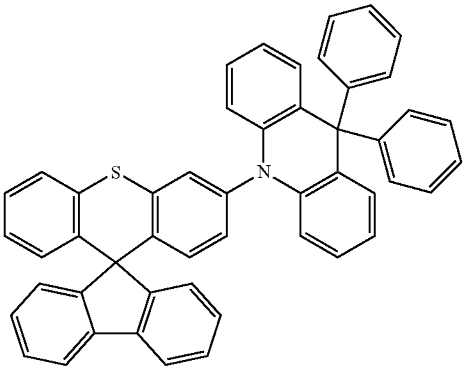
-continued
Z2-16
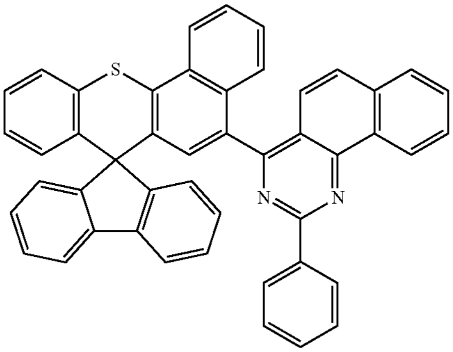
Z2-17
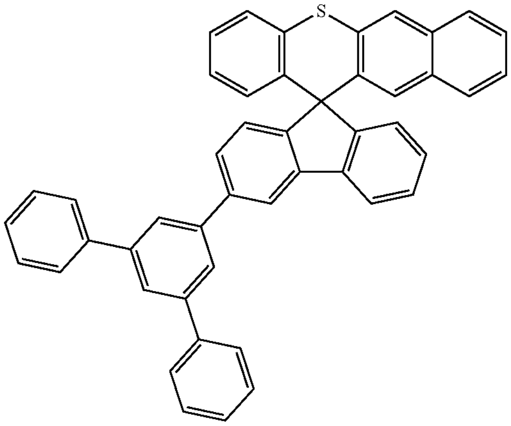
Z2-18
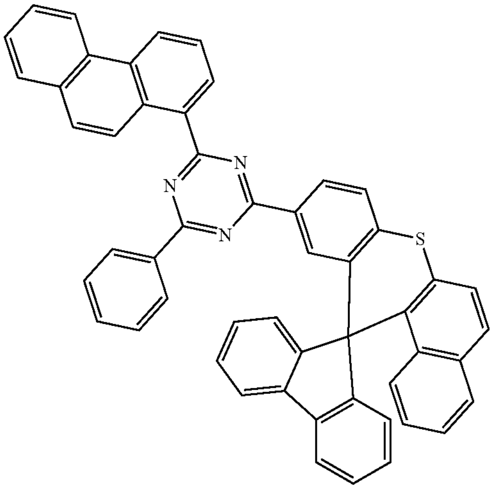

-continued
Z2-19
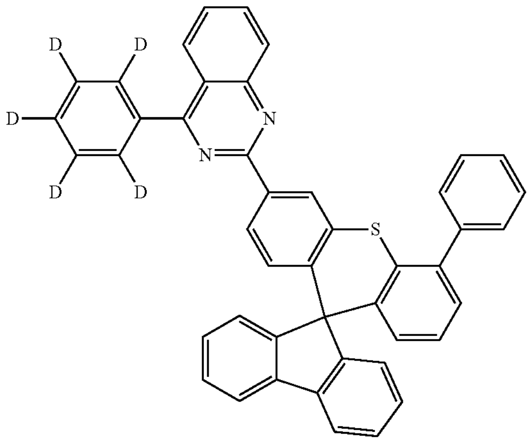
Z2-20
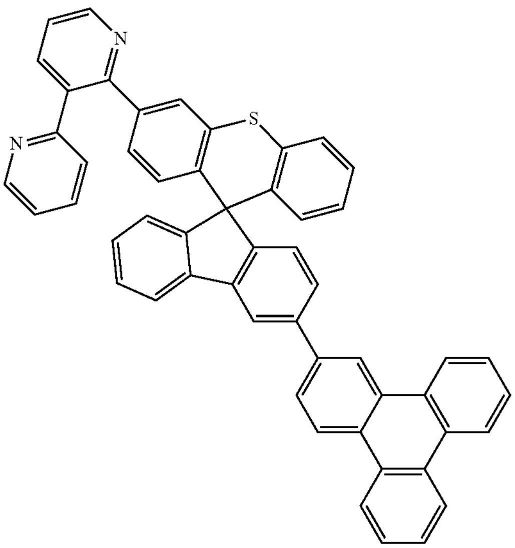
Z2-21
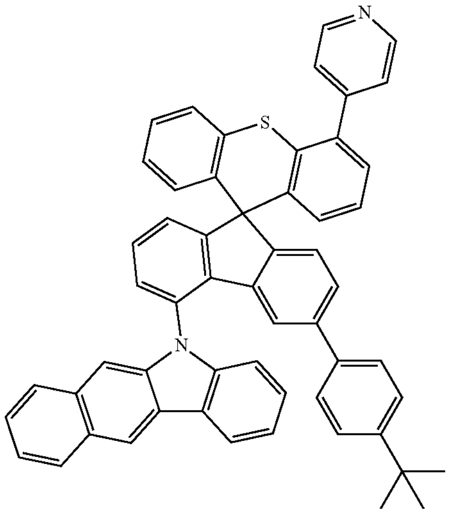
-continued
Z2-22
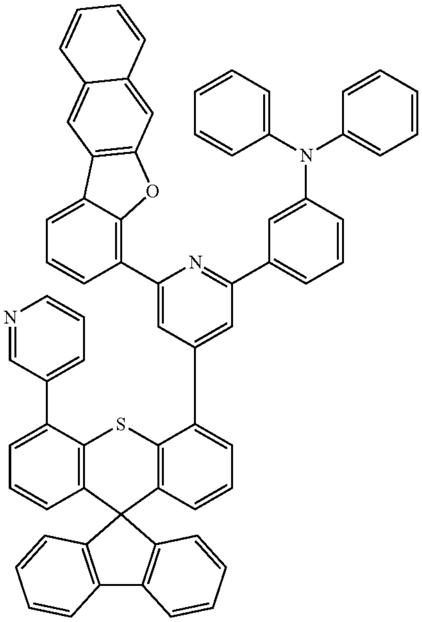
Z2-23
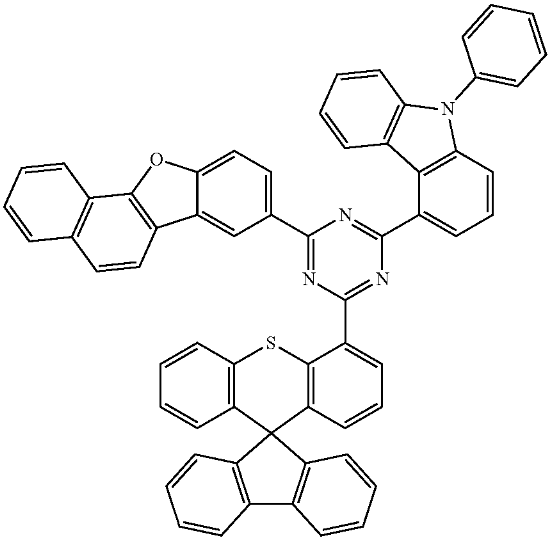

-continued
Z2-24
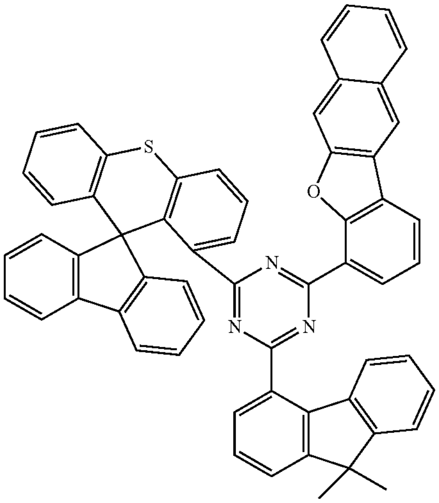
Z2-25
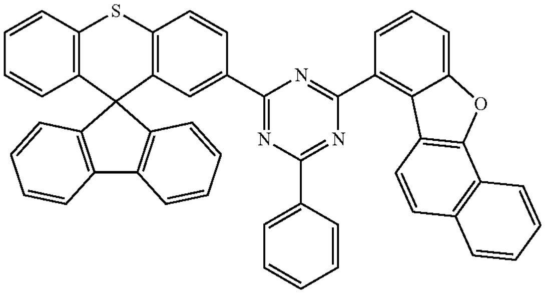
Z2-26
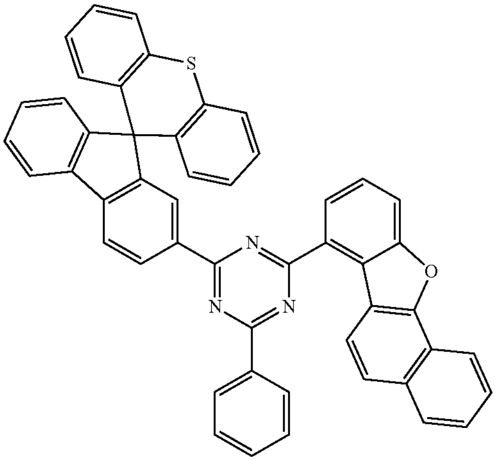
-continued
Z2-27
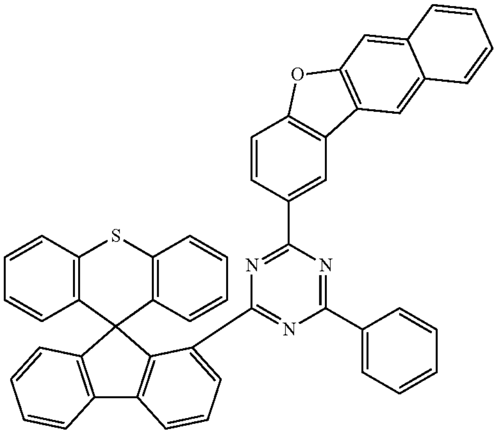
Z2-28
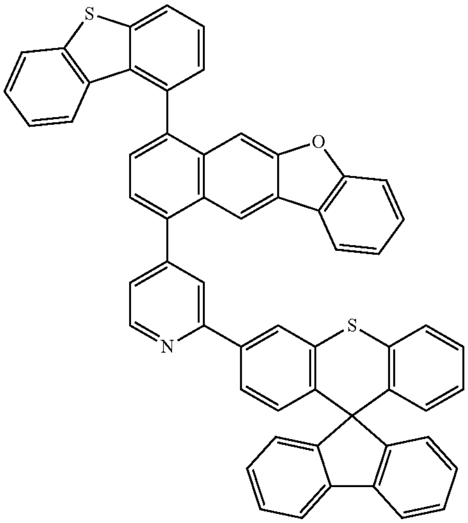
Z2-29
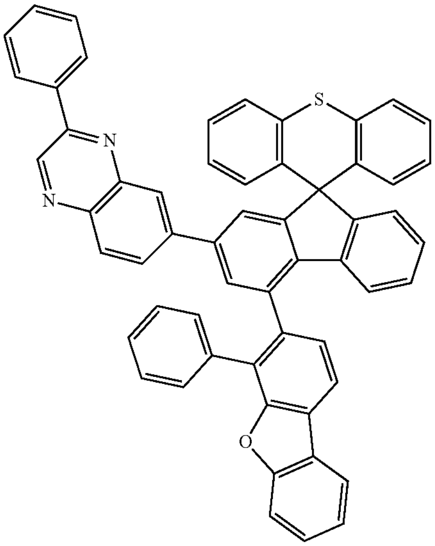

-continued
Z2-30
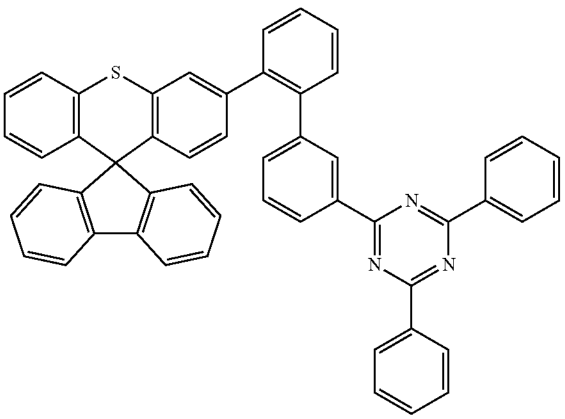
Z3-1
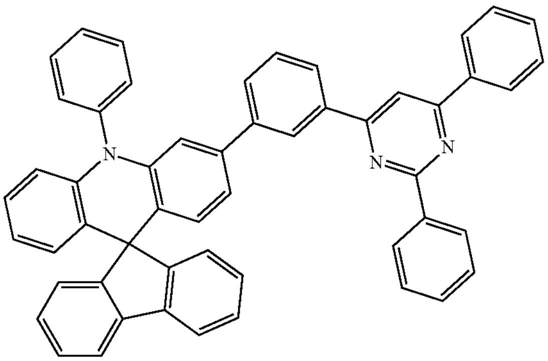
Z3-2
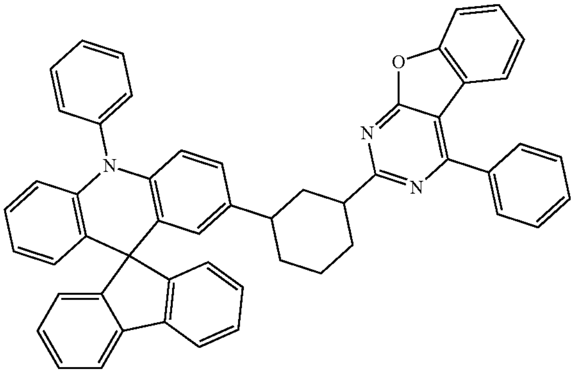
Z3-3
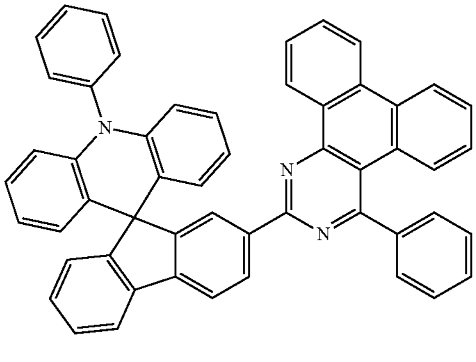
-continued
Z3-4
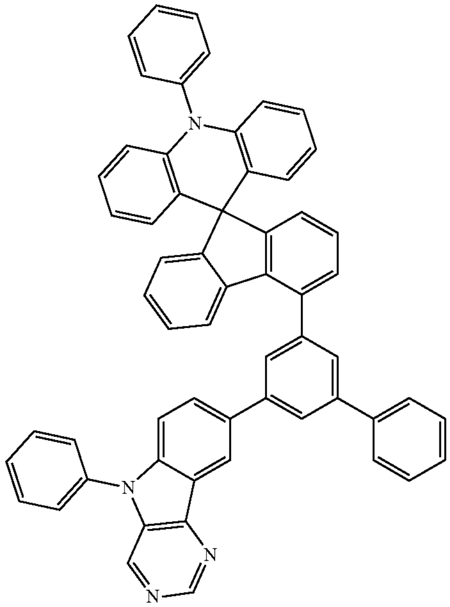
Z3-5
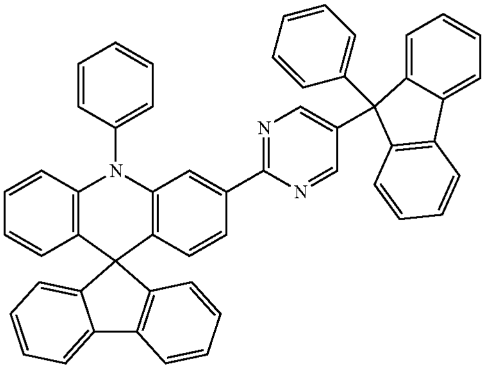
Z3-6
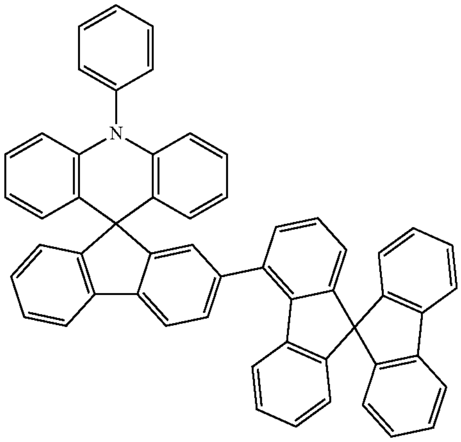

-continued
Z3-7
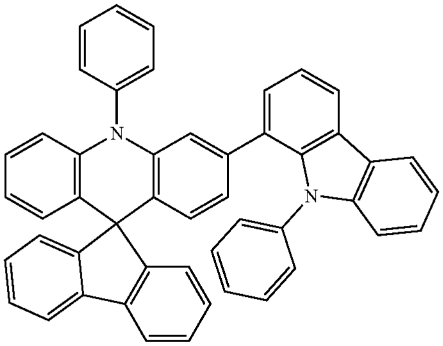
Z3-8
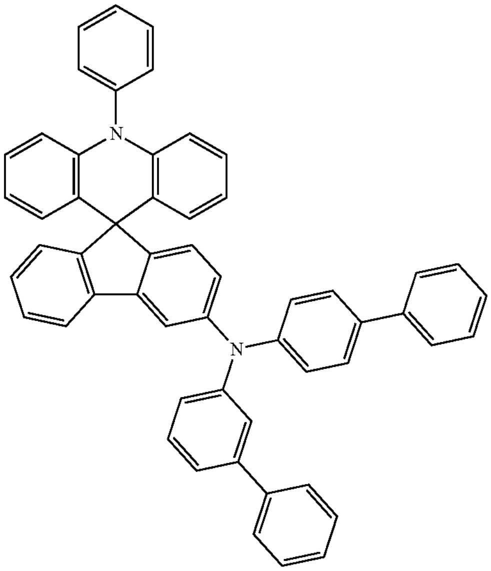
Z3-9
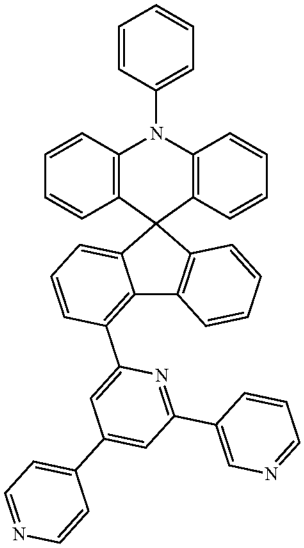
-continued
Z3-10
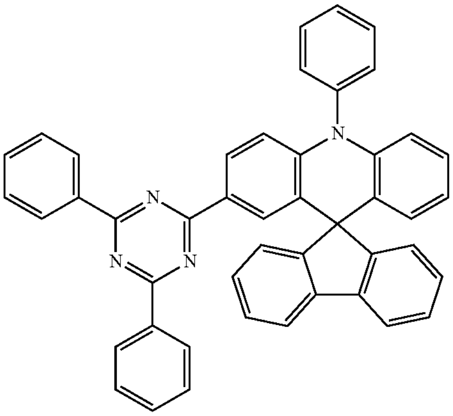
Z3-11
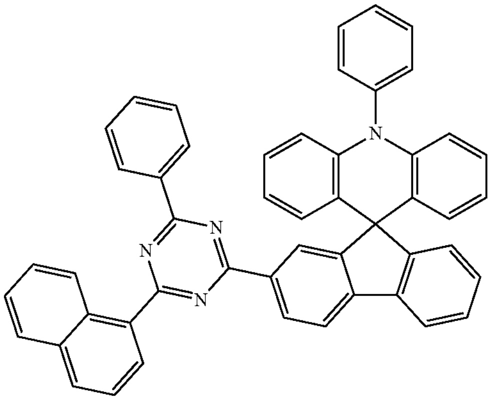
Z3-12
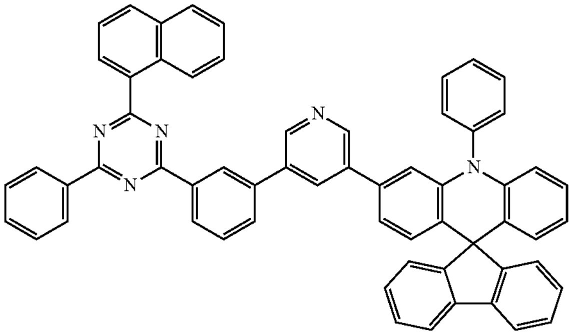
Z3-13
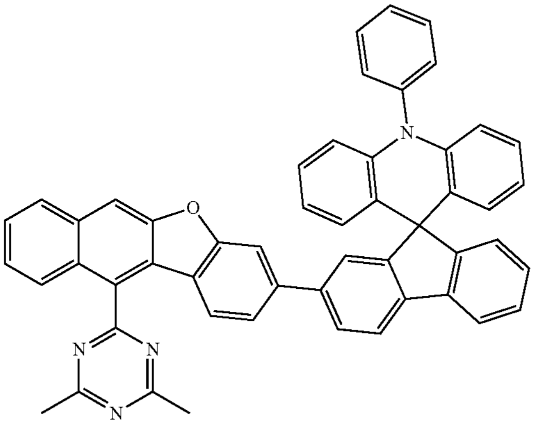

-continued
Z3-14
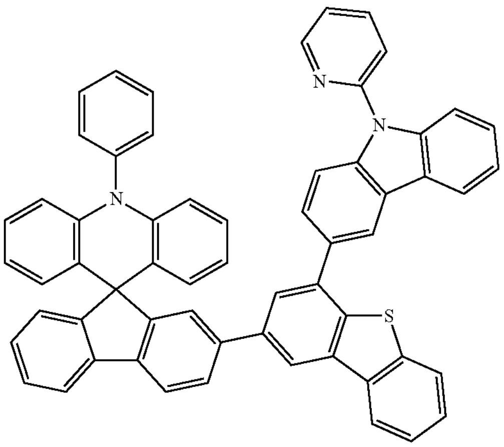
Z3-15
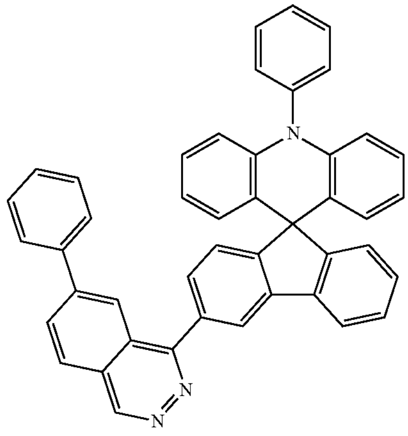
Z3-16
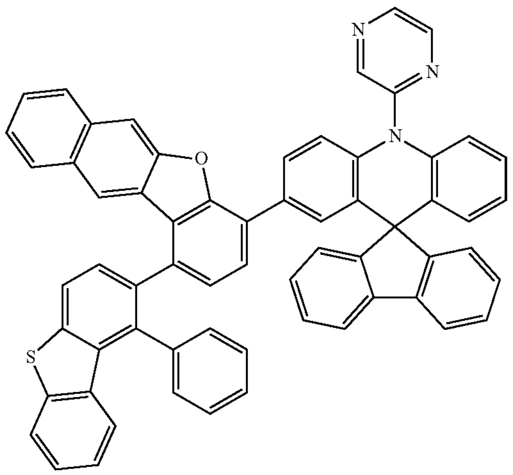
-continued
Z3-17
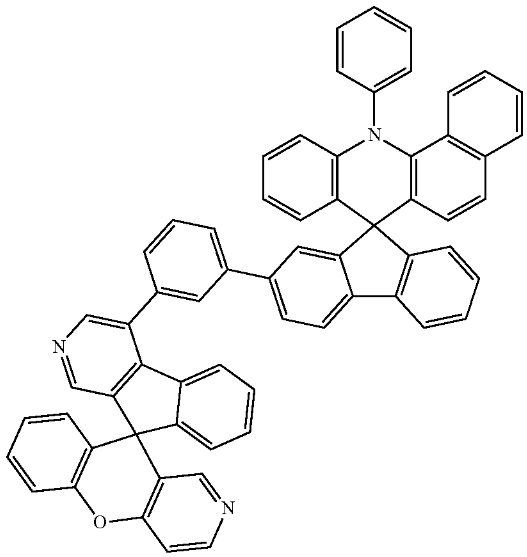
Z3-18
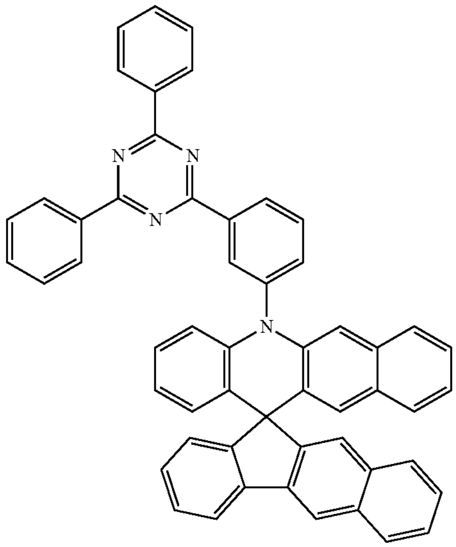
Z3-19
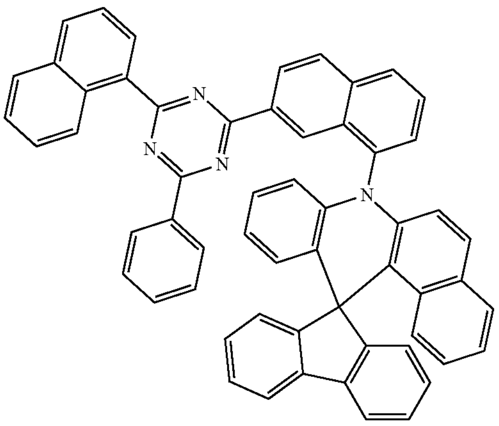

-continued
Z3-20
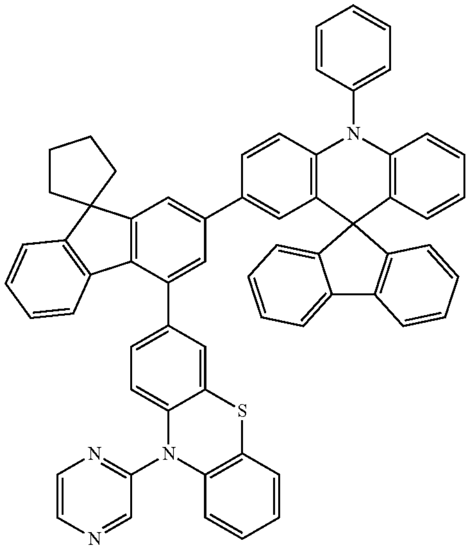
Z3-21
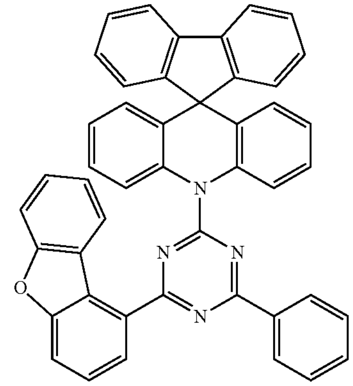
Z3-22
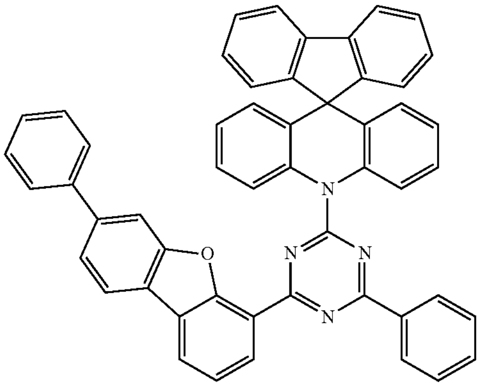
-continued
Z3-23
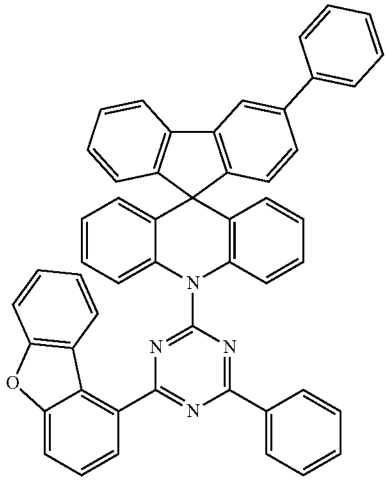
Z3-24
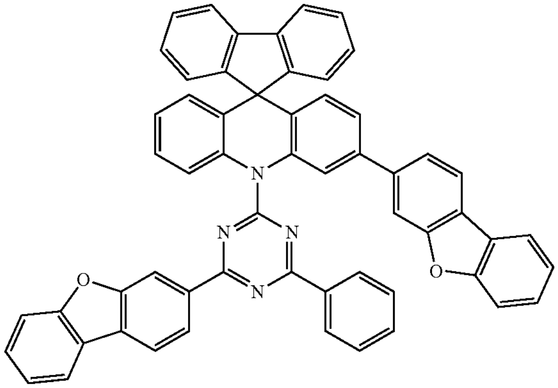
Z3-25
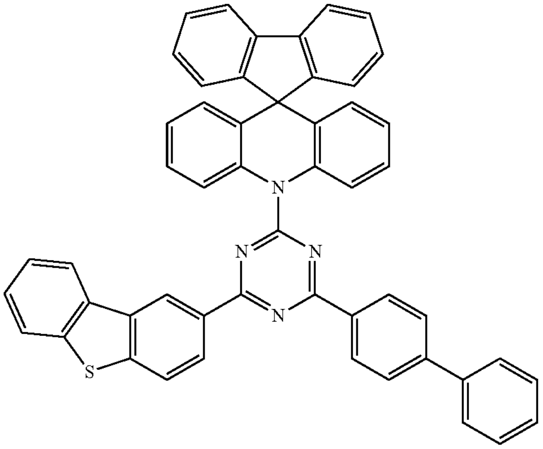

-continued
Z3-26
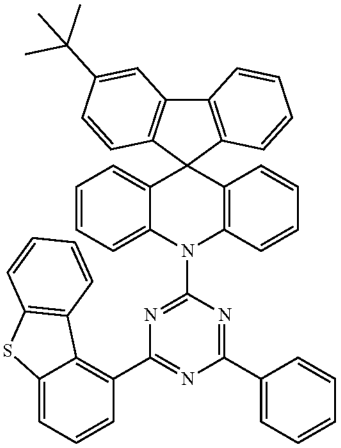
Z3-27
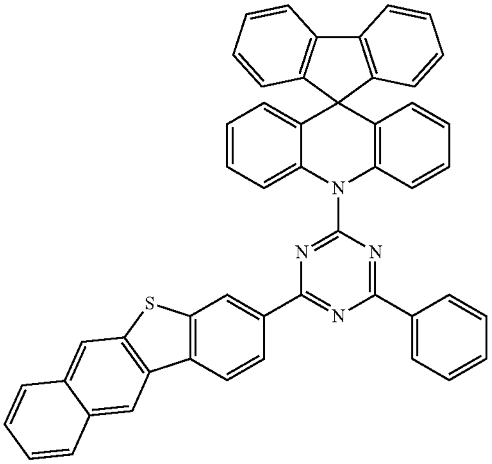
Z3-28
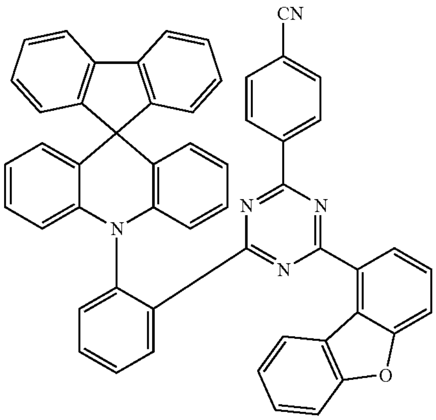
-continued
Z3-29
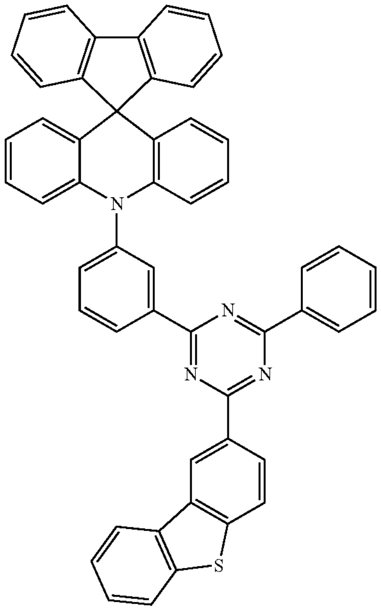
Z3-30
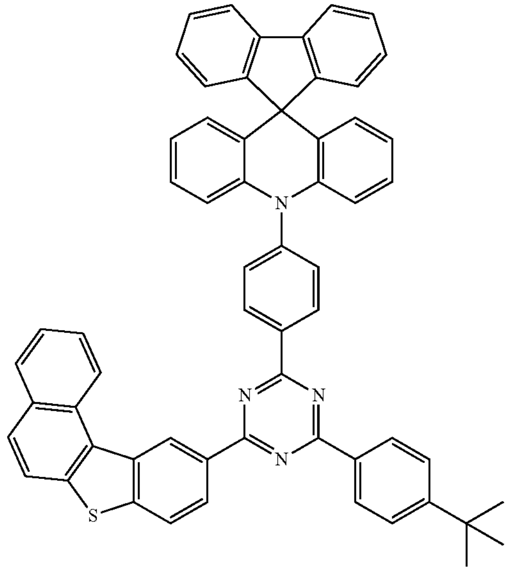
Z3-31
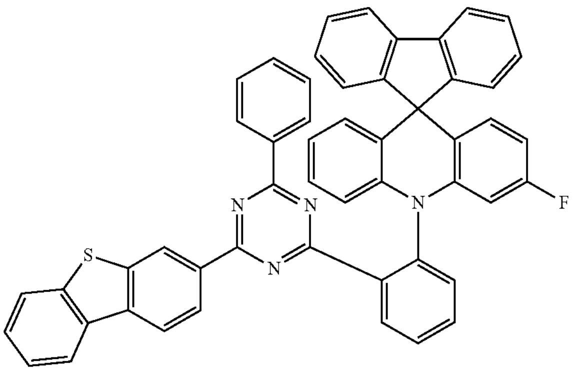

-continued
Z3-32
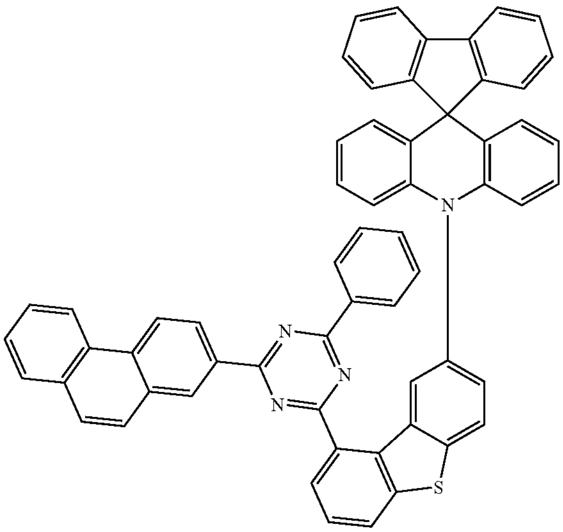
Z3-33
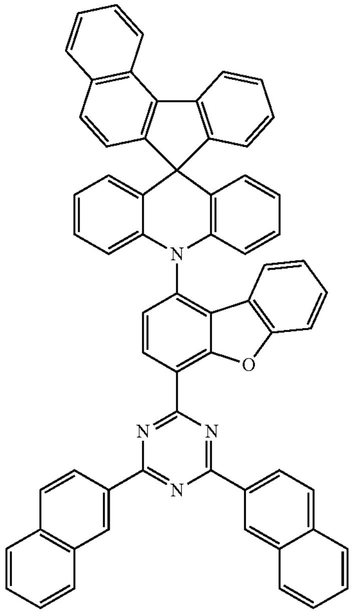
-continued
Z3-34
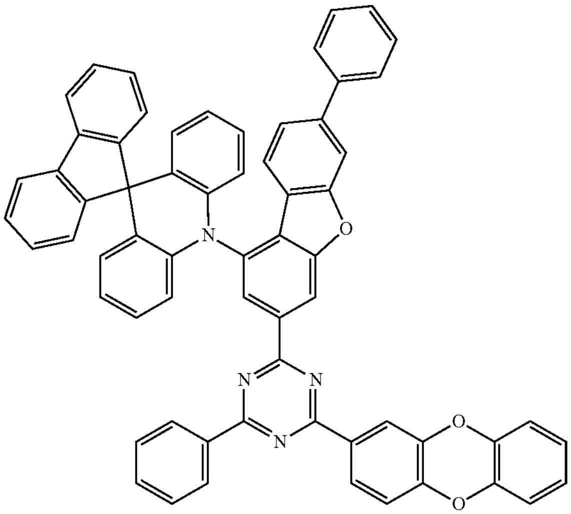
Z3-35
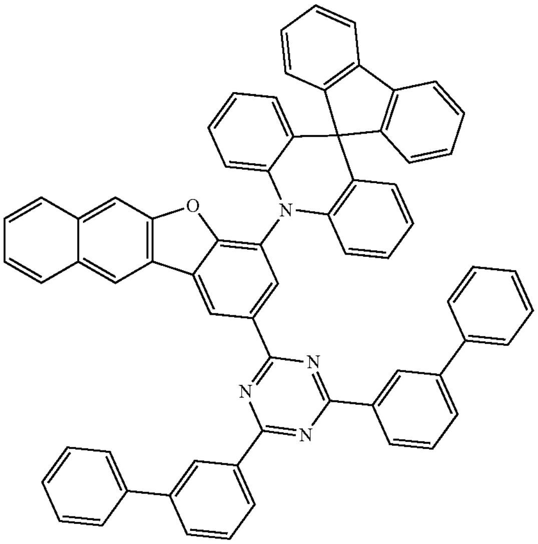
Z3-36
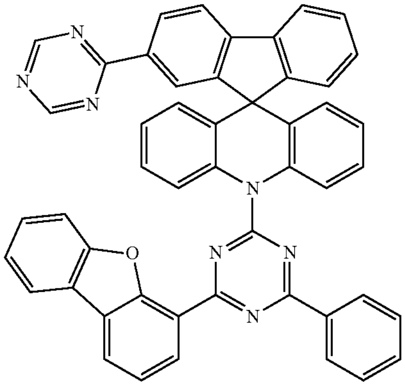

-continued
Z3-37
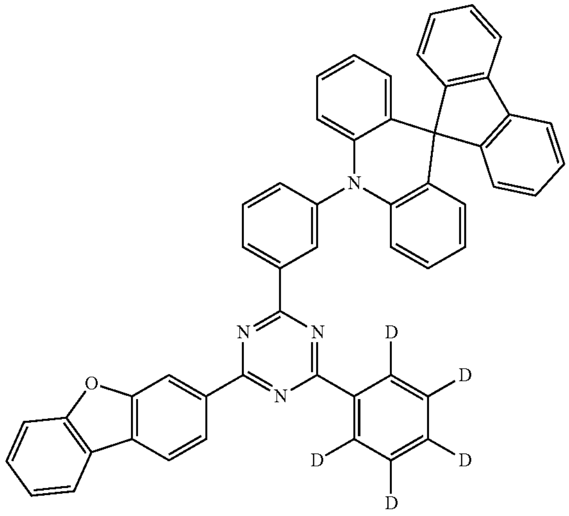
Z3-38
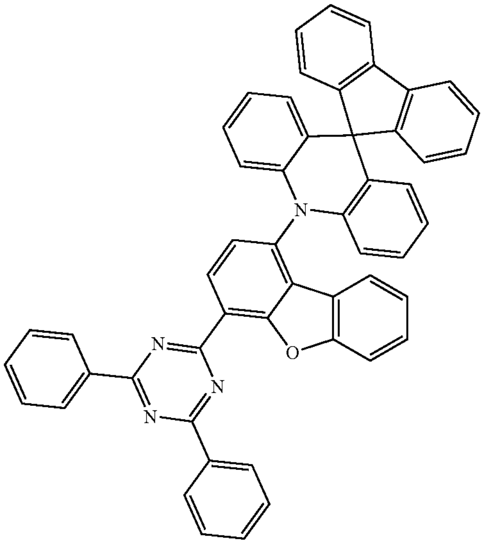
Z3-39
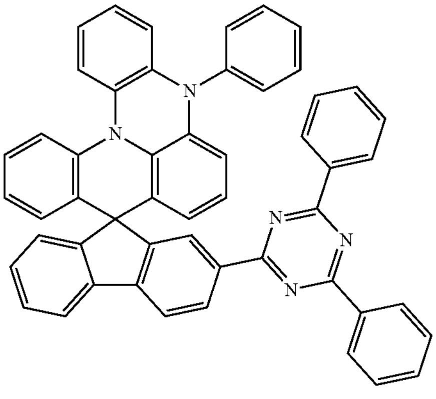
-continued
Z3-40
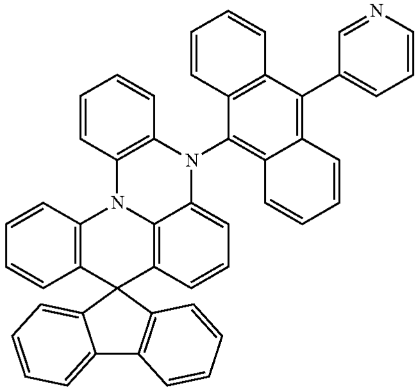
Z3-41
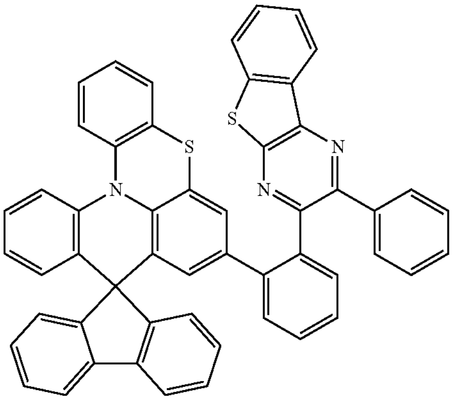
Z3-42
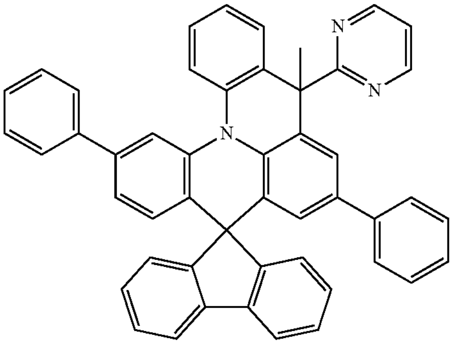
Z3-43
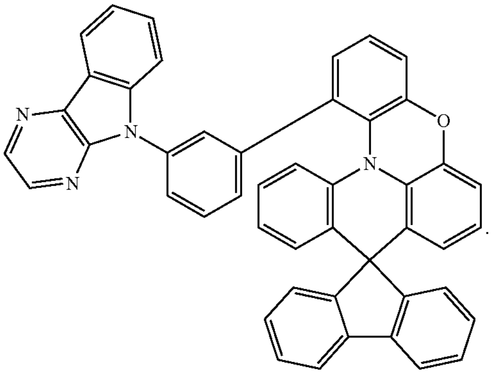
In an embodiment of the present invention, the host of the phosphorescent light emitting layer may be a mixture of the compound represented by Formula 1 and the compound represented by Formula 2 in a weight ratio of 2:8 to 8:2.

In another embodiment of the present invention, the organic material layer further comprises one or more hole transport band layers formed between the light-emitting layer and the anode, the hole transport band layers comprise at least one of a hole transport layer and an emission auxiliary layer and comprise the compound represented by Formula 1.

Hereinafter, examples for synthesizing the compounds represented by Formulas 1 and 2 will be described in detail with reference to examples, but the present invention is not limited to the following examples.

SYNTHESIS EXAMPLE

[Synthesis Example of 1] Synthesis Example of Formula 1

The compound (final product 1, final product 1') represented by Formula 1 according to the present invention may be prepared as shown in Reaction Schemes 1 and 2 below, but is not limited thereto. In Formula 1, the final product 1 may be synthesized by Reaction Scheme 1 when n is 0, and the final product 1' may be synthesized by Reaction Scheme 2 when n is 1.

<Reaction Scheme 1>

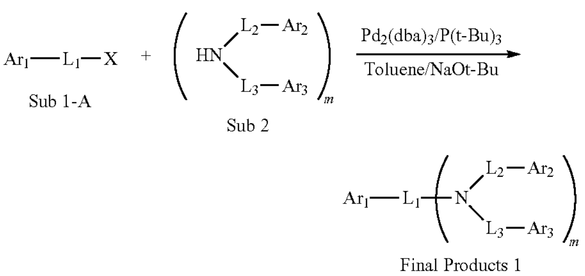

X = Br, I, Cl

<Reaction Scheme 2>

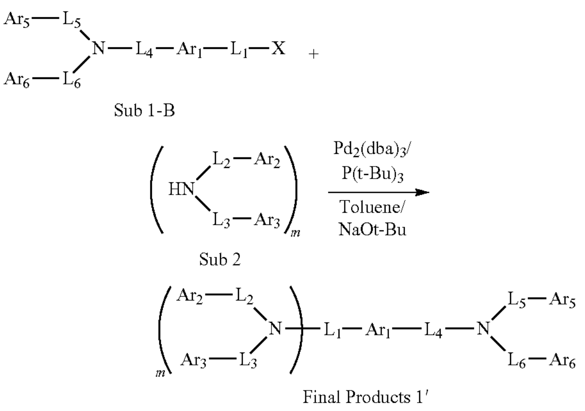

X = Br, I, Cl

[Synthesis Example of 1-1] Synthesis Example of the Compound (Final Product 1') Represented by Formula 1

1. Synthesis example of Sub 1-A

Sub 1-A of Reaction Scheme 1 may be the following structure, but is not limited thereto. Each of symbols is the same as defined in Formula 1-A-1, 1-A-2, 1-D-2, etc., y and z are 0 or 1, and at least one of y and z is 1.

Sub 1-A-a

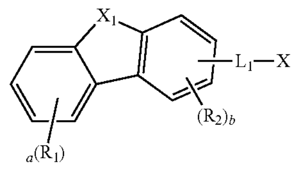

Sub 1-A-b

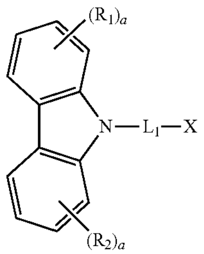

Sub 1-A-c

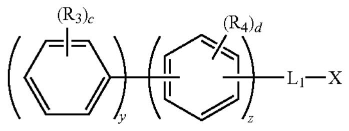

*$X_1$ = N—L'—Ar', O, S, CR'R''

Synthesis of Sub 1-A-a to Sub 1-A-c

The Sub 1-A-a to Sub 1-A-c may be synthesized by the reaction routes of the following Reaction Schemes 3 to 5, but are not limited thereto.

<Reaction Scheme 3>

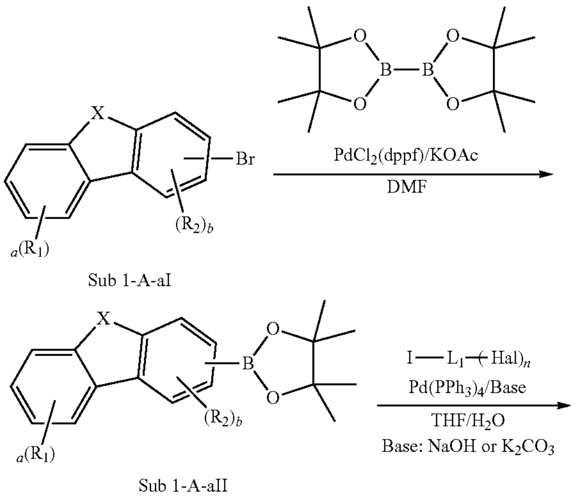

-continued

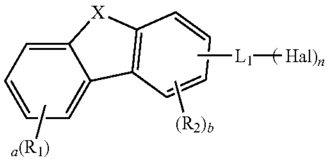

Sub 1-A-a

-continued

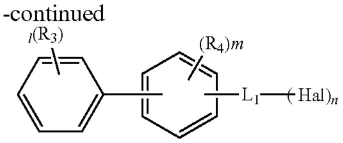

Sub 1-A-c

<Reaction Scheme 4>

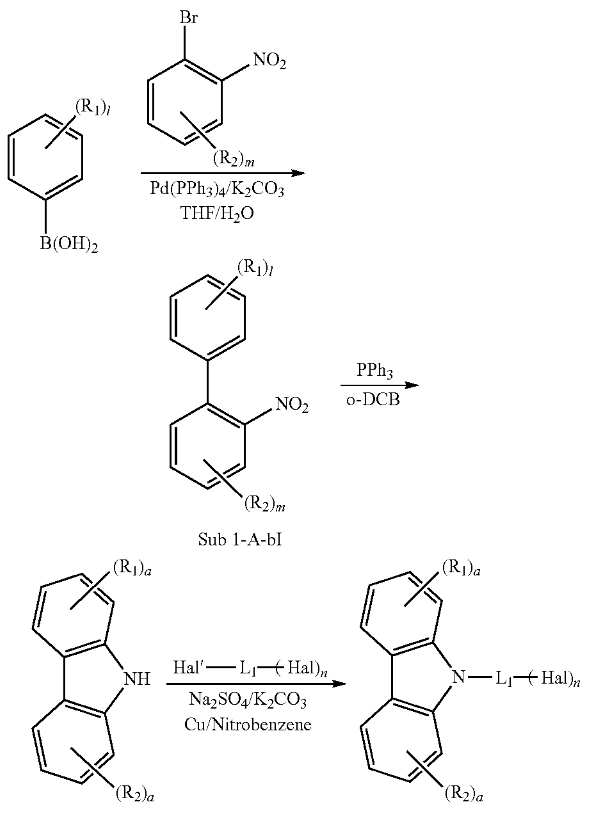

Sub 1-A-bI

Sub 1-A-bII

Sub 1-A-b

<Reaction Scheme 5>

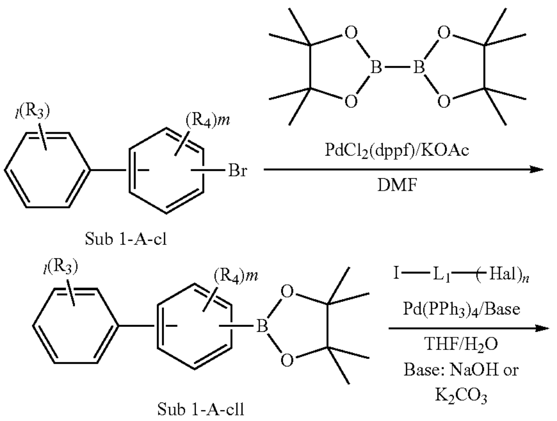

Sub 1-A-cI

Sub 1-A-cII

Synthesis Example of Sub 1-A-3

After 9-phenyl-2-(4,4,5,5-tetramethyl-1,3,2-dioxaborolan-2-yl)-9H-carbazole (29.5 g, 80 mmol) was dissolved in THF (360 mL), 1-bromo-4-iodobenzene (23.8 g, 84 mmol), $Pd(PPh_3)_4$ (2.8 g, 2.4 mmol), NaOH (9.6 g, 240 mmol) and water (180 mL) were added to the solution and the mixture was stirred under reflux. When the reaction was completed, the reaction product was extracted with ether and water. Then, an organic layer was dried over $MgSO_4$ and concentrated. Then, the concentrate was separated by a silica gel column and recrystallized to obtain 22.9 g (72%) of the product.

Synthesis Example of Sub 1-A-5

After 9-phenyl-2-(4,4,5,5-tetramethyl-1,3,2-dioxaborolan-2-yl)-9H-carbazole (73.92 g, 200.2 mmol) was dissolved in THF (880 mL), 1-bromo-2-iodobenzene (85.0 g, 300.3 mmol), $Pd(PPh_3)_4$ (11.6 g, 10 mmol), $K_2CO_3$ (83 g, 600.6 mmol) and water (440 mL) were added to the solution and the synthesis was carried out in the same manner as in the synthesis method of Sub 1-A-3 to obtain 55.8 g (yield: 70%) of the product.

Synthesis Example of Sub 1-A-61

After 4,4,5,5-tetramethyl-2-(naphtho[2,3-b]benzofuran-2-yl)-1,3,2-dioxaborolane (21 g, 61.01 mmol) was dissolved in THF (203 mL), 1,4-dibromonaphthalene (17.45 g, 61.01 mmol), $Pd(PPh_3)_4$ (2.82 g, 2.44 mmol), NaOH (7.32 g, 183.02 mmol) and water (102 mL) were added to the solution and the synthesis was carried out in the same manner as in the synthesis method of Sub 1-A-3 to obtain 22.9 g (75%) of the product.

Compounds belong to Sub 1-A are as follows, but are not limited thereto, and FD-MS values of the compounds are shown in Table 1 below.

Sub 1-A-1

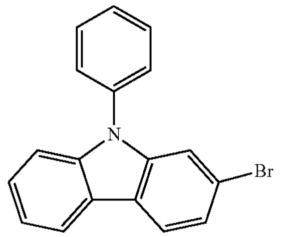

-continued
Sub 1-A-2
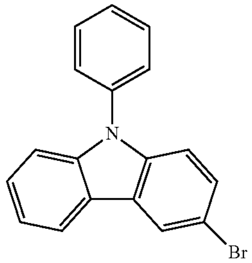
Sub 1-A-3
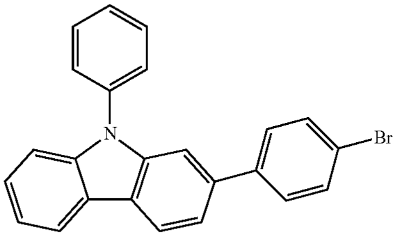
Sub 1-A-4
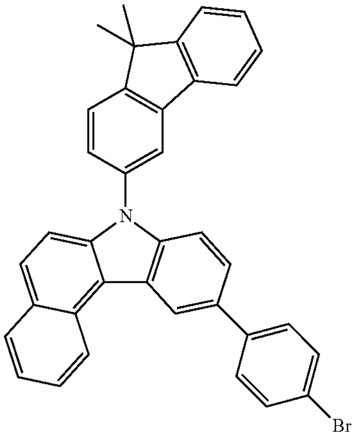
Sub 1-A-5
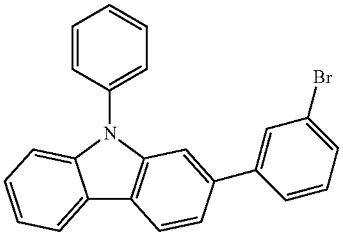
Sub 1-A-6
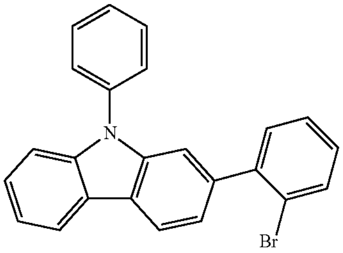
-continued
Sub 1-A-7
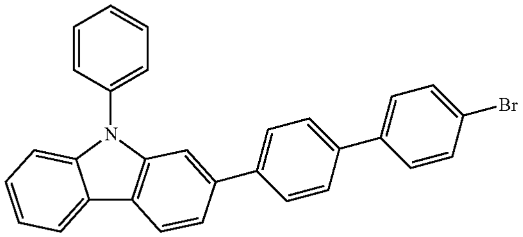
Sub 1-A-8
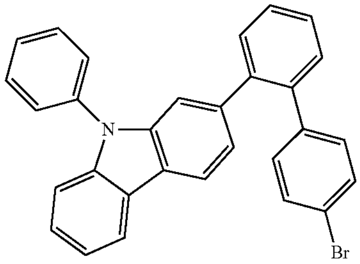
Sub 1-A-9
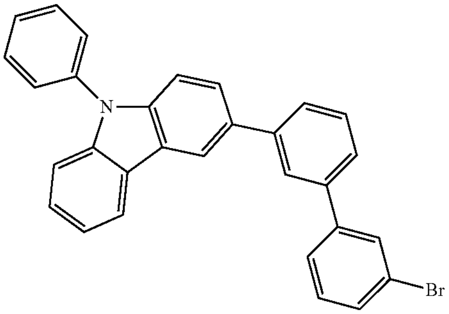
Sub 1-A-10
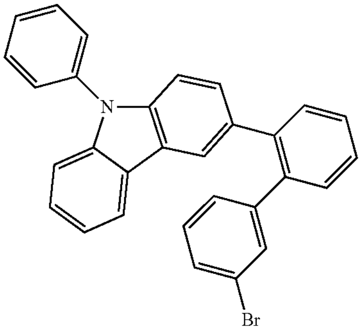
Sub 1-A-11
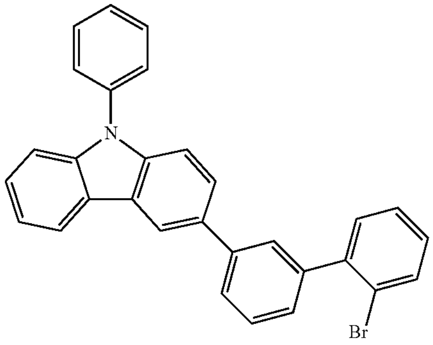

-continued
Sub 1-A-12
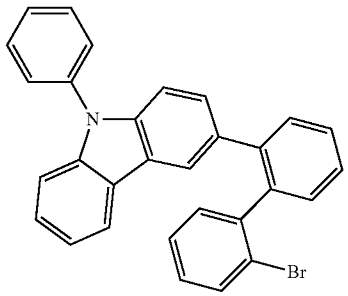
Sub 1-A-13
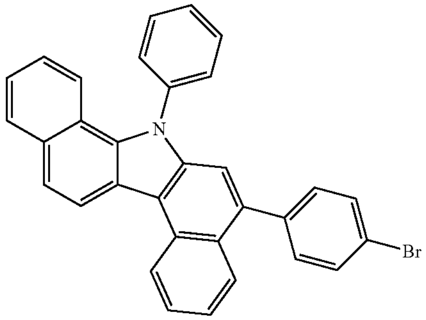
Sub 1-A-14
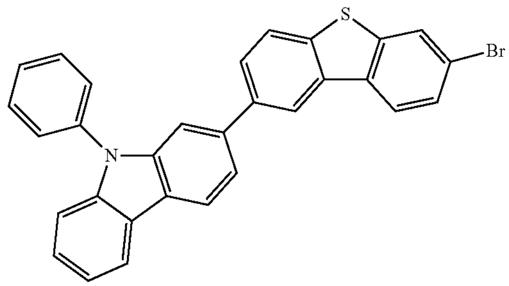
Sub 1-A-15
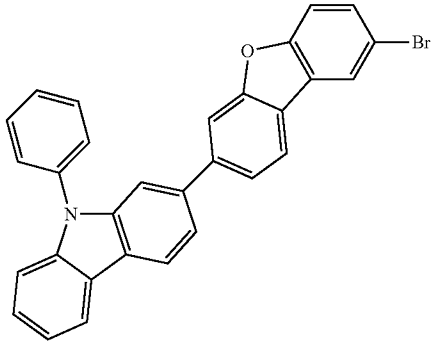
-continued
Sub 1-A-16
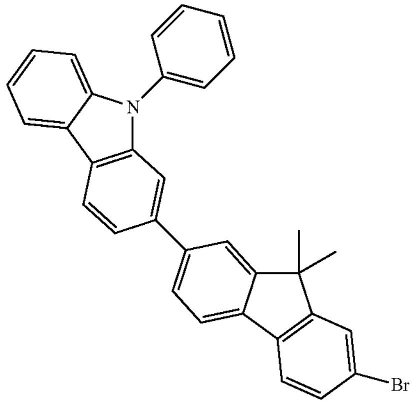
Sub 1-A-17
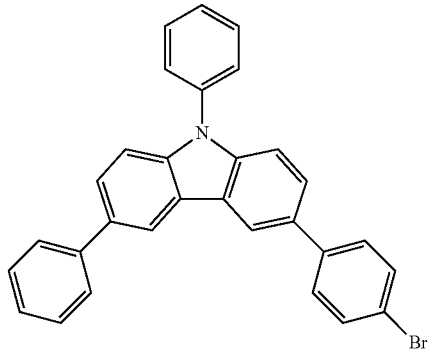
Sub 1-A-18
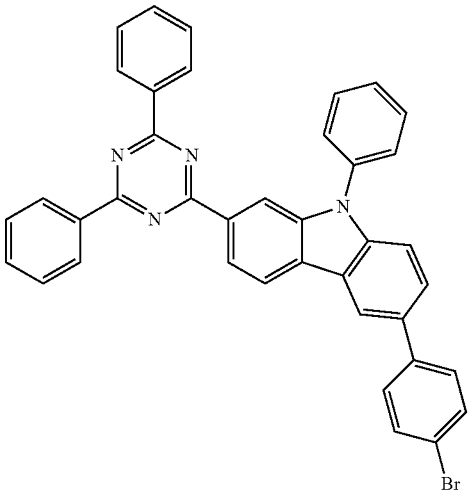

-continued
Sub 1-A-19
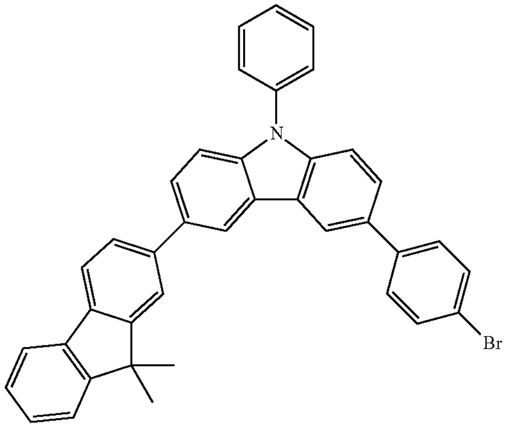
Sub 1-A-20
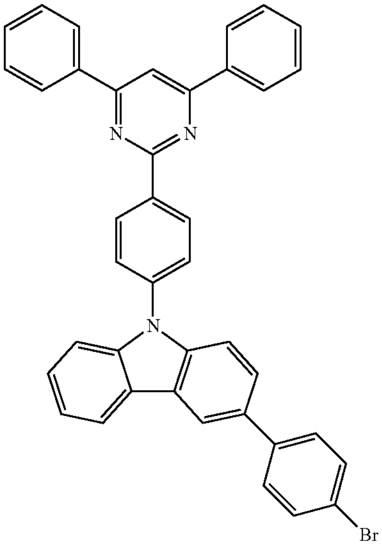
Sub 1-A-21
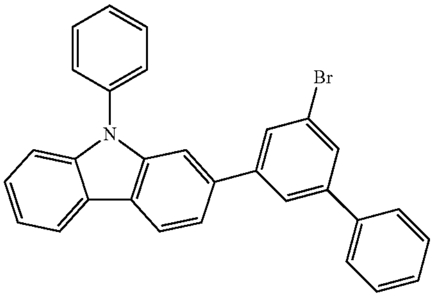
Sub 1-A-27
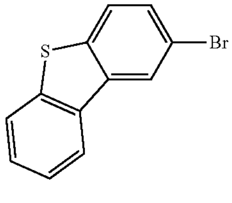
-continued
Sub 1-A-28
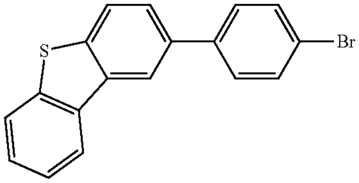
Sub 1-A-29
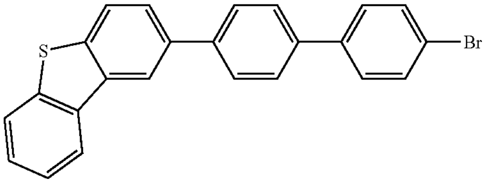
Sub 1-A-31
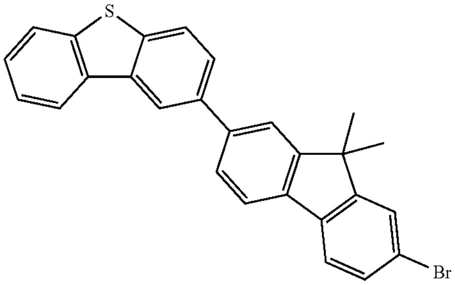
Sub 1-A-32
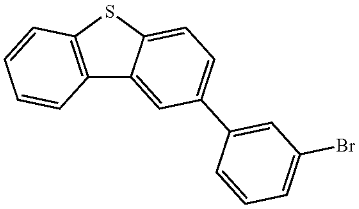
Sub 1-A-32
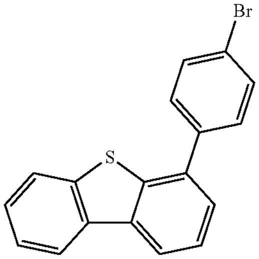
Sub 1-A-33
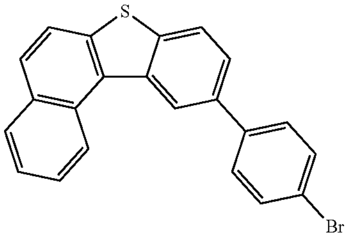

-continued
Sub 1-A-34
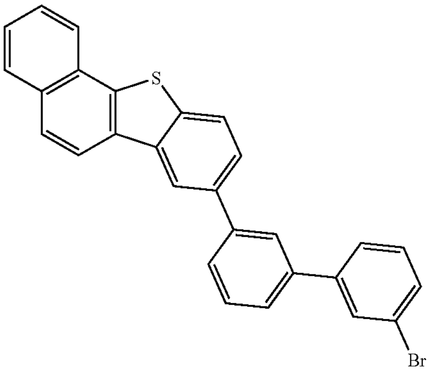
Sub 1-A-35
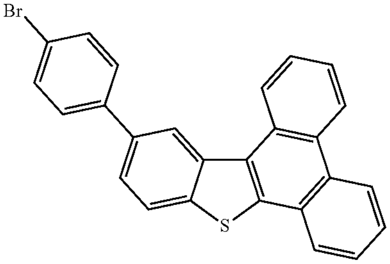
Sub 1-A-36
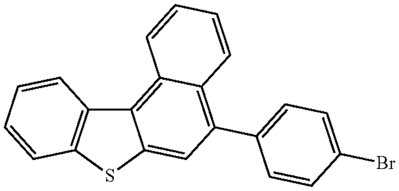
Sub 1-A-37
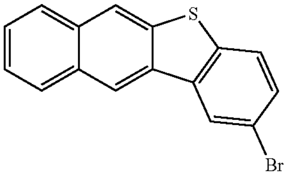
Sub 1-A-38
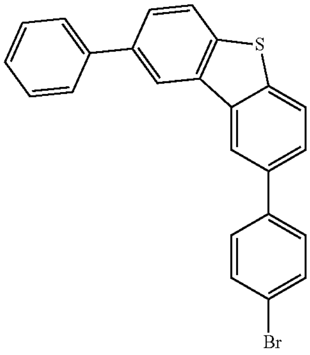
-continued
Sub A-1-39
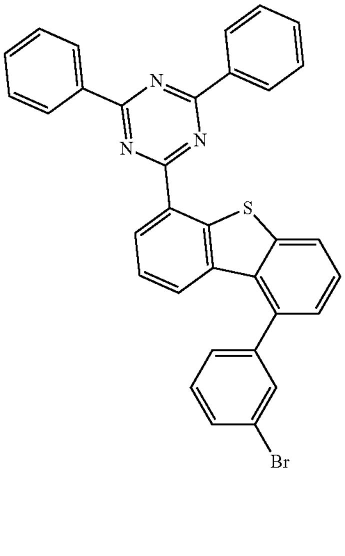
Sub A-1-40
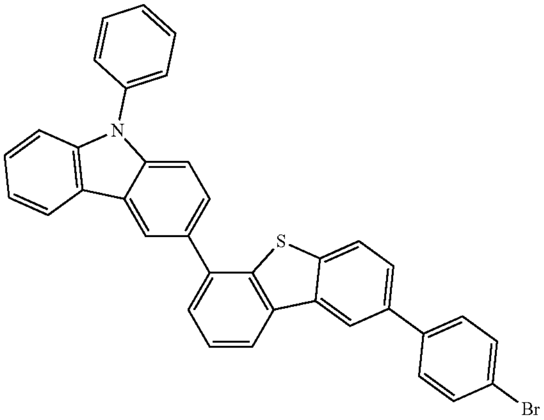
Sub A-1-41
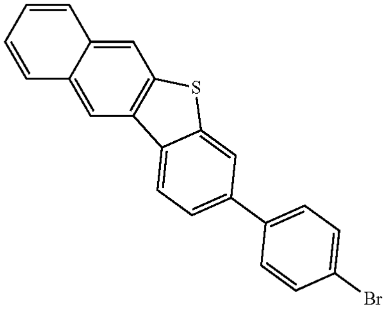
Sub A-1-42
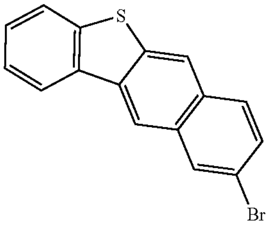

-continued
Sub 1-A-43
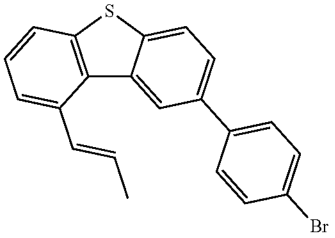
Sub 1-A-44
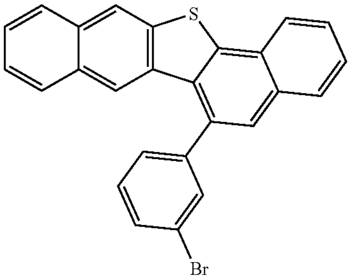
Sub 1-A-45
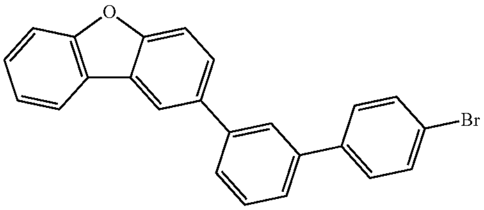
Sub 1-A-46
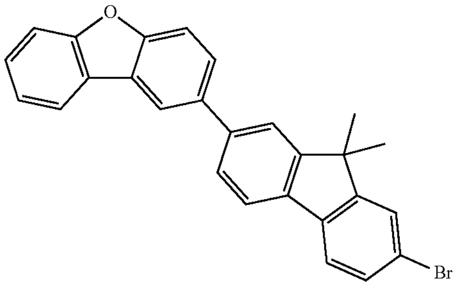
Sub 1-A-47
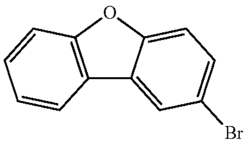
Sub 1-A-48
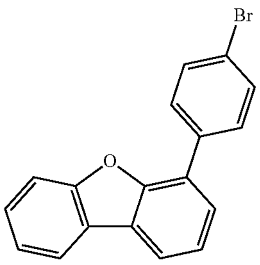
-continued
Sub 1-A-49
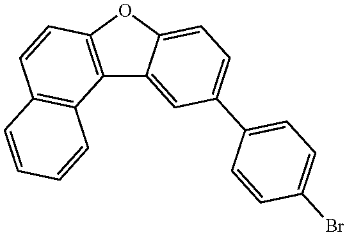
Sub 1-A-50
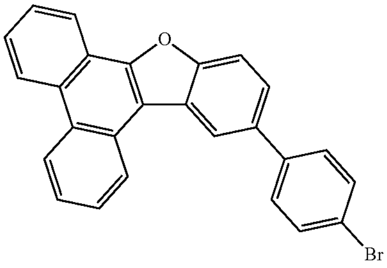
Sub A-1-51
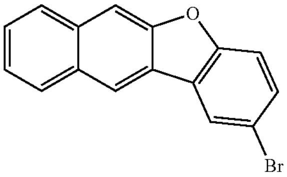
Sub 1-A-52
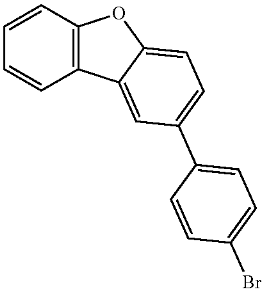
Sub 1-A-53
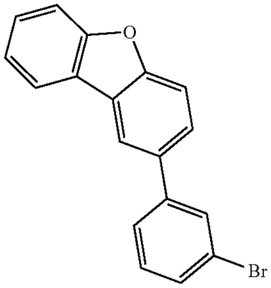
Sub A-1-54
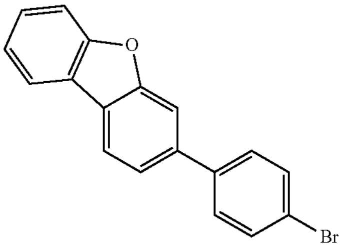

-continued
Sub A-1-55
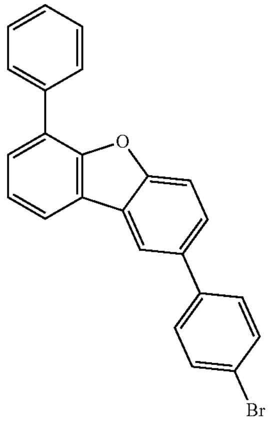
Sub A-1-56
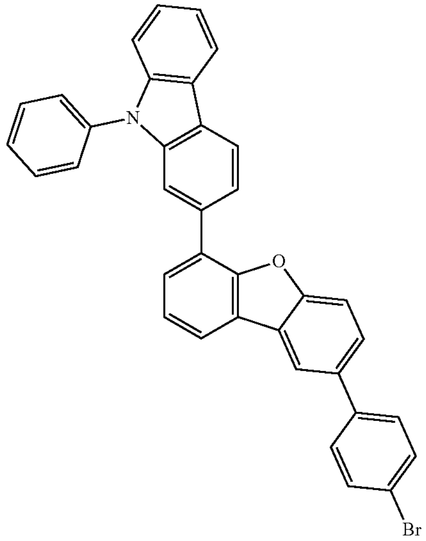
Sub 1-A-57
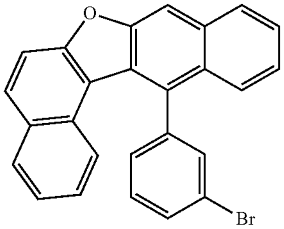
Sub 1-A-58
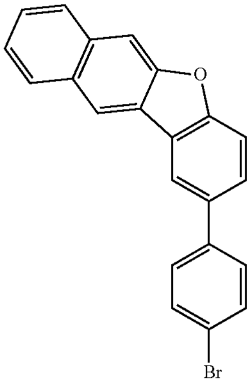
-continued
Sub 1-A-59
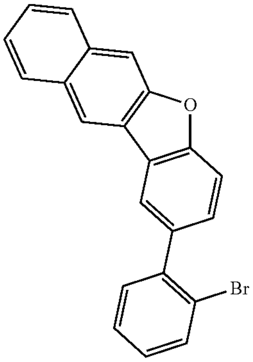
Sub 1-A-60
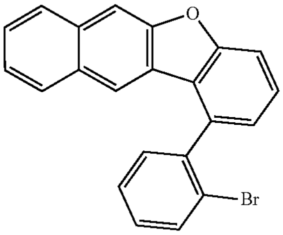
Sub 1-A-61
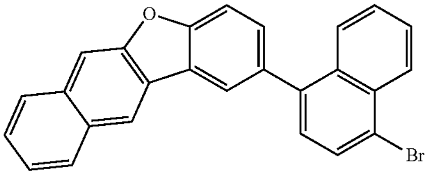
Sub 1-A-62
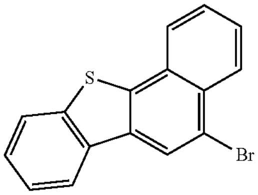
Sub 1-A-63
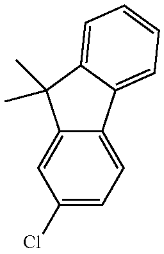
Sub 1-A-64
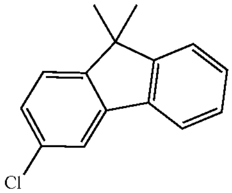

-continued
Sub 1-A-65
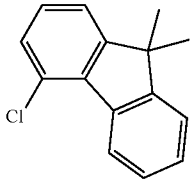
Sub 1-A-66
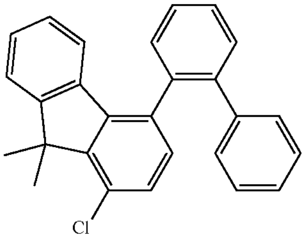
Sub 1-A-67
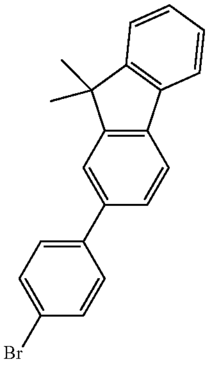
Sub 1-A-68
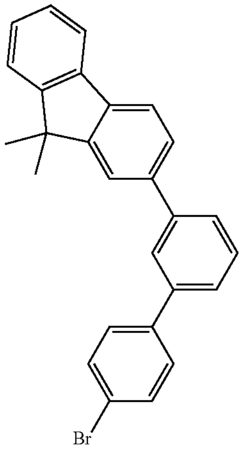
-continued
Sub 1-A-69
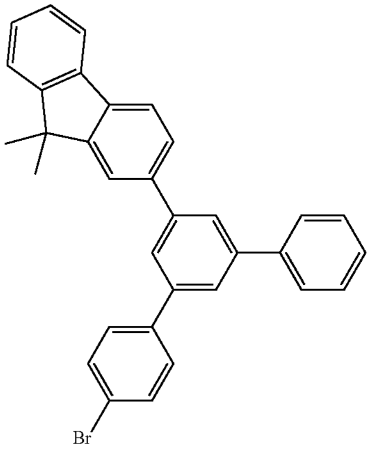
Sub 1-A-70
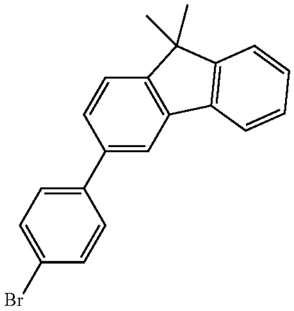
Sub 1-A-71
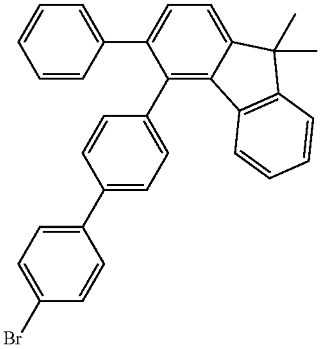
Sub 1-A-72
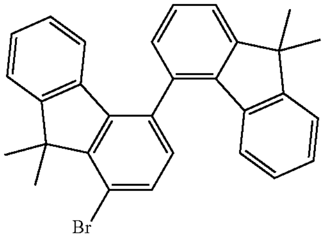
Sub 1-A-73
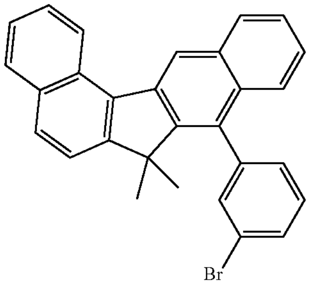

Sub 1-A-74
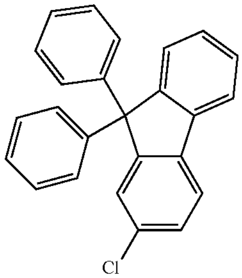
Sub 1-A-75
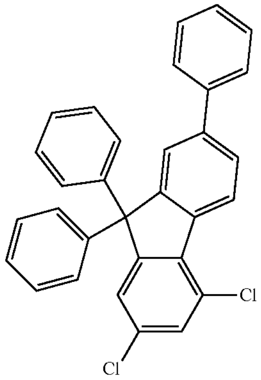
Sub 1-A-76
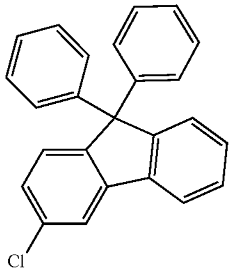
Sub 1-A-77
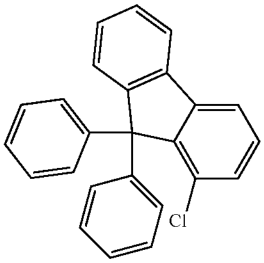
Sub 1-A-78
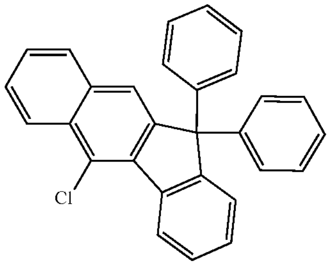
Sub 1-A-79
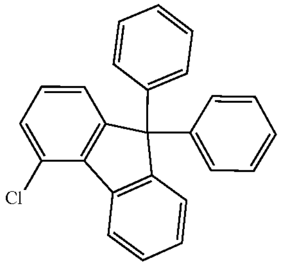
Sub 1-A-80
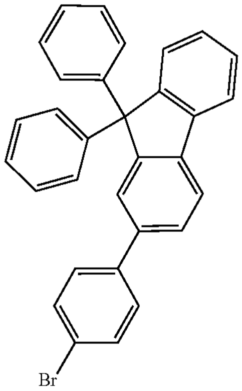
Sub 1-A-81
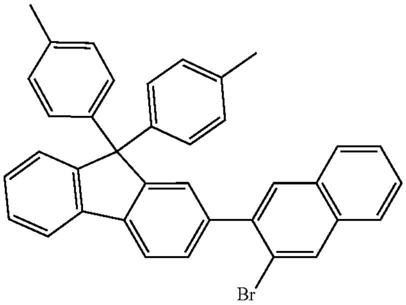
Sub 1-A-82
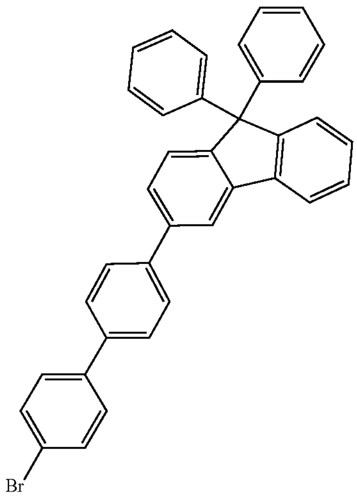

-continued
Sub 1-A-83
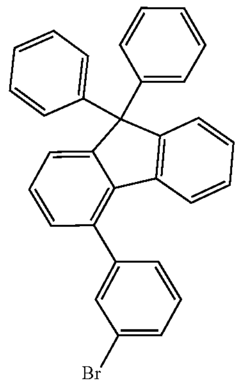
Sub 1-A-84
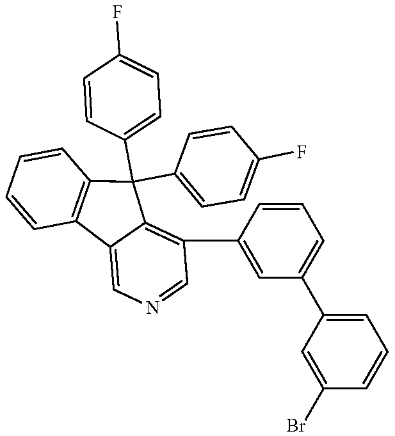
Sub 1-A-85
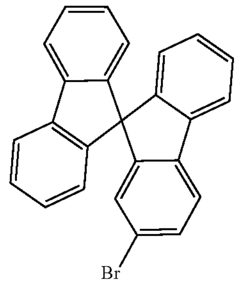
Sub 1-A-86
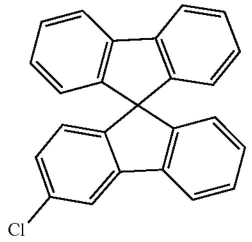
Sub 1-A-87
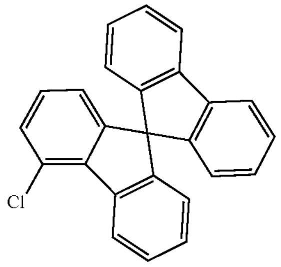
-continued
Sub 1-A-88
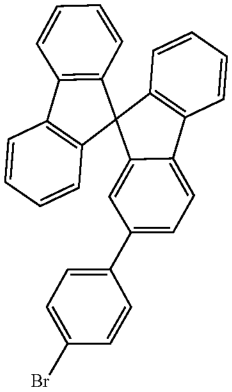
Sub 1-A-89
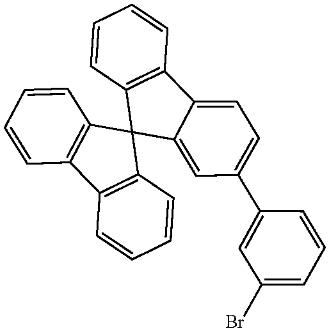
Sub 1-A-90
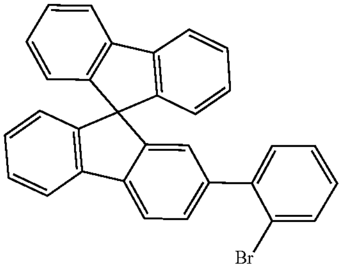
Sub 1-A-91
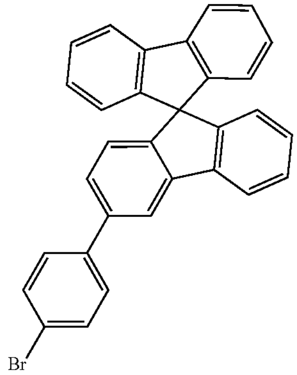

-continued
Sub 1-A-92
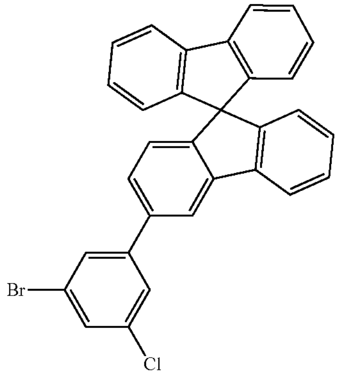
Sub 1-A-93
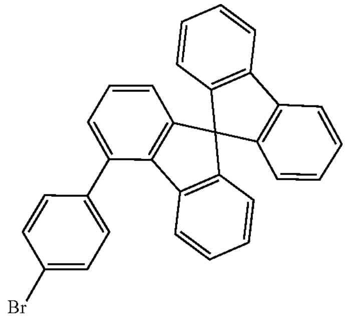
Sub 1-A-94
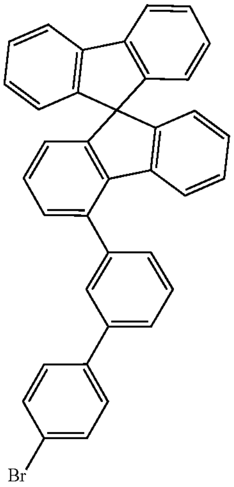
Sub 1-A-95
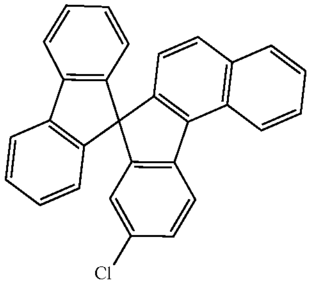
-continued
Sub 1-A-96
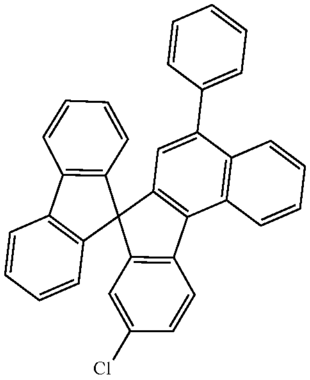
Sub 1-A-97
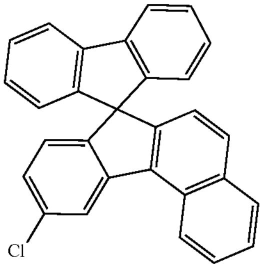
Sub 1-A-98
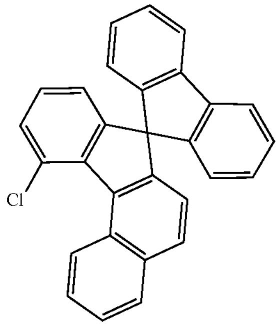
Sub 1-A-99
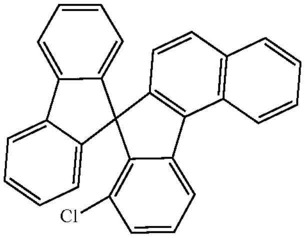
Sub 1-A-100
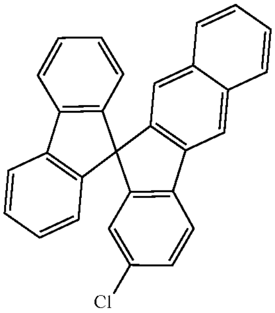

-continued
Sub 1-A-101
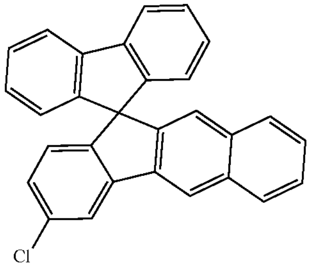
Sub 1-A-102
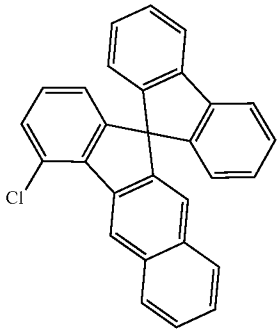
Sub 1-A-103
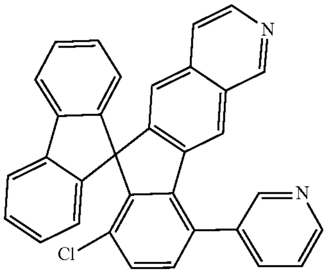
Sub 1-A-104
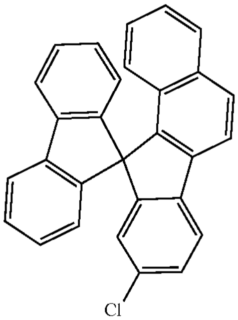
Sub 1-A-105
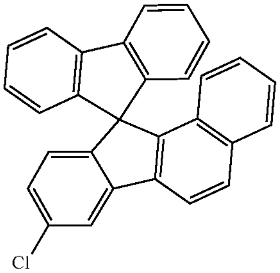
-continued
Sub 1-A-106
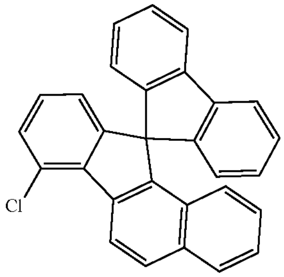
Sub 1-A-107
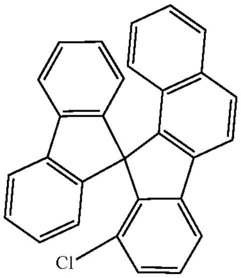
Sub 1-A-108
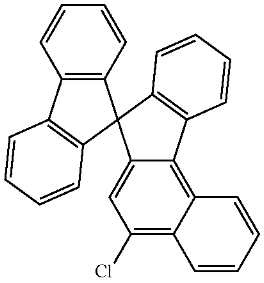
Sub 1-A-109
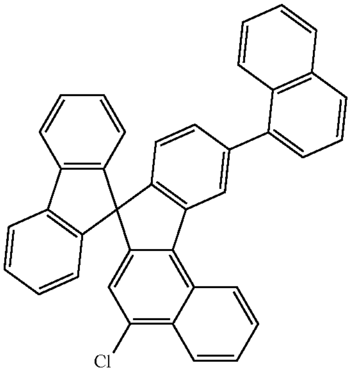
Sub 1-A-110
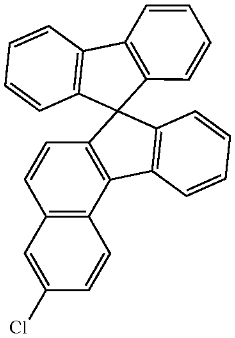

-continued
Sub 1-A-111
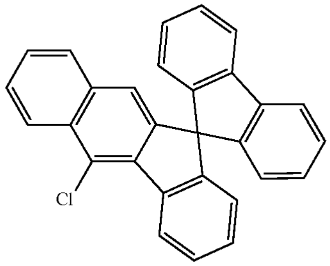
Sub 1-A-112
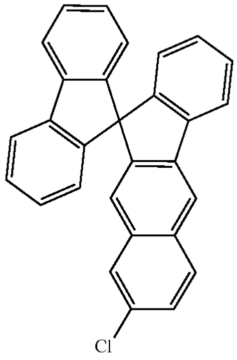
Sub 1-A-113
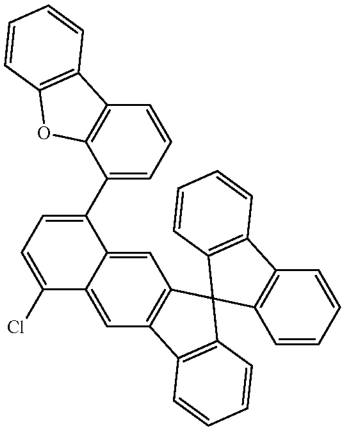
Sub 1-A-114
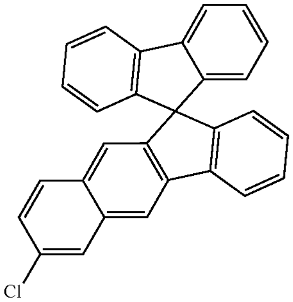
-continued
Sub 1-A-115
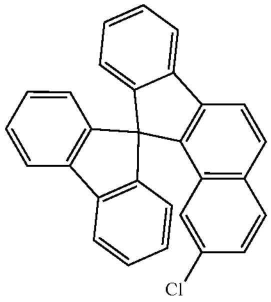
Sub 1-A-116
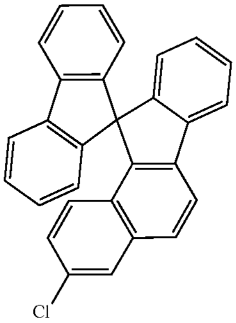
Sub 1-A-117
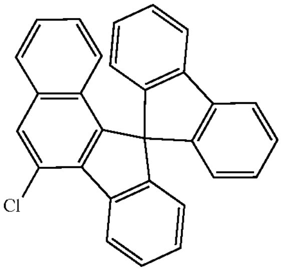
Sub 1-A-118
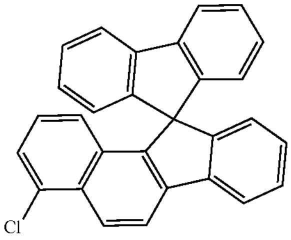
Sub 1-A-119
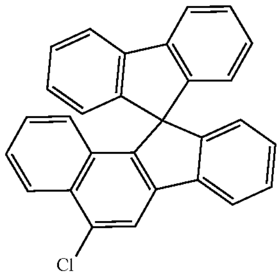

Sub 1-A-120
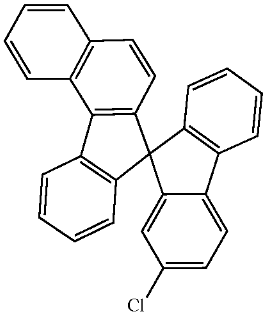
Sub 1-A-121
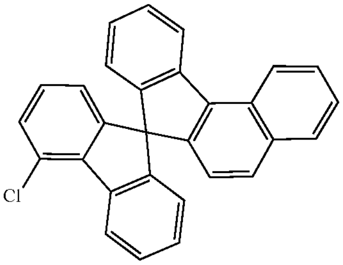
Sub 1-A-122
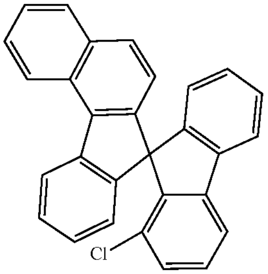
Sub 1-A-123
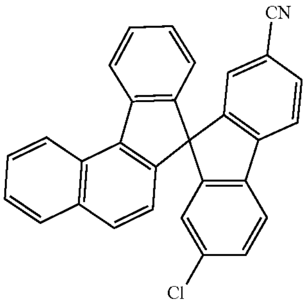
Sub 1-A-124
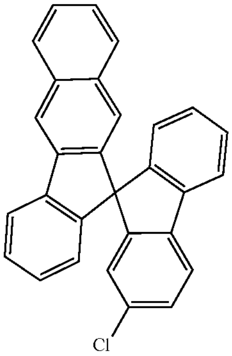
Sub 1-A-125
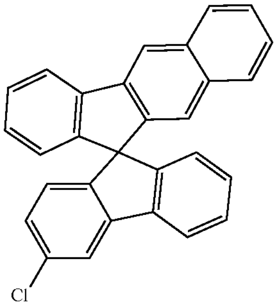
Sub 1-A-126
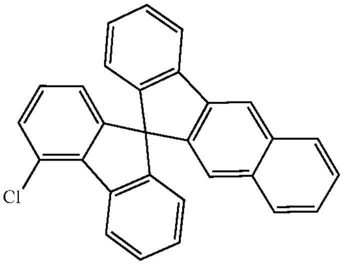
Sub 1-A-127
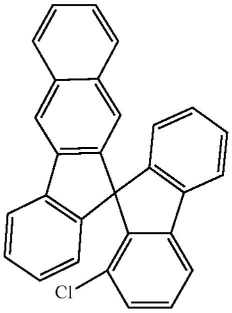
Sub 1-A-128
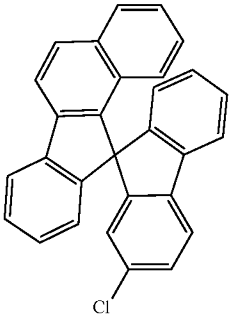
Sub 1-A-129
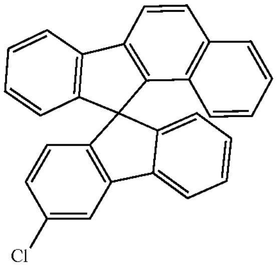

-continued
Sub 1-A-130
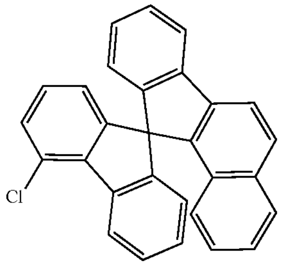
Sub 1-A-131
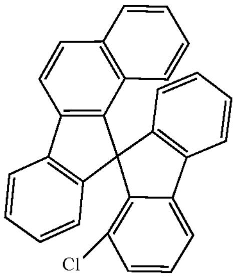
Sub 1-A-132
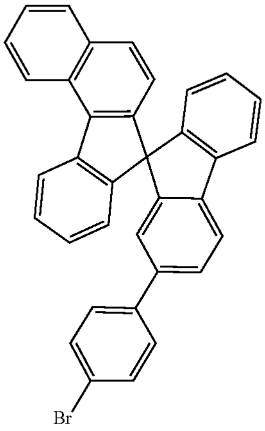
Sub 1-A-133
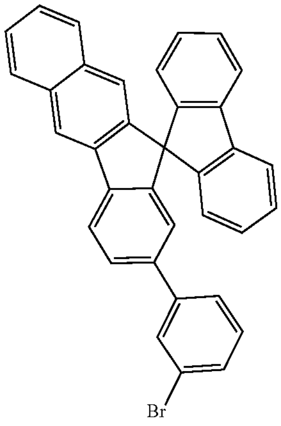
-continued
Sub 1-A-134
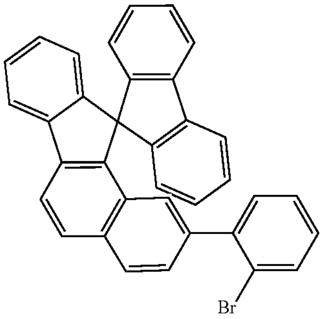
Sub 1-A-135
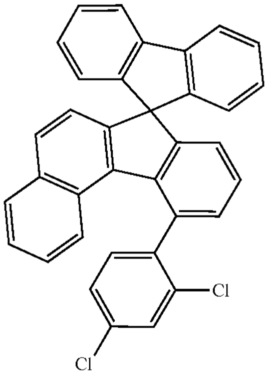
Sub 1-A-136
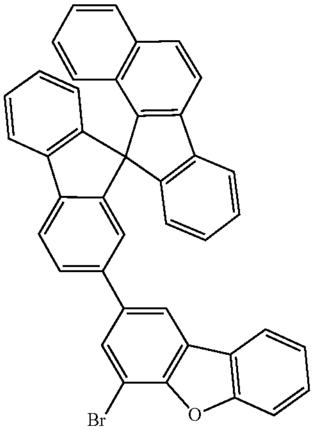
Sub 1-A-137
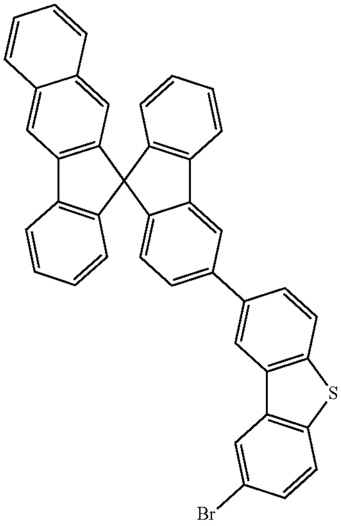

-continued
Sub 1-A-138
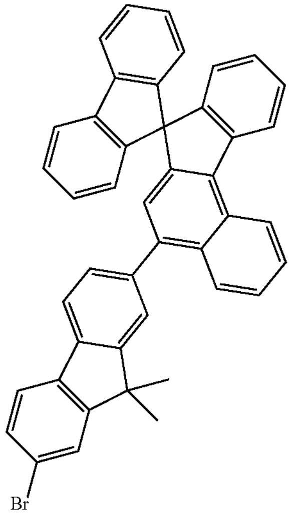
Sub 1-A-139
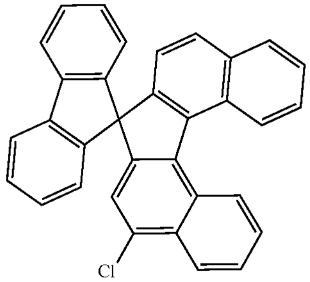
Sub 1-A-140
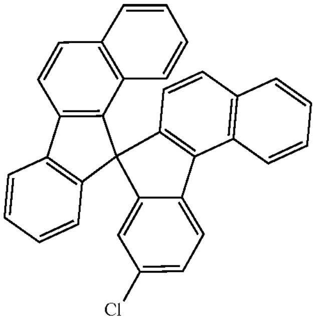
Sub 1-A-141
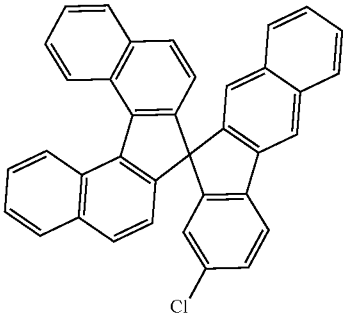
-continued
Sub 1-A-142
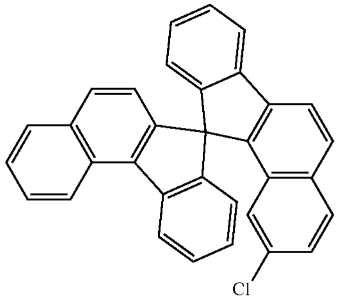
Sub 1-A-143
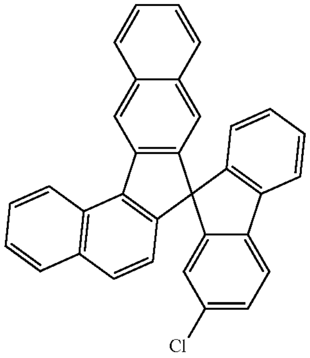
Sub 1-A-144
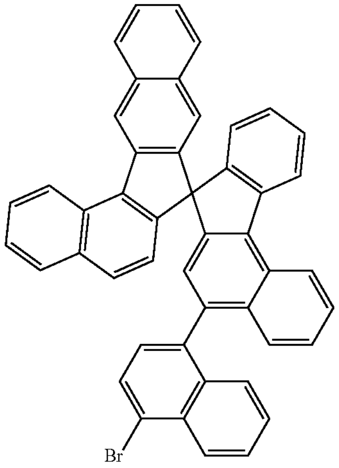
Sub 1-A-145
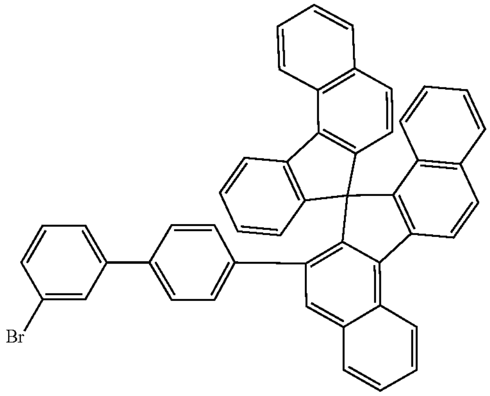

-continued
Sub 1-A-146
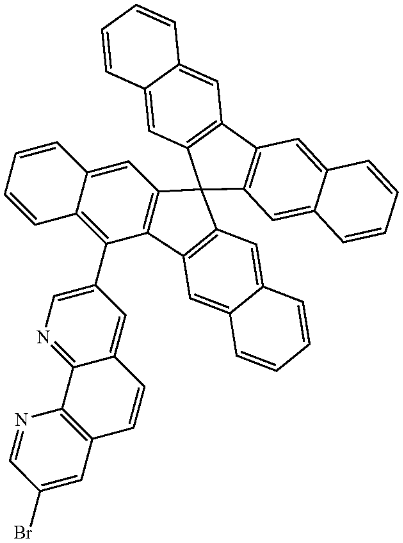
Sub 1-A-147
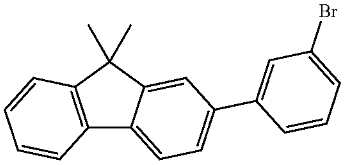
Sub 1-A-148
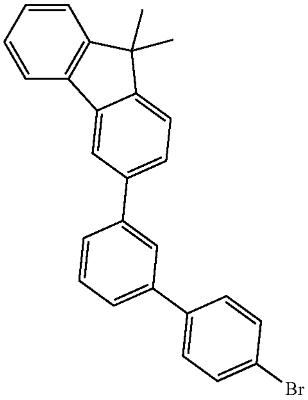
Sub 1-A-149
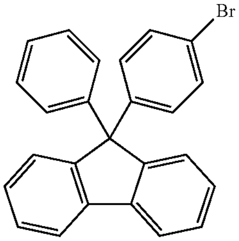
Sub 1-A-50
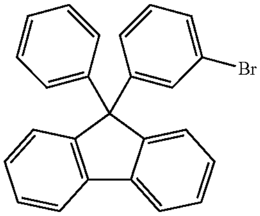
-continued
Sub 1-A-151
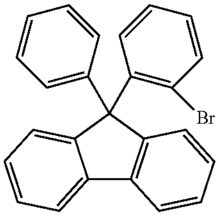
Sub 1-A-152
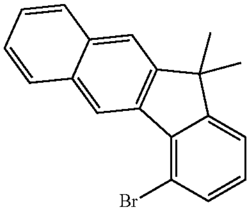
Sub 1-A-153
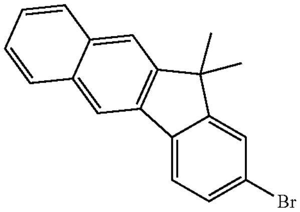
Sub 1-A-154
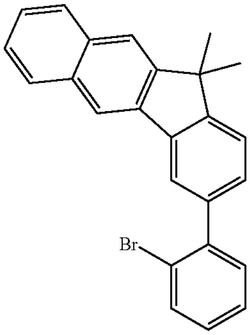
Sub 1-A-155
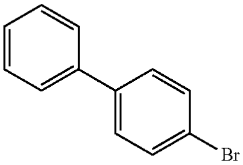
Sub 1-A-156
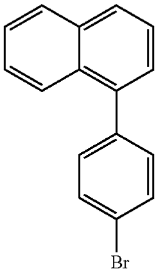

-continued
Sub 1-A-157
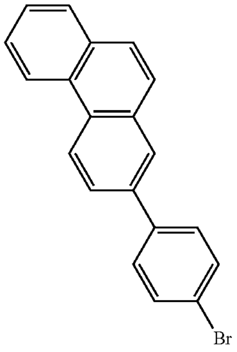
Sub 1-A158
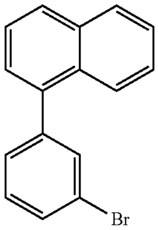
Sub 1-A-159
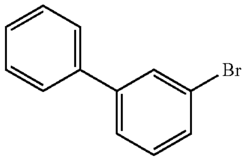
Sub 1-A-160
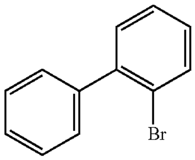
Sub 1-A-161
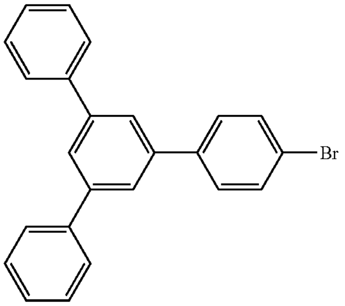
Sub 1-A-162
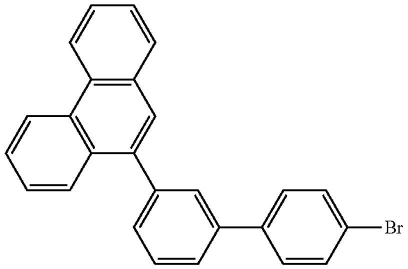
-continued
Sub 1-A-163
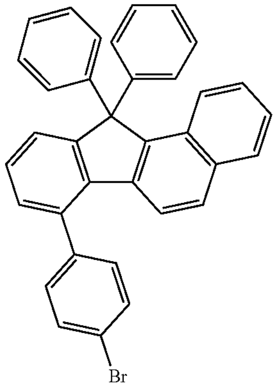
Sub 1-A-164
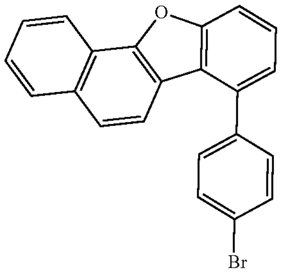
Sub 1-A-165
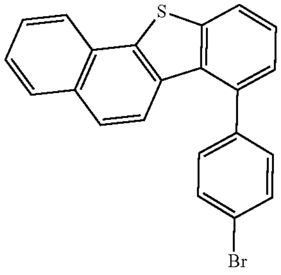
Sub 1-A-166
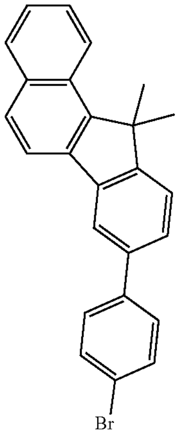

-continued
Sub 1-A-167
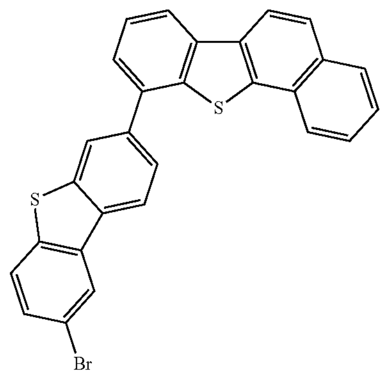
Sub 1-A-168
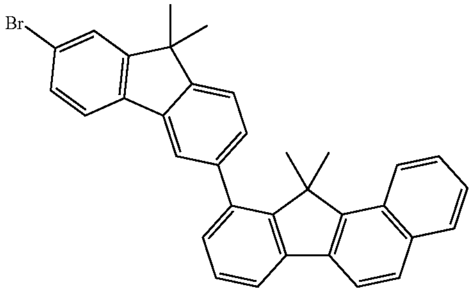
Sub 1-A-169
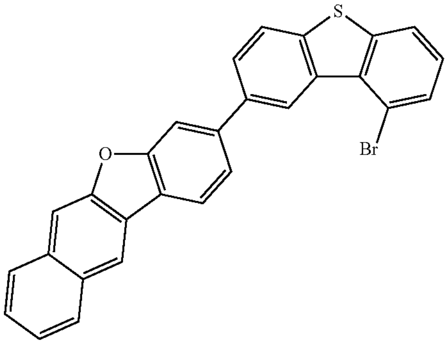
Sub 1-A-170
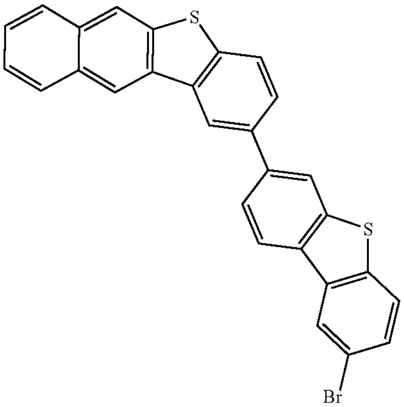
-continued
Sub 1-A-171
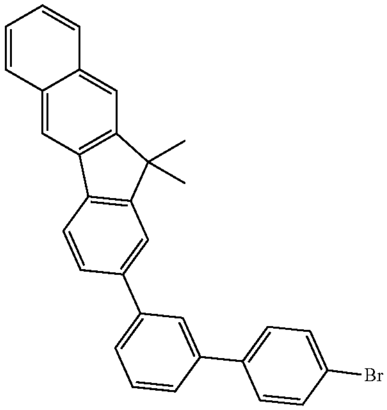
Sub 1-A-172
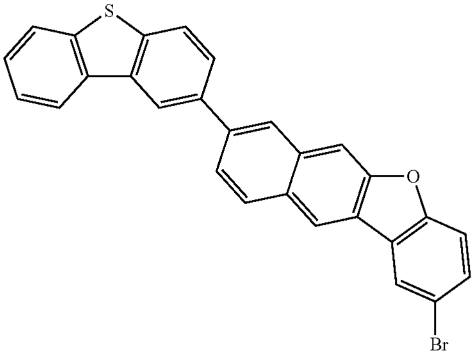
Sub 1-A-173
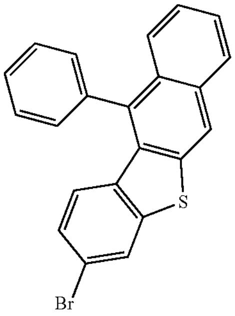
Sub 1-A-b-1
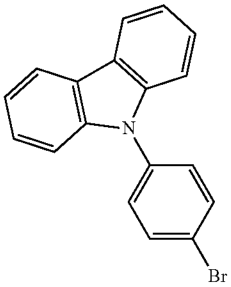

-continued
Sub 1-A-b-2
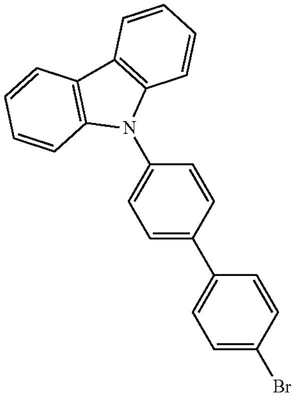
Sub 1-A-b-3
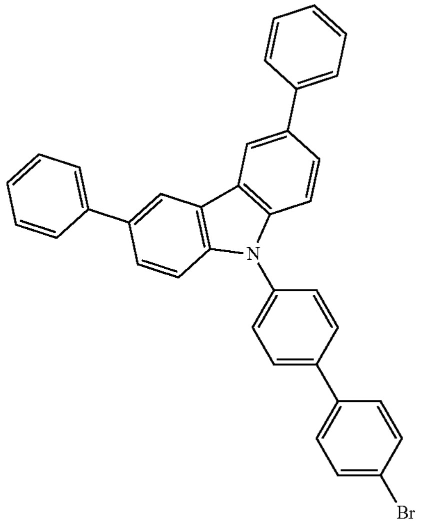
Sub 1-A-b-4
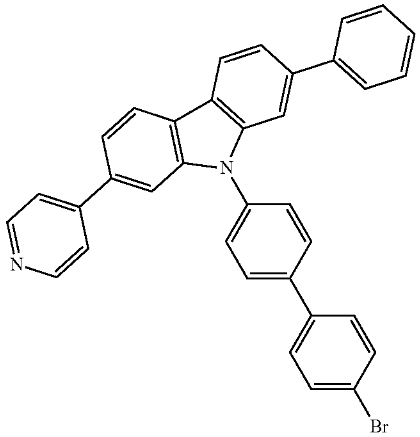
-continued
Sub 1-A-b-5
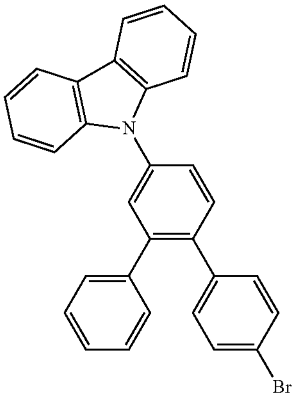
Sub 1-A-b-6
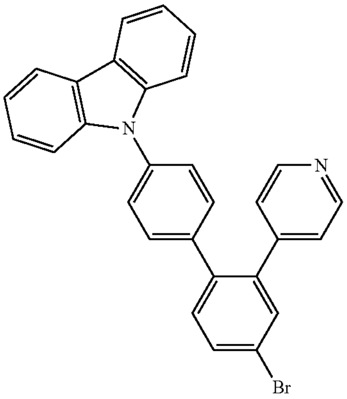
Sub 1-A-b-7
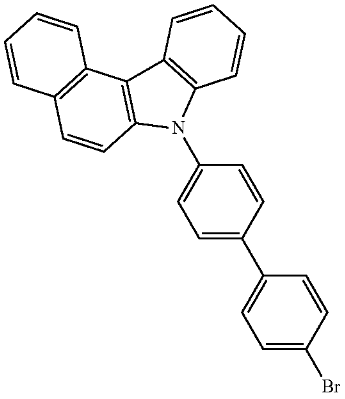
Sub 1-A-b-8
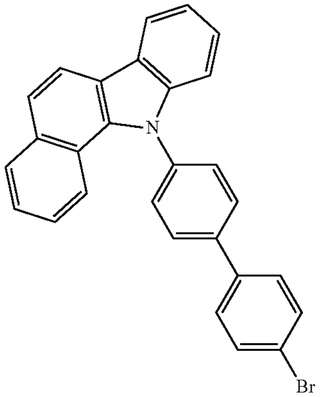

-continued
Sub 1-A-b-9
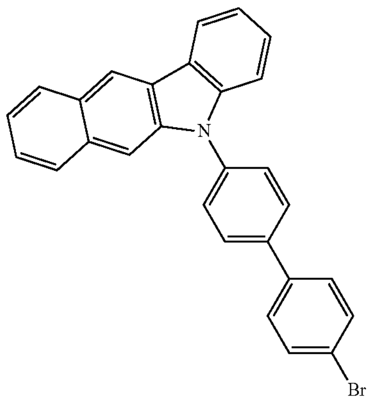
Sub 1-A-b-10
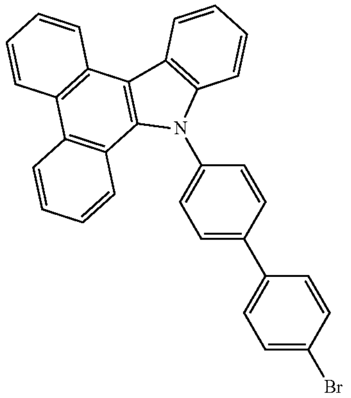
Sub 1-A-b-11
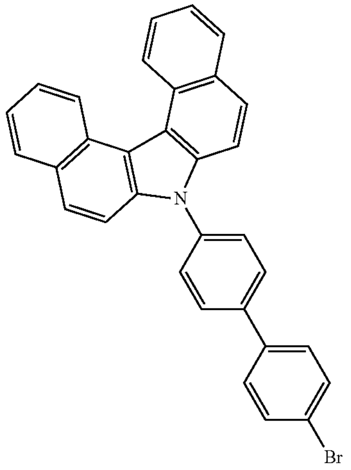
-continued
Sub 1-A-b-12
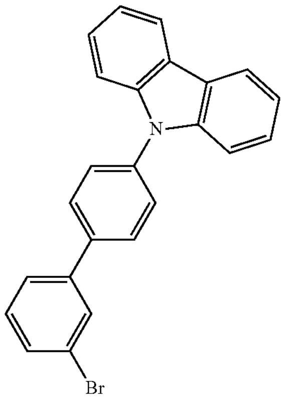
Sub 1-A-b-13
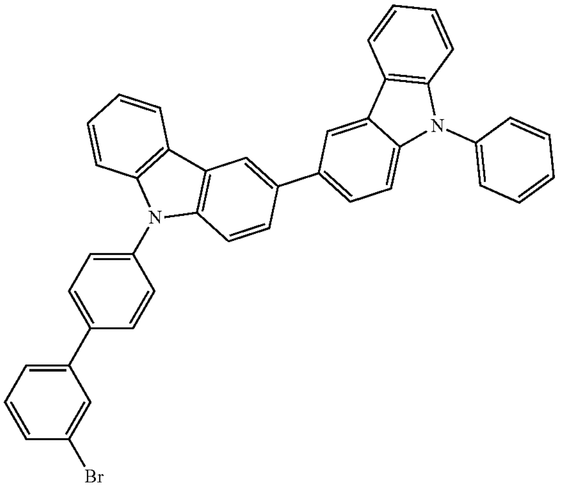
Sub 1-A-b-14
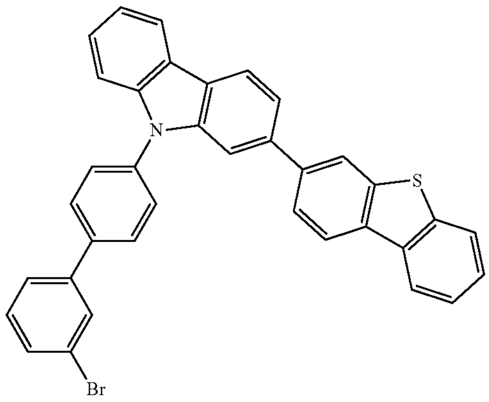

-continued
Sub 1-A-b-15
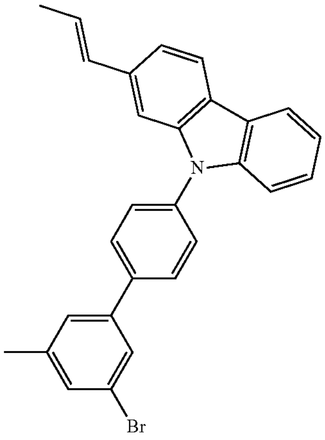
Sub 1-A-b-16
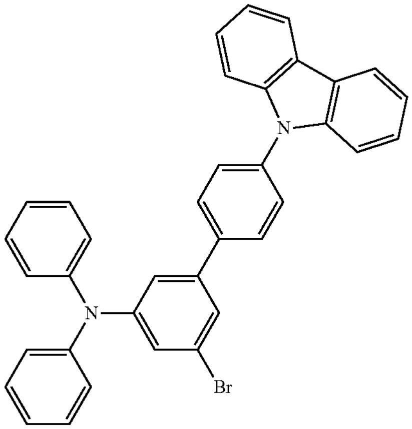
Sub 1-A-b-17
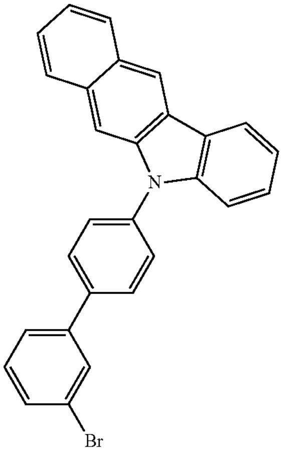
Sub 1-A-b-18
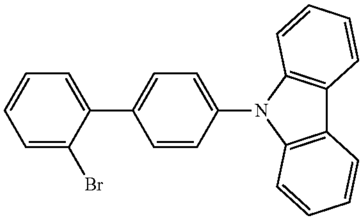
-continued
Sub 1-A-b-19
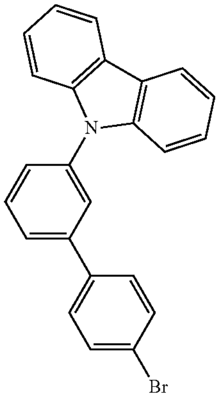
Sub 1-A-b-20
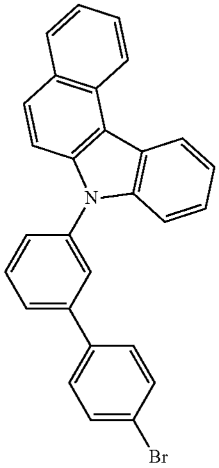
Sub 1-A-b-21
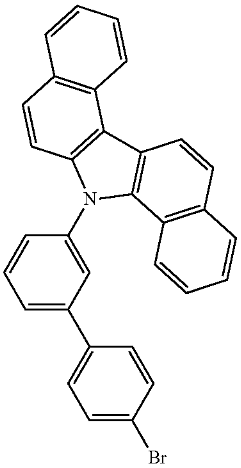

-continued
Sub 1-A-b-22
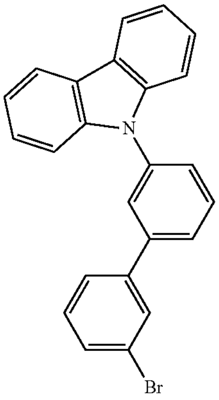
Sub 1-A-b-23
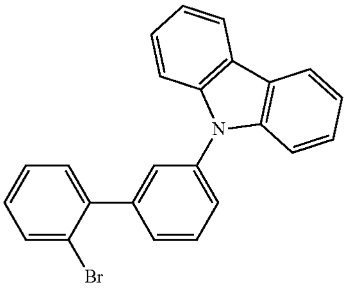
Sub 1-A-b-24
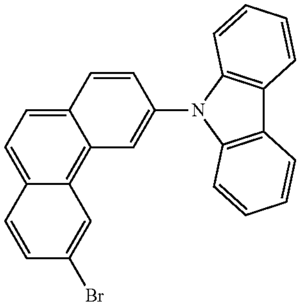
Sub 1-A-b-25
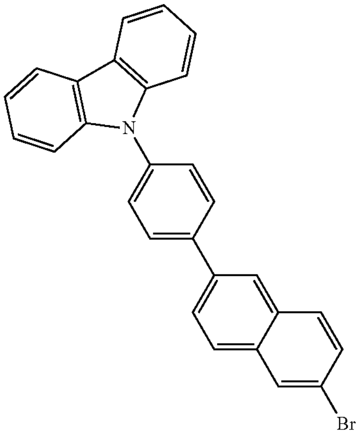
-continued
Sub 1-A-b-26
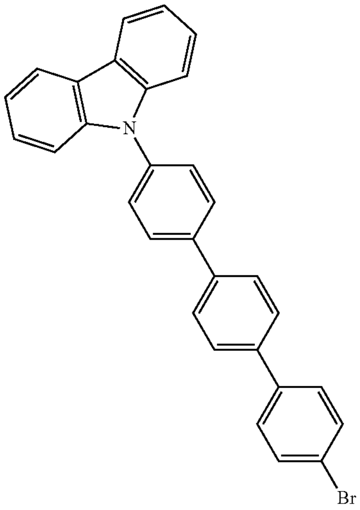
Sub 1-A-b-27
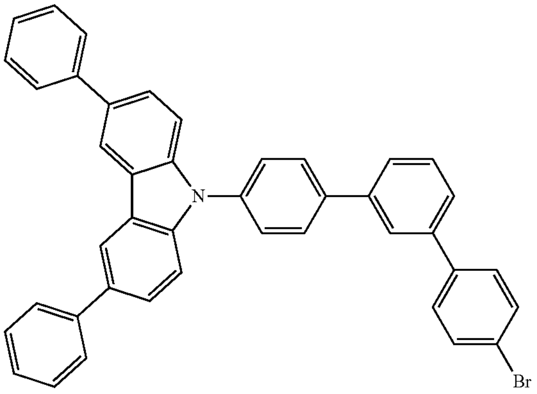
Sub 1-A-b-28
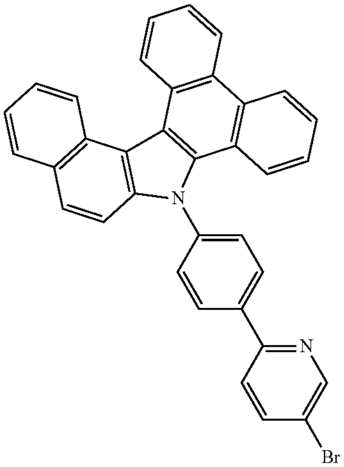

-continued
Sub 1-A-b-29
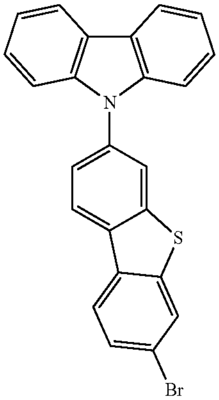
Sub 1-A-b-30
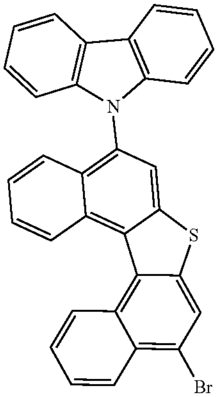
Sub 1-A-b-31
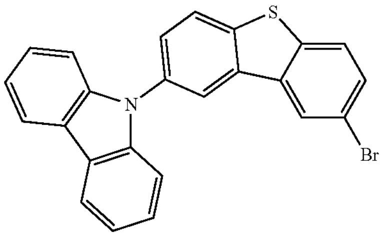
Sub 1-A-b-32
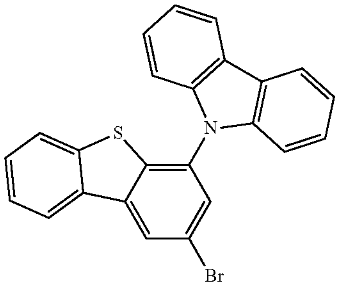
Sub 1-A-b-33
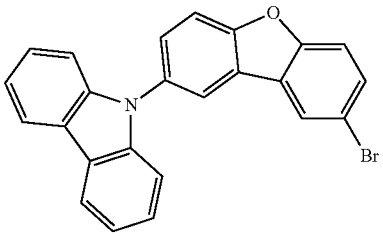
-continued
Sub 1-A-b-34
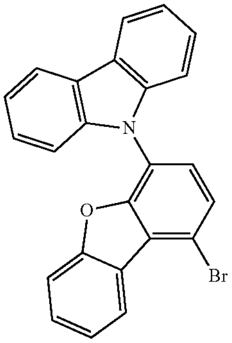
Sub 1-A-b-35
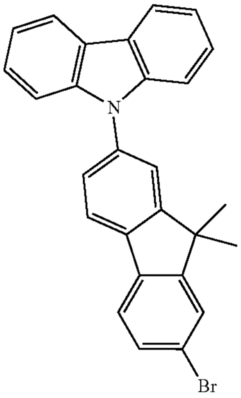
Sub 1-A-b-36
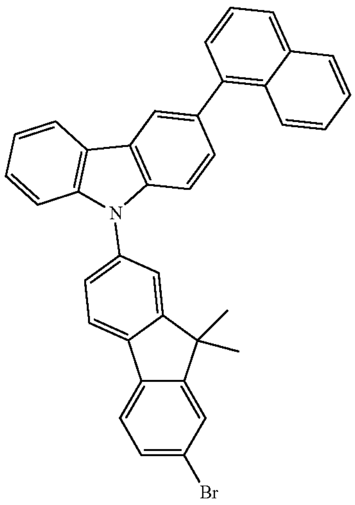

-continued
Sub 1-A-b-37
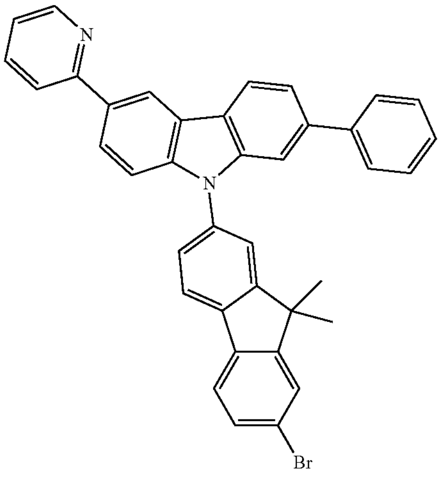
Sub 1-A-b-38
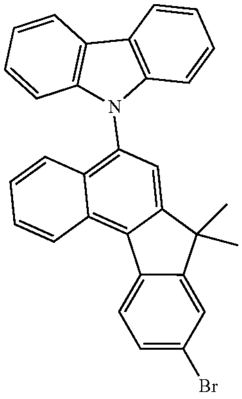
Sub 1-A-b-39
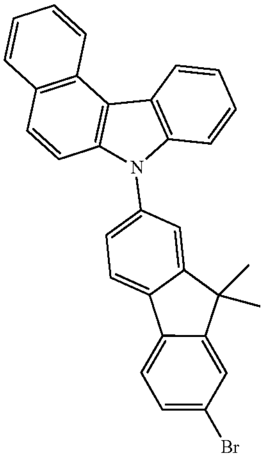
-continued
Sub 1-A-b-40
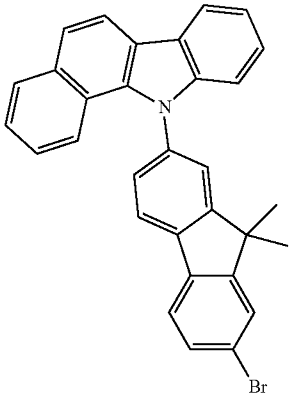
Sub 1-A-b-41
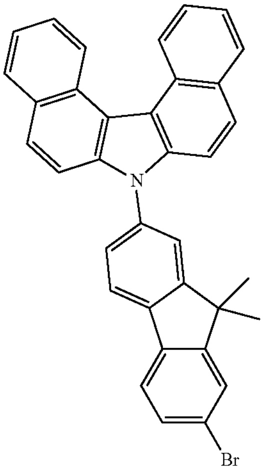
Sub 1-A-b-42
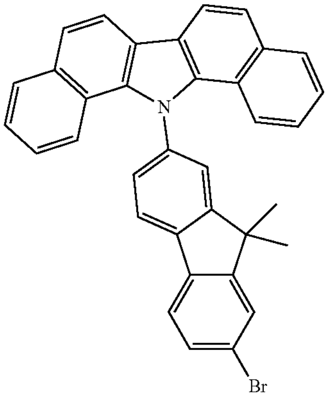
Sub 1-A-b-43
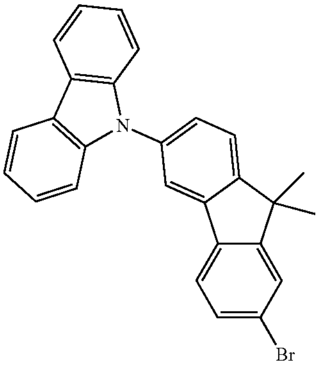

-continued

Sub 1-A-b-44

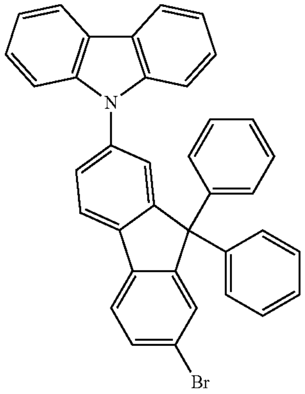

Sub 1-A-b-45

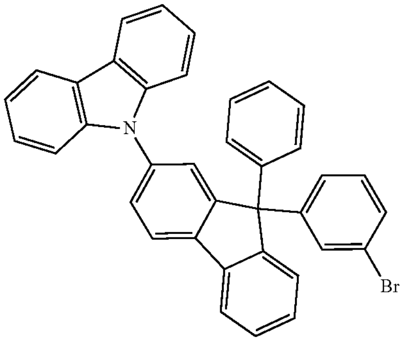

Sub 1-A-b-46

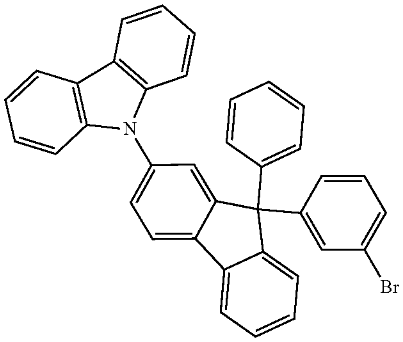

-continued

Sub 1-A-b-47

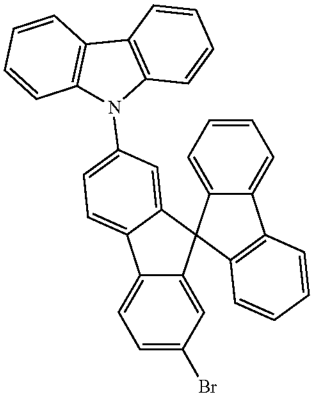

Sub 1-A-b-48

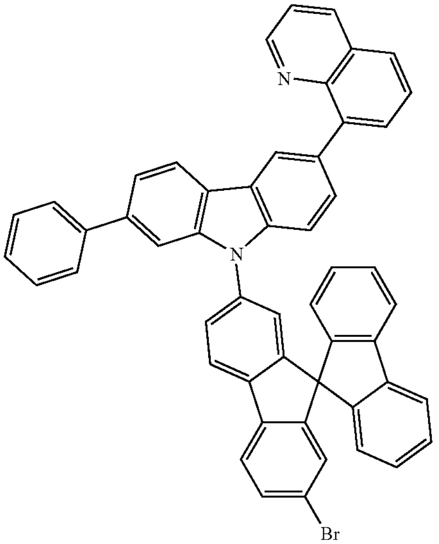

TABLE 1

| Compound | FD-MS | Compound | FD-MS |
|---|---|---|---|
| Sub 1-A-1 | m/z = 321.02 ($C_{18}H_{12}BrN$ = 322.21) | Sub 1-A-2 | m/z = 321.02 ($C_{18}H_{12}BrN$ = 322.21) |
| Sub 1-A-3 | m/z = 397.05 ($C_{24}H_{16}BrN$ = 398.30) | Sub 1-A-4 | m/z = 563.12 ($C_{37}H_{26}BrN$ = 564.53) |
| Sub 1-A-5 | m/z = 397.05 ($C_{24}H_{16}BrN$ = 398.30) | Sub 1-A-6 | m/z = 397.05 ($C_{24}H_{16}BrN$ = 398.30) |
| Sub 1-A-7 | m/z = 473.08 ($C_{30}H_{20}BrN$ = 474.40) | Sub 1-A-8 | m/z = 473.08 ($C_{30}H_{20}BrN$ = 474.40) |
| Sub 1-A-9 | m/z = 473.08 ($C_{30}H_{20}BrN$ = 474.40) | Sub 1-A-10 | m/z = 473.08 ($C_{30}H_{20}BrN$ = 474.40) |
| Sub 1-A-11 | m/z = 473.08 ($C_{30}H_{20}BrN$ = 474.40) | Sub 1-A-12 | m/z = 473.08 ($C_{30}H_{20}BrN$ = 474.40) |
| Sub 1-A-13 | m/z = 497.08 ($C_{32}H_{20}BrN$ = 498.42) | Sub 1-A-14 | m/z = 503.03 ($C_{30}H_{18}BrNS$ = 504.45) |
| Sub 1-A-15 | m/z = 487.06 ($C_{30}H_{18}BrNO$ = 488.38) | Sub 1-A-16 | m/z = 513.11 ($C_{33}H_{24}BrN$ = 514.47) |
| Sub 1-A-17 | m/z = 473.08 ($C_{30}H_{20}BrN$ = 474.40) | Sub 1-A-18 | m/z = 628.13 ($C_{39}H_{25}BrN_4$ = 629.56) |
| Sub 1-A-19 | m/z = 589.14 ($C_{39}H_{28}BrN$ = 590.56) | Sub 1-A-20 | m/z = 627.13 ($C_{40}H_{26}BrN_3$ = 628.57) |
| Sub 1-A-21 | m/z = 473.08 ($C_{30}H_{20}BrN$ = 474.40) | | |
| Sub 1-A-27 | m/z = 261.95 ($C_{12}H_7BrS$ = 263.15) | Sub 1-A-28 | m/z = 337.98 ($C_{18}H_{11}BrS$ = 339.25) |
| Sub 1-A-29 | m/z = 414.01 ($C_{24}H_{15}BrS$ = 415.35) | Sub 1-A-30 | m/z = 454.04 ($C_{27}H_{19}BrS$ = 455.41) |
| Sub 1-A-31 | m/z = 337.98 ($C_{18}H_{11}BrS$ = 339.25) | Sub 1-A-32 | m/z = 337.98 ($C_{18}H_{11}BrS$ = 339.25) |
| Sub 1-A-33 | m/z = 387.99 ($C_{22}H_{13}BrS$ = 389.31) | Sub 1-A-34 | m/z = 464.02 ($C_{28}H_{17}BrS$ = 465.41) |
| Sub 1-A-35 | m/z = 438.01 ($C_{26}H_{15}BrS$ = 439.37) | Sub 1-A-36 | m/z = 387.99 ($C_{22}H_{13}BrS$ = 389.31) |
| Sub 1-A-37 | m/z = 311.96 ($C_{16}H_9BrS$ = 313.21) | Sub 1-A-38 | m/z = 414.01 ($C_{24}H_{15}BrS$ = 415.35) |
| Sub 1-A-39 | m/z = 569.06 ($C_{33}H_{20}BrN_3S$ = 570.51) | Sub 1-A-40 | m/z = 579.07 ($C_{36}H_{22}BrNS$ = 580.54) |
| Sub 1-A-41 | m/z = 387.99 ($C_{22}H_{13}BrS$ = 389.31) | Sub 1-A-42 | m/z = 311.96 ($C_{16}H_9BrS$ = 313.21) |
| Sub 1-A-43 | m/z = 378.01 ($C_{21}H_{15}BrS$ = 379.32) | Sub 1-A-44 | m/z = 438.01 ($C_{26}H_{15}BrS$ = 439.37) |
| Sub 1-A-45 | m/z = 398.03 ($C_{24}H_{15}BrO$ = 399.29) | Sub 1-A-46 | m/z = 438.06 ($C_{27}H_{19}BrO$ = 439.35) |

TABLE 1-continued

| Compound | FD-MS | Compound | FD-MS |
| --- | --- | --- | --- |
| Sub 1-A-47 | m/z = 245.97 ($C_{12}H_7BrO$ = 247.09) | Sub 1-A-48 | m/z = 322 ($C_{18}H_{11}BrO$ = 323.19) |
| Sub 1-A-49 | m/z = 372.01 ($C_{22}H_{13}BrO$ = 373.25) | Sub 1-A-50 | m/z = 422.03 ($C_{26}H_{15}BrO$ = 423.31) |
| Sub 1-A-51 | m/z = 295.98 ($C_{16}H_9BrO$ = 297.15) | Sub 1-A-52 | m/z = 322 ($C_{18}H_{11}BrO$ = 323.19) |
| Sub 1-A-53 | m/z = 322 ($C_{18}H_{11}BrO$ = 323.19) | | |
| Sub 1-A-63 | m/z = 228.07 ($C_{15}H_{13}Cl$ = 228.72) | Sub 1-A-64 | m/z = 228.07 ($C_{15}H_{13}Cl$ = 228.72) |
| Sub 1-A-65 | m/z = 228.07 ($C_{15}H_{13}Cl$ = 228.72) | Sub 1-A-66 | m/z = 380.13 ($C_{27}H_{21}Cl$ = 380.92) |
| Sub 1-A-67 | m/z = 348.05 ($C_{21}H_{17}Br$ = 349.27) | Sub 1-A-68 | m/z = 424.08 ($C_{27}H_{21}Br$ = 425.37) |
| Sub 1-A-69 | m/z = 500.11 ($C_{33}H_{25}Br$ = 501.47) | Sub 1-A-70 | m/z = 348.05 ($C_{21}H_{17}Br$ = 349.27) |
| Sub 1-A-71 | m/z = 500.11 ($C_{33}H_{25}Br$ = 501.47) | Sub 1-A-72 | m/z = 464.11 ($C_{30}H_{25}Br$ = 465.43) |
| Sub 1-A-73 | m/z = 448.08 ($C_{29}H_{21}Br$ = 449.39) | Sub 1-A-74 | m/z = 352.10 ($C_{25}H_{17}Cl$ = 352.86) |
| Sub 1-A-75 | m/z = 462.09 ($C_{31}H_{20}Cl_2$ = 463.40) | Sub 1-A-76 | m/z = 352.10 ($C_{25}H_{17}Cl$ = 352.86) |
| Sub 1-A-77 | m/z = 352.10 ($C_{25}H_{17}Cl$ = 352.86) | Sub 1-A-78 | m/z = 402.12 (C29H19Cl = 402.92) |
| Sub 1-A-79 | m/z = 352.10 ($C_{25}H_{17}Cl$ = 352.86) | Sub 1-A-80 | m/z = 472.08 ($C_{31}H_{21}Br$ = 473.41) |
| Sub 1-A-81 | m/z = 550.13 ($C_{37}H_{27}Br$ = 551.53) | Sub 1-A-82 | m/z = 548.11 ($C_{37}H_{25}Br$ = 549.51) |
| Sub 1-A-83 | m/z = 472.08 ($C_{31}H_{21}Br$ = 473.41) | Sub 1-A-84 | m/z = 585.09 ($C_{36}H_{22}BrF_2N$ = 586.48) |
| Sub 1-A-85 | m/z = 394.04 ($C_{25}H_{15}Br$ = 395.30) | Sub 1-A-86 | m/z = 350.09 ($C_{25}H_{15}Cl$ = 350.85) |
| Sub 1-A-87 | m/z = 350.09 ($C_{25}H_{15}Cl$ = 350.85) | Sub 1-A-88 | m/z = 470.07 ($C_{31}H_{19}Br$ = 471.40) |
| Sub 1-A-89 | m/z = 470.07 ($C_{31}H_{19}Br$ = 471.40) | Sub 1-A-90 | m/z = 470.07 ($C_{31}H_{19}Br$ = 471.40) |
| Sub 1-A-91 | m/z = 470.07 ($C_{31}H_{19}Br$ = 471.40) | Sub 1-A-92 | m/z = 504.03 ($C_{31}H_{18}BrCl$ = 505.84) |
| Sub 1-A-93 | m/z = 470.07 ($C_{31}H_{19}Br$ = 471.40) | Sub 1-A-94 | m/z = 546.10 ($C_{37}H_{23}Br$ = 547.50) |
| Sub 1-A-95 | m/z = 400.10 ($C_{29}H_{17}Cl$ = 400.91) | Sub 1-A-96 | m/z = 476.13 ($C_{35}H_{21}Cl$ = 477.00) |
| Sub 1-A-97 | m/z = 400.10 ($C_{29}H_{17}Cl$ = 400.91) | Sub 1-A-98 | m/z = 400.10 ($C_{29}H_{17}Cl$ = 400.91) |
| Sub 1-A-99 | m/z = 400.10 ($C_{29}H_{17}Cl$ = 400.91) | Sub 1-A-100 | m/z = 400.10 ($C_{29}H_{17}Cl$ = 400.91) |
| Sub 1-A-101 | m/z = 400.10 ($C_{29}H_{17}Cl$ = 400.91) | Sub 1-A-102 | m/z = 400.10 ($C_{29}H_{17}Cl$ = 400.91) |
| Sub 1-A-103 | m/z = 478.12 ($C_{33}H_{19}ClN_2$ = 478.98) | Sub 1-A-104 | m/z = 400.10 ($C_{29}H_{17}Cl$ = 400.91) |
| Sub 1-A-105 | m/z = 400.10 ($C_{28}H_{17}Cl$ = 400.91) | Sub 1-A-106 | m/z = 400.10 ($C_{29}H_{17}Cl$ = 400.91) |
| Sub 1-A-107 | m/z = 400.10 ($C_{29}H_{17}Cl$ = 400.91) | Sub 1-A-108 | m/z = 400.10 ($C_{29}H_{17}Cl$ = 400.91) |
| Sub 1-A-109 | m/z = 526.15 ($C_{39}H_{23}Cl$ = 527.06) | Sub 1-A-110 | m/z = 400.10 ($C_{29}H_{17}Cl$ = 400.91) |
| Sub 1-A-111 | m/z = 400.10 ($C_{29}H_{17}Cl$ = 400.91) | Sub 1-A-112 | m/z = 400.10 ($C_{29}H_{17}Cl$ = 400.91) |
| Sub 1-A-113 | m/z = 566.14 ($C_{41}H_{23}ClO$ = 567.08) | Sub 1-A-114 | m/z = 400.10 ($C_{29}H_{17}Cl$ = 400.91) |
| Sub 1-A-115 | m/z = 400.10 ($C_{29}H_{17}Cl$ = 400.91) | Sub 1-A-116 | m/z = 400.10 ($C_{29}H_{17}Cl$ = 400.91) |
| Sub 1-A-117 | m/z = 400.10 ($C_{29}H_{17}Cl$ = 400.91) | Sub 1-A-118 | m/z = 400.10 ($C_{29}H_{17}Cl$ = 400.91) |
| Sub 1-A-119 | m/z = 400.10 ($C_{29}H_{17}Cl$ = 400.91) | Sub 1-A-120 | m/z = 400.10 ($C_{29}H_{17}Cl$ = 400.91) |
| Sub 1-A-121 | m/z = 400.10 ($C_{29}H_{17}Cl$ = 400.91) | Sub 1-A-122 | m/z = 400.10 ($C_{29}H_{17}Cl$ = 400.91) |
| Sub 1-A-123 | m/z = 425.10 ($C_{30}H_{16}ClN$ = 425.92) | Sub 1-A-124 | m/z = 400.10 ($C_{29}H_{17}Cl$ = 400.91) |
| Sub 1-A-125 | m/z = 400.10 ($C_{29}H_{17}Cl$ = 400.91) | Sub 1-A-126 | m/z = 400.10 ($C_{29}H_{17}Cl$ = 400.91) |
| Sub 1-A-127 | m/z = 400.10 ($C_{29}H_{17}Cl$ = 400.91) | Sub 1-A-128 | m/z = 400.10 ($C_{29}H_{17}Cl$ = 400.91) |
| Sub 1-A-129 | m/z = 400.10 ($C_{29}H_{17}Cl$ = 400.91) | Sub 1-A-130 | m/z = 400.10 ($C_{29}H_{17}Cl$ = 400.91) |
| Sub 1-A-131 | m/z = 400.10 ($C_{29}H_{17}Cl$ = 400.91) | Sub 1-A-132 | m/z = 520.08 ($C_{35}H_{21}Br$ = 521.46) |
| Sub 1-A-133 | m/z = 520.08 ($C_{35}H_{21}Br$ = 521.46) | Sub 1-A-134 | m/z = 520.08 ($C_{35}H_{21}Br$ = 521.46) |
| Sub 1-A-135 | m/z = 510.09 ($C_{35}H_{20}Cl_2$ = 511.45) | Sub 1-A-136 | m/z = 610.09 ($C_{41}H_{23}BrO$ = 611.54) |
| Sub 1-A-137 | m/z = 626.07 ($C_{41}H_{23}BrS$ = 627.60) | Sub 1-A-138 | m/z = 636.15 ($C_{44}H_{29}Br$ = 637.62) |
| Sub 1-A-139 | m/z = 450.12 ($C_{33}H_{19}Cl$ = 450.97) | Sub 1-A-140 | m/z = 450.12 ($C_{33}H_{19}Cl$ = 450.97) |
| Sub 1-A-141 | m/z = 500.13 ($C_{37}H_{21}Cl$ = 501.03) | Sub 1-A-142 | m/z = 450.12 ($C_{33}H_{19}Cl$ = 450.97) |
| Sub 1-A-143 | m/z = 450.12 ($C_{33}H_{19}Cl$ = 450.97) | Sub 1-A-144 | m/z = 670.13 ($C_{47}H_{27}Br$ = 671.64) |
| Sub 1-A-145 | m/z = 696.15 ($C_{49}H_{29}Br$ = 697.68) | Sub 1-A-146 | m/z = 772.15 ($C_{53}H_{29}BrN_2$ = 773.73) |
| Sub 1-A-148 | m/z = 348.05 ($C_{21}H_{17}Br$ = 349.27) | Sub 1-A-149 | m/z = 424.08 ($C_{27}H_{21}Br$ = 425.37) |
| Sub 1-A-152 | m/z = 396.05 ($C_{25}H_{17}Br$ = 397.32) | Sub 1-A-154 | m/z = 322.04 ($C_{19}H_{15}Br$ = 323.23) |
| Sub 1-A-155 | m/z = 231.99 ($C_{12}H_9Br$ = 233.11) | Sub 1-A-156 | m/z = 282 ($C_{16}H_{11}Br$ = 283.17) |
| Sub 1-A-157 | m/z = 332.02 ($C_{20}H_{13}Br$ = 333.23) | Sub 1-A-161 | m/z = 384.05 ($C_{24}H_{17}Br$ = 385.3) |
| Sub 1-A-162 | m/z = 408.05 ($C_{26}H_{17}Br$ = 409.33) | Sub 1-A-163 | m/z522.10 ($C_{35}H_{23}Br$ = 523.47) |
| Sub 1-A-164 | m/z = 372.01 ($C_{22}H_{13}BrO$ = 373.25) | Sub 1-A-165 | m/z = 387.99 ($C_{22}H_{13}BrS$ = 389.31) |
| Sub 1-A-166 | m/z = 398.07 ($C_{25}H_{19}Br$ = 399.33) | Sub 1-A-167 | m/z = 493.98 ($C_{28}H_{15}$BrS2 = 495.45) |
| Sub 1-A-168 | m/z = 514.13 ($C_{34}H_{27}Br$ = 515.49) | Sub 1-A-169 | m/z = 478.00 ($C_{28}H_{15}BrOS$ = 479.39) |
| Sub 1-A-170 | m/z = 493.98 ($C_{28}H_{15}$BrS2 = 495.45) | Sub 1-A-171 | m/z = 474.10 ($C_{31}H_{23}Br$ = 475.43) |
| Sub 1-A-172 | m/z = 478.00 ($C_{28}H_{15}BrOS$ = 479.39) | Sub 1-A-173 | m/z = 387.99 ($C_{22}H_{13}BrS$ = 389.31) |
| Sub 1-A-b-1 | m/z = 321.02 ($C_{18}H_{12}BrN$ = 322.20) | Sub 1-A-b-2 | m/z = 397.05 ($C_{24}H_{16}BrN$ = 398.29) |
| Sub 1-A-b-3 | m/z = 549.11 ($C_{36}H_{24}BrN$ = 550.49) | Sub 1-A-b-4 | m/z = 550.10 ($C_{35}H_{23}BrN_2$ = 551.47) |
| Sub 1-A-b-5 | m/z = 473.08 ($C_{30}H_{20}BrN$ = 474.39) | Sub 1-A-b-6 | m/z = 474.07 ($C_{29}H_{19}BrN_2$ = 475.38) |
| Sub 1-A-b-7 | m/z = 447.06 ($C_{28}H_{18}BrN$ = 448.35) | Sub 1-A-b-8 | m/z = 447.06 ($C_{28}H_{18}BrN$ = 448.35) |
| Sub 1-A-b-9 | m/z = 447.06 ($C_{28}H_{18}BrN$ = 448.35) | Sub 1-A-b-10 | m/z = 497.08 ($C_{32}H_{20}BrN$ = 498.41) |
| Sub 1-A-b-11 | m/z = 497.08 ($C_{32}H_{20}BrN$ = 498.41) | Sub 1-A-b-12 | m/z = 397.05 ($C_{24}H_{16}BrN$ = 398.29) |
| Sub 1-A-b-13 | m/z = 638.14 ($C_{42}H_{27}BrN_2$ = 639.58) | Sub 1-A-b-14 | m/z = 579.07 ($C_{36}H_{22}BrNS$ = 580.54) |
| Sub 1-A-b-15 | m/z = 451.09 ($C_{28}H_{22}BrN$ = 452.38) | Sub 1-A-b-16 | m/z = 564.12 ($C_{36}H_{25}BrN_2$ = 565.50) |
| Sub 1-A-b-17 | m/z = 447.06 ($C_{28}H_{18}BrN$ = 448.35) | Sub 1-A-b-18 | m/z = 397.05 ($C_{24}H_{16}BrN$ = 398.29) |
| Sub 1-A-b-19 | m/z = 397.05 ($C_{24}H_{16}BrN$ = 398.29) | Sub 1-A-b-20 | m/z = 447.06 ($C_{28}H_{18}BrN$ = 448.35) |
| Sub 1-A-b-21 | m/z = 497.08 ($C_{32}H_{20}BrN$ = 498.41) | Sub 1-A-b-22 | m/z = 397.05 ($C_{24}H_{16}BrN$ = 398.29) |
| Sub 1-A-b-23 | m/z = 397.05 ($C_{24}H_{16}BrN$ = 398.29) | Sub 1-A-b-24 | m/z = 421.05 ($C_{26}H_{16}BrN$ = 422.32) |
| Sub 1-A-b-25 | m/z = 447.06 ($C_{28}H_{18}BrN$ = 448.35) | Sub 1-A-b-26 | m/z = 473.08 ($C_{30}H_{20}BrN$ = 474.39) |
| Sub 1-A-b-27 | m/z = 625.14 ($C_{42}H_{28}BrN$ = 626.58) | Sub 1-A-b-28 | m/z = 548.09 ($C_{35}H_{21}BrN_2$ = 549.46) |
| Sub 1-A-b-29 | m/z = 427.00 ($C_{24}H_{14}BrNS$ = 428.34) | Sub 1-A-b-30 | m/z = 527.03 ($C_{32}H_{18}BrNS$ = 528.46) |
| Sub 1-A-b-31 | m/z = 427.00 ($C_{24}H_{14}BrNS$ = 428.34) | Sub 1-A-b-32 | m/z = 427.00 ($C_{24}H_{14}BrNS$ = 428.34) |
| Sub 1-A-b-33 | m/z = 411.03 ($C_{24}H_{14}BrNO$ = 412.28) | Sub 1-A-b-34 | m/z = 411.03 ($C_{24}H_{14}BrNO$ = 412.28) |
| Sub 1-A-b-35 | m/z = 437.08 ($C_{27}H_{20}BrN$ = 438.36) | Sub 1-A-b-36 | m/z = 563.12 ($C_{37}H_{26}BrN$ = 564.51) |
| Sub 1-A-b-37 | m/z = 590.14 ($C_{38}H_{27}BrN_2$ = 591.54) | Sub 1-A-b-38 | m/z = 487.09 ($C_{31}H_{22}BrN$ = 488.42) |
| Sub 1-A-b-39 | m/z = 487.09 ($C_{31}H_{22}BrN$ = 488.42) | Sub 1-A-b-40 | m/z = 487.09 ($C_{31}H_{22}BrN$ = 488.42) |
| Sub 1-A-b-41 | m/z = 537.11 ($C_{35}H_{24}BrN$ = 538.48) | Sub 1-A-b-42 | m/z = 537.11 ($C_{35}H_{24}BrN$ = 538.48) |
| Sub 1-A-b-43 | m/z = 437.08 ($C_{27}H_{20}BrN$ = 438.36) | Sub 1-A-b-44 | m/z = 561.11 ($C_{37}H_{24}BrN$ = 562.50) |

TABLE 1-continued

| Compound | FD-MS | Compound | FD-MS |
|---|---|---|---|
| Sub 1-A-b-45 | m/z = 561.11 ($C_{37}H_{24}BrN$ = 562.50) | Sub 1-A-b-46 | m/z = 559.09 ($C_{37}H_{22}BrN$ = 560.48) |
| Sub 1-A-b-47 | m/z = 559.09 ($C_{37}H_{22}BrN$ = 560.48) | Sub 1-A-b-48 | m/z = 762.17 ($C_{52}H_{31}BrN_2$ = 763.72) |

2. Example of Sub 1-B

Examples of Sub 1-B of Reaction Scheme 2 are as follows, but are not limited thereto. The same symbols as those used in Formula 1, Formula 1-A-1 to 1-A-5, and Formula 1-D-1 to 1-D-6 are defined identically, and b is an integer of 0 to 4 in Sub 1-B-b, y and z are each 0 or 1 and except when both are 1 in Sub 1-B-c, and m, l, etc. are each an integer of 0 to 4, r is an integer of 0 to 4, s is an integer of 0 to 3.

Sub 1-B-a

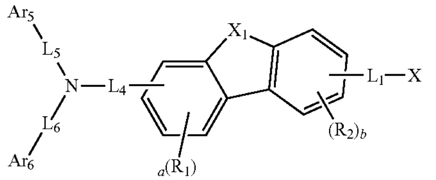

Sub 1-B-b

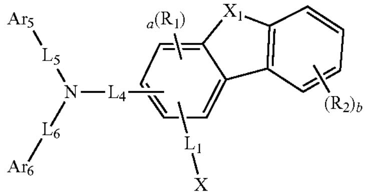

Sub 1-B-c

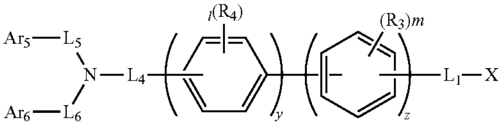

Sub 1-B-d

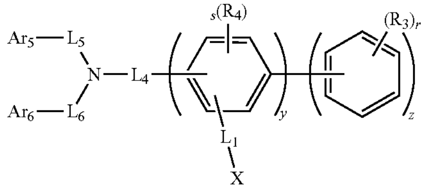

*X = halogen (F, Cl. Br, I)

Synthesis of Sub 1-B-a to Sub 1-B-d

<Reaction Scheme 6>

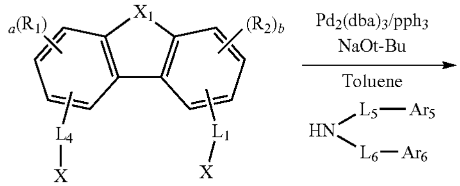

-continued

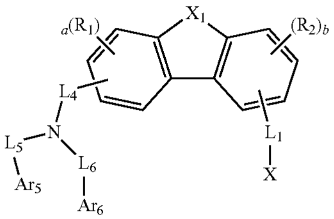

Sub 1-B-a

<Reaction Scheme 7>

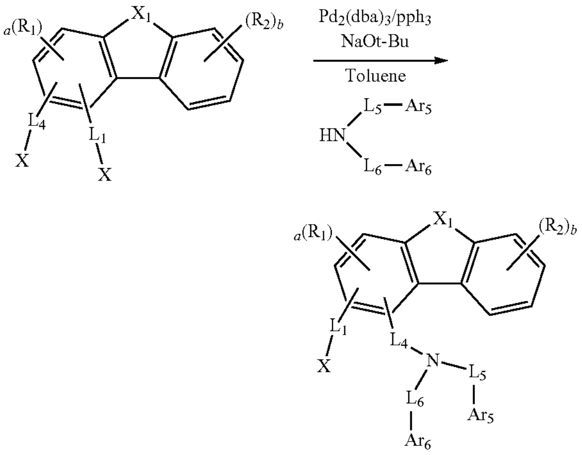

Sub 1-B-b

<Reaction Scheme 8>

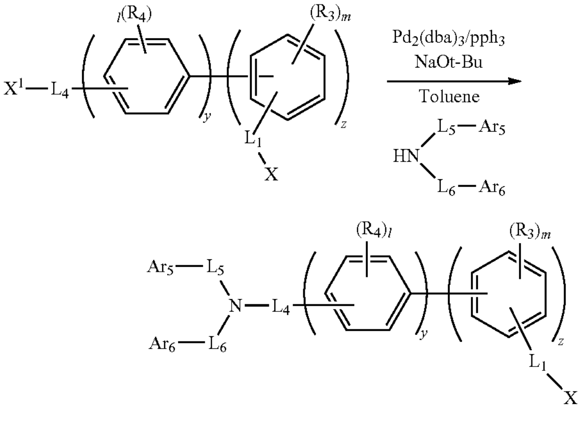

Sub 1-B-c

<Reaction Scheme 9>

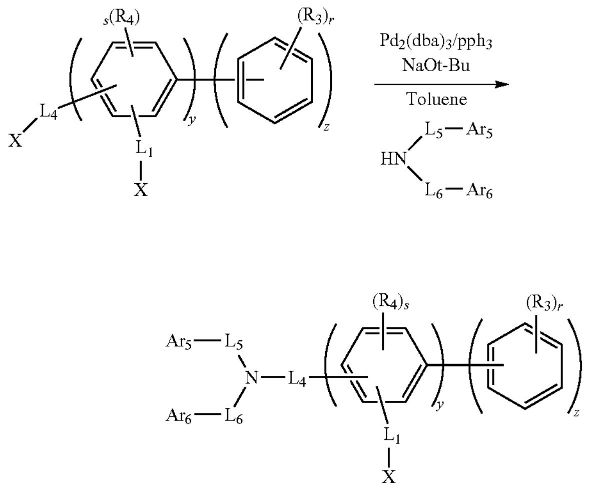

Sub 1-B-d

1. Synthesis Example of Sub 1-B-1

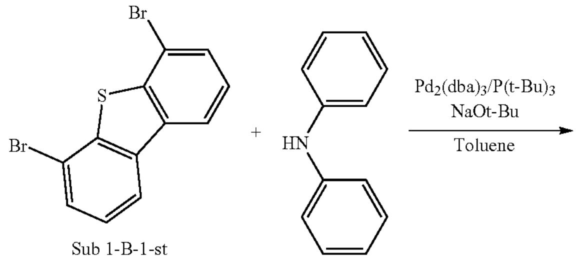

Sub 1-B-1-st

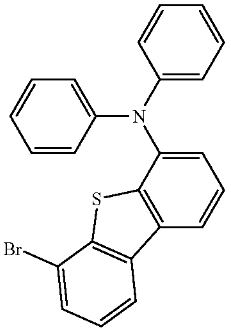

Sub 1-B-1

After diphenylamine (15.22 g, 89.94 mmol) was dissolved in toluene (750 ml), Sub 1-B-1-st (CAS Registry Number: 669773-34-6) (46.14 g, 134.91 mmol), $Pd_2(dba)_3$ (2.47 g, 2.70 mmol), $P(t-Bu)_3$ (1.82 g, 8.99 mmol) and NaOt-Bu (25.93 g, 269.81 mmol) were added to the solution and the mixture was stirred at 80° C. When the reaction was completed, the reaction product was extracted with $CH_2Cl_2$ and water. Then, an organic layer was dried over $MgSO_4$ and concentrated. Then, the concentrate was separated by a silica gel column and recrystallized to obtain 23.61 g (yield: 61%) of the product.

2. Synthesis Example of Sub 1-B-63

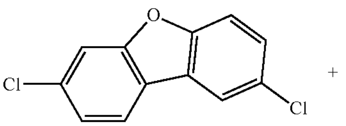

Sub 1-B-63-st

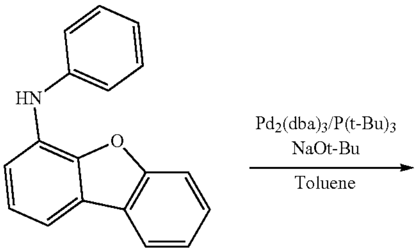

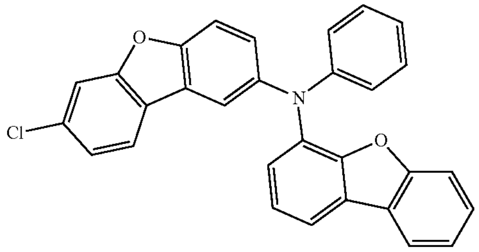

Sub 1-B-63

After N-phenyldibenzo[b,d]furan-4-amine (10.94 g, 42.18 mmol) was dissolved in toluene (422 ml), Sub 1-B-63-st (10 g, 42.18 mmol), $Pd_2(dba)_3$ (1.16 g, 1.27 mmol) $P(t-Bu)_3$ (8.53 g, 42.18 mmol) and NaOt-Bu (8.11 g, 84.36 mmol) were added to the solution, and then the synthesis was carried out in the same manner as in the synthesis method of Sub 1-B-1 to obtain 13 g (yield: 67%) of the product.

3. Synthesis Example of Sub 1-B-157

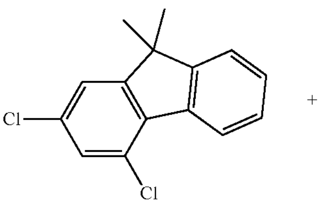

Sub 1-B-157-st

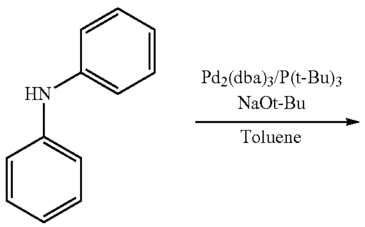

-continued

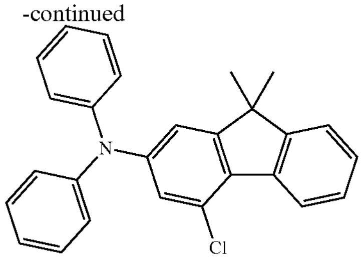

Sub 1-B-157

After diphenylamine (25 g, 95 mmol) was dissolved in toluene (950 ml), Sub 3-157-st (16.08 g, 95 mmol), $Pd_2(dba)_3$ (2.61 g, 2.85 mmol) $P(t\text{-}Bu)_3$ (19.22 g, 95 mmol) and NaOt-Bu (18.26 g, 190 mmol) were added to the solution, and then the synthesis was carried out in the same manner as in the synthesis method of Sub 1-B-1 to obtain 24.45 g (yield: 65%) of the product.

Compounds belong to Sub 1-B are as follows, but are not limited thereto, and FD-MS values of the compounds are shown in Table 2 below.

Sub 1-B-1

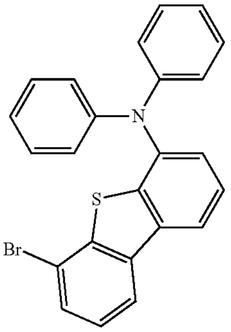

Sub 1-B-2

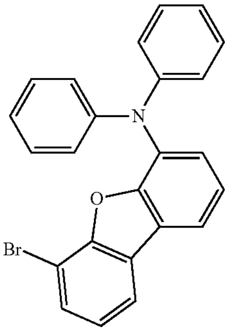

Sub 1-B-3

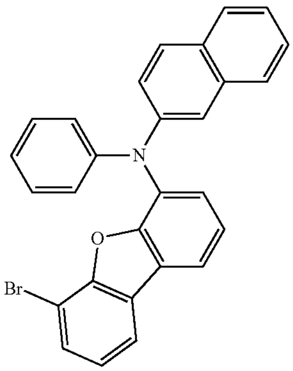

-continued

Sub 1-B-4

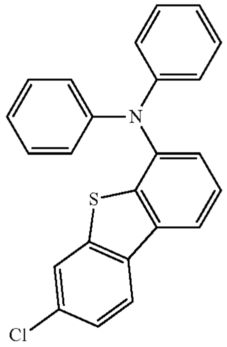

Sub 1-B-5

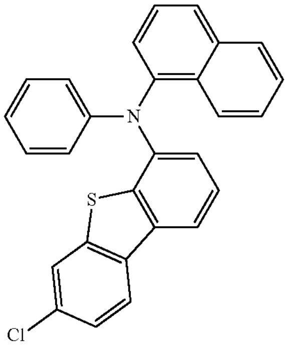

Sub 1-B-6

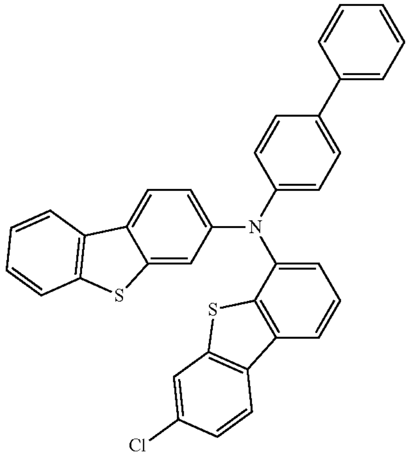

Sub 1-B-7

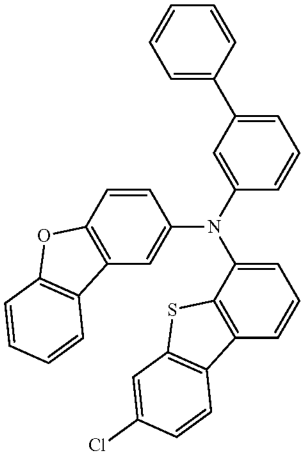

-continued
Sub 1-B-8
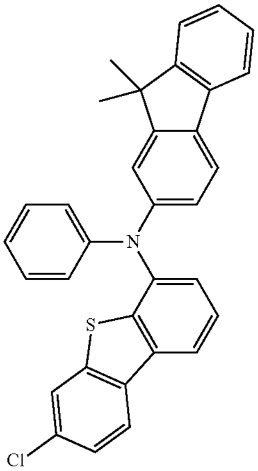
Sub 1-B-9
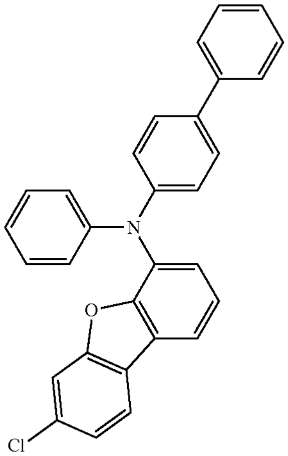
Sub 1-B-10
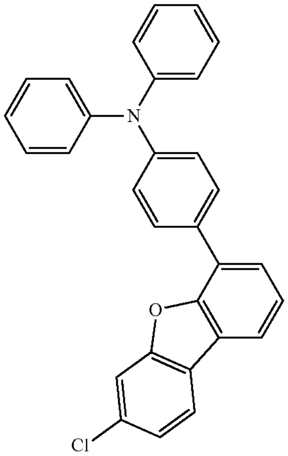
-continued
Sub 1-B-11
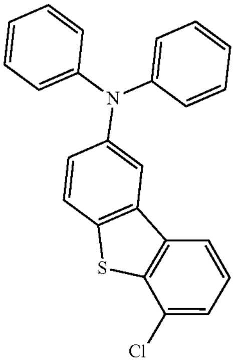
Sub 1-B-12
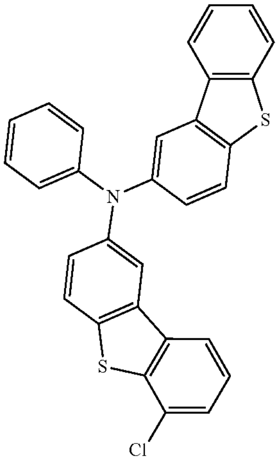
Sub 1-B-13
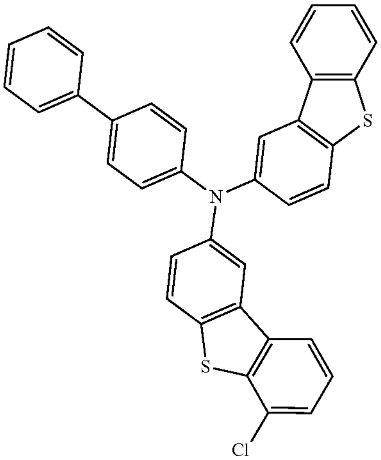

-continued
Sub 1-B-14
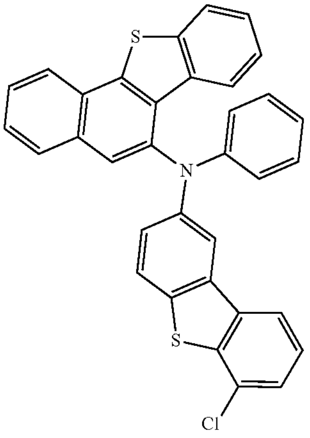
Sub 1-B-15
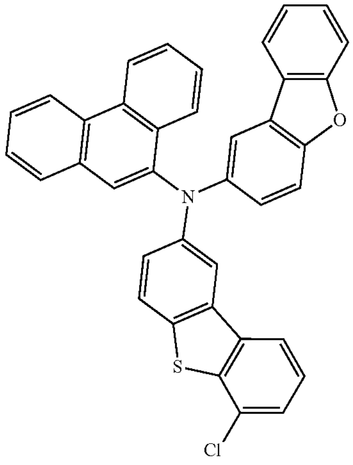
Sub 1-B-16
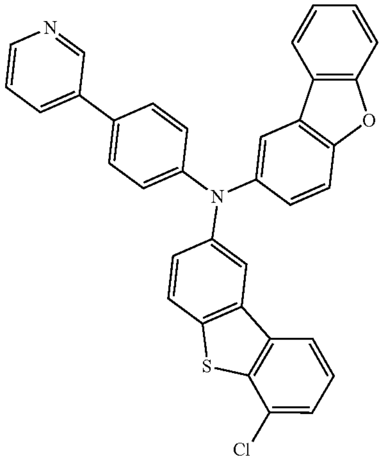
-continued
Sub 1-B-17
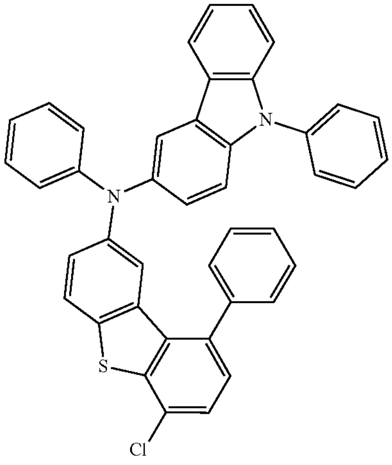
Sub 1-B-18
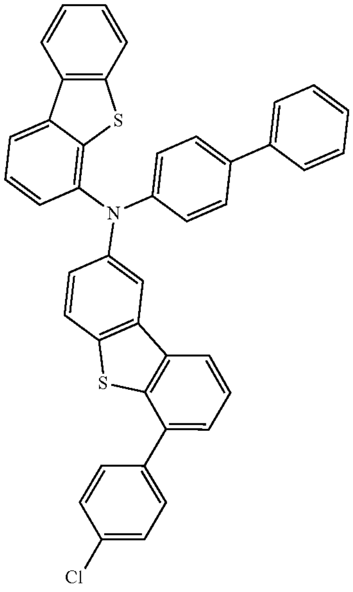
Sub 1-B-19
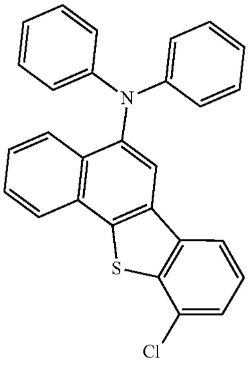

Sub 1-B-20
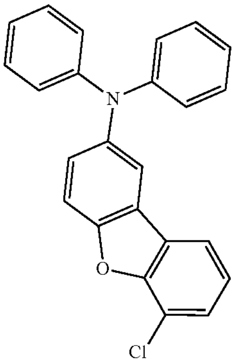
Sub 1-B-21
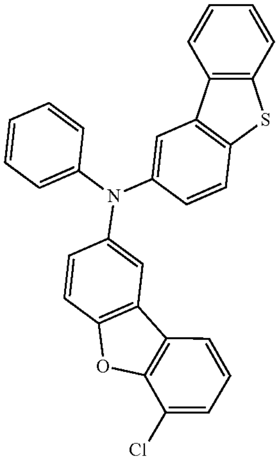
Sub 1-B-22
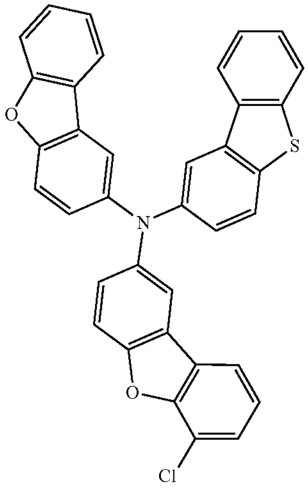
Sub 1-B-23
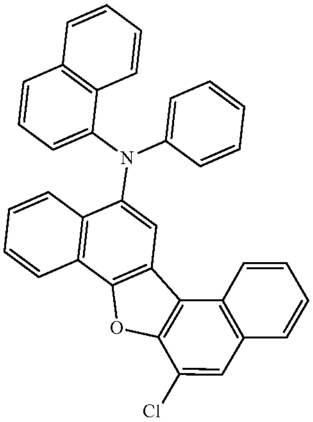
Sub 1-B-24
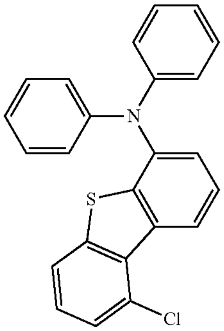
Sub 1-B-25
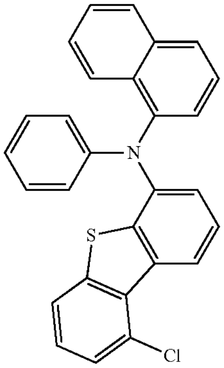
Sub 1-B-26
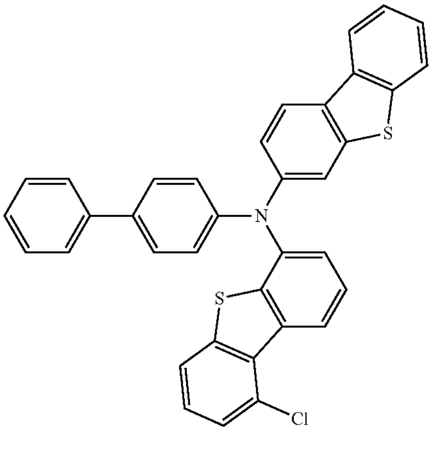

-continued
Sub 1-B-27
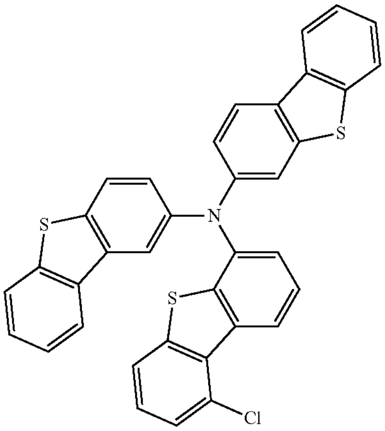
Sub 1-B-28
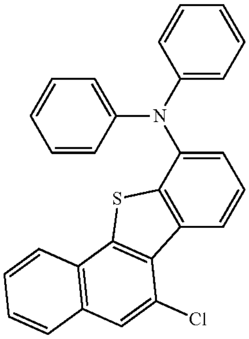
Sub 1-B-29
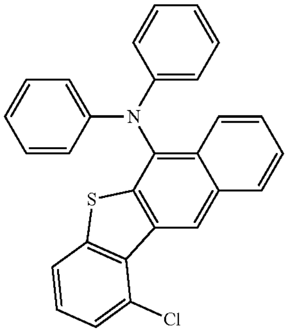
Sub 1-B-30
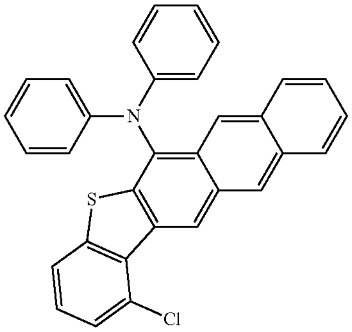
-continued
Sub 1-B-31
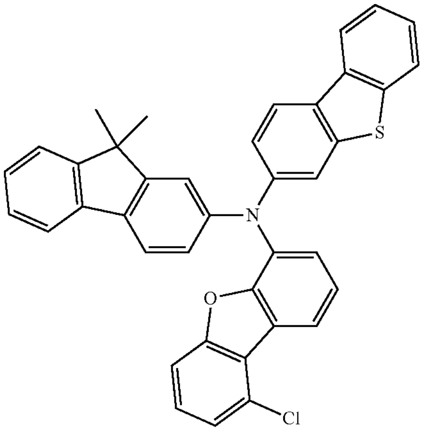
Sub 1-B-32
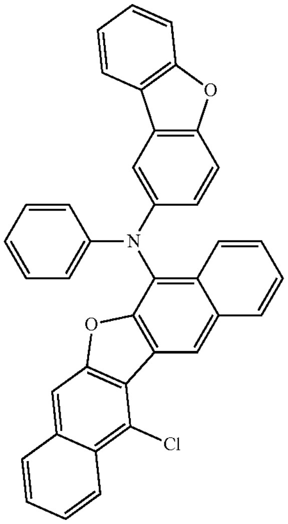
Sub 1-B-33
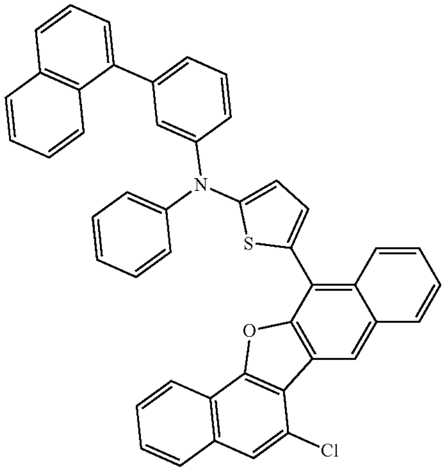

Sub 1-B-34
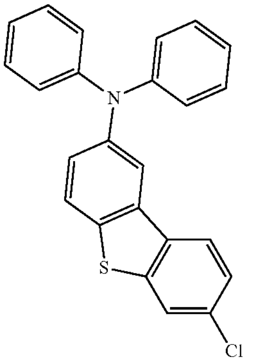
Sub 1-B-35
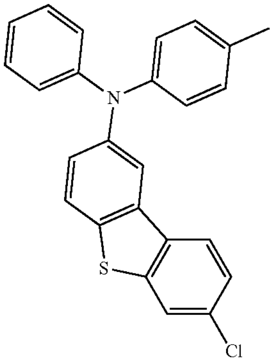
Sub 1-B-36
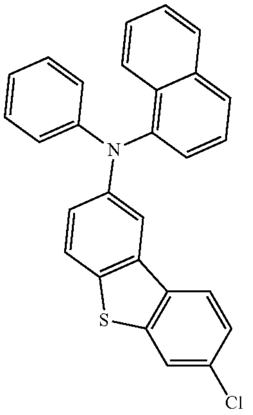
Sub 1-B-37
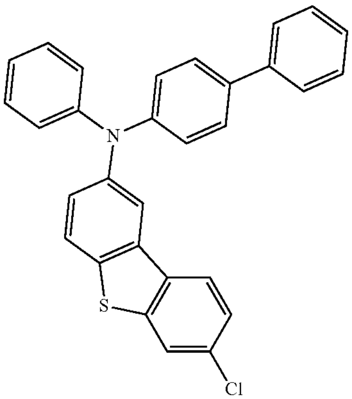
Sub 1-B-38
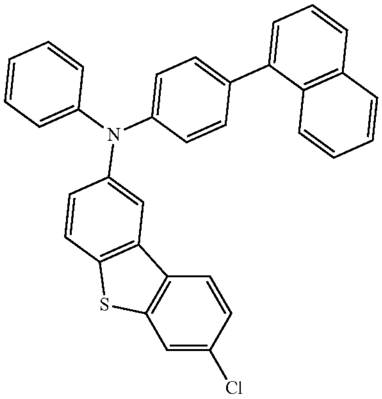
Sub 1-B-39
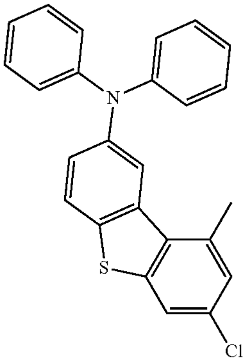
Sub 1-B-40
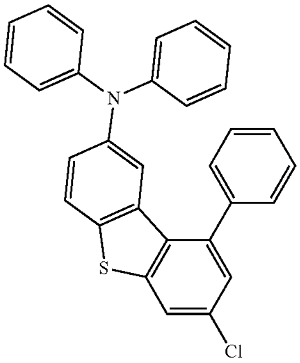
Sub 1-B-41
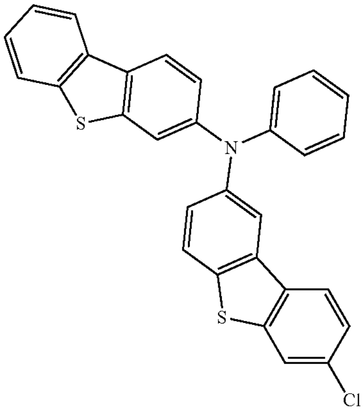

-continued
Sub 1-B-42
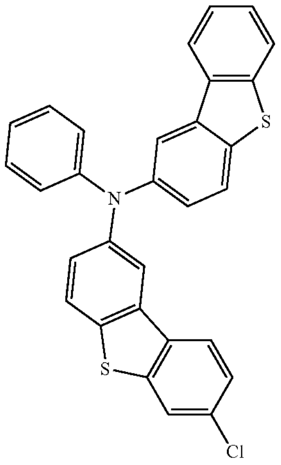
Sub 1-B-43
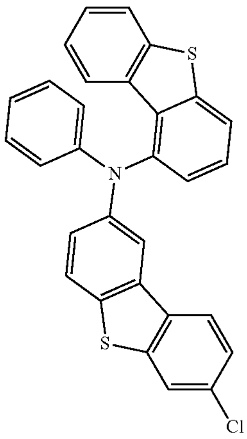
Sub 1-B-44
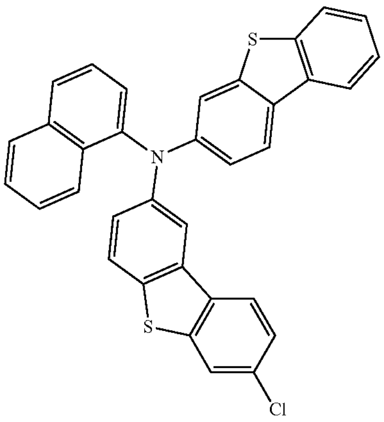
-continued
Sub 1-B-45
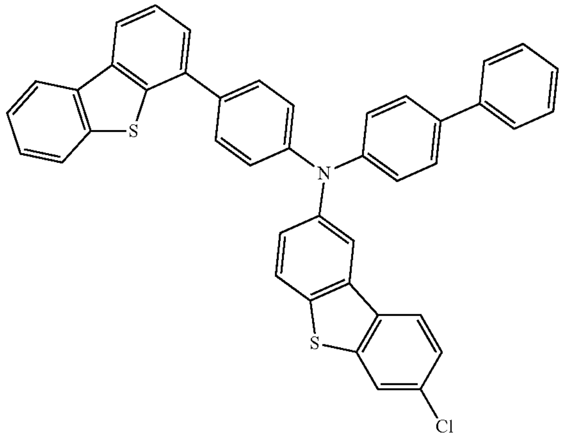
Sub 1-B-46
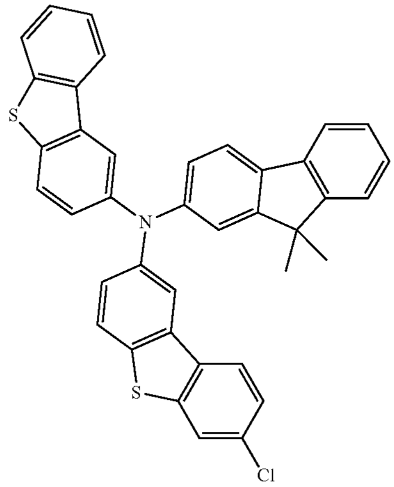
Sub 1-B-47
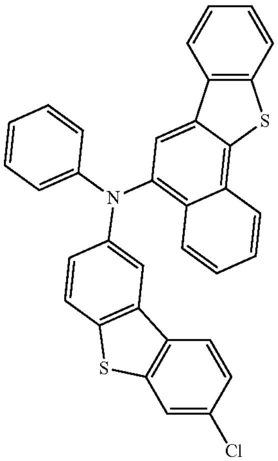

-continued
Sub 1-B-48
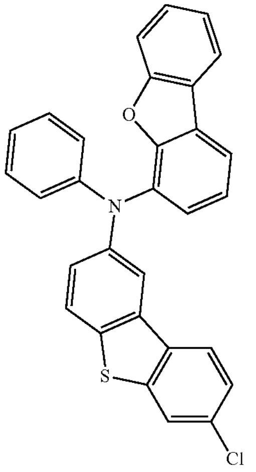
Sub 1-B-49
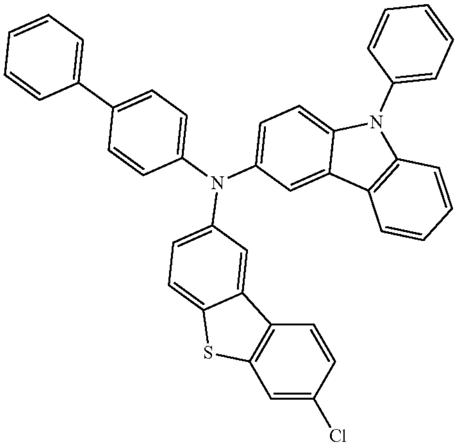
Sub 1-B-50
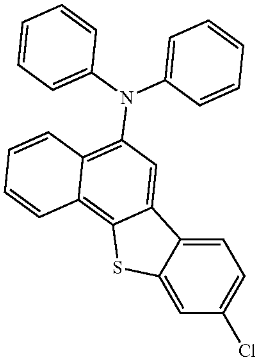
Sub 1-B-51
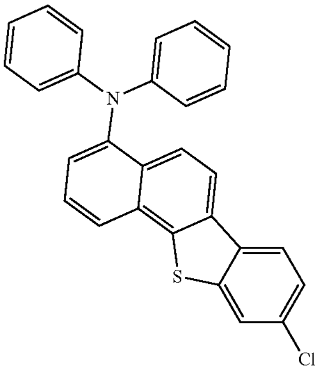
-continued
Sub 1-B-52
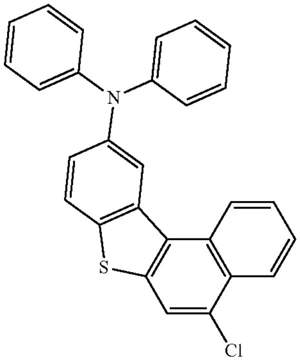
Sub 1-B-53
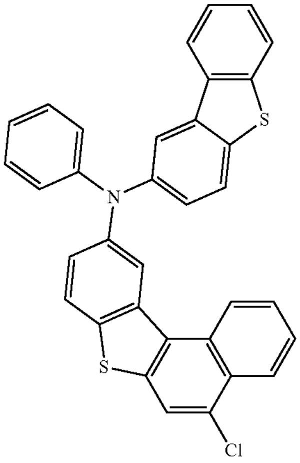
Sub 1-B-54
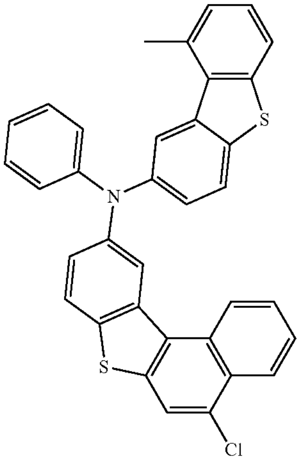

-continued
Sub 1-B-55
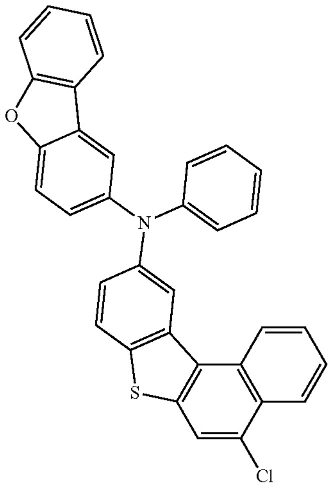
Sub 1-B-56
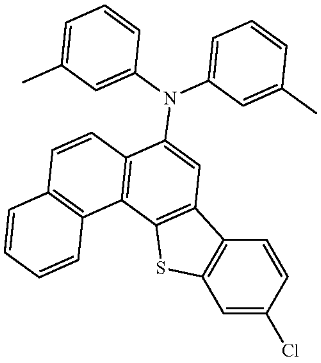
Sub 1-B-57
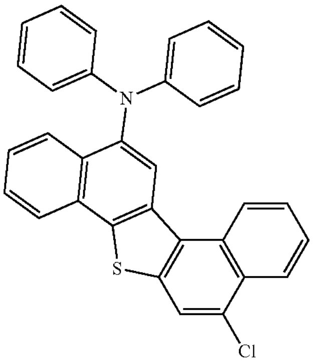
-continued
Sub 1-B-58
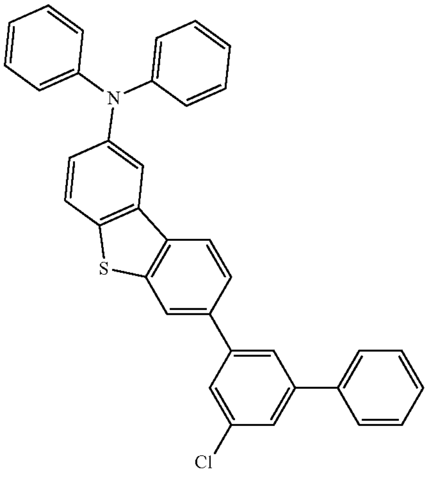
Sub 1-B-59
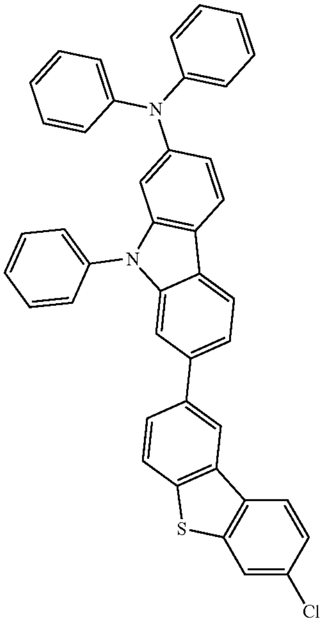
Sub 1-B-60
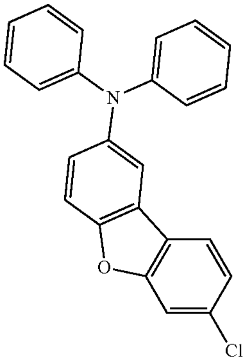

-continued
Sub 1-B-61
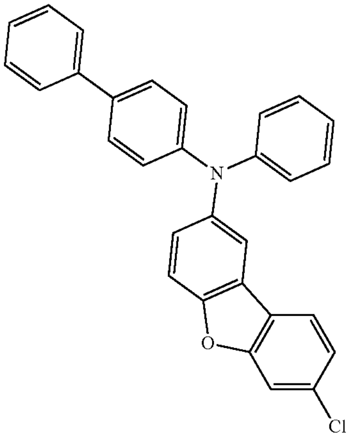
Sub 1-B-62
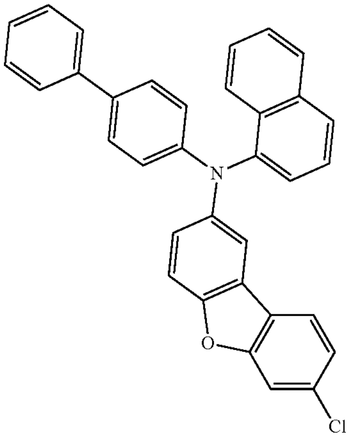
Sub 1-B-63
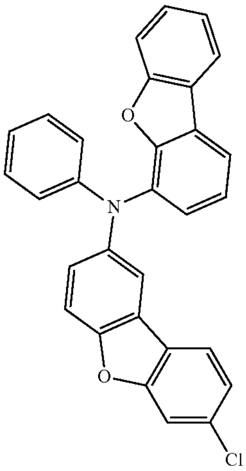
-continued
Sub 1-B-64
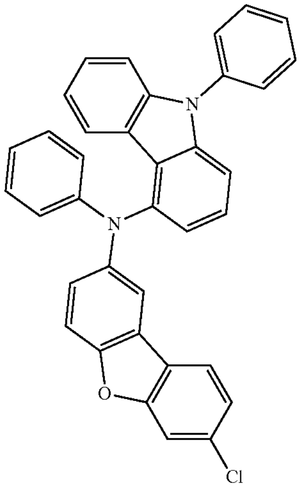
Sub 1-B-65
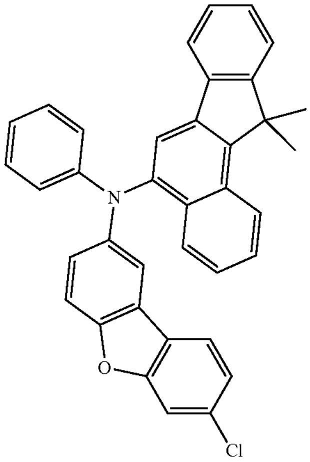
Sub 1-B-66
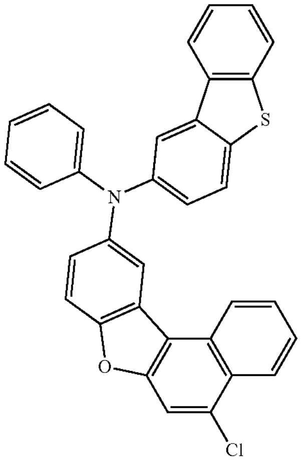

-continued
Sub 1-B-67
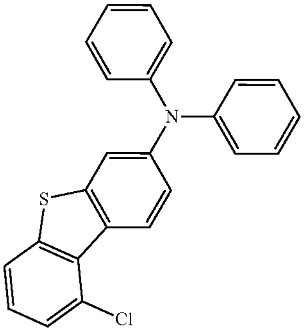
Sub 1-B-68
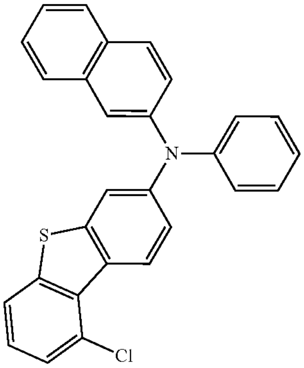
Sub 1-B-69
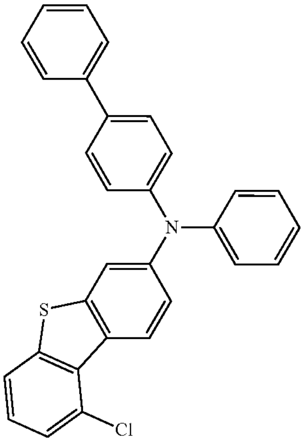
Sub 1-B-70
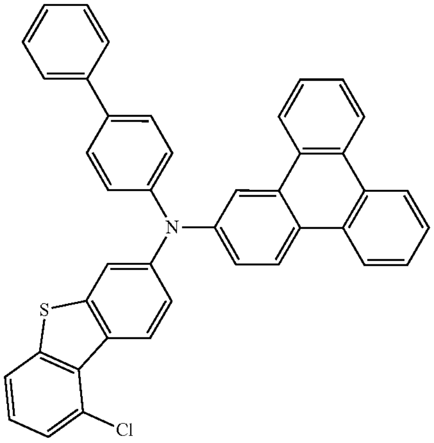
-continued
Sub 1-B-71
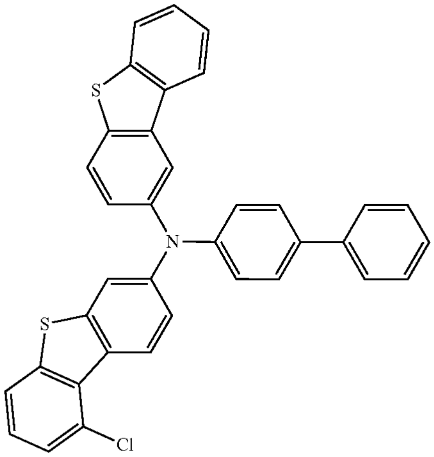
Sub 1-B-72
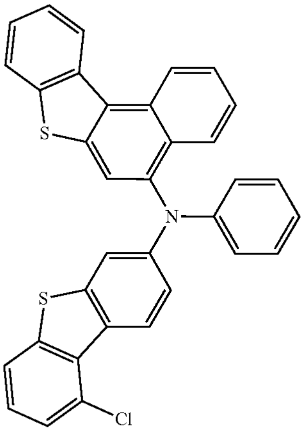
Sub 1-B-73
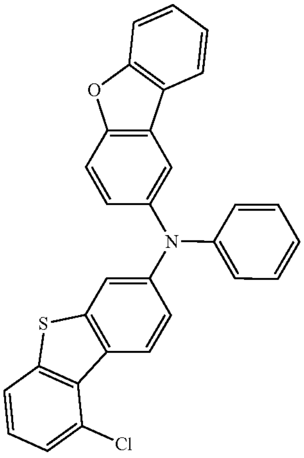

-continued
Sub 1-B-74
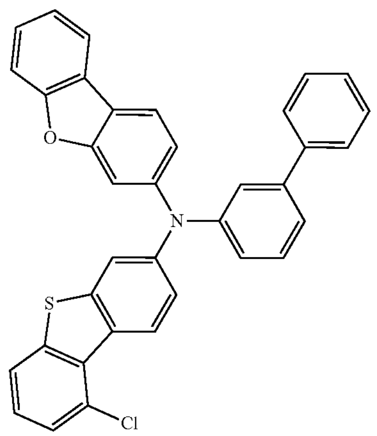
Sub 1-B-75
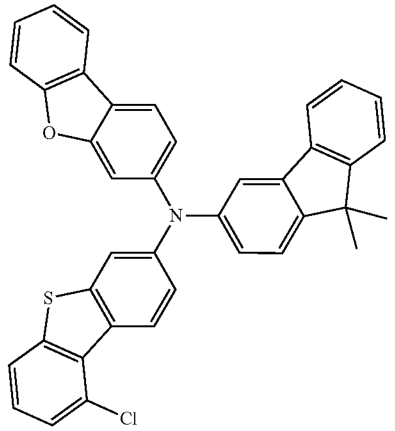
Sub 1-B-76
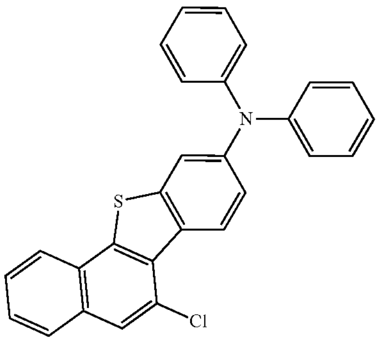
Sub 1-B-77
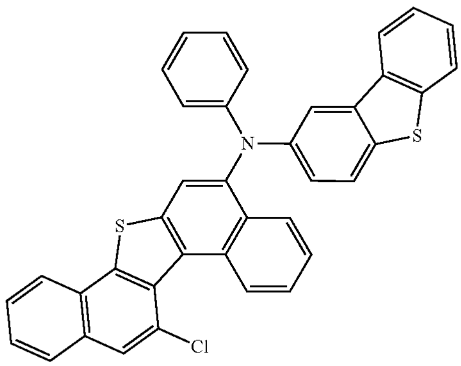
-continued
Sub 1-B-78
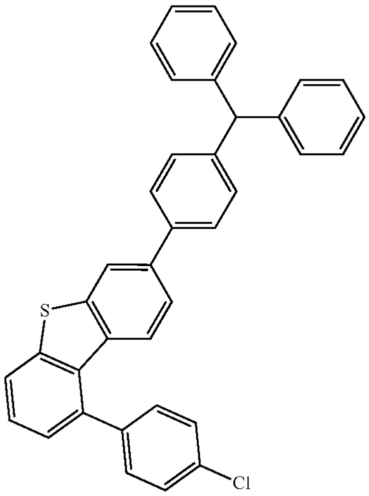
Sub 1-B-79
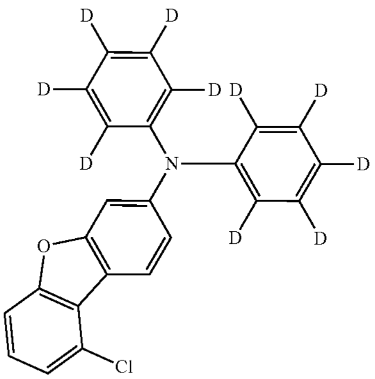
Sub 1-B-80
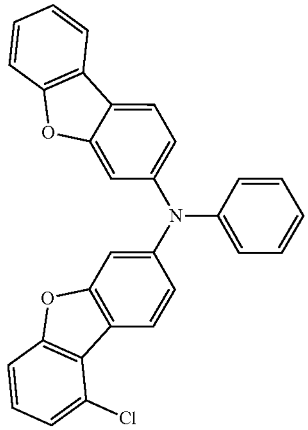

-continued
Sub 1-B-81
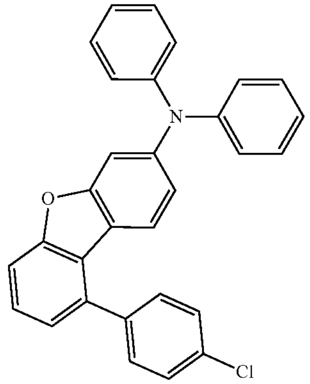
Sub 1-B-82
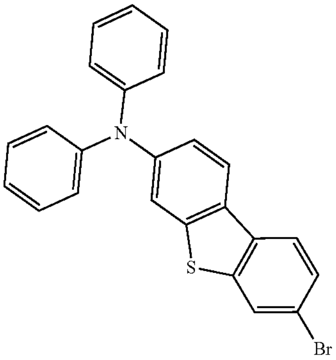
Sub 1-B-83
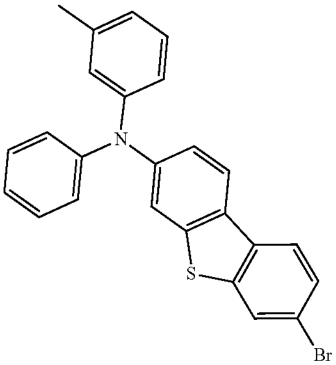
Sub 1-B-84
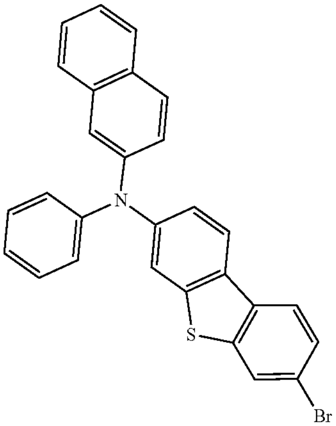
-continued
Sub 1-B-85
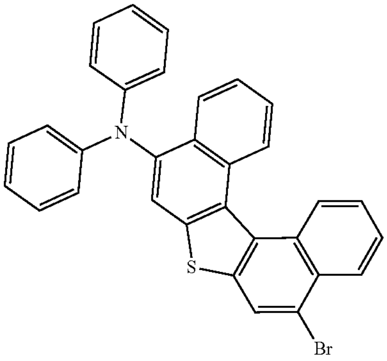
Sub 1-B-86
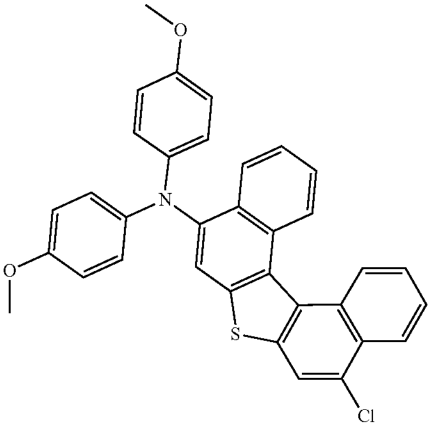
Sub 1-B-87
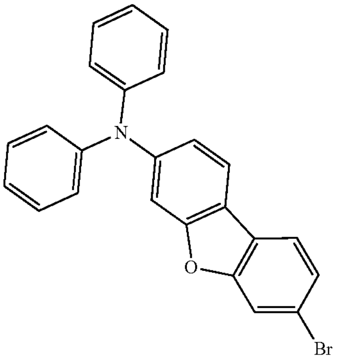
Sub 1-B-88
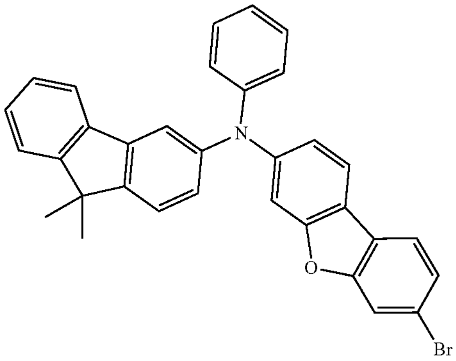

-continued
Sub 1-B-89
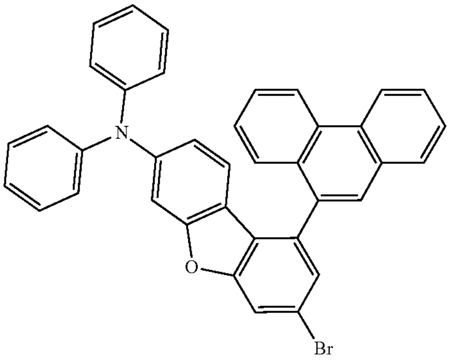
Sub 1-B-90
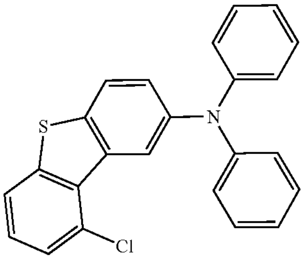
Sub 1-B-91
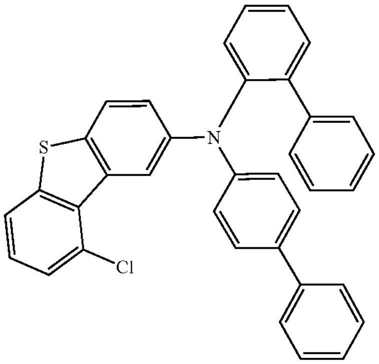
Sub 1-B-92
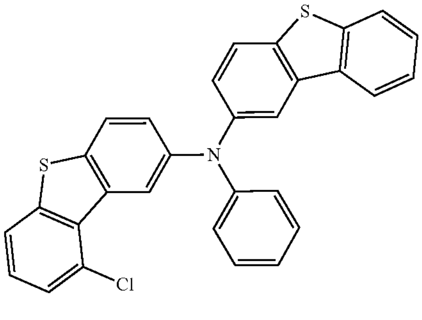
-continued
Sub 1-B-93
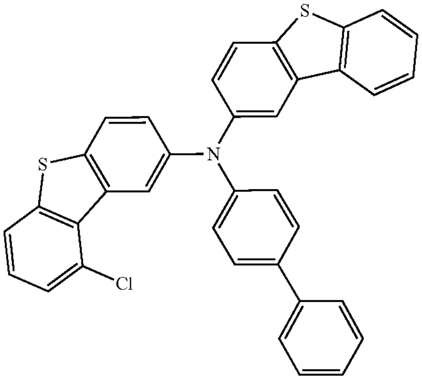
Sub 1-B-94
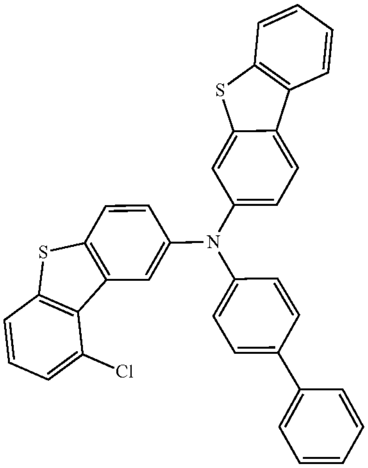
Sub 1-B-95
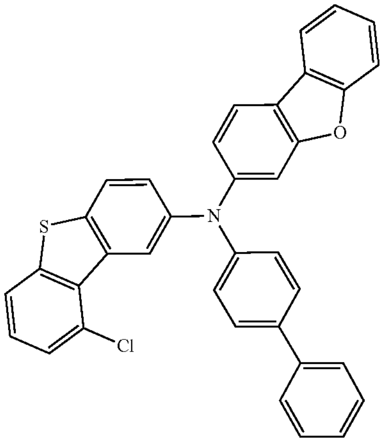

-continued
Sub 1-B-96
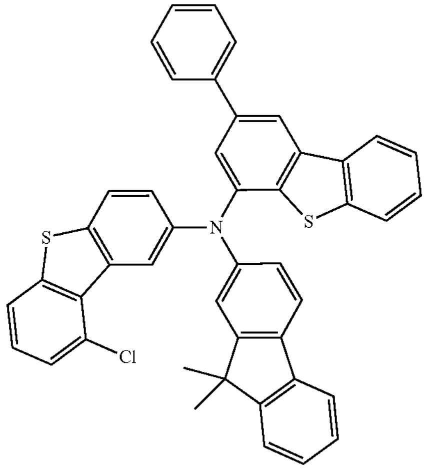
Sub 1-B-97
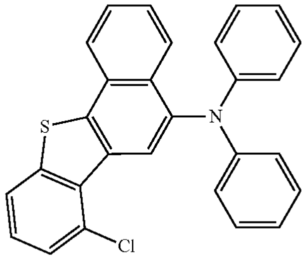
Sub 1-B-98
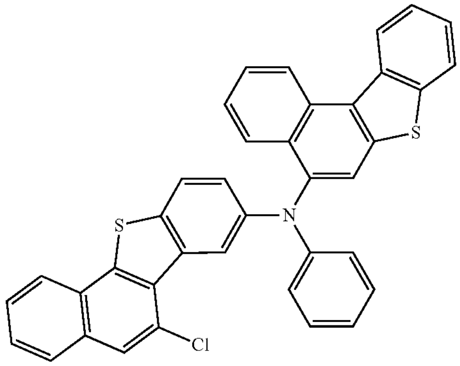
Sub 1-B-99
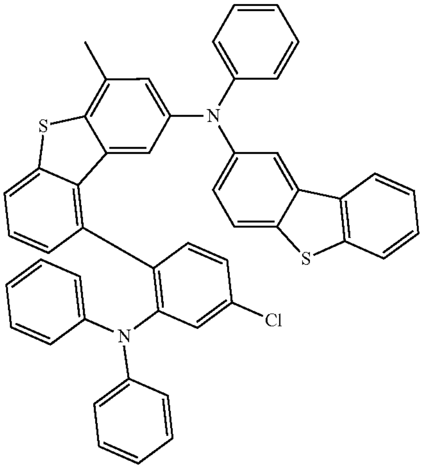
-continued
Sub 1-B-100
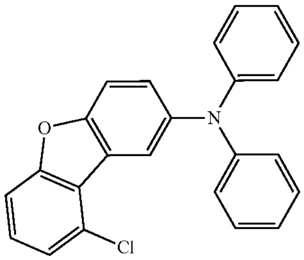
Sub 1-B-101
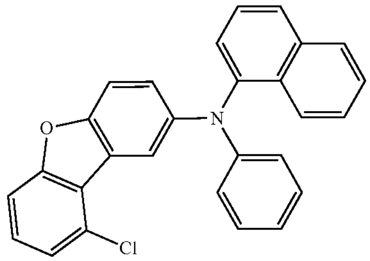
Sub 1-B-102
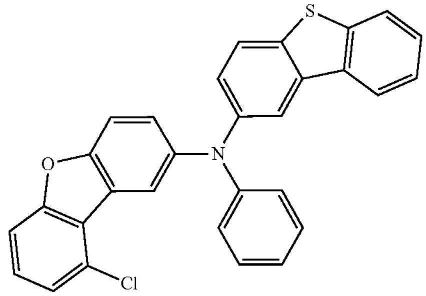
Sub 1-B-103
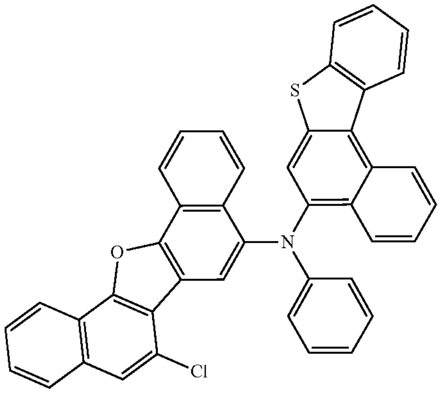
Sub 1-B-104
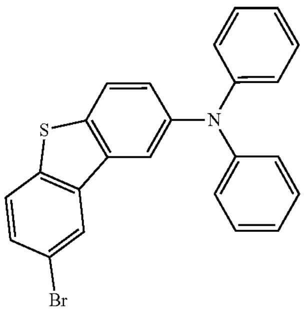

-continued
Sub 1-B-105
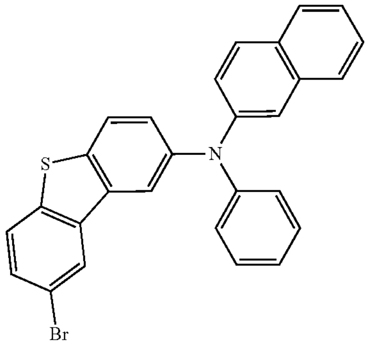
Sub 1-B-106
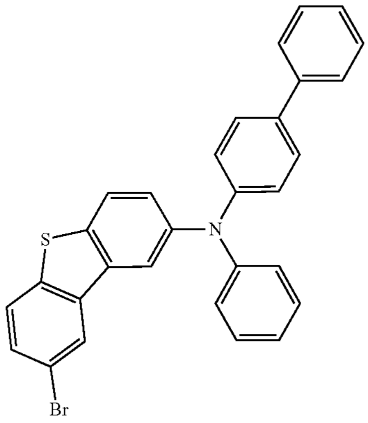
Sub 1-B-107
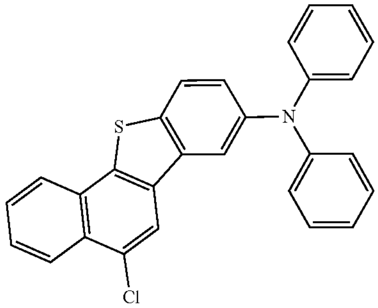
Sub 1-B-108
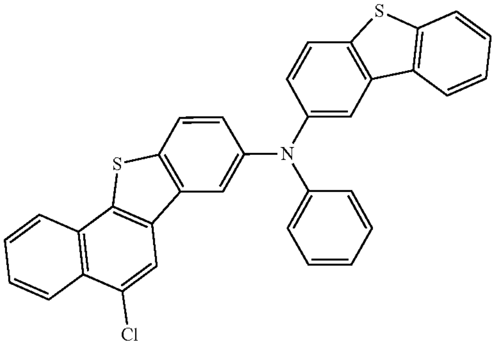
-continued
Sub 1-B-109
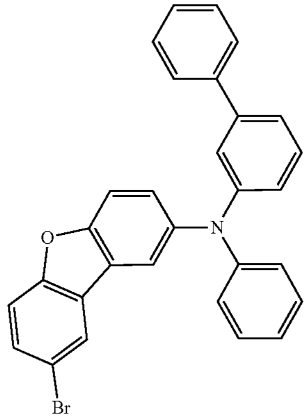
Sub 1-B-110
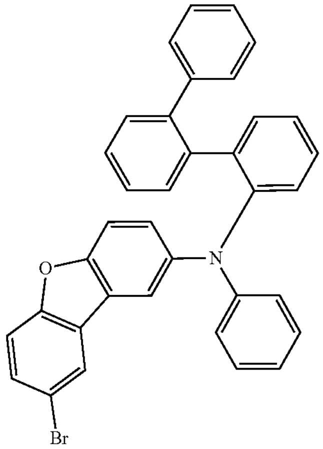
Sub 1-B-111
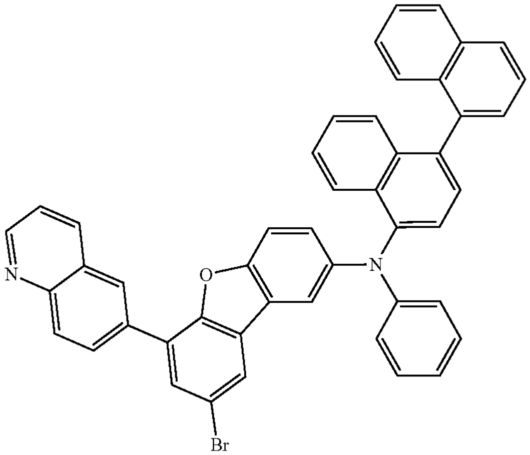
Sub 1-B-112
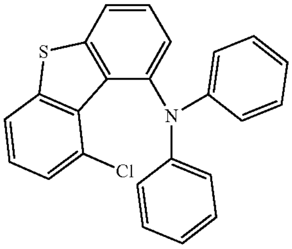

-continued
Sub 1-B-113
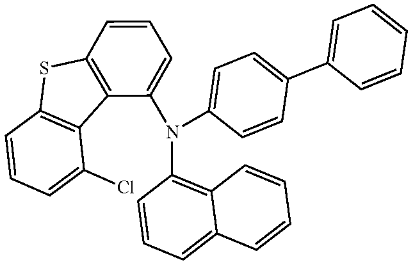
Sub 1-B-114
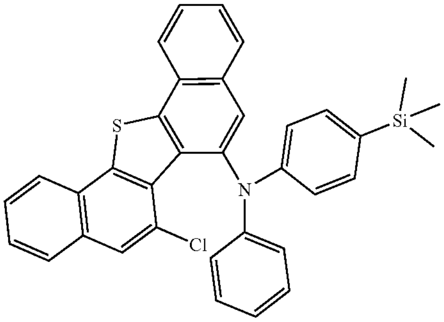
Sub 1-B-115
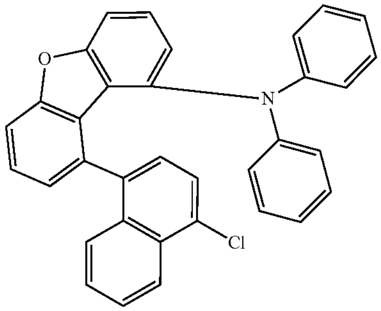
Sub 1-B-116
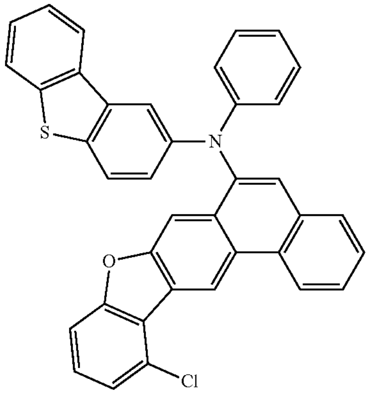
-continued
Sub 1-B-117
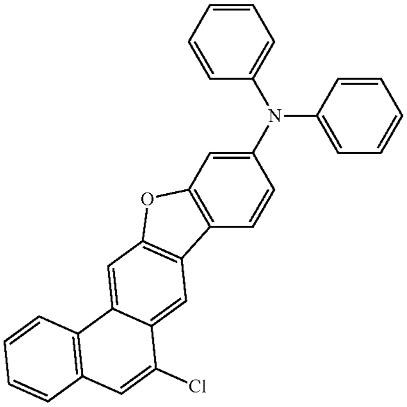
Sub 1-B-118
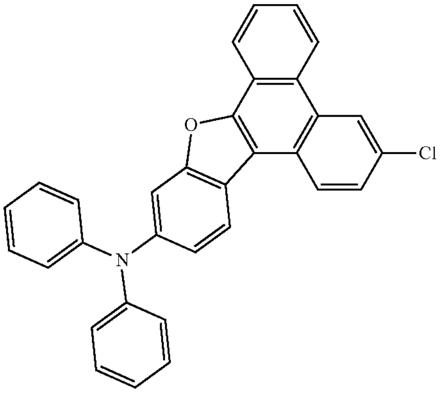
Sub 1-B-119
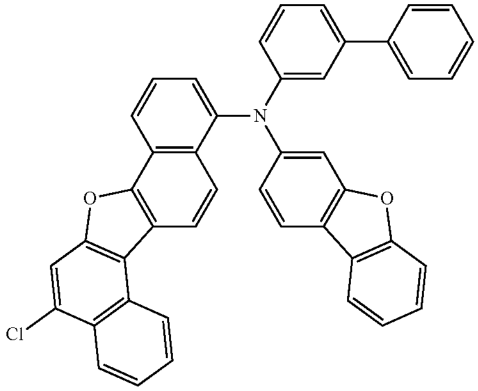
Sub 1-B-120
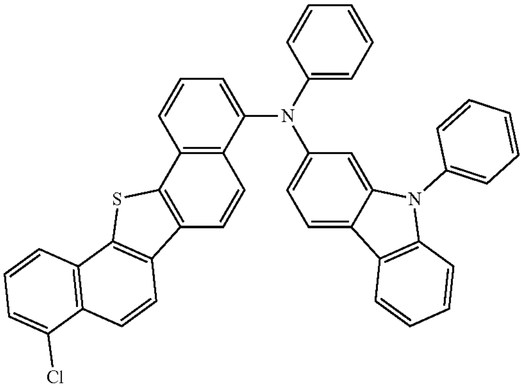

Sub 1-B-121
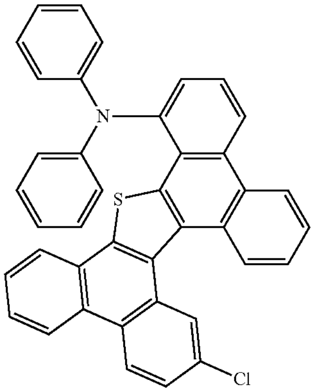
Sub 1-B-122
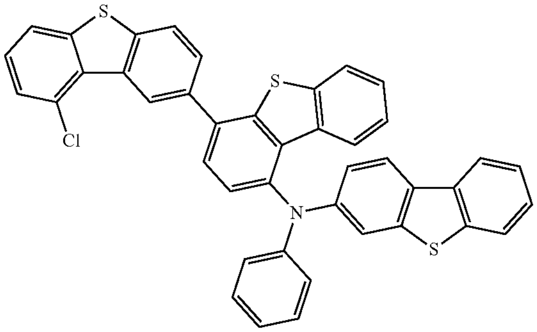
Sub 1-B-123
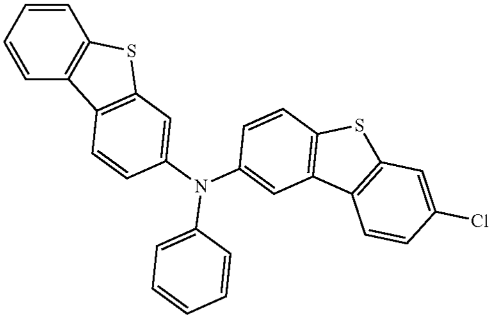
Sub 1-B-124
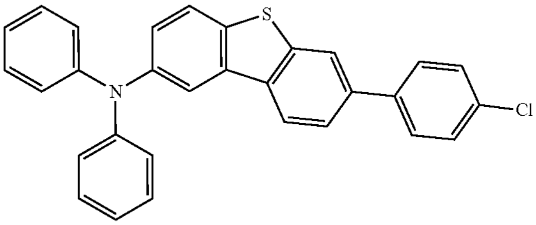
Sub 1-B-125
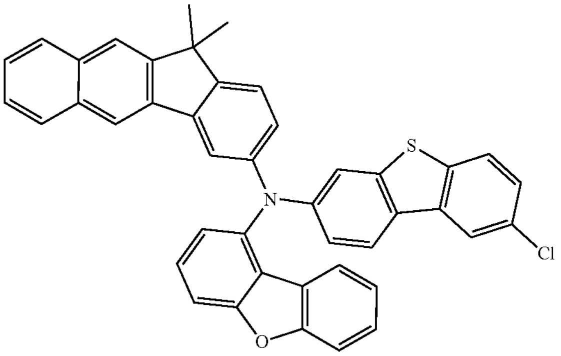
Sub 1-B-126
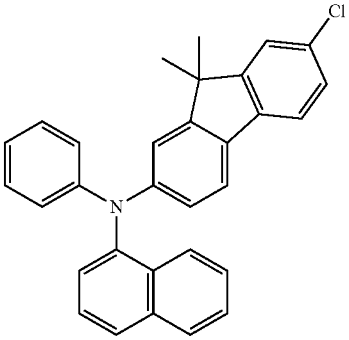
Sub 1-B-127
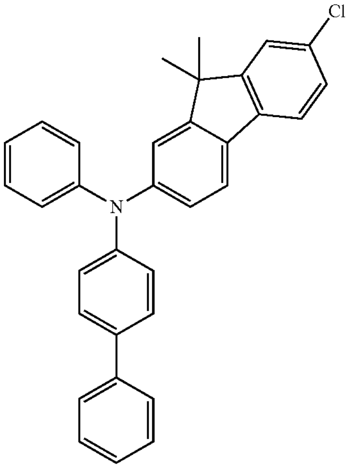
Sub 1-B-128
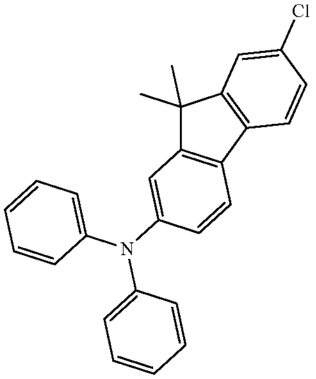

-continued
Sub 1-B-129
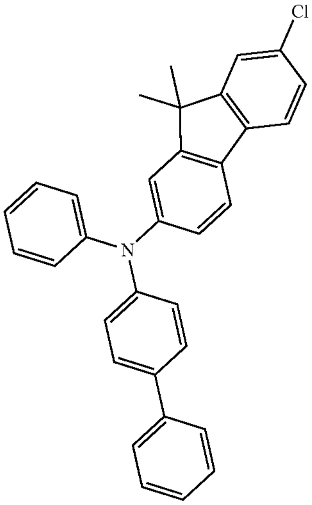
Sub 1-B-130
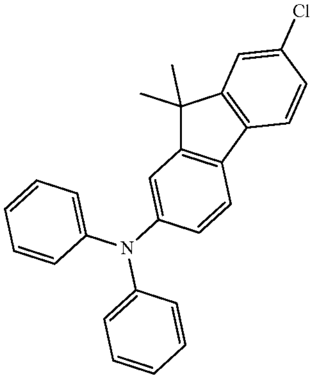
Sub 1-B-131
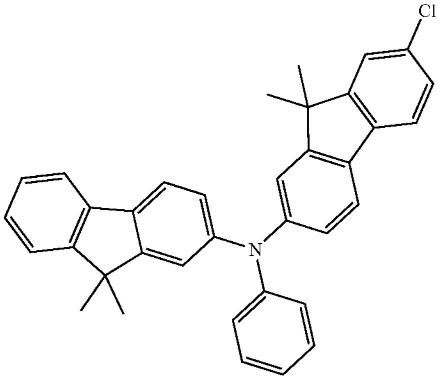
-continued
Sub 1-B-132
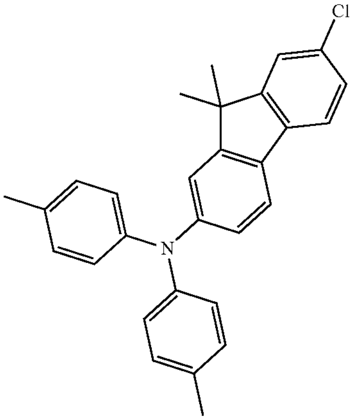
Sub 1-B-133
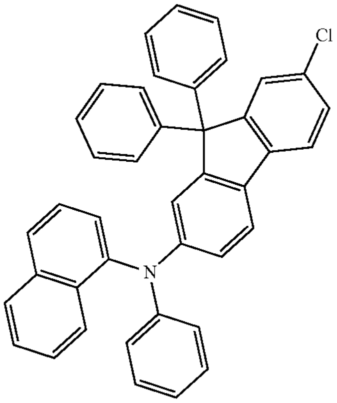
Sub 1-B-134
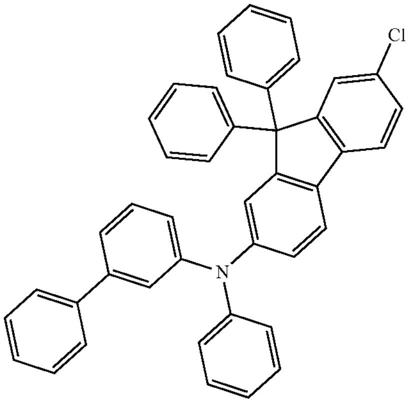
Sub 1-B-135
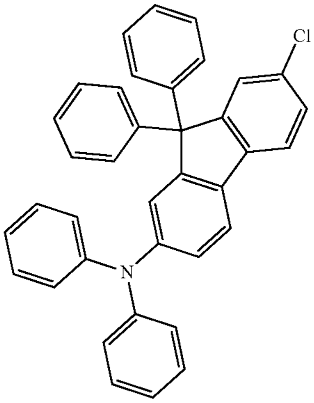

-continued
Sub 1-B-136
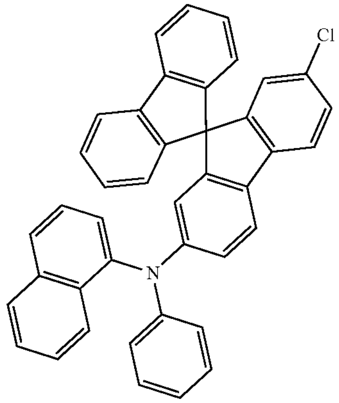
Sub 1-B-137
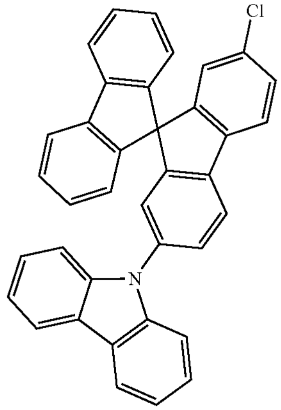
Sub 1-B-138
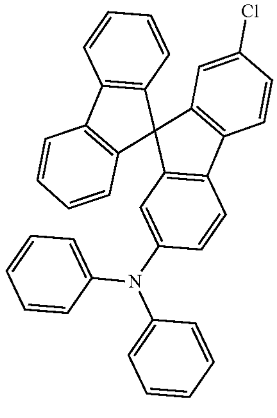
-continued
Sub 1-B-139
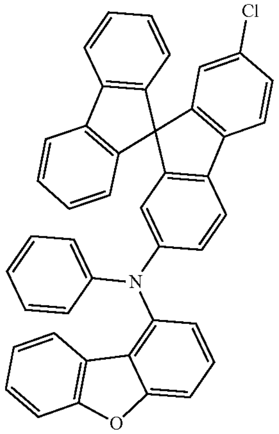
Sub 1-B-140
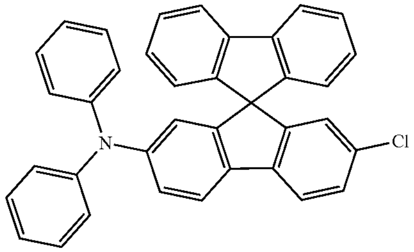
Sub 1-B-141
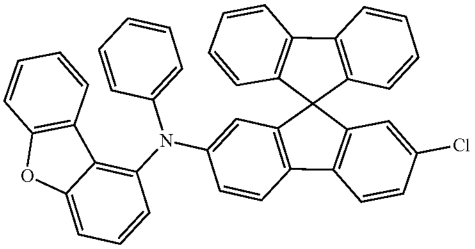
Sub 1-B-142
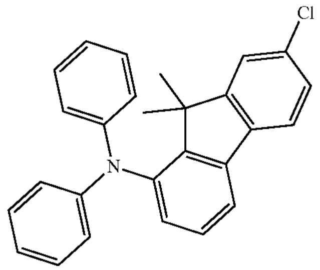

-continued
Sub 1-B-143
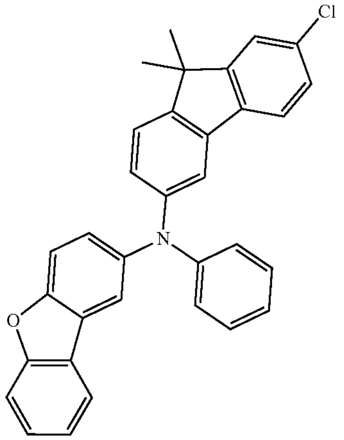
Sub 1-B-144
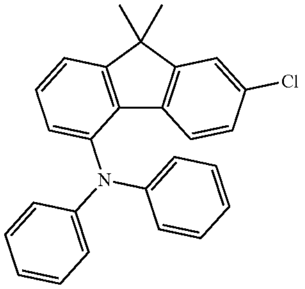
Sub 1-B-145
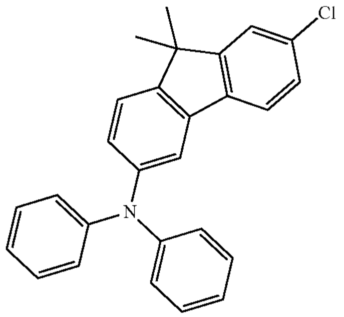
Sub 1-B-146
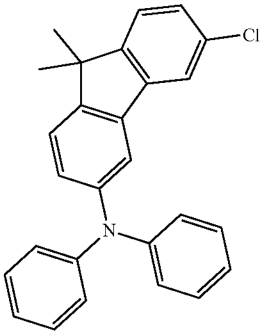
-continued
Sub 1-B-147
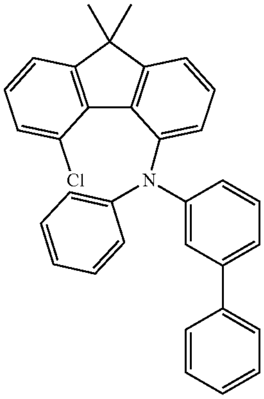
Sub 1-B-148
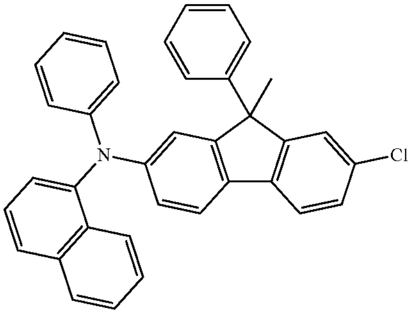
Sub 1-B-149
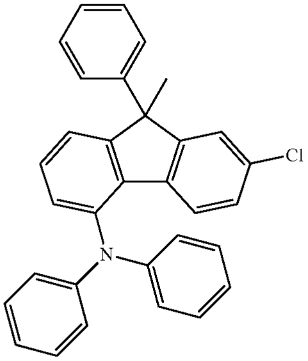
Sub 1-B-150
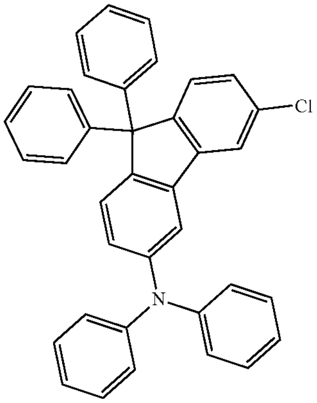

-continued
Sub 1-B-151
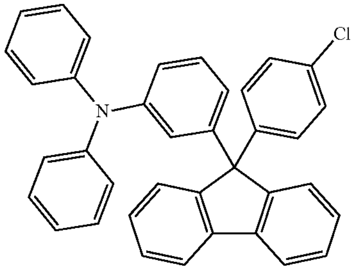
Sub 1-B-152
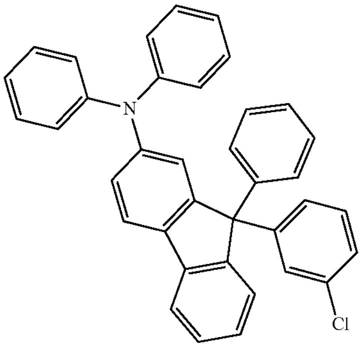
Sub 1-B-153
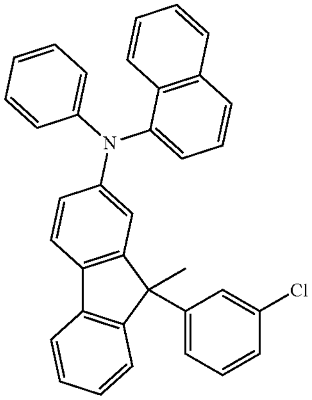
Sub 1-B-154
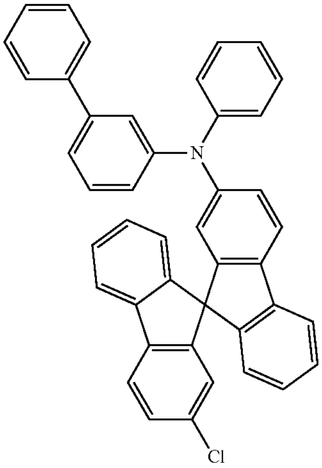
-continued
Sub 1-B-155
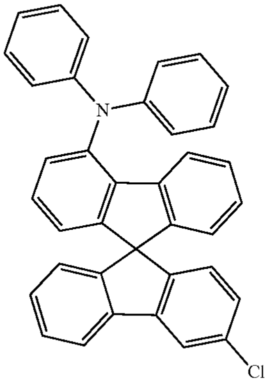
Sub 1-B-156
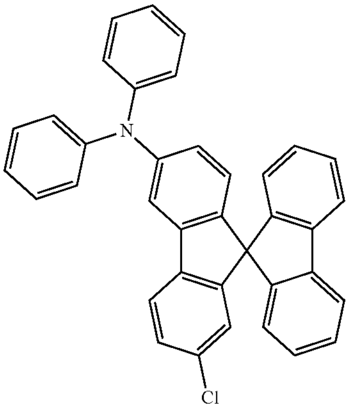
Sub 1-B-157
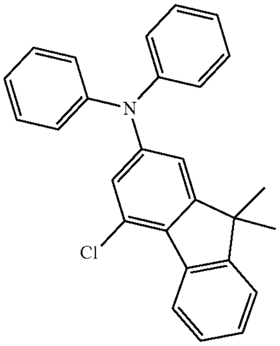
Sub 1-B-158
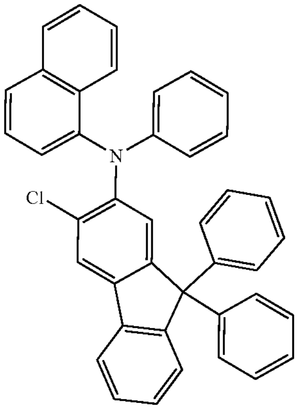

-continued
Sub 1-B-159
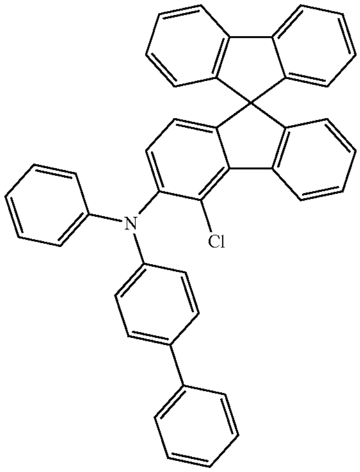
Sub 1-B-160
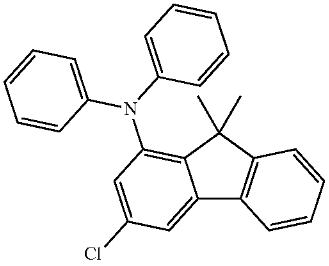
Sub 1-B-161
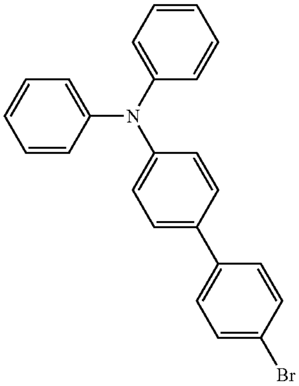
Sub 1-B-162
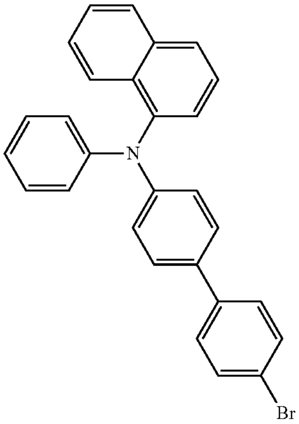
-continued
Sub 1-B-163
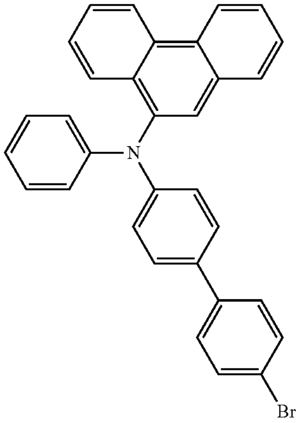
Sub 1-B-164
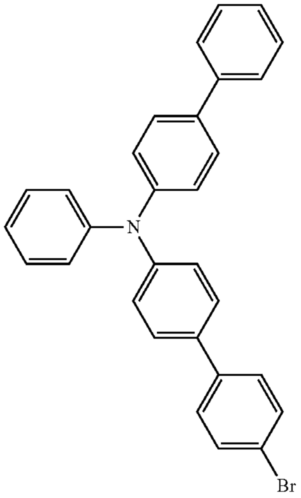
Sub 1-B-165
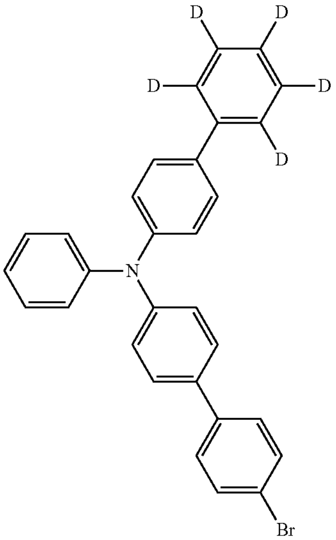

-continued
Sub 1-B-166
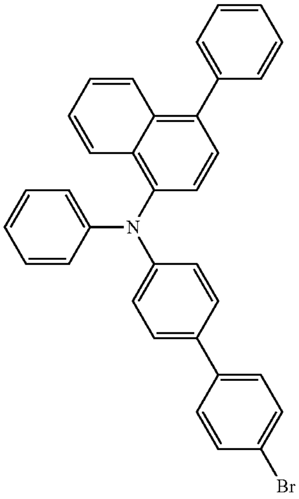
Sub 1-B-167
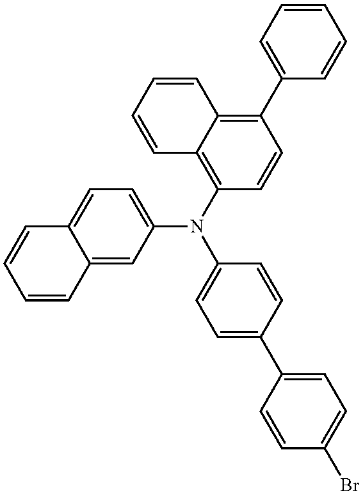
Sub 1-B-168
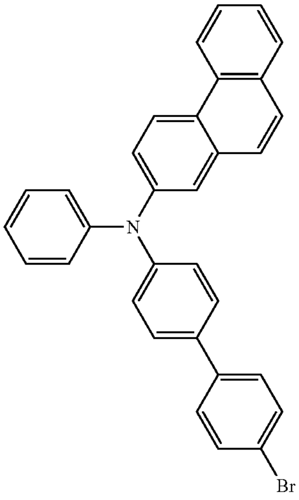
-continued
Sub 1-B-169
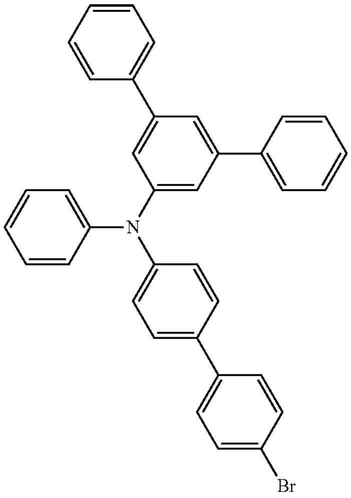
Sub 1-B-170
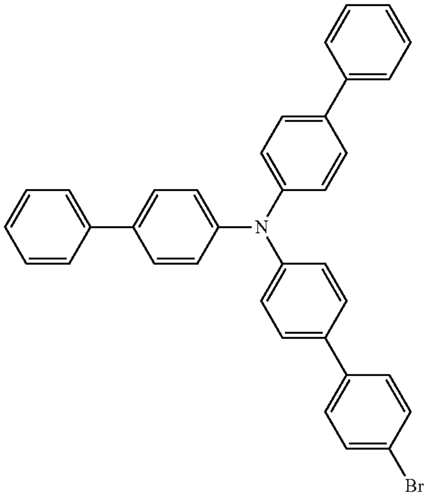
Sub 1-B-171
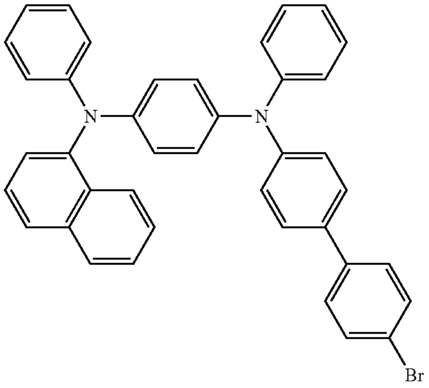

-continued
Sub 1-B-172
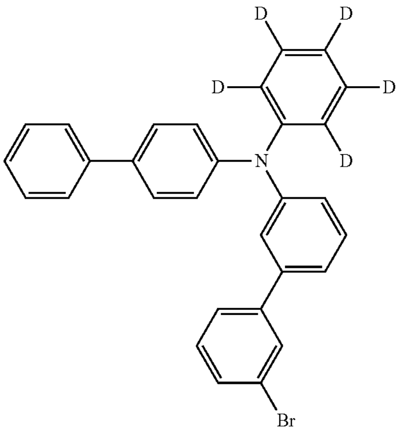
Sub 1-B-173
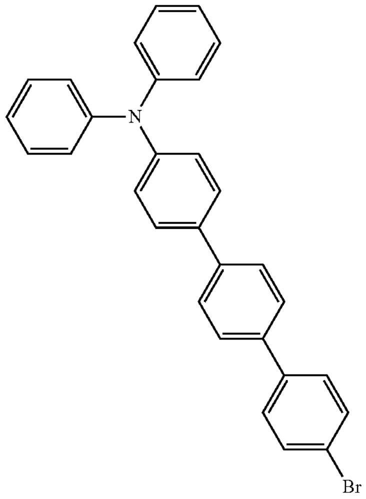
Sub 1-B-174
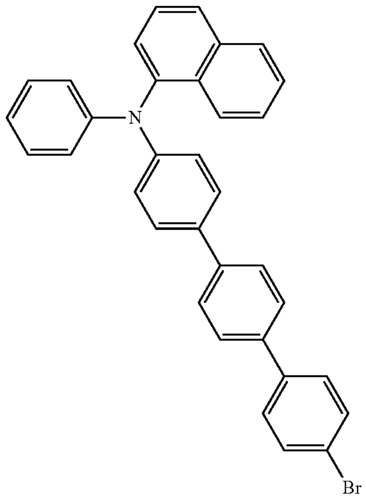
-continued
Sub 1-B-175
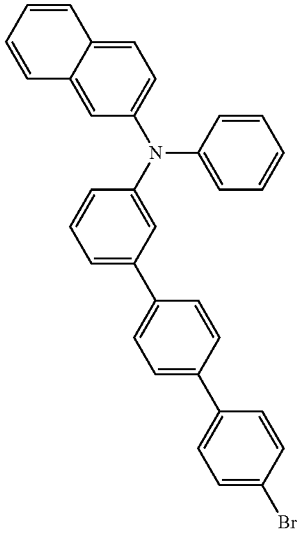
Sub 1-B-176
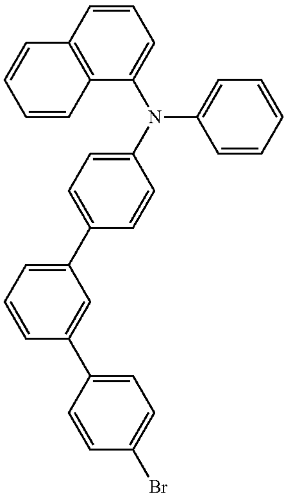
Sub 1-B-177
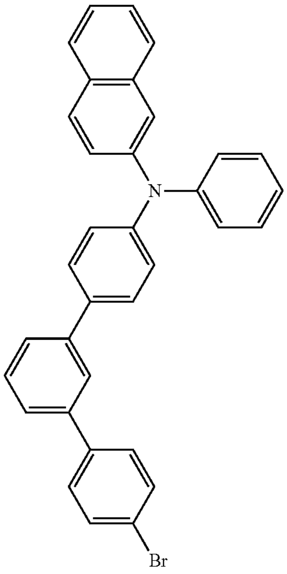

-continued
Sub 1-B-178
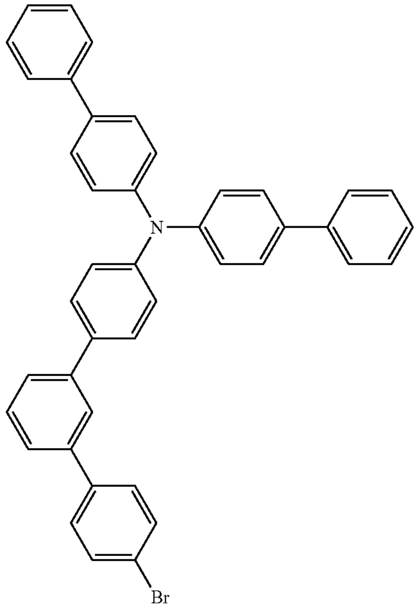
Sub 1-B-179
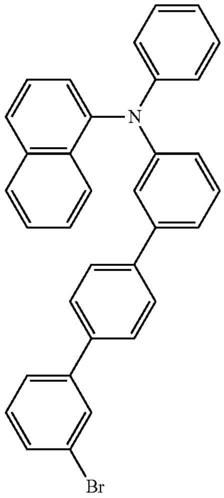
Sub 1-B-180
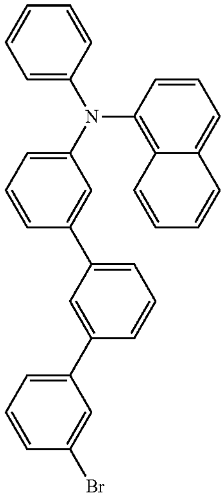
-continued
Sub 1-B-181
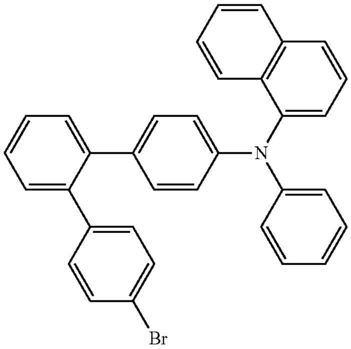
Sub 1-B-182
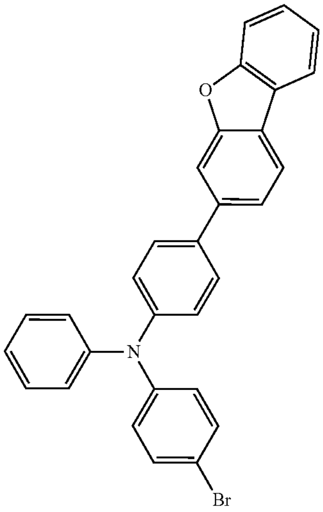
Sub 1-B-183
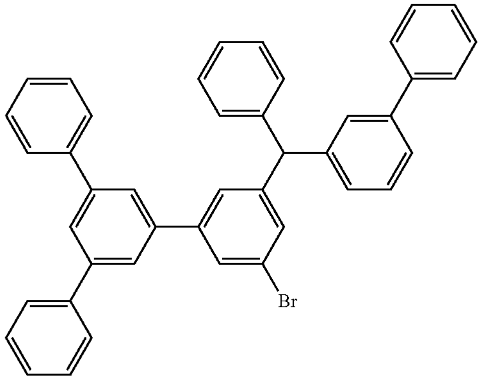
Sub 1-B-184
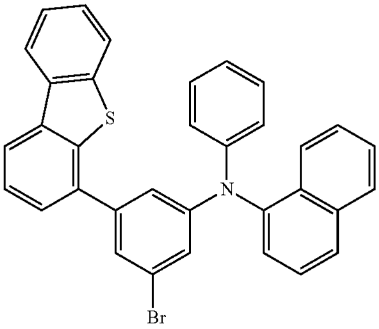

-continued
Sub 1-B-185
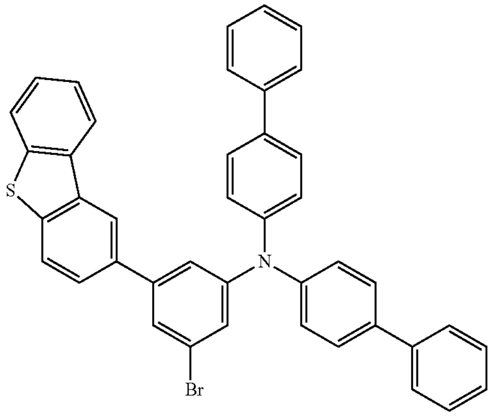
Sub 1-B-186
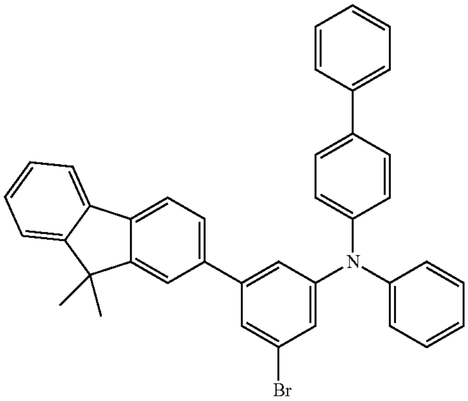
Sub 1-B-187
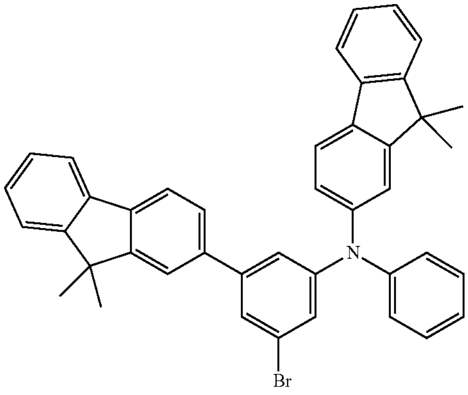
-continued
Sub 1-B-188
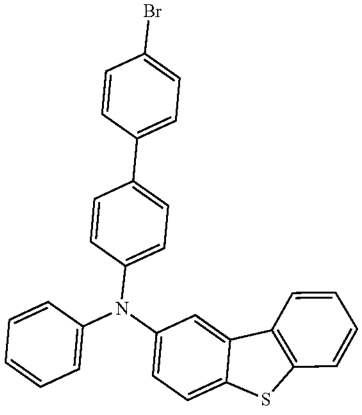
Sub 1-B-189
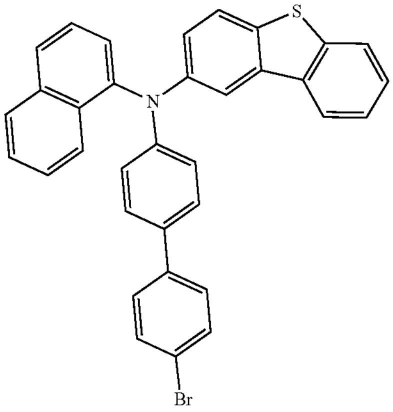
Sub 1-B-190
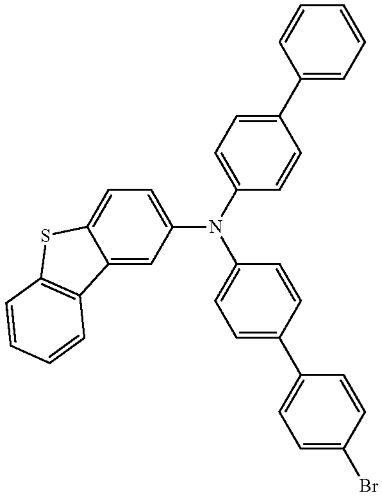

-continued
Sub 1-B-191
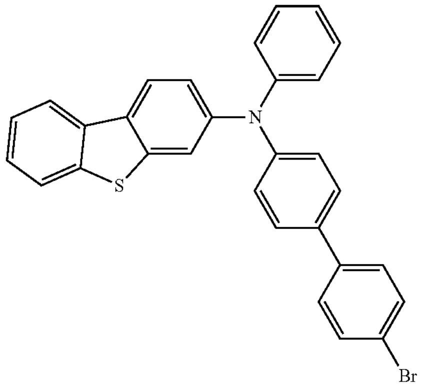
Sub 1-B-192
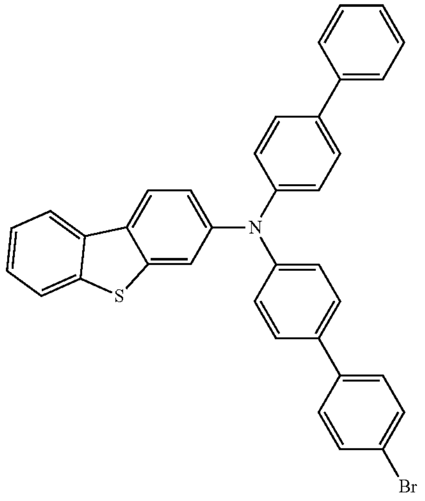
Sub 1-B-193
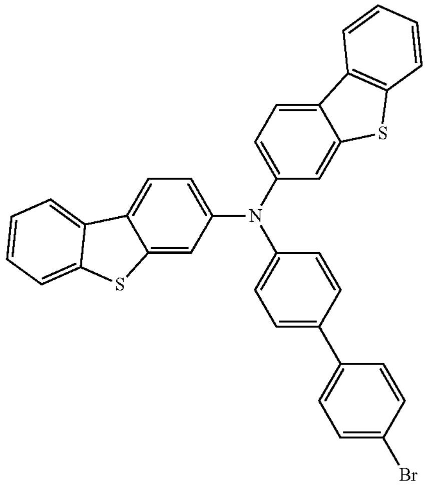
-continued
Sub 1-B-194
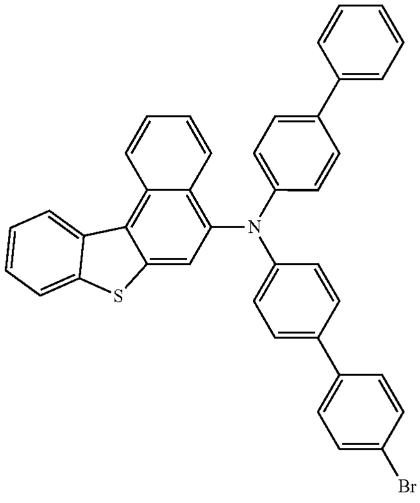
Sub 1-B-195
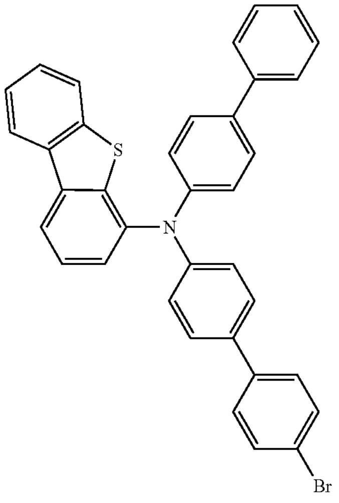
Sub 1-B-196
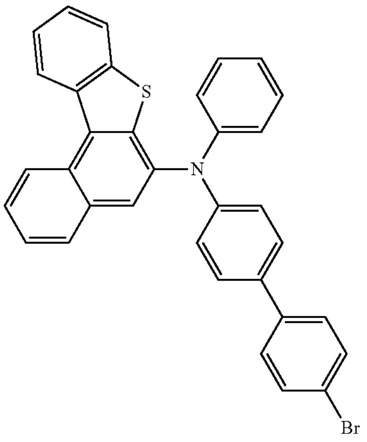

-continued
Sub 1-B-197
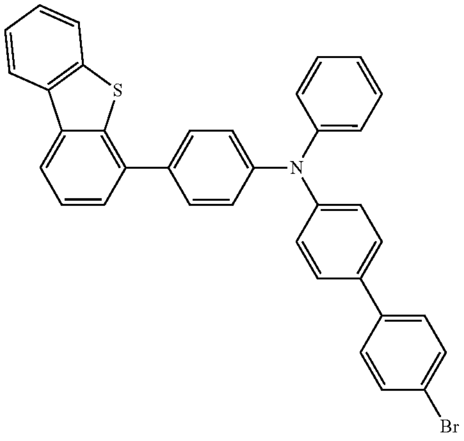
Sub 1-B-198
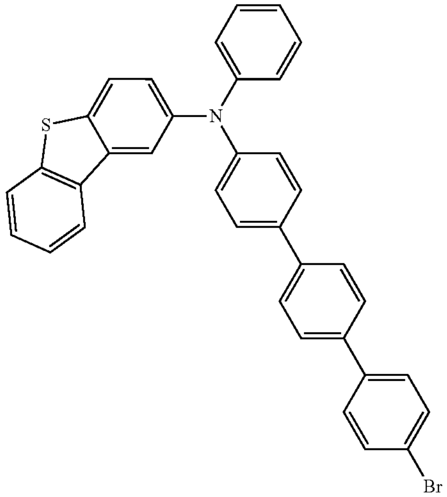
Sub 1-B-199
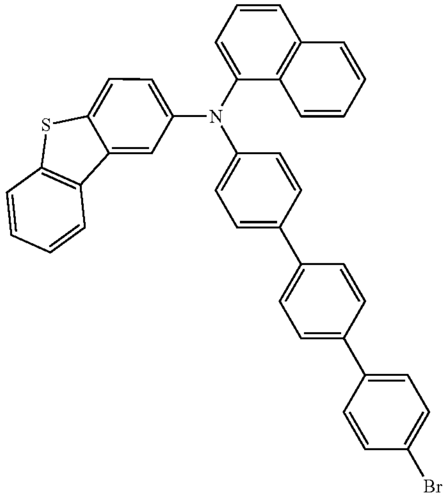
-continued
Sub 1-B-200
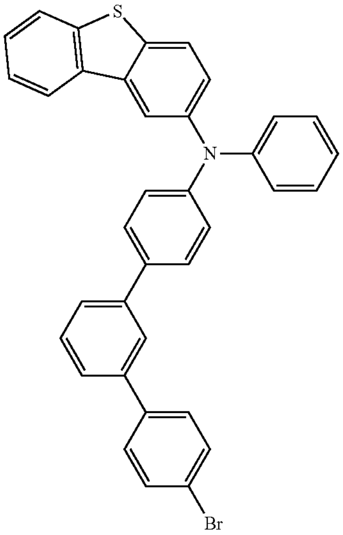
Sub 1-B-201
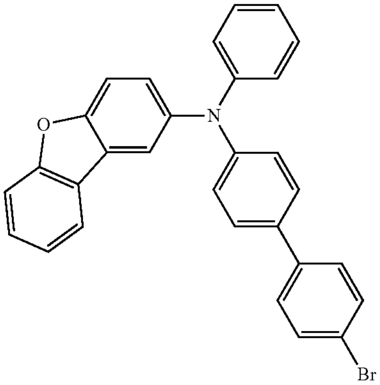
Sub 1-B-202
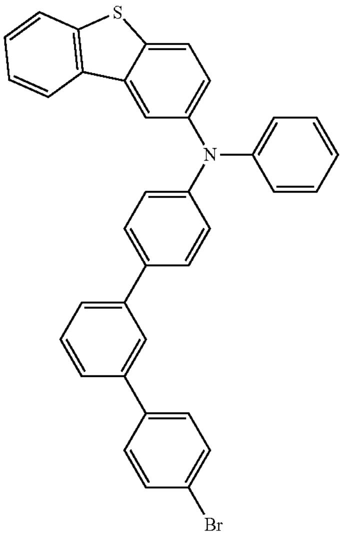

Sub 1-B-203
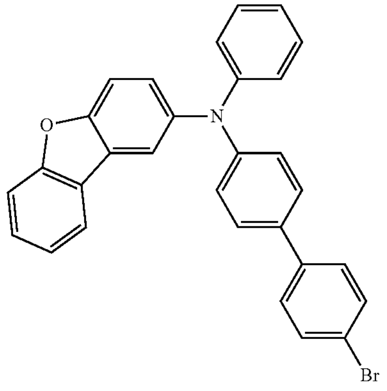
Sub 1-B-204
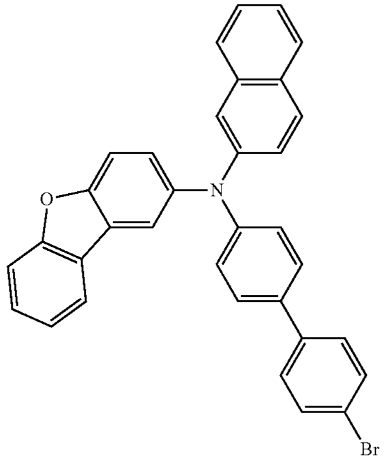
Sub 1-B-205
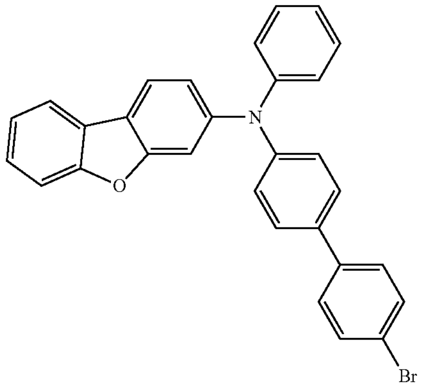
Sub 1-B-206
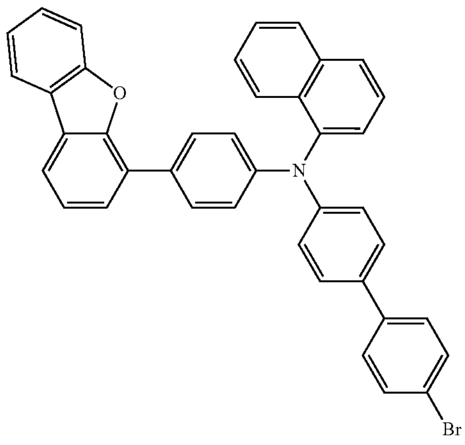
Sub 1-B-207
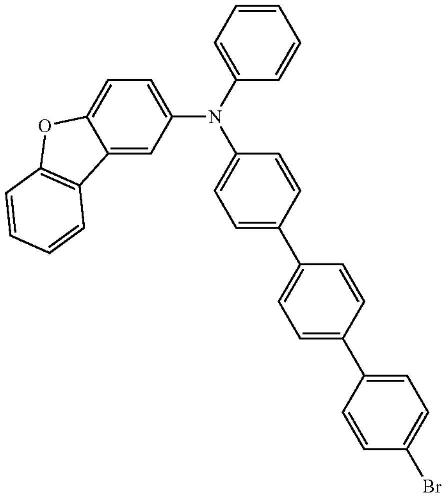
Sub 1-B-208
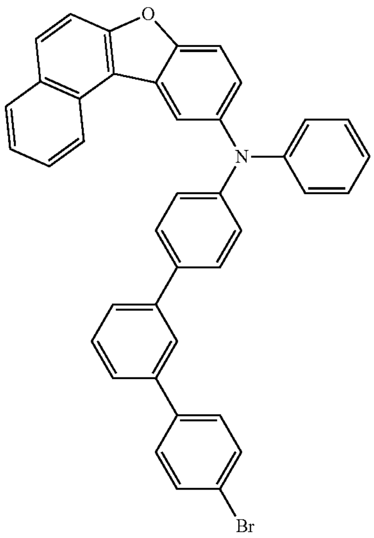

-continued
Sub 1-B-209
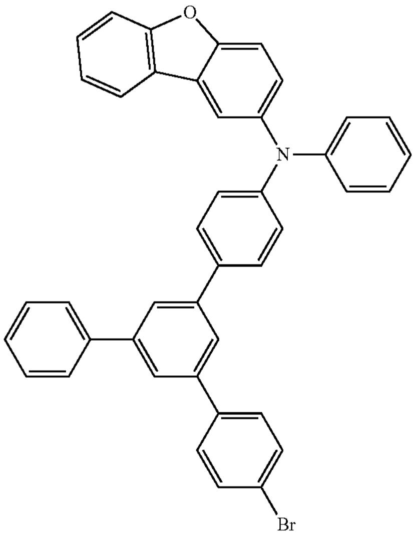
Sub 1-B-210
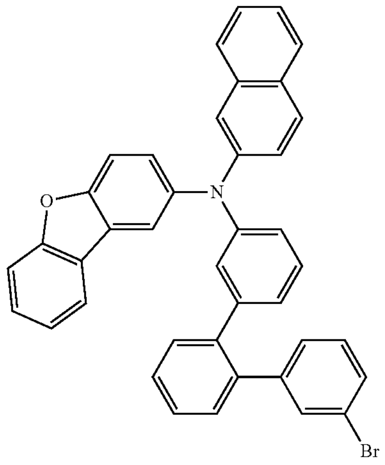
Sub 1-B-211
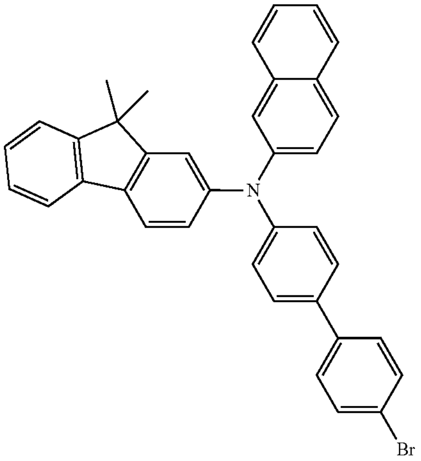
-continued
Sub 1-B-212
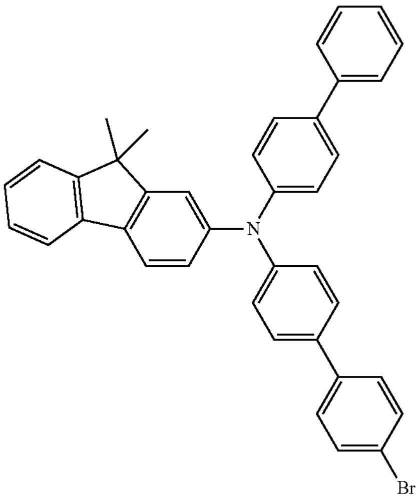
Sub 1-B-213
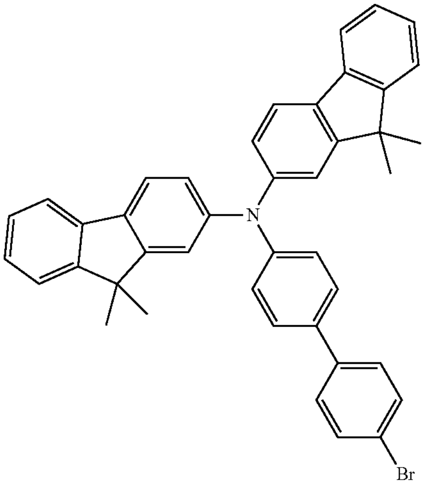
Sub 1-B-214
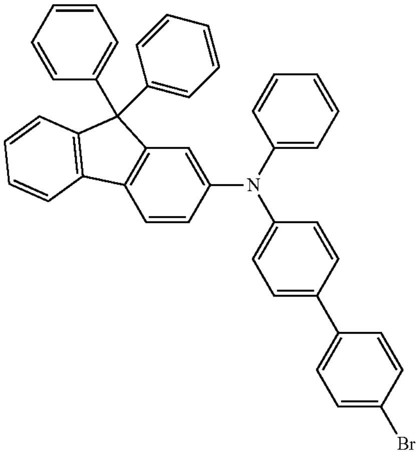

-continued
Sub 1-B-215
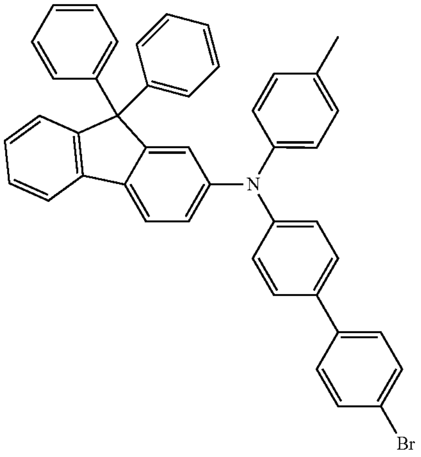
Sub 1-B-216
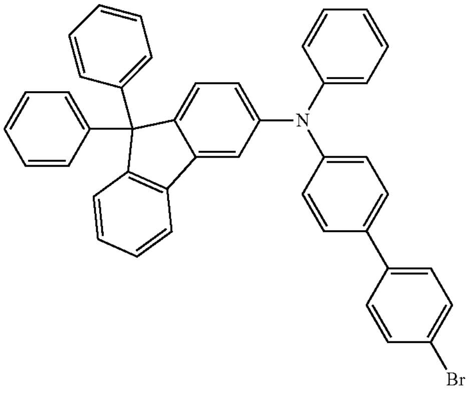
Sub 1-B-217
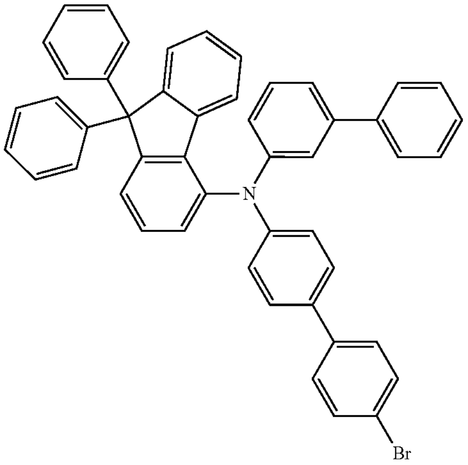
-continued
Sub 1-B-218
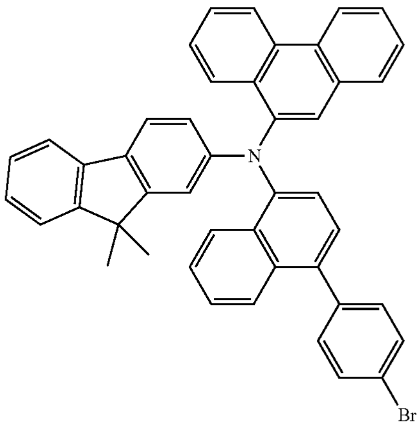
Sub 1-B-219
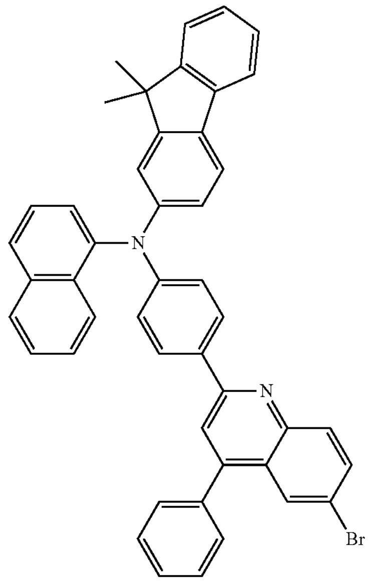
Sub 1-B-220
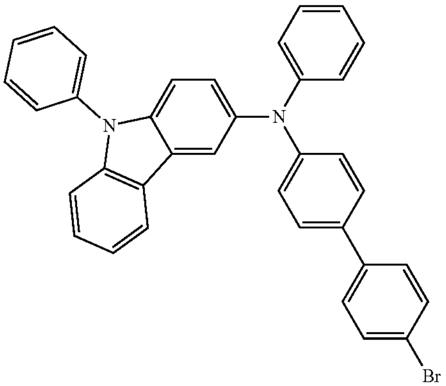

-continued
Sub 1-B-221
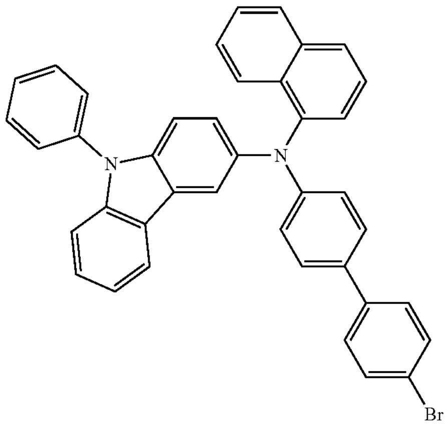
Sub 1-B-222
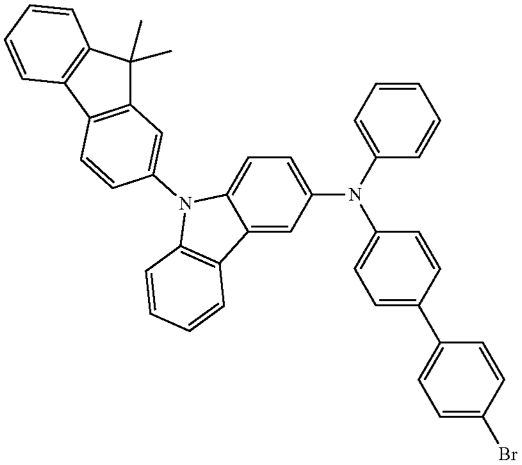
Sub 1-B-223
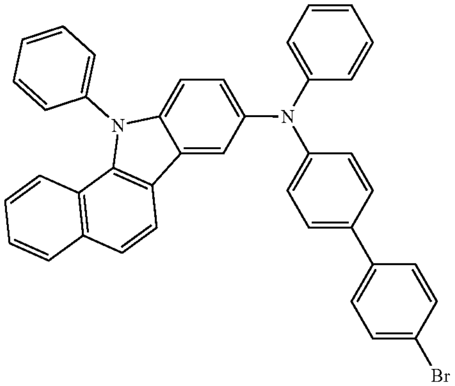
-continued
Sub 1-B-224
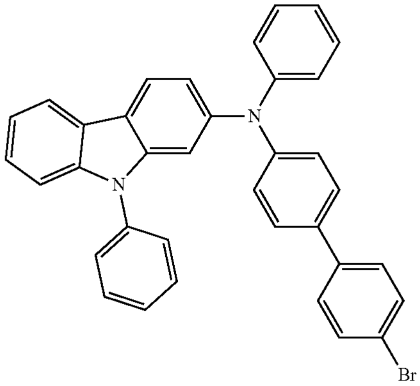
Sub 1-B-225
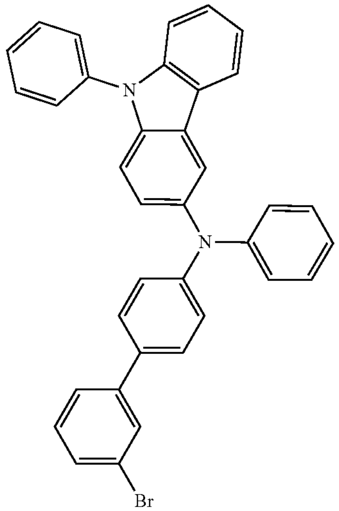
Sub 1-B-226
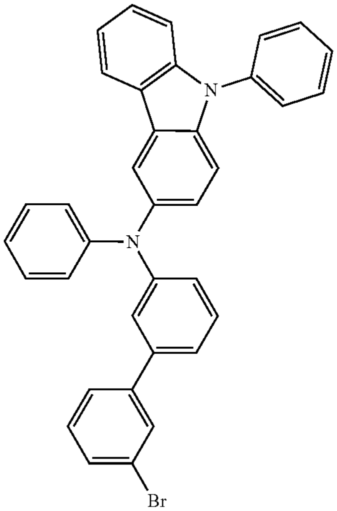
TABLE 2
| Compound | FD-MS | Compound | FD-MS |
|---|---|---|---|
| Sub 1-B-1 | m/z = 429.02 ($C_{24}H_{16}BrNS$ = 430.36) | Sub 1-B-2 | m/z = 413.04 ($C_{24}H_{16}BrNO$ = 414.30) |
| Sub 1-B-3 | m/z = 463.06 ($C_{28}H_{18}BrNO$ = 464.36) | Sub 1-B-4 | m/z = 385.07 ($C_{24}H_{16}ClNS$ = 385.91) |
| Sub 1-B-5 | m/z = 435.08 ($C_{28}H_{18}ClNS$ = 435.97) | Sub 1-B-6 | m/z = 567.09 ($C_{36}H_{22}ClNS_2$ = 568.15) |
| Sub 1-B-7 | m/z = 551.11 ($C_{36}H_{22}ClNOS$ = 552.09) | Sub 1-B-8 | m/z = 501.13 ($C_{33}H_{24}ClNS$ = 502.07) |

TABLE 2-continued

| Compound | FD-MS | Compound | FD-MS |
|---|---|---|---|
| Sub 1-B-9 | m/z = 445.12 ($C_{30}H_{20}ClNO$ = 445.95) | Sub 1-B-10 | m/z = 445.12 ($C_{30}H_{20}ClNO$ = 445.95) |
| Sub 1-B-11 | m/z = 385.07 ($C_{24}H_{16}ClNS$ = 385.91) | Sub 1-B-12 | m/z = 491.06 ($C_{30}H_{18}ClNS_2$ = 492.05) |
| Sub 1-B-13 | m/z = 567.09 ($C_{36}H_{22}ClNS_2$ = 568.15) | Sub 1-B-14 | m/z = 541.07 ($C_{34}H_{20}ClNS_2$ = 542.11) |
| Sub 1-B-15 | m/z = 575.11 ($C_{38}H_{22}ClNOS$ = 576.11) | Sub 1-B-16 | m/z = 552.11 ($C_{35}H_{21}ClN_2OS$ = 553.08) |
| Sub 1-B-17 | m/z = 626.16 ($C_{42}H_{27}ClN_2S$ = 627.20) | Sub 1-B-18 | m/z = 643.12 ($C_{42}H_{26}ClNS_2$ = 644.25) |
| Sub 1-B-19 | m/z = 435.08 ($C_{28}H_{18}ClNS$ = 435.97) | Sub 1-B-20 | m/z = 369.09 ($C_{24}H_{16}ClNO$ = 369.85) |
| Sub 1-B-21 | m/z = 475.08 ($C_{30}H_{18}ClNOS$ = 475.99) | Sub 1-B-22 | m/z = 565.09 ($C_{36}H_{20}ClNO_2S$ = 566.07) |
| Sub 1-B-23 | m/z = 519.14 ($C_{36}H_{22}ClNO$ = 520.03) | Sub 1-B-24 | m/z = 385.07 ($C_{24}H_{16}ClNS$ = 385.91) |
| Sub 1-B-25 | m/z = 435.08 ($C_{28}H_{18}ClNS$ = 435.97) | Sub 1-B-26 | m/z = 567.09 ($C_{36}H_{22}ClNS_2$ = 568.15) |
| Sub 1-B-27 | m/z = 597.04 ($C_{36}H_{20}ClNS_3$ = 598.19) | Sub 1-B-28 | m/z = 435.08 ($C_{28}H_{18}ClNS$ = 435.97) |
| Sub 1-B-29 | m/z = 435.08 ($C_{28}H_{18}ClNS$ = 435.97) | Sub 1-B-30 | m/z = 485.10 ($C_{32}H_{20}ClNS$ = 486.03) |
| Sub 1-B-31 | m/z = 591.14 ($C_{39}H_{26}ClNOS$ = 592.15) | Sub 1-B-32 | m/z = 559.13 ($C_{38}H_{22}ClNO_2$ = 560.05) |
| Sub 1-B-33 | m/z = 677.16 ($C_{46}H_{28}ClNOS$ = 678.25) | Sub 1-B-34 | m/z = 385.07 ($C_{24}H_{16}ClNS$ = 385.91) |
| Sub 1-B-35 | m/z = 399.08 ($C_{25}H_{18}ClNS$ = 399.94) | Sub 1-B-36 | m/z = 435.08 ($C_{28}H_{18}ClNS$ = 435.97) |
| Sub 1-B-37 | m/z = 461.10 ($C_{30}H_{20}ClNS$ = 462.01) | Sub 1-B-38 | m/z = 511.12 ($C_{34}H_{22}ClNS$ = 512.07) |
| Sub 1-B-39 | m/z = 399.08 ($C_{25}H_{18}ClNS$ = 399.94) | Sub 1-B-40 | m/z = 461.10 ($C_{30}H_{20}ClNS$ = 462.01) |
| Sub 1-B-41 | m/z = 491.06 ($C_{30}H_{18}ClNS_2$ = 492.05) | Sub 1-B-42 | m/z = 491.06 ($C_{30}H_{18}ClNS_2$ = 492.05) |
| Sub 1-B-43 | m/z = 491.06 ($C_{30}H_{18}ClNS_2$ = 492.05) | Sub 1-B-44 | m/z = 541.07 ($C_{34}H_{20}ClNS_2$ = 542.11) |
| Sub 1-B-45 | m/z = 643.12 ($C_{42}H_{26}ClNS_2$ = 644.25) | Sub 1-B-46 | m/z = 607.12 ($C_{39}H_{26}ClNS_2$ = 608.21) |
| Sub 1-B-47 | m/z = 541.07 ($C_{34}H_{20}ClNS_2$ = 542.11) | Sub 1-B-48 | m/z = 475.08 ($C_{30}H_{18}ClNOS$ = 475.99) |
| Sub 1-B-49 | m/z = 626.16 ($C_{42}H_{27}ClN_2S$ = 627.20) | Sub 1-B-50 | m/z = 435.08 ($C_{28}H_{18}ClNS$ = 435.97) |
| Sub 1-B-51 | m/z = 435.08 ($C_{28}H_{18}ClNS$ = 435.97) | Sub 1-B-52 | m/z = 435.08 ($C_{28}H_{18}ClNS$ = 435.97) |
| Sub 1-B-53 | m/z = 541.07 ($C_{34}H_{20}ClNS_2$ = 542.11) | Sub 1-B-54 | m/z = 555.09 ($C_{35}H_{22}ClNS_2$ = 556.14) |
| Sub 1-B-55 | m/z = 525.10 ($C_{34}H_{20}ClNOS$ = 526.05) | Sub 1-B-56 | m/z = 513.13 ($C_{34}H_{24}ClNS$ = 514.08) |
| Sub 1-B-57 | m/z = 485.10 ($C_{32}H_{20}ClNS$ = 486.03) | Sub 1-B-58 | m/z = 537.13 ($C_{36}H_{24}ClNS$ = 538.11) |
| Sub 1-B-59 | m/z = 626.16 ($C_{42}H_{27}ClN_2S$ = 627.20) | Sub 1-B-60 | m/z = 369.09 ($C_{24}H_{16}ClNO$ = 369.85) |
| Sub 1-B-61 | m/z = 445.12 ($C_{30}H_{20}ClNO$ = 445.95) | Sub 1-B-62 | m/z = 495.14 ($C_{34}H_{22}ClNO$ = 496.01) |
| Sub 1-B-63 | m/z = 459.10 ($C_{30}H_{18}ClNO_2$ = 459.93) | Sub 1-B-64 | m/z = 534.15 ($C_{36}H_{23}ClN_2O$ = 535.04) |
| Sub 1-B-65 | m/z = 535.17 ($C_{37}H_{26}ClNO$ = 536.07) | Sub 1-B-66 | m/z = 525.10 ($C_{34}H_{20}ClNOS$ = 526.05) |
| Sub 1-B-67 | m/z = 385.07 ($C_{24}H_{16}ClNS$ = 385.91) | Sub 1-B-68 | m/z = 435.08 ($C_{28}H_{18}ClNS$ = 435.97) |
| Sub 1-B-69 | m/z = 461.10 ($C_{30}H_{20}ClNS$ = 462.01) | Sub 1-B-70 | m/z = 611.15 ($C_{42}H_{26}ClNS$ = 612.19) |
| Sub 1-B-71 | m/z = 567.09 ($C_{36}H_{22}ClNS_2$ = 568.15) | Sub 1-B-72 | m/z = 541.07 ($C_{34}H_{20}ClNS_2$ = 542.11) |
| Sub 1-B-73 | m/z = 475.08 ($C_{30}H_{18}ClNOS$ = 475.99) | Sub 1-B-74 | m/z = 551.11 ($C_{36}H_{22}ClNOS$ = 552.09) |
| Sub 1-B-75 | m/z = 591.14 ($C_{39}H_{26}ClNOS$ = 592.15) | Sub 1-B-76 | m/z = 435.08 ($C_{28}H_{18}ClNS$ = 435.97) |
| Sub 1-B-77 | m/z = 591.09 ($C_{38}H_{22}ClNS_2$ = 592.17) | Sub 1-B-78 | m/z = 537.13 ($C_{36}H_{24}ClNS$ = 538.11) |
| Sub 1-B-79 | m/z = 379.15 ($C_{24}H_6D_{10}ClNO$ = 379.91) | Sub 1-B-80 | m/z = 459.10 ($C_{30}H_{18}ClNO_2$ = 459.93) |
| Sub 1-B-81 | m/z = 445.12 ($C_{30}H_{20}ClNO$ = 445.95) | Sub 1-B-82 | m/z = 429.02 ($C_{24}H_{16}BrNS$ = 430.36) |
| Sub 1-B-83 | m/z = 443.03 ($C_{25}H_{18}BrNS$ = 444.39) | Sub 1-B-84 | m/z = 479.03 ($C_{28}H_{18}BrNS$ = 480.42) |
| Sub 1-B-85 | m/z = 485.10 ($C_{32}H_{20}ClNS$ = 486.03) | Sub 1-B-86 | m/z = 545.12 ($C_{34}H_{24}ClNO_2S$ = 546.08) |
| Sub 1-B-87 | m/z = 413.04 ($C_{24}H_{16}BrNO$ = 414.30) | Sub 1-B-88 | m/z = 529.10 ($C_{33}H_{24}BrNO$ = 530.47) |
| Sub 1-B-89 | m/z = 589.10 ($C_{38}H_{24}BrNO$ = 590.52) | Sub 1-B-90 | m/z = 385.07 ($C_{24}H_{16}ClNS$ = 385.91) |
| Sub 1-B-91 | m/z = 537.13 ($C_{36}H_{24}ClNS$ = 538.11) | Sub 1-B-92 | m/z = 491.06 ($C_{30}H_{18}ClNS_2$ = 492.05) |
| Sub 1-B-93 | m/z = 567.09 ($C_{36}H_{22}ClNS_2$ = 568.15) | Sub 1-B-94 | m/z = 567.09 ($C_{36}H_{22}ClNS_2$ = 568.15) |
| Sub 1-B-95 | m/z = 551.11 ($C_{36}H_{22}ClNOS$ = 552.09) | Sub 1-B-96 | m/z = 683.15 ($C_{45}H_{30}ClNS_2$ = 684.31) |
| Sub 1-B-97 | m/z = 435.08 ($C_{28}H_{18}ClNS$ = 435.97) | Sub 1-B-98 | m/z = 591.09 ($C_{38}H_{22}ClNS_2$ = 592.17) |
| Sub 1-B-99 | m/z = 748.18 ($C_{49}H_{33}ClN_2S_2$ = 749.39) | Sub 1-B-100 | m/z = 369.09 ($C_{24}H_{16}ClNO$ = 369.85) |
| Sub 1-B-101 | m/z = 419.11 ($C_{28}H_{18}ClNO$ = 419.91) | Sub 1-B-102 | m/z = 475.08 ($C_{30}H_{18}ClNOS$ = 475.99) |
| Sub 1-B-103 | m/z = 625.13 ($C_{42}H_{24}ClNOS$ = 626.17) | Sub 1-B-104 | m/z = 429.02 ($C_{24}H_{16}BrNS$ = 430.36) |
| Sub 1-B-105 | m/z = 479.03 ($C_{28}H_{18}BrNS$ = 480.42) | Sub 1-B-106 | m/z = 505.05 ($C_{30}H_{20}BrNS$ = 506.46) |
| Sub 1-B-107 | m/z = 435.08 ($C_{28}H_{18}ClNS$ = 435.97) | Sub 1-B-108 | m/z = 541.07 ($C_{34}H_{20}ClNS_2$ = 542.11) |
| Sub 1-B-109 | m/z = 489.07 ($C_{30}H_{20}BrNO$ = 490.40) | Sub 1-B-110 | m/z = 565.10 ($C_{36}H_{24}BrNO$ = 566.50) |
| Sub 1-B-111 | m/z = 716.15 ($C_{47}H_{29}BrN_2O$ = 717.67) | Sub 1-B-112 | m/z = 385.07 ($C_{24}H_{16}ClNS$ = 385.91) |
| Sub 1-B-113 | m/z = 511.12 ($C_{34}H_{22}ClNS$ = 512.07) | Sub 1-B-114 | m/z = 557.14 ($C_{35}H_{28}ClNSSi$ = 558.21) |
| Sub 1-B-115 | m/z = 495.14 ($C_{34}H_{22}ClNO$ = 496.01) | Sub 1-B-116 | m/z = 575.11 ($C_{38}H_{22}ClNOS$ = 576.11) |
| Sub 1-B-117 | m/z = 469.12 ($C_{32}H_{20}ClNO$ = 469.97) | Sub 1-B-118 | m/z = 469.12 ($C_{32}H_{20}ClNO$ = 469.97) |
| Sub 1-B-119 | m/z = 635.17 ($C_{44}H_{26}ClNO_2$ = 636.15) | Sub 1-B-120 | m/z = 650.16 ($C_{44}H_{27}ClN_2S$ = 651.22) |
| Sub 1-B-121 | m/z = 585.13 ($C_{40}H_{24}ClNS$ = 586.15) | Sub 1-B-122 | m/z = 673.08 ($C_{42}H_{24}ClNS_3$ = 674.29) |
| Sub 1-B-123 | m/z = 491.06 ($C_{30}H_{18}ClNS_2$ = 492.05) | Sub 1-B-124 | m/z = 461.1 ($C_{30}H_{20}ClNS$ = 462.01) |
| Sub 1-B-125 | m/z = 641.16 ($C_{43}H_{28}ClNOS$ = 642.21) | Sub 1-B-126 | m/z = 445.16 ($C_{31}H_{24}ClN$ = 445.99) |
| Sub 1-B-127 | m/z = 471.18 ($C_{33}H_{26}ClN$ = 472.03) | Sub 1-B-128 | m/z = 395.14 ($C_{27}H_{22}ClN$ = 395.93) |
| Sub 1-B-129 | m/z = 471.18 ($C_{33}H_{26}ClN$ = 472.03) | Sub 1-B-130 | m/z = 395.14 ($C_{27}H_{22}ClN$ = 395.93) |
| Sub 1-B-131 | m/z = 511.21 ($C_{36}H_{30}ClN$ = 512.09) | Sub 1-B-132 | m/z = 423.18 ($C_{29}H_{26}ClN$ = 423.98) |
| Sub 1-B-133 | m/z = 569.19 ($C_{41}H_{28}ClN$ = 570.13) | Sub 1-B-134 | m/z = 595.21 ($C_{43}H_{30}ClN$ = 596.17) |
| Sub 1-B-135 | m/z = 519.18 ($C_{37}H_{26}ClN$ = 520.07) | Sub 1-B-136 | m/z = 567.18 ($C_{41}H_{26}ClN$ = 568.12) |
| Sub 1-B-137 | m/z = 515.14 ($C_{37}H_{22}ClN$ = 516.04) | Sub 1-B-138 | m/z = 517.16 ($C_{37}H_{24}ClN$ = 518.06) |
| Sub 1-B-139 | m/z = 607.17 ($C_{43}H_{26}ClNO$ = 608.14) | Sub 1-B-140 | m/z = 517.16 ($C_{27}H_{24}ClN$ = 518.06) |
| Sub 1-B-141 | m/z = 607.17 ($C_{43}H_{26}ClNO$ = 608.14) | Sub 1-B-142 | m/z = 395.14 ($C_{27}H_{22}ClN$ = 395.93) |
| Sub 1-B-143 | m/z = 485.15 ($C_{33}H_{24}ClNO$ = 486.01) | Sub 1-B-148 | m/z = 507.18 ($C_{36}H_{26}ClN$ = 508.06) |
| Sub 1-B-149 | m/z = 457.16 ($C_{32}H_{24}ClN$ = 458) | Sub 1-B-150 | m/z = 519.18 ($C_{37}H_{26}ClN$ = 520.07) |
| Sub 1-B-161 | m/z = 399.06 ($C_{24}H_{18}BrN$ = 400.32) | Sub 1-B-162 | m/z = 449.08 ($C_{28}H_{20}BrN$ = 450.38) |
| Sub 1-B-163 | m/z = 499.09 ($C_{32}H_{22}BrN$ = 500.44) | Sub 1-B-164 | m/z = 475.09 ($C_{30}H_{22}BrN$ = 476.42) |
| Sub 1-B-165 | m/z = 480.12 ($C_{30}H_{17}D_5BrN$ = 481.45) | Sub 1-B-166 | m/z = 525.11 ($C_{34}H_{24}BrN$ = 526.48) |
| Sub 1-B-167 | m/z = 575.12 ($C_{38}H_{26}BrN$ = 576.54) | Sub 1-B-169 | m/z = 551.12 ($C_{36}H_{26}BrN$ = 552.52) |
| Sub 1-B-171 | m/z = 616.15 ($C_{40}H_{29}BrN_2$ = 617.59) | Sub 1-B-178 | m/z = 627.16 ($C_{42}H_{30}BrN$ = 628.61) |
| Sub 1-B-182 | m/z = 489.07 ($C_{30}H_{20}BrNO$ = 490.4) | Sub 1-B-184 | m/z = 555.07 ($C_{34}H_{22}BrNS$ = 556.52) |
| Sub 1-B-185 | m/z = 657.11 ($C_{42}H_{28}BrNS$ = 658.66) | Sub 1-B-186 | m/z = 591.16 ($C_{39}H_{30}BrN$ = 592.58) |
| Sub 1-B-187 | m/z = 631.19 ($C_{42}H_{34}BrN$ = 632.65) | Sub 1-B-188 | m/z = 505.05 ($C_{30}H_{20}BrNS$ = 506.46) |
| Sub 1-B-190 | m/z = 581.08 ($C_{36}H_{24}BrNS$ = 582.56) | Sub 1-B-193 | m/z = 611.04 ($C_{36}H_{22}BrNS_2$ = 612.6) |

TABLE 2-continued

| Compound | FD-MS | Compound | FD-MS |
|---|---|---|---|
| Sub 1-B-194 | m/z = 631.1 ($C_{40}H_{26}BrNS$ = 632.62) | Sub 1-B-204 | m/z = 539.09 ($C_{34}H_{22}BrNO$ = 540.46) |
| Sub 1-B-206 | m/z = 615.12 ($C_{40}H_{26}BrNO$ = 616.56) | Sub 1-B-209 | m/z = 641.14 ($C_{42}H_{28}BrNO$ = 642.6) |
| Sub 1-B-211 | m/z = 565.14 ($C_{37}H_{28}BrN$ = 566.54) | Sub 1-B-212 | m/z = 591.16 ($C_{39}H_{30}BrN$ = 592.58) |

2. Synthesis Example of Sub 2

Sub 2 of Reaction Schemes 1 and 2 may be synthesized by the reaction route of Reaction Scheme 6 below, but is not limited thereto.

<Reaction Scheme 6>

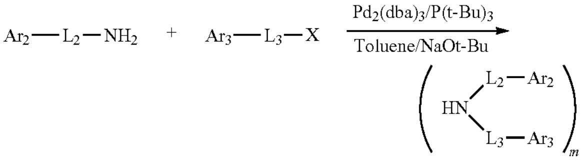

Sub 2

Synthesis of Sub 2-1

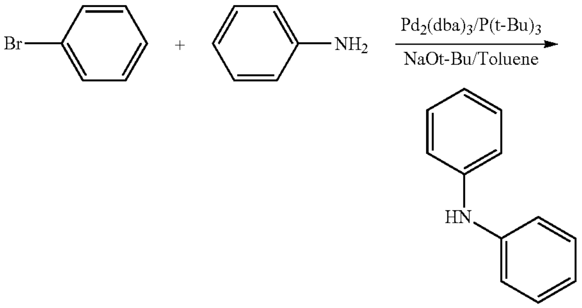

After bromobenzene (37.1 g, 236.2 mmol) was dissolved in toluene (2200 mL), aniline (20 g, 214.8 mmol), $Pd_2(dba)_3$ (9.83 g, 10.7 mmol), $P(t-Bu)_3$ (4.34 g, 21.5 mmol) and NaOt-Bu (62 g, 644.3 mmol) were added sequentially the solution and the mixture was stirred at 100° C. When the reaction was completed, the reaction product was extracted with ether and water. Then, an organic layer was dried over $MgSO_4$ and concentrated. Then, the concentrate was separated by a silica gel column and recrystallized to obtain 28 g (yield: 77%) of the product.

Synthesis of Sub 2-80

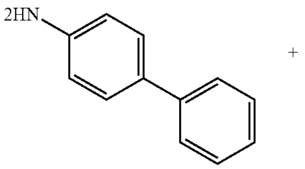

-continued

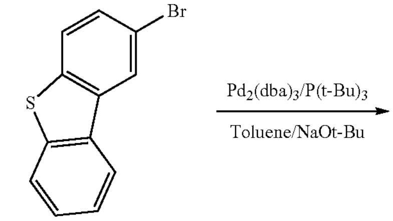

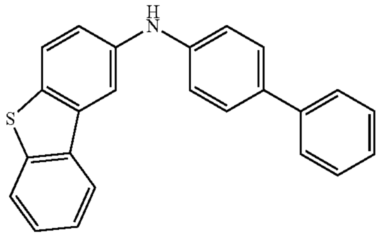

After [1,1'-biphenyl]-4-amine (15 g, 88.64 mmol) was dissolved in toluene (886 mL), 2-bromodibenzo[b,d]thiophene (23.32 g, 88.64 mmol), $Pd_2(dba)_3$ (2.43 g, 2.66 mmol), $P(t-Bu)_3$ (17.93 g, 88.64 mmol) and NaOt-Bu (17.04 g, 177.27 mmol) were added to the solution, and then the synthesis was carried out in the same manner as in the synthesis method of Sub 2-1 to obtain 24.61 g (yield: 79%) of the product.

Synthesis of Sub 2-134

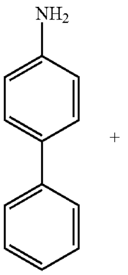

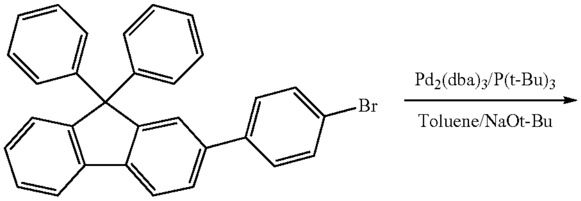

-continued

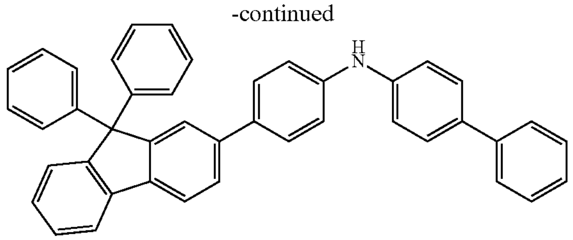

After [1,1'-biphenyl]-4-amine (15 g, 88.6 mmol) was dissolved in toluene (931 mL), 2-(4-bromophenyl)-9,9-diphenyl-9H-fluorene (46.2 g, 97.5 mmol), $Pd_2(dba)_3$ (4.06 g, 4.43 mmol), $P(t\text{-}Bu)_3$ (1.8 g, 8.86 mmol) and NaOt-Bu (28.1 g, 292.5 mmol) were added to the solution, and then the synthesis was carried out in the same manner as in the synthesis method of Sub 2-1 to obtain 34.9 g (yield: 70%) of the product.

Synthesis of Sub 2-222

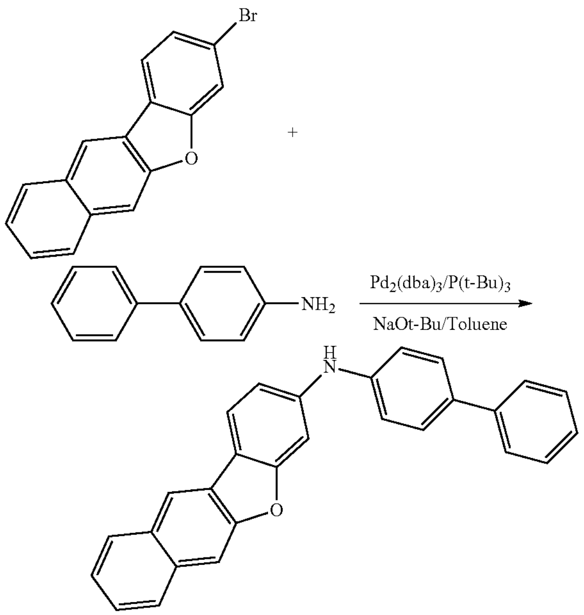

After 3-bromonaphtho[2,3-b]benzofuran (15 g, 50.48 mmol) was dissolved in toluene (505 mL), [1,1'-biphenyl]-4-amine (8.54 g, 50.48 mmol), $Pd_2(dba)_3$ (1.39 g, 1.51 mmol), $P(t\text{-}Bu)_3$ (10.21 g, 50.48 mmol) and NaOt-Bu (9.70 g, 100.96 mmol) were added to the solution, and then the synthesis was carried out in the same manner as in the synthesis method of Sub 2-1 to obtain 13.82 g (yield: 71%) of the product.

Compounds belong to Sub 2 are as follows, but are not limited thereto, and FD-MS values of the compounds are shown in Table 3 below.

Sub 2-1

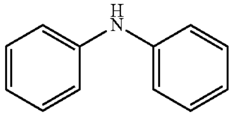

-continued

Sub 2-2

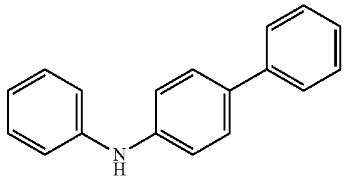

Sub 2-3

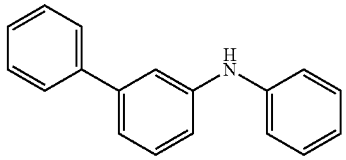

Sub 2-4

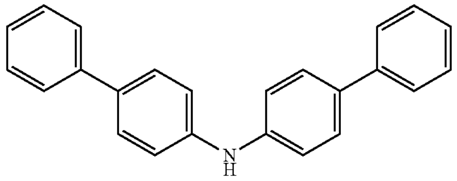

Sub 2-5

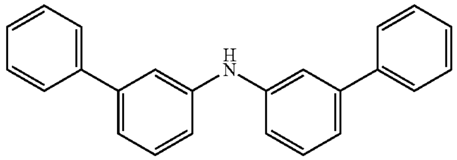

Sub 2-6

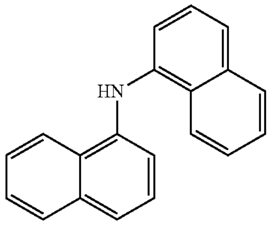

Sub 2-7

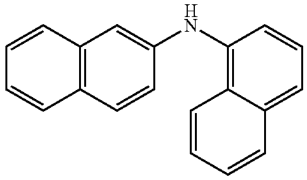

Sub 2-8

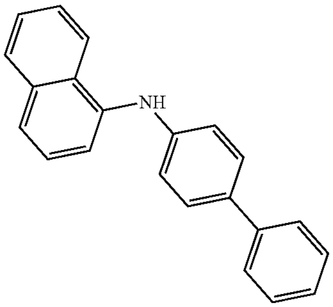

-continued
Sub 2-9
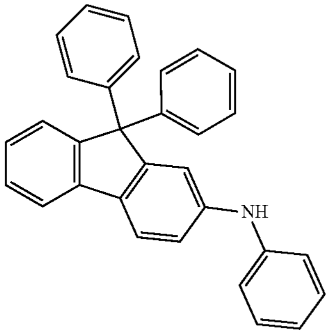
Sub 2-10
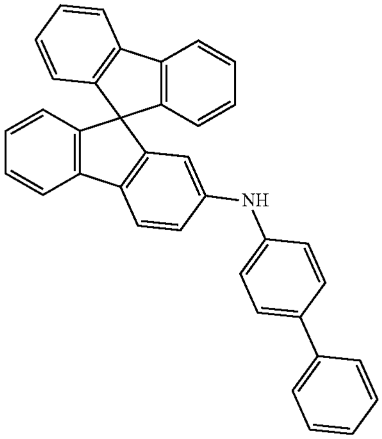
Sub 2-11
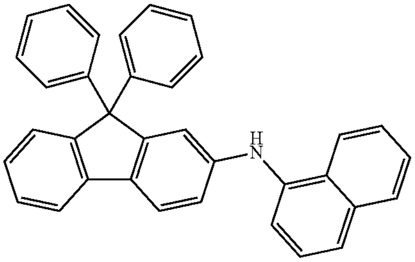
Sub 2-12
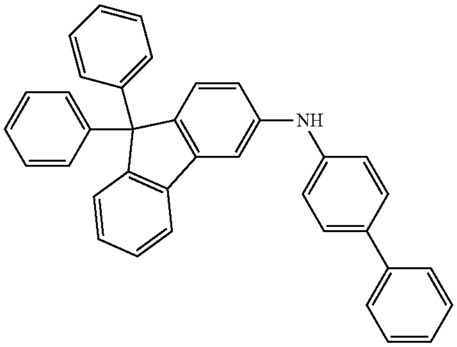
-continued
Sub 2-13
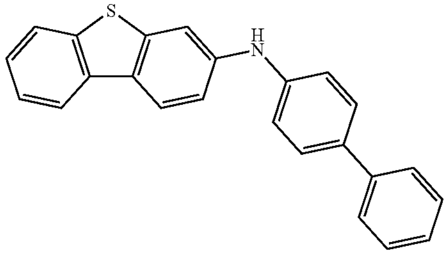
Sub 2-14
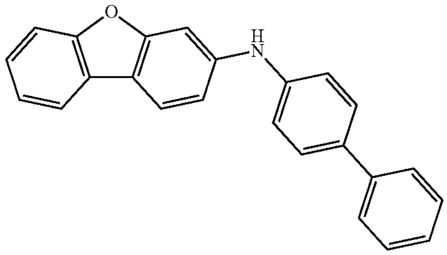
Sub 2-15
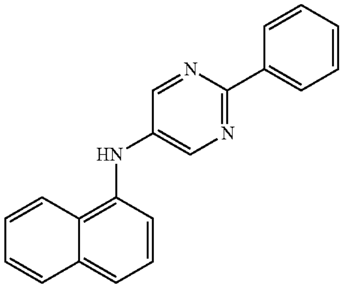
Sub 2-16
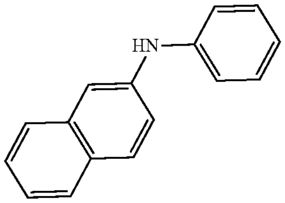
Sub 2-17
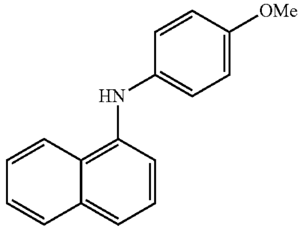
Sub 2-18
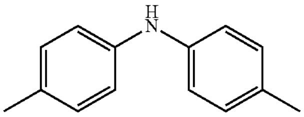
Sub 2-19
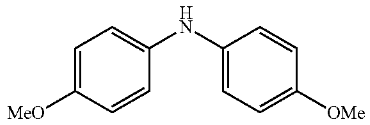

-continued
Sub 2-20
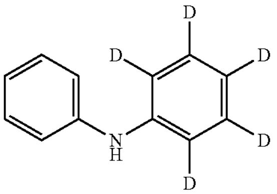
Sub 2-21
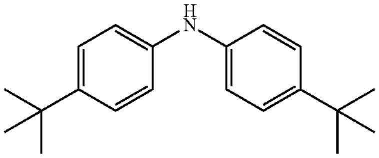
Sub 2-22
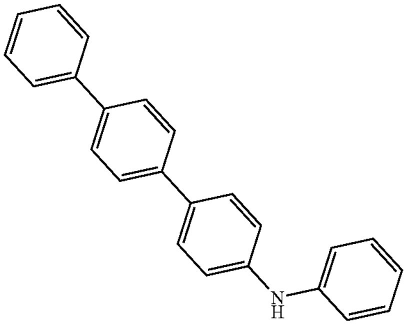
Sub 2-23
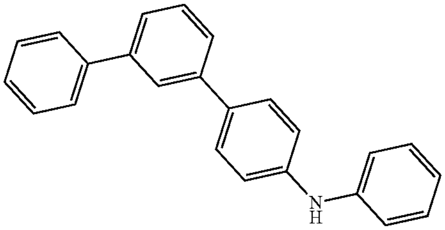
Sub 2-24
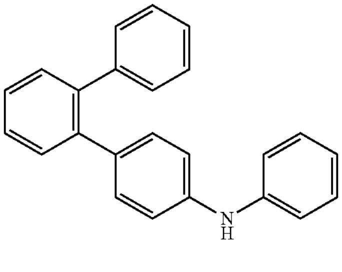
Sub 2-25
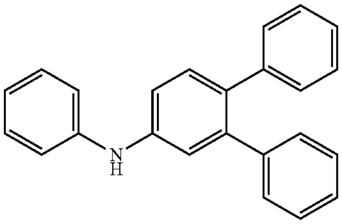
-continued
Sub 2-26
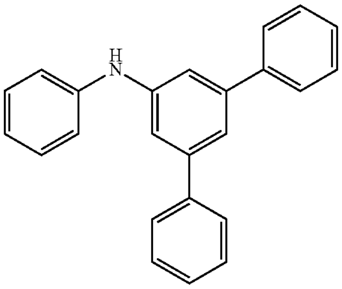
Sub 2-27
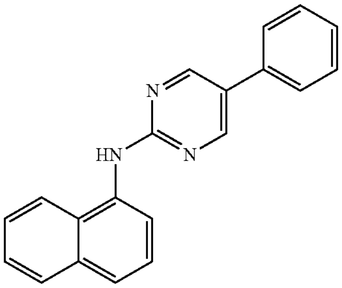
Sub 2-28
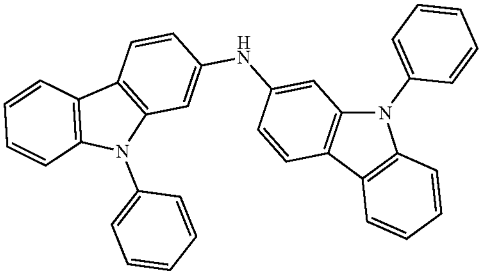
Sub 2-29
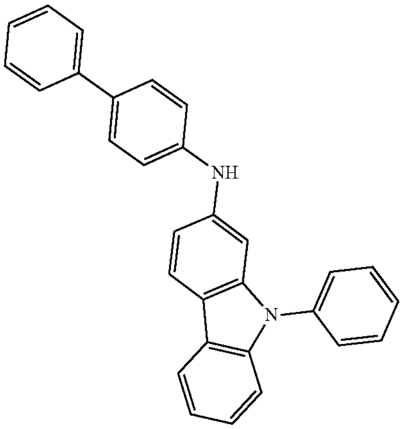

-continued
Sub 2-30
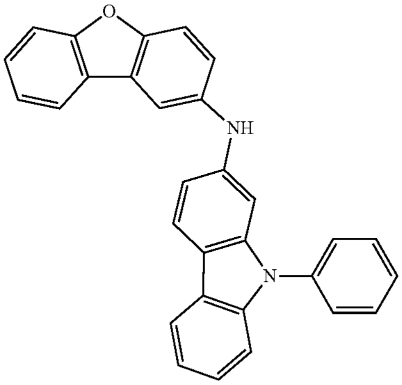
Sub 2-31
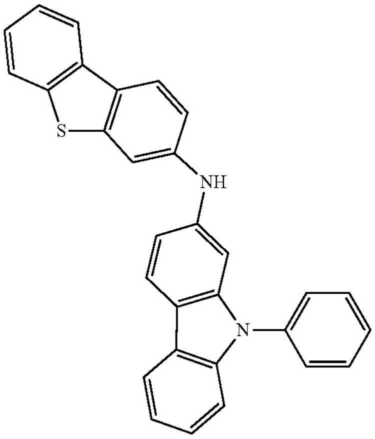
Sub 2-32
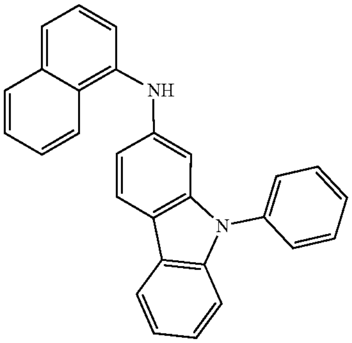
Sub 2-33
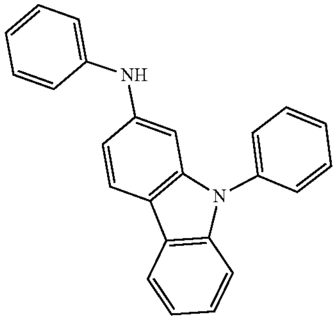
-continued
Sub 2-34
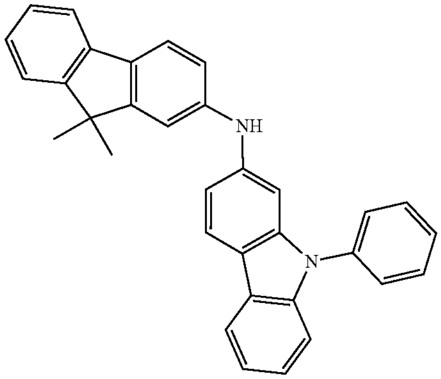
Sub 2-35
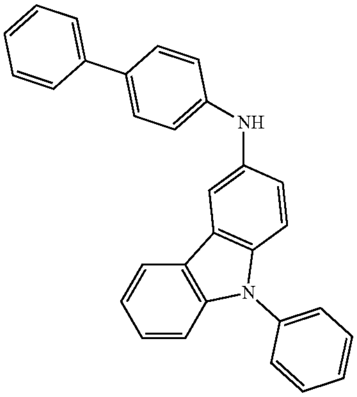
Sub 2-36
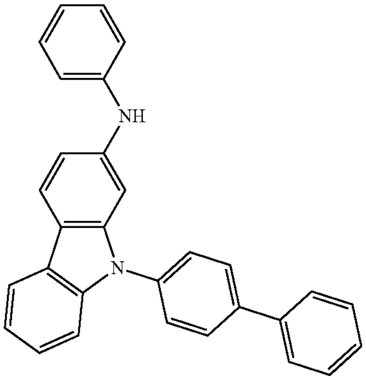

-continued
Sub 2-37
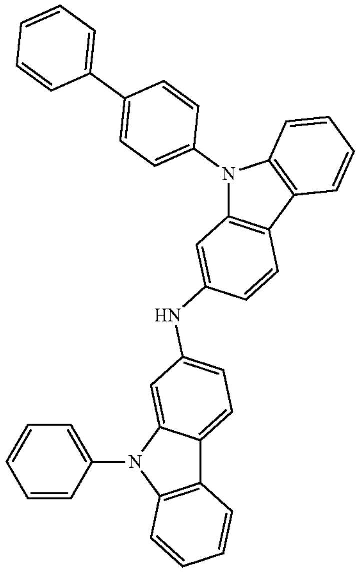
Sub 2-38
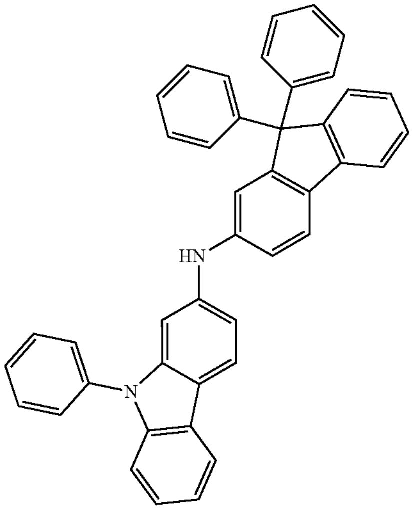
Sub 2-39
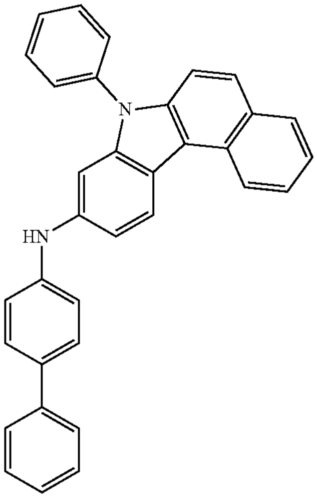
-continued
Sub 2-40
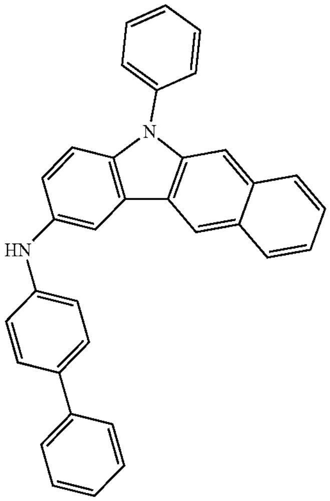
Sub 2-41
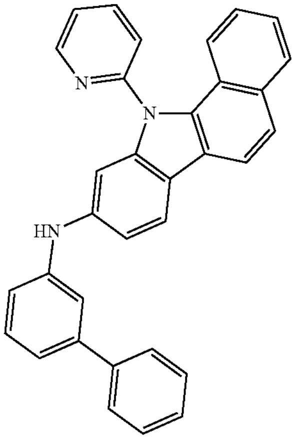
Sub 2-42
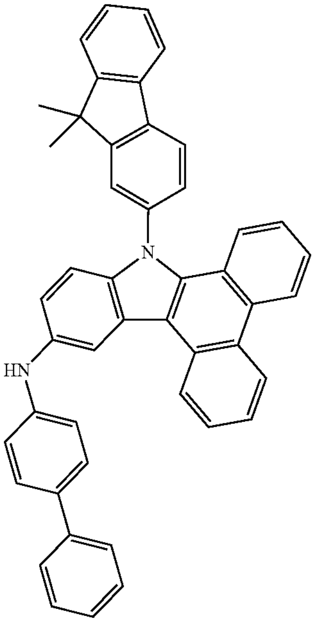

-continued
Sub 2-43
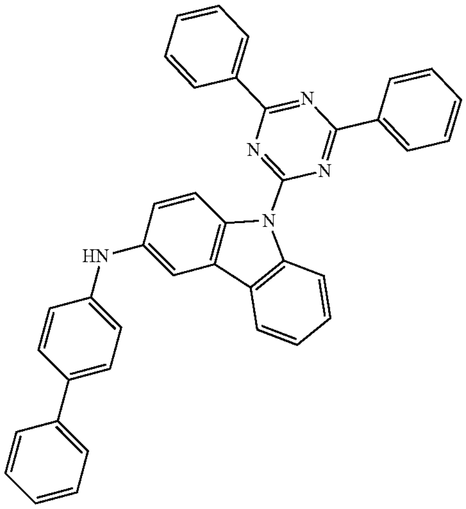
Sub 2-44
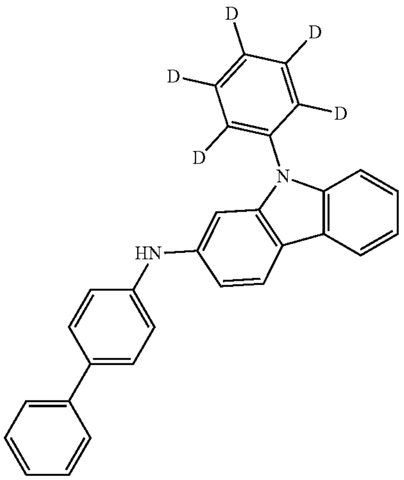
Sub 2-45
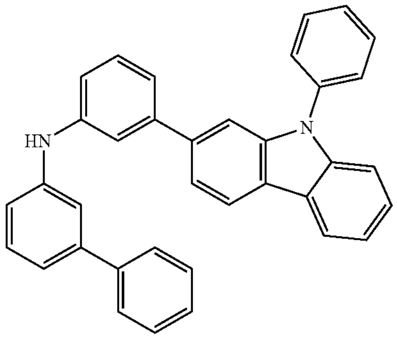
-continued
Sub 2-46
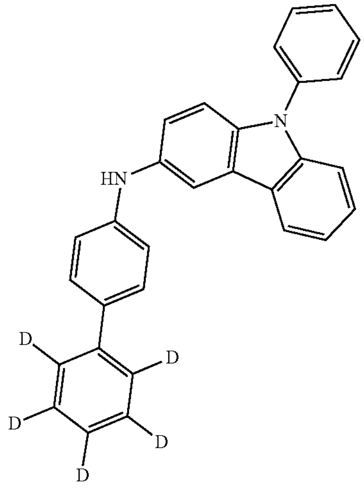
Sub 2-47
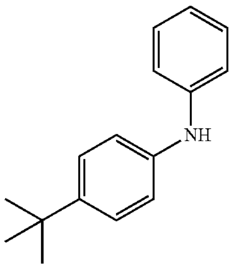
Sub 2-48
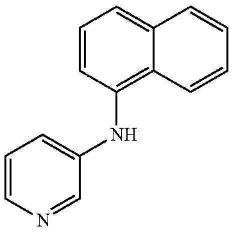
Sub 2-49
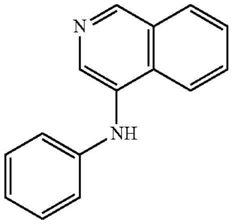
Sub 2-50
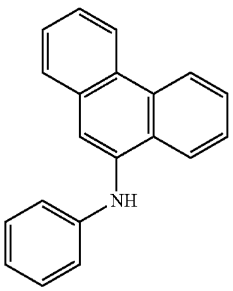

-continued
Sub 2-51
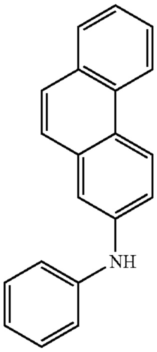
Sub 2-52
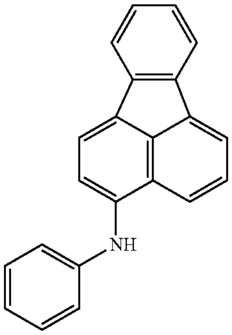
Sub 2-53
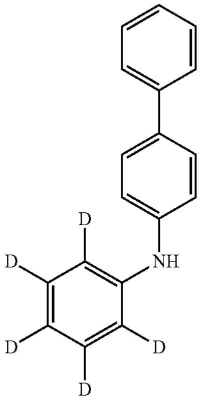
Sub 2-54
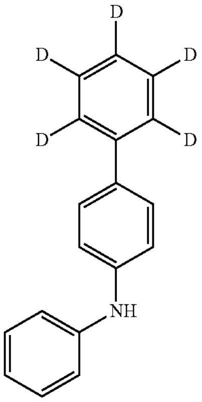
-continued
Sub 2-55
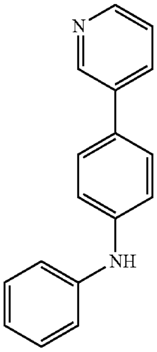
Sub 2-56
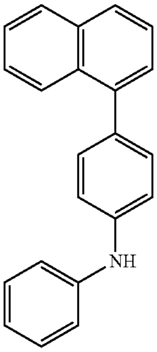
Sub 2-57
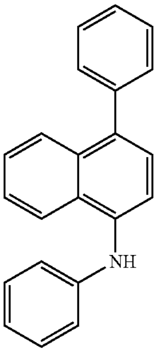
Sub 2-58
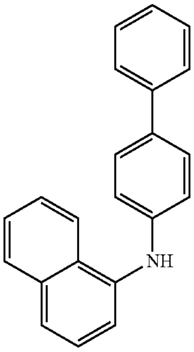

-continued
Sub 2-59
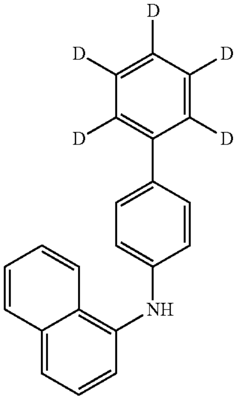
Sub 2-60
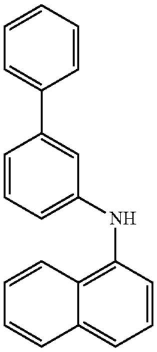
Sub 2-61
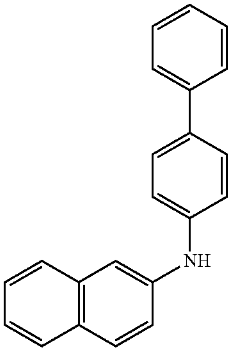
Sub 2-62
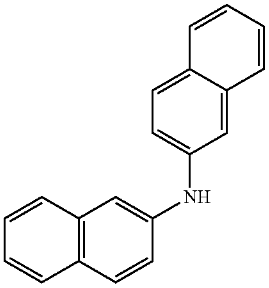
-continued
Sub 2-63
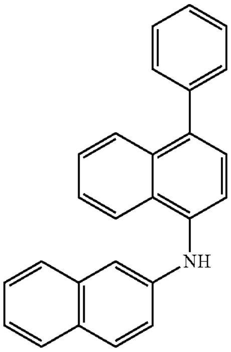
Sub 2-64
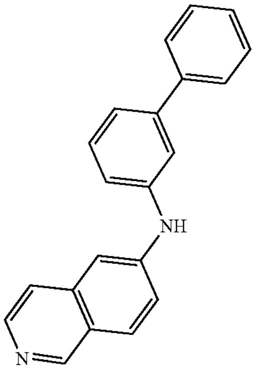
Sub 2-65
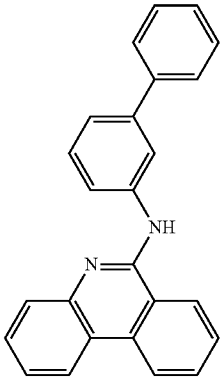
Sub 2-66
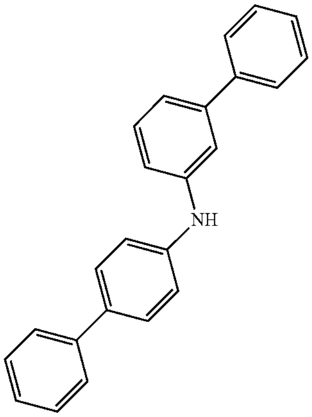

-continued
Sub 2-67
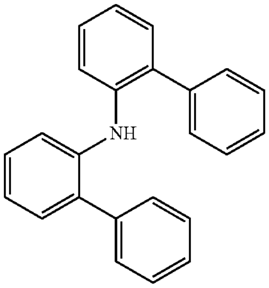
Sub 2-68
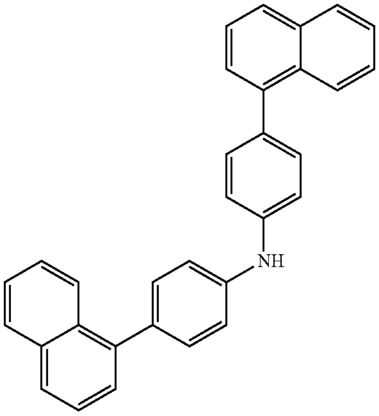
Sub 2-69
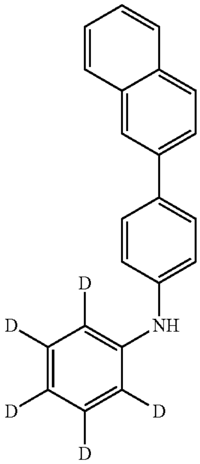
Sub 2-70
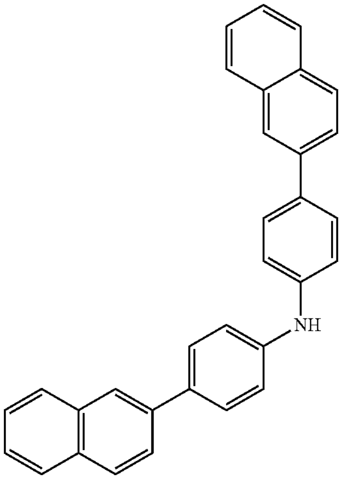
-continued
Sub 2-71
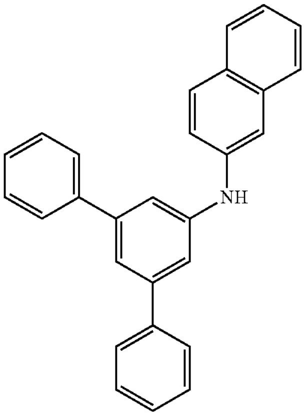
Sub 2-72
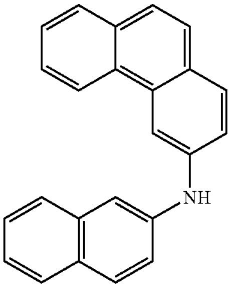
Sub 2-73
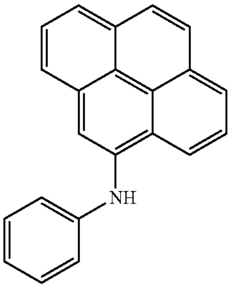
Sub 2-74
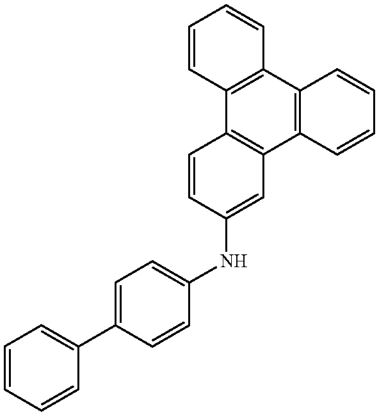

-continued
Sub 2-75
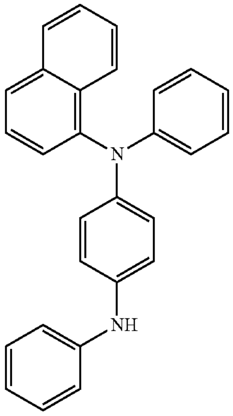
Sub 2-76
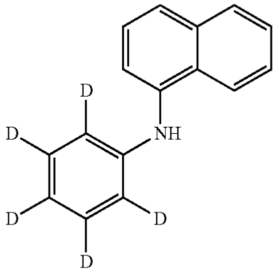
Sub 2-77
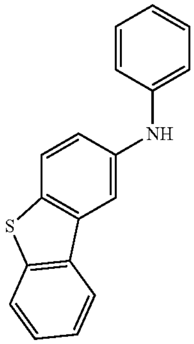
Sub 2-78
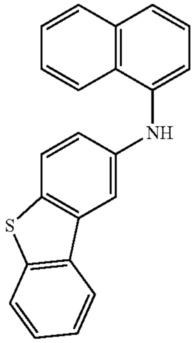
-continued
Sub 2-79
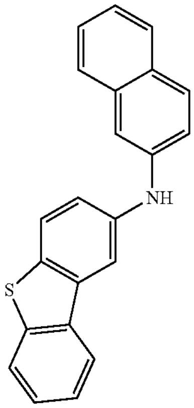
Sub 2-80
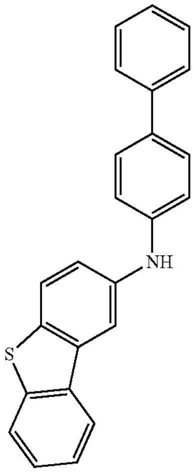
Sub 2-81
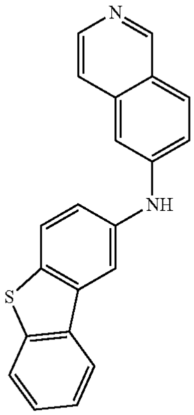

-continued
Sub 2-82
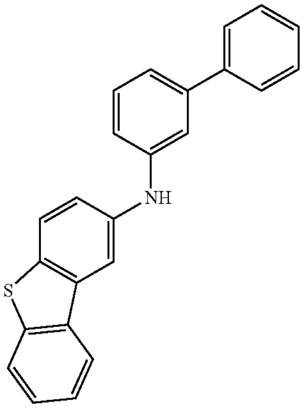
Sub 2-83
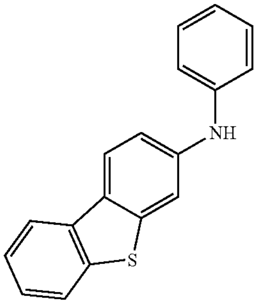
Sub 2-84
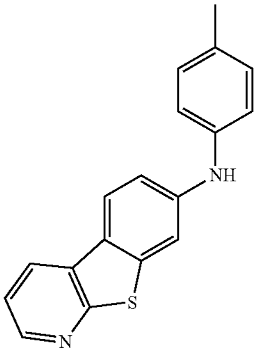
Sub 2-85
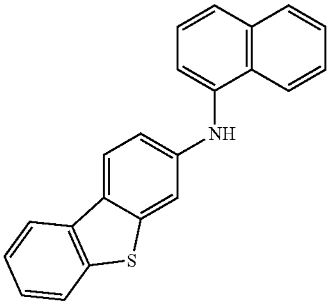
-continued
Sub 2-86
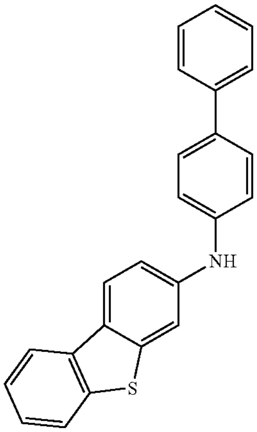
Sub 2-87
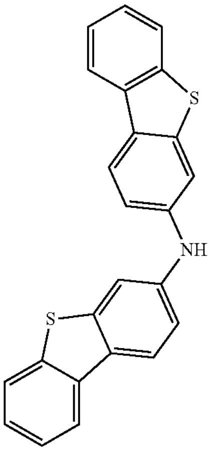
Sub 2-88
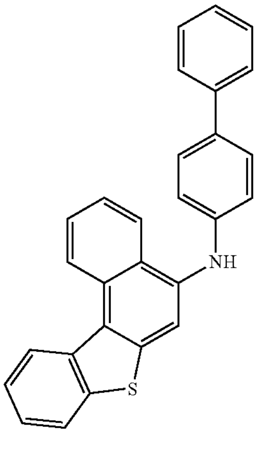
Sub 2-89
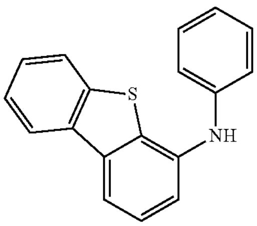

-continued
Sub 2-90
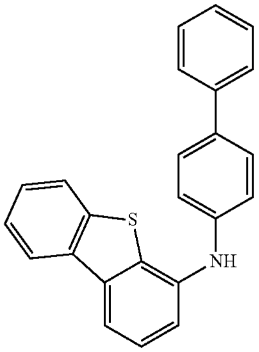
Sub 2-91
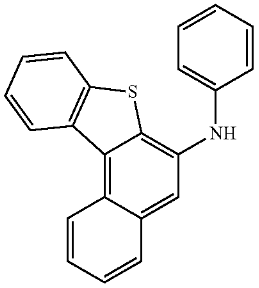
Sub 2-92
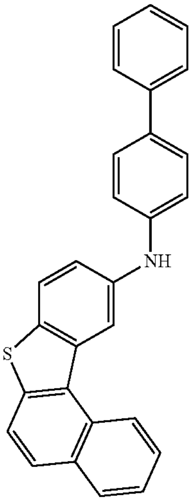
Sub 2-93
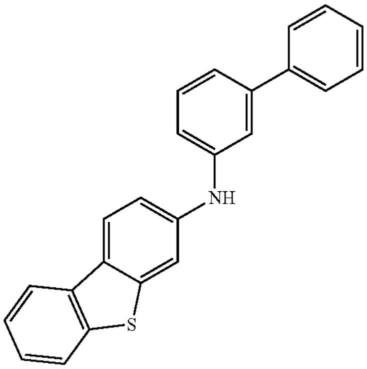
-continued
Sub 2-94
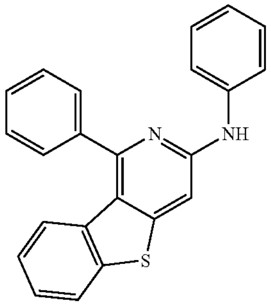
Sub 2-95
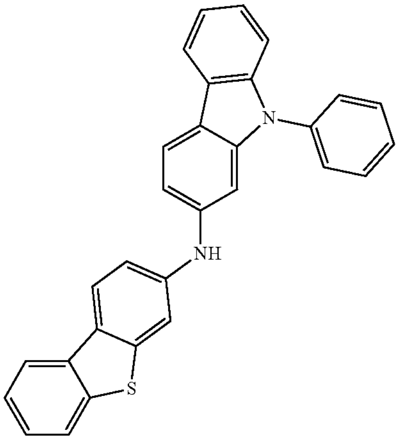
Sub 2-96
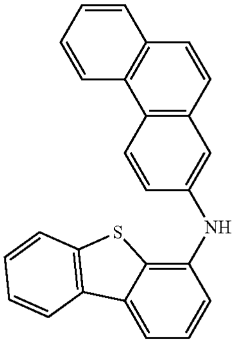
Sub 2-97
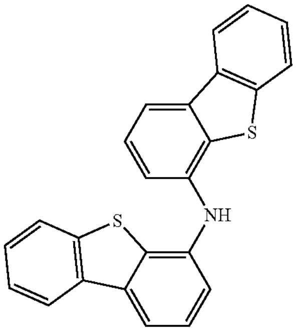

-continued
Sub 2-98
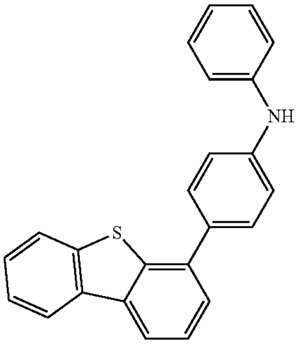
Sub 2-99
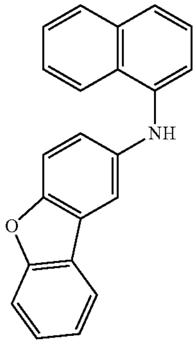
Sub 2-100
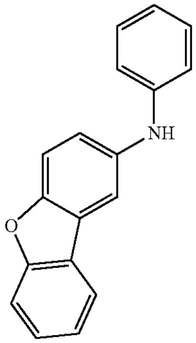
Sub 2-101
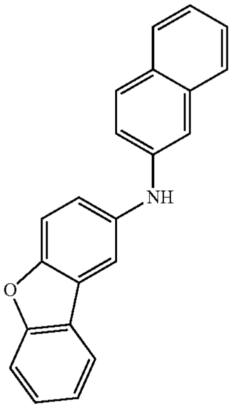
-continued
Sub 2-102
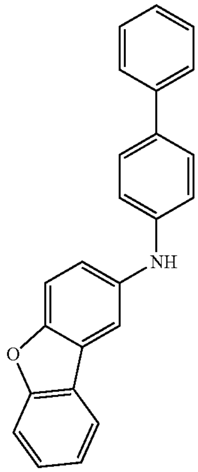
Sub 2-103
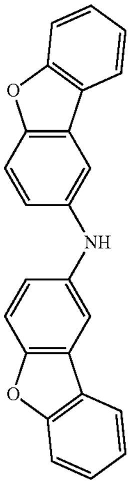
Sub 2-104
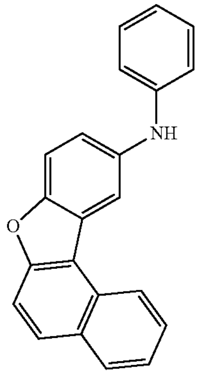

-continued
Sub 2-105
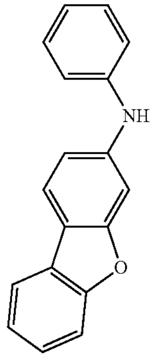
Sub 2-106
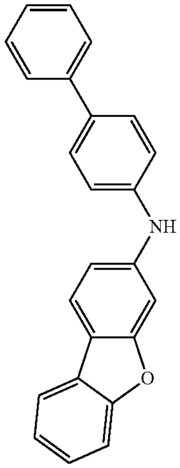
Sub 2-107
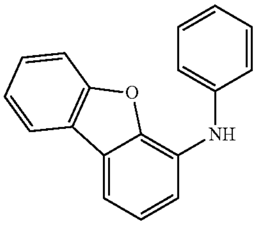
Sub 2-108
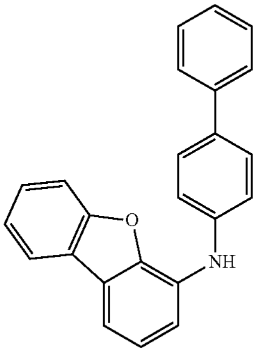
-continued
Sub 2-109
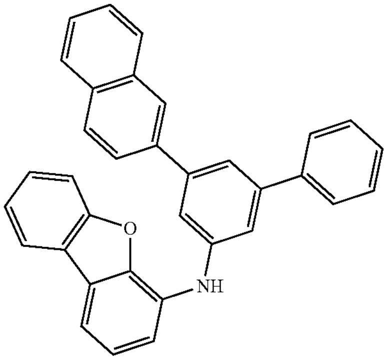
Sub 2-110
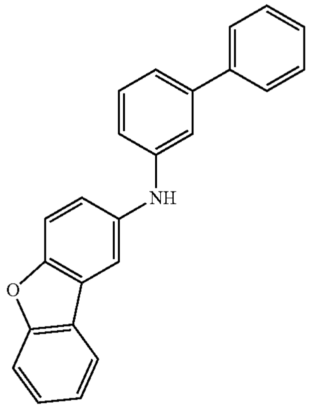
Sub 2-111
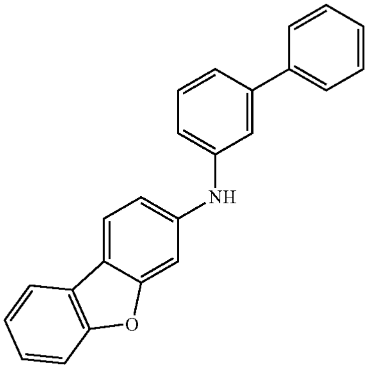
Sub 2-112
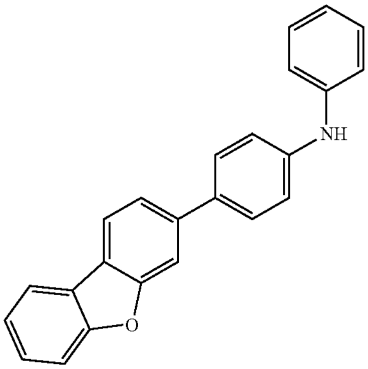

-continued
Sub 2-113
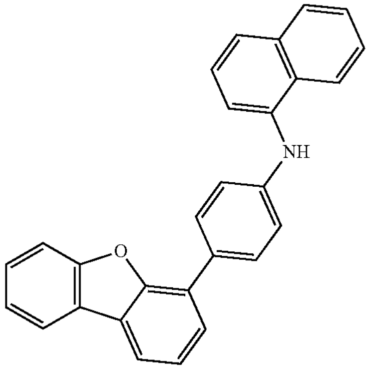
Sub 2-114
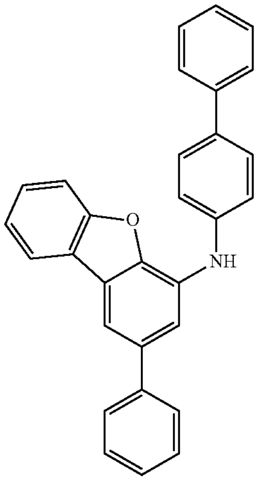
Sub 2-115
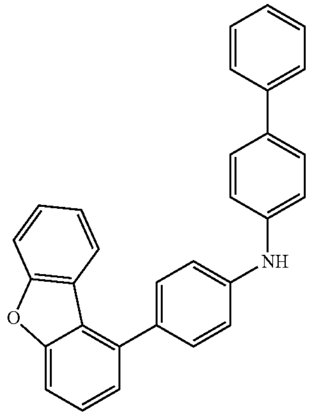
Sub 2-116
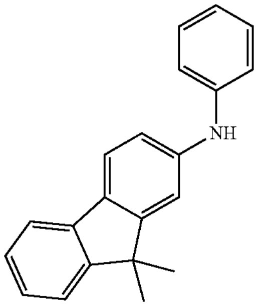
-continued
Sub 2-117
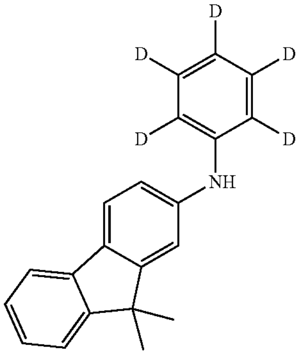
Sub 2-118
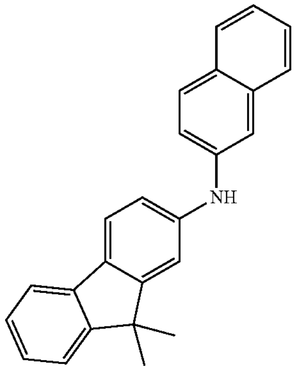
Sub 2-119
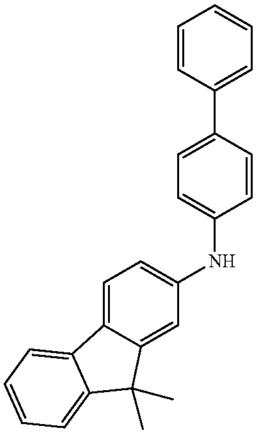
Sub 2-120
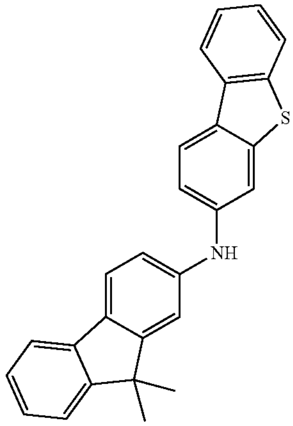

-continued
Sub 2-121
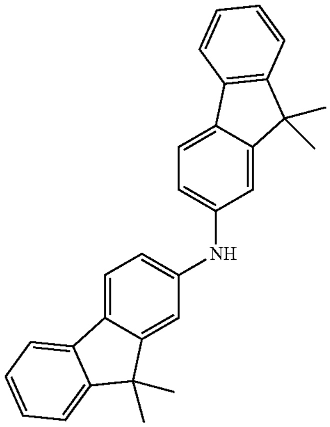
Sub 2-122
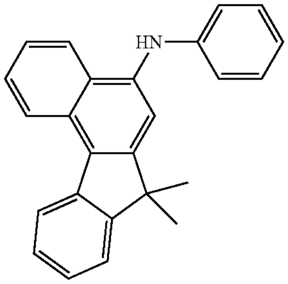
Sub 2-123
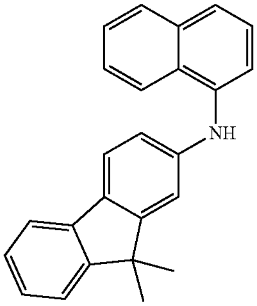
Sub 2-124
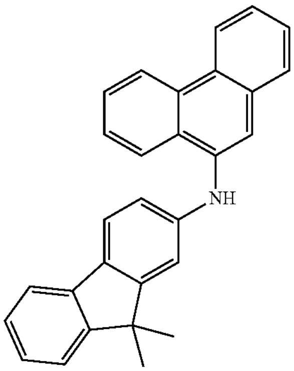
-continued
Sub 2-125
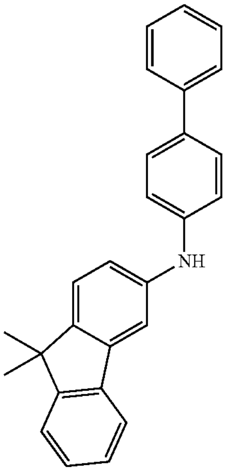
Sub 2-126
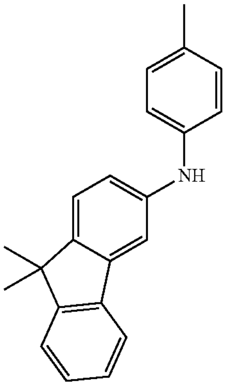
Sub 2-127
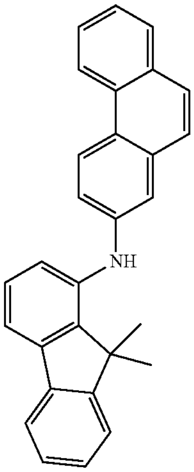

-continued
Sub 2-128
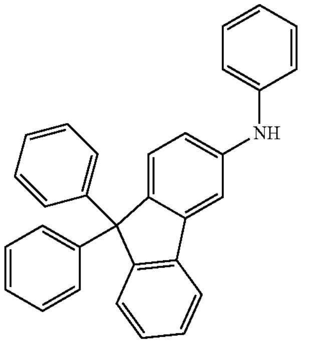
Sub 2-129
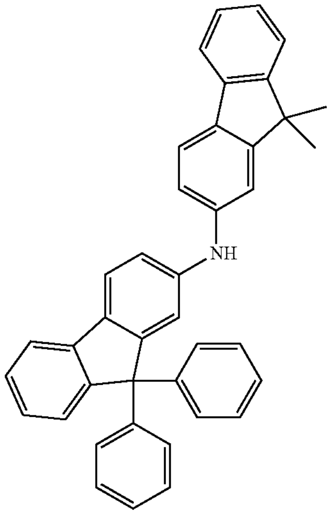
Sub 2-130
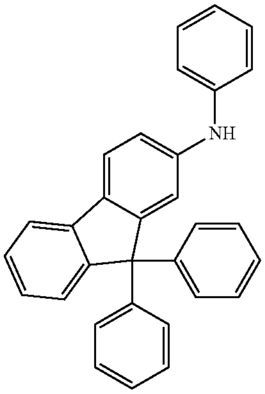
-continued
Sub 2-131
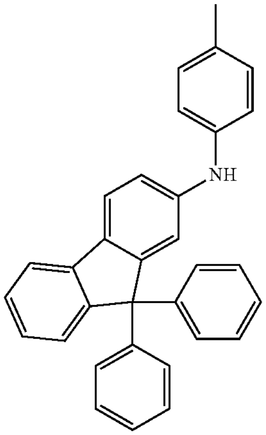
Sub 2-132
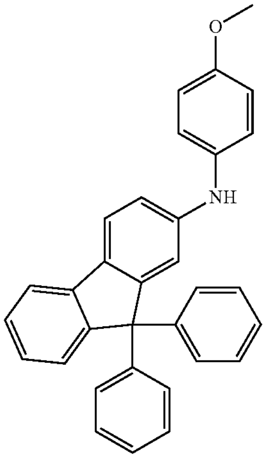
Sub 2-133
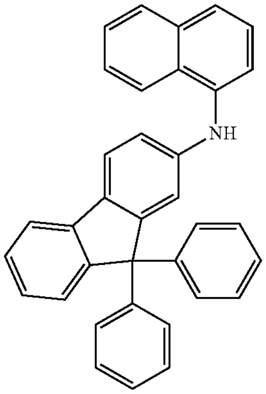

-continued
Sub 2-134
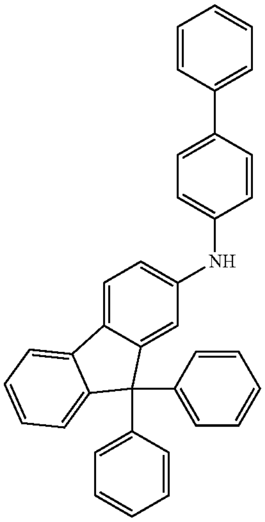
Sub 2-135
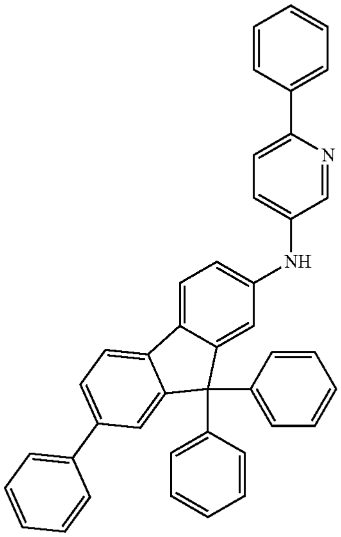
Sub 2-136
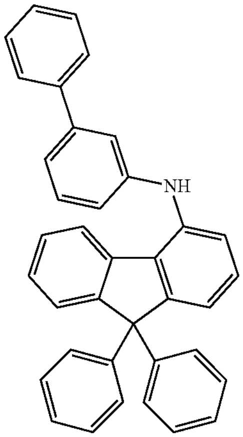
-continued
Sub 2-137
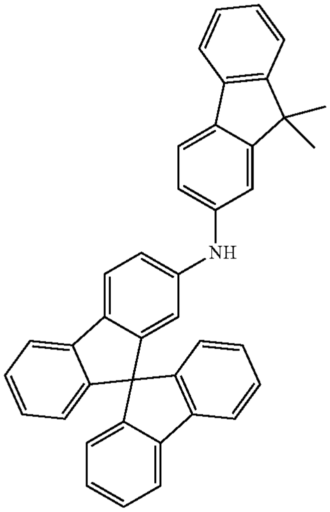
Sub 2-138
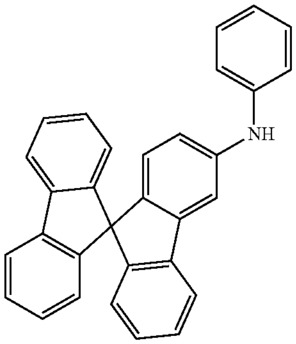
Sub 2-139
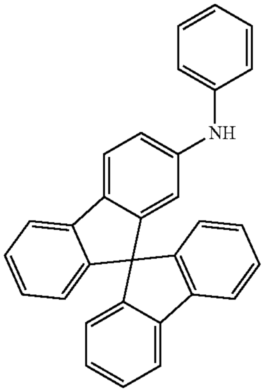

-continued
Sub 2-140
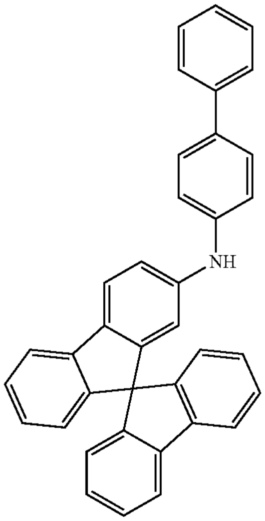
Sub 2-141
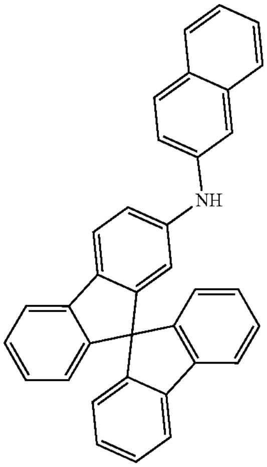
Sub 2-142
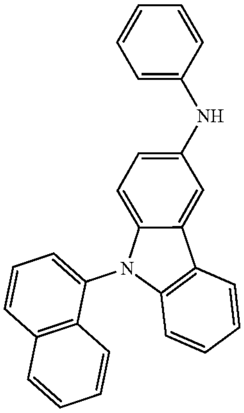
-continued
Sub 2-143
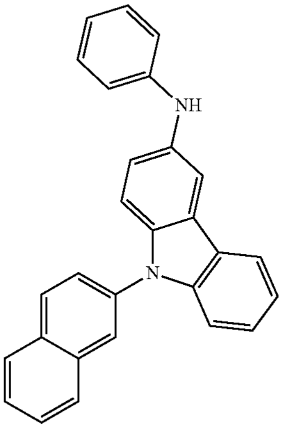
Sub 2-144
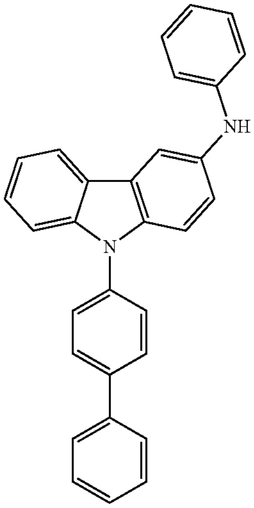
Sub 2-145
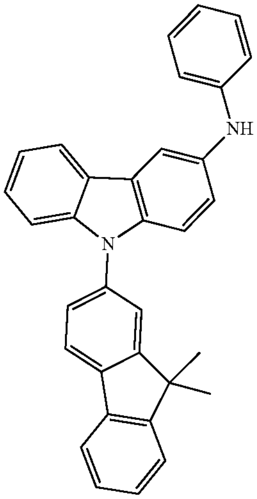

-continued
Sub 2-146
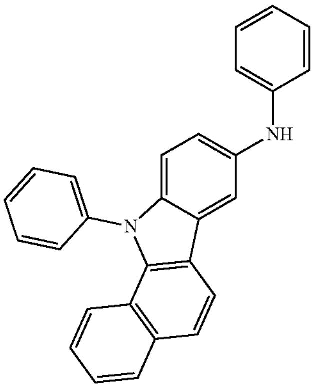
Sub 2-147
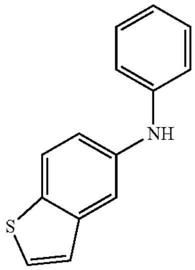
Sub 2-148
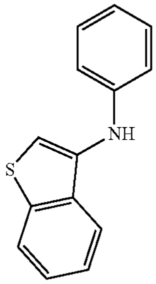
Sub 2-149
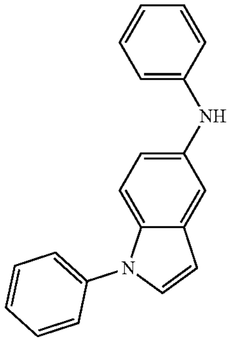
Sub 2-150
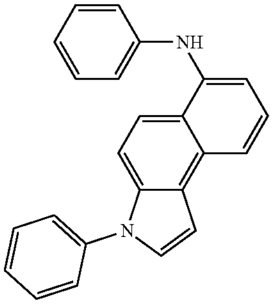
-continued
Sub 2-151
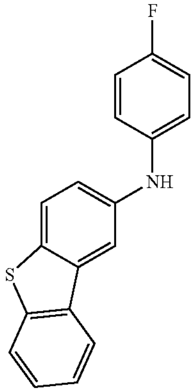
Sub 2-152
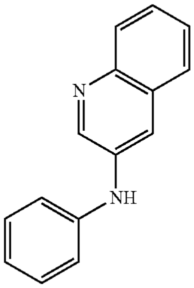
Sub 2-153
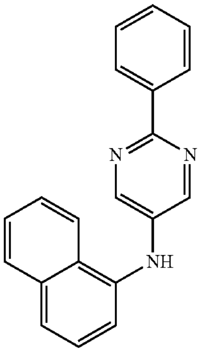
Sub 2-154
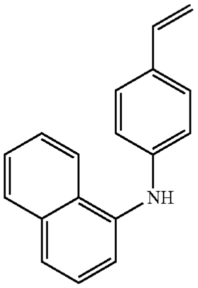

-continued
Sub 2-155
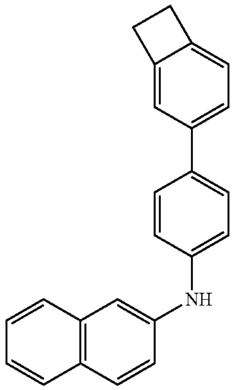
Sub 2-156
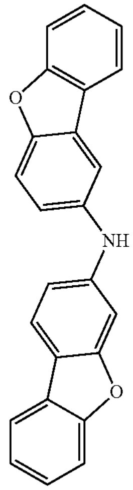
Sub 2-157
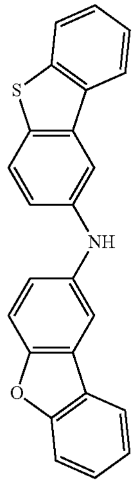
-continued
Sub 2-158
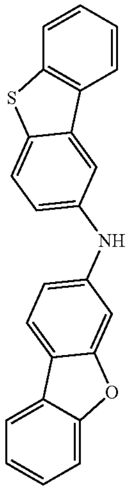
Sub 2-159
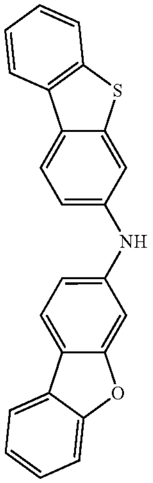
Sub 2-160
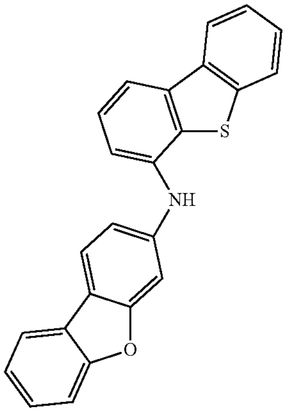

-continued
Sub 2-161
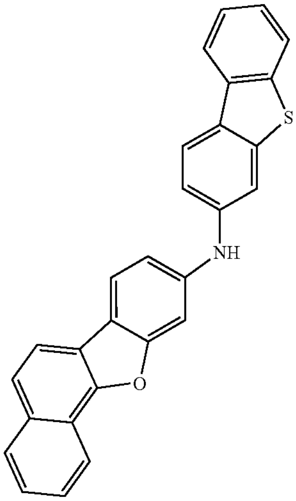
Sub 2-162
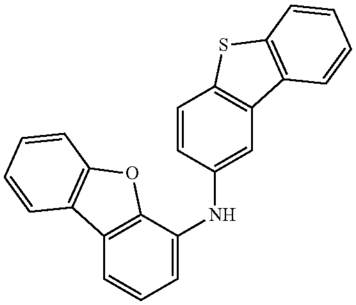
Sub 2-163
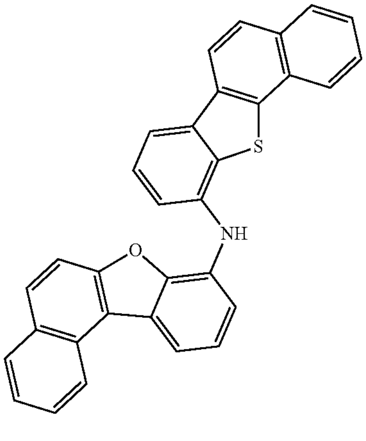
Sub 2-164
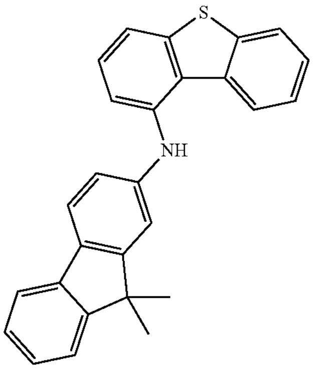
-continued
Sub 2-165
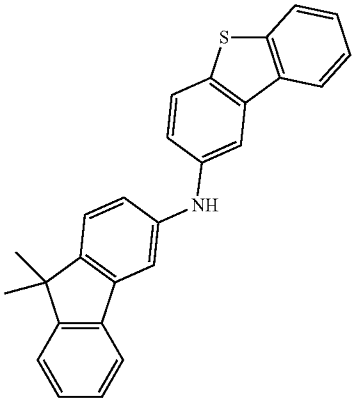
Sub 2-166
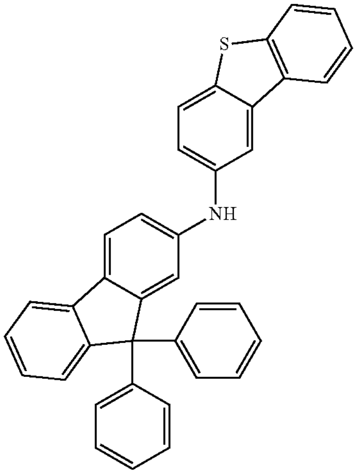
Sub 2-167
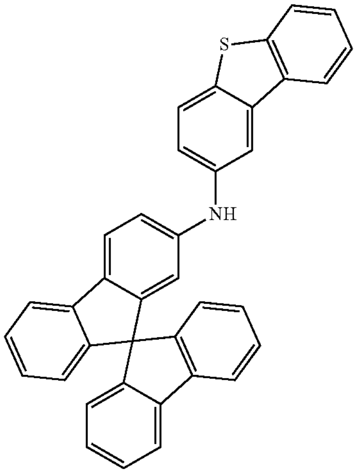

-continued
Sub 2-168
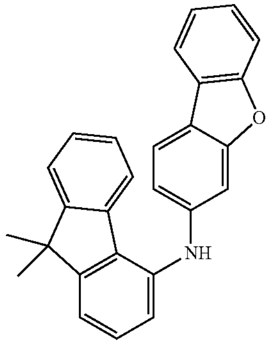
Sub 2-169
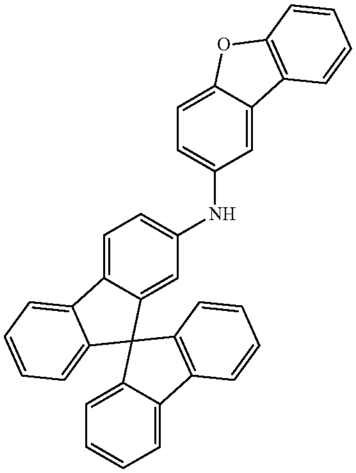
Sub 2-170
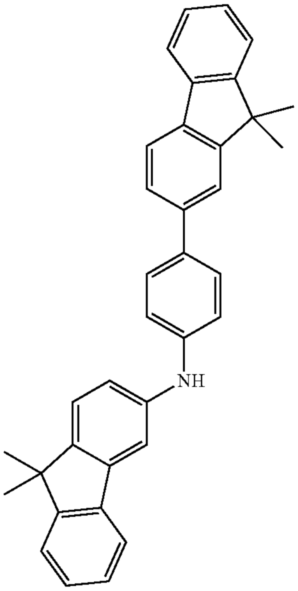
-continued
Sub 2-171
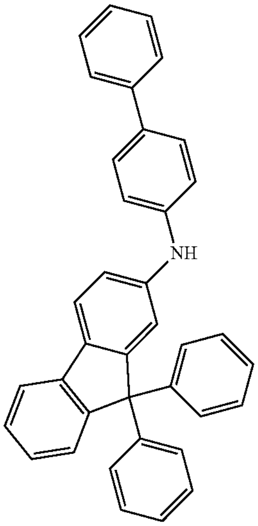
Sub 2-172
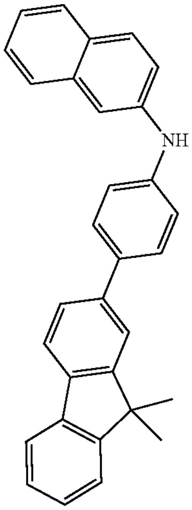
Sub 2-173
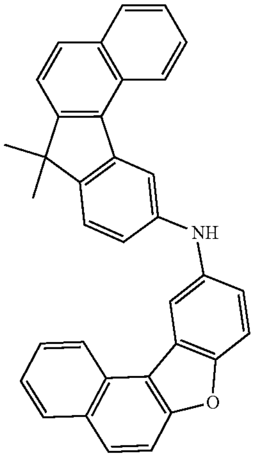

-continued
Sub 2-174
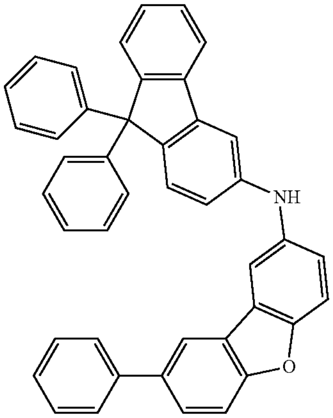
Sub 2-175
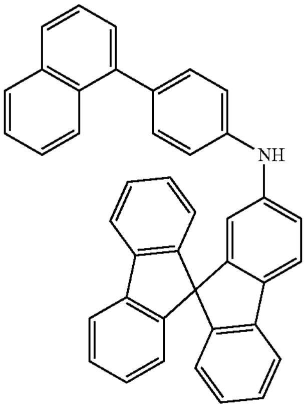
Sub 2-176
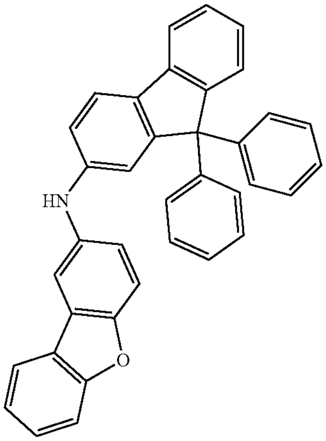
-continued
Sub 2-177
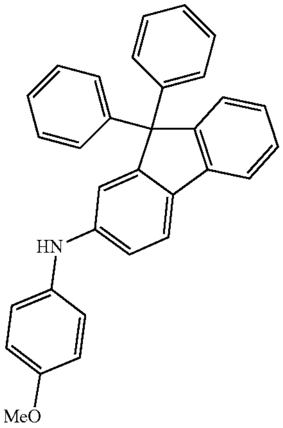
Sub 2-178
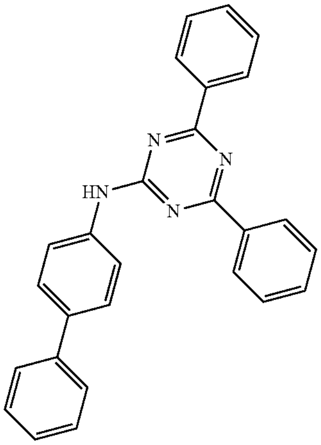
Sub 2-179
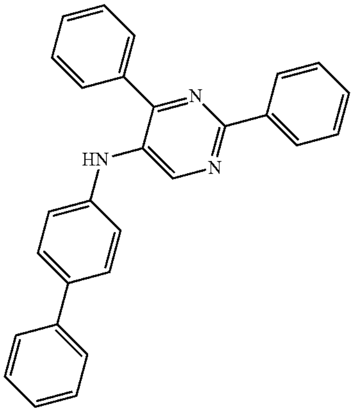
Sub 2-180
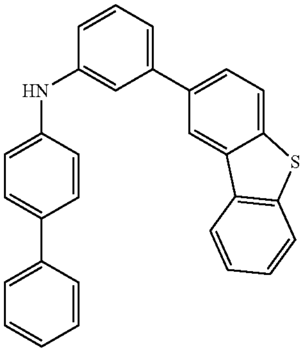

-continued
Sub 2-181
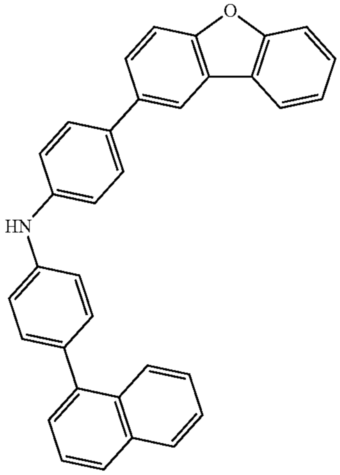
Sub 2-182
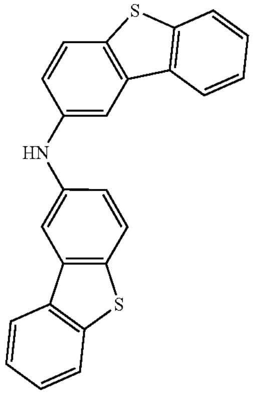
Sub 2-183
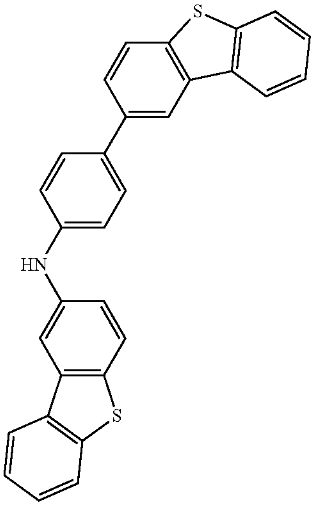
-continued
Sub 2-184
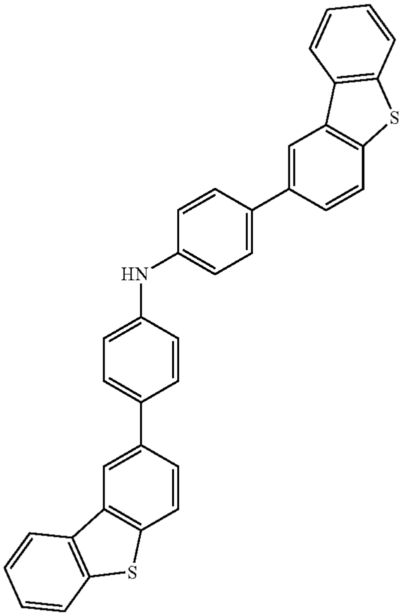
Sub 2-185
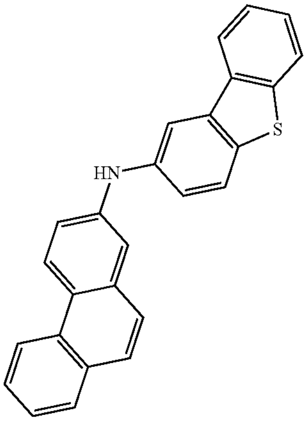
Sub 2-186
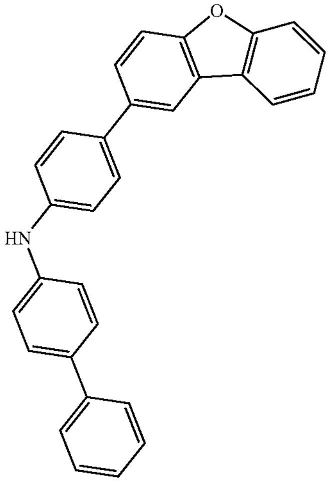

-continued
Sub 2-187
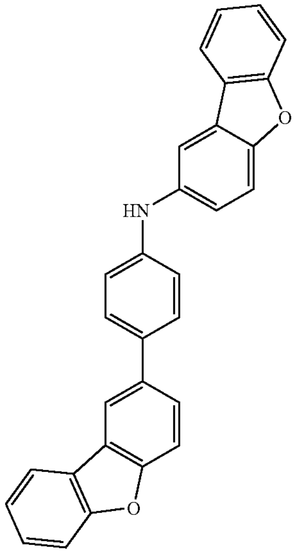
Sub 2-188
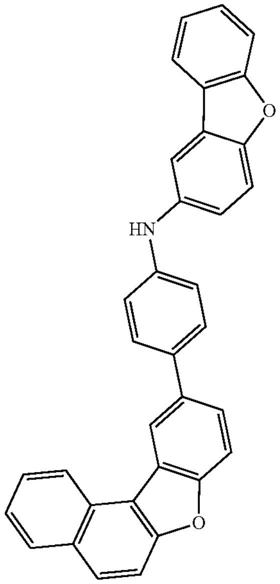
Sub 2-189
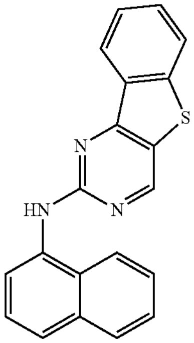
-continued
Sub 2-190
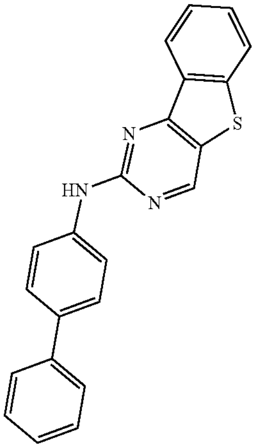
Sub 2-191
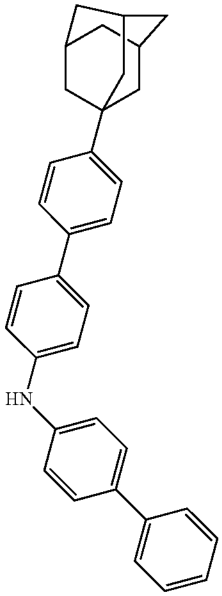
Sub 2-192
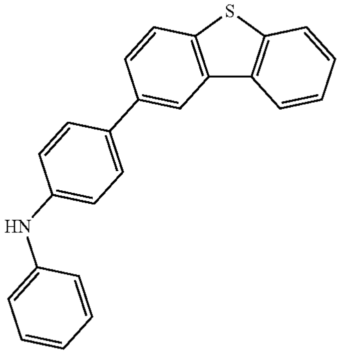

Sub 2-193
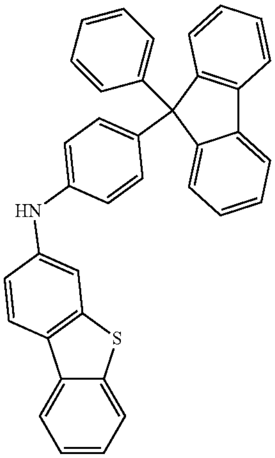
Sub 2-194
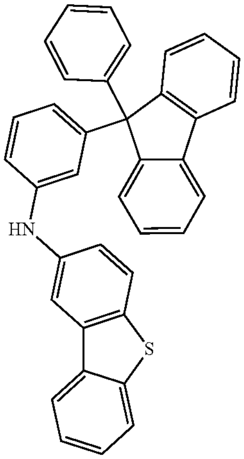
Sub 2-195
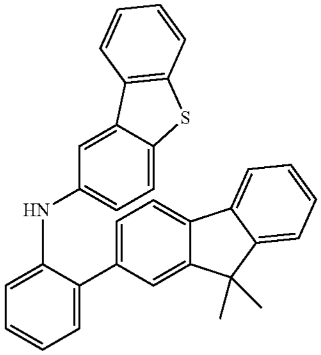
Sub 2-196
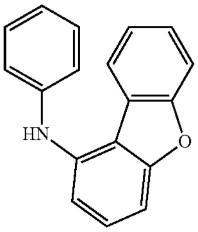
Sub 2-197
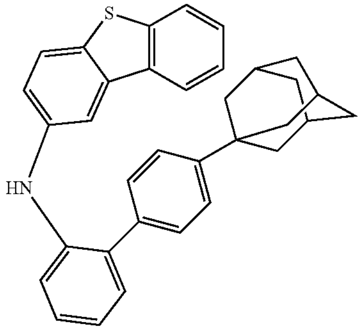
Sub 2-198
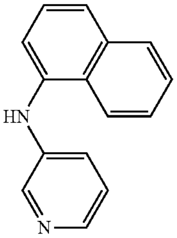
Sub 2-199
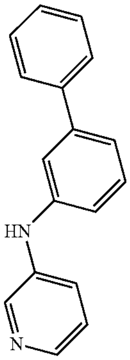
Sub 2-200
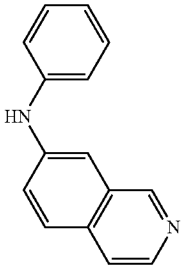
Sub 2-201
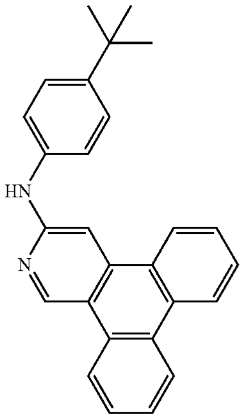

-continued
Sub 2-202
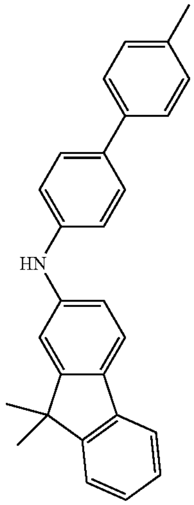
Sub 2-203
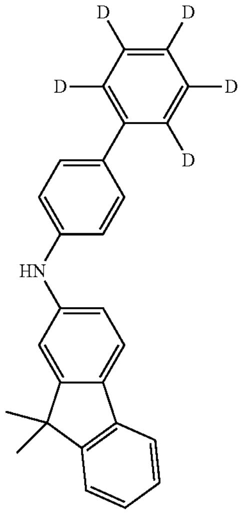
Sub 2-204
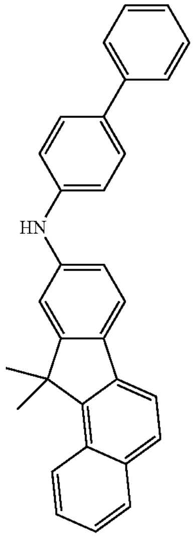
-continued
Sub 2-205
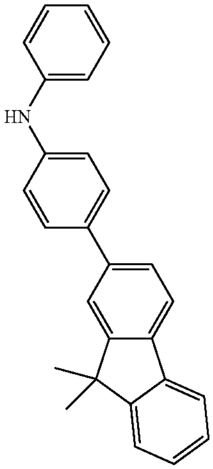
Sub 2-206
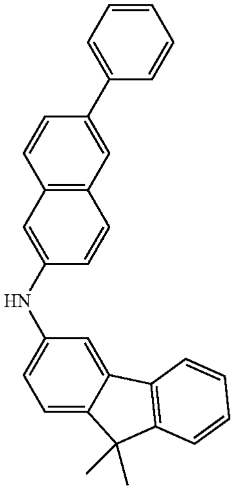
Sub 2-207
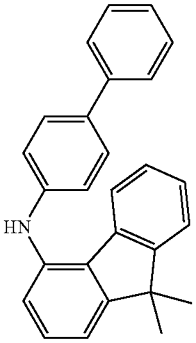

-continued
Sub 2-208
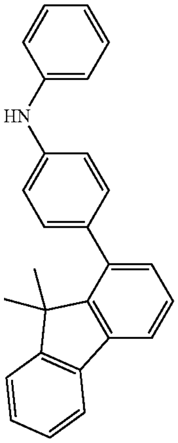
Sub 2-209
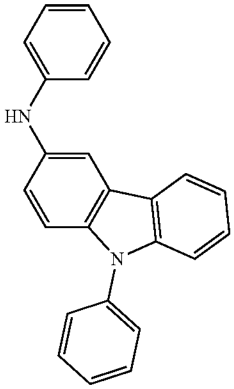
Sub 2-210
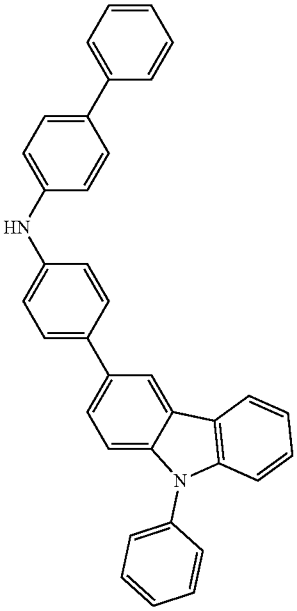
-continued
Sub 2-211
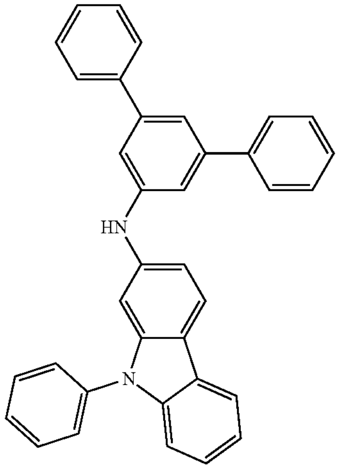
Sub 2-212
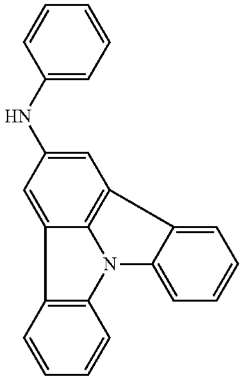
Sub 2-213
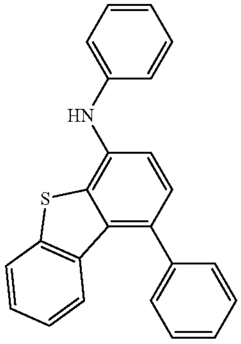
Sub 2-214
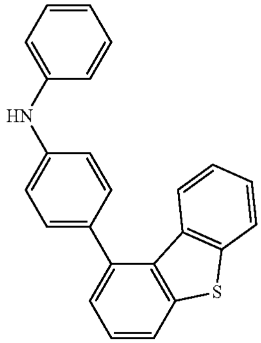

-continued
Sub 2-215
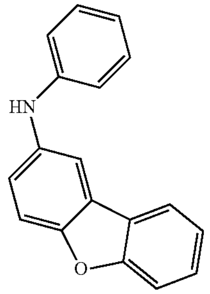
Sub 2-216
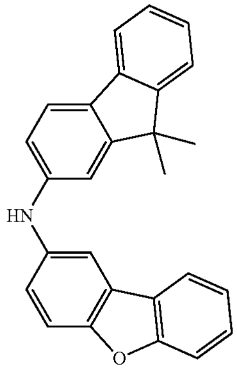
Sub 2-217
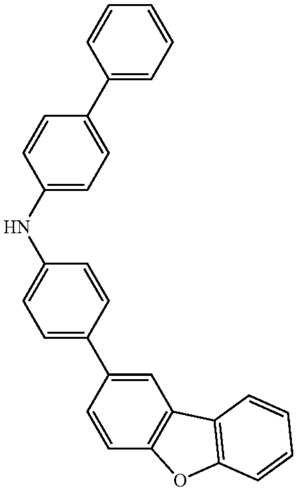
Sub 2-218
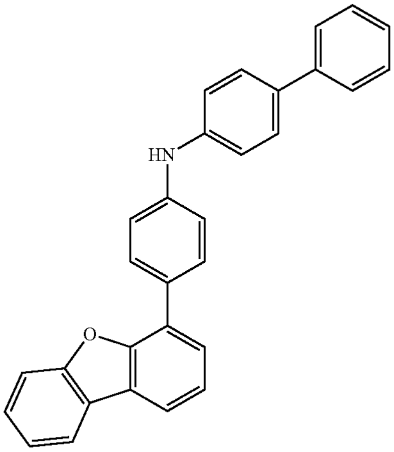
-continued
Sub 2-219
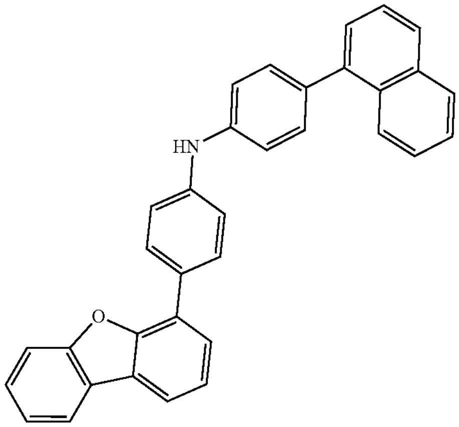
Sub 2-220
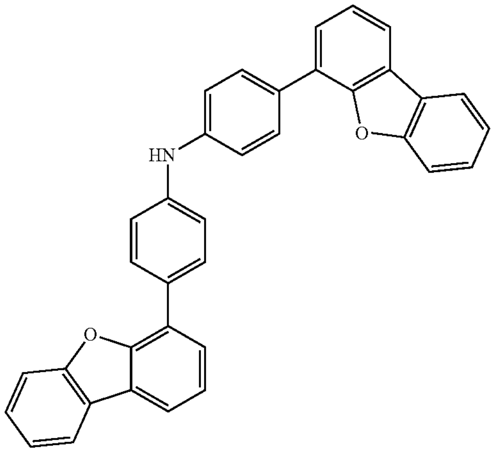
Sub 2-221
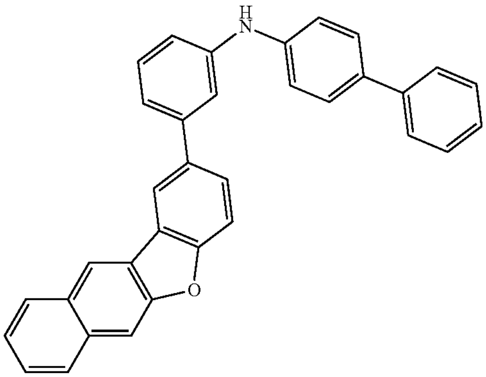

-continued

Sub 2-222

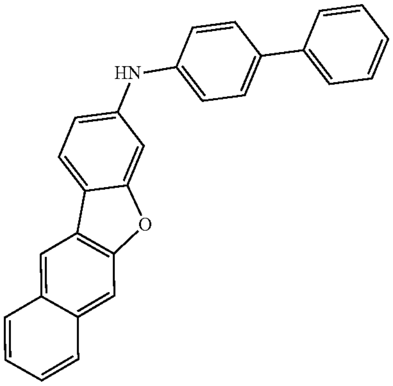

Sub 2-223

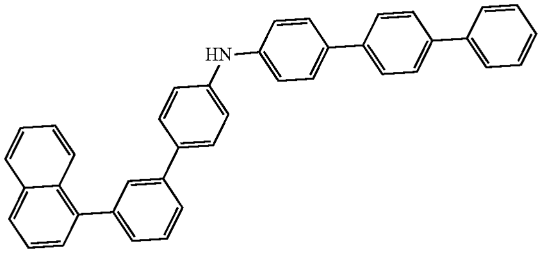

TABLE 3

| Compound | FD-MS | Compound | FD-MS |
|---|---|---|---|
| Sub 2-1 | m/z = 169.09($C_{12}H_{11}N$ = 169.22) | Sub 2-2 | m/z = 245.12($C_{18}H_{15}N$ = 245.32) |
| Sub 2-3 | m/z = 245.12($C_{18}H_{15}N$ = 245.32) | Sub 2-4 | m/z = 321.15($C_{24}H_{19}N$ = 321.41) |
| Sub 2-5 | m/z = 321.15($C_{24}H_{19}N$ = 321.41) | Sub 2-6 | m/z = 269.12($C_{20}H_{15}N$ = 269.34) |
| Sub 2-7 | m/z = 269.12($C_{20}H_{15}N$ = 269.34) | Sub 2-8 | m/z = 295.14($C_{22}H_{17}N$ = 295.38) |
| Sub 2-9 | m/z = 409.18($C_{31}H_{23}N$ = 409.52) | Sub 2-10 | m/z = 483.20($C_{37}H_{25}N$ = 483.60) |
| Sub 2-11 | m/z = 459.20($C_{35}H_{25}N$ = 459.58) | Sub 2-12 | m/z = 485.21($C_{37}H_{27}N$ = 485.62) |
| Sub 2-13 | m/z = 275.08($C_{18}H_{13}NS$ = 275.37) | Sub 2-14 | m/z = 335.13($C_{24}H_{17}NO$ = 335.40) |
| Sub 2-15 | m/z = 297.13($C_{20}H_{15}N_3$ = 297.35) | Sub 2-16 | m/z = 219.10($C_{16}H_{13}N$ = 219.28) |
| Sub 2-17 | m/z = 249.12($C_{17}H_{15}NO$ = 249.31) | Sub 2-18 | m/z = 197.12($C_{14}H_{15}N$ = 197.28) |
| Sub 2-19 | m/z = 229.11($C_{14}H_{15}NO_2$ = 229.27) | Sub 2-20 | m/z = 174.12($C_{12}H_6D_5N$ = 174.25) |
| Sub 2-21 | m/z = 281.21($C_{20}H_{27}N$ = 281.44) | Sub 2-22 | m/z = 321.15($C_{24}H_{19}N$ = 321.41) |
| Sub 2-23 | m/z = 321.15($C_{24}H_{19}N$ = 321.41) | Sub 2-24 | m/z = 321.15($C_{24}H_{19}N$ = 321.41) |
| Sub 2-25 | m/z = 321.15($C_{24}H_{19}N$ = 321.41) | Sub 2-26 | m/z = 321.15($C_{24}H_{19}N$ = 321.41) |
| Sub 2-27 | m/z = 297.13($C_{20}H_{15}N_3$ = 297.35) | Sub 2-28 | m/z = 499.20($C_{36}H_{25}N_3$ = 499.60) |
| Sub 2-29 | m/z = 499.20($C_{36}H_{22}N_2$ = 410.51) | Sub 2-30 | m/z = 424.16($C_{30}H_{20}N_2O$ = 424.49) |
| Sub 2-31 | m/z = 440.13($C_{30}H_{20}N_2S$ = 440.56) | Sub 2-32 | m/z = 384.16($C_{28}H_{20}N_2$ = 384.47) |
| Sub 2-33 | m/z = 334.15($C_{24}H_{18}N_2$ = 334.41) | Sub 2-34 | m/z = 450.21($C_{33}H_{26}N_2$ = 450.57) |
| Sub 2-35 | m/z = 410.18($C_{30}H_{22}N_2$ = 410.51) | Sub 2-36 | m/z = 410.18($C_{30}H_{22}N_2$ = 410.51) |
| Sub 2-37 | m/z = 575.24($C_{42}H_{29}N_3$ = 575.70) | Sub 2-38 | m/z = 574.24($C_{43}H_{30}N_2$ = 574.71) |
| Sub 2-39 | m/z = 460.19($C_{34}H_{24}N_2$ = 460.57) | Sub 2-40 | m/z = 460.19($C_{34}H_{24}N_2$ = 460.57) |
| Sub 2-41 | m/z = 461.19($C_{33}H_{23}N_3$ = 461.56) | Sub 2-42 | m/z = 626.27($C_{47}H_{34}N_2$ = 626.79) |
| Sub 2-43 | m/z = 565.23($C_{39}H_{27}N_5$ = 565.67) | Sub 2-44 | m/z = 415.21($C_{30}H_{17}D_5N_2$ = 415.54) |
| Sub 2-45 | m/z = 486.21($C_{36}H_{26}N_2$ = 486.61) | Sub 2-46 | m/z = 415.21($C_{30}H_{17}D_5N_2$ = 415.54) |
| Sub 2-47 | m/z = 225.15($C_{16}H_{19}N$ = 225.33) | Sub 2-48 | m/z = 220.10($C_{15}H_{12}N_2$ = 220.27) |
| Sub 2-49 | m/z = 220.10($C_{15}H_{12}N_2$ = 220.27) | Sub 2-50 | m/z = 269.12($C_{20}H_{15}N$ = 269.34) |
| Sub 2-51 | m/z = 269.12($C_{20}H_{15}N$ = 269.34) | Sub 2-52 | m/z = 293.12($C_{22}H_{15}N$ = 293.36) |
| Sub 2-53 | m/z = 250.1 5($C_{18}H_{10}D_5N$ = 250.35) | Sub 2-54 | m/z = 250.15($C_{18}H_{10}D_5N$ = 250.35) |
| Sub 2-55 | m/z = 246.12($C_{17}H_{14}N_2$ = 246.31) | Sub 2-56 | m/z = 295.14($C_{22}H_{17}N$ = 295.38) |
| Sub 2-57 | m/z = 295.14($C_{22}H_{17}N$ = 295.38) | Sub 2-58 | m/z = 295.14($C_{22}H_{17}N$ = 295.38) |
| Sub 2-59 | m/z = 300.17($C_{22}H_{12}D_5N$ = 300.41) | Sub 2-60 | m/z = 295.14($C_{22}H_{17}N$ = 295.38) |
| Sub 2-61 | m/z = 295.14($C_{22}H_{17}N$ = 295.38) | Sub 2-62 | m/z = 269.12($C_{20}H_{15}N$ = 269.34) |
| Sub 2-63 | m/z = 345.15($C_{26}H_{19}N$ = 345.44) | Sub 2-64 | m/z = 296.13($C_{21}H_{16}N_2$ = 296.37) |
| Sub 2-65 | m/z = 346.15($C_{25}H_{18}N_2$ = 346.42) | Sub 2-66 | m/z = 321.15($C_{24}H_{19}N$ = 321.41) |
| Sub 2-67 | m/z = 321.15($C_{24}H_{19}N$ = 321.41) | Sub 2-68 | m/z = 421.18($C_{32}H_{23}N$ = 421.53) |
| Sub 2-69 | m/z = 300.17($C_{22}H_{12}D_5N$ = 300.41) | Sub 2-70 | m/z = 421.18($C_{32}H_{23}N$ = 421.53) |
| Sub 2-71 | m/z = 321.15($C_{24}H_{19}N$ = 321.41) | Sub 2-72 | m/z = 371.17($C_{28}H_{21}N$ = 371.47) |
| Sub 2-73 | m/z = 319.14($C_{24}H_{17}N$ = 319.40) | Sub 2-74 | m/z = 293.12($C_{22}H_{15}N$ = 293.36) |
| Sub 2-75 | m/z = 395.17($C_{30}H_{21}N$ = 395.49) | Sub 2-76 | m/z = 386.18($C_{28}H_{22}N_2$ = 386.49) |
| Sub 2-77 | m/z = 224.14($C_{16}H_8D_5N$ = 224.31) | Sub 2-78 | m/z = 275.08($C_{18}H_{13}NS$ = 275.37) |
| Sub 2-79 | m/z = 325.09($C_{22}H_{15}NS$ = 325.43) | Sub 2-80 | m/z = 325.09($C_{22}H_{15}NS$ = 325.43) |
| Sub 2-81 | m/z = 351.11($C_{24}H_{17}NS$ = 351.46) | Sub 2-82 | m/z = 326.09($C_{21}H_{14}N_2S$ = 326.41) |

TABLE 3-continued

| Compound | FD-MS | Compound | FD-MS |
|---|---|---|---|
| Sub 2-83 | m/z = 351.11($C_{24}H_{17}NS$ = 351.46) | Sub 2-84 | m/z = 275.08($C_{18}H_{13}NS$ = 275.37) |
| Sub 2-85 | m/z = 290.09($C_{18}H_{14}N_2S$ = 290.38) | Sub 2-86 | m/z = 325.09($C_{22}H_{15}NS$ = 325.43) |
| Sub 2-87 | m/z = 351.11($C_{24}H_{17}NS$ = 351.46) | Sub 2-88 | m/z = 381.06($C_{24}H_{15}NS_2$ = 381.51) |
| Sub 2-89 | m/z = 401.12($C_{28}H_{19}NS$ = 401.52) | Sub 2-90 | m/z = 275.08($C_{18}H_{13}NS$ = 275.37) |
| Sub 2-91 | m/z = 351.11($C_{24}H_{17}NS$ = 351.46) | Sub 2-92 | m/z = 325.09($C_{22}H_{15}NS$ = 325.43) |
| Sub 2-93 | m/z = 401.12($C_{28}H_{19}NS$ = 401.52) | Sub 2-94 | m/z = 351.11($C_{24}H_{17}NS$ = 351.46) |
| Sub 2-95 | m/z = 352.10($C_{23}H_{16}N_2S$ = 352.45) | Sub 2-96 | m/z = 440.13($C_{30}H_{20}N_2S$ = 440.56) |
| Sub 2-97 | m/z = 375.11($C_{26}H_{17}NS$ = 375.48) | Sub 2-98 | m/z = 381.06($C_{24}H_{15}NS_2$ = 381.51) |
| Sub 2-99 | m/z = 351.11($C_{24}H_{17}NS$ = 351.46) | Sub 2-100 | m/z = 309.12($C_{22}H_{15}NO$ = 309.36) |
| Sub 2-101 | m/z = 259.10($C_{18}H_{13}NO$ = 259.30) | Sub 2-102 | m/z = 309.12($C_{22}H_{15}NO$ = 309.36) |
| Sub 2-103 | m/z = 335.13($C_{24}H_{17}NO$ = 335.40) | Sub 2-104 | m/z = 349.11($C_{24}H_{15}NO_2$ = 349.38) |
| Sub 2-105 | m/z = 309.12($C_{22}H_{15}NO$ = 309.36) | Sub 2-106 | m/z = 259.10($C_{18}H_{13}NO$ = 259.30) |
| Sub 2-107 | m/z = 335.13($C_{24}H_{17}NO$ = 335.40) | Sub 2-108 | m/z = 259.10($C_{18}H_{13}NO$ = 259.30) |
| Sub 2-109 | m/z = 335.13($C_{24}H_{17}NO$ = 335.40) | Sub 2-110 | m/z = 461.18($C_{34}H_{23}NO$ = 461.55) |
| Sub 2-111 | m/z = 335.13($C_{24}H_{17}NO$ = 335.40) | Sub 2-112 | m/z = 335.13($C_{24}H_{17}NO$ = 335.40) |
| Sub 2-113 | m/z = 335.13($C_{24}H_{17}NO$ = 335.40) | Sub 2-114 | m/z = 385.15($C_{28}H_{19}NO$ = 385.46) |
| Sub 2-115 | m/z = 411.16($C_{30}H_{21}NO$ = 411.49) | Sub 2-116 | m/z = 411.16($C_{30}H_{21}NO$ = 411.49) |
| Sub 2-117 | m/z = 285.15($C_{21}H_{19}N$ = 285.38) | Sub 2-118 | m/z = 290.18($C_{21}H_{14}D_5N$ = 290.41) |
| Sub 2-119 | m/z = 335.17($C_{25}H_{21}N$ = 335.44) | Sub 2-120 | m/z = 361.18($C_{27}H_{23}N$ = 361.48) |
| Sub 2-121 | m/z = 391.14($C_{27}H_{21}NS$ = 391.53) | Sub 2-122 | m/z = 401.21($C_{30}H_{27}N$ = 401.54) |
| Sub 2-123 | m/z = 335.17($C_{25}H_{21}N$ = 335.44) | Sub 2-124 | m/z = 335.17($C_{25}H_{21}N$ = 335.44) |
| Sub 2-125 | m/z = 385.18($C_{29}H_{23}N$ = 385.50) | Sub 2-126 | m/z = 361.18($C_{27}H_{23}N$ = 361.48) |
| Sub 2-127 | m/z = 299.17($C_{22}H_{21}N$ = 299.41) | Sub 2-128 | m/z = 385.18($C_{29}H_{23}N$ = 385.50) |
| Sub 2-129 | m/z = 409.18($C_{31}H_{23}N$ = 409.52) | Sub 2-130 | m/z = 525.25($C_{40}H_{31}N$ = 525.68) |
| Sub 2-131 | m/z = 409.18($C_{31}H_{23}N$ = 409.52) | Sub 2-132 | m/z = 423.20($C_{32}H_{25}N$ = 423.55) |
| Sub 2-133 | m/z = 439.19($C_{32}H_{25}NO$ = 439.55) | Sub 2-134 | m/z = 459.20($C_{35}H_{25}N$ = 459.58) |
| Sub 2-135 | m/z = 485.21($C_{37}H_{27}N$ = 485.62) | Sub 2-136 | m/z = 562.24($C_{42}H_{30}N_2$ = 562.70) |
| Sub 2-137 | m/z = 485.21($C_{37}H_{27}N$ = 485.62) | Sub 2-138 | m/z = 523.23($C_{40}H_{29}N$ = 523.66) |
| Sub 2-139 | m/z = 407.17($C_{31}H_{21}N$ = 407.51) | Sub 2-140 | m/z = 407.17($C_{31}H_{21}N$ = 407.51) |
| Sub 2-141 | m/z = 483.20($C_{37}H_{25}N$ = 483.60) | Sub 2-142 | m/z = 457.18($C_{35}H_{23}N$ = 457.56) |
| Sub 2-143 | m/z = 410.18($C_{30}H_{22}N_2$ = 410.51) | Sub 2-144 | m/z = 384.16($C_{28}H_{20}N_2$ = 384.47) |
| Sub 2-145 | m/z = 384.16($C_{28}H_{20}N_2$ = 384.47) | Sub 2-146 | m/z = 410.18($C_{30}H_{22}N_2$ = 410.51) |
| Sub 2-147 | m/z = 450.21($C_{33}H_{26}N_2$ = 450.57) | Sub 2-148 | m/z = 384.16($C_{28}H_{20}N_2$ = 384.47) |
| Sub 2-149 | m/z = 225.06($C_{14}H_{11}NS$ = 225.31) | Sub 2-150 | m/z = 225.06($C_{14}H_{11}NS$ = 225.31) |
| Sub 2-151 | m/z = 284.13($C_{20}H_{16}N_2$ = 284.35) | Sub 2-152 | m/z = 334.15($C_{24}H_{18}N_2$ = 334.41) |
| Sub 2-153 | m/z = 293.07($C_{18}H_{12}FNS$ = 293.36) | Sub 2-154 | m/z = 220.10($C_{15}H_{12}N_2$ = 220.27) |
| Sub 2-155 | m/z = 297.13($C_{20}H_{15}N_3$ = 297.35) | Sub 2-156 | m/z = 245.12($C_{18}H_{15}N$ = 245.32) |
| Sub 2-157 | m/z = 321.15($C_{24}H_{19}N$ = 321.41) | Sub 2-158 | m/z = 349.11($C_{24}H_{15}NO_2$ = 349.38) |
| Sub 2-159 | m/z = 365.09($C_{24}H_{15}NOS$ = 365.45) | Sub 2-160 | m/z = 365.09($C_{24}H_{15}NOS$ = 365.45) |
| Sub 2-161 | m/z = 365.09($C_{24}H_{15}NOS$ = 365.45) | Sub 2-162 | m/z = 365.09($C_{24}H_{15}NOS$ = 365.45) |
| Sub 2-163 | m/z = 415.10($C_{28}H_{17}NOS$ = 415.51) | Sub 2-164 | m/z = 365.09($C_{24}H_{15}NOS$ = 365.45) |
| Sub 2-165 | m/z = 465.12($C_{32}$ $H_{19}NOS$ = 465.57) | Sub 2-166 | m/z = 391.14($C_{27}H_{21}NS$ = 391.53) |
| Sub 2-167 | m/z = 391.14($C_{27}H_{21}NS$ = 391.53) | Sub 2-168 | m/z = 515.17($C_{37}H_{25}NS$ = 515.67) |
| Sub 2-169 | m/z = 513.16($C_{37}H_{23}NS$ = 513.65) | Sub 2-170 | m/z = 375.16($C_{27}H_{21}NO$ = 375.46) |
| Sub 2-171 | m/z = 497.18($C_{37}H_{23}NO$ = 497.58) | Sub 2-172 | m/z = 477.25($C_{36}H_{31}N$ = 477.64) |
| Sub 2-173 | m/z = 561.25($C_{43}H_{31}N$ = 561.73) | Sub 2-174 | m/z = 411.2($C_{31}H_{25}N$ = 411.55) |
| Sub 2-175 | m/z = 475.19($C_{35}H_{25}NO$ = 475.59) | Sub 2-176 | m/z = 575.22($C_{43}H_{29}NO$ = 575.71) |
| Sub 2-177 | m/z = 533.21($C_{41}H_{27}N$ = 533.67) | Sub 2-178 | m/z = 499.19($C_{37}H_{25}NO$ = 499.61) |
| Sub 2-179 | m/z = 439.19($C_{32}H_{25}NO$ = 439.56) | Sub 2-180 | m/z = 400.17($C_{27}H_{20}N_4$ = 400.49) |
| Sub 2-181 | m/z = 399.17($C_{28}H_{21}N_3$ = 399.5) | Sub 2-182 | m/z = 427.14($C_{30}H_{21}NS$ = 427.57) |
| Sub 2-183 | m/z = 461.18($C_{34}H_{23}NO$ = 461.56) | Sub 2-184 | m/z = 381.06($C_{24}H_{15}NS_2$ = 381.51) |
| Sub 2-185 | m/z = 457.1($C_{30}H_{19}NS_2$ = 457.61) | Sub 2-186 | m/z = 533.13($C_{36}H_{23}NS_2$ = 533.71) |
| Sub 2-187 | m/z = 375.11($C_{26}H_{17}NS$ = 375.49) | Sub 2-188 | m/z = 411.16($C_{30}H_{21}NO$ = 411.5) |
| Sub 2-189 | m/z = 425.14($C_{30}H_{19}NO_2$ = 425.49) | Sub 2-190 | m/z = 475.16($C_{34}H_{21}NO_2$ = 475.55) |
| Sub 2-191 | m/z = 327.08($C_{20}H_{13}N_3S$ = 327.41) | Sub 2-192 | m/z = 353.1($C_{22}H_{15}N_3S$ = 353.44) |
| Sub 2-193 | m/z = 455.26($C_{34}H_{33}N$ = 455.65) | Sub 2-194 | m/z = 351.11($C_{24}H_{17}NS$ = 351.47) |
| Sub 2-195 | m/z = 515.17($C_{37}H_{25}NS$ = 515.67) | Sub 2-196 | m/z = 515.17($C_{37}H_{25}NS$ = 515.67) |
| Sub 2-197 | m/z = 467.17($C_{33}H_{25}NS$ = 467.63) | Sub 2-198 | m/z = 259.1($C_{18}H_{13}NO$ = 259.31) |
| Sub 2-199 | m/z = 485.22($C_{34}H_{31}NS$ = 485.69) | Sub 2-200 | m/z = 220.10($C_{15}H_{12}N_2$ = 220.28) |
| Sub 2-201 | m/z = 246.12($C_{17}H_{14}N_2$ = 246.31) | Sub 2-202 | m/z = 220.10($C_{15}H_{12}N_2$ = 220.28) |
| Sub 2-203 | m/z = 376.19($C_{27}H_{24}N_2$ = 376.50) | Sub 2-204 | m/z = 375.20($C_{28}H_{25}N$ = 375.52) |
| Sub 2-205 | m/z = 366.21($C_{27}H_{18}D_5N$ = 366.52) | Sub 2-206 | m/z = 411.20($C_{31}H_{25}N$ = 411.55) |
| Sub 2-207 | m/z = 361.18($C_{27}H_{23}N$ = 361.49) | Sub 2-208 | m/z = 411.20($C_{31}H_{25}N$ = 411.55) |
| Sub 2-209 | m/z = 361.18($C_{27}H_{23}N$ = 361.49) | Sub 2-210 | m/z = 361.18($C_{27}H_{23}N$ = 361.49) |
| Sub 2-211 | m/z = 334.15($C_{24}H_{18}N_2$ = 334.42) | Sub 2-212 | m/z = 486.21($C_{36}H_{26}N_2$ = 486.62) |
| Sub 2-213 | m/z = 486.21($C_{36}H_{26}N_2$ = 486.62) | Sub 2-214 | m/z = 332.13($C_{24}$ $H_{16}N_2$ = 332.41) |
| Sub 2-215 | m/z = 351.11($C_{24}H_{17}NS$ = 351.47) | Sub 2-216 | m/z = 351.11($C_{24}H_{17}NS$ = 351.47) |
| Sub 2-217 | m/z = 259.10($C_{18}H_{13}NO$ = 259.31) | Sub 2-218 | m/z = 375.16($C_{27}H_{21}NO$ = 375.47) |
| Sub 2-219 | m/z = 411.16($C_{30}H_{21}NO$ = 411.50) | Sub 2-220 | m/z = 411.16($C_{30}H_{21}NO$ = 411.50) |
| Sub 2-221 | m/z = 461.18($C_{34}H_{23}NO$ = 461.56) | Sub 2-222 | m/z = 385.15($C_{28}H_{19}NO$ = 385.47) |
| Sub 2-223 | m/z = 523.23(C40H29N = 523.68) | | |

A synthesis example of Final Product 1 of Reaction Scheme 1 is as follows.

Synthesis Example of Final Products 1

Synthesis of 1-54

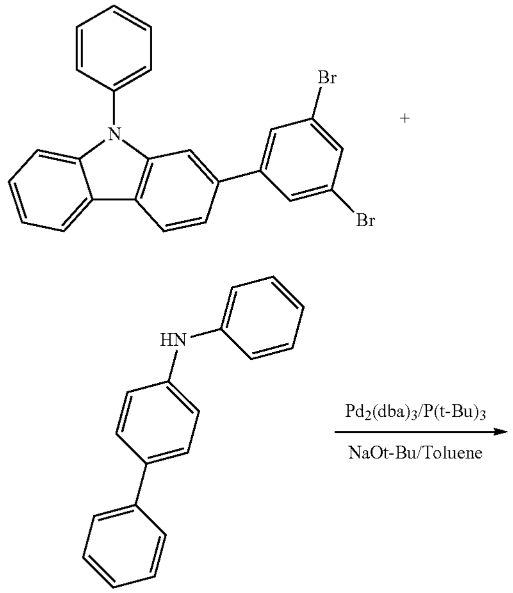

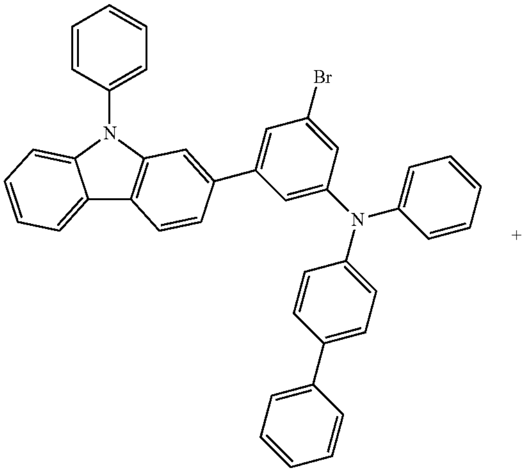

Inter_A-1

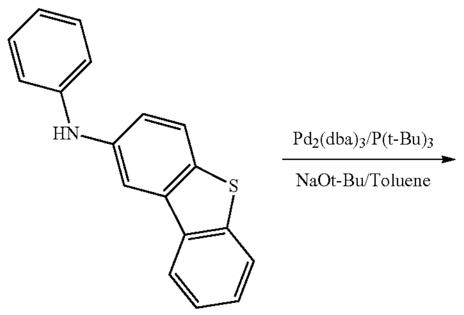

-continued

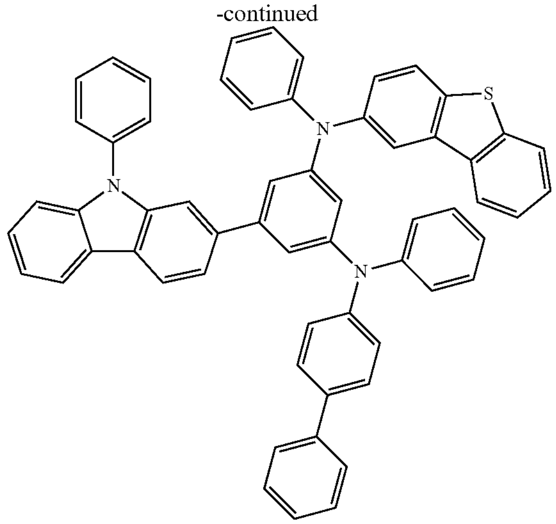

1) Synthesis of Inter_A-1

After N-phenyl[1,1'-biphenyl]-4-amine (11.6 g, 47.3 mmol) was dissolved in toluene (500 mL), 2-(3,5-dibromophenyl)-9-phenyl-9H-carbazole (24.8 g, 52.0 mmol), $Pd_2(dba)_3$ (2.4 g, 2.6 mmol), $P(t-Bu)_3$ (1.05 g, 5.2 mmol) and NaOt-Bu (13.6 g, 141.8 mmol) were added to the solution and the mixture was stirred at 100° C. When the reaction was completed, the reaction product was extracted with $CH_2Cl_2$ and water. Then, an organic layer was dried over $MgSO_4$ and concentrated. Then, the concentrate was separated by a silica gel column and recrystallized to obtain 22.8 g (yield: 75%) of the product.

2) Synthesis of 1-54

After N-phenyldibenzo[b,d]thiophen-2-amine (8 g, 29.05 mmol) was dissolved in toluene (305 mL), Inter_A-1 (20.5 g, 32 mmol), $Pd_2(dba)_3$ (1.5 g, 1.6 mmol), $P(t-Bu)_3$ (0.65 g, 3.2 mmol) and NaOt-Bu (8.4 g, 87.2 mmol) were added to the solution, and then the synthesis was carried out in the same manner as in the synthesis method of Inter_A-1 to obtain 18g (yield: 74%) of the product 1-54.

Synthesis of 2-9

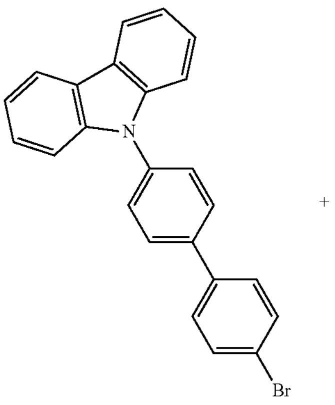

-continued

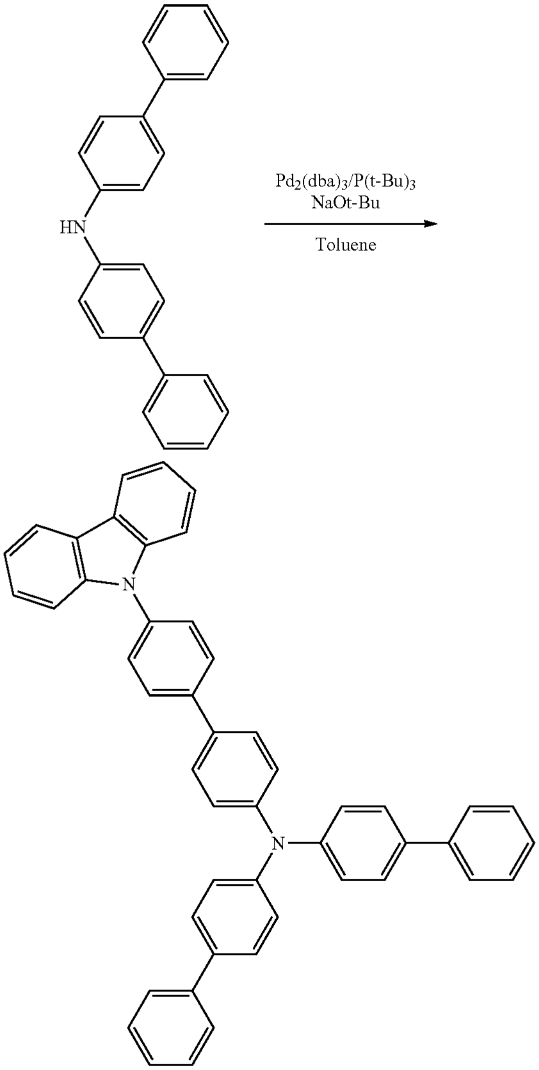

After Sub 2-26 (7 g, 21.8 mmol) was dissolved in toluene (230 mL), Sub 1-2 (9.54 g, 24 mmol), $Pd_2(dba)_3$ (1 g, 1.1 mmol), 50% $P(t\text{-}Bu)_3$ (1.1 ml, 2.2 mmol) and NaOt-Bu (6.91 g, 71.9 mmol) were added to the solution and the mixture was stirred at 100° C. When the reaction was completed, the reaction product was extracted with $CH_2Cl_2$ and water. Then, an organic layer was dried over $MgSO_4$ and concentrated. Then, the concentrate was separated by a silica gel column and recrystallized to obtain 11.69 g (yield: 84%) of the product.

Synthesis of 3-52

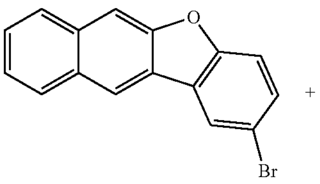

-continued

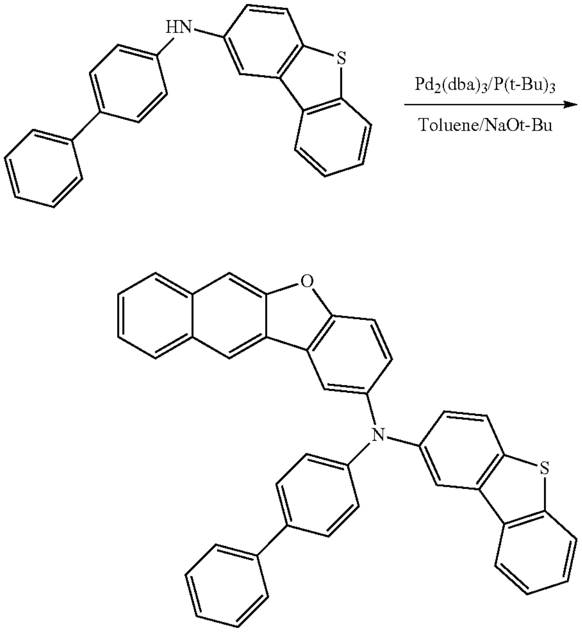

After 2-bromonaphtho[2,3-b]benzofuran (10 g, 33.65 mmol) was dissolved in toluene (337 mL), N-([1,1'-biphenyl]-4-yl)dibenzo[b,d]thiophen-2-amine (11.83 g, 33.65 mmol), $Pd_2(dba)_3$ (0.92 g, 1.01 mmol), $P(t\text{-}Bu)_3$ (6.81 g, 33.65 mmol) and NaOt-Bu (6.47 g, 67.31 mmol) were added to the solution, and then the synthesis was carried out in the same manner as in the synthesis method of 2-9 to obtain 15.28 g (yield: 80%) of the product.

Synthesis of 6-12

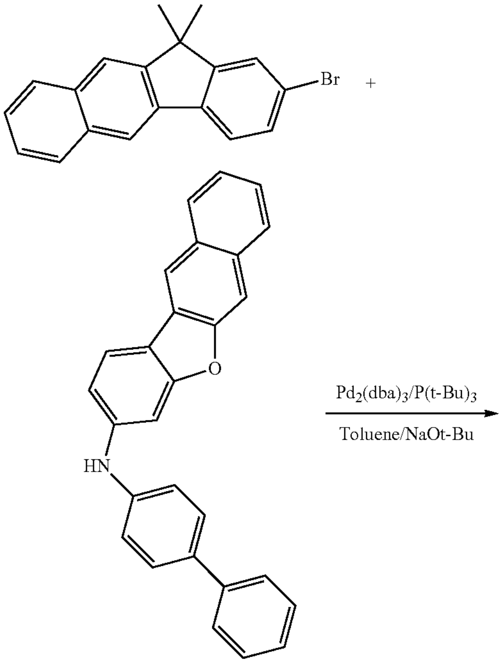

-continued

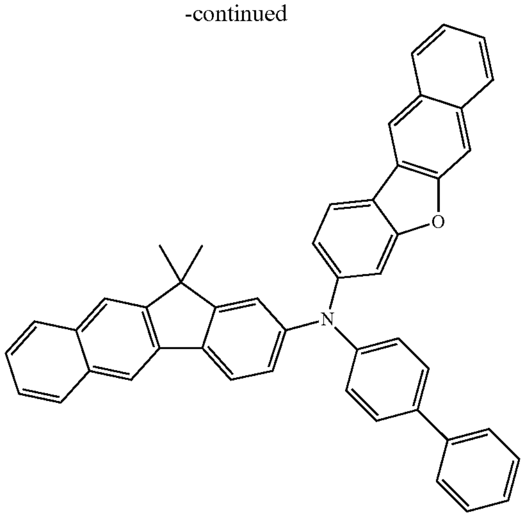

After 2-bromo-11,11-dimethyl-11H-benzo[b]fluorene (10 g, 30.94 mmol) was dissolved in toluene (309 mL), N-([1,1'-biphenyl]-4-yl)naphtho[2,3-b]benzofuran-3-amine (11.93 g, 30.94 mmol), $Pd_2(dba)_3$ (0.85 g, 0.93 mmol), $P(t\text{-}Bu)_3$ (6.26 g, 30.94 mmol) and NaOt-Bu (5.95 g, 61.88 mmol) were added to the solution, and then the synthesis was carried out in the same manner as in the synthesis method of 2-9 to obtain 15.15 g (yield: 78%) of the product.

Synthesis of 11-4

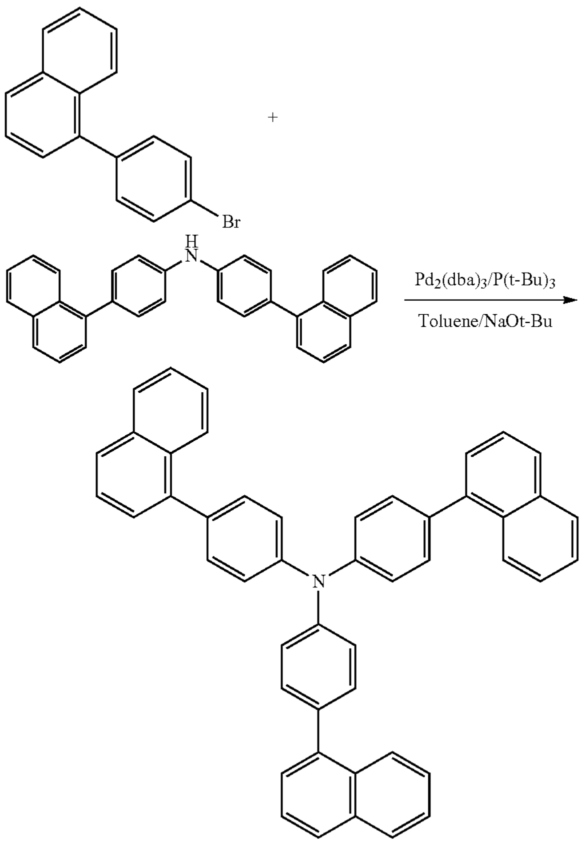

After 1-(4-bromophenyl)naphthalene (10 g, 35.3 mmol) was dissolved in toluene (353 mL), bis(4-(naphthalen-1-yl)phenyl)amine (14.8 g, 35.31 mmol), $Pd_2(dba)_3$ (0.97 g, 1.06 mmol), $P(t\text{-}Bu)_3$ (7.14 g, 35.31 mmol) and NaOt-Bu (6.79 g, 70.63 mmol) were added to the solution, and then the synthesis was carried out in the same manner as in the synthesis method of 2-9 to obtain 16.9 g (yield: 78%) of the product.

[Synthesis Example of 1-2] Synthesis Example of Compounds (Final Product 1') Represented by Formula 1

Some compounds of the present invention were prepared by the synthesis method disclosed in Korean Patent No. 10-1668448 (registration-published on Oct. 17, 2016) and Korean Patent Registration No. 10-1789998 (registration-published on Oct. 19, 2017) of the present applicant.

1. Synthesis Example of 7-8

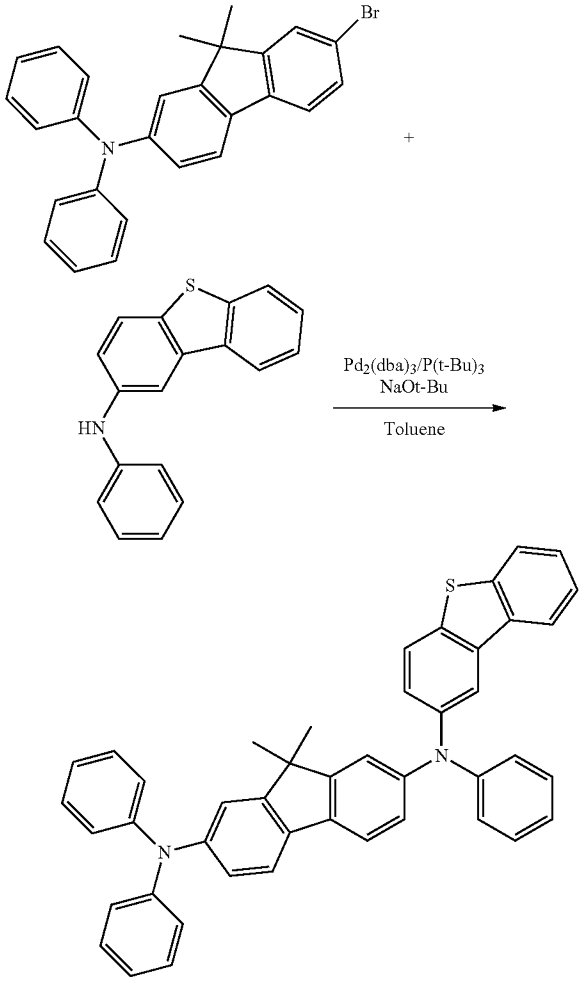

After 7-bromo-9,9-dimethyl-N,N-diphenyl-9H-fluoren-2-amine (8 g, 18.2 mmol) was dissolved in toluene (100 ml), N-phenyldibenzo[b,d]thiophen-2-amine (5 g, 18.2 mmol), $Pd_2(dba)_3$ (0.5 g, 0.55 mmol) $P(t\text{-}Bu)_3$ (0.23 g, 1.1 mmol) and NaOt-Bu (5.3 g, 54.6 mmol) were added to the solution and the mixture was stirred at 100° C. When the reaction was completed, the reaction product was extracted with $CH_2Cl_2$ and water. Then, an organic layer was dried over $MgSO_4$ and concentrated. Then, the concentrate was separated by a silica gel column and recrystallized to obtain 8.9 g (yield: 76%) of the product.

2. Synthesis Example of 10-37

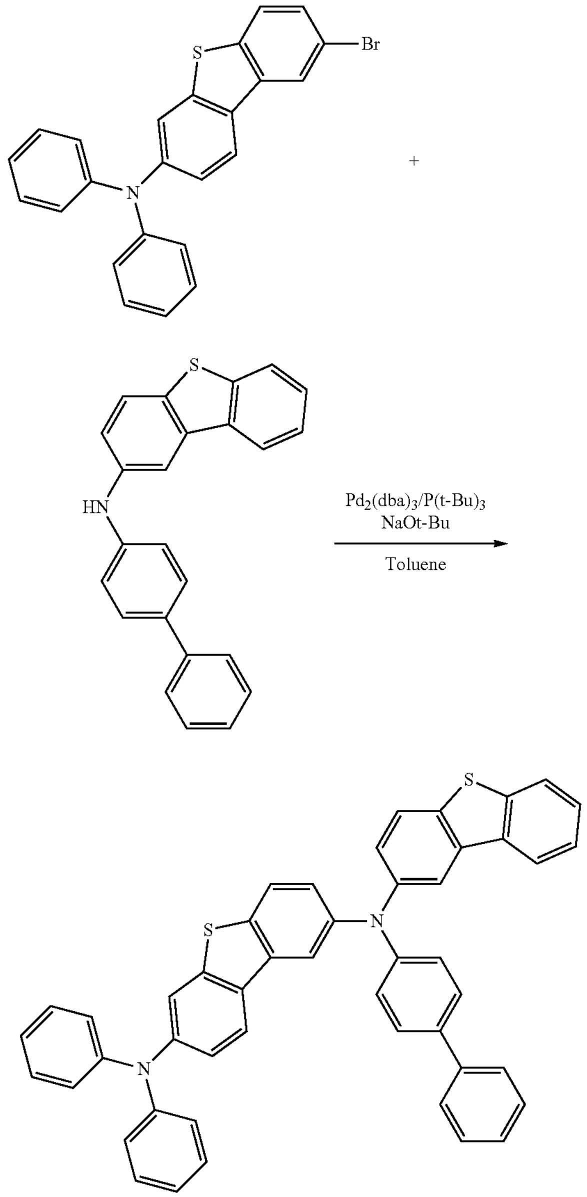

After 8-bromo-N,N-diphenyldibenzo[b,d]thiophen-3-amine (5.29 g, 12.29 mmol) was dissolved in toluene (125 ml), N-([1,1'-biphenyl]-4-yl)dibenzo[b,d]thiophen-2-amine (4.32 g, 12.29 mmol), $Pd_2(dba)_3$ (0.34 g, 0.37 mmol) P(t-Bu)$_3$ (0.25 g, 1.23 mmol) and NaOt-Bu (3.54 g, 36.87 mmol) were added to the solution, and then the synthesis was carried out in the same manner as in the synthesis method of 7-8 to obtain 6.81 g (yield: 79%) of the product.

3. Synthesis Example of 10-176

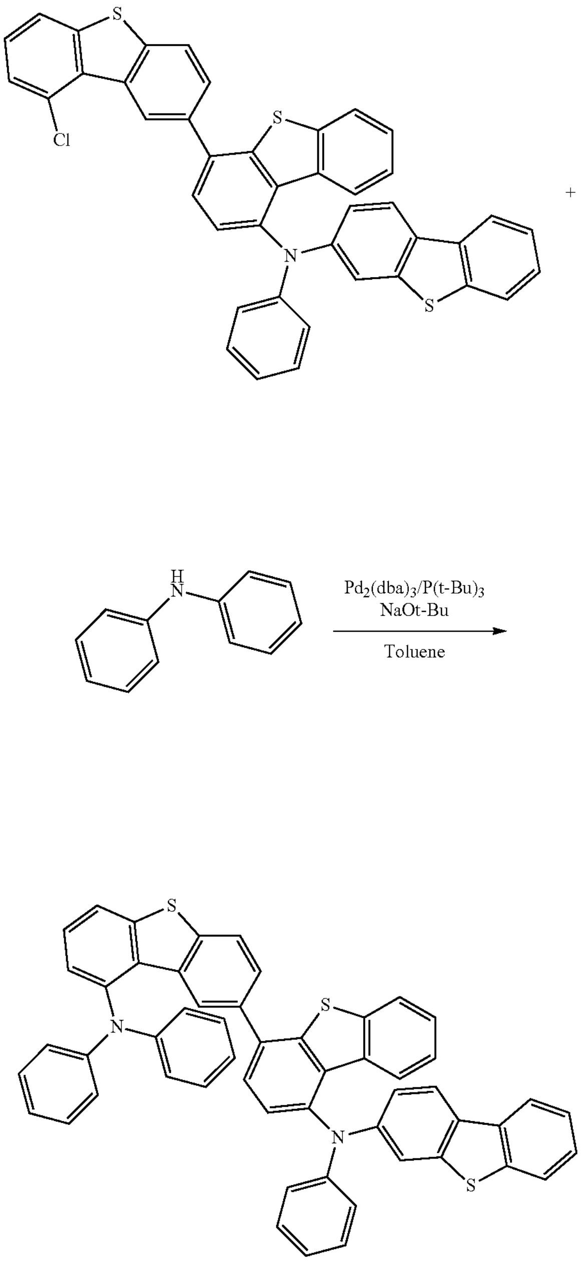

After 9-chloro-N-(dibenzo[b,d]thiophen-3-yl)-N-phenyl-[2,4'-bidibenzo[b,d]thiophen]-1'-amine (25 g, 37.08 mmol) was dissolved in toluene (371 ml), diphenylamine (6.27 g, 37.08 mmol), $Pd_2(dba)_3$ (1.02 g, 1.11 mmol) P(t-Bu)$_3$ (7.50 g, 37.08 mmol) and NaOt-Bu (7.13 g, 74.15 mmol) were added to the solution, and then the synthesis was carried out in the same manner as in the synthesis method of 7-8 to obtain 8.9 g (yield: 72%) of the product.

4. Synthesis Example of 12-1

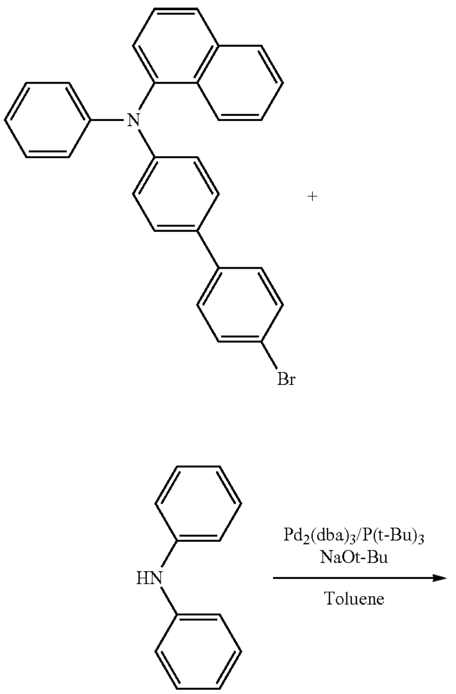

-continued

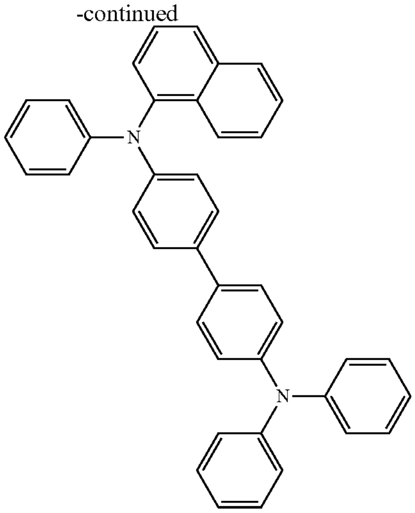

After N-(4'-bromo-[1,1'-biphenyl]-4-yl)-N-phenylnaphthalen-1-amine (25 g, 55.51 mmol) was dissolved in toluene (555 ml), diphenylamine (9.39 g, 55.51 mmol), $Pd_2(dba)_3$ (1.52 g, 1.67 mmol) $P(t\text{-}Bu)_3$ (11.23 g, 55.51 mmol), NaOt-Bu (10.67 g, 111.02 mmol) were added to the solution, and then the synthesis was carried out in the same manner as in the synthesis method of 7-8 to obtain 21.77 g (yield: 81%) of the product.

FD-MS values of the compounds 1-1 to 12-70 of the present invention synthesized by the above synthesis method are shown in Table 4 below.

TABLE 4

| Compound | FD-MS | Compound | FD-MS |
|---|---|---|---|
| 1-1 | m/z = 562.24($C_{42}H_{30}N_2$ = 562.72) | 1-2 | m/z = 602.27($C_{45}H_{34}N_2$ = 602.78) |
| 1-3 | m/z = 563.24($C_{41}H_{29}N_3$ = 563.70) | 1-4 | m/z = 714.30($C_{54}H_{38}N_2$ = 714.91) |
| 1-5 | m/z = 678.30($C_{51}H_{38}N_2$ = 678.88) | 1-6 | m/z = 802.33($C_{61}H_{42}N_2$ = 803.02) |
| 1-7 | m/z = 800.32($C_{61}H_{40}N_2$ = 801.01) | 1-8 | m/z = 563.24($C_{41}H_{29}N_3$ = 563.70) |
| 1-9 | m/z = 668.23($C_{48}H_{32}N_2S$ = 668.86) | 1-10 | m/z = 727.30($C_{54}H_{37}N_3$ = 727.91) |
| 1-11 | m/z = 652.25($C_{48}H_{32}N_2O$ = 652.80) | 1-12 | m/z = 662.27($C_{50}H_{34}N_2$ = 662.84) |
| 1-13 | m/z = 536.23($C_{40}H_{28}N_2$ = 536.68) | 1-14 | m/z = 586.24($C_{44}H_{30}N_2$ = 586.74) |
| 1-15 | m/z = 712.29($C_{54}H_{36}N_2$ = 712.90) | 1-16 | m/z = 714.30($C_{54}H_{38}N_2$ = 714.91) |
| 1-17 | m/z = 754.33($C_{57}H_{42}N_2$ = 754.98) | 1-18 | m/z = 957.38($C_{70}H_{47}N_5$ = 958.18) |
| 1-19 | m/z = 965.38($C_{73}H_{47}N_3$ = 966.20) | 1-20 | m/z = 719.24($C_{51}H_{33}N_3S$ = 719.91) |
| 1-21 | m/z = 758.24($C_{54}H_{34}N_2OS$ = 758.94) | 1-22 | m/z = 893.38($C_{67}H_{47}N_3$ = 894.13) |
| 1-23 | m/z = 652.25($C_{48}H_{32}N_2O$ = 652.80) | 1-24 | m/z = 662.27($C_{50}H_{34}N_2$ = 662.84) |
| 1-25 | m/z = 562.24($C_{42}H_{30}N_2$ = 562.72) | 1-26 | m/z = 612.26($C_{46}H_{32}N_2$ = 612.78) |
| 1-27 | m/z = 688.29($C_{52}H_{36}N_2$ = 688.87) | 1-28 | m/z = 714.30($C_{54}H_{38}N_2$ = 714.91) |
| 1-29 | m/z = 754.33($C_{57}H_{42}N_2$ = 754.98) | 1-30 | m/z = 878.37($C_{67}H_{46}N_2$ = 879.12) |
| 1-31 | m/z = 876.35($C_{67}H_{44}N_2$ = 877.10) | 1-32 | m/z = 639.27($C_{47}H_{33}N_3$ = 369.80) |
| 1-33 | m/z = 768.26($C_{56}H_{36}N_2S$ = 768.98) | 1-34 | m/z = 833.29($C_{60}H_{39}N_3S$ = 834.05) |
| 1-35 | m/z = 742.26($C_{54}H_{34}N_2O_5$ = 742.88) | 1-36 | m/z = 778.333($C_{59}H_{42}N_2$ = 779.00) |
| 1-37 | m/z = 486.21($C_{36}H_{26}N_2$ = 486.62) | 1-38 | m/z = 536.23($C_{40}H_{28}N_2$ = 536.68) |
| 1-39 | m/z = 612.26($C_{46}H_{32}N_2$ = 612.78) | 1-40 | m/z = 638.27($C_{48}H_{34}N_2$ = 638.81) |
| 1-41 | m/z = 491.24($C_{36}H_{21}D_5N_2$ = 491.65) | 1-42 | m/z = 612.26($C_{46}H_{32}N_2$ = 612.78) |
| 1-43 | m/z = 794.28($C_{58}H_{38}N_2S$ = 795.02) | 1-44 | m/z = 656.26($C_{48}H_{33}FN_2$ = 656.80) |
| 1-45 | m/z = 717.29($C_{51}H_{35}N_5$ = 717.88) | 1-46 | m/z = 728.32($C_{55}H_{40}N_2$ = 728.94) |
| 1-47 | m/z = 842.34($C_{62}H_{42}N_4$ = 843.05) | 1-48 | m/z = 714.30($C_{54}H_{38}N_2$ = 714.91) |
| 1-49 | m/z = 653.28($C_{48}H_{35}N_3$ = 653.81) | 1-50 | m/z = 703.30($C_{52}H_{37}N_3$ = 703.87) |
| 1-51 | m/z = 805.35($C_{60}H_{43}N_3$ = 806.00) | 1-52 | m/z = 753.31($C_{56}H_{39}N_3$ = 753.93) |
| 1-53 | m/z = 818.34($C_{60}H_{42}N_4$ = 819.00) | 1-54 | m/z = 835.30($C_{60}H_{41}N_3S$ = 836.05) |
| 1-55 | m/z = 655.27($C_{46}H_{33}N_5$ = 655.79) | 1-56 | m/z = 885.32($C_{64}H_{43}N_3S$ = 886.11) |
| 1-57 | m/z = 759.27($C_{54}H_{37}N_3S$ = 759.96) | 1-58 | m/z = 706.28($C_{49}H_{34}N_6$ = 706.83) |
| 1-59 | m/z = 960.39($C_{69}H_{48}N_6$ = 961.16) | 1-60 | m/z = 853.35($C_{64}H_{43}N_3$ = 854.05) |
| 1-61 | m/z = 894.37($C_{66}H_{46}N_4$ = 895.10) | 1-62 | m/z = 834.38($C_{62}H_{38}D_5N_3$ = 835.06) |
| 1-63 | m/z = 855.36($C_{64}H_{45}N_3$ = 856.06) | 1-64 | m/z = 853.35($C_{54}H_{43}N_3$ = 854.05) |
| 1-65 | m/z = 794.37($C_{60}H_{46}N_2$ = 795.04) | 1-66 | m/z = 987.39($C_{71}H_{49}N_5O$ = 988.21) |
| 1-67 | m/z = 1021.44($C_{77}H_{55}N_3$ = 1022.31) | 1-68 | m/z = 737.23($C_{51}H_{32}FN_3S$ = 737.90) |
| 1-69 | m/z = 562.24($C_{42}H_{30}N_2$ = 562.72) | 1-70 | m/z = 602.27($C_{45}H_{34}N_2$ = 602.78) |
| 1-71 | m/z = 563.24($C_{41}H_{29}N_3$ = 563.70) | 1-72 | m/z = 714.30($C_{54}H_{38}N_2$ = 714.91) |
| 1-73 | m/z = 678.30($C_{51}H_{38}N_2$ = 678.88) | 1-74 | m/z = 802.33($C_{61}H_{42}N_2$ = 803.02) |
| 1-75 | m/z = 800.32($C_{61}H_{40}N_2$ = 801.01) | 1-76 | m/z = 563.24($C_{41}H_{29}N_3$ = 563.70) |

TABLE 4-continued

| Compound | FD-MS | Compound | FD-MS |
|---|---|---|---|
| 1-77 | m/z = 668.23($C_{48}H_{32}N_2S$ = 668.86) | 1-78 | m/z = 727.30($C_{54}H_{37}N_3$ = 727.91) |
| 1-79 | m/z = 652.25($C_{48}H_{32}N_2O$ = 652.80) | 1-80 | m/z = 662.27($C_{50}H_{34}N_2$ = 662.84) |
| 1-81 | m/z = 536.23($C_{40}H_{28}N_2$ = 536.68) | 1-82 | m/z = 586.24($C_{44}H_{30}N_2$ = 586.74) |
| 1-83 | m/z = 712.29($C_{54}H_{36}N_2$ = 712.90) | 1-84 | m/z = 714.30($C_{54}H_{38}N_2$ = 714.91) |
| 1-85 | m/z = 754.33($C_{57}H_{42}N_2$ = 754.98) | 1-86 | m/z = 957.38($C_{70}H_{47}N_5$ = 958.18) |
| 1-87 | m/z = 965.38($C_{73}H_{47}N_3$ = 966.20) | 1-88 | m/z = 719.24($C_{51}H_{33}N_3S$ = 719.91) |
| 1-89 | m/z = 758.24($C_{54}H_{34}N_2OS$ = 758.94) | 1-90 | m/z = 893.38($C_{67}H_{47}N_3$ = 894.13) |
| 1-91 | m/z = 652.25($C_{48}H_{32}N_2O$ = 652.80) | 1-92 | m/z = 662.27($C_{50}H_{34}N_2$ = 662.84) |
| 1-93 | m/z = 562.24($C_{42}H_{30}N_2$ = 562.72) | 1-94 | m/z = 612.26($C_{46}H_{32}N_2$ = 612.78) |
| 1-95 | m/z = 688.29($C_{52}H_{36}N_2$ = 688.87) | 1-96 | m/z = 714.30($C_{54}H_{38}N_2$ = 714.91) |
| 1-97 | m/z = 754.33($C_{57}H_{42}N_2$ = 754.98) | 1-98 | m/z = 878.37($C_{67}H_{46}N_2$ = 879.12) |
| 1-99 | m/z = 876.35($C_{67}H_{44}N_2$ = 877.10) | 1-100 | m/z = 639.27($C_{47}H_{33}N_3$ = 369.80) |
| 1-101 | m/z = 768.26($C_{56}H_{36}N_2S$ = 768.98) | 1-102 | m/z = 833.29($C_{60}H_{39}N_3S$ = 834.05) |
| 1-103 | m/z = 742.26($C_{54}H_{34}N_2O_5$ = 742.88) | 1-104 | m/z = 778.333($C_{59}H_{42}N_2$ = 779.00) |
| 1-105 | m/z = 486.21($C_{36}H_{26}N_2$ = 486.62) | 1-106 | m/z = 536.23($C_{40}H_{28}N_2$ = 536.68) |
| 1-107 | m/z = 612.26($C_{46}H_{32}N_2$ = 612.78) | 1-108 | m/z = 638.27($C_{48}H_{34}N_2$ = 638.81) |
| 1-109 | m/z = 491.24($C_{35}H_{21}D_5N_2$ = 491.65) | 1-110 | m/z = 612.26($C_{46}H_{32}N_2$ = 612.78) |
| 1-111 | m/z = 794.28($C_{58}H_{38}N_2S$ = 795.02) | 1-112 | m/z = 656.26($C_{48}H_{33}FN_2$ = 656.80) |
| 1-113 | m/z = 717.29($C_{51}H_{35}N_5$ = 717.88) | 1-114 | m/z = 728.32($C_{55}H_{40}N_2$ = 728.94) |
| 1-115 | m/z = 842.34($C_{62}H_{42}N_4$ = 843.05) | 1-116 | m/z = 714.30($C_{54}H_{38}N_2$ = 714.91) |
| 1-117 | m/z = 653.28($C_{48}H_{35}N_3$ = 653.81) | 1-118 | m/z = 703.30($C_{52}H_{37}N_3$ = 703.87) |
| 1-119 | m/z = 805.35($C_{60}H_{43}N_3$ = 806.00) | 1-120 | m/z = 753.31($C_{56}H_{39}N_3$ = 753.93) |
| 1-121 | m/z = 818.34($C_{60}H_{42}N_4$ = 819.00) | 1-122 | m/z = 835.30($C_{60}H_{41}N_3S$ = 836.05) |
| 1-123 | m/z = 655.27($C_{46}H_{33}N_5$ = 655.79) | 1-124 | m/z = 885.32($C_{64}H_{43}N_3S$ = 886.11) |
| 1-125 | m/z = 759.27($C_{54}H_{37}N_3S$ = 759.96) | 1-126 | m/z = 706.28($C_{49}H_{34}N_6$ = 706.83) |
| 1-127 | m/z = 960.39($C_{69}H_{48}N_6$ = 961.16) | 1-128 | m/z = 853.35($C_{64}H_{43}N_3$ = 854.05) |
| 1-129 | m/z = 894.37($C_{65}H_{46}N_4$ = 895.10) | 1-130 | m/z = 834.38($C_{62}H_{38}D_5N_3$ = 835.06) |
| 1-131 | m/z = 855.36($C_{64}H_{45}N_3$ = 856.06) | 1-132 | m/z = 853.35($C_{64}H_{43}N_3$ = 854.05) |
| 1-133 | m/z = 794.37($C_{60}H_{46}N_2$ = 795.04) | 1-134 | m/z = 987.39($C_{71}H_{49}N_5O$ = 988.21) |
| 1-135 | m/z = 1021.44($C_{77}H_{55}N_3$ = 1022.31) | 1-136 | m/z = 737.23($C_{51}H_{32}FN_3S$ = 737.90) |
| 1-137 | m/z = 650.27($C_{49}H_{34}N_2$ = 650.83) | | |
| 2-1 | m/z = 486.21($C_{36}H_{26}N_2$ = 486.61) | 2-2 | m/z = 541.26($C_{40}H_{23}D_5N_2$ = 541.69) |
| 2-3 | m/z = 612.26($C_{45}H_{32}N_2$ = 612.76) | 2-4 | m/z = 562.24($C_{42}H_{30}N_2$ = 562.70) |
| 2-5 | m/z = 636.26($C_{48}H_{32}N_2$ = 636.78) | 2-6 | m/z = 586.24($C_{44}H_{30}N_2$ = 586.72) |
| 2-7 | m/z = 712.29($C_{54}H_{36}N_2$ = 712.88) | 2-8 | m/z = 638.27($C_{48}H_{34}N_2$ = 638.80) |
| 2-9 | m/z = 638.27($C_{48}H_{34}N_2$ = 638.80) | 2-10 | m/z = 638.27($C_{48}H_{34}N_2$ = 638.80) |
| 2-11 | m/z = 638.27($C_{48}H_{34}N_2$ = 638.80) | 2-12 | m/z = 738.30($C_{56}H_{38}N_2$ = 738.91) |
| 2-13 | m/z = 653.28($C_{48}H_{35}N_3$ = 653.81) | 2-14 | m/z = 820.36($C_{60}H_{44}N_4$ = 821.02) |
| 2-15 | m/z = 651.27($C_{48}H_{33}N_3$ = 651.80) | 2-16 | m/z = 642.21($C_{46}H_{30}N_2S$ = 642.81) |
| 2-17 | m/z = 668.23($C_{48}H_{32}N_2S$ = 668.85) | 2-18 | m/z = 668.23($C_{48}H_{32}N_2S$ = 668.85) |
| 2-19 | m/z = 692.23($C_{50}H_{32}N_2S$ = 692.87) | 2-20 | m/z = 708.26($C_{51}H_{36}N_2S$ = 708.91) |
| 2-21 | m/z = 794.28($C_{58}H_{32}N_2S$ = 795.00) | 2-22 | m/z = 698.19($C_{48}H_{30}N_2S_2$ = 698.90) |
| 2-23 | m/z = 652.25($C_{48}H_{32}N_2O$ = 652.78) | 2-24 | m/z = 778.30($C_{58}H_{38}N_2O$ = 778.94) |
| 2-25 | m/z = 753.28($C_{55}H_{35}N_3O$ = 753.89) | 2-26 | m/z = 666.23($C_{48}H_{30}N_2O_2$ = 666.76) |
| 2-27 | m/z = 682.21($C_{48}H_{30}N_2OS$ = 682.83) | 2-28 | m/z = 682.21($C_{48}H_{30}N_2OS$ = 682.83) |
| 2-29 | m/z = 678.30($C_{51}H_{38}N_2$ = 678.86) | 2-30 | m/z = 702.30($C_{53}H_{38}N_2$ = 702.88) |
| 2-31 | m/z = 692.28($C_{51}H_{36}N_2O$ = 692.84) | 2-32 | m/z = 708.26($C_{51}H_{36}N_2S$ = 708.91) |
| 2-33 | m/z = 794.37($C_{60}H_{46}N_2$ = 795.02) | 2-34 | m/z = 802.33($C_{61}H_{42}N_2$ = 803.00) |
| 2-35 | m/z = 879.36($C_{65}H_{45}N_3$ = 880.08) | 2-36 | m/z = 842.37($C_{64}H_{46}N_2$ = 843.06) |
| 2-37 | m/z = 832.29($C_{61}H_{40}N_2S$ = 833.05) | 2-38 | m/z = 724.29($C_{55}H_{36}N_2$ = 724.89) |
| 2-39 | m/z = 800.32($C_{61}H_{40}N_2$ = 800.98) | 2-40 | m/z = 840.35($C_{64}H_{44}N_2$ = 841.05) |
| 2-41 | m/z = 830.28($C_{61}H_{38}N_2S$ = 831.03) | 2-42 | m/z = 814.30($C_{61}H_{38}N_2O$ = 814.97) |
| 2-43 | m/z = 638.27($C_{48}H_{34}N_2$ = 638.80) | 2-44 | m/z = 803.33($C_{60}H_{41}N_3$ = 803.99) |
| 2-45 | m/z = 638.27($C_{48}H_{34}N_2$ = 638.80) | 2-46 | m/z = 668.23($C_{48}H_{32}N_2S$ = 668.85) |
| 2-47 | m/z = 678.30($C_{51}H_{38}N_2$ = 678.86) | 2-48 | m/z = 835.30($C_{60}H_{41}N_3S$ = 836.05) |
| 2-49 | m/z = 682.21($C_{48}H_{30}N_2OS$ = 682.83) | 2-50 | m/z = 668.23($C_{48}H_{32}N_2S$ = 668.85) |
| 2-51 | m/z = 612.26($C_{45}H_{32}N_2$ = 612.76) | 2-52 | m/z = 638.27($C_{48}H_{34}N_2$ = 638.80) |
| 2-53 | m/z = 782.24($C_{56}H_{34}N_2OS$ = 782.95) | 2-54 | m/z = 790.33($C_{60}H_{42}N_2$ = 790.99) |
| 2-55 | m/z = 805.31($C_{59}H_{39}N_3O$ = 805.96) | 2-56 | m/z = 664.29($C_{50}H_{36}N_2$ = 664.83) |
| 2-57 | m/z = 803.33($C_{60}H_{41}N_3$ = 803.99) | 2-58 | m/z = 768.26($C_{56}H_{36}N_2S$ = 768.96) |
| 2-59 | m/z = 650.27($C_{49}H_{34}N_2$ = 650.81) | 2-60 | m/z = 688.29($C_{52}H_{36}N_2$ = 688.86) |
| 2-61 | m/z = 744.26($C_{54}H_{36}N_2S$ = 744.94) | 2-62 | m/z = 667.21($C_{47}H_{29}N_3S$ = 667.82) |
| 2-63 | m/z = 642.21($C_{46}H_{30}N_2S$ = 642.81) | 2-64 | m/z = 566.18($C_{40}H_{26}N_2S$ = 566.71) |
| 2-65 | m/z = 699.18($C_{47}H_{29}N_3S_2$ = 699.88) | 2-66 | m/z = 682.21($C_{48}H_{30}N_2OS$ = 682.83) |
| 2-67 | m/z = 742.24($C_{54}H_{34}N_2S$ = 742.93) | 2-68 | m/z = 652.25($C_{48}H_{32}N_2O$ = 652.78) |
| 2-69 | m/z = 652.25($C_{48}H_{32}N_2O$ = 652.78) | 2-70 | m/z = 678.30($C_{51}H_{38}N_2$ = 678.86) |
| 2-71 | m/z = 657.32($C_{49}H_{31}D_5N_2$ = 657.85) | 2-72 | m/z = 576.26($C_{43}H_{32}N_2$ = 576.73) |
| 2-73 | m/z = 642.30($C_{48}H_{38}N_2$ = 642.83) | 2-74 | m/z = 766.33($C_{58}H_{42}N_2$ = 766.97) |
| 2-75 | m/z = 767.33($C_{57}H_{41}N_3$ = 767.96) | 2-76 | m/z = 708.26($C_{51}H_{36}N_2S$ = 708.91) |
| 2-77 | m/z = 692.28($C_{51}H_{36}N_2O$ = 692.84) | 2-78 | m/z = 706.26($C_{51}H_{34}N_2O_2$ = 706.83) |
| 2-79 | m/z = 722.24($C_{51}H_{34}N_2OS$ = 722.89) | 2-80 | m/z = 666.27($C_{49}H_{34}N_2O$ = 666.81) |
| 2-81 | m/z = 603.27($C_{44}H_{33}N_3$ = 603.75) | 2-82 | m/z = 778.33($C_{59}H_{42}N_2$ = 778.98) |
| 2-83 | m/z = 755.33($C_{56}H_{41}N_3$ = 755.94) | 2-84 | m/z = 802.33($C_{61}H_{42}N_2$ = 803.00) |
| 2-85 | m/z = 778.31($C_{57}H_{38}N_4$ = 778.94) | 2-86 | m/z = 890.37($C_{68}H_{46}N_2$ = 891.11) |
| 2-87 | m/z = 756.26($C_{55}H_{36}N_2S$ = 756.95) | 2-88 | m/z = 846.27($C_{61}H_{38}N_2OS$ = 847.03) |
| 2-89 | m/z = 776.32($C_{59}H_{40}N_2$ = 776.96) | 2-90 | m/z = 648.26($C_{49}H_{32}N_2$ = 648.79) |
| 2-91 | m/z = 800.32($C_{61}H_{40}N_2$ = 800.98) | 2-92 | m/z = 830.28($C_{61}H_{38}N_2S$ = 831.03) |
| 2-93 | m/z = 864.31($C_{65}H_{40}N_2O$ = 865.03) | 2-94 | m/z = 840.35($C_{64}H_{44}N_2$ = 841.05) |

TABLE 4-continued

| Compound | FD-MS | Compound | FD-MS |
|---|---|---|---|
| 2-95 | m/z = 936.35($C_{72}H_{44}N_2$ = 937.13) | 2-96 | m/z = 844.25($C_{61}H_{36}N_2OS$ = 845.02) |
| 2-97 | m/z = 927.36($C_{70}H_{45}N_3$ = 928.13) | 2-98 | m/z = 688.29($C_{52}H_{36}N_2$ = 688.86) |
| 2-99 | m/z = 652.29($C_{49}H_{35}N_2$ = 652.82) | 2-100 | m/z = 826.33($C_{63}H_{42}N_2$ = 827.02) |
| 2-101 | m/z = 702.27($C_{52}H_{34}N_2O$ = 702.84) | 2-102 | m/z = 688.29($C_{52}H_{36}N_2$ = 688.86) |
| 2-103 | m/z = 728.32($C_{55}H_{40}N_2$ = 728.92) | 2-104 | m/z = 884.29($C_{64}H_{40}N_2OS$ = 885.08) |
| 2-105 | m/z = 586.24($C_{44}H_{30}N_2$ = 586.72) | 2-106 | m/z = 718.24($C_{52}H_{34}N_2S$ = 718.90) |
| 2-107 | m/z = 732.22($C_{52}H_{32}N_2OS$ = 732.89) | 2-108 | m/z = 702.30($C_{53}H_{38}N_2$ = 702.88) |
| 2-109 | m/z = 688.29($C_{52}H_{36}N_2$ = 688.86) | 2-110 | m/z = 702.27($C_{52}H_{34}N_2O$ = 702.84) |
| 2-111 | m/z = 692.23($C_{50}H_{32}N_2S$ = 692.87) | 2-112 | m/z = 782.24($C_{56}H_{34}N_2OS$ = 782.95) |
| 2-113 | m/z = 738.30($C_{56}H_{38}N_2$ = 738.91) | 2-114 | m/z = 768.26($C_{56}H_{36}N_2S$ = 768.96) |
| 2-115 | m/z = 716.32($C_{54}H_{40}N_2$ = 716.91) | 2-116 | m/z = 857.29($C_{62}H_{39}N_3S$ = 858.06) |
| 2-117 | m/z = 738.30($C_{56}H_{38}N_2$ = 738.91) | 2-118 | m/z = 753.28($C_{55}H_{35}N_3O$ = 753.89) |
| 2-119 | m/z = 677.28($C_{50}H_{35}N_3$ = 677.83) | 2-120 | m/z = 879.32($C_{65}H_{41}N_3O$ = 880.04) |
| 2-121 | m/z = 612.26($C_{46}H_{32}N_2$ = 612.76) | 2-122 | m/z = 756.31($C_{56}H_{40}N_2O$ = 756.93) |
| 2-123 | m/z = 727.30($C_{54}H_{37}N_3$ = 727.89) | 2-124 | m/z = 866.37($C_{66}H_{46}N_2$ = 867.08) |
| 3-1 | m/z = 503.17($C_{36}H_{25}NS$ = 503.66) | 3-2 | m/z = 603.20($C_{44}H_{29}NS$ = 603.77) |
| 3-3 | m/z = 477.16($C_{34}H_{23}NS$ = 477.62) | 3-4 | m/z = 503.17($C_{36}H_{25}NS$ = 503.66) |
| 3-5 | m/z = 451.14($C_{32}H_{21}NS$ = 451.58) | 3-6 | m/z = 593.22($C_{43}H_{31}NS$ = 593.78) |
| 3-7 | m/z = 641.22($C_{47}H_{31}NS$ = 641.82) | 3-8 | m/z = 665.22($C_{49}H_{31}NS$ = 665.84) |
| 3-9 | m/z = 503.17($C_{36}H_{25}NS$ = 503.66) | 3-10 | m/z = 655.23($C_{48}H_{33}NS$ = 655.85) |
| 3-11 | m/z = 695.26($C_{51}H_{37}NS$ = 695.91) | 3-12 | m/z = 593.18($C_{42}H_{27}NOS$ = 593.73) |
| 3-13 | m/z = 583.14($C_{40}H_{25}NS_2$ = 583.76) | 3-14 | m/z = 579.20($C_{42}H_{29}NS$ = 579.75) |
| 3-15 | m/z = 685.19($C_{48}H_{31}NS_2$ = 685.90) | 3-16 | m/z = 719.23($C_{52}H_{33}NOS$ = 719.89) |
| 3-17 | m/z = 629.22($C_{46}H_{31}NS$ = 629.81) | 3-18 | m/z = 629.22($C_{46}H_{31}NS$ = 629.81) |
| 3-19 | m/z = 603.20($C_{44}H_{29}NS$ = 603.77) | 3-20 | m/z = 563.08($C_{36}H_{21}NS_3$ = 563.75) |
| 3-21 | m/z = 639.11($C_{42}H_{25}NS_3$ = 639.85) | 3-22 | m/z = 715.15($C_{48}H_{29}NS_3$ = 715.95) |
| 3-23 | m/z = 791.18($C_{54}H_{33}NS_3$ = 792.04) | 3-24 | m/z = 607.16($C_{42}H_{25}NO_2S$ = 607.72) |
| 3-25 | m/z = 633.21($C_{45}H_{31}NOS$ = 633.80) | 3-26 | m/z = 733.24($C_{53}H_{35}NOS$ = 733.92) |
| 3-27 | m/z = 883.29($C_{65}H_{41}NOS$ = 884.09) | 3-28 | m/z = 585.13($C_{38}H_{23}N_3S_2$ = 585.74) |
| 3-29 | m/z = 553.19($C_{40}H_{27}NS$ = 553.71) | 3-30 | m/z = 603.20($C_{44}H_{29}NS$ = 603.77) |
| 3-31 | m/z = 841.28($C_{63}H_{39}NS$ = 842.06) | 3-32 | m/z = 567.17($C_{40}H_{25}NOS$ = 567.71) |
| 3-33 | m/z = 563.22($C_{42}H_{29}NO$ = 563.69) | 3-34 | m/z = 563.22($C_{42}H_{29}NO$ = 563.69) |
| 3-35 | m/z = 613.24($C_{46}H_{31}NO$ = 613.74) | 3-36 | m/z = 703.29($C_{53}H_{37}NO$ = 703.87) |
| 3-37 | m/z = 587.22($C_{44}H_{29}NO$ = 587.71) | 3-38 | m/z = 639.26($C_{48}H_{33}NO$ = 639.78) |
| 3-39 | m/z = 639.26($C_{48}H_{33}NO$ = 639.78) | 3-40 | m/z = 653.24($C_{48}H_{31}NO_2$ = 653.77) |
| 3-41 | m/z = 603.26($C_{45}H_{33}NO$ = 603.75) | 3-42 | m/z = 727.29($C_{55}H_{37}NO$ = 727.89) |
| 3-43 | m/z = 725.27($C_{55}H_{35}NO$ = 725.87) | 3-44 | m/z = 595.17($C_{40}H_{25}N_3OS$ = 595.71) |
| 3-45 | m/z = 567.26($C_{42}H_{33}NO$ = 567.72) | 3-46 | m/z = 611.22($C_{46}H_{29}NO$ = 611.73) |
| 3-47 | m/z = 617.18($C_{44}H_{27}NOS$ = 617.76) | 3-48 | m/z = 637.24($C_{48}H_{31}NO$ = 637.77) |
| 3-49 | m/z = 667.21($C_{48}H_{29}NO_3$ = 667.75) | 3-50 | m/z = 767.25($C_{56}H_{33}NO_3$ = 767.87) |
| 3-51 | m/z = 681.27($C_{50}H_{35}NO_2$ = 681.82) | 3-52 | m/z = 567.17($C_{40}H_{25}NOS$ = 567.71 |
| 3-53 | m/z = 658.22($C_{45}H_{30}N_4S$ = 658.82) | 3-54 | m/z = 655.23($C_{48}H_{33}NS$ = 655.86) |
| 3-55 | m/z = 744.26($C_{54}H_{35}N_2S$ = 744.96) | 3-56 | m/z = 784.27($C_{55}H_{36}N_4S$ = 784.98) |
| 3-57 | m/z = 553.19($C_{40}H_{27}NS$ = 553.72) | 3-58 | m/z = 553.19($C_{40}H_{27}NS$ = 553.72) |
| 3-59 | m/z = 543.2($C_{39}H_{29}NS$ = 543.73) | 3-60 | m/z = 671.21($C_{48}H_{30}FNS$ = 671.83) |
| 3-61 | m/z = 641.25($C_{46}H_{31}N_3O$ = 641.77) | 3-62 | m/z = 639.26($C_{48}H_{33}NO$ = 639.8) |
| 3-63 | m/z = 652.25($C_{48}H_{32}N_2O$ = 652.8) | 3-64 | m/z = 667.25($C_{49}H_{33}NO_2$ = 667.81) |
| 3-65 | m/z = 567.17($C_{40}H_{25}NOS$ = 567.71) | 3-66 | m/z = 567.17($C_{40}H_{25}NOS$ = 567.71) |
| 3-67 | m/z = 731.23($C_{53}H_{33}NOS$ = 731.91) | 3-68 | m/z = 731.23($C_{53}H_{33}NOS$ = 731.91) |
| 3-69 | m/z = 683.23($C_{49}H_{33}NOS$ = 683.87) | 3-70 | m/z = 551.19($C_{40}H_{25}NO_2$ = 551.65) |
| 3-71 | m/z = 643.2($C_{46}H_{29}NOS$ = 643.8) | 3-72 | m/z = 601.2($C_{44}H_{27}NO_2$ = 601.71) |
| 3-73 | m/z = 607.2($C_{43}H_{29}NOS$ = 607.77) | 3-74 | m/z = 701.28($C_{50}H_{39}NOS$ = 701.93) |
| 3-75 | m/z = 577.24($C_{43}H_{31}NO$ = 577.73) | 3-76 | m/z = 567.17($C_{40}H_{25}NOS$ = 567.71) |
| 4-1 | m/z = 513.25($C_{39}H_{31}N$ = 513.68) | 4-2 | m/z = 613.28($C_{47}H_{35}N$ = 613.80) |
| 4-3 | m/z = 665.31($C_{51}H_{39}N$ = 665.88) | 4-4 | m/z = 705.34($C_{54}H_{43}N$ = 705.95) |
| 4-5 | m/z = 593.31($C_{45}H_{39}N$ = 593.81) | 4-6 | m/z = 589.28($C_{45}H_{35}N$ = 589.78) |
| 4-7 | m/z = 513.25($C_{39}H_{31}N$ = 513.68) | 4-8 | m/z = 639.29($C_{49}H_{37}N$ = 639.84) |
| 4-9 | m/z = 589.28($C_{45}H_{35}N$ = 589.78) | 4-10 | m/z = 665.31($C_{51}H_{39}N$ = 665.88) |
| 4-11 | m/z = 553.28($C_{42}H_{35}N$ = 553.75) | 4-12 | m/z = 669.34($C_{51}H_{43}N$ = 669.91) |
| 4-13 | m/z = 779.36($C_{60}H_{45}N$ = 780.03) | 4-14 | m/z = 761.35($C_{56}H_{47}NSi$ = 762.08) |
| 4-15 | m/z = 705.34($C_{54}H_{43}N$ = 705.95) | 4-16 | m/z = 589.28($C_{45}H_{35}N$ = 589.78) |
| 4-17 | m/z = 665.31($C_{51}H_{39}N$ = 665.88) | 4-18 | m/z = 728.3 2($C_{55}H_{40}N2$ = 728.94) |
| 4-19 | m/z = 637.28($C_{49}H_{35}N$ = 637.83) | 4-20 | m/z = 789.34($C_{61}H_{43}N$ = 790.02) |
| 4-21 | m/z = 677.31($C_{52}H_{39}N$ = 677.89) | 4-22 | m/z = 775.32($C_{60}H_{41}N$ = 776.00) |
| 4-23 | m/z = 801.34($C_{62}H_{43}N$ = 802.03) | 4-24 | m/z = 799.32($C_{62}H_{41}N$ = 800.02) |
| 4-25 | m/z = 965.40($C_{75}H_{51}N$ = 966.24) | 4-26 | m/z = 637.28($C_{49}H_{35}N$ = 637.83) |
| 4-27 | m/z = 635.26($C_{49}H_{33}N$ = 635.81) | 4-28 | m/z = 616.29($C_{47}H_{28}D_5N$ = 616.82) |
| 4-29 | m/z = 727.32($C_{56}H_{41}N$ = 727.95) | 4-30 | m/z = 687.29($C_{53}H_{37}N$ = 687.89) |
| 4-31 | m/z = 877.37($C_{68}H_{47}N$ = 878.13) | 4-32 | m/z = 753.34($C_{58}H_{43}N$ = 753.99) |
| 4-33 | m/z = 689.31($C_{53}H_{39}N$ = 689.90) | 4-34 | m/z = 637.28($C_{49}H_{35}N$ = 637.83) |
| 4-35 | m/z = 850.32($C_{52}H_{40}F_2N_2$ = 851.01) | 4-36 | m/z = 559.23($C_{43}H_{29}N$ = 559.71) |
| 4-37 | m/z = 635.26($C_{49}H_{33}N$ = 635.81) | 4-38 | m/z = 663.29($C_{51}H_{37}N$ = 663.86) |
| 4-39 | m/z = 735.29($C_{57}H_{37}N$ = 735.93) | 4-40 | m/z = 735.29($C_{57}H_{37}N$ = 735.93) |
| 4-41 | m/z = 725.31($C_{56}H_{39}N$ = 725.94) | 4-42 | m/z = 735.29($C_{57}H_{37}N$ = 735.93) |
| 4-43 | m/z = 751.32($C_{58}H_{41}N$ = 751.97) | 4-44 | m/z = 725.31($C_{56}H_{39}N$ = 725.94) |
| 4-45 | m/z = 675.29($C_{52}H_{37}N$ = 675.88) | 4-46 | m/z = 675.29($C_{52}H_{37}N$ = 675.88) |
| 4-47 | m/z = 751.32($C_{58}H_{41}N$ = 751.97) | 4-48 | m/z = 675.29($C_{52}H_{37}N$ = 675.88) |
| 4-49 | m/z = 721.28($C_{56}H_{35}N$ = 721.90) | 4-50 | m/z = 797.31($C_{62}H_{39}N$ = 798.00) |

TABLE 4-continued

| Compound | FD-MS | Compound | FD-MS |
|---|---|---|---|
| 4-51 | m/z = 959.36($C_{75}H_{45}N$ = 960.19) | 4-52 | m/z = 607.23($C_{47}H_{29}N$ = 607.76) |
| 4-53 | m/z = 675.29($C_{52}H_{37}N$ = 675.88) | 4-54 | m/z = 635.26($C_{49}H_{33}N$ = 635.81) |
| 4-55 | m/z = 640.29($C_{49}H_{28}D_5N$ = 640.84) | 4-56 | m/z = 685.28($C_{53}H_{35}N$ = 685.87) |
| 4-57 | m/z = 735.29($C_{57}H_{37}N$ = 735.93) | 4-58 | m/z = 583.23($C_{45}H_{29}N$ = 583.73) |
| 4-59 | m/z = 725.31($C_{56}H_{39}N$ = 725.94) | 4-60 | m/z = 725.31($C_{56}H_{39}N$ = 725.94) |
| 4-61 | m/z = 635.26($C_{49}H_{33}N$ = 635.81) | 4-62 | m/z = 751.32($C_{58}H_{41}N$ = 751.97) |
| 4-63 | m/z = 751.32($C_{58}H_{41}N$ = 751.97) | 4-64 | m/z = 751.32($C_{58}H_{41}N$ = 751.97) |
| 4-65 | m/z = 842.37($C_{64}H_{46}N2$ = 843.09) | 4-66 | m/z = 751.32($C_{58}H_{41}N$ = 751.97) |
| 4-67 | m/z = 873.34($C_{68}H_{43}N$ = 874.10) | 4-68 | m/z = 711.29($C_{55}H_{37}N$ = 711.91) |
| 4-69 | m/z = 751.32($C_{58}H_{41}N$ = 751.97) | 4-70 | m/z = 787.32($C_{61}H_{41}N$ = 788.01) |
| 5-1 | m/z = 583.23($C_{45}H_{29}N$ = 583.73) | 5-2 | m/z = 609.25($C_{47}H_{31}N$ = 609.77) |
| 5-3 | m/z = 685.28($C_{53}H_{35}N$ = 685.87) | 5-4 | m/z = 659.26($C_{51}H_{33}N$ = 659.83) |
| 5-5 | m/z = 607.23($C_{47}H_{29}N$ = 607.76) | 5-6 | m/z = 685.28($C_{53}H_{35}N$ = 685.87) |
| 5-7 | m/z = 664.29($C_{51}H_{28}D_5N$ = 664.86) | 5-8 | m/z = 649.28($C_{50}H_{35}N$ = 649.84) |
| 5-9 | m/z = 699.29($C_{54}H_{37}N$ = 699.90) | 5-10 | m/z = 699.29($C_{54}H_{37}N$ = 699.90) |
| 5-11 | m/z = 725.31($C_{56}H_{39}N$ = 725.94) | 5-12 | m/z = 739.32($C_{57}H_{41}N$ = 739.96) |
| 5-13 | m/z = 730.34($C_{56}H_{34}D_5N$ = 730.97) | 5-14 | m/z = 775.32($C_{60}H_{41}N$ = 776.00) |
| 5-15 | m/z = 775.32($C_{60}H_{41}N$ = 776.00) | 5-16 | m/z = 775.32($C_{60}H_{41}N$ = 776.00) |
| 5-17 | m/z = 725.31($C_{56}H_{39}N$ = 725.94) | 5-18 | m/z = 773.31($C_{60}H_{39}N$ = 773.98) |
| 5-19 | m/z = 725.31($C_{56}H_{39}N$ = 725.94) | 5-20 | m/z = 774.30($C_{59}H_{38}N_2$ = 774.97) |
| 5-21 | m/z = 639.20($C_{47}H_{29}NS$ = 639.82) | 5-22 | m/z = 699.26($C_{53}H_{33}NO$ = 699.85) |
| 5-23 | m/z = 775.29($C_{59}H_{37}NO$ = 775.95) | 5-24 | m/z = 775.29($C_{59}H_{37}NO$ = 775.95) |
| 5-25 | m/z = 865.30($C_{65}H_{39}NO_2$ = 866.03) | 5-26 | m/z = 583.23($C_{45}H_{29}N$ = 583.73) |
| 5-27 | m/z = 685.28($C_{53}H_{35}N$ = 685.87) | 5-28 | m/z = 649.28($C_{50}H_{35}N$ = 649.84) |
| 5-29 | m/z = 699.29($C_{54}H_{37}N$ = 699.90) | 5-30 | m/z = 725.31($C_{56}H_{39}N$ = 725.94) |
| 5-31 | m/z = 725.31($C_{56}H_{39}N$ = 725.94) | 5-32 | m/z = 775.32($C_{60}H_{41}N$ = 776.00) |
| 5-33 | m/z = 775.32($C_{60}H_{41}N$ = 776.00) | 5-34 | m/z = 775.32($C_{60}H_{41}N$ = 776.00) |
| 5-35 | m/z = 699.29($C_{54}H_{37}N$ = 699.90) | 5-36 | m/z = 773.31($C_{60}H_{39}N$ = 773.98) |
| 5-37 | m/z = 715.23($C_{53}H_{33}NS$ = 715.91) | 5-38 | m/z = 739.29($C_{56}H_{37}NO$ = 739.92) |
| 5-39 | m/z = 699.26($C_{53}H_{33}NO$ = 699.85) | 5-40 | m/z = 662.25($C_{48}H_{30}N_4$ = 662.80) |
| 5-41 | m/z = 685.28($C_{53}H_{35}N$ = 685.87) | 5-42 | m/z = 685.28($C_{53}H_{35}N$ = 685.87) |
| 5-43 | m/z 633.25($C_{49}H_{31}N$ = 633.79) | 5-44 | m/z = 649.28($C_{50}H_{35}N$ = 649.84) |
| 5-45 | m/z = 725.31($C_{56}H_{39}N$ = 725.94) | 5-46 | m/z = 725.31($C_{56}H_{39}N$ = 725.94) |
| 5-47 | m/z = 801.34($C_{62}H_{43}N$ = 802.03) | 5-48 | m/z = 725.31($C_{56}H_{39}N$ = 725.94) |
| 5-49 | m/z = 849.34($C_{66}H_{43}N$ = 850.08) | 5-50 | m/z = 850.33($C_{65}H_{42}N_2$ = 851.07) |
| 5-51 | m/z = 689.22($C_{51}H_{31}NS$ = 689.88) | 5-52 | m/z = 623.22($C_{47}H_{29}NO$ = 623.76) |
| 5-53 | m/z = 775.29($C_{59}H_{37}NO$ = 775.95) | 5-54 | m/z = 699.26($C_{53}H_{33}NO$ = 699.85) |
| 5-55 | m/z = 715.23($C_{53}H_{33}NS$ = 715.91) | 5-56 | m/z = 690.31($C_{53}H_{30}D_5N$ = 690.90) |
| 5-57 | m/z = 787.32($C_{61}H_{41}N$ = 788.01) | 5-58 | m/z = 699.29($C_{54}H_{37}N$ = 699.90) |
| 5-59 | m/z = 725.31($C_{56}H_{39}N$ = 725.94) | 5-60 | m/z = 715.23($C_{53}H_{33}NS$ = 715.91) |
| 5-61 | m/z = 633.25($C_{49}H_{31}N$ = 633.79) | 5-62 | m/z = 583.23($C_{45}H_{29}N$ = 583.73) |
| 5-63 | m/z = 865.33($C_{66}H_{43}NO$ = 866.08) | 5-64 | m/z = 821.31($C_{64}H_{39}N$ = 822.02) |
| 5-65 | m/z = 698.27($C_{53}H_{34}N_2$ = 698.87) | 5-66 | m/z = 659.26($C_{51}H_{33}N$ = 659.83) |
| 5-67 | m/z = 649.28($C_{50}H_{35}N$ = 649.84) | 5-68 | m/z = 849.34($C_{66}H_{43}N$ = 850.08) |
| 5-69 | m/z = 850.33($C_{65}H_{42}N_2$ = 851.07) | 5-70 | m/z = 825.30($C_{63}H_{39}NO$ = 826.01) |
| 5-71 | m/z = 583.23($C_{45}H_{29}N$ = 583.73) | 5-72 | m/z = 685.28($C_{53}H_{35}N$ = 685.87) |
| 5-73 | m/z = 693.32($C_{53}H_{23}D_{10}N$ = 693.92) | 5-74 | m/z = 699.29($C_{54}H_{37}N$ = 699.90) |
| 5-75 | m/z = 725.31($C_{56}H_{39}N$ = 725.94) | 5-76 | m/z = 775.32($C_{60}H_{41}N$ = 776.00) |
| 5-77 | m/z = 725.31($C_{56}H_{39}N$ = 725.94) | 5-78 | m/z = 849.34($C_{66}H_{43}N$ = 850.08) |
| 5-79 | m/z = 765.31($C_{57}H_{39}N_3$ = 765.96) | 5-80 | m/z = 775.29($C_{59}H_{37}NO$ = 775.95) |
| 5-81 | m/z = 685.28($C_{53}H_{35}N$ = 685.87) | 5-82 | m/z = 609.25($C_{47}H_{31}N$ = 609.77) |
| 5-83 | m/z = 785.31($C_{61}H_{39}N$ = 785.99) | 5-84 | m/z = 725.31($C_{56}H_{39}N$ = 725.94) |
| 5-85 | m/z = 729.21($C_{53}H_{31}NOS$ = 729.90) | 5-86 | m/z = 583.23($C_{45}H_{29}N$ = 583.73) |
| 5-87 | m/z = 685.28($C_{53}H_{35}N$ = 685.87) | 5-88 | m/z = 735.29 (C57H37N=) |
| 5-89 | m/z = 685.28($C_{53}H_{35}N$ = 685.87) | 5-90 | m/z = 685.28($C_{53}H_{35}N$ = 685.87) |
| 5-91 | m/z = 725.31($C_{56}H_{39}N$ = 725.94) | 5-92 | m/z = 749.31($C_{58}H_{39}N$ = 749.96) |
| 5-93 | m/z = 725.31($C_{56}H_{39}N$ = 725.94) | 5-94 | m/z = 725.31($C_{56}H_{39}N$ = 725.94) |
| 5-95 | m/z = 725.31($C_{56}H_{39}N$ = 725.94) | 5-96 | m/z = 773.31($C_{60}H_{39}N$ = 773.98) |
| 5-97 | m/z = 850.33($C_{65}H_{42}N_2$ = 851.07) | 5-98 | m/z = 699.26($C_{53}H_{33}NO$ = 699.85) |
| 5-99 | m/z = 715.23($C_{53}H_{33}NS$ = 715.91) | 5-100 | m/z = 739.29($C_{56}H_{37}NO$ = 739.92) |
| 5-101 | m/z = 709.28($C_{55}H_{35}N$ = 709.89) | 5-102 | m/z = 749.31($C_{58}H_{39}N$ = 749.96) |
| 5-103 | m/z = 901.37($C_{70}H_{47}N$ = 902.15) | 5-104 | m/z = 660.26($C_{50}H_{32}N_2$ = 660.82) |
| 5-105 | m/z = 673.24($C_{51}H_{31}NO$ = 673.82) | 5-106 | m/z = 685.28($C_{53}H_{35}N$ = 685.87) |
| 5-107 | m/z = 775.32($C_{60}H_{41}N$ = 776.00) | 5-108 | m/z = 772.29(C59H36N2 = 772.95) |
| 5-109 | m/z = 928.38($C_{71}H_{48}N_2$ = 929.18) | 5-110 | m/z = 941.31($C_{71}H_{43}NS$ = 942.19) |
| 5-111 | m/z = 836.32($C_{64}H_{40}N_2$ = 837.04) | 5-112 | m/z = 913.35($C_{69}H_{43}N_3$ = 914.12) |
| 5-113 | m/z = 800.28($C_{60}H_{36}N_2O$ = 800.96) | 5-114 | m/z = 841.28($C_{63}H_{39}NS$ = 842.07) |
| 5-115 | m/z = 877.37($C_{68}H_{47}N$ = 878.13) | | |
| 6-1 | m/z = 713.31($C_{55}H_{39}N$ = 713.92) | 6-2 | m/z = 589.28($C_{45}H_{35}N$ = 589.78) |
| 6-3 | m/z = 639.29($C_{49}H_{37}N$ = 639.84) | 6-4 | m/z = 613.28($C_{47}H_{35}N$ = 613.8) |
| 6-5 | m/z = 601.28($C_{46}H_{35}N$ = 601.79) | 6-6 | m/z = 677.31 ($C_{52}H_{39}N$ = 677.89) |
| 6-7 | m/z = 777.3($C_{59}H_{39}NO$ = 777.97) | 6-8 | m/z = 651.26($C_{49}H_{33}NO$ = 651.81) |
| 6-9 | m/z = 577.24($C_{43}H_{31}NO$ = 577.73) | 6-10 | m/z = 593.22($C_{43}H_{31}NS$ = 593.79) |
| 6-11 | m/z = 577.24($C_{43}H_{31}NO$ = 577.73) | 6-12 | m/z = 627.26($C_{47}H_{33}NO$ = 627.79) |
| 6-13 | m/z = 679.32($C_{52}H_{41}N$ = 679.91) | 6-14 | m/z = 651.29($C_{50}H_{37}N$ = 651.85) |
| 6-15 | m/z = 725.31($C_{56}H_{39}N$ = 725.94) | 6-16 | m/z = 725.31($C_{56}H_{39}N$ = 725.94) |
| 6-17 | m/z = 677.31($C_{52}H_{39}N$ = 677.89) | 6-18 | m/z = 601.28($C_{46}H_{35}N$ = 601.79) |
| 6-19 | m/z = 691.29($C_{52}H_{37}NO$ = 691.87) | 6-20 | m/z = 691.29($C_{52}H_{37}NO$ = 691.87) |

TABLE 4-continued

| Compound | FD-MS | Compound | FD-MS |
|---|---|---|---|
| 6-21 | m/z = 691.29($C_{52}H_{37}NO$ = 691.87) | 6-22 | m/z = 689.27($C_{52}H_{35}NO$ = 689.86) |
| 6-23 | m/z = 767.32($C_{58}H_{41}NO$ = 767.97) | 6-24 | m/z = 767.32($C_{58}H_{41}NO$ = 767.97) |
| 6-25 | m/z = 767.32($C_{58}H_{41}NO$ = 767.97) | 6-26 | m/z = 765.3($C_{58}H_{39}NO$ = 765.96) |
| 6-27 | m/z = 677.31($C_{52}H_{39}N$ = 677.89) | 6-28 | m/z = 753.34($C_{58}H_{43}N$ = 753.99) |
| 6-29 | m/z = 753.34($C_{58}H_{43}N$ = 753.99) | 6-30 | m/z = 819.33($C_{61}H_{45}NSi$ = 820.12) |
| 6-31 | m/z = 824.36($C_{61}H_{40}D_5NSi$ = 825.15) | 6-32 | m/z = 725.31(C56H39N = 725.94) |
| 6-33 | m/z = 727.32(C56H41N = 727.95) | 6-34 | m/z = 751.32(C58H41N = 751.97) |
| 34 | m/z = 751.32(C58H41N = 751.97) | | |
| 7-1 | m/z = 760.29($C_{55}H_{40}N_2S$ = 761) | 7-2 | m/z = 744.31 ($C_{55}H_{40}N_2O$ = 744.94) |
| 7-3 | m/z = 680.32($C_{51}H_{40}N_2$ = 680.9) | 7-4 | m/z = 720.35($C_{54}H_{44}N_2$ = 720.96) |
| 7-5 | m/z = 528.26($C_{39}H_{32}N_2$ = 528.7) | 7-6 | m/z = 578.27($C_{43}H_{34}N_2$ = 578.76) |
| 7-7 | m/z = 680.32($C_{51}H_{40}N_2$ = 680.9) | 7-8 | m/z = 634.24($C_{45}H_{34}N_2S$ = 634.84) |
| 7-9 | m/z = 618.27($C_{45}H_{34}N_2O$ = 618.78) | 7-10 | m/z = 634.24($C_{45}H_{34}N_2S$ = 634.84) |
| 7-11 | m/z = 618.27($C_{45}H_{34}N_2O$ = 618.78) | 7-12 | m/z = 652.29($C_{49}H_{36}N_2$ = 652.84) |
| 7-13 | m/z = 720.35($C_{54}H_{44}N_2$ = 720.96) | 7-14 | m/z = 760.38($C_{57}H_{48}N_2$ = 761.03) |
| 7-15 | m/z = 693.31($C_{51}H_{39}N_3$ = 693.89) | 7-16 | m/z = 584.32($C_{43}H_{40}N_2$ = 584.81) |
| 7-17 | m/z = 752.32($C_{57}H_{40}N_2$ = 752.96) | 7-18 | m/z = 742.33($C_{56}H_{42}N_2$ = 742.97) |
| 7-19 | m/z = 758.28($C_{55}H_{38}N_2S$ = 758.98) | 7-20 | m/z = 768.35($C_{58}H_{44}N_2$ = 769) |
| 7-21 | m/z = 650.27($C_{49}H_{34}N_2$ = 650.83) | 7-22 | m/z = 766.33($C_{58}H_{42}N_2$ = 766.99) |
| 7-23 | m/z = 750.3($C_{57}H_{38}N_2$ = 750.95) | 7-24 | m/z = 646.24($C_{49}H_{30}N_2$ = 646.79) |
| 7-25 | m/z = 817.35($C_{61}H_{43}N_3$ = 818.04) | 7-26 | m/z = 756.26($C_{55}H_{36}N_2S$ = 756.97) |
| 7-27 | m/z = 830.29($C_{51}H_{38}N_2O_2$ = 830.99) | 7-28 | m/z = 815.33($C_{61}H_{41}N_3$ = 816.02) |
| 7-29 | m/z = 694.33($C_{52}H_{42}N_2$ = 694.92) | 7-30 | m/z = 668.28($C_{49}H_{36}N_2O$ = 668.84) |
| 7-31 | m/z = 710.28($C_{51}H_{38}N_2S$ = 710.94) | 7-32 | m/z = 684.26($C_{49}H_{36}N_2S$ = 684.9) |
| 7-33 | m/z = 668.28($C_{49}H_{36}N_2O$ = 668.84) | 7-34 | m/z = 604.29($C_{45}H_{36}N_2$ = 604.8) |
| 7-35 | m/z = 630.3($C_{47}H_{38}N_2$ = 630.84) | 7-36 | m/z = 708.29($C_{52}H_{37}FN_2$ = 708.88) |
| 7-37 | m/z = 830.37($C_{63}H_{46}N_2$ = 831.08) | 7-38 | m/z = 808.29($C_{59}H_{40}N_2S$ = 809.04) |
| 7-39 | m/z = 844.38($C_{64}H_{48}N_2$ = 845.1) | 7-40 | m/z = 834.31($C_{51}H_{42}N_2S$ = 835.08) |
| 7-41 | m/z = 742.3($C_{55}H_{38}N_2O$ = 742.92) | 7-42 | m/z = 968.41($C_{74}H_{52}N_2$ = 969.24) |
| 7-43 | m/z = 690.3($C_{52}H_{38}N_2$ = 690.89) | 7-44 | m/z = 802.33($C_{61}H_{42}N_2$ = 803.02) |
| 7-45 | m/z = 816.31($C_{61}H_{40}N_2O$ = 817) | 7-46 | m/z = 708.26($C_{51}H_{36}N_2S$ = 708.92) |
| 7-47 | m/z = 832.29($C_{61}H_{40}N_2S$ = 833.07) | 7-48 | m/z = 694.3($C_{51}H_{38}N_2O$ = 694.88) |
| 7-49 | m/z = 818.37($C_{62}H_{46}N_2$ = 819.06) | 7-50 | m/z = 802.33($C_{61}H_{42}N_2$ = 803.02) |
| 7-51 | m/z = 769.35($C_{57}H_{43}N_3$ = 769.99) | | |
| 8-1 | m/z = 385.15($C_{28}H_{19}NO$ = 385.47) | 8-2 | m/z = 553.19($C_{40}H_{27}NS$ = 553.72) |
| 8-3 | m/z = 511.23($C_{39}H_{29}N$ = 511.67) | 8-4 | m/z = 501.21 ($C_{37}H_{27}NO$ = 501.63) |
| 8-5 | m/z = 583.14($C_{40}H_{25}NS_2$ = 583.77) | 8-6 | m/z = 511.23($C_{39}H_{29}N$ = 511.67) |
| 8-7 | m/z = 501.21($C_{37}H_{27}NO$ = 501.63) | 8-8 | m/z = 501.16($C_{36}H_{23}NS$ = 501.65) |
| 8-9 | m/z = 593.22($C_{43}H_{31}NS$ = 593.79) | 8-10 | m/z = 567.17($C_{40}H_{25}NOS$ = 567.71) |
| 8-11 | m/z = 661.28($C_{51}H_{35}N$ = 661.85) | 8-12 | m/z = 613.24($C_{46}H_{31}NO$ = 613.76) |
| 8-13 | m/z = 567.17($C_{40}H_{25}NOS$ = 567.71) | 8-14 | m/z = 669.25($C_{49}H_{35}NS$ = 669.89) |
| 8-15 | m/z = 777.30($C_{59}H_{39}NO$ = 777.97) | 8-16 | m/z = 643.20($C_{46}H_{29}NOS$ = 643.8) |
| 8-17 | m/z = 774.30($C_{59}H_{38}N_2$ = 774.97) | 8-18 | m/z = 702.27($C_{52}H_{34}N_2O$ = 702.86) |
| 8-19 | m/z = 593.21($C_{40}H_{15}D_{10}NS_2$ = 593.83) | 8-20 | m/z = 841.37($C_{65}H_{47}N$ = 842.10) |
| 8-21 | m/z = 461.18($C_{34}H_{23}NO$ = 461.56) | 8-22 | m/z = 491.13($C_{34}H_{21}NOS$ = 491.61) |
| 8-23 | m/z = 511.23($C_{39}H_{29}N$ = 511.67) | 8-24 | m/z = 553.19($C_{40}H_{27}NS$ = 553.72) |
| 8-25 | m/z = 725.31($C_{56}H_{39}N$ = 725.94) | 8-26 | m/z = 541.15($C_{38}H_{23}NOS$ = 541.67) |
| 8-27 | m/z = 583.14($C_{40}H_{25}NS_2$ = 583.77) | 8-28 | m/z = 557.24($C_{43}H_{31}NO$ = 557.73) |
| 8-29 | m/z = 567.17($C_{40}H_{25}NOS$ = 567.71) | 8-30 | m/z = 727.32($C_{56}H_{41}N$ = 727.95) |
| 8-31 | m/z = 627.22($C_{46}H_{29}NO_2$ = 627.74) | 8-32 | m/z = 593.22($C_{43}H_{31}NS$ = 593.79) |
| 8-33 | m/z = 723.39($C_{55}H_{49}N$ = 724.00) | 8-34 | m/z = 567.17($C_{40}H_{25}NOS$ = 567.71) |
| 8-35 | m/z = 643.23($C_{47}H_{33}NS$ = 643.85) | 8-36 | m/z = 567.17($C_{40}H_{25}NOS$ = 567.71) |
| 8-37 | m/z = 583.14($C_{40}H_{25}NS_2$ = 583.77) | 8-38 | m/z = 563.26($C_{43}H_{33}N$ = 563.74) |
| 8-39 | m/z = 567.17($C_{40}H_{25}NOS$ = 567.71) | 8-40 | m/z = 629.22($C_{46}H_{31}NS$ = 629.82) |
| 8-41 | m/z = 537.21($C_{40}H_{27}NO$ = 537.66) | 8-42 | m/z = 437.10($C_{28}H_{17}F_2NS$ = 437.51) |
| 8-43 | m/z = 461.19($C_{33}H_{23}N_3$ = 461.57) | 8-44 | m/z = 551.19($C_{40}H_{25}NO_2$ = 551.65) |
| 8-45 | m/z = 567.20($C_{41}H_{29}NS$ = 567.75) | 8-46 | m/z = 593.22($C_{43}H_{31}NS$ = 593.79) |
| 8-47 | m/z = 601.20($C_{44}H_{27}NO_2$ = 601.71) | 8-48 | m/z = 659.17($C_{46}H_{29}NS_2$ = 659.87) |
| 8-49 | m/z = 749.27($C_{57}H_{35}NO$ = 749.91) | 8-50 | m/z = 643.20($C_{46}H_{29}NOS$ = 643.80) |
| 8-51 | m/z = 537.21($C_{40}H_{27}NO$ = 537.66) | 8-52 | m/z = 567.17($C_{40}H_{25}NOS$ = 567.71) |
| 8-53 | m/z = 577.28($C_{44}H_{35}N$ = 577.77) | 8-54 | m/z = 623.23($C_{44}H_{33}NOS$ = 623.81) |
| 8-55 | m/z = 582.12($C_{39}H_{22}N_2S_2$ = 582.74) | 8-56 | m/z = 793.28($C_{59}H_{39}NS$ = 794.03) |
| 8-57 | m/z = 561.21($C_{42}H_{27}NO$ = 561.68) | 8-58 | m/z = 669.25($C_{49}H_{35}NS$ = 669.89) |
| 8-59 | m/z = 715.23($C_{53}H_{33}NS$ = 715.91) | 8-60 | m/z = 643.20($C_{53}H_{33}NS$ = 643.80) |
| 8-61 | m/z = 669.25($C_{49}H_{35}NS$ = 669.89) | 8-62 | m/z = 759.26($C_{55}H_{37}NOS$ = 759.97) |
| 8-63 | m/z = 643.20($C_{46}H_{29}NOS$ = 643.80) | 8-64 | m/z = 659.17($C_{46}H_{29}NS_2$ = 659.87) |
| 8-65 | m/z = 807.26($C_{59}H_{37}NOS$ = 808.01) | 8-66 | m/z = 501.21($C_{37}H_{27}NO$ = 501.63) |
| 8-67 | m/z = 553.19($C_{40}H_{27}NS$ = 553.72) | 8-68 | m/z = 593.22($C_{43}H_{31}NS$ = 593.79) |
| 8-69 | m/z = 485.18($C_{36}H_{23}NO$ = 485.59) | 8-70 | m/z = 567.17($C_{40}H_{25}NOS$ = 567.71) |
| 8-71 | m/z = 809.31($C_{60}H_{43}NS$ = 810.07) | 8-72 | m/z = 593.27($C_{44}H_{35}NO$ = 593.77) |
| 8-73 | m/z = 583.14($C_{40}H_{25}NS_2$ = 583.77) | 8-74 | m/z = 593.27($C_{44}H_{35}NO$ = 593.77) |
| 8-75 | m/z = 659.23($C_{47}H_{33}NOS$ = 659.85) | 8-76 | m/z = 759.26($C_{55}H_{37}NOS$ = 759.97) |
| 8-77 | m/z = 593.22($C_{43}H_{31}NS$ = 593.79) | 8-78 | m/z = 567.17($C_{40}H_{25}NOS$ = 567.71) |
| 8-79 | m/z = 667.20($C_{48}H_{29}NOS$ = 667.83) | 8-80 | m/z = 698.27($C_{53}H_{34}N_2$ = 698.87) |
| 8-81 | m/z = 567.17($C_{40}H_{25}NOS$ = 567.71) | 8-82 | m/z = 501.16($C_{36}H_{23}NS$ = 501.65) |
| 8-83 | m/z = 593.22($C_{43}H_{31}NS$ = 593.79) | 8-84 | m/z = 537.21($C_{40}H_{27}NO$ = 537.66) |
| 8-85 | m/z = 553.19($C_{40}H_{27}NS$ = 553.72) | 8-86 | m/z = 593.22($C_{43}H_{31}NS$ = 593.79) |
| 8-87 | m/z = 537.21($C_{40}H_{27}NO$ = 537.66) | 8-88 | m/z = 642.21 ($C_{46}H_{30}N_2S$ = 642.82) |

TABLE 4-continued

| Compound | FD-MS | Compound | FD-MS |
|---|---|---|---|
| 8-89 | m/z = 725.31($C_{56}H_{39}N$ = 725.94) | 8-90 | m/z = 551.19($C_{40}H_{25}NO_2$ = 551.65) |
| 8-91 | m/z = 567.17($C_{40}H_{25}NOS$ = 567.71) | 8-92 | m/z = 593.22($C_{43}H_{31}NS$ = 593.79) |
| 8-93 | m/z = 577.24($C_{43}H_{31}NO$ = 577.73) | 8-94 | m/z = 583.14($C_{40}H_{25}NS_2$ = 583.77) |
| 8-95 | m/z = 701.27($C_{53}H_{35}NO$ = 701.87) | 8-96 | m/z = 525.17($C_{38}H_{23}NO_2$ = 525.61) |
| 8-97 | m/z = 527.17($C_{38}H_{25}NS$ = 527.69) | 8-98 | m/z = 567.20($C_{41}H_{29}NS$ = 567.75) |
| 8-99 | m/z = 541.15($C_{38}H_{23}NOS$ = 541.67) | 8-100 | m/z = 527.17($C_{38}H_{25}NS$ = 527.69) |
| 8-101 | m/z = 583.23($C_{45}H_{29}N$ = 583.73) | 8-102 | m/z = 551.22($C_{41}H_{29}NO$ = 551.69) |
| 8-103 | m/z = 603.20($C_{44}H_{29}NS$ = 603.78) | 8-104 | m/z = 585.25($C_{45}H_{31}N$ = 585.75) |
| 10-1 | m/z = 618.21($C_{44}H_{30}N_2S$ = 618.80) | 10-2 | m/z = 700.20($C_{48}H_{32}N_2S_2$ = 700.92) |
| 10-3 | m/z = 708.22($C_{50}H_{32}N_2OS$ = 708.88) | 10-4 | m/z = 692.25($C_{50}H_{32}N_2O_2$ = 692.82) |
| 10-5 | m/z = 742.30($C_{55}H_{38}N_2O$ = 742.92) | 10-6 | m/z = 654.27($C_{48}H_{34}N_2O$ = 654.81) |
| 10-7 | m/z = 700.20($C_{48}H_{32}N_2S_2$ = 700.92) | 10-8 | m/z = 760.25($C_{54}H_{36}N_2OS$ = 760.96) |
| 10-9 | m/z = 730.16($C_{48}H_{30}N_2S_3$ = 730.96) | 10-10 | m/z = 734.24($C_{52}H_{34}N_2OS$ = 734.92) |
| 10-11 | m/z = 872.32($C_{64}H_{44}N_2S$ = 873.13) | 10-12 | m/z = 718.26($C_{52}H_{34}N_2O_2$ = 718.86) |
| 10-13 | m/z = 568.20($C_{40}H_{28}N_2S$ = 568.74) | 10-14 | m/z = 624.17($C_{42}H_{28}N_2S_2$ = 624.82) |
| 10-15 | m/z = 658.21($C_{46}H_{30}N_2OS$ = 658.82) | 10-16 | m/z = 730.30($C_{54}H_{38}N_2O$ = 730.91) |
| 10-17 | m/z = 698.20($C_{48}H_{30}N_2O_2S$ = 698.84) | 10-18 | m/z = 624.17($C_{42}H_{28}N_2S_2$ = 624.82) |
| 10-19 | m/z = 700.20($C_{48}H_{32}N_2S_2$ = 700.92) | 10-20 | m/z = 708.22($C_{50}H_{32}N_2OS$ = 708.88) |
| 10-21 | m/z = 750.22($C_{52}H_{34}N_2S_2$ = 750.98) | 10-22 | m/z = 776.23($C_{54}H_{36}N_2S_2$ = 777.02) |
| 10-23 | m/z = 867.24($C_{59}H_{37}N_3OS_2$ = 868.09) | 10-24 | m/z = 759.27($C_{54}H_{37}N_3S$ = 759.97) |
| 10-25 | m/z = 608.19($C_{42}H_{28}N_2OS$ = 608.76) | 10-26 | m/z = 608.19($C_{42}H_{28}N_2OS$ = 608.76) |
| 10-27 | m/z = 692.25($C_{50}H_{32}N_2O_2$ = 692.82) | 10-28 | m/z = 894.20($C_{60}H_{34}N_2O_3S_2$ = 895.06) |
| 10-29 | m/z = 618.21($C_{44}H_{30}N_2S$ = 618.80) | 10-30 | m/z = 700.20($C_{48}H_{32}N_2S_2$ = 700.92) |
| 10-31 | m/z = 780.17($C_{52}H_{32}N_2S_3$ = 781.02) | 10-32 | m/z = 734.24($C_{52}H_{34}N_2OS$ = 734.92) |
| 10-33 | m/z = 834.31($C_{61}H_{42}N_2S$ = 835.08) | 10-34 | m/z = 700.20($C_{48}H_{32}N_2S_2$ = 700.92) |
| 10-35 | m/z = 724.25($C_{51}H_{36}N_2OS$ = 724.92) | 10-36 | m/z = 624.17($C_{42}H_{28}N_2S_2$ = 624.82) |
| 10-37 | m/z = 700.20($C_{48}H_{32}N_2S_2$ = 700.92) | 10-38 | m/z = 700.20($C_{48}H_{32}N_2S_2$ = 700.92) |
| 10-39 | m/z = 674.19($C_{46}H_{30}N_2S_2$ = 674.88) | 10-40 | m/z = 700.20($C_{48}H_{32}N_2S_2$ = 700.92) |
| 10-41 | m/z = 608.19($C_{42}H_{28}N_2OS$ = 608.76) | 10-42 | m/z = 684.22($C_{48}H_{32}N_2OS$ = 684.86) |
| 10-43 | m/z = 684.22($C_{48}H_{32}N_2OS$ = 684.86) | 10-44 | m/z = 624.17($C_{42}H_{28}N_2S_2$ = 624.82) |
| 10-45 | m/z = 674.19($C_{46}H_{30}N_2S_2$ = 674.88) | 10-46 | m/z = 700.20($C_{48}H_{32}N_2S_2$ = 700.92) |
| 10-47 | m/z = 826.25($C_{58}H_{38}N_2S_2$ = 827.08) | 10-48 | m/z = 608.19($C_{42}H_{28}N_2OS$ = 608.76) |
| 10-49 | m/z = 624.17($C_{42}H_{28}N_2S_2$ = 624.82) | 10-50 | m/z = 684.22($C_{48}H_{32}N_2OS$ = 684.86) |
| 10-51 | m/z = 700.20($C_{48}H_{32}N_2S_2$ = 700.92) | 10-52 | m/z = 684.22($C_{48}H_{32}N_2OS$ = 684.86) |
| 10-53 | m/z = 730.16($C_{48}H_{30}N_2S_3$ = 730.96) | 10-54 | m/z = 826.25($C_{58}H_{38}N_2S_2$ = 827.08) |
| 10-55 | m/z = 806.19($C_{54}H_{34}N_2S_3$ = 807.06) | 10-56 | m/z = 674.19($C_{46}H_{30}N_2S_2$ = 674.88) |
| 10-57 | m/z = 674.19($C_{46}H_{30}N_2S_2$ = 674.88) | 10-58 | m/z = 674.19($C_{46}H_{30}N_2S_2$ = 674.88) |
| 10-59 | m/z = 674.19($C_{46}H_{30}N_2S_2$ = 674.88) | 10-60 | m/z = 674.19($C_{46}H_{30}N_2S_2$ = 674.88) |
| 10-61 | m/z = 638.19($C_{43}H_{30}N_2S_2$ = 638.85) | 10-62 | m/z = 638.19($C_{43}H_{30}N_2S_2$ = 638.85) |
| 10-63 | m/z = 638.19($C_{43}H_{30}N_2S_2$ = 638.85) | 10-64 | m/z = 622.21($C_{43}H_{30}N_2OS$ = 622.79) |
| 10-65 | m/z = 688.20($C_{47}H_{32}N_2S_2$ = 688.91) | 10-66 | m/z = 700.20($C_{48}H_{32}N_2S_2$ = 700.92) |
| 10-67 | m/z = 789.23($C_{54}H_{35}N_3S_2$ = 790.02) | 10-68 | m/z = 638.19($C_{43}H_{30}N_2S_2$ = 638.85) |
| 10-69 | m/z = 638.19($C_{43}H_{30}N_2S_2$ = 638.85) | 10-70 | m/z = 642.16($C_{42}H_{27}FN_2S_2$ = 642.81) |
| 10-71 | m/z = 638.19($C_{43}H_{30}N_2S_2$ = 638.85) | 10-72 | m/z = 714.22($C_{49}H_{34}N_2S_2$ = 714.95) |
| 10-73 | m/z = 716.20($C_{48}H_{32}N_2OS_2$ = 716.92) | 10-74 | m/z = 670.24($C_{48}H_{34}N_2S$ = 670.87) |
| 10-75 | m/z = 634.24($C_{45}H_{34}N_2S$ = 634.84) | 10-76 | m/z = 759.27($C_{54}H_{37}N_3S$ = 759.97) |
| 10-77 | m/z = 674.19($C_{46}H_{30}N_2S_2$ = 674.88) | 10-78 | m/z = 708.22($C_{50}H_{32}N_2OS$ = 708.88) |
| 10-79 | m/z = 674.19($C_{46}H_{30}N_2S_2$ = 674.88) | 10-80 | m/z = 748.22($C_{52}H_{32}N_2O_2S$ = 748.90) |
| 10-81 | m/z = 821.29($C_{57}H_{35}D_5N_2S_2$ = 822.11) | 10-82 | m/z = 730.16($C_{48}H_{30}N_2S_3$ = 730.96) |
| 10-83 | m/z = 730.16($C_{48}H_{30}N_2S_3$ = 730.96) | 10-84 | m/z = 714.18($C_{48}H_{30}N_2OS_2$ = 714.90) |
| 10-85 | m/z = 882.22($C_{60}H_{38}N_2S_3$ = 883.16) | 10-86 | m/z = 624.17($C_{42}H_{28}N_2S_2$ = 624.82) |
| 10-87 | m/z = 700.20($C_{48}H_{32}N_2S_2$ = 700.92) | 10-88 | m/z = 674.19($C_{46}H_{30}N_2S_2$ = 674.88) |
| 10-89 | m/z = 674.19($C_{46}H_{30}N_2S_2$ = 674.88) | 10-90 | m/z = 708.22($C_{50}H_{32}N_2OS$ = 708.88) |
| 10-91 | m/z = 759.27($C_{54}H_{37}N_3S$ = 759.97) | 10-92 | m/z = 674.19($C_{46}H_{30}N_2S_2$ = 674.88) |
| 10-93 | m/z = 688.20($C_{47}H_{32}N_2S_2$ = 688.91) | 10-94 | m/z = 760.25($C_{54}H_{36}N_2OS$ = 760.96) |
| 10-95 | m/z = 759.27($C_{54}H_{37}N_3S$ = 759.97) | 10-96 | m/z = 608.19($C_{42}H_{28}N_2OS$ = 608.76) |
| 10-97 | m/z = 684.22($C_{48}H_{32}N_2OS$ = 684.86) | 10-98 | m/z = 622.21($C_{43}H_{30}N_2OS$ = 622.79) |
| 10-99 | m/z = 760.25($C_{54}H_{36}N_2OS$ = 760.96) | 10-100 | m/z = 658.21($C_{46}H_{30}N_2OS$ = 658.82) |
| 10-101 | m/z = 658.21($C_{46}H_{30}N_2OS$ = 658.82) | 10-102 | m/z = 692.25($C_{50}H_{32}N_2O_2$ = 692.82) |
| 10-103 | m/z = 628.25($C_{46}H_{32}N_2O$ = 628.78) | 10-104 | m/z = 693.28($C_{50}H_{35}N_3O$ = 693.85) |
| 10-105 | m/z = 723.23($C_{50}H_{33}N_3OS$ = 723.89) | 10-106 | m/z = 749.29($C_{54}H_{31}D_5N_2S$ = 749.99) |
| 10-107 | m/z = 700.20($C_{48}H_{32}N_2S_2$ = 700.92) | 10-108 | m/z = 674.19($C_{46}H_{30}N_2S_2$ = 674.88) |
| 10-109 | m/z = 684.22($C_{48}H_{32}N_2OS$ = 684.86) | 10-110 | m/z = 724.25($C_{51}H_{36}N_2OS$ = 724.92) |
| 10-111 | m/z = 674.19($C_{46}H_{30}N_2S_2$ = 674.88) | 10-112 | m/z = 674.19($C_{46}H_{30}N_2S_2$ = 674.88) |
| 10-113 | m/z = 780.17($C_{52}H_{32}N_2S_3$ = 781.02) | 10-114 | m/z = 684.22($C_{48}H_{32}N_2OS$ = 684.86) |
| 10-115 | m/z = 684.22($C_{48}H_{32}N_2OS$ = 684.86) | 10-116 | m/z = 698.20($C_{48}H_{30}N_2O_2S$ = 698.84) |
| 10-117 | m/z = 618.26($C_{42}H_{18}D_{10}N_2OS$ = 618.82) | 10-118 | m/z = 757.27($C_{54}H_{35}N_3O_2$ = 757.89) |
| 10-119 | m/z = 668.25($C_{48}H_{32}N_2O_2$ = 668.80) | 10-120 | m/z = 720.26($C_{52}H_{36}N_2S$ = 720.93) |
| 10-121 | m/z = 670.24($C_{48}H_{34}N_2S$ = 670.87) | 10-122 | m/z = 700.20($C_{48}H_{32}N_2S_2$ = 700.92) |
| 10-123 | m/z = 674.19($C_{46}H_{30}N_2S$ = 674.88) | 10-124 | m/z = 700.20($C_{48}H_{32}N_2S_2$ = 700.92) |
| 10-125 | m/z = 608.19($C_{42}H_{28}N_2OS$ = 608.76) | 10-126 | m/z = 860.25($C_{58}H_{40}N_2O_2S_2$ = 861.09) |
| 10-127 | m/z = 798.27($C_{57}H_{38}N_2OS$ = 799.00) | 10-128 | m/z = 734.33($C_{54}H_{42}N_2O$ = 734.94) |
| 10-129 | m/z = 742.26($C_{54}H_{34}N_2O_2$ = 742.88) | 10-130 | m/z = 945.37($C_{70}H_{47}N_3O$ = 946.17) |
| 10-131 | m/z = 670.24($C_{48}H_{34}N_2S$ = 670.87) | 10-132 | m/z = 624.17($C_{42}H_{28}N_2S_2$ = 624.82) |
| 10-133 | m/z = 700.20($C_{48}H_{32}N_2S_2$ = 700.92) | 10-134 | m/z = 724.20($C_{50}H_{32}N_2S_2$ = 724.94) |
| 10-135 | m/z = 816.26($C_{57}H_{40}N_2S_2$ = 817.08) | 10-136 | m/z = 760.25($C_{54}H_{35}N_2OS$ = 760.96) |
| 10-137 | m/z = 674.19($C_{46}H_{30}N_2S_2$ = 674.88) | 10-138 | m/z = 730.16($C_{48}H_{30}N_2S_3$ = 730.96) |
| 10-139 | m/z = 881.29($C_{61}H_{43}N_3S_2$ = 882.16) | 10-140 | m/z = 704.28($C_{52}H_{36}N_2O$ = 704.87) |

TABLE 4-continued

| Compound | FD-MS | Compound | FD-MS |
|---|---|---|---|
| 10-141 | m/z = 608.19($C_{42}H_{28}N_2OS$ = 608.76) | 10-142 | m/z = 682.23($C_{48}H_{30}N_2O_3$ = 682.78) |
| 10-143 | m/z = 670.24($C_{48}H_{34}N_2S$ = 670.87) | 10-144 | m/z = 776.23($C_{54}H_{36}N_2S_2$ = 777.02) |
| 10-145 | m/z = 674.19($C_{46}H_{30}N_2S_2$ = 674.88) | 10-146 | m/z = 759.27($C_{54}H_{37}N_3S$ = 759.97) |
| 10-147 | m/z = 758.24($C_{54}H_{34}N_2OS$ = 758.94) | 10-148 | m/z = 806.28($C_{59}H_{38}N_2S$ = 807.03) |
| 10-149 | m/z = 823.30($C_{59}H_{38}FN_3O$ = 823.97) | 10-150 | m/z = 743.29($C_{54}H_{37}N_3O$ = 743.91) |
| 10-151 | m/z = 998.33($C_{73}H_{46}N_2OS$ = 999.24) | 10-152 | m/z = 700.20($C_{48}H_{32}N_2S_2$ = 700.92) |
| 10-153 | m/z = 674.19($C_{46}H_{30}N_2S_2$ = 674.88) | 10-154 | m/z = 674.19($C_{46}H_{30}N_2S_2$ = 674.88) |
| 10-155 | m/z = 674.19($C_{46}H_{30}N_2S_2$ = 674.88) | 10-156 | m/z = 674.19($C_{46}H_{30}N_2S_2$ = 674.88) |
| 10-157 | m/z = 762.29($C_{50}H_{46}N_2SSi_2$ = 763.16) | 10-158 | m/z = 624.17($C_{42}H_{28}N_2S_2$ = 624.82) |
| 10-159 | m/z = 784.25($C_{56}H_{36}N_2OS$ = 784.98) | 10-160 | m/z = 810.27($C_{58}H_{38}N_2OS$ = 811.02) |
| 10-161 | m/z = 860.29($C_{62}H_{40}N_2OS$ = 861.08) | 10-162 | m/z = 708.22($C_{50}H_{32}N_2OS$ = 708.88) |
| 10-163 | m/z = 742.26($C_{54}H_{34}N_2O_2$ = 742.88) | 10-164 | m/z = 828.26($C_{58}H_{40}N_2S_2$ = 829.09) |
| 10-165 | m/z = 708.22($C_{50}H_{32}N_2OS$ = 708.88) | 10-166 | m/z = 724.20($C_{50}H_{32}N_2S_2$ = 724.94) |
| 10-167 | m/z = 834.27($C_{60}H_{38}N_2OS$ = 835.04) | 10-168 | m/z = 768.28($C_{56}H_{36}N_2O_2$ = 768.92) |
| 10-169 | m/z = 830.19($C_{56}H_{34}N_2S_3$ = 831.08) | 10-170 | m/z = 810.27($C_{58}H_{38}N_2OS$ = 811.02) |
| 10-171 | m/z = 810.31($C_{59}H_{42}N_2S$ = 811.06) | 10-172 | m/z = 692.25($C_{50}H_{32}N_2O_2$ = 692.82) |
| 10-173 | m/z = 758.24($C_{54}H_{34}N_2OS$ = 758.94) | 10-174 | m/z = 783.27($C_{56}H_{37}N_3S$ = 783.99) |
| 10-175 | m/z = 808.25($C_{58}H_{36}N_2OS$ = 809.00) | 10-176 | m/z = 806.19($C_{54}H_{34}N_2S_3$ = 807.06) |
| 10-177 | m/z = 764.2($C_{52}H_{32}N_2OS_2$ = 764.96) | 10-178 | m/z = 684.22($C_{48}H_{32}N_2OS$ = 684.86) |
| 10-179 | m/z = 774.27($C_{55}H_{38}N_2OS$ = 774.98) | 10-180 | m/z = 684.22($C_{48}H_{32}N_2OS$ = 684.86) |
| 10-181 | m/z = 658.21($C_{46}H_{30}N_2OS$ = 658.82) | 10-182 | m/z = 700.2($C_{48}H_{32}N_2S_2$ = 700.92) |
| 10-183 | m/z = 700.2($C_{48}H_{32}N_2S_2$ = 700.92) | 10-184 | m/z = 700.2($C_{48}H_{32}N_2S_2$ = 700.92) |
| 10-185 | m/z = 684.22($C_{48}H_{32}N_2OS$ = 684.86) | 10-186 | m/z = 684.22($C_{48}H_{32}N_2OS$ = 684.86) |
| 10-187 | m/z = 724.25($C_{51}H_{36}N_2OS$ = 724.92) | 10-188 | m/z = 832.31($C_{51}H_{40}N_2O_2$ = 833) |
| 10-189 | m/z = 861.37($C_{63}H_{47}N_3O$ = 862.09) | | |
| 11-1 | m/z = 473.21($C_{36}H_{27}N$ = 473.61) | 11-2 | m/z = 523.23($C_{40}H_{29}N$ = 523.66) |
| 11-3 | m/z = 573.25($C_{44}H_{31}N$ = 573.72) | 11-4 | m/z = 623.26($C_{48}H_{33}N$ = 623.78) |
| 11-5 | m/z = 447.20($C_{34}H_{25}N$ = 447.57) | 11-6 | m/z = 371.17($C_{28}H_{21}N$ = 371.47) |
| 11-7 | m/z = 471.20($C_{36}H_{25}N$ = 471.59) | 11-8 | m/z = 521.21($C_{40}H_{27}N$ = 521.65) |
| 11-9 | m/z = 549.25($C_{42}H_{31}N$ = 549.70) | 11-10 | m/z = 625.28($C_{48}H_{35}N$ = 625.80) |
| 11-11 | m/z = 675.29($C_{52}H_{37}N$ = 675.86) | 11-12 | m/z = 473.21($C_{36}H_{27}N$ = 473.61) |
| 11-13 | m/z = 523.23($C_{40}H_{29}N$ = 523.66) | 11-14 | m/z = 623.26($C_{48}H_{33}N$ = 623.78) |
| 11-15 | m/z = 549.25($C_{42}H_{31}N$ = 549.70) | 11-16 | m/z = 625.28($C_{48}H_{35}N$ = 625.80) |
| 11-17 | m/z = 473.21($C_{36}H_{27}N$ = 473.62) | 11-18 | m/z = 725.31($C_{56}H_{39}N$ = 725.94) |
| 11-19 | m/z = 625.28($C_{48}H_{35}N$ = 625.82) | 11-20 | m/z = 749.31($C_{58}H_{39}N$ = 749.96) |
| 11-21 | m/z = 699.29($C_{54}H_{37}N$ = 699.9) | 11-22 | m/z = 730.34($C_{56}H_{34}D_5N$ = 730.97) |
| 11-23 | m/z = 753.33($C_{58}H_{35}D_4N$ = 753.98) | | |
| 12-1 | m/z = 690.30($C_{52}H_{38}N_2$ = 690.87) | 12-2 | m/z = 790.33($C_{60}H_{42}N_2$ = 790.99) |
| 12-3 | m/z = 740.32($C_{56}H_{40}N_2$ = 740.93) | 12-4 | m/z = 840.35($C_{64}H_{44}N_2$ = 841.05) |
| 12-5 | m/z = 691.30($C_{51}H_{37}N_3$ = 691.86) | 12-6 | m/z = 688.29($C_{52}H_{36}N_2$ = 688.86) |
| 12-7 | m/z = 700.37($C_{52}H_{28}D_{10}N_2$ = 700.93) | 12-8 | m/z = 650.35($C_{48}H_{26}D_{10}N_2$ = 650.87) |
| 12-9 | m/z = 922.40($C_{68}H_{50}N_4$ = 923.15) | 12-10 | m/z = 730.33($C_{55}H_{42}N_2$ = 730.94) |
| 12-11 | m/z = 832.38($C_{63}H_{48}N_2$ = 833.07) | 12-12 | m/z = 761.38($C_{57}H_{39}D_5N_2$ = 762.00) |
| 12-13 | m/z = 806.37($C_{61}H_{45}N_2$ = 807.03) | 12-14 | m/z = 876.35($C_{64}H_{48}N_2S$ = 877.14) |
| 12-15 | m/z = 872.41($C_{66}H_{52}N_2$ = 873.13) | 12-16 | m/z = 770.37($C_{58}H_{46}N_2$ = 771.00) |
| 12-17 | m/z = 952.48($C_{72}H_{60}N_2$ = 953.26) | 12-18 | m/z = 828.35($C_{63}H_{44}N_2$ = 829.04) |
| 12-19 | m/z = 910.34($C_{67}H_{46}N_2S$ = 911.16) | 12-20 | m/z = 863.33($C_{62}H_{45}N_3S$ = 864.11) |
| 12-21 | m/z = 804.35($C_{61}H_{44}N_2$ = 805.02) | 12-22 | m/z = 970.39($C_{73}H_{50}N_2O$ = 971.19) |
| 12-23 | m/z = 981.41($C_{74}H_{51}N_3$ = 982.22) | 12-24 | m/z = 968.41 ($C_{74}H_{52}N_2$ = 969.22) |
| 12-25 | m/z = 878.37($C_{67}H_{46}N_2$ = 879.10) | 12-26 | m/z = 816.31 ($C_{61}H_{40}N_2O$ = 816.98) |
| 12-27 | m/z = 805.35($C_{60}H_{43}N_3$ = 806.00) | 12-28 | m/z = 885.32($C_{64}H_{43}N_3S$ = 886.11) |
| 12-29 | m/z = 805.35($C_{60}H_{43}N_3$ = 806.00) | 12-30 | m/z = 1050.47($C_{78}H_{58}N_4$ = 1051.32) |
| 12-31 | m/z = 696.26($C_{50}H_{36}N_2S$ = 696.90) | 12-32 | m/z = 696.26($C_{50}H_{36}N_2S$ = 696.90) |
| 12-33 | m/z = 822.31($C_{60}H_{42}N_2S$ = 823.05) | 12-34 | m/z = 746.28($C_{54}H_{38}N_2S$ = 746.96) |
| 12-35 | m/z = 700.20($C_{48}H_{32}N_2S_2$ = 700.91) | 12-36 | m/z = 800.23($C_{56}H_{36}N_2S_2$ = 801.03) |
| 12-37 | m/z = 852.26($C_{60}H_{40}N_2S_2$ = 853.10) | 12-38 | m/z = 952.29($C_{68}H_{44}N_2S_2$ = 953.22) |
| 12-39 | m/z = 912.18($C_{50}H_{36}N_2S_4$ = 913.20) | 12-40 | m/z = 852.26($C_{60}H_{40}N_2S_2$ = 853.10) |
| 12-41 | m/z = 806.33($C_{60}H_{42}N_2O$ = 806.99) | 12-42 | m/z = 768.28($C_{56}H_{36}N_2O_2$ = 768.90) |
| 12-43 | m/z = 920.34($C_{63}H_{44}N_2O_2$ = 921.09) | 12-44 | m/z = 684.22($C_{48}H_{32}N_2OS$ = 684.85) |
| 12-45 | m/z = 970.43($C_{74}H_{54}N_2$ = 971.23) | 12-46 | m/z = 947.42($C_{71}H_{53}N_3$ = 948.20) |
| 12-47 | m/z = 829.35($C_{62}H_{43}N_3$ = 830.02) | 12-48 | m/z = 860.29($C_{62}H_{40}N_2OS$ = 861.06) |
| 12-49 | m/z = 664.29($C_{50}H_{36}N_2$ = 664.83) | 12-50 | m/z = 956.41($C_{73}H_{52}N_2$ = 957.21) |
| 12-51 | m/z = 829.35($C_{62}H_{43}N_3$ = 830.02) | 12-52 | m/z = 911.33($C_{65}H_{45}N_3S$ = 912.15) |
| 12-53 | m/z = 664.29($C_{50}H_{36}N_2$ = 664.83) | 12-54 | m/z = 776.23($C_{54}H_{36}N_2S_2$ = 777.01) |
| 12-55 | m/z = 744.28($C_{54}H_{36}N_2O_2$ = 744.88) | 12-56 | m/z = 894.37($C_{66}H_{46}N_4$ = 895.10) |
| 12-57 | m/z = 776.23($C_{54}H_{36}N_2S_2$ = 777.01) | 12-58 | m/z = 844.31 ($C_{62}H_{40}N_2O_2$ = 844.99) |
| 12-59 | m/z = 664.29($C_{50}H_{36}N_2$ = 664.83) | 12-60 | m/z = 844.31 ($C_{62}H_{40}N_2O_2$ = 844.99) |
| 12-61 | m/z = 640.29($C_{48}H_{36}N_2$ = 640.83) | 12-62 | m/z = 604.29($C_{45}H_{36}N_2$ = 604.8) |
| 12-63 | m/z = 578.24($C_{42}H_{30}N_2O$ = 578.72) | 12-64 | m/z = 654.27($C_{48}H_{34}N_2O$ = 654.81) |
| 12-66 | m/z = 730.3($C_{54}H_{38}N_2O$ = 730.91) | 12-68 | m/z = 770.33($C_{57}H_{42}N_2O$ = 770.98) |
| 12-70 | m/z = 668.25($C_{48}H_{32}N_2O_2$ = 668.8) | 12-71 | m/z = 952.48($C_{72}H_{60}N_2$ = 953.26) |

[Synthesis Example 2] Synthesis Example of Formula 2

Compound (final product 2) represented by Formula 2 according to the present invention may be synthesized as shown in Reaction Scheme 7 below, but there is not limited thereto.

<Reaction Scheme 7>

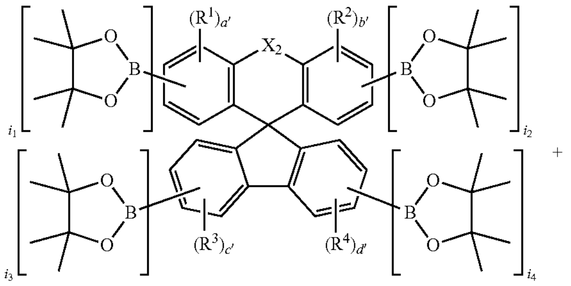

Sub 3

-continued

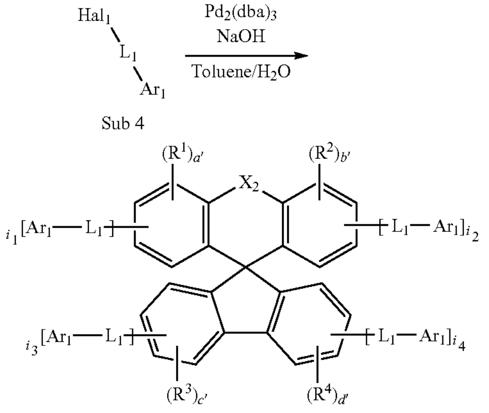

Sub 4

Final Product 2

($Hal_1$ = I, Br, Cl)

Synthesis of Sub3

Sub3 of Reaction Scheme 7 may be synthesized by the reaction route of Reaction Scheme 8, but there is not limited thereto. Sub3 can be synthesized according to the synthesis route of (1) when $X^1$ is —OH, according to the synthesis route of (2) when $X^1$ is —SH, and according to the synthesis route of (3) when $X^1$ is —$NH_2$.

<Reaction Scheme 8>

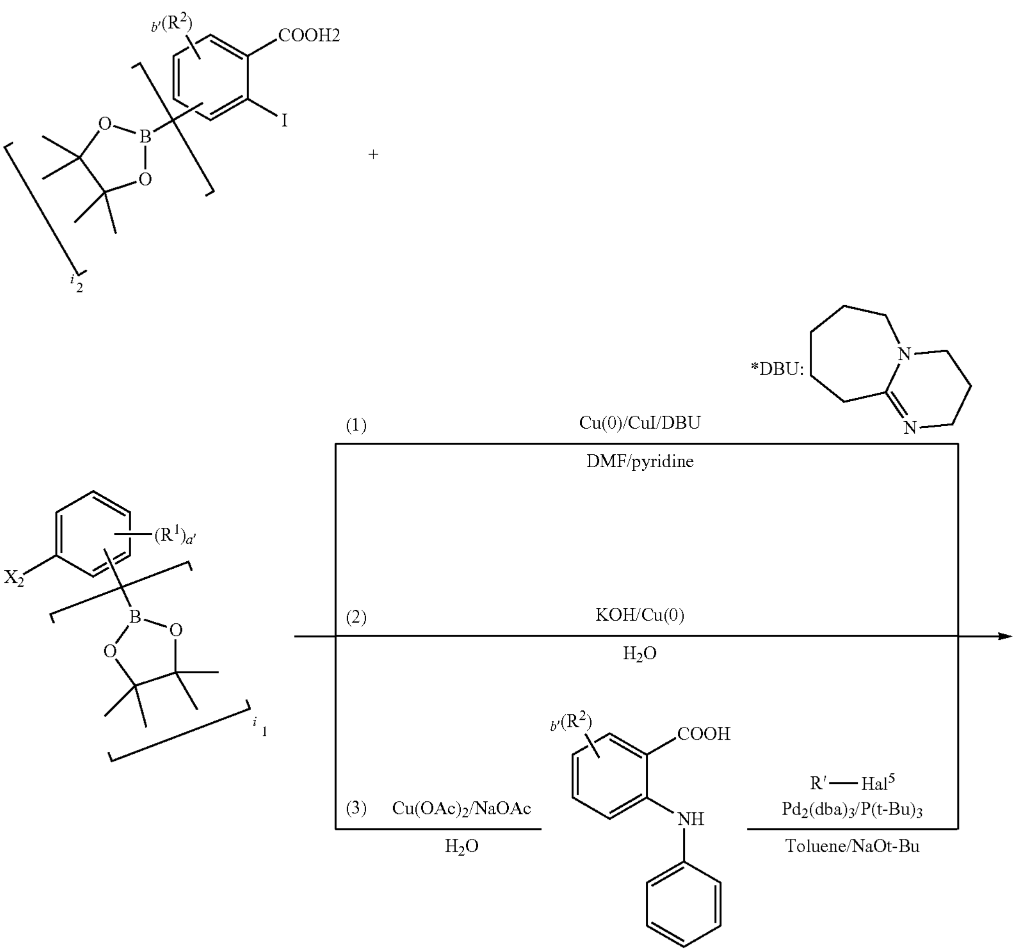

-continued
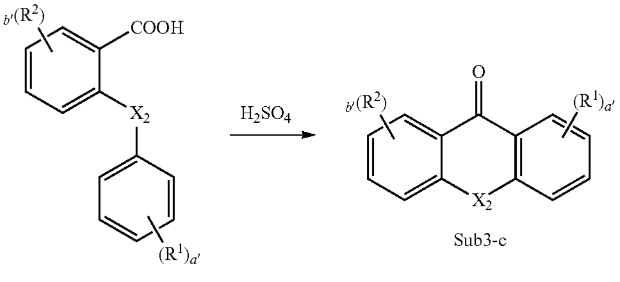
Sub3-b
Sub3-c
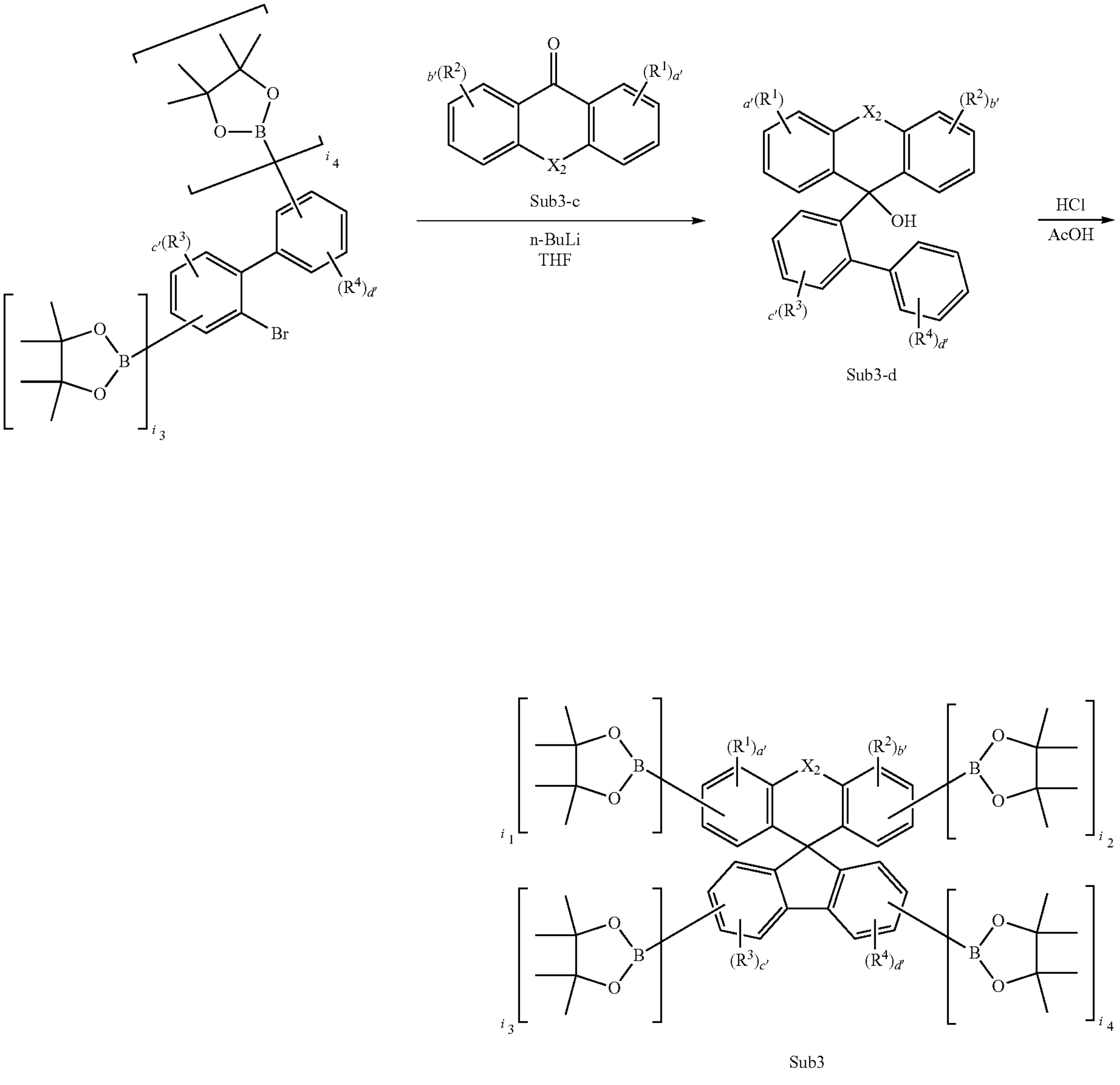
Sub3-c
Sub3-d
Sub3

(1) Synthesis Example Sub3-20

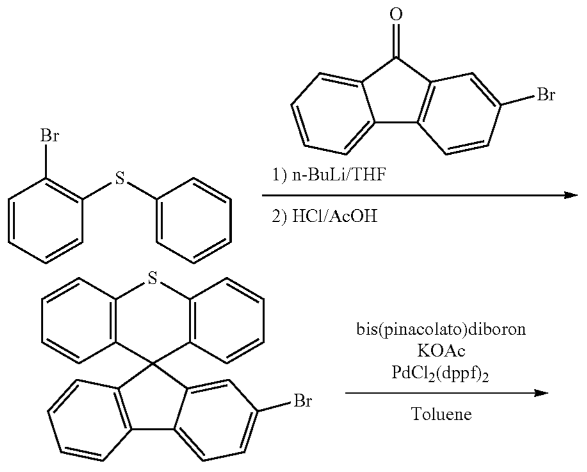

Sub3-20-a

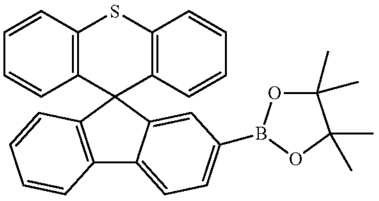

Sub3-20

Synthesis of Sub3-20-a

After adding THF (100 ml) to 2-bromophenyl)(phenyl) sulfane (9.40 g, 35.45 mmol), 2.5M n-BuLi (14.18 ml, 35.45 mmol) was slowly added to the solution at −78° C. and the mixture was stirred for 1 hour. Thereafter, 2-bromo-9H-fluoren-9-one (9.18 g, 35.45 mmol) dissolved in THF (50 ml) was added to the mixture at −78° C., and then the reaction temperature was slowly raised to room temperature. When the reaction was completed, the solvent was removed after quenching with $NH_4Cl$. Acetic acid (100 ml) and HCl (20 ml) are added to the reaction product and the mixture was stirred at 80° C. for 5 hours. When the reaction was completed, the temperature was lowered to room temperature, the reaction product was filtered and the filtrate was extracted with MC, and washed with water. An organic layer was dried over $MgSO_4$ and concentrated. Then, the concentrate was separated by a silica gel column to obtain 10.45 g (69%) of the product.

Synthesis of Sub3-20

Bis(pinacolato)diboron (8.46 g, 30.19 mmol), $PdCl_2(dppf)_2$ (0.82 g, 1.01 mmol), KOAc (3.95 g, 40.25 mmol) and toluene (100 ml) were added to Sub3-20-a (8.60 g, 21.12 mmol) and the mixture was refluxed at 120° C. for 6 hours. When the reaction was completed, the temperature of the reaction product is cooled to room temperature, the reaction product was extracted with MC and washed with water. An organic layer was dried over $MgSO_4$ and concentrated. Then, the concentrate was separated by a silica gel column to obtain 7.64 g (80%) of the product.

(2) Synthesis of Sub3-5

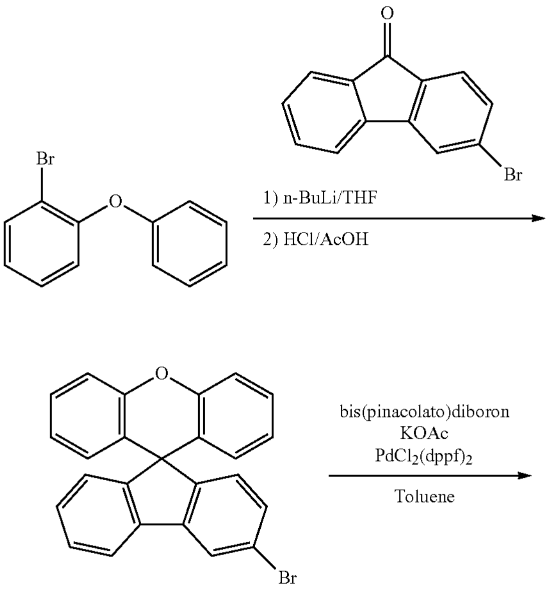

Sub3-5-a

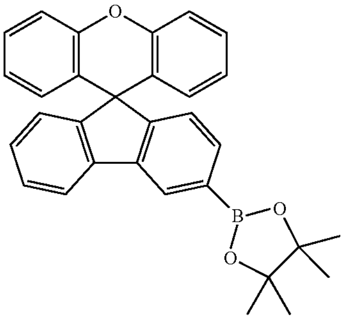

Sub3-5

Synthesis of Sub3-5-a

After 1-bromo-2-phenoxybenzene (11.00 g, 44.16 mmol) was dissolved in THF (150 ml), 2.5M n-BuLi (17.66 ml, 44.16 mmol), 3-bromo-9H-fluoren-9-one (11.44 g, 44.16 mmol), AcOH (110 ml) and HCl (20 ml) were added to the solution, and then the synthesis was carried out in the same manner as in the synthesis method of Sub3-20-a to obtain 13.08 g (72%) of the product.

Synthesis of Sub3-5

Bis(pinacolato)diboron (7.56 g, 26.99 mmol), $PdCl_2(dppf)_2$ (0.73 g, 0.90 mmol), KOAc (3.53 g, 35.98 mmol) and toluene (100 ml) were added to Sub-1-7-a (7.40 g, 17.99 mmol), and then the synthesis was carried out in the same manner as in the synthesis method of Sub3-20 to obtain 6.68 g (81%) of the product.

(2) Synthesis of Sub3-34

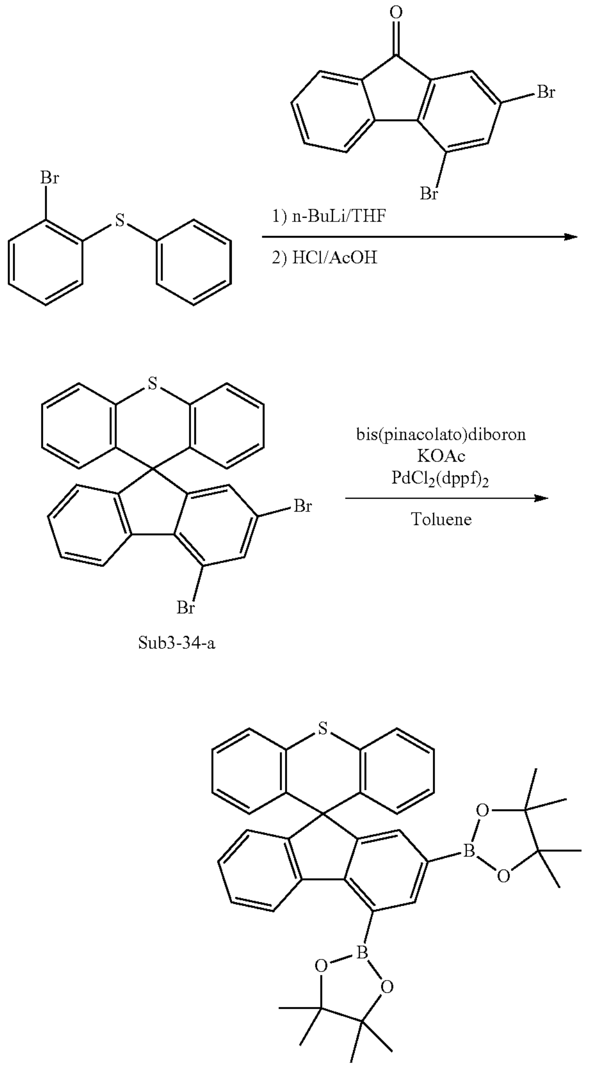

Sub3-34-a

Sub3-34

Synthesis of Sub3-34-a

After (2-bromophenyl)(phenyl)sulfane (7.0 g, 26.40 mmol) was dissolved in THF (88 ml), 2.5M n-BuLi (1.69 g, 26.40 mmol), 2,4-dibromo-9H-fluoren-9-one (8.92 g, 26.40 mmol), AcOH (61 ml) and HCl (13.2 ml) were added to the solution, and then the synthesis was carried out in the same manner as in the synthesis method of Sub3-20-a to obtain 8.02 g (60%) of the product.

Synthesis of Sub3-34

Bis(pinacolato)diboron (4.43 g, 17.43 mmol), $PdCl_2(dppf)_2$ (0.39 g, 0.48 mmol), KOAc (4.66 g, 47.52 mmol) and toluene (79 ml) were added to Sub3-34-a (8.02 g, 15.84 mmol), and then the synthesis was carried out in the same manner as in the synthesis method of Sub3-20-a to obtain 6.66 g (70%) of the product.

(3) Synthesis of Sub3-35

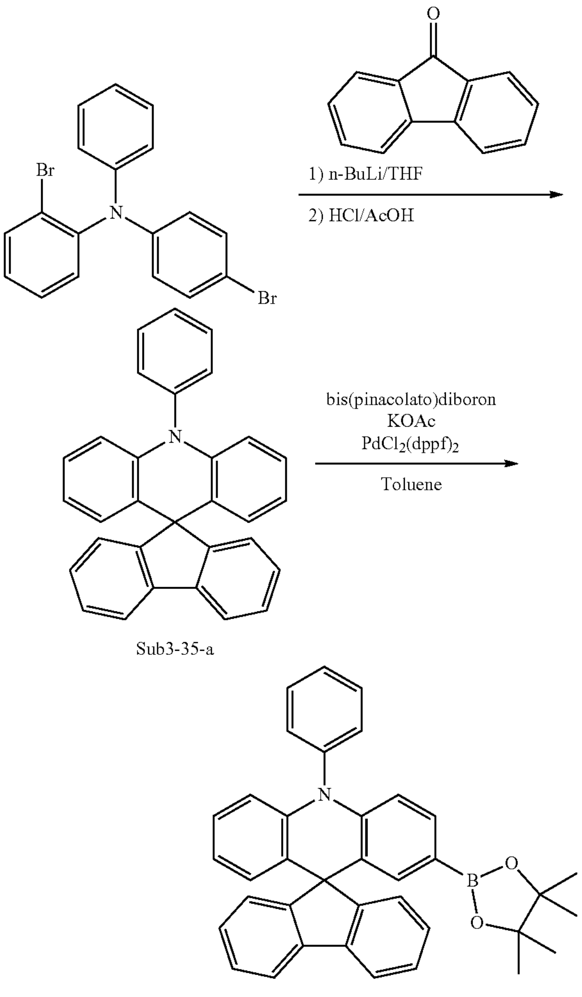

Sub3-35-a

Sub3-35

Synthesis of Sub3-35-a

After 2-bromo-N-(4-bromophenyl)-N-phenylaniline (8.5 g, 21.09 mmol) was dissolved in THF (70.3 ml), 2.5M n-BuLi (1.35 g, 21.09 mmol), 9H-fluoren-9-one (3.80 g, 21.09 mmol), AcOH (49.04 ml) and HCl (10.5 ml) were added to the solution, and then the synthesis was carried out in the same manner as in the synthesis method of Sub3-20-a to obtain 5.50 g (64%) of the product.

Synthesis of Sub3-35

Bis(pinacolato)diboron (3.30 g, 11.95 mmol), $PdCl_2(dppf)_2$ (0.27 g, 0.33 mmol), KOAc (3.20 g, 32.59 mmol), toluene (54 ml) were added to Sub3-35-a (5.50 g, 10.86 mmol), and then the synthesis was carried out in the same manner as in the synthesis method of Sub3-20 to obtain 4.44 g (68%) of the product.

Compounds belong to Sub 3 are as follows, but are not limited thereto, and FD-MS values of the compounds are shown in Table 5 below.

Sub3-1
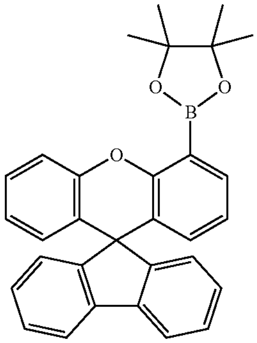
Sub3-2
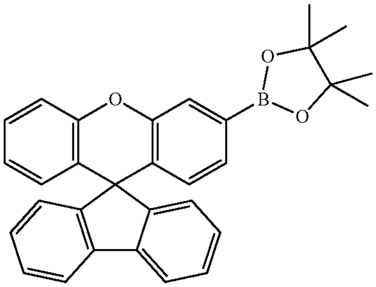
Sub3-3
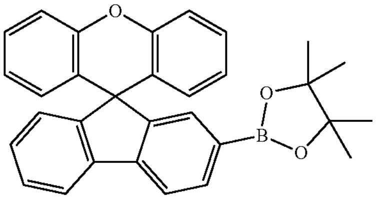
Sub3-4
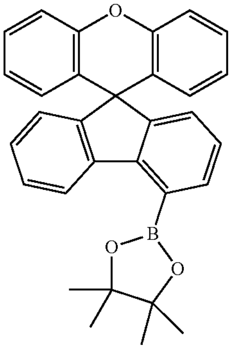
Sub3-5
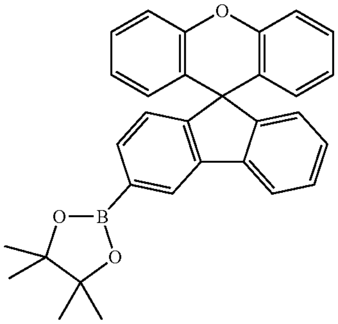
-continued
Sub3-6
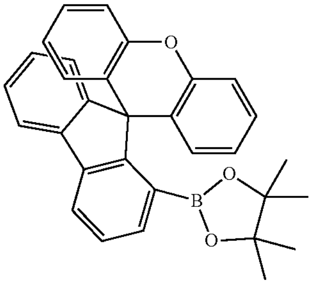
Sub3-7
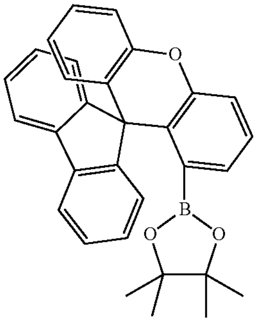
Sub3-8
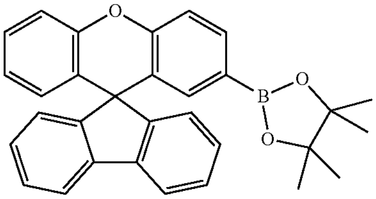
Sub3-9
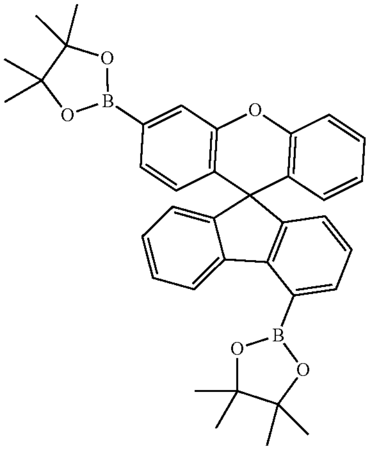

-continued
Sub3-10
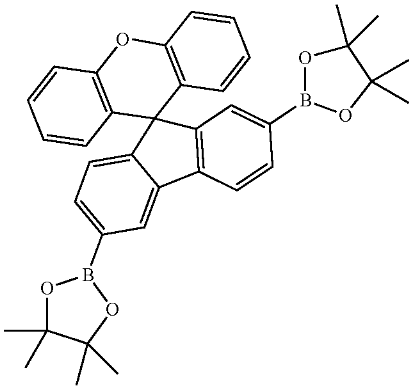
Sub3-11
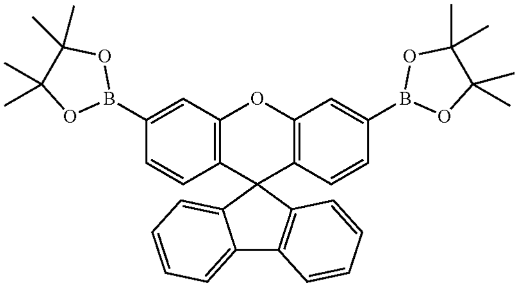
Sub3-12
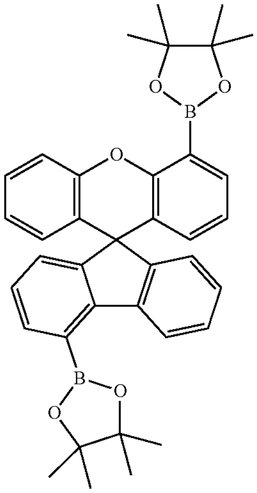
Sub3-13
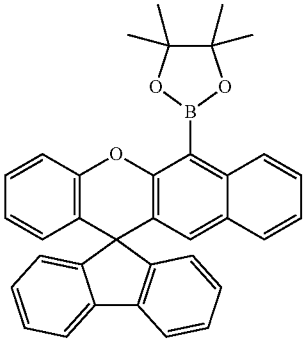
-continued
Sub3-14
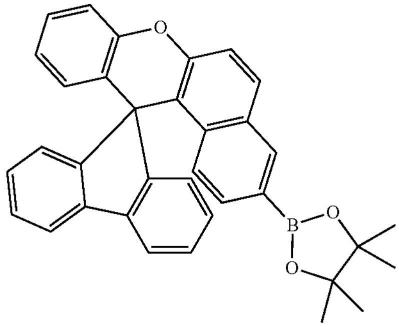
Sub3-15
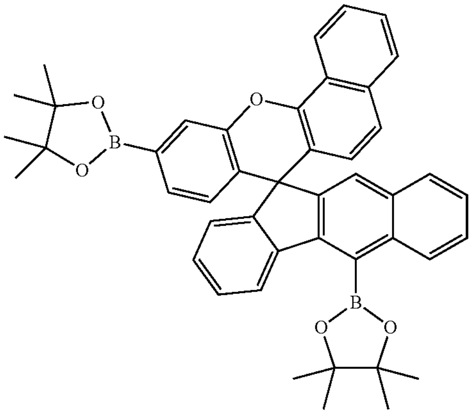
Sub3-16
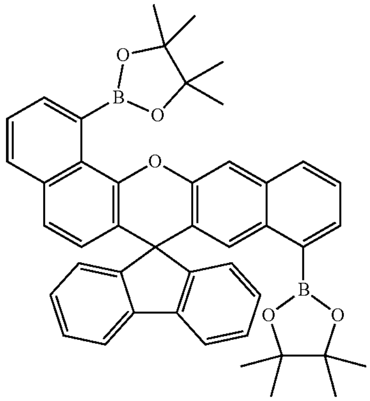
Sub3-17
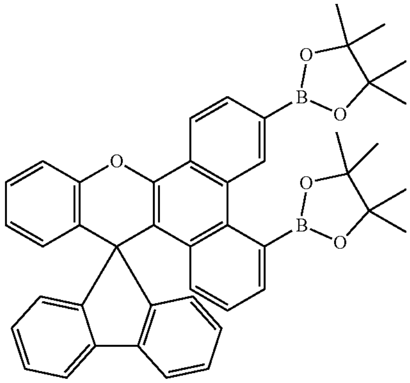

-continued
Sub3-18
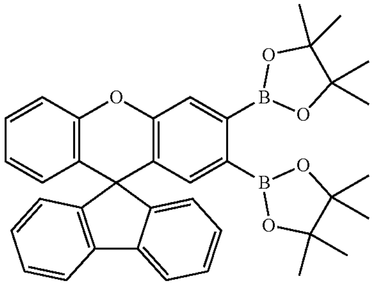
Sub3-19
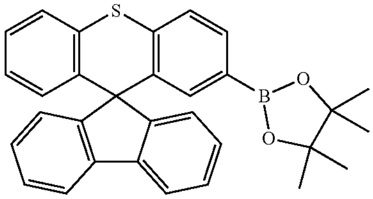
Sub3-20
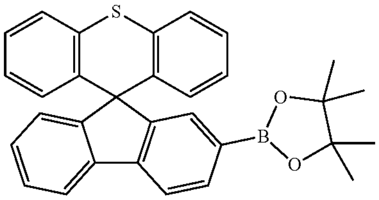
Sub3-21
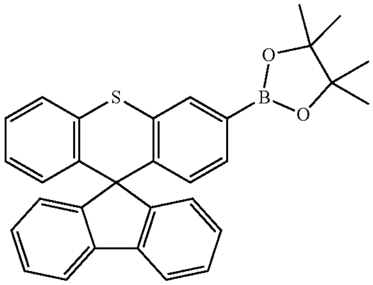
Sub3-22
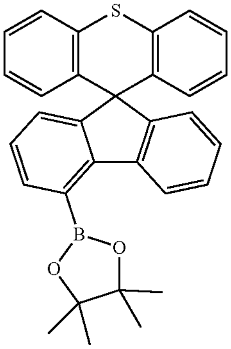
-continued
Sub3-23
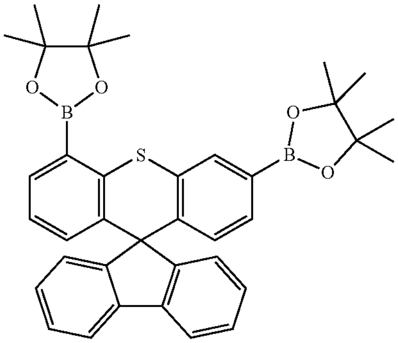
Sub3-24
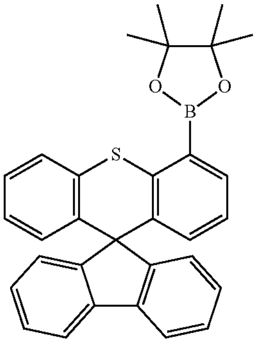
Sub3-25
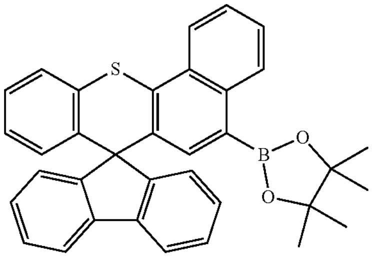
Sub3-26
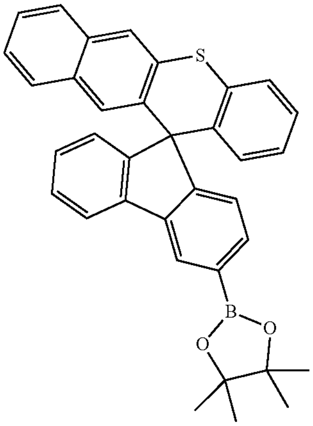
Sub3-27
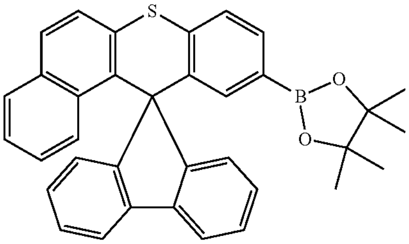

-continued
Sub3-28
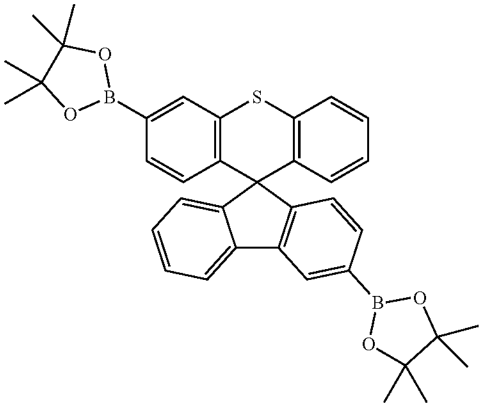
Sub3-29
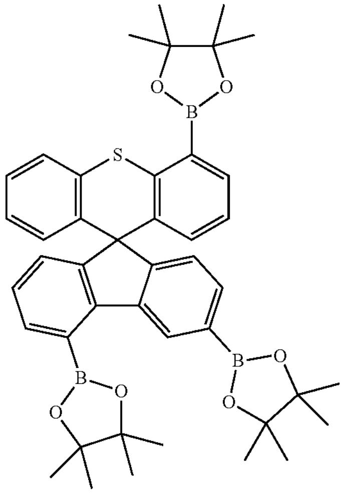
Sub3-30
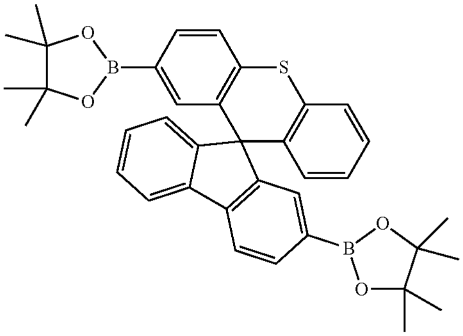
Sub3-31
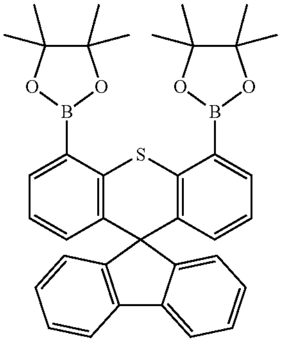
-continued
Sub3-32
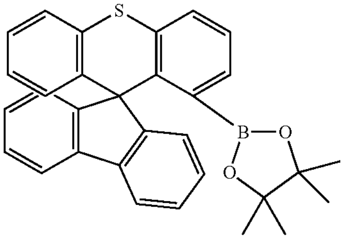
Sub3-33
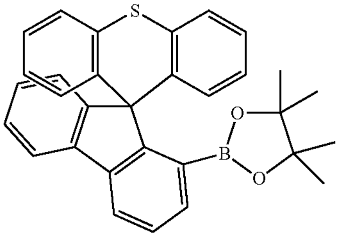
Sub3-34
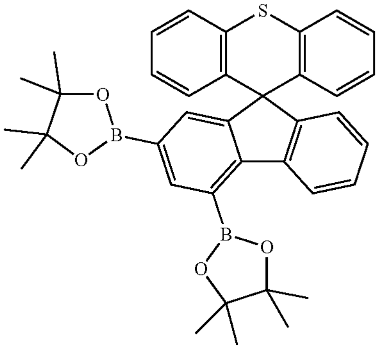
Sub3-35
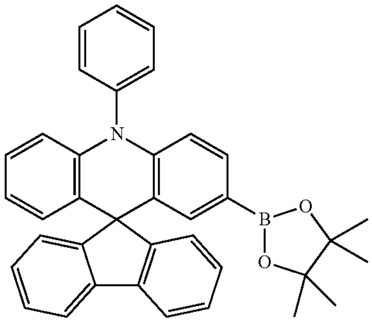
Sub3-36
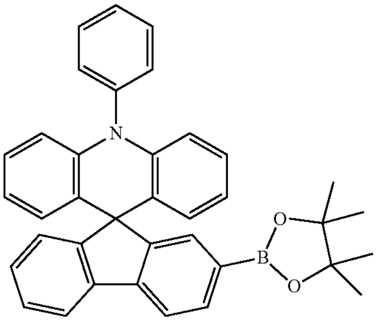

-continued
Sub3-37
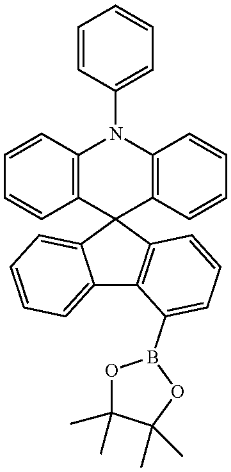
Sub3-38
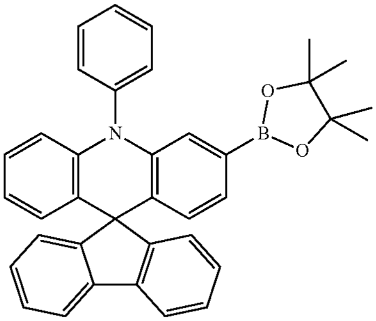
Sub3-39
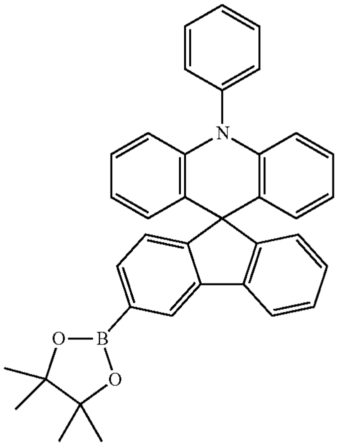
Sub3-40
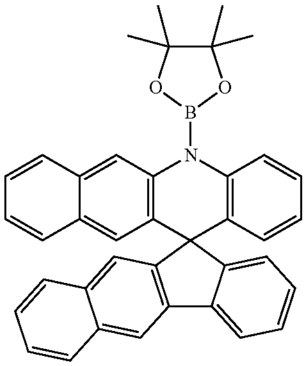
-continued
Sub3-41
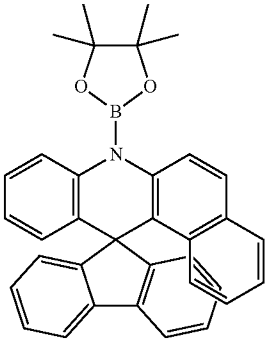
Sub3-42
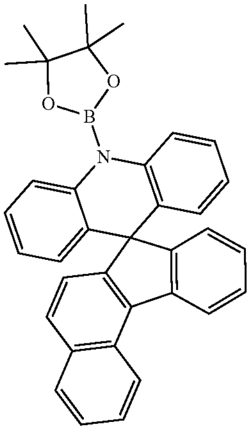
Sub3-43
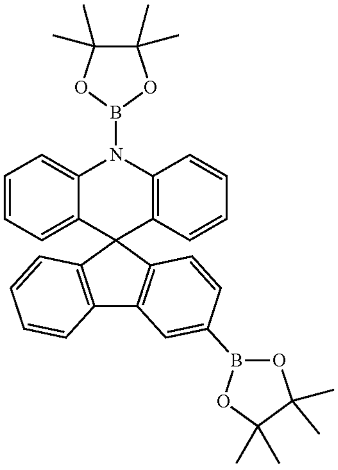
Sub3-44
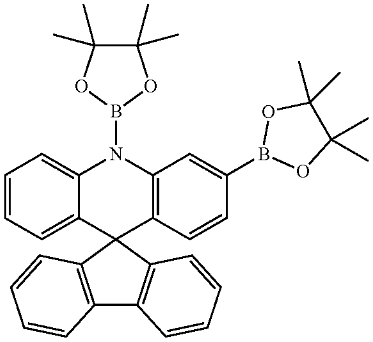

-continued

Sub3-45

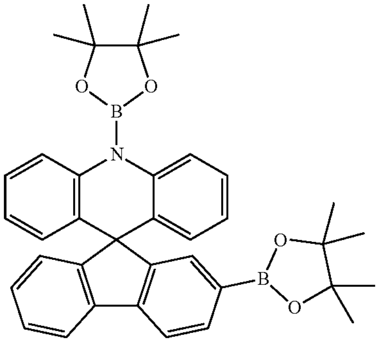

Sub3-46

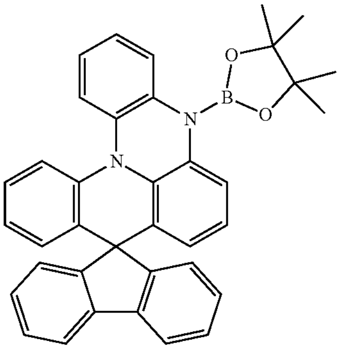

Sub3-47

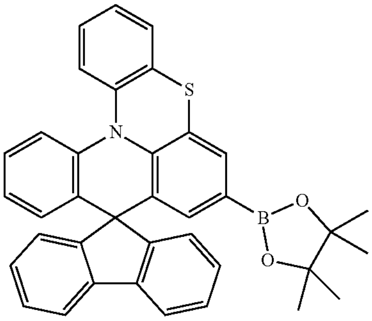

-continued

Sub3-48

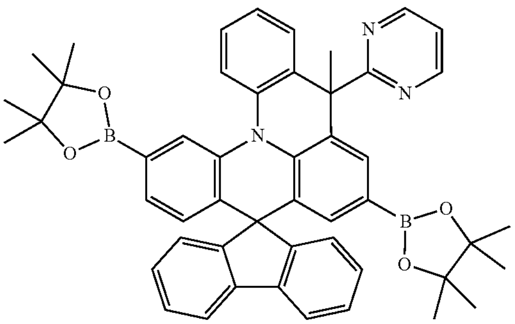

Sub 3-49

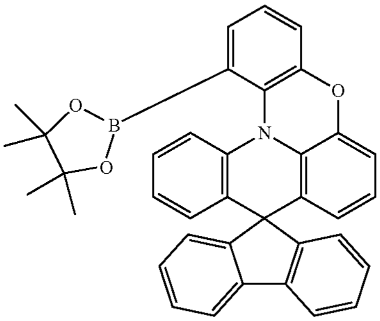

Sub 3-50

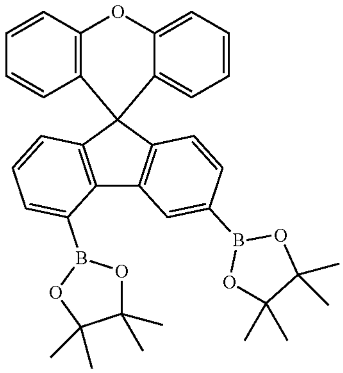

TABLE 5

| Compound | FD-MS | Compound | FD-MS |
|---|---|---|---|
| Sub3-1 | m/z = 458.21($C_{31}H_{27}BO_3$ = 458.36) | Sub3-2 | m/z = 458.21($C_{31}H_{27}BO_3$ = 458.36) |
| Sub3-3 | m/z = 458.21($C_{31}H_{27}BO_3$ = 458.36) | Sub3-4 | m/z = 458.21($C_{31}H_{27}BO_3$ = 458.36) |
| Sub3-5 | m/z = 458.21($C_{31}H_{27}BO_3$ = 458.36) | Sub3-6 | m/z = 458.21($C_{31}H_{27}BO_3$ = 458.36) |
| Sub3-7 | m/z = 458.21($C_{31}H_{27}BO_3$ = 458.36) | Sub3-8 | m/z = 458.21($C_{31}H_{27}BO_3$ = 458.36) |
| Sub3-9 | m/z = 584.29($C_{37}H_{38}B_2O_5$ = 584.33) | Sub3-10 | m/z = 584.29($C_{37}H_{38}B_2O_5$ = 584.33) |
| Sub3-11 | m/z = 584.29($C_{37}H_{38}B_2O_5$ = 584.33) | Sub3-12 | m/z = 584.29($C_{37}H_{38}B_2O_5$ = 584.33) |
| Sub3-13 | m/z = 508.22($C_{35}H_{29}BO_3$ = 508.42) | Sub3-14 | m/z = 508.22($C_{35}H_{29}BO_3$ = 508.42) |
| Sub3-15 | m/z = 684.32($C_{45}H_{42}B_2O_5$ = 684.45) | Sub3-16 | m/z = 684.32($C_{45}H_{42}B_2O_5$ = 684.45) |
| Sub3-17 | m/z = 684.32($C_{45}H_{42}B_2O_5$ = 684.45) | Sub3-18 | m/z = 584.29($C_{37}H_{38}B_2O_5$ = 584.33) |
| Sub3-19 | m/z = 474.18($C_{31}H_{27}BO_2S$ = 474.43) | Sub3-20 | m/z = 474.18($C_{31}H_{27}BO_2S$ = 474.43) |
| Sub3-21 | m/z = 474.18($C_{31}H_{27}BO_2S$ = 474.43) | Sub3-22 | m/z = 474.18($C_{31}H_{27}BO_2S$ = 474.43) |
| Sub3-23 | m/z = 600.27($C_{37}H_{38}B_2O_4S$ = 600.39) | Sub3-24 | m/z = 474.18($C_{31}H_{27}BO_2S$ = 474.43) |
| Sub3-25 | m/z = 524.2($C_{35}H_{29}BO_2S$ = 524.49) | Sub3-26 | m/z = 524.2($C_{35}H_{29}BO_2S$ = 524.49) |
| Sub3-27 | m/z = 524.2($C_{35}H_{29}BO_2S$ = 524.49) | Sub3-28 | m/z = 600.27($C_{37}H_{38}B_2O_4S$ = 600.39) |
| Sub3-29 | m/z = 726.35($C_{43}H_{49}B_3O_6S$ = 726.35) | Sub3-30 | m/z = 600.27($C_{37}H_{38}B_2O_4S$ = 600.39) |
| Sub3-31 | m/z = 600.27($C_{37}H_{38}B_2O_4S$ = 600.39) | Sub3-32 | m/z = 474.18($C_{31}H_{27}BO_2S$ = 474.43) |
| Sub3-33 | m/z = 474.18($C_{31}H_{27}BO_2S$ = 474.43) | Sub3-34 | m/z = 600.27($C_{37}H_{38}B_2O_4S$ = 600.39) |
| Sub3-35 | m/z = 533.25($C_{37}H_{32}BNO_2$ = 533.48) | Sub3-36 | m/z = 533.25($C_{37}H_{32}BNO_2$ = 533.48) |
| Sub3-37 | m/z = 533.25($C_{37}H_{32}BNO_2$ = 533.48) | Sub3-38 | m/z = 533.25($C_{37}H_{32}BNO_2$ = 533.48) |
| Sub3-39 | m/z = 533.25($C_{37}H_{32}BNO_2$ = 533.48) | Sub3-40 | m/z = 557.25($C_{39}H_{32}BNO_2$ = 557.5) |
| Sub3-41 | m/z = 507.24($C_{35}H_{30}BNO_2$ = 507.44) | Sub3-42 | m/z = 507.24($C_{35}H_{30}BNO_2$ = 507.44) |
| Sub3-43 | m/z = 583.31($C_{37}H_{39}B_2NO_4$ = 583.34) | Sub3-44 | m/z = 583.31($C_{37}H_{39}B_2NO_4$ = 583.34) |

TABLE 5-continued

| Compound | FD-MS | Compound | FD-MS |
|---|---|---|---|
| Sub3-45 | m/z = 583.31($C_{37}H_{39}B_2NO_4$ = 583.34) | Sub3-46 | m/z = 546.25($C_{37}H_{31}BN_2O_2$ = 546.48) |
| Sub3-47 | m/z = 563.21($C_{37}H_{30}BNO_2S$ = 563.52) | Sub3-48 | m/z = 763.38($C_{49}H_{47}B_2N_3O_4$ = 763.55) |
| Sub3-49 | m/z = 547.23($C_{37}H_{30}BNO_3$ = 547.46) | Sub3-50 | m/z = 584.29($C_{37}H_{38}B_2O_5$ = 584.33) |

Synthesis Example of Sub 4

Sub 4 of Reaction Scheme 7 may be synthesized as shown in Reaction Scheme 8, but there is not limited thereto.

<Reaction Scheme 8>

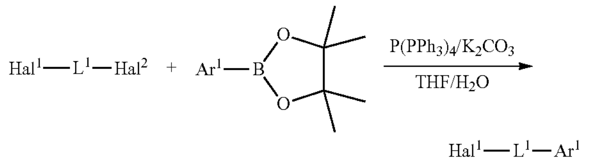

Sub 4

(Hal[1] is I, Br or Cl; Hal[2] is Br or Cl)

(1) Synthesis of Sub4-19

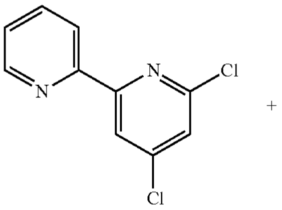

Sub4-19a

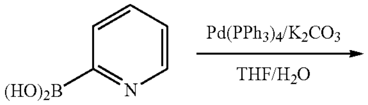

Sub4-19b

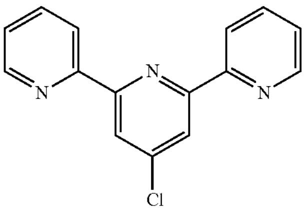

Sub4-19

Sub4-19b (6.55 g, 53.32 mmol), $Pd(PPh_3)_4$ (2.05 g, 1.78 mmol), $K_2CO_3$ (18.42 g, 133.29 mmol), THF (163 ml) and $H_2O$ (81 ml) were added to sub 4-19a (10 g, 44.43 mmol) and the mixture was refluxed at 120° C. for 3 hours. When the reaction was completed, the temperature of the reaction product was cooled to room temperature. The resulting solid was filtered and it dissolved in o-DCB. Then, the resultant was separated by a silica filter and recrystallized to obtain 8.09 g (68%) of the product.

(2) Synthesis of Sub4-34

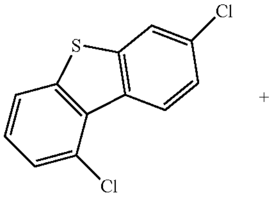

Sub4-34a

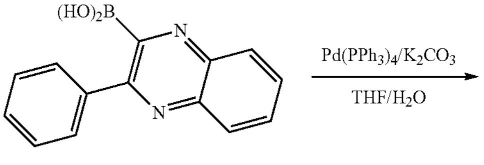

Sub4-34b

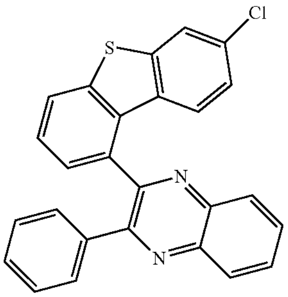

Sub4-34

Sub4-34b (14.22 g, 56.89 mmol), $Pd(PPh_3)_4$ (2.19 g, 1.90 mmol), $K_2CO_3$ (19.66 g, 142.21 mmol), THF (174 ml) and $H_2O$ (87 ml) were added to Sub4-34a (12 g, 47.40 mmol), and then the synthesis was carried out in the same manner as in the synthesis method of Sub4-19 to obtain 13.03 g (65%) of the product.

(3) Synthesis of Sub4-45

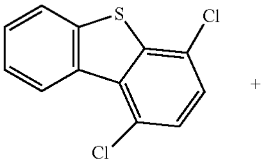

Sub4-45a

-continued

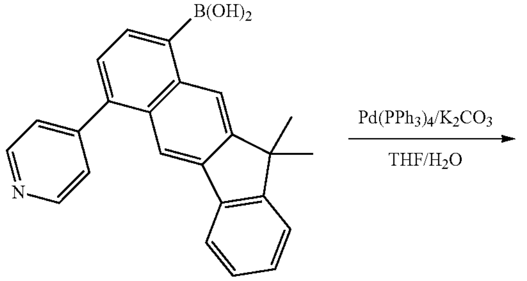

Sub4-45b

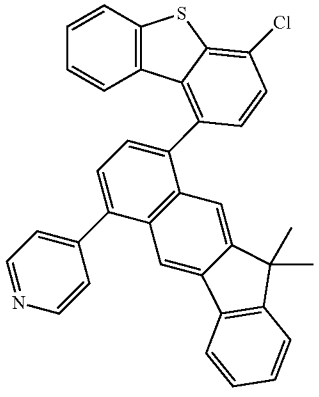

Sub4-45

Sub4-45b (13.85 g, 37.92 mmol), $Pd(PPh_3)_4$ (1.46 g, 1.26 mmol), $K_2CO_3$ (13.10 g, 94.81 mmol), THF (116 ml) and $H_2O$ (58 ml) were added to Sub4-45a (8 g, 31.60 mmol), and then the synthesis was carried out in the same manner as in the synthesis method of Sub4-19 to obtain 10.54 g (62%) of the product.

(4) Synthesis of Sub4-70

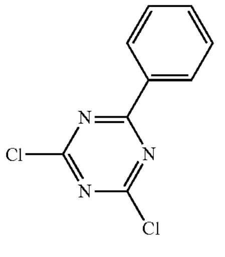

Sub4-70a

+

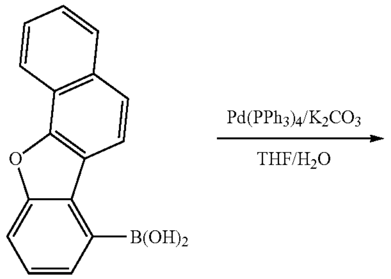

Sub4-70b

-continued

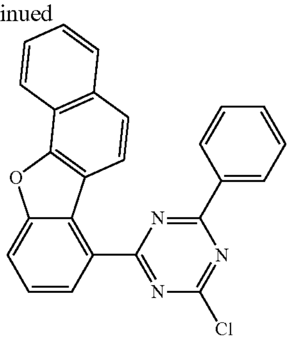

Sub4-70

Sub4-70b (20.87 g, 79.62 mmol), $Pd(PPh_3)_4$ (3.07 g, 2.65 mmol), $K_2CO_3$ (27.51 g, 199.06 mmol), THF (243 ml) and $H_2O$ (122 ml) were added to Sub4-70a (15 g, 66.35 mmol), and then the synthesis was carried out in the same manner as in the synthesis method of Sub4-19 to obtain 19.49 g (72%) of the product.

(5) Synthesis of Sub4-83

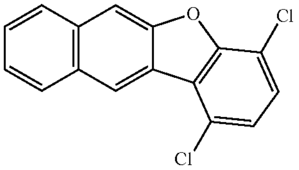

Sub4-83a

+

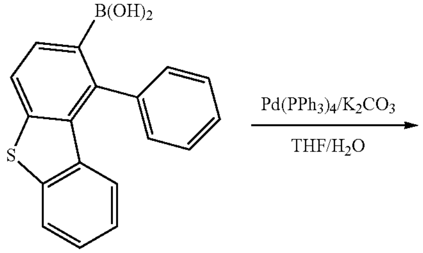

Sub4-83b

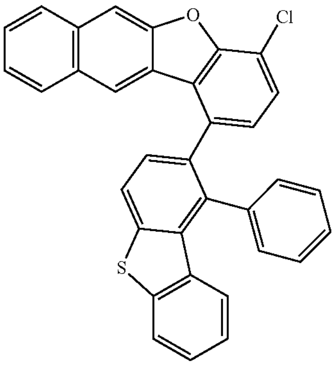

Sub4-83

Sub4-83b (13.98 g, 45.97 mmol), $Pd(PPh_3)_4$ (1.77 g, 1.53 mmol), $K_2CO_3$ (15.88 g, 114.93 mmol), THF (140 ml) and $H_2O$ (70 ml) were added to Sub4-83a (11 g, 38.31 mmol), and then the synthesis was carried out in the same manner as in the synthesis method of Sub4-19 to obtain 14.49 g (74%) of the product.

(6) Synthesis of Sub4-105

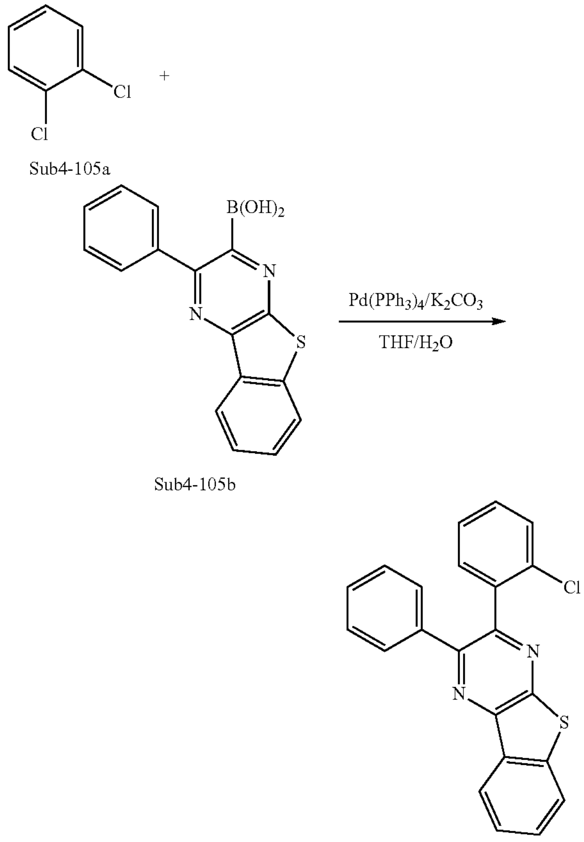

Sub4-105a

Sub4-105b

Sub4-105

Sub4-105b (44.99 g, 146.94 mmol), $Pd(PPh_3)_4$ (5.66 g, 4.9 mmol), $K_2CO_3$ (50.77 g, 367.35 mmol), THF (449 ml) and $H_2O$ (224 ml) were added to Sub4-105a (18 g, 122.45 mmol), and then the synthesis was carried out in the same manner as in the synthesis method of Sub4-19 to obtain 31.50 g (69%) of the product.

Compounds belong to Sub 4 are as follows, but are not limited thereto, and FD-MS values of the compounds are shown in Table 6 below.

Sub4-1

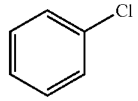

Sub4-2

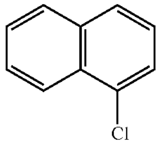

-continued

Sub4-3

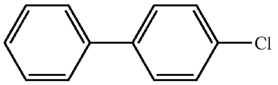

Sub4-4

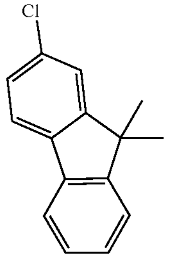

Sub4-5

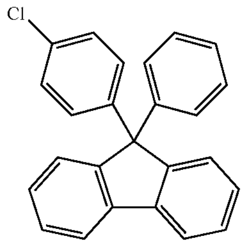

Sub4-6

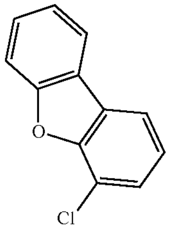

Sub4-7

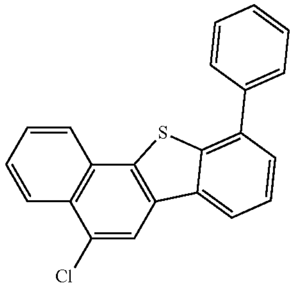

Sub4-8

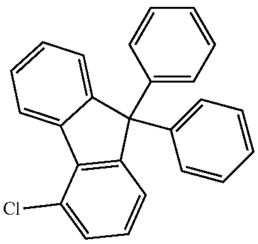

Sub4-9

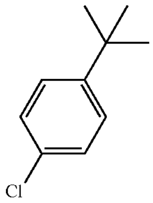

-continued
Sub4-10
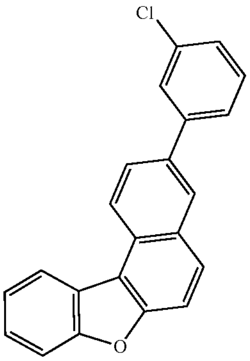
Sub4-11
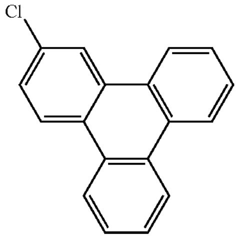
Sub4-12
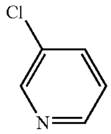
Sub4-13
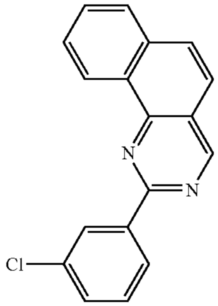
Sub4-14
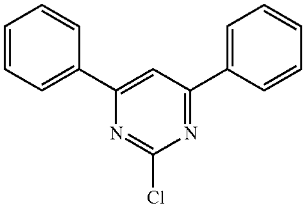
Sub4-15
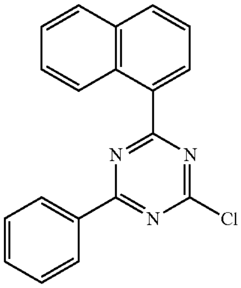
-continued
Sub4-16
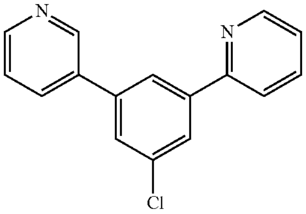
Sub4-17
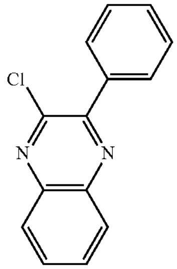
Sub4-18
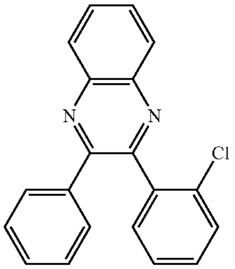
Sub4-19
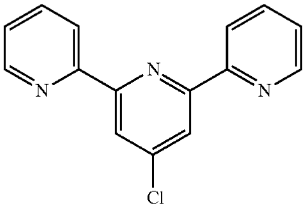
Sub4-20
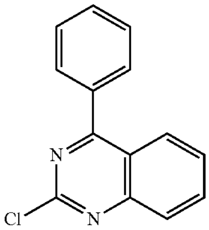
Sub4-21
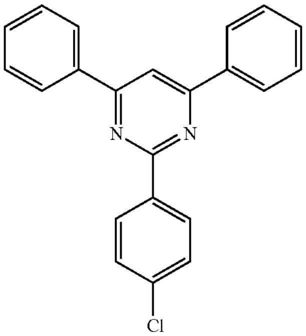

-continued
Sub4-22
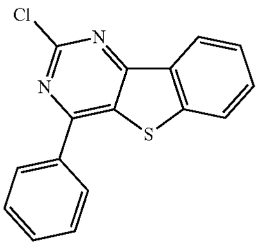
Sub4-23
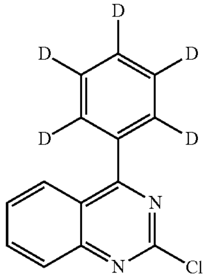
Sub4-24
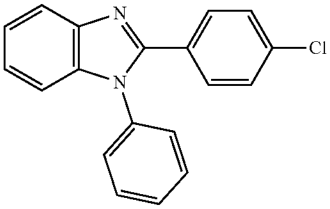
Sub4-25
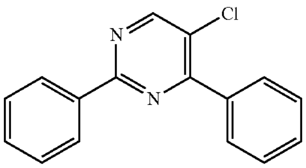
Sub4-26
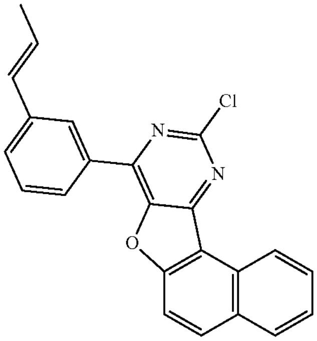
Sub4-27
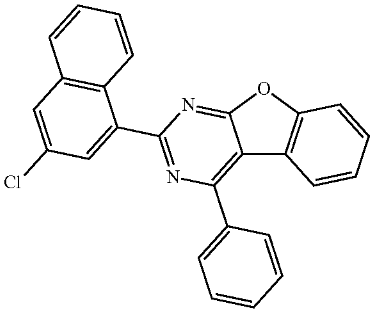
-continued
Sub4-28
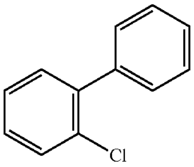
Sub4-29
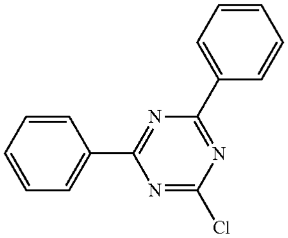
Sub4-30
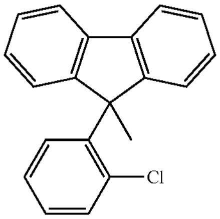
Sub4-31
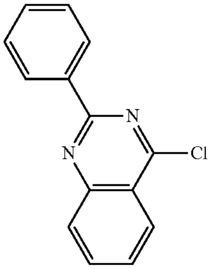
Sub4-32
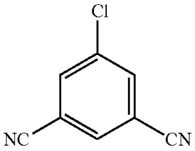
Sub4-33
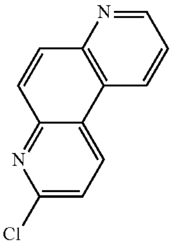

-continued
Sub4-34
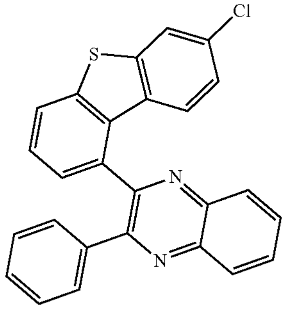
Sub4-35
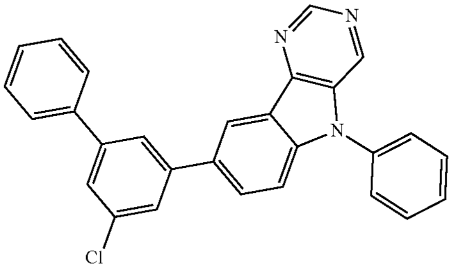
Sub4-36
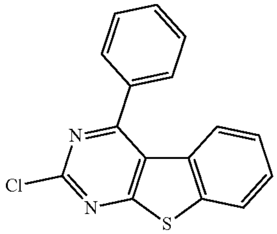
Sub4-37
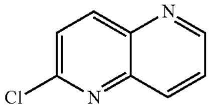
Sub4-38
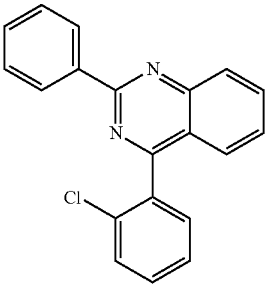
Sub4-39
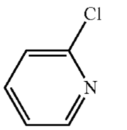
Sub4-40
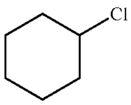
-continued
Sub4-41
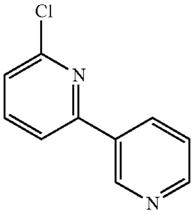
Sub4-42
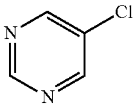
Sub4-43
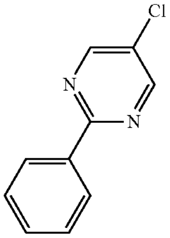
Sub4-44
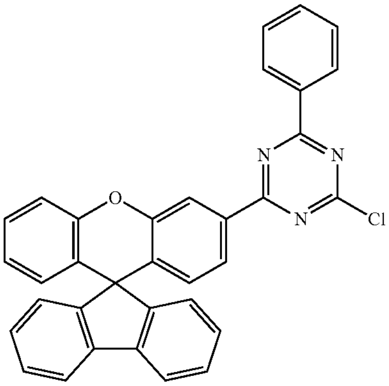
Sub4-45
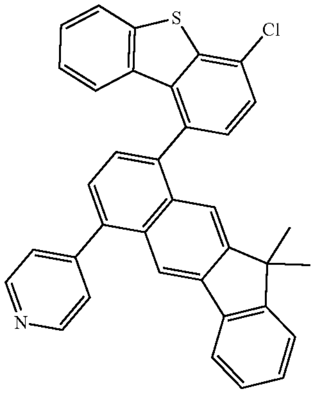

-continued
Sub4-46
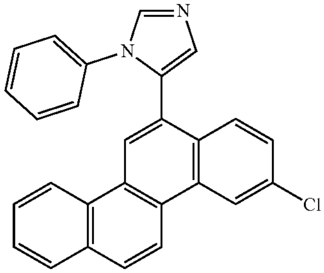
Sub4-47
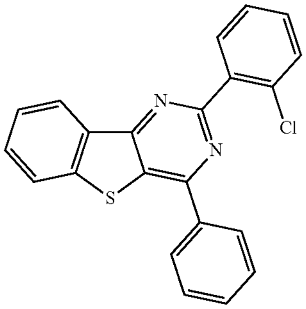
Sub4-48
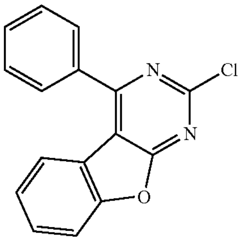
Sub4-49
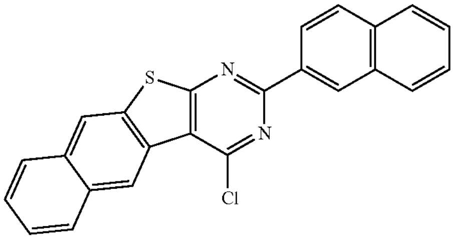
Sub4-50
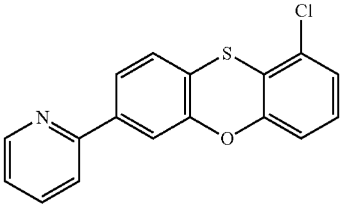
Sub4-51
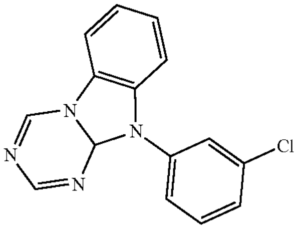
-continued
Sub4-52
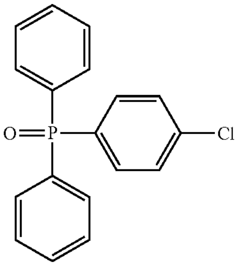
Sub4-53
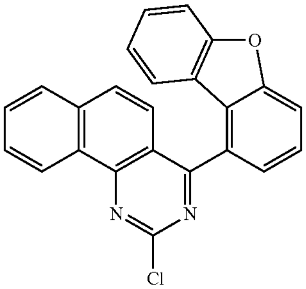
Sub4-54
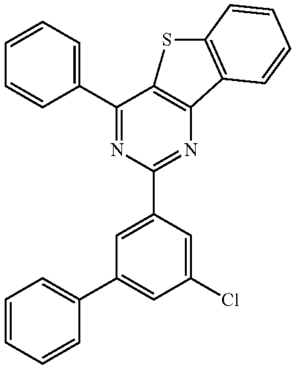
Sub4-55
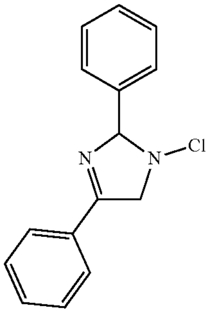

-continued
Sub4-56
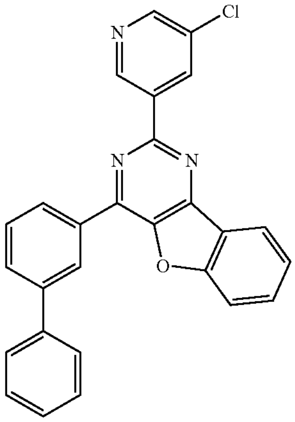
Sub4-57
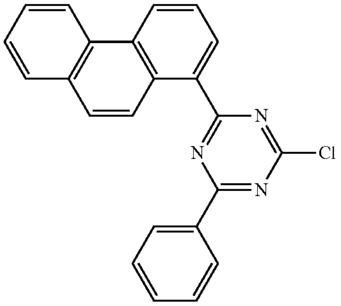
Sub4-58
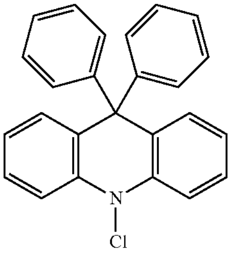
Sub4-59
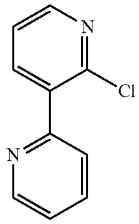
Sub4-60
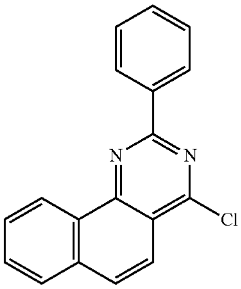
-continued
Sub4-61
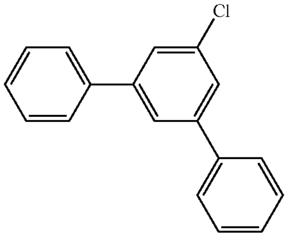
Sub4-62
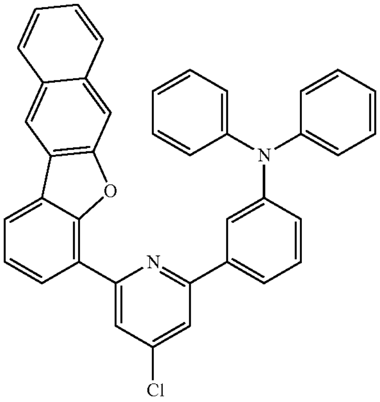
Sub4-63
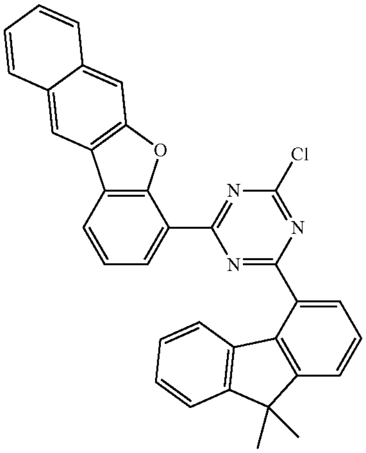
Sub4-64
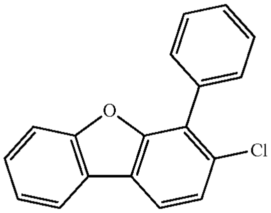

-continued
Sub4-65
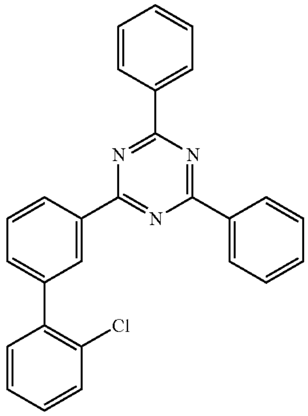
Sub4-66
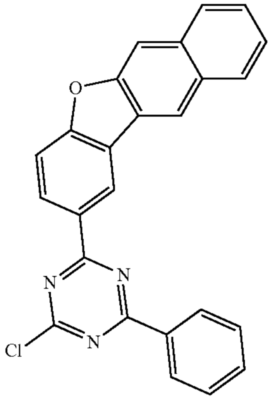
Sub4-67
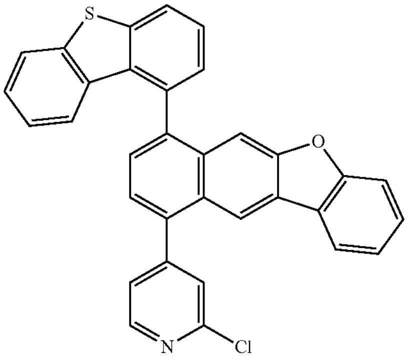
Sub4-68
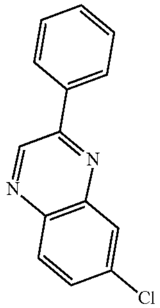
-continued
Sub4-69
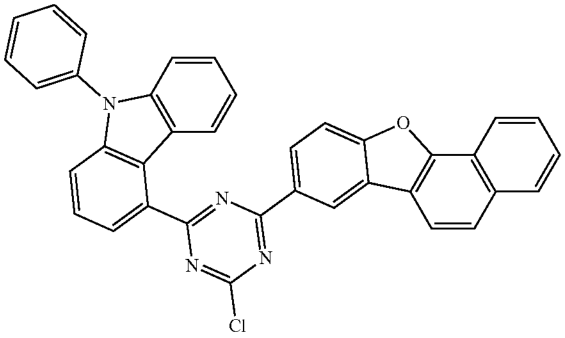
Sub4-70
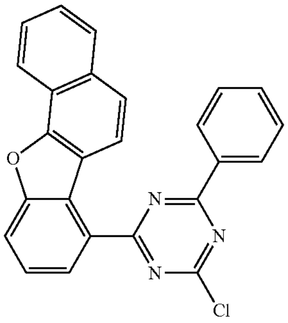
Sub4-71
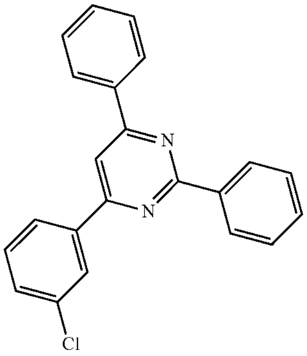
Sub4-72
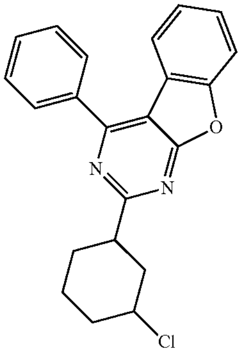

-continued
Sub4-73
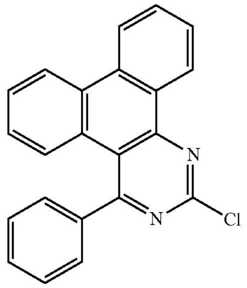
Sub4-74
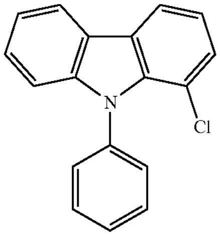
Sub4-75
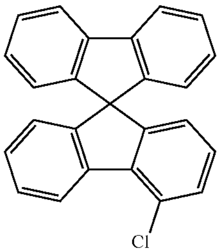
Sub4-76
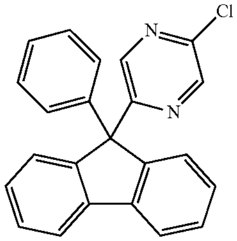
Sub4-77
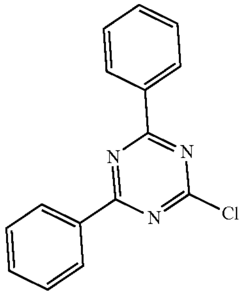
Sub4-78
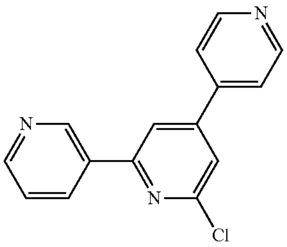
-continued
Sub4-79
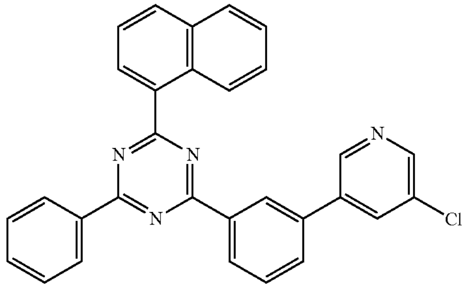
Sub4-80
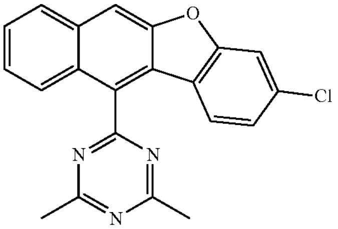
Sub4-81
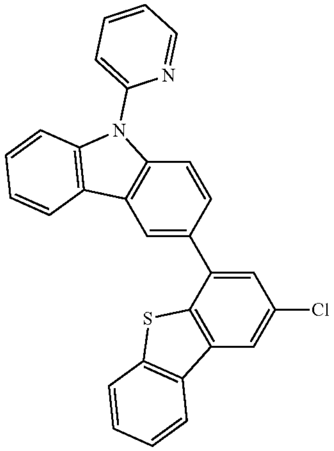
Sub4-82
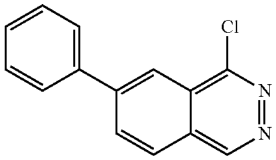
Sub4-83
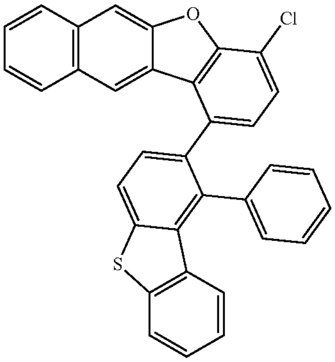

-continued
Sub4-84
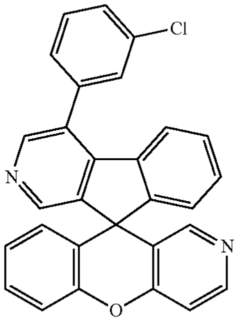
Sub4-85
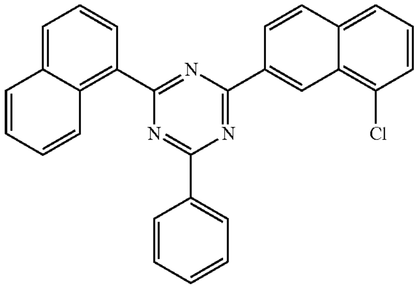
Sub4-86
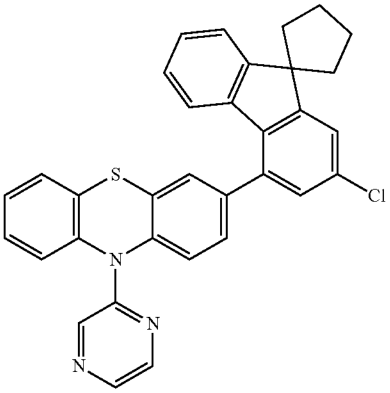
Sub4-87
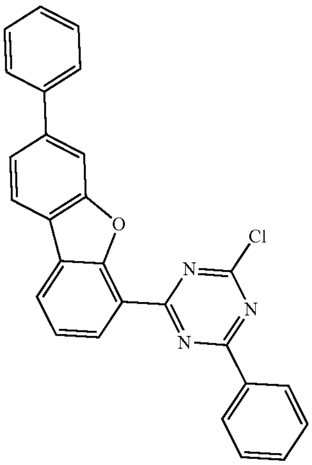
-continued
Sub4-88
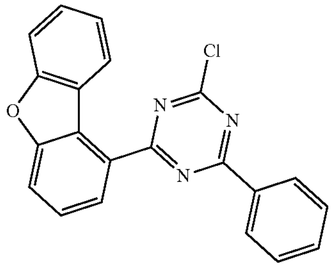
Sub4-89
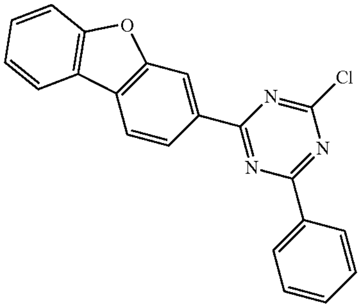
Sub4-90
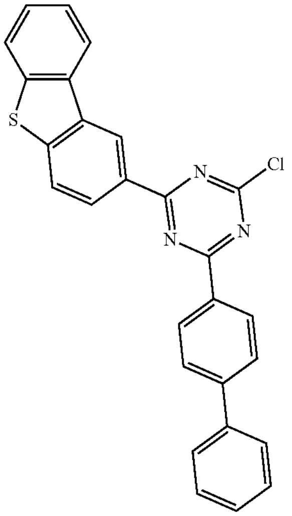
Sub4-91
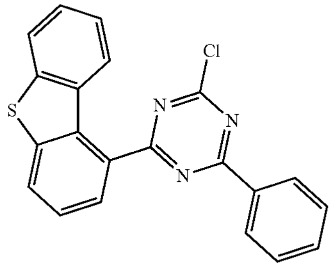

-continued
Sub4-92
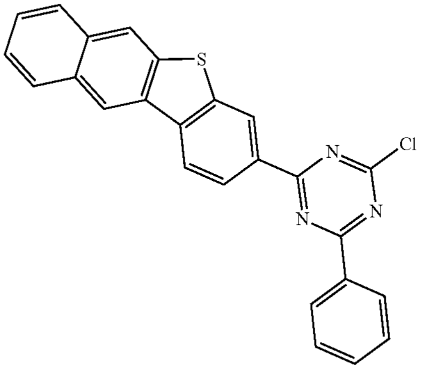
Sub4-93
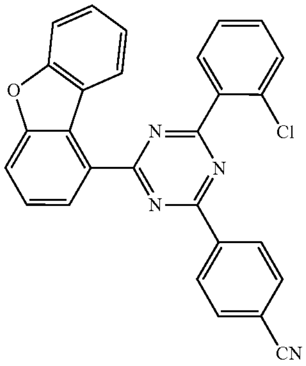
Sub4-94
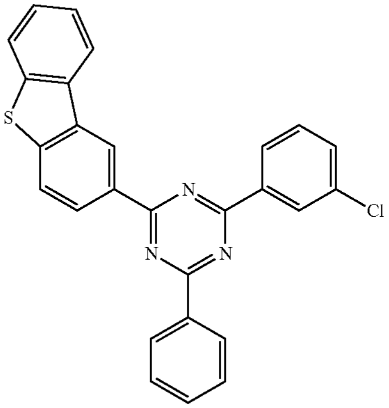
-continued
Sub4-95
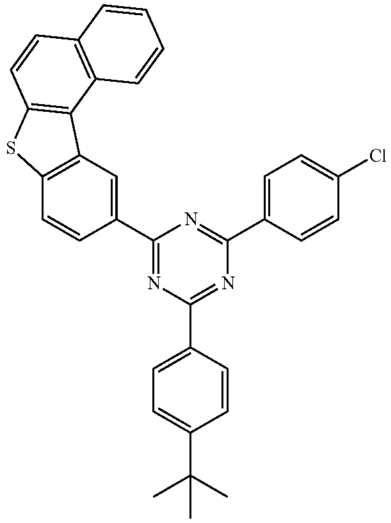
Sub4-96
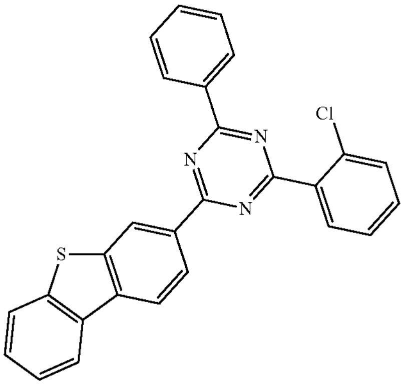
Sub4-97
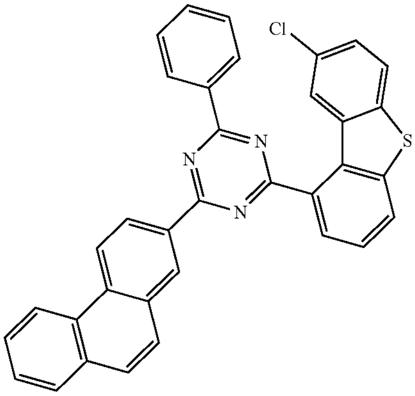

-continued
Sub4-98
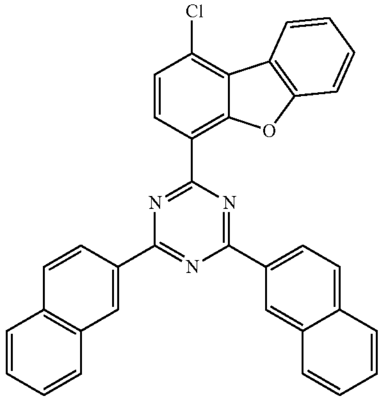
Sub4-99
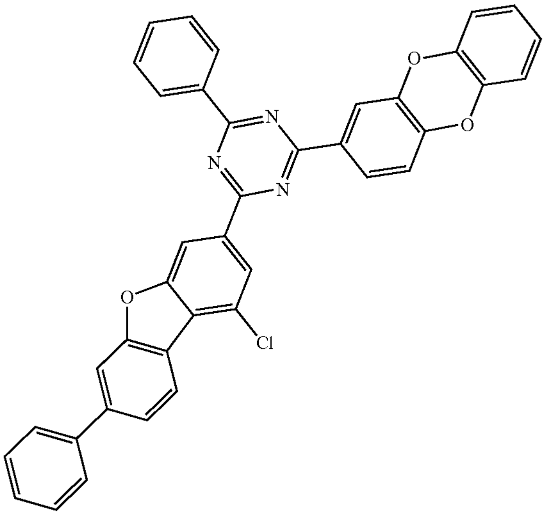
Sub4-100
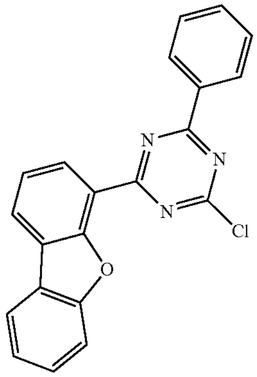
-continued
Sub4-101
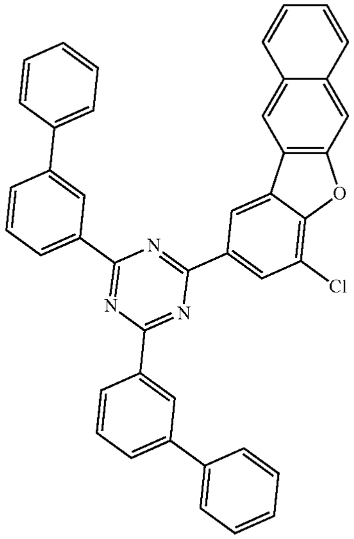
Sub4-102
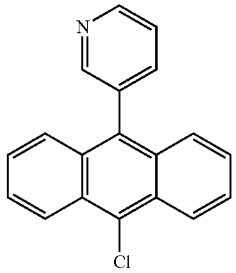
Sub4-103
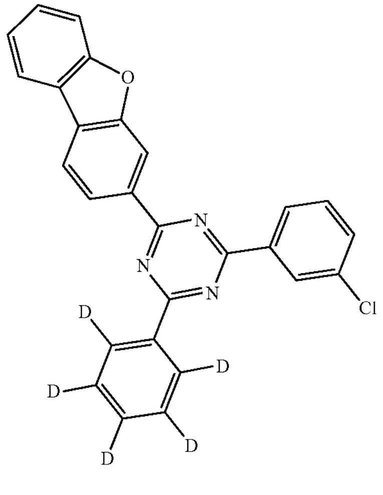
Sub4-104
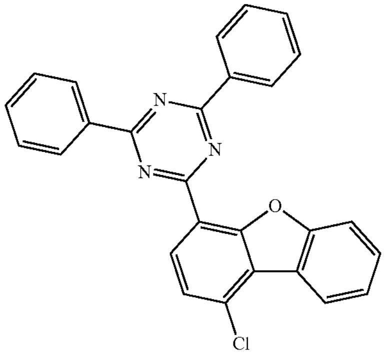

-continued

Sub4-105

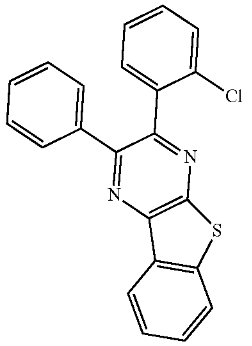

Sub4-106

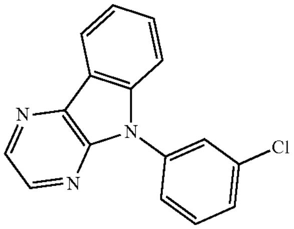

TABLE 6

| Compound | FD-MS | Compound | FD-MS |
|---|---|---|---|
| Sub4-1 | m/z = 112.01($C_6H_5Cl$ = 112.56) | Sub4-2 | m/z = 162.02($C_{10}H_7Cl$ = 162.62) |
| Sub4-3 | m/z = 188.04($C_{12}H_9Cl$ = 188.65) | Sub4-4 | m/z = 228.07($C_{15}H_{13}Cl$ = 228.72) |
| Sub4-5 | m/z = 352.1($C_{25}H_{17}Cl$ = 352.86) | Sub4-6 | m/z = 202.02($C_{12}H_7ClO$ = 202.64) |
| Sub4-7 | m/z = 344.04($C_{22}H_{13}ClS$ = 344.86) | Sub4-8 | m/z = 352.1($C_{25}H_{17}Cl$ = 352.86) |
| Sub4-9 | m/z = 168.07($C_{10}H_{13}Cl$ = 168.66) | Sub4-10 | m/z = 328.07($C_{22}H_{13}ClO$ = 328.8) |
| Sub4-11 | m/z = 262.05($C_{18}H_{11}Cl$ = 262.74) | Sub4-12 | m/z = 113($C_5H_4ClN$ = 113.54) |
| Sub4-13 | m/z = 290.06($C_{18}H_{11}ClN_2$ = 290.75) | Sub4-14 | m/2 = 266.06($C_{16}H_{11}ClN_2$ = 266.73) |
| Sub4-15 | m/z = 317.07($C_{19}H_{12}ClN_3$ = 317.78) | Sub4-16 | m/z = 266.06($C_{16}H_{11}ClN_2$ = 266.73) |
| Sub4-17 | m/z = 240.05($C_{14}H_9ClN_2$ = 240.69) | Sub4-18 | m/z = 316.08($C_{20}H_{13}ClN_2$ = 316.79) |
| Sub4-19 | m/z = 267.06($C_{15}H_{10}ClN_3$ = 267.72) | Sub4-20 | m/z = 240.05($C_{14}H_9ClN_2$ = 240.69) |
| Sub4-21 | m/z = 342.09($C_{22}H_{15}ClN_2$ = 342.83) | Sub4-22 | m/z = 296.02($C_{16}H_9ClN_2S$ = 296.77) |
| Sub4-23 | m/z = 245.08($C_{14}H_4D_5ClN_2$ = 245.72) | Sub4-24 | m/z = 304.08($C_{19}H_{13}ClN_2$ = 304.78) |
| Sub4-25 | m/z = 266.06($C_{16}H_{11}ClN_2$ = 266.73) | Sub4-26 | m/z = 370.09($C_{23}H_{15}ClN_2O$ = 370.84) |
| Sub4-27 | m/z = 406.09($C_{26}H_{15}ClN_2O$ = 406.87) | Sub4-28 | m/z = 188.04($C_{12}H_9Cl$ = 188.65) |
| Sub4-29 | m/z = 267.06($C_{15}H_{10}ClN_3$ = 267.72) | Sub4-30 | m/z = 290.09($C_{20}H_{15}Cl$ = 290.79) |
| Sub4-31 | m/z = 162($C_8H_3ClN_2$ = 162.58) | Sub4-32 | m/z = 214.03($C_{12}H_7ClN_2$ = 214.65) |
| Sub4-33 | m/z = 214.03($C_{12}H_7ClN_2$ = 214.65) | Sub4-34 | m/z = 422.06($C_{26}H_{15}ClN_2S$ = 422.93) |
| Sub4-35 | m/z = 214.03($C_{12}H_7ClN_2$ = 214.65) | Sub4-36 | m/z = 422.06($C_{26}H_{15}ClN_2S$ = 422.93) |
| Sub4-37 | m/z = 164.01($C_sH_5ClN_2$ = 164.59) | Sub4-38 | m/z = 316.08($C_{20}H_{13}ClN_2$ = 316.79) |
| Sub4-39 | m/z = 113($C_5H_4ClN$ = 113.54) | Sub4-40 | m/z = 118.05($C_6H_{11}Cl$ = 118.6) |
| Sub4-41 | m/z = 190.03($C_{10}H_7ClN_2$ = 190.63) | Sub4-42 | m/z = 114($C_4H_3ClN_2$ = 114.53) |
| Sub4-43 | m/z = 190.03($C_{10}H_7ClN_2$ = 190.63) | Sub4-44 | m/z = 521.13($C_{34}H_{20}ClN_3O$ = 522) |
| Sub4-45 | m/z = 537.13($C_{36}H_{24}ClNS$ = 538.11) | Sub4-46 | m/z = 404.11($C_{27}H_{17}ClN_2$ = 404.9) |
| Sub4-47 | m/z = 372.05($C_{22}H_{13}ClN_2S$ = 372.87) | Sub4-48 | m/z = 280.04($C_{16}H_9ClN_2O$ = 280.71) |
| Sub4-49 | m/z = 396.05($C_{24}H_{13}ClN_2S$ = 396.89) | Sub4-50 | m/z = 311.02($C_{17}H_{10}ClNOS$ = 311.78) |
| Sub4-51 | m/z = 282.07($C_{15}H_{11}ClN_4$ = 282.73) | Sub4-52 | m/z = 312.05($C_{18}H_{14}ClOP$ = 312.73) |
| Sub4-53 | m/z = 380.07($C_{24}H_{13}ClN_2O$ = 380.83) | Sub4-54 | m/z = 448.08($C_{28}H_{17}ClN_2S$ = 448.97) |
| Sub4-55 | m/z = 256.08($C_{15}H_{13}ClN_2$ = 256.73) | Sub4-56 | m/z = 433.1($C_{27}H_{16}ClN_3O$ = 433.9) |
| Sub4-57 | m/z = 367.09($C_{23}H_{14}ClN_3$ = 367.84) | Sub4-58 | m/z = 367.11($C_{25}H_{18}ClN$ = 367.88) |
| Sub4-59 | m/z = 190.03($C_{10}H_7ClN_2$ = 190.63) | Sub4-60 | m/z = 290.06($C_{18}H_{11}ClN_2$ = 290.75) |
| Sub4-61 | m/z = 264.07($C_{18}H_{13}Cl$ = 264.75) | Sub4-62 | m/z = 572.17($C_{39}H_{25}ClN_2O$ = 573.09) |
| Sub4-63 | m/z = 523.15($C_{34}H_{22}ClN_3O$ = 524.02) | Sub4-64 | m/z = 278.05($C_{18}H_{11}ClO$ = 278.74) |
| Sub4-65 | m/z = 419.12($C_{27}H_{18}ClN_3$ = 419.91) | Sub4-66 | m/z = 407.08($C_{25}H_{14}ClN_3O$ = 407.86) |
| Sub4-67 | m/z = 511.08($C_{33}H_{18}ClNOS$ = 512.02) | Sub4-68 | m/z = 240.05($C_{14}H_9ClN_2$ = 240.69) |
| Sub4-69 | m/z = 572.14($C_{37}H_{21}ClN_4O$ = 573.05) | Sub4-70 | m/z = 407.08($C_{25}H_{14}ClN_3O$ = 407.86) |
| Sub4-71 | m/z = 342.09($C_{22}H_{15}ClN_2$ = 342.83) | Sub4-72 | m/z = 362.12($C_{22}H_{19}ClN_2O$ = 362.86) |
| Sub4-73 | m/z = 340.08($C_{22}H_{13}ClN_2$ = 340.81) | Sub4-74 | m/z = 277.07($C_{18}H_{12}ClN$ = 277.75) |
| Sub4-75 | m/z = 350.09($C_{25}H_{15}Cl$ = 350.85) | Sub4-76 | m/z = 354.09($C_{23}H_{15}ClN_2$ = 354.84) |
| Sub4-77 | m/z = 267.06($C_{15}H_{10}ClN_3$ = 267.72) | Sub4-78 | m/z = 267.06($C_{15}H_{10}ClN_3$ = 267.72) |
| Sub4-79 | m/z = 470.13($C_{30}H_{19}ClN_4$ = 470.96) | Sub4-80 | m/z = 359.08($C_{21}H_{14}ClN_3O$ = 359.81) |
| Sub4-81 | m/z = 460.08($C_{29}H_{17}ClN_2S$ = 460.98) | Sub4-82 | m/z = 240.05($C_{14}H_9ClN_2$ = 240.69) |
| Sub4-83 | m/z = 510.08($C_{34}H_{19}ClOS$ = 511.04) | Sub4-84 | m/z = 444.1($C_{29}H_{17}ClN_2O$ = 444.92) |
| Sub4-85 | m/z = 443.12($C_{29}H_{18}ClN_3$ = 443.93) | Sub4-86 | m/z = 529.14($C_{33}H_{24}ClN_3S$ = 530.09) |
| Sub4-87 | m/z = 433.1($C_{27}H_{16}ClN_3O$ = 433.9) | Sub4 88 | m/z = 357.07($C_{21}H_{12}ClN_3O$ = 357.8) |
| Sub4-89 | m/z = 357.07($C_{21}H_{12}ClN_3O$ = 357.8) | Sub4-90 | m/z = 449.08($C_{27}H_{16}ClN_3S$ = 449.96) |

TABLE 6-continued

| Compound | FD-MS | Compound | FD-MS |
|---|---|---|---|
| Sub4-91 | m/z = 373.04($C_{21}H_{12}ClN_3S$ = 373.86) | Sub4-92 | m/z = 423.06($C_{25}H_{14}ClN_3S$ = 423.92) |
| Sub4-93 | m/z = 458.09($C_{28}H_{15}ClN_4O$ = 458.91) | Sub4-94 | m/z = 449.08($C_{27}H_{16}ClN_3S$ = 449.96) |
| Sub4-95 | m/z = 555.15($C_{35}H_{26}ClN_3S$ = 556.12) | Sub4-96 | m/z = 449.08($C_{27}H_{16}ClN_3S$ = 449.96) |
| Sub4-97 | m/z = 549.11($C_{35}H_{20}ClN_3S$ = 550.08) | Sub4-98 | m/z = 533.13($C_{35}H_{20}ClN_3O$ = 534.02) |
| Sub4-99 | m/z = 615.13($C_{39}H_{22}ClN_3O_3$ = 616.07) | Sub4-100 | m/z = 357.07($C_{21}H_{12}ClN_3O$ = 357.8) |
| Sub4-101 | m/z = 635.18($C_{43}H_{26}ClN_3O$ = 636.15) | Sub4-102 | m/z = 289.07($C_{19}H_{12}ClN$ = 289.76) |
| Sub4-103 | m/z = 438.13($C_{27}H_{11}D_5ClN_3O$ = 438.93) | Sub4-104 | m/z = 433.1($C_{27}H_{16}ClN_3O$ = 433.9) |
| Sub4-105 | m/z = 372.05($C_{22}H_{13}ClN_2S$ = 372.87) | Sub4-106 | m/z = 279.06($C_{16}H_{10}ClN_3$ = 279.73) |

Synthesis Example of Final Product

1. Synthesis of Z1-15

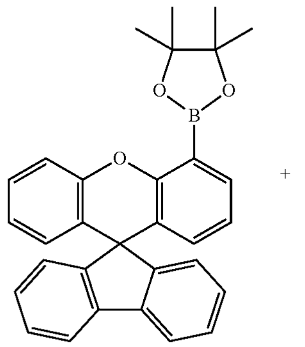

Sub3-1

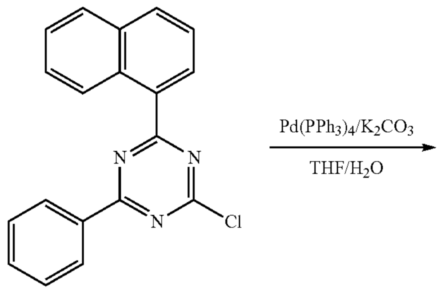

Sub4-15

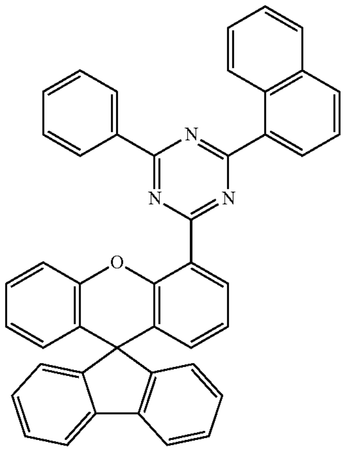

Z1-15

Sub 3-1 (16 g, 34.91 mmol) and Sub 4-15 (13.31 g, 41.889 mmol) were placed in a round-bottom flask and the mixture was dissolved in THF (128 ml). $Pd(PPh_3)_4$ (1.61 g, 1.40 mmol), $K_2CO_3$ (14.47 g, 104.72 mmol) and water (64 ml) were placed into the round-bottom flask and the mixture was stirred under reflux. When the reaction was completed, the reaction product was extracted with ether and water and an organic layer was concentrated. The concentrated organic layer was dried over $MgSO_4$ and concentrated once more. The final concentrate was separated by a silica gel column and recrystallized to obtain 17.14 g (yield 80%) of a product.

2. Synthesis of Z1-35

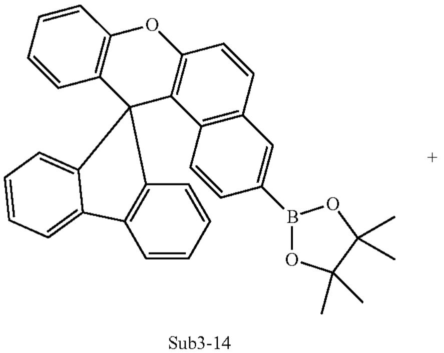

Sub3-14

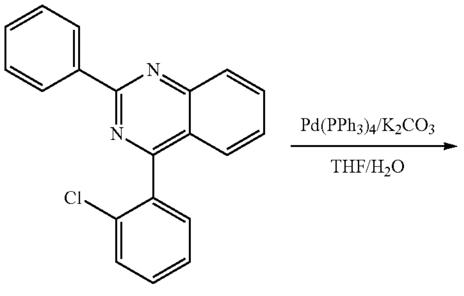

Sub4-38

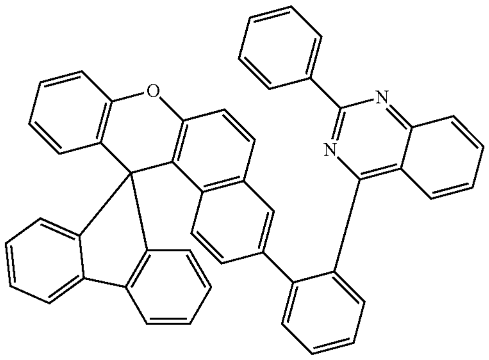

Z1-35

Sub 3-14 (12 g, 23.60 mmol and Sub 4-38 (8.97 g, 28.32 mmol) were placed in a round-bottom flask and the mixture was dissolved in THF. $Pd(PPh_3)_4$ (0.04 eq.), $K_2CO_3$ (3 eq.) and water were added into the round-bottom flask, and then the synthesis was carried out in the same manner as in the synthesis method of Z1-15 to obtain 11.26 g (yield 72%) of the product.

3. Synthesis of Z2-1

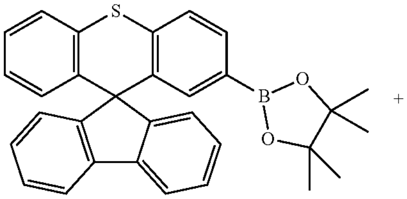

Sub3-19

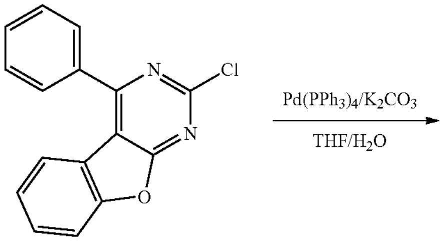

Sub4-48

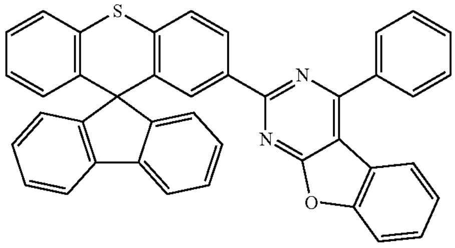

Z2-1

Sub 3-19 (21 g, 44.26 mmol) and Sub 4-48 (14.91 g, 53.12 mmol) were placed in a round-bottom flask and the mixture was dissolved in THF. $Pd(PPh_3)_4$ (0.04 eq.), $K_2CO_3$ (3 eq.) and water were added into the round-bottom flask, and then the synthesis was carried out in the same manner as in the synthesis method of Z1-15 to obtain 20.20 g (yield 77%) of the product.

4. Synthesis of Z3-12

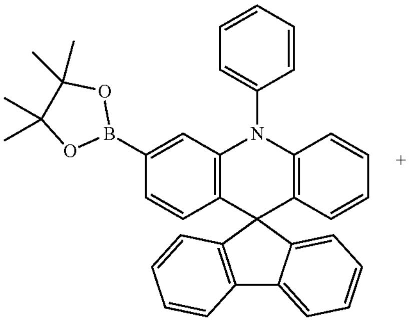

Sub3-38

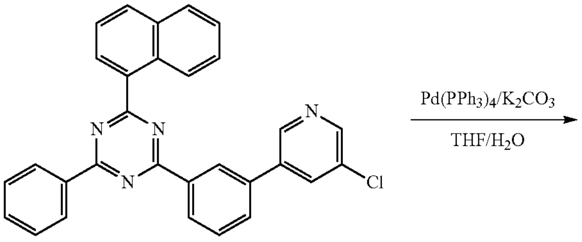

Sub4-79

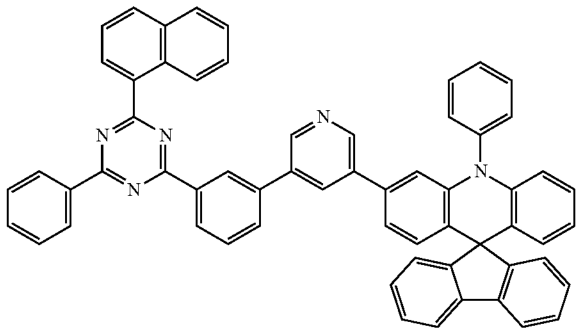

Z3-12

Sub 3-38 (19 g, 35.62 mmol) and Sub 4-79 (20.13 g, 42.74 mmol) were placed in a round-bottom flask and the mixture was dissolved in THF. $Pd(PPh_3)_4$ (0.04 eq.), $K_2CO_3$ (3 eq.) and water were added into the round-bottom flask, and then the synthesis was carried out in the same manner as in the synthesis method of Z1-15 to obtain 22.49 g (yield 75%) of the product.

5. Synthesis of Z3-33

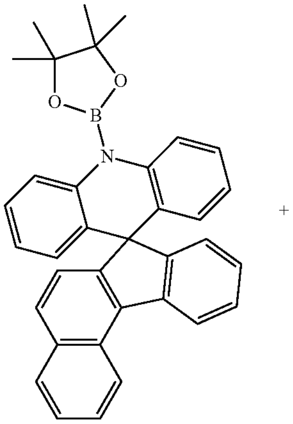

Sub3-42

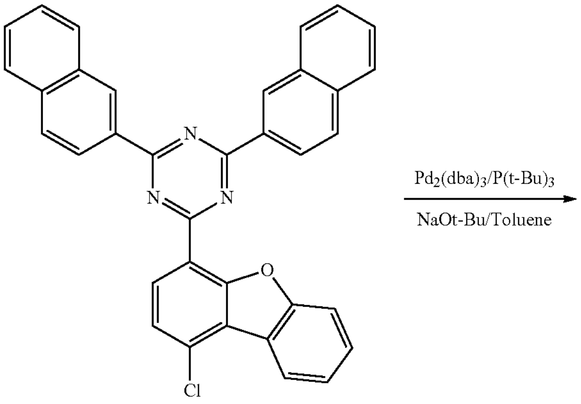

Sub4-98

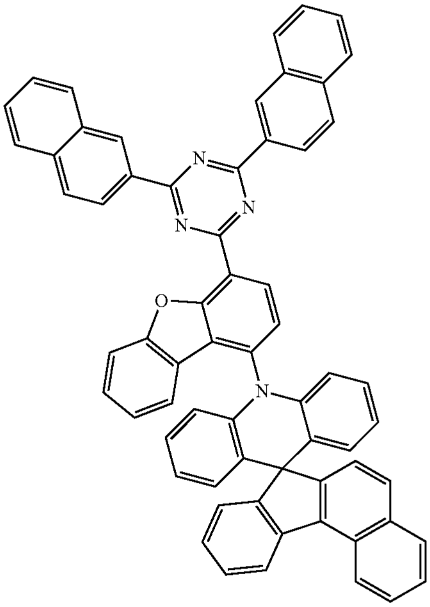

Z3-33

After Sub3-42 (15 g, 29.56 mmol) was dissolved in toluene (296 mL), Sub4-98 (15.79 g, 29.56 mmol), $Pd_2(dba)_3$ (0.81 g, 0.89 mmol), $P(t-Bu)_3$ (0.48 g, 2.36 mmol) and NaOt-Bu (8.52 g, 88.68 mmol) were added to the solution and the mixture was stirred at 60° C. When the reaction was completed, the reaction product was extracted with $CH_2Cl_2$ and water and an organic layer was dried over $MgSO_4$ and concentrated. Thereafter, the concentrate was separated by a silica gel column and recrystallized to obtain 18.19 g (yield 70%) of a product.

6. Synthesis of Z3-43

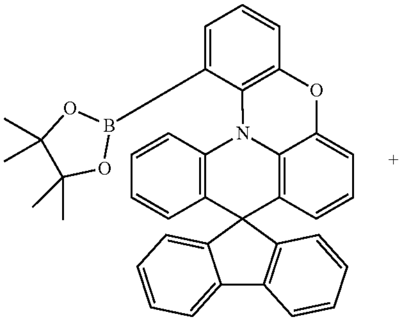

Sub3-49

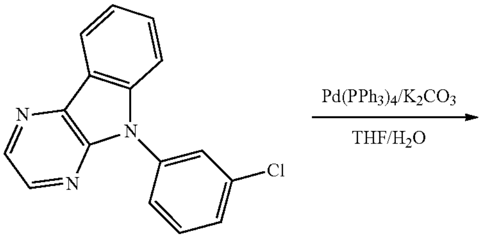

Sub4-106

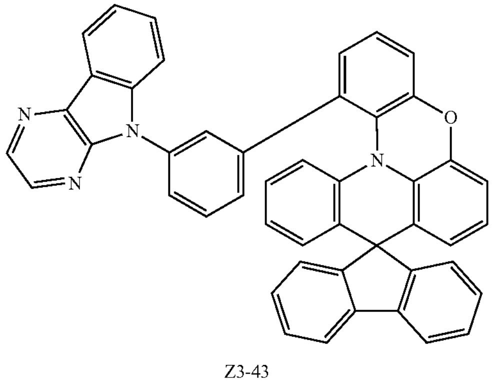

Z3-43

Sub 3-49 (8 g, 14.61 mmol) and Sub 4-106 (4.91 g, 17.54 mmol) were placed in a round-bottom flask and the mixture was dissolved in anhydrous THF. $Pd(PPh_3)_4$ (0.04 eq.), $K_2CO_3$ (3 eq.), anhydrous THF and water were added into the round-bottom flask, and then the synthesis was carried out in the same manner as in the synthesis method of Z1-15 to obtain 6.61 g (yield 68%) of the product.

FD-MS values of the compounds Z1-1 to Z3-43 of the present invention synthesized by the above synthesis method are shown in Table 7 below.

TABLE 7

| Compound | FD-MS | Compound | FD-MS |
|---|---|---|---|
| Z1-1 | m/z = 408.15($C_{31}H_{20}O$ = 408.5) | Z1-2 | m/z = 458.17($C_{35}H_{22}O$ = 458.56) |
| Z1-3 | m/z = 484.18($C_{37}H_{24}O$ = 484.6) | Z1-4 | m/z = 524.21($C_{40}H_{28}O$ = 524.66) |
| Z1-5 | m/z = 648.25($C_{50}H_{32}O$ = 648.81) | Z1-6 | m/z = 498.16($C_{37}H_{22}O_2$ = 498.58) |
| Z1-7 | m/z = 640.19($C_{47}H_{28}OS$ = 640.8) | Z1-8 | m/z = 648.25($C_{50}H_{32}O$ = 648.81) |
| Z1-9 | m/z = 464.21($C_{35}H_{28}O$ = 464.61) | Z1-10 | m/z = 624.21($C_{47}H_{28}O_2$ = 624.74) |
| Z1-11 | m/z = 558.2($C_{43}H_{26}O$ = 558.68) | Z1-12 | m/z = 409.15($C_{30}H_{19}NO$ = 409.49) |
| Z1-13 | m/z = 586.2($C_{43}H_{26}N_2O$ = 586.69) | Z1-14 | m/z = 562.2($C_{41}H_{26}N_2O$ = 562.67) |
| Z1-15 | m/z = 613.22($C_{44}H_{27}N_3O$ = 613.72) | Z1-16 | m/z = 562.2($C_{41}H_{26}N_2O$ = 562.67) |
| Z1-17 | m/z = 536.19($C_{39}H_{24}N_2O$ = 536.63) | Z1-18 | m/z = 612.22($C_{45}H_{28}N_2O$ = 612.73) |
| Z1-19 | m/z = 563.2($C_{40}H_{25}N_3O$ = 563.66) | Z1-20 | m/z = 536.19($C_{39}H_{24}N_2O$ = 536.63) |
| Z1-21 | m/z = 638.24($C_{47}H_{30}N_2O$ = 638.77) | Z1-22 | m/z = 592.16($C_{41}H_{24}N_2OS$ = 592.72) |
| Z1-23 | m/z = 541.22($C_{39}H_{19}D_5N_2O$ = 541.66) | Z1-24 | m/z = 600.22($C_{44}H_{28}N_2O$ = 600.72) |
| Z1-25 | m/z = 562.2($C_{41}H_{26}N_2O$ = 562.67) | Z1-26 | m/z = 666.23($C_{48}H_{30}N_2O_2$ = 666.78) |
| Z1-27 | m/z = 702.23($C_{51}H_{30}N_2O_2$ = 702.81) | Z1-28 | m/z = 688.25($C_{51}H_{32}N_2O$ = 688.83) |
| Z1-29 | m/z = 689.22($C_{48}H_{27}N_5O$ = 689.78) | Z1-30 | m/z = 764.28($C_{57}H_{36}N_2O$ = 764.93) |
| Z1-31 | m/z = 718.21($C_{51}H_{30}N_2OS$ = 718.87) | Z1-32 | m/z = 942.34($C_{69}H_{42}N_4O$ = 943.12) |
| Z1-33 | m/z = 642.18($C_{45}H_{26}N_2OS$ = 642.78) | Z1-34 | m/z = 510.17($C_{37}H_{22}N_2O$ = 510.6) |
| Z1-35 | m/z = 662.24($C_{49}H_{30}N_2O$ = 662.79) | Z1-36 | m/z = 539.19($C_{39}H_{25}NO_2$ = 539.63) |
| Z1-37 | m/z = 668.28($C_{49}H_{36}N_2O$ = 668.84) | Z1-38 | m/z = 586.2($C_{43}H_{26}N_2O$ = 586.69) |
| Z1-39 | m/z = 817.27($C_{59}H_{35}N_3O_2$ = 817.95) | Z1-40 | m/z = 833.28($C_{61}H_{39}NOS$ = 834.05) |
| Z1-41 | m/z = 562.2($C_{41}H_{26}N_2O$ = 562.67) | | |
| Z2-1 | m/z = 592.16($C_{41}H_{24}N_2OS$ = 592.72) | Z2-2 | m/z = 629.19($C_{44}H_{27}N_3S$ = 629.78) |
| Z2-3 | m/z = 716.23($C_{52}H_{32}N_2S$ = 716.9) | Z2-4 | m/z = 760.2($C_{53}H_{32}N_2S_2$ = 760.97) |
| Z2-5 | m/z = 552.17($C_{39}H_{24}N_2S$ = 552.7) | Z2-6 | m/z = 708.17($C_{49}H_{28}N_2S_2$ = 708.9) |
| Z2-7 | m/z = 641.13($C_{42}H_{24}FNOS_2$ = 641.78) | Z2-8 | m/z = 594.19($C_{40}H_{26}N_4S$ = 594.74) |
| Z2-9 | m/z = 568.2($C_{40}H_{28}N_2S$ = 568.74) | Z2-10 | m/z = 760.2($C_{53}H_{32}N_2S_2$ = 760.97) |
| Z2-11 | m/z = 692.19($C_{49}H_{28}N_2OS$ = 692.84) | Z2-12 | m/z = 555.18($C_{38}H_{25}N_3S$ = 555.7) |
| Z2-13 | m/z = 624.17($C_{43}H_{29}OPS$ = 624.74) | Z2-14 | m/z = 745.22($C_{52}H_{31}N_3OS$ = 745.9) |
| Z2-15 | m/z = 679.23($C_{50}H_{33}NS$ = 679.88) | Z2-16 | m/z = 652.2($C_{47}H_{28}N_2S$ = 652.82) |
| Z2-17 | m/z = 626.21($C_{47}H_{30}S$ = 626.82) | Z2-18 | m/z = 729.22($C_{52}H_{31}N_3S$ = 729.9) |
| Z2-19 | m/z = 633.23($C_{45}H_{23}D_5N_2S$ = 633.82) | Z2-20 | m/z = 728.23($C_{53}H_{32}N_2S$ = 728.91) |
| Z2-21 | m/z = 772.29($C_{56}H_{40}N_2S$ = 773.01) | Z2-22 | m/z = 961.31($C_{69}H_{43}N_3OS$ = 962.18) |
| Z2-23 | m/z = 884.26($C_{62}H_{36}N_4OS$ = 885.06) | Z2-24 | m/z = 835.27($C_{59}H_{37}N_3OS$ = 836.03) |
| Z2-25 | m/z = 719.2($C_{50}H_{29}N_3OS$ = 719.86) | Z2-26 | m/z = 719.2($C_{50}H_{29}N_3OS$ = 719.86) |
| Z2-27 | m/z = 719.2($C_{50}H_{29}N_3OS$ = 719.86) | Z2-28 | m/z = 823.2($C_{58}H_{33}NOS_2$ = 824.03) |
| Z2-29 | m/z = 794.24($C_{57}H_{34}N_2OS$ = 794.97) | Z2-30 | m/z = 731.24($C_{52}H_{33}N_3S$ = 731.92) |
| Z3-1 | m/z = 713.28($C_{53}H_{35}N_3$ = 713.88) | Z3-2 | m/z = 733.31($C_{53}H_{39}N_3O$ = 733.92) |
| Z3-3 | m/z = 711.27($C_{53}H_{33}N_3$ = 711.87) | Z3-4 | m/z = 802.31($C_{59}H_{38}N_4$ = 802.98) |
| Z3-5 | m/z = 725.28($C_{54}H_{35}N_3$ = 725.9) | Z3-6 | m/z = 721.28($C_{56}H_{35}N$ = 721.9) |
| Z3-7 | m/z = 648.26($C_{49}H_{32}N_2$ = 648.81) | Z3-8 | m/z = 726.3($C_{55}H_{38}N_2$ = 726.92) |
| Z3-9 | m/z = 638.25($C_{46}H_{30}N_4$ = 638.77) | Z3-10 | m/z = 638.25($C_{46}H_{30}N_4$ = 638.77) |
| Z3-11 | m/z = 688.26($C_{50}H_{32}N_4$ = 688.83) | Z3-12 | m/z = 841.32($C_{61}H_{39}N_5$ = 842.02) |
| Z3-13 | m/z = 730.27($C_{52}H_{34}N_4O$ = 730.87) | Z3-14 | m/z = 831.27($C_{60}H_{37}N_3S$ = 832.04) |
| Z3-15 | m/z = 611.24($C_{45}H_{29}N_3$ = 611.75) | Z3-16 | m/z = 883.27($C_{63}H_{37}N_3OS$ = 884.07) |
| Z3-17 | m/z = 865.31($C_{64}H_{39}N_3O$ = 866.04) | Z3-18 | m/z = 738.28($C_{54}H_{34}N_4$ = 738.89) |
| Z3-19 | m/z = 788.29($C_{58}H_{36}N_4$ = 788.95) | Z3-20 | m/z = 900.33($C_{64}H_{44}N_4S$ = 901.14) |
| Z3-21 | m/z = 652.23($C_{46}H_{28}N_4O$ = 652.76) | Z3-22 | m/z = 728.26($C_{52}H_{32}N_4O$ = 728.86) |
| Z3-23 | m/z = 728.26($C_{52}H_{32}N_4O$ = 728.86) | Z3-24 | m/z = 818.27($C_{58}H_{34}N_4O_2$ = 818.94) |
| Z3-25 | m/z = 744.23($C_{52}H_{32}N_4S$ = 744.92) | Z3-26 | m/z = 724.27($C_{50}H_{36}N_4S$ = 724.93) |
| Z3-27 | m/z = 718.22($C_{50}H_{30}N_4S$ = 718.88) | Z3-28 | m/z = 753.25($C_{53}H_{31}N_5O$ = 753.87) |
| Z3-29 | m/z = 744.23($C_{52}H_{32}N_4S$ = 744.92) | Z3-30 | m/z = 850.31($C_{60}H_{42}N_4S$ = 851.08) |
| Z3-31 | m/z = 762.23($C_{52}H_{31}FN_4S$ = 762.91) | Z3-32 | m/z = 844.27($C_{60}H_{36}N_4S$ = 845.04) |
| Z3-33 | m/z = 878.3($C_{64}H_{38}N_4O$ = 879.04) | Z3-34 | m/z = 910.29($C_{64}H_{38}N_4O_3$ = 911.03) |
| Z3-35 | m/z = 930.34($C_{68}H_{42}N_4O$ = 931.11) | Z3-36 | m/z = 731.24($C_{49}H_{29}N_7O$ = 731.82) |
| Z3-37 | m/z = 733.29($C_{52}H_{27}D_5N_4O$ = 733.89) | Z3-38 | m/z = 728.26($C_{52}H_{32}N_4O$ = 728.86) |
| Z3-39 | m/z = 727.27($C_{52}H_{33}N_5$ = 727.87) | Z3-40 | m/z = 673.25($C_{50}H_{31}N_3$ = 673.82) |
| Z3-41 | m/z = 773.2($C_{53}H_{31}N_3S_2$ = 773.97) | Z3-42 | m/z = 663.27($C_{49}H_{33}N_3$ = 663.82) |
| Z3-43 | m/z = 664.23($C_{47}H_{28}N_4O$ = 664.77) | | |

Manufacturing and Evaluation of Organic Electric Element

[Test Example 1] to [Test Example 20] Red Organic Electroluminescent Element (Mixed-Phosphorescent Host of a Light Emitting Layer)

After A hole injection layer having a thickness of 60 nm was formed by vacuum-deposition of 4,4',4"-tris[2-naphthyl (phenyl)amino]triphenylamine (hereinafter, abbreviated as 2-TNATA) on an ITO layer (anode), N,N'-bis(1-naphthalenyl)-N,N'-bis-phenyl-(1,1'-biphenyl)-4,4'-diamine (hereinafter, abbreviated as NPB) was vacuum-deposited to a thickness of 60 nm to form a hole transport layer on the hole injection layer.

Next, as shown in Table 8 below, a light emitting layer having a thickness of 30 nm was formed on the hole transport layer, wherein a mixture of compound represented by Formula 1 (first host) and compound represented by Formula 2 (second host) in a ratio of 3:7 was used as host, and bis-(1-phenylisoquinolyl)iridium (III)acetylacetonate (hereinafter, abbreviated as $(piq)_2Ir(acac)$) was used as dopant, and the dopant was doped so that the host and dopant had a weight ratio of 95:5.

Thereafter, (1,1'-biphenyl-4-olato)bis(2-methyl-8-quinolinolato)aluminum (hereinafter, abbreviated as BAlq) was vacuum-deposited to a thickness of 10 nm on the light-emitting layer to form a hole blocking layer and tris-(8-hydroxyquinoline)aluminum (hereinafter, abbreviated as "$Alq_3$") was vacuum-deposited to a thickness of 40 nm on the hole blocking layer to form an electron transport layer.

Thereafter, LiF was deposited to a thickness of 0.2 nm to form, and then Al was deposited to a thickness of 150 nm to form a cathode.

[Comparative Example 1] to [Comparative Example 4]

Organic electroluminescent element was manufactured in the same manner as in Test Example 1, except that Compound 11-4, 12-1, Z1-42 or Z1-43 was each used alone as host of the light emitting layer.

[Comparative Example 5] and [Comparative Example 6]

Organic electroluminescent element was manufactured in the same manner as in Test Example 1, except that the following comparative compound 1 was used as the first host material of the light emitting layer, and the compound Z1-42 or Z1-43 was used as the second host material.

[Comparative Example 7] and [Comparative Example 8]

Organic electroluminescent element was manufactured in the same manner as in Test Example 1, except that the following comparative compound 2 was used as the first host material of the light emitting layer, and the compound Z1-42 or Z1-43 was used as the second host material.

A forward bias DC voltage was applied to the o electroluminescent elements manufactured in Test Examples 1 to 65 and Comparative Examples 1 to 8 and electroluminescence (EL) characteristics were measured with a PR-650 manufactured by photo research and lifetime (T95) was measured with a lifetime measuring device manufactured by Mc Science at 2500 cd/$m^2$ standard luminance. The measurement results are shown in Table 8 below.

<Comparative compound 1>

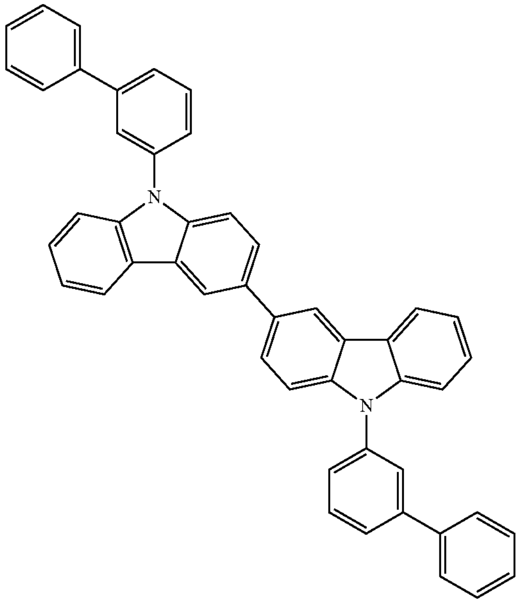

<Comparative compound 2>

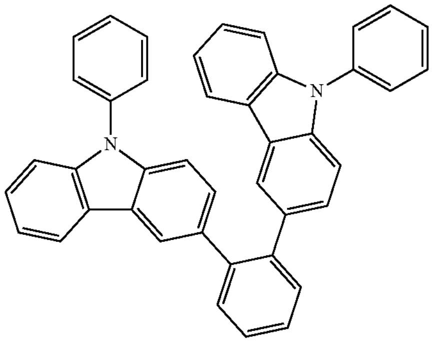

TABLE 8

| | Host 1 | Host 2 | Voltage (V) | Current Density (mA/cm$^2$) | Brightness (cd/m$^2$) | Efficiency (cd/A) | Lifetime T(95) |
|---|---|---|---|---|---|---|---|
| comp. Ex (1) | 11-4 | — | 6.1 | 16.4 | 2500 | 15.2 | 82.4 |
| comp. Ex (2) | 12-1 | — | 5.8 | 13.5 | 2500 | 18.5 | 93.7 |
| comp. Ex (3) | Z1-42 | | 5.6 | 12.6 | 2500 | 19.9 | 100.1 |
| comp. Ex (4) | Z1-43 | | 5.6 | 13.0 | 2500 | 19.3 | 101.4 |
| comp. Ex (5) | Comp. compd1 | Z1-42 | 5.4 | 8.8 | 2500 | 28.4 | 112.7 |
| comp. Ex (6) | | Z1-43 | 5.4 | 9.0 | 2500 | 27.8 | 113.4 |
| comp. Ex (7) | Comp. compd2 | Z1-42 | 5.5 | 9.2 | 2500 | 27.3 | 111.9 |
| comp. Ex (8) | | Z1-43 | 5.5 | 9.4 | 2500 | 26.7 | 112.2 |
| Test Ex. (1) | 3-32 | Z1-15 | 4.9 | 6.4 | 2500 | 39.2 | 137.2 |
| Test Ex. (2) | | Z1-23 | 4.9 | 6.3 | 2500 | 39.4 | 137.5 |
| Test Ex. (3) | | Z1-27 | 5.0 | 6.4 | 2500 | 39.0 | 136.7 |
| Test Ex. (4) | | Z1-33 | 5.0 | 6.5 | 2500 | 38.3 | 136.5 |
| Test Ex. (5) | | Z1-42 | 5.1 | 6.6 | 2500 | 37.7 | 135.9 |
| Test Ex. (6) | | Z1-43 | 5.1 | 6.7 | 2500 | 37.5 | 135.6 |
| Test Ex. (7) | | Z2-13 | 5.1 | 6.7 | 2500 | 37.3 | 135.2 |
| Test Ex. (8) | | Z2-21 | 5.1 | 6.7 | 2500 | 37.1 | 134.8 |
| Test Ex. (9) | | Z2-30 | 4.9 | 6.5 | 2500 | 38.5 | 136.8 |
| Test Ex. (10) | | Z3-1 | 4.9 | 6.4 | 2500 | 38.8 | 137.0 |
| Test Ex. (11) | | Z3-10 | 4.9 | 6.4 | 2500 | 39.3 | 137.4 |
| Test Ex. (12) | | Z3-32 | 5.0 | 6.6 | 2500 | 38.1 | 136.3 |
| Test Ex. (13) | | Z3-41 | 5.0 | 6.6 | 2500 | 37.9 | 136.1 |
| Test Ex. (14) | 4-21 | Z1-15 | 4.8 | 6.6 | 2500 | 37.7 | 135.2 |
| Test Ex. (15) | | Z1-23 | 4.8 | 6.6 | 2500 | 38.0 | 135.6 |

TABLE 8-continued

| | Host 1 | Host 2 | Voltage (V) | Current Density ($mA/cm^2$) | Brightness ($cd/m^2$) | Efficiency (cd/A) | Lifetime T(95) |
|---|---|---|---|---|---|---|---|
| Test Ex. (16) | | Z1-27 | 4.9 | 6.7 | 2500 | 37.5 | 134.5 |
| Test Ex. (17) | | Z1-33 | 4.9 | 6.8 | 2500 | 37.0 | 134.2 |
| Test Ex. (18) | | Z1-42 | 5.0 | 6.8 | 2500 | 36.5 | 133.5 |
| Test Ex. (19) | | Z1-43 | 5.0 | 6.9 | 2500 | 36.2 | 133.3 |
| Test Ex. (20) | | Z2-13 | 5.0 | 6.9 | 2500 | 36.0 | 133.0 |
| Test Ex. (21) | | Z2-21 | 5.0 | 7.0 | 2500 | 35.6 | 132.8 |
| Test Ex. (22) | | Z2-30 | 4.8 | 6.7 | 2500 | 37.1 | 134.7 |
| Test Ex. (23) | | Z3-1 | 4.8 | 6.7 | 2500 | 37.3 | 135.0 |
| Test Ex. (24) | | Z3-10 | 4.8 | 6.6 | 2500 | 37.8 | 135.3 |
| Test Ex. (25) | | Z3-32 | 4.9 | 6.8 | 2500 | 36.9 | 134.1 |
| Test Ex. (26) | | Z3-41 | 4.9 | 6.8 | 2500 | 36.7 | 133.8 |
| Test Ex. (27) | 10-41 | Z1-15 | 4.7 | 6.0 | 2500 | 41.8 | 141.1 |
| Test Ex. (28) | | Z1-23 | 4.7 | 5.9 | 2500 | 42.4 | 141.5 |
| Test Ex. (29) | | Z1-27 | 4.8 | 6.0 | 2500 | 41.5 | 140.1 |
| Test Ex. (30) | | Z1-33 | 4.8 | 6.1 | 2500 | 40.9 | 139.7 |
| Test Ex. (31) | | Z1-42 | 4.9 | 6.2 | 2500 | 40.2 | 139.1 |
| Test Ex. (32) | | Z1-43 | 4.9 | 6.3 | 2500 | 40.0 | 138.9 |
| Test Ex. (33) | | Z2-13 | 4.9 | 6.3 | 2500 | 39.7 | 138.8 |
| Test Ex. (34) | | Z2-21 | 4.9 | 6.3 | 2500 | 39.5 | 138.6 |
| Test Ex. (35) | | Z2-30 | 4.7 | 6.1 | 2500 | 41.1 | 140.3 |
| Test Ex. (36) | | Z3-1 | 4.7 | 6.1 | 2500 | 41.3 | 140.8 |
| Test Ex. (37) | | Z3-10 | 4.7 | 5.9 | 2500 | 42.1 | 141.3 |
| Test Ex. (38) | | Z3-32 | 4.8 | 6.2 | 2500 | 40.6 | 139.5 |
| Test Ex. (39) | | Z3-41 | 4.8 | 6.2 | 2500 | 40.3 | 139.3 |
| Test Ex. (40) | 11-4 | Z1-15 | 5.0 | 6.9 | 2500 | 36.1 | 133.3 |
| Test Ex. (41) | | Z1-23 | 5.0 | 6.8 | 2500 | 36.5 | 133.6 |
| Test Ex. (42) | | Z1-27 | 5.1 | 7.0 | 2500 | 35.9 | 132.8 |
| Test Ex. (43) | | Z1-33 | 5.1 | 7.1 | 2500 | 35.4 | 132.6 |
| Test Ex. (44) | | Z1-42 | 5.2 | 7.2 | 2500 | 34.9 | 131.8 |
| Test Ex. (45) | | Z1-43 | 5.2 | 7.2 | 2500 | 34.7 | 131.5 |
| Test Ex. (46) | | Z2-13 | 5.2 | 7.3 | 2500 | 34.4 | 131.2 |
| Test Ex. (47) | | Z2-21 | 5.2 | 7.3 | 2500 | 34.1 | 130.8 |
| Test Ex. (48) | | Z2-30 | 5.0 | 7.0 | 2500 | 35.5 | 132.9 |
| Test Ex. (49) | | Z3-1 | 5.0 | 7.0 | 2500 | 35.8 | 133.1 |
| Test Ex. (50) | | Z3-10 | 5.0 | 6.9 | 2500 | 36.3 | 133.4 |
| Test Ex. (51) | | Z3-32 | 5.1 | 7.1 | 2500 | 35.2 | 132.4 |
| Test Ex. (52) | | Z3-41 | 5.1 | 7.1 | 2500 | 35.0 | 132.2 |
| Test Ex. (53) | 12-1 | Z1-15 | 4.6 | 6.2 | 2500 | 40.2 | 139.1 |
| Test Ex. (54) | | Z1-23 | 4.6 | 6.2 | 2500 | 40.5 | 139.6 |
| Test Ex. (55) | | Z1-27 | 4.7 | 6.3 | 2500 | 40.0 | 138.5 |
| Test Ex. (56) | | Z1-33 | 4.7 | 6.3 | 2500 | 39.6 | 138.3 |
| Test Ex. (57) | | Z1-42 | 4.8 | 6.4 | 2500 | 39.0 | 137.5 |
| Test Ex. (58) | | Z1-43 | 4.8 | 6.4 | 2500 | 38.8 | 137.3 |
| Test Ex. (59) | | Z2-13 | 4.8 | 6.5 | 2500 | 38.6 | 137.0 |
| Test Ex. (60) | | Z2-21 | 4.8 | 6.5 | 2500 | 38.5 | 136.7 |
| Test Ex. (61) | | Z2-30 | 4.6 | 6.3 | 2500 | 39.7 | 138.6 |
| Test Ex. (62) | | Z3-1 | 4.6 | 6.3 | 2500 | 39.9 | 138.9 |
| Test Ex. (63) | | Z3-10 | 4.6 | 6.2 | 2500 | 40.4 | 139.4 |
| Test Ex. (64) | | Z3-32 | 4.7 | 6.4 | 2500 | 39.3 | 138.1 |
| Test Ex. (65) | | Z3-41 | 4.7 | 6.4 | 2500 | 39.1 | 137.7 |

As can be seen from Table 8, in Comparative Examples 5-8, the characteristics of element were improved compared to Comparative Examples 1-4, and the element characteristics of the present invention were the best, wherein a single material included in Formula 1 or Formula 2 was used as host in Comparative Examples 1-4, a mixture of material included in Formula 2 of the present invention and comparative compound was used as host in Comparative Examples 5-8, and a mixture of compound included in Formula 1 and compound included in Formula 2 was used as host in the present invention.

The reason why the element characteristics of the embodiment of the present invention are the best is as follows. When the compound represented by Formula 1, which has minimal differences in HOMO energy level from the hole transport material, is used as a host, a hole transport from the hole transport layer to a light emitting layer is facilitated, so that holes can be provided to the light emitting layer more quickly. In addition, since the compound represented by Formula 2 of the present invention having a condensed structure has a deep (low) LUMO energy level, the difference of LUMO energy level between the electron transport material is minimized to facilitate the movement of electrons. As a result, the efficiency is improved and the thermal stability is also improved due to the high Tg value.

That is, when the compound represented by Formula 1 and the compound represented by Formula 2 of the present invention are mixed, the injection/transport capability of holes and electrons toward the light emitting layer is improved and the stability is increased. As a result, it seems that the overall driving of the element is improved, the efficiency is increased because the charge balance in the light emitting layer of holes and electrons is increased, so that light emission occurs well inside the light emitting layer rather than the hole transport layer interface, and the overall lifespan of the element is maximized because the deterioration of the HTL interface is also reduced.

This suggests that the entire performance of the element can be improved by electrochemically synergistic action when the compound represented by Formula 1 and the compound represented by Formula 2 are combined and used as a host.

[Test Example 66] and [Test Example 67]

Organic electroluminescent element was manufactured in the same manner as in Test Example 41, except for changing the mixing ratio of the first host and the second host as shown in Table 9 below.

[Test Example 68] and [Test Example 69]

Organic electroluminescent element was manufactured in the same manner as in Test Example 54, except for changing the mixing ratio of the first host and the second host as shown in Table 9 below.

TABLE 9

| | Host 1 | Host 2 | mixing ratio (Host 1: Host 2) | Voltage (V) | Current Density ($mA/cm^2$) | Brightness ($cd/m^2$) | Efficiency (cd/A) | Lifetime T(95) |
|---|---|---|---|---|---|---|---|---|
| Test Ex. (41) | 11-4 | Z1-23 | 3:7 | 5.0 | 6.8 | 2500 | 36.5 | 133.6 |
| Test Ex. (66) | | | 5:5 | 5.1 | 7.1 | 2500 | 35.1 | 132.4 |
| Test Ex. (67) | | | 7:3 | 5.1 | 7.5 | 2500 | 33.4 | 131.7 |
| Test Ex. (54) | 12-1 | Z1-23 | 3:7 | 4.6 | 6.2 | 2500 | 40.5 | 139.6 |
| Test Ex. (68) | | | 5:5 | 4.8 | 6.3 | 2500 | 39.8 | 138.0 |
| Test Ex. (69) | | | 7:3 | 4.9 | 6.4 | 2500 | 39.1 | 137.2 |

As can be seen from Table 9 above, when the mixing ratio of the first host and the second host is changed, the driving voltage, lifespan and efficiency are slightly different. When the first host and the second host are mixed in a ratio of 3:7, the driving voltage, efficiency and lifespan were the best, and as the mixing ratio of the first host was increased, the efficiency and lifespan were slightly decreased.

This result shows that the mixing ratio of a mixture affects the characteristics of the element, and it is suggested that each component of the mixture needs to be properly mixed so that the charge balance in the light emitting layer can be maximized.

Although the exemplary embodiments of the present invention have been described for illustrative purposes, those skilled in the art to which the present invention pertains will be capable of various modifications without departing from the essential characteristics of the present invention. Therefore, the embodiment disclosed herein is intended to illustrate the present invention rather than to limit the present invention and the scope of the present invention is not limited by the embodiments. The scope of the present invention shall be construed on the basis of the accompanying claims, and it shall be construed that all of the technical ideas included within the scope equivalent to the claims belong to the present invention.

What is claimed is:

1. An organic electric element comprising:

a first electrode,;

a second electrode,; and an organic material layer formed between the first electrode and the second electrode, the organic material layer comprising a phosphorescent light emitting layer, including a host, the host comprising a first compound represented by the following Formula 1 and a second compound represented by the following Formula 2:

<Formula 1>

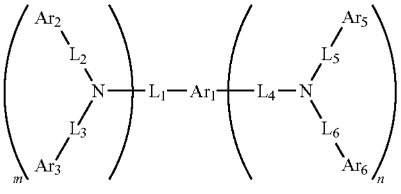

-continued

<Formula 2>

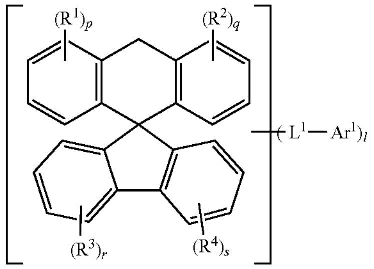

wherein:

$Ar_1$ to $Ar_3$, $Ar_5$, $Ar_6$ and $Ar_1$ are each independently selected from the group consisting of a $C_6$-$C_{60}$ aryl group, a fluorenyl group, a $C_2$-$C_{60}$ heterocyclic group comprising at least one heteroatom selected from the group consisting of O, N, S, Si and P, a $C_3$-$C_{60}$ aliphatic ring, and L'—N($R_a$) ($R_b$), $L_1$ to $L_6$, $L_1$ are each independently selected from the group consisting of a single bond, a $C_6$-$C_{60}$ arylene group, a fluorenylene group, a $C_3$-$C_{60}$ aliphatic ring, and a $C_2$-$C_{60}$ heterocyclic group comprising at least one heteroatom selected from the group consisting of O, N, S, Si and P, $X^1$ is N—La—$Ar^a$, O or S, $R^1$ to $R^4$ are each independently selected from the group consisting of hydrogen, deuterium, halogen, a cyano group, a nitro group, a $C_6$-$C_{60}$ aryl group, a fluorenyl group, a $C_2$-$C_{60}$ heterocyclic group comprising at least one heteroatom selected from the group consisting of O, N, S, Si and P, a $C_3$-$C_{60}$ aliphatic ring, a $C_1$-$C_{30}$ alkyl group, a $C_2$-$C_{30}$ alkenyl group, a $C_2$-$C_{30}$ alkynyl group, a $C_1$-$C_{30}$ alkoxyl group, a $C_6$-$C_{30}$ aryloxy group and —L'—N($R_a$) ($R_b$), and neighboring groups may be bonded to each other to form a ring, n is 0 or 1, m is 1 or 2, and when m is 2, each of a plurality of $L_{2s}$, each of a plurality of $L_{3s}$, each of a plurality of Ares, and each of a plurality of $Ar_{3s}$ are the same as or different from each other, 1 is an integer of 0 to 4, and 1 is not 0 when $X^1$ is O or S, when 1 is an integer of 2 or more, each of a plurality of L's, each of a plurality of $Ar^1$s are the same as or different from each other, p, q, r and s are an integer of 0 to 4, and where each of these is an integer of 2 or more, each of $R^1$s, each of $R^2$s, each of $R^3$s and each of $R^4$s are the same as or different from each other, L' and $L^a$ are each independently selected from the group consisting of a single bond, a $C_6$-$C_{60}$ arylene group, a fluorenylene group, a $C_3$-$C_{60}$ aliphatic ring, a $C_2$-$C_{60}$ heterocyclic group comprising at least one heteroatom selected from the group consisting of O, N, S, Si and P, and a combination thereof, $R_a$, $R_b$ and $Ar^a$ are each independently selected from the group consisting of a $C_6$-$C_{60}$ aryl group, a fluorenyl group, a $C_3$-$C_{60}$ aliphatic ring, and a $C_2$-$C_{60}$ heterocyclic group comprising at least one heteroatom selected from the group consisting of O, N, S, Si and P, and $Ar_1$ to $Ar_3$, $Ar_5$, $Ar_6$, $Ar_1$, L' to $L^a$, $L_1$, $R^1$ to $R^4$, L', $L^a$, $Ar^a$, $R_a$, $R_b$ and the ring formed by linking neighboring groups to each other may be each substituted with one or more substituents selected from the group consisting of deuterium, halogen, a silane group unsubstituted or substituted with a $C_1$-$C_{20}$ alkyl group or a $C_6$-$C_{20}$ aryl group, a siloxane group, a cyano group, a nitro group, a $C_1$-$C_{20}$ alkylthio group, a $C_1$-$C_{20}$ alkoxy group, a $C_6$-$C_{20}$ aryloxy group, a $C_6$-$C_{20}$ arylthio, a $C_1$-$C_{20}$ alkyl group, a $C_2$-$C_{20}$ alkenyl group, a $C_2$-$C_{20}$ alkynyl group, a $C_6$-$C_{20}$ aryl group, a fluorenyl group, a $C_2$-$C_{20}$ heterocyclic group containing at least one heteroatom of O, N, S, Si, and P, a $C_3$-$C_{20}$ aliphatic ring group, a $C_7$-$C_{20}$ arylalkyl group, and a $C_8$-$C_{20}$ arylalkenyl group.

2. The organic electric element of claim 1, wherein Formula 1 is represented by one of the following Formula 1-A-1 to Formula 1-A-5:

<Formula 1-A-1>

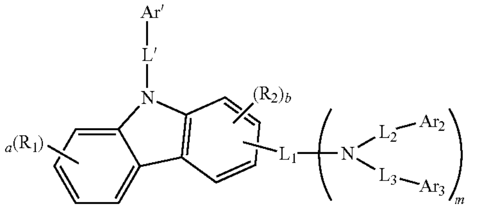

<Formula 1-A-2>

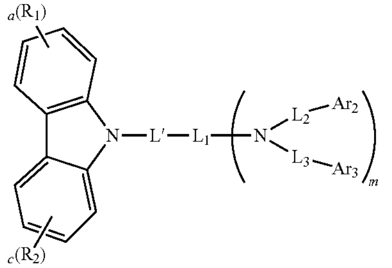

<Formula 1-A-3>

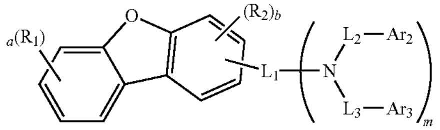

-continued

<Formula 1-A-4>

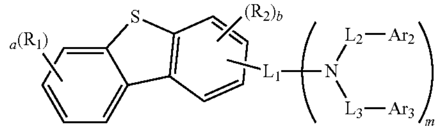

<Formula 1-A-5>

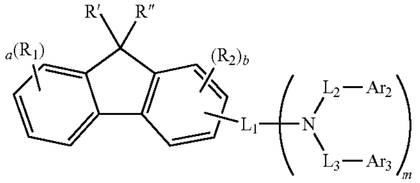

wherein:

$L_1$ to $L_3$, $Ar_2$, $Ar_3$ and m are the same as defined in claim 1,

L' is selected from the group consisting of a single bond, a $C_6$-$C_{20}$ arylene group, a fluorenylene group, a $C_2$-$C_{20}$ heterocyclic group comprising at least one heteroatom selected from the group consisting of O, N, S, Si and P, and a $C_3$-$C_{20}$ aliphatic ring, Ar' is selected from the group consisting of a $C_6$-$C_{20}$ aryl group, a fluorenyl group, a $C_2$-$C_{20}$ heterocyclic group containing at least one heteroatom of O, N, S, Si, and P, and a $C_3$-$C_{20}$ aliphatic ring group, $R_1$, $R_2$, R' and R" are each independently selected from the group consisting of hydrogen, deuterium, halogen, a silane group unsubstituted or substituted with a $C_1$-$C_{20}$ alkyl group or a $C_6$-$C_{20}$ aryl group, a cyano group, a nitro group, a $C_1$-$C_{20}$ alkylthio group, a $C_1$-$C_{20}$ alkoxy group, a $C_6$-$C_{20}$ aryloxy group, a $C_6$-$C_{20}$ arylthio, a $C_1$-$C_{20}$ alkyl group, a $C_2$-$C_{20}$ alkenyl group, a $C_2$-$C_{20}$ alkynyl group, a $C_6$-$C_{20}$ aryl group, a fluorenyl group, a $C_2$-$C_{20}$ heterocyclic group containing at least one heteroatom of O, N, S, Si, and P, and a $C_3$-$C_{20}$ aliphatic ring group, and neighboring groups may be linked to each other to form a ring, and R' and R" may be linked to each other to form a ring, and a and c are each an integer of 0-4, b is an integer of 0-3, and where each of these is an integer of 2 or more, each of $R_{1s}$ and each of $R_{2s}$ are the same as or different from each other.

3. The organic electric element of claim 1, wherein Formula 1 is represented by one of the following Formula 1-B-1 to Formula 1-B-4:

<Formula 1-B-1>

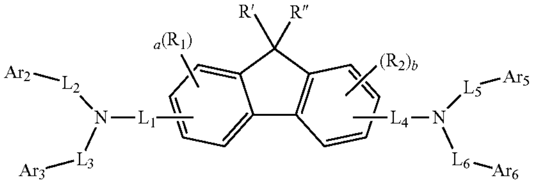

-continued

<Formula 1-B-2>

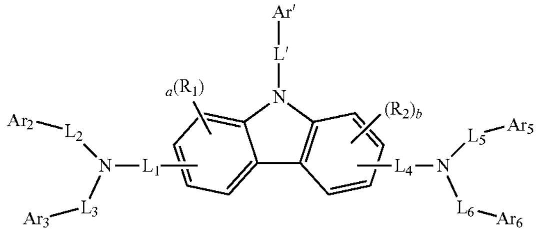

<Formula 1-B-3>

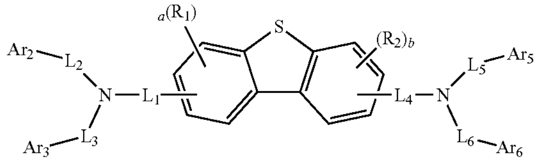

<Formula 1-B-4>

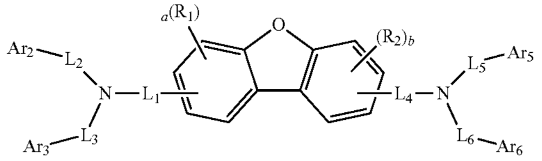

wherein:

$L_1$ to $L_6$, $Ar_2$, $Ar_3$, $Ar_5$ and $Ar_6$ are the same as defined in claim 1, L' is selected from the group consisting of a single bond, a $C_6$-$C_{20}$ arylene group, a fluorenylene group, a $C_2$-$C_{20}$ heterocyclic group comprising at least one heteroatom selected from the group consisting of O, N, S, Si and P, and a $C_3$-$C_{20}$ aliphatic ring, Ar' is selected from the group consisting of a $C_6$-$C_{20}$ aryl group, a fluorenyl group, a $C_2$-$C_{20}$ heterocyclic group containing at least one heteroatom of O, N, S, Si, and P, and a $C_3$-$C_{20}$ aliphatic ring group, $R^1$, $R_2$, R' and R" are each independently selected from the group consisting of hydrogen, deuterium, halogen, a silane group unsubstituted or substituted with a $C_1$-$C_{20}$ alkyl group or a $C_6$-$C_{20}$ aryl group, a cyano group, a nitro group, a $C_1$-$C_{20}$ alkylthio group, a $C_1$-$C_{20}$ alkoxy group, a $C_6$-$C_{20}$ aryloxy group, a $C_6$-$C_{20}$ arylthio, a $C_1$-$C_{20}$ alkyl group, a $C_2$-$C_{20}$ alkenyl group, a $C_2$-$C_{20}$ alkynyl group, a $C_6$-$C_{20}$ aryl group, a fluorenyl group, a $C_2$-$C_{20}$ heterocyclic group containing at least one heteroatom of O, N, S, Si, and P, and a $C_3$-$C_{20}$ aliphatic ring group, and neighboring groups may be linked to each other to form a ring, and R' and R" may be linked to each other to form a ring, and a and b are each an integer of 0-3, and where each of these is an integer of 2 or more, each of $R_{1s}$ and each of $R_{2s}$ are the same as or different from each other.

4. The organic electric element of claim 1, wherein Formula 1 is represented by one of the following Formula 1-C-1 to Formula 1-C-4:

<Formula 1-C-1>

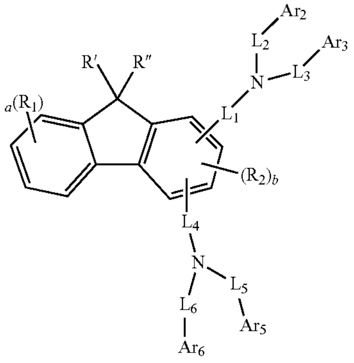

<Formula 1-C-2>

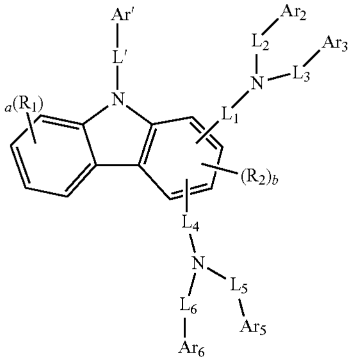

<Formula 1-C-3>

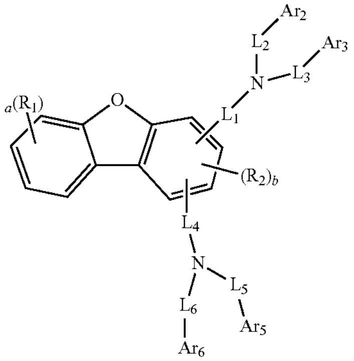

<Formula 1-C-4>

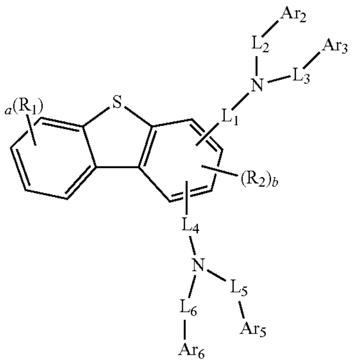

wherein:

$L_1$ to $L_6$, $Ar_2$, $Ar_3$, $Ar_5$ and $Ar_6$ are the same as defined in claim 1, L' is selected from the group consisting of a single bond, a $C_6$-$C_{20}$ arylene group, a fluorenylene group, a $C_2$-$C_{20}$ heterocyclic group comprising at least one heteroatom selected from the group consisting of O, N, S, Si and P, and a $C_3$-$C_{20}$ aliphatic ring, Ar' is selected from the group consisting of a $C_6$-$C_{20}$ aryl group, a fluorenyl group, a $C_2$-$C_{20}$ heterocyclic group containing at least one heteroatom of O, N, S, Si, and P, and a $C_3$-$C_{20}$ aliphatic ring group, and $R^1$, $R_2$, R' and R" are each independently selected from the group consisting of hydrogen, deuterium, halogen, a silane group unsubstituted or substituted with a $C_1$-$C_{20}$ alkyl group or a $C_6$-$C_{20}$ aryl group, a cyano group, a nitro group, a $C_1$-$C_{20}$ alkylthio group, a $C_1$-$C_{20}$ alkoxy group, a $C_6$-$C_{20}$ aryloxy group, a $C_6$-$C_{20}$ arylthio, a $C_1$-$C_{20}$ alkyl group, a $C_2$-$C_{20}$ alkenyl group, a $C_2$-$C_{20}$ alkynyl group, a $C_6$-$C_{20}$ aryl group, a fluorenyl group, a $C_2$-$C_{20}$ heterocyclic group containing at least one heteroatom of O, N, S, Si, and P, and a $C_3$-$C_{20}$ aliphatic ring group, and neighboring groups may be linked to each other to form a ring, and R' and R" may be linked to each other to form a ring, and a is an integer of 0-4, b is an integer of 0-2, and where each of these is an integer of 2 or more, each of $R_{1s}$ and each of $R_{2s}$ are the same as or different from each other.

5. The organic electric element of claim 1, wherein Formula 1 is represented by one of the following Formula 1-E-1 to Formula 1-E-5:

<Formula 1-E-1>

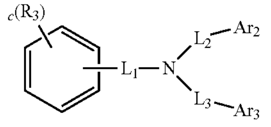

<Formula 1-E-2>

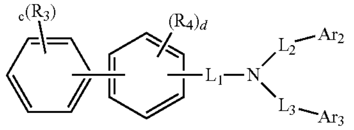

<Formula 1-E-3>

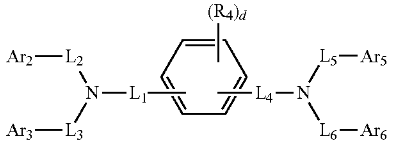

<Formula 1-E-4>

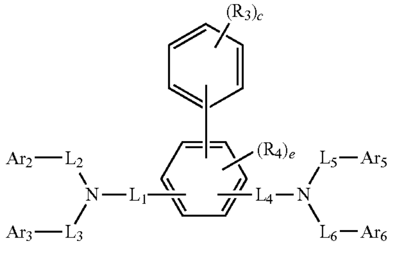

<Formula 1-E-5>

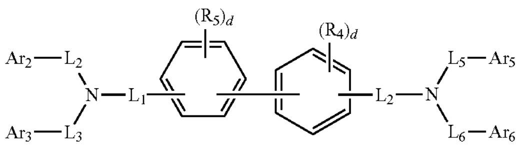

wherein:

$L_1$ to $L_6$, $Ar_2$, $Ar_3$, $Ar_5$ and $Ar_6$ are the same as defined in claim 1, $R_3$ to $R_5$ are each independently selected from the group consisting of hydrogen, deuterium, halogen, a silane group unsubstituted or substituted with a $C_1$-$C_{20}$ alkyl group or a $C_6$-$C_{20}$ aryl group, a cyano group, a nitro group, a $C_1$-$C_{20}$ alkylthio group, a $C_1$-$C_{20}$ alkoxy group, a $C_6$-$C_{20}$ aryloxy group, a $C_6$-$C_{20}$ arylthio, a $C_1$-$C_{20}$ alkyl group, a $C_2$-$C_{20}$ alkenyl group, a $C_2$-$C_{20}$ alkynyl group, a $C_6$-$C_{20}$ aryl group, a fluorenyl group, a $C_2$-$C_{20}$ heterocyclic group containing at least one heteroatom of O, N, S, Si, and P, and a $C_3$-$C_{20}$ aliphatic ring group, and neighboring groups may be linked to each other to form a ring, and c is an integer of 0-5, d is an integer of 0-4, e is an integer of 0-3, and when each of these is an integer of 2 or more, each of $R_3$s, each of Ras and each of $R_5$s are the same as or different from each other.

6. The organic electric element of claim 1, wherein Formula 2 is represented by one of the following Formulas 2-A-1 to 2-A-3:

<Formula 2-A-1>

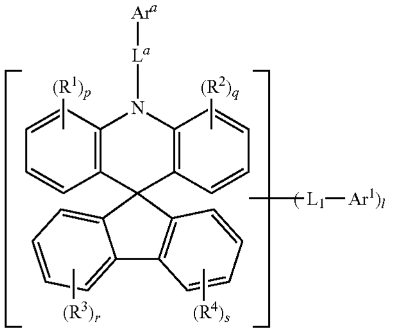

<Formula 2-A-2>

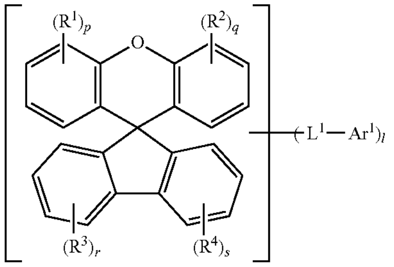

<Formula 2-A-3>

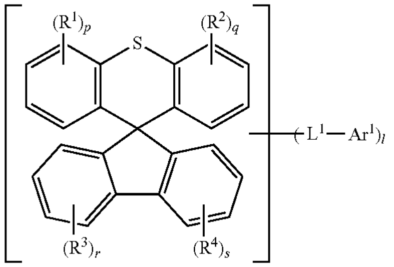

wherein $R^1$ to $R^4$, $L^a$, $Ar^a$, $L_1$, $Ar_1$, p to s, 1 are the same as defined in claim 1.

7. The organic electric element of claim 1, wherein Formula 2 is represented by Formula 2-B-1:

<Formula 2-B-1>

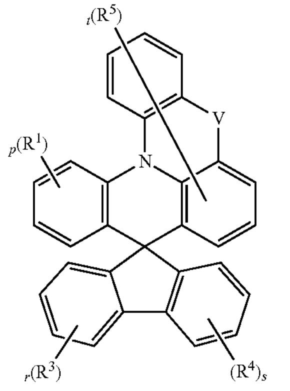

wherein:

$R^1$, $R_3$, $R^4$, p, r and s are the same as defined in claim 1,

V is N—$L^a$—$Ar^a$, C(R') (R"), O or S, $R_5$, R' and R" are each independently selected from the group consisting of hydrogen, deuterium, halogen, a silane group unsubstituted or substituted with a $C_1$-$C_{20}$ alkyl group or a $C_6$-$C_{20}$ aryl group, a cyano group, a nitro group, a $C_1$-$C_{20}$ alkylthio group, a $C_1$-$C_{20}$ alkoxy group, a $C_6$-$C_{20}$ aryloxy group, a $C_6$-$C_{20}$ arylthio, a $C_1$-$C_{20}$ alkyl group, a $C_2$-$C_{20}$ alkenyl group, a $C_2$-$C_{20}$ alkynyl group, a $C_6$-$C_{20}$ aryl group, a fluorenyl group, a $C_2$-$C_{20}$ heterocyclic group containing at least one heteroatom of O, N, S, Si, and P, and a $C_3$-$C_{20}$ aliphatic ring group, and neighboring groups may be linked to each other to form a ring, and R' and R" may be linked to each other to form a ring, t is an integer of 0-7, and when t is an integer of 2 or more, each of $R_5$ s is the same as or different from each other, $L^a$ is selected from the group consisting of a single bond, a $C_6$-$C_{20}$ arylene group, a fluorenylene group, a $C_2$-$C_{20}$ heterocyclic group comprising at least one heteroatom selected from the group consisting of O, N, S, Si and P, and a $C_3$-$C_{20}$ aliphatic ring, and $Ar^a$ is selected from the group consisting of a $C_6$-$C_{20}$ aryl group, a fluorenyl group, a $C_2$-$C_{20}$ heterocyclic group containing at least one heteroatom of O, N, S, Si, and P, and a $C_3$-$C_{20}$ aliphatic ring group.

8. The organic electric element of claim 1, wherein the ring formed by linking neighboring $R^1s$ to each other, neighboring $R_2s$ to each other, neighboring $R_3s$ to each other, or neighboring $R^4s$ to each other is a ring represented by one of the following Formulas F-1 to F-4:

<Formula F-1>

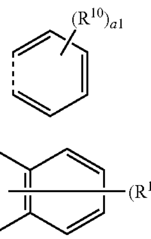

<Formula F-2>

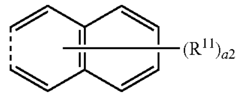

<Formula F-3>

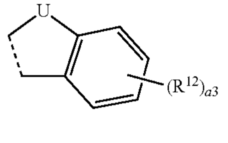

-continued

<Formula F-4>

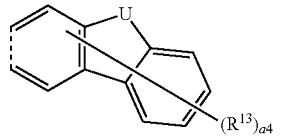

wherein:

the dotted line is the condensation site,

U is N—$L^a$—$Ar^a$, C(R') (R"), O or S, $R^{10}$ to $R^{13}$, R' and R" are each independently selected from the group consisting of hydrogen, deuterium, halogen, a silane group unsubstituted or substituted with a $C_1$-$C_{20}$ alkyl group or a $C_6$-$C_{20}$ aryl group, a cyano group, a nitro group, a $C_1$-$C_{20}$ alkylthio group, a $C_1$-$C_{20}$ alkoxy group, a $C_6$-$C_{20}$ aryloxy group, a $C_6$-$C_{20}$ arylthio, a $C_1$-$C_{20}$ alkyl group, a $C_2$-$C_{20}$ alkenyl group, a $C_2$-$C_{20}$ alkynyl group, a $C_6$-$C_{20}$ aryl group, a fluorenyl group, a $C_2$-$C_{20}$ heterocyclic group containing at least one heteroatom of O, N, S, Si, and P, and a $C_3$-$C_{20}$ aliphatic ring group, and neighboring groups may be linked to each other to form a ring, and R' and R" may be linked to each other to form a ring, and a1 and a3 are each an integer of 0-4, a2 and a4 are each an integer of 0-6, and where each of these is an integer of 2 or more, each of $R^{10}$s, each of $R^{11}$s, each of $R^{12}$s and each of $R^{13}$s are the same as or different from each other, $L_a$ is selected from the group consisting of a single bond, a $C_6$-$C_{20}$ arylene group, a fluorenylene group, a $C_2$-$C_{20}$ heterocyclic group comprising at least one heteroatom selected from the group consisting of O, N, S, Si and P, and a $C_3$-$C_{20}$ aliphatic ring, and $Ar_a$ is selected from the group consisting of a $C_6$-$C_{20}$ aryl group, a fluorenyl group, a $C_2$-$C_{20}$ heterocyclic group containing at least one heteroatom of O, N, S, Si, and P, and a $C_3$-$C_{20}$ aliphatic ring group.

9. The organic electric element of claim 1, wherein $R^1$ to $R^4$ are one of the following Formula S-1 or S-2:

<Formula S-1>

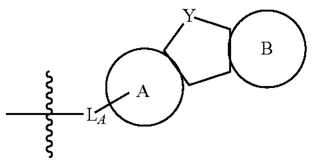

<Formula S-2>

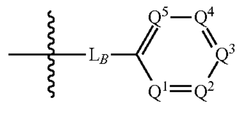

wherein:

Y is N—$L^a$—$Ar^a$, C(R') (R"), O or S, $Q^1$ to $Q^5$ are each independently N or C(R'), $L_A$, $L_B$ and $L_a$ are each independently from the group consisting of a single bond, a $C_6$-$C_{20}$ arylene group, a fluorenylene group, a $C_2$-$C_{20}$ heterocyclic group comprising at least one heteroatom selected from the group consisting of O, N, S, Si and P, and a $C_3$-$C_{20}$ aliphatic ring, $Ar_a$ is selected from the group consisting of a $C_6$-$C_{20}$ aryl group, a fluorenyl group, a $C_2$-$C_{20}$ heterocyclic group containing at least one heteroatom of O, N, S, Si, and P, and a $C_3$-$C_{20}$ aliphatic ring group, R' and R" are each independently selected from the group consisting of hydrogen, deuterium, halogen, a silane group unsubstituted or substituted with a $C_1$-$C_{20}$ alkyl group or a $C_6$-$C_{20}$ aryl group, a cyano group, a nitro group, a $C_1$-$C_{20}$ alkylthio group, a $C_1$-$C_{20}$ alkoxy group, a $C_6$-$C_{20}$ aryloxy group, a $C_6$-$C_{20}$ arylthio, a $C_1$-$C_{20}$ alkyl group, a $C_2$-$C_{20}$ alkenyl group, a $C_2$-$C_{20}$ alkynyl group, a $C_6$-$C_{20}$ aryl group, a fluorenyl group, a $C_2$-$C_{20}$ heterocyclic group containing at least one heteroatom of O, N, S, Si, and P, and a $C_3$-$C_{20}$ aliphatic ring group, neighboring groups may be linked to each other to form a ring, and R' and R" may be linked to each other to form a ring, A ring and B ring are each selected from the following structures:

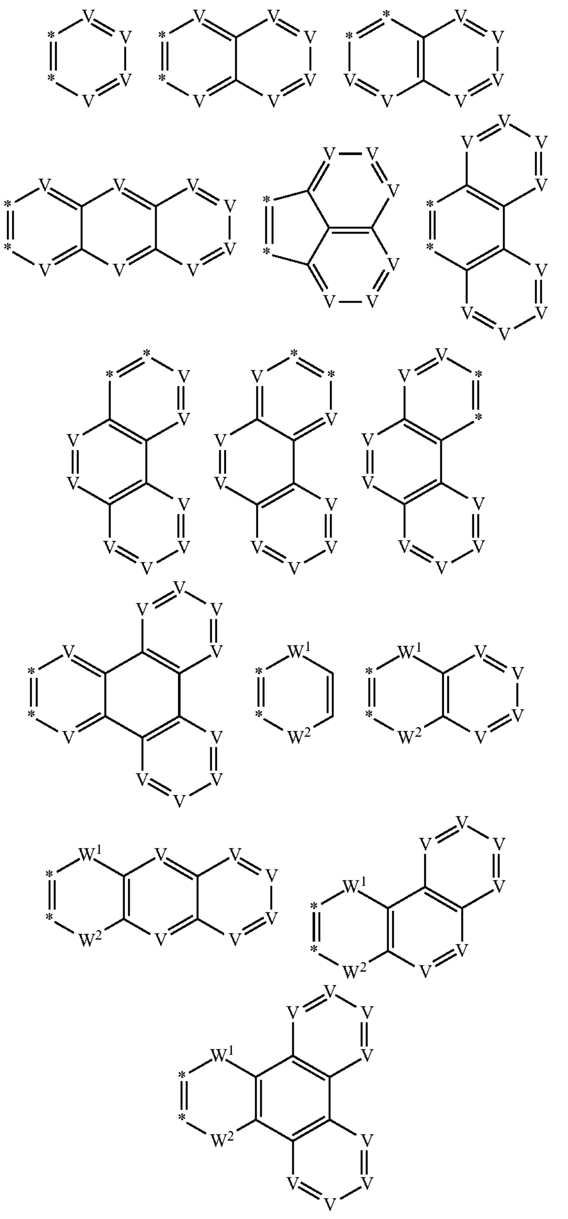

wherein:

* indicates a condensed position,

Vs are each N or C(R'), at least one of Vs is N, $W^1$ and $W^2$ are each independently a single bond, N—$L^a$—$Ar^a$, C(R') (R"), O or S, and R', R", $L^a$ and $Ar^a$ are the same as defined in the above.

10. The organic electric element of claim 1, wherein Formula 2 is represented by one of the following Formula 2-C-1 to Formula 2-C-5:

<Formula 2-C-1>

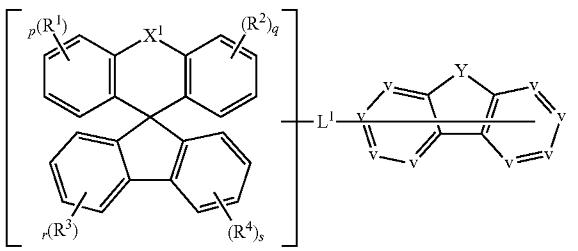

<Formula 2-C-2>

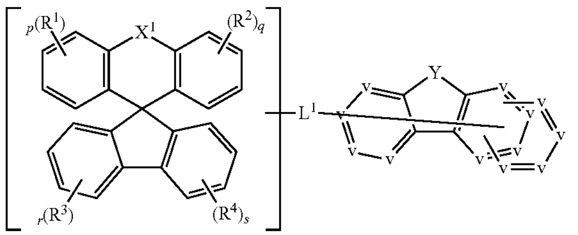

<Formula 2-C-3>

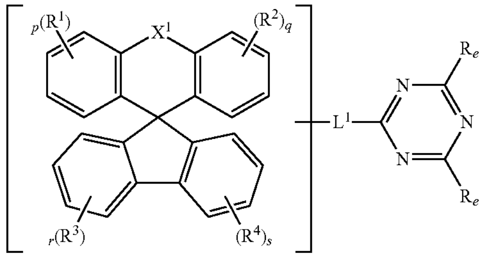

<Formula 2-C-4>

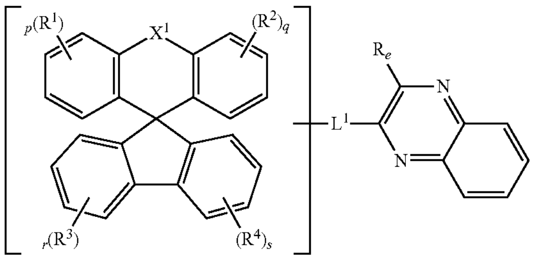

<Formula 2-C-5>

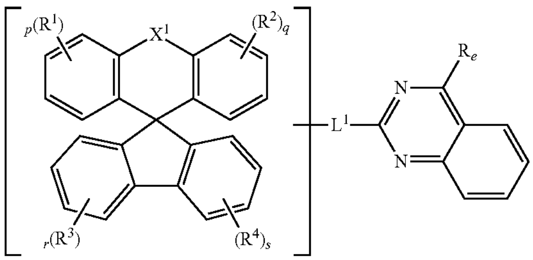

wherein:

$R^1$ to $R^4$, $X^1$, $L_1$, p to s are the same as defined in claim 1,

Y is N—$L^a$—$Ar^a$, C(R') (R"), O or S,

Vs are each independently N or C(R'),

Re, R' and R" are each independently selected from the group consisting of hydrogen, deuterium, halogen, a silane group unsubstituted or substituted with a $C_1$-$C_{20}$ alkyl group or a $C_6$-$C_{20}$ aryl group, a cyano group, a nitro group, a $C_1$-$C_{20}$ alkylthio group, a $C_1$-$C_{20}$ alkoxy group, a $C_6$-$C_{20}$ aryloxy group, a $C_6$-$C_{20}$ arylthio, a $C_1$-$C_{20}$ alkyl group, a $C_2$-$C_{20}$ alkenyl group, a $C_2$-$C_{20}$ alkynyl group, a $C_6$-$C_{20}$ aryl group, a fluorenyl group, a $C_2$-$C_{20}$ heterocyclic group containing at least one heteroatom of O, N, S, Si, and P, and a $C_3$-$C_{20}$ aliphatic ring group, and neighboring R's may be linked to each other to form a ring, and R' and R" may be linked to each other to form a ring, $L_a$ is independently selected from the group consisting of a single bond, a $C_6$-$C_{20}$ arylene group, a fluorenylene group, a $C_2$-$C_{20}$ heterocyclic group comprising at least one heteroatom selected from the group consisting of O, N, S, Si and P, and a $C_3$-$C_{20}$ aliphatic ring, and $Ar^a$ is selected from the group consisting of a $C_6$-$C_{20}$ aryl group, a fluorenyl group, a $C_2$-$C_{20}$ heterocyclic group containing at least one heteroatom of O, N, S, Si, and P, and a $C_3$-$C_{20}$ aliphatic ring group.

11. The organic electric element of claim 1, wherein the compound represented by Formula 1 is one of the following compounds:

1-1

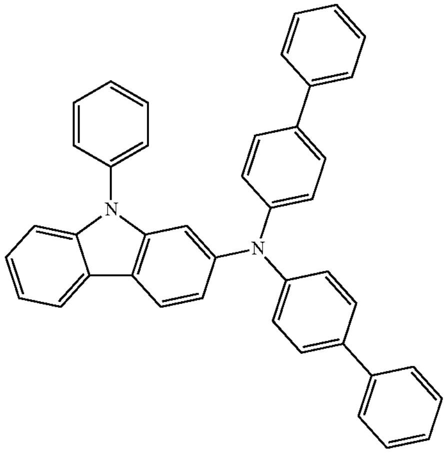

1-2

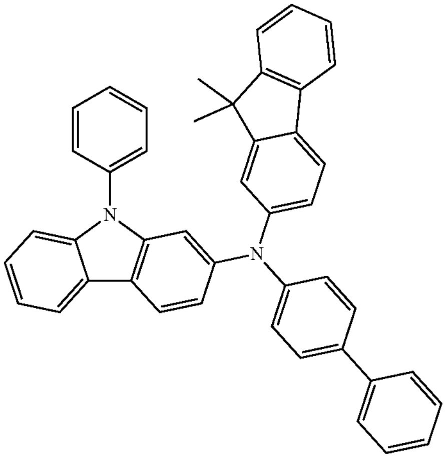

1-3

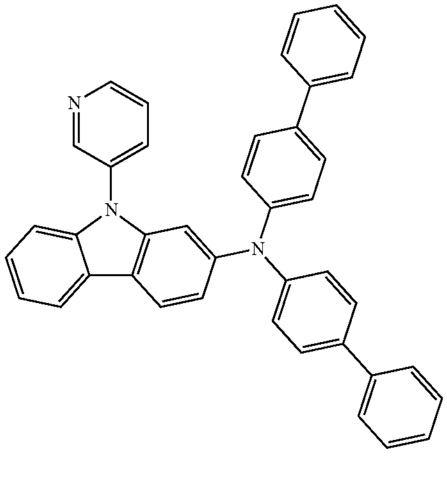

1-4

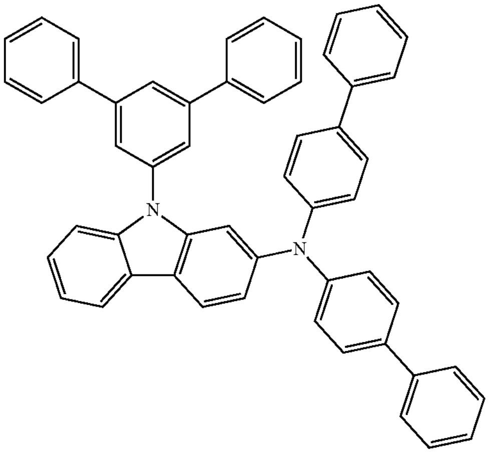

-continued
1-5
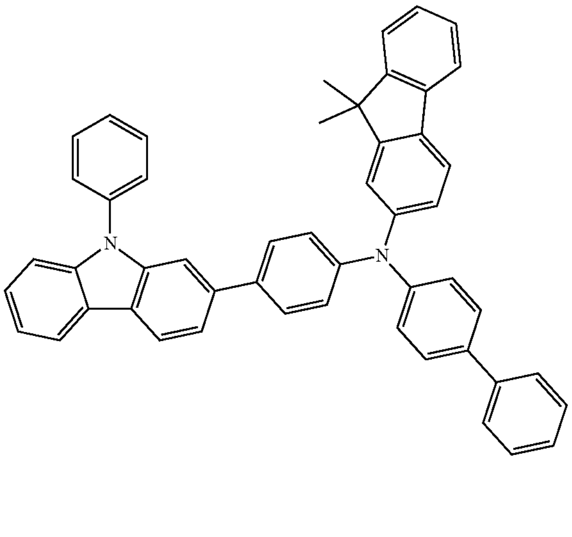
1-6
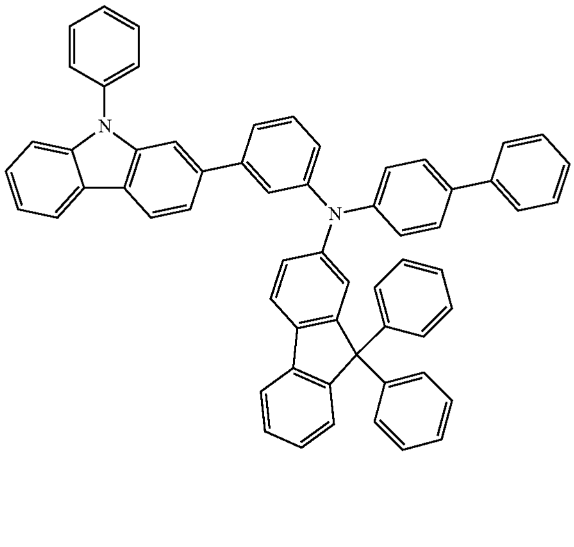
1-7
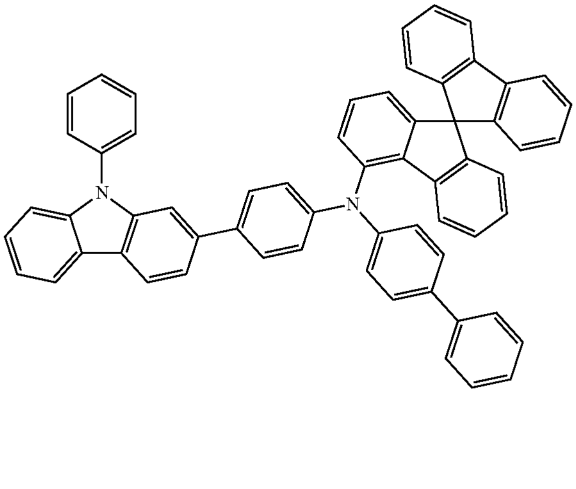
1-8
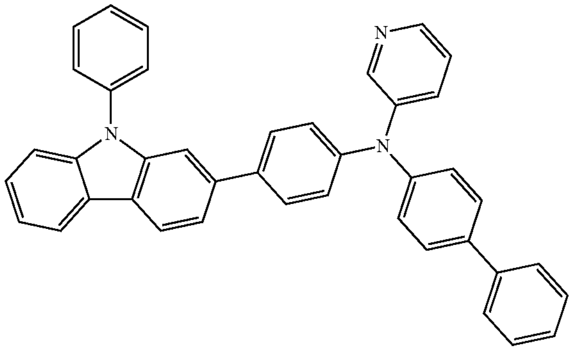
1-9
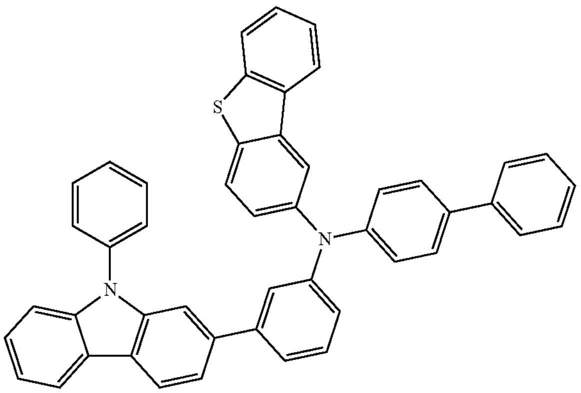

-continued
1-10
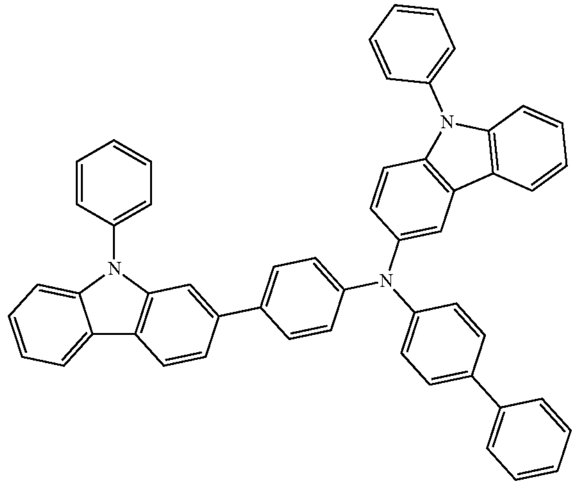
1-11
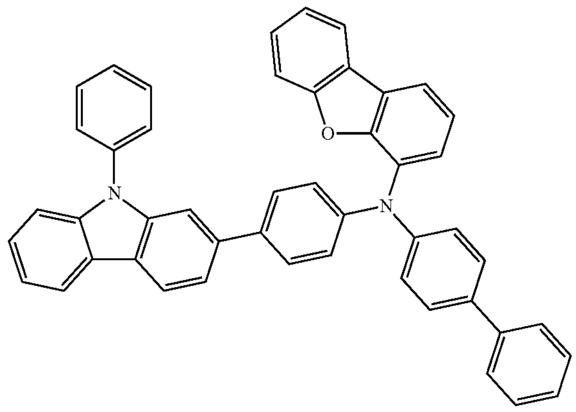
1-12
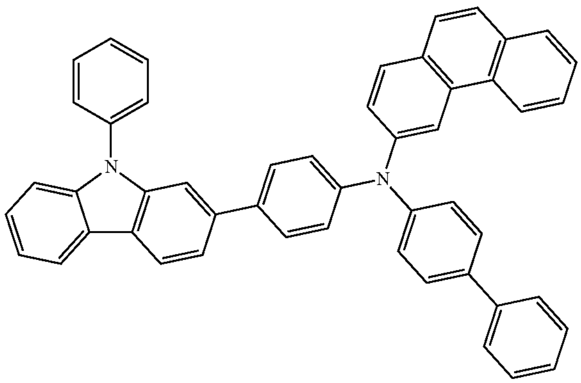
1-13
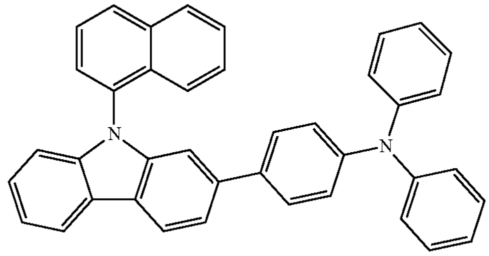
1-14
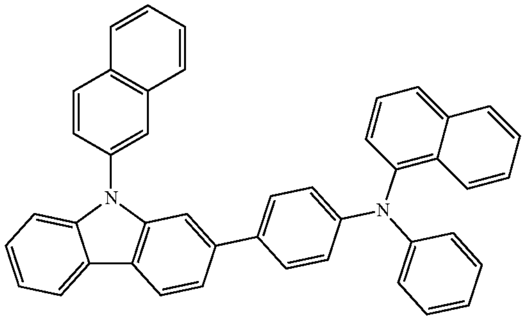

-continued
1-15
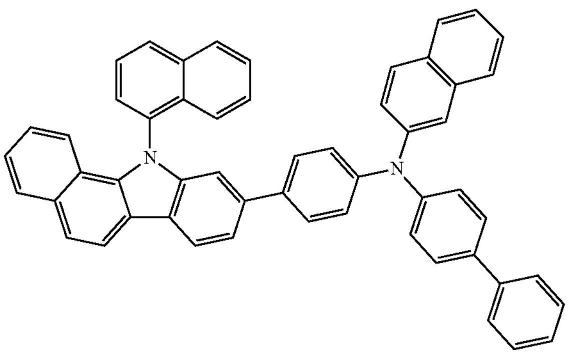
1-16
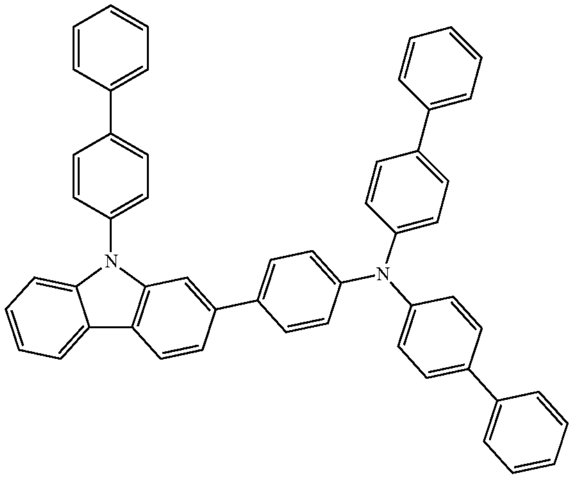
1-17
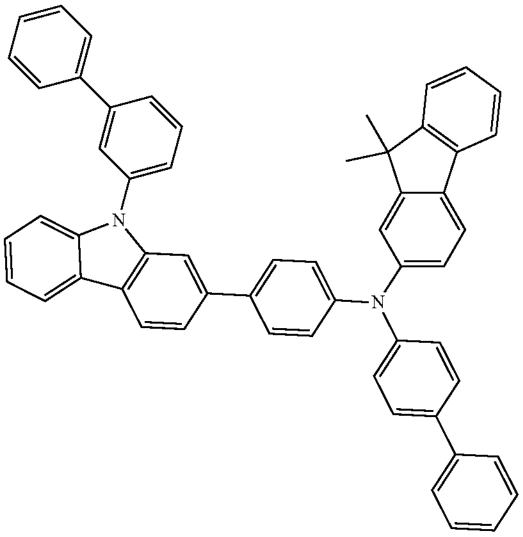
1-18
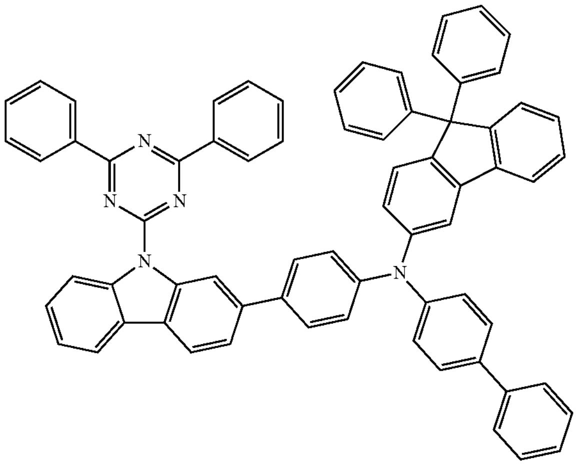
1-19
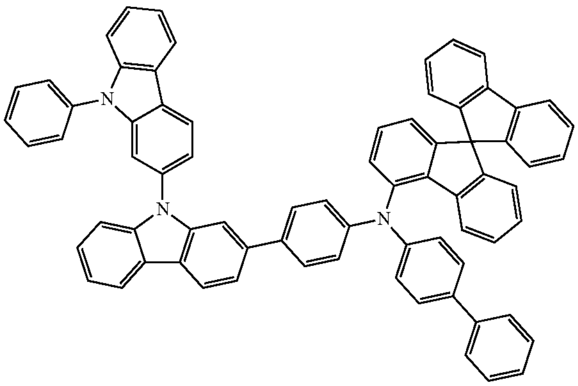
1-20
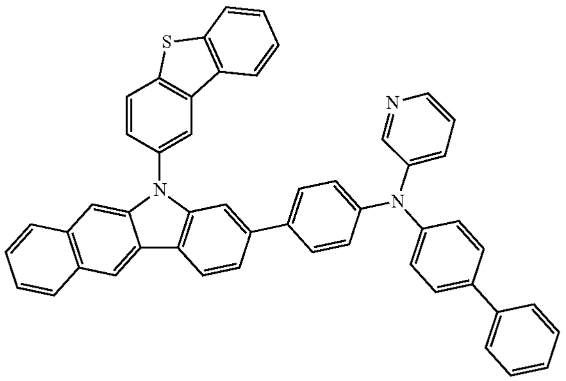

-continued
1-21
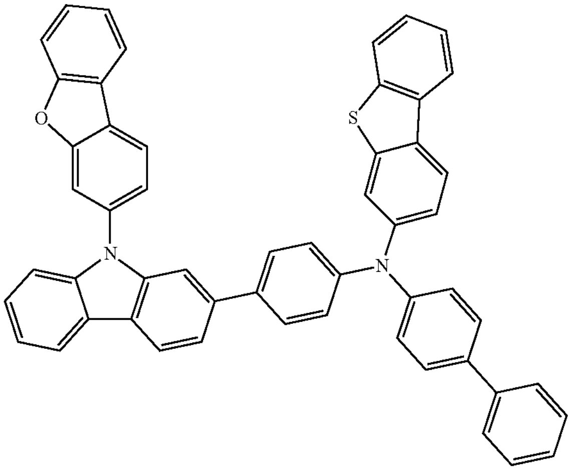
1-22
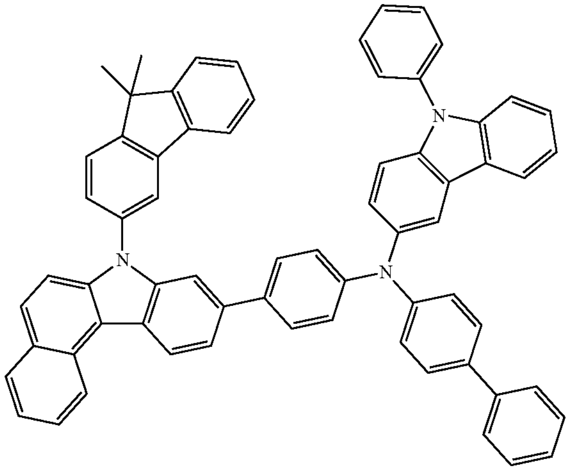
1-23
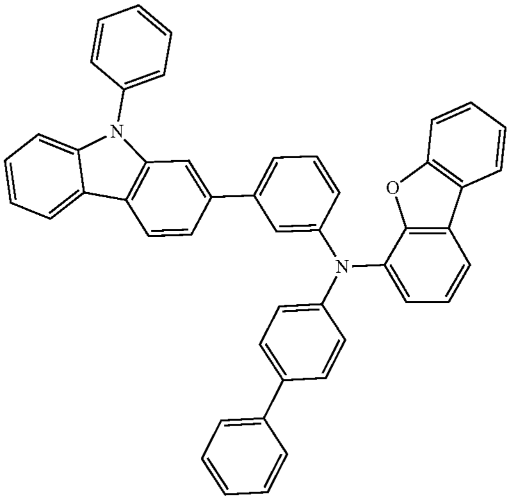
1-24
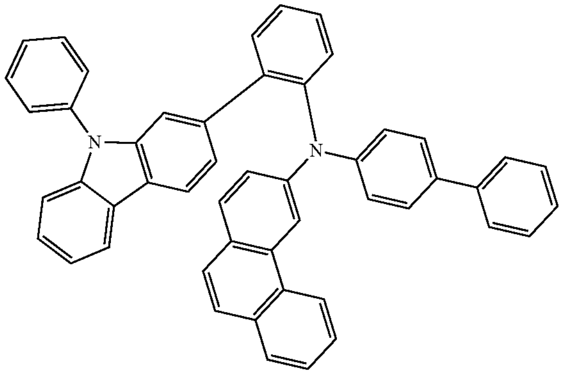
1-25
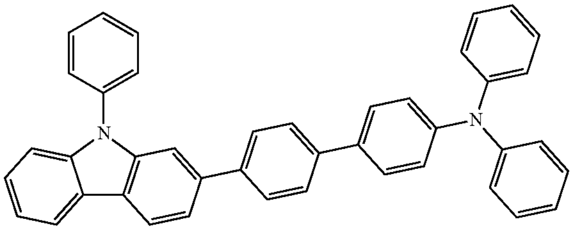
1-26
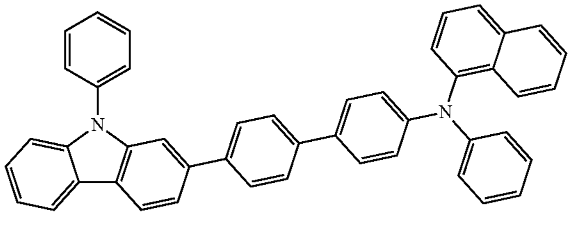

-continued
1-27
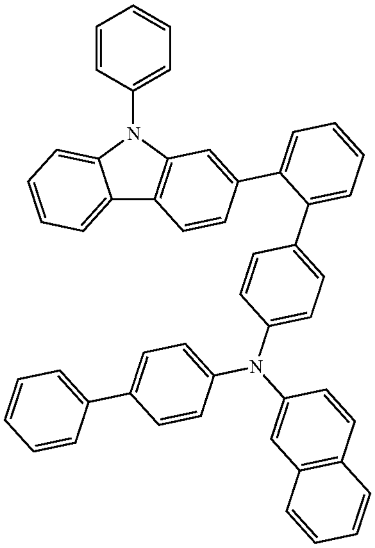
1-28
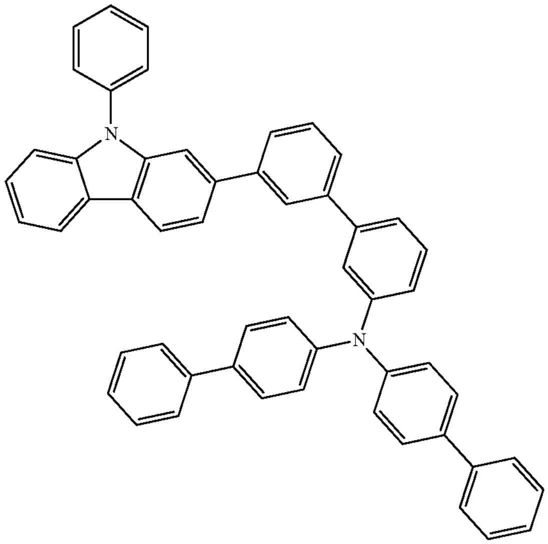
1-29
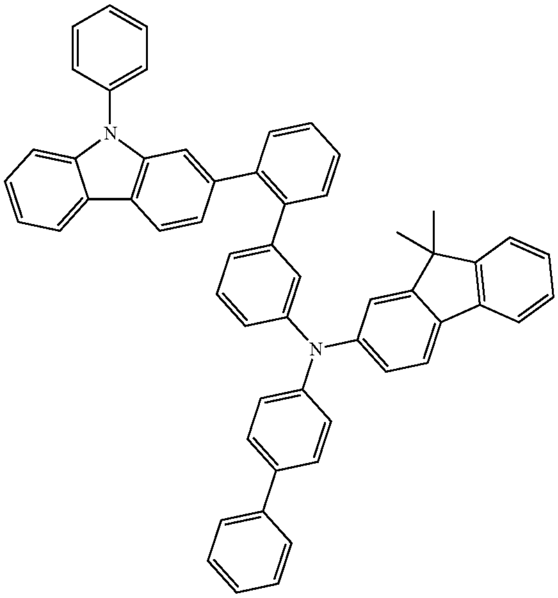
1-30
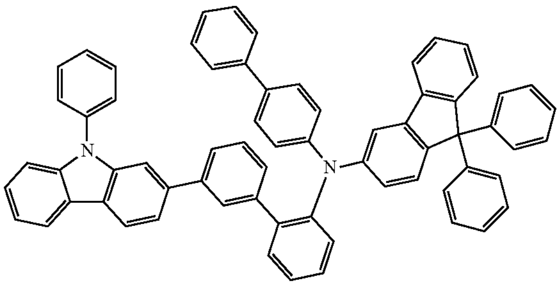
1-31
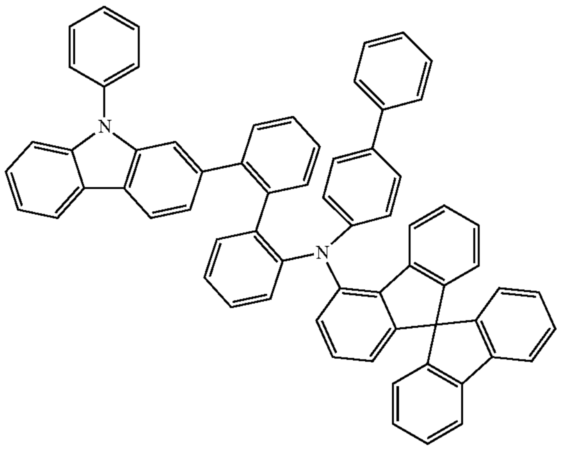

-continued
1-32
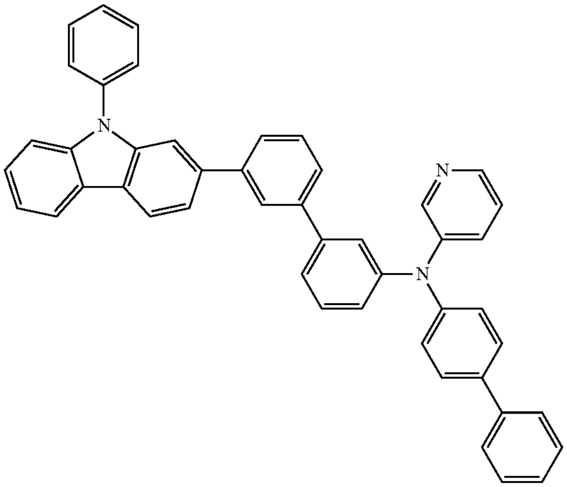
1-33
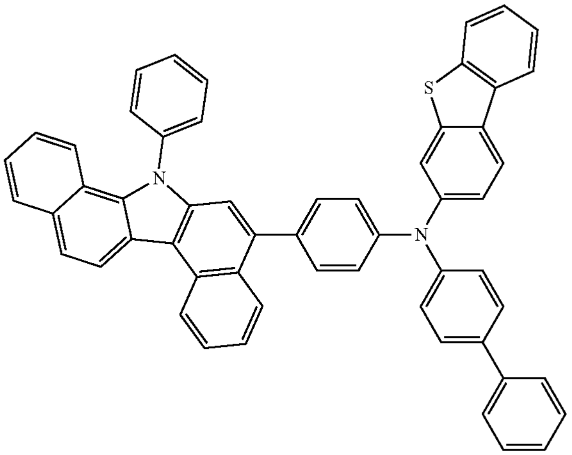
1-34
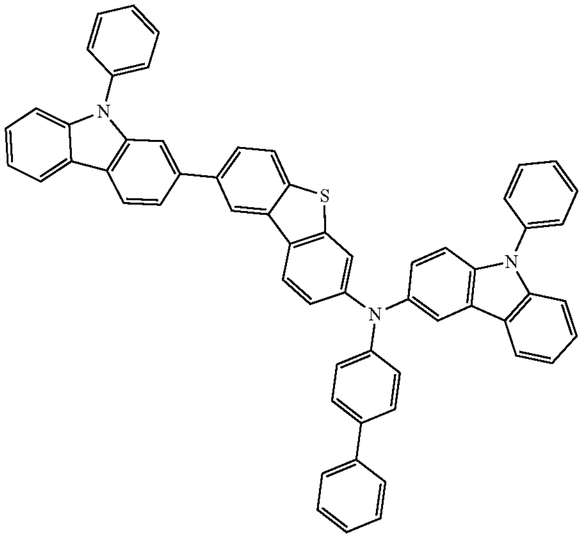
1-35
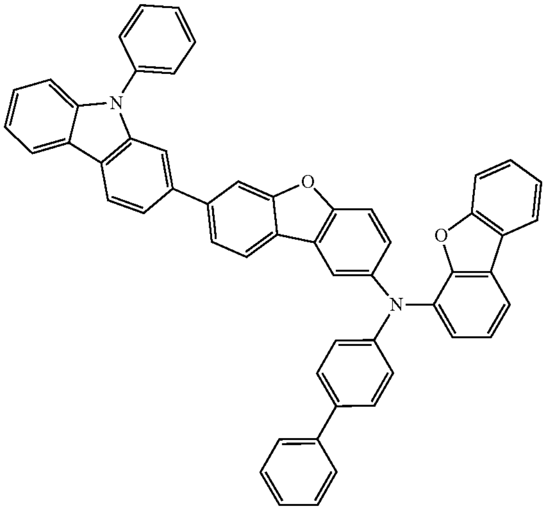

-continued
1-36
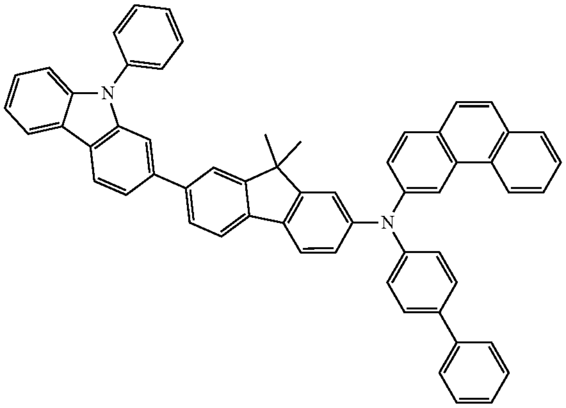
1-37
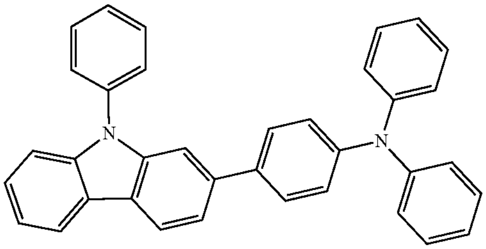
1-38
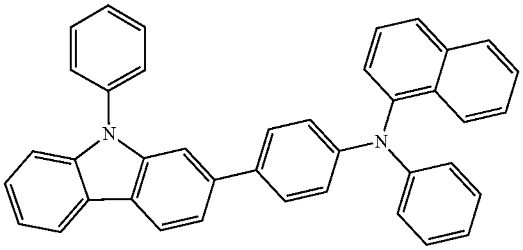
1-39
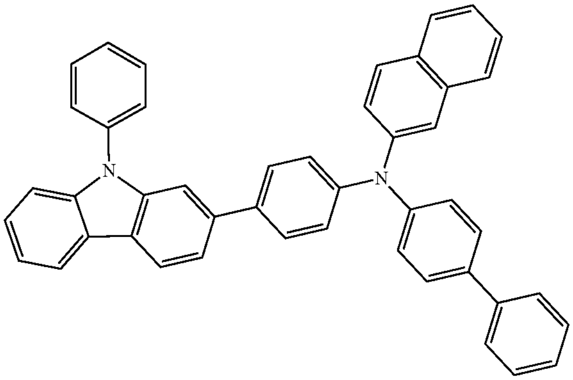
1-40
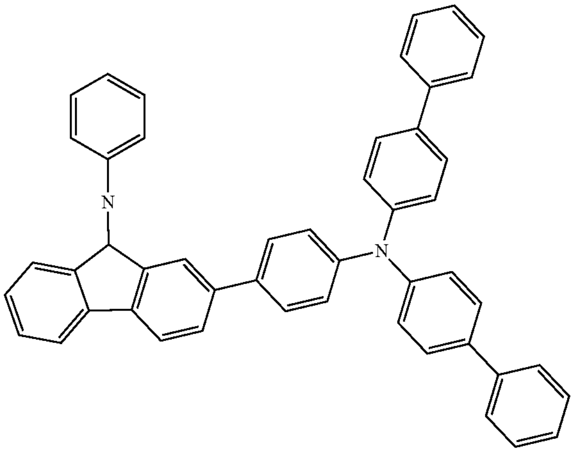
1-41
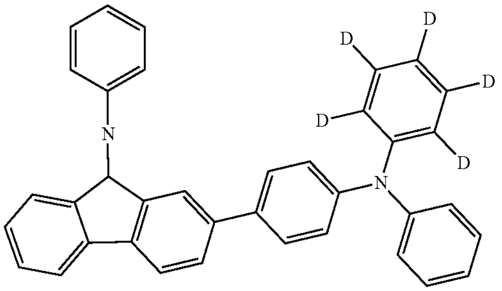

-continued
1-42
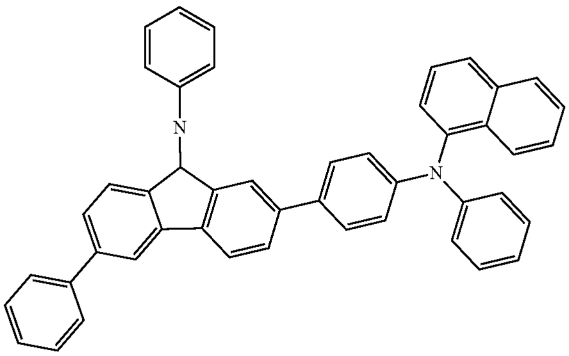
1-43
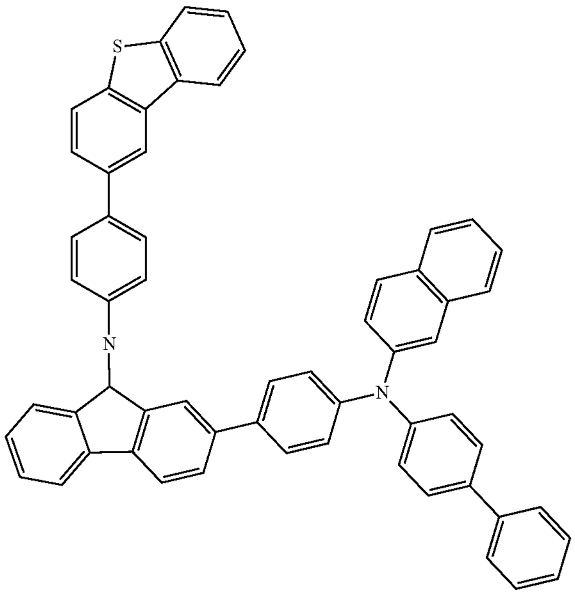
1-44
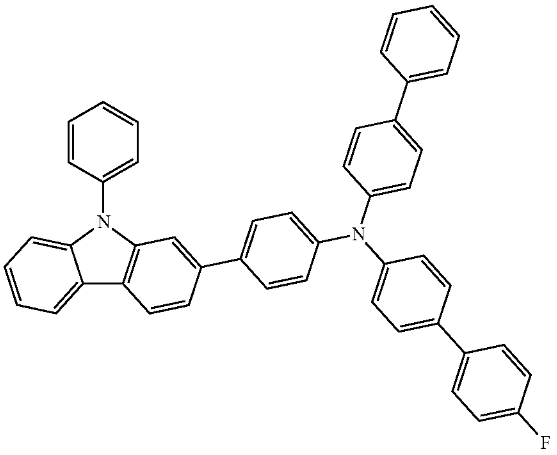
1-45
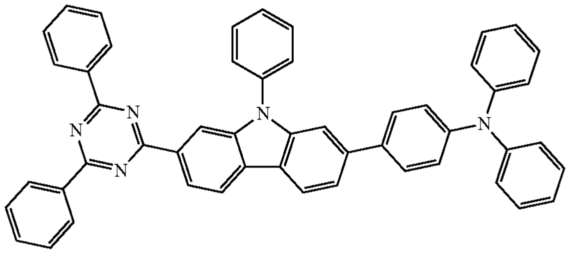
1-46
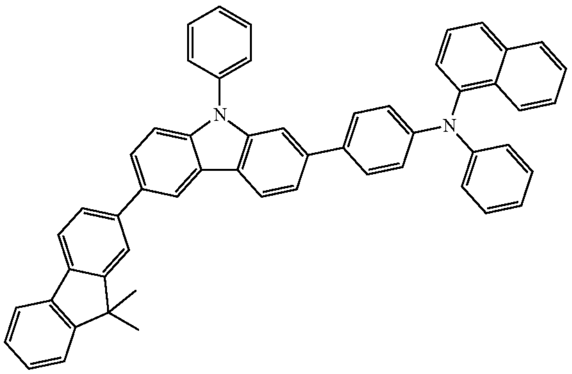
1-47
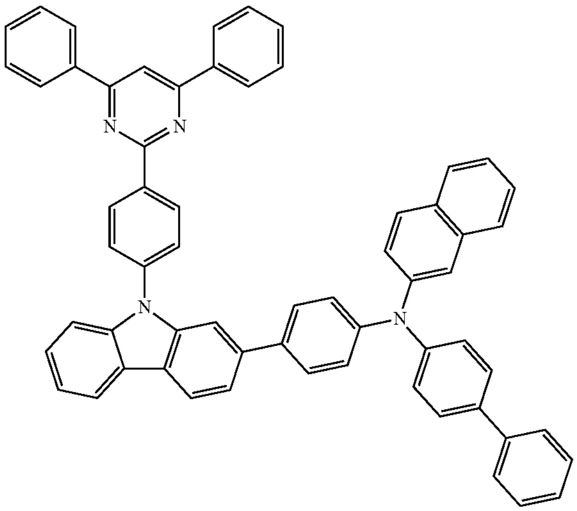

-continued
1-48
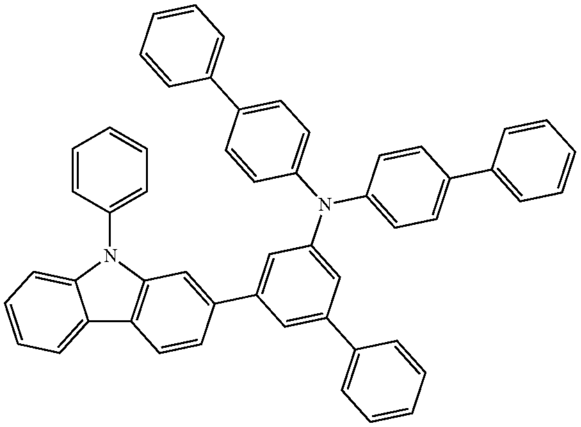
1-49
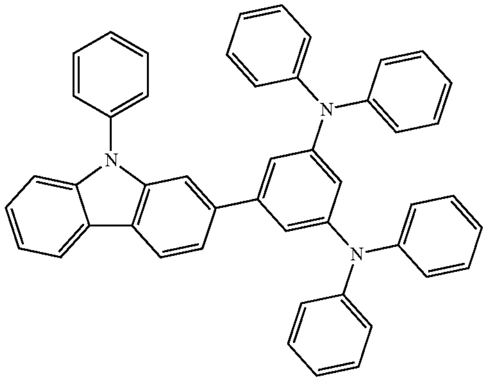
1-50
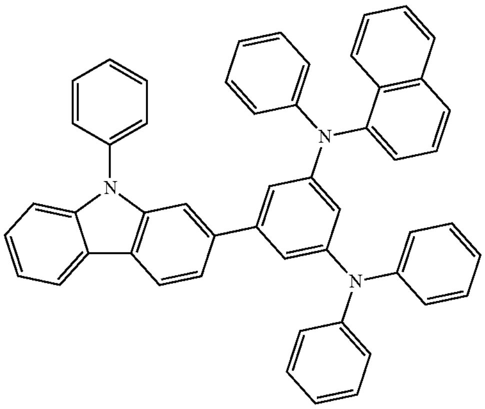
1-51
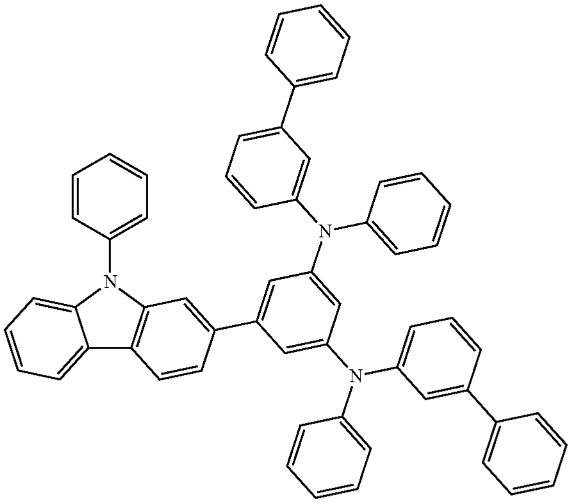
1-52
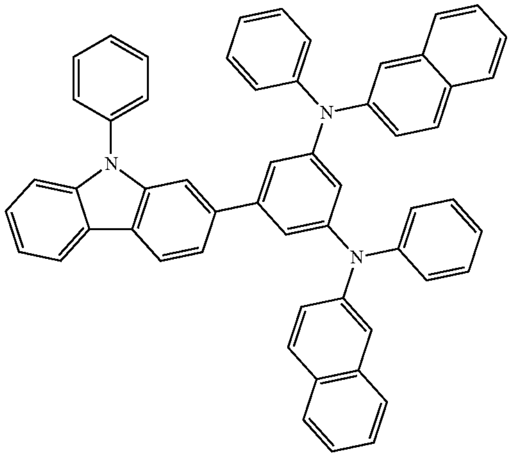

-continued
1-53
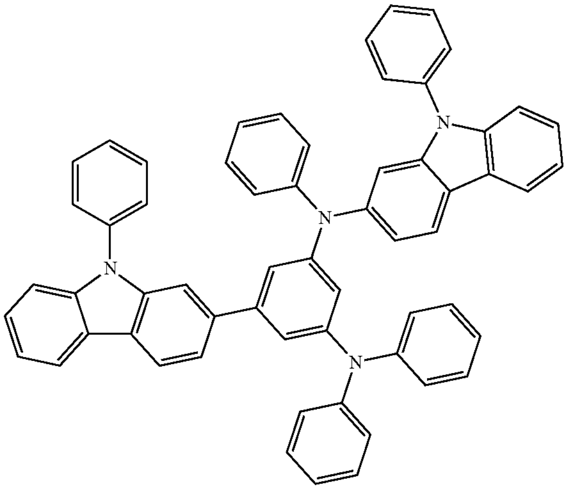
1-54
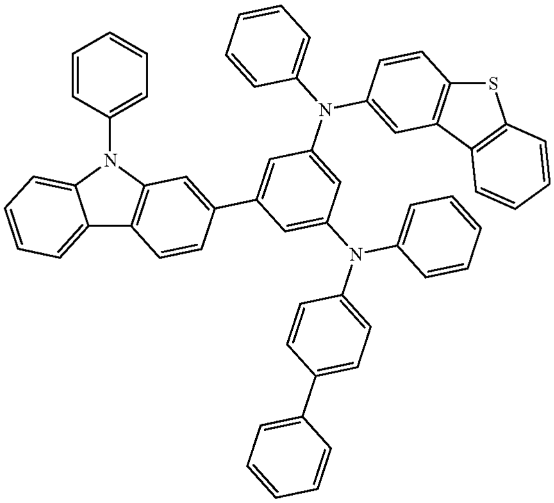
1-55
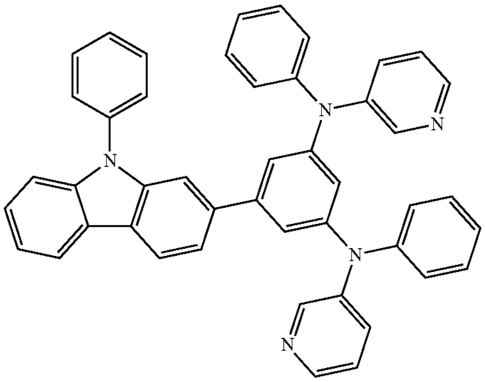
1-56
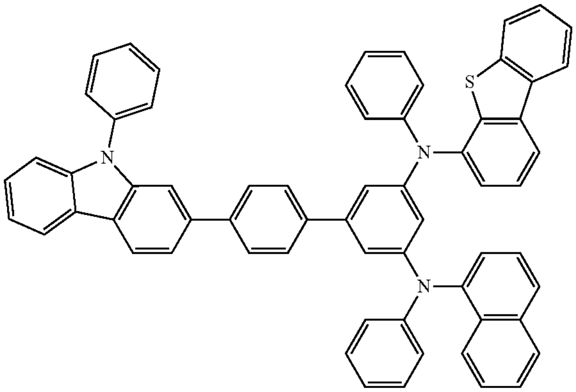

-continued
1-57
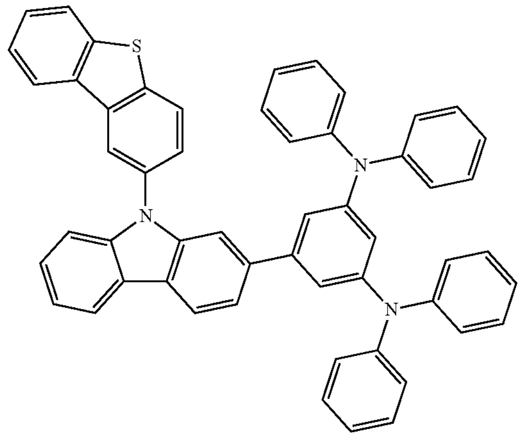
1-58
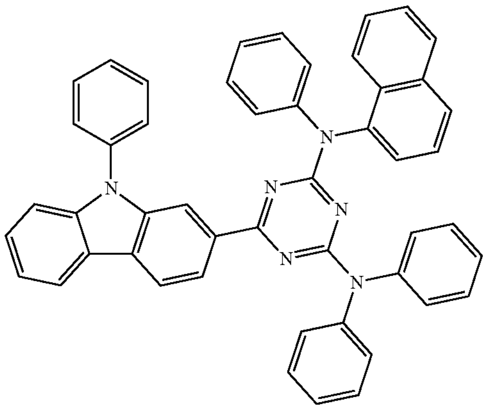
1-59
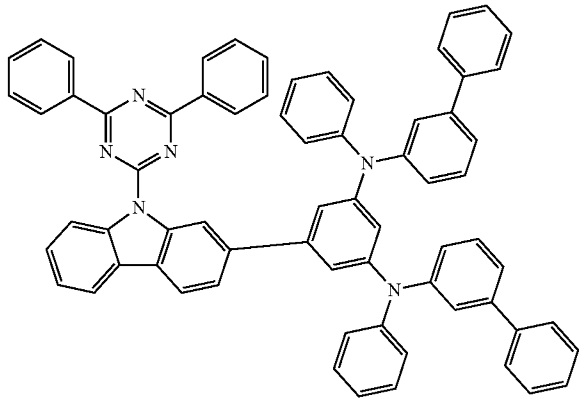
1-60
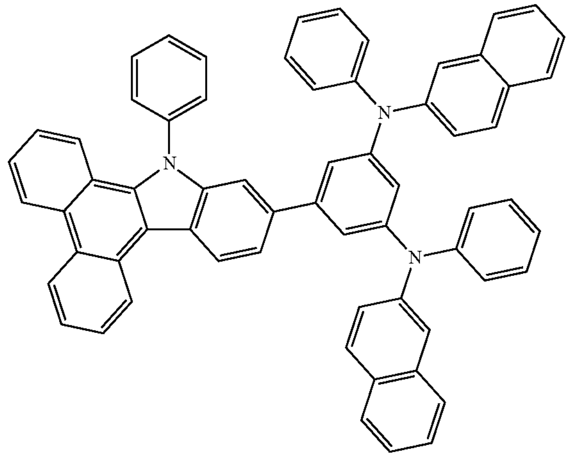
1-61
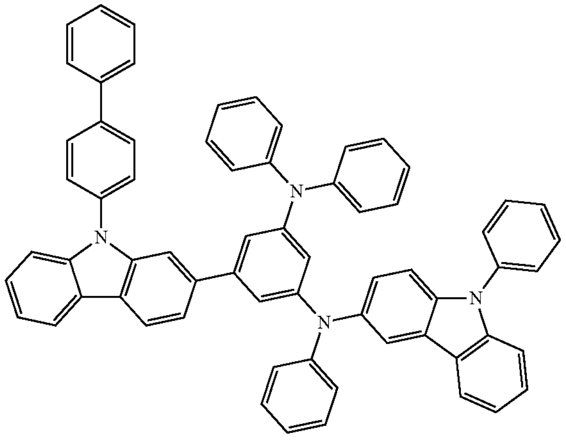

-continued
1-62
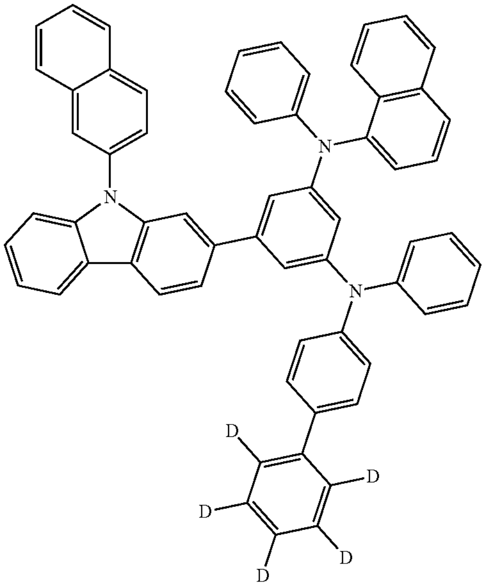
1-63
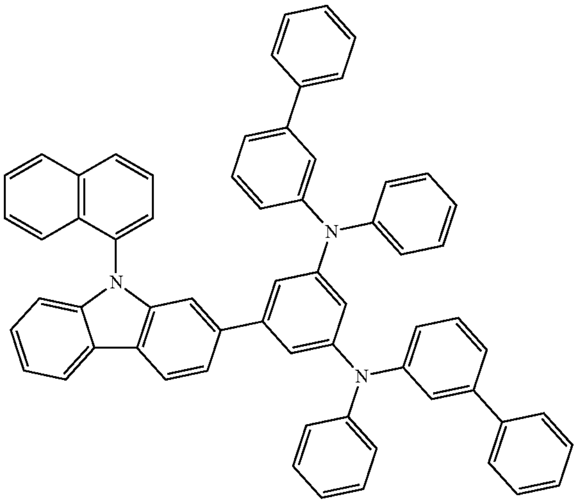
1-64
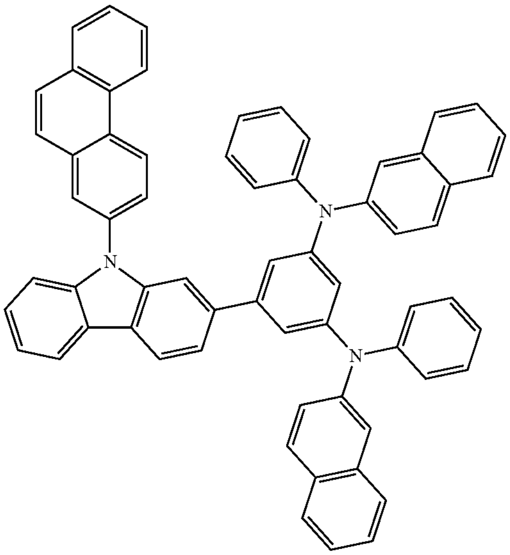
1-65
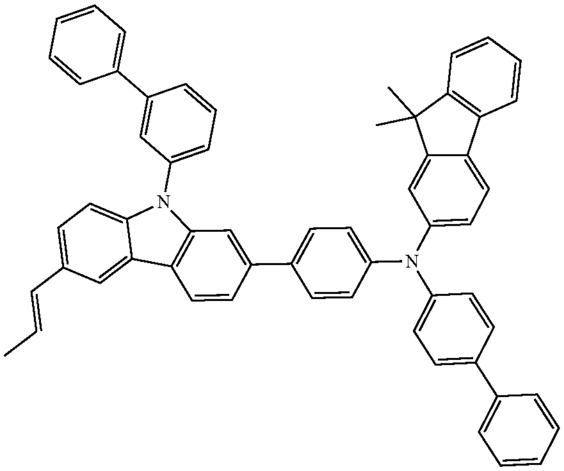

-continued
1-66
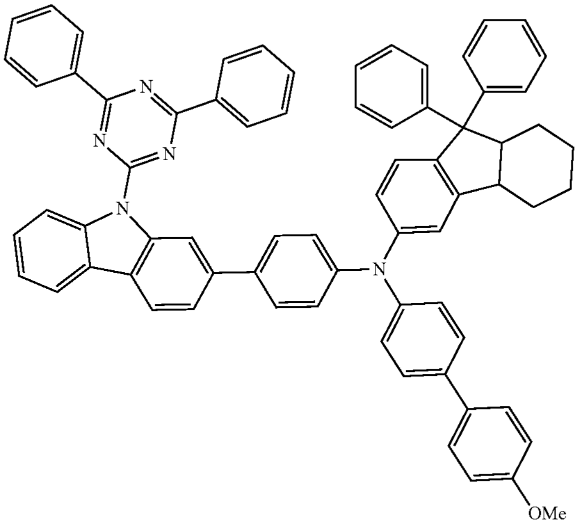
1-67
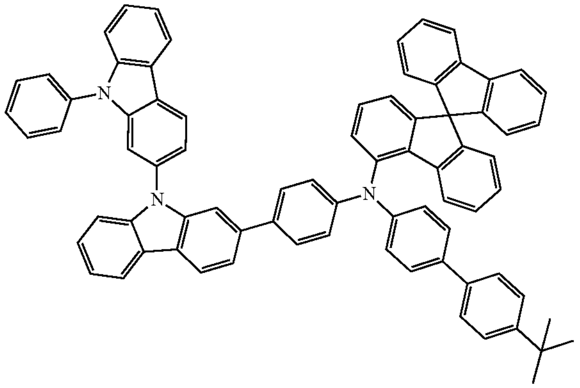
1-68
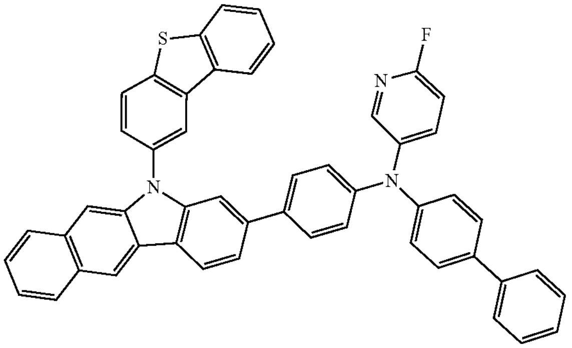
1-69
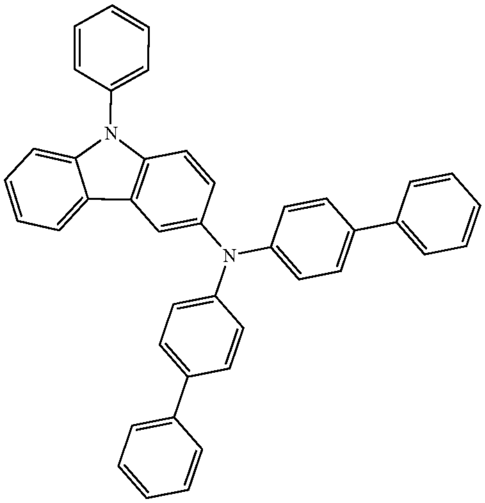
1-70
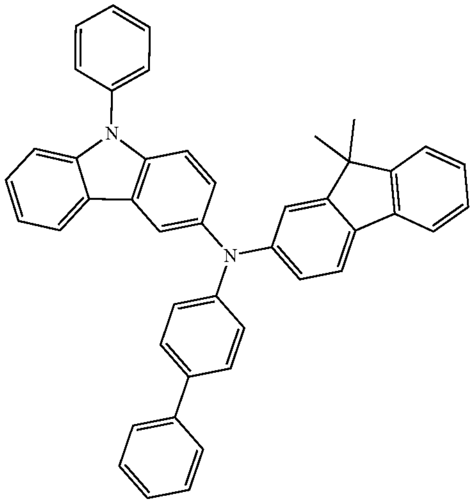

-continued
1-71
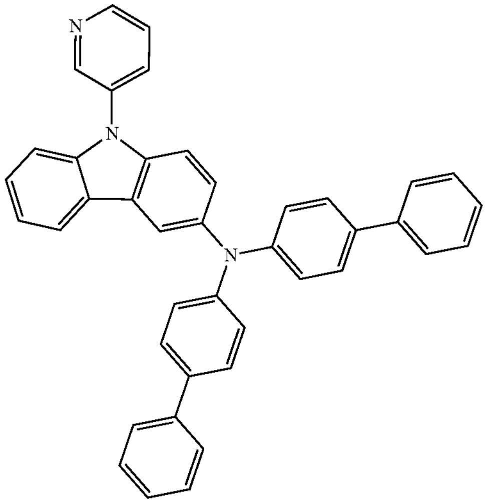
1-73
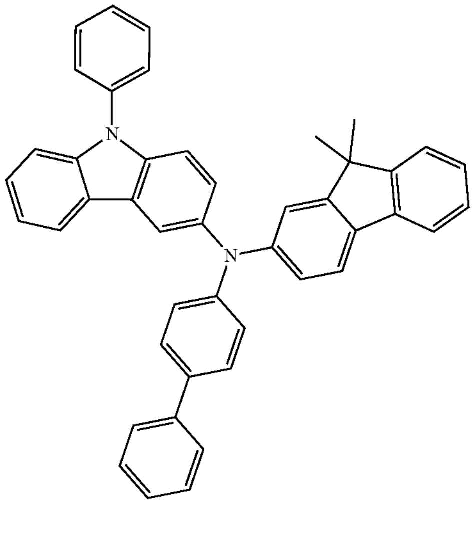
1-74
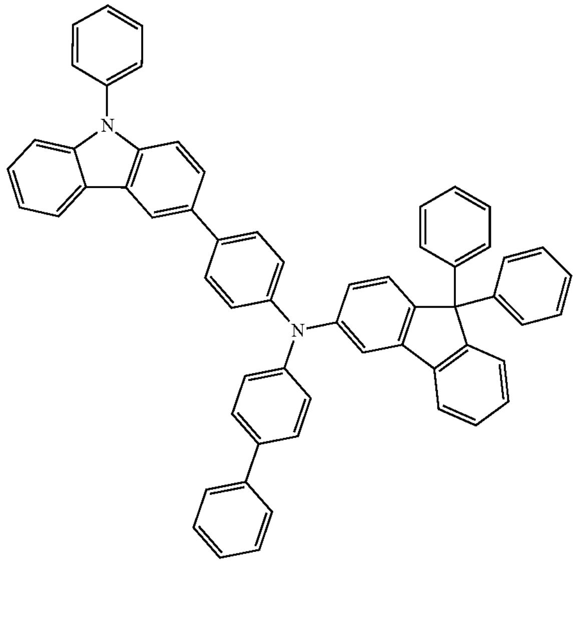

-continued
1-75
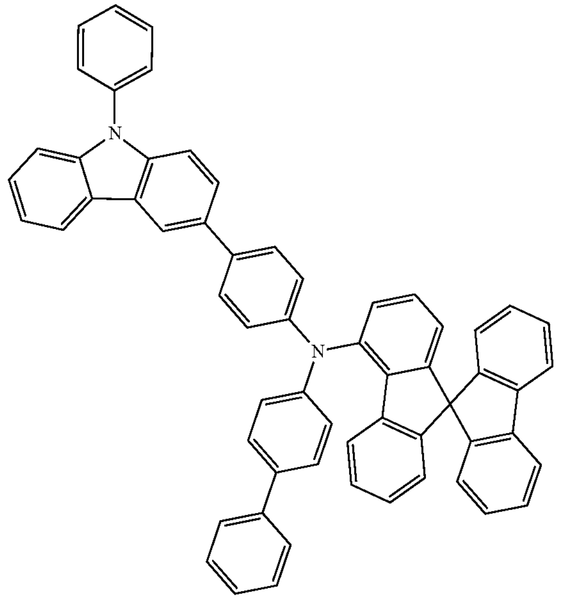
1-76
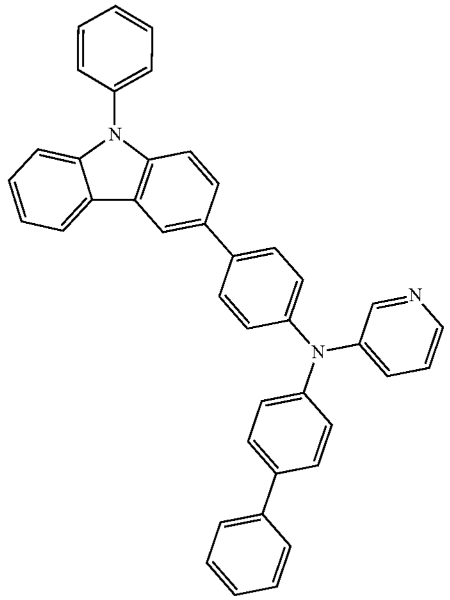
1-77
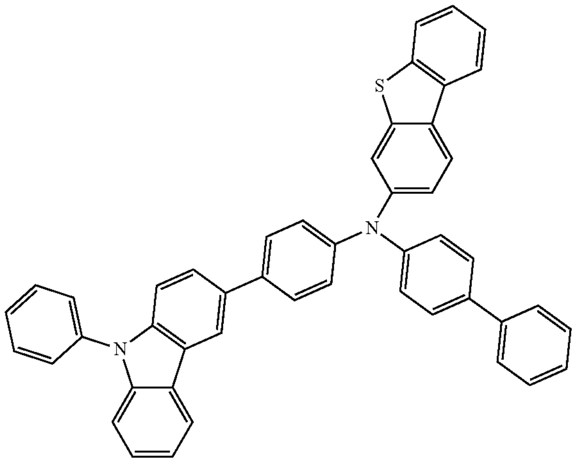
1-78
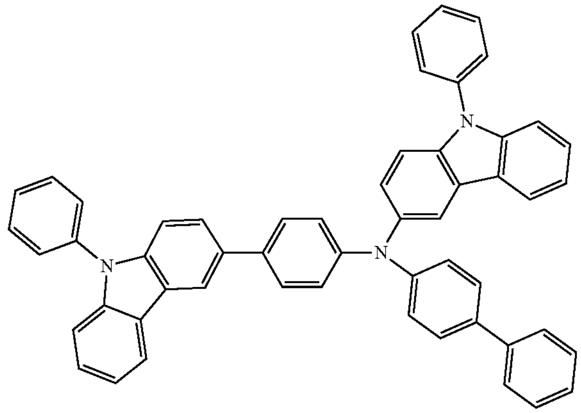

-continued
1-79
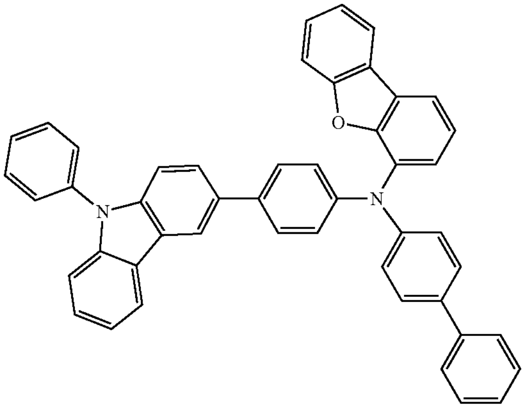
1-80
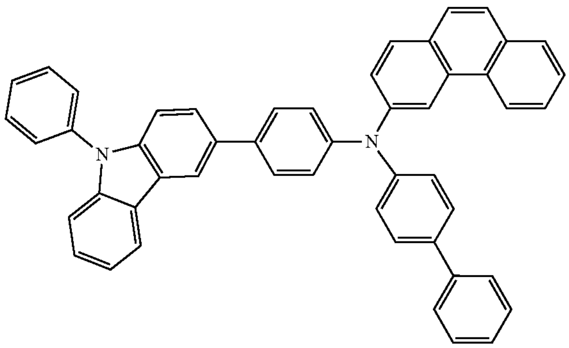
1-81
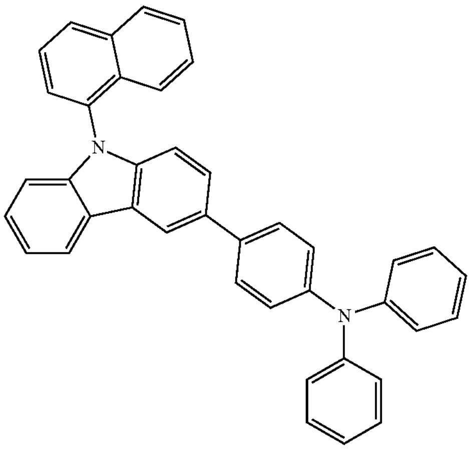
1-82
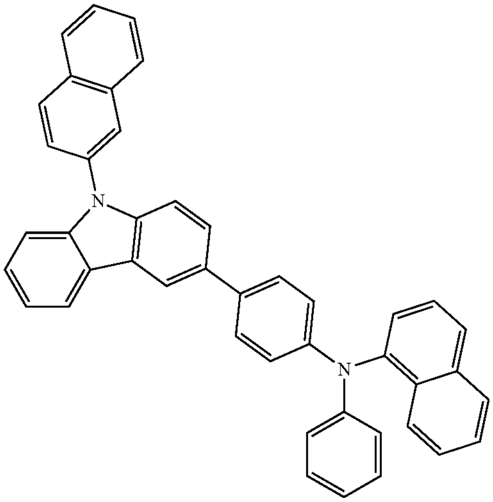
1-83
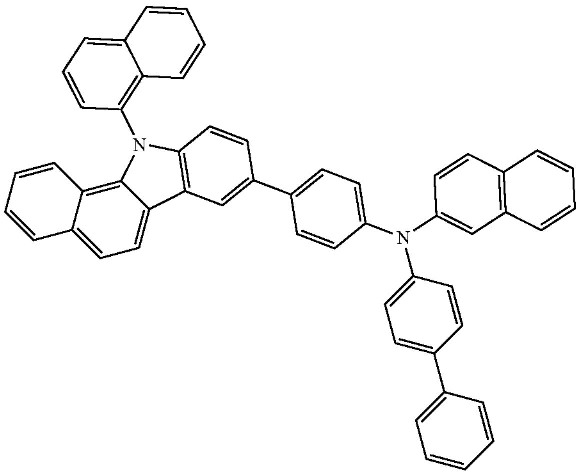
1-84
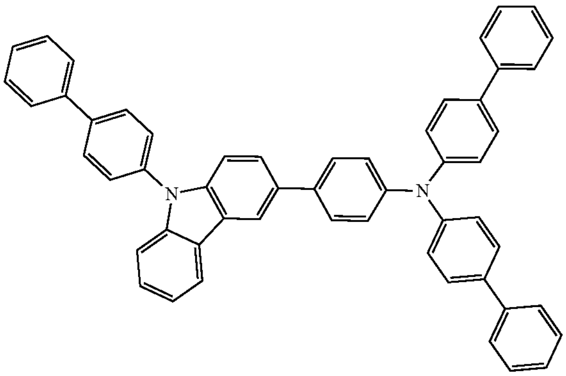

-continued
1-85
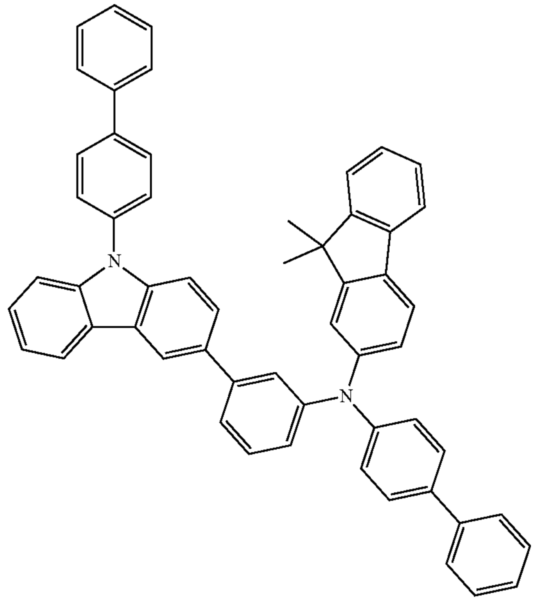
1-86
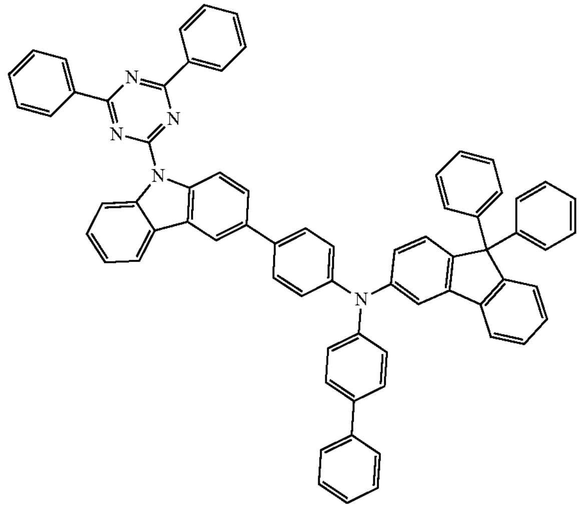
1-87
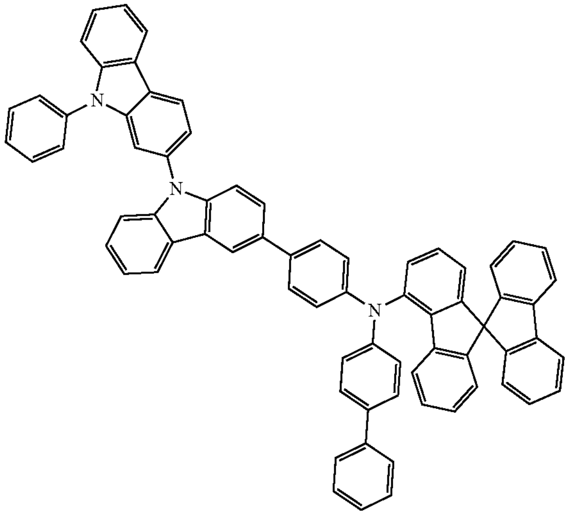
1-88
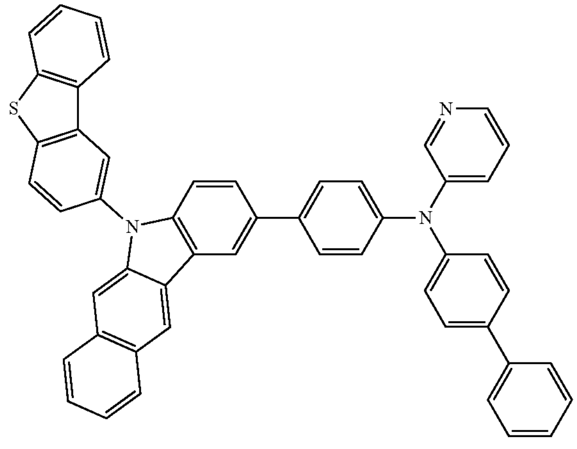

-continued
1-89
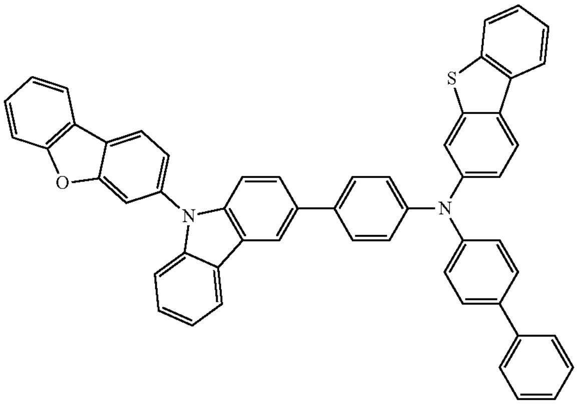
1-90
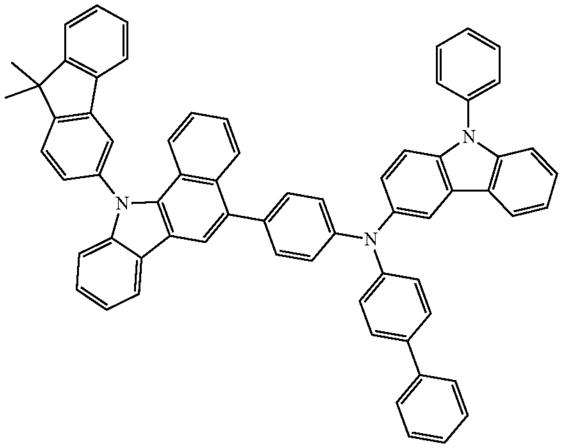
1-91
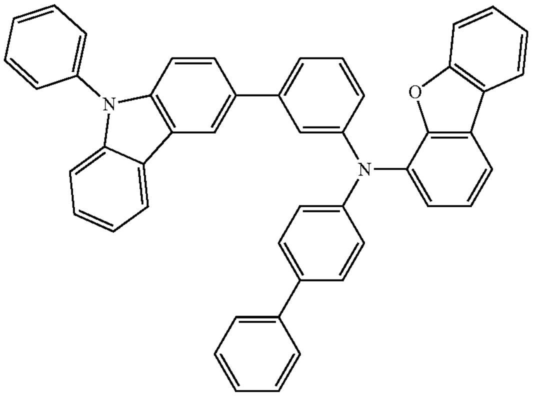
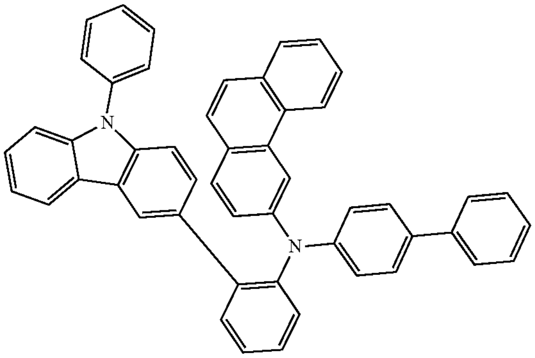
1-93
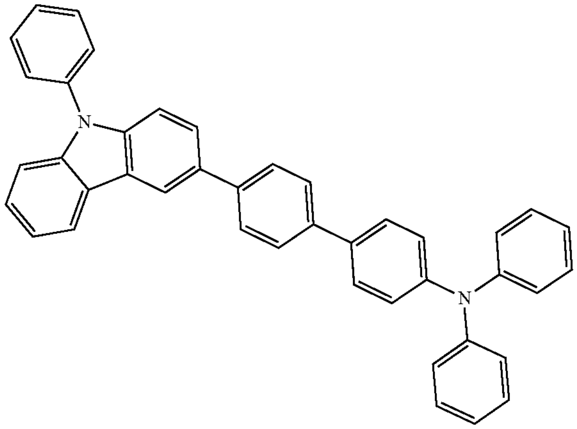

-continued
1-94
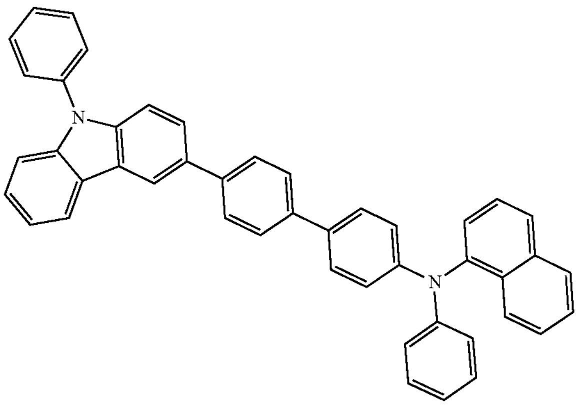
1-95
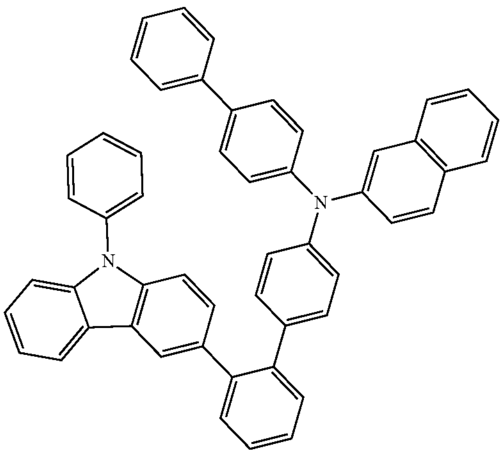
1-96
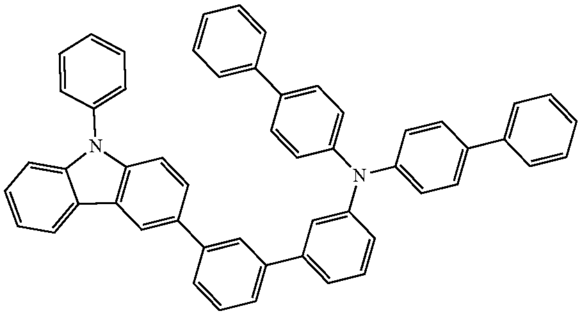
1-97
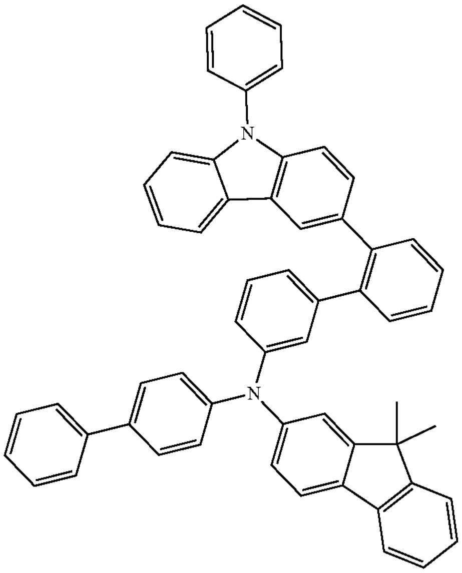
1-98
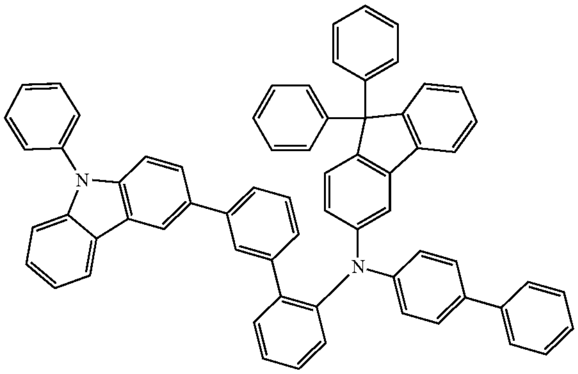

-continued
1-99
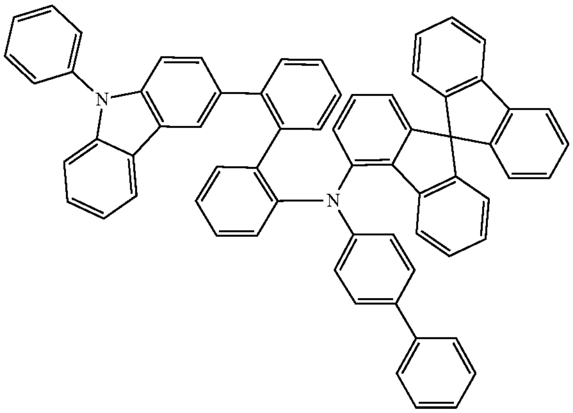
1-100
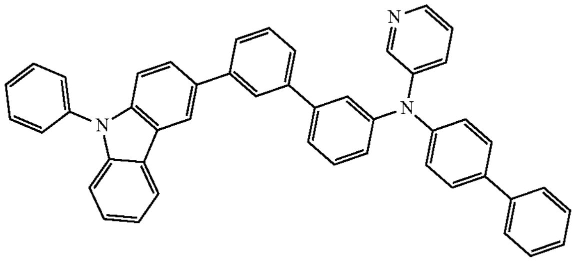
1-101
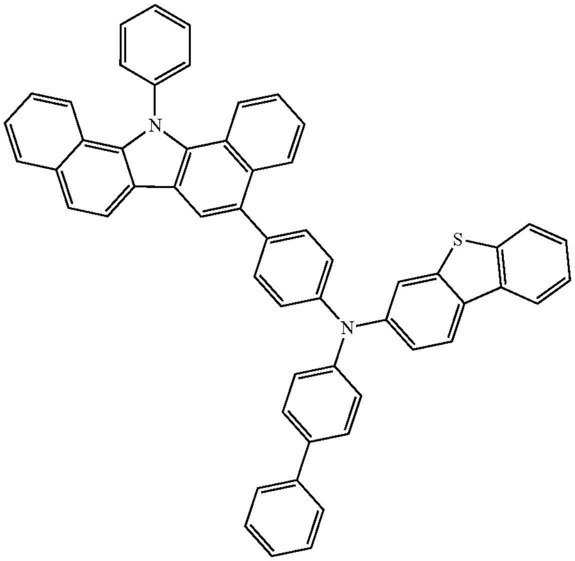
1-102
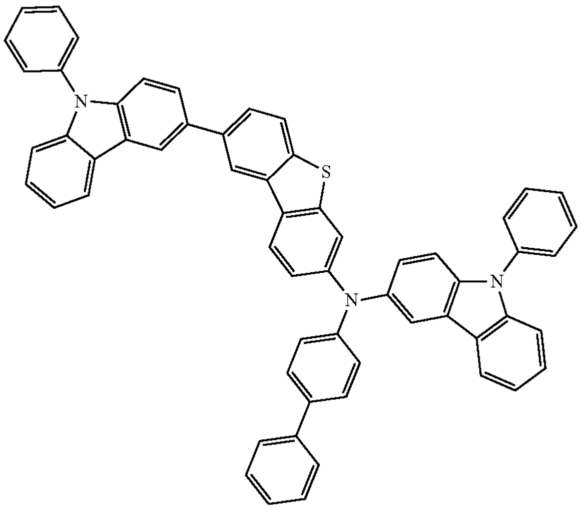
1-103
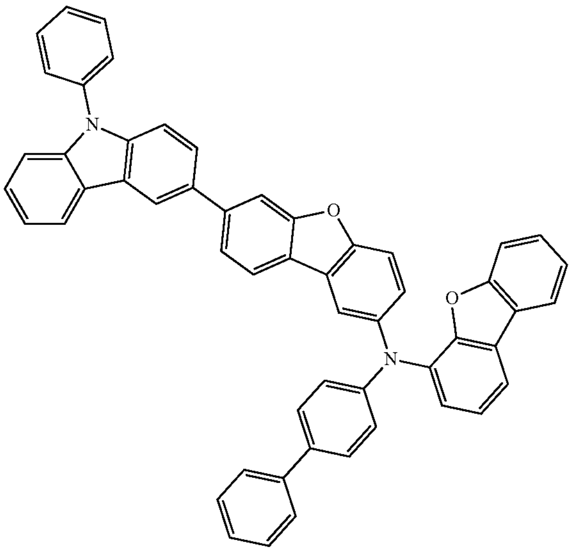

-continued
1-104
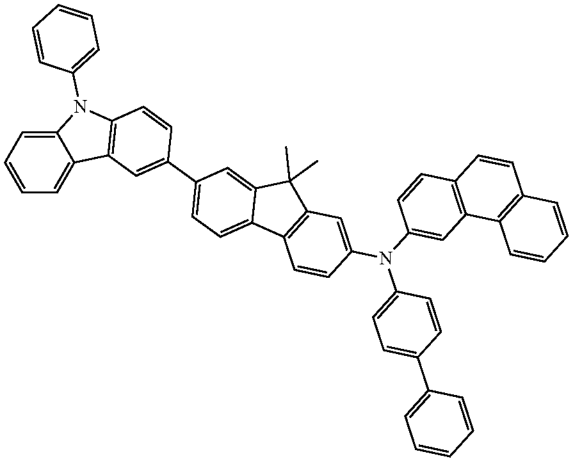
1-105
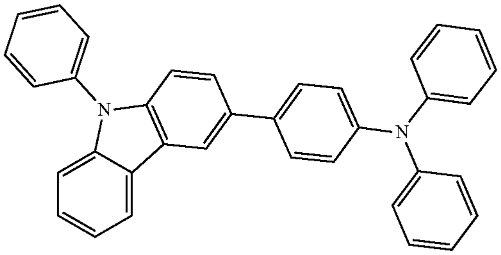
1-106
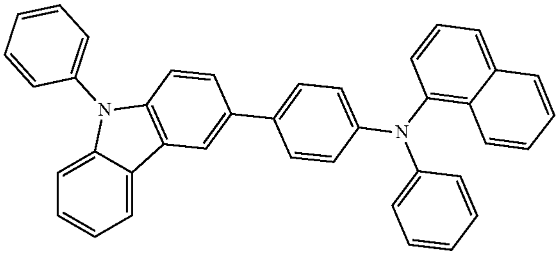
1-107
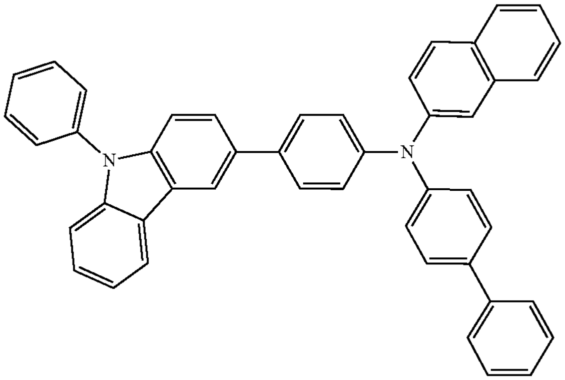
1-108
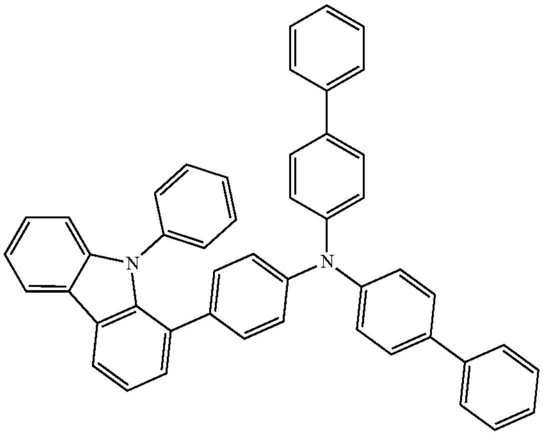
1-109
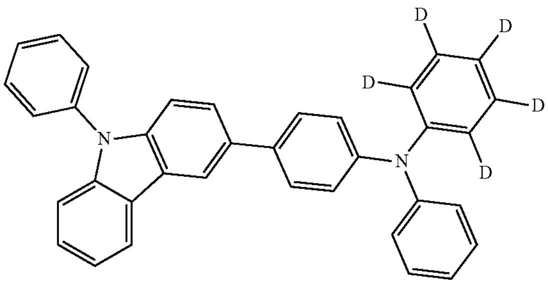
1-110
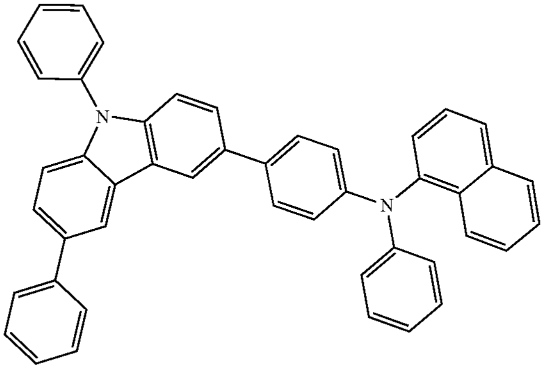

-continued
1-111
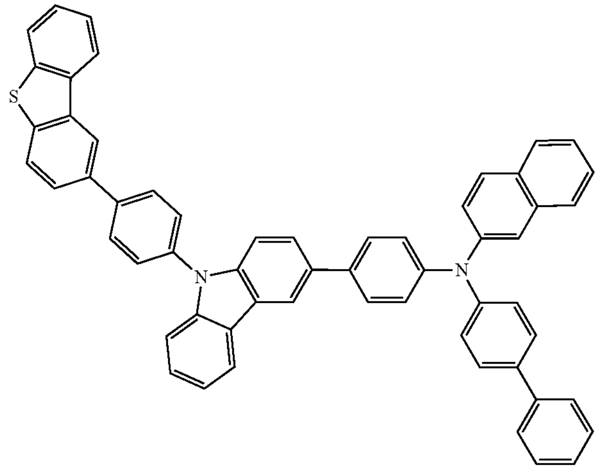
1-112
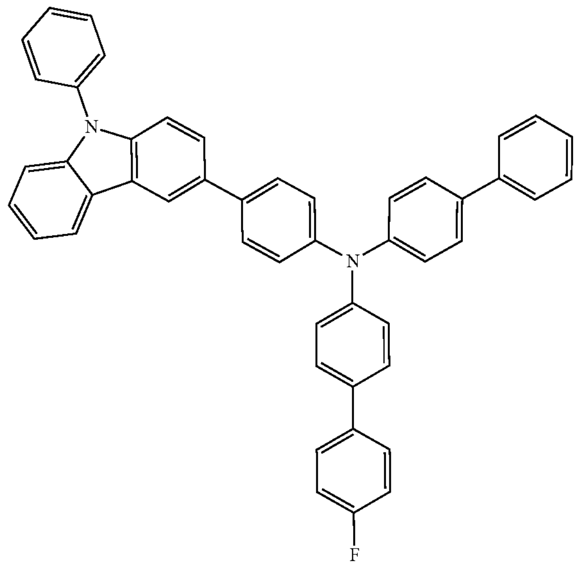
1-113
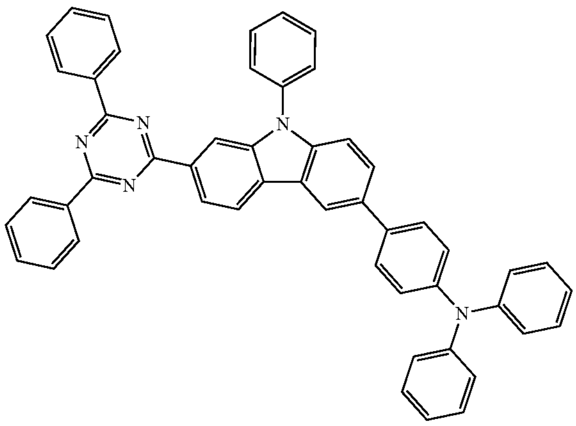
1-114
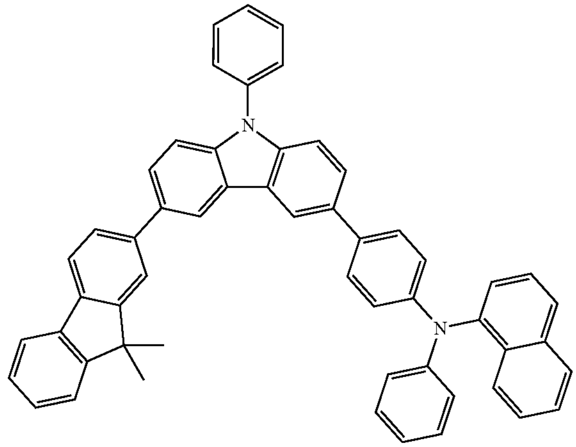

-continued
1-115
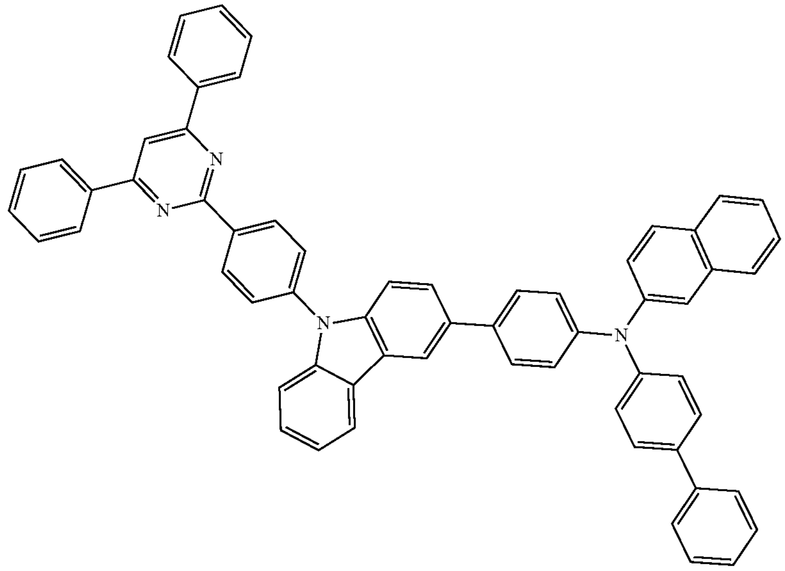
1-116
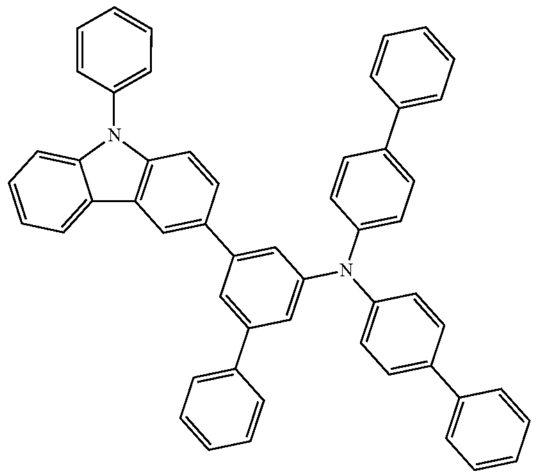
1-117
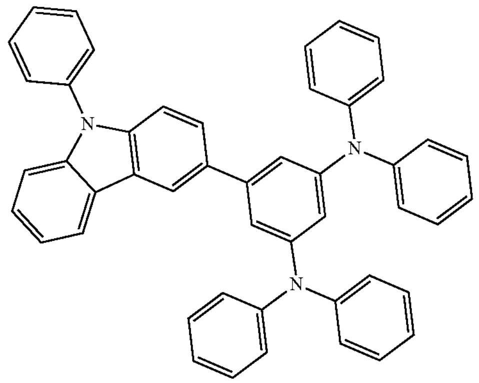

-continued
1-118
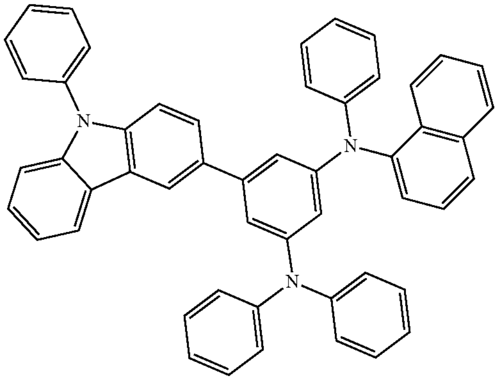
1-119
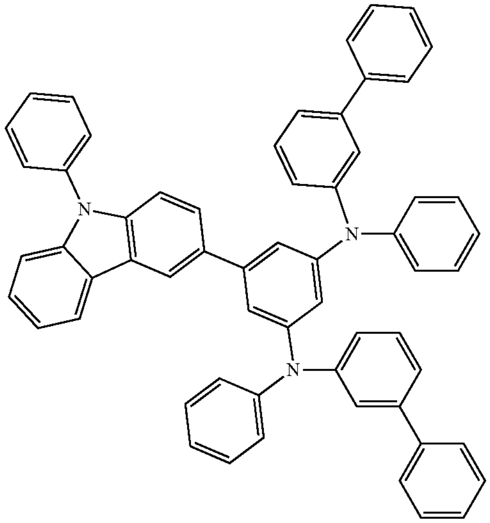
1-120
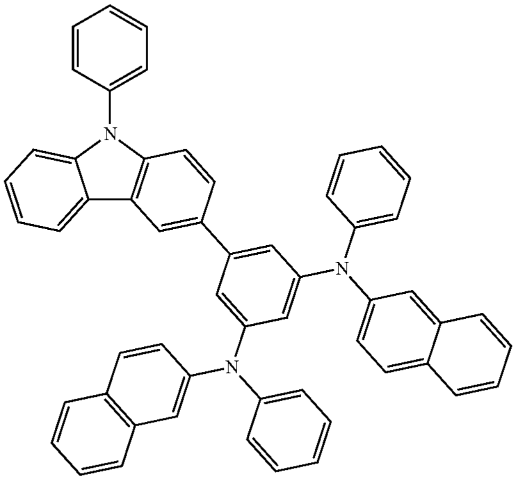
1-121
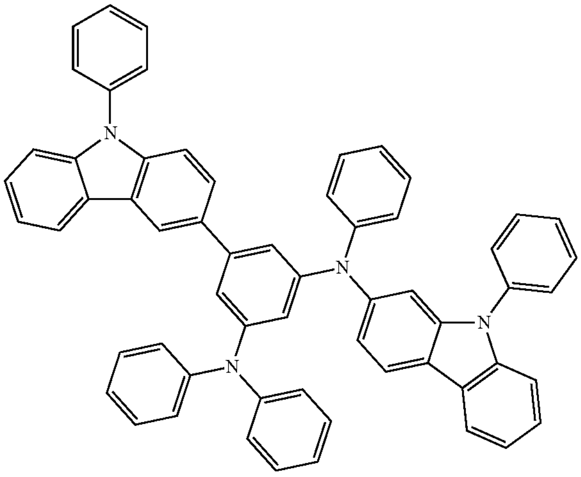

-continued
1-122
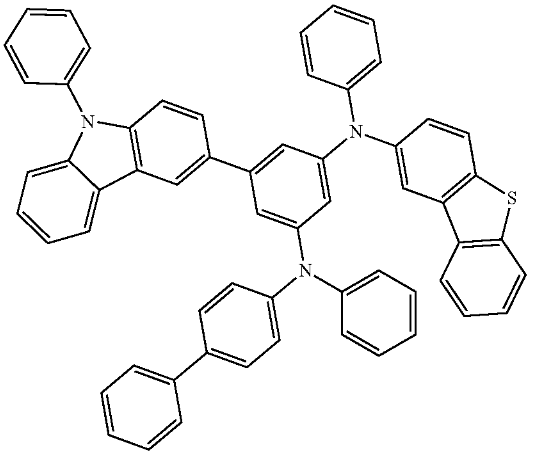
1-123
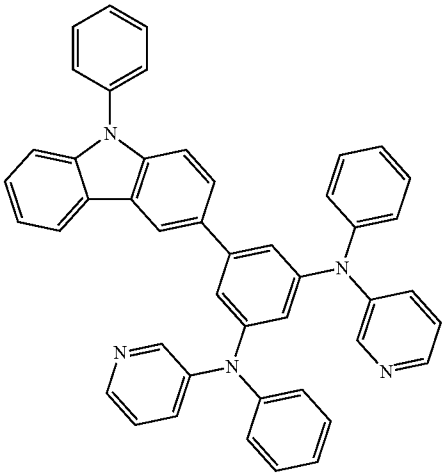
1-124
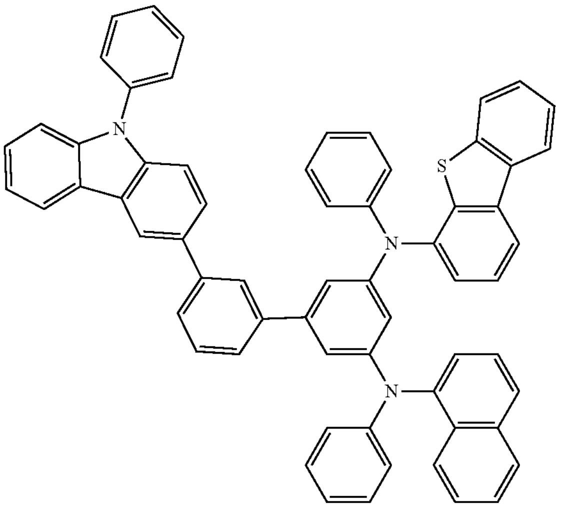
1-125
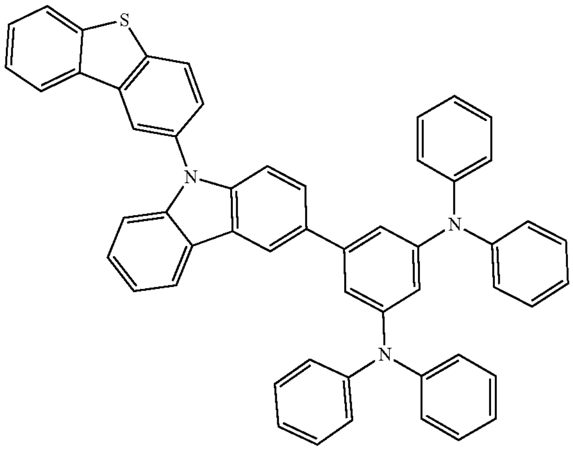

-continued
1-126
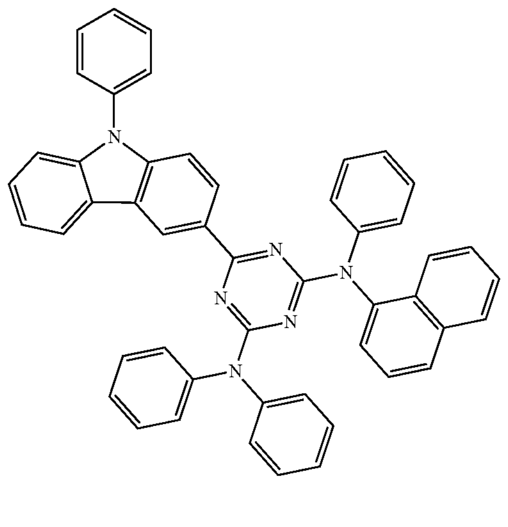
1-127
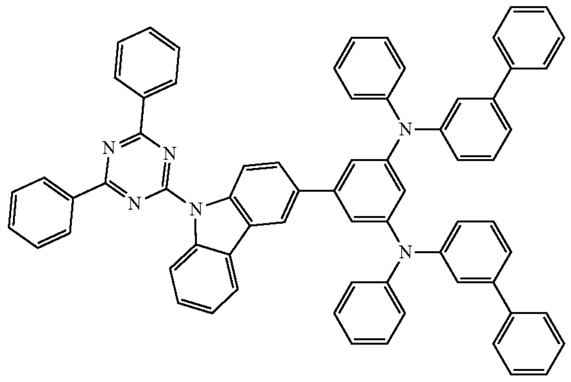
1-128
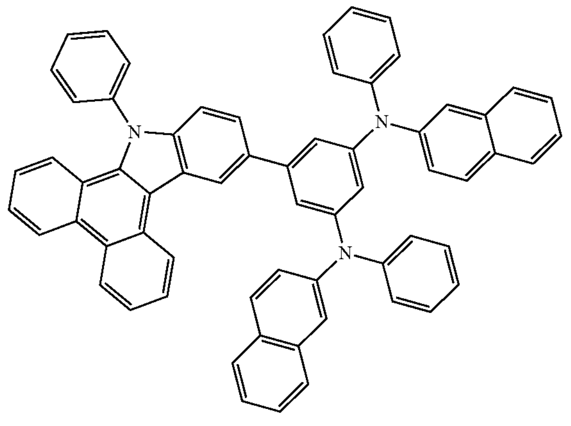

-continued
1-129
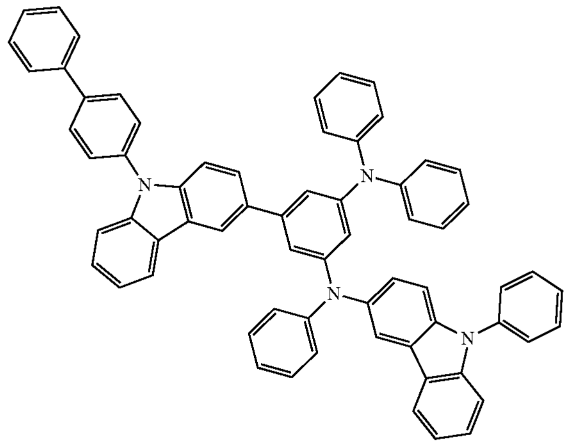
1-130
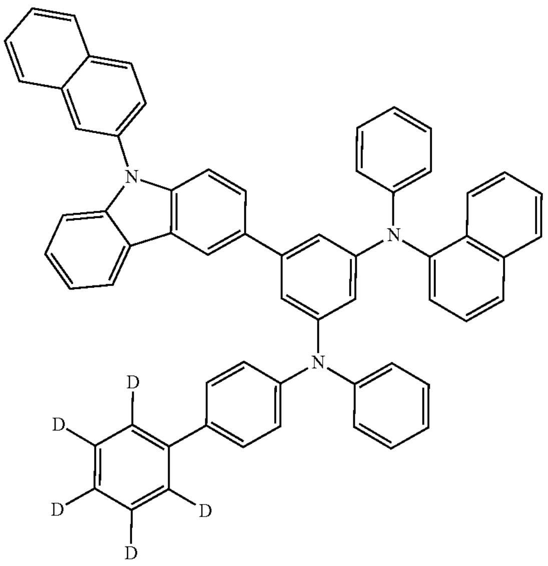
1-131
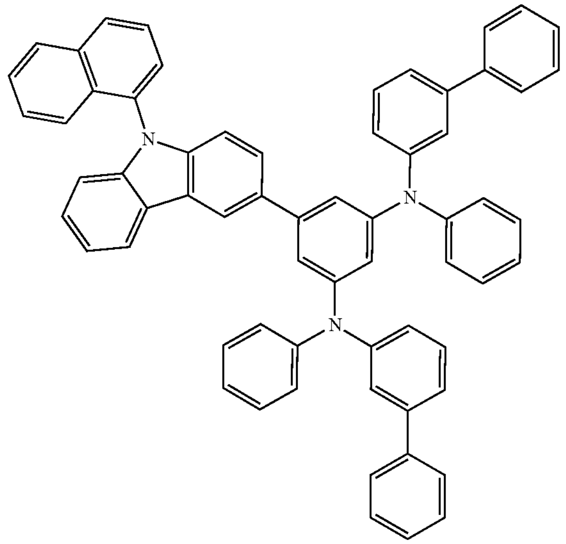

-continued
1-132
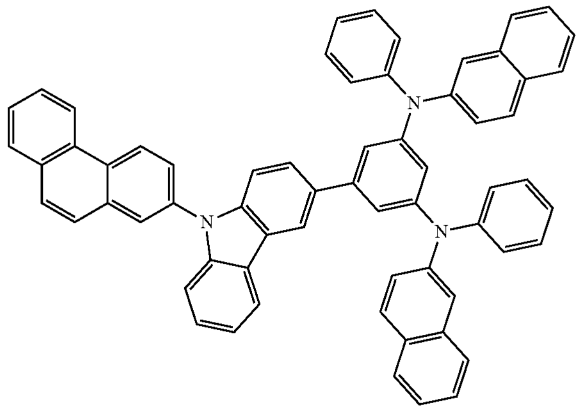
1-133
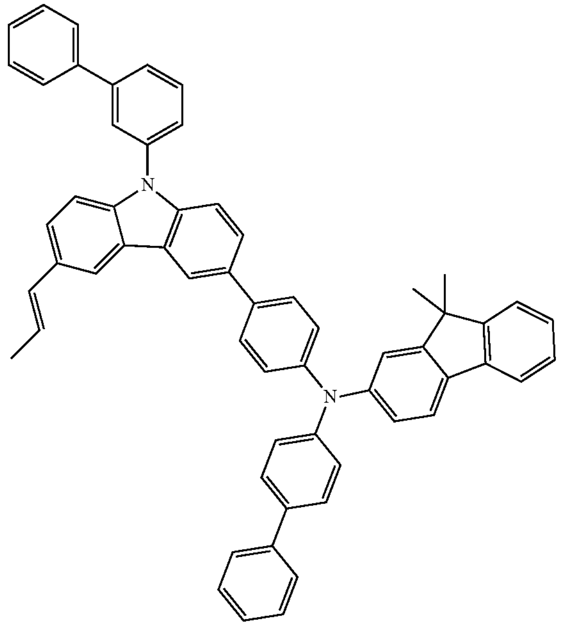
1-134
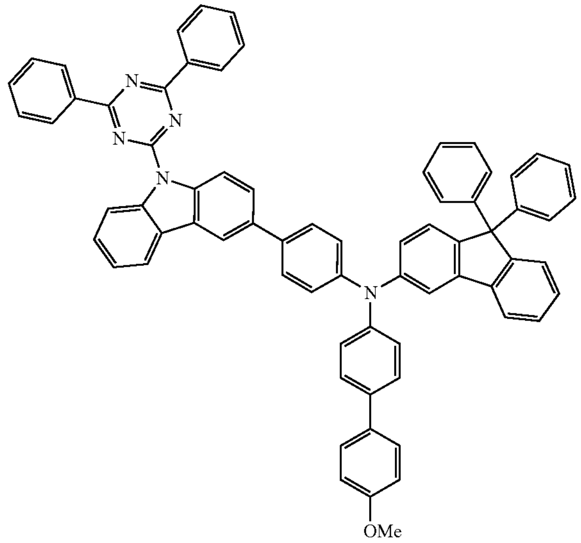

-continued
1-135
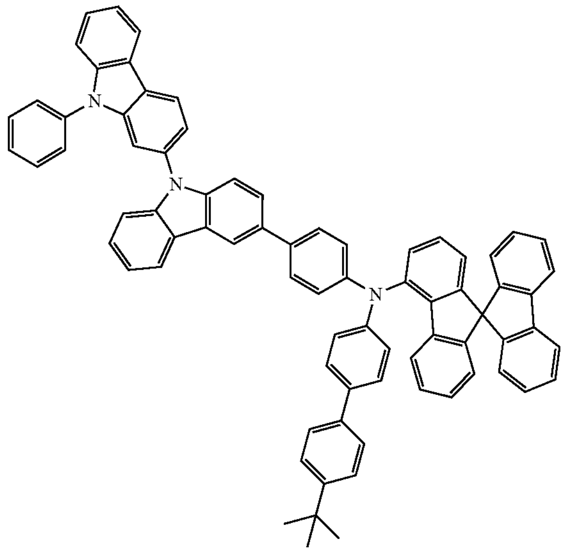
1-136
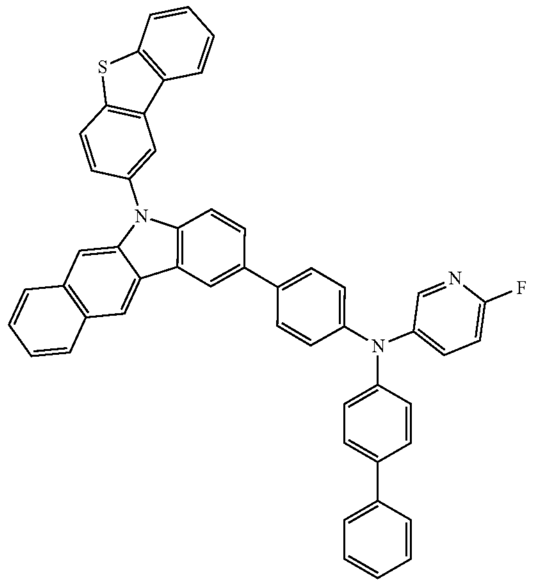
1-137
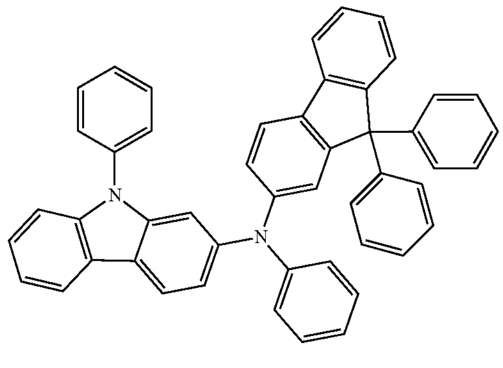

-continued
2-33
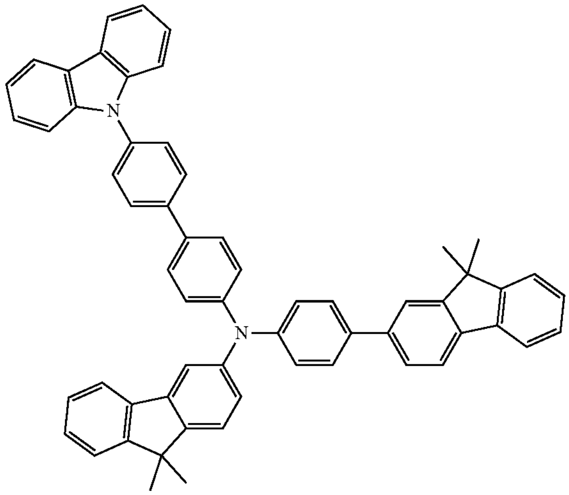
2-34
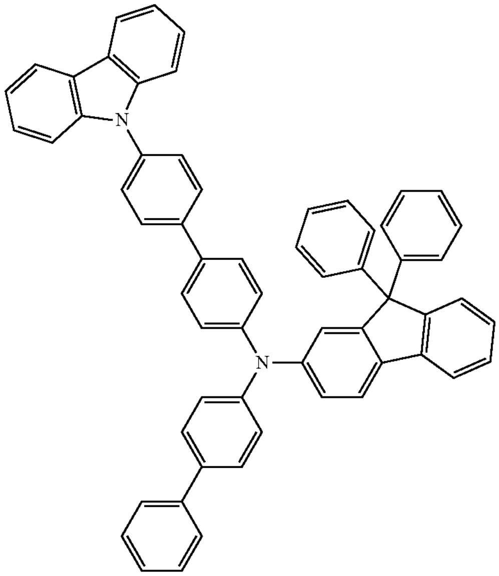
2-35
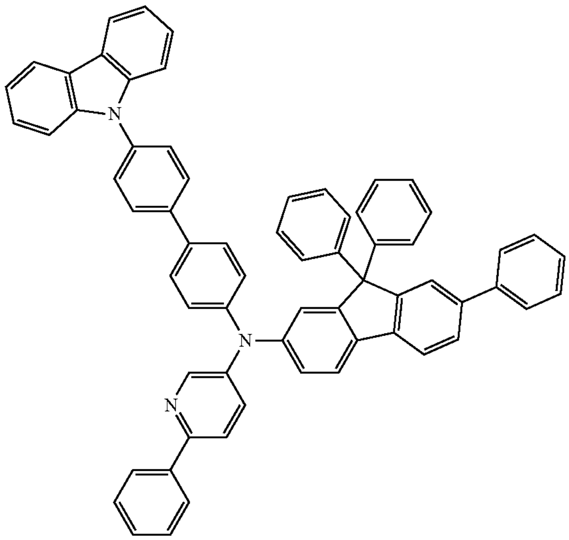
2-36
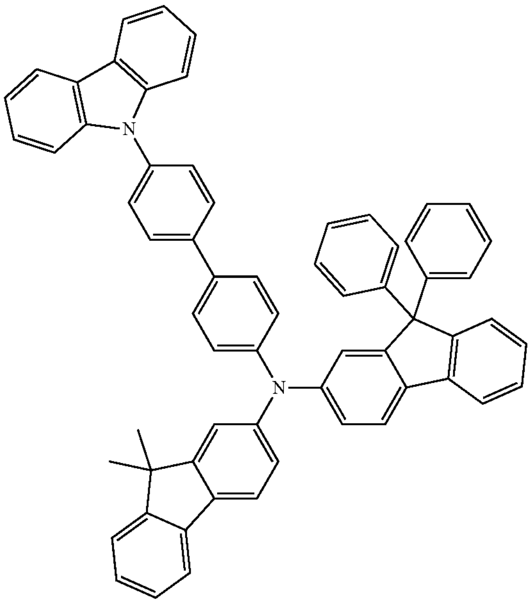
2-37
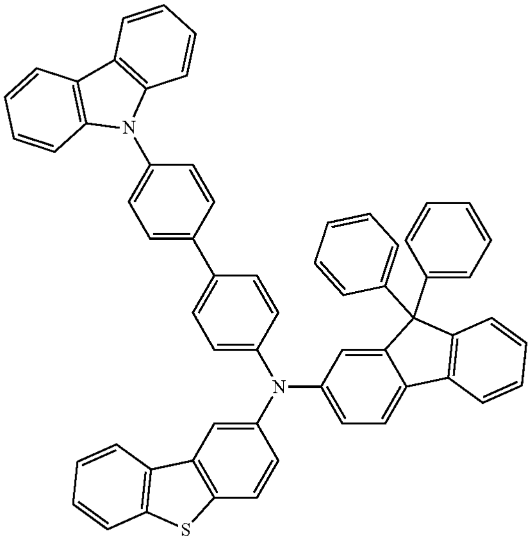

-continued
2-38
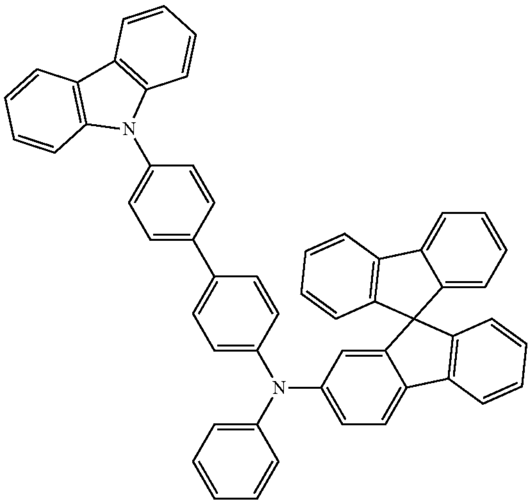
2-39
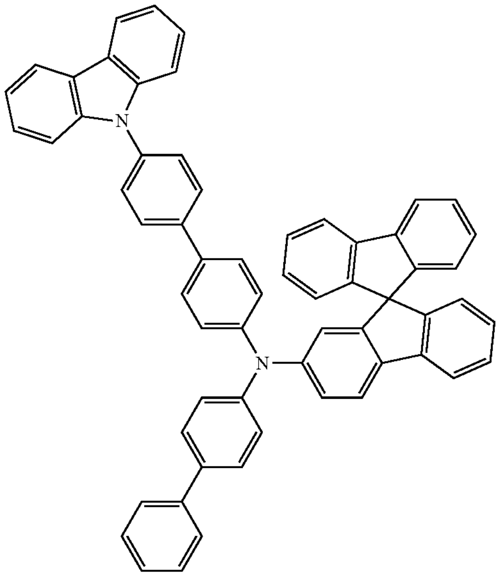
-continued
2-40
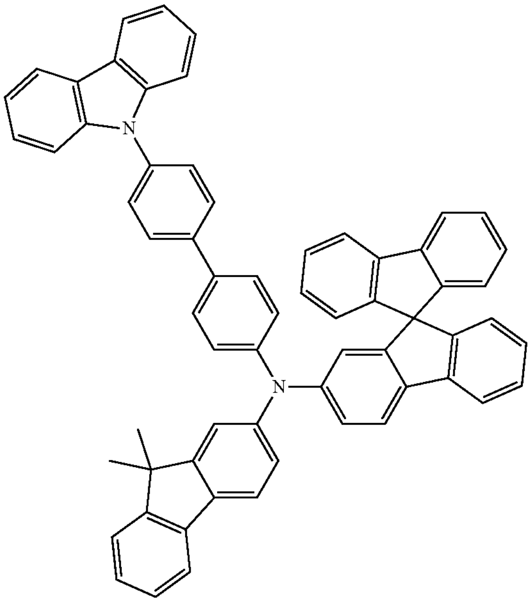
2-41
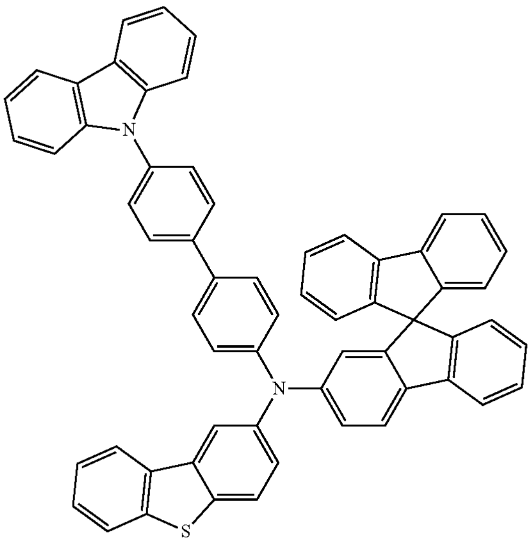

-continued
2-42
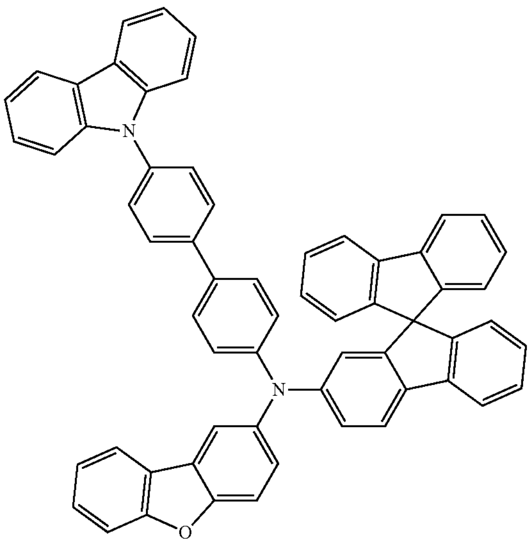
2-43
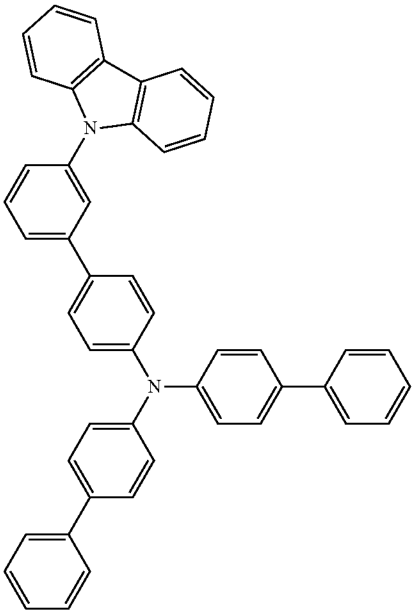
-continued
2-44
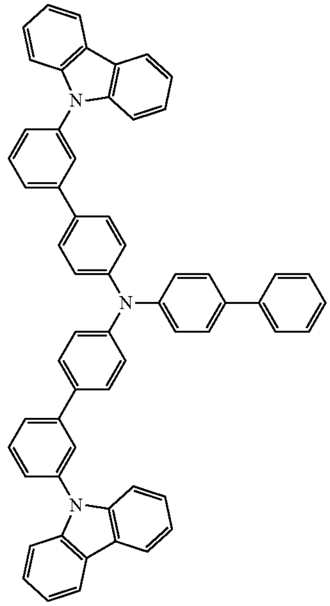
2-45
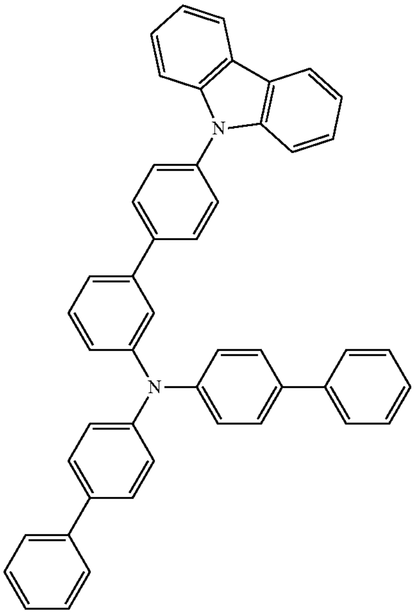

-continued
2-46
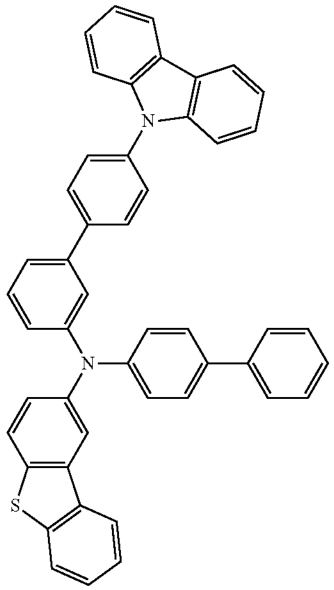
2-47
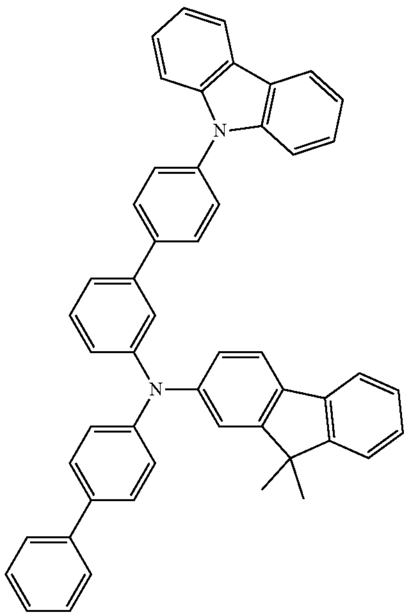
-continued
2-48
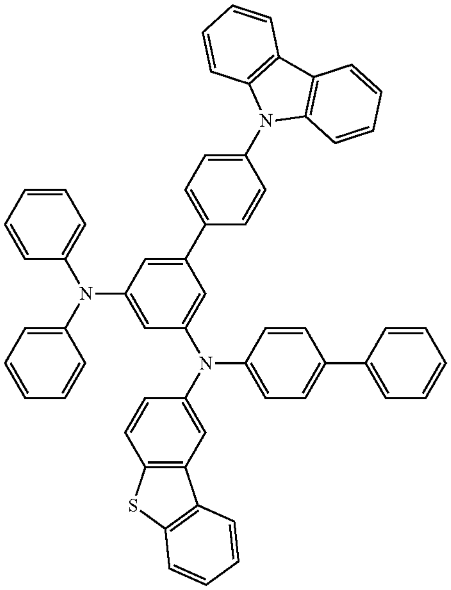
2-49
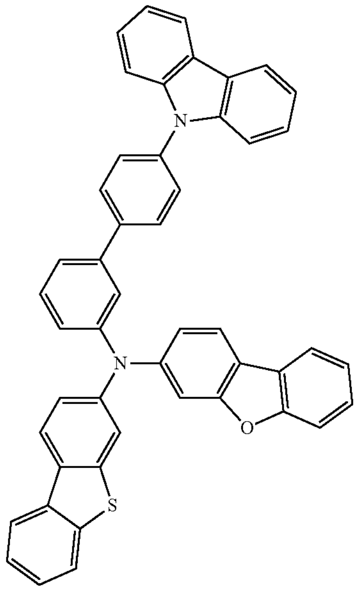
2-50
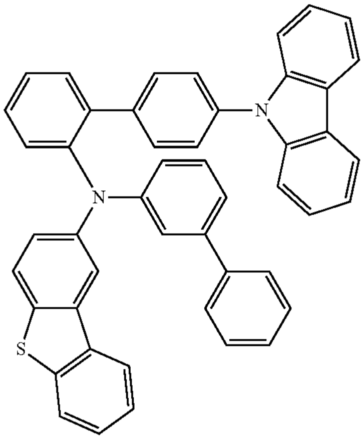

-continued
2-51
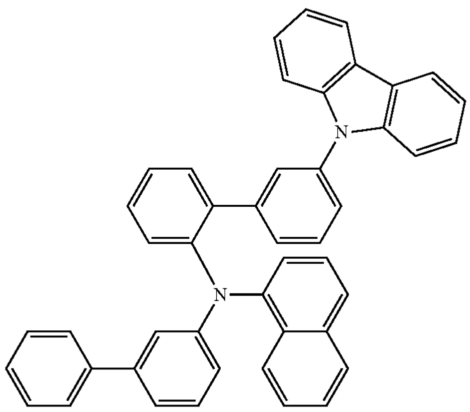
2-52
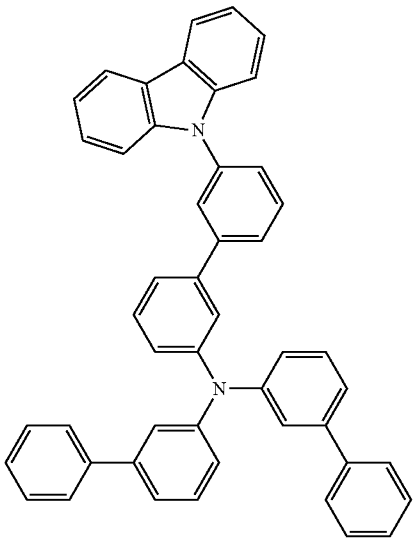
2-53
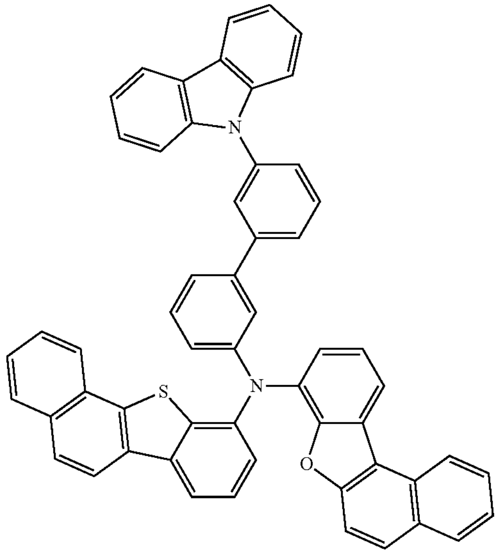
-continued
2-54
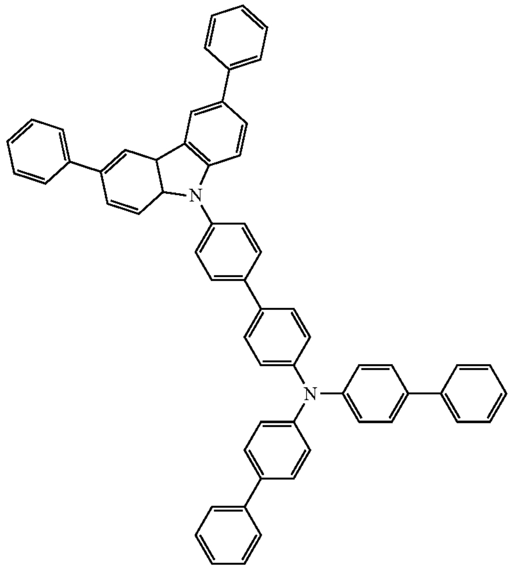
2-55
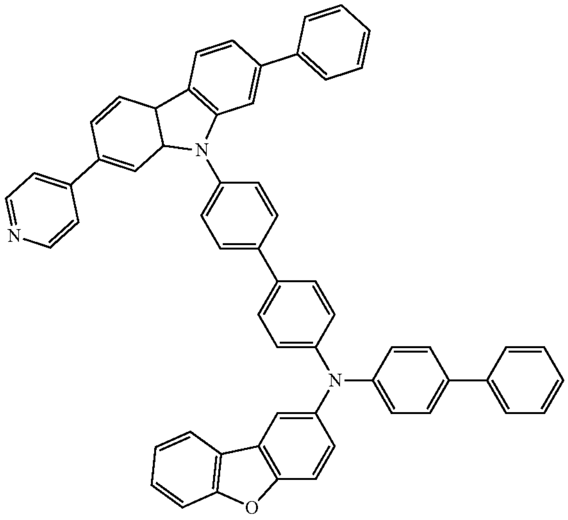
2-56
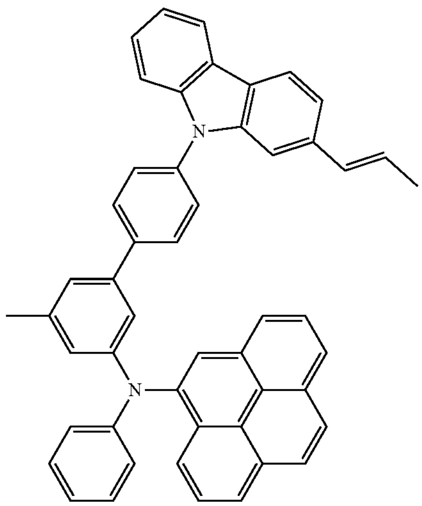

-continued
2-57
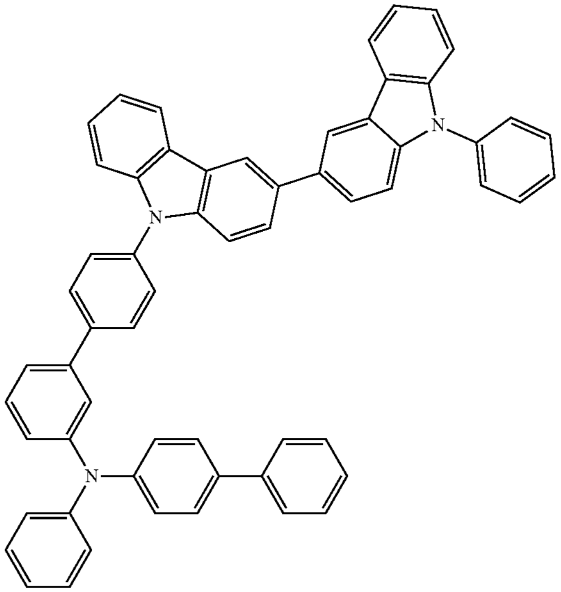
2-58
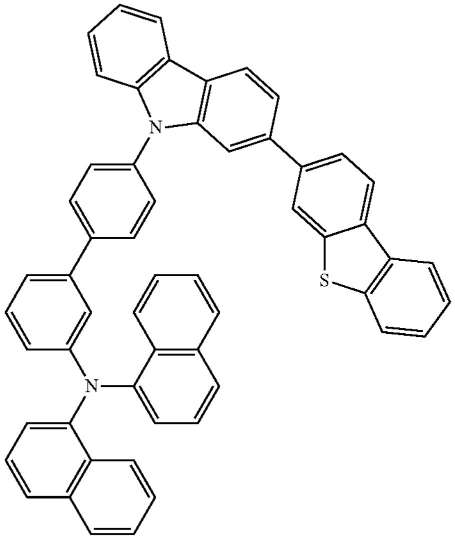
2-59
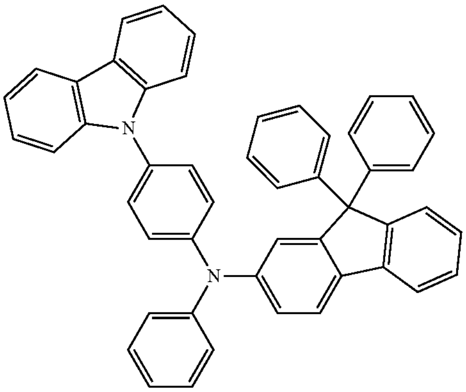
-continued
2-60
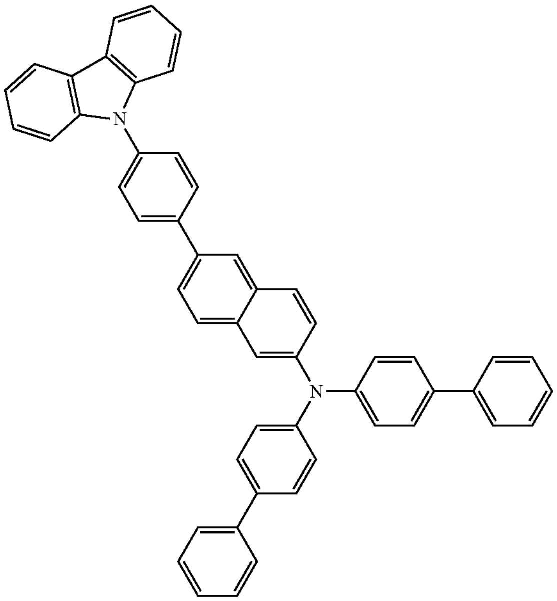
2-61
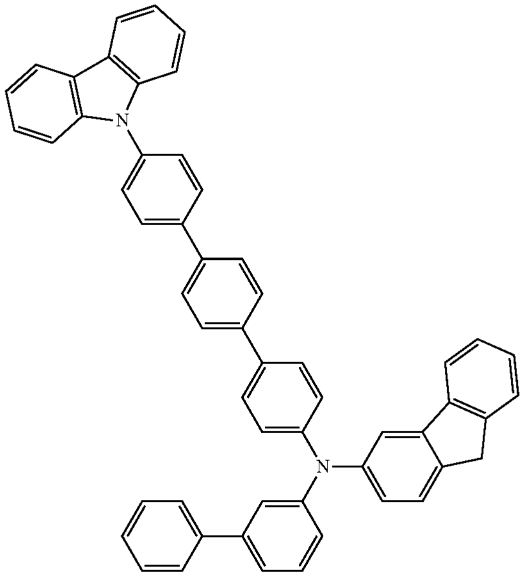
2-62
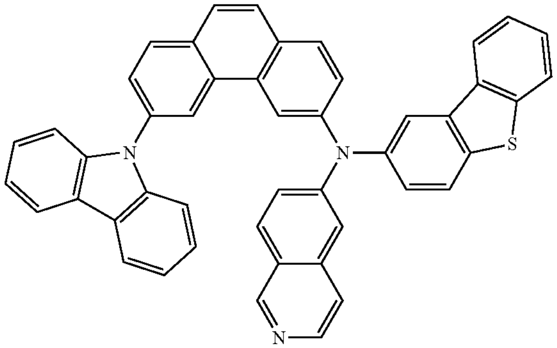

-continued
2-63
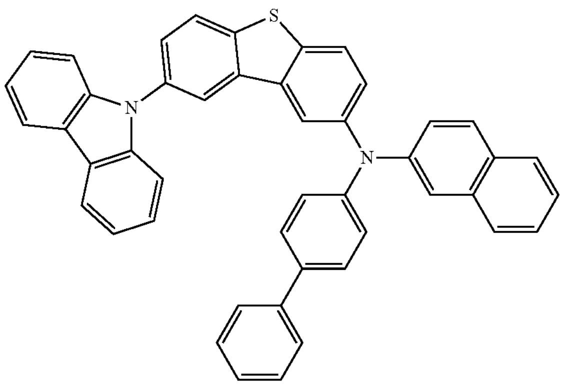
2-64
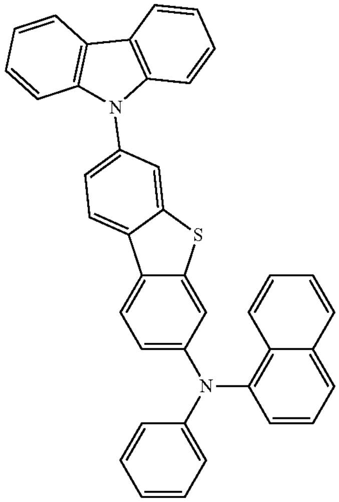
2-65
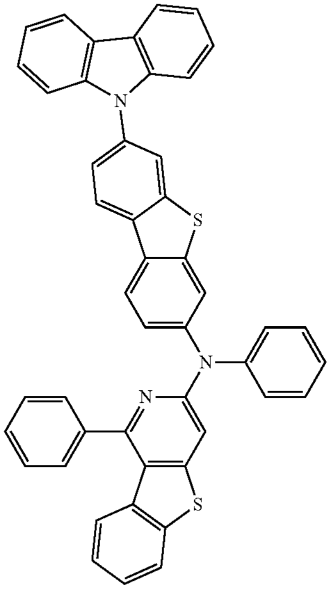
-continued
2-66
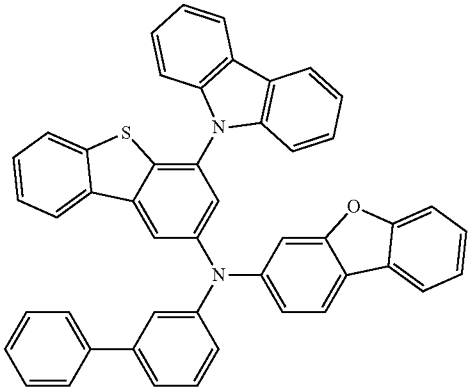
2-67
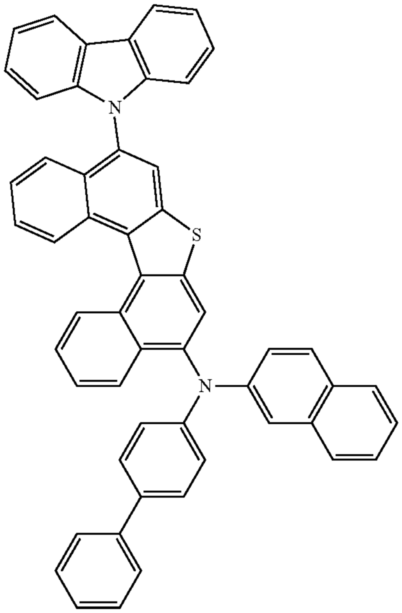
2-68
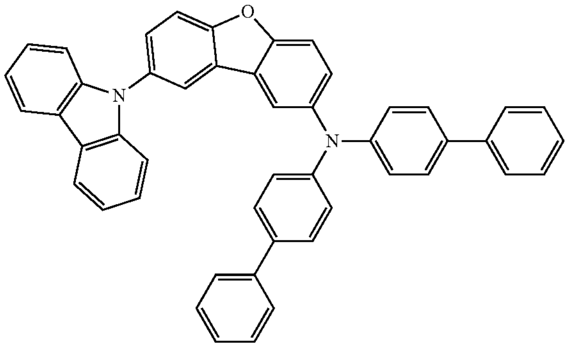

-continued
2-69
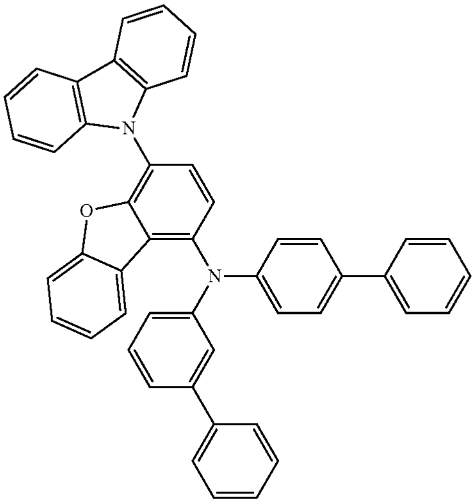
2-70
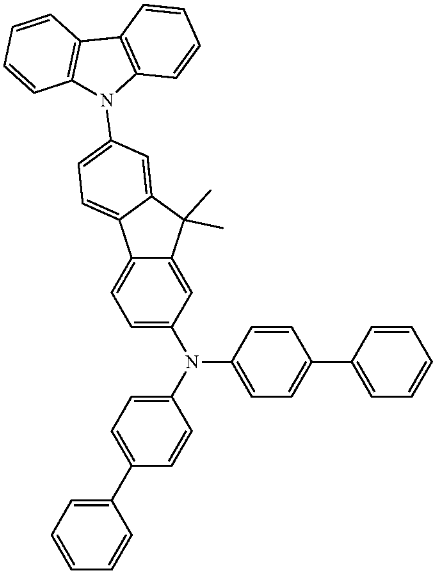
2-71
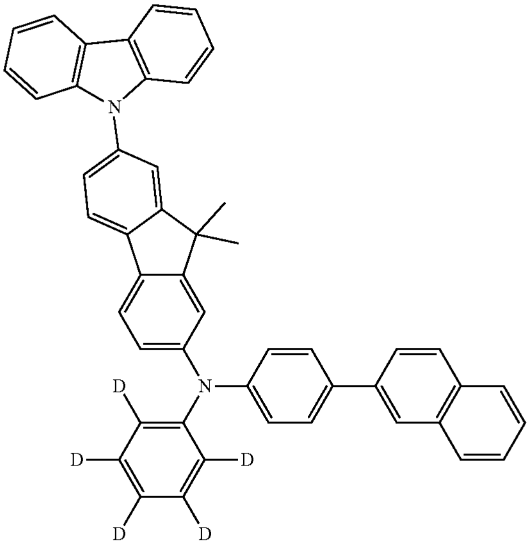
-continued
2-72
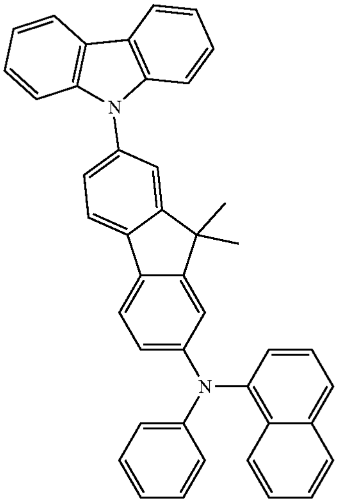
2-73
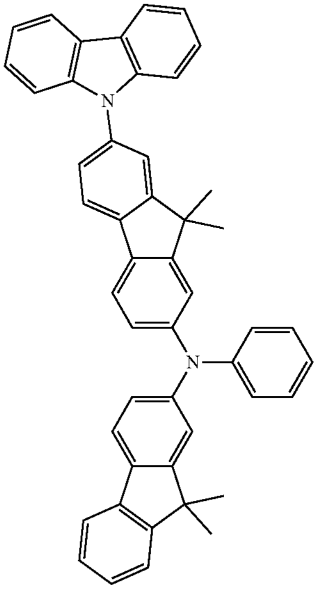

-continued
2-74
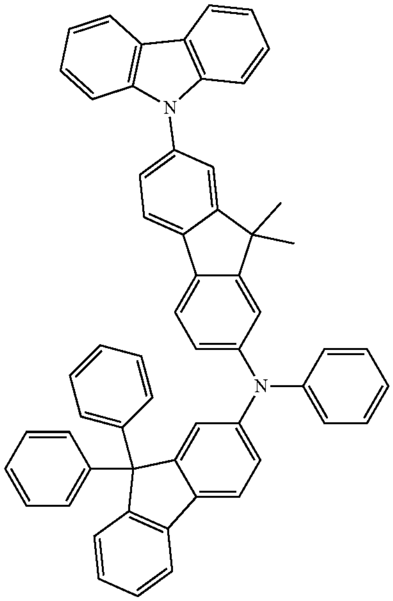
2-75
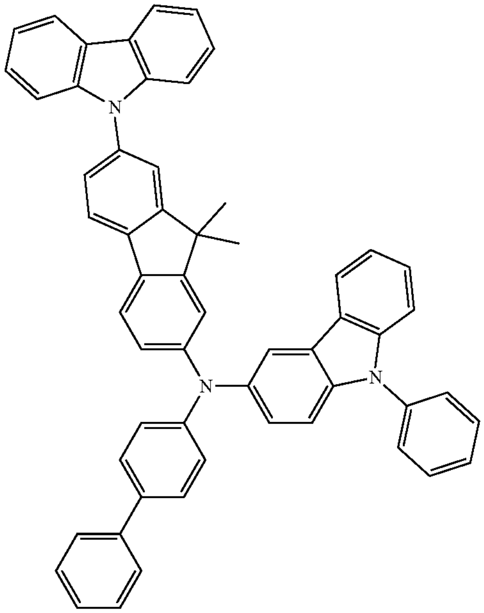
-continued
2-76
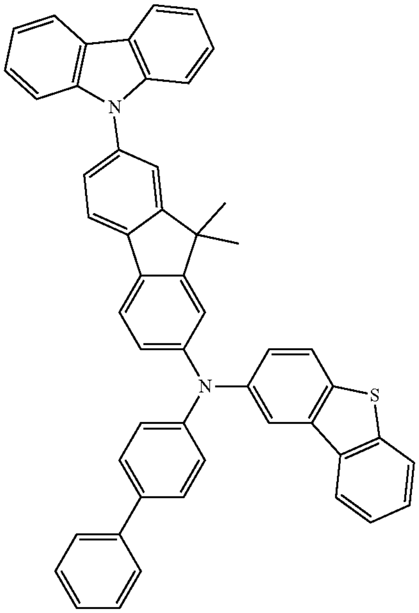
2-77
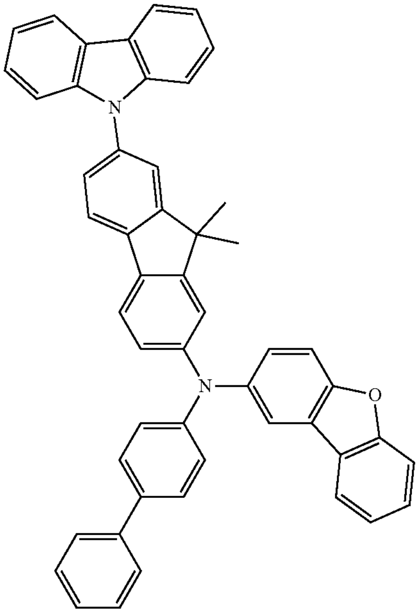

-continued
2-78
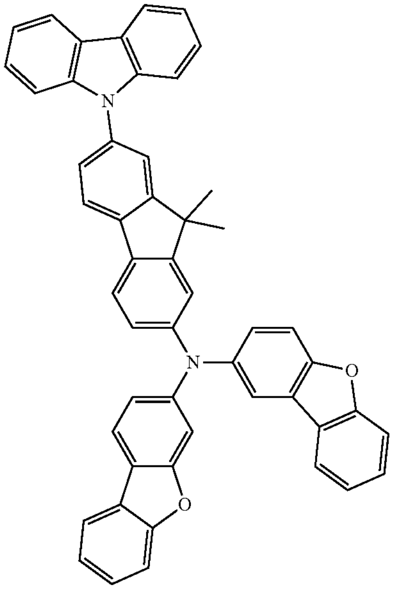
2-79
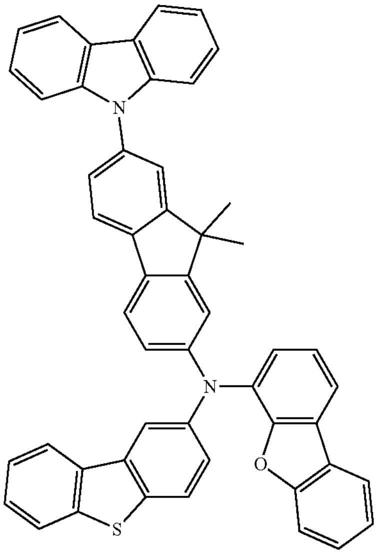
-continued
2-80
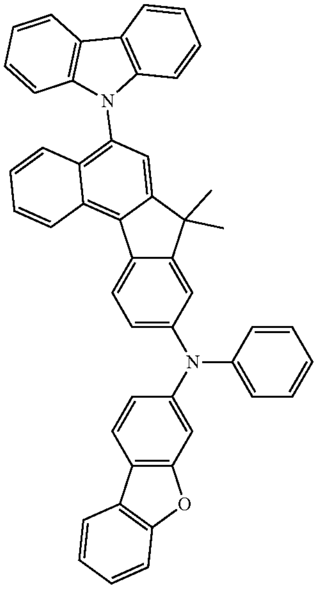
2-81
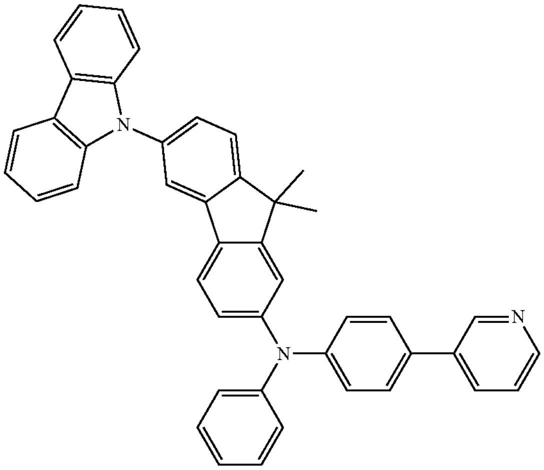

-continued
2-82
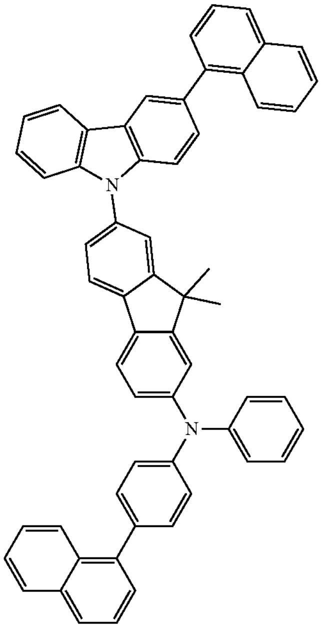
2-83
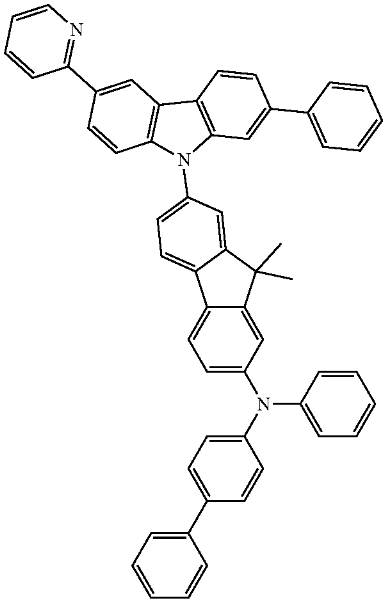
-continued
2-84
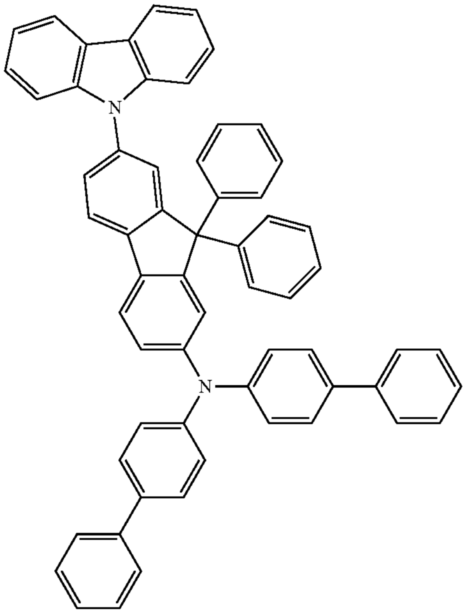
2-85
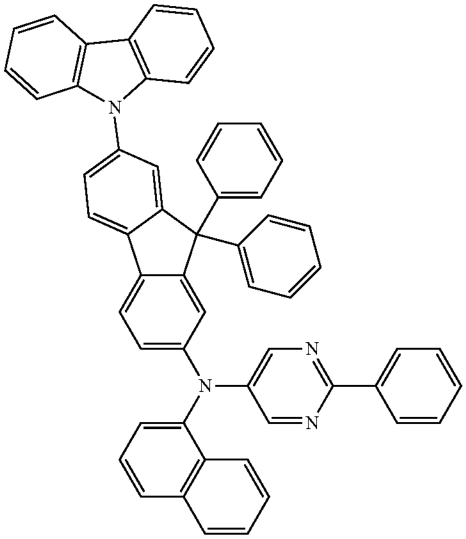

-continued
2-86
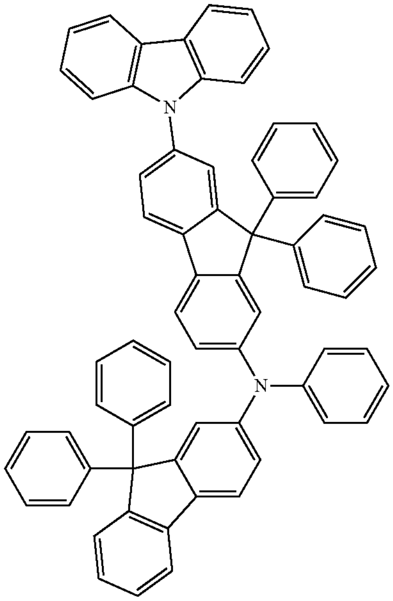
2-87
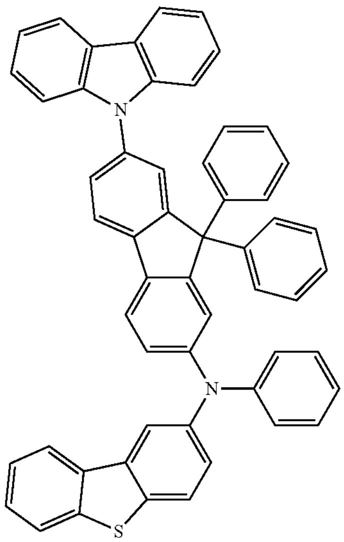
-continued
2-88
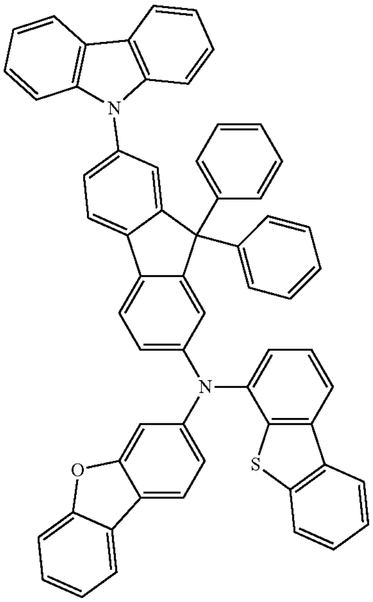
2-89
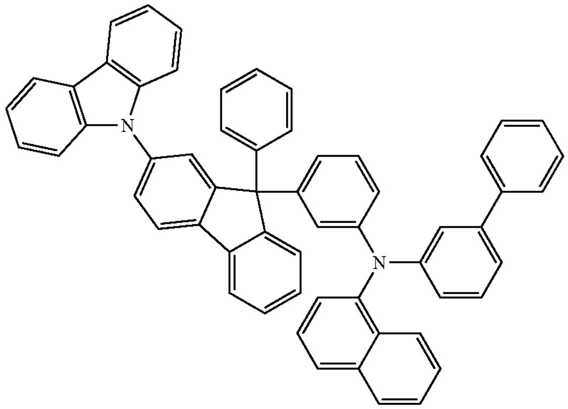
2-90
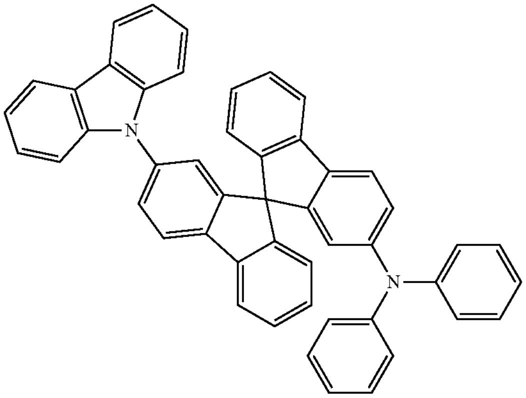

-continued
2-91
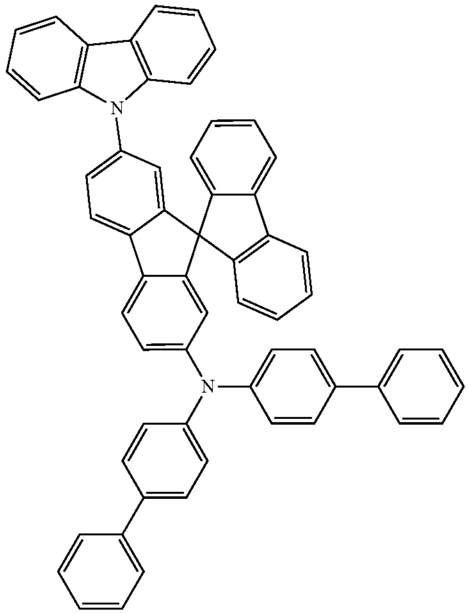
2-92
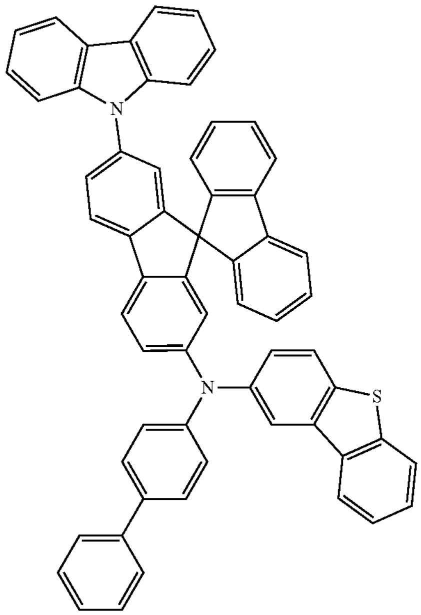
-continued
2-93
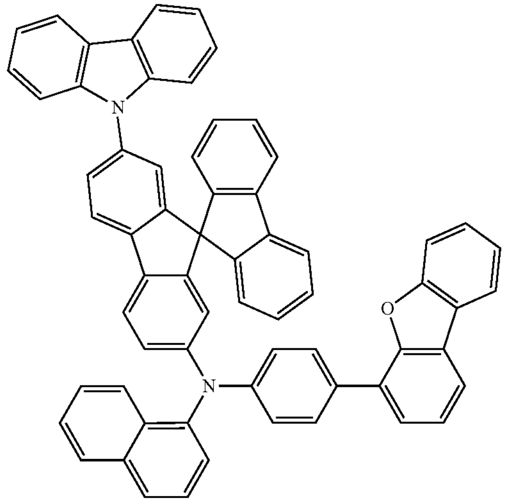
2-94
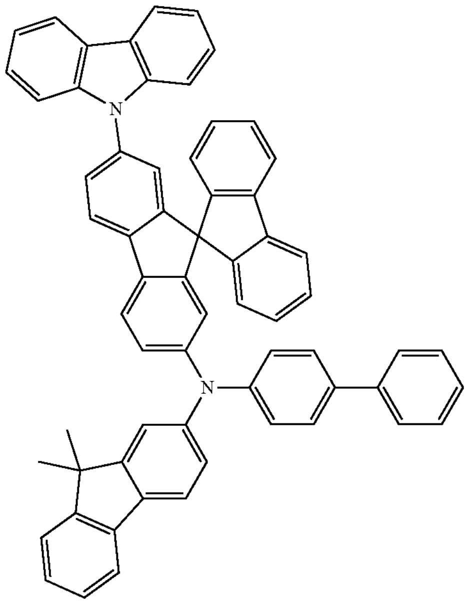

-continued
2-95
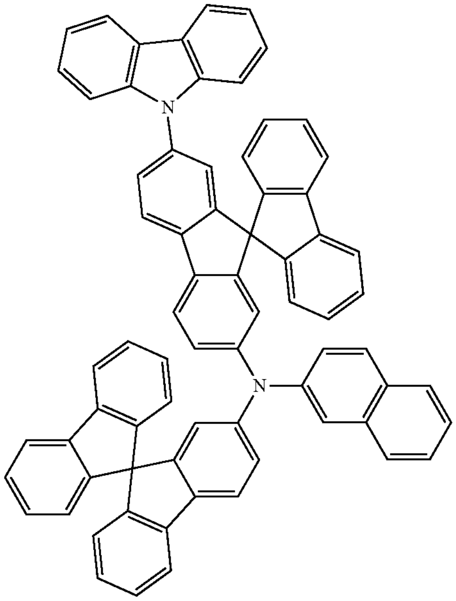
2-96
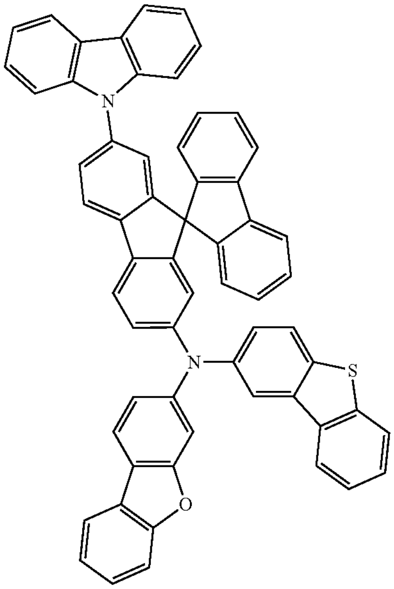
-continued
2-97
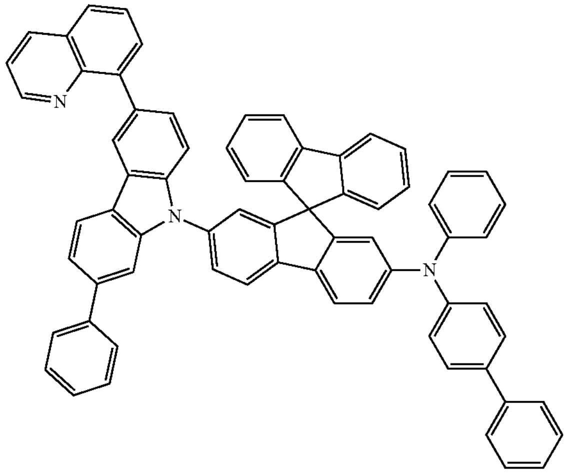
2-98
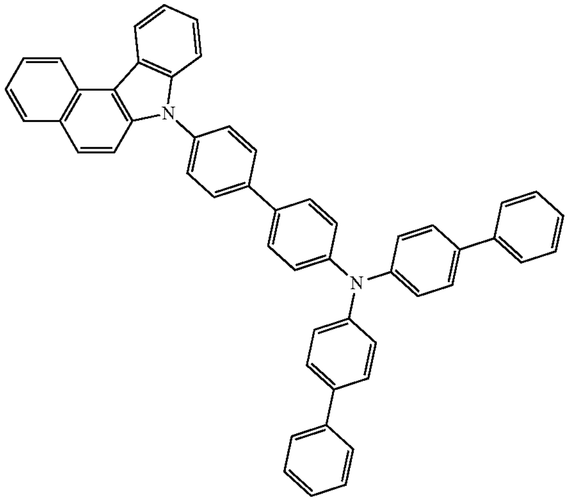
2-99
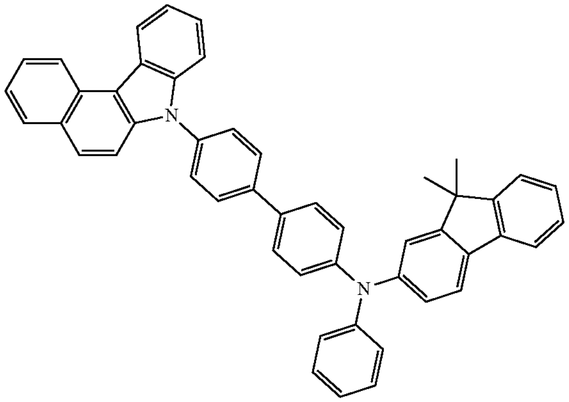

-continued
2-100
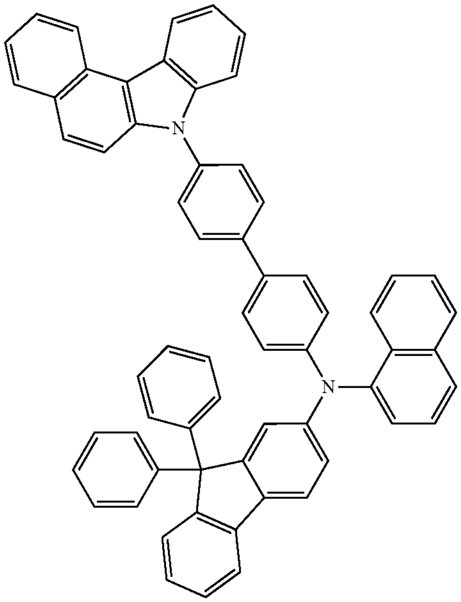
2-101
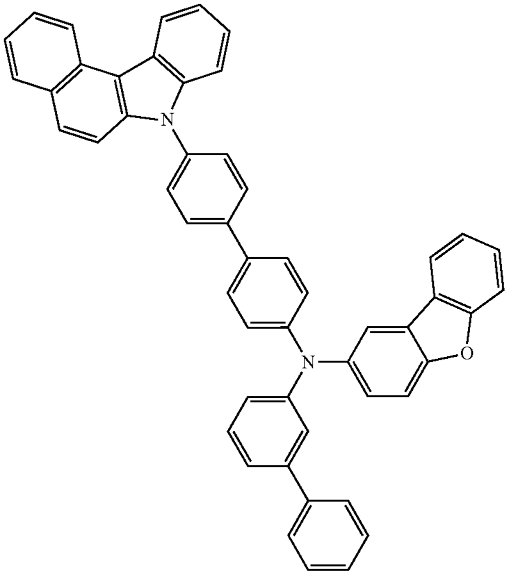
-continued
2-102
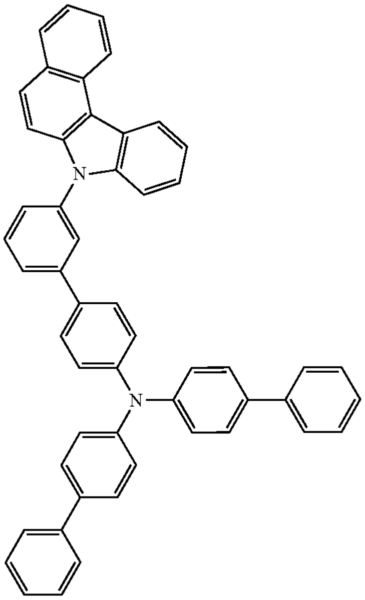
2-103
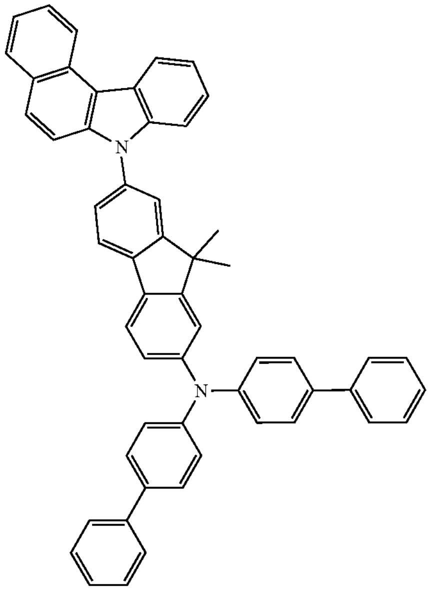

-continued
2-104
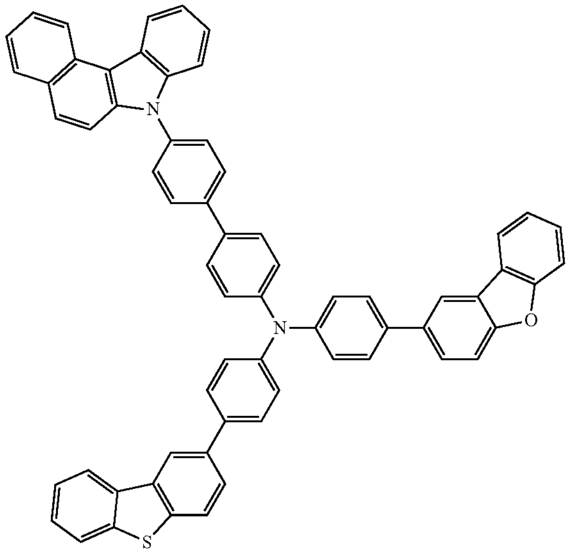
2-105
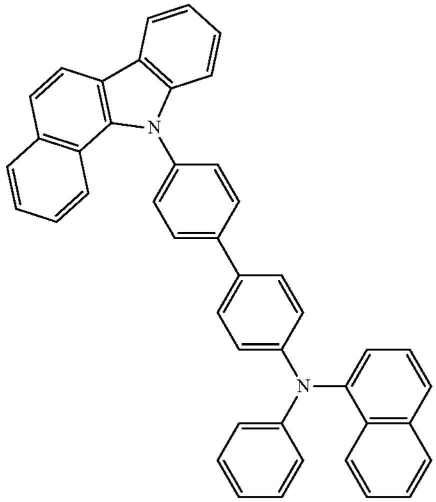
2-106
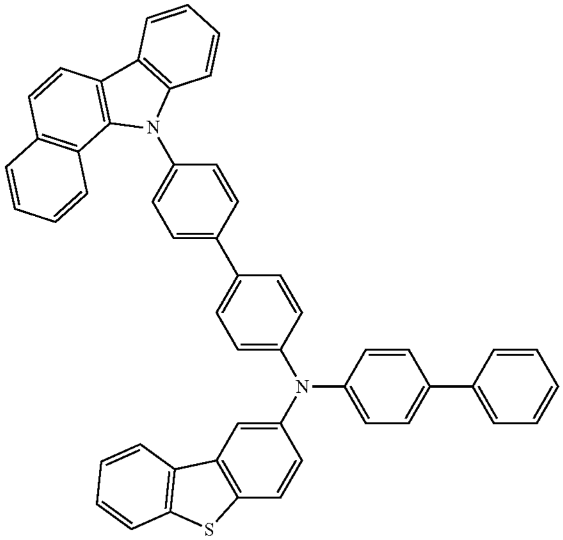
-continued
2-107
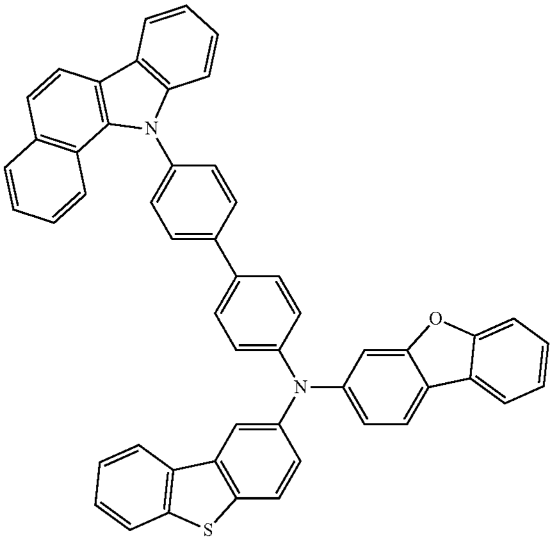
2-108
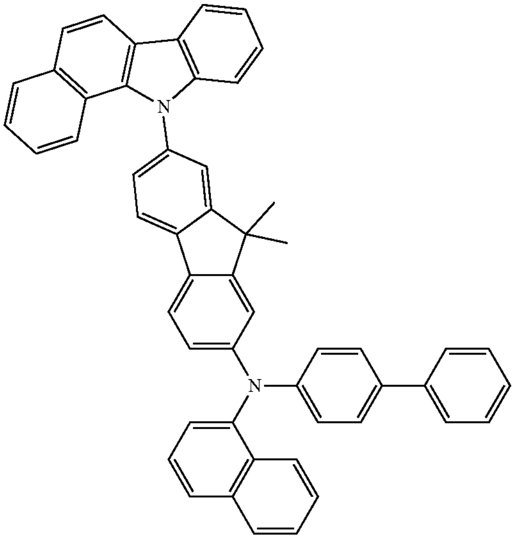

-continued
2-109
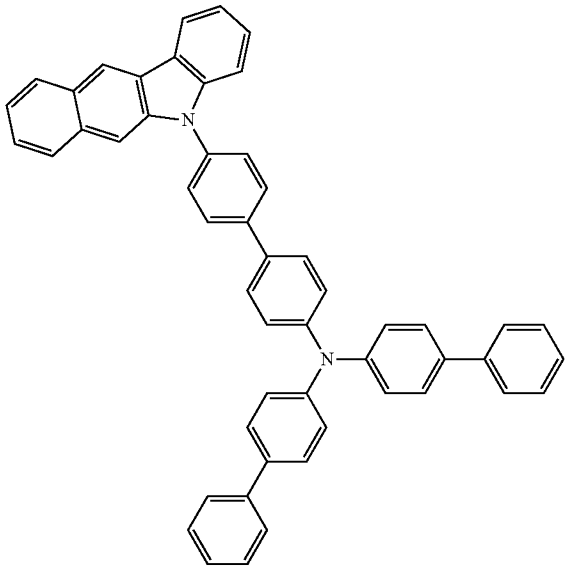
2-110
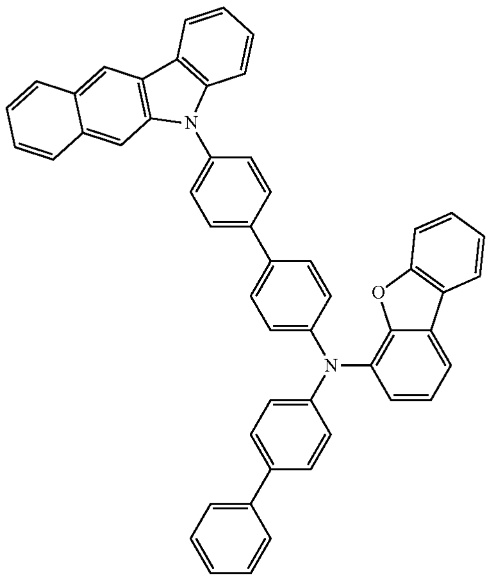
-continued
2-111
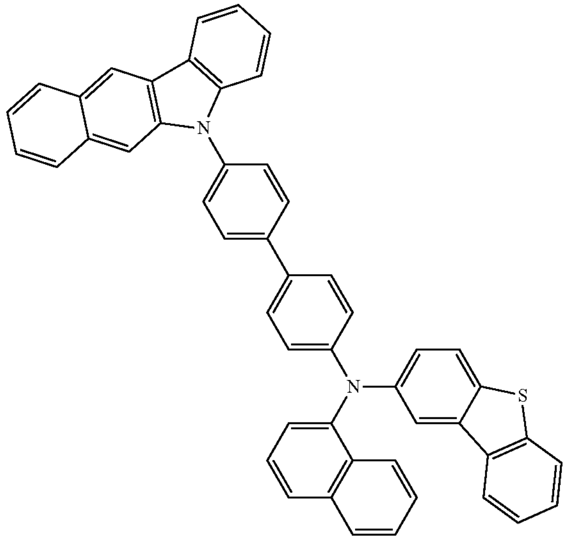
2-112
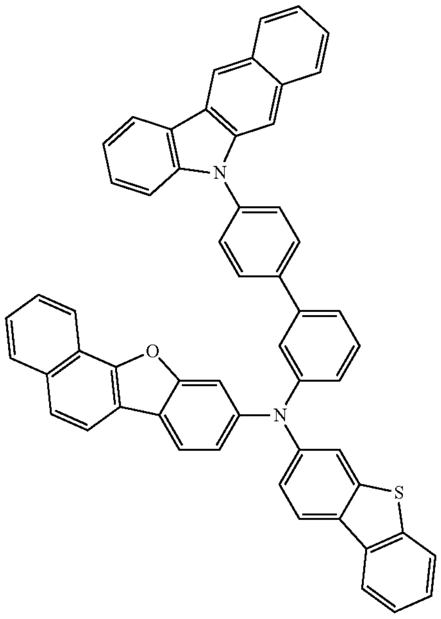

-continued
2-113
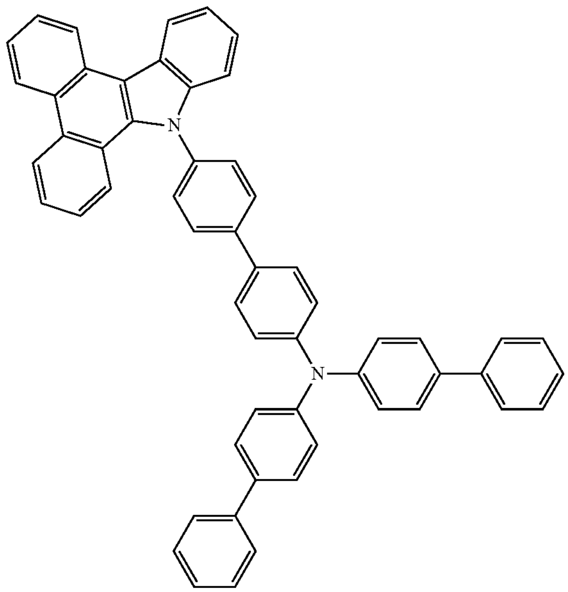
2-114
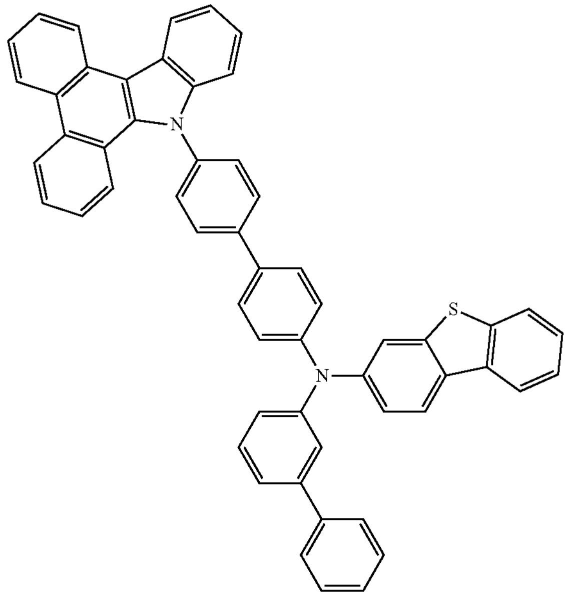
-continued
2-115
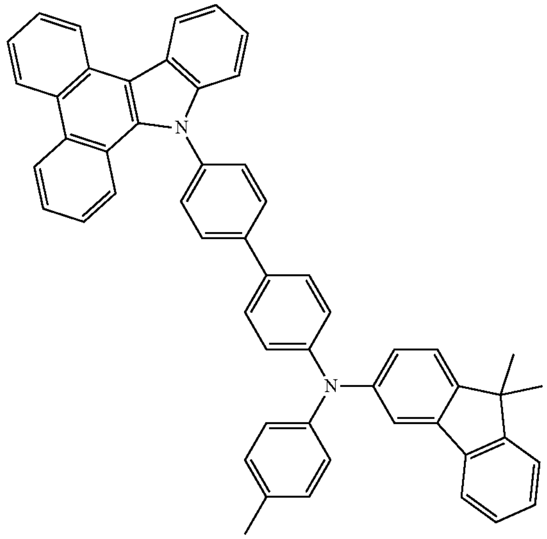
2-116
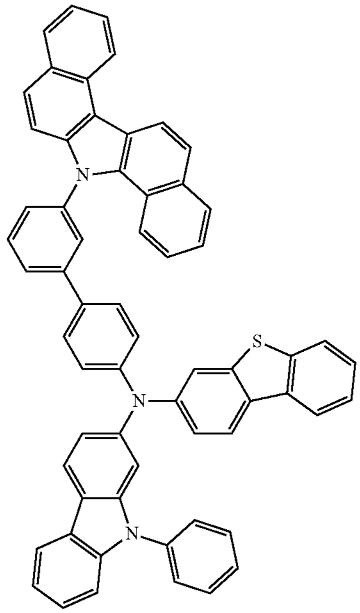

-continued
2-117
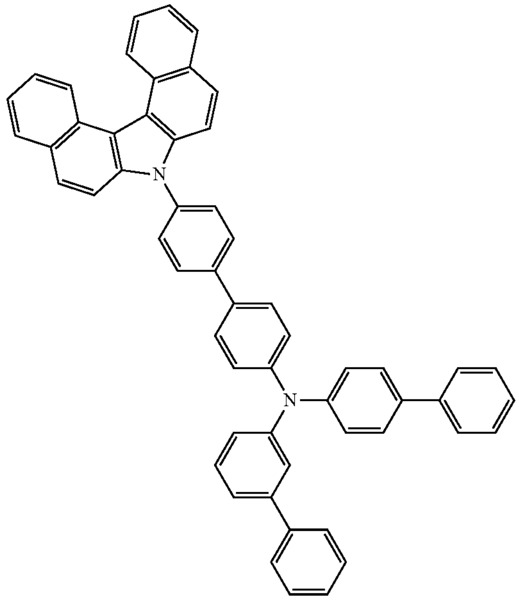
2-118
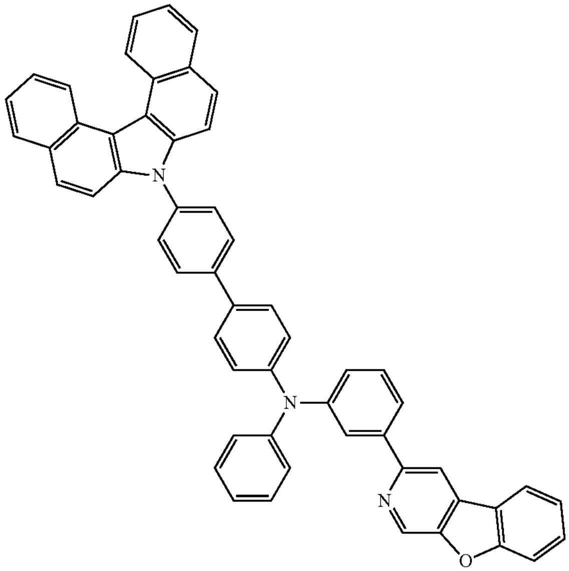
-continued
2-119
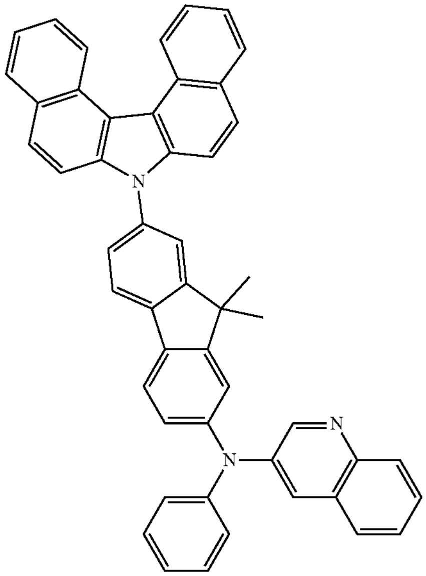
2-120
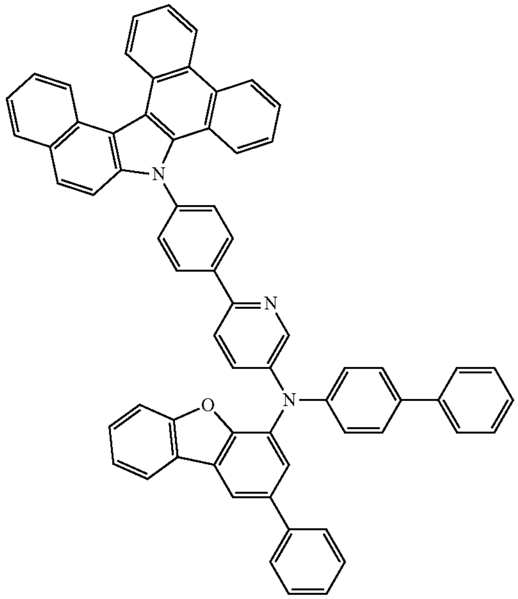

-continued
2-121
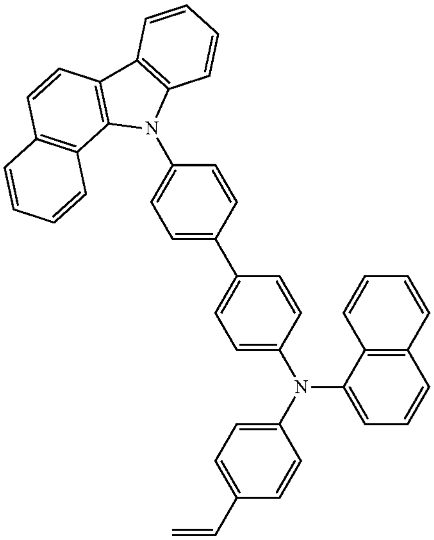
2-122
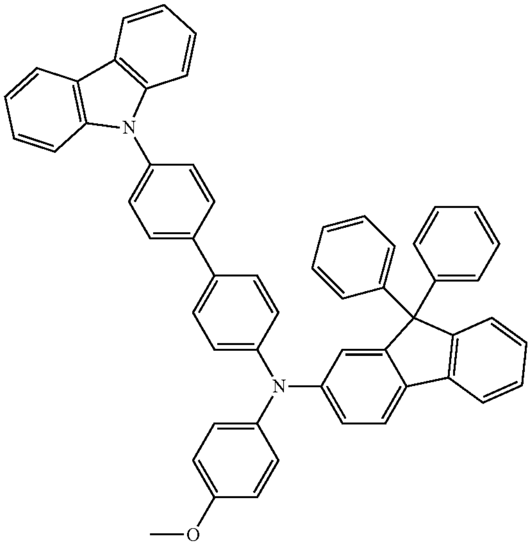
2-123
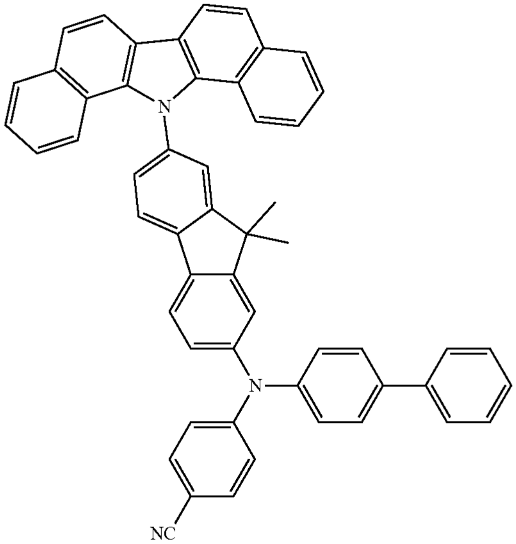
-continued
2-124
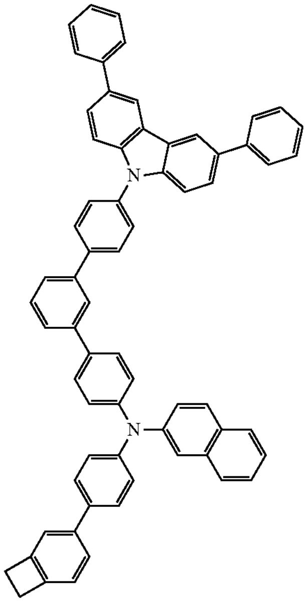
3-1
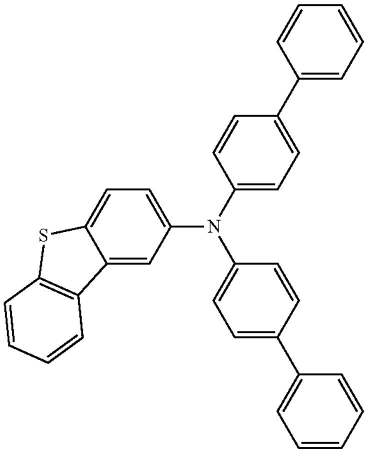
3-2
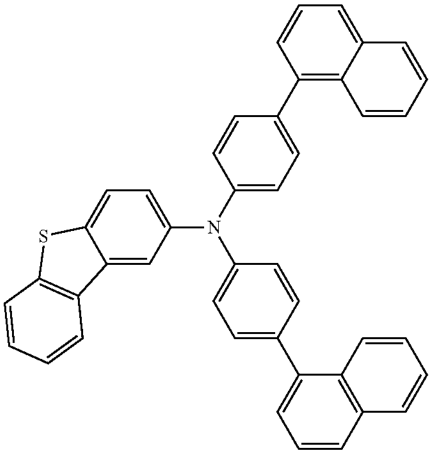

-continued
3-3
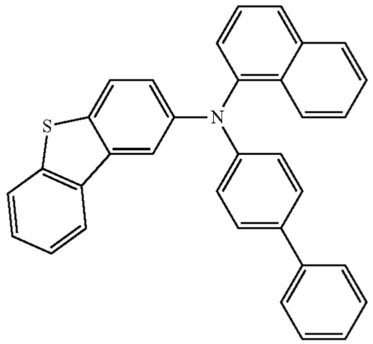
3-4
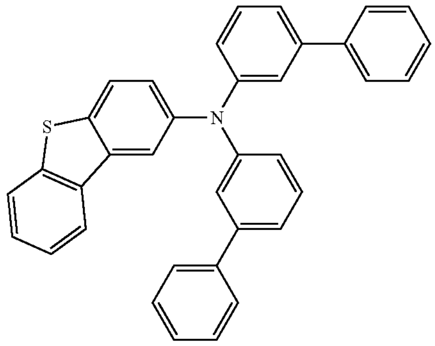
3-5
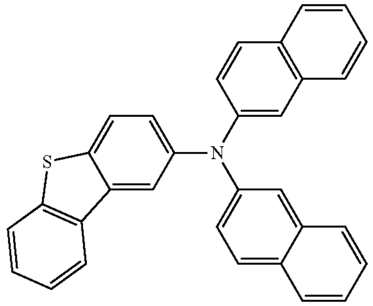
3-6
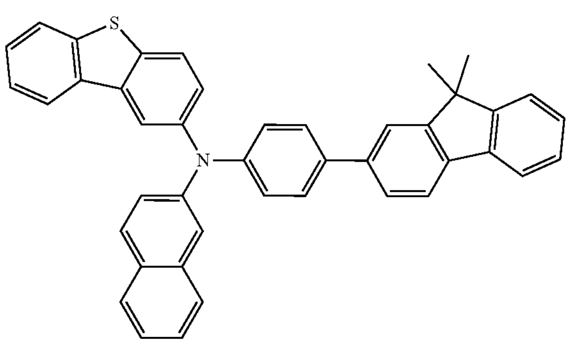
-continued
3-7
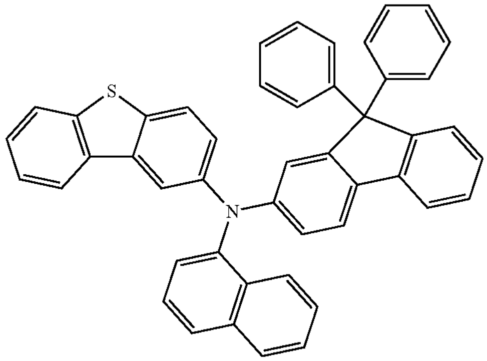
3-8
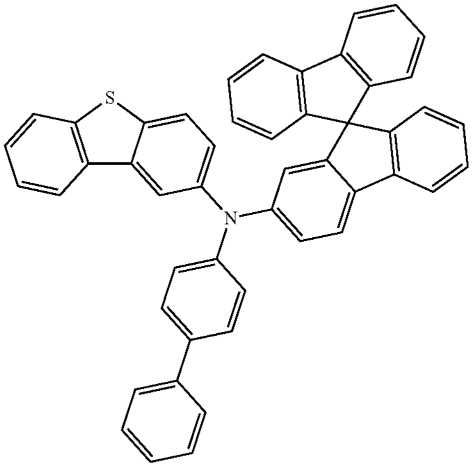
3-9
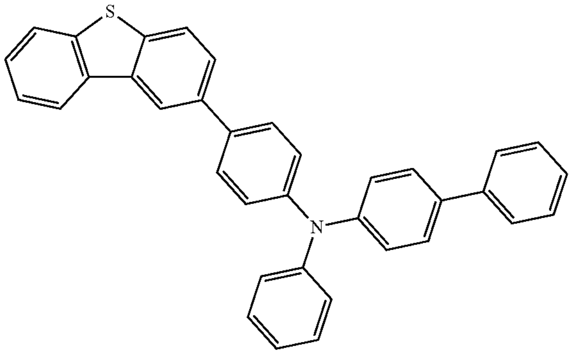

-continued
3-10
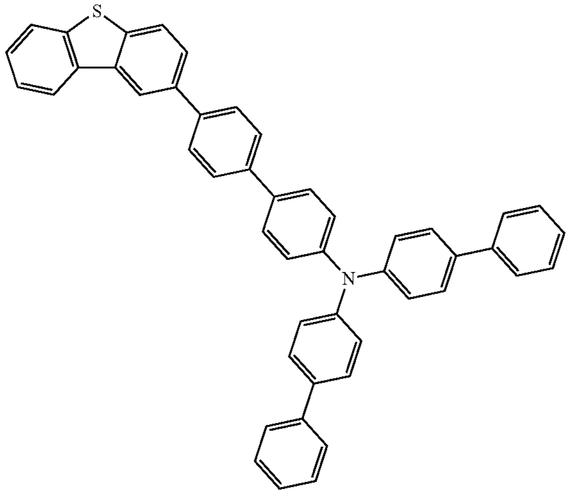
3-11
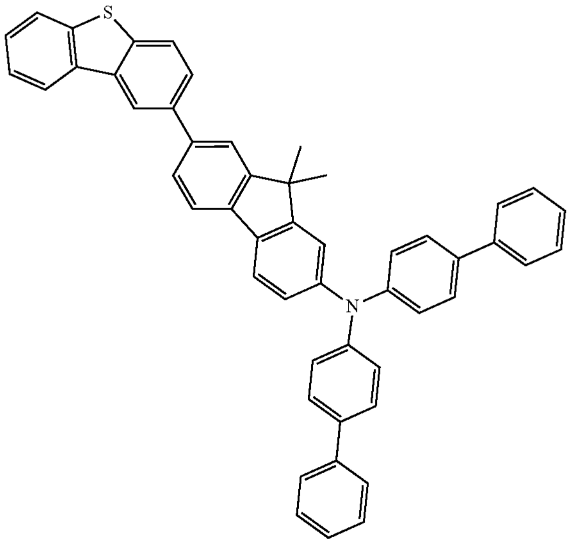
3-12
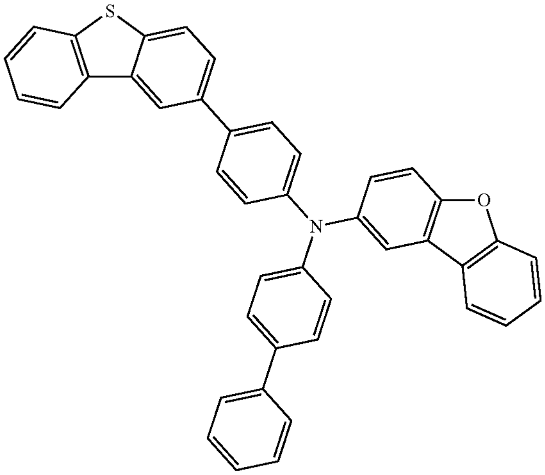
-continued
3-13
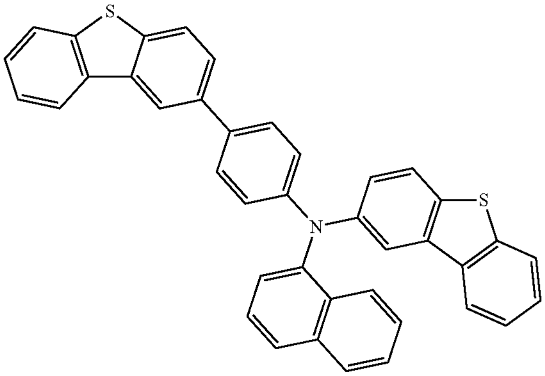
3-14
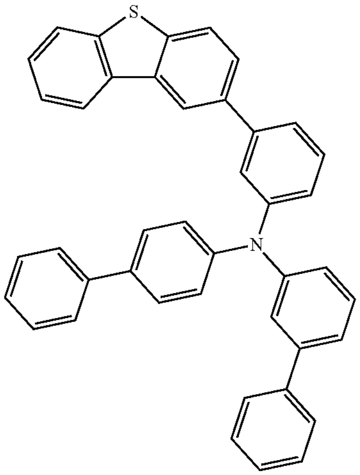
3-15
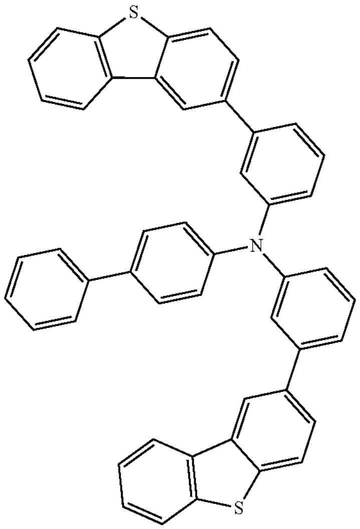

-continued
3-16
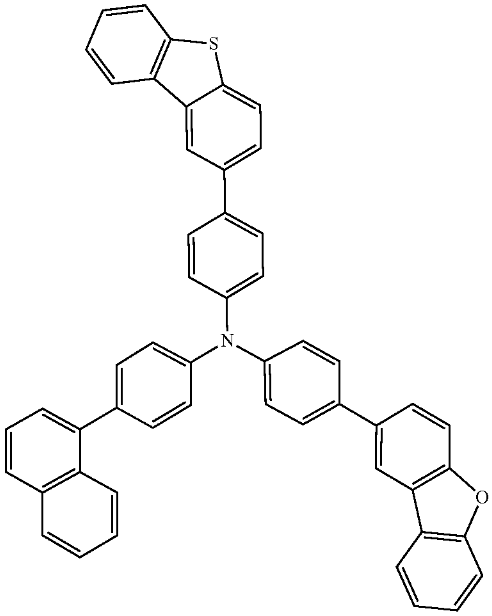
3-17
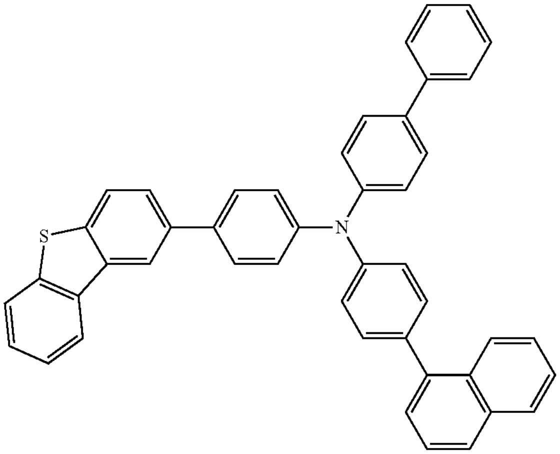
3-18
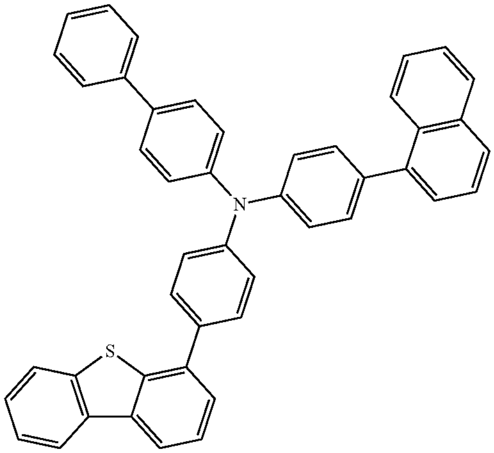
-continued
3-19
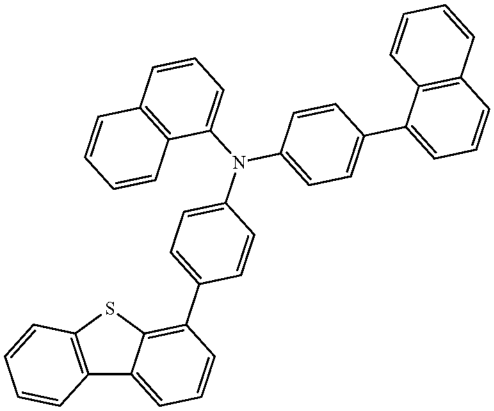
3-20
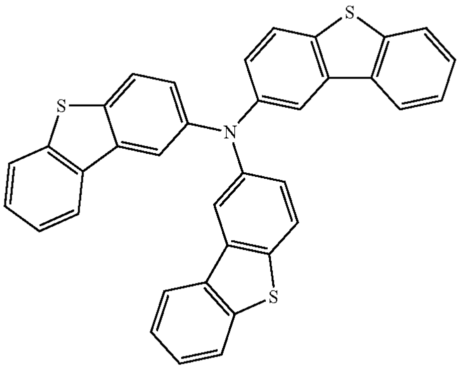
3-21
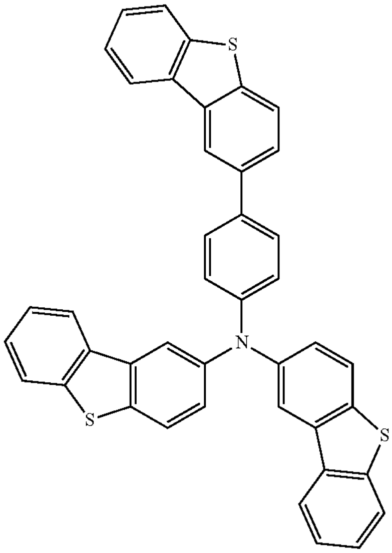

-continued
3-22
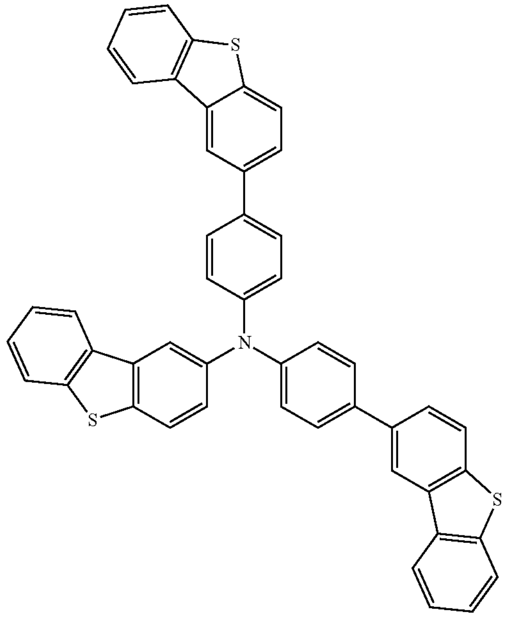
3-23
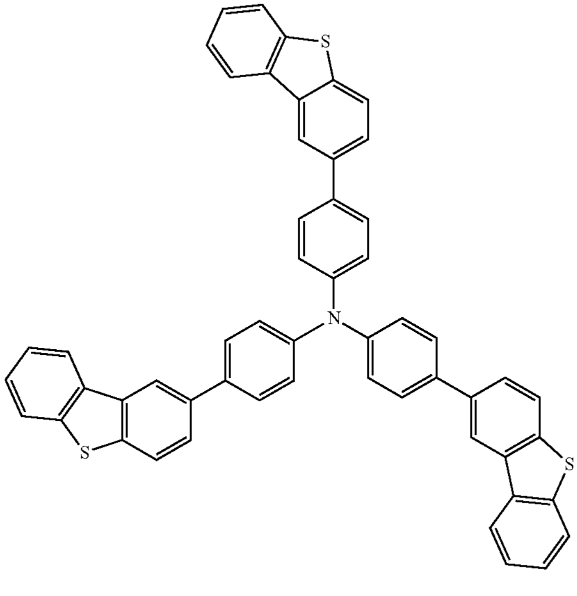
-continued
3-24
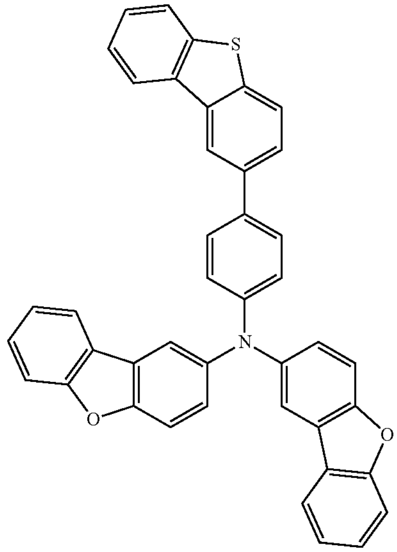
3-25
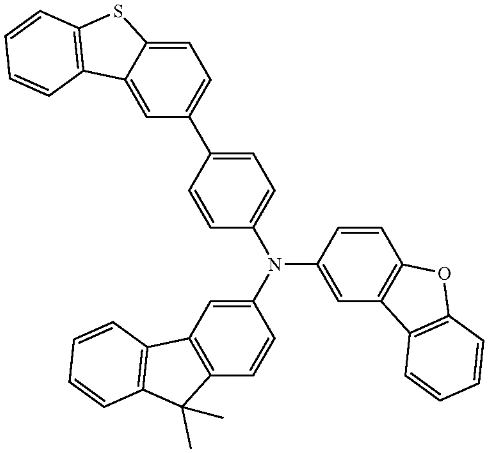
3-26
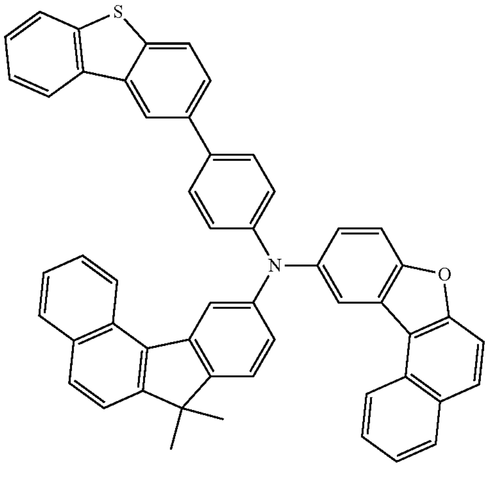

-continued
3-27
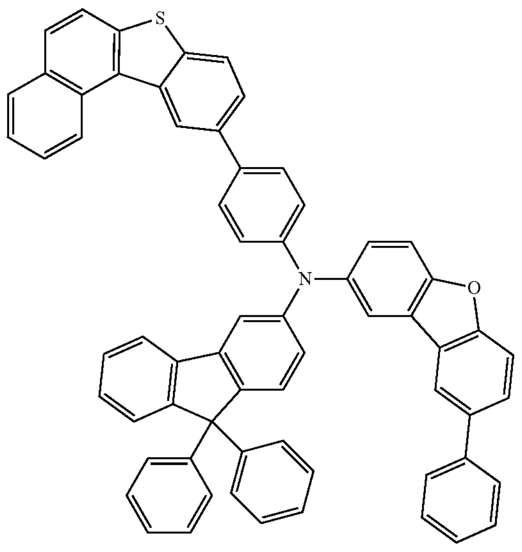
3-28
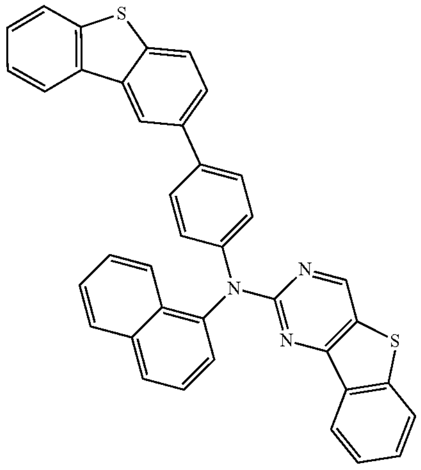
3-29
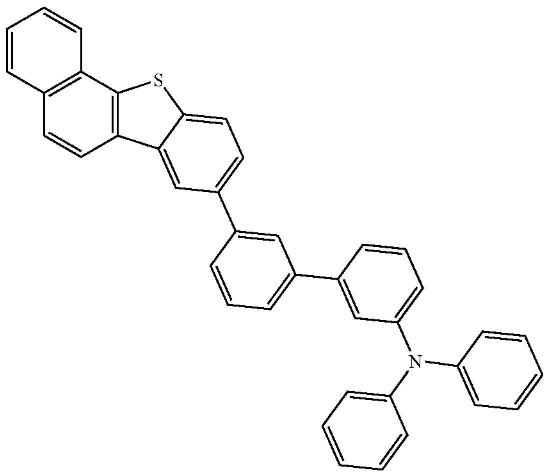
-continued
3-30
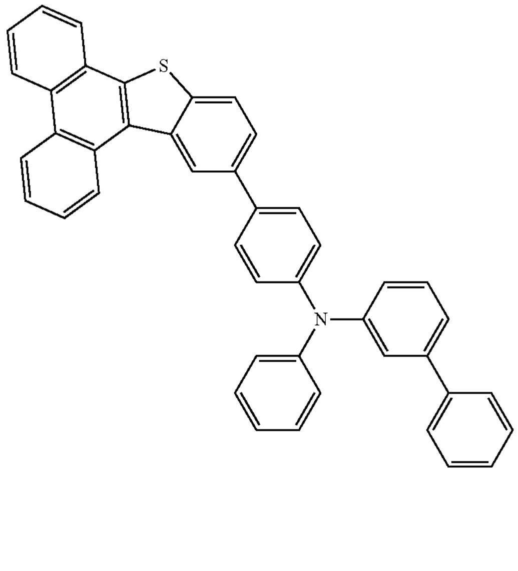
3-31
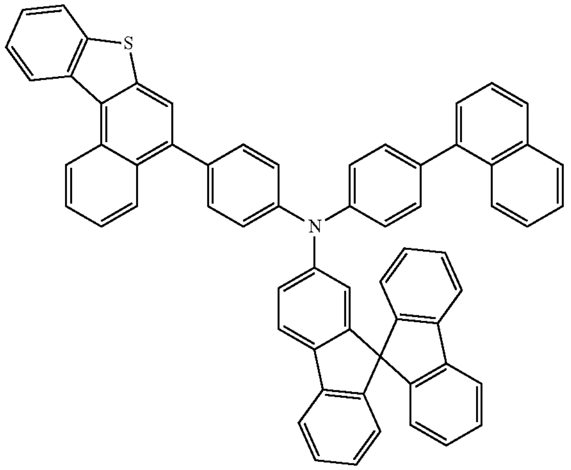
3-32
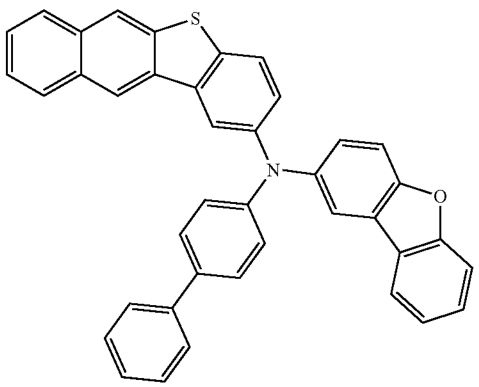

-continued
3-33
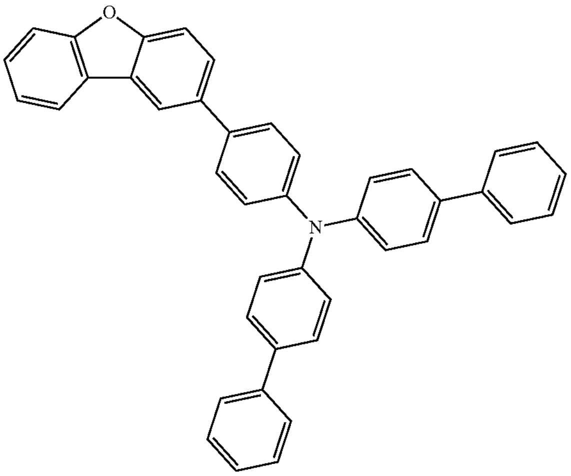
3-34
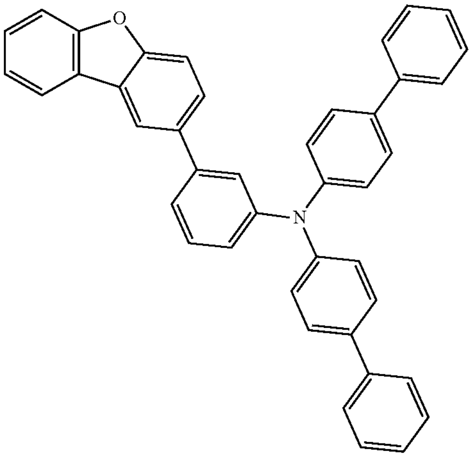
3-35
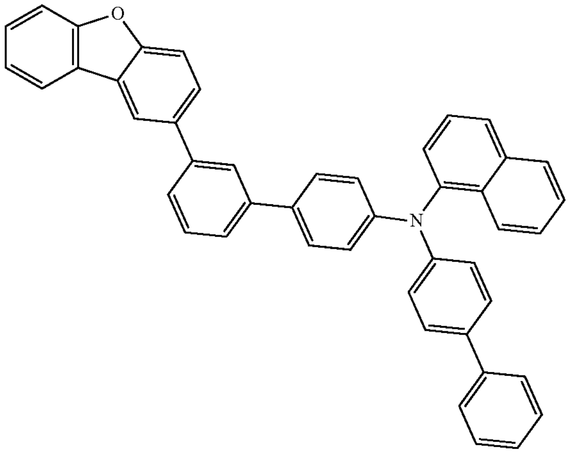
-continued
3-36
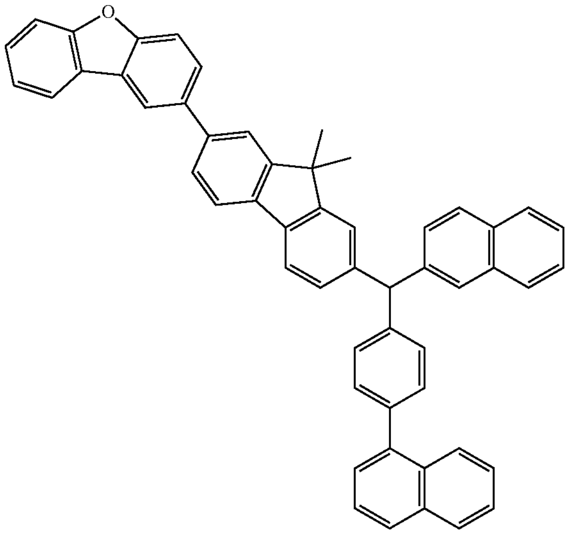
3-37
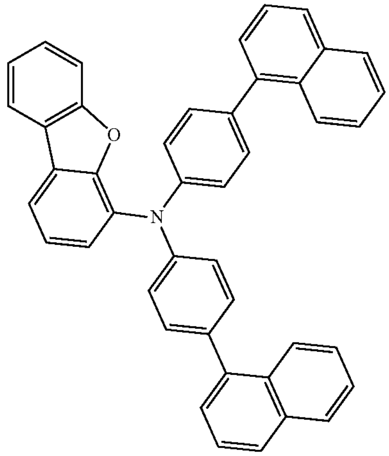
3-38
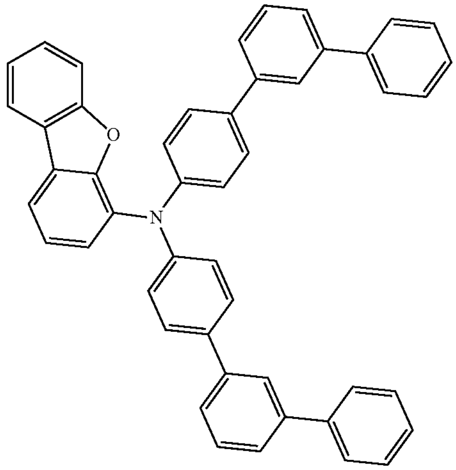

-continued
3-39
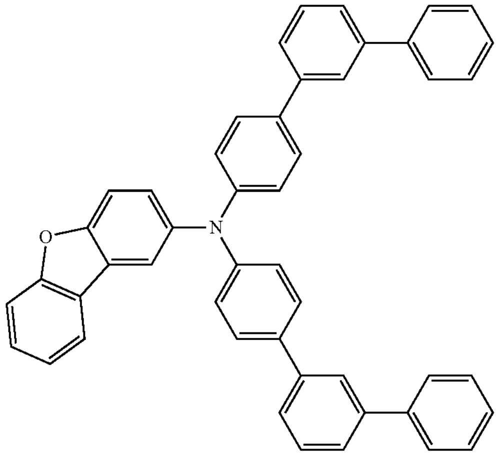
3-40
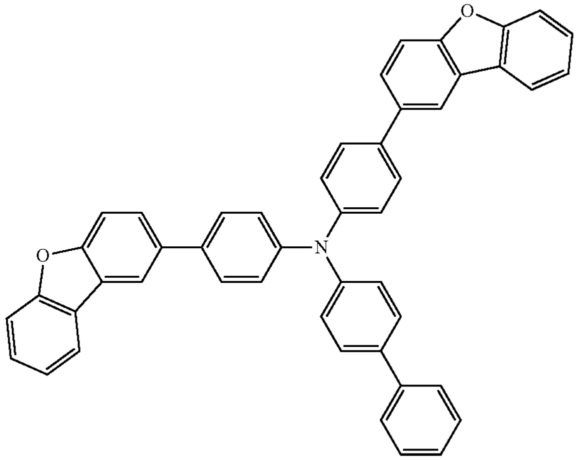
3-41
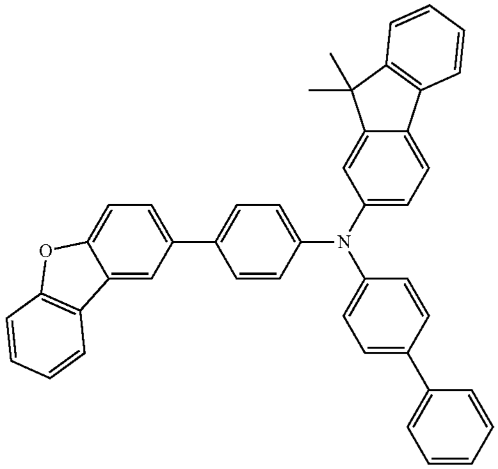
-continued
3-42
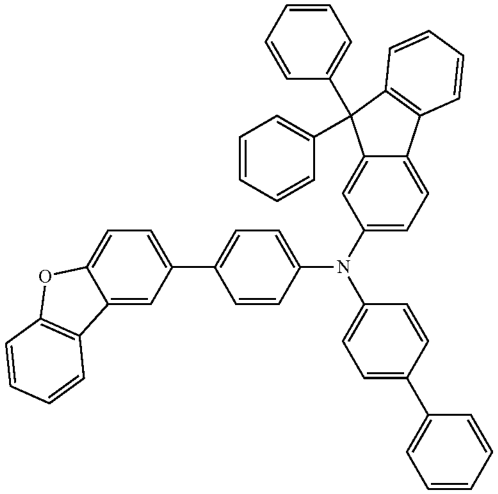
3-43
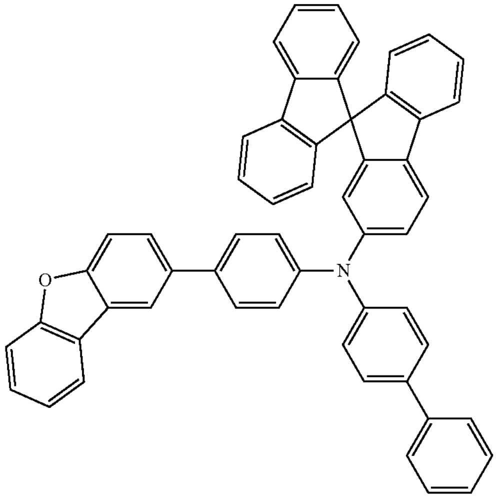
3-44
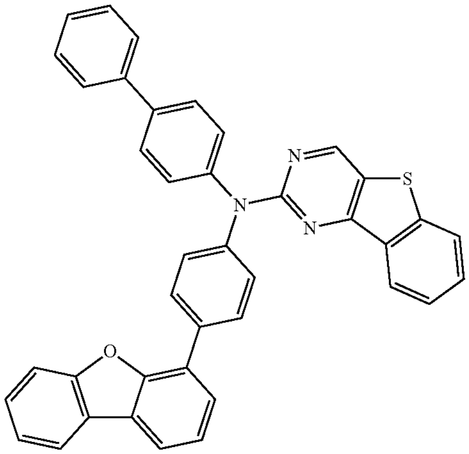

-continued
3-45
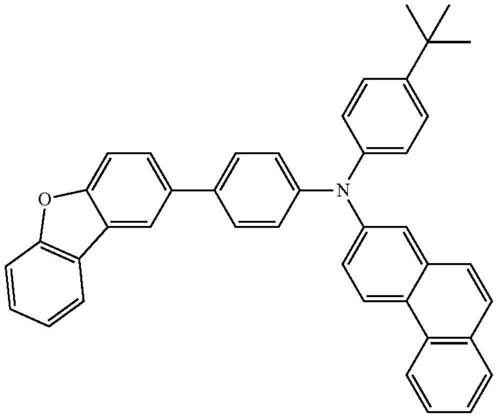
3-46
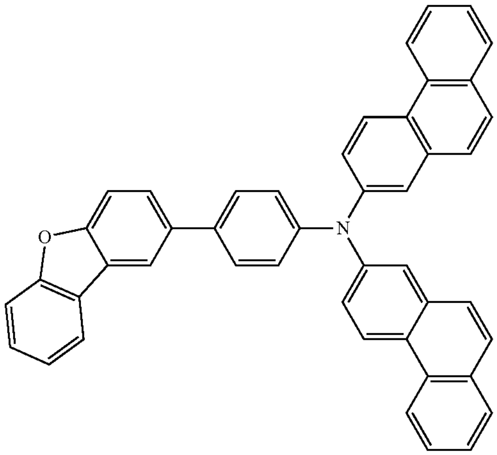
3-47
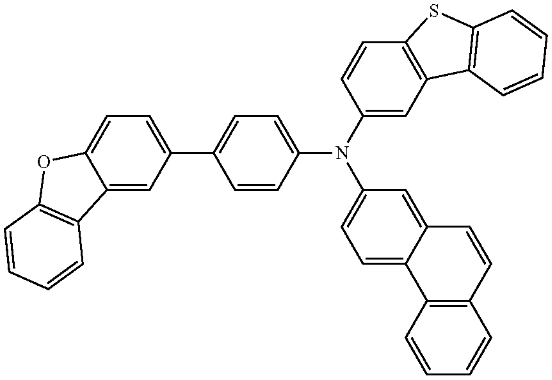
-continued
3-48
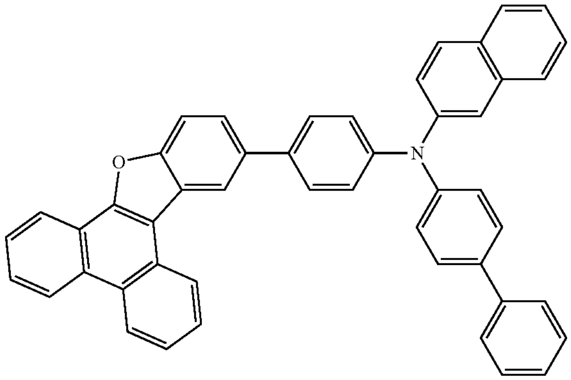
3-49
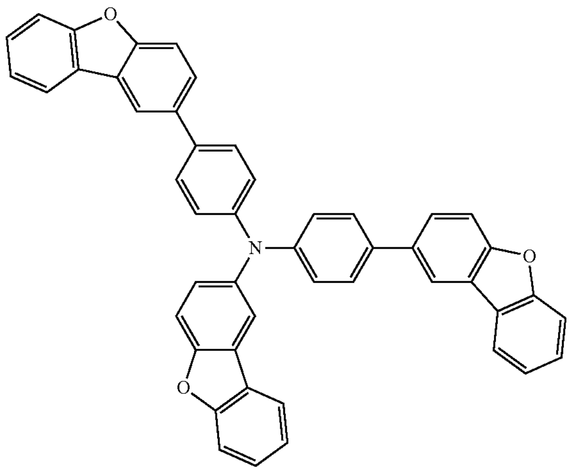
3-50
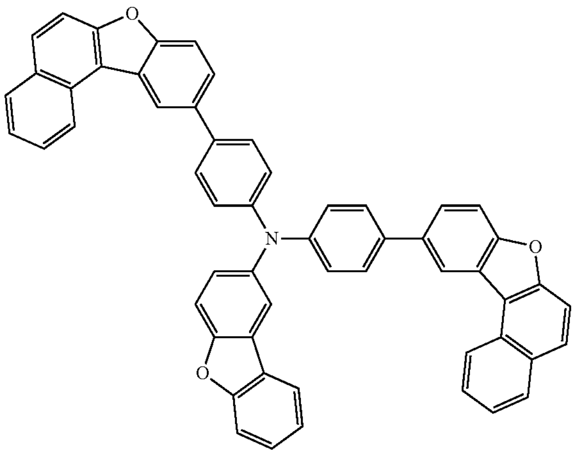

3-51
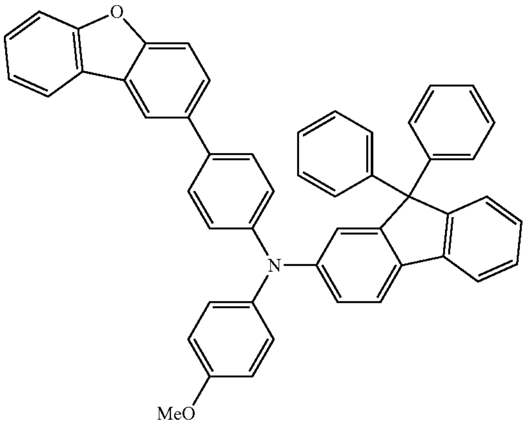
3-52
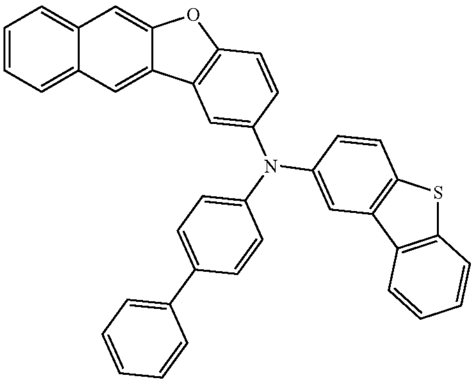
3-53
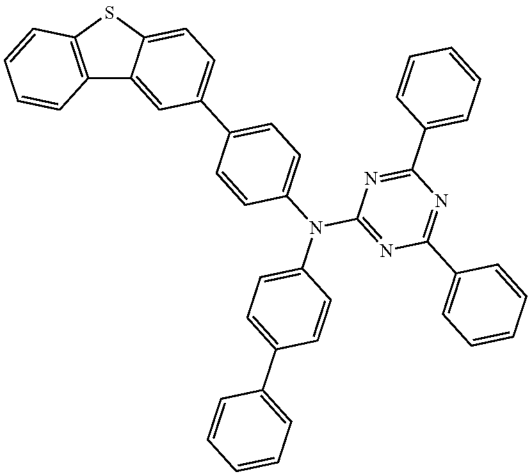
3-54
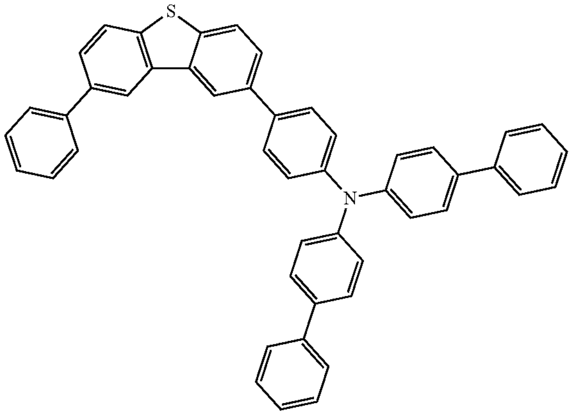
3-55
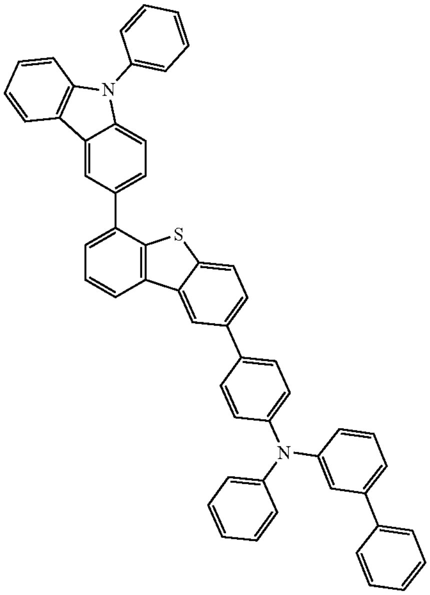
3-56
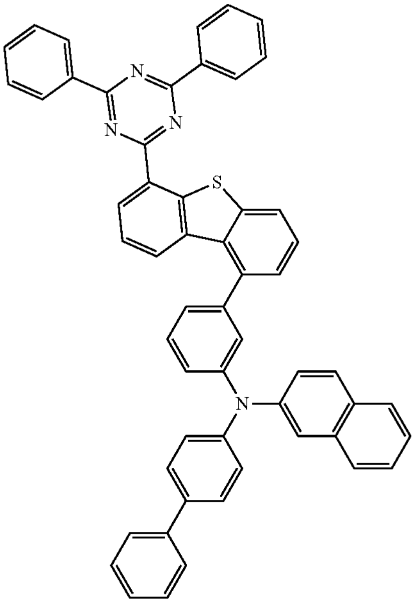

-continued
3-57
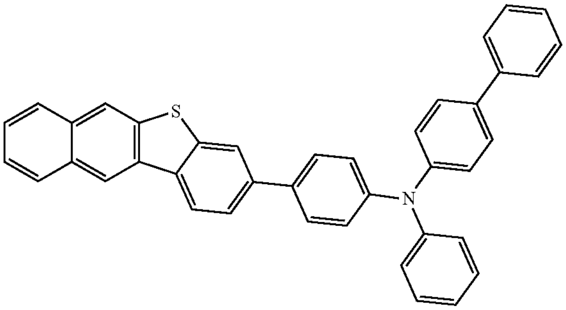
3-58
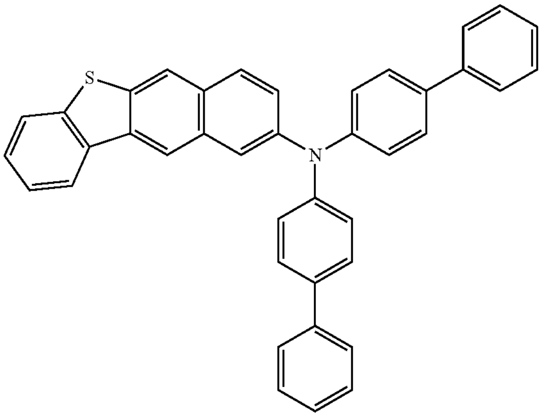
3-59
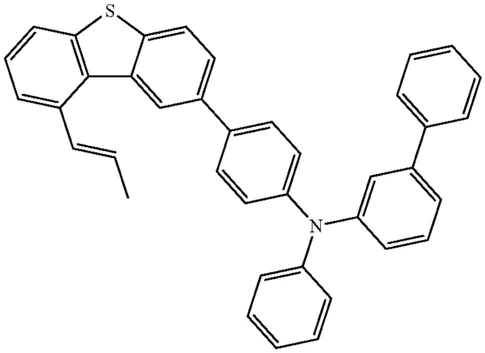
3-60
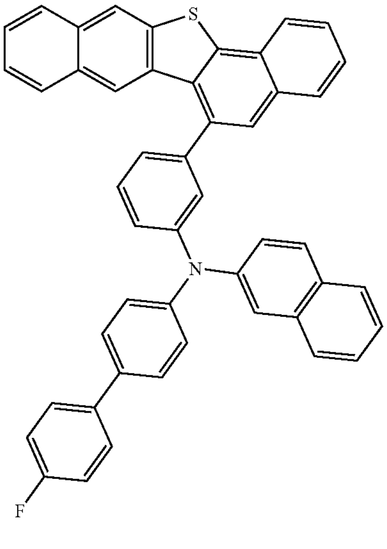
-continued
3-61
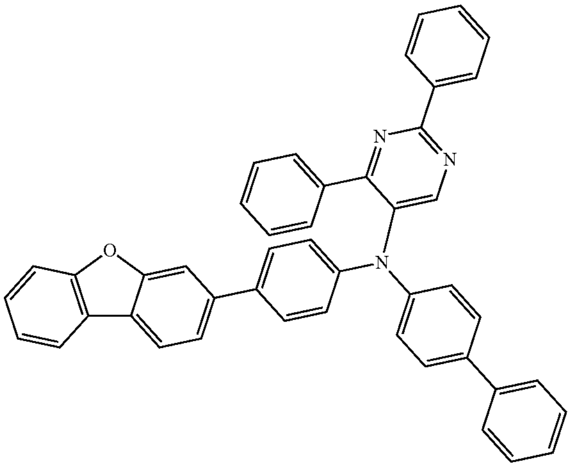
3-62
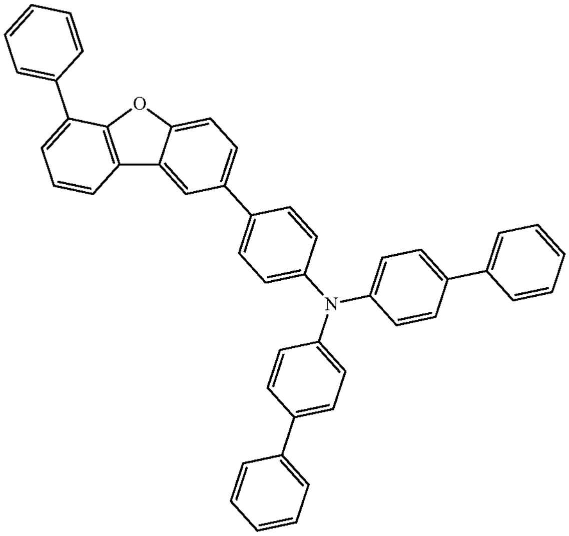
3-63
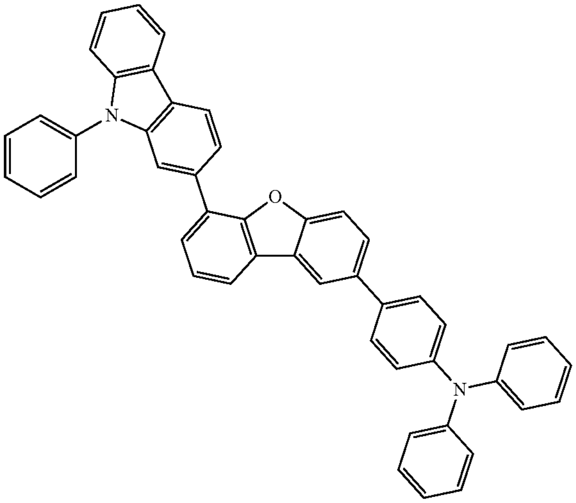

-continued
6-34
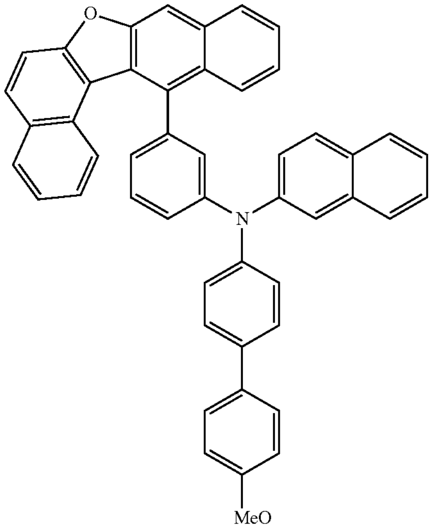
3-65
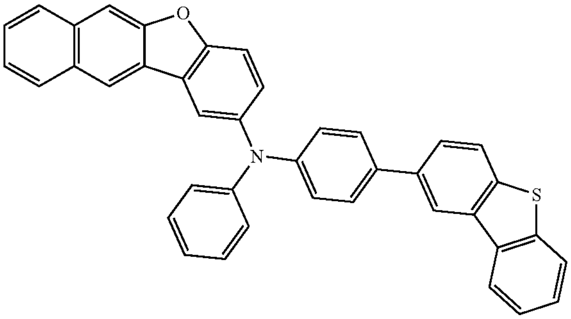
3-66
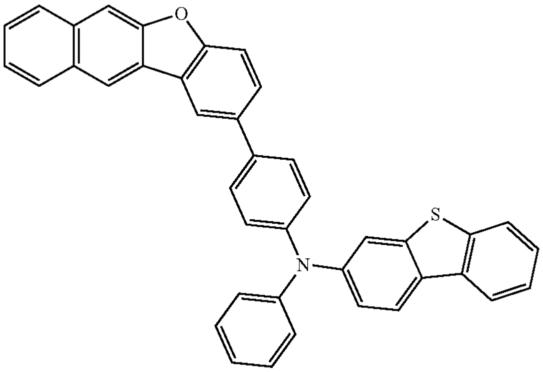
-continued
3-67
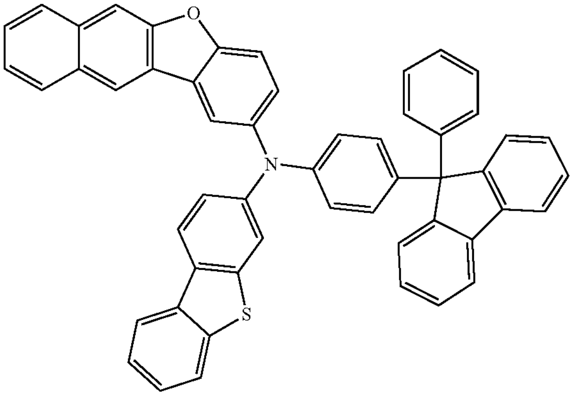
3-68
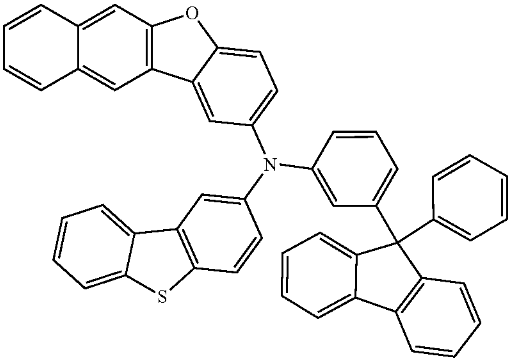
3-69
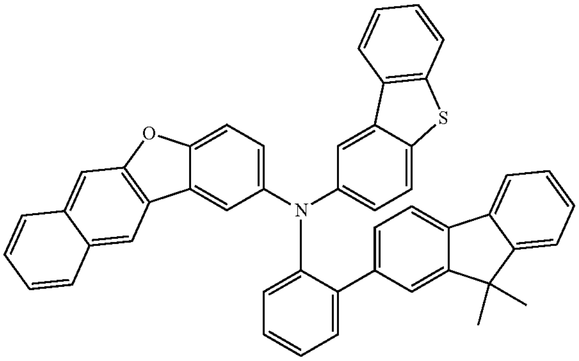
3-70
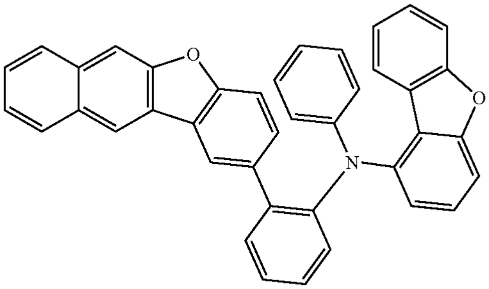

-continued
3-71
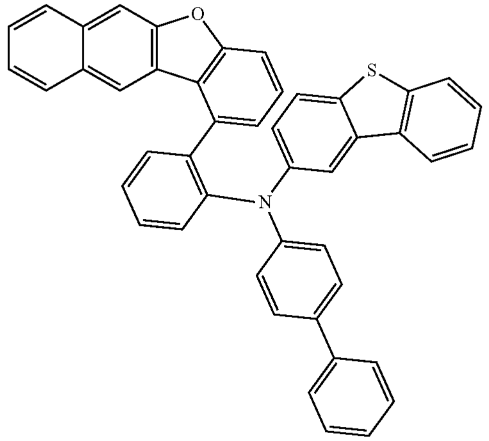
3-72
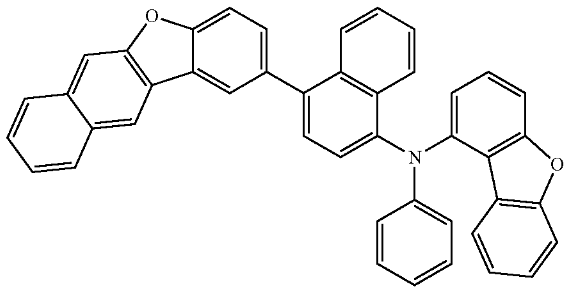
3-73
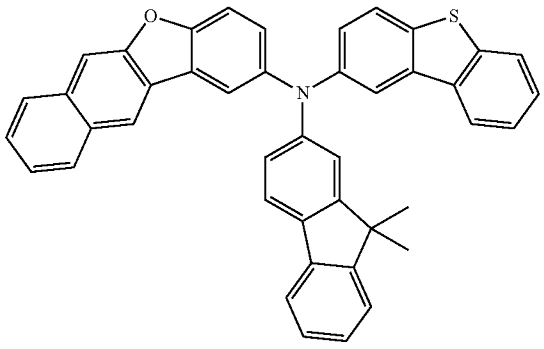
3-74
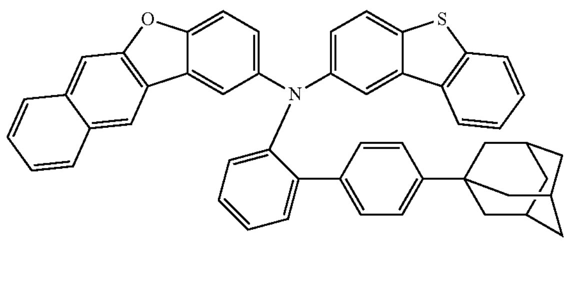
-continued
3-75
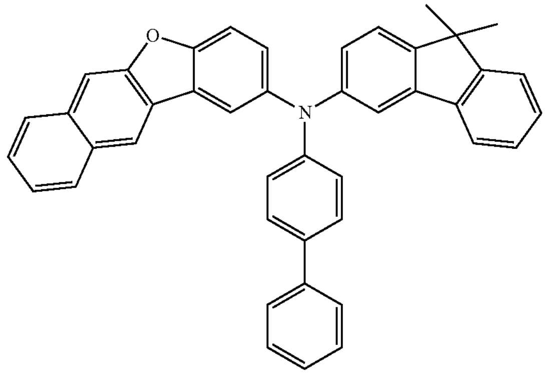
3-76
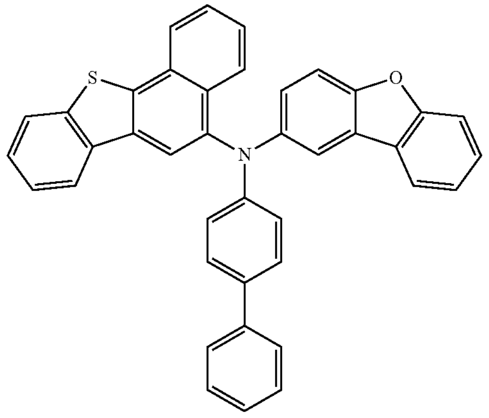
4-1
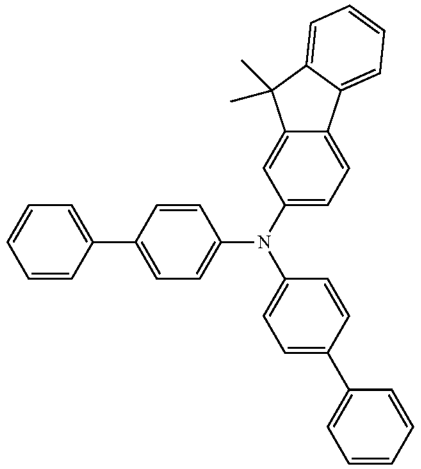

-continued
4-2
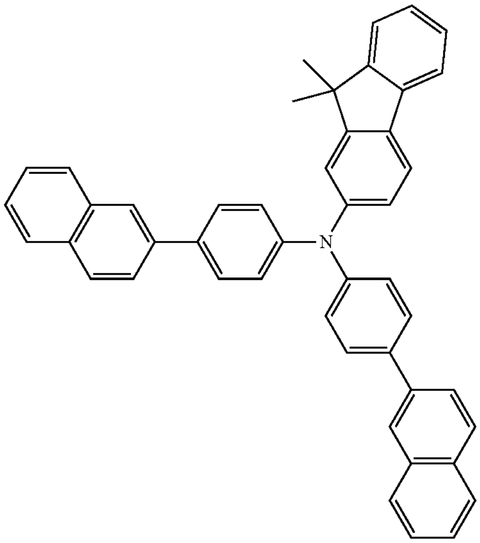
4-3
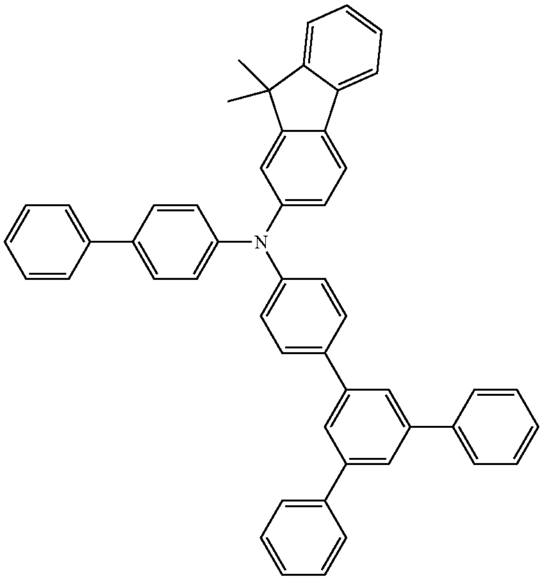
-continued
4-4
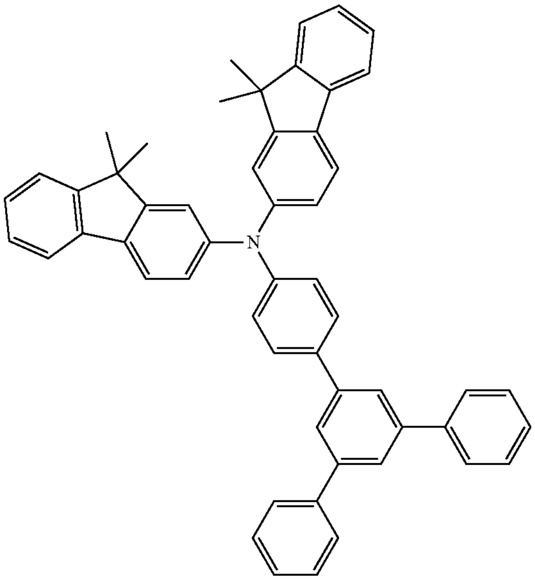
4-5
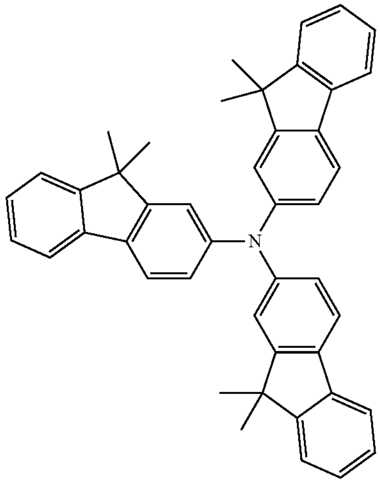
4-6
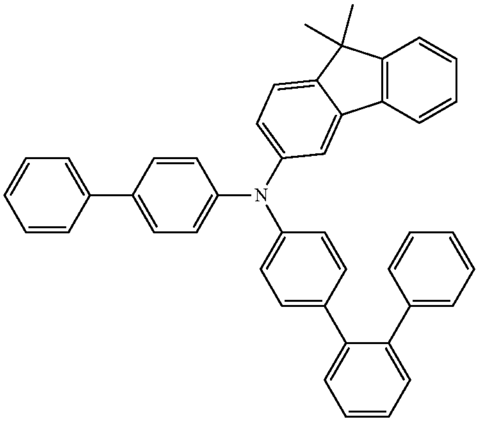

-continued
4-7
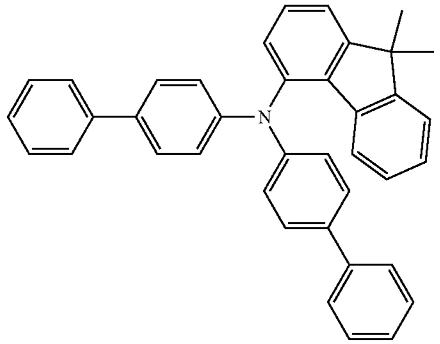
4-8
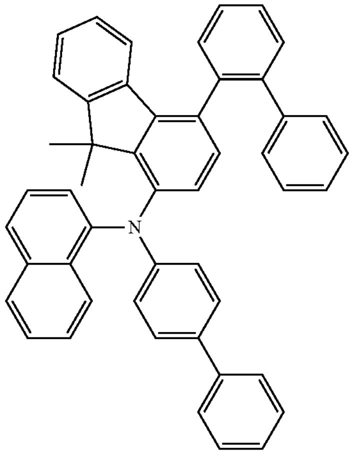
4-9
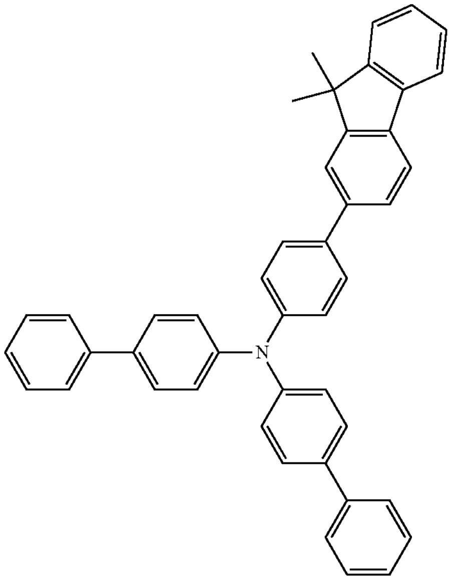
-continued
4-10
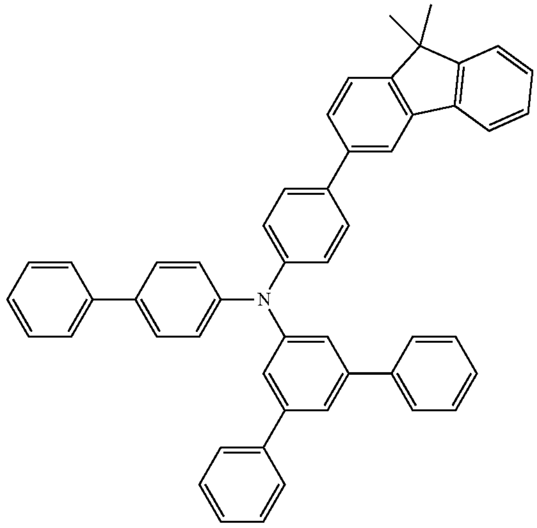
4-11
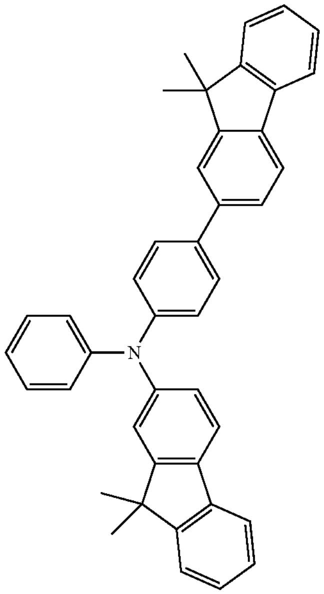

-continued
4-12
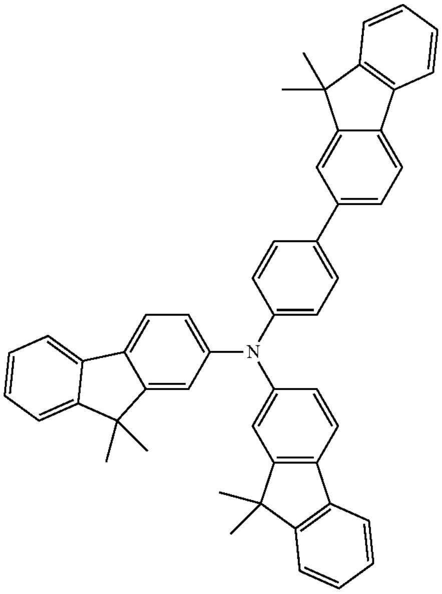
4-13
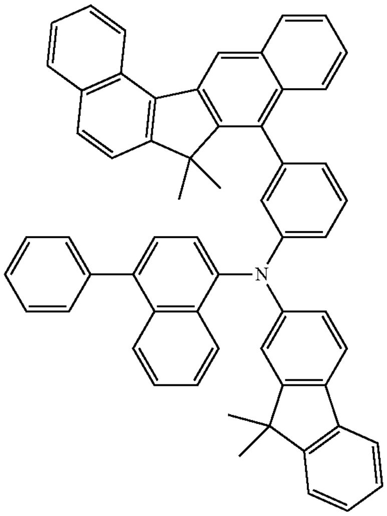
4-14
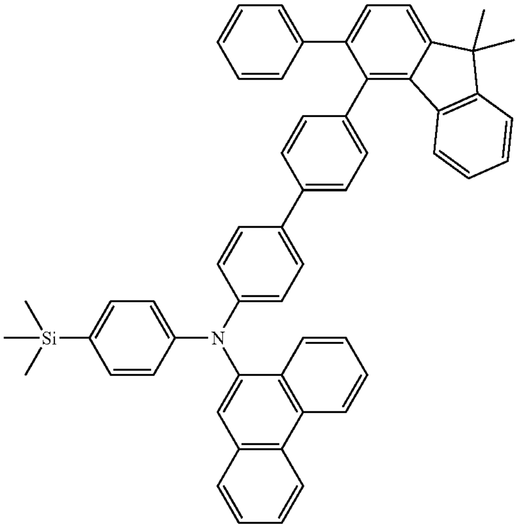
-continued
4-15
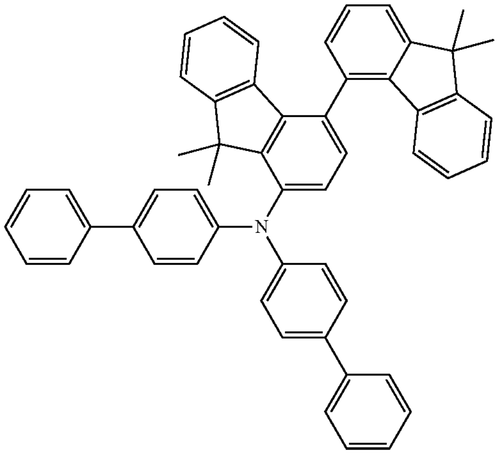
4-16
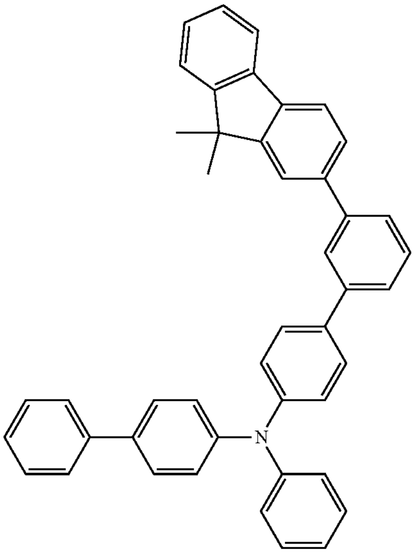
4-17
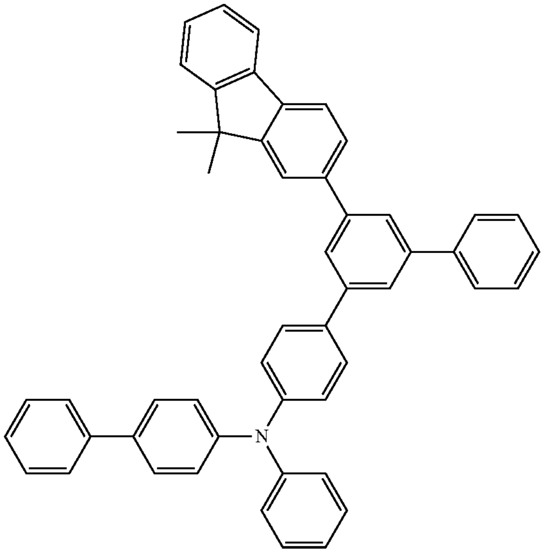

-continued
4-18
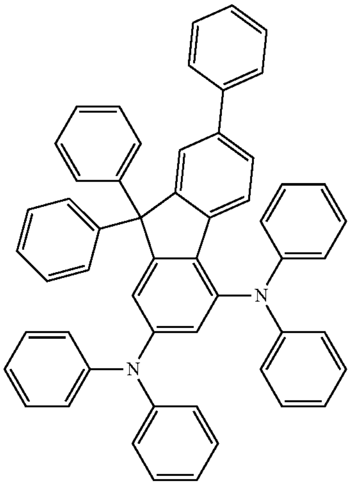
4-19
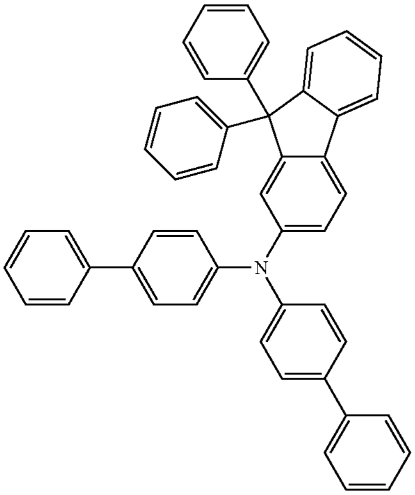
4-20
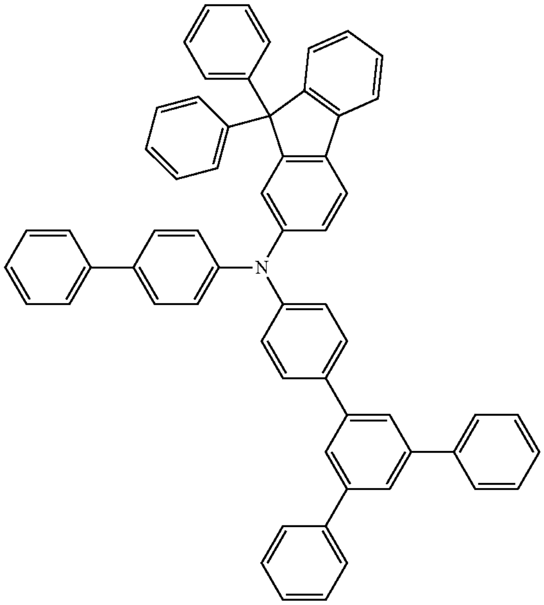
-continued
4-21
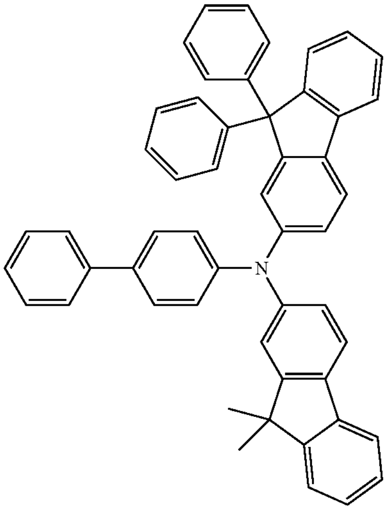
4-22
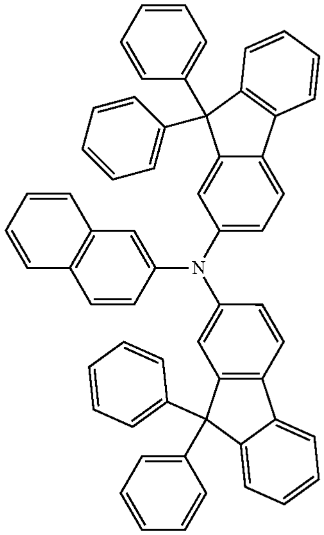
4-23
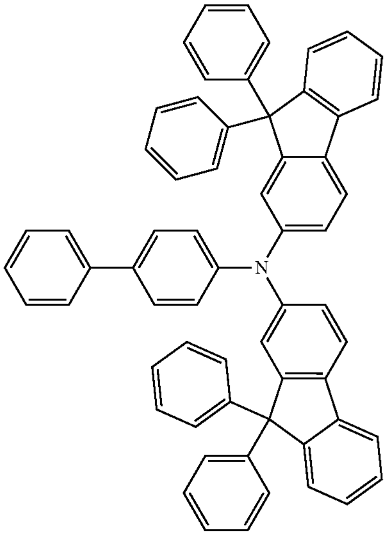

-continued
4-24
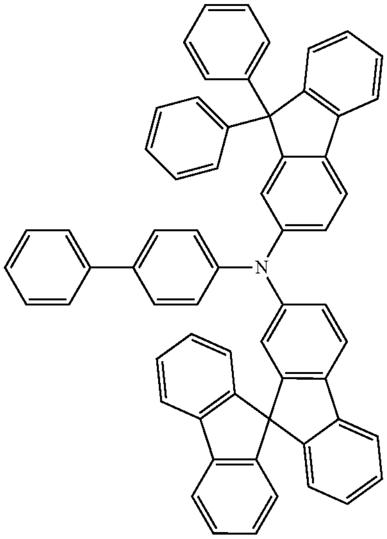
4-25
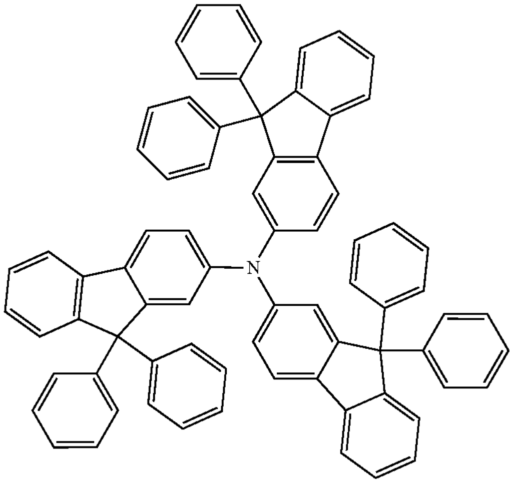
4-26
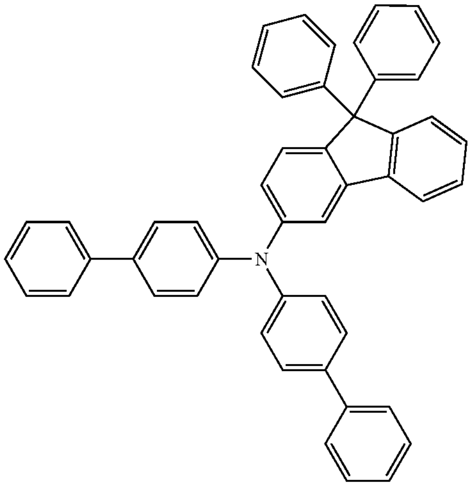
-continued
4-27
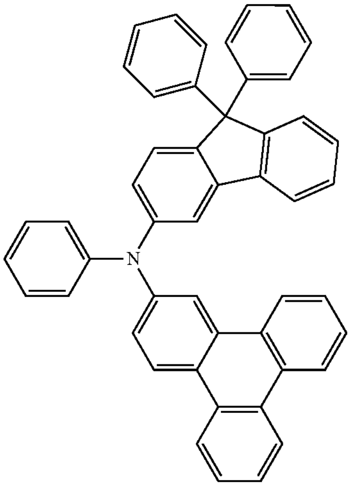
4-28
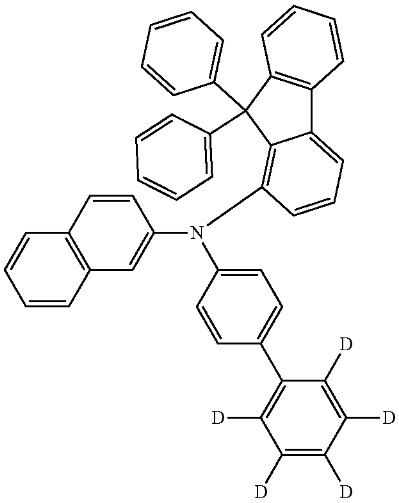
4-29
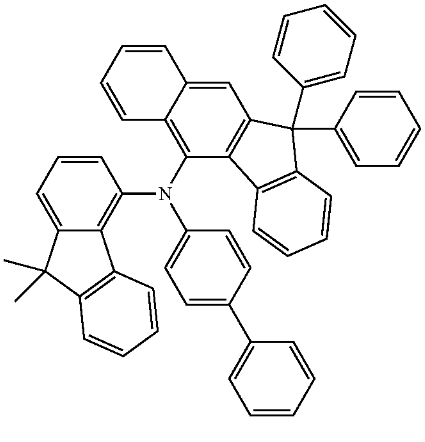

-continued
4-30
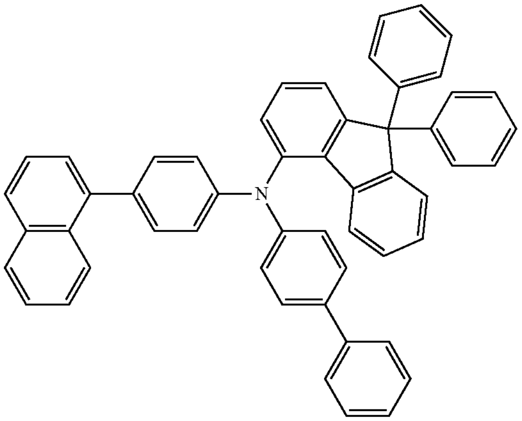
4-31
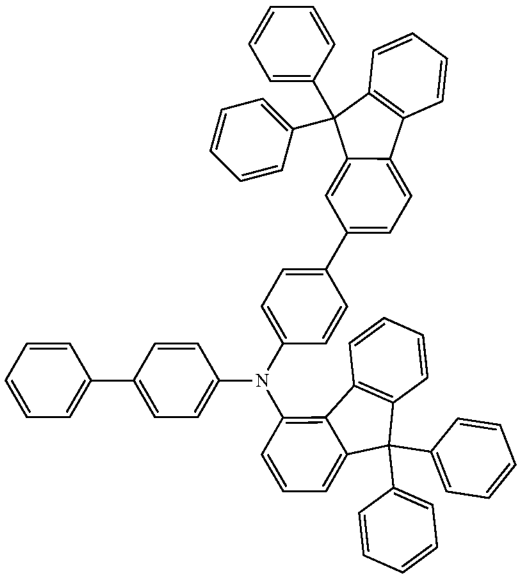
4-32
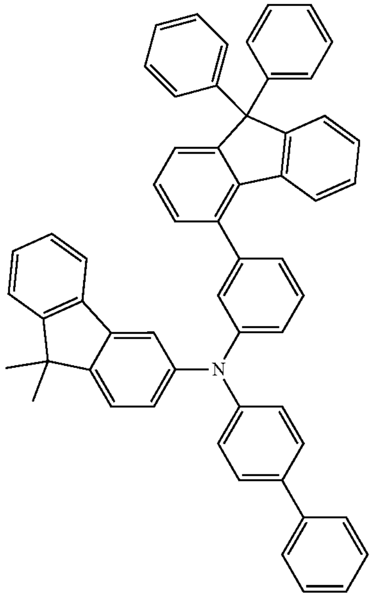
-continued
4-33
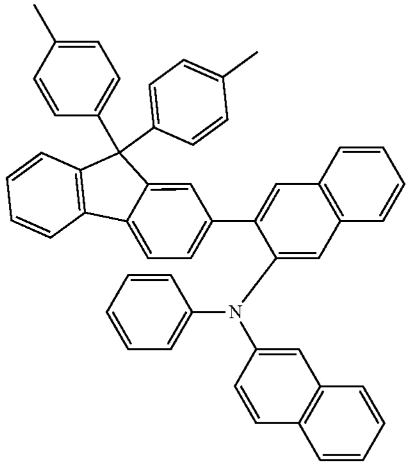
4-34
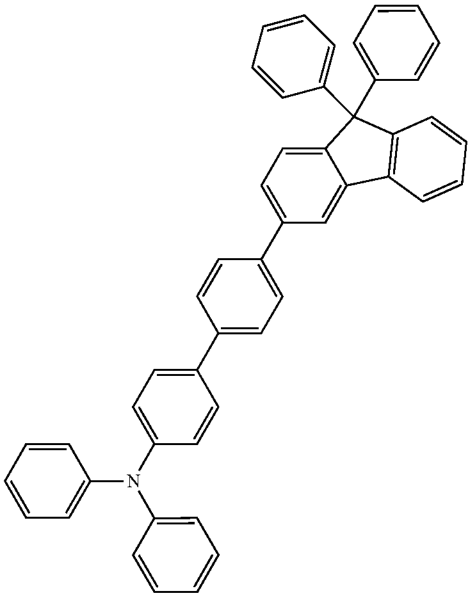
4-35
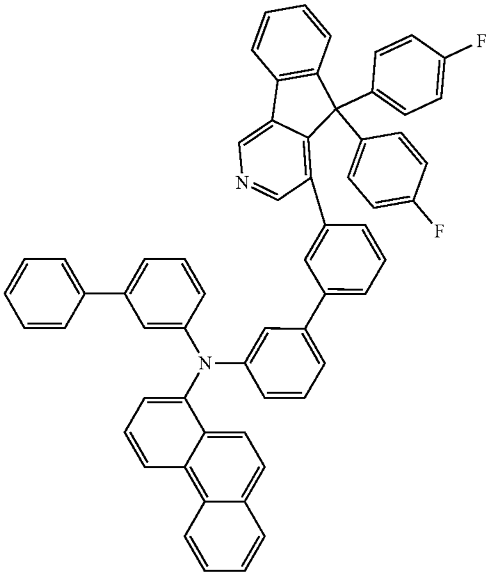

-continued
4-36
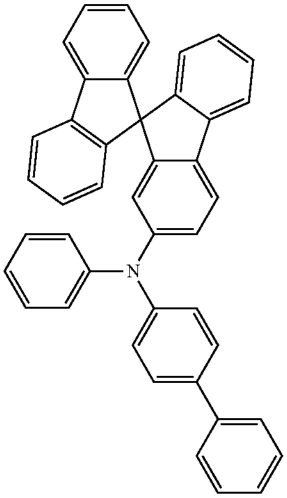
4-37
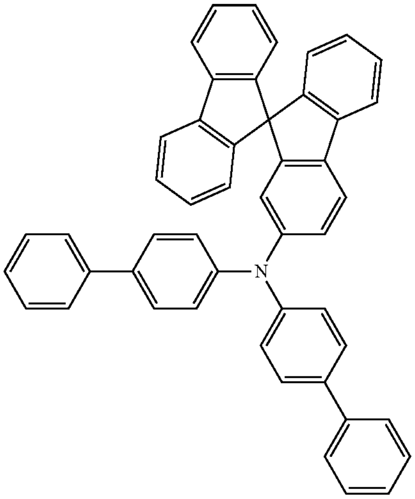
4-38
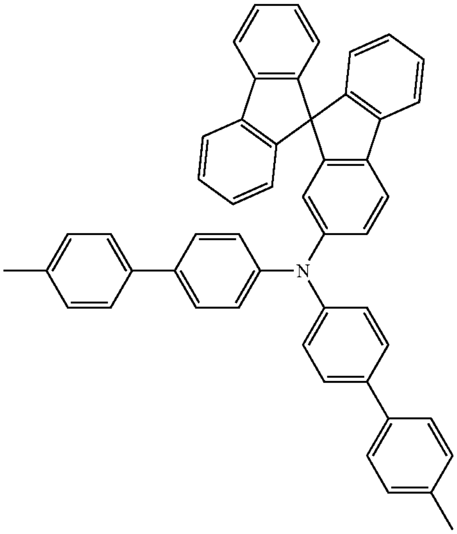
-continued
4-39
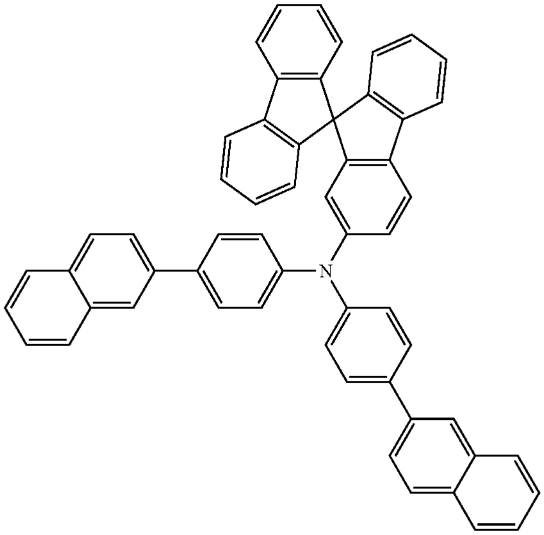
4-40
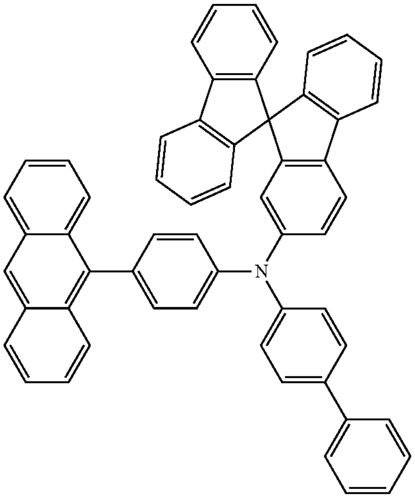
4-41
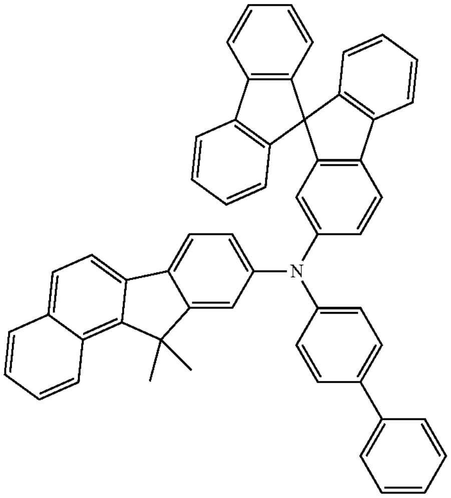

-continued
4-42
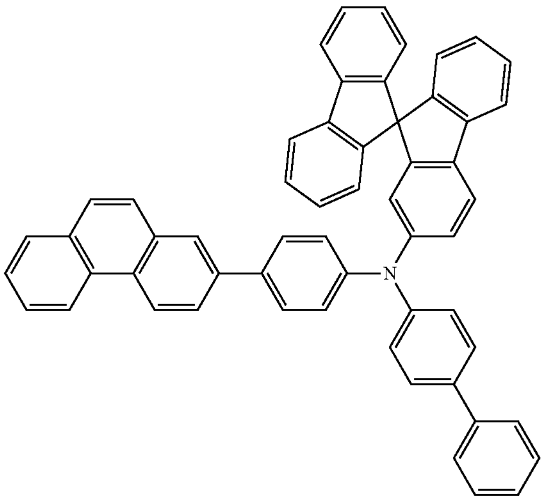
4-43
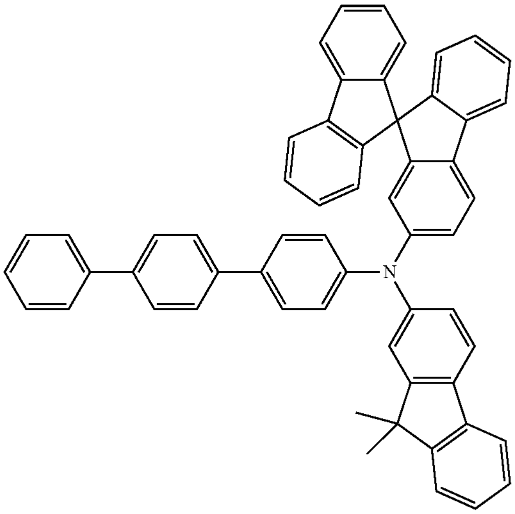
4-44
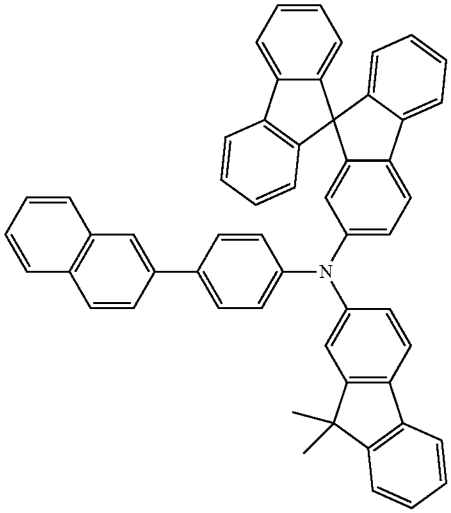
-continued
4-45
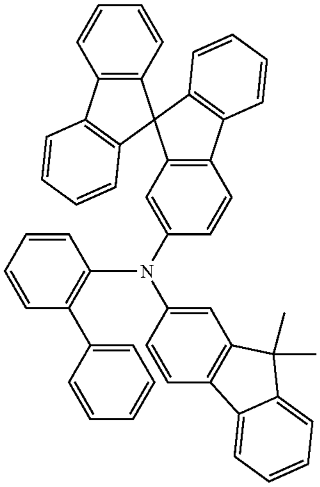
4-46
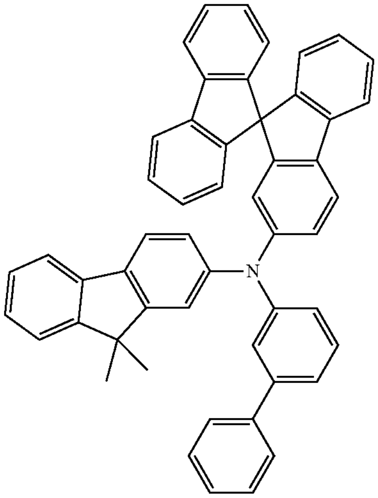
4-47
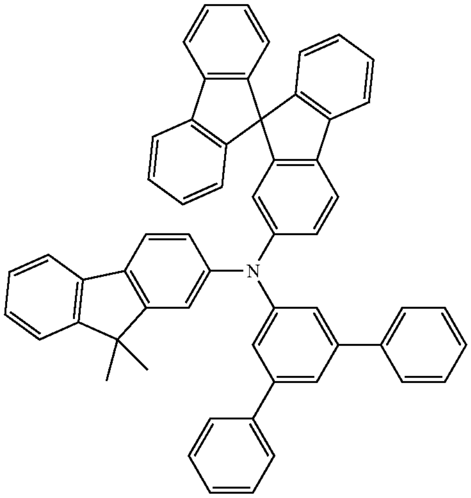

-continued
4-48
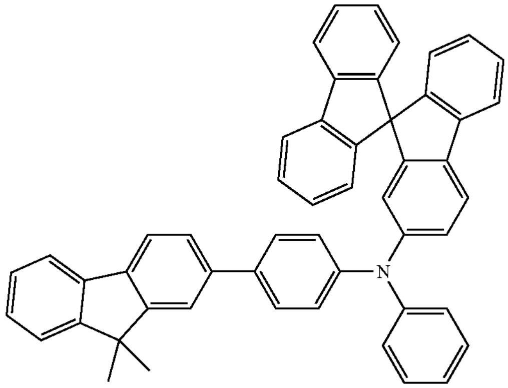
4-49
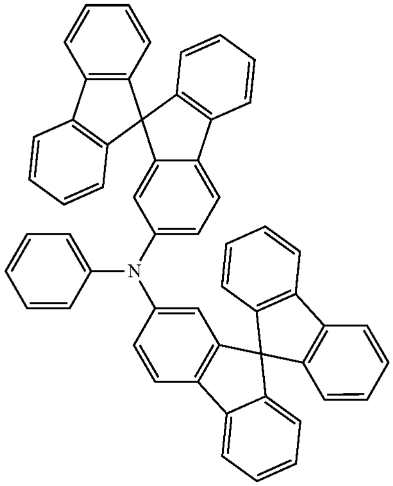
4-50
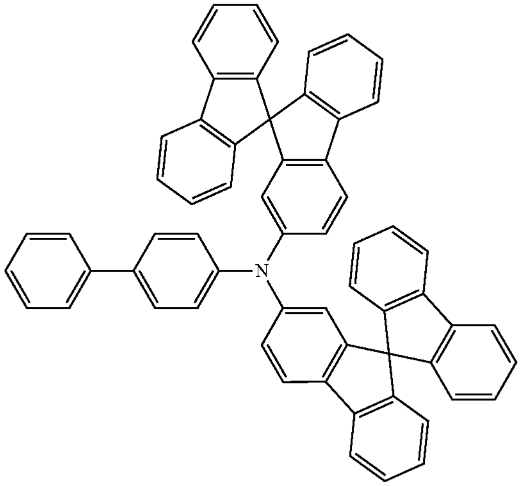
-continued
4-51
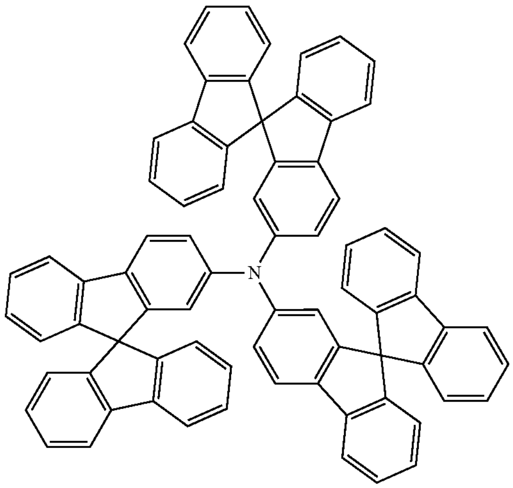
4-52
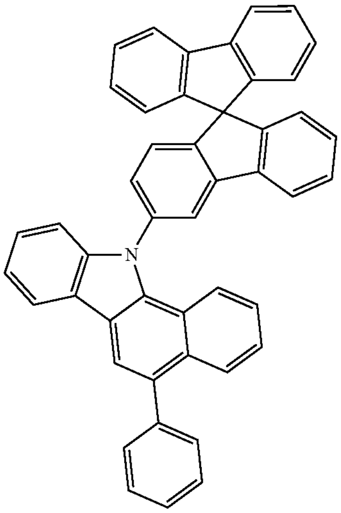
4-53
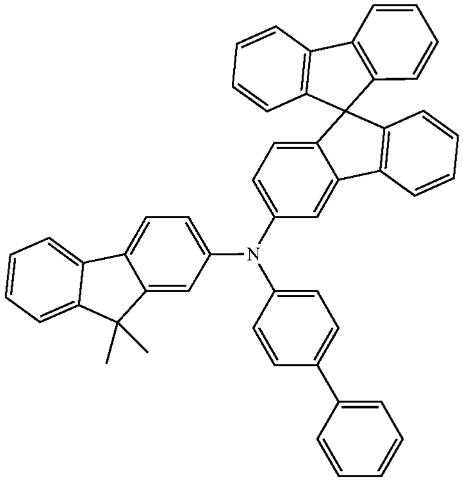

-continued
4-54
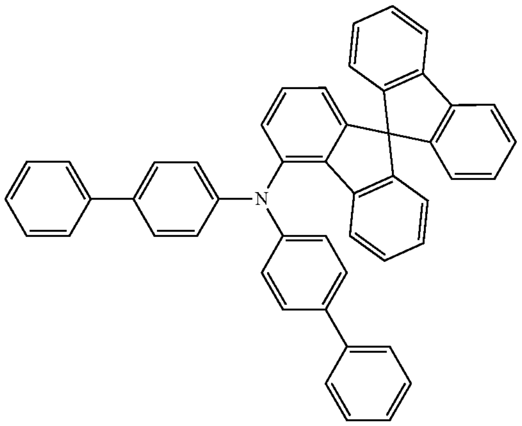
4-55
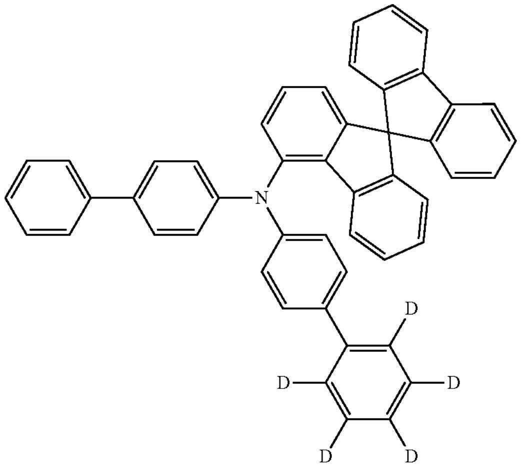
4-56
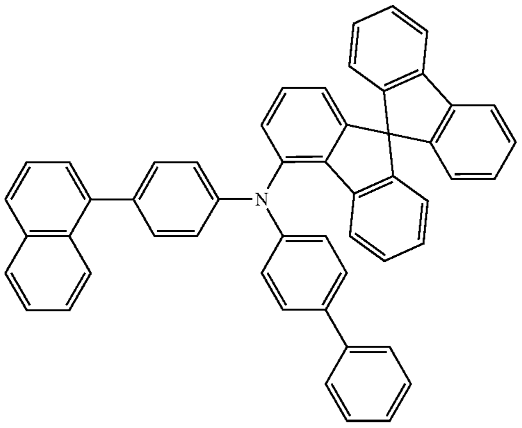
-continued
4-57
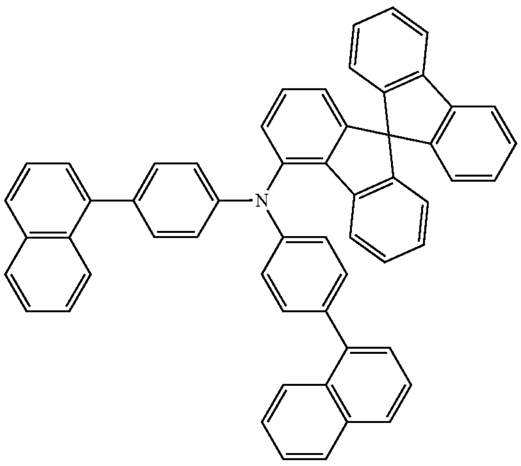
4-58
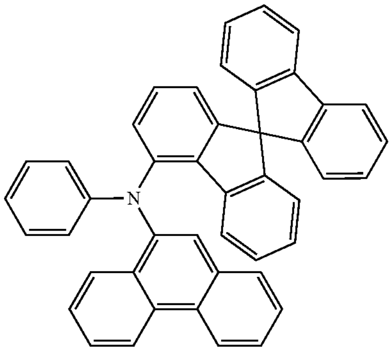
4-59
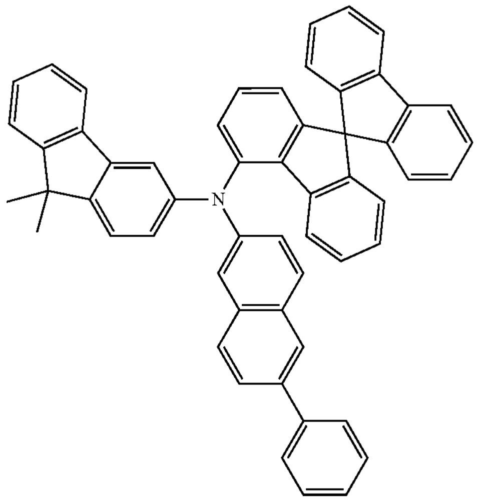

4-60
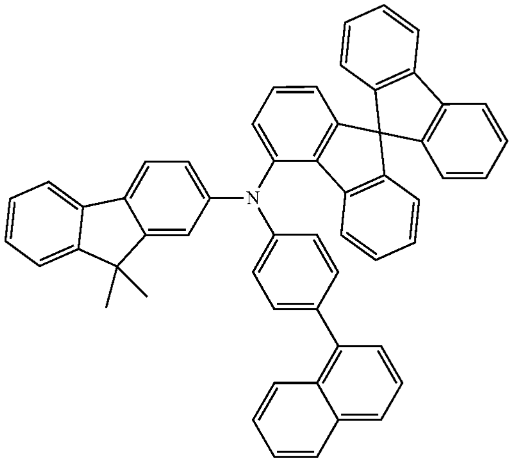
4-61
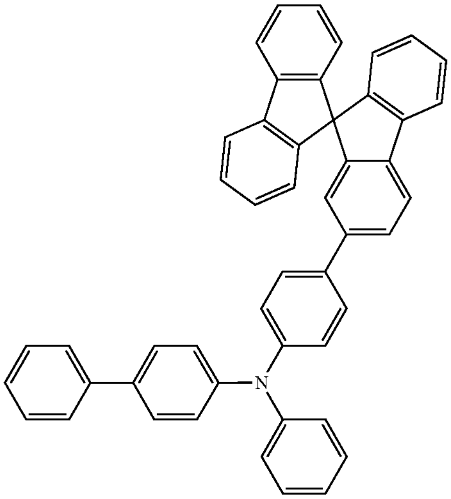
4-62
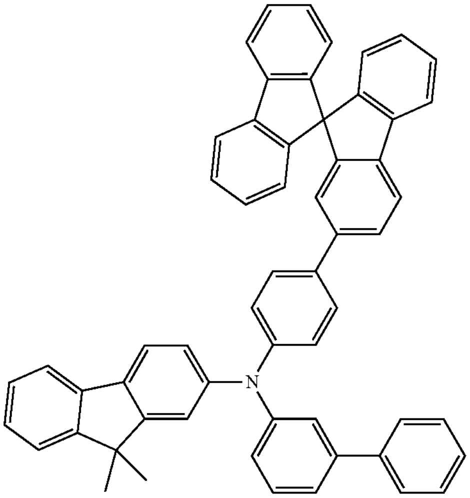
4-63
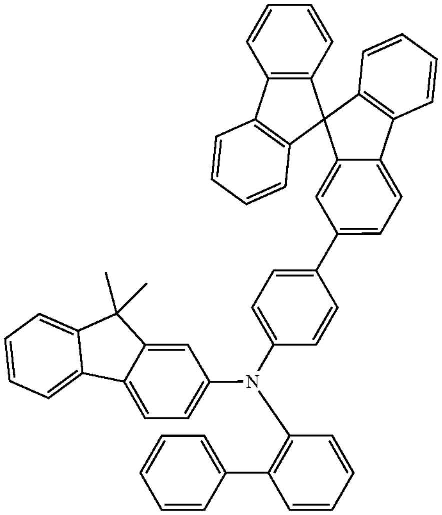
4-64
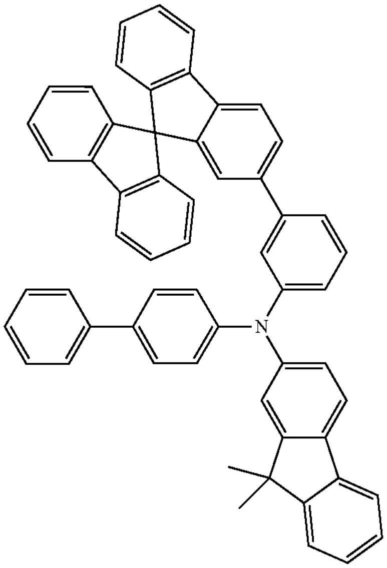
4-65
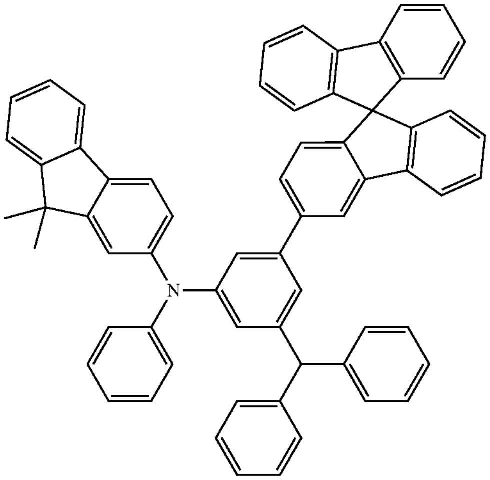

-continued
4-66
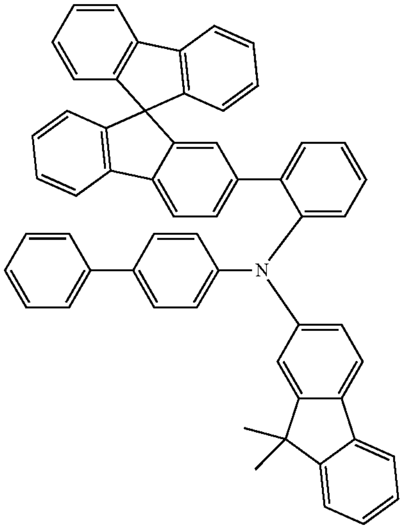
4-67
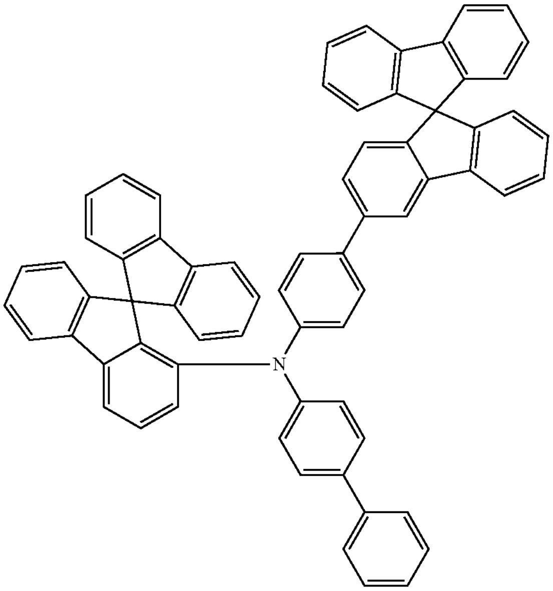
-continued
4-68
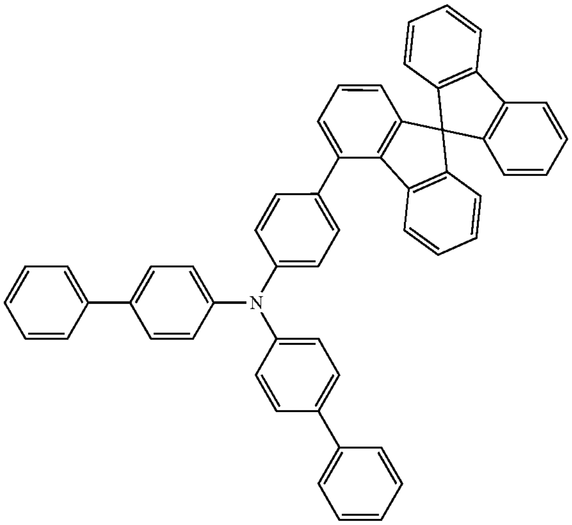
4-69
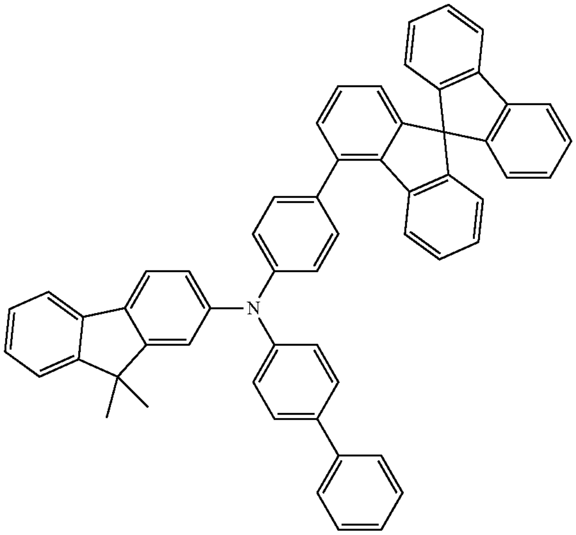
4-70
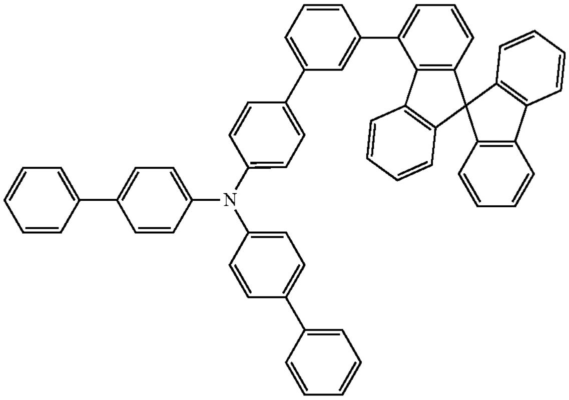

-continued
5-1
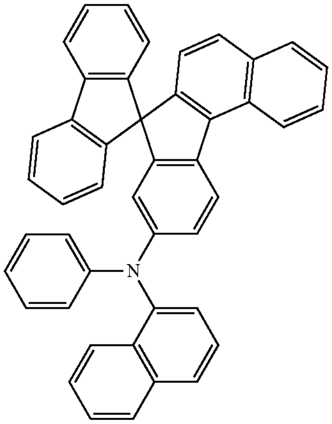
5-2
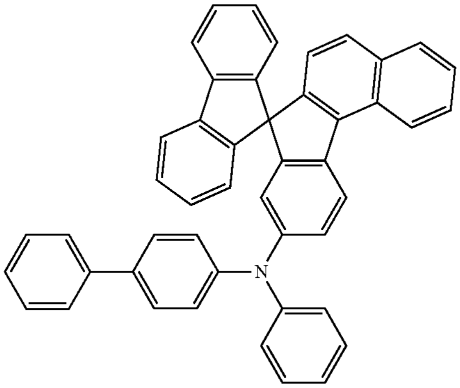
5-3
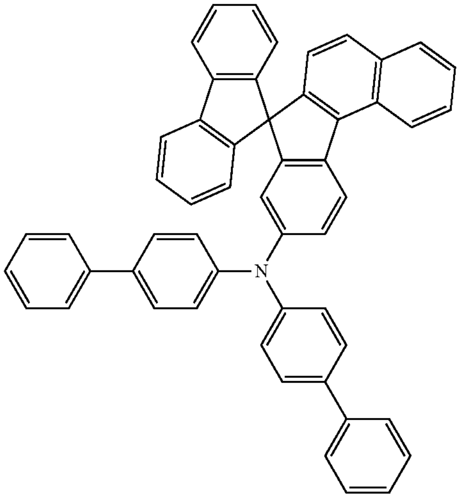
-continued
5-4
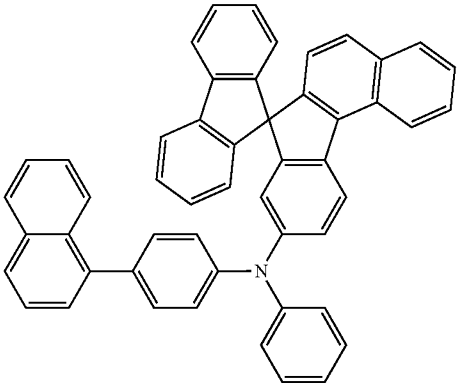
5-5
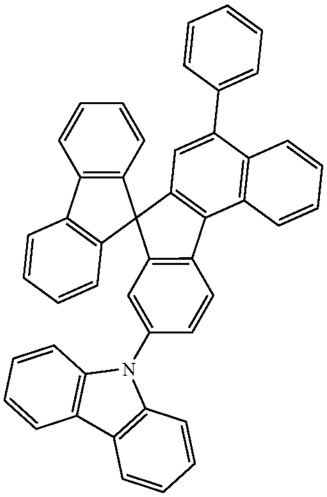
5-6
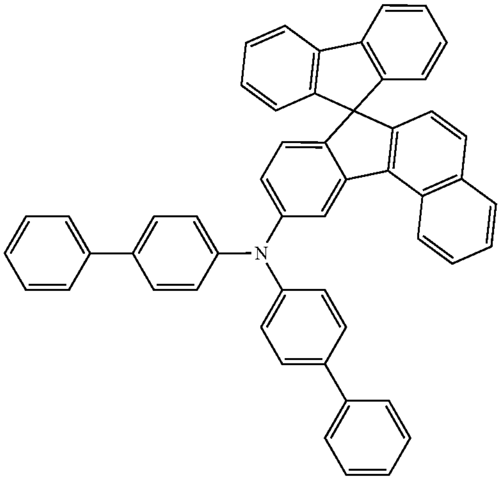

-continued
5-7
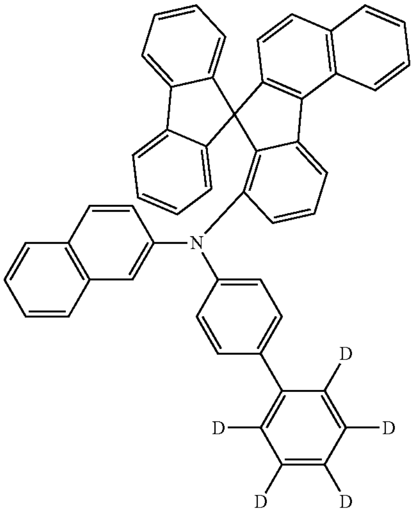
5-8
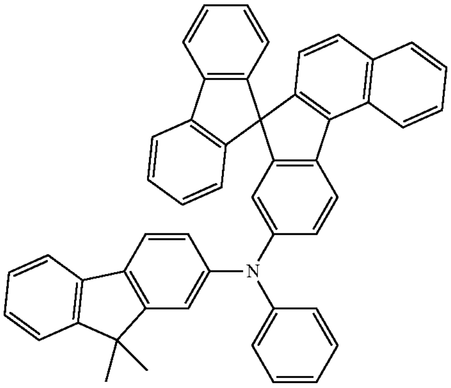
5-9
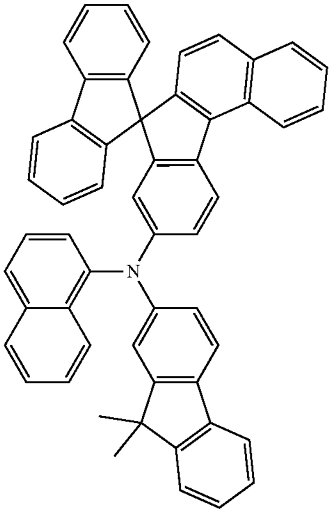
-continued
5-10
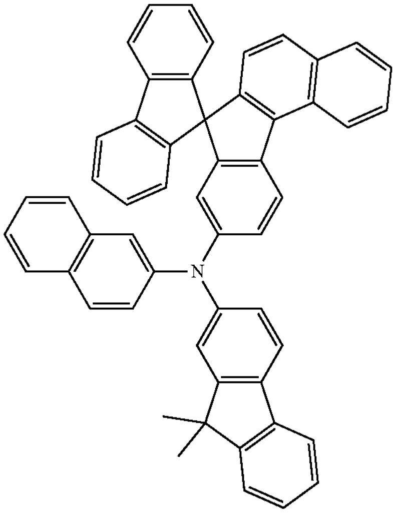
5-11
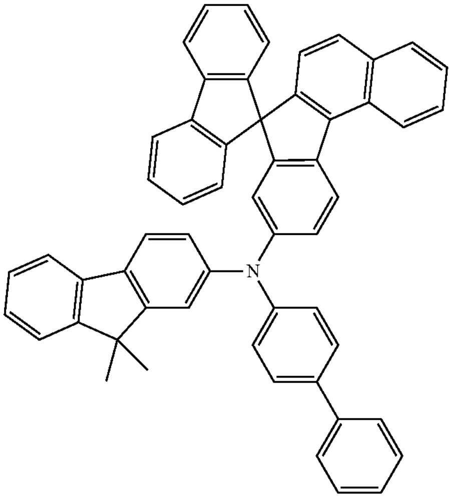
5-12
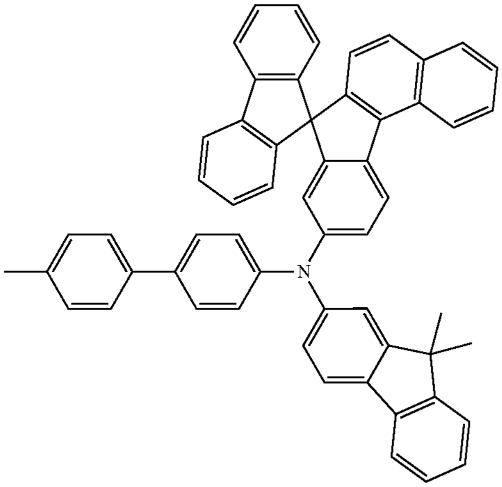

-continued
5-13
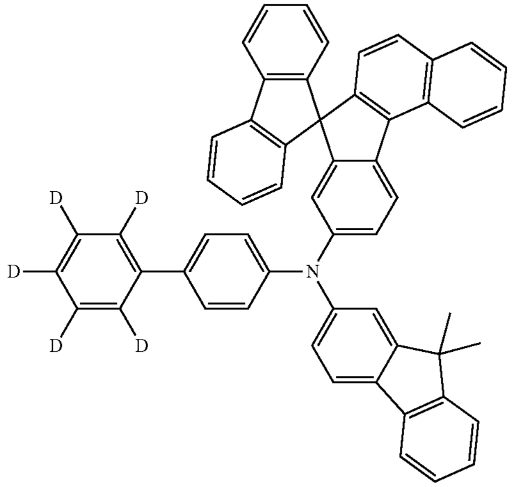
5-14
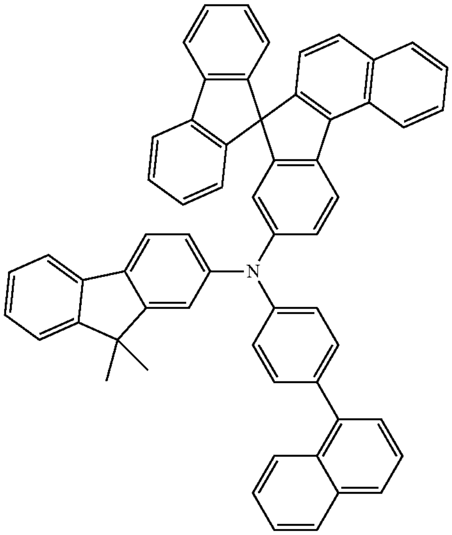
5-15
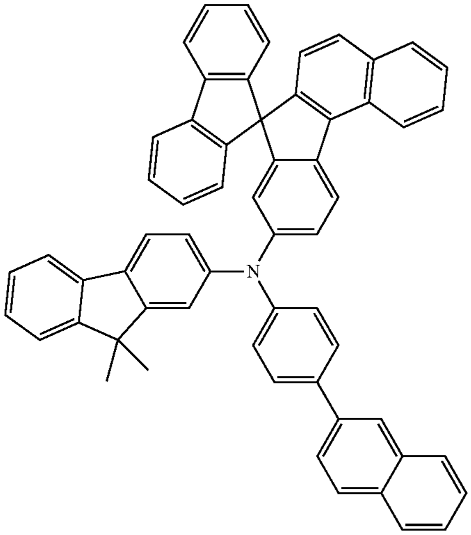
-continued
5-16
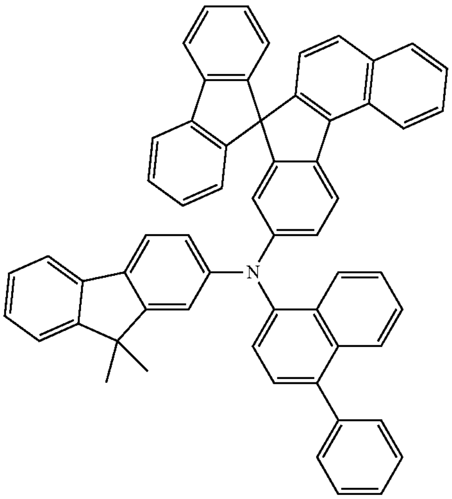
5-17
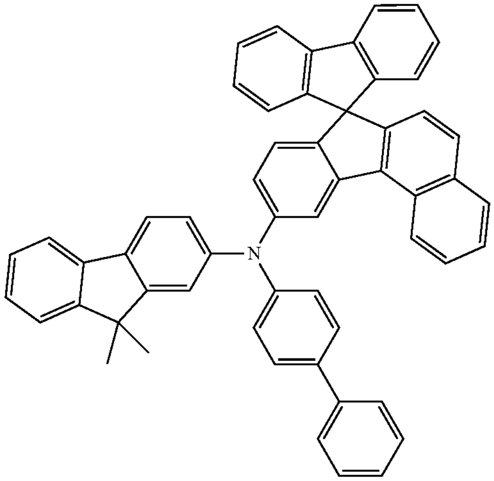
5-18
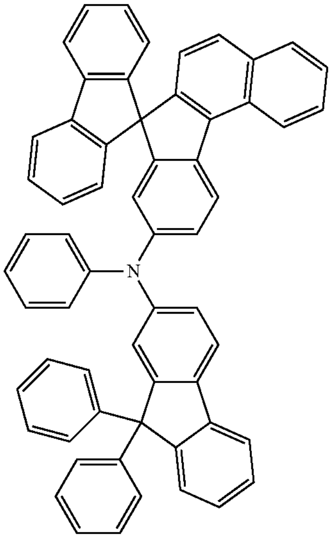

-continued
5-19
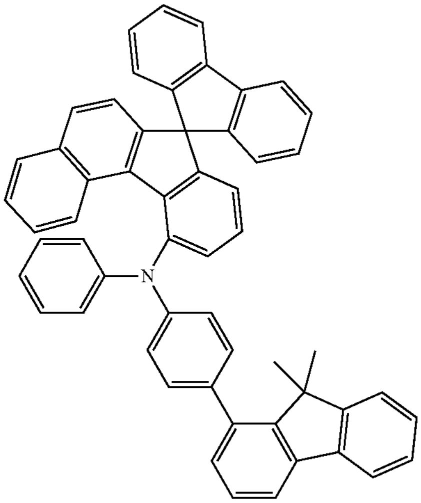
5-20
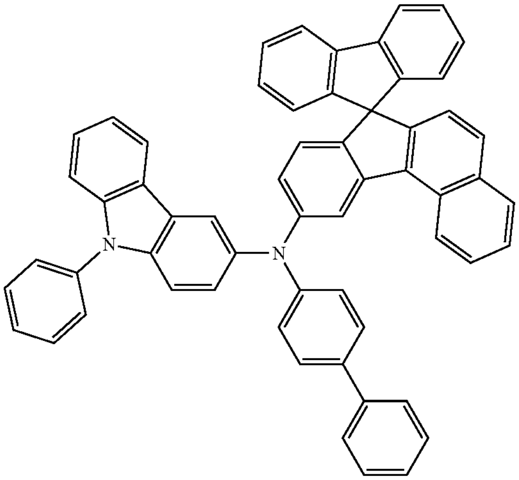
5-21
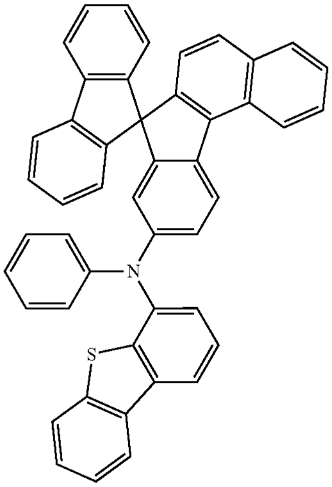
-continued
5-22
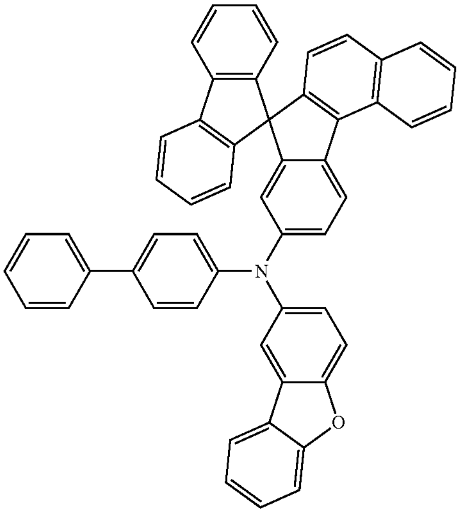
5-23
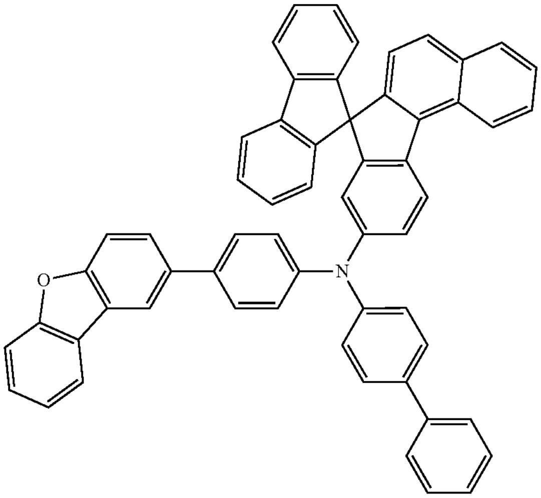
5-24
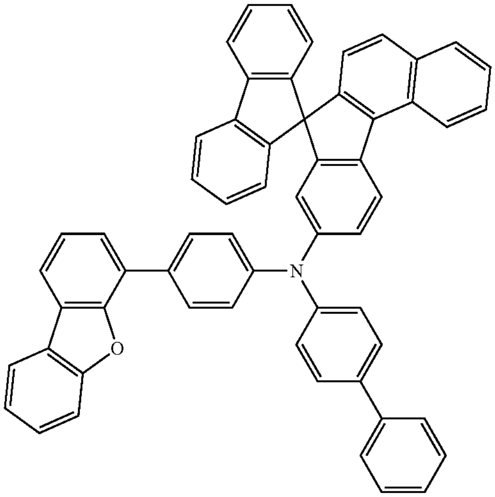

-continued
5-25
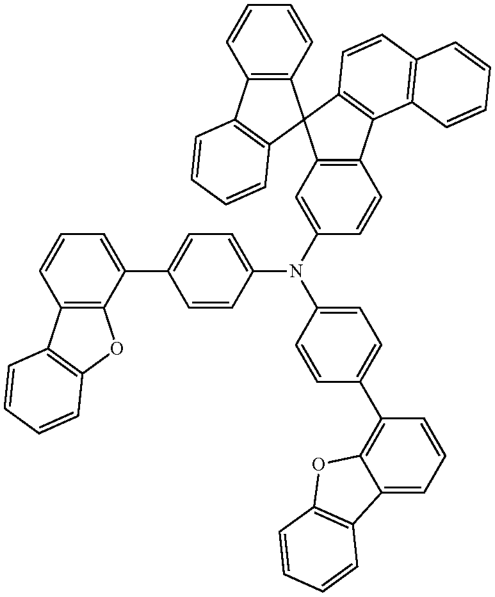
5-26
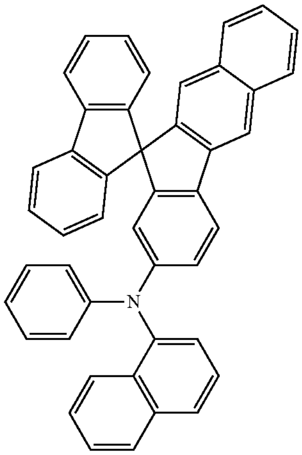
5-27
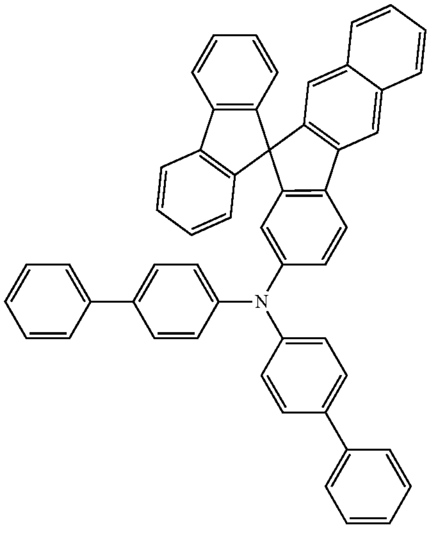
-continued
5-28
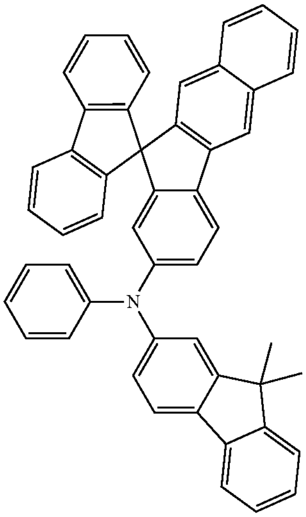
5-29
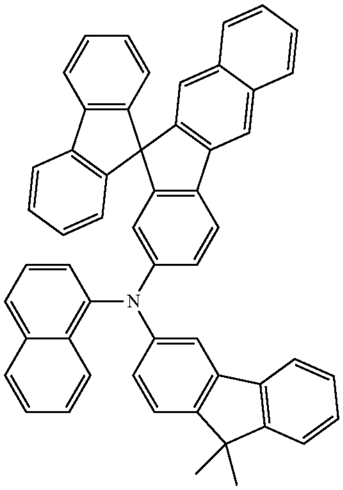
5-30
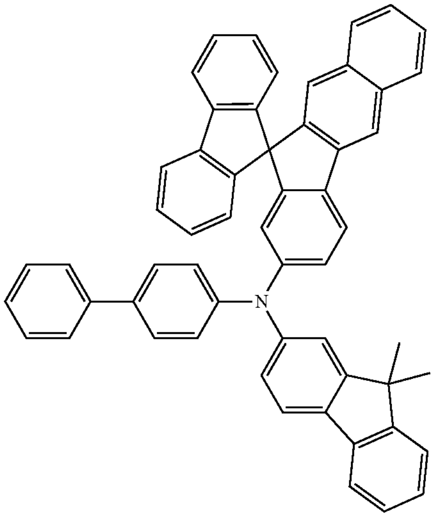

-continued
5-31
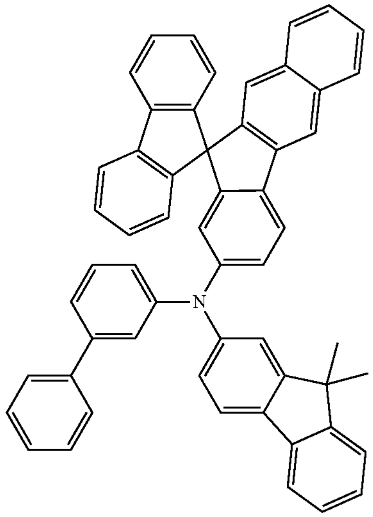
5-32
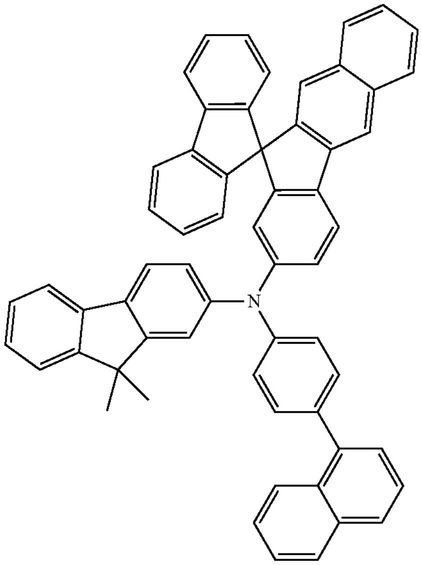
5-33
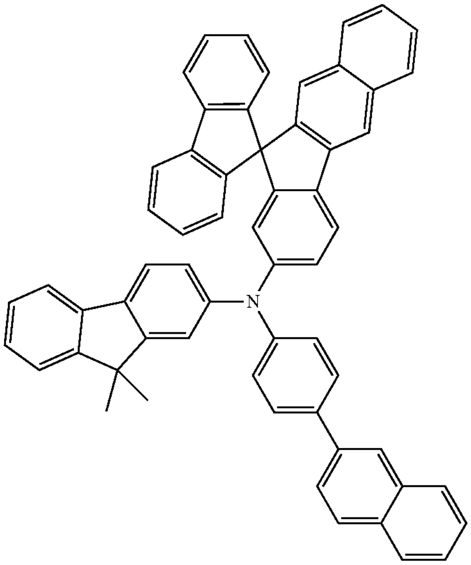
-continued
5-34
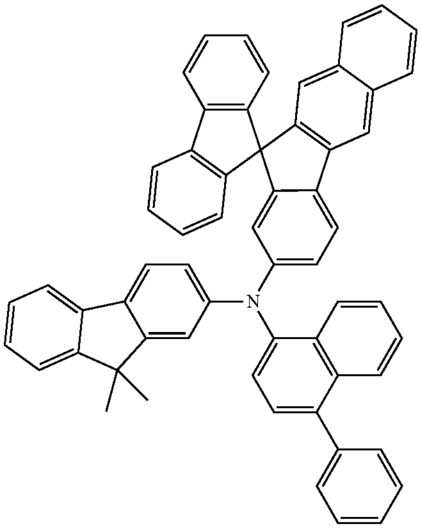
5-35
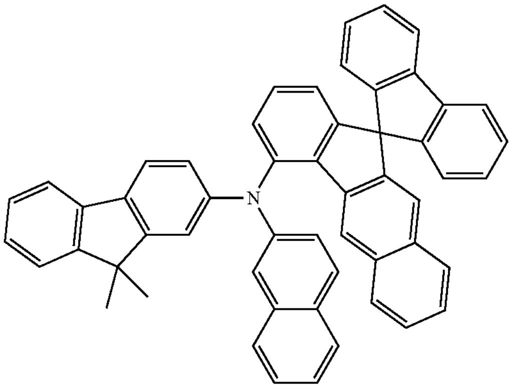
5-36
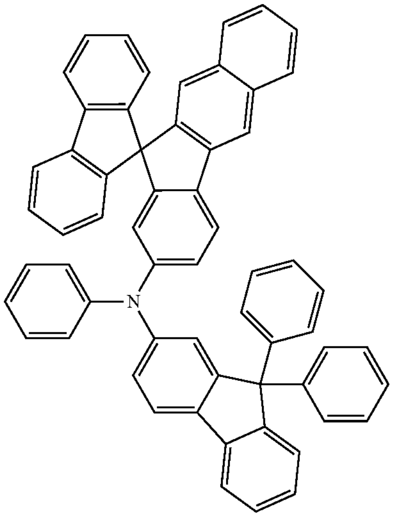

-continued
5-37
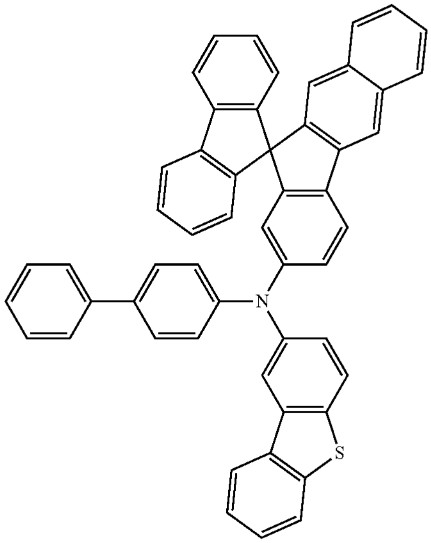
5-38
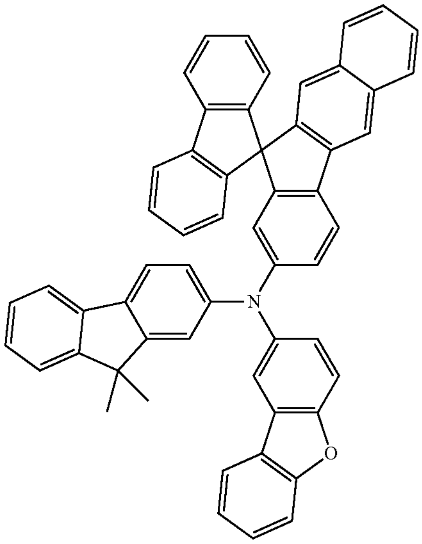
5-39
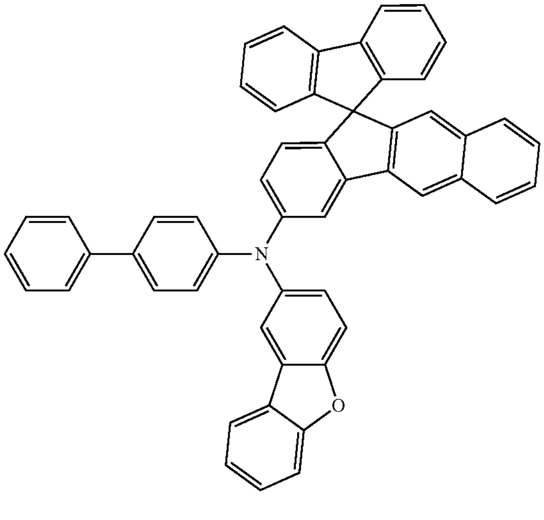
-continued
5-40
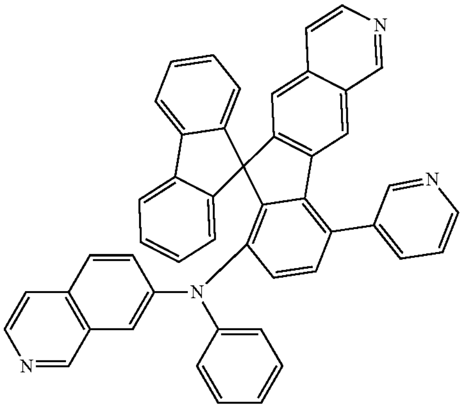
5-41
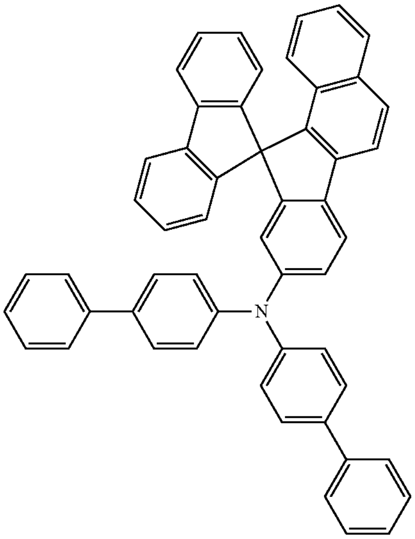
5-42
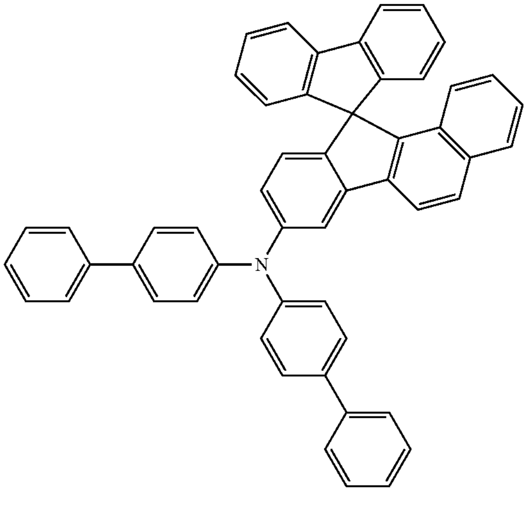

-continued
5-43
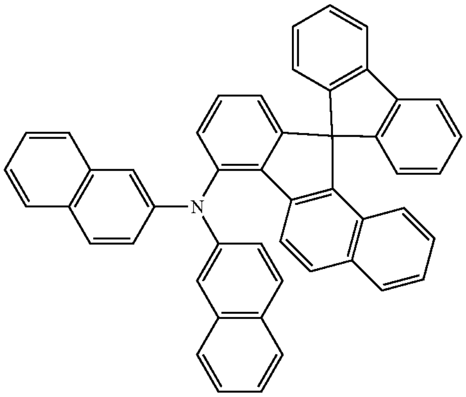
5-44
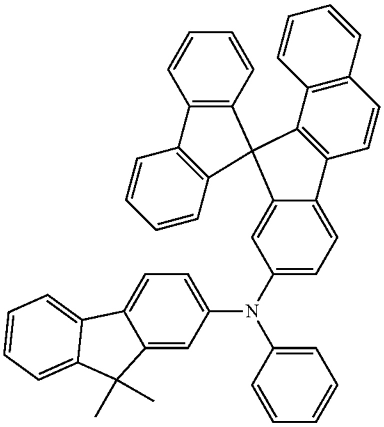
5-45
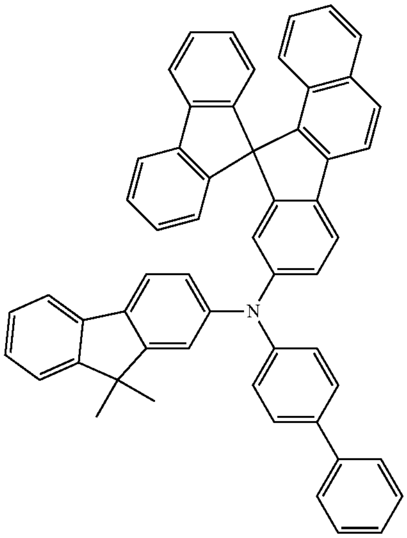
-continued
5-46
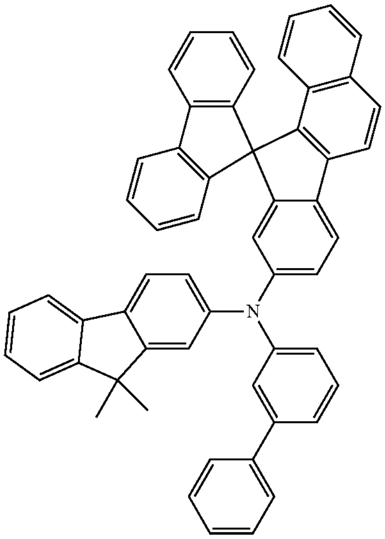
5-47
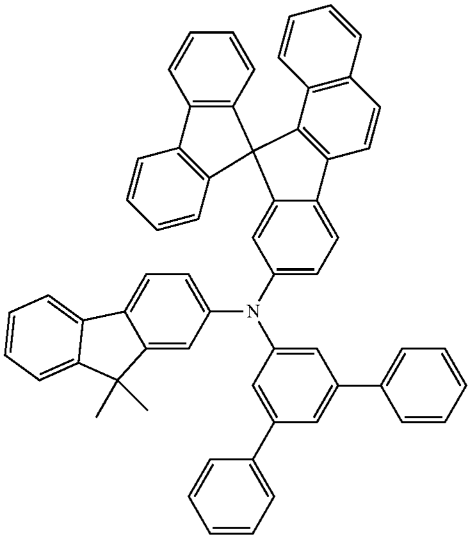
5-48
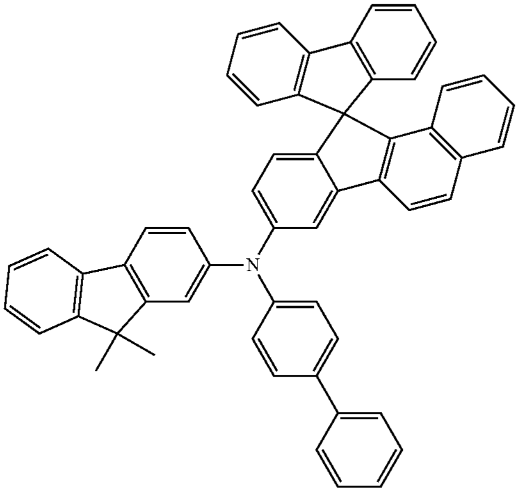

-continued
5-49
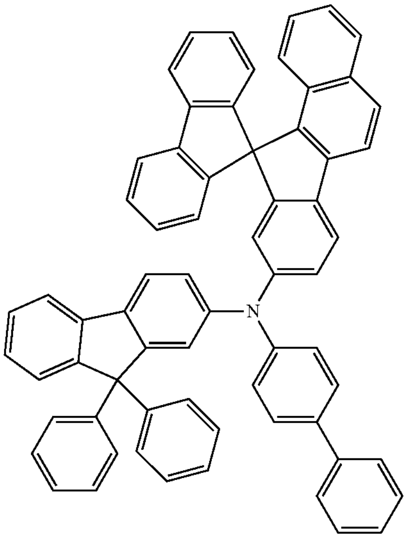
5-50
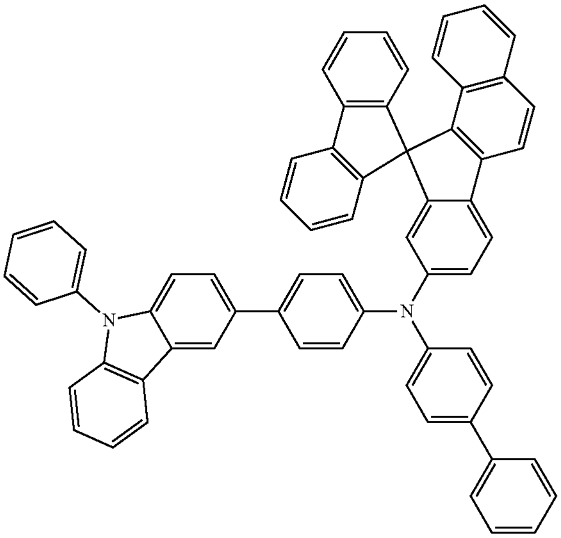
5-51
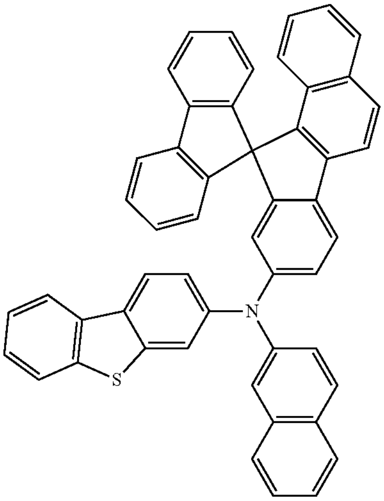
-continued
5-52
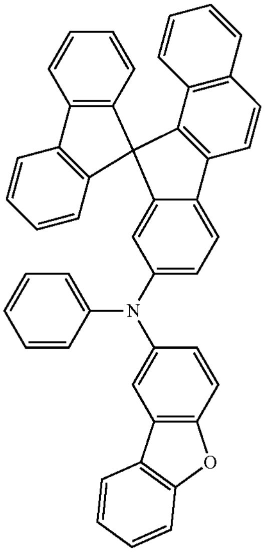
5-53
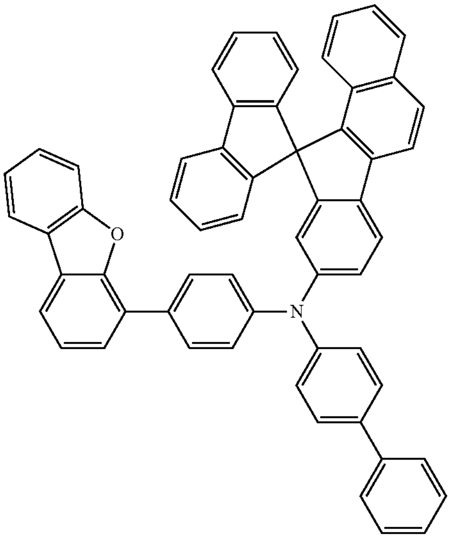
5-54
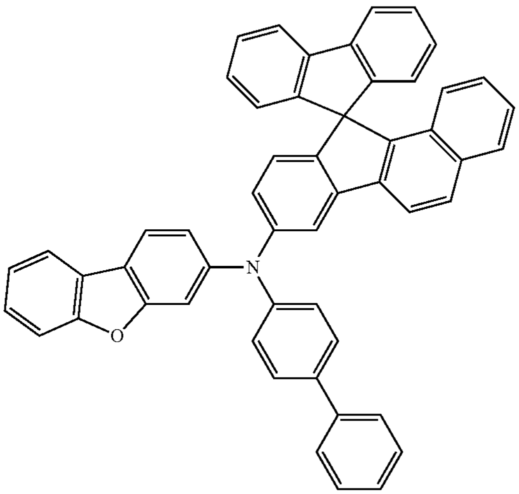

-continued
5-55
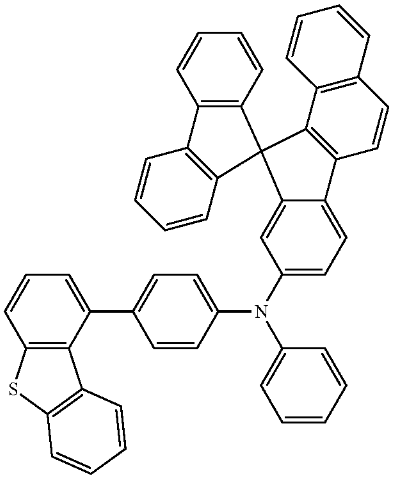
5-56
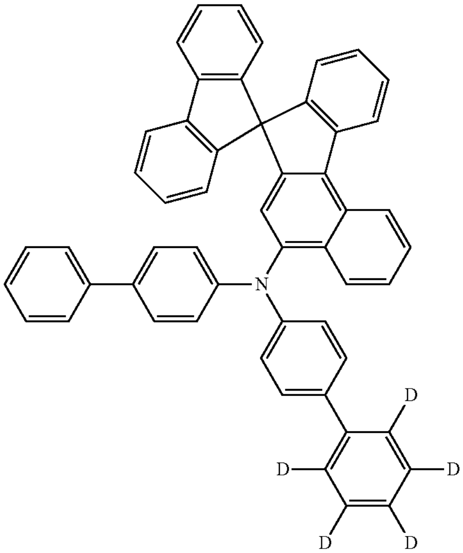
5-57
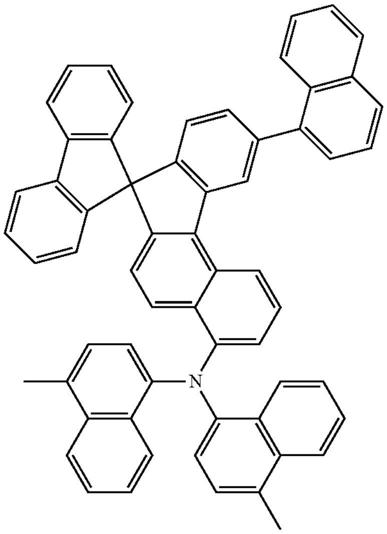
-continued
5-58
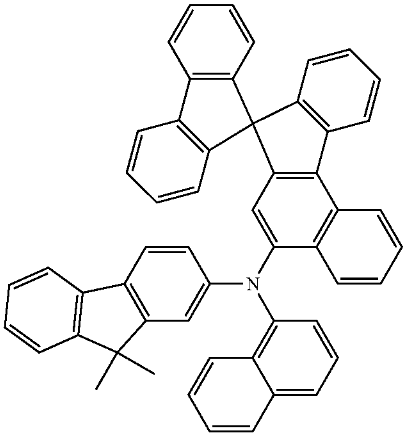
5-59
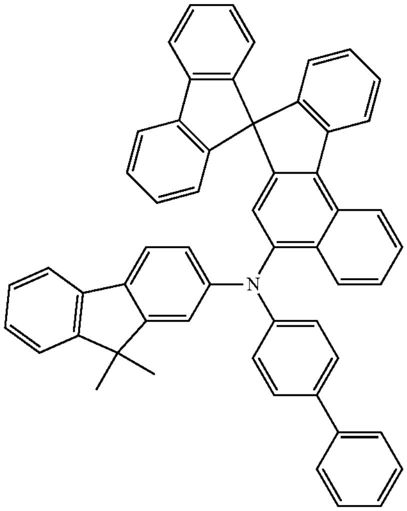
5-60
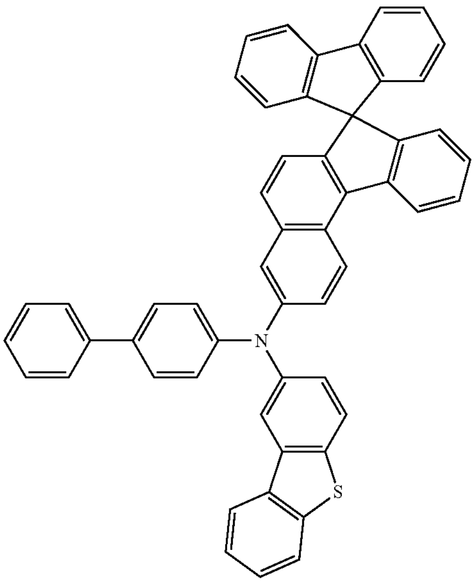

-continued
5-61
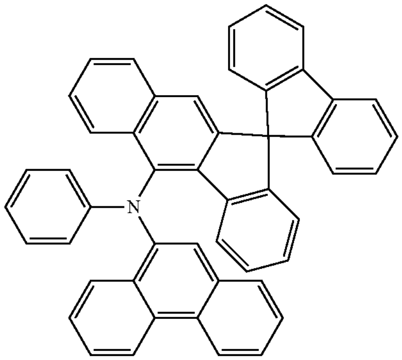
5-62
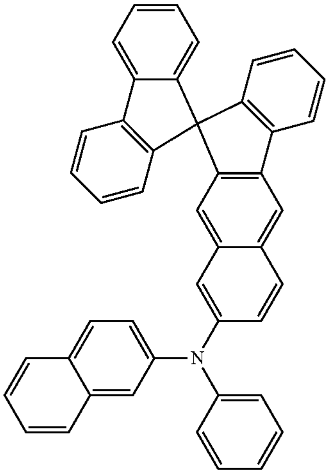
5-63
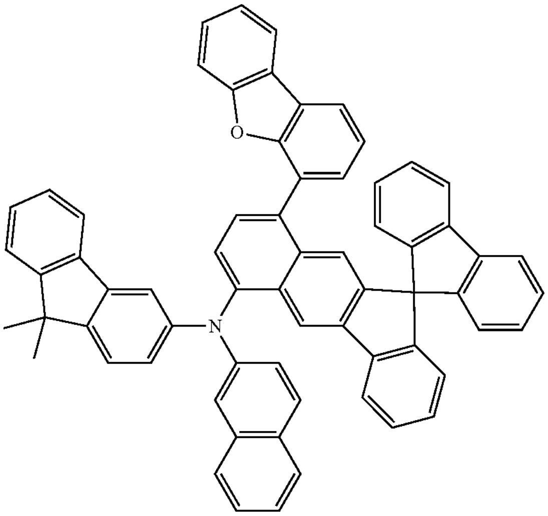
-continued
5-64
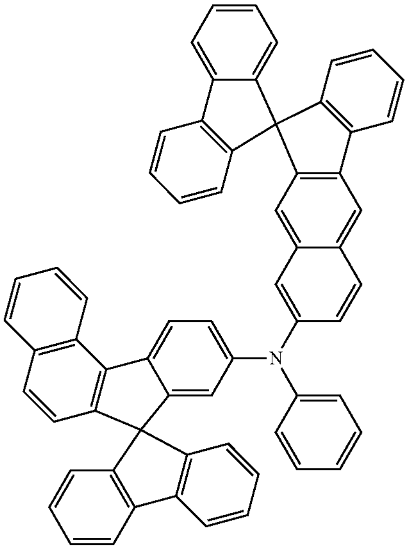
5-65
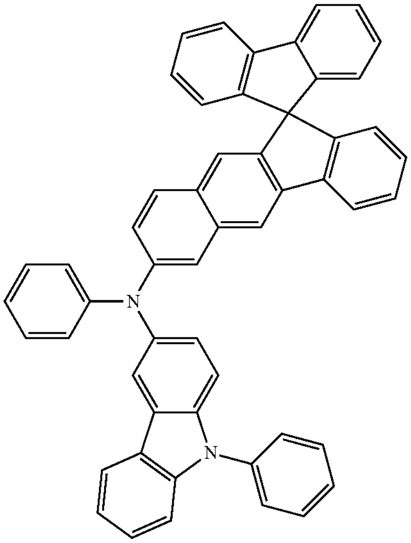
5-66
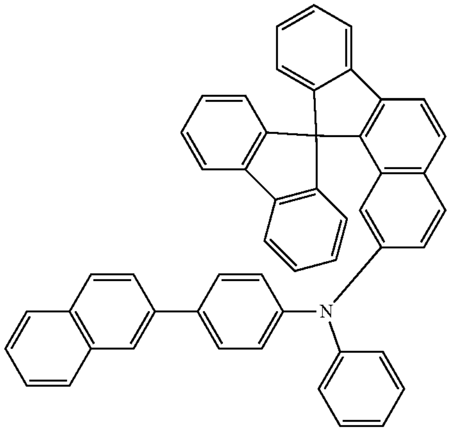

-continued
5-67
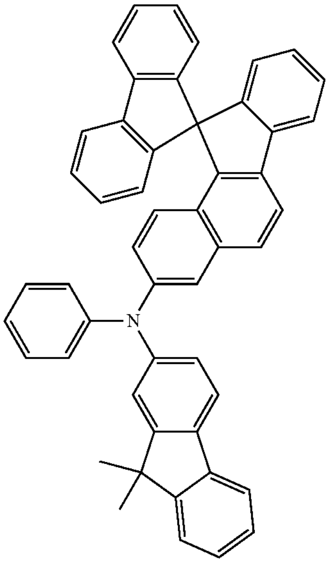
5-68
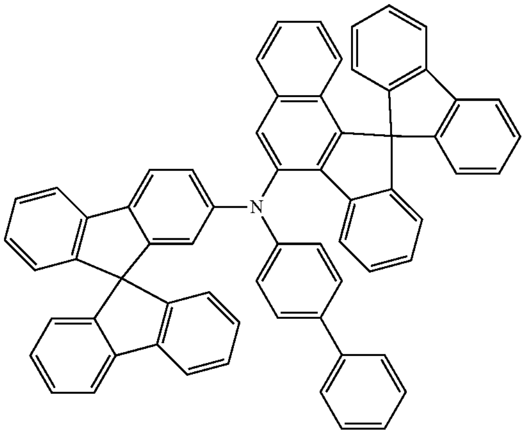
5-69
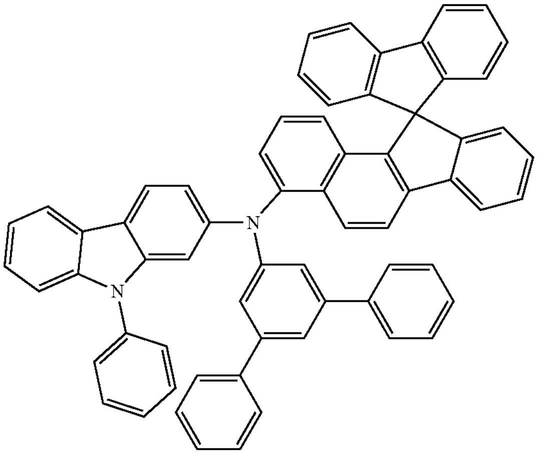
-continued
5-70
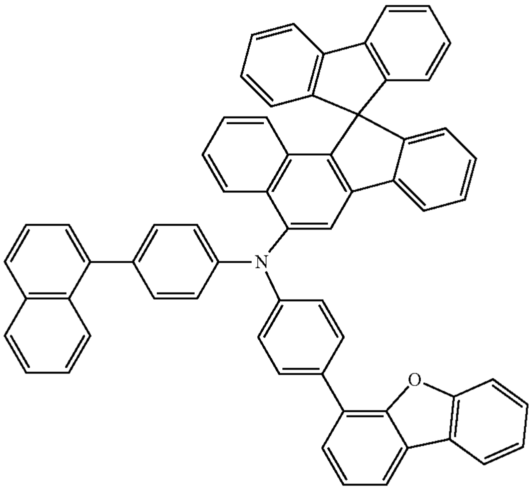
5-71
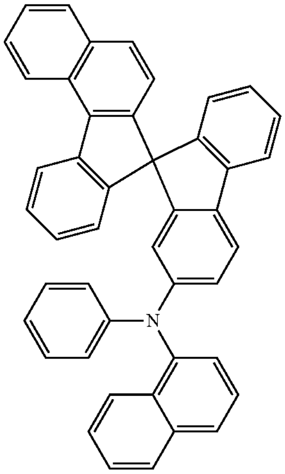
5-72
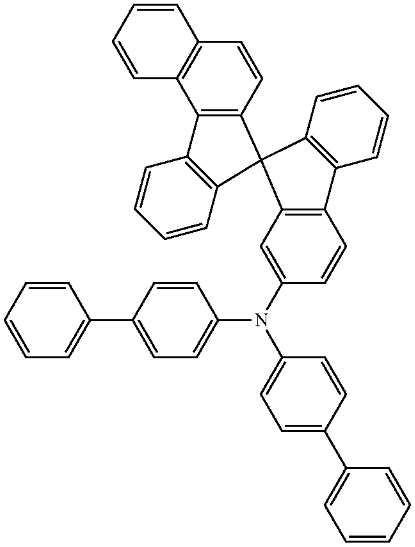

-continued
5-73
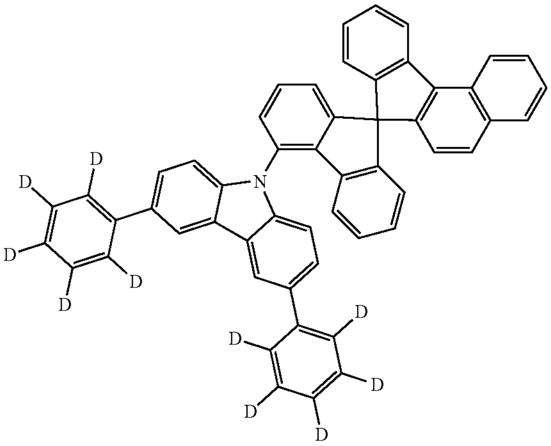
5-74
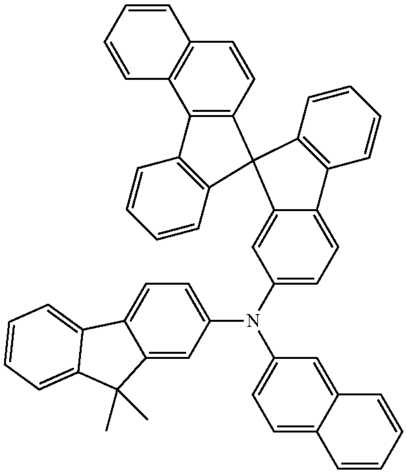
5-75
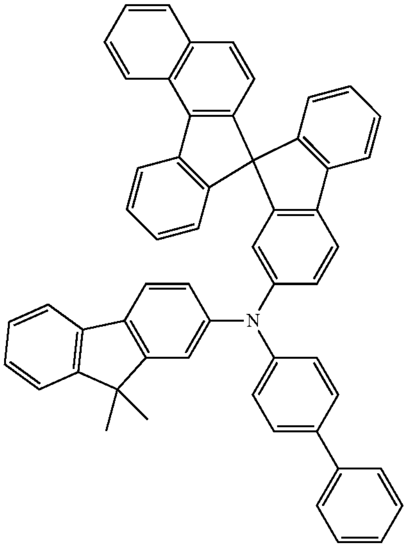
-continued
5-76
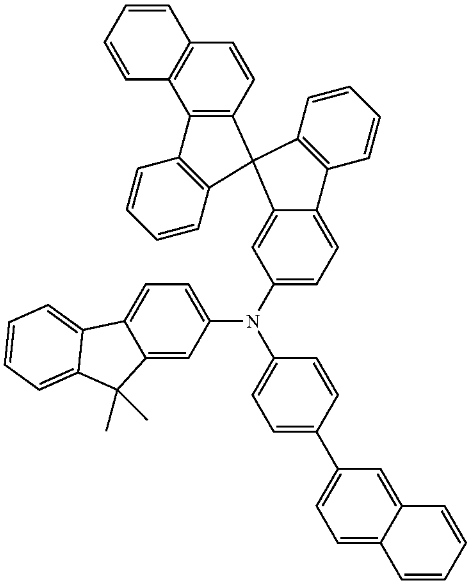
5-77
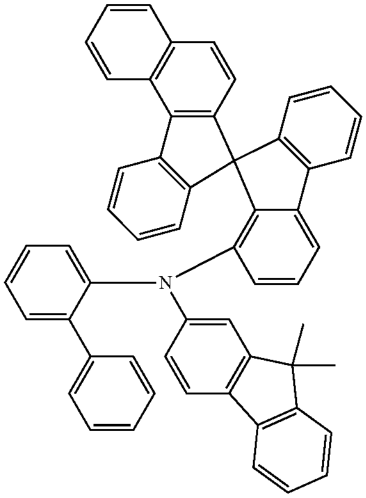
5-78
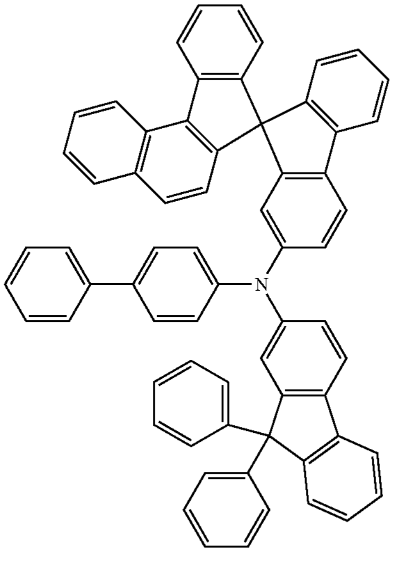

-continued
5-79
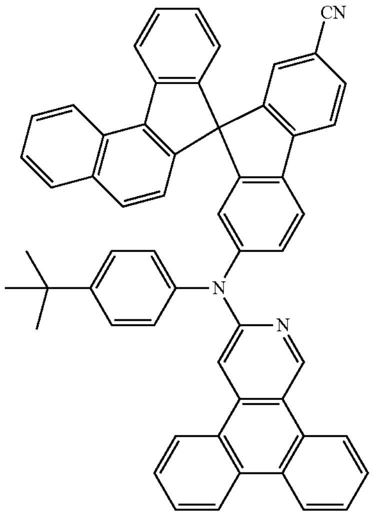
5-80
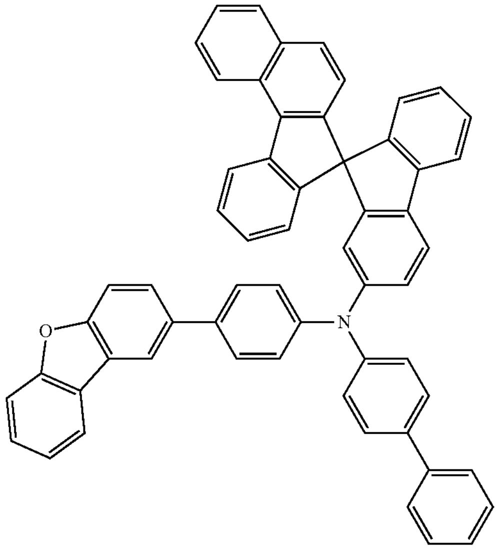
5-81
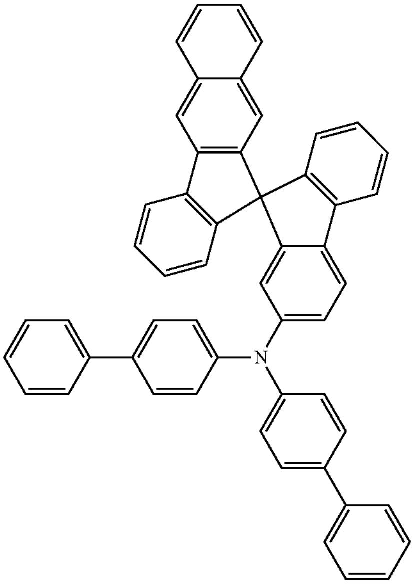
-continued
5-82
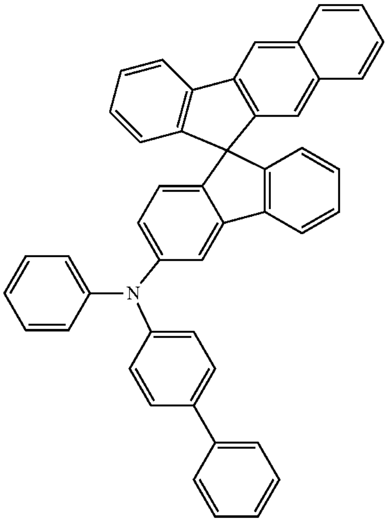
5-83
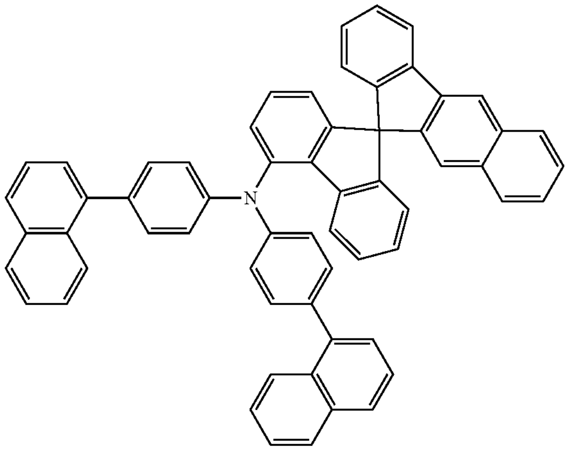
5-84
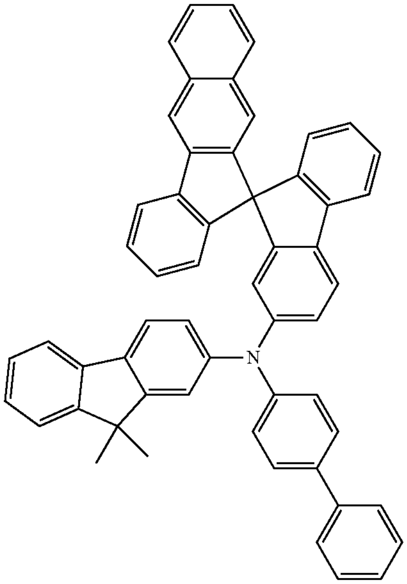

-continued
5-85
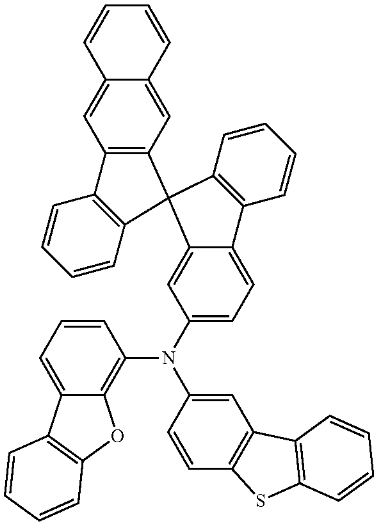
5-86
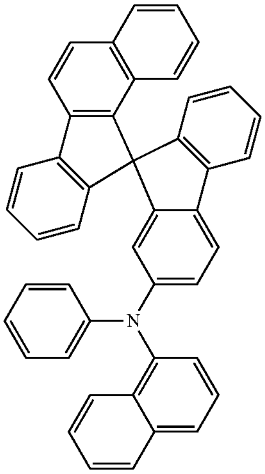
5-87
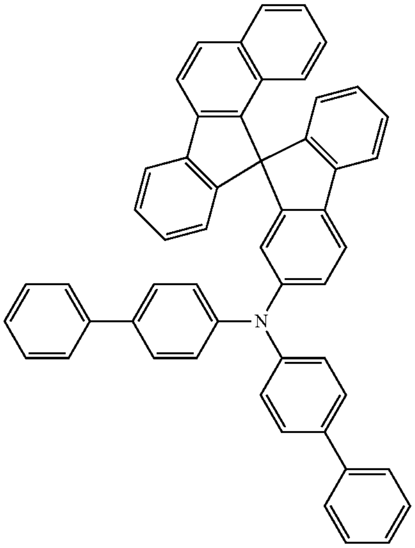
-continued
5-88
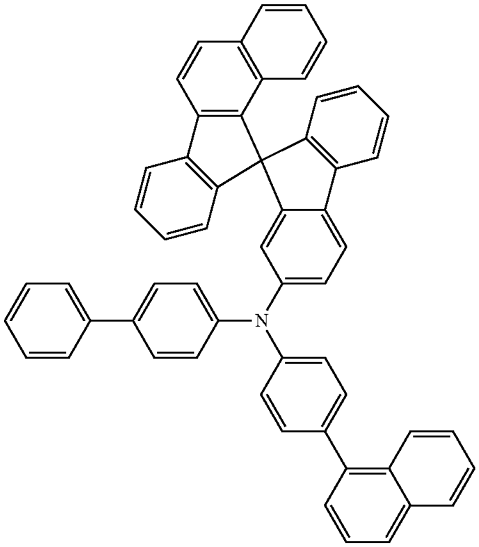
5-89
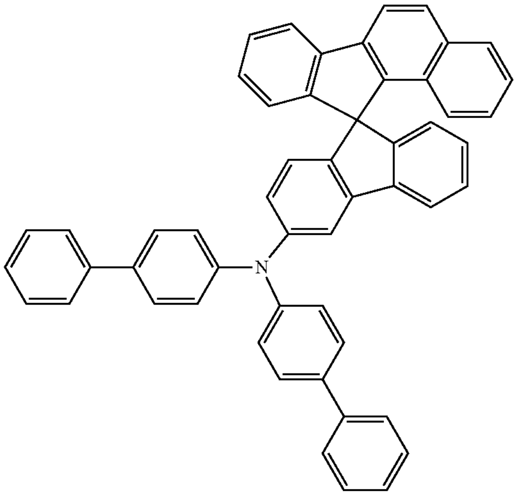
5-90
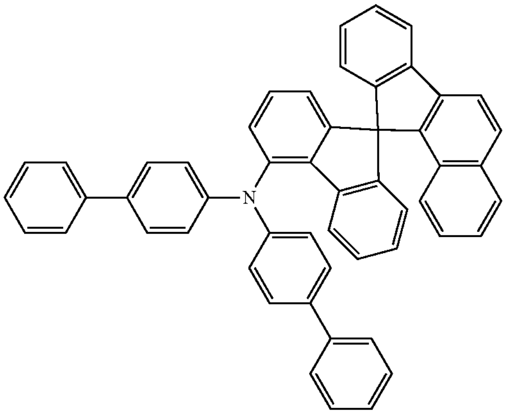

-continued
5-91
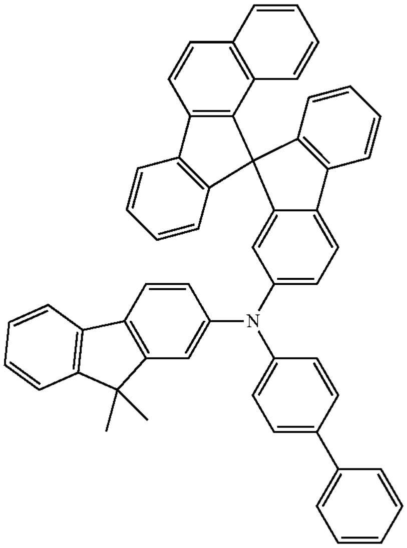
5-92
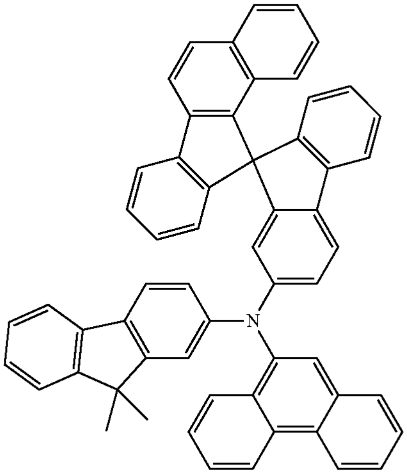
5-93
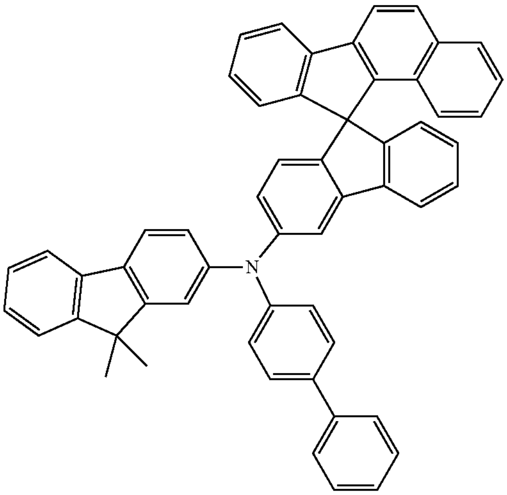
-continued
5-94
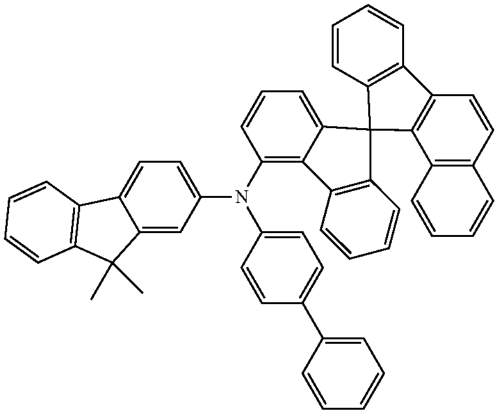
5-95
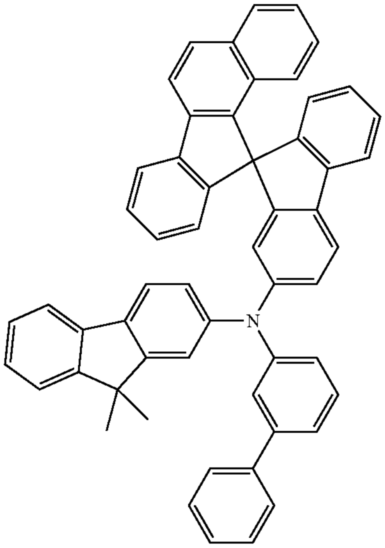
5-96
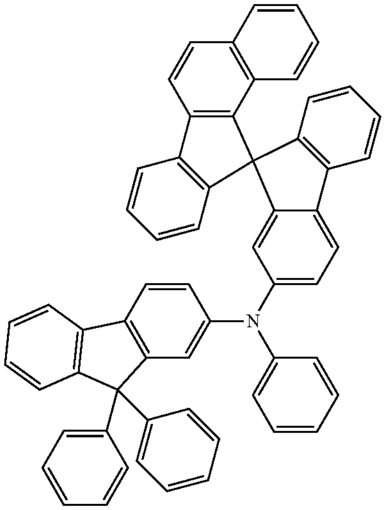

-continued
5-97
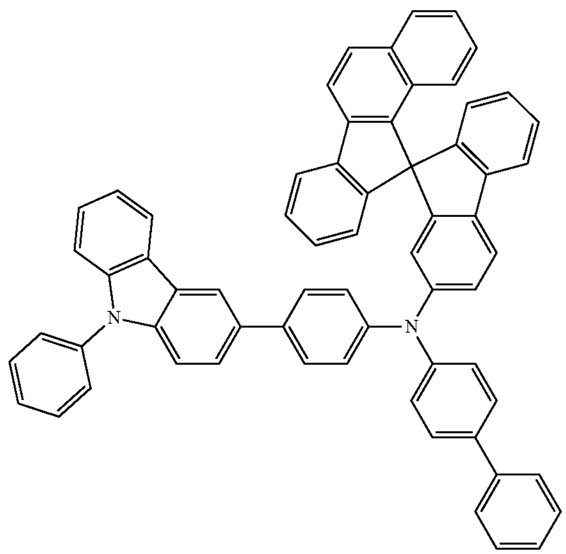
5-98
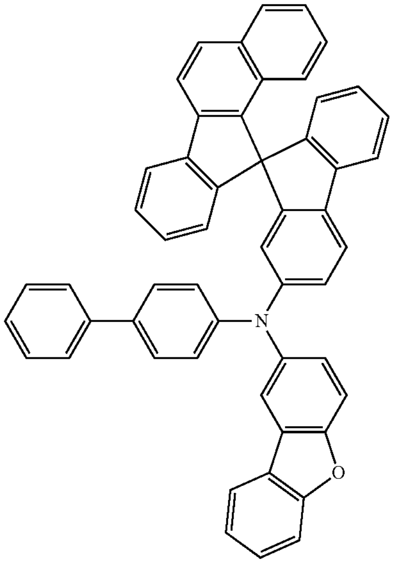
-continued
5-99
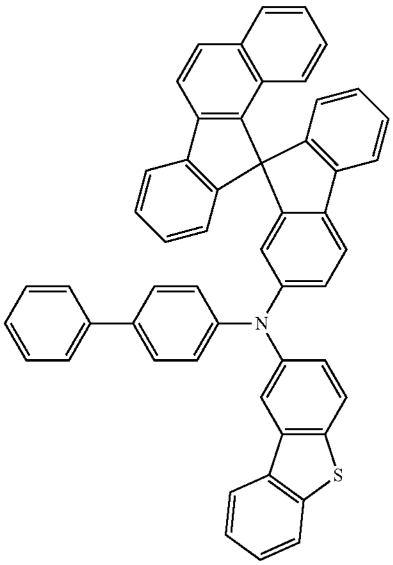
5-100
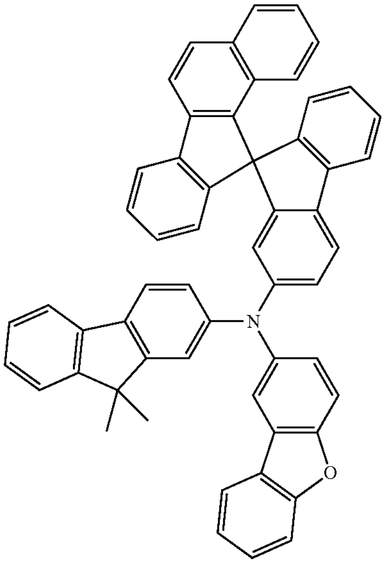
5-101
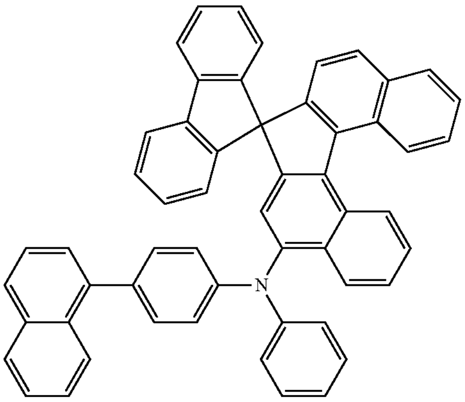

5-102
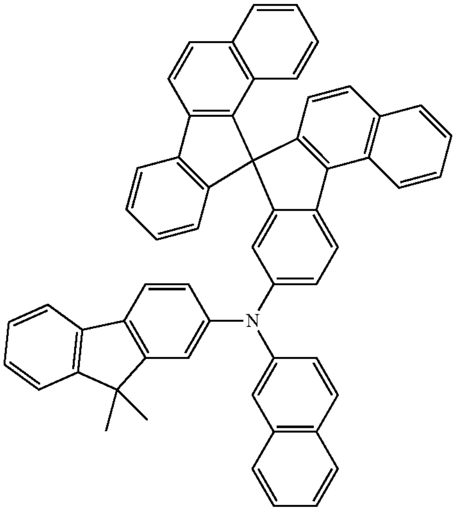
5-103
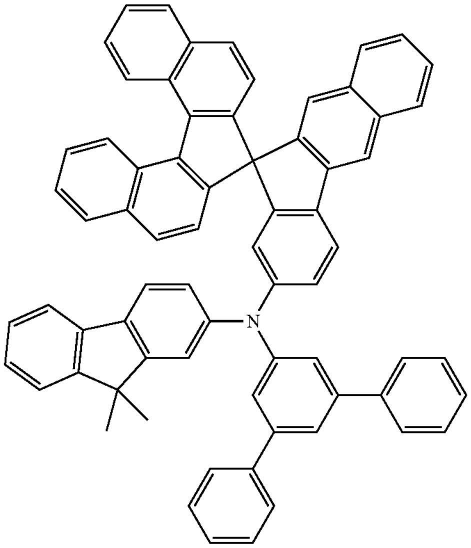
5-104
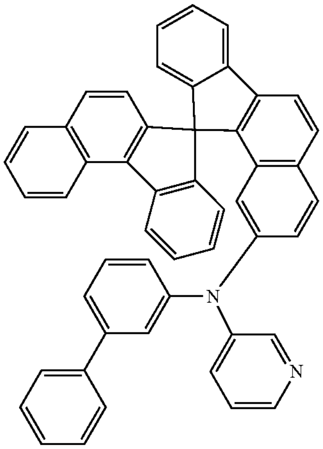
5-105
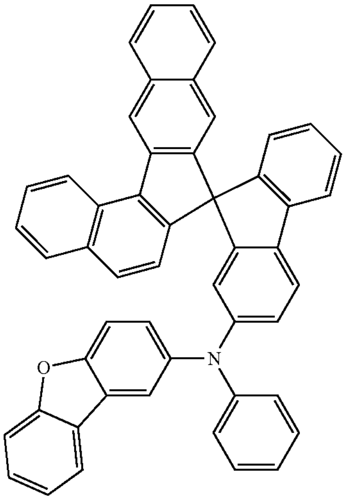
5-106
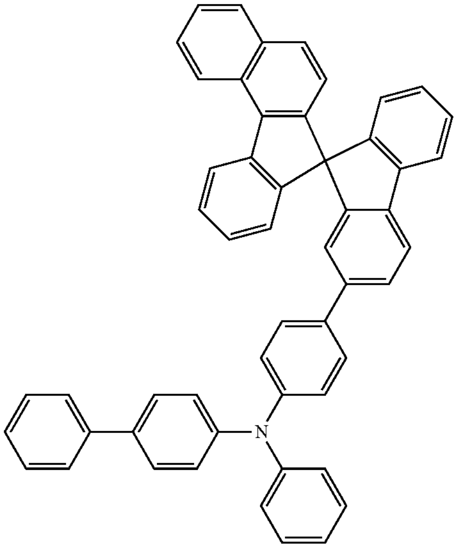
5-107
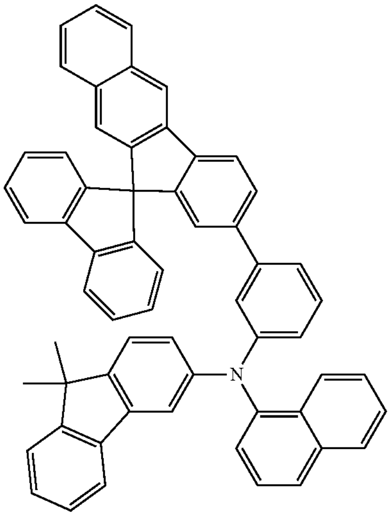

5-108
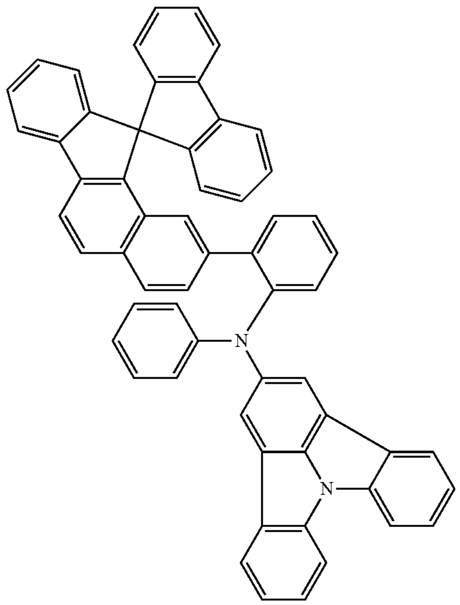
5-109
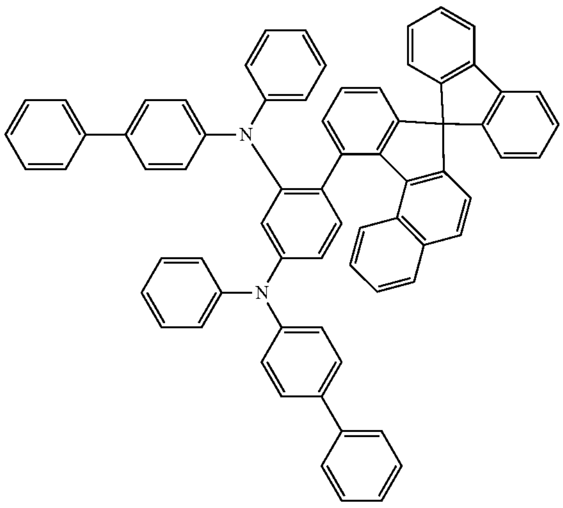
5-110
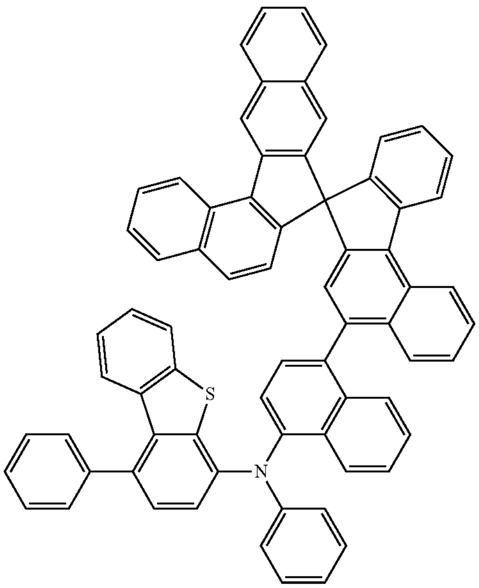
5-111
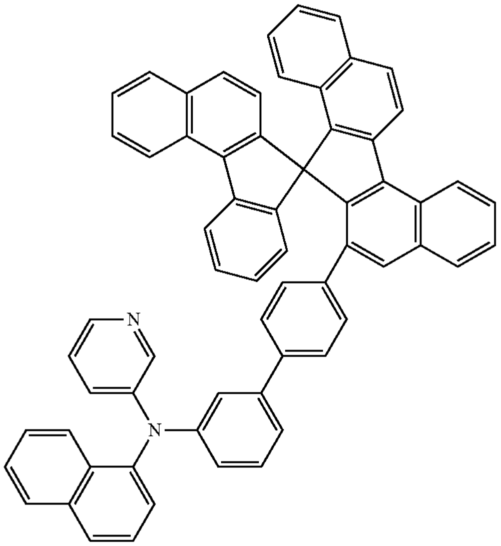

-continued
5-112
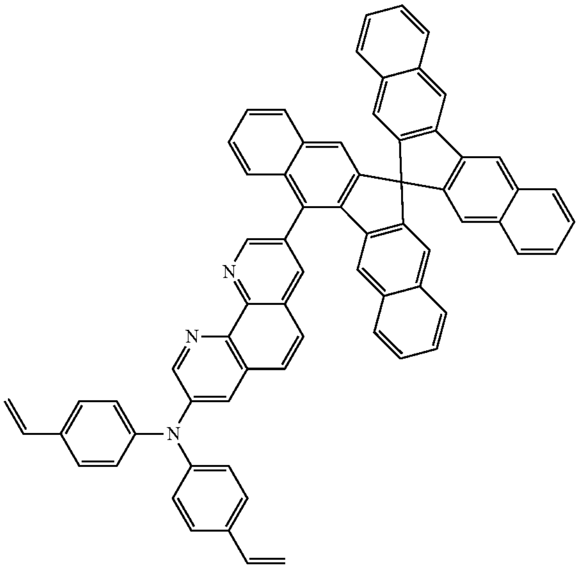
5-113
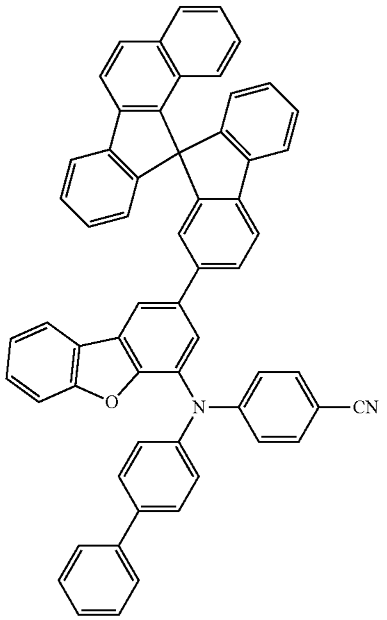
-continued
5-114
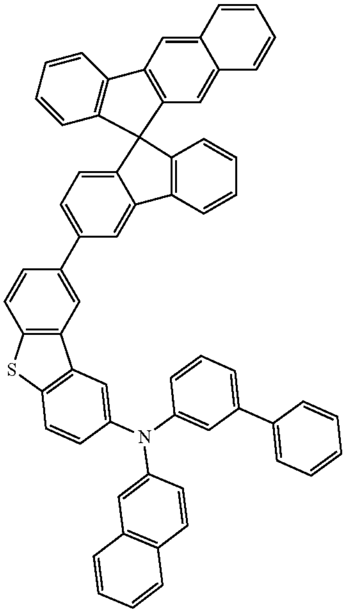
5-115
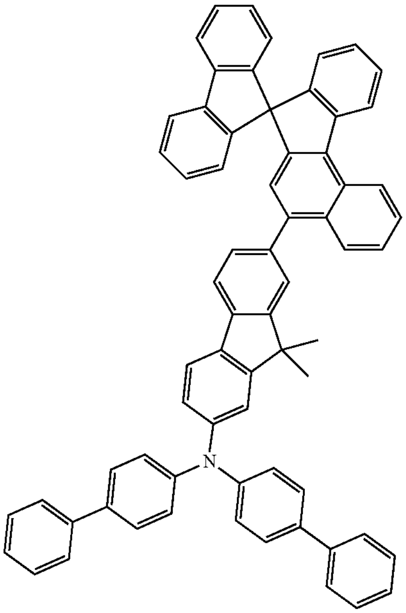

-continued
6-1
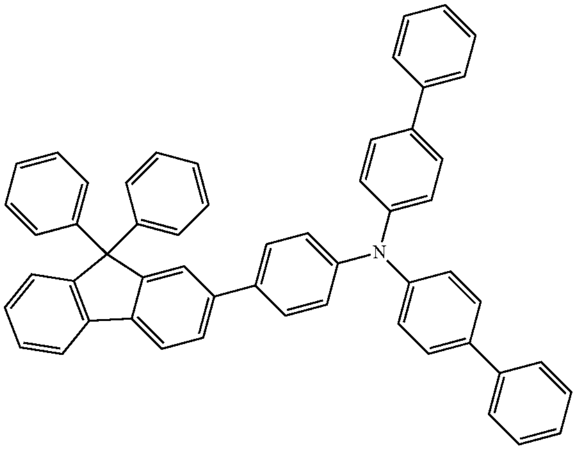
6-2
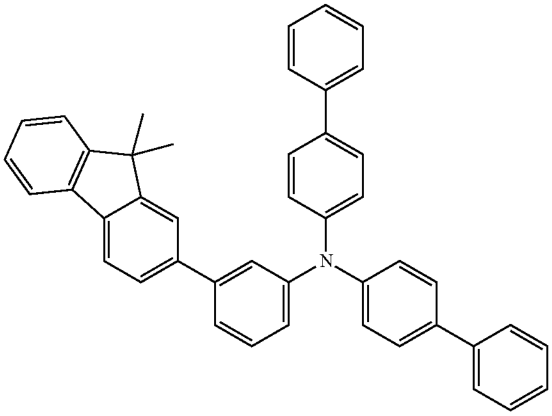
6-3
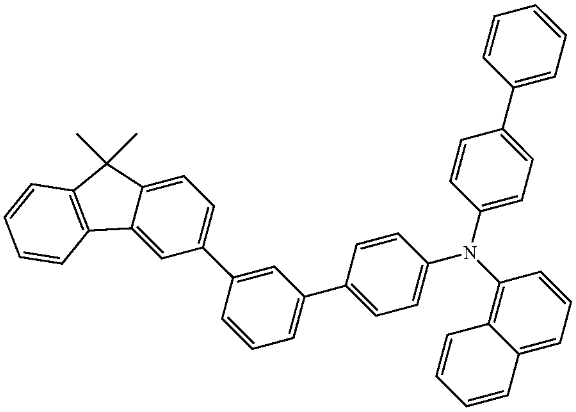
-continued
6-4
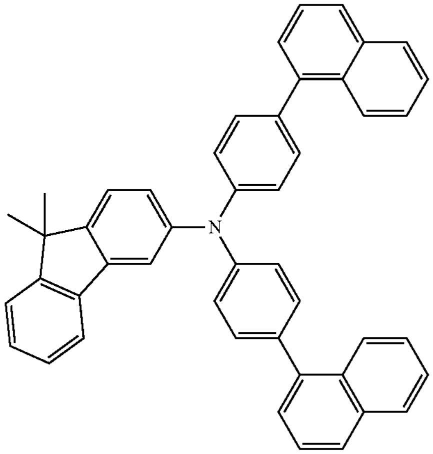
6-5
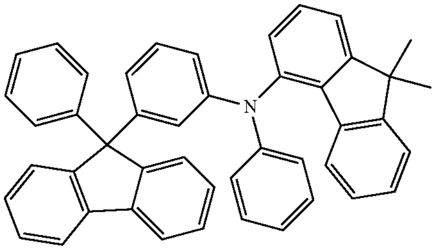
6-6
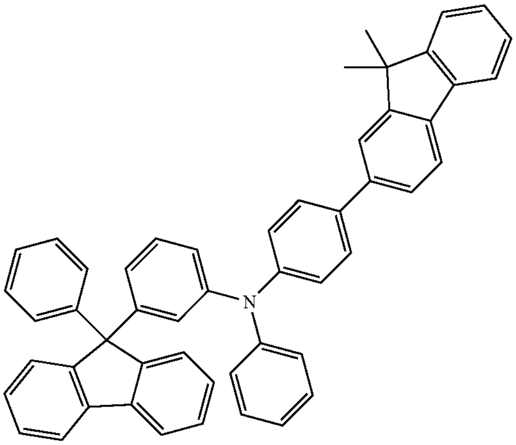
6-7
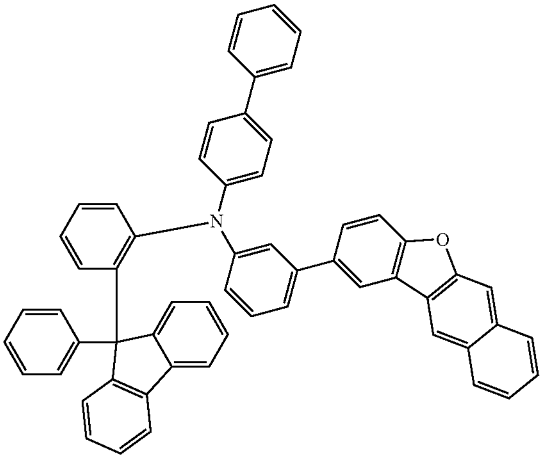

-continued
6-8
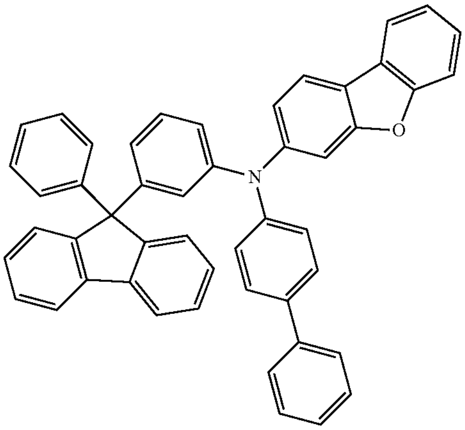
6-9
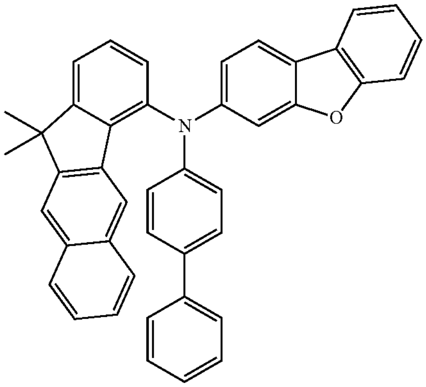
6-10
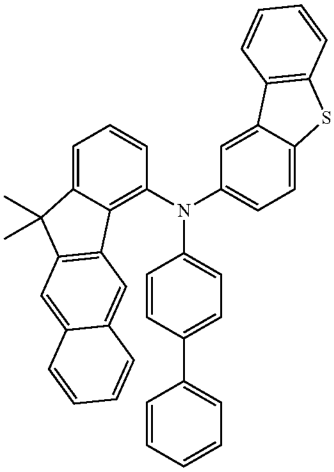
-continued
6-11
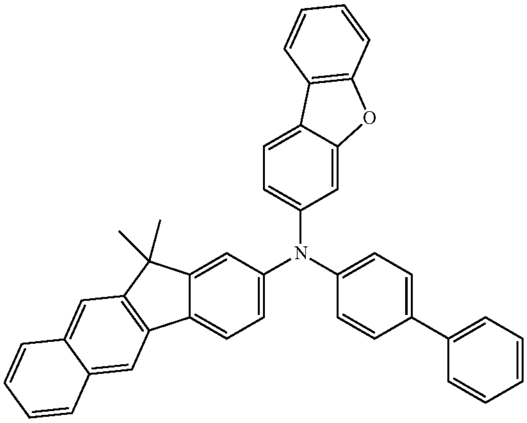
6-12
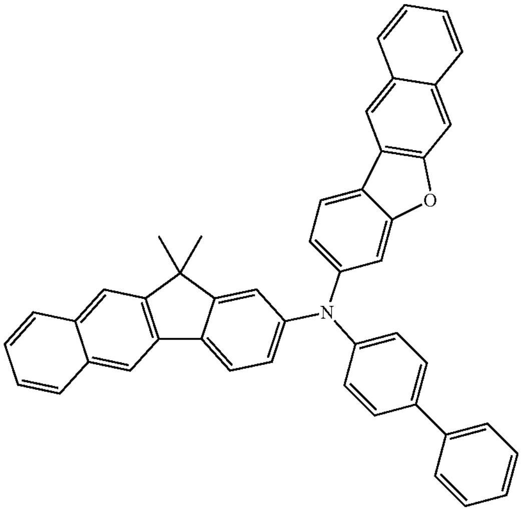
6-13
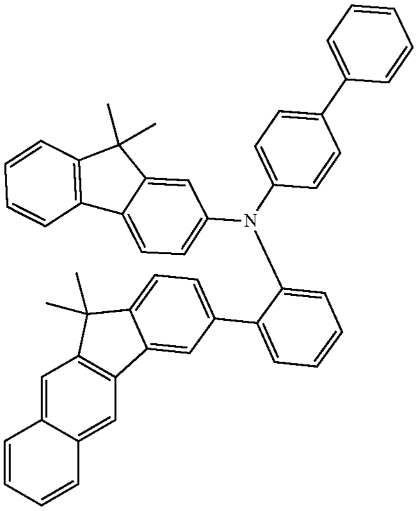

-continued
6-14
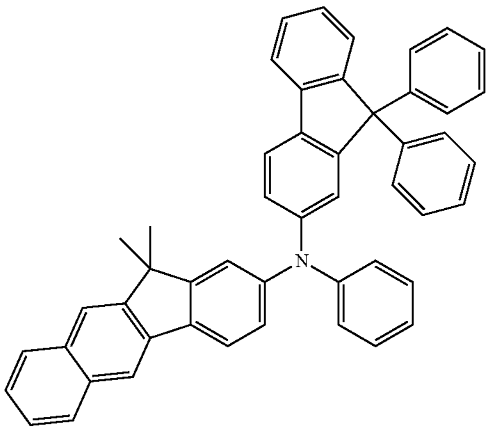
6-15
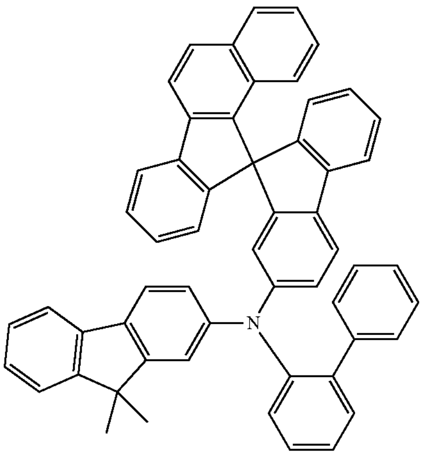
6-16
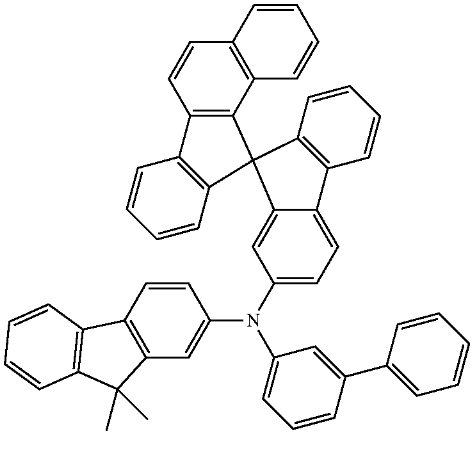
-continued
6-17
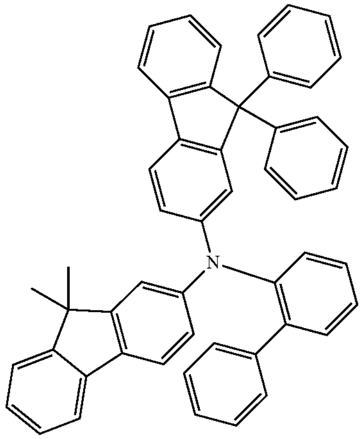
6-18
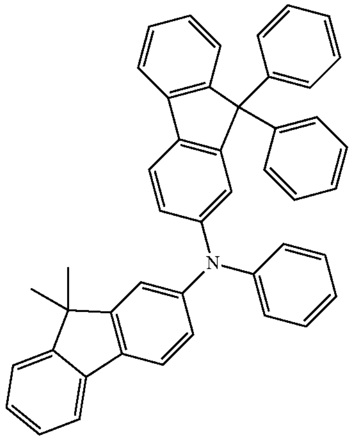
6-19
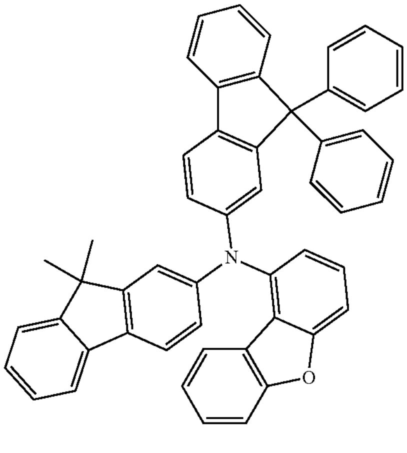

-continued
6-20
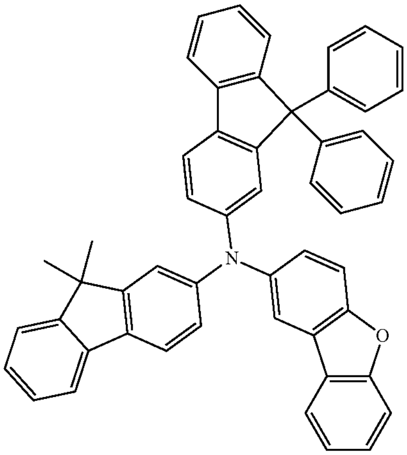
6-21
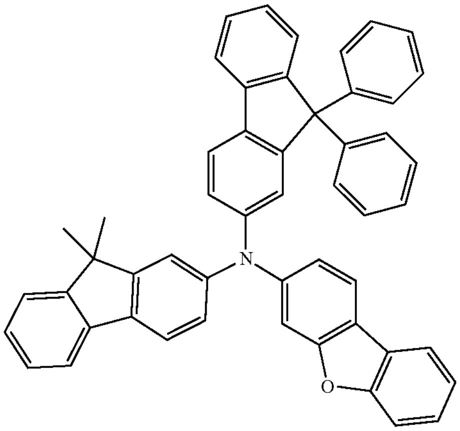
6-22
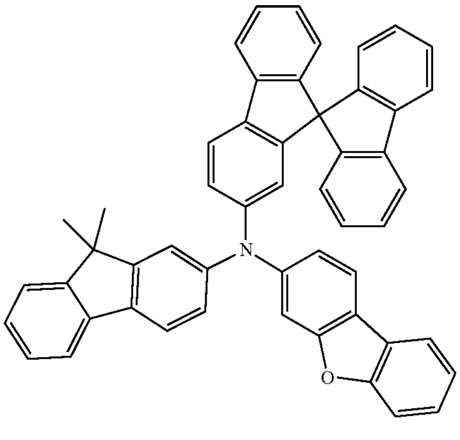
-continued
6-23
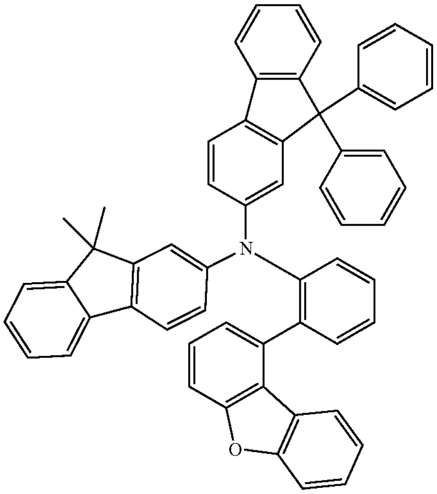
6-24
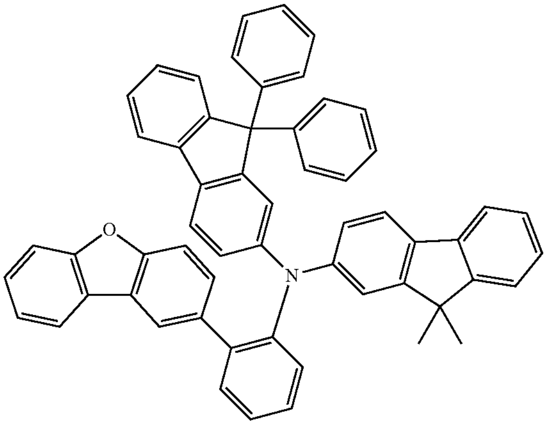
6-25
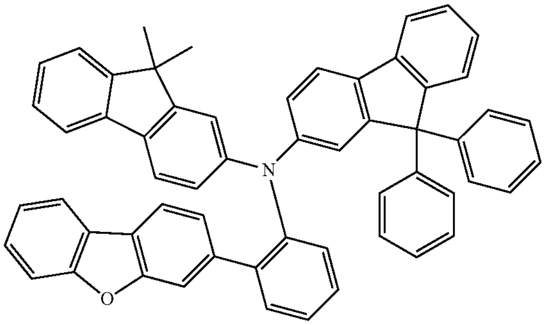
6-26
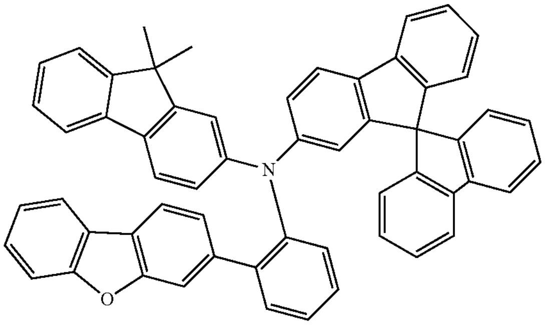

-continued
6-27
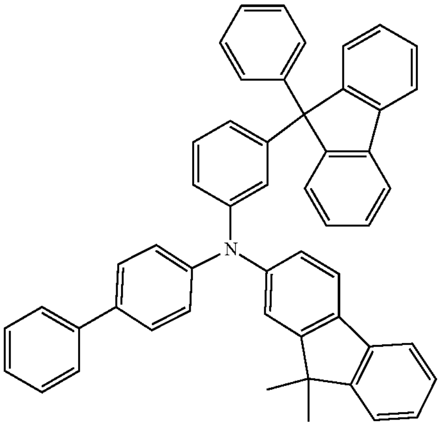
6-28
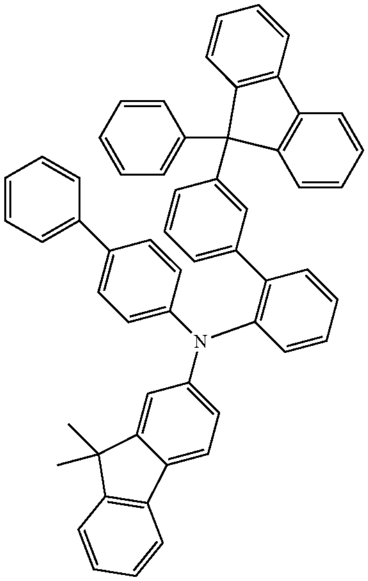
6-29
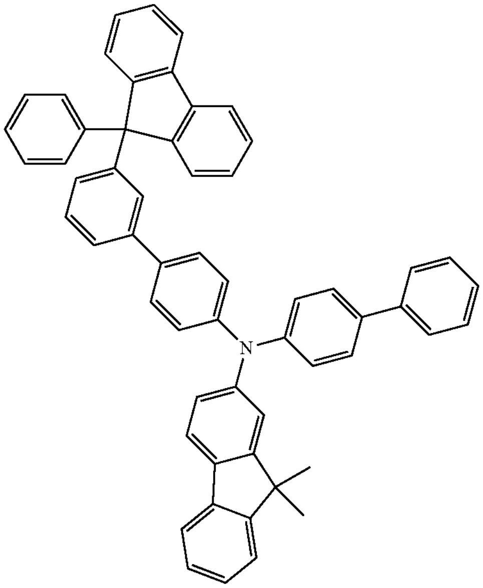
-continued
6-30
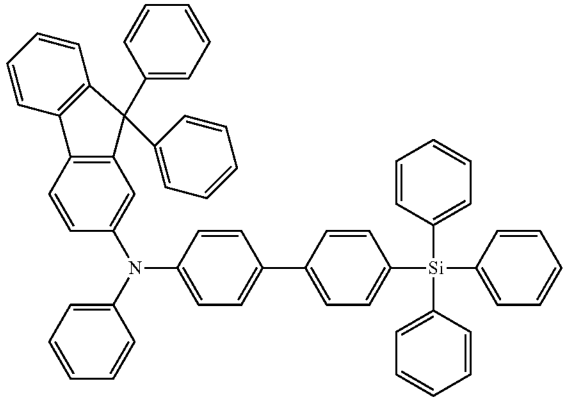
6-31
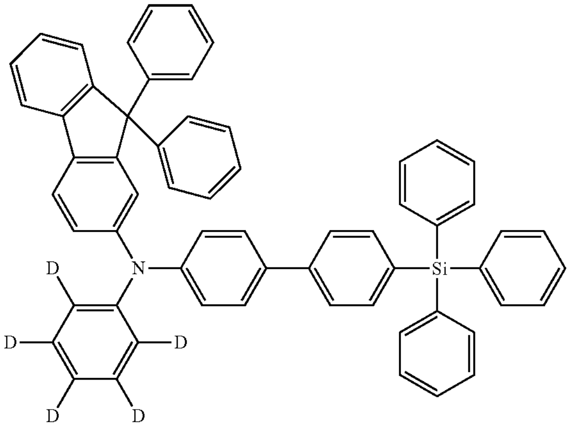
6-32
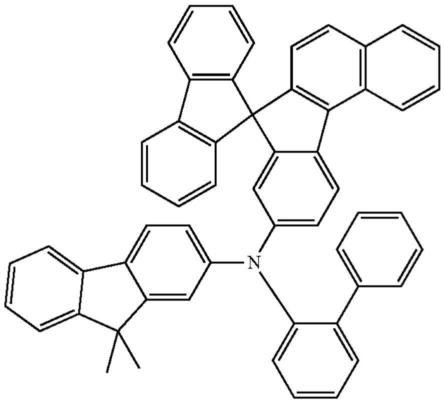

-continued
6-33
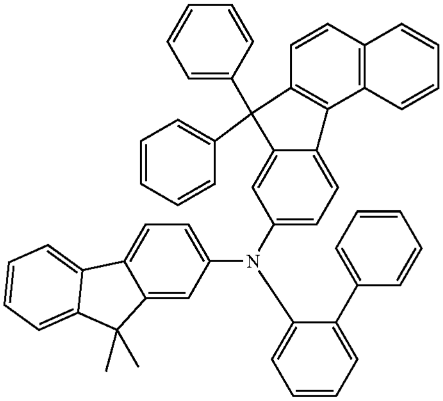
6-34
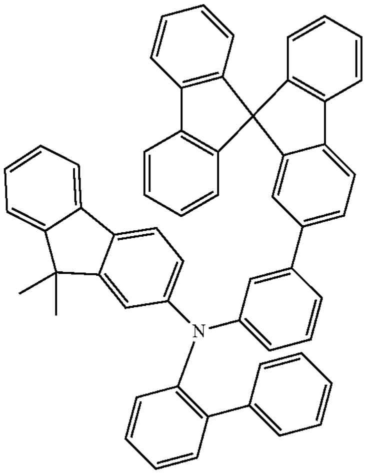
6-35
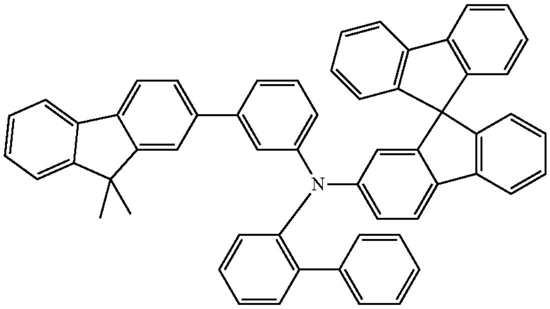
7-1
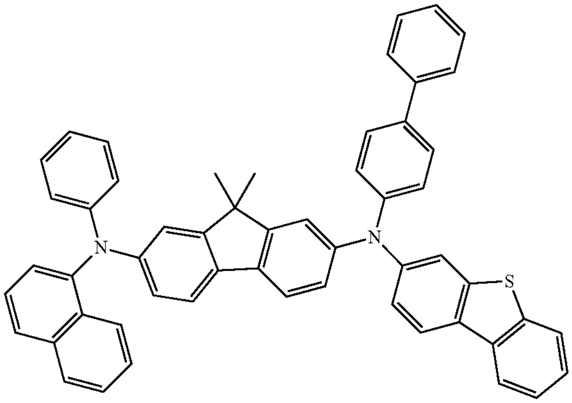
-continued
7-2
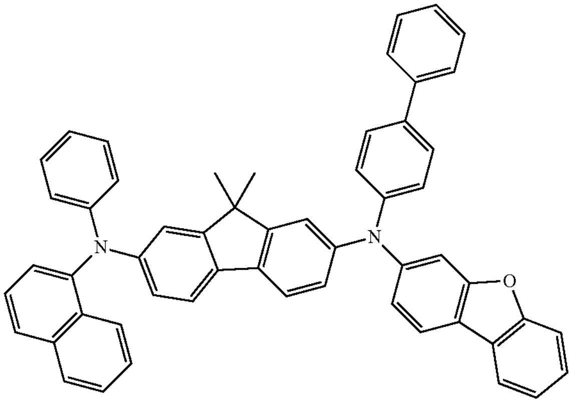
7-3
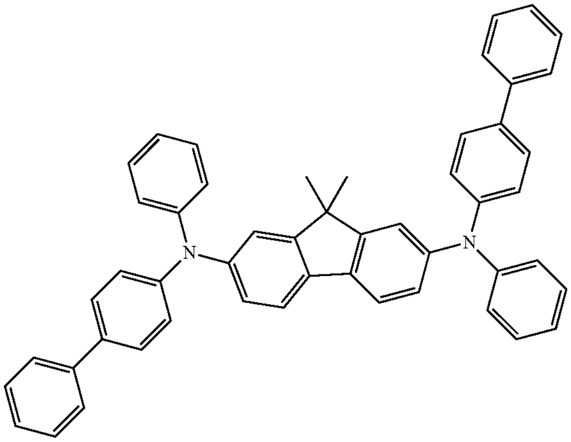
7-4
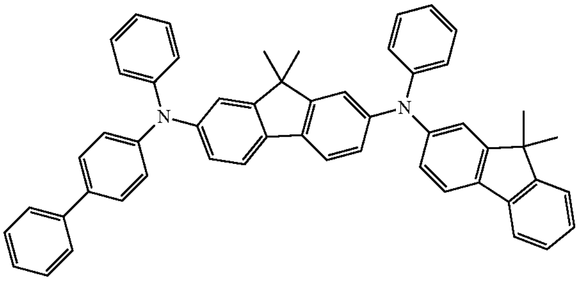

-continued
7-5
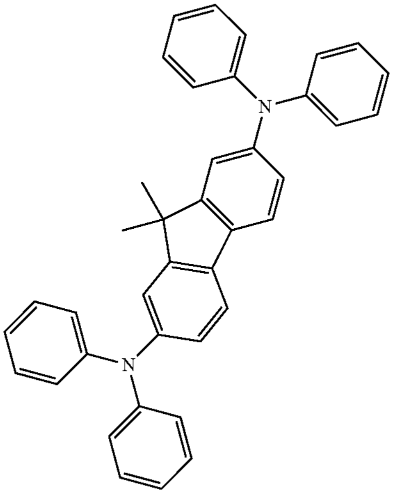
7-6
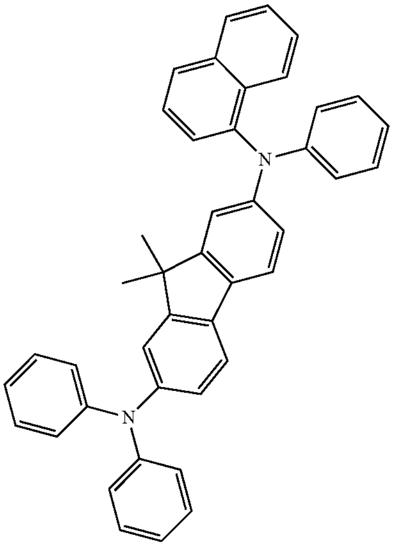
7-7
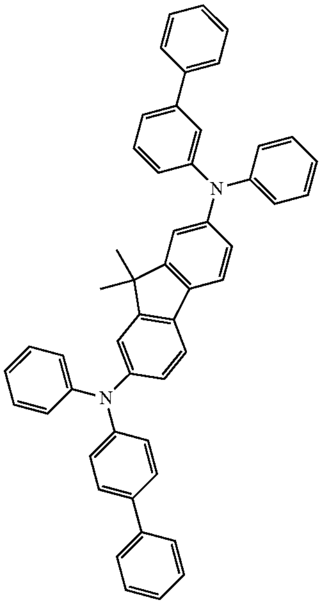
-continued
7-8
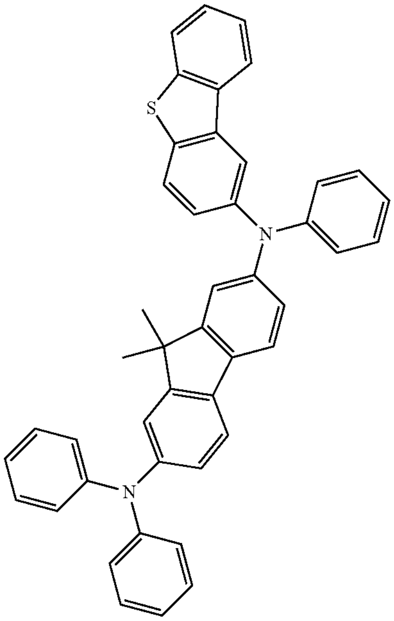
7-9
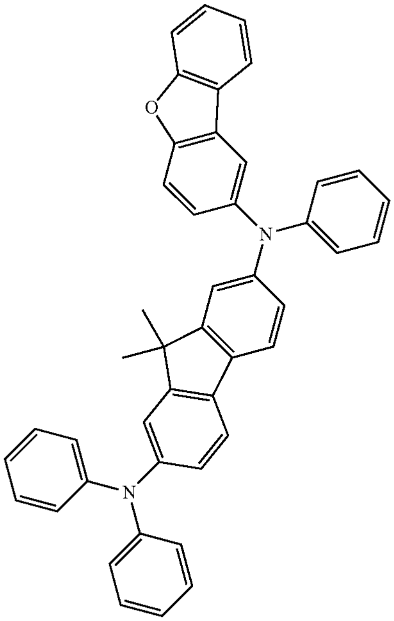

-continued
7-10
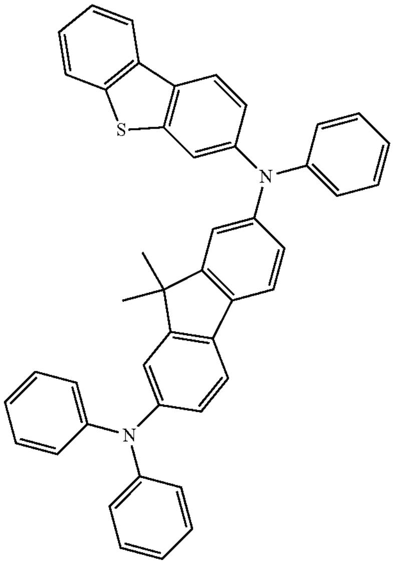
7-11
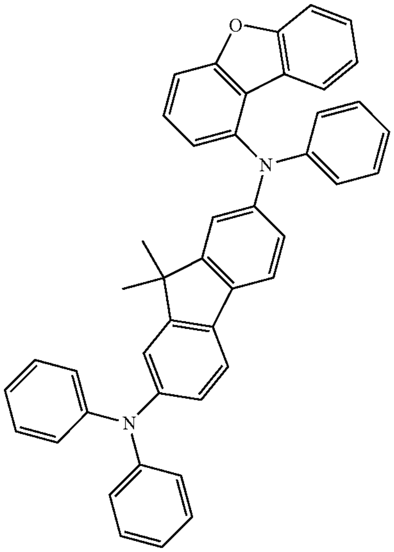
7-12
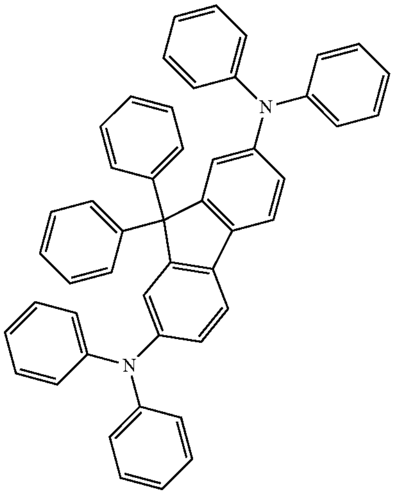
-continued
7-13
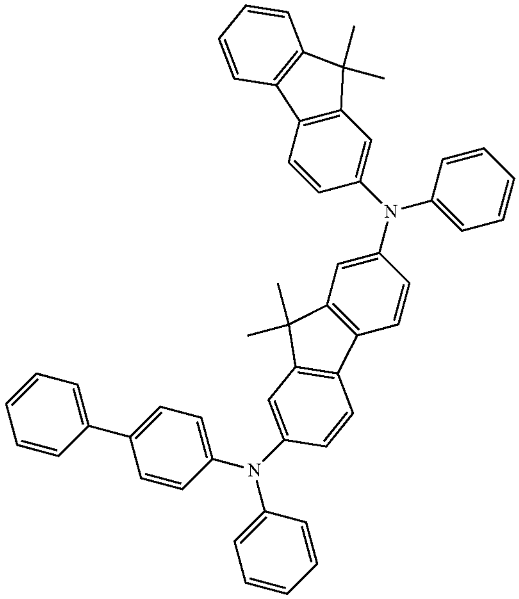
7-14
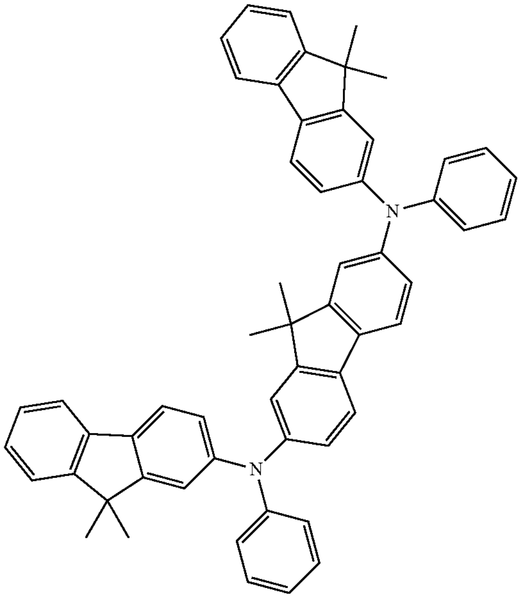

-continued
7-15
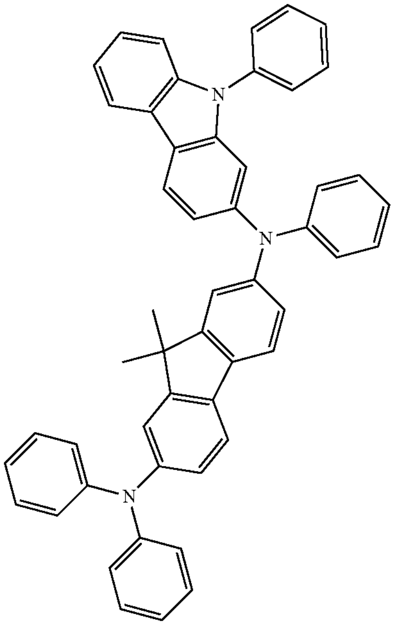
7-16
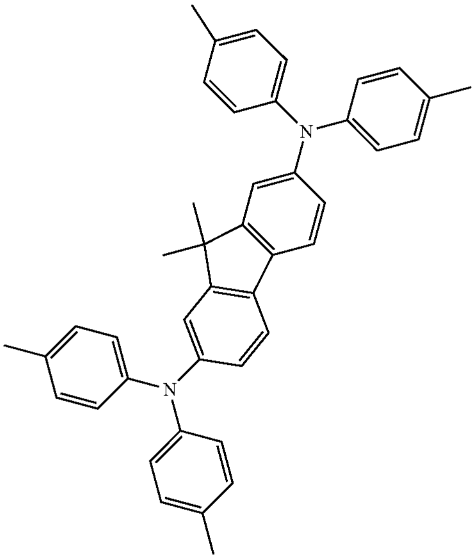
-continued
7-17
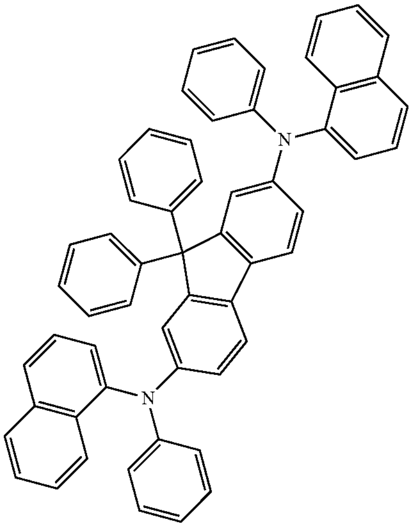
7-18
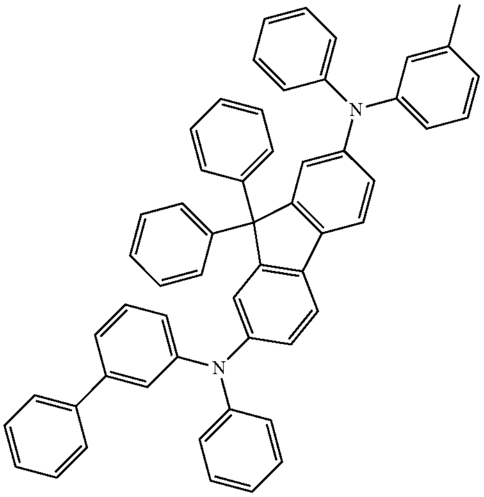
7-19
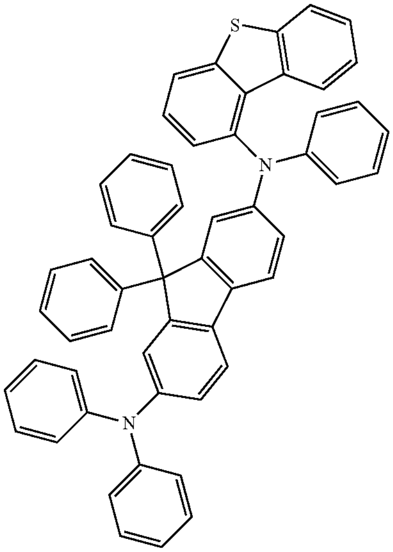

-continued
7-20
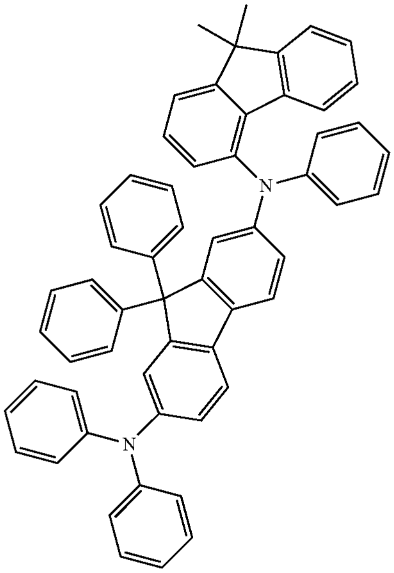
7-21
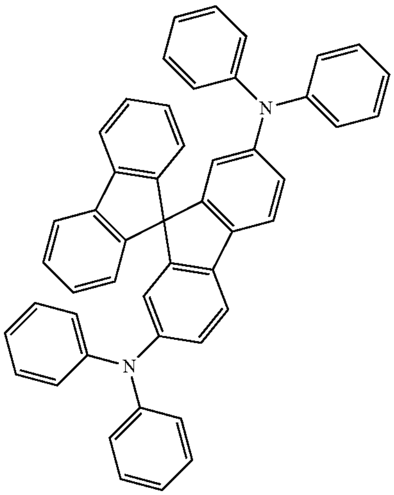
7-22
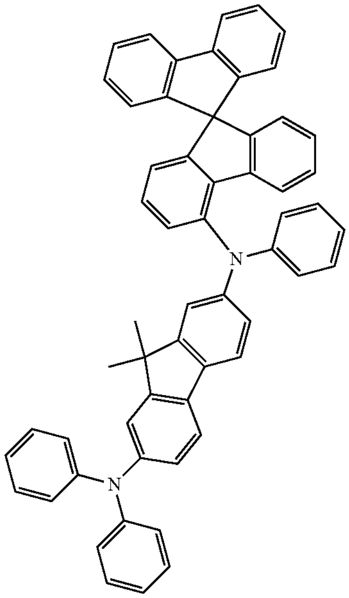
-continued
7-23
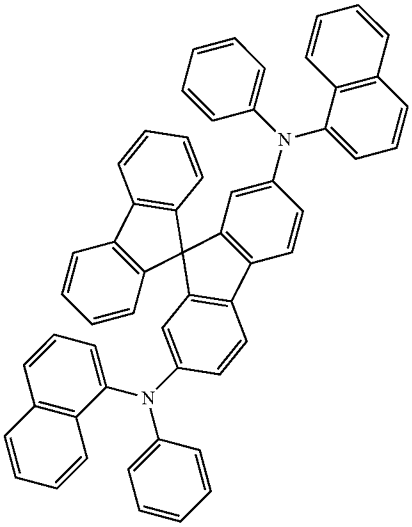
7-24
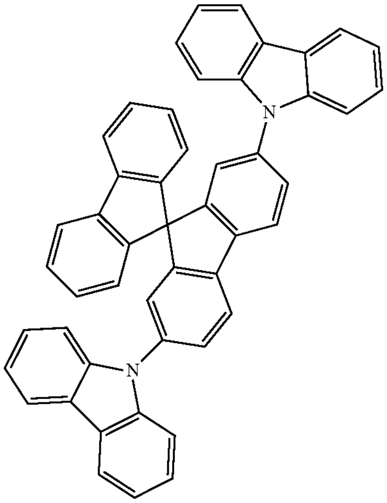
7-25
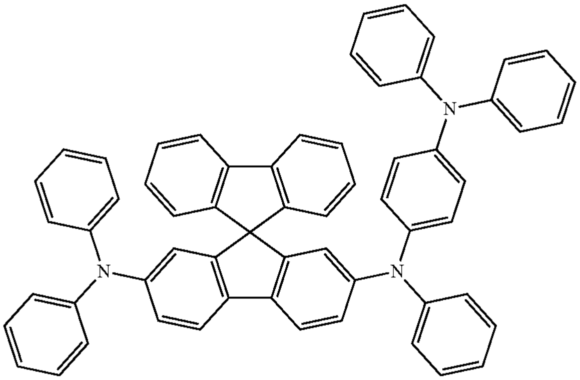

-continued
7-26
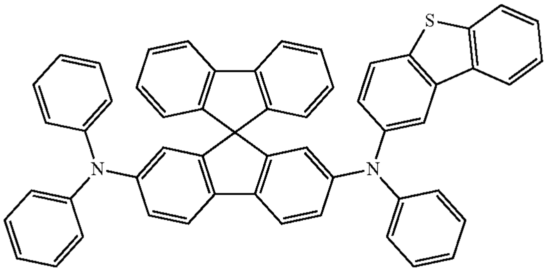
7-27
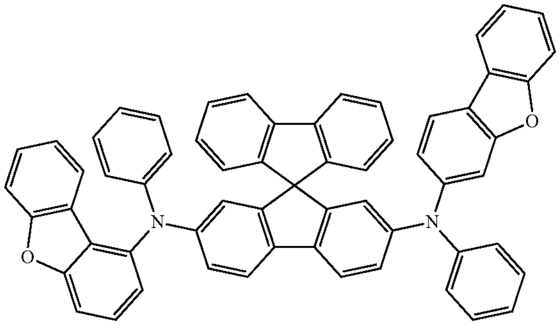
7-28
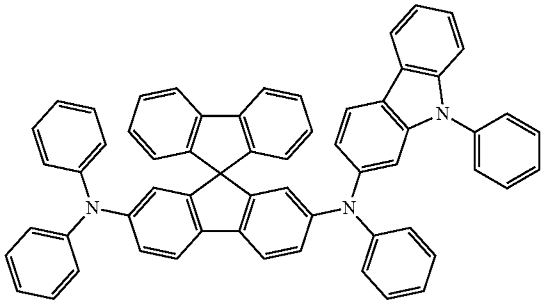
7-29
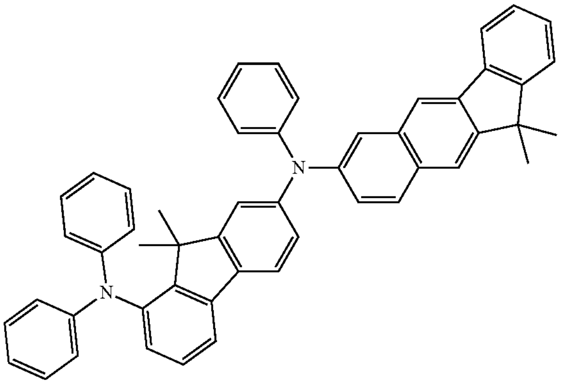
-continued
7-30
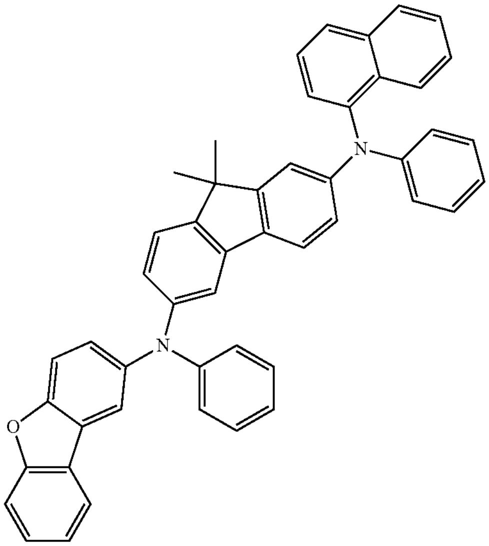
7-31
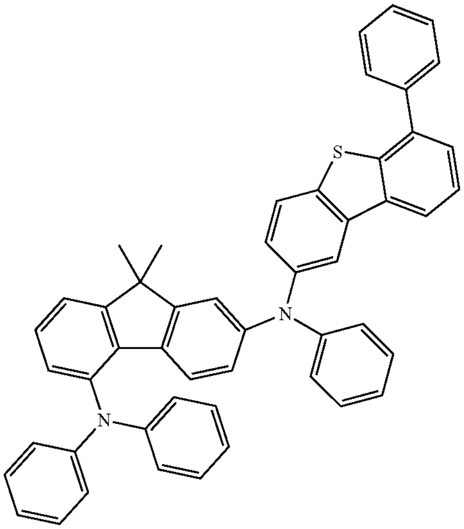
7-32
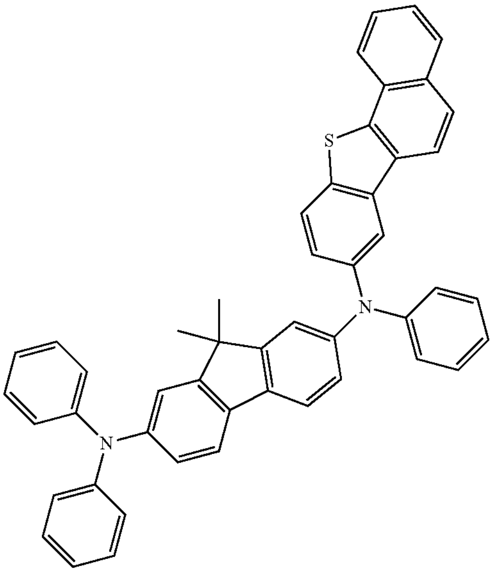

-continued
7-33
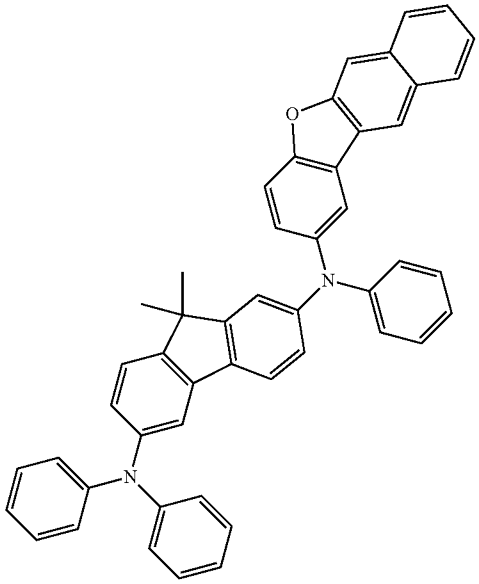
7-34
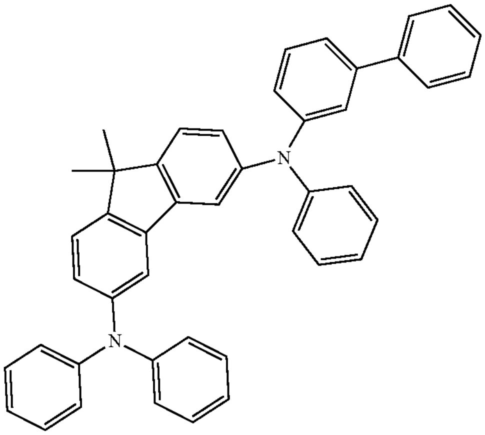
7-35
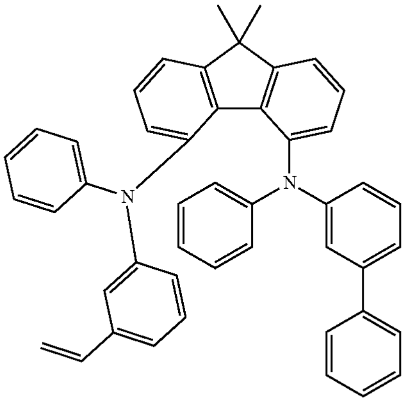
-continued
7-36
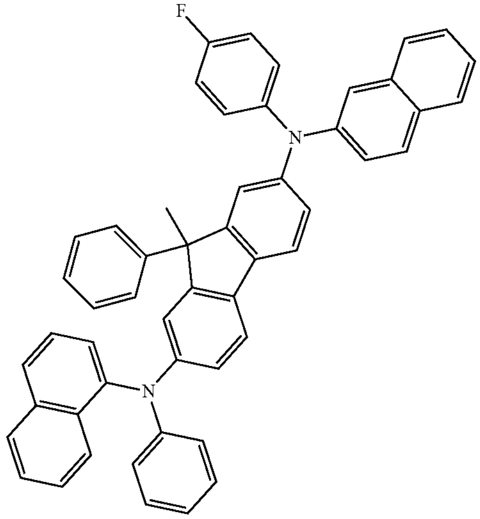
7-37
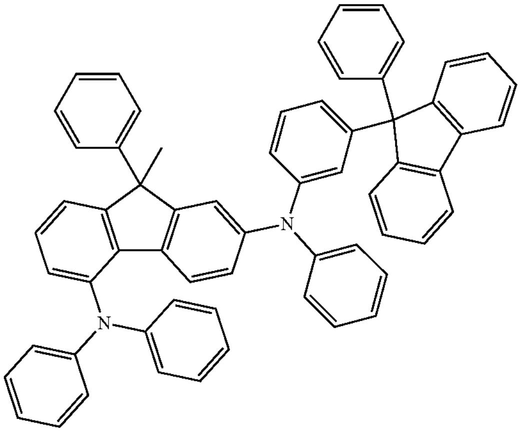
7-38
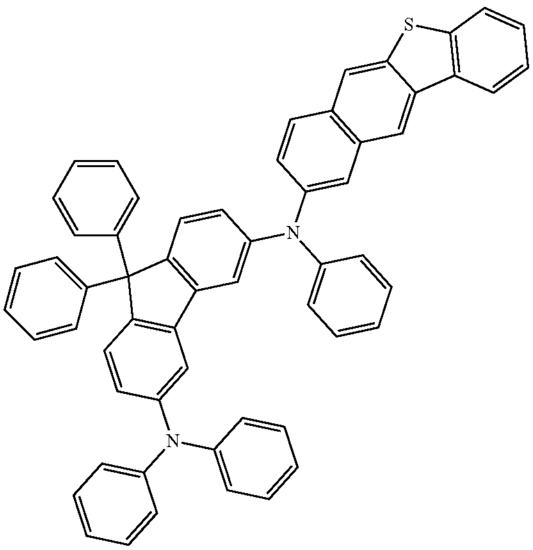

-continued
7-39
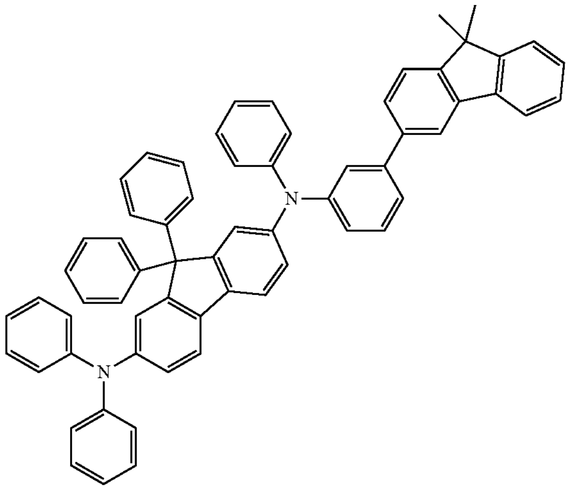
7-40
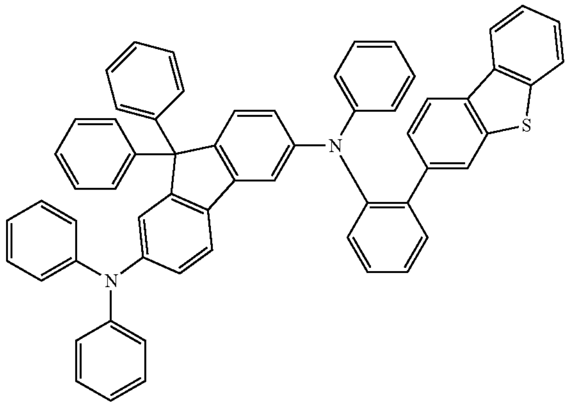
7-41
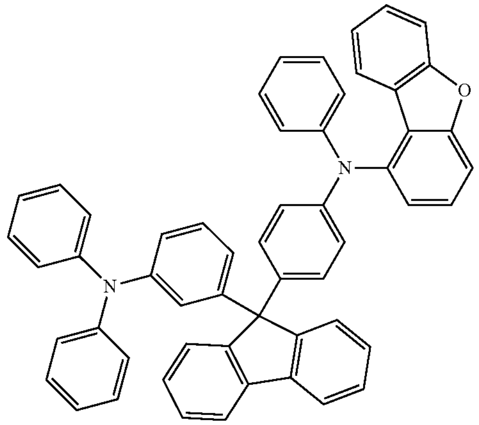
-continued
7-42
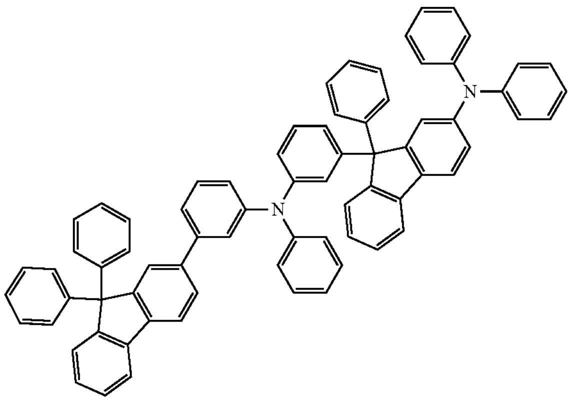
7-43
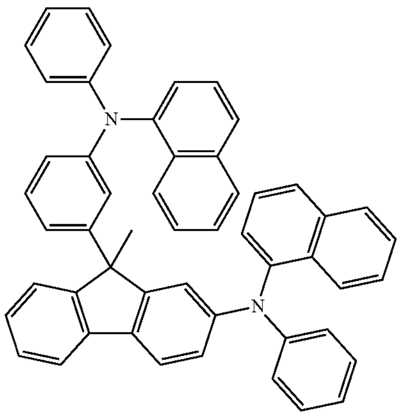
7-44
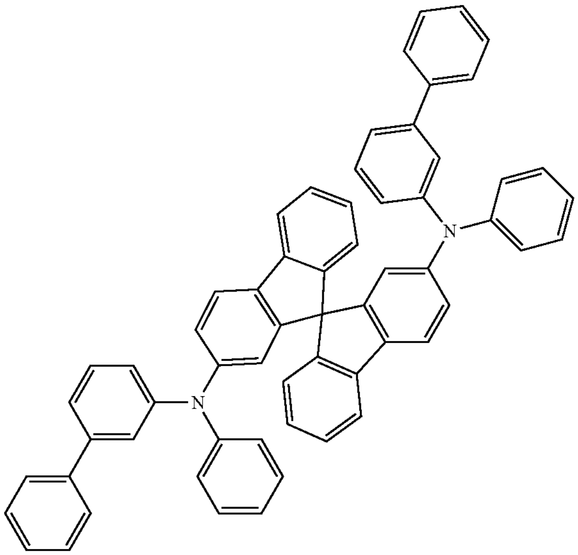

-continued
7-45
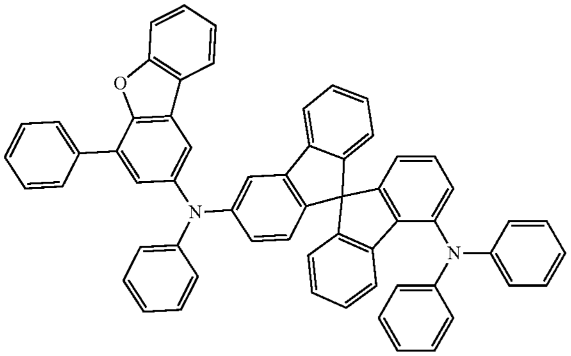
7-46
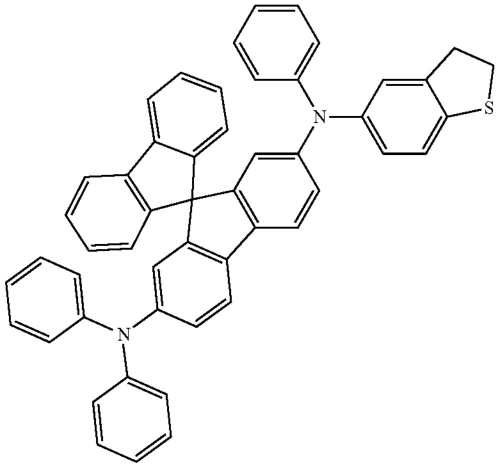
7-47
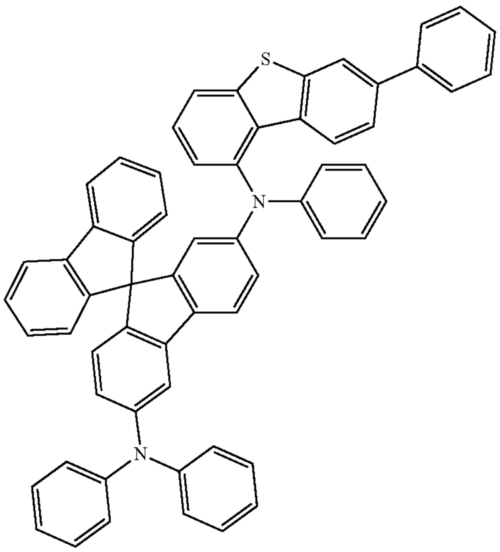
-continued
7-48
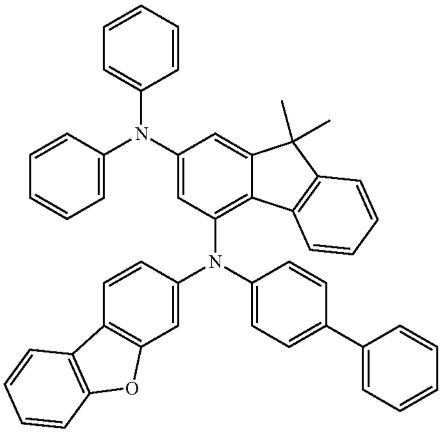
7-49
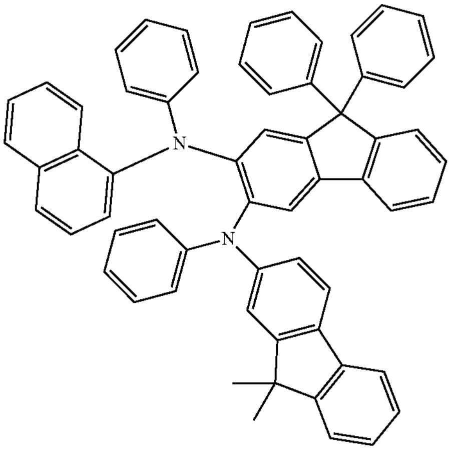
7-50
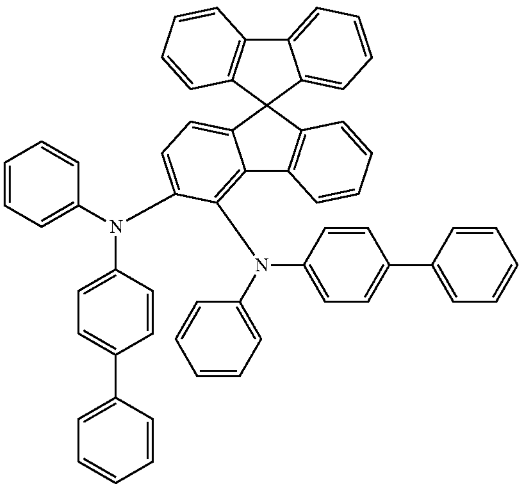

-continued
7-51
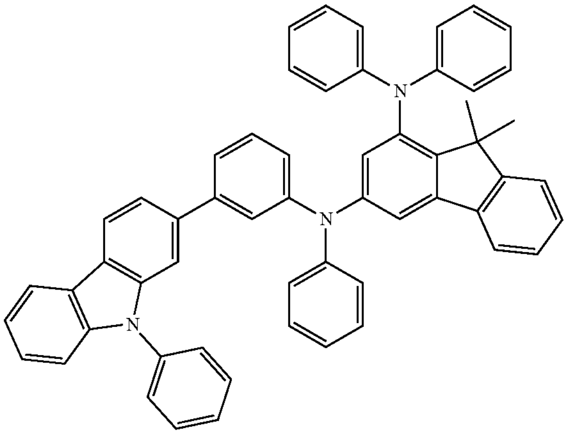
8-1
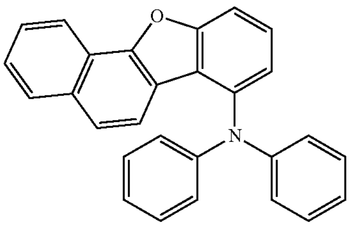
8-2
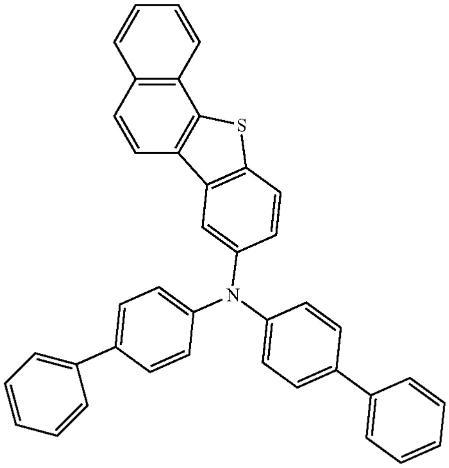
8-3
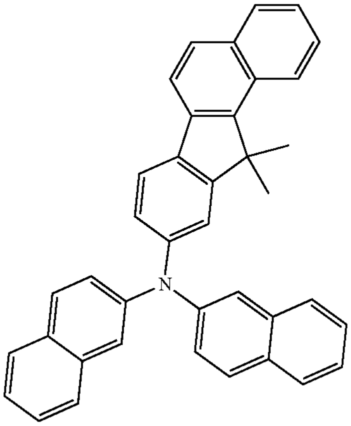
-continued
8-4
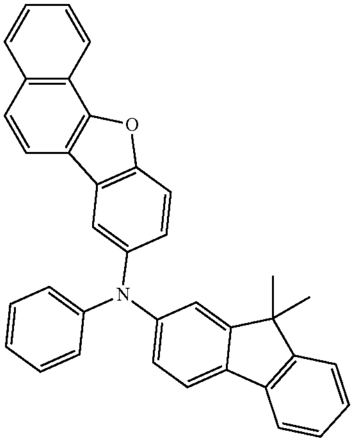
8-5
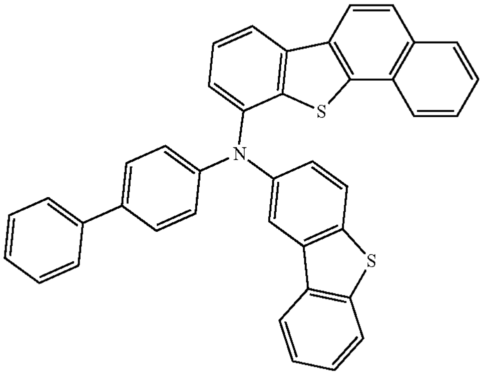
8-6
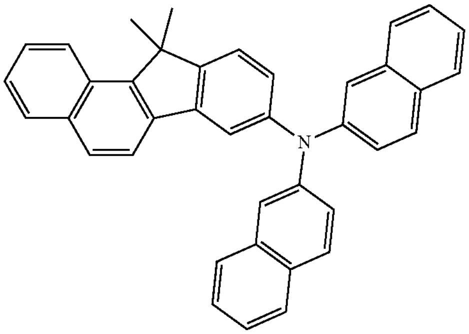
8-7
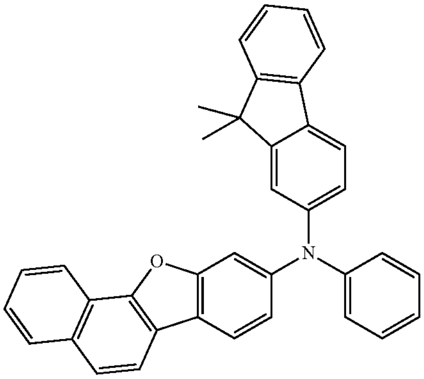

-continued
8-8
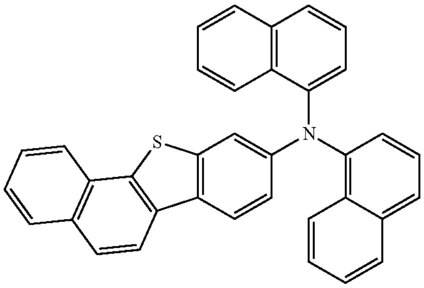
8-9
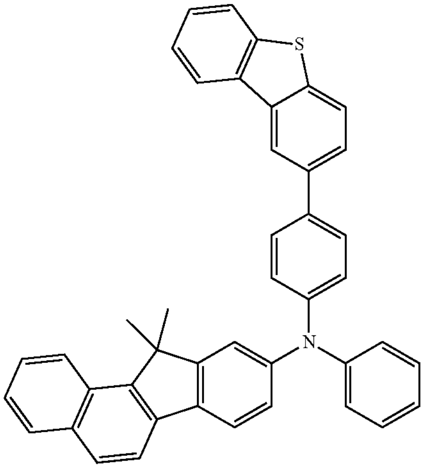
8-10
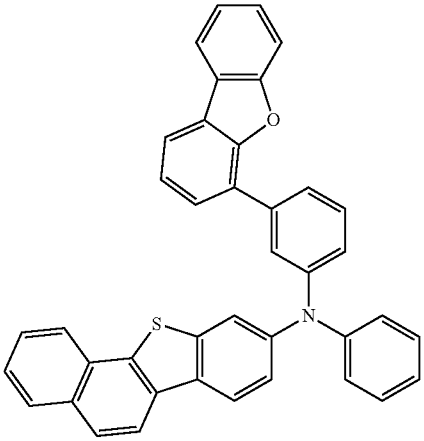
-continued
8-11
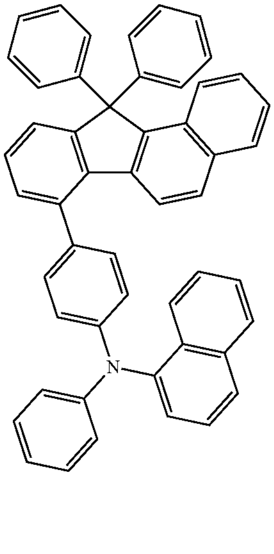
8-12
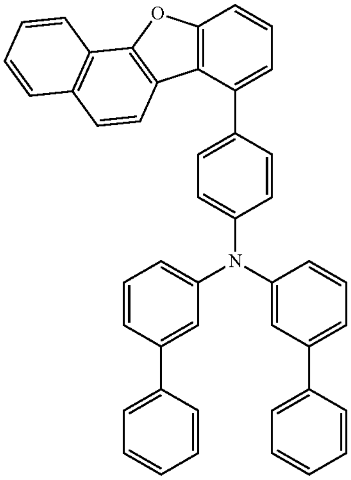
8-13
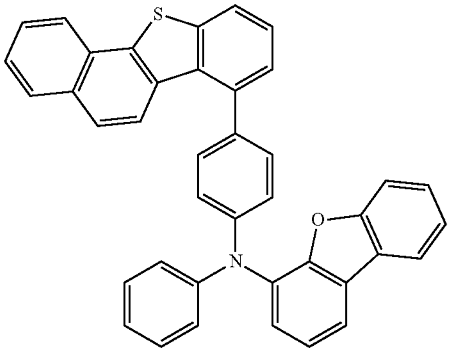

-continued
8-14
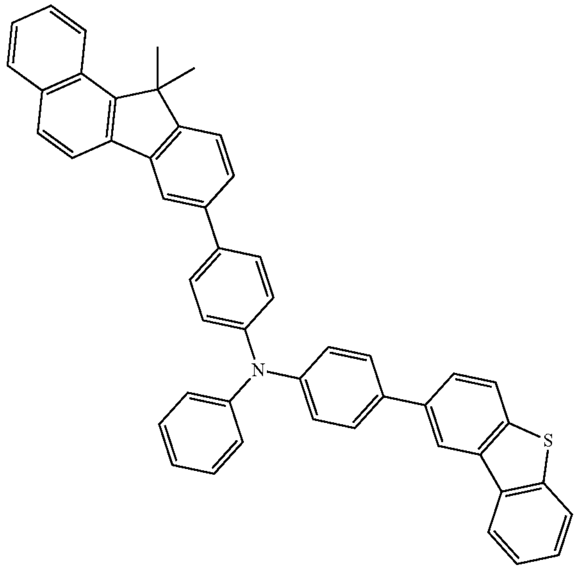
8-15
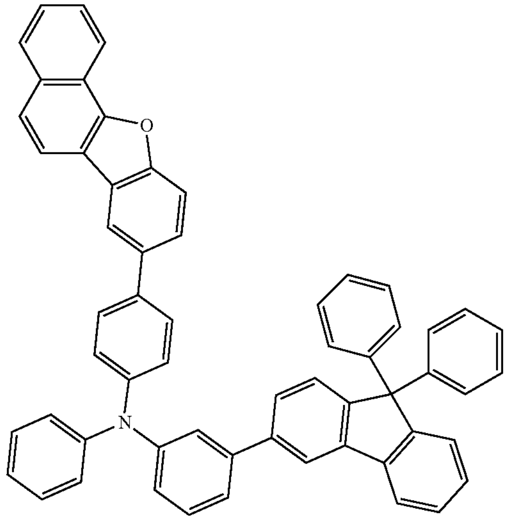
8-16
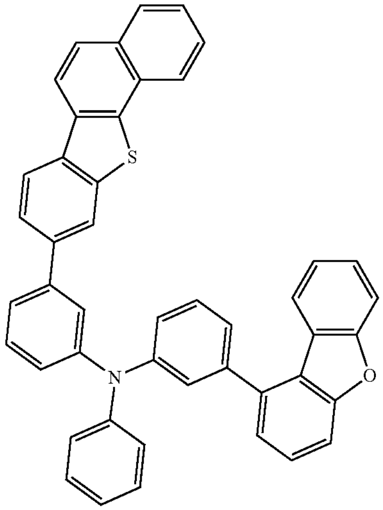
-continued
8-17
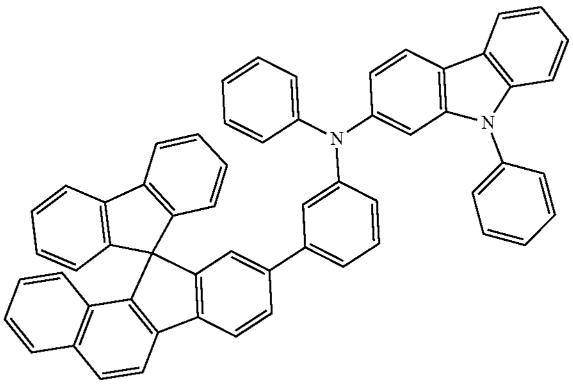
8-18
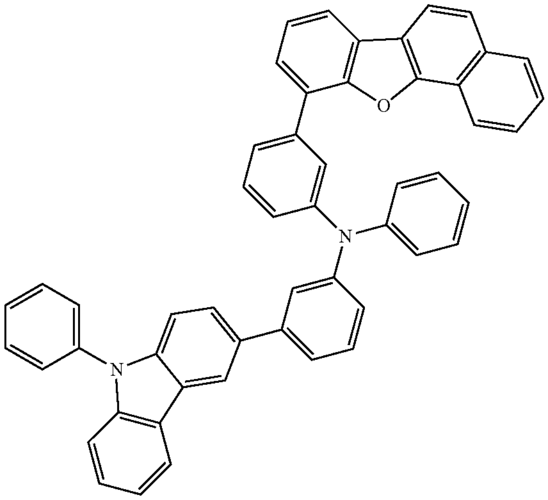
8-19
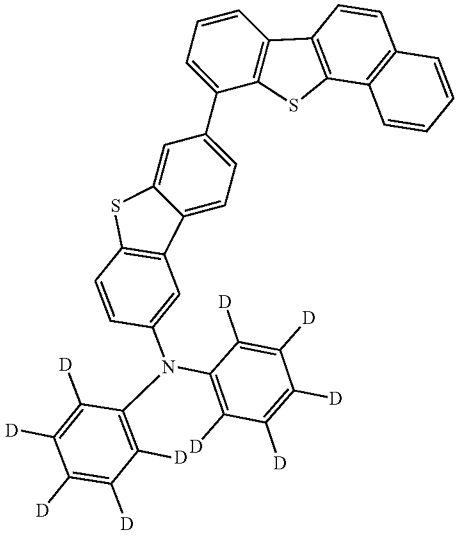

-continued
8-20
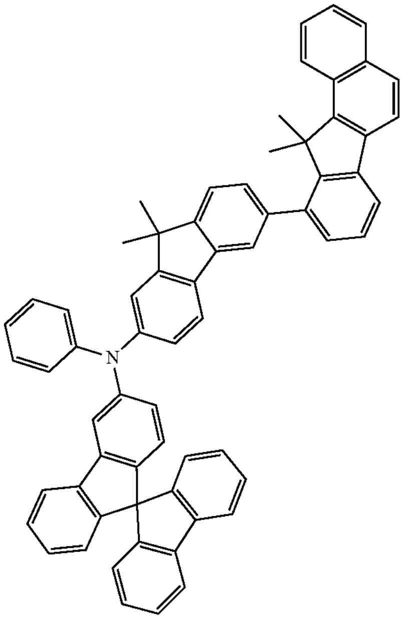
8-21
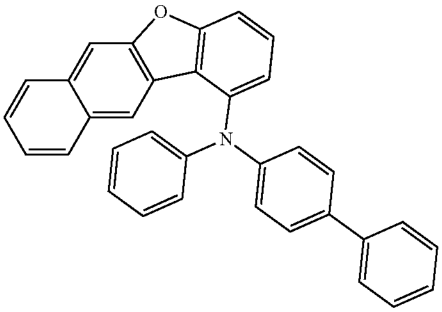
8-22
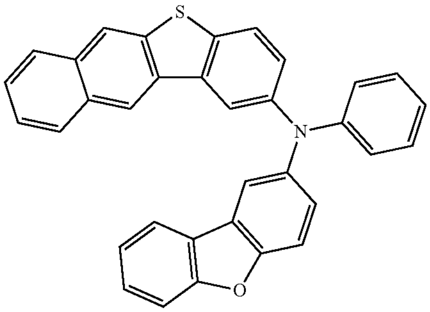
8-23
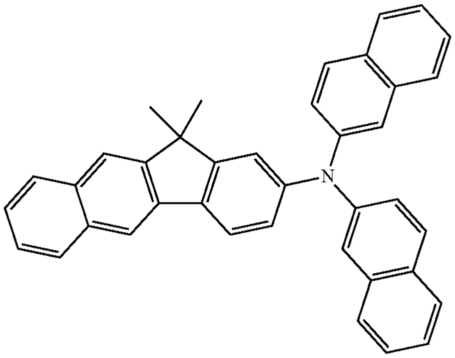
-continued
8-24
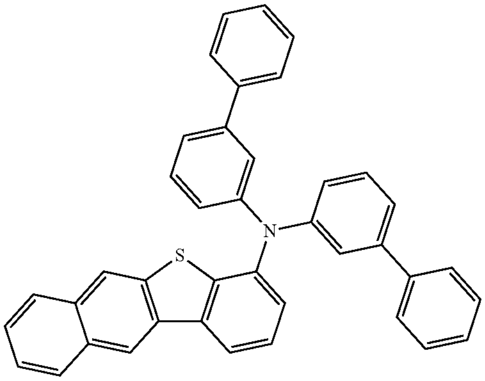
8-25
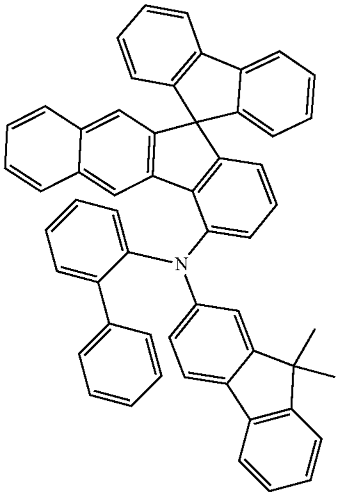
8-26
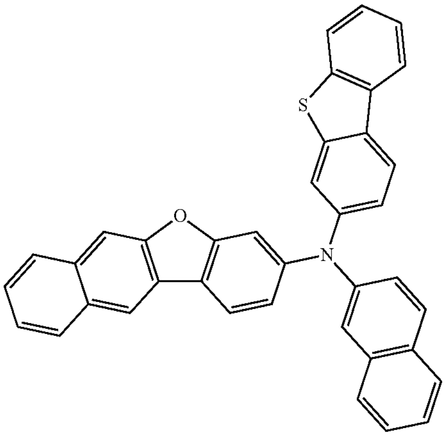

-continued
8-27
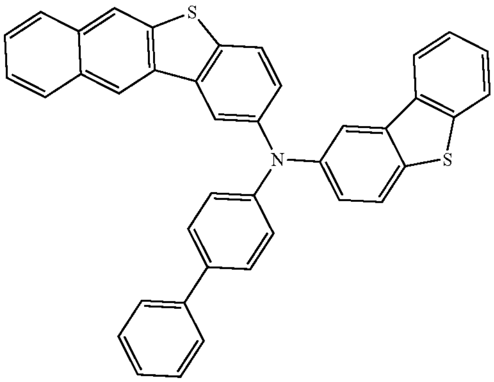
8-28
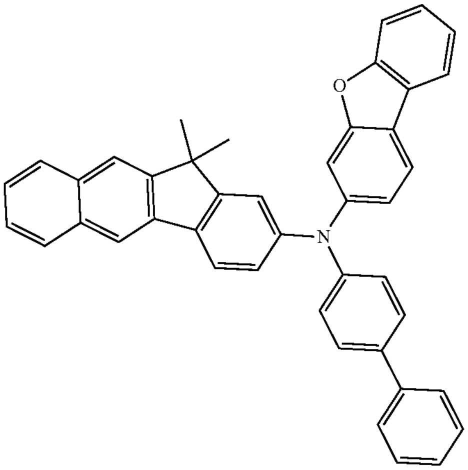
8-29
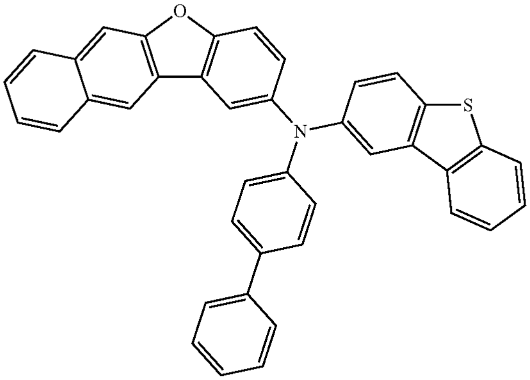
-continued
8-30
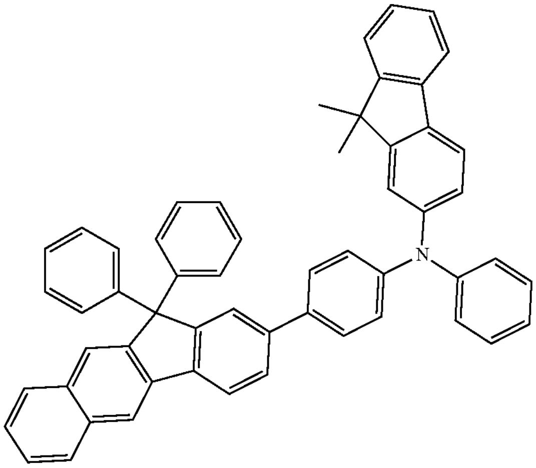
8-31
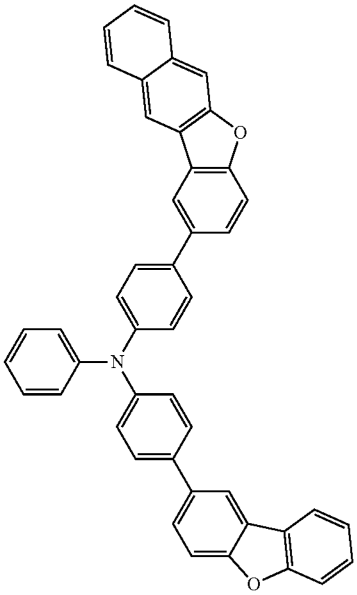
8-32
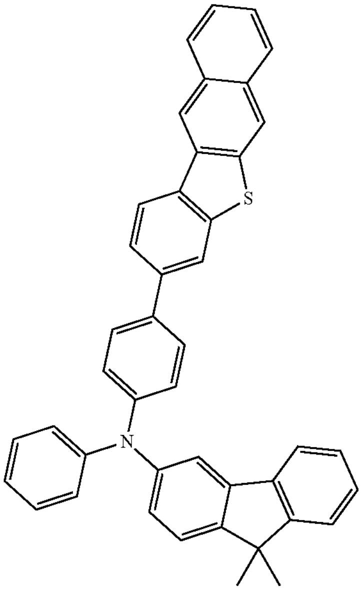

-continued
8-33
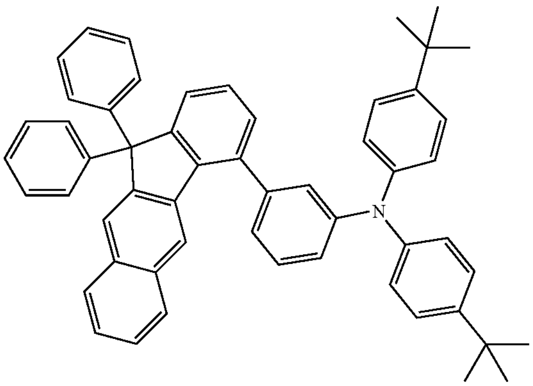
8-34
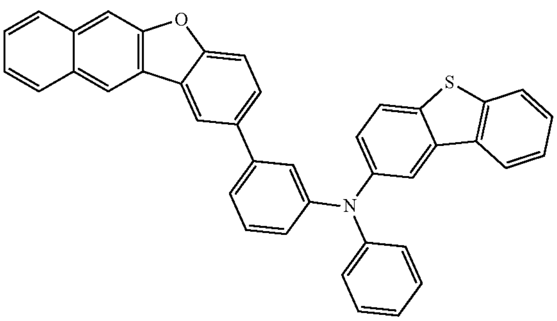
8-35
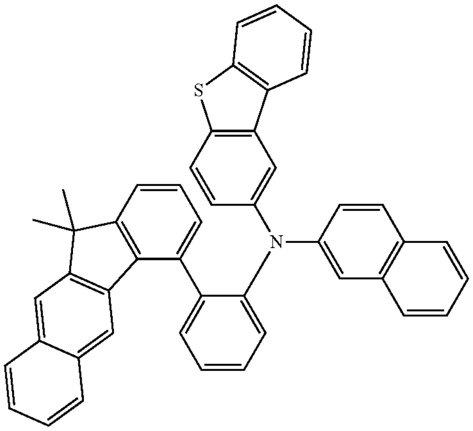
8-36
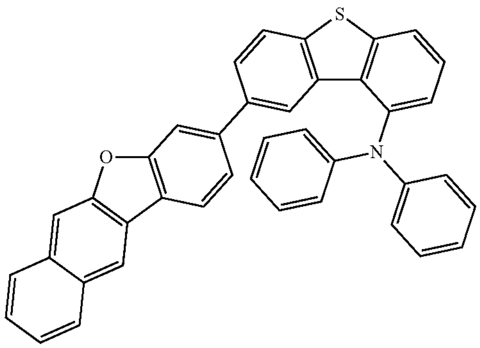
-continued
8-37
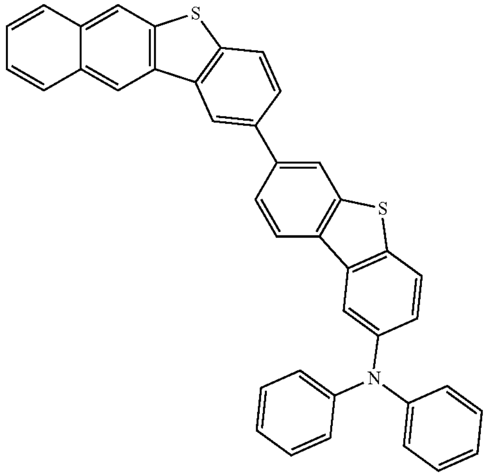
8-38
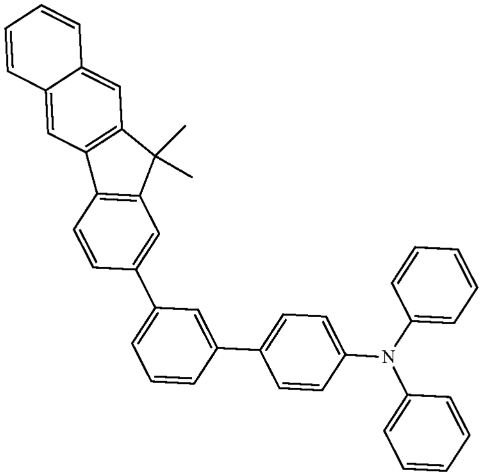
8-39
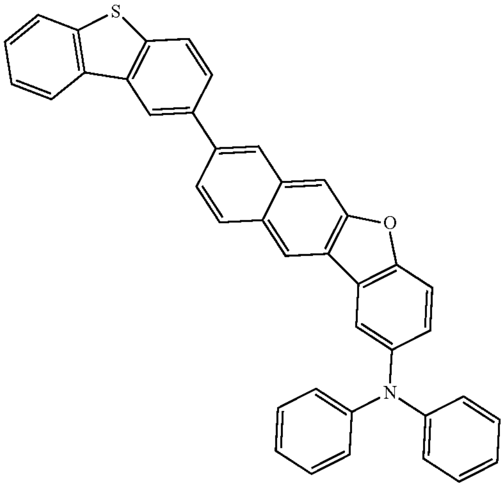

-continued
8-40
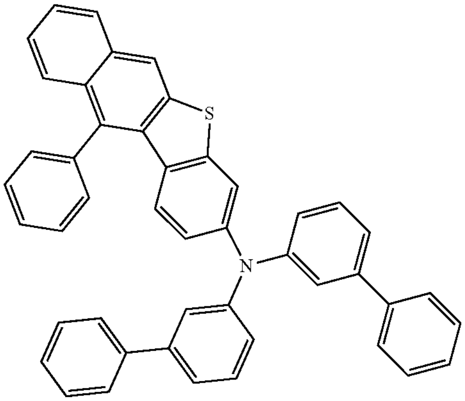
8-41
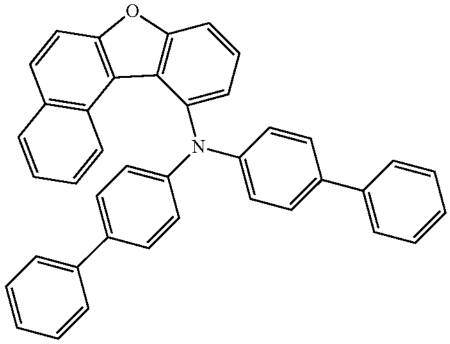
8-42
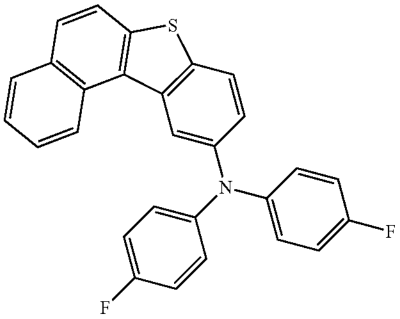
8-43
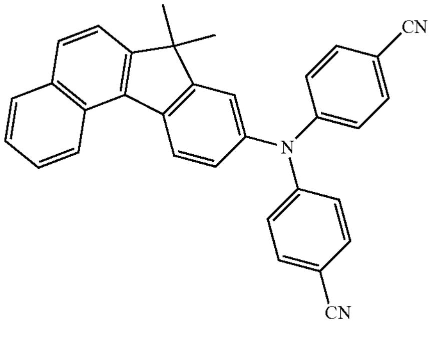
-continued
8-44
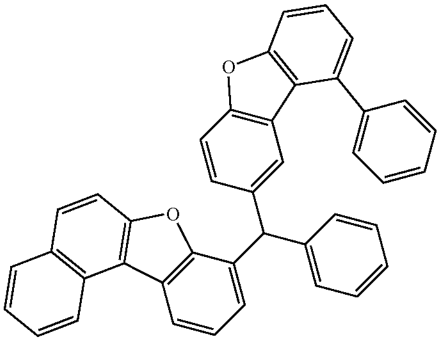
8-45
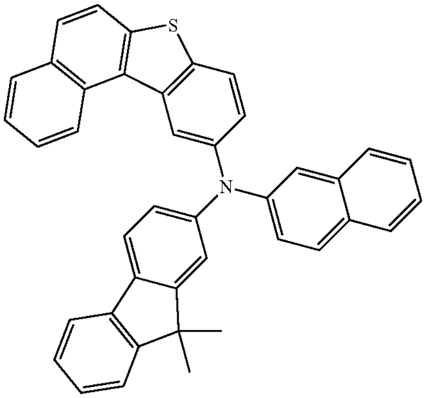
8-46
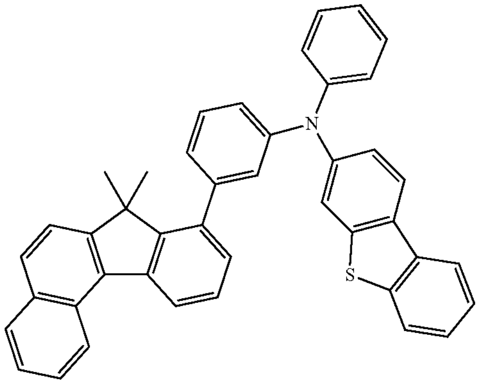
8-47
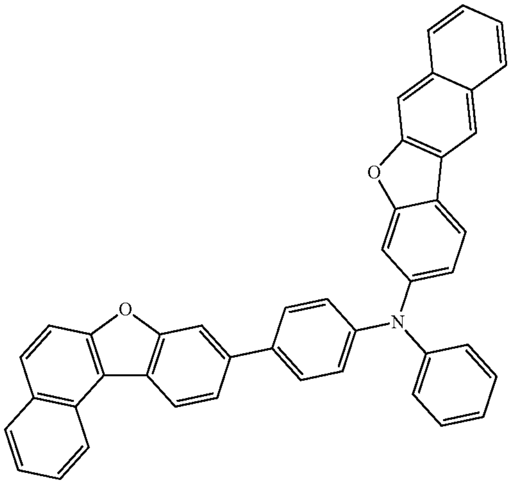

-continued
8-48
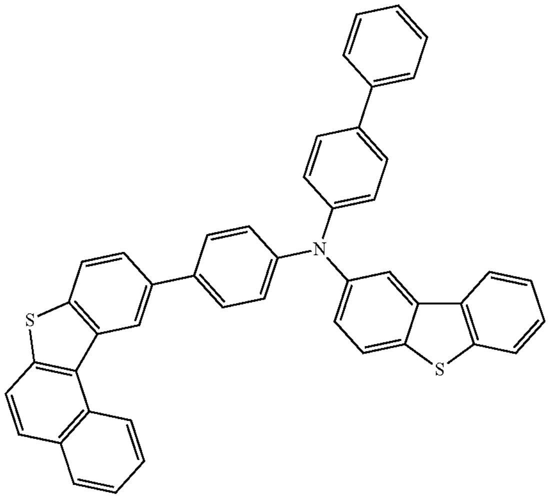
8-49
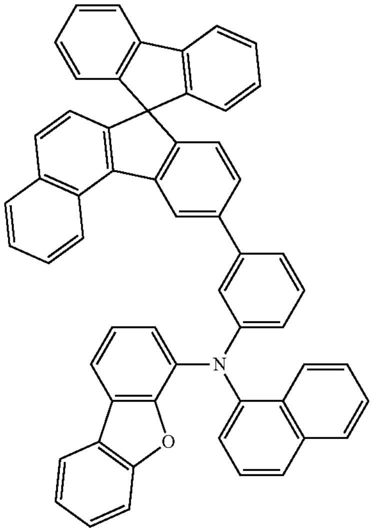
8-50
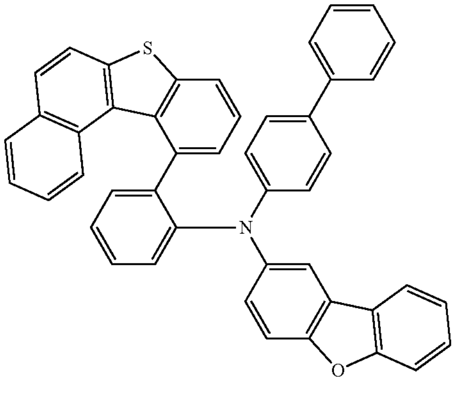
8-51
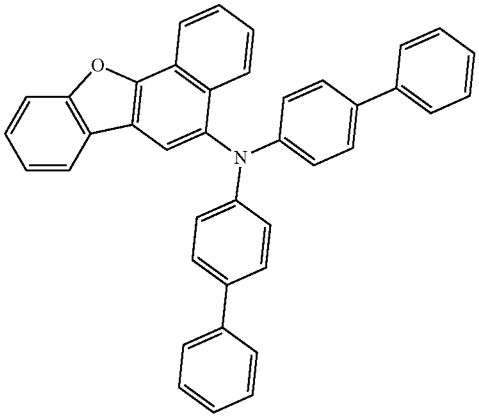
8-52
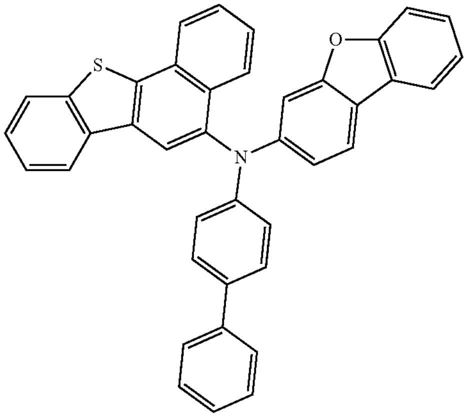
8-53
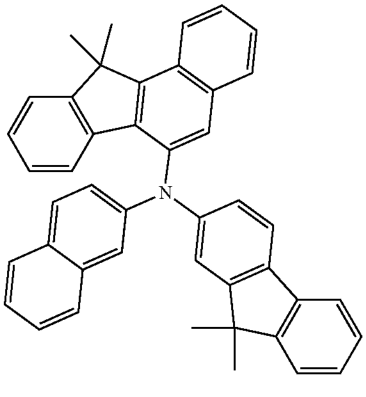

8-54
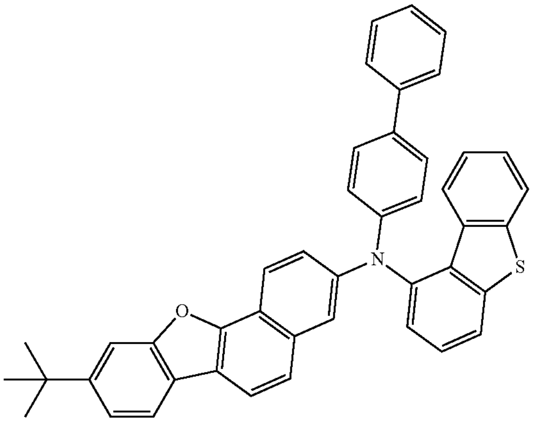
8-55
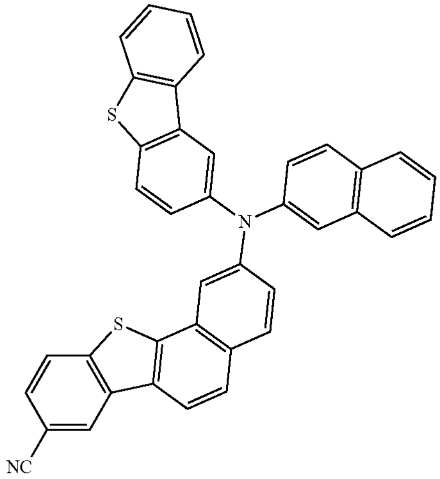
8-56
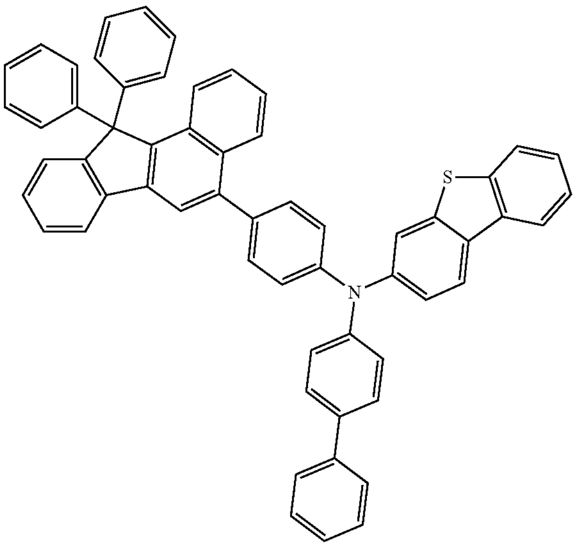
8-57
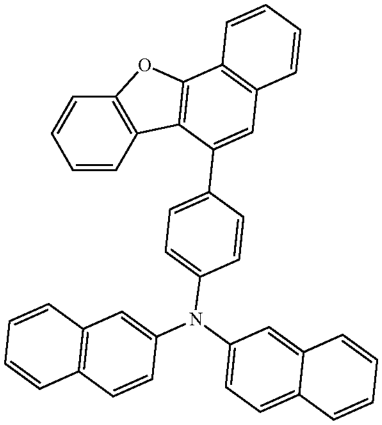
8-58
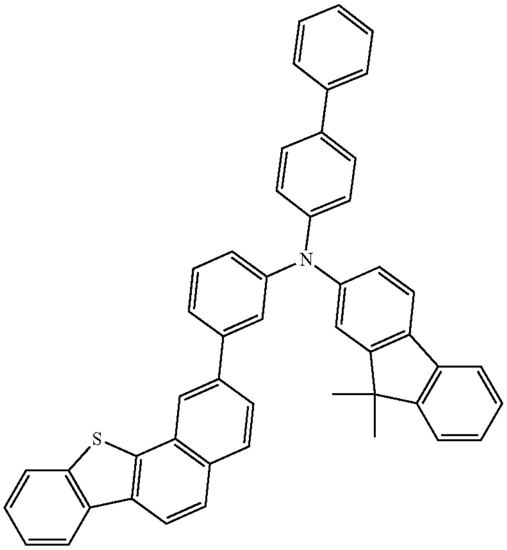
8-59
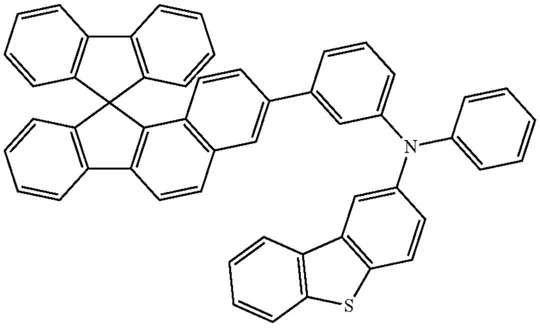

-continued
8-60
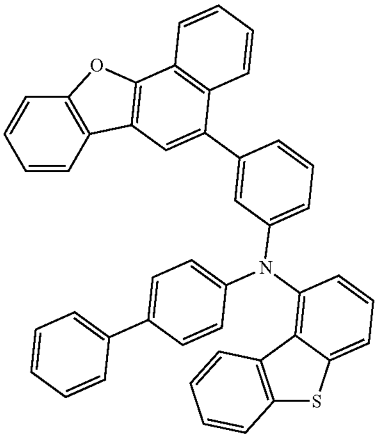
8-61
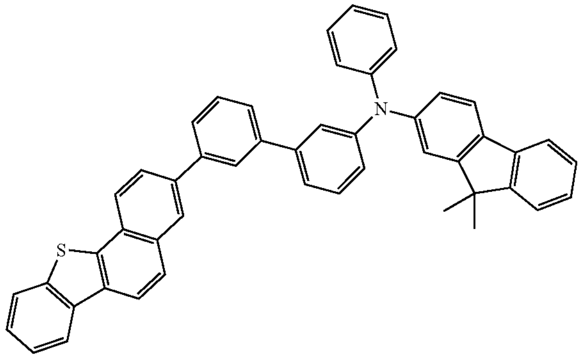
8-62
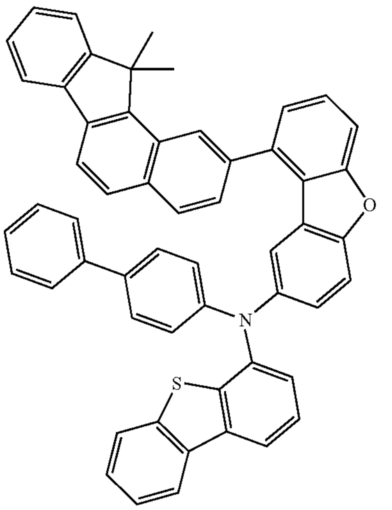
-continued
8-63
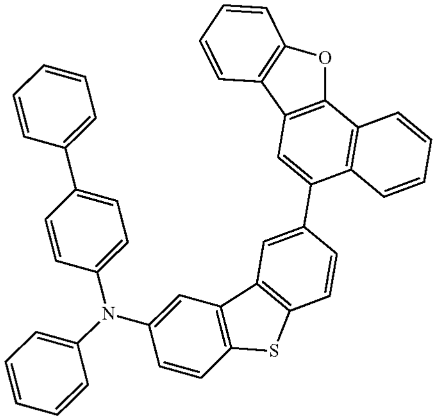
8-64
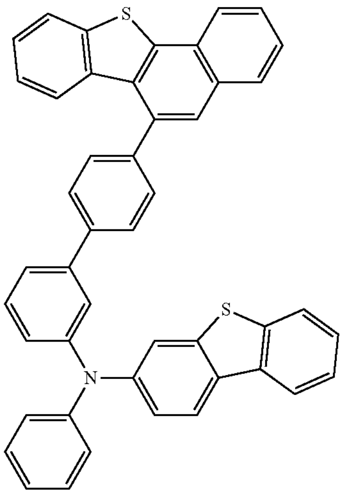
8-65
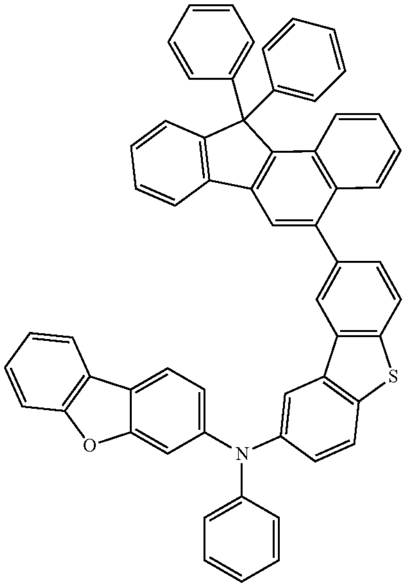

-continued
8-66
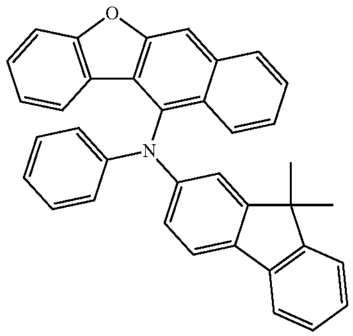
8-67
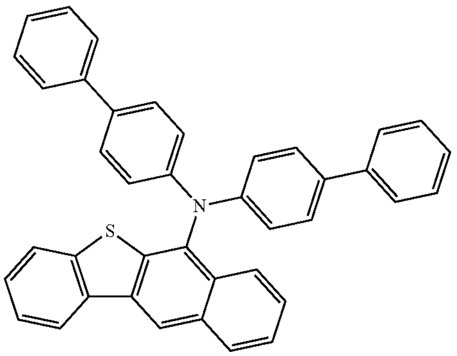
8-68
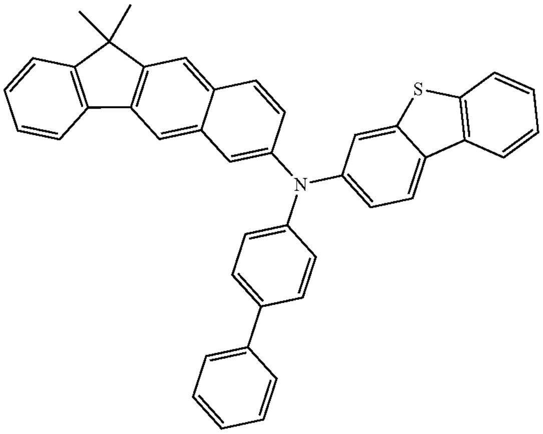
8-69
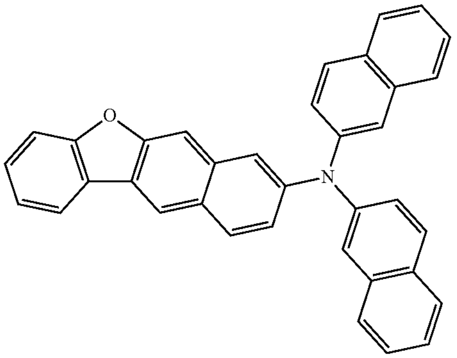
-continued
8-70
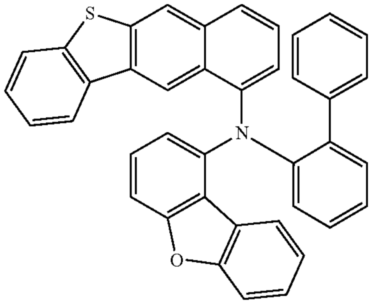
8-71
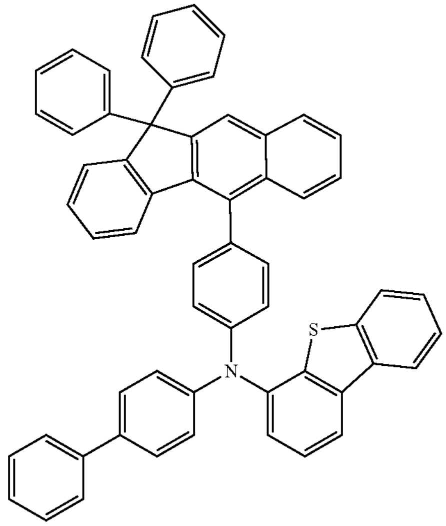
8-72
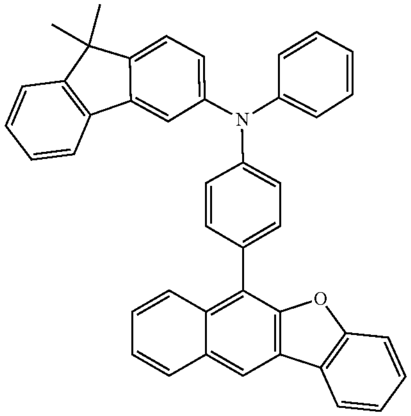

-continued
8-73
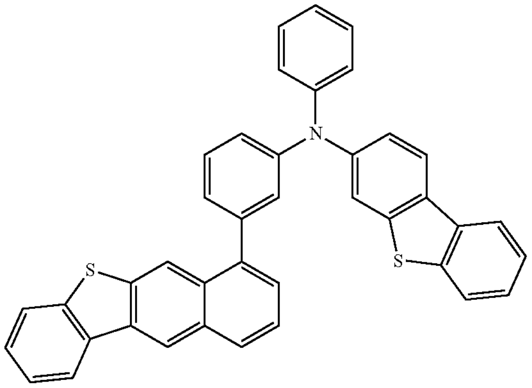
8-74
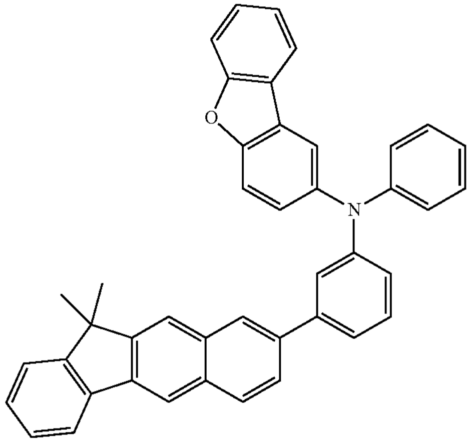
8-75
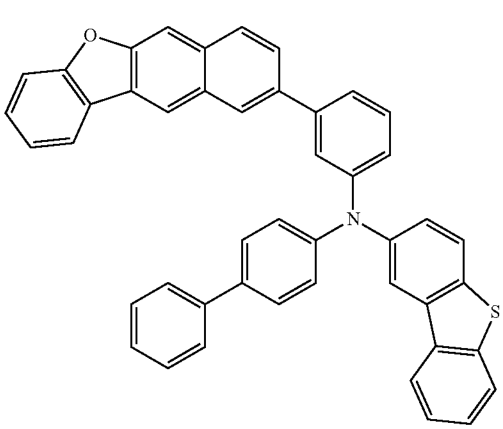
-continued
8-76
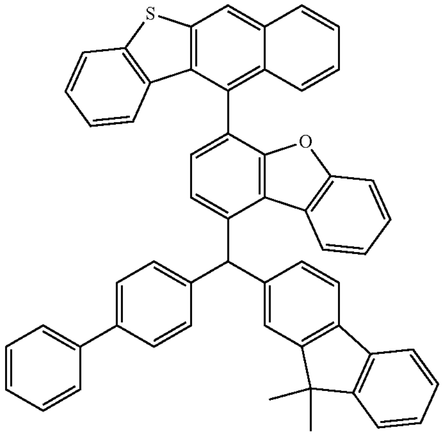
8-77
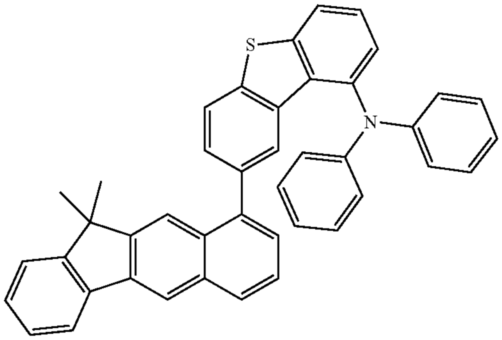
8-78
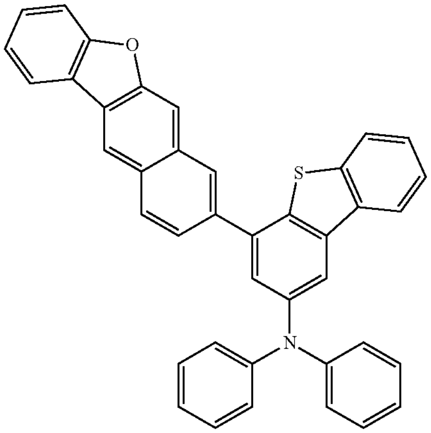

-continued
8-79
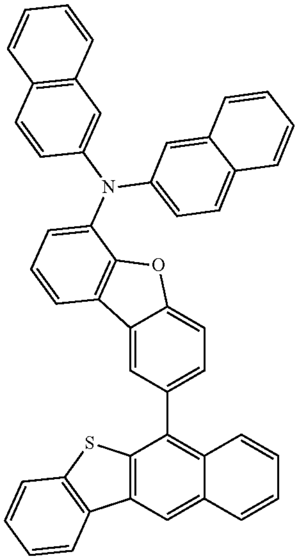
8-80
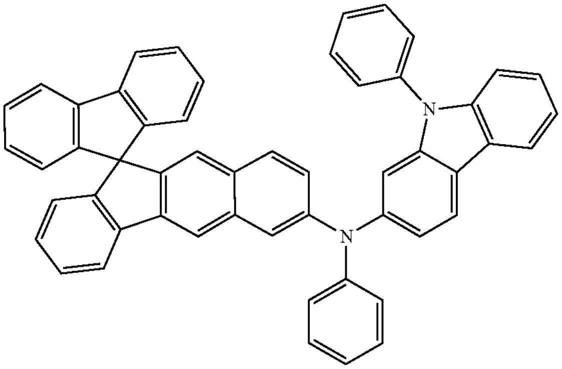
8-81
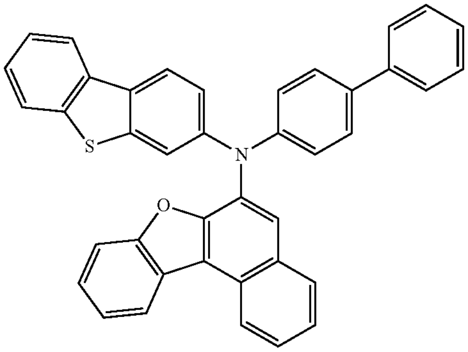
8-82
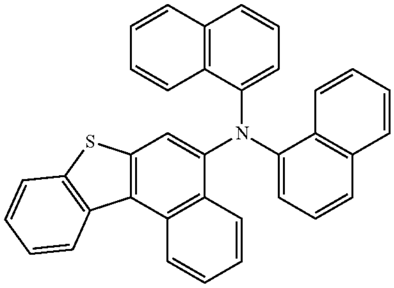
-continued
8-83
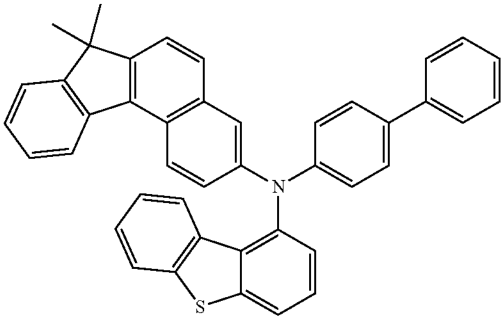
8-84
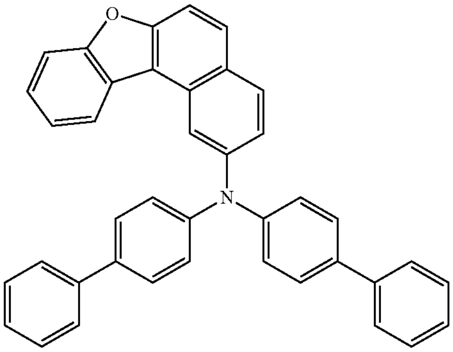
8-85
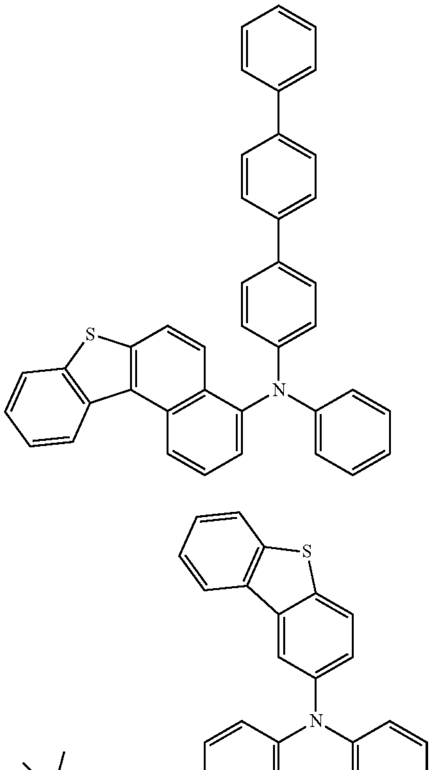
8-86
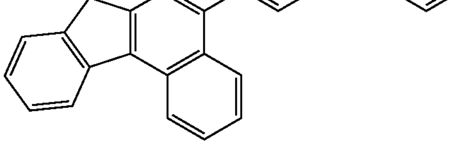

-continued
8-87
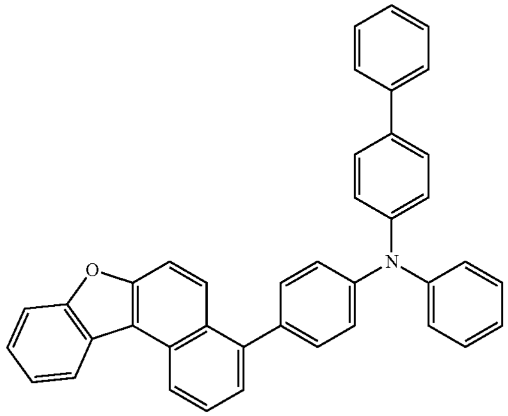
8-88
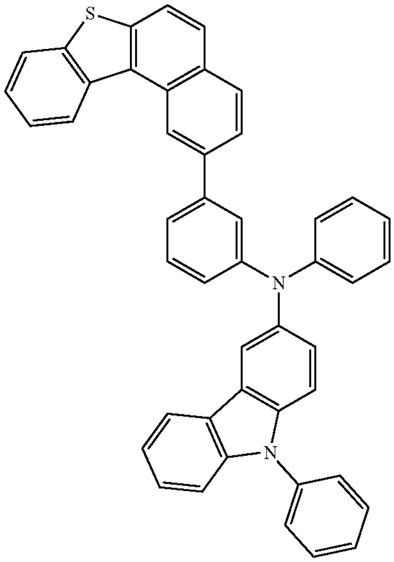
8-89
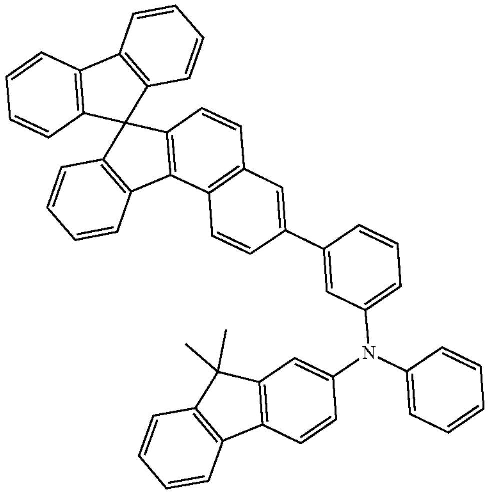
-continued
8-90
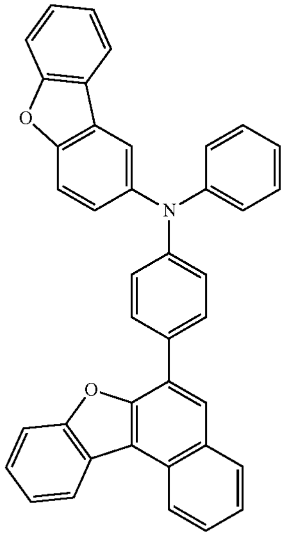
8-91
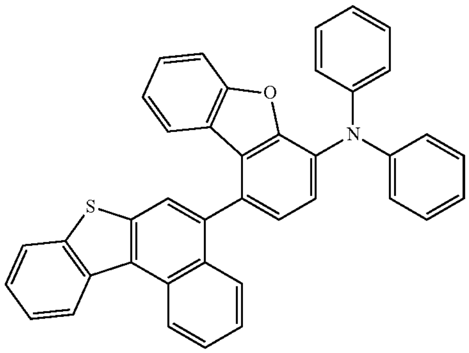
8-92
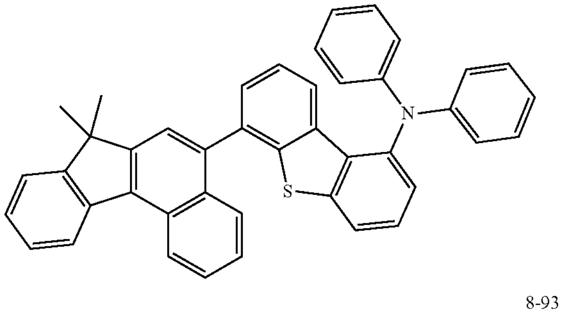
8-93
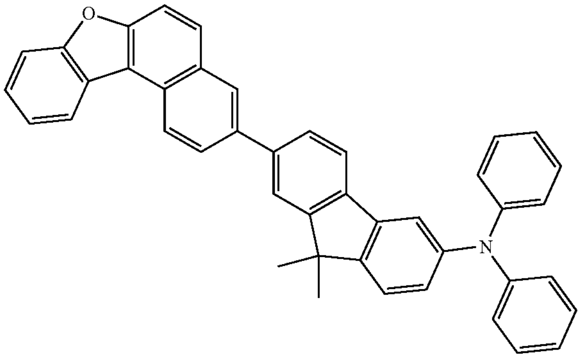

-continued
8-94
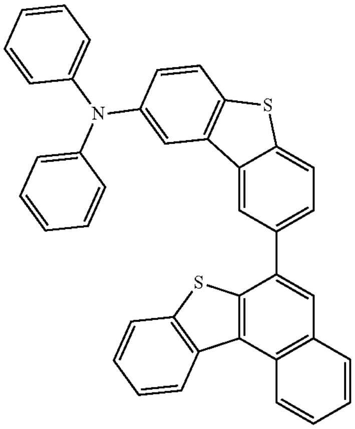
8-95
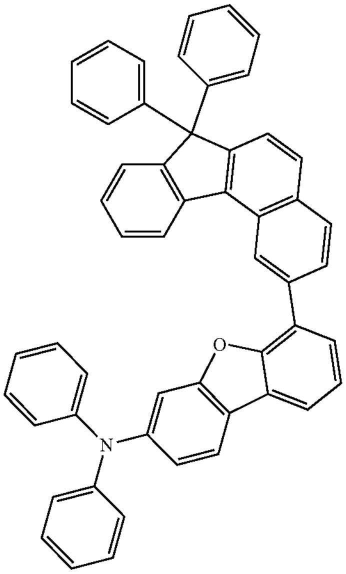
8-96
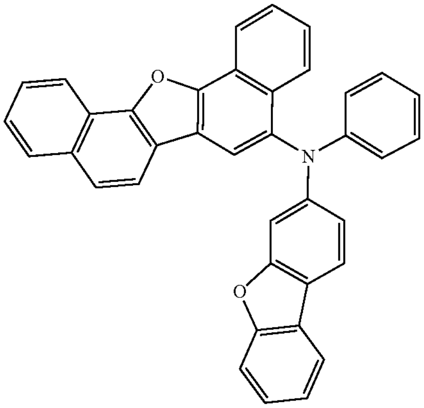
-continued
8-97
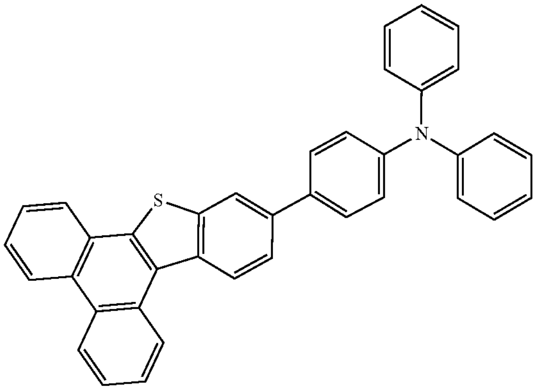
8-98
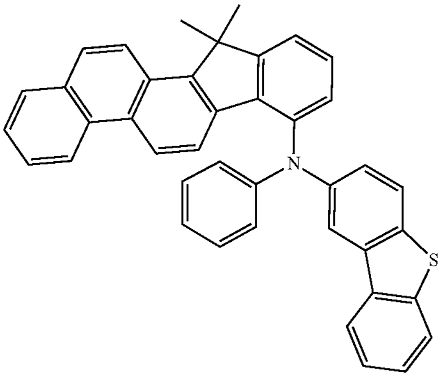
8-99
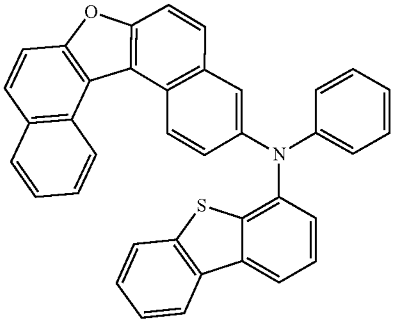
8-100
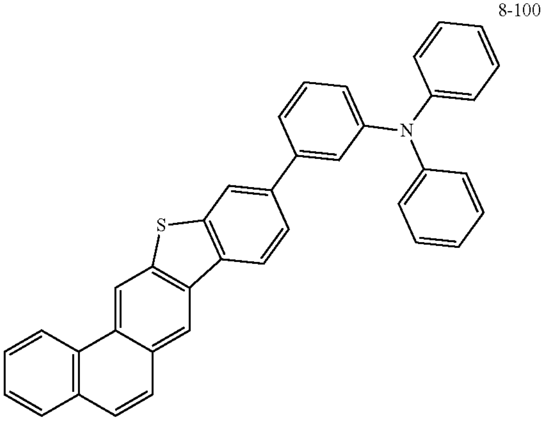

-continued
8-101
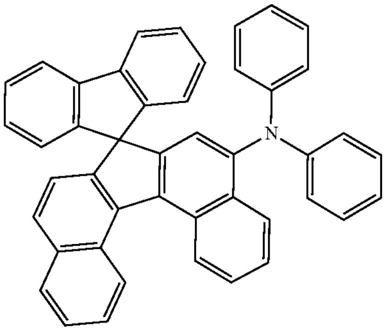
8-102
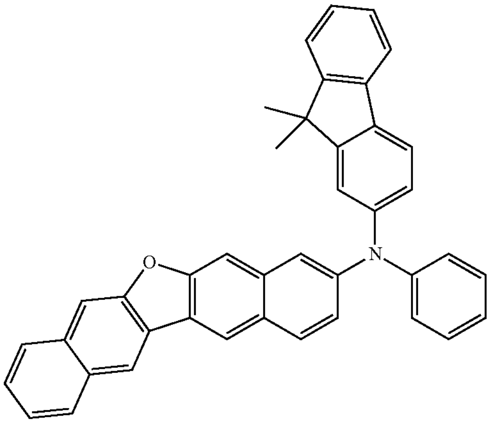
8-103
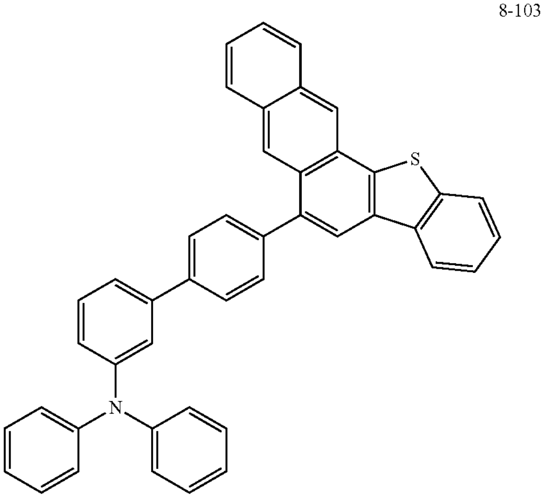
8-104
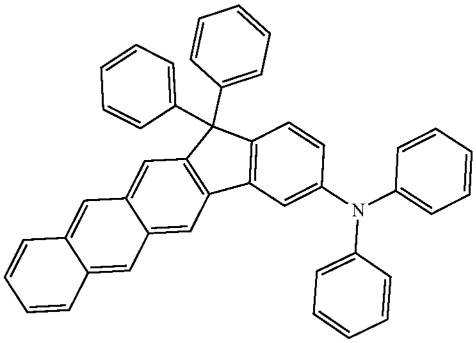
-continued
10-1
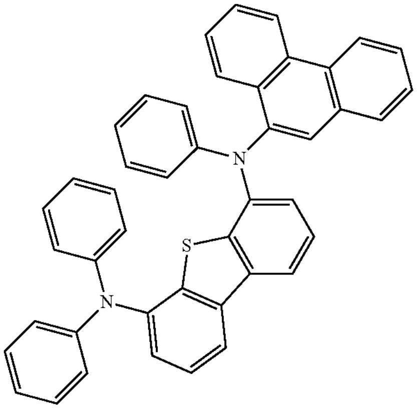
10-2
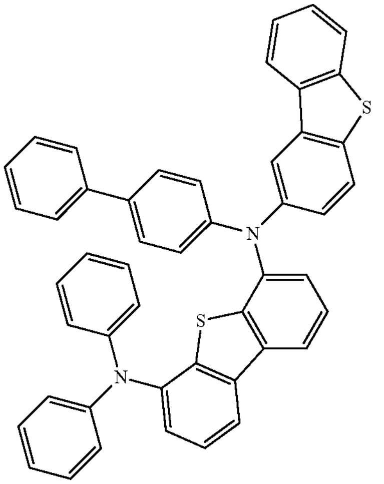
10-3
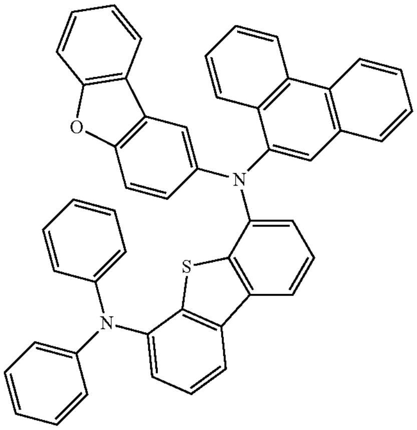

-continued
10-4
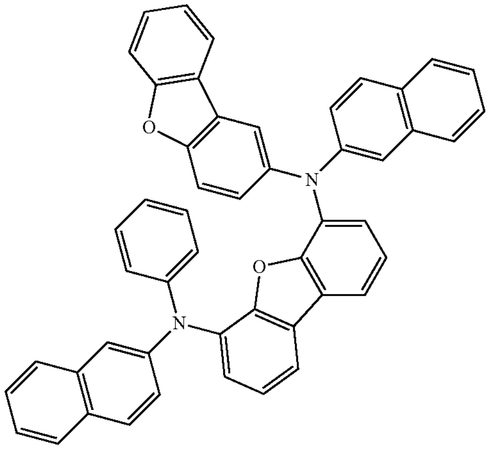
10-5
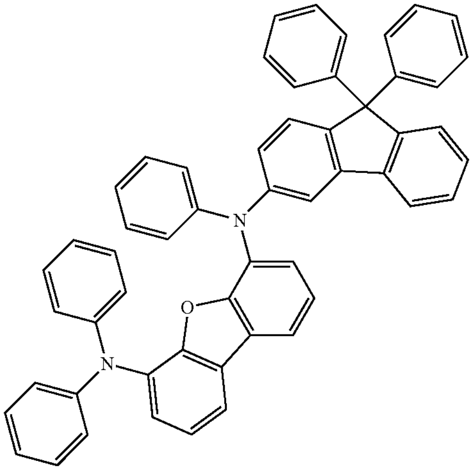
10-6
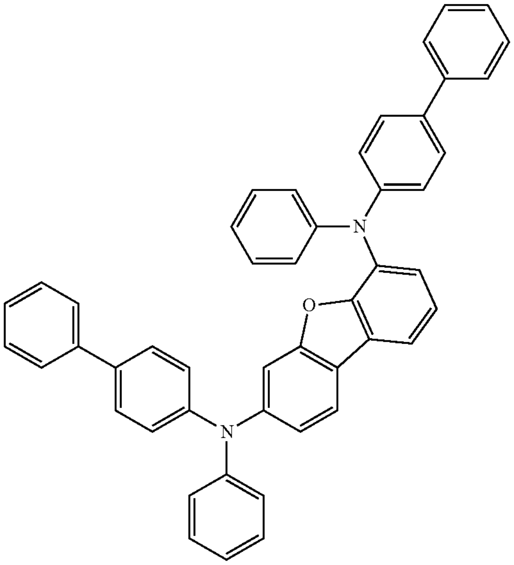
-continued
10-7
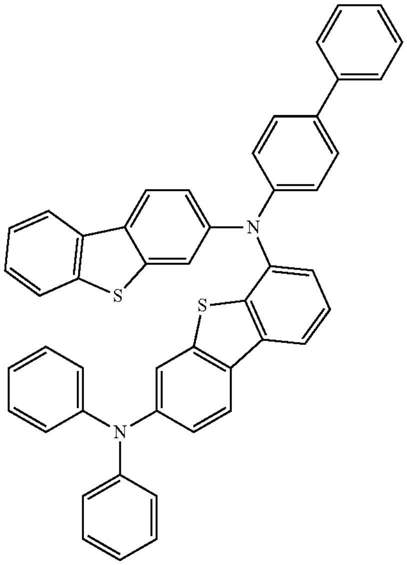
10-8
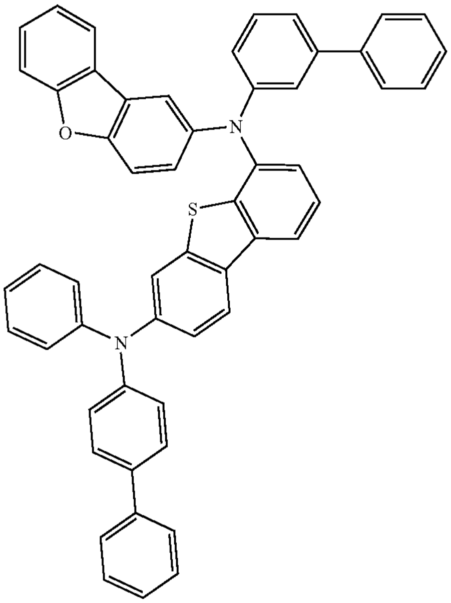

-continued
10-9
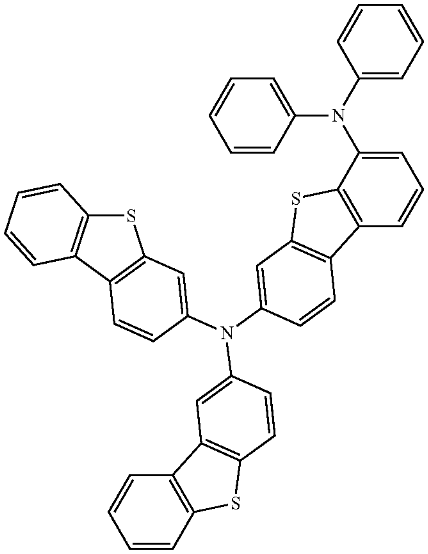
10-10
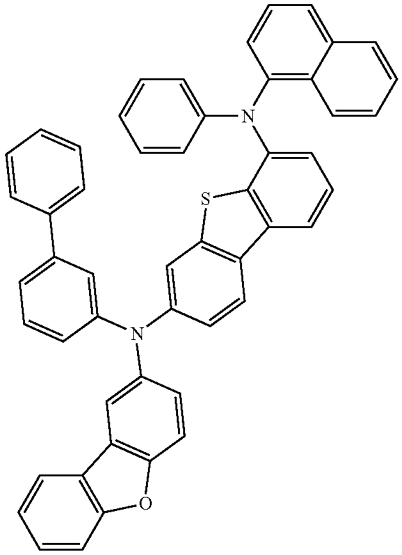
-continued
10-11
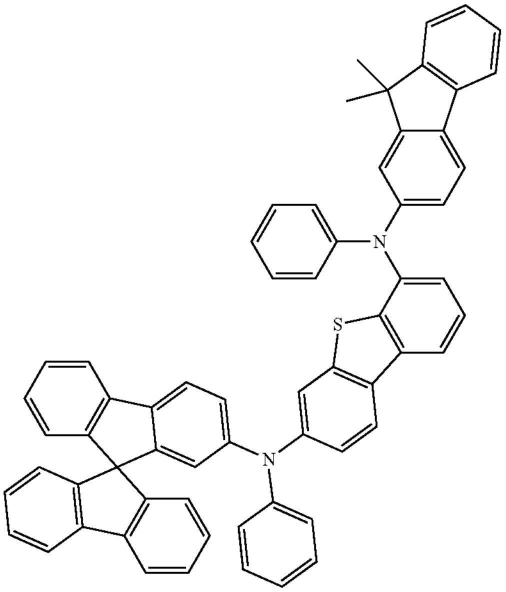
10-12
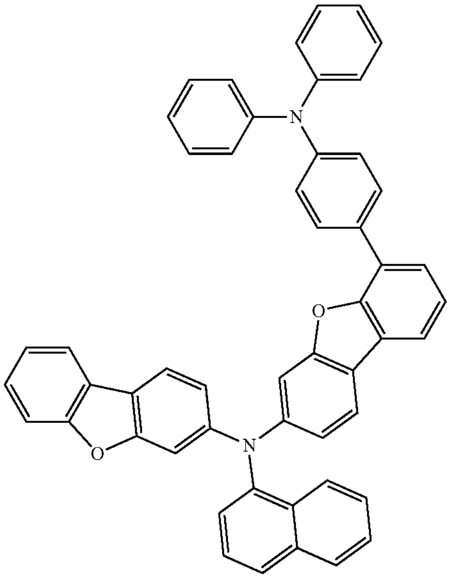

-continued
10-13
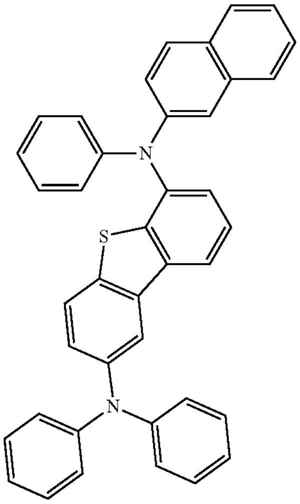
10-14
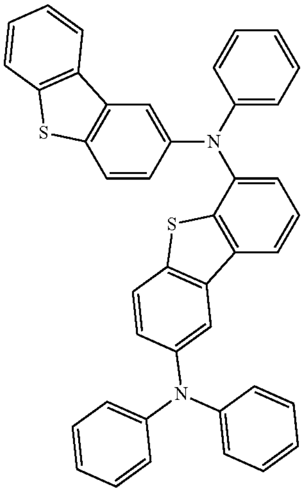
10-15
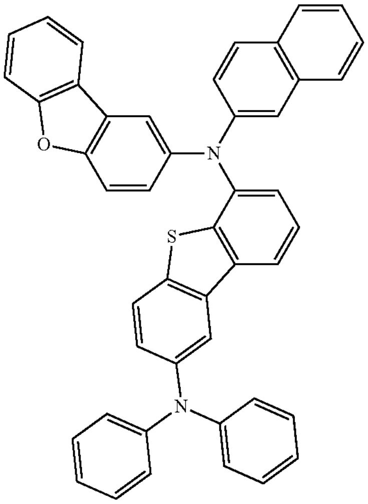
-continued
10-16
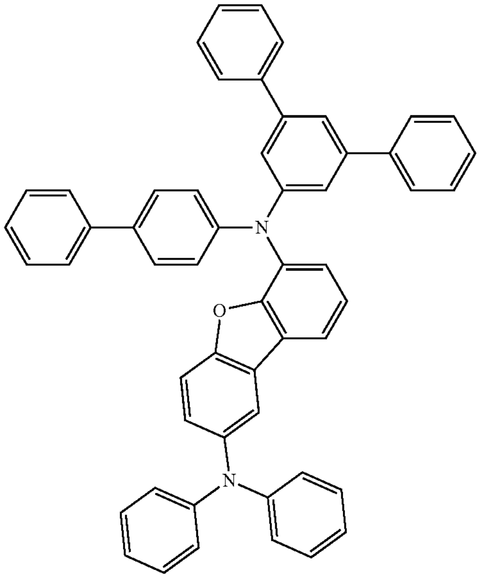
10-17
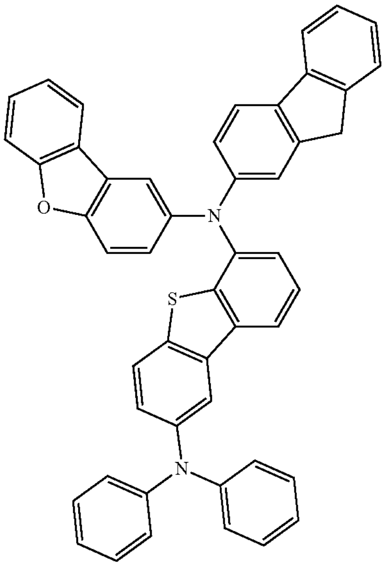

10-18
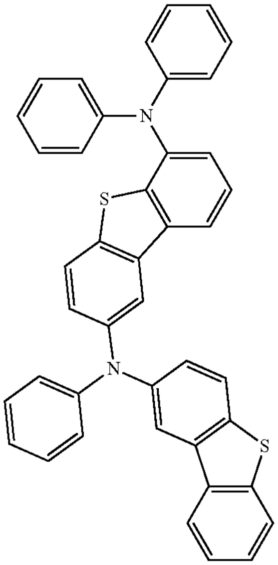
10-19
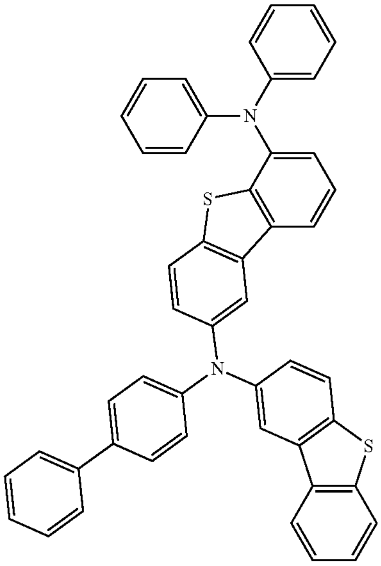
10-20
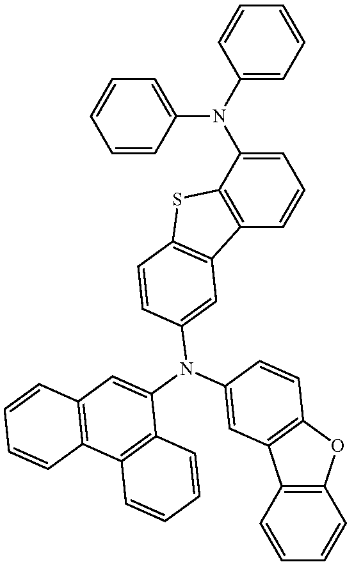
10-21
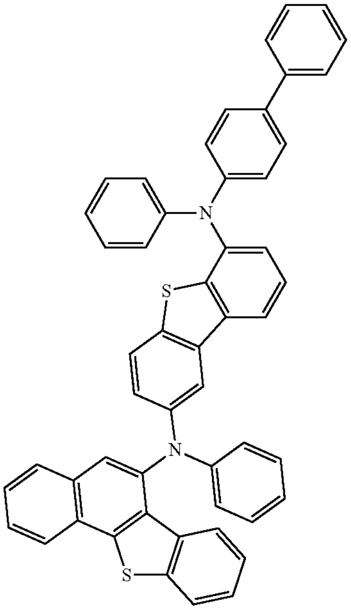

-continued
10-22
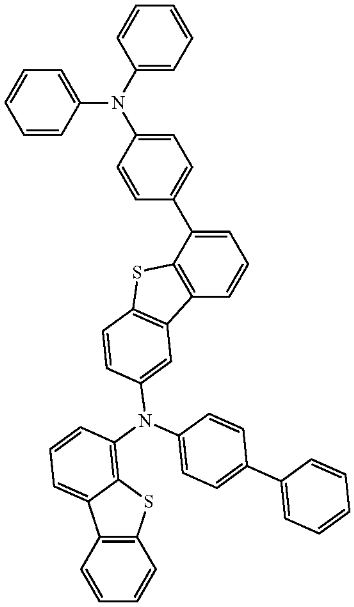
10-23
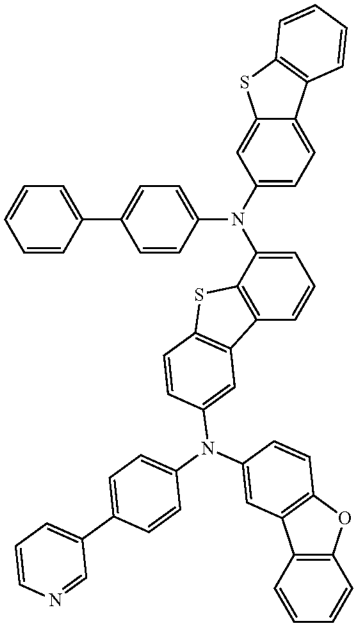
-continued
10-24
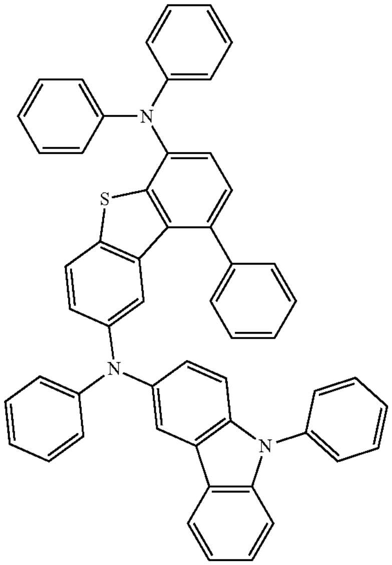
10-25
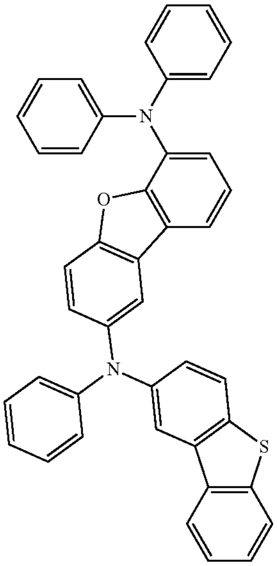
10-26
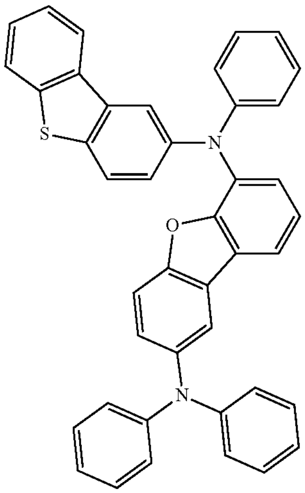

-continued
10-27
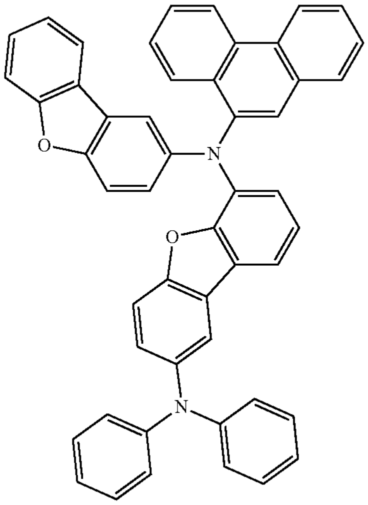
10-28
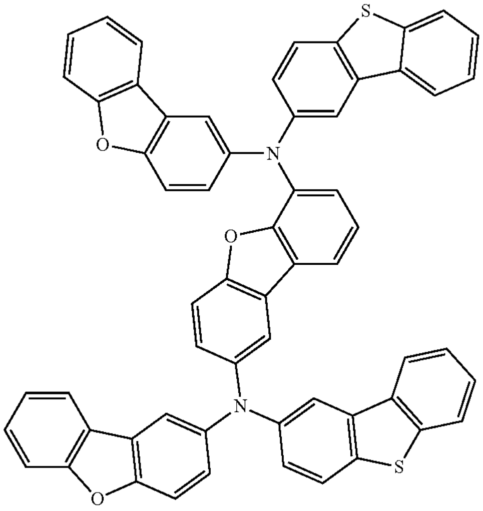
10-29
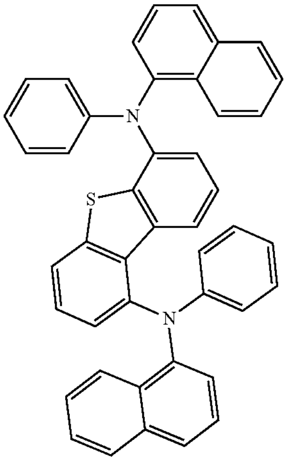
-continued
10-30
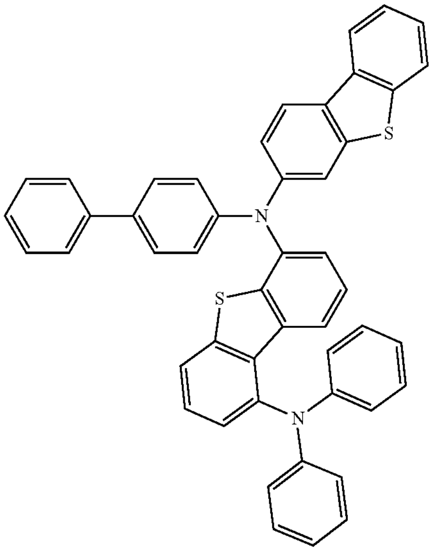
10-31
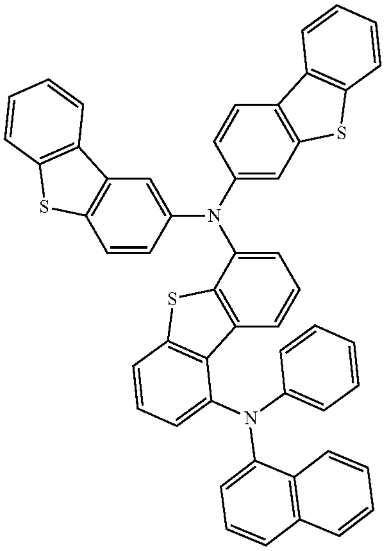
10-32
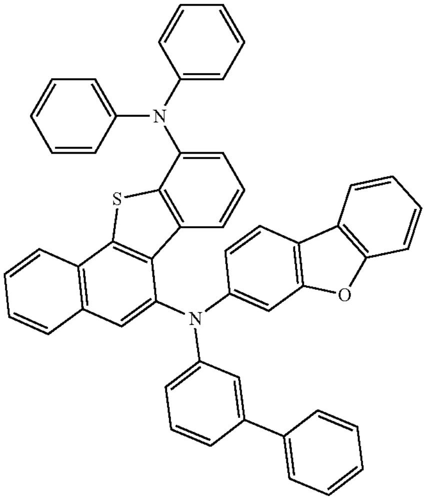

10-33
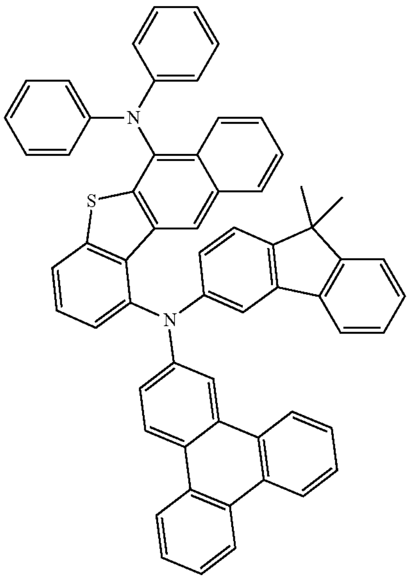
10-34
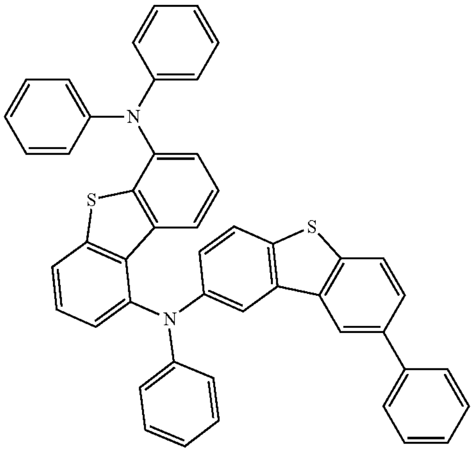
10-35
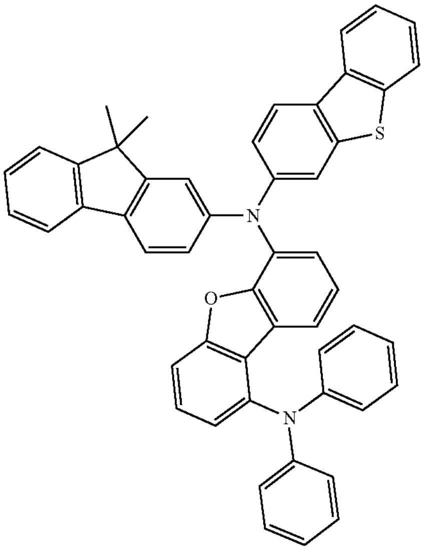
10-36
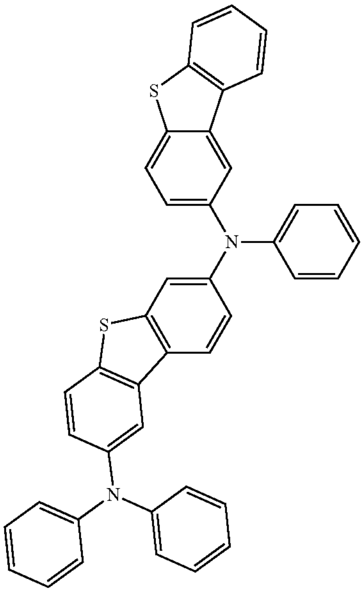
10-37
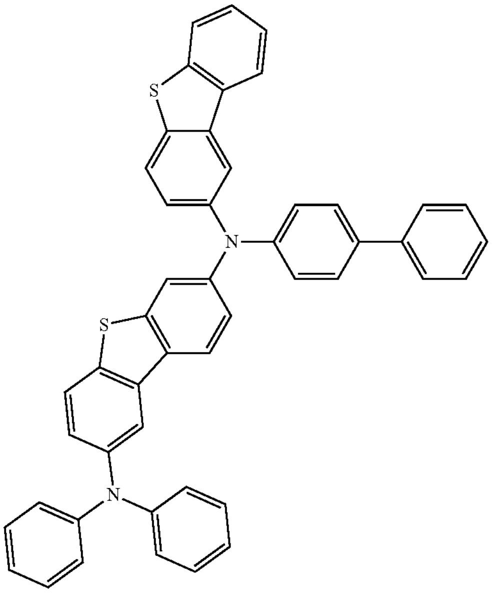

-continued
10-38
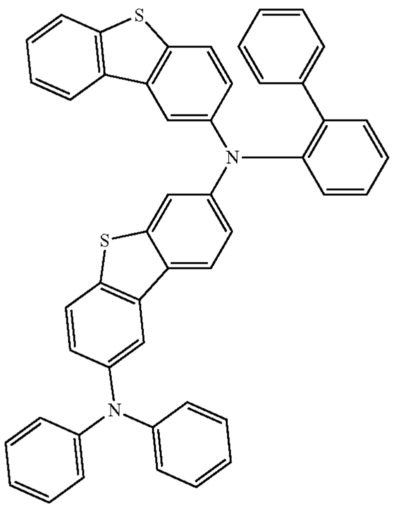
10-39
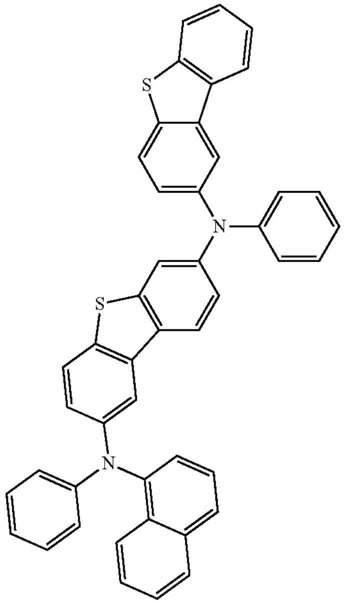
-continued
10-40
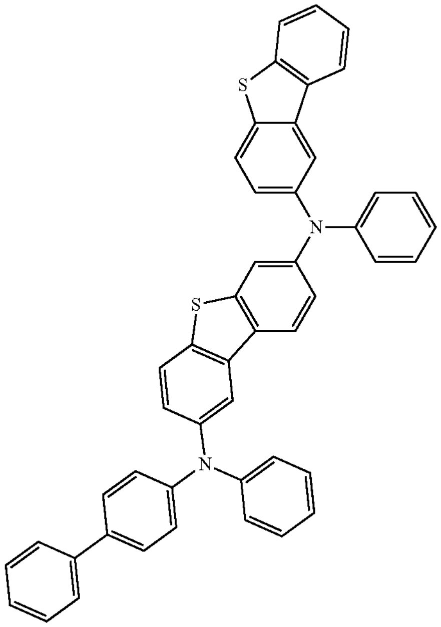
10-41
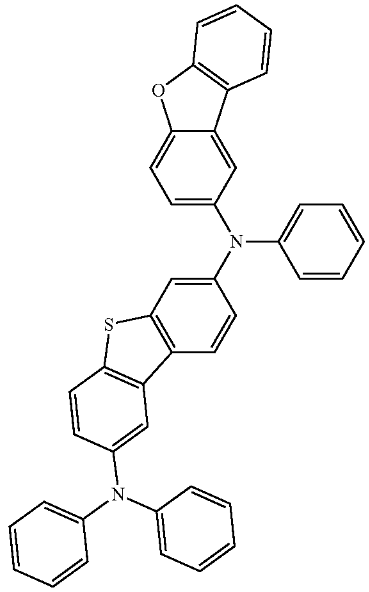

-continued
10-42
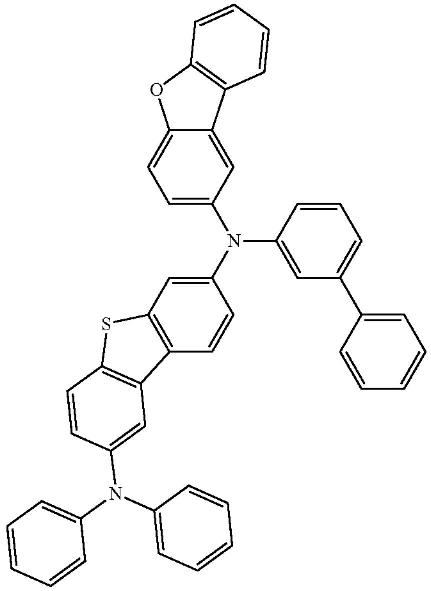
10-43
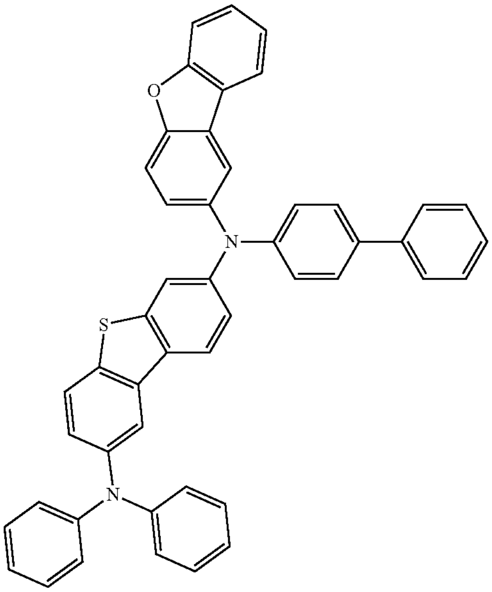
-continued
10-44
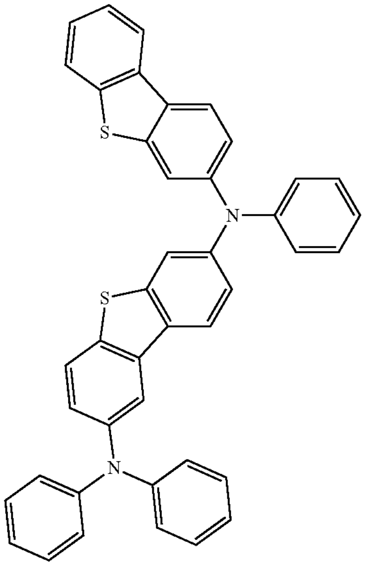
10-45
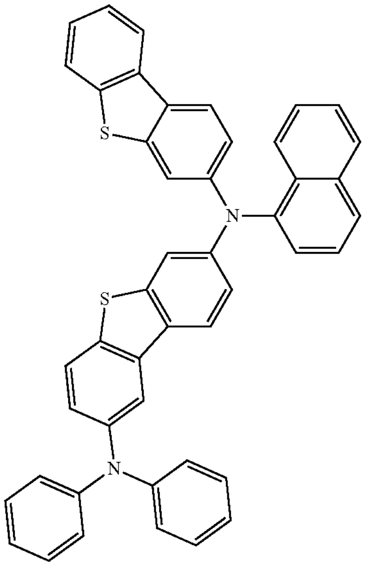

-continued
10-46
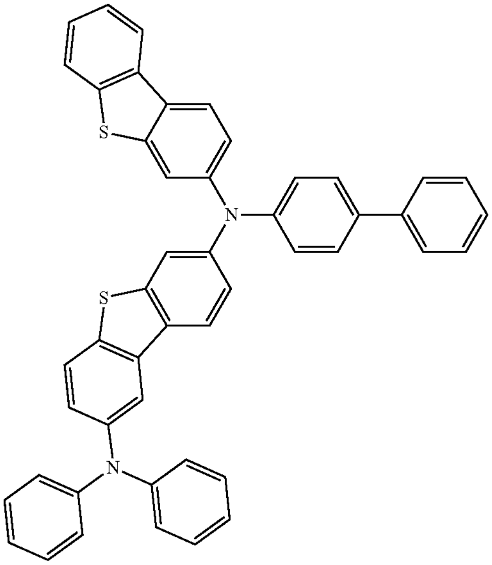
10-47
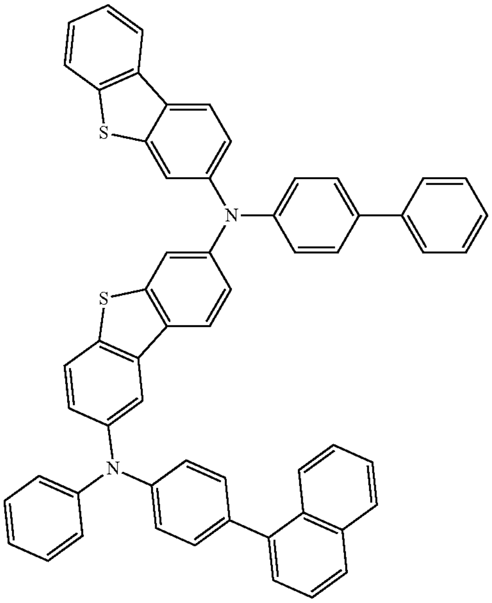
-continued
10-48
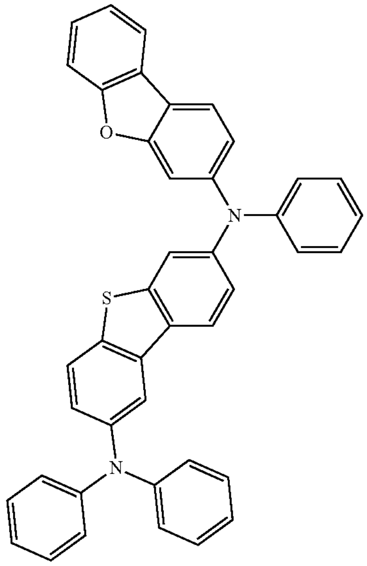
10-49
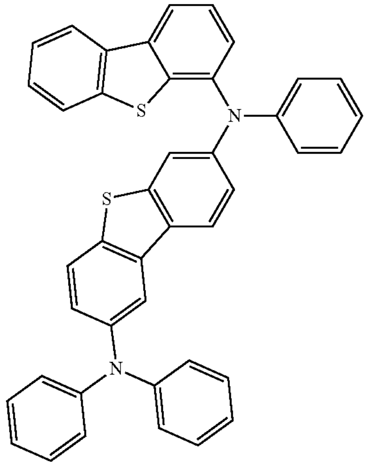
10-50
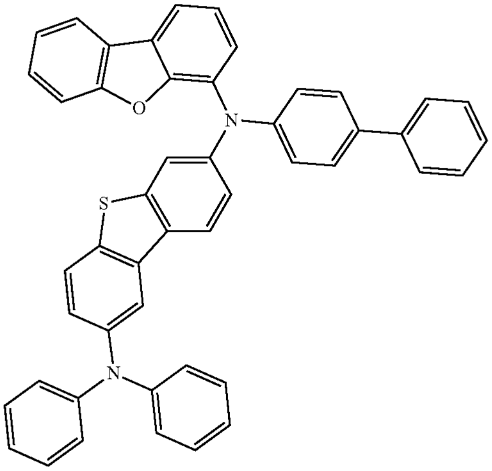

-continued
10-51
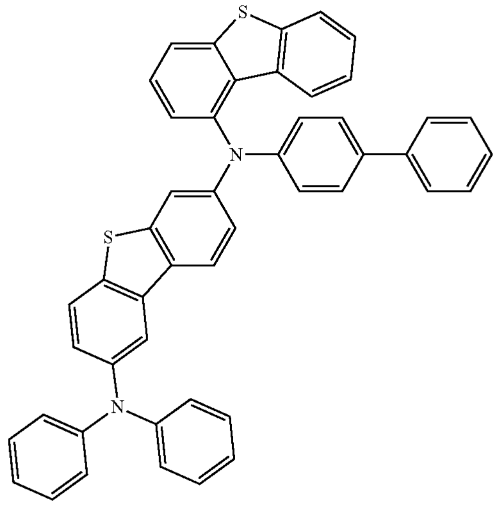
10-52
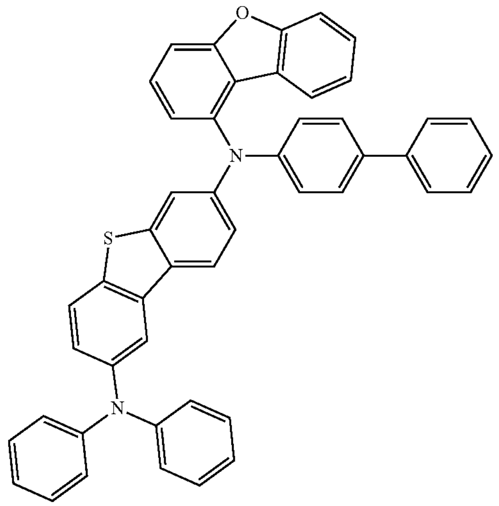
10-53
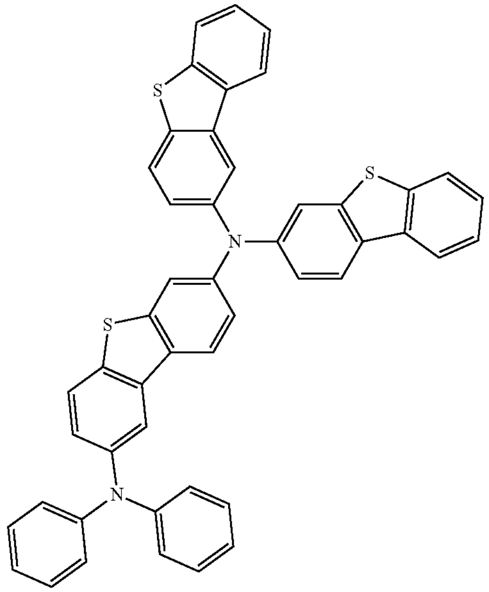
-continued
10-54
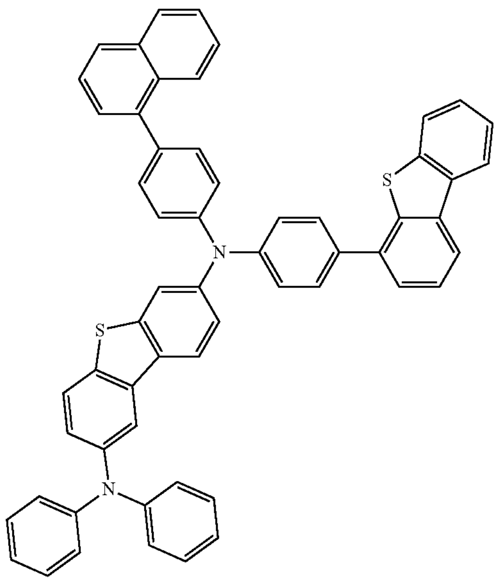
10-55
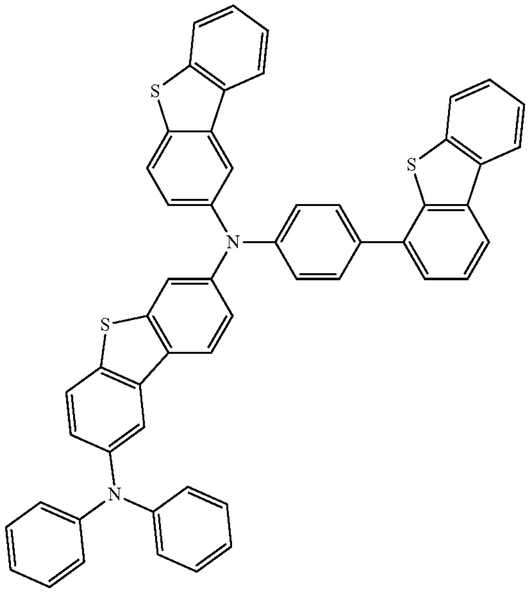

-continued
10-56
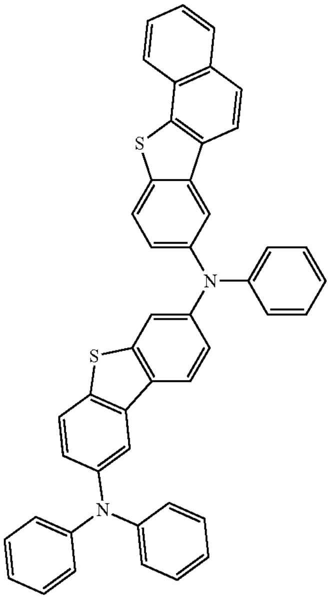
10-57
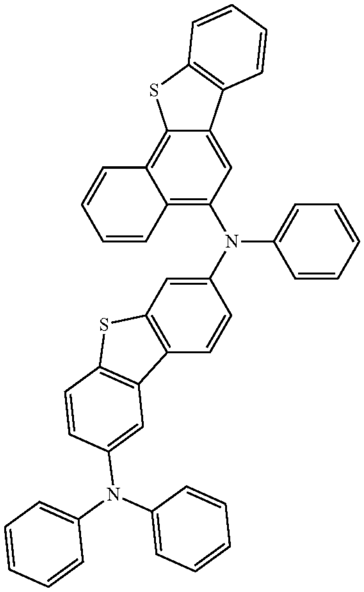
-continued
10-58
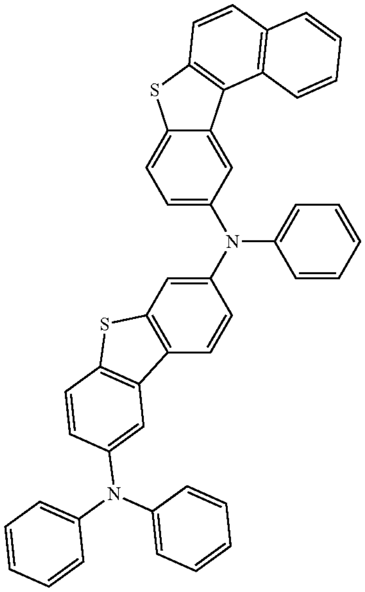
10-59
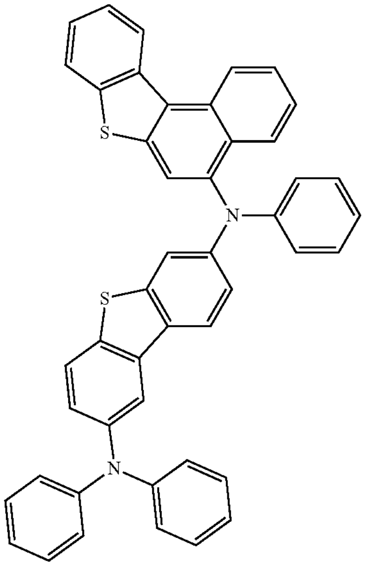
10-60
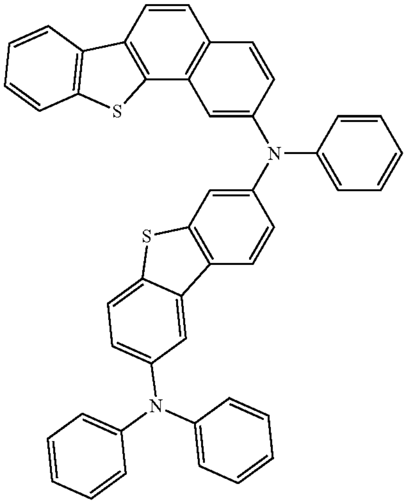

-continued
10-61
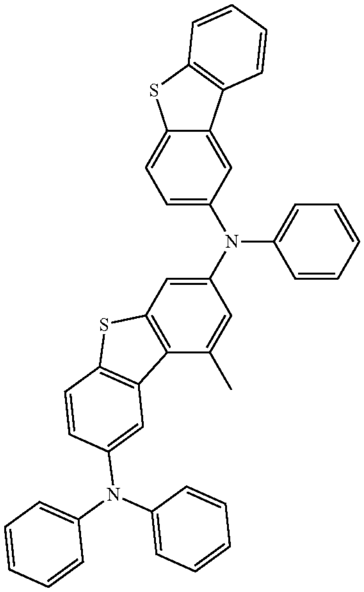
10-62
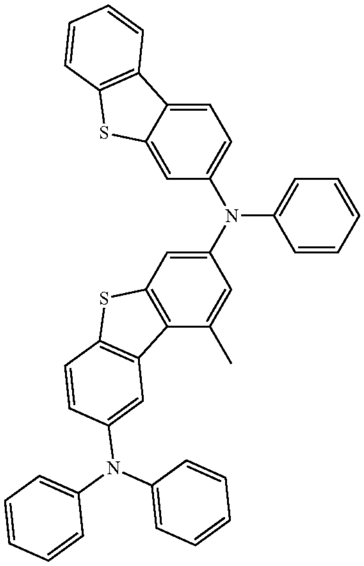
10-63
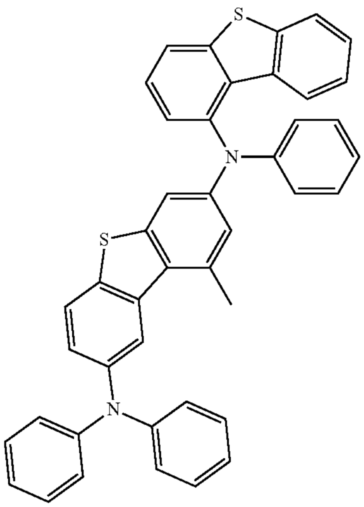
-continued
10-64
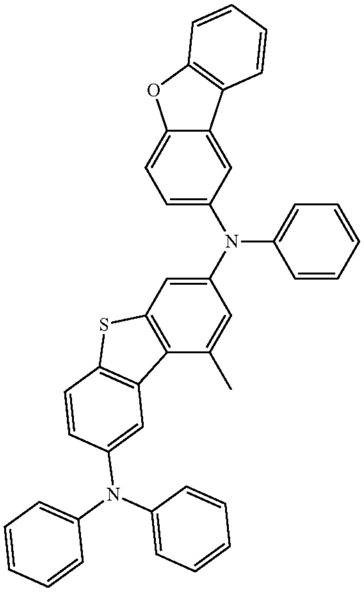
10-65
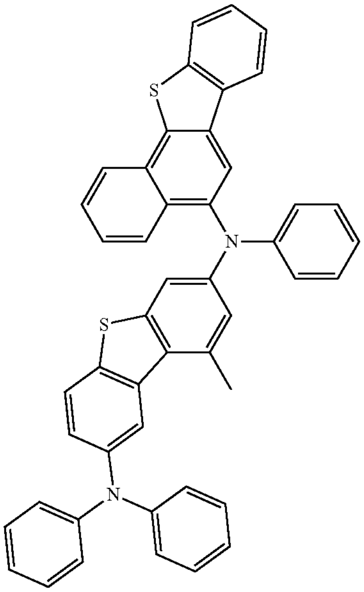

-continued
10-66
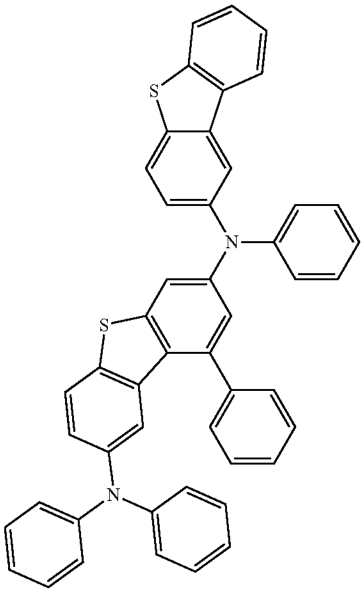
-continued
10-68
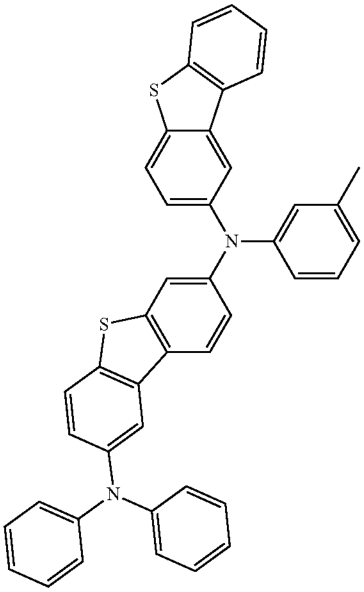
10-67
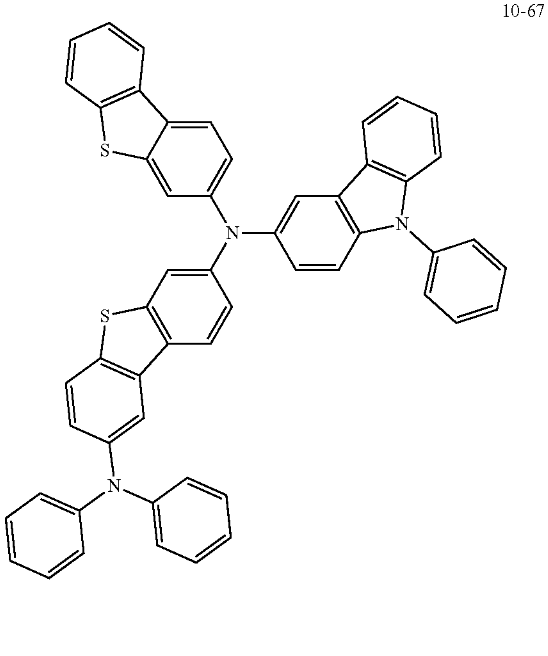
10-69
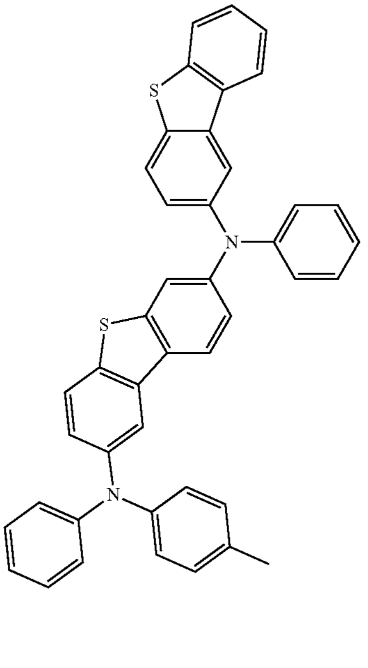

-continued
10-70
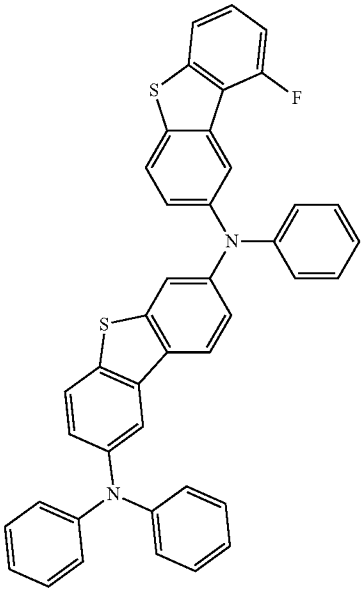
10-71
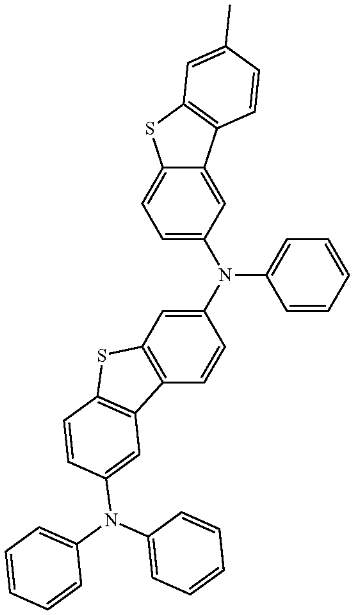
-continued
10-72
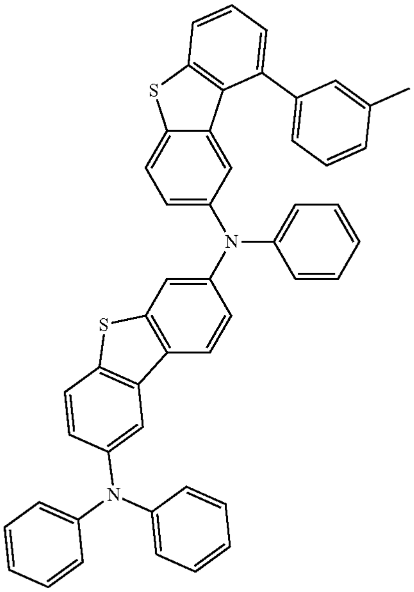
10-73
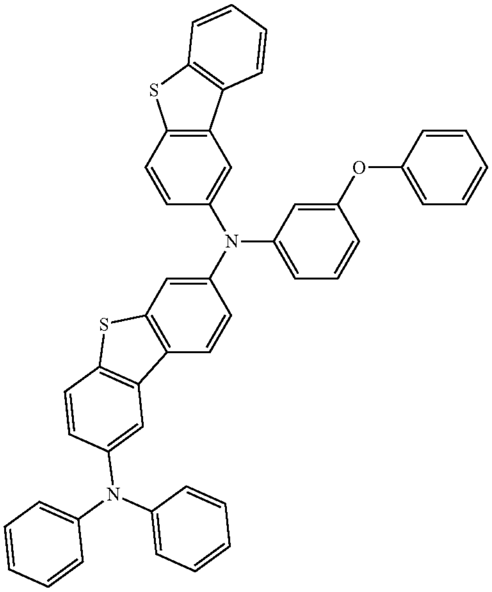

-continued
10-74
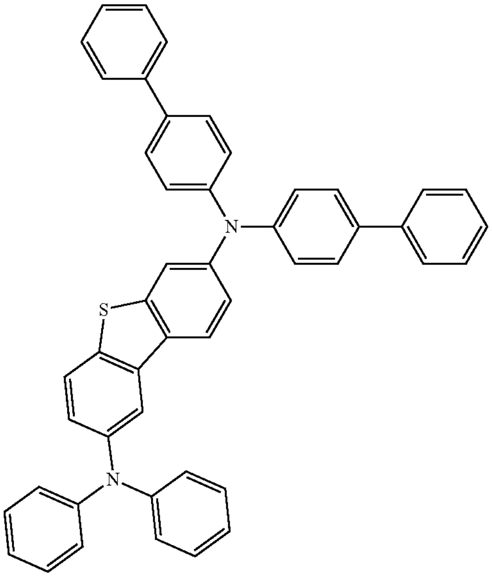
10-75
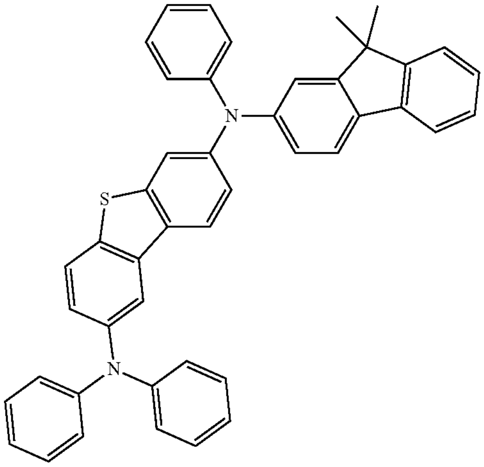
10-76
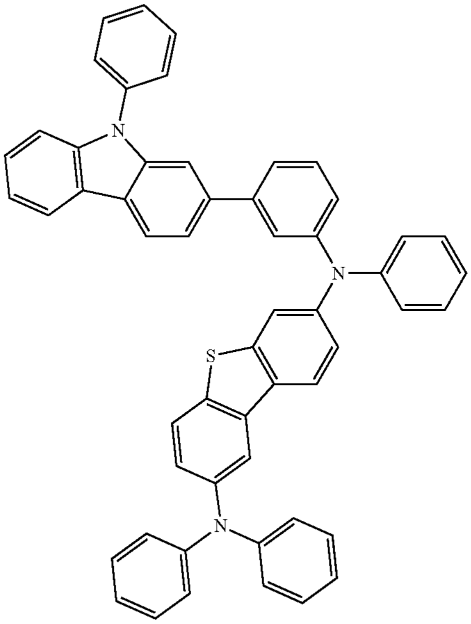
-continued
10-77
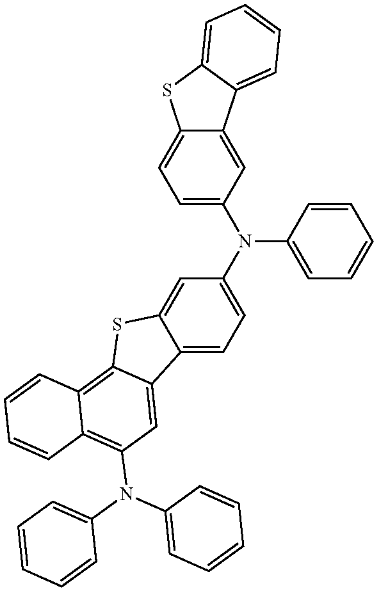
10-78
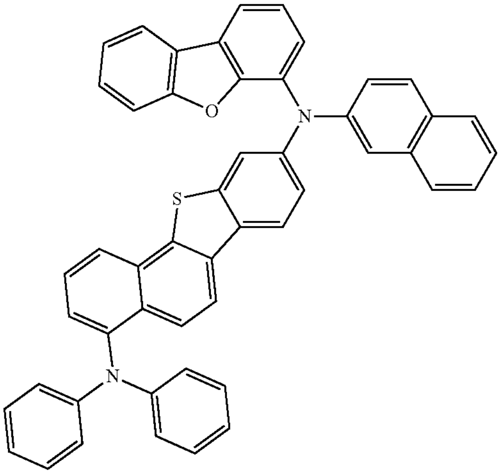
10-79
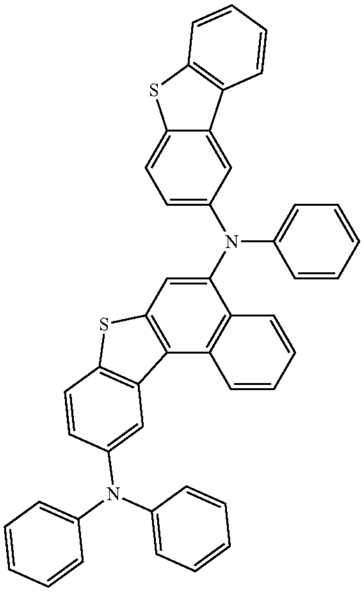

-continued
10-80
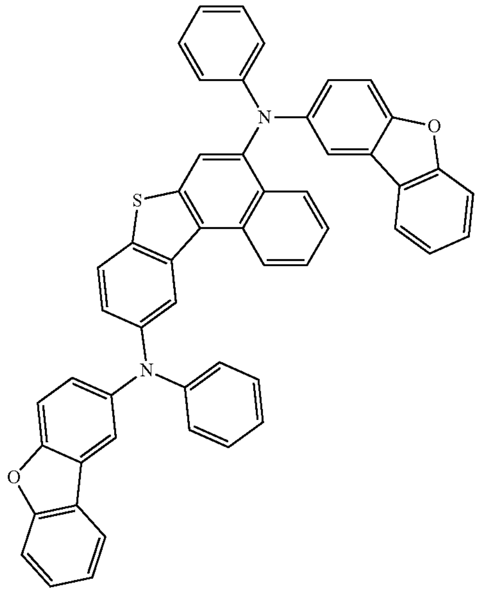
10-81
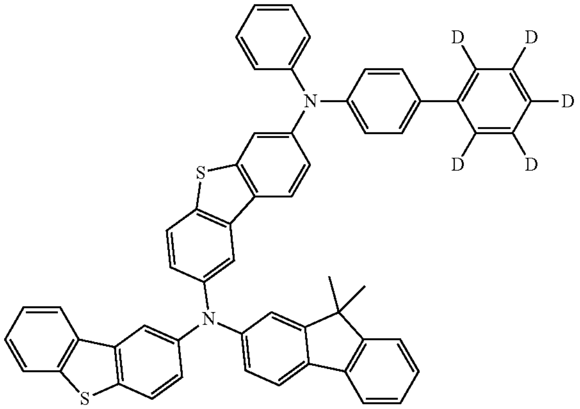
10-82
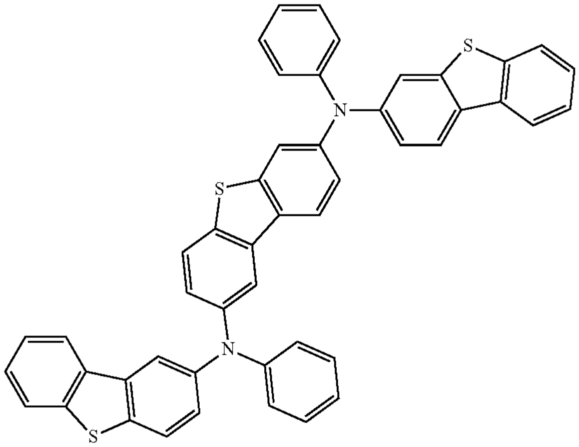
-continued
10-83
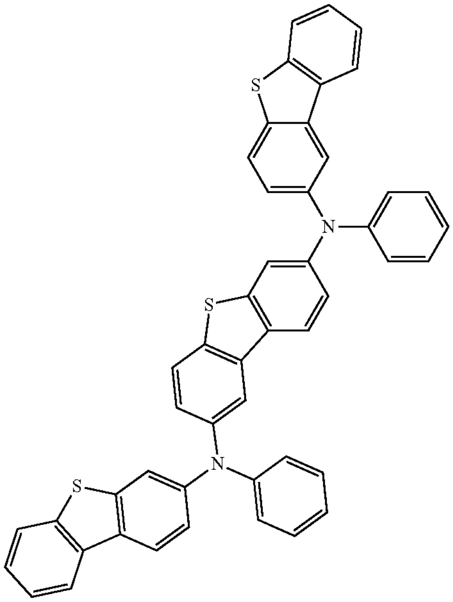
10-84
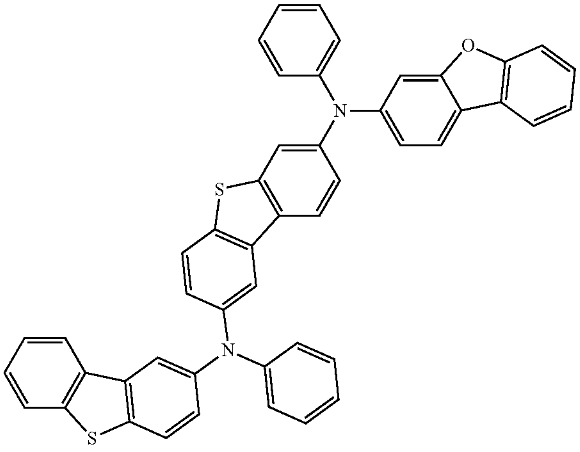
10-85
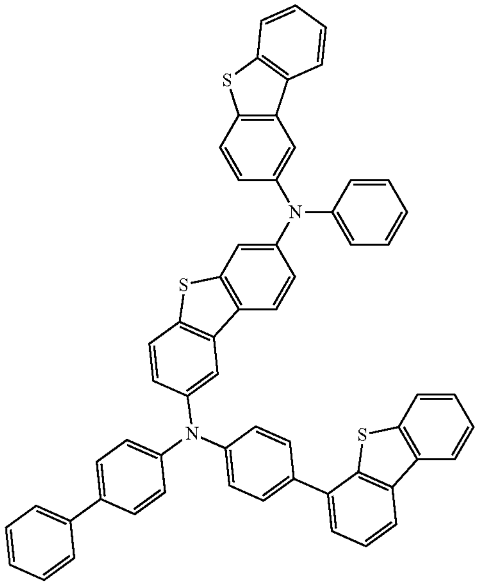

-continued
10-86
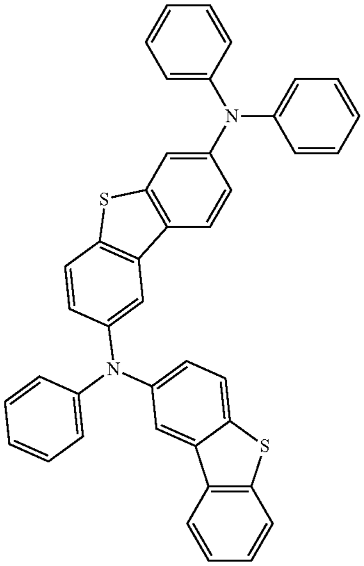
10-87
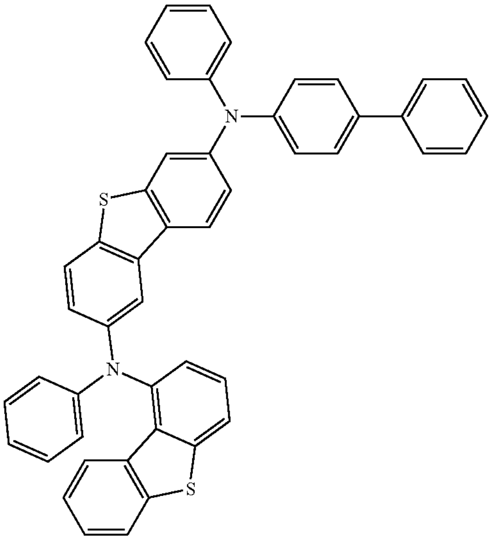
10-88
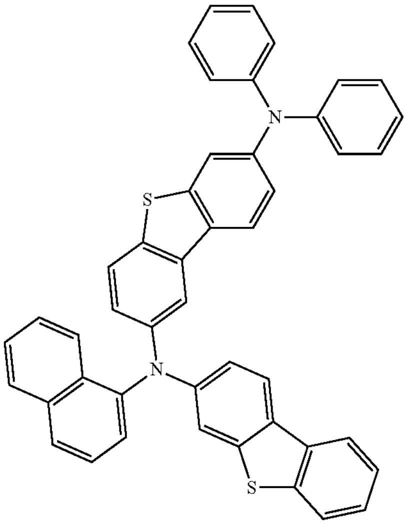
-continued
10-89
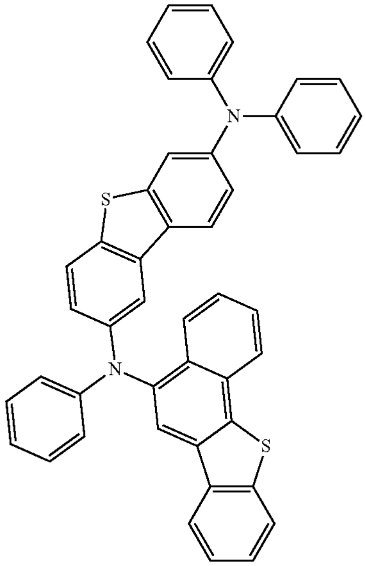
10-90
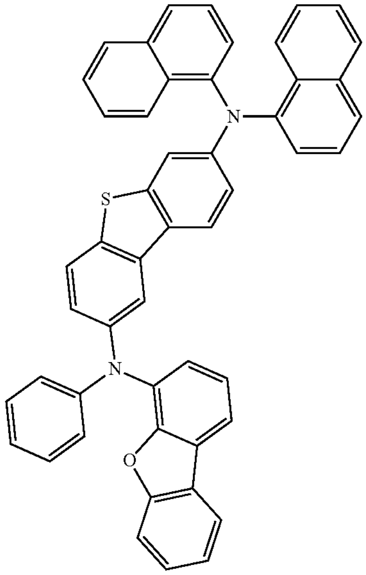

-continued
10-91
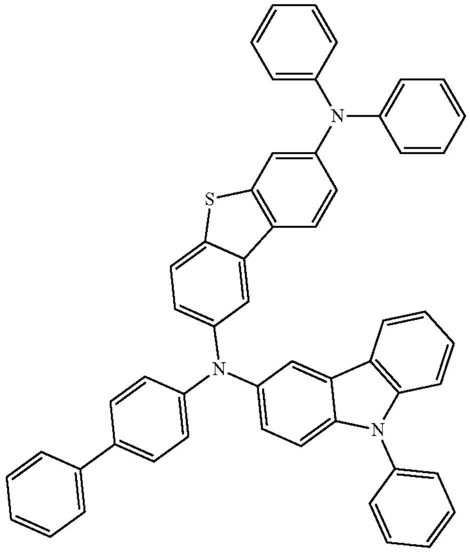
10-92
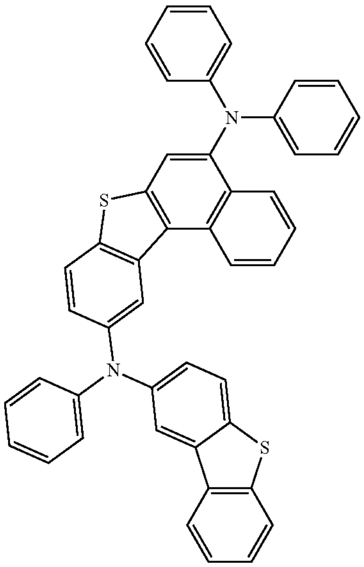
-continued
10-93
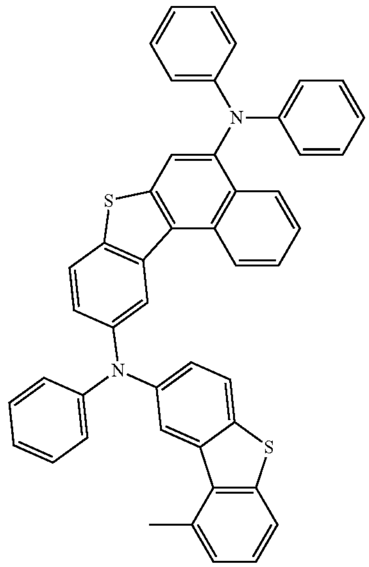
10-94
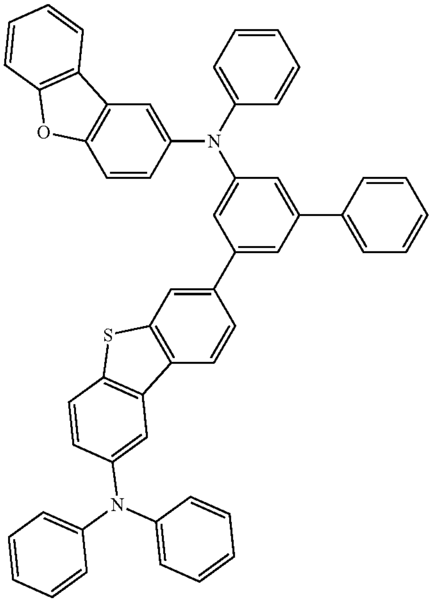

-continued
10-95
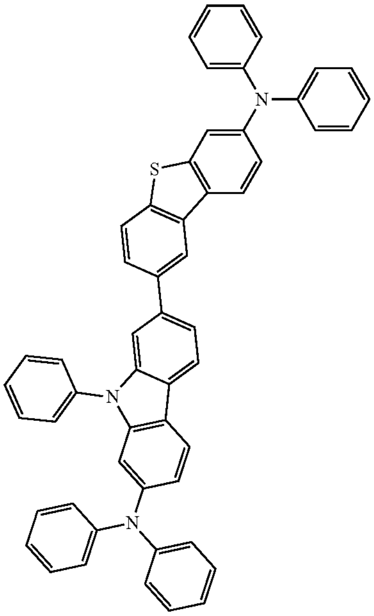
10-96
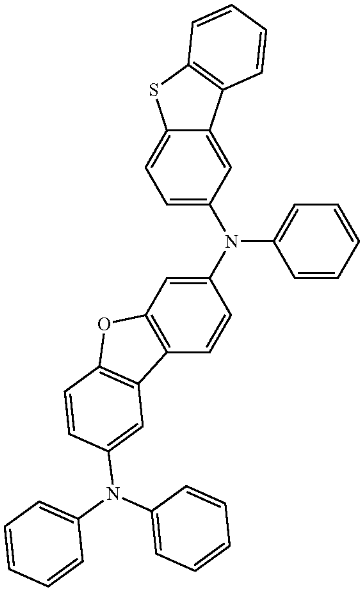
-continued
10-97
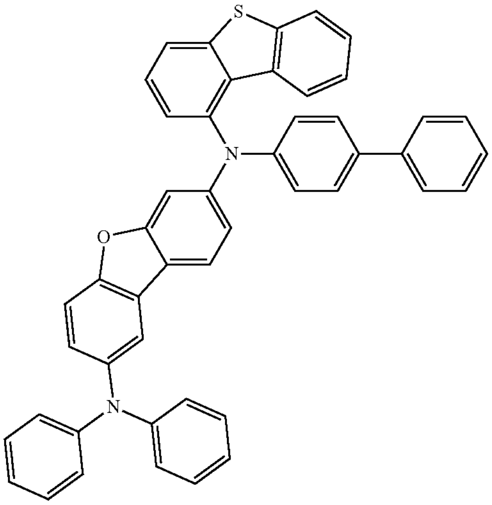
10-98
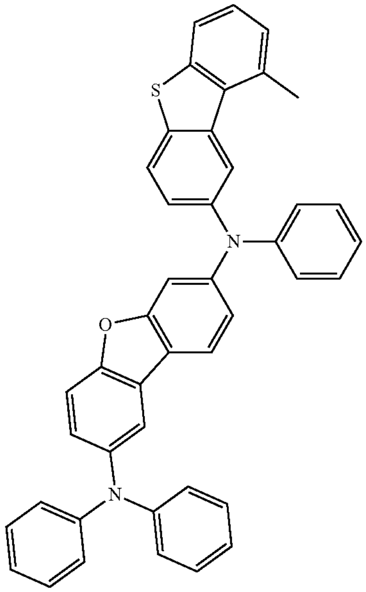

-continued
10-99
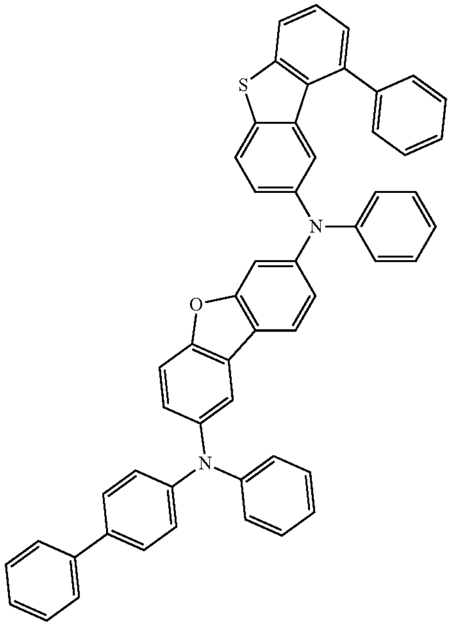
10-100
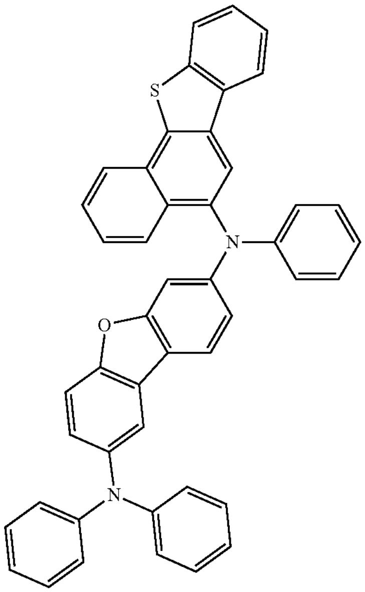
-continued
10-101
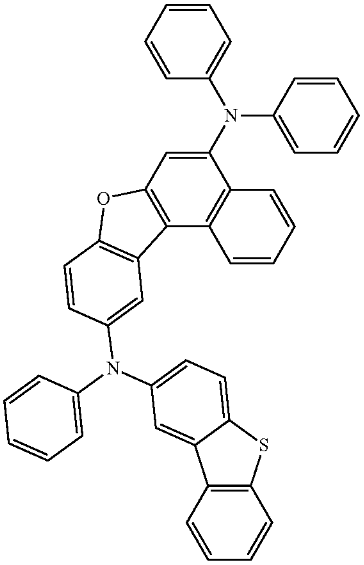
10-102
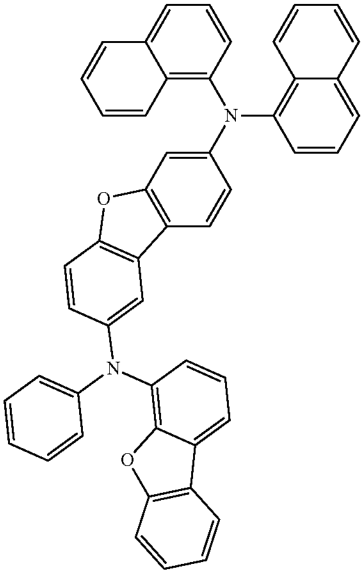

-continued
10-103
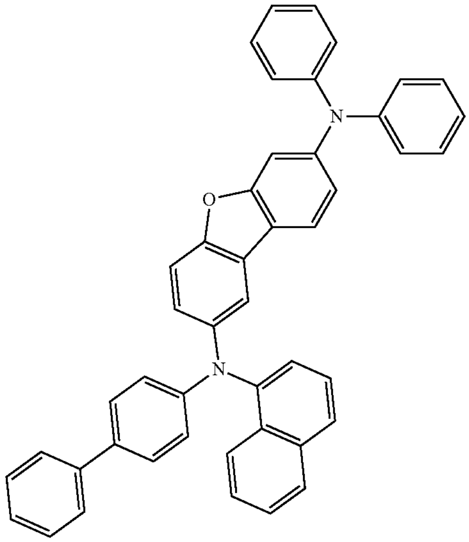
10-104
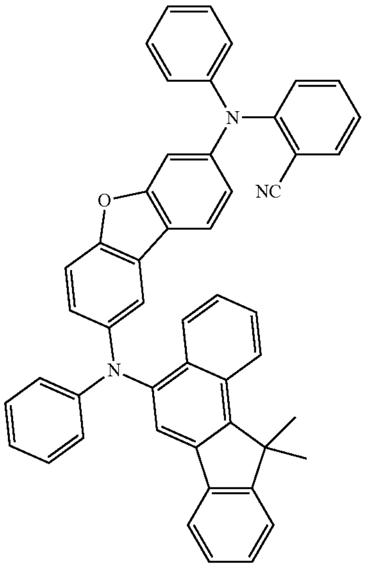
-continued
10-105
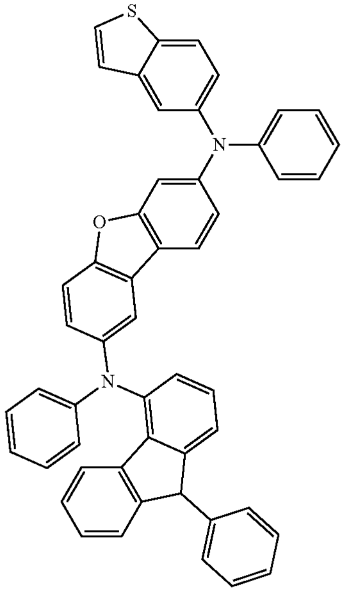
10-106
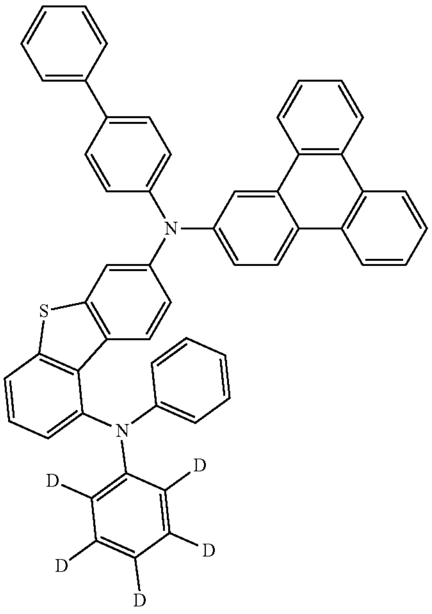

-continued
10-107
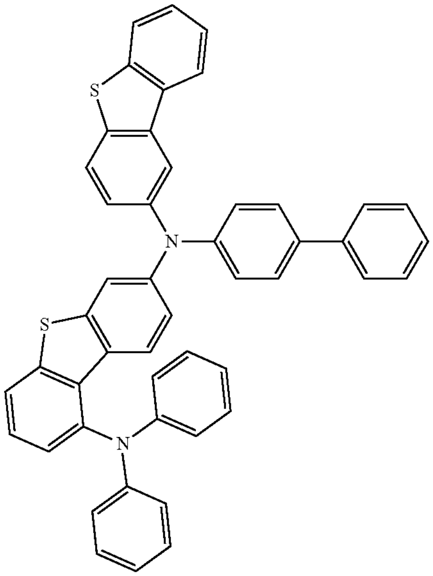
10-108
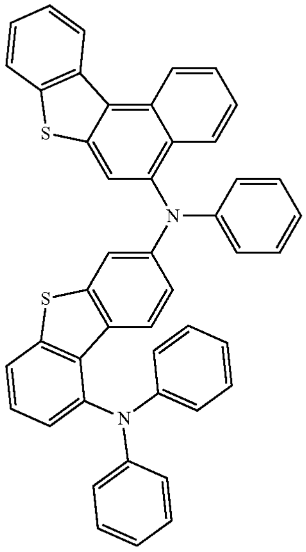
-continued
10-109
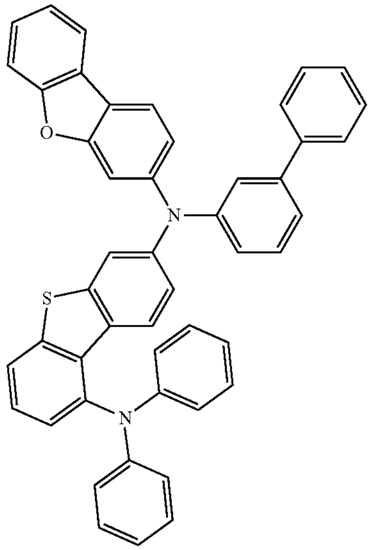
10-110
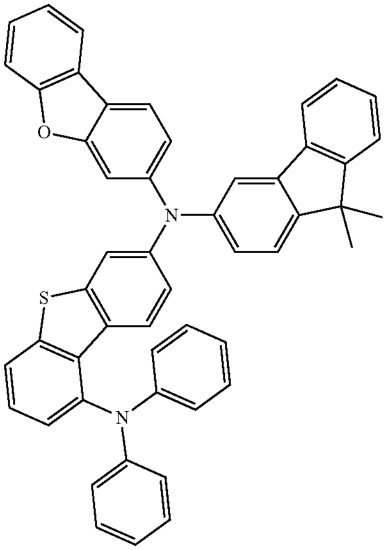
10-111
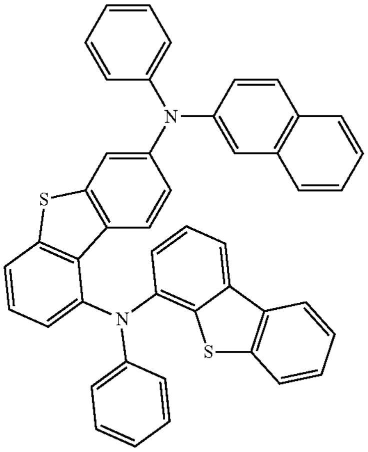

-continued
10-112
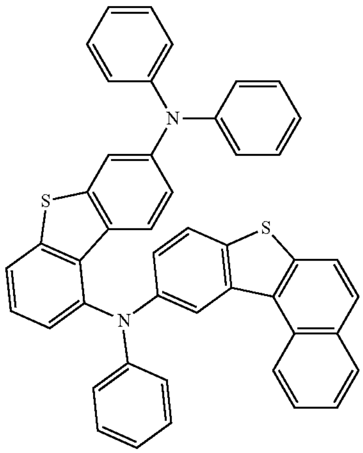
10-113
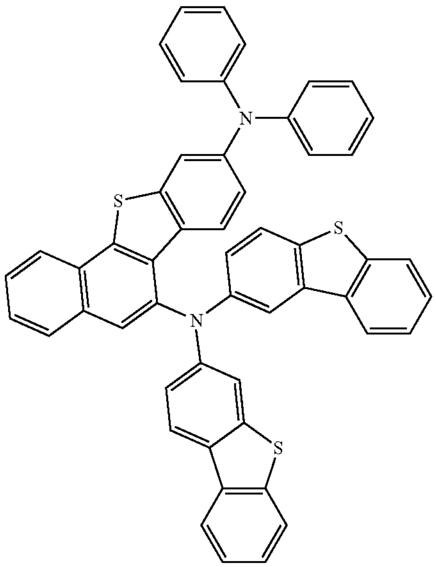
10-114
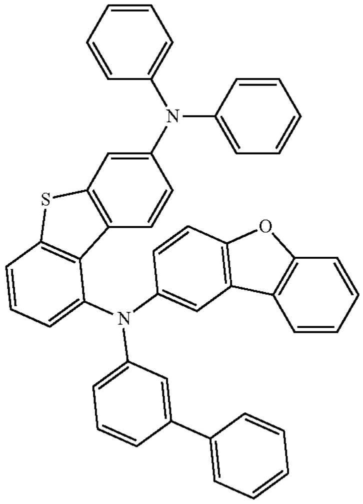
-continued
10-115
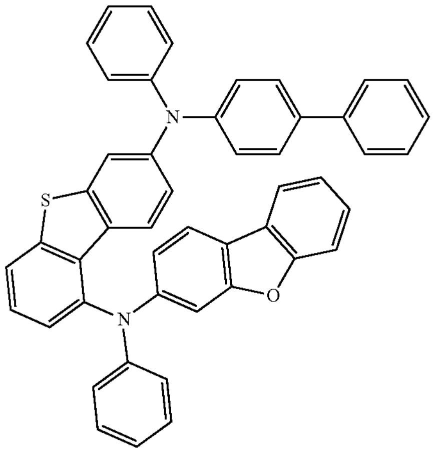
10-116
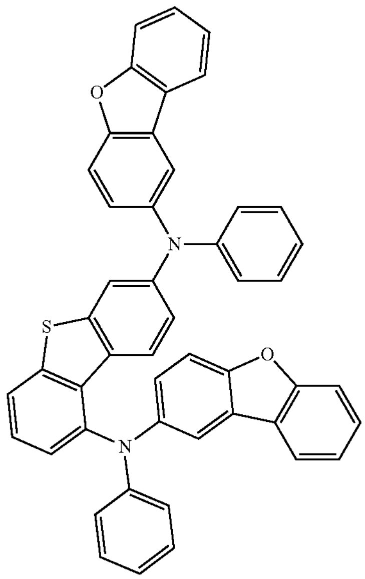
10-117
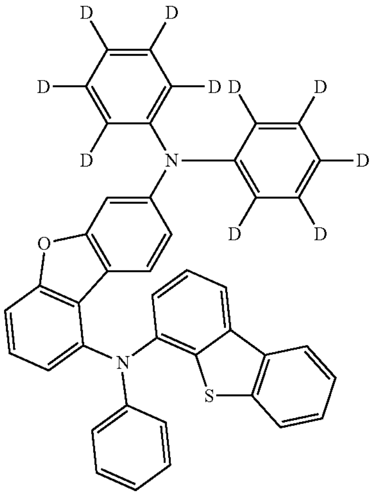

-continued
10-118
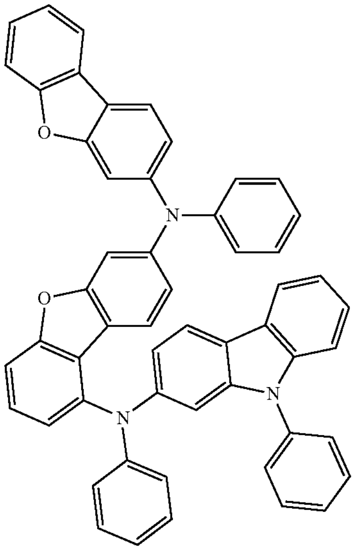
10-119
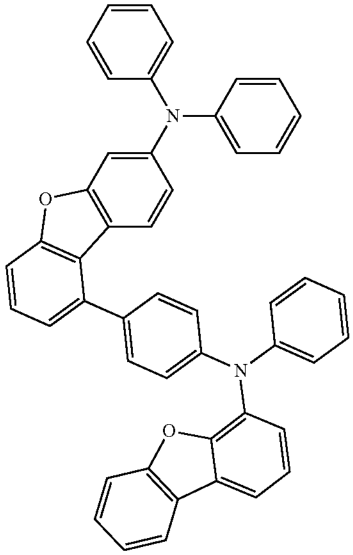
-continued
10-120
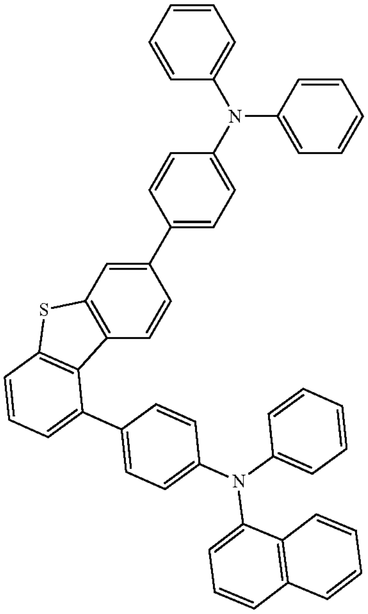
10-121
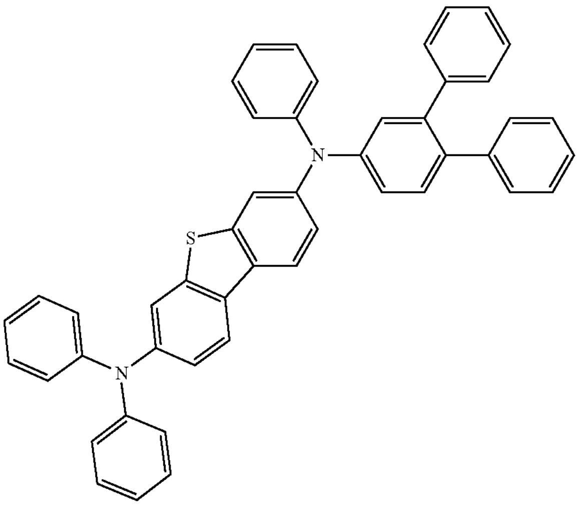

-continued
10-122
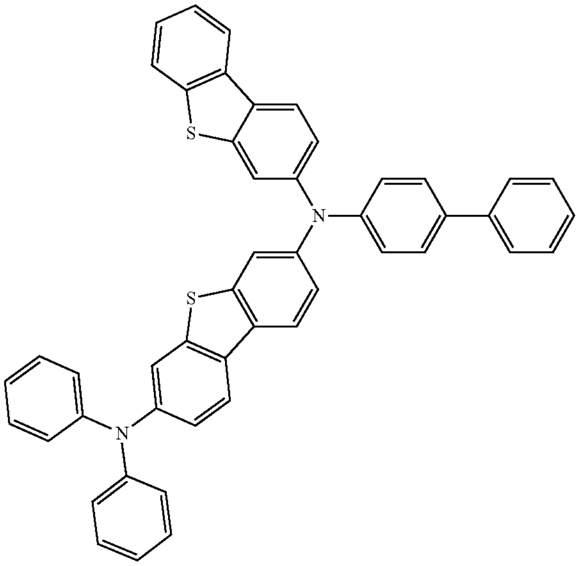
10-123
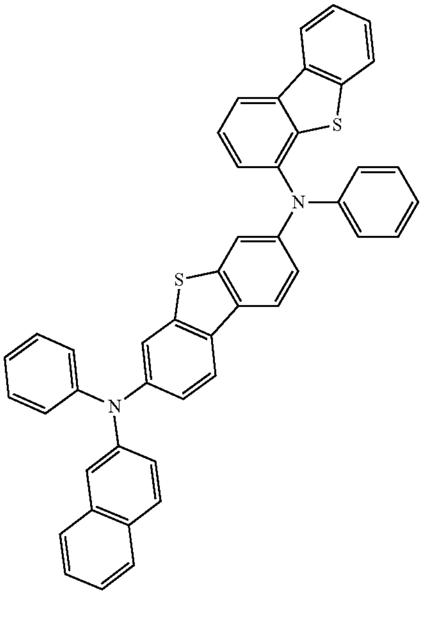
-continued
10-124
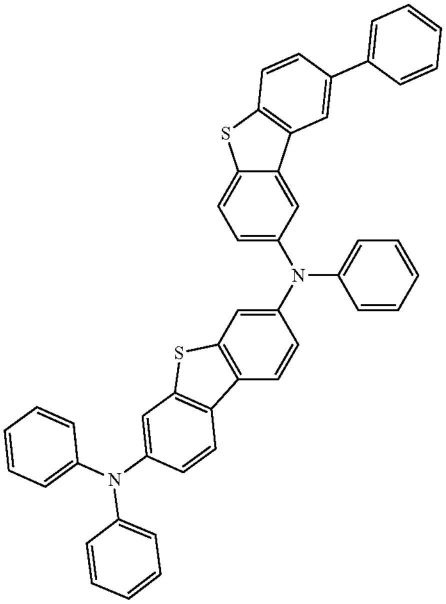
10-125
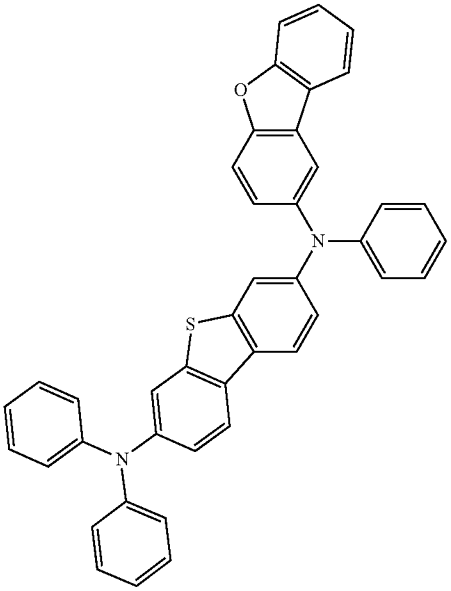

-continued
10-126
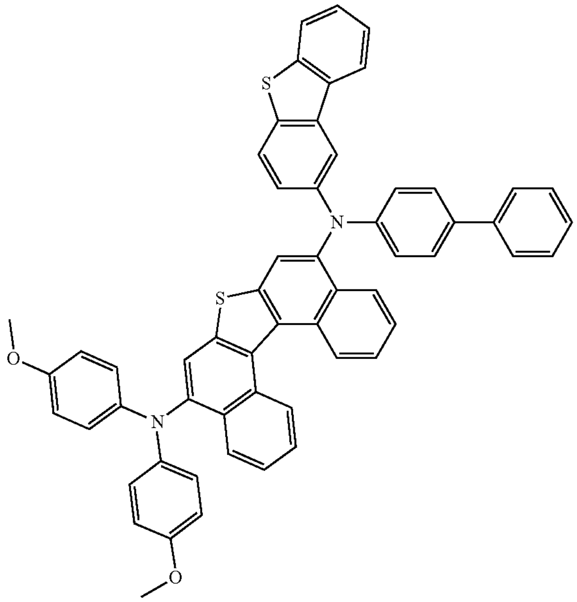
10-127
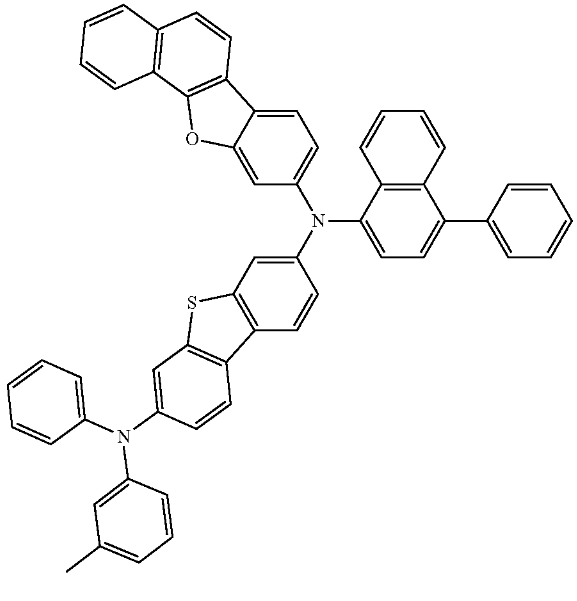
-continued
10-128
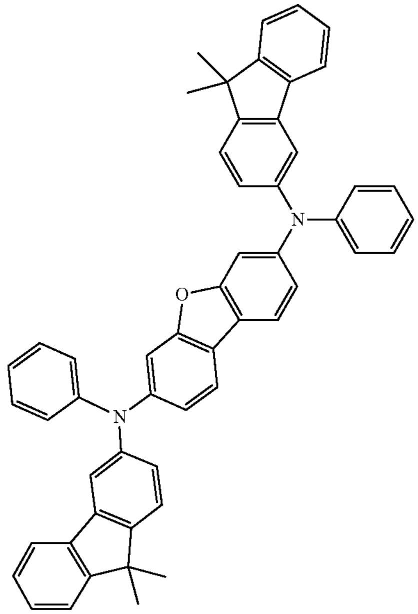
10-129
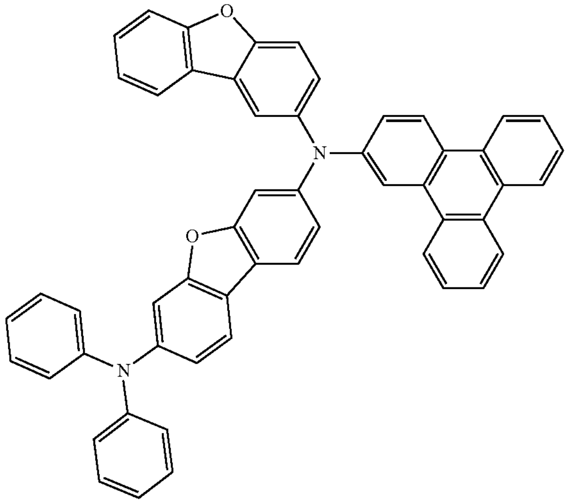

10-130
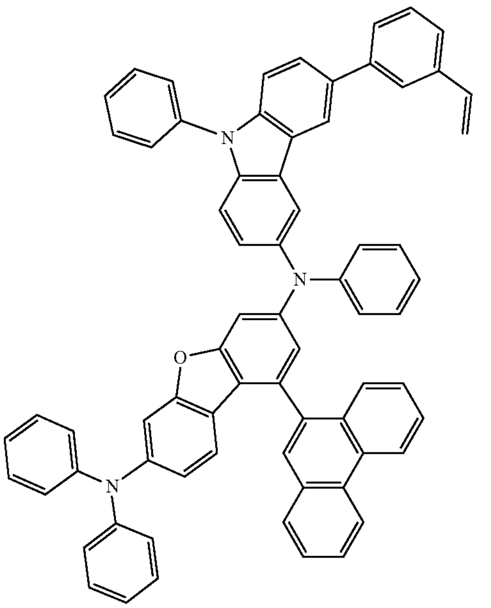
10-131
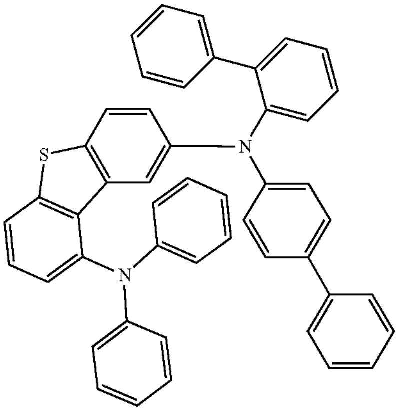
10-132
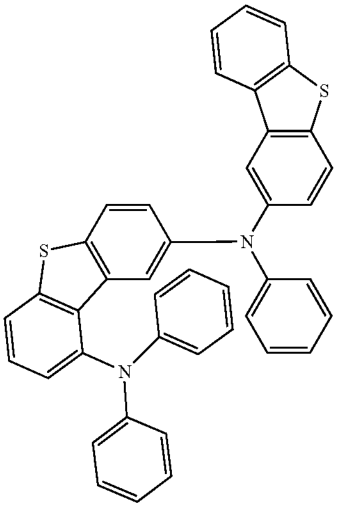
10-133
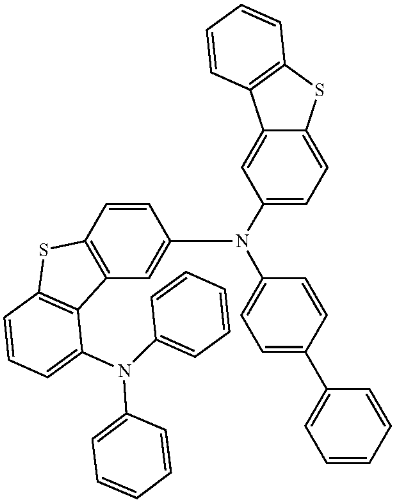
10-134
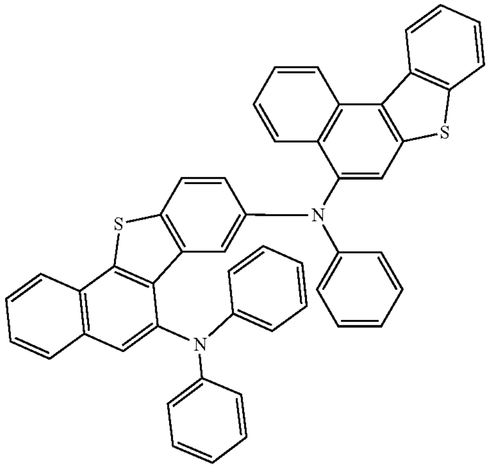
10-135
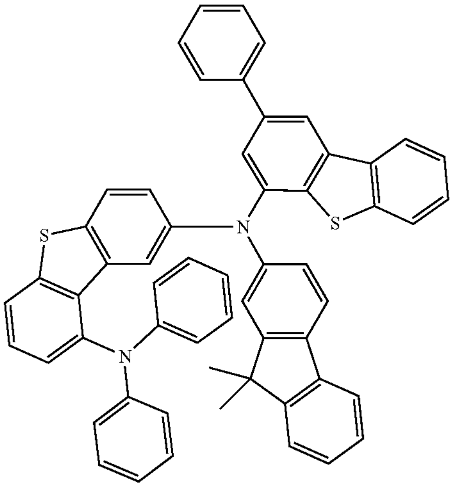

-continued
10-136
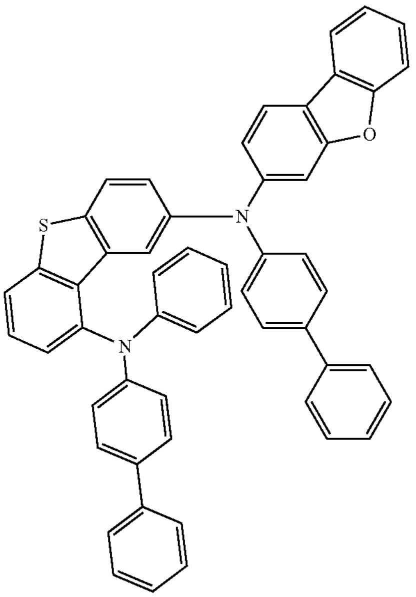
10-137
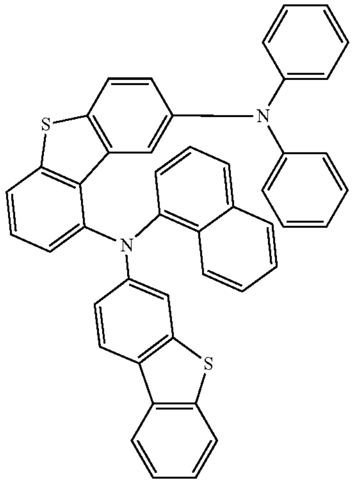
10-138
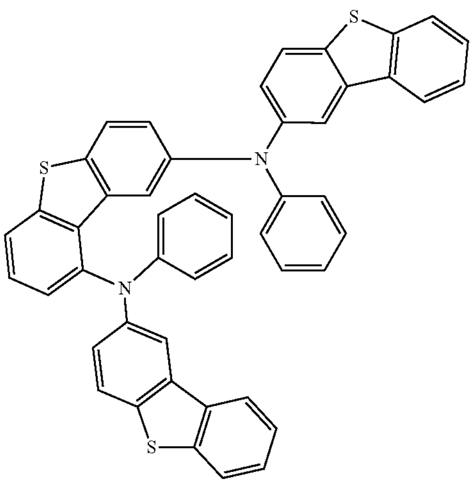
-continued
10-139
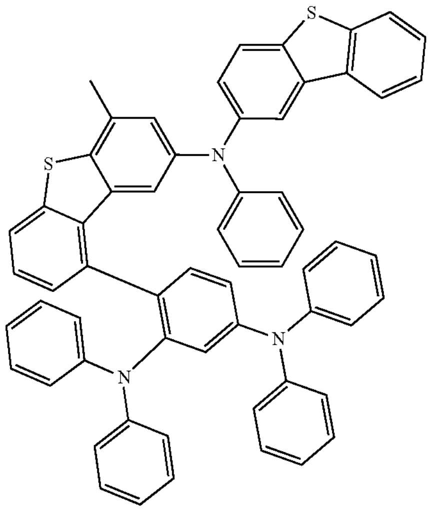
10-140
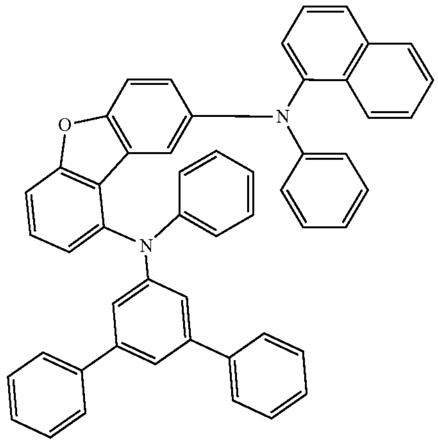
10-141
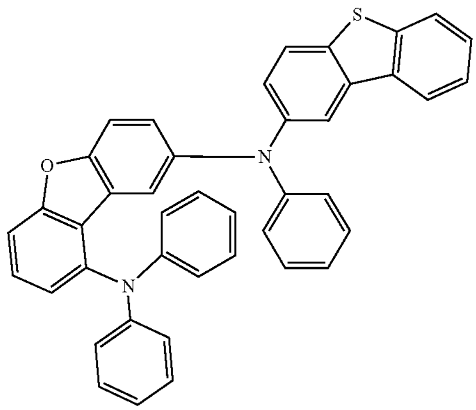

-continued
10-142
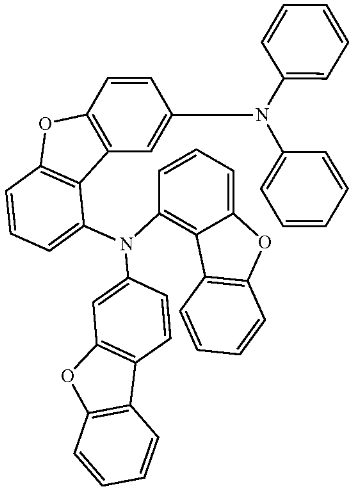
10-143
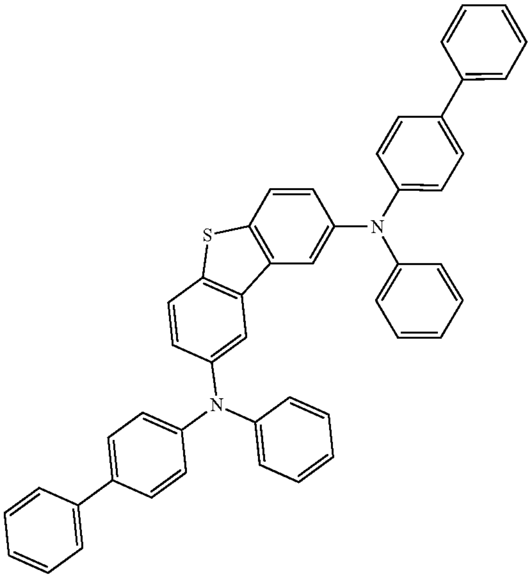
10-144
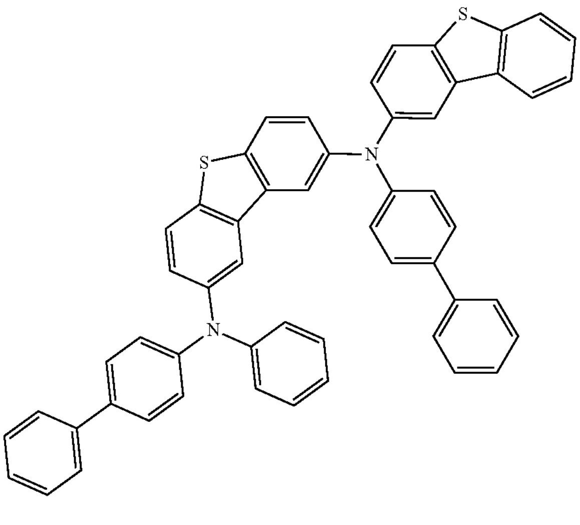
-continued
10-145
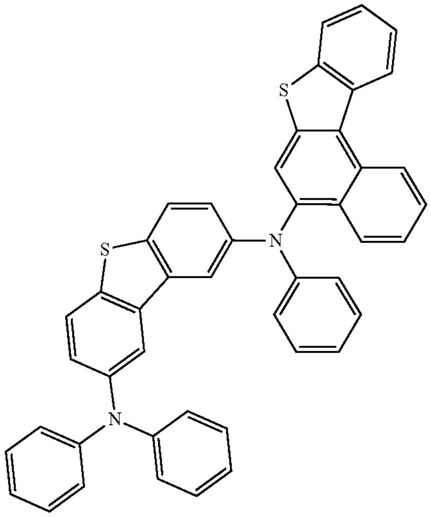
10-146
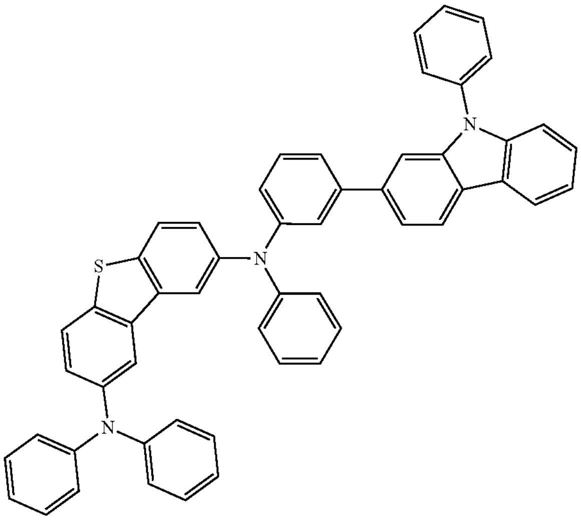
10-147
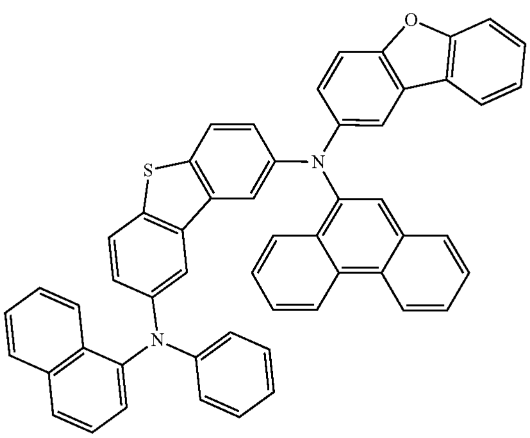

-continued
10-148
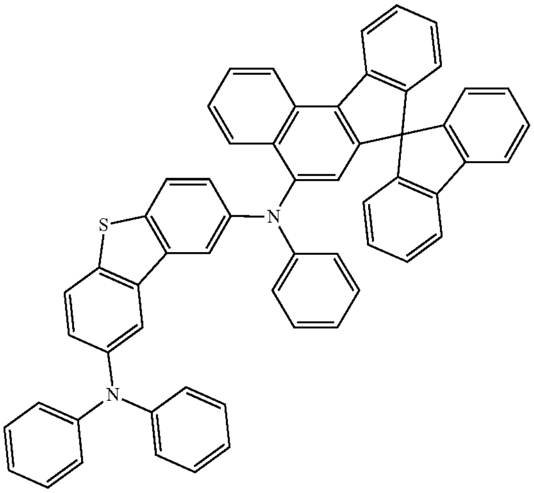
10-149
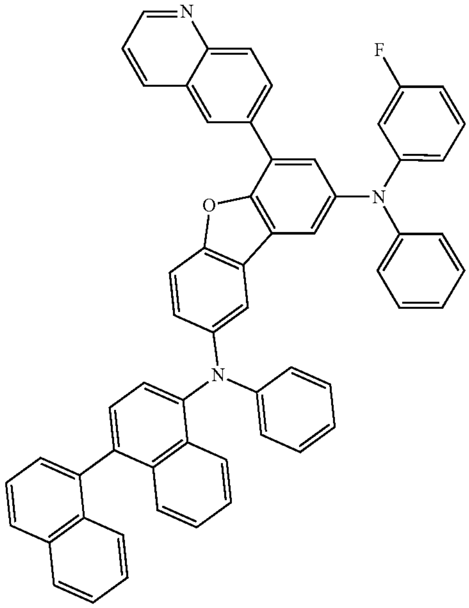
-continued
10-150
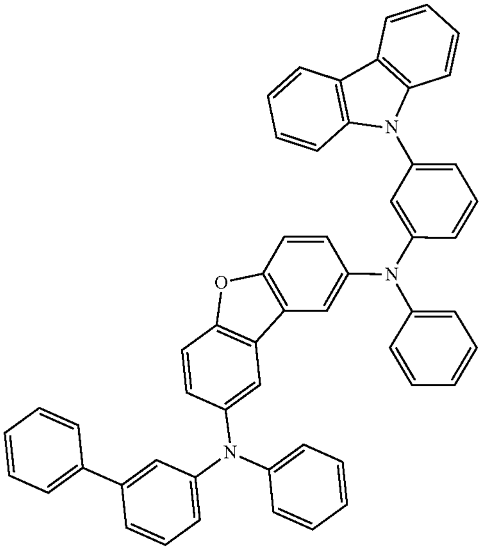
10-151
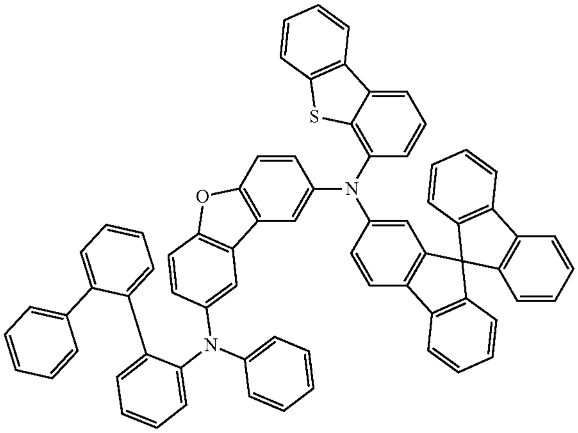
10-152
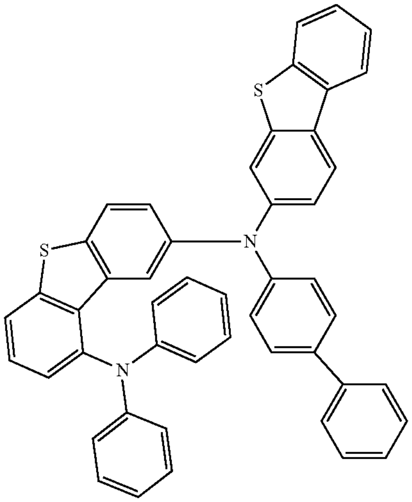

-continued
10-153
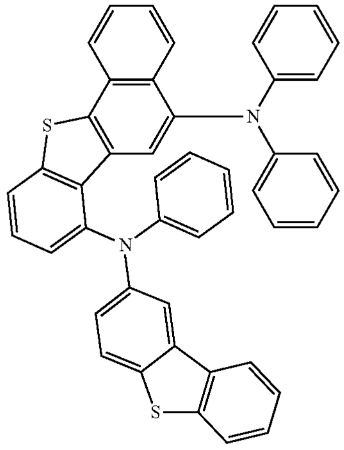
10-154
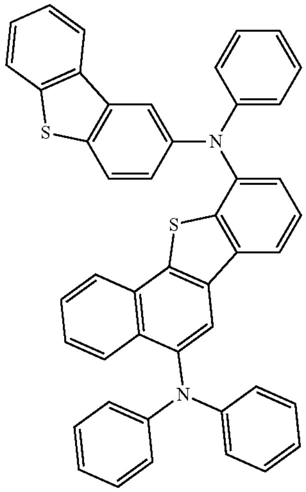
10-155
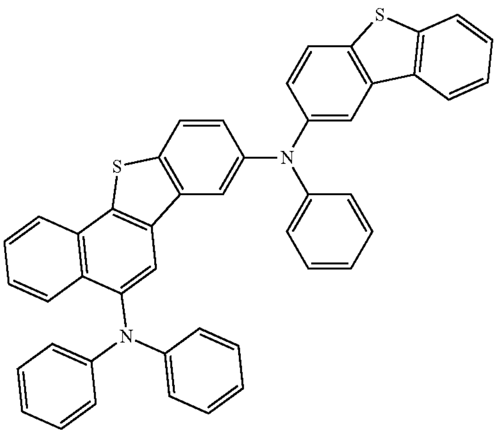
-continued
10-156
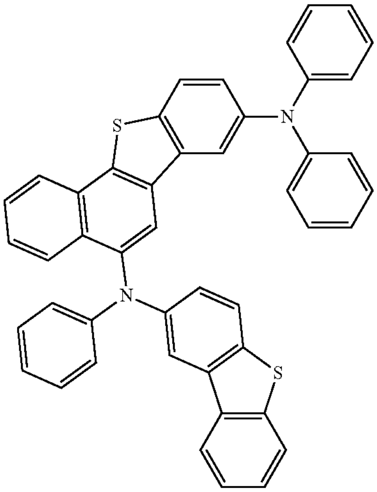
10-157
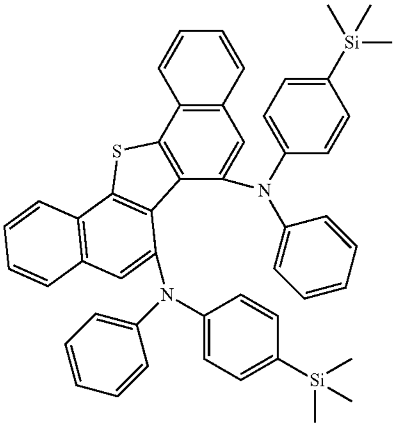
10-158
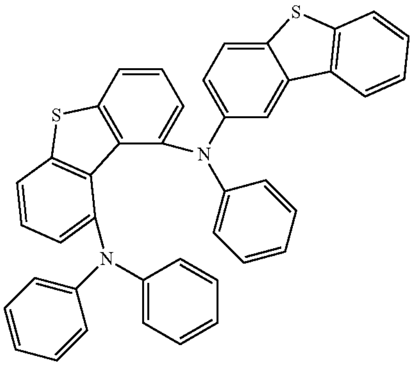

-continued
10-159
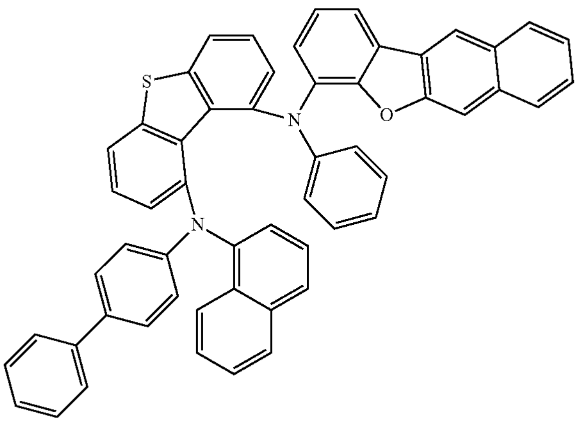
10-160
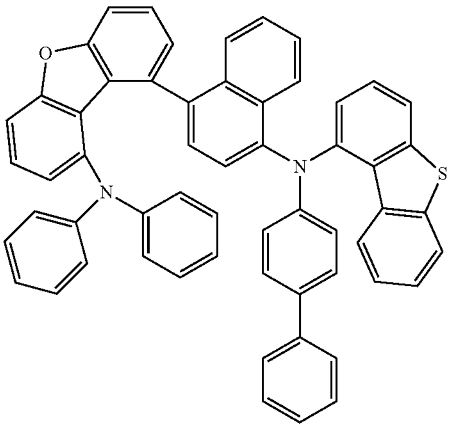
10-161
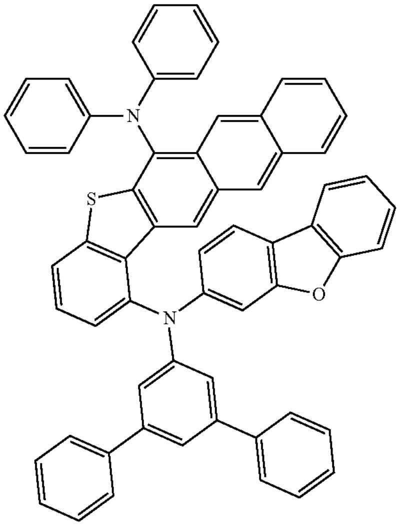
-continued
10-162
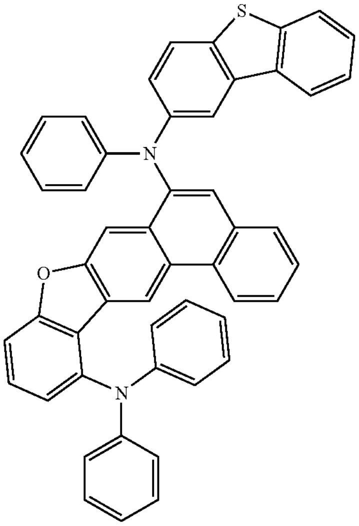
10-163
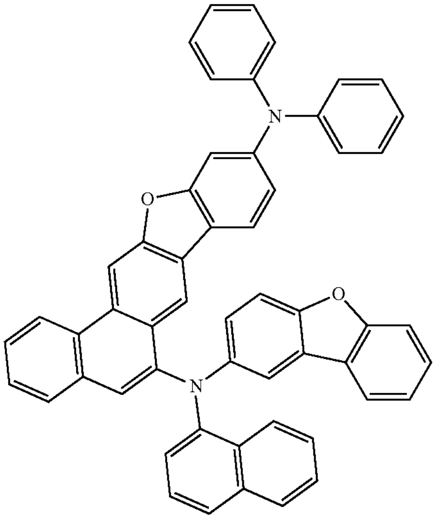
10-164
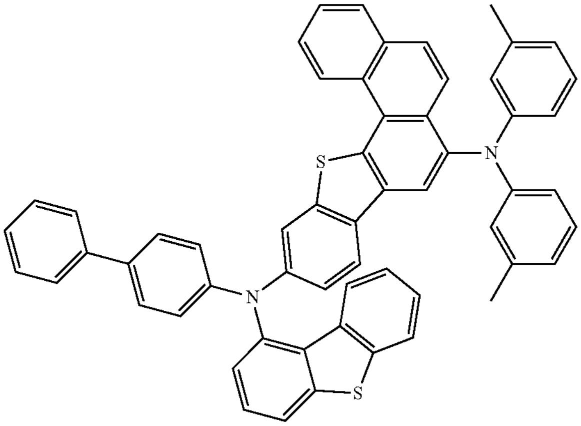

-continued
10-165
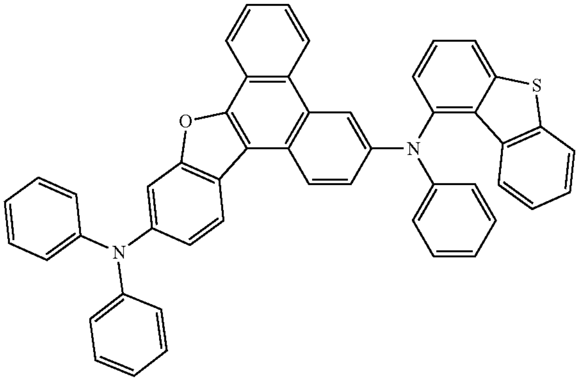
10-166
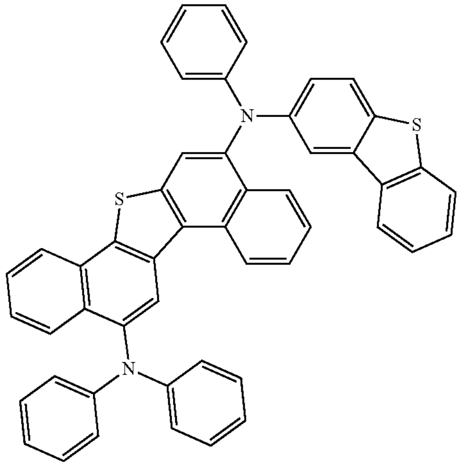
10-167
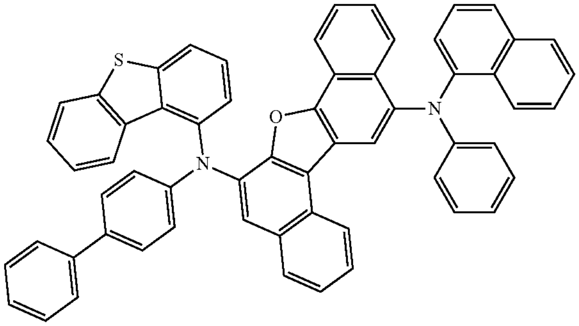
-continued
10-168
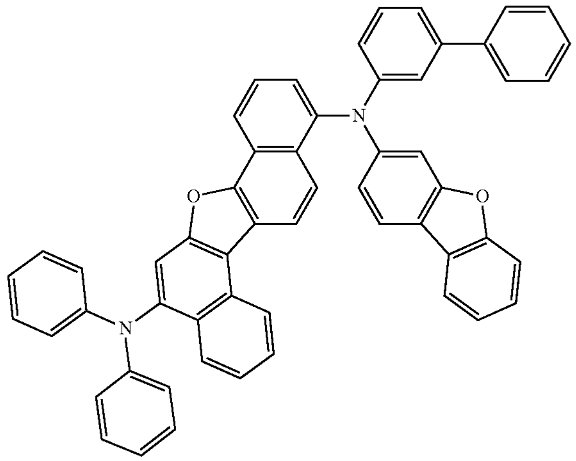
10-169
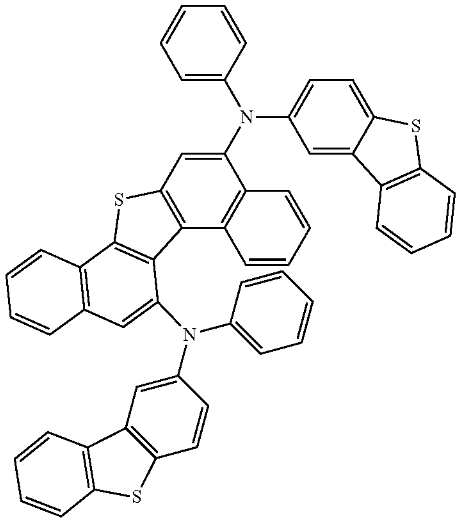
10-170
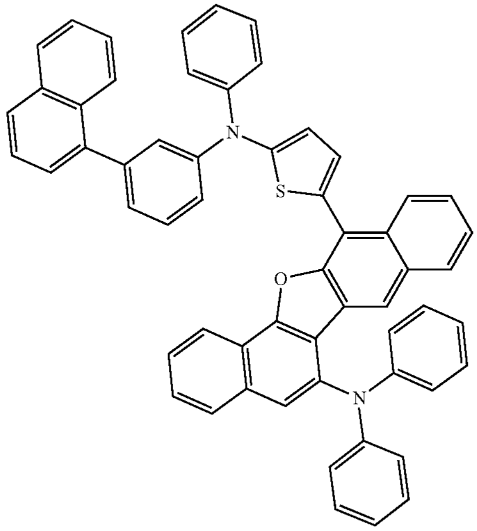

10-171
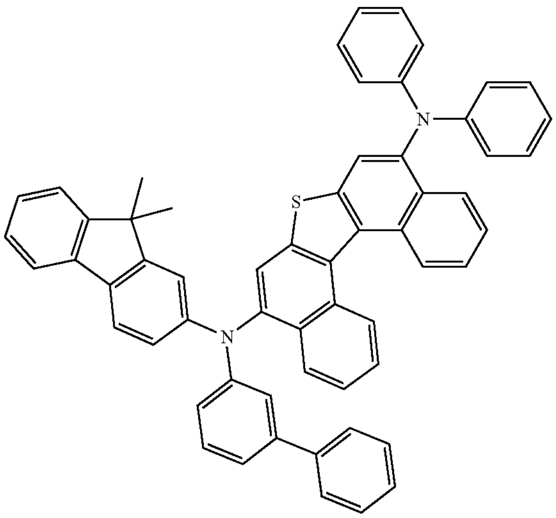
10-172
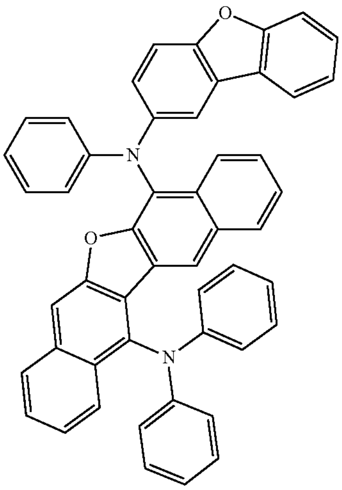
10-173
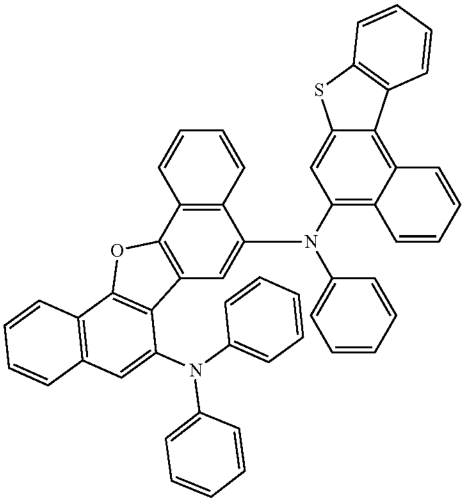
10-174
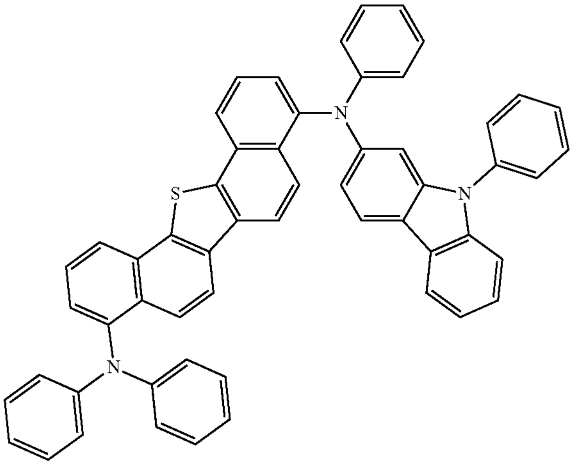
10-175
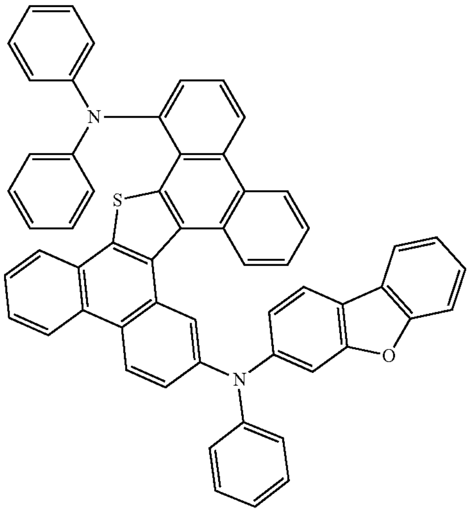
10-176
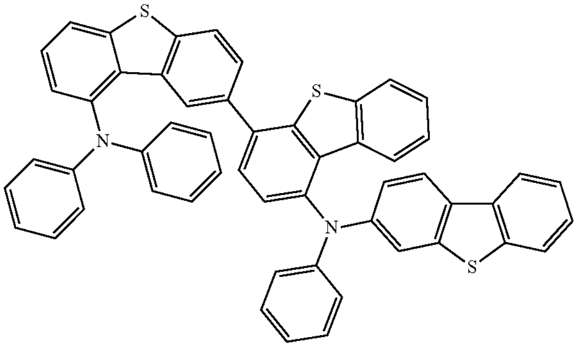

-continued
10-177
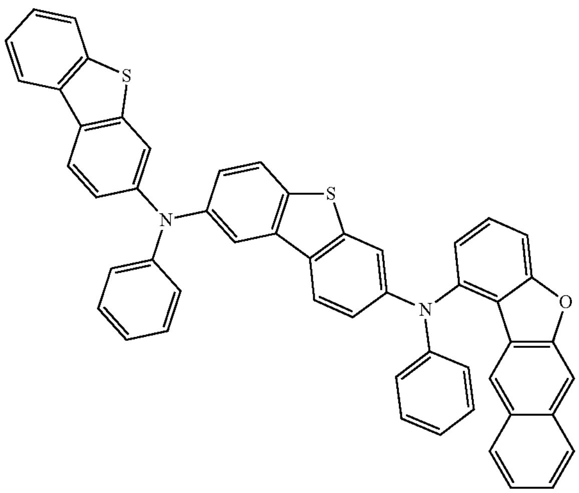
10-178
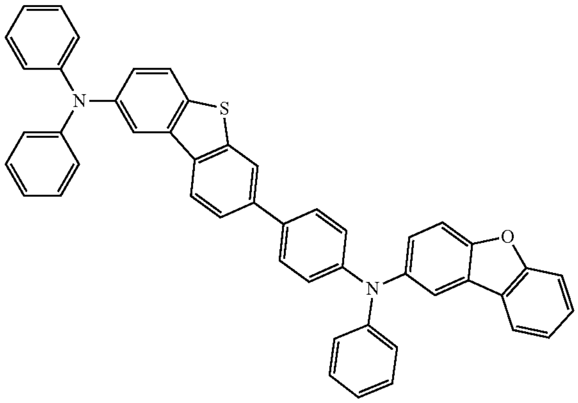
10-179
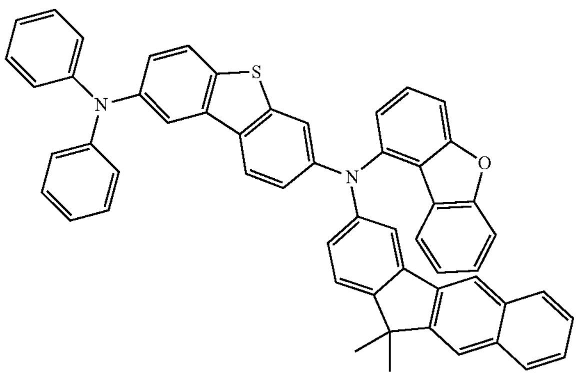
-continued
10-180
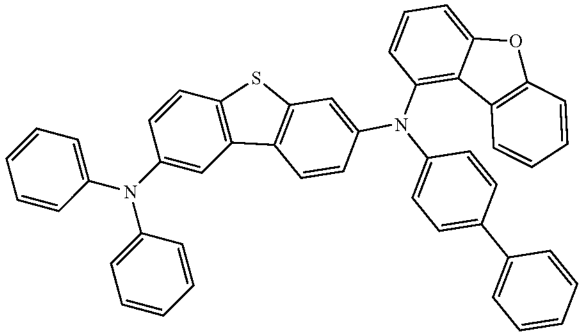
10-181
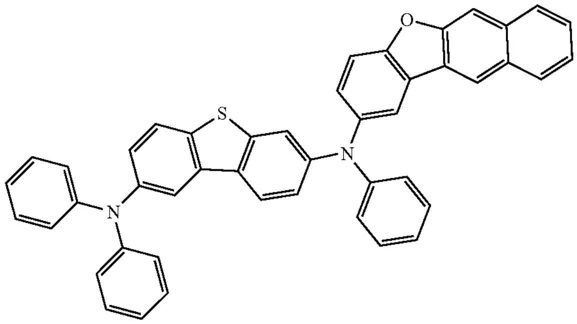
10-182
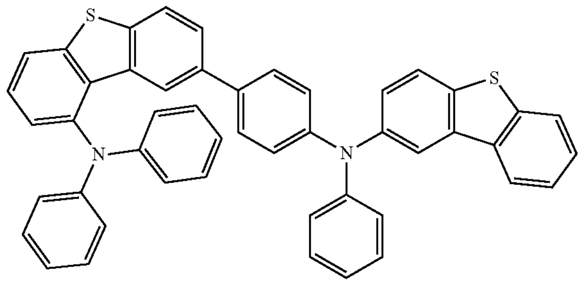
10-183
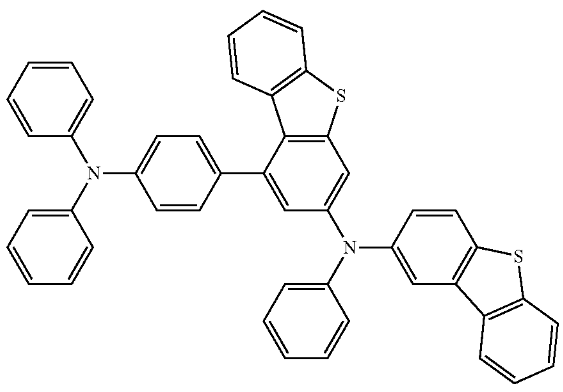

-continued
10-184
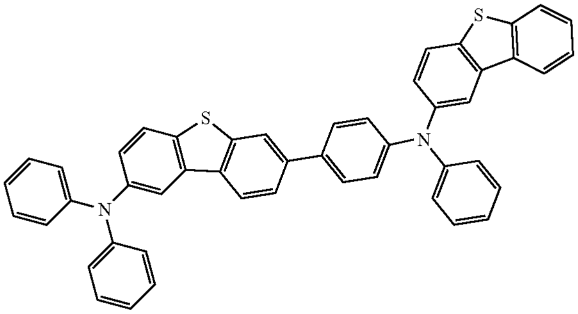
10-185
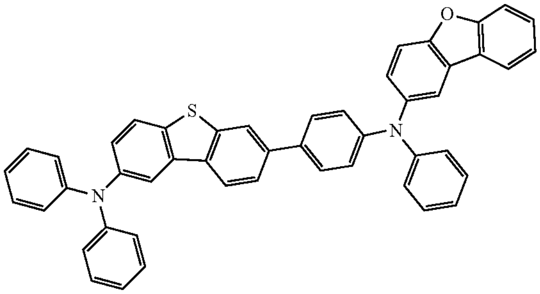
10-186
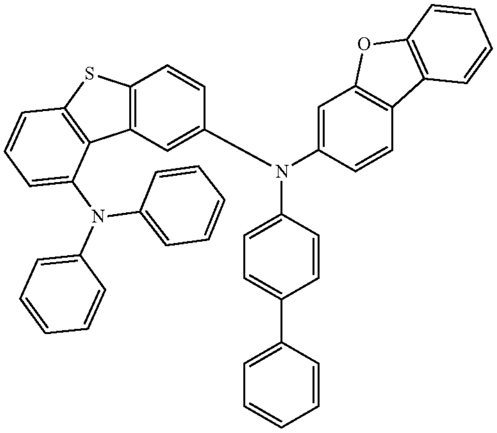
10-187
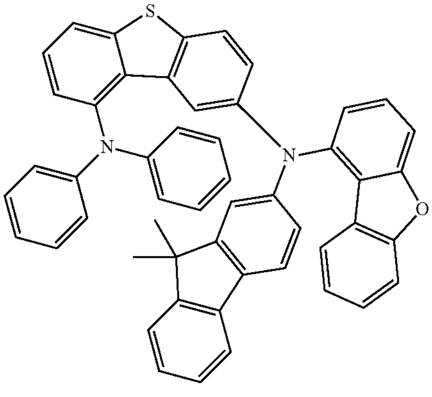
-continued
10-188
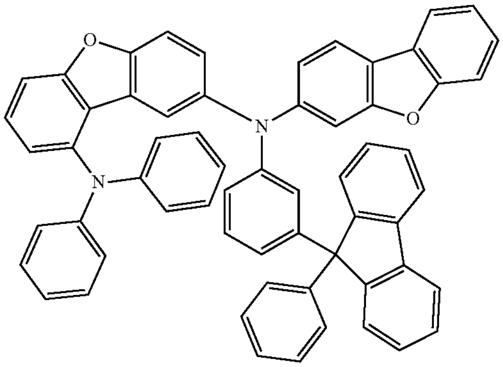
10-189
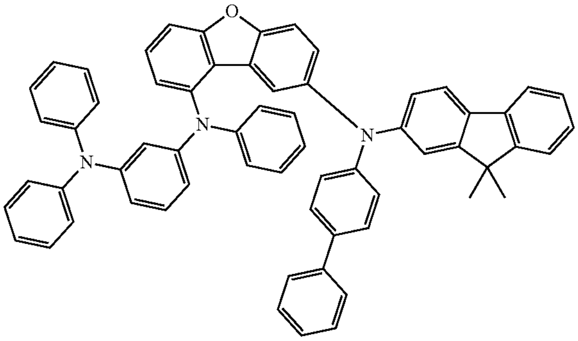
11-1
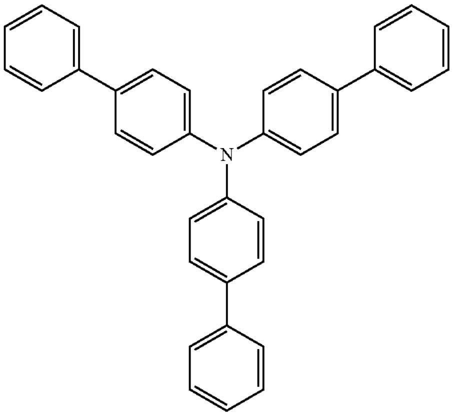
11-2
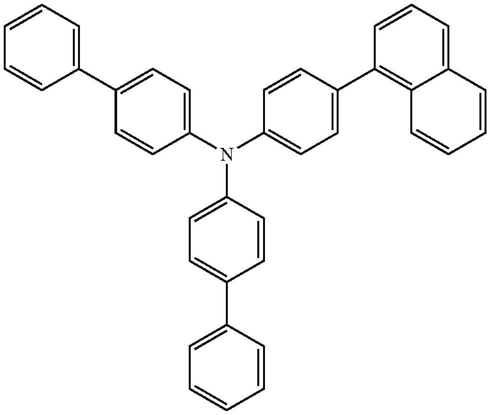

-continued
11-3
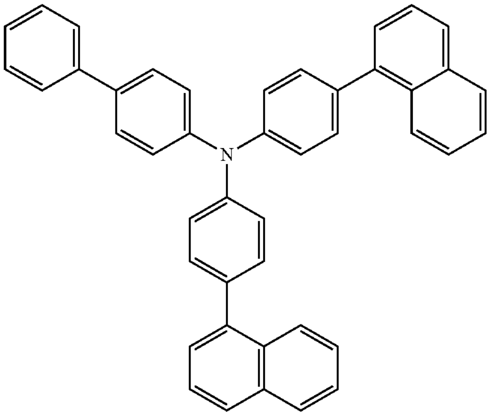
11-4
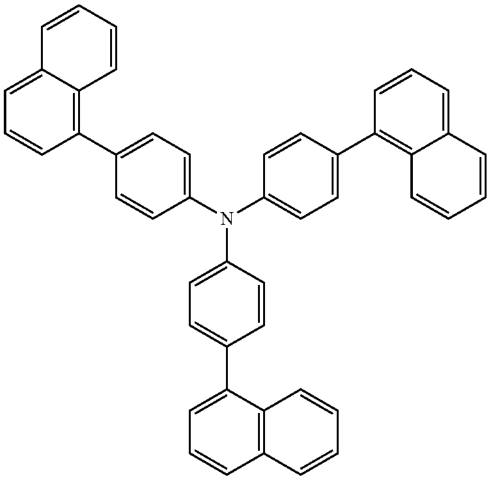
11-5
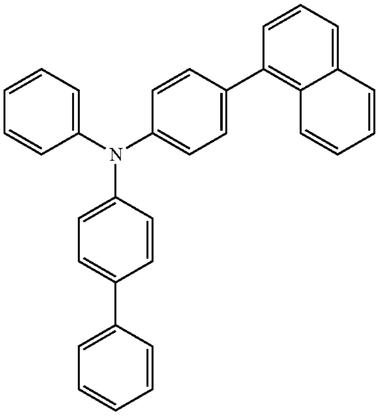
11-6
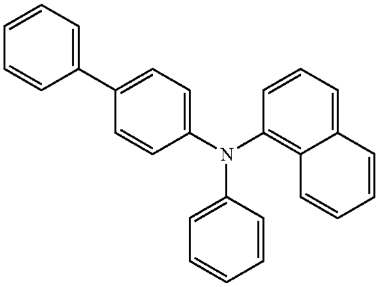
11-7
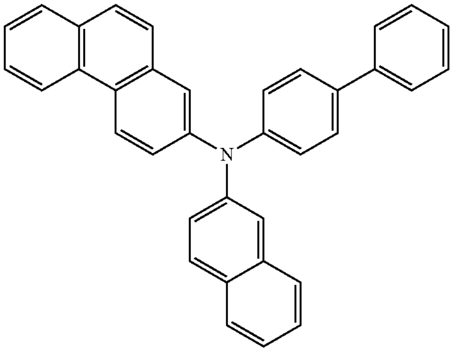
11-8
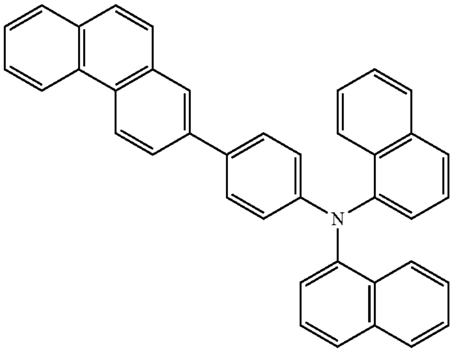
11-9
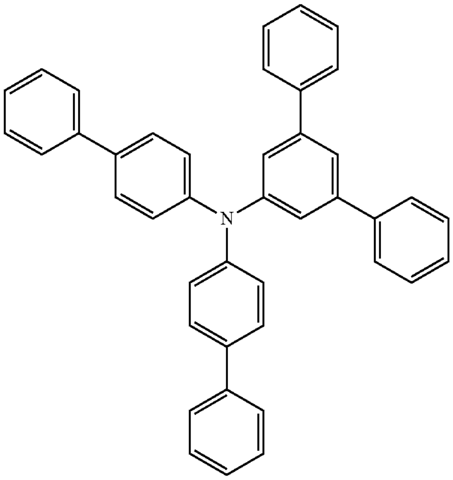

-continued
11-10
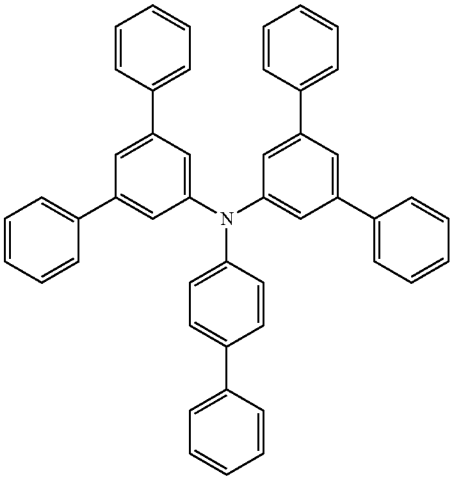
11-11
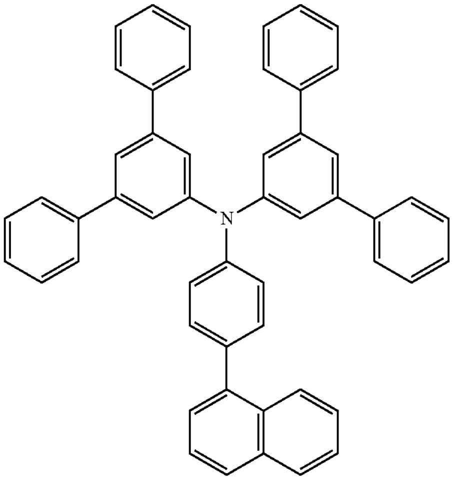
11-12
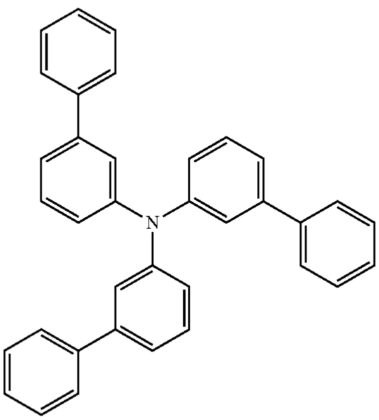
-continued
11-13
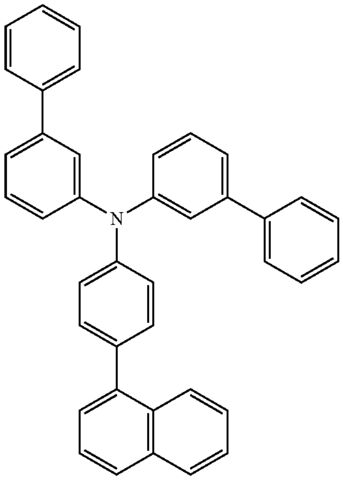
11-14
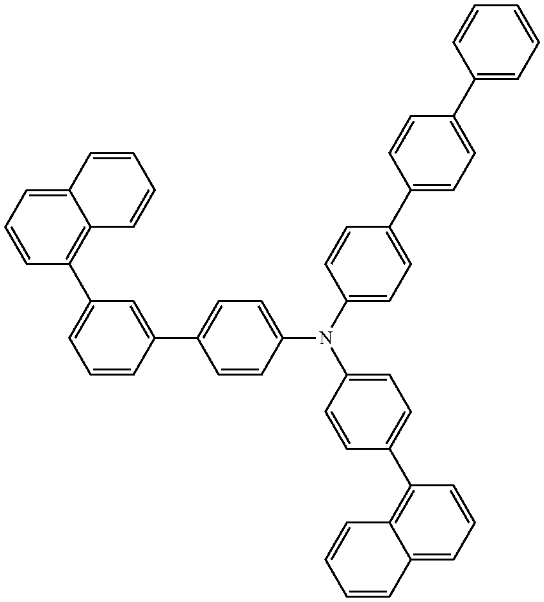
11-15
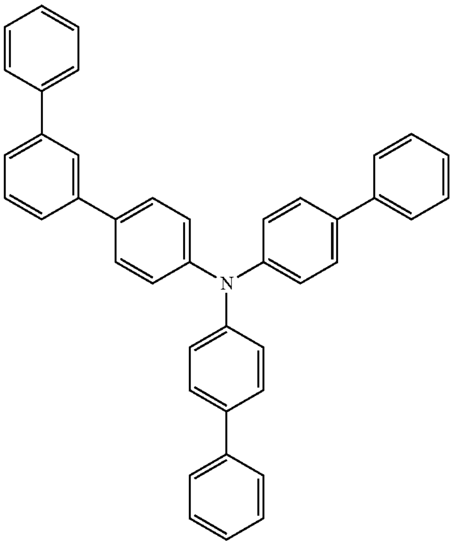

-continued
11-16
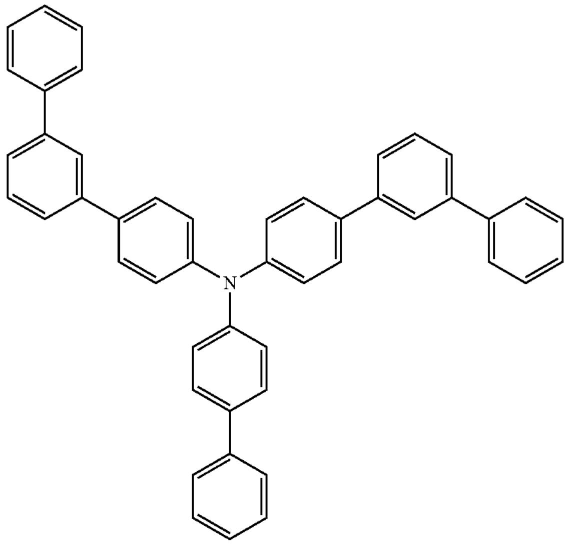
11-17
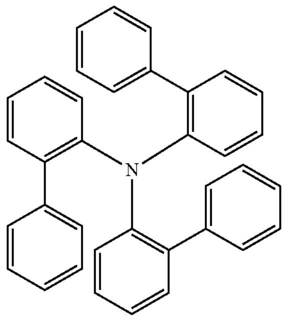
11-18
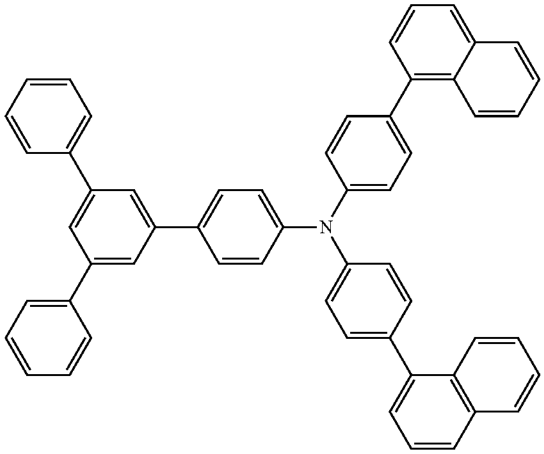
-continued
11-19
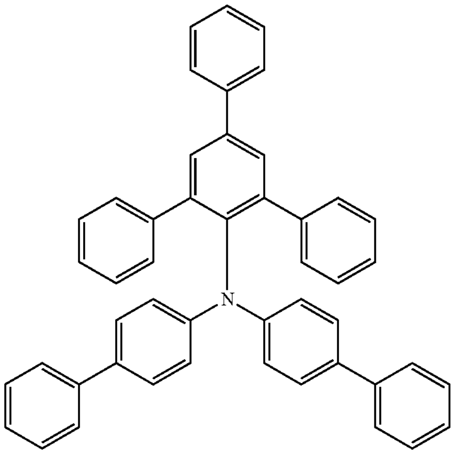
11-20
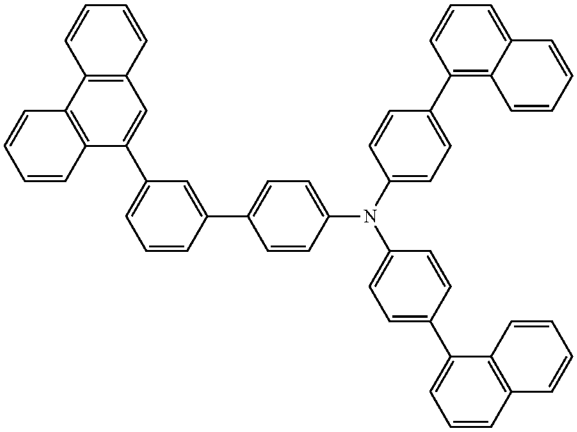
11-21
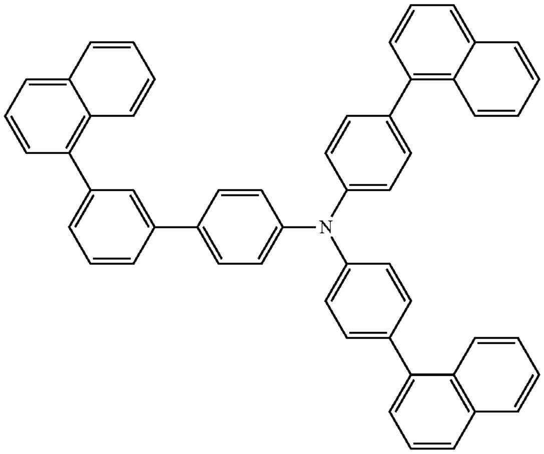

-continued
11-22
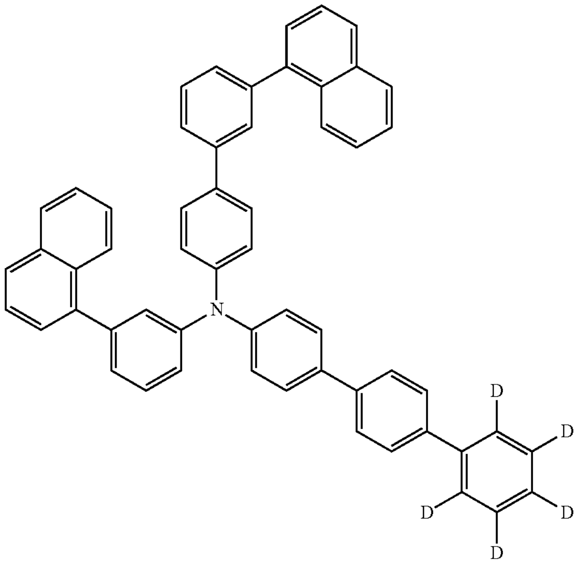
11-23
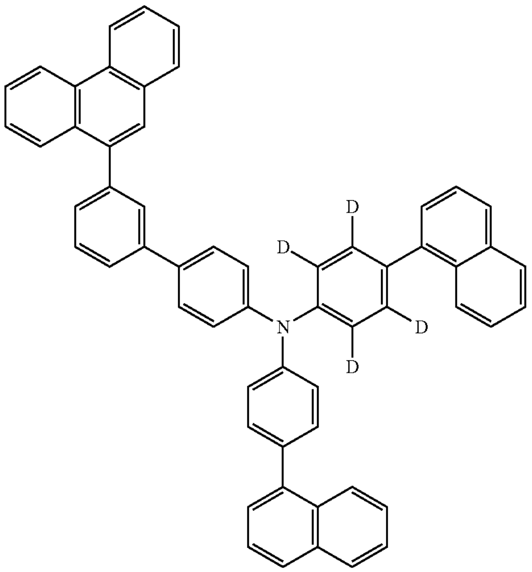
-continued
12-1
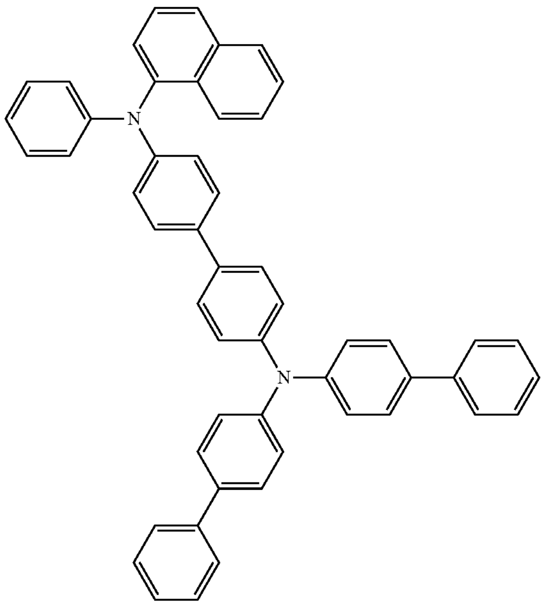
12-2
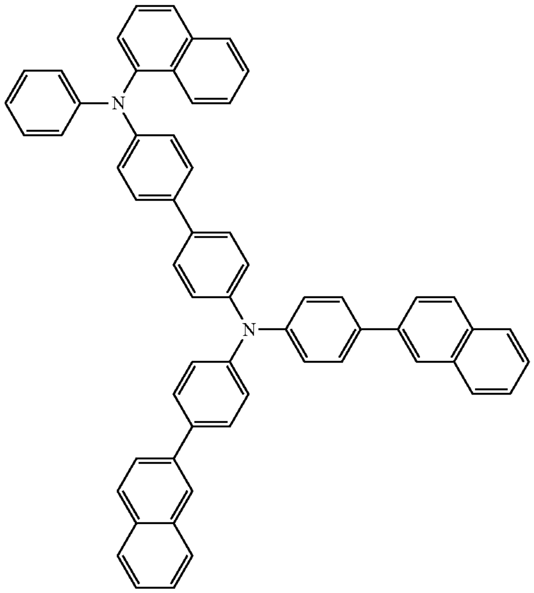

-continued
12-3
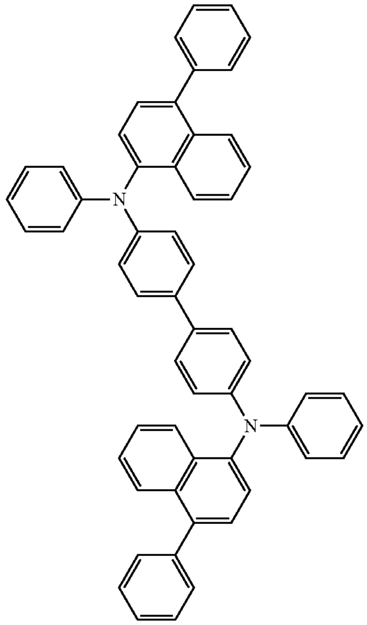
12-4
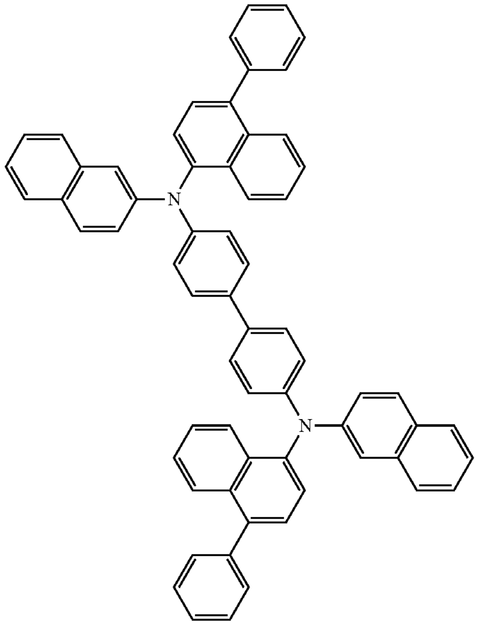
-continued
12-5
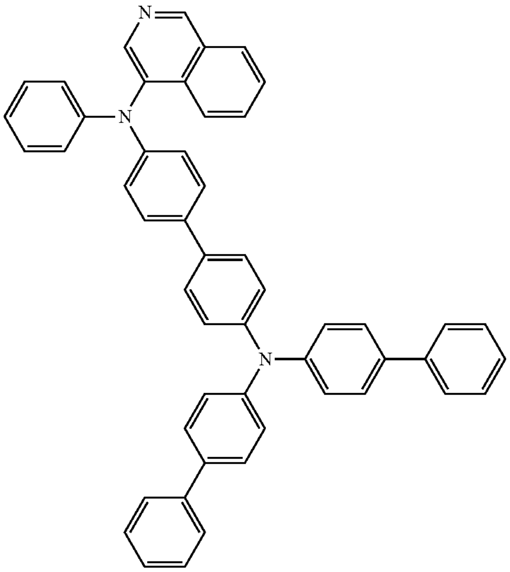
12-6
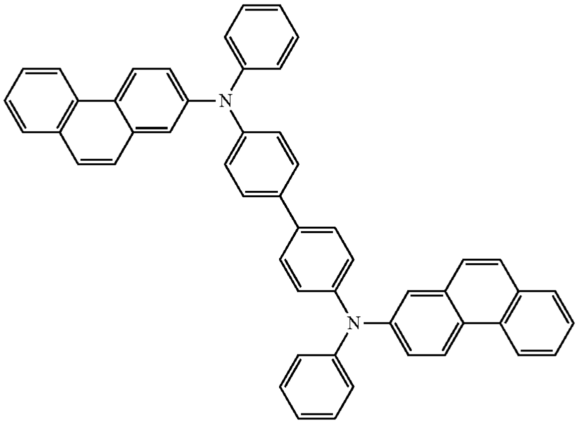
12-7
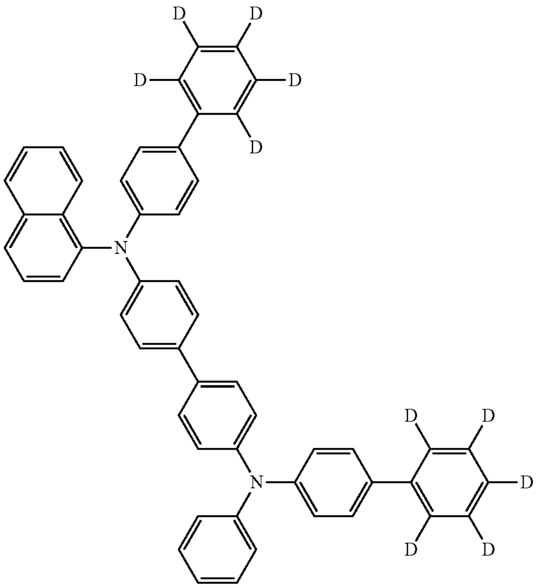

-continued
12-8
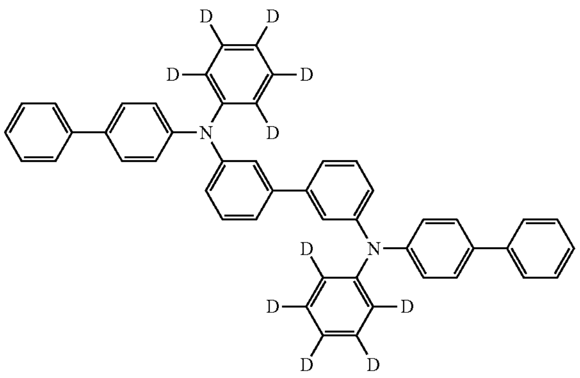
12-9
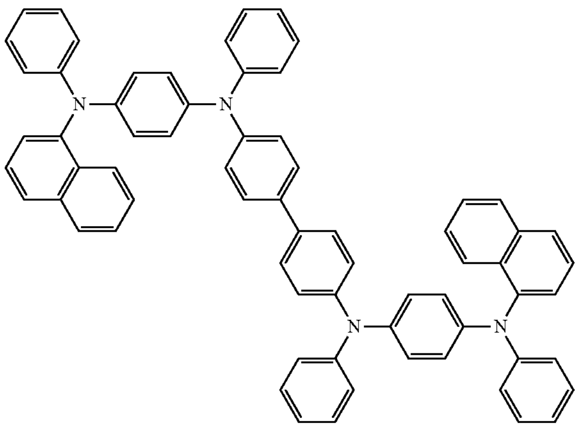
12-10
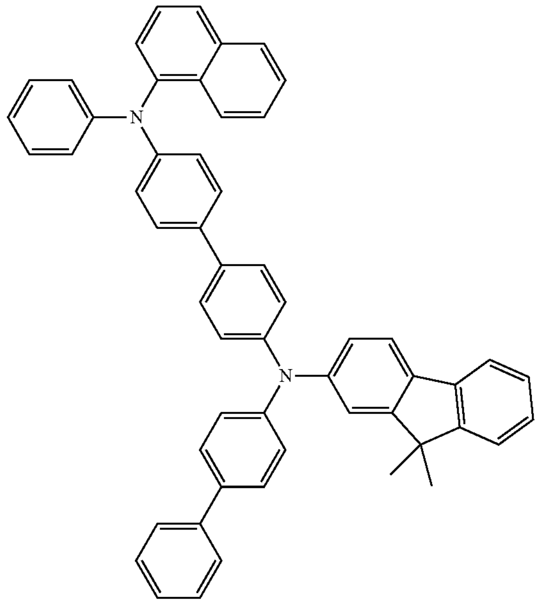
-continued
12-11
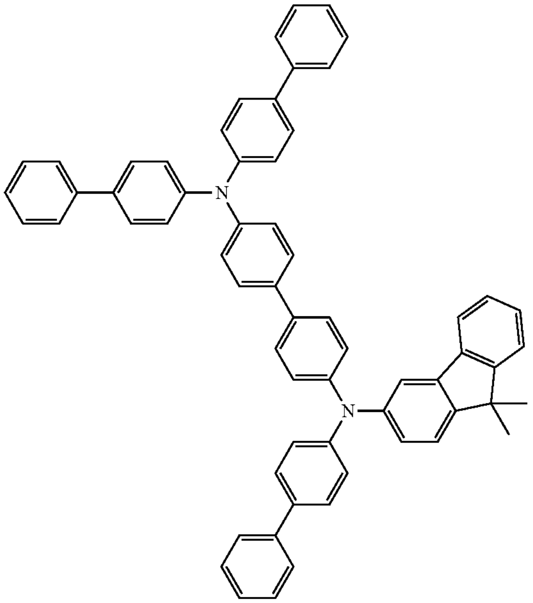
12-12
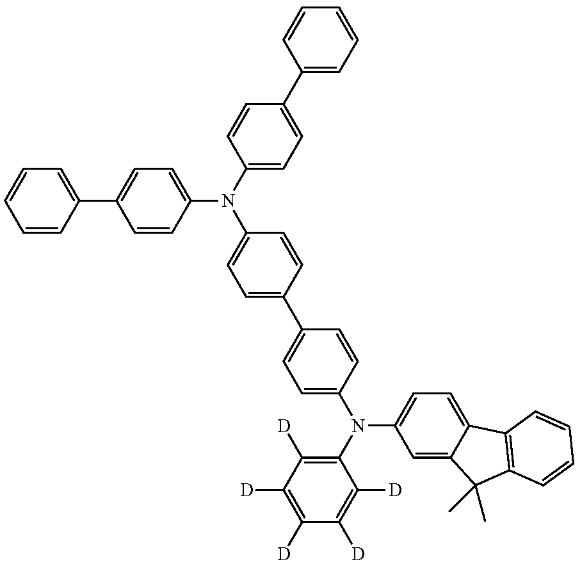

-continued
12-13
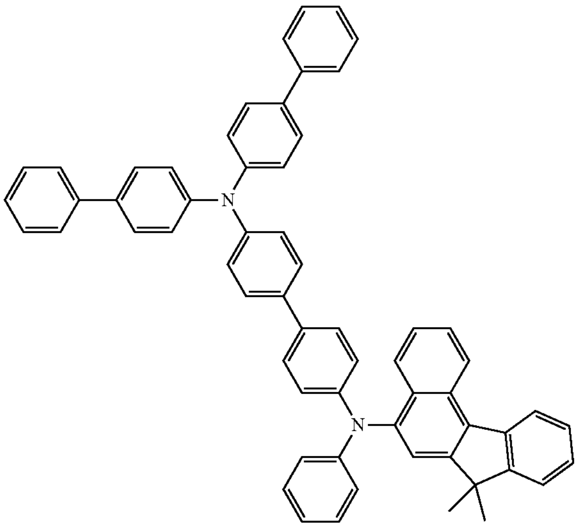
12-14
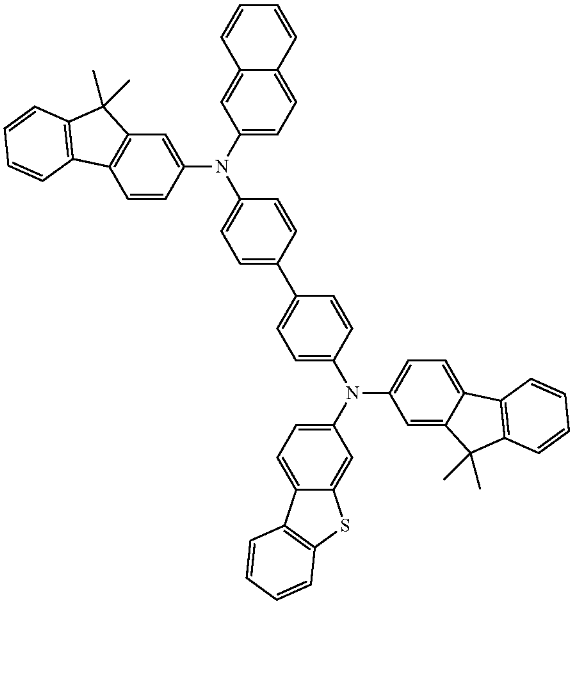
-continued
12-15
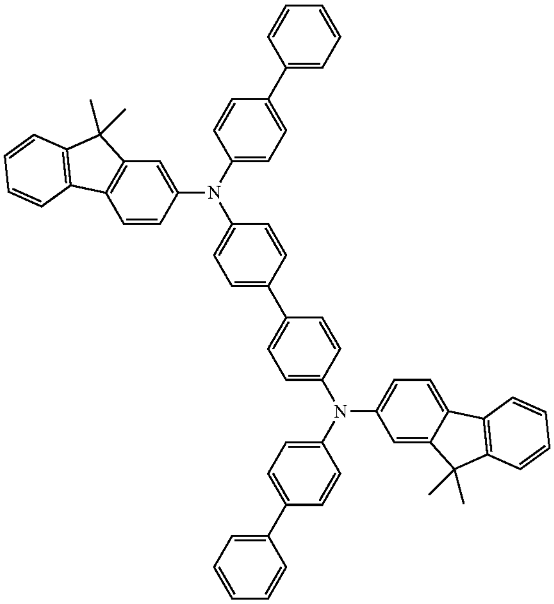
12-16
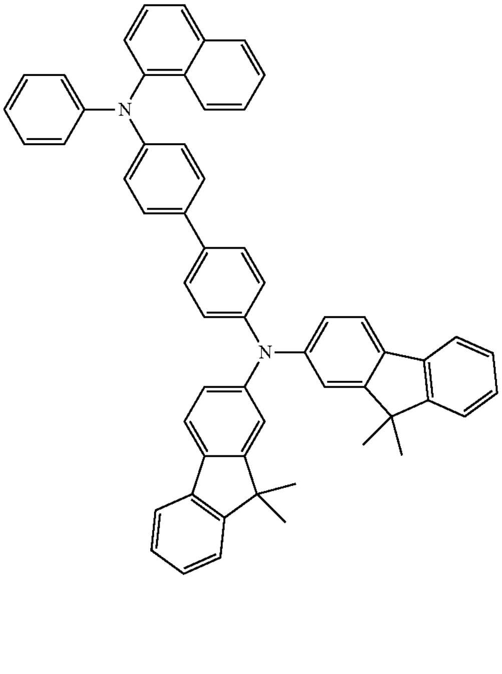

-continued
12-17
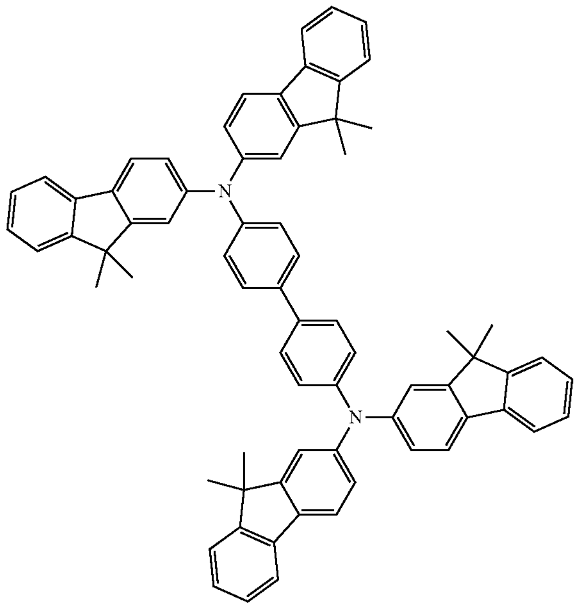
12-18
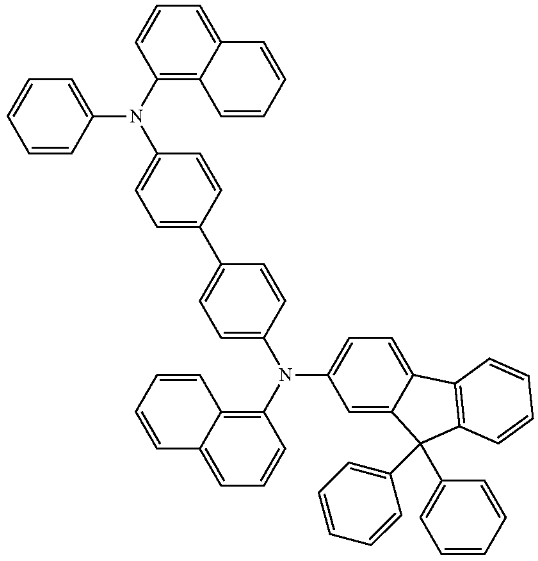
-continued
12-19
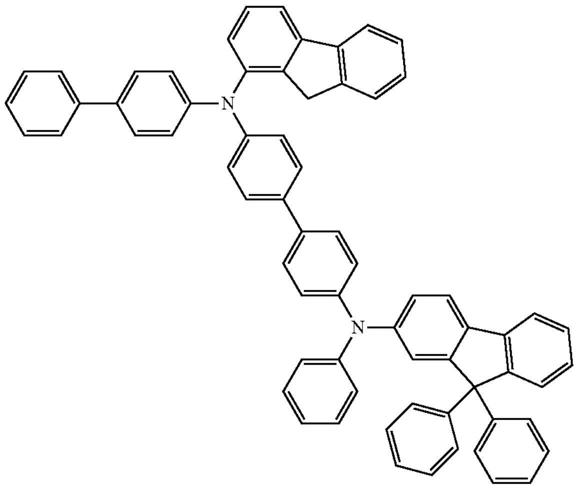
12-20
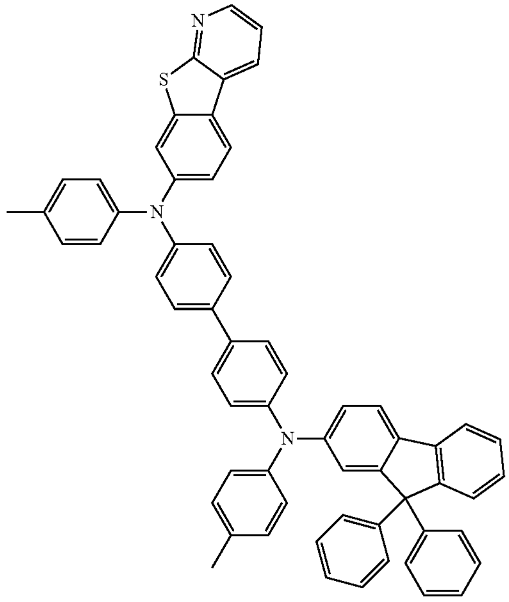

-continued
12-21
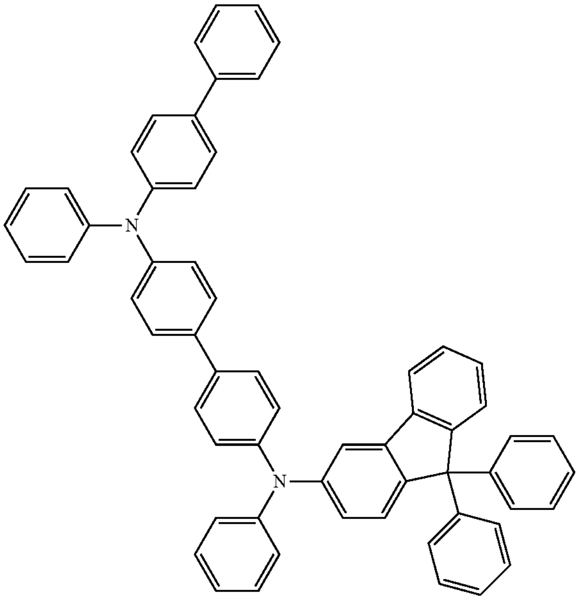
12-22
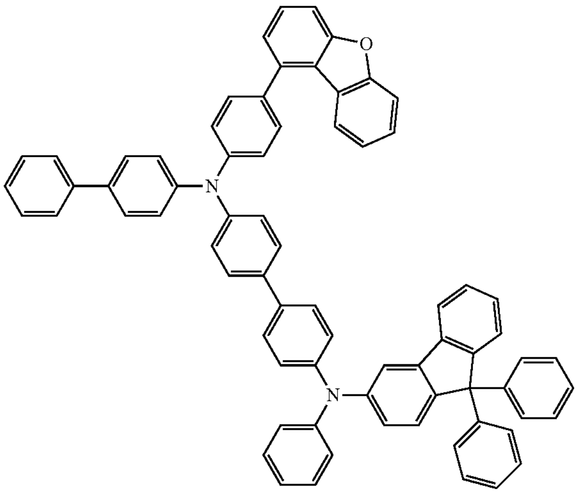
-continued
12-23
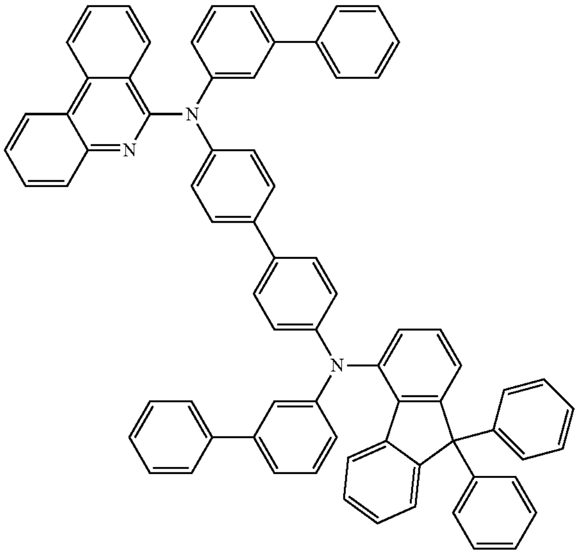
12-24
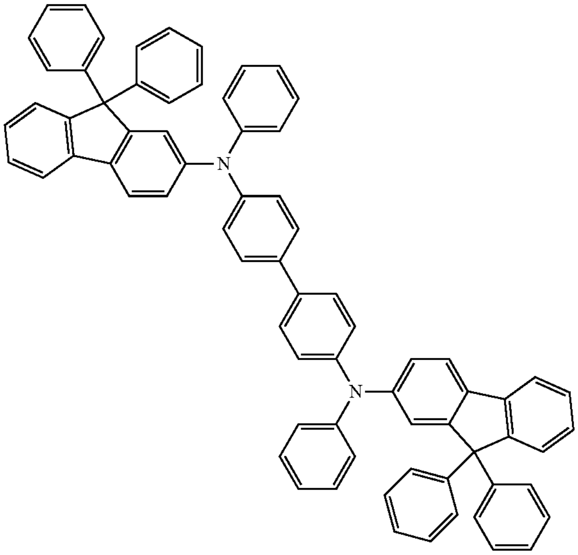

-continued
12-21
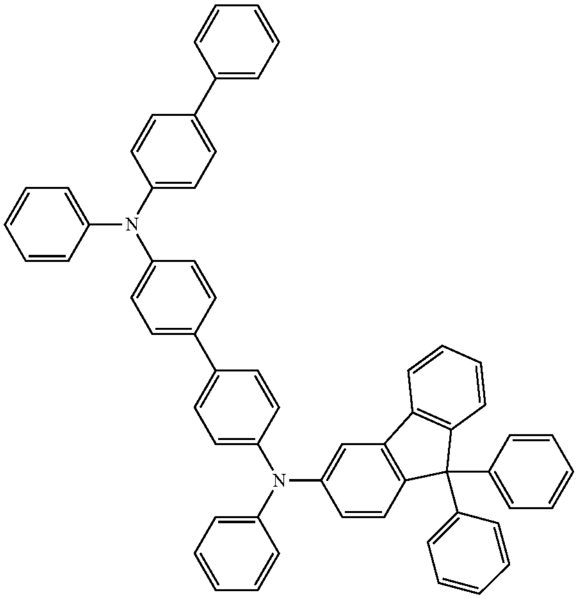
12-22
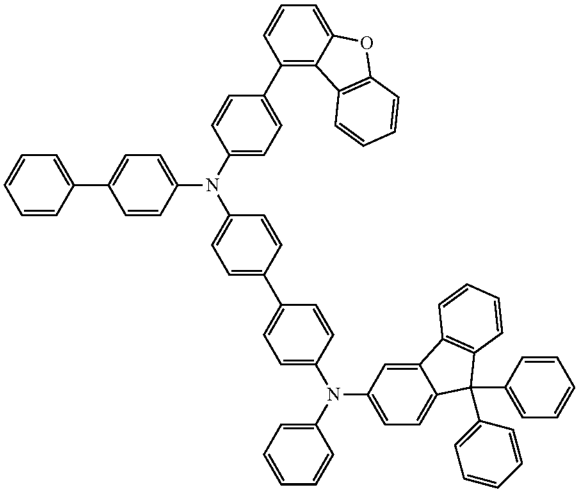
-continued
12-23
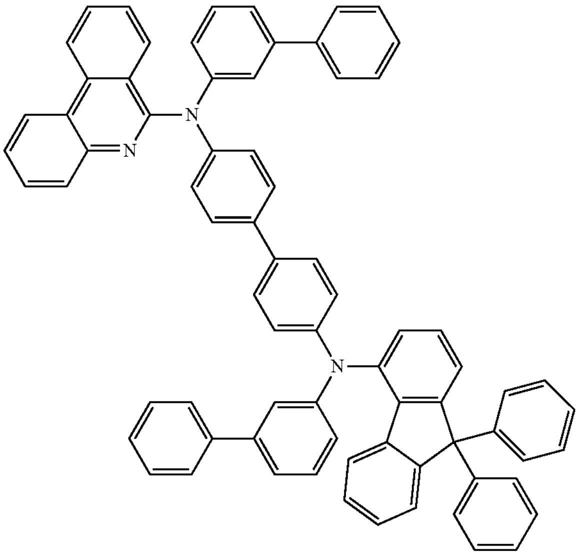
12-24
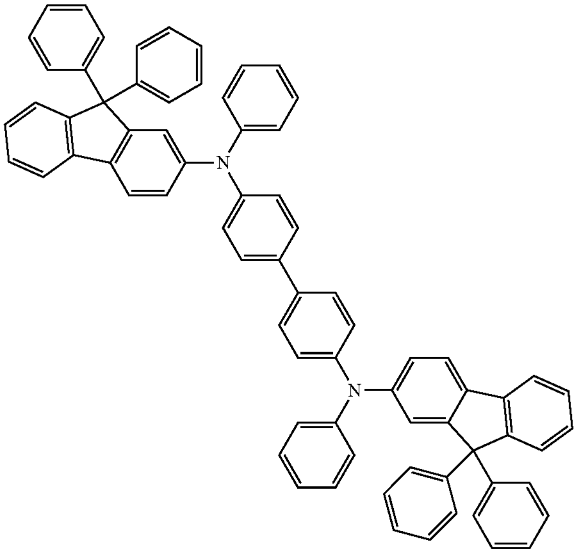

-continued
12-25
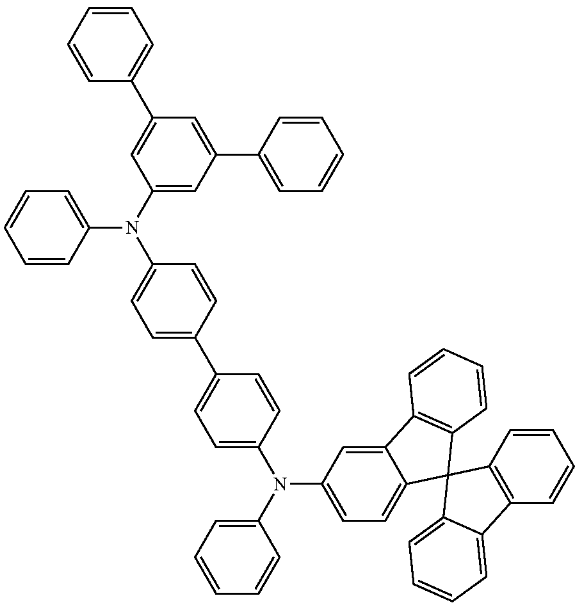
12-26
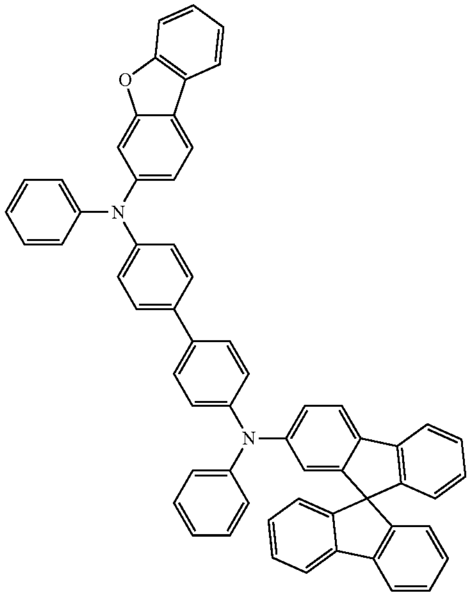
-continued
12-27
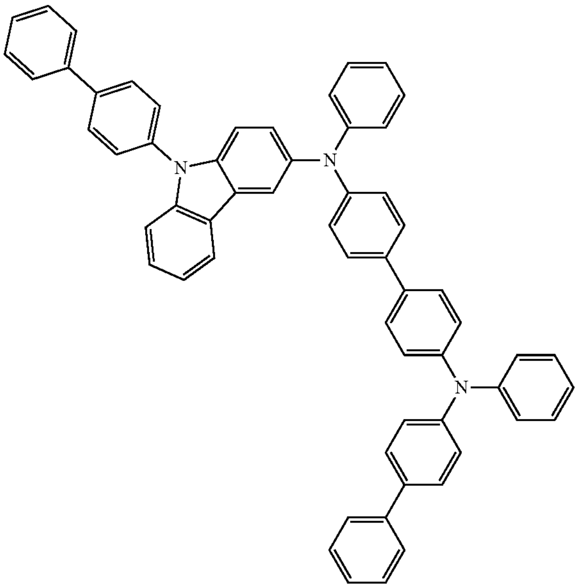
12-28
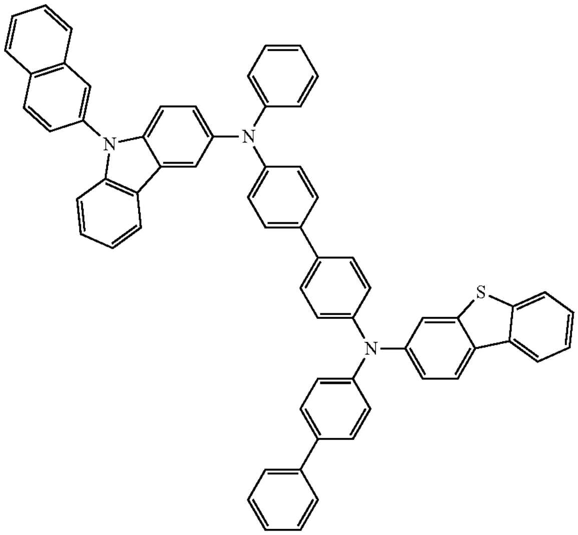

-continued
12-29
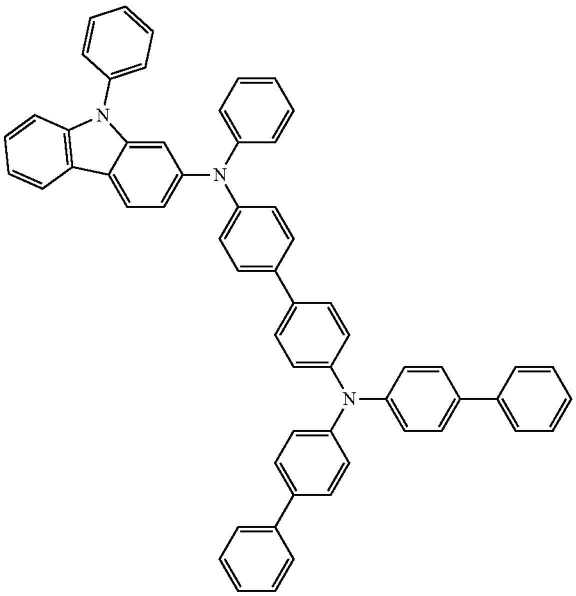
12-30
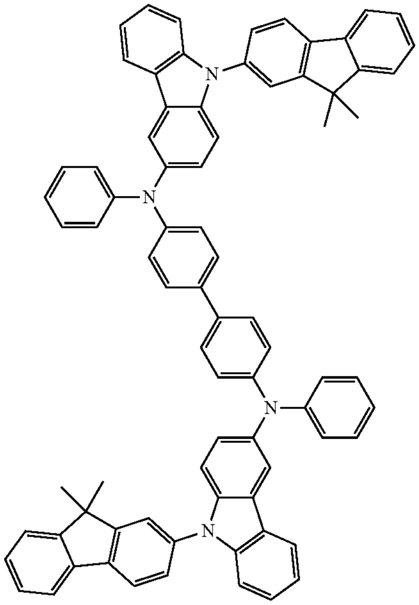
-continued
12-31
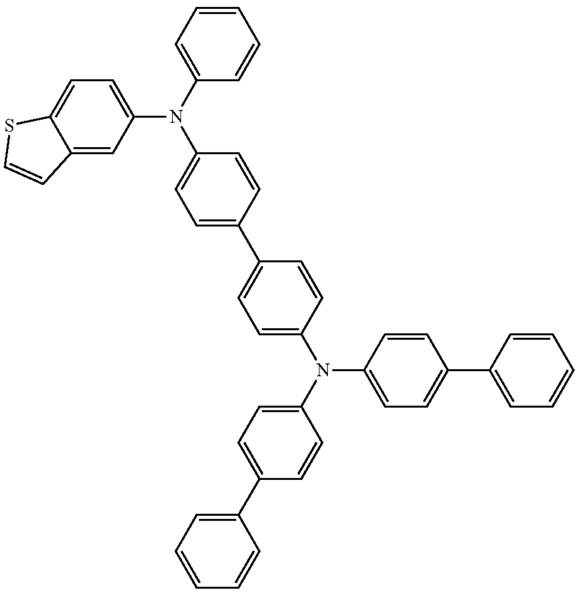
12-32
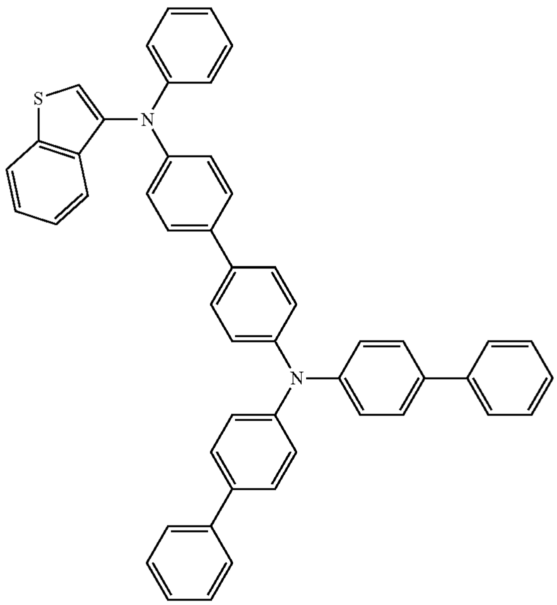

-continued
12-33
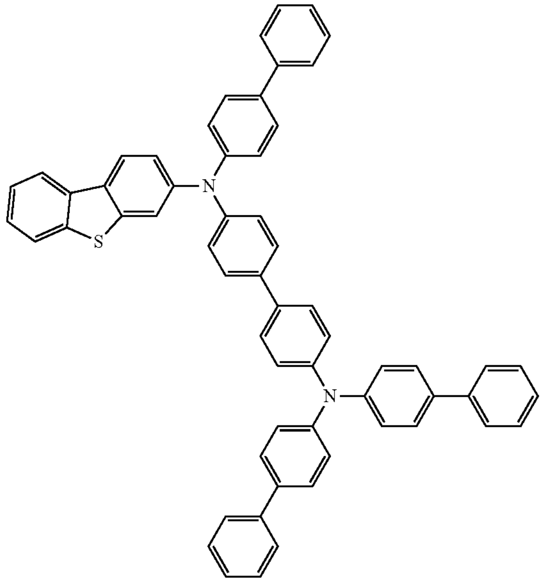
12-34
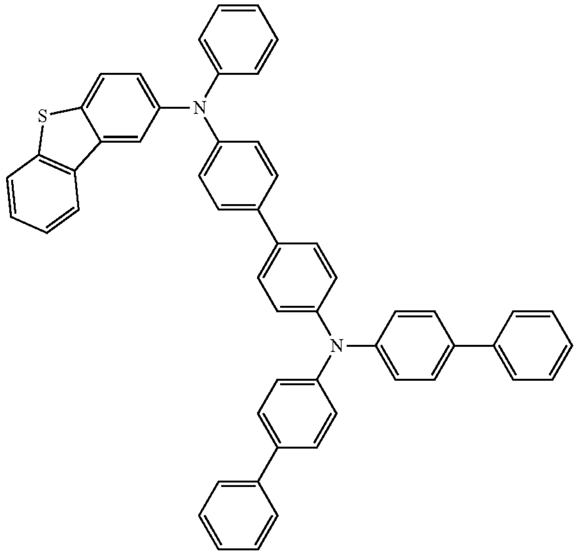
-continued
12-35
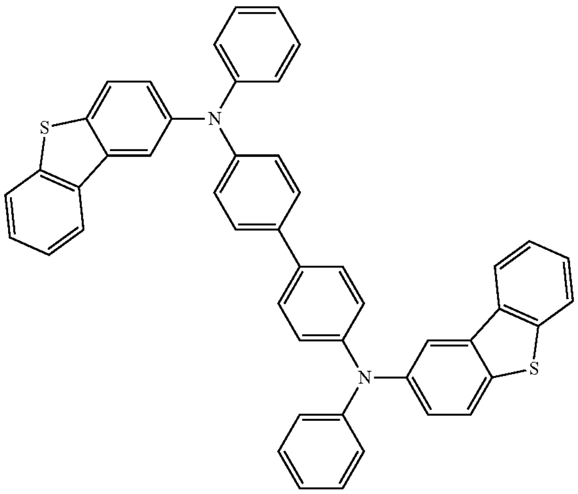
12-36
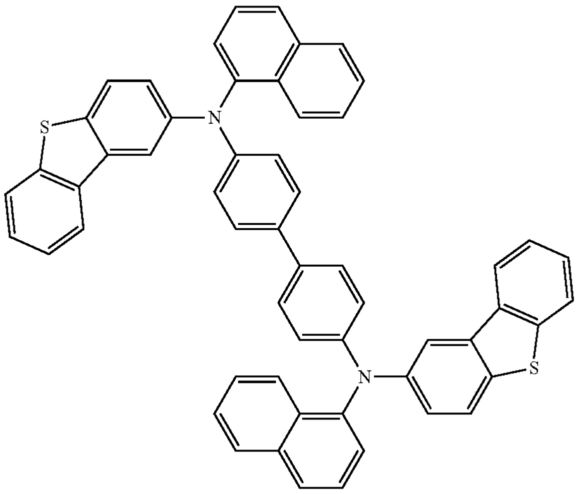
12-37
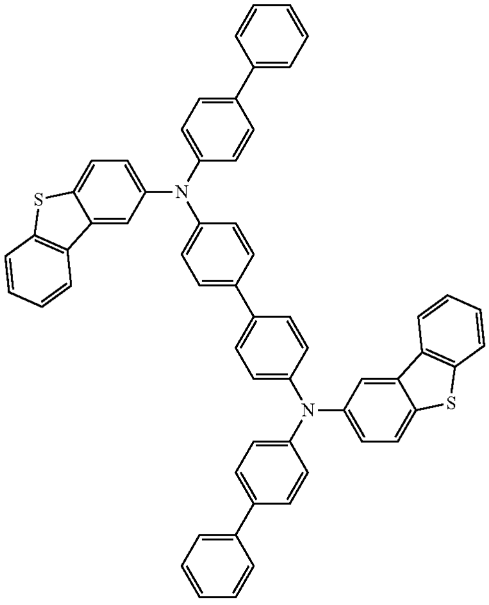

12-38
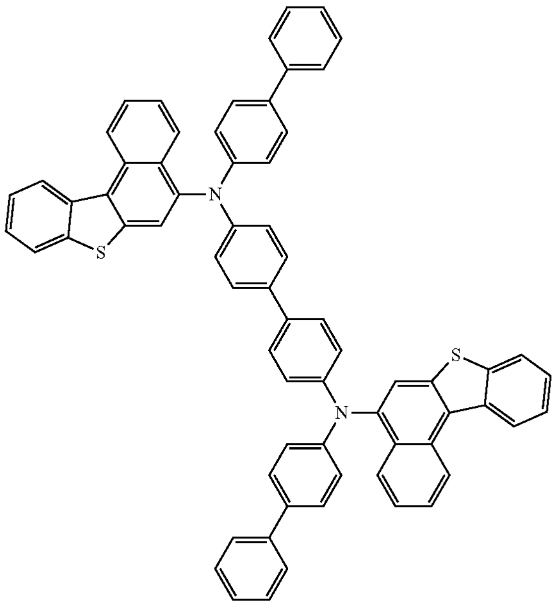
12-39
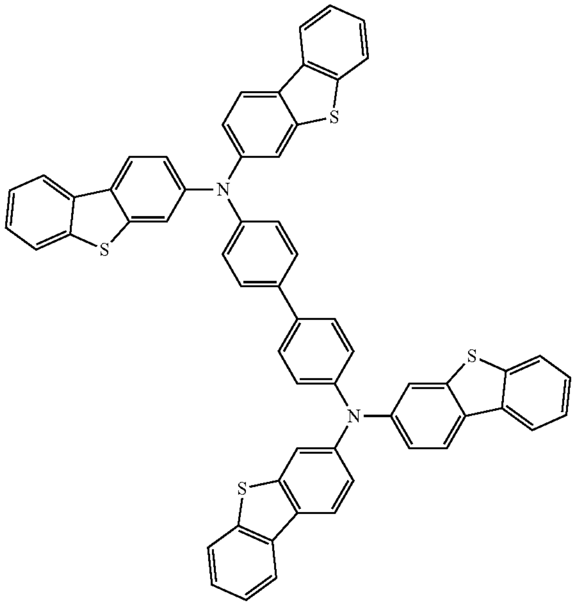
12-40
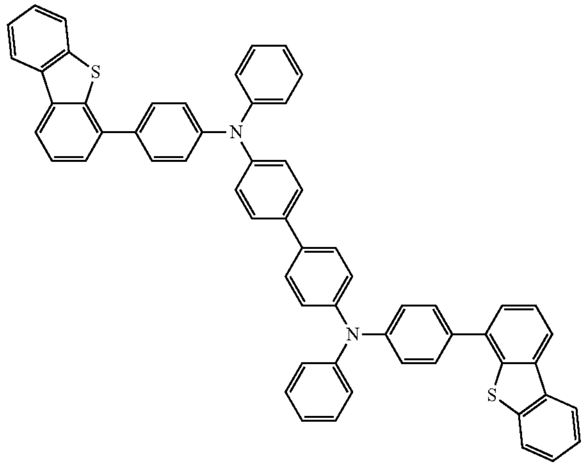
12-41
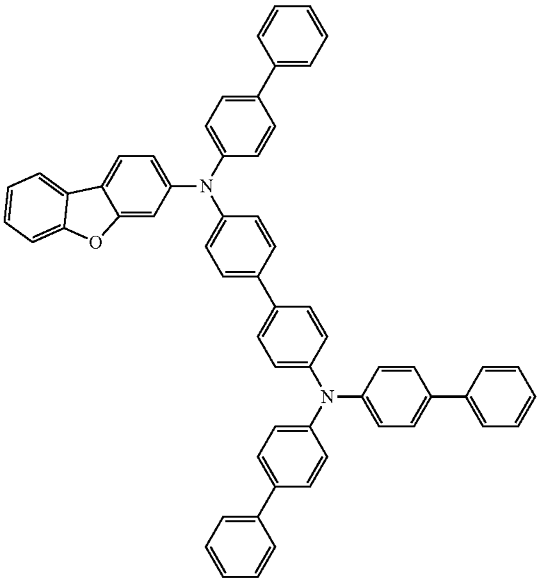

-continued
12-42
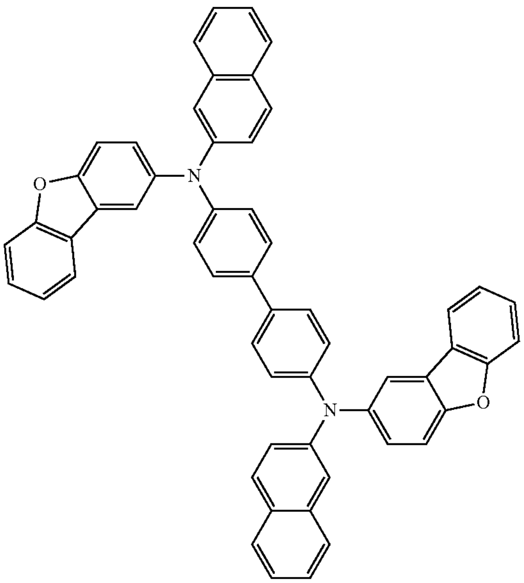
12-43
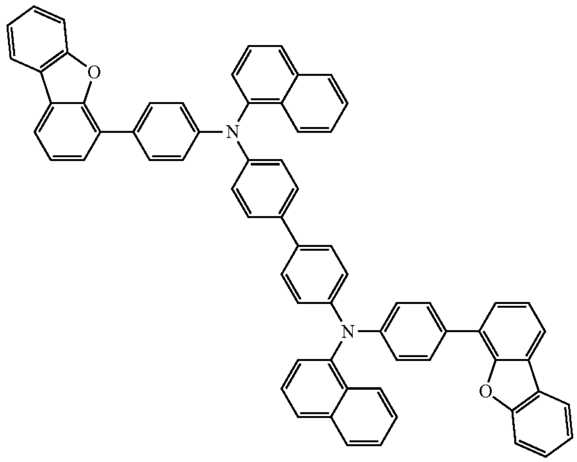
12-44
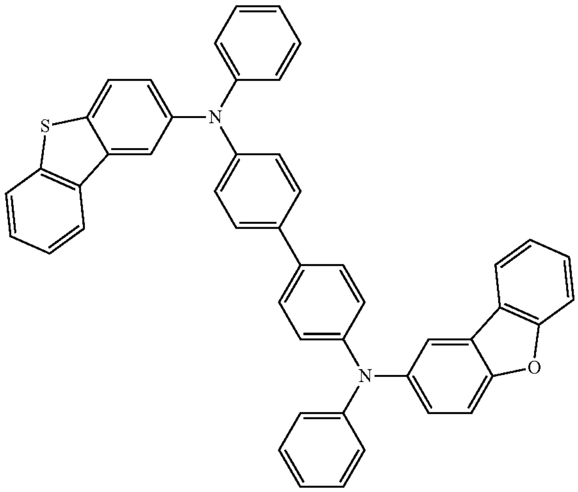
-continued
12-45
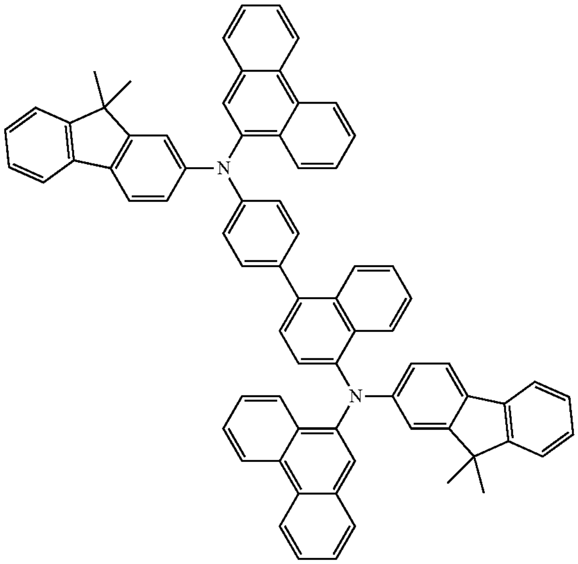
12-46
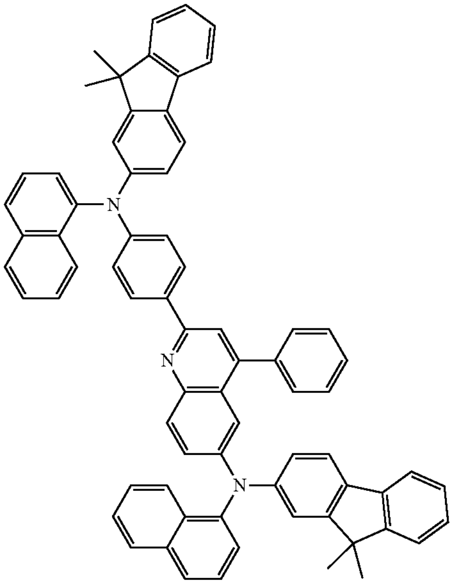

-continued
12-47
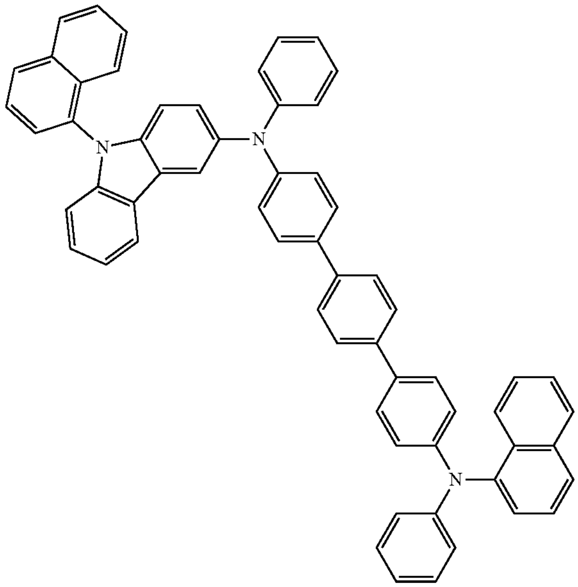
12-48
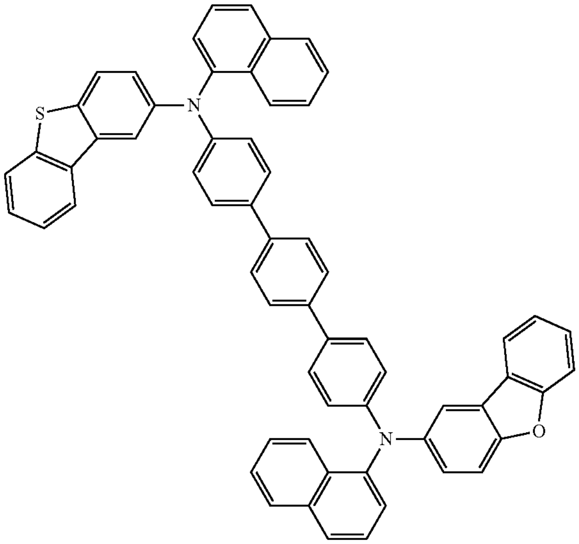
-continued
12-49
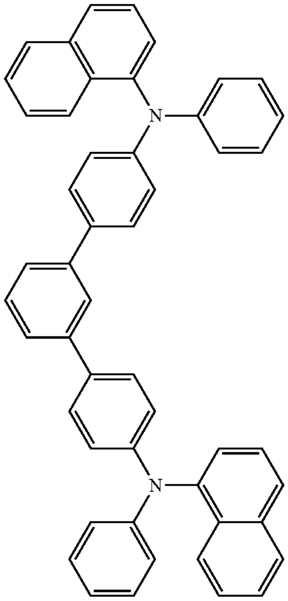
12-50
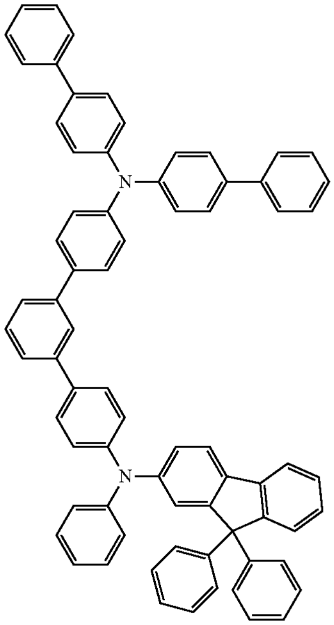

-continued
12-51
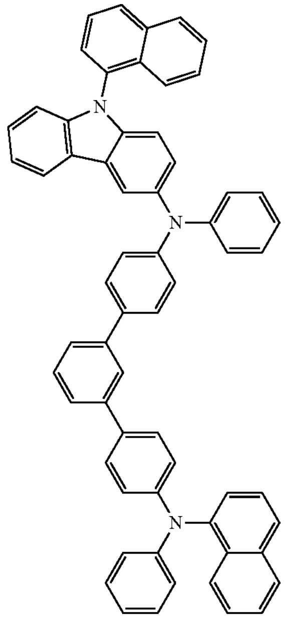
12-52
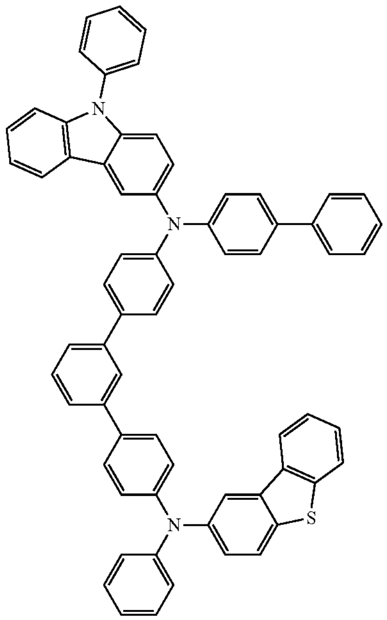
-continued
12-53
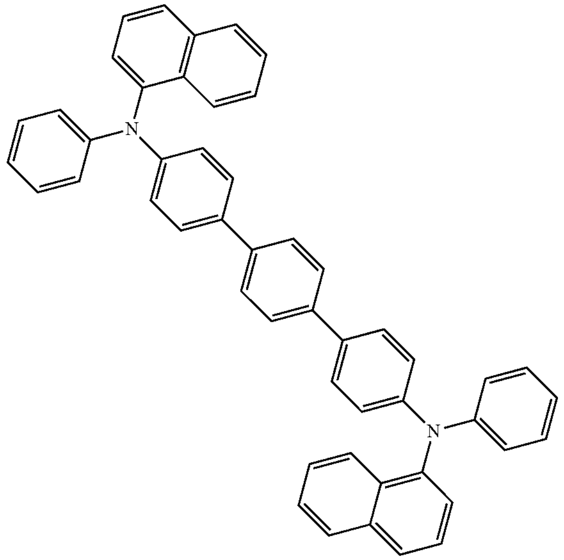
12-54
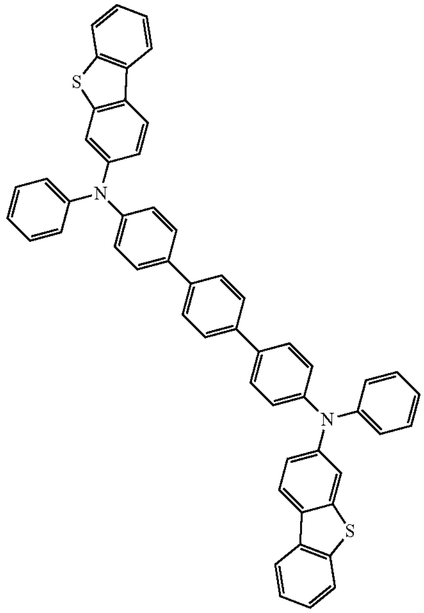

-continued
12-55
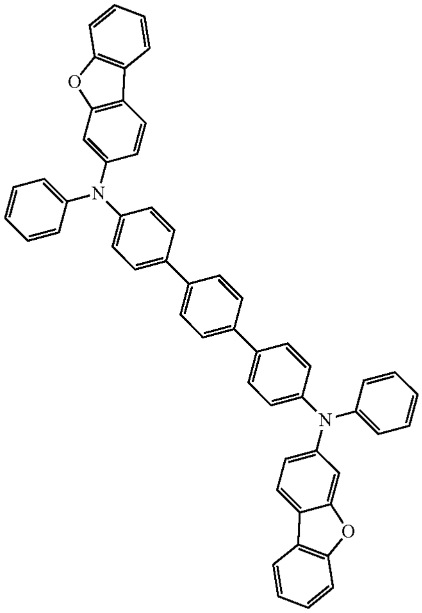
12-56
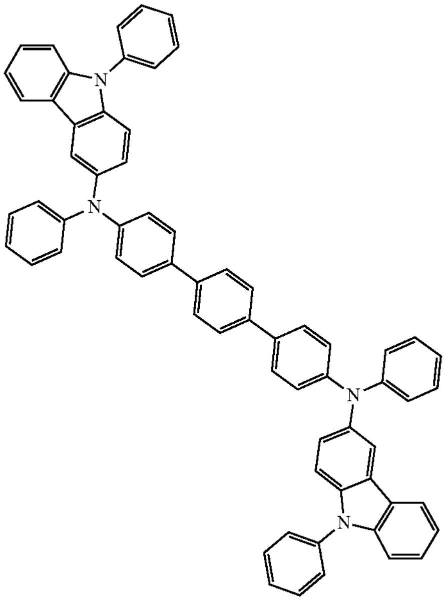
-continued
12-57
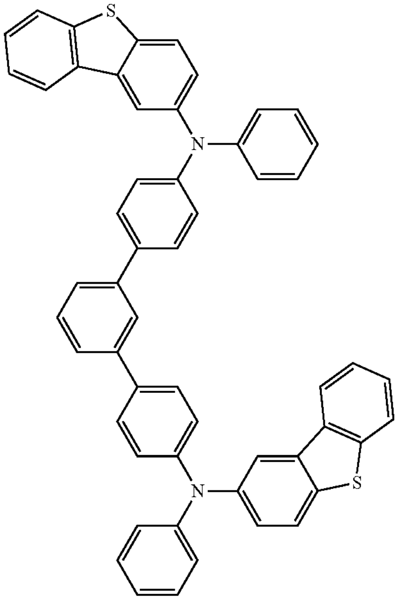
12-58
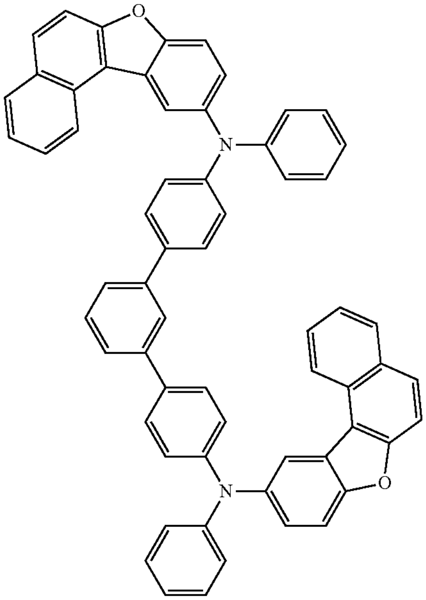
12-59
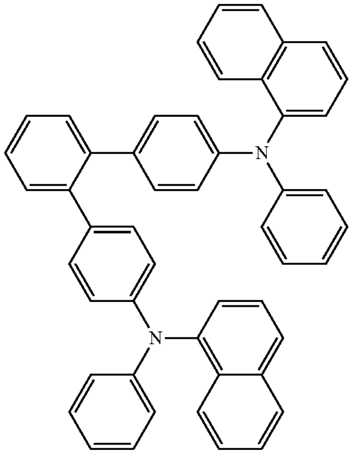

12-60
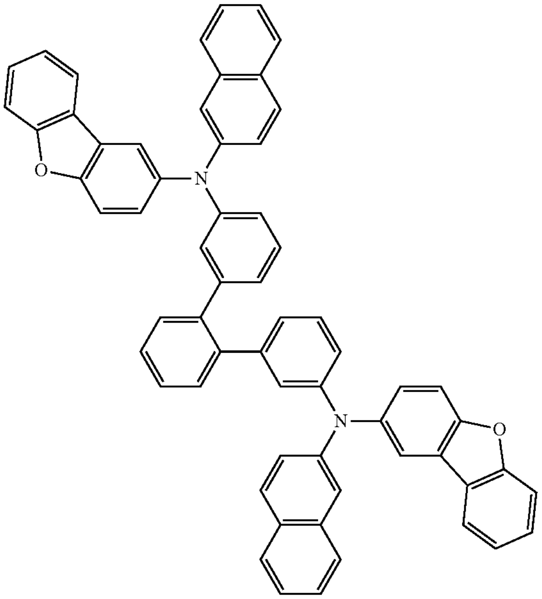
12-61
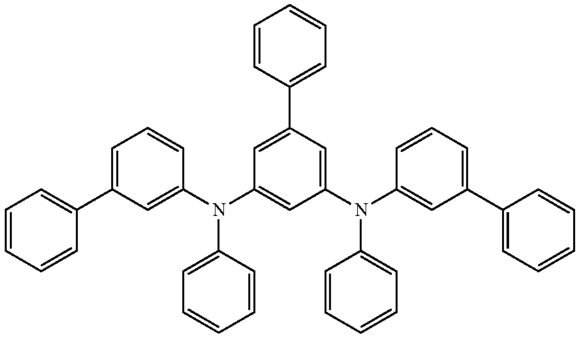
12-62
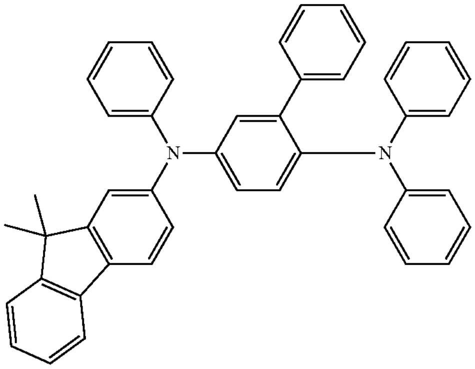
12-63
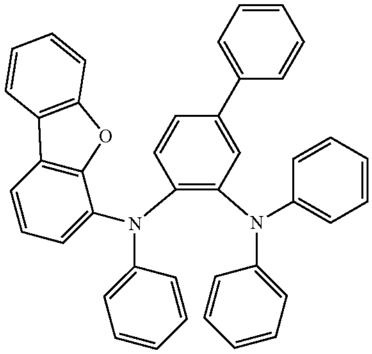
12-64
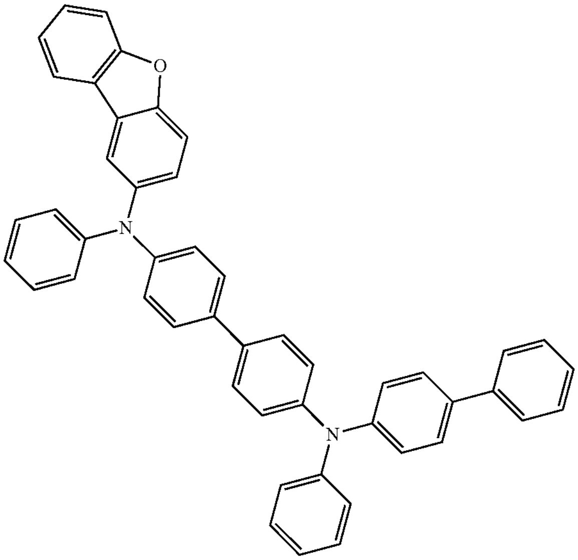
12-65
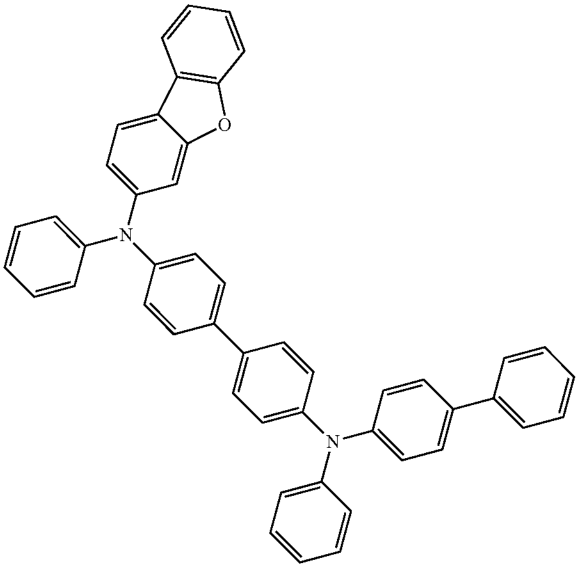

-continued
12-66
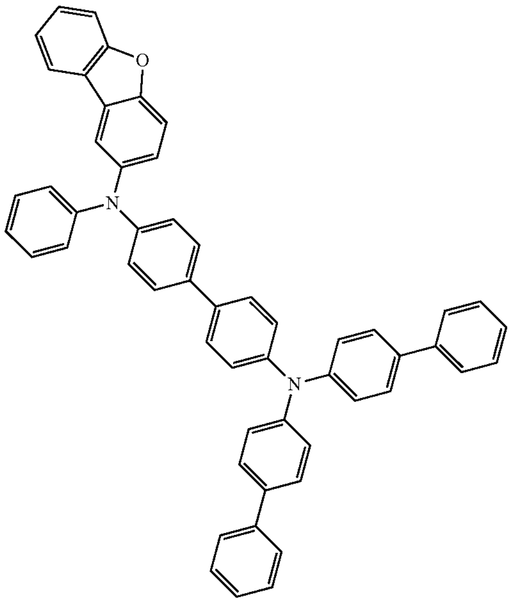
12-67
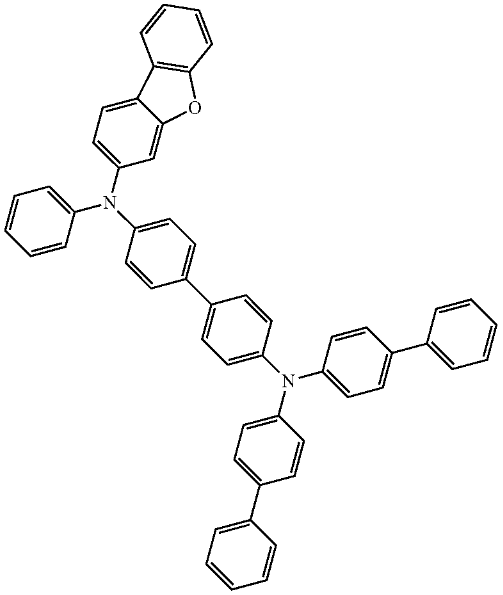
-continued
12-68
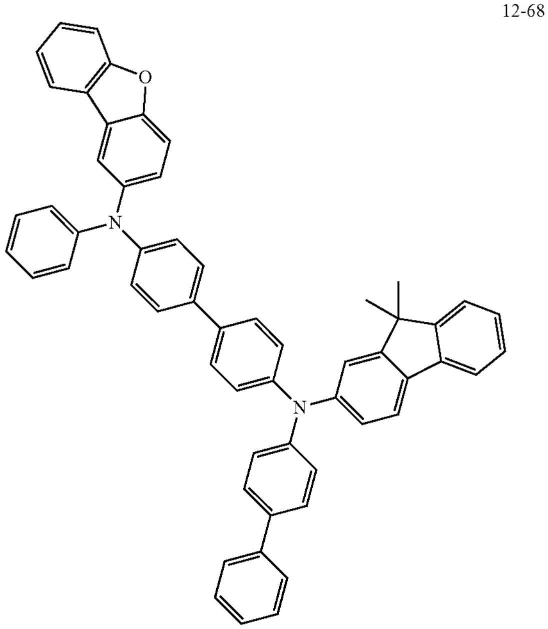
12-69
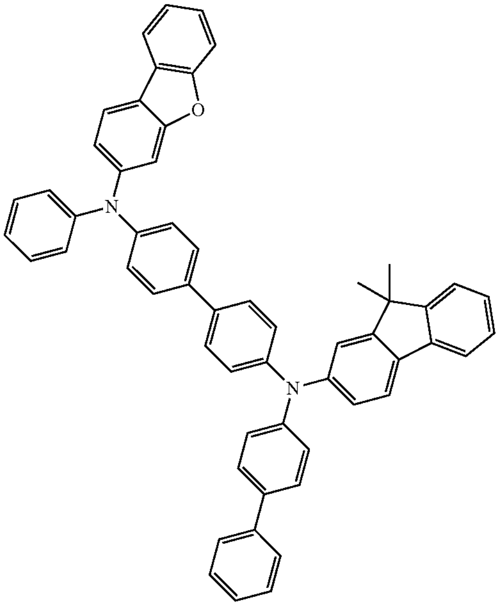

-continued
12-70
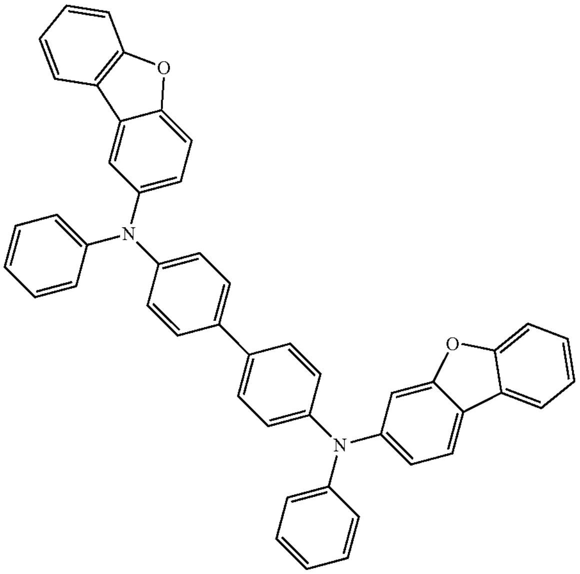
12-71
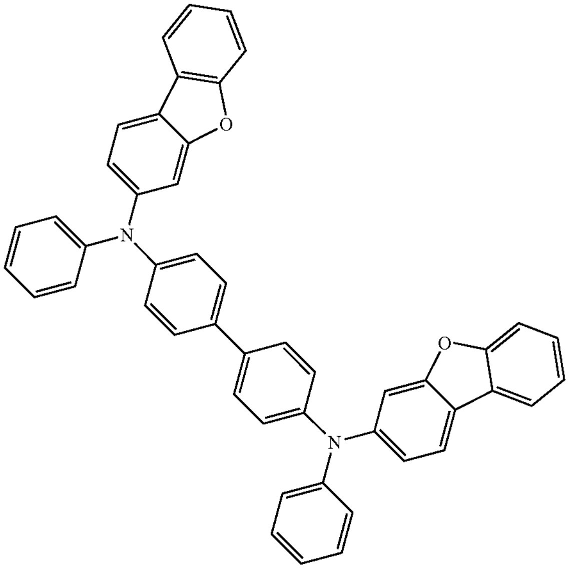
.
12. The organic electric element of claim 1, wherein the compound represented by Formula 2 is one of the following compounds:
Z1-1
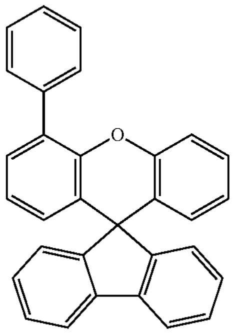
Z1-2
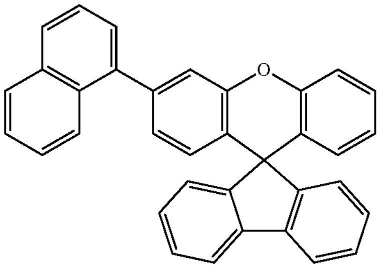
Z1-3
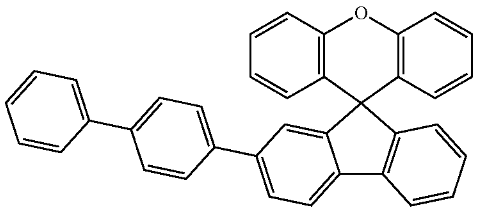
Z1-4
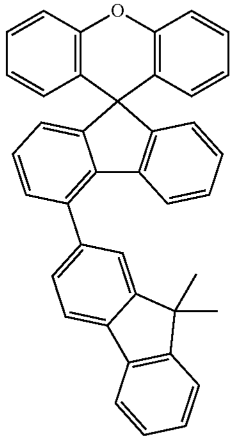

-continued
Z1-5
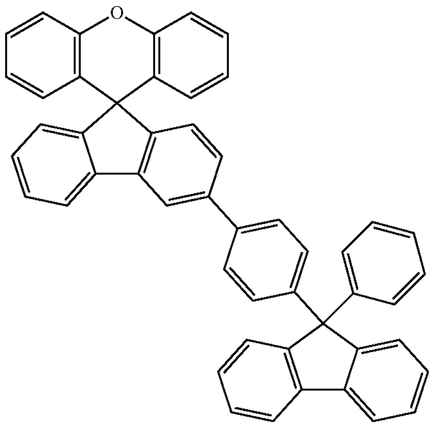
Z1-6
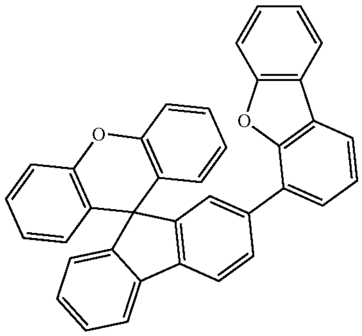
Z1-7
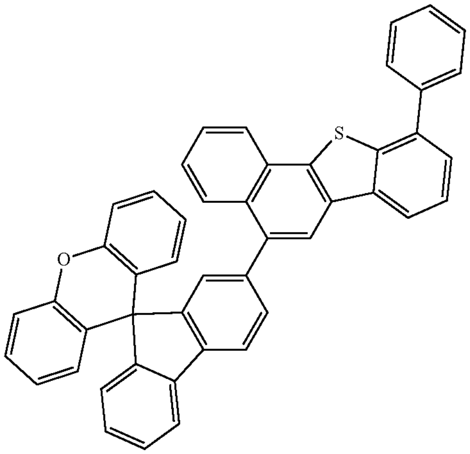
-continued
Z1-8
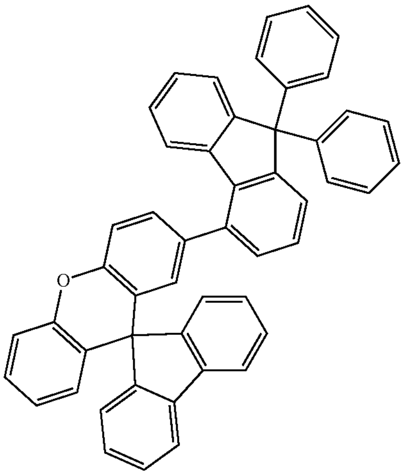
Z1-9
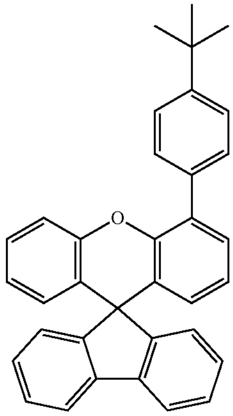
Z1-10
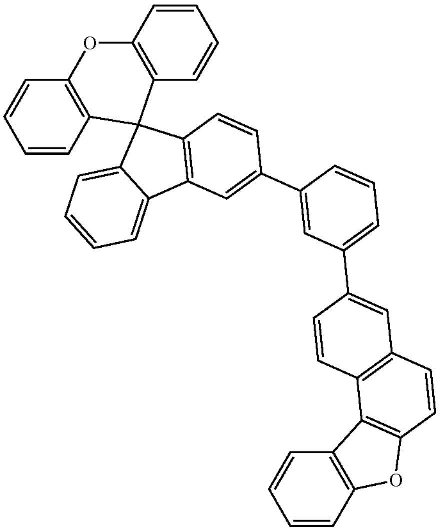

-continued
Z1-11
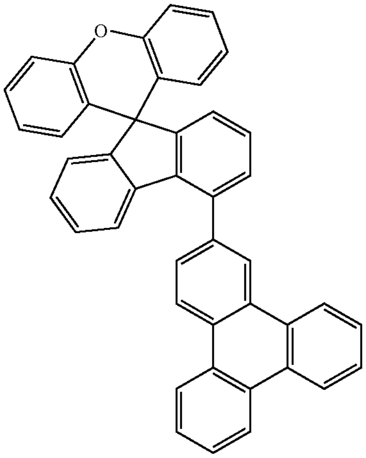
Z1-12
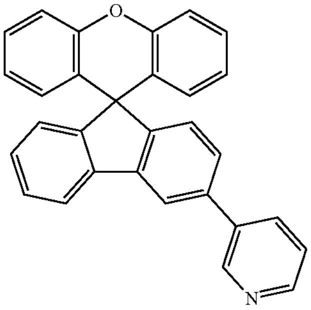
Z1-13
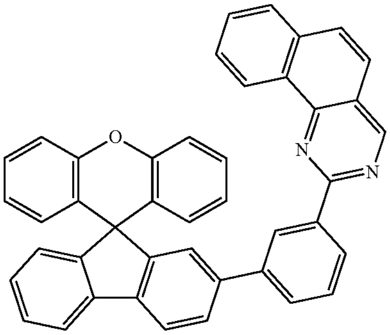
Z1-14
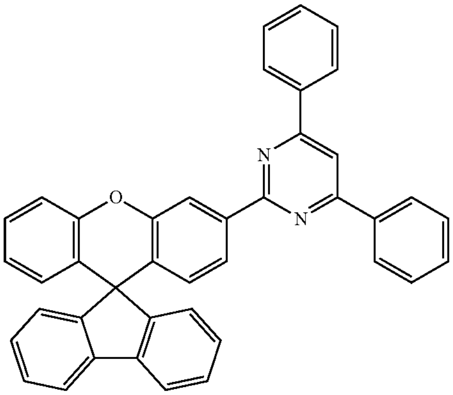
-continued
Z1-15
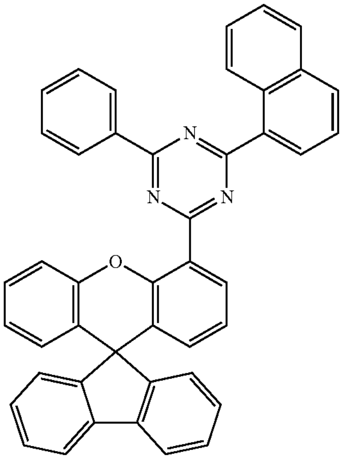
Z1-16
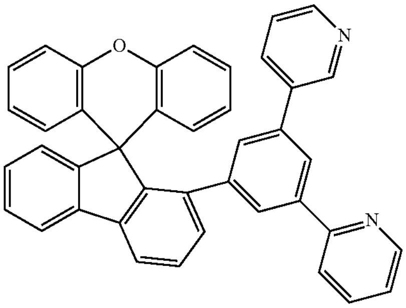
Z1-17
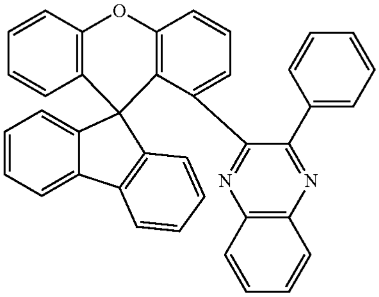
Z1-18
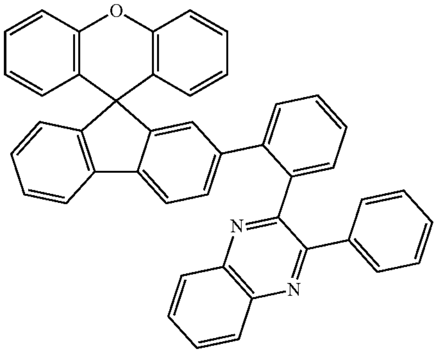

-continued
Z1-19
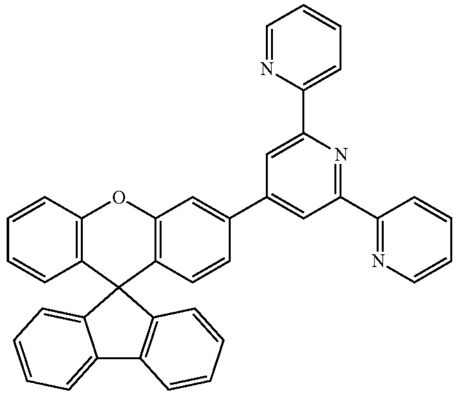
Z1-20
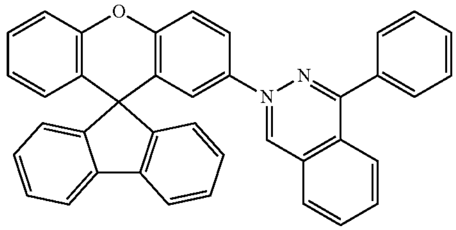
Z1-21
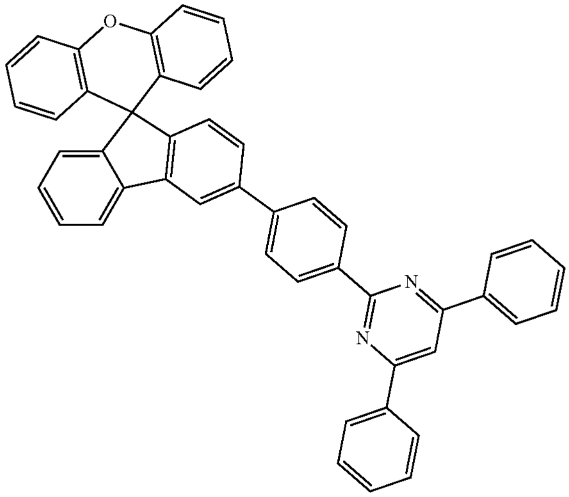
Z1-22
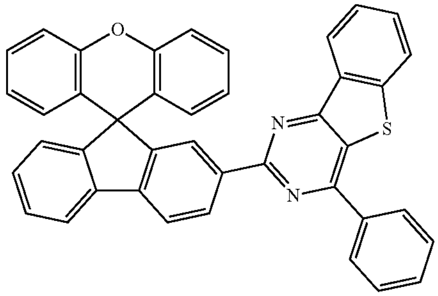
-continued
Z1-23
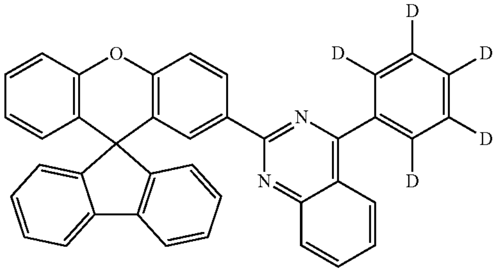
Z1-24
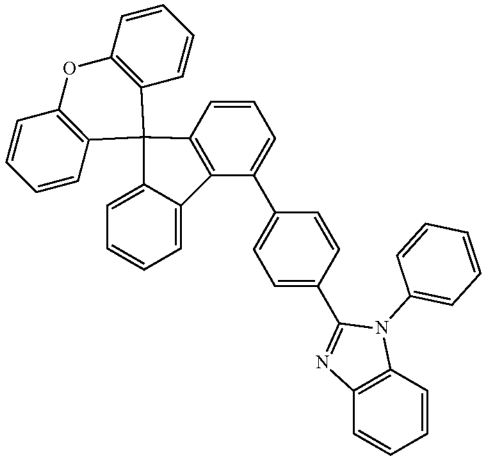
Z1-25
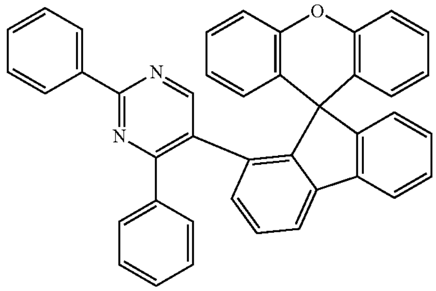
Z1-26
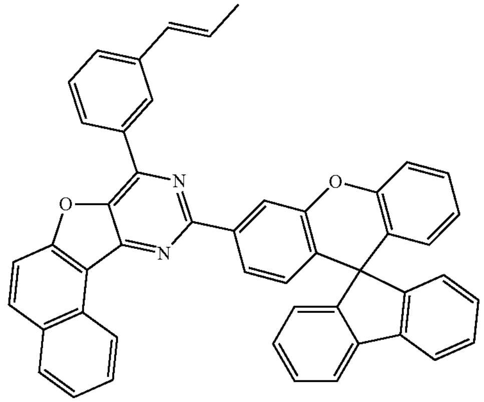

-continued
Z1-27
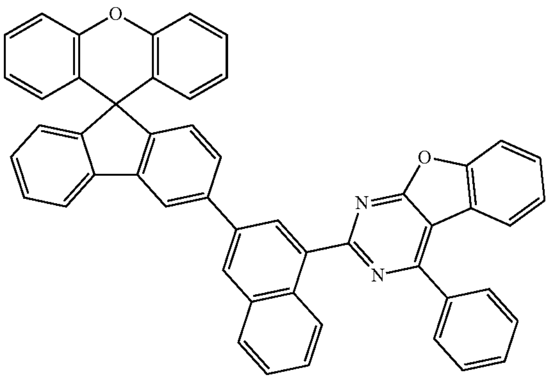
Z1-28
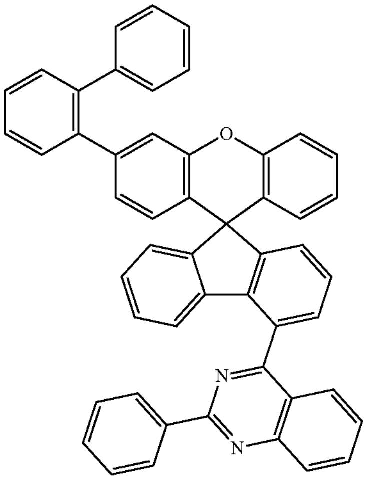
Z1-29
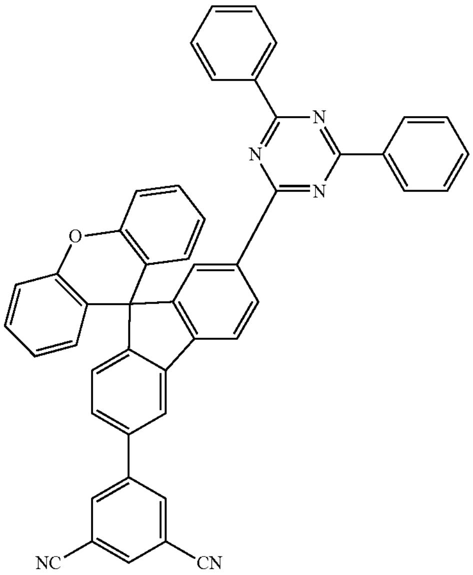
-continued
Z1-30
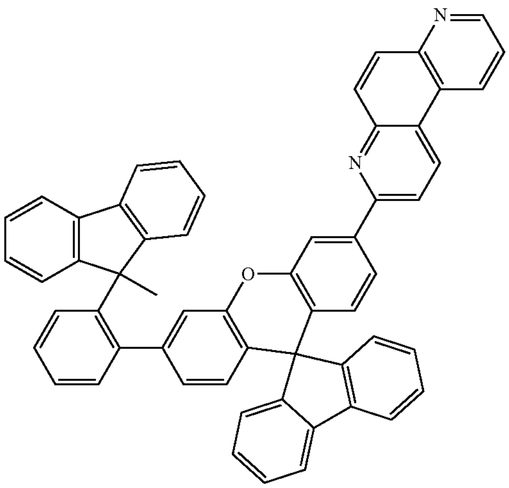
Z1-31
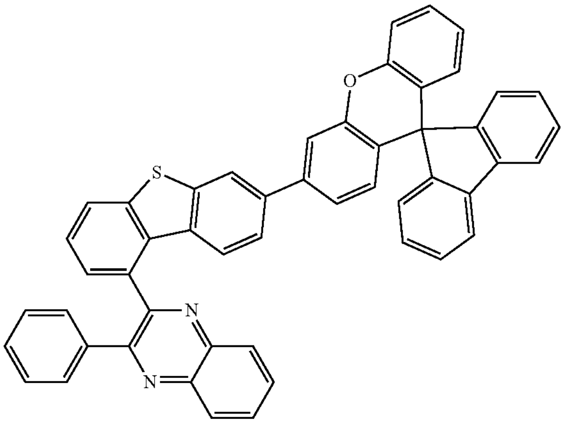
Z1-32
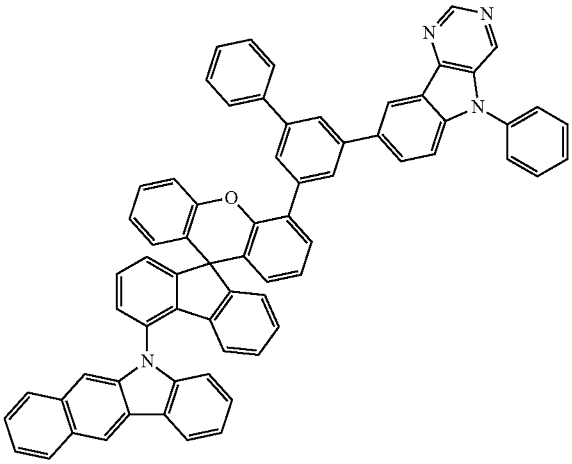

-continued
Z1-33
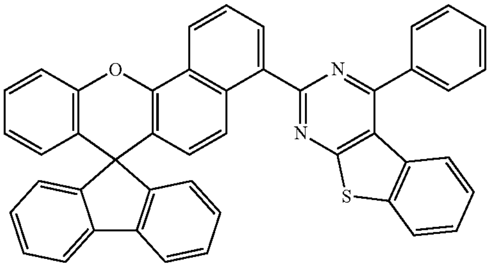
Z1-34
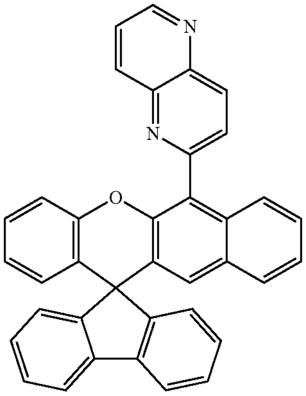
Z1-35
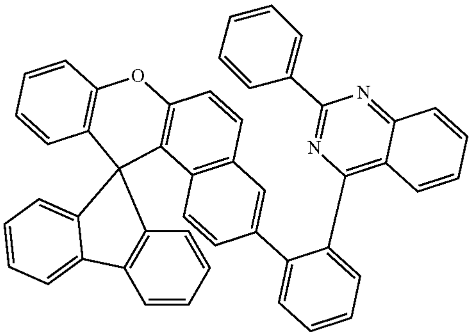
Z1-36
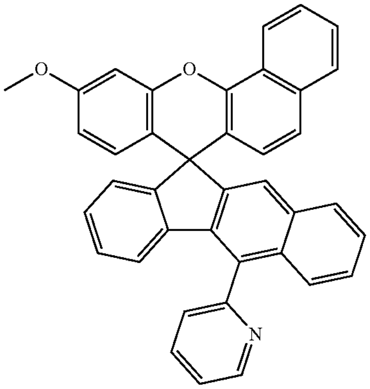
-continued
Z1-37
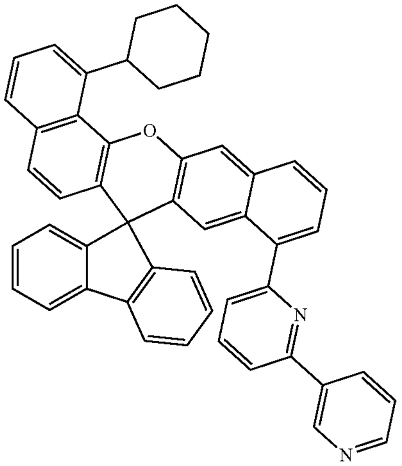
Z1-38
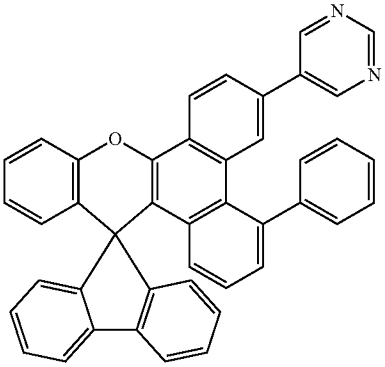
Z1-39
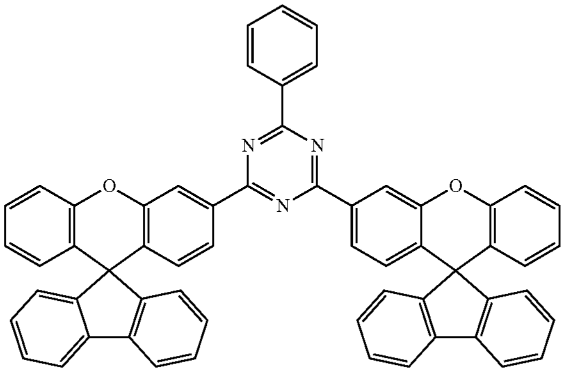

-continued
Z1-40
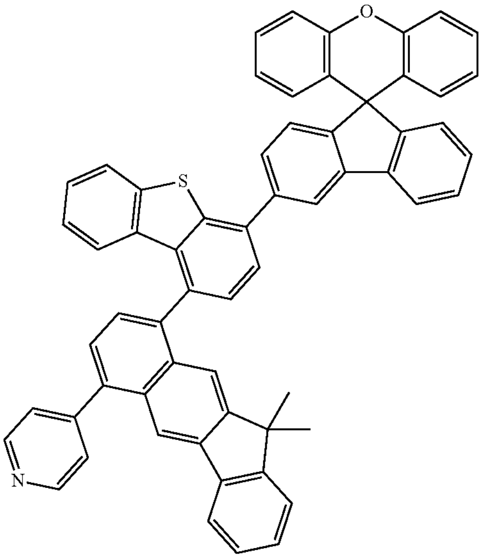
Z1-41
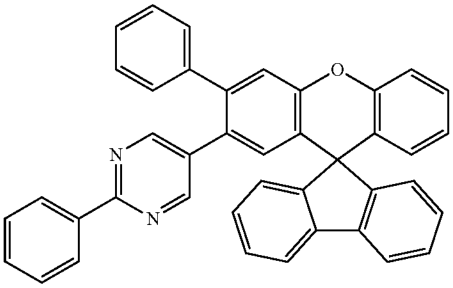
Z1-42
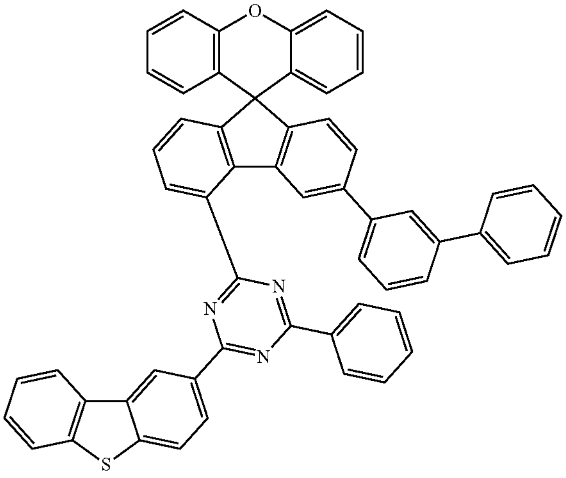
-continued
Z1-43
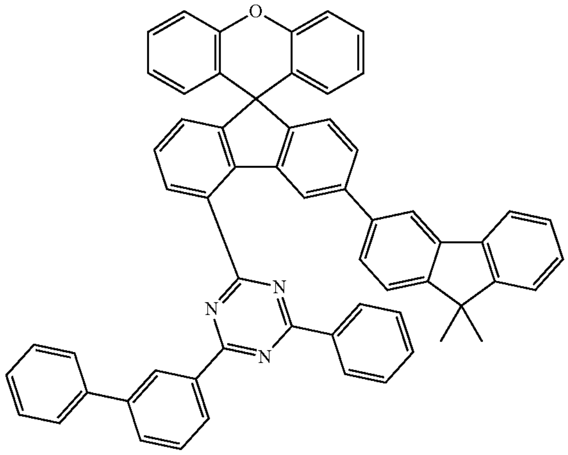
Z2-1
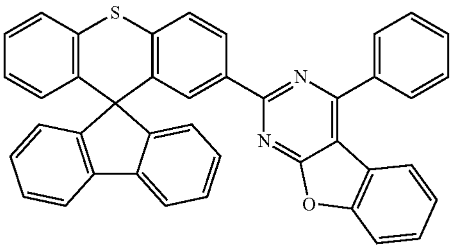
Z2-2
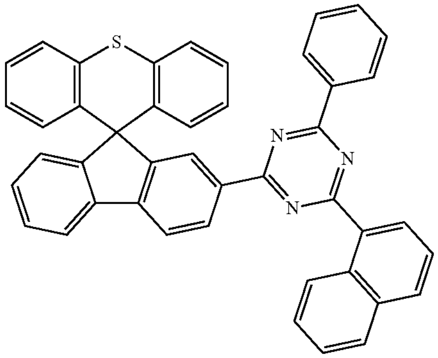
Z2-3
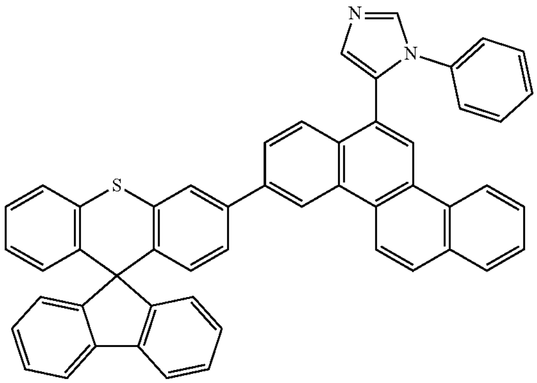

Z2-4
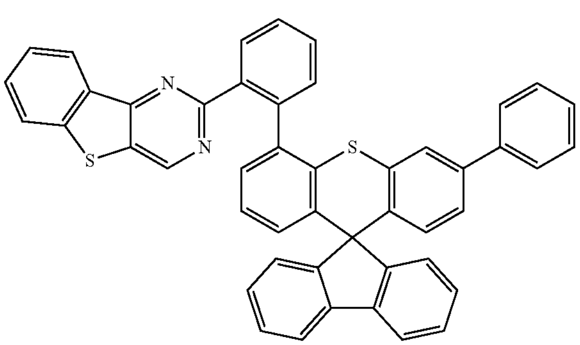
Z2-5
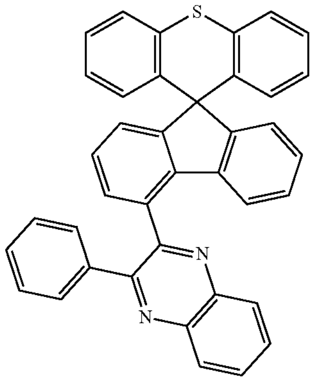
Z2-6
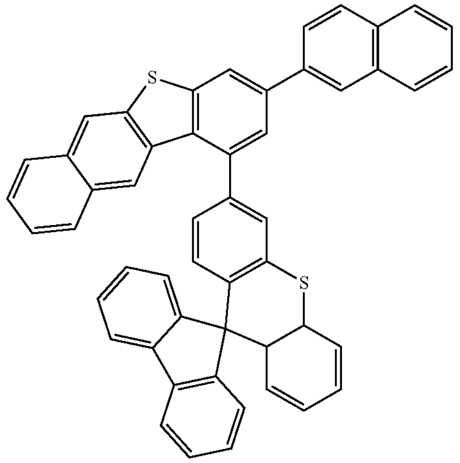
Z2-7
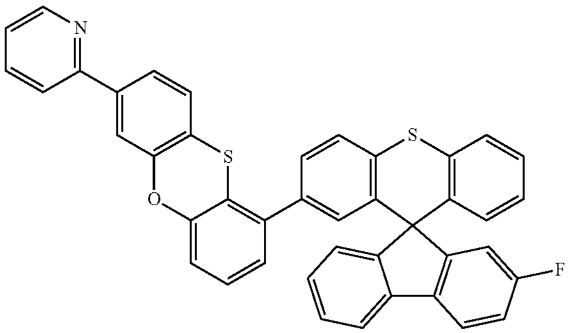
Z2-8
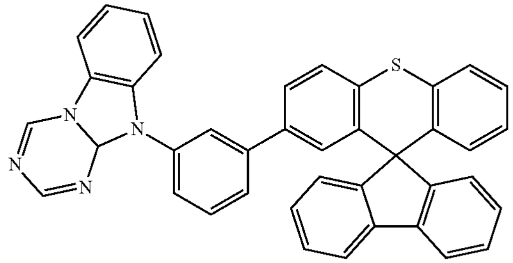
Z2-9
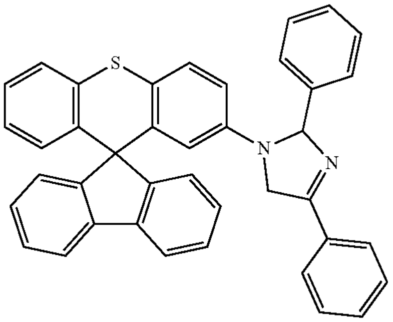
Z2-10
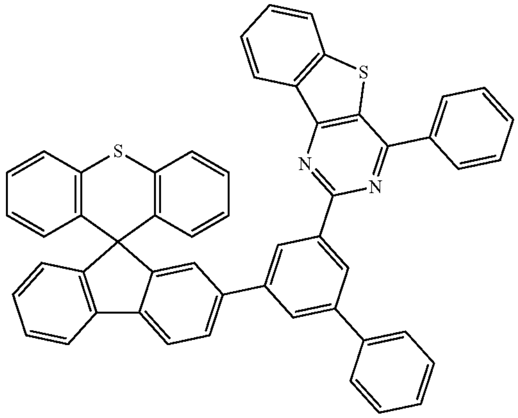
Z2-11
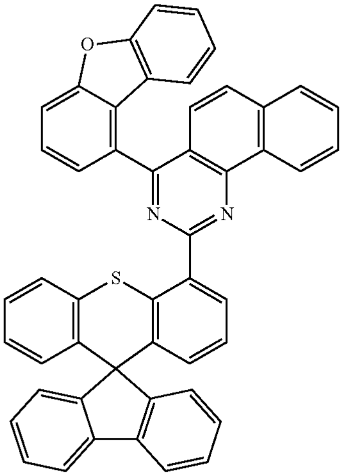

-continued
Z2-12
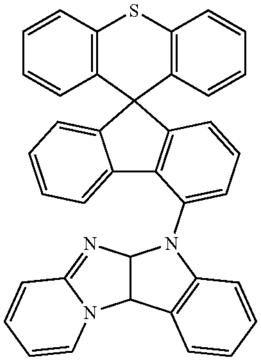
Z2-13
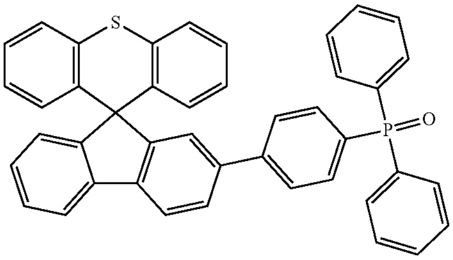
Z2-14
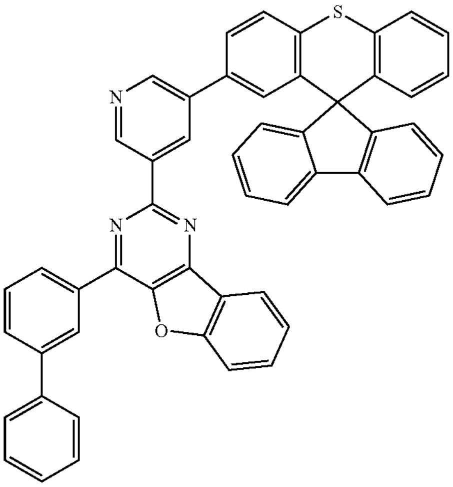
Z2-15
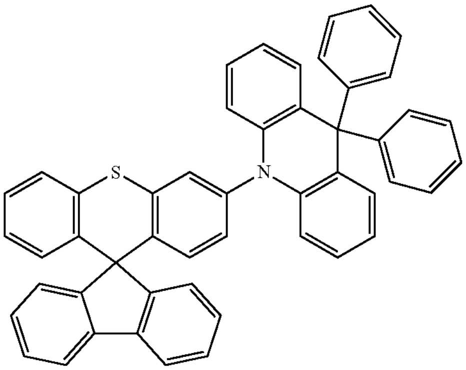
-continued
Z2-16
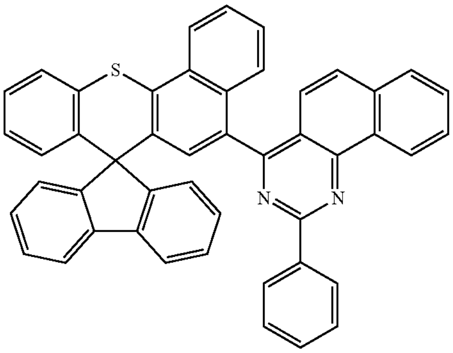
Z2-17
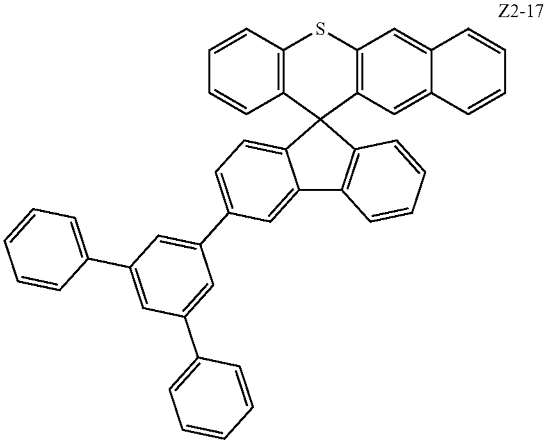
Z2-18
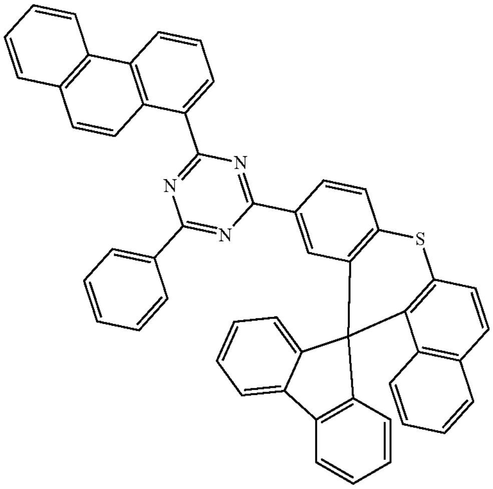

-continued
Z2-19
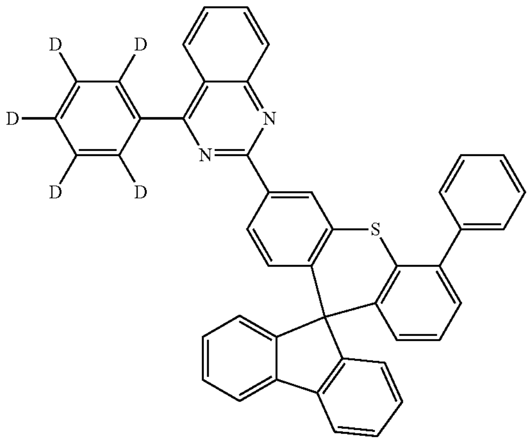
Z2-20
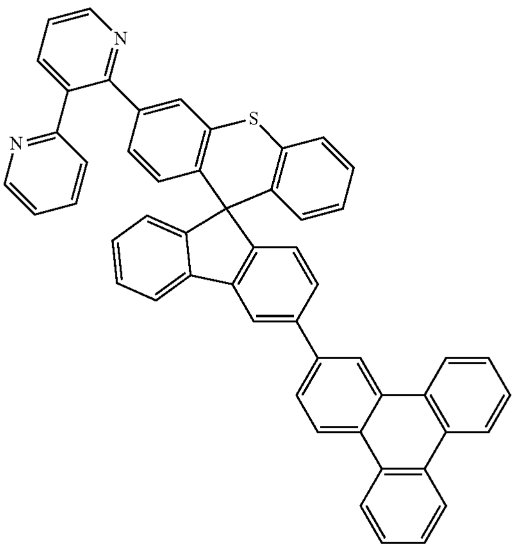
Z2-21
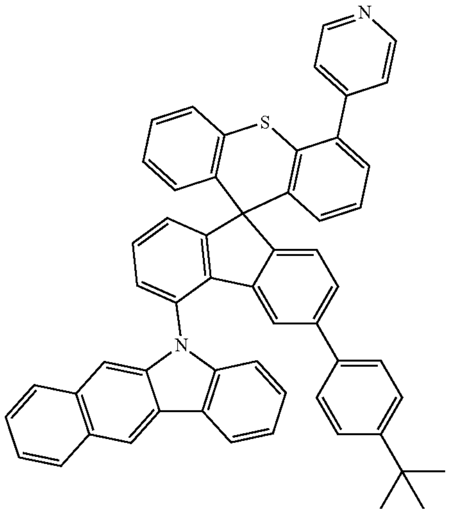
-continued
Z2-22
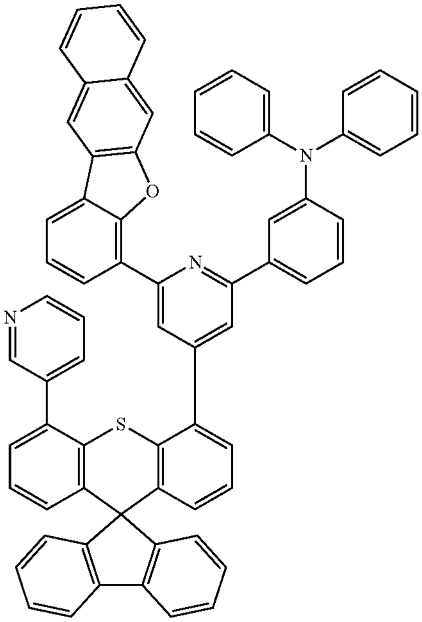
Z2-23
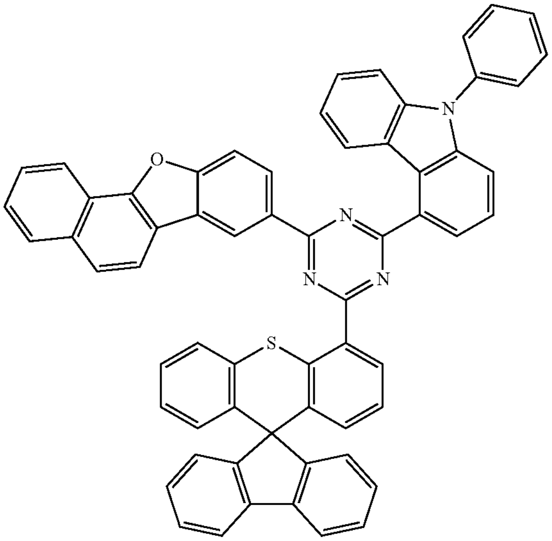

-continued
Z2-24
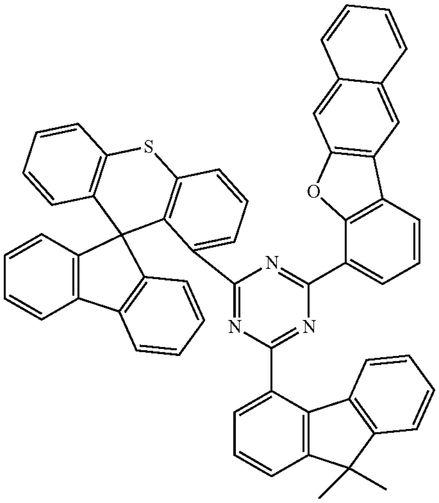
Z2-25
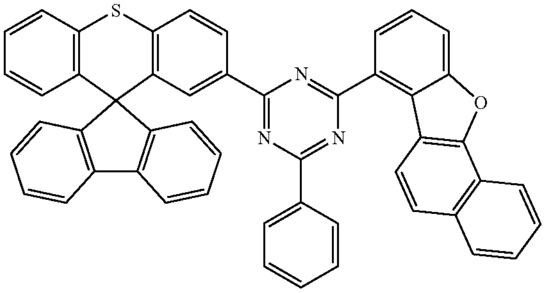
Z2-26
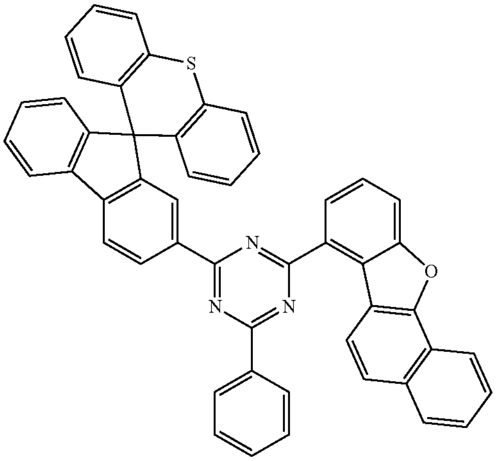
-continued
Z2-27
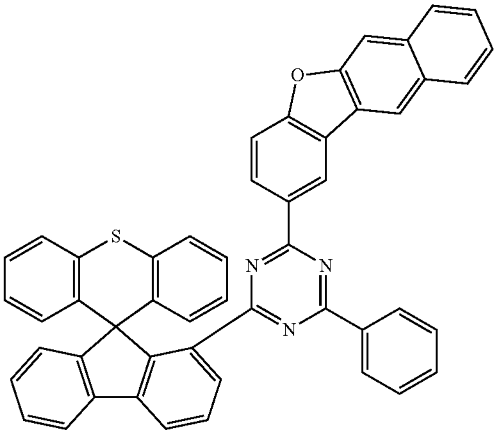
Z2-28
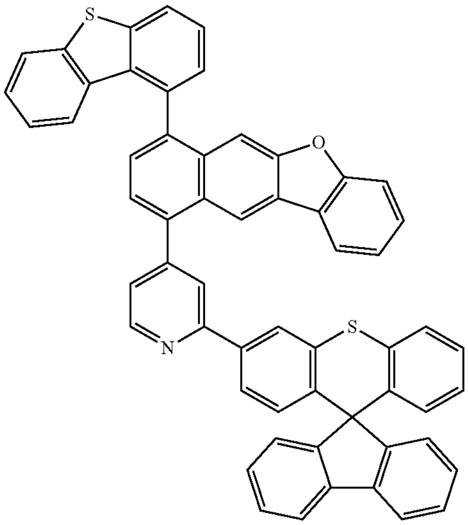
Z2-29
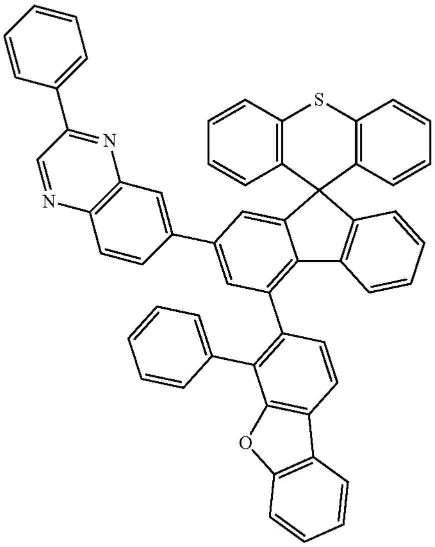

-continued
Z2-30
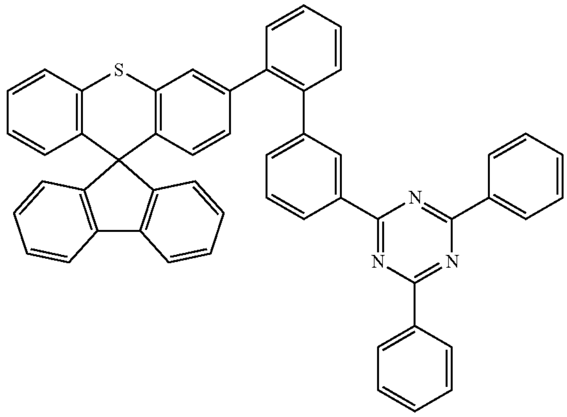
Z3-1
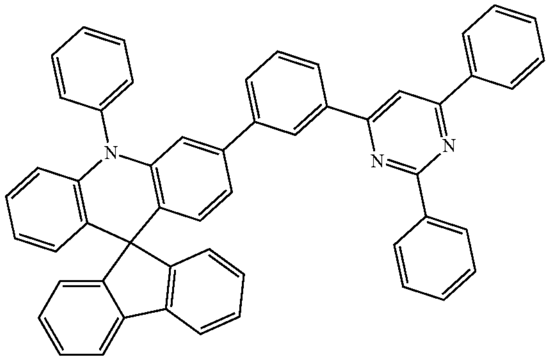
Z3-2
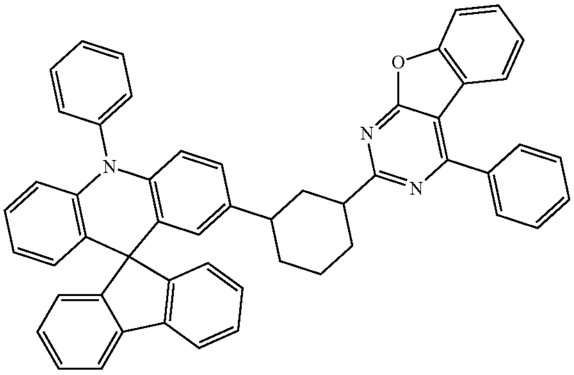
Z3-3
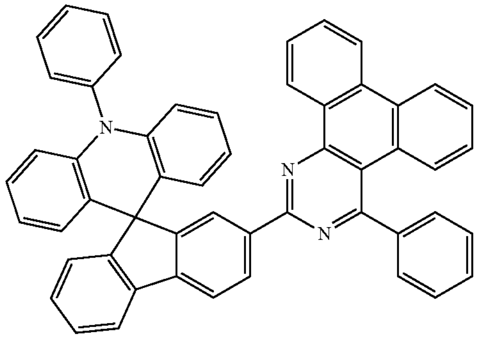
-continued
Z3-4
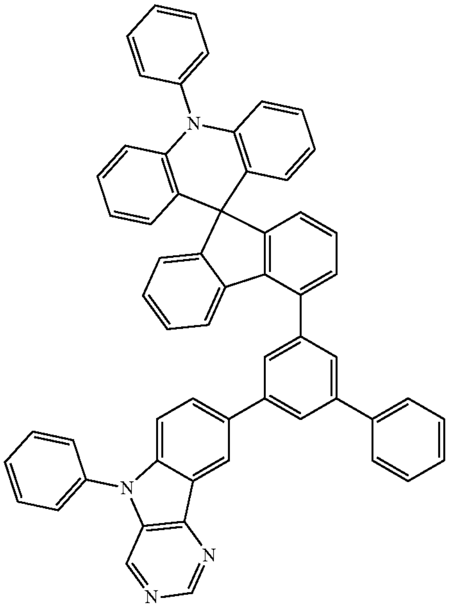
Z3-5
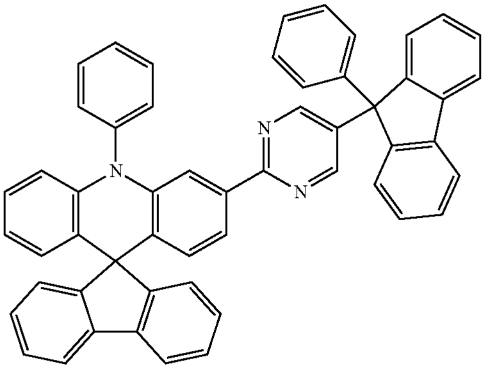
Z3-6
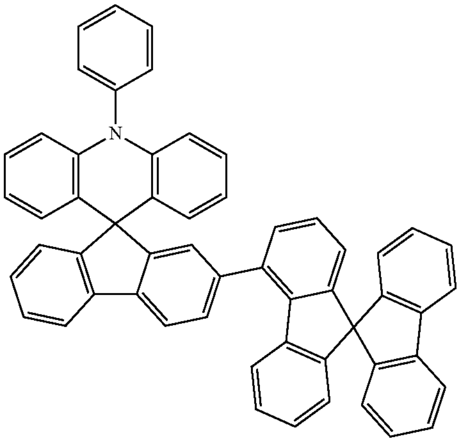

-continued
Z3-7
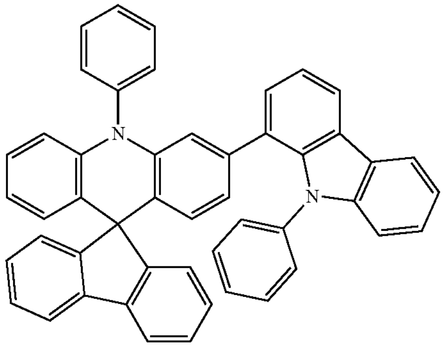
Z3-8
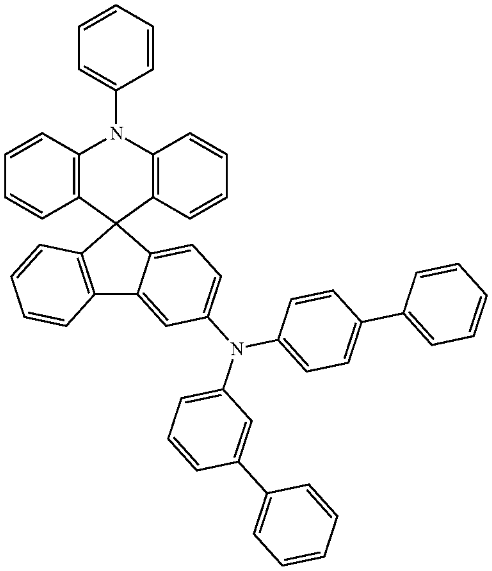
Z3-9
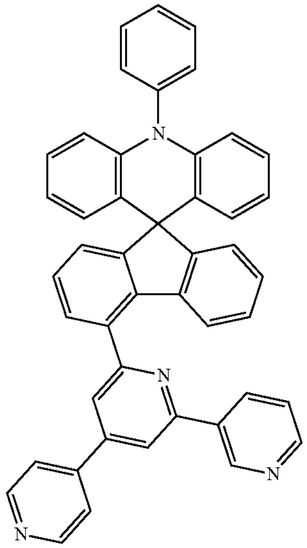
-continued
Z3-10
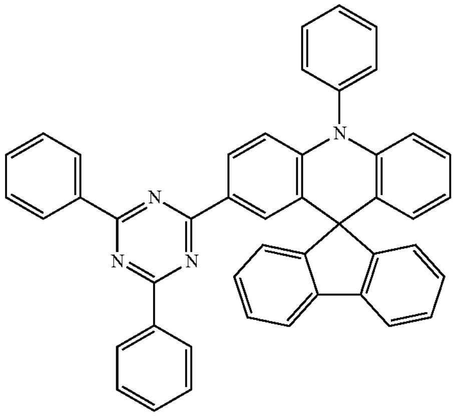
Z3-11
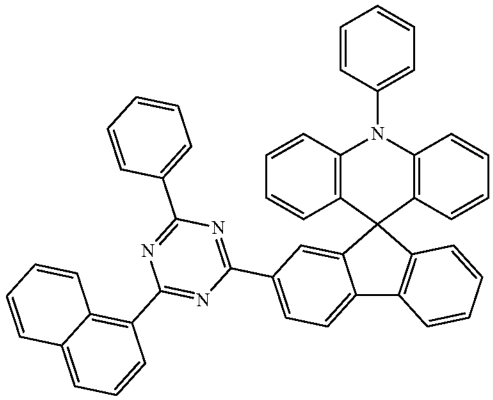
Z3-12
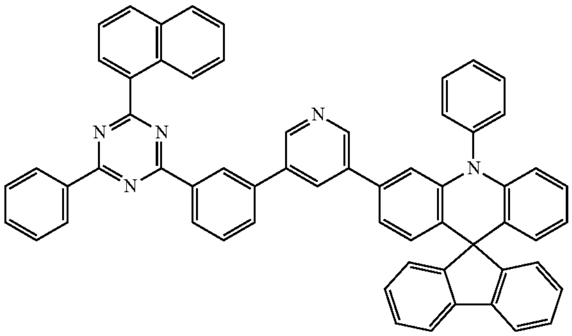
Z3-13
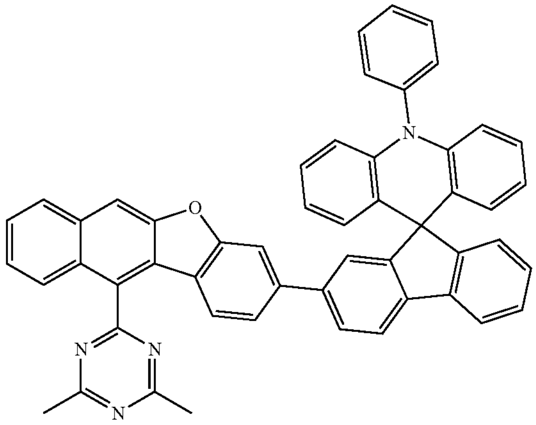

-continued
Z3-14
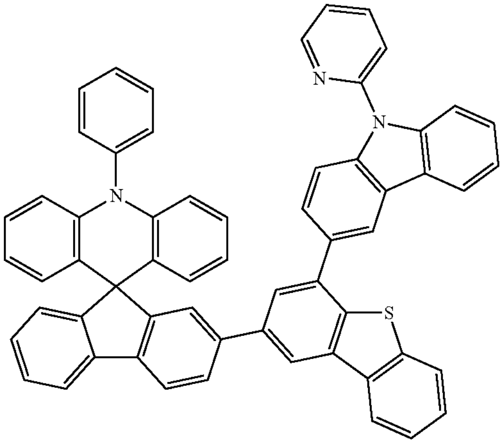
Z3-15
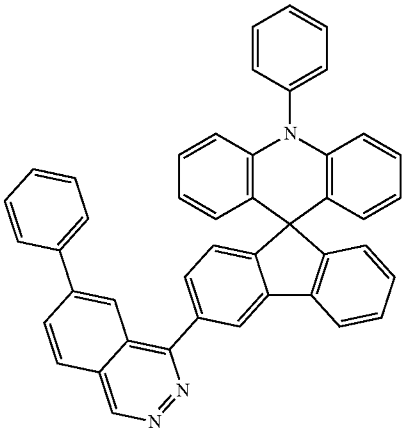
Z3-16
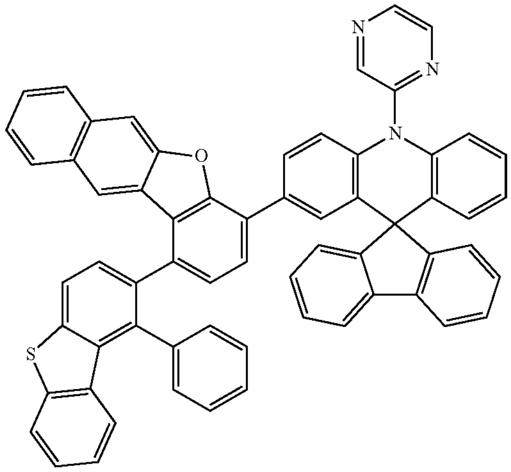
-continued
Z3-17
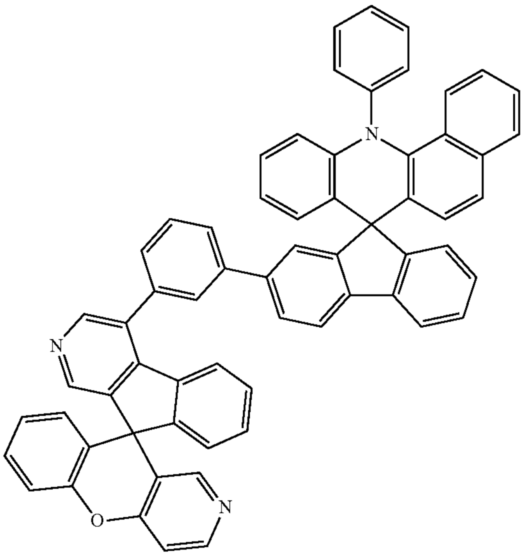
Z3-18
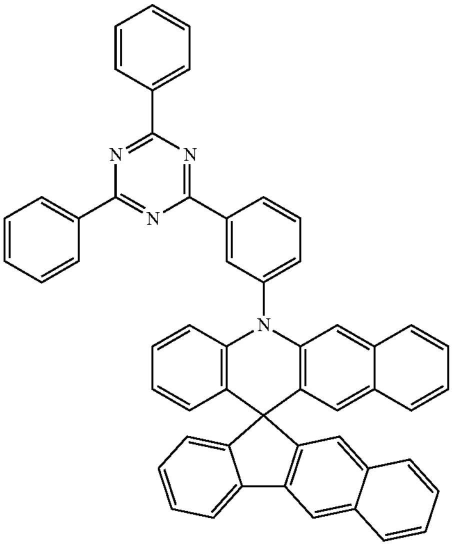
Z3-19
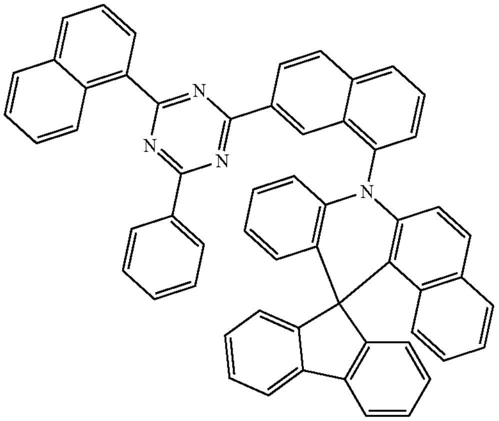

-continued
Z3-20
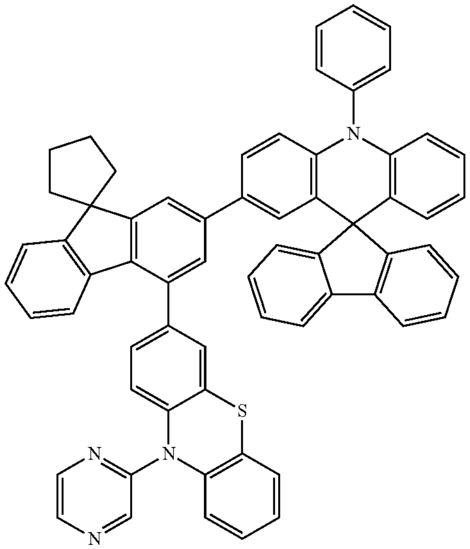
Z3-21
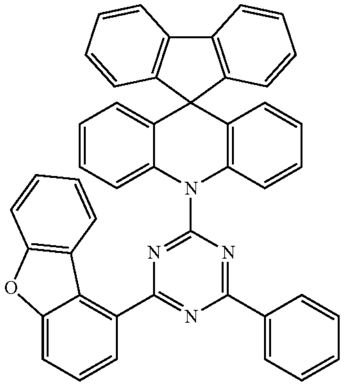
Z3-22
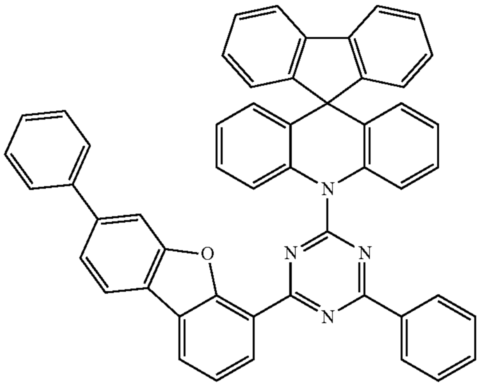
-continued
Z3-23
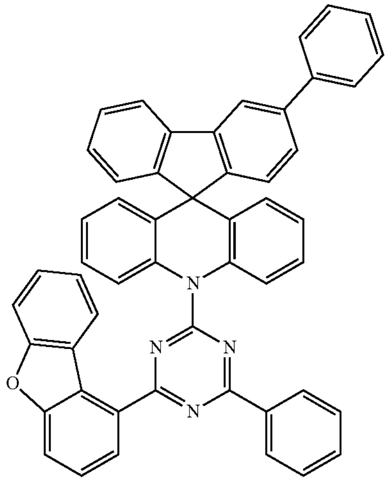
Z3-24
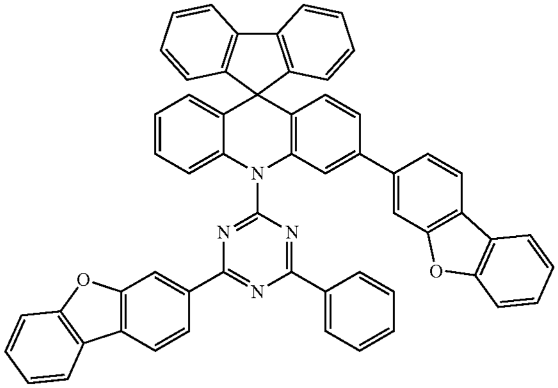
Z3-25
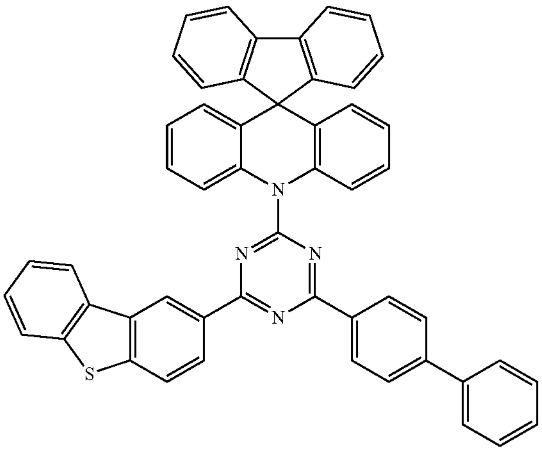

-continued
Z3-26
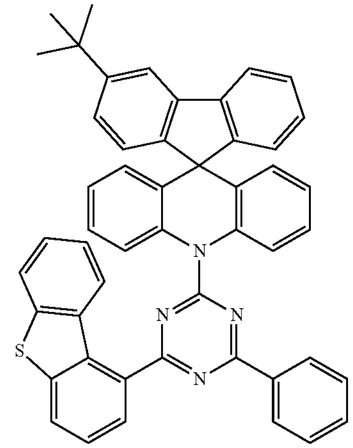
Z3-27
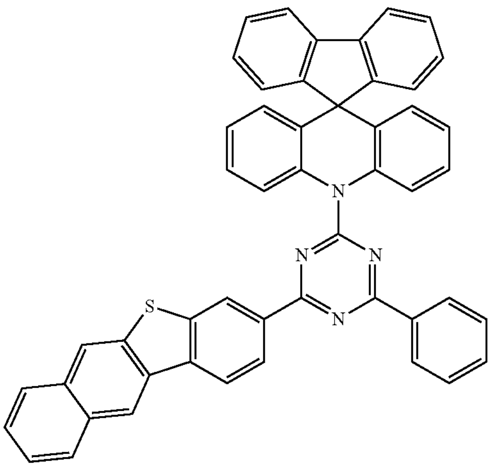
Z3-28
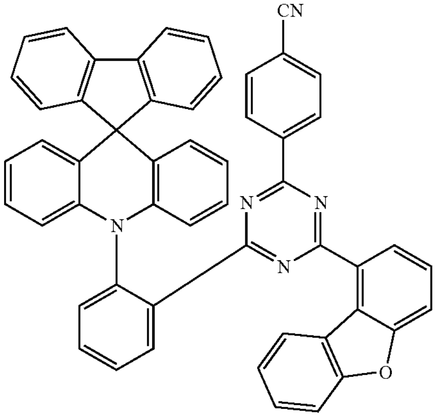
-continued
Z3-29
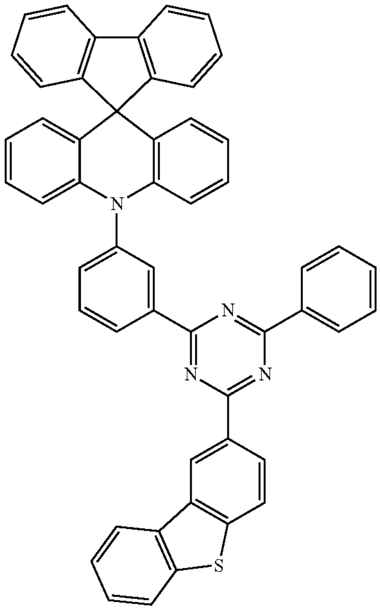
Z3-30
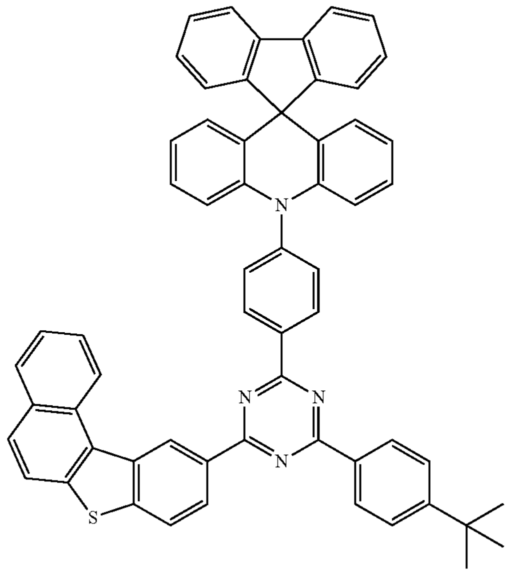
Z3-31
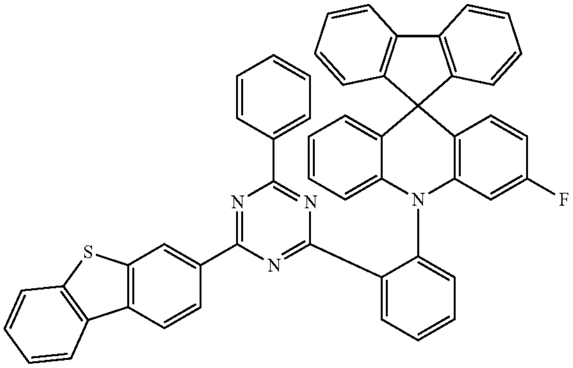

-continued
Z3-32
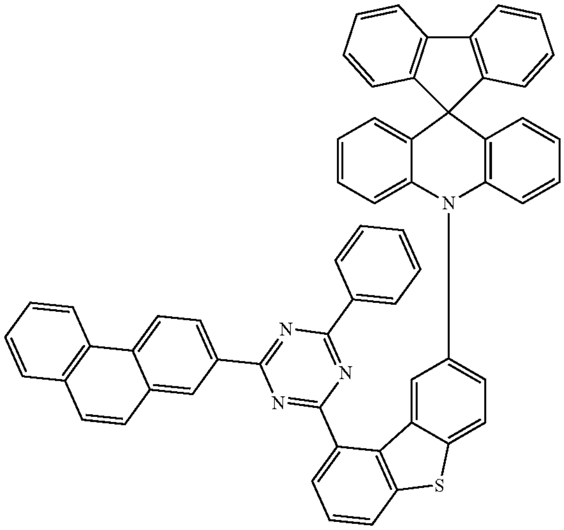
Z3-33
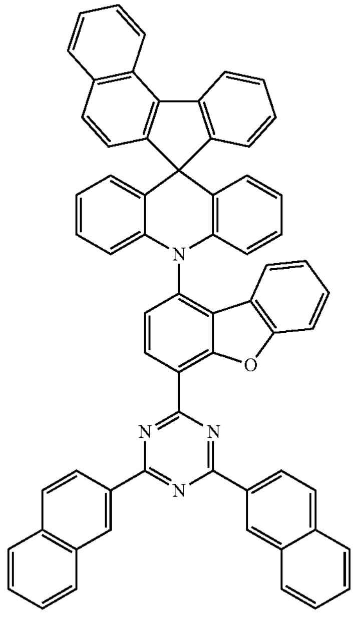
-continued
Z3-34
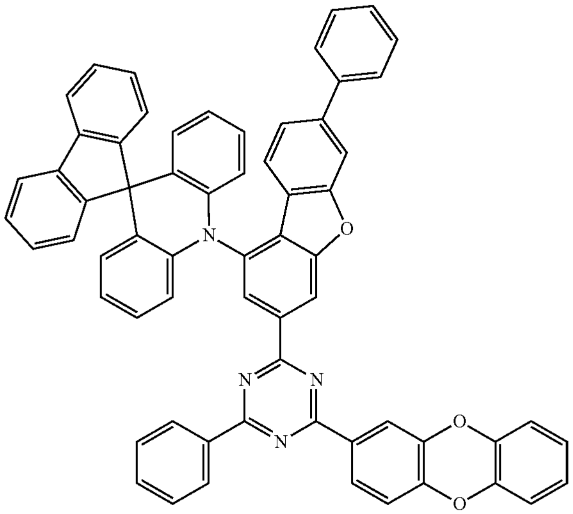
Z3-35
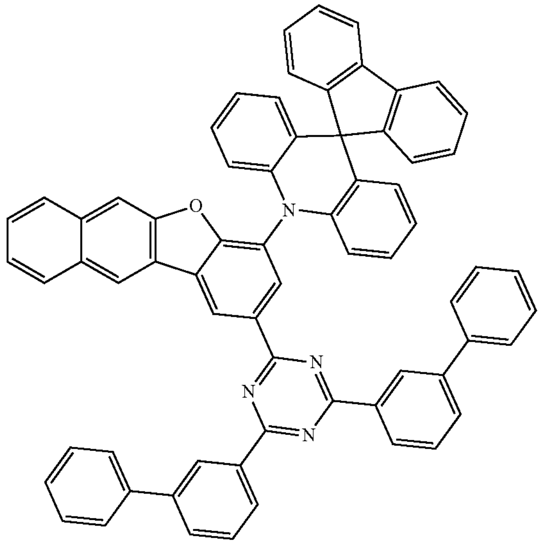
Z3-36
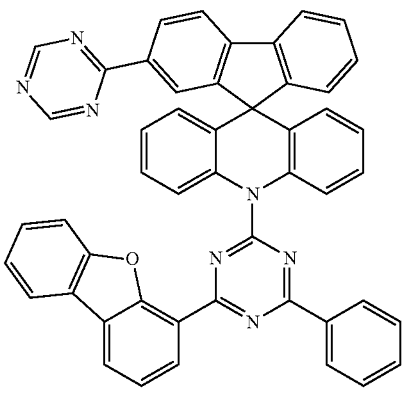

-continued
Z3-37
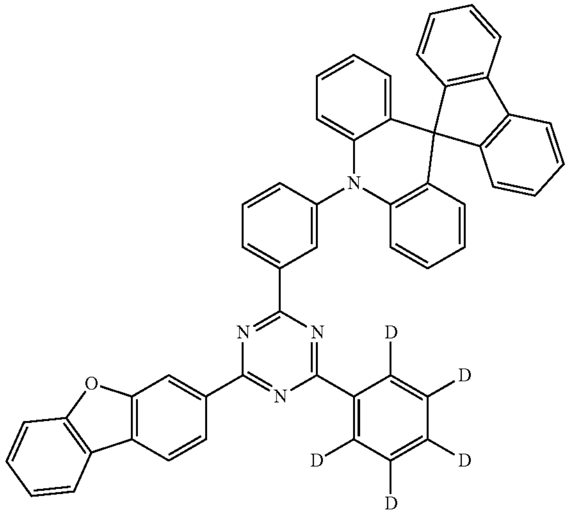
Z3-38
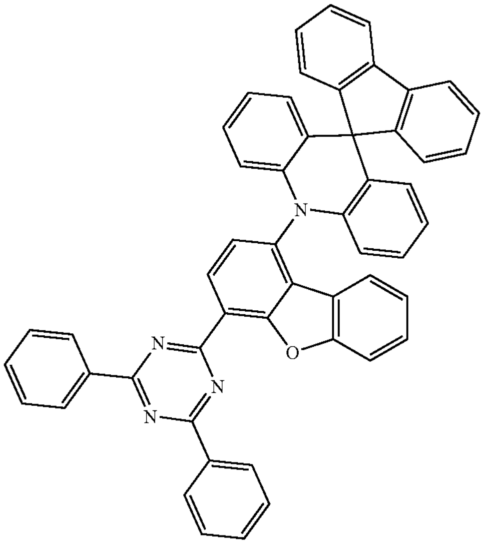
Z3-39
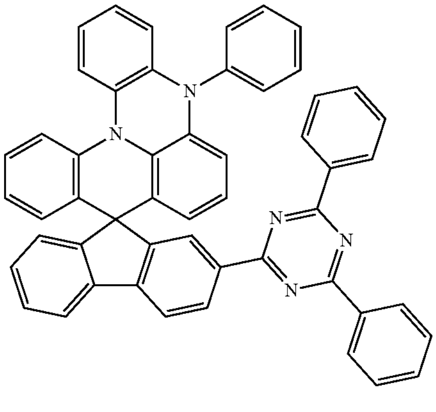
-continued
Z3-40
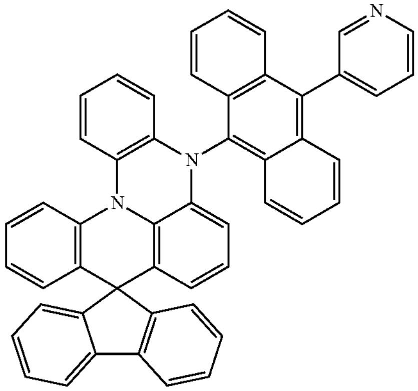
Z3-41
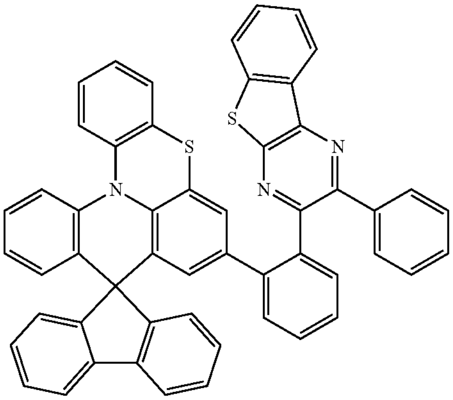
Z3-42
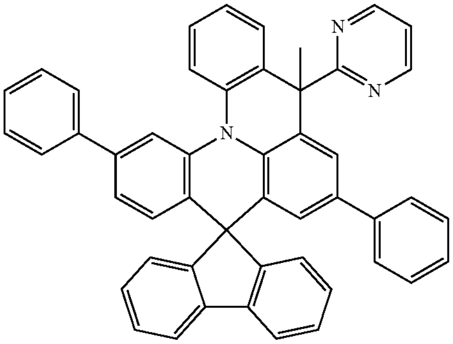
Z3-43
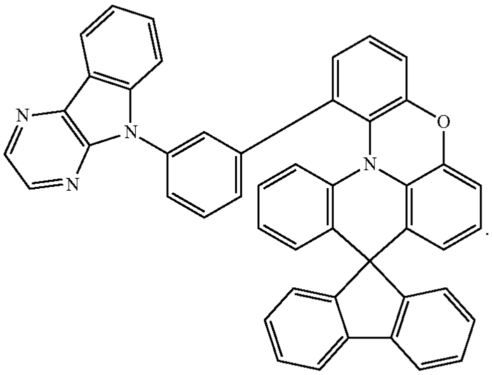
13. The organic electric element of claim 1, wherein the weight ratio of the first compound to the second compound is 2:8 to 8:2.

14. The organic electric element of claim 1, further comprising a layer for improving luminous efficiency, wherein the layer for improving luminous efficiency is formed on one side of both sides of the first electrode or the second electrode and the one side is not facing the organic material layer.

15. The organic electric element of claim 1, wherein the organic material layer comprises two or more stacks, and the stacks each comprise a hole transport layer, a light-emitting layer and an electron transport layer formed sequentially on the first electrode.

16. The organic electric element of claim 15, wherein the organic material layer further comprises a charge generation layer formed between the two or more stacks.

17. The organic electric element of claim 1, wherein the organic material layer further comprises one or more hole transport band layers formed between the light-emitting layer and the anode, and the hole transport band layers comprise at least one of a hole transport layer and an emission auxiliary layer comprising the formula 1.

18. An electronic device comprising:

a display device comprising organic electric element of claim 1; and a control unit for driving the display device.

19. The electronic device of claim 18, wherein the organic electric element is an organic electroluminescent element, an organic solar cell, an organic photo conductor, an organic transistor, an element for monochromatic illumination or a quantum dot display.

* * * * *